US012178117B2

(12) United States Patent
Sim et al.

(10) Patent No.: US 12,178,117 B2
(45) Date of Patent: Dec. 24, 2024

(54) COMPOSITION AND ORGANIC LIGHT-EMITTING DEVICE INCLUDING THE SAME

(71) Applicants: Samsung Electronics Co., Ltd., Suwon-si (KR); SAMSUNG SDI CO., LTD., Yongin-si (KR)

(72) Inventors: Myungsun Sim, Suwon-si (KR); Sunghun Lee, Hwaseong-si (KR); Yoonhyun Kwak, Seoul (KR); Jiwhan Kim, Seoul (KR); Jeoungin Yi, Seoul (KR); Mitsunori Ito, Kanagawa-ken (JP); Wataru Sotoyama, Kanagawa-ken (JP); Kum Hee Lee, Seoul (KR); Byoungki Cho, Hwaseong-si (KR); Sunghyun Jung, Yongin-si (KR); Dalho Huh, Yongin-si (KR); Hyungsun Kim, Yongin-si (KR)

(73) Assignees: SAMSUNG ELECTRONICS CO., LTD., Gyeonggi-Do (KR); SAMSUNG SDI CO., LTD., Gyeonggi-Do (KR)

( * ) Notice: Subject to any disclaimer, the term of this patent is extended or adjusted under 35 U.S.C. 154(b) by 581 days.

(21) Appl. No.: 17/343,632

(22) Filed: Jun. 9, 2021

(65) Prior Publication Data

US 2022/0069240 A1 Mar. 3, 2022

(30) Foreign Application Priority Data

Jun. 10, 2020 (KR) ........................ 10-2020-0070359
May 20, 2021 (KR) ........................ 10-2021-0064956

(51) Int. Cl.
*H01L 51/50* (2006.01)
*C07F 15/00* (2006.01)
(Continued)

(52) U.S. Cl.
CPC ....... *H10K 85/346* (2023.02); *C07F 15/0086* (2013.01); *C09K 11/02* (2013.01);
(Continued)

(58) Field of Classification Search
None
See application file for complete search history.

(56) References Cited

U.S. PATENT DOCUMENTS 5,061,569 A 10/1991 Vanslyke et al.
5,707,747 A 1/1998 Tomiyama et al.
(Continued)

FOREIGN PATENT DOCUMENTS

JP 1993009471 A 2/1993
JP 1995126615 A 5/1997
(Continued)

OTHER PUBLICATIONS

English Abstract of KR 10-2019-0038108.
(Continued)

*Primary Examiner* — Gregory D Clark
(74) *Attorney, Agent, or Firm* — CANTOR COLBURN LLP

(57) ABSTRACT

Provided are a composition and an organic light-emitting device including the same, wherein the composition includes a platinum-containing organometallic compound, a first compound, a second compound, and a third compound.

20 Claims, 1 Drawing Sheet

(51) Int. Cl.

| | |
|---|---|
| ***C09K 11/02*** | (2006.01) |
| ***C09K 11/06*** | (2006.01) |
| ***H10K 85/30*** | (2023.01) |
| *H10K 50/11* | (2023.01) |
| *H10K 50/15* | (2023.01) |
| *H10K 50/16* | (2023.01) |
| *H10K 50/17* | (2023.01) |
| *H10K 50/18* | (2023.01) |
| *H10K 101/00* | (2023.01) |
| *H10K 101/30* | (2023.01) |

(52) U.S. Cl.

CPC ...... *C09K 11/06* (2013.01); *C09K 2211/1007* (2013.01); *C09K 2211/1029* (2013.01); *C09K 2211/1044* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 2101/30* (2023.02); *H10K 2101/90* (2023.02)

(56) References Cited

U.S. PATENT DOCUMENTS

| | | | |
|---|---|---|---|
| 5,837,166 | A | 11/1998 | Kawamura et al. |
| 6,203,725 | B1 | 3/2001 | Ogiso et al. |
| 8,008,657 | B2 | 8/2011 | Kai et al. |
| 8,723,164 | B2 | 5/2014 | Schmid et al. |
| 8,743,031 | B2 | 6/2014 | Hashimoto et al. |
| 9,190,620 | B2 | 11/2015 | Zeng et al. |
| 9,640,774 | B2 | 5/2017 | Lee et al. |
| 9,876,180 | B2 | 1/2018 | Jeong et al. |
| 9,893,290 | B2 | 2/2018 | Min et al. |
| 10,144,867 | B2 | 12/2018 | Ma et al. |
| 10,741,772 | B2 | 8/2020 | Lee et al. |
| 2004/0086743 | A1 | 5/2004 | Brown et al. |
| 2013/0009139 | A1 | 1/2013 | Ohsawa et al. |
| 2014/0197389 | A1 | 7/2014 | Adamovich et al. |
| 2015/0349268 | A1 | 12/2015 | Zeng et al. |
| 2016/0233436 | A1 | 8/2016 | Zeng et al. |
| 2016/0240800 | A1 | 8/2016 | Ma et al. |
| 2017/0092873 | A1 | 3/2017 | Kang et al. |
| 2017/0117487 | A1 | 4/2017 | Kawakami et al. |
| 2017/0317293 | A1 | 11/2017 | Kim et al. |
| 2018/0013078 | A1 | 1/2018 | Lee et al. |
| 2018/0233679 | A1 | 8/2018 | Baik et al. |
| 2018/0309070 | A1 | 10/2018 | Lee et al. |
| 2019/0074468 | A1 | 3/2019 | Kwak et al. |
| 2019/0165280 | A1 | 5/2019 | Jang et al. |
| 2020/0106024 | A1 | 4/2020 | Seo et al. |
| 2020/0207732 | A1 | 7/2020 | Numata et al. |
| 2020/0212314 | A1 | 7/2020 | Numata et al. |
| 2020/0266357 | A1 | 8/2020 | Lui et al. |
| 2020/0266358 | A1 | 8/2020 | Yang et al. |
| 2021/0009616 | A1* | 1/2021 | Kim ....................... H10K 50/11 |
| 2022/0328774 | A1 | 10/2022 | Lin et al. |

FOREIGN PATENT DOCUMENTS

| | | | |
|---|---|---|---|
| JP | 1998095973 | A | 4/1998 |
| JP | 4550160 | B2 | 7/2010 |
| JP | 5729957 | B2 | 6/2015 |
| JP | 5763309 | B2 | 6/2015 |
| JP | 2013033958 | A5 | 7/2015 |
| JP | 2017081909 | A | 5/2017 |
| JP | 2019010058 | A | 1/2019 |
| JP | 2020105154 | A | 7/2020 |
| JP | 2020107868 | A | 7/2020 |
| KR | 20100063713 | A | 6/2010 |
| KR | 20160024074 | A | 3/2016 |
| KR | 20160026744 | A | 3/2016 |
| KR | 20160050614 | A | 5/2016 |
| KR | 20170037277 | A | 4/2017 |
| KR | 20170065733 | A | 6/2017 |
| KR | 20170096860 | A | 8/2017 |
| KR | 20180002351 | A | 1/2018 |
| KR | 20180005128 | A | 1/2018 |
| KR | 20180035196 | A | 4/2018 |
| KR | 20180117919 | A | 10/2018 |
| KR | 20190026618 | A | 3/2019 |
| KR | 20190038108 | A | 4/2019 |
| KR | 20190078954 | A | 7/2019 |
| KR | 20190098676 | A | 8/2019 |
| KR | 20200099932 | A | 8/2020 |
| KR | 20200099933 | A | 8/2020 |
| WO | 9509147 | A1 | 4/1995 |

OTHER PUBLICATIONS

English Translation of Office Action dated Jul. 13, 2023, issued in corresponding KR Patent Application No. 10-2021-0064956, 13 pp.
Office Action dated Jul. 13, 2023, issued in corresponding KR Patent Application No. 10-2021-0064956, 11 pp.
English Abstract of JP 1993-009471.
English Abstract of JP 2019-010058.
English Abstract of JP 5763309.
English Abstract of KR 10-2016-0050614.
English Abstract of KR 10-2017-0096860.
English Abstract of KR 10-2018-0035196.
English Abstract of KR 10-2019-0078954.

* cited by examiner

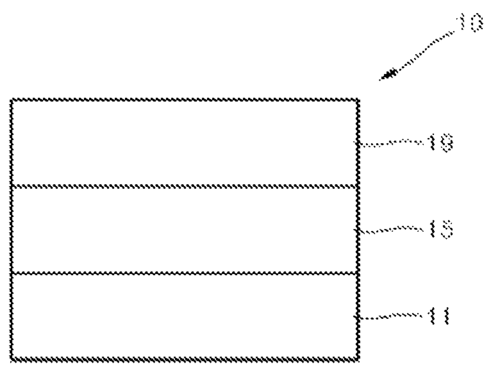
10
19
15
11

COMPOSITION AND ORGANIC LIGHT-EMITTING DEVICE INCLUDING THE SAME

CROSS-REFERENCE TO RELATED APPLICATIONS

This application claims priority to and the benefit of Korean Patent Application No. 10-2020-0070359, filed on Jun. 10, 2020 and Korean Patent Application No. 10-2021-0064956, filed on May 20, 2021, in the Korean Intellectual Property Office, the contents of which are incorporated herein in their entirety by reference.

BACKGROUND

1. Field

One or more embodiments relate to a composition and an organic light-emitting device including the same.

2. Description of Related Art

Organic light-emitting devices are self-emission devices, which have improved characteristics in terms of viewing angles, response time, brightness, driving voltage, and response speed, and produce full-color images.

In an example, an organic light-emitting device includes an anode, a cathode, and an organic layer located between the anode and the cathode and including an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state to thereby generate light.

SUMMARY

One or more embodiments relate to a novel composition and an organic light-emitting device including the same.

Additional aspects will be set forth in part in the description which follows and, in part, will be apparent from the description, or may be learned by practice of the presented embodiments of the disclosure.

According to one or more embodiments, an organic light-emitting device includes a platinum-containing organometallic compound, a first compound, a second compound, and a third compound, wherein the platinum-containing organometallic compound, the first compound, the second compound, and the third compound are different from each other, the first compound includes at least one electron transport moiety, the second compound does not include an electron transport moiety, the third compound has a greater band gap than a band gap of the first compound and a bandgap of the second compound, a difference between an absolute value of a highest occupied molecular orbital (HOMO) energy level of the first compound and an absolute value of a HOMO energy level of the second compound is equal to or less than about 0.35 eV, and the HOMO energy levels of the first compound and the second compound are each measured using a DFT method with Gaussian program on structures optimized using B3LYP/6-31G(d,p) functional and basis set.

According to one or more embodiments, a composition includes a platinum-containing organometallic compound, first compound, second compound, and third compound, wherein the platinum-containing organometallic compound, the first compound, the second compound, and the third compound are different from each other, the first compound includes at least one electron transport moiety, the second compound does not include an electron transport moiety, the third compound has a greater band gap than band gaps of the first compound and the second compound, and the platinum-containing organometallic compound is an organometallic compound represented by Formula 1-1 or 1-2:

Formula 1-1

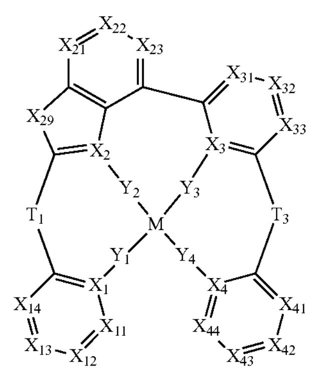

Formula 1-2

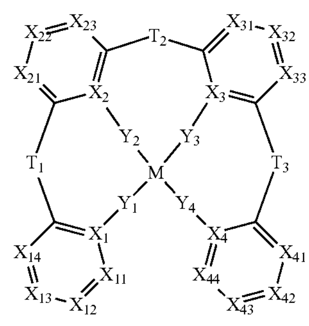

wherein, in Formulae 1-1 and 1-2,

M is platinum (Pt), $Y_1$ is O or S, and each of $Y_2$ to $Y_4$ is a chemical bond, each of $X_1$ and $X_3$ is C, and each of $X_2$ and $X_4$ is N, $T_1$ is a single bond, a double bond, *—N($R_{51}$)—*', *—B($R_{51}$)—*', *—P($R_{51}$)—*', *—C($R_{51}$)($R_{52}$)—*', *—Si($R_{51}$)($R_{52}$)—*', *—Ge($R_{51}$)($R_{52}$)—*', *—S—*', *—Se—*', *—O—*', *—C(═O)—*', *—S(═O)—*', *—S(═O)$_2$—*', *—C($R_{51}$)═*', *═C($R_{51}$)—*', *—C($R_{51}$)═C($R_{52}$)—*', *—C(═S)—*', or *—C≡C*', $T_2$ is a single bond, a double bond, *—N($R_{53}$)—*', *—B($R_{53}$)—*', *—P($R_{53}$)—*', *—C($R_{53}$)($R_{54}$)—*',

*—Si($R_{53}$)($R_{54}$)—*', *—Ge($R_{53}$)($R_{54}$)—*', *—S—*', *—Se—*', *—O—*', *—C(=O)—*', *—S(=O)—*', *—S(=O)$_2$—*—C($R_{53}$)=*', *=C($R_{53}$)—*', *—C($R_{53}$)=C($R_{54}$)*', *—C(=S)—*', or *—C≡C—*', $T_3$ is a single bond, a double bond, *—N($R_{55}$)—*', *—B($R_{55}$)—*', *—P($R_{55}$)—*', *—C($R_{55}$)($R_{56}$)—*, *—Si($R_{55}$)($R_{56}$)—*', *—Ge($R_{55}$)($R_{56}$)—*', *—S—*', *—Se—*', *—O—*', *—C(=O)—*', *—S(=O)—*', *—S(=O)$_2$—*—C($R_{55}$)=*', *=C($R_{55}$)—*', *—C($R_{55}$)=C($R_{56}$)—*', *—C(=S)—*', or *—C≡C—*', $X_{11}$ is N or C-[$(L_{11})_{a11}$-$(R_{11})_{b11}$], $X_{12}$ is N or C-[$(L_{12})_{a12}$-$(R_{12})_{b12}$], $X_{13}$ is N or C-[$(L_{13})_{a13}$-$(R_{13})_{b13}$], and $X_{14}$ is N or C-[$(L_{14})_{a14}$-$(R_{14})_{b14}$], $X_{21}$ is N or C-[$(L_{21})_{a21}$-$(R_{21})_{b21}$], $X_{22}$ is N or C-[$(L_{22})_{a22}$-$(R_{22})_{b22}$], and $X_{23}$ is N or C-[$(L_{23})_{a23}$-$(R_{23})_{b23}$], $X_{29}$ is O, S, C($R_{27}$)($R_{28}$), Si($R_{27}$)($R_{28}$), or N-[$(L_{29})_{a29}$-$(R_{29})_{b29}$], $X_{31}$ is N or C-[$(L_{31})_{a31}$-$(R_{31})_{b31}$], $X_{32}$ is N or C-[$(L_{32})_{a32}$-$(R_{32})_{b32}$], and $X_{33}$ is N or C-[$(L_{33})_{a33}$-$(R_{33})_{b33}$], $X_{41}$ is N or C-[$(L_{41})_{a41}$-$(R_{41})_{b41}$], $X_{42}$ is N or C-[$(L_{42})_{a42}$-$(R_{42})_{b42}$], $X_{43}$ is N or C-[$(L_{43})_{a43}$-$(R_{43})_{b43}$], and X is N or C-[$(L_{44})_{a44}$-$(R_{44})_{b44}$], $L_{11}$ to $L_{14}$, $L_{21}$ to $L_{23}$, $L_{31}$ to $L_{33}$, and $L_{41}$ to $L_{44}$ are each independently a single bond, a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, a11 to a14, a21 to a23, a31 to a33, and a41 to a44 are each independently an integer from 1 to 10, $R_{11}$ to $R_{14}$, $R_{21}$ to $R_{23}$, $R_{27}$ to $R_{29}$, $R_{31}$ to $R_{33}$, and $R_{41}$ to $R_{44}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(=O)($Q_8$)($Q_9$), b11 to b14, b21 to b23, b29, b31 to b33, and b41 to b44 are each independently an integer from 1 to 10, two of $R_{11}$ to $R_{14}$ are optionally linked to each other form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two of $R_{21}$ to $R_{23}$ are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two of $R_3$ to $R_{33}$ are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, and two of $R_{41}$ to $R_{44}$ are optionally linked to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

According to one or more embodiments, an organic light-emitting device includes a first electrode, a second electrode, and an organic layer located between the first electrode and the second electrode and including an emission layer, wherein the organic layer includes the composition.

BRIEF DESCRIPTION OF THE DRAWINGS

The above and other aspects, features, and advantages of certain embodiments of the disclosure will be more apparent from the following description taken in conjunction with the accompanying drawings, in which:

FIGURE which shows a schematic cross-sectional view of an organic light-emitting device according to an exemplary embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

An aspect of the present disclosure provides a composition including a platinum-containing organometallic compound, a first compound, a second compound, and a third compound.

The platinum-containing organometallic compound, the first compound, the second compound, and the third compound may be different from each other.

The first compound may include at least one electron transport moiety, the second compound may not include an electron transport moiety, and the third compound may have a greater band gap than a band gap of the first compound and a band gap of the second compound.

A difference between an absolute value of a highest occupied molecular orbital (HOMO) energy level of the first compound and an absolute value of a HOMO energy level of the second compound may be equal to or less than 0.35 eV.

The HOMO energy levels of the first compound and the second compound may each be measured using a DFT method with Gaussian program on structures optimized using B3LYP/6-31G(d,p) functional and basis set.

Platinum-Containing Organometallic Compound

In an embodiment, the platinum-containing organometallic compound may include platinum and an organic ligand, and the platinum and the organic ligand together may include 1, 2, or 3 cyclometalated rings.

In an embodiment, the platinum-containing organometallic compound may include platinum and a tetradentate organic ligand, and the platinum and the tetradentate organic ligand together may include 3 or 4 cyclometalated rings.

In an embodiment, the tetradentate organic ligand may include a benzimidazole group, or the tetradentate organic ligand may include at least one of an amino group, a boryl group, a silyl group, an alkoxy group or any combination thereof.

In one or more embodiments, the platinum-containing organometallic compound may be an organometallic compound represented by Formula 1:

Formula 1

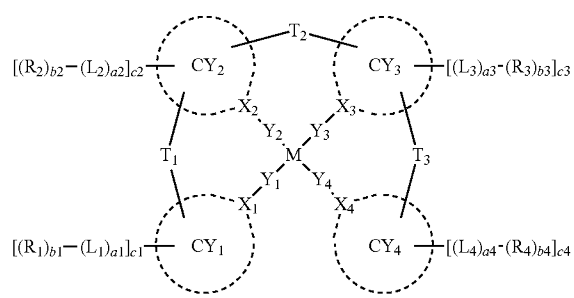

wherein M in Formula 1 may be platinum (Pt).

In Formula 1, $Y_1$ to $Y_4$ may each independently be a chemical bond, O, S, $N(R_a)$, $C(R_a)(R_b)$, or $Si(R_a)(R_b)$.

When $Y_1$ is a chemical bond, $X_1$ may directly bond to M, when $Y_2$ is a chemical bond, $X_2$ may directly bond to M, when $Y_3$ is a chemical bond, $X_3$ may directly bond to M, and when $Y_4$ is a chemical bond, $X_4$ may directly bond to M.

In an embodiment, in Formula, $Y_1$ may be O or S, and each of $Y_2$ to $Y_4$ may be a chemical bond.

In an embodiment, in Formula 1, two bonds among a bond between M and either of $Y_1$ and $X_1$, a bond between M and either of $Y_2$ and $X_2$, a bond between M and either of $Y_3$ and $X_3$, and a bond between M and either of $Y_4$ and $X_4$ may each be a coordination bond, and the other two bonds may each be a covalent bond. Thus, the organometallic compound represented by Formula 1 may be electrically neutral.

In Formula 1, $X_1$ to $X_4$ may each independently be C or N.

For example, in Formula 1, each of $X_1$ and $X_3$ may be C, and each of $X_2$ and $X_4$ may be N.

In an embodiment, in Formula 1, $Y_1$ may be O or S, each of $Y_2$ to $Y_4$ may be a chemical bond, each of $X_1$ and $X_3$ may be C, and each of $X_2$ and $X_4$ may be N.

In Formula 1, ring $CY_1$ to ring $CY_4$ may each independently be a $C_5$-$C_{30}$ carbocyclic group or a $C_1$-$C_{30}$ heterocyclic group.

For example, ring $CY_1$ to ring $CY_4$ may each independently be, i) a first ring, ii) a second ring, iii) a condensed ring in which two or more first rings are condensed with each other, iv) a condensed ring in which two or more second rings are condensed with each other, or v) a condensed ring in which one or more first rings and one or more second rings are condensed with each other.

For example, the first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isozadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

In an embodiment, in Formula 1, ring $CY_1$ to ring $CY_4$ may each independently be a cyclopentane group, a cyclohexane group, a cyclopentene group, a cyclohexene group, a cycloheptane group, a cycloheptene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a borole group, a phosphole group, a germole group, a selenophene group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an imidazopyridine group, an imidazopyrazine group, or a purine group.

In an embodiment, ring $CY_2$ may be a benzimidazole group, a benzoxazole group, or a benzothiazole group, and ring $CY_1$, ring $CY_3$, and ring $CY_4$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a fluorene group, a carbazole group, a dibenzofuran group, a dibenzothiophene group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a cinnoline group, a phthalazine group, a 5,6,7,8-tetrahydroisoquinoline group, a 5,6,7,8-tetrahydroquinoline group, a 5,6,7,8-tetrahydrophthalazine group, and a 5,6,7,8-tetrahydrocinnoline group.

In one or more embodiments, each of ring $CY_1$ and ring $CY_3$ may be a benzene ring, and each of ring $CY_2$ and ring $CY_4$ may be a pyridine ring.

$T_1$ in Formula 1 may be a single bond, a double bond, *—N($R_{51}$)—*', *—B($R_{51}$)—*', *—P($R_{51}$)—*', *—C($R_{51}$)($R_{52}$)—*', *—Si($R_{51}$)($R_{52}$)—*', *—Ge($R_{51}$)($R_{52}$)—*', *—S—*, *—Se—*', *—O—*', *—C(═O)—*', *—S(═O)—*', *—S(═O)$_2$—*', *—C($R_{51}$)═*', *═C($R_{51}$)—*', *—C($R_{51}$)═C($R_{52}$)—*', *—C(═S)—*', or *—C≡C—*', $T_2$ in Formula 1 may be a single bond, a double bond, *—N($R_{53}$)—*', *—B($R_{53}$)—*', *—P($R_{53}$)—*', *—C($R_{53}$)($R_{54}$)—*', *—Si($R_{53}$)($R_{54}$)—*', *—Ge($R_{53}$)($R_4$)—*', *—S—*', *—Se—*', *—O—*', *—C(═O)—*', *—S(═O)—*', *—S(═O)$_2$—*', *—C($R_{53}$)═*', *═C($R_{53}$)—*', *—C($R_{53}$)═C($R_{54}$)—*', *—C(═S)—*', or *—C≡C—*', and $T_3$ in Formula 1 may be a single bond, a double bond, *—N($R_{55}$)—*', *—B($R_{55}$)—*', *—P($R_{55}$)—*', *—C($R_{55}$)($R_{56}$)—*', *—Si($R_{55}$)($R_{56}$)—*', *—Ge($R_{55}$)($R_{56}$)—*', *—S—*', *—Se—*', *—O—*', *—C(═O)—*', *—S(═O)—*', *—S(═O)$_2$—*', *—C($R_{55}$)═*', *═C($R_{55}$)—*', *—C($R_{55}$)═C($R_{56}$)—*', *—C(═S)—*', or *—C≡C*'.

In an embodiment, in Formula 1, all of $T_1$ to $T_3$ may be single bonds, or at least one of $T_1$ to $T_3$ may not be a single bond.

For example, i) all of $T_1$ to $T_3$ may be single bonds, ii) each of $T_1$ and $T_2$ may be a single bond, and $T_3$ may be *—N($R_{55}$)—*', *—P($R_{55}$)—*', *—C($R_{55}$)($R_6$)—*', *—Si($R_{55}$)($R_{56}$)—*', *—Ge($R_{55}$)($R_{56}$)—*', *—S—*', or *—O—*', iii) $T_1$ may be *—N($R_{51}$)—*', *—P($R_{51}$)—*', *—C($R_{51}$)($R_{52}$)—*', *—Si($R_{51}$)($R_{52}$)—*', *—Ge($R_{51}$)($R_{52}$)—*', *—S—*', or *—O—*', and each of $T_2$ and $T_3$ may be a single bond, iv) each of $T_1$ and $T_3$ may be a single bond, and $T_2$ may be *—N($R_{53}$)—*', *—P($R_{53}$)—*', *—C($R_{53}$)($R_{54}$)—*', *—Si($R_{53}$)($R_{54}$)—*', *—Ge($R_{53}$)($R_{54}$)—*', *—S—*', or *—O—*', v) $T_1$ may be *—N($R_{51}$)—*', *—P($R_{51}$)—*', *—C($R_{51}$)($R_{52}$)*', *—Si($R_{51}$)($R_{52}$)—*', *—Ge($R_{51}$)($R_{52}$)*', *—S—*', or *—O—*', $T_2$ may be *—N($R_{53}$)—*', *—P($R_{53}$)—*', *—C($R_{53}$)($R_{54}$)—*', *—Si($R_{53}$)($R_{54}$)—*', *—Ge($R_{53}$)($R_{54}$)—*', *—S—*', or *—O—*', and $T_3$ may be a single bond, or vi) $T_1$ may be a single bond, $T_2$ may be *—N($R_{53}$)—*', *—P($R_{53}$)—*', *—C($R_{53}$)

$(R_{54})$—*', *—$Si(R_{53})(R_{54})$—*', *—$Ge(R_{53})(R_{54})$—*', *—S—*', or *—O—*', and $T_3$ may be *—$N(R_{55})$—*', *—$P(R_{55})$—*', *—$C(R_{55})(R_{56})$—*', *—$Si(R_{55})(R_{56})$—*', *—$Ge(R_{55})(R_{56})$—*', *—S—*', or *—O—*'.

In Formula 1, $L_1$ to $L_4$, a1 to a4, $R_a$, $R_b$, $R_1$ to $R_4$, $R_{51}$ to $R_{56}$, and b1 to b4 may each be the same as described in the present specification.

In Formula 1, c1 to c4 indicate the number of a group represented by *-$(L_1)_{a1}$-$(R_1)_{b1}$, a group represented by *-$(L_2)_{a2}$-$(R_2)_{b2}$, a group represented by *-$(L_3)_{a3}$-$(R_3)_{b3}$, and a group represented by *-$(L_4)_{a4}$-$(R_4)_{b4}$, respectively, and may each independently be an integer from 1 to 10.

In an embodiment, the platinum-containing organometallic compound may be an organometallic compound represented by Formula 1-1 or 1-2:

Formula 1-1

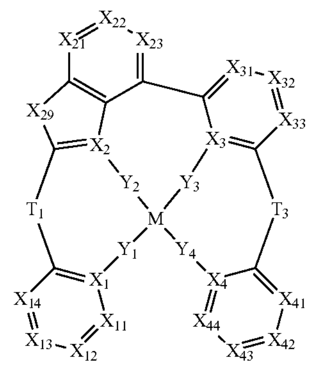

Formula 1-2

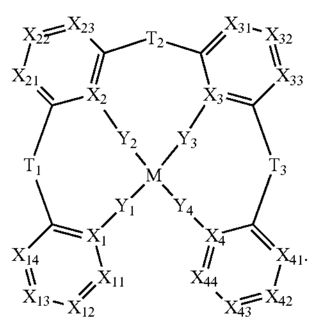

In Formulae 1-1 and 1-2,

M may be Pt, $Y_1$ may be O or S, and each of $Y_2$ to $Y_4$ may be a chemical bond, each of $X_1$ and $X_3$ may be C, and each of $X_2$ and $X_4$ may be N, $T_1$ may be a single bond, a double bond, *—$N(R_{51})$—*', *—$B(R_{51})$—*', *—$P(R_{51})$—*', *—$C(R_{51})(R_{52})$—*', *—$Si(R_{51})(R_{52})$—*', *—$Ge(R_{51})(R_{52})$—*', *—S—*', *—Se—*', *—O—*', *—C(═O)—*', *—S(═O)—*', *—$S(═O)_2$—*', *—$C(R_{51})$=*', *═$C(R_{51})$—*', *—$C(R_{51})$═$C(R_{52})$—*', *—C(═S)—*', or *—C≡C—*', $T_2$ may be a single bond, a double bond, *—$N(R_{53})$—*', *—$B(R_{53})$—*', *—$P(R_{53})$—*', *—$C(R_{53})(R_{54})$—*', *—$Si(R_{53})(R_{54})$—*', *—$Ge(R_{53})(R_{54})$—*', *—S—*', *—Se—*', *—O—*', *—C(═O)—*', *—S(═O)—*', *—$S(═O)_2$—*', *—$C(R_{53})$=*', *═$C(R_{53})$—*', *—$C(R_{53})$═$C(R_{54})$—*', *—C(═S)—*', or *—C≡C—*', $T_3$ may be a single bond, a double bond, *—$N(R_{55})$—*', *—$B(R_{55})$—*', *—$P(R_{55})$—*', *—$C(R_{55})(R_{56})$—*', *—$Si(R_{55})(R_{56})$—*', *—$Ge(R_{55})(R_{56})$—*', *—S—*', *—Se—*', *—O—*', *—C(═O)—*', *—S(═O)—*', *—$S(═O)_2$—*', *—$C(R_{55})$=*', *═$C(R_{55})$—*', *—$C(R_{55})$═$C(R_{56})$—*', *—C(═S)—*', or *—C≡C—*', $X_{11}$ may be N or C-$[(L_{11})_{a11}$-$(R_{11})_{b11}]$, $X_{12}$ may be N or C-$[(L_{12})_{a12}$-$(R_{12})_{b12}]$, $X_{13}$ may be N or C$[(L_{13})_{a13}$-$(R_{13})_{b13}]$, and $X_{14}$ may be N or C-$[(L_{14})_{a14}$-$(R_{14})_{b14}]$, $X_{21}$ may be N or C-$[(L_{21})_{a21}$-$(R_{21})_{b21}]$, $X_2$ may be N or C-$[(L_{22})_{a22}$-$(R_{22})_{b22}]$, and $X_{23}$ may be N or C-$[(L_{23})_{a23}$-$(R_{23})_{b23}]$, $X_{29}$ may be O, S, $C(R_{27})(R_{28})$, $Si(R_{27})(R_{28})$, or N-$[(L_{29})_{a29}$-$(R_{29})_{b29}]$, $X_{31}$ may be N or C-$[(L_{31})_{a31}$-$(R_{31})_{b31}]$, $X_{32}$ may be N or C-$[(L_{32})_{a32}$-$(R_{32})_{b32}]$, and $X_{33}$ may be N or C-$[(L_{33})_{a33}$-$(R_{33})_{b33}]$, $X_{41}$ may be N or C-$[(L_4)_{a41}$-$(R_{41})_{b41}]$, $X_{42}$ may be N or C-$[(L_{42})_{a42}$-$(R_2)_{b42}]$, $X_{43}$ may be N or C-$[(L_{43})_{a43}$-$(R_{43})_{b43}]$, and $X_4$ may be N or C-$[(L_4)_{a44}$-$(R_{44})_{b44}]$, $L_{11}$ to $L_{14}$, $L_{21}$ to $L_{23}$, $L_{31}$ to $L_{33}$, and $L_{41}$ to $L_{44}$ may each independently be a single bond, a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, a11 to a14, a21 to a23, a31 to a33, and a41 to a44 may each independently be an integer from 1 to 10, $R_{11}$ to $R_{14}$, $R_{21}$ to $R_{23}$, $R_{27}$ to $R_{29}$, $R_{31}$ to $R_{33}$, and $R_{41}$ to $R_{44}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(═O)(Q_8)(Q_9)$, b11 to b14, b21 to b23, b29, b31 to b33, and b41 to b44 may each independently be an integer from 1 to 10, two of $R_{11}$ to $R_{14}$ may optionally be linked to each other form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two of $R_{21}$ to $R_{23}$ may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two of $R_{31}$ to $R_{33}$ may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, and two of $R_{41}$ to $R_{44}$ may optionally be linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$.

First Compound (ET Host)

In an embodiment, the electron transport moiety included in the first compound may be a cyano group, a fluoro group, a π-electron deficient nitrogen-containing cyclic group, a group represented by one of the following formulae, or a combination thereof:

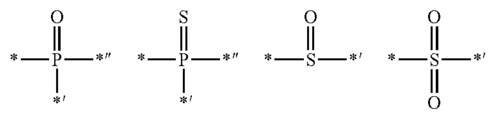

wherein *, *', and *" in the formulae above are each a binding site to a neighboring atom.

The term "π-electron deficient nitrogen-containing cyclic group" as used herein refers to a heterocyclic group which has, as a ring-forming moiety, at least one *—N=*' moiety.

For example, the "π-electron deficient nitrogen-containing cyclic group" may be i) a 5-membered to 7-membered heteromonocyclic group having at least one *—N=*' moiety, ii) a heteropolycyclic group in which two or more 5-membered to 7-membered heteromonocyclic groups each having at least one *—N=*' moiety are condensed with each other, or iii) a heteropolycyclic group in which at least one of 5-membered to 7-membered heteromonocyclic groups, each having at least one *—N=*' moiety, is condensed with at least one $C_5$-$C_{60}$ carbocyclic group.

Examples of the π-electron deficient nitrogen-containing cyclic groups include an imidazole ring, a pyrazole ring, a thiazole ring, an isothiazole ring, an oxazole ring, an isoxazole ring, a pyridine ring, a pyrazine ring, a pyrimidine ring, a pyridazine ring, an indazole ring, a purine ring, a quinoline ring, an isoquinoline ring, a benzoquinoline ring, a phthalazine ring, a naphthyridine ring, a quinoxaline ring, a quinazoline ring, a cinnoline ring, a phenanthridine ring, an acridine ring, a phenanthroline ring, a phenazine ring, a benzimidazole ring, an isobenzothiazole ring, a benzoxazole ring, an isobenzoxazole ring, a triazole ring, a tetrazole ring, an oxadiazole ring, a triazine ring, a thiadiazole ring, an imidazopyridine ring, an imidazopyrimidine ring, and an azacarbazole ring, but are not limited thereto.

In one or more embodiments, the first compound may be a compound represented by Formula 2:

Formula 2

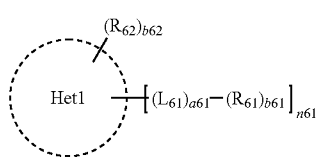

wherein Het1 in Formula 2 may be a $C_1$-$C_{30}$ π-electron deficient nitrogen-containing cyclic group.

In an embodiment, Het1 in Formula 2 may be a group represented by one of Formulae 2-1 to 2-40:

2-1

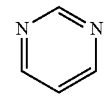

2-2

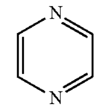

2-3

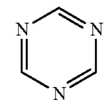

2-4

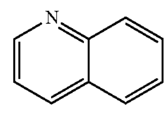

2-5

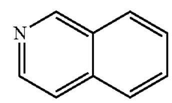

2-6

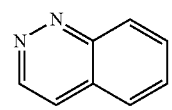

2-7

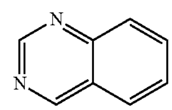

2-8

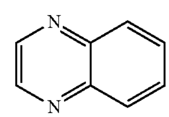

2-9

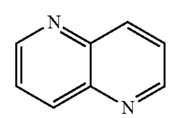

2-10

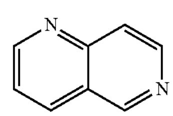

2-11

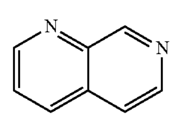

2-12

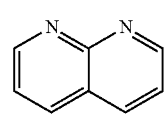

2-13

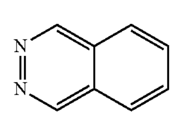

2-14

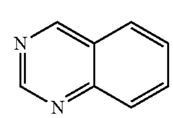

-continued
2-15
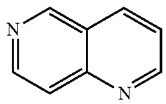
2-16
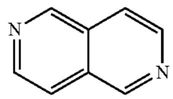
2-17
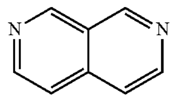
2-18
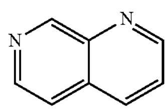
2-19
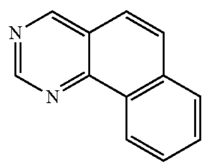
2-20
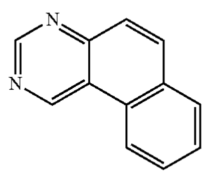
2-21
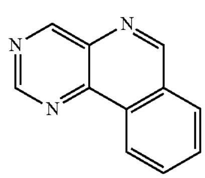
2-23
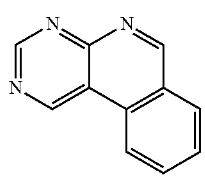
2-24
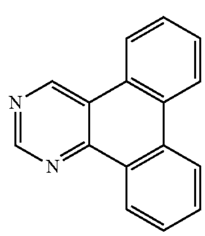
2-25
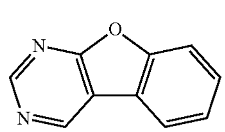
-continued
2-26
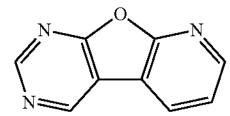
2-27
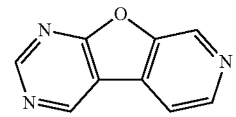
2-28
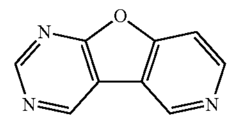
2-29
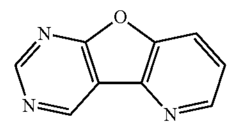
2-30
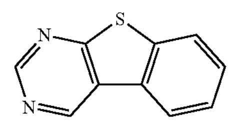
2-31
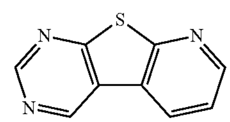
2-32
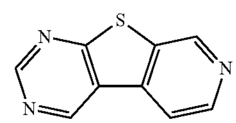
2-33
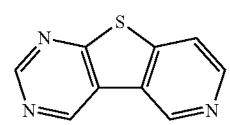
2-34
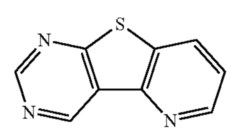
2-35
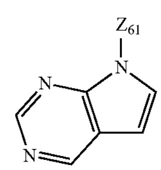
2-36
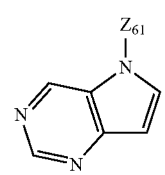
2-37
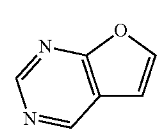

-continued 2-38

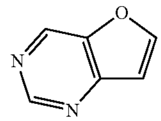

2-39

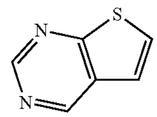

2-40

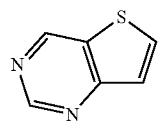

wherein $Z_{61}$ in Formulae 2-35 and 2-36 may be a group represented by *-$(L_{61})_{a61}$-$(R_{61})_{b61}$ in Formula 2 or $R_{62}$.

In Formula 2, $L_{61}$, a61, $R_{61}$, $R_{62}$, b61, and b62 may each be the same as described in the present specification.

In an embodiment, at least one of $R_{61}$(s) in the number of b61 in Formula 2 may be a substituted or unsubstituted carbazolyl group, a substituted or unsubstituted indolocarbazolyl group, a substituted or unsubstituted dibenzofuranyl group, a substituted or unsubstituted dibenzothiophenyl group, a substituted or unsubstituted fused-carbazolyl group, a substituted or unsubstituted fused-dibenzofuranyl group, a substituted or unsubstituted fused-dibenzothiophenyl group, a substituted or unsubstituted fused-indolocarbazolyl group, a substituted or unsubstituted pyridinyl group, a substituted or unsubstituted pyrimidinyl group, a substituted or unsubstituted triazinyl group, a substituted or unsubstituted quinolinyl group, a substituted or unsubstituted isoquinolinyl group, a substituted or unsubstituted quinoxalinyl group, a substituted or unsubstituted quinazolinyl group, or a substituted or unsubstituted benzoquinazolinyl group.

In one or more embodiments, at least one of $R_{61}$(s) in the number of b61 in Formula 2 may be a group represented by Formula 2A or Formula 2B:

2A

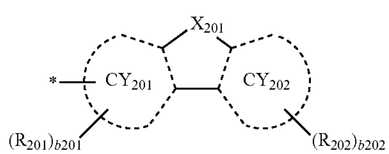

2B

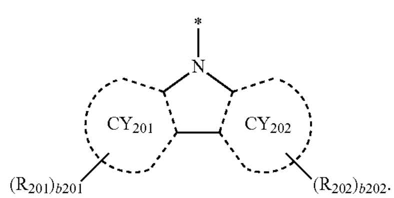

In Formulae 2A and 2B, $CY_{201}$ and ring $CY_{202}$ may each independently be a benzene ring, a naphthalene ring, an anthracene ring, a phenanthrene ring, a carbazole ring, a dibenzofuran ring, a dibenzothiophene ring, a benzocarbazole ring, a naphthobenzofuran ring, a naphthobenzothiophene ring, a dibenzocarbazole ring, a dinaphthofuran ring, or a dinaphthothiophene ring, $X_{201}$ may be O, S, and $N(R_{203})$, $R_{201}$ to $R_{203}$ may each be the same as described in connection with $R_1$, b201 and b202 may each independently be an integer from 1 to 8, and

* indicates a binding site to a neighboring atom.

In Formula 2, n61 indicates the number of a group represented by *-$(L_{61})_{a61}$-$(R_{61})_{b61}$, and may be an integer from 1 to 10.

In one or more embodiments, the first compound may be represented by one of Formulae 2(1) to 2(8):

2(1)

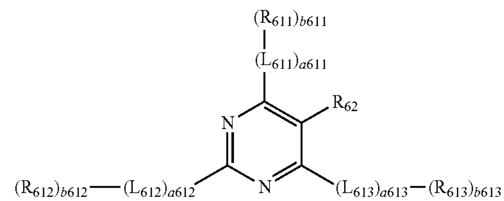

2(2)

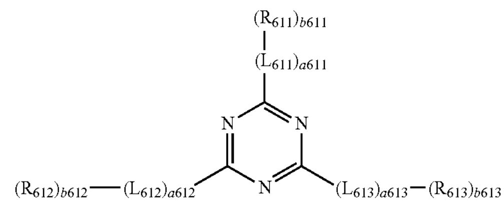

2(3)

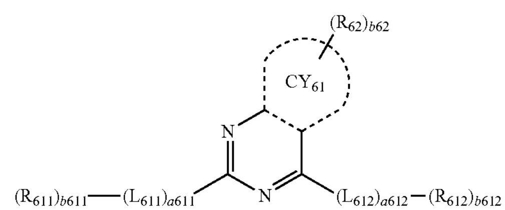

2(4)

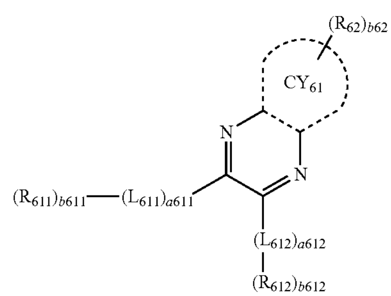

2(5)

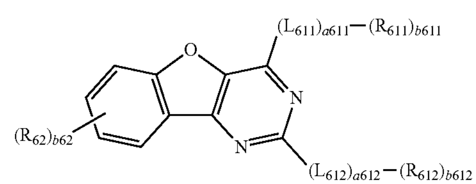

2(6)

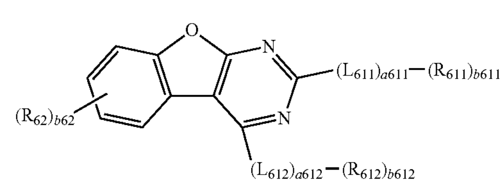

-continued

2(7)

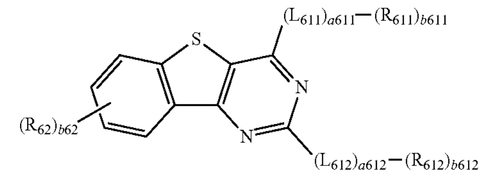

2(8)

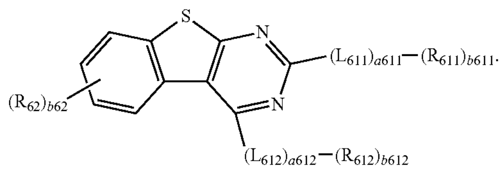

In Formulae 2(1) to 2(8), ring $CY_{61}$ may be a benzene ring or a naphthalene ring, $L_{611}$ to $L_{613}$ may each be the same as described in connection with $L_{61}$, a611 to a613 may each be the same as described in connection with a61, $R_{611}$ to $R_{613}$ may each be the same as described in connection with $R_{61}$, b611 to b613 may each be the same as described in connection with b61, $R_{62}$ may be the same as described in the present specification, and b62 may be an integer from 1 to 6.

Second Compound (HT Host)

In an embodiment, the second compound may include at least one π-electron rich cyclic group.

The term "π-electron rich cyclic group" as used herein refers to a carbocyclic group or a heterocyclic group which does not include, as a ring-forming moiety, *=N—*'.

The "π-electron rich cyclic group" may be, for example, a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, a benzonaphthofuran group, a benzonaphthothiophene group, an indolophenanthrene group, a benzofuranophenanthrene group, or a benzothienophenanthrene group, but embodiments of the present disclosure are not limited thereto.

In one or more embodiments, the second compound may include at least one carbazole group, at least one fused carbazole group, at least one amine group, or any combination thereof.

In one or more embodiments, the second compound may be a compound represented by one of Formulae 3-1 to 3-4:

Formula 3-1

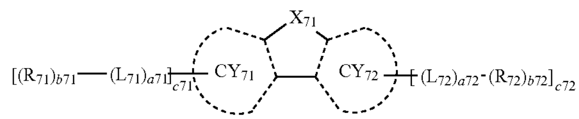

Formula 3-2

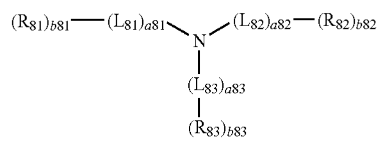

Formula 3-3

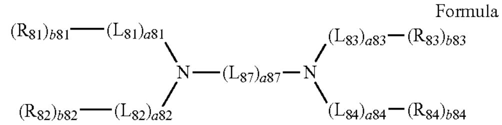

Formula 3-4

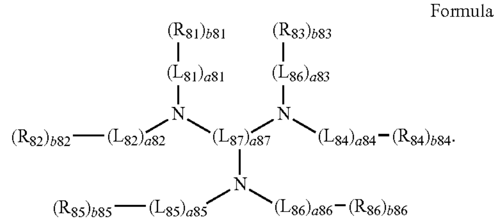

In Formula 3-1, ring $CY_{71}$ and ring $CY_{72}$ may each independently be a $C_3$-$C_{30}$ π-electron rich cyclic group, and are optionally linked to each other via a $C_3$-$C_{30}$ π-electron rich cyclic group that is unsubstituted or substituted with at least one $R_{10a}$.

In Formula 3-1, $X_{71}$ may be O, S, N-$(L_{73})_{a73}$-$(R_{73})_{b73}$, $C(R_{73})(R_{74})$, or $Si(R_{73})(R_{74})$.

In an embodiment, a group represented by

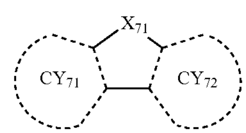

in Formula 3-1 may be represented by one of Formulae 3(1) to 3(67) and 3(94) to 3(96):

3(1)

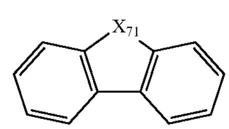

3(2)

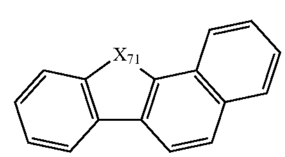

-continued
3(3)
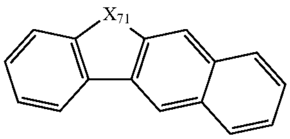
3(4)
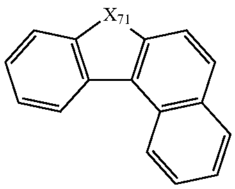
3(5)
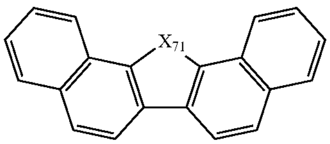
3(6)
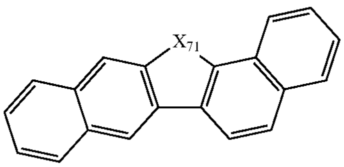
3(7)
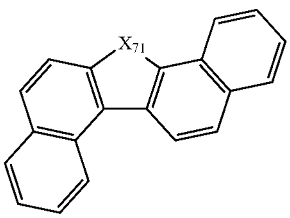
3(8)
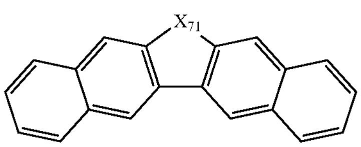
3(9)
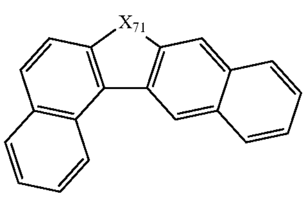
3(10)
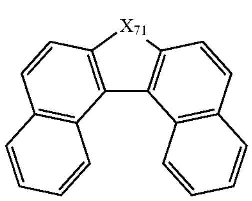
3(11)
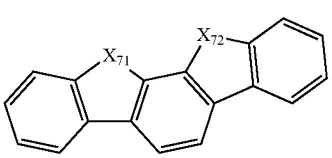
-continued
3(12)
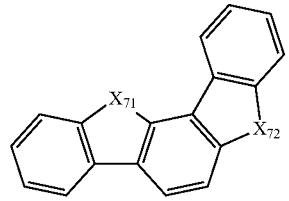
3(13)
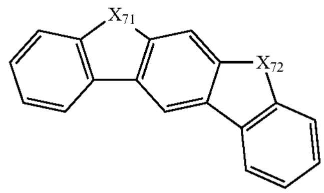
3(14)
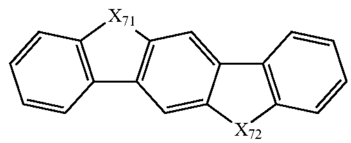
3(15)
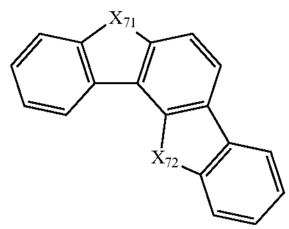
3(16)
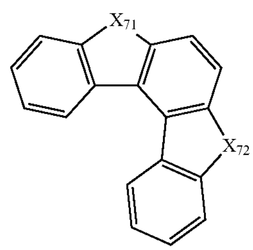
3(17)
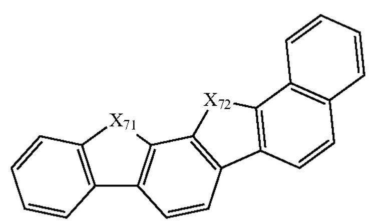
3(18)
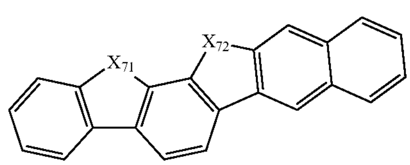
3(19)
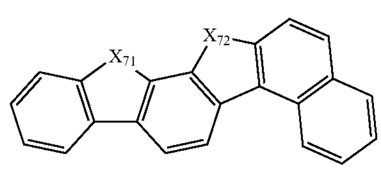

-continued
3(20)
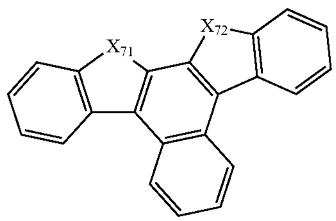
3(21)
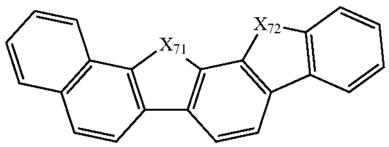
3(22)
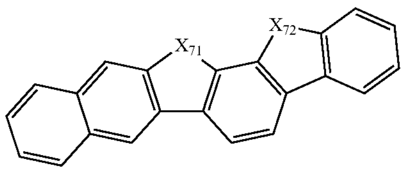
3(23)
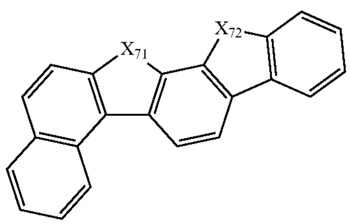
3(24)
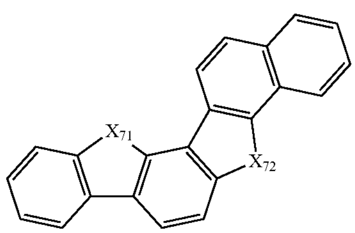
3(25)
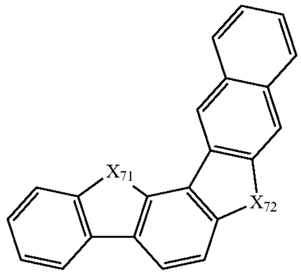
3(26)
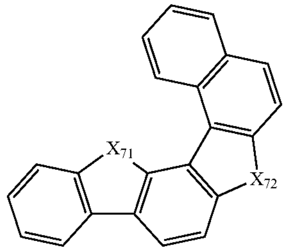
-continued
3(27)
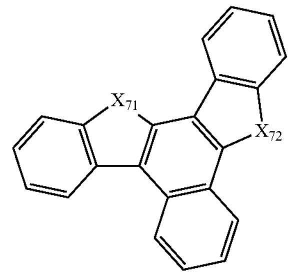
3(28)
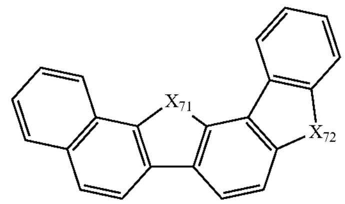
3(29)
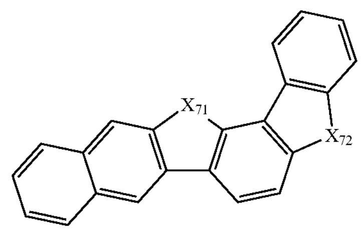
3(30)
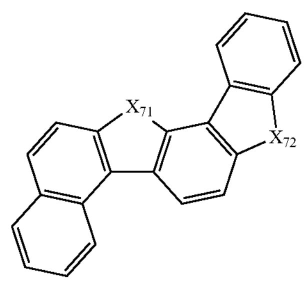
3(31)
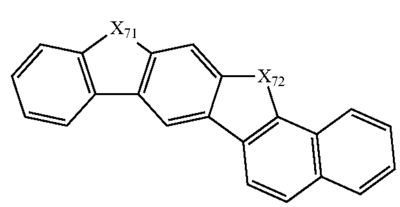
3(32)
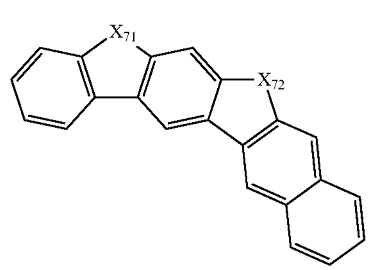

-continued
3(33)
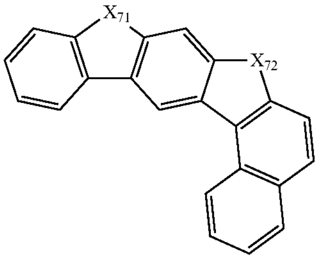
3(34)
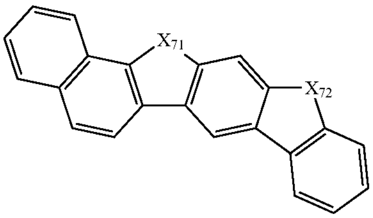
3(35)
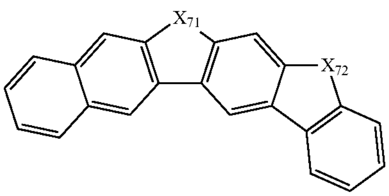
3(36)
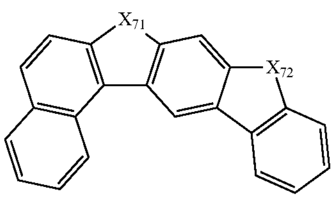
3(37)
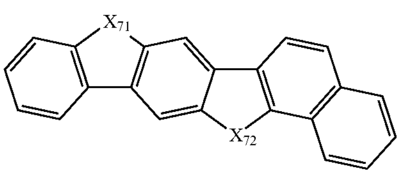
3(38)
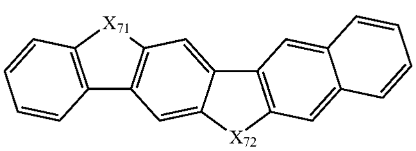
3(39)
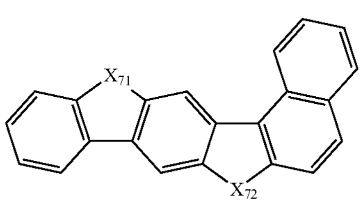
3(40)
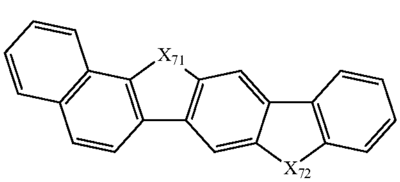
-continued
3(41)
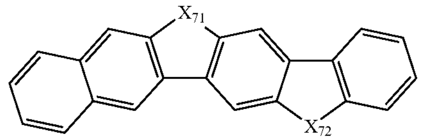
3(42)
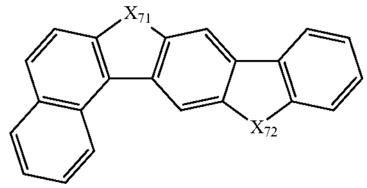
3(43)
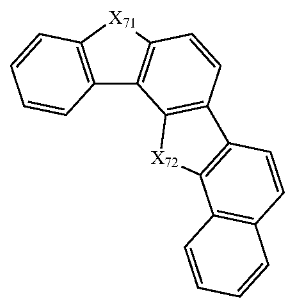
3(44)
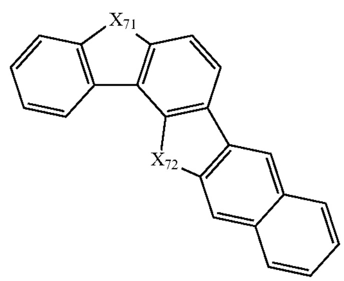
3(45)
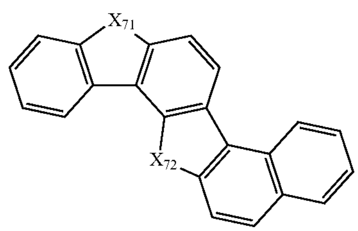
3(46)
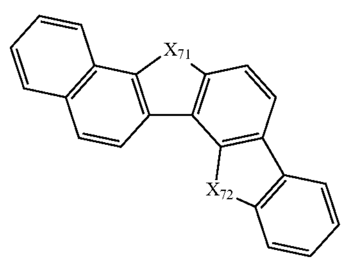
3(47)
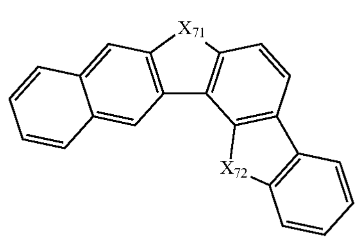

-continued
3(48)
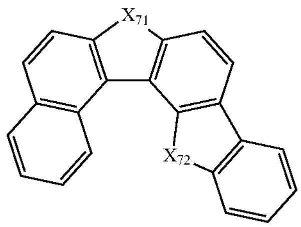
3(49)
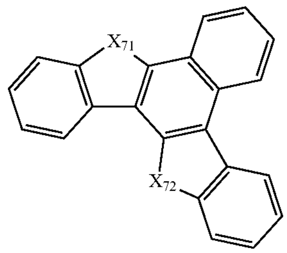
3(50)
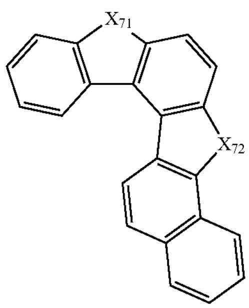
3(51)
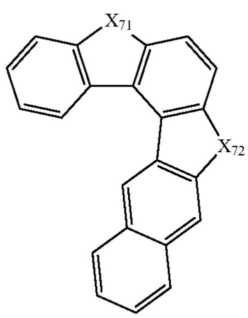
3(52)
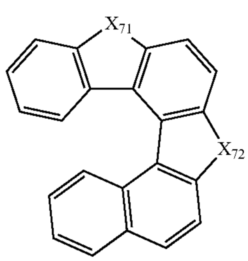
3(53)
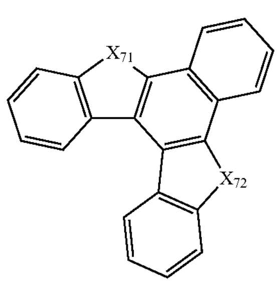
-continued
3(54)
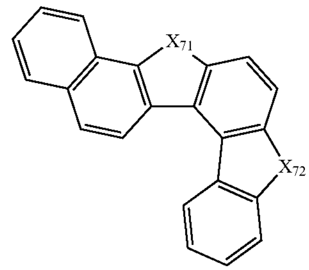
3(55)
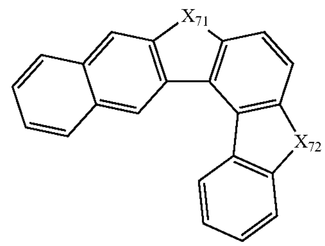
3(56)
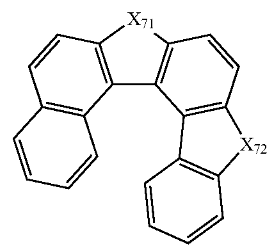
3(57)
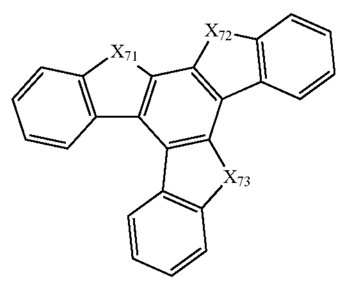
3(58)
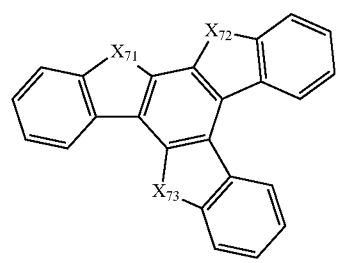
3(59)
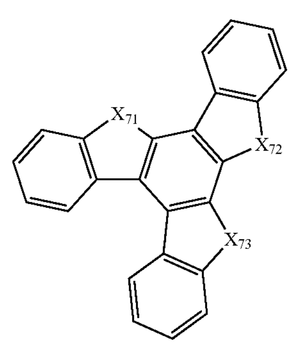

-continued

3(60)

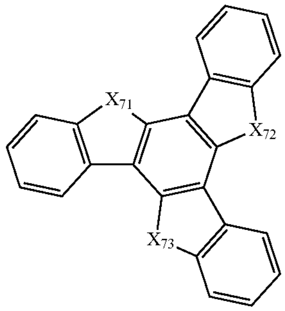

3(61)

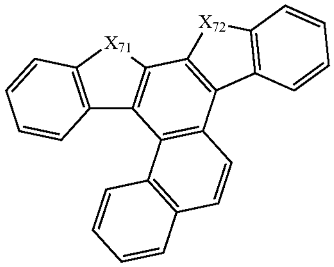

3(62)

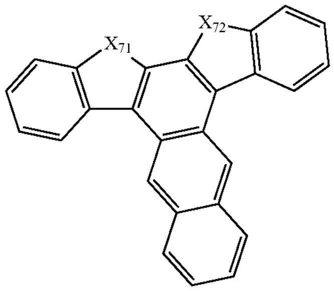

3(63)

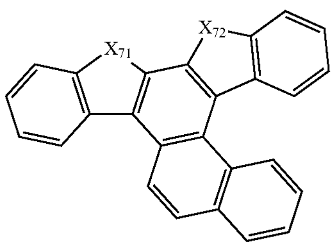

3(64)

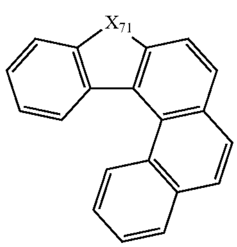

3(65)

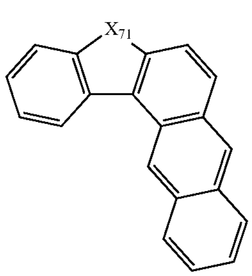

-continued

3(66)

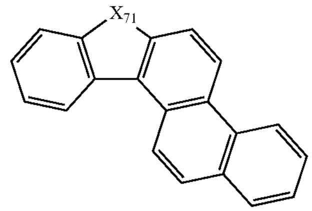

3(67)

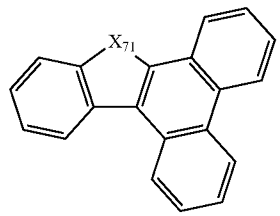

3(94)

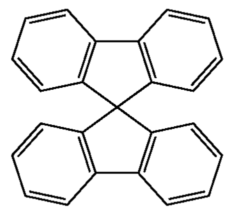

3(95)

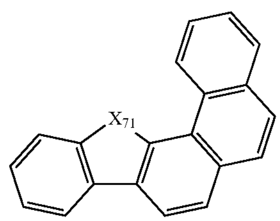

3(96)

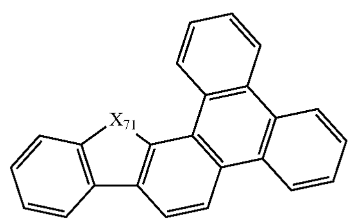

In Formulae 3(1) to 3(67) and 3(94) to 3(96), $X_{71}$ may be the same as described in the present specification, $X_{72}$ may be O, S, $N(R_{75})$, $C(R_{75})(R_{76})$, or $Si(R_{75})(R_{76})$, $X_{73}$ may be O, S, $N(R_{77})$, C(Rn)$(R_{78})$, or $Si(R_{77})(R_{78})$, and $R_{75}$ to $R_{78}$ may each be the same as described in connection with $R_{71}$.

In Formulae 3-1 to 3-4, $L_{71}$, $L_{72}$, $L_{81}$ to $L_{87}$, a71 to a73, a81 to a87, $R_{71}$, $R_{72}$, $R_{51}$ to $R_{86}$, b71, b72, and b81 to b86 may each be the same as described in the present specification.

In Formula 3-1, c71 and c72 each indicate the number of a group represented by $*-(L_{71})_{a71}-(R_{71})_{b71}$ and the number of a group represented by $*-(L_{72})_{a72}-(R_{72})_{b72}$, respectively, and may each independently be an integer from 1 to 10.

In an embodiment, at least one of $R_{51}$ to $R_{83}$ in Formula 3-2, at least one of $R_{51}$ to $R_{84}$ in Formula 3-3, and/or at least one of $R_{81}$ to $R_{86}$ in Formula 3-3 may be a group represented by Formula 3A:

Formula 3A

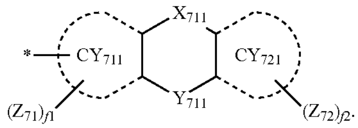

In Formula 3A, $X_{711}$ may be O, S, $N(Z_{73})$, $C(Z_{73})(Z_{74})$, or $Si(Z_{73})(Z_{74})$, $Y_{711}$ may be a single bond, O, S, $C(Z_{75})(Z_{76})$, or $Si(Z_{75})(Z_{76})$, ring $CY_{711}$ and ring $CY_{721}$ may each be the same as described in connection with $CY_{71}$ and $CY_{72}$, respectively, $Z_{71}$ to $Z_{76}$ may each be the same as described in connection with $R_1$, $Z_{73}$ and/or $Z_{75}$ may optionally be linked to neighboring ring $CY_{711}$ and/or ring $CY_{712}$, respectively, to form a $C_5$-$C_{30}$ carbocyclic group or a $C_1$-$C_{30}$ heterocyclic group, and

* indicates a binding site to a neighboring atom.

Third Compound (WBG Host)

The third compound may have a greater band gap than a band gap of the first compound and a band gap of the second compound.

For example, a gap between a HOMO energy level of the third compound and a LUMO energy level of the third compound may be equal to or greater than about 4.1 eV, for example, equal to or greater than about 4.3 eV.

In an embodiment, the third compound may include at least one group represented by Formula 4A, 4B, or 4C:

Formula 4A

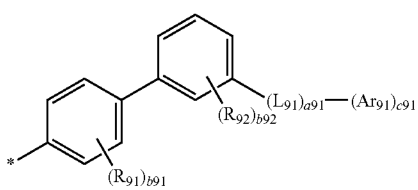

Formula 4B

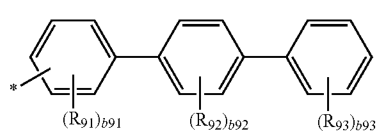

-continued

Formula 4C

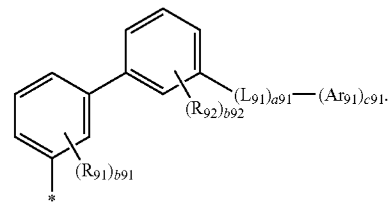

In Formulae 4A to 4C, $L_{91}$ may be a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, a91 may be an integer from 1 to 10, $Ar_{91}$ may be a substituted or unsubstituted benzene group or a substituted or unsubstituted naphthalene group, c91 may be an integer from 1 to 5, $R_{91}$ to $R_{93}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, b91 and b92 may each independently be an integer from 1 to 4, b93 may be an integer from 1 to 5, and

* indicates a binding site to a neighboring atom.

In one or more embodiments, the third compound may be a compound represented by one of Formulae 4-1 to 4-3:

Formula 4-1

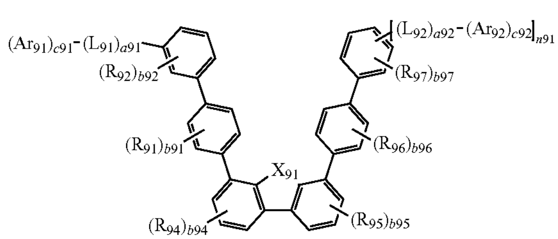

Formula 4-2

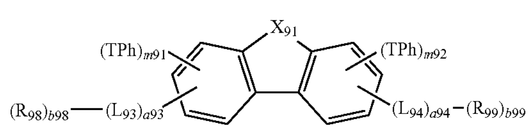

-continued

Formula 4-3

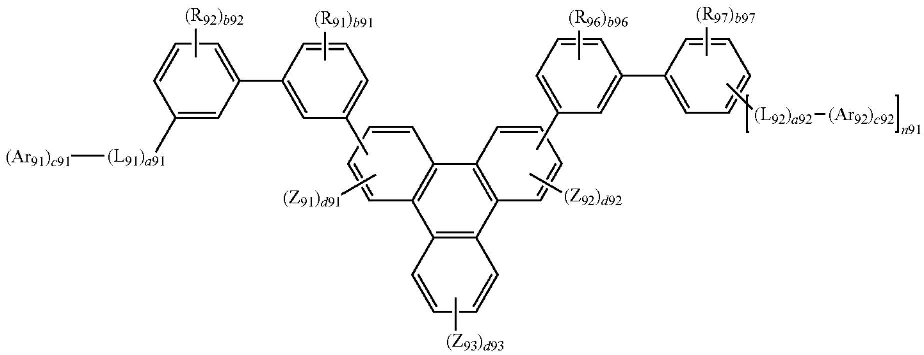

Formula 4B

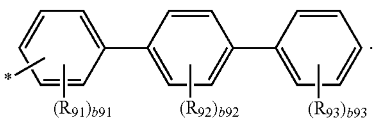

In Formulae 4-1 and 4-2, $X_{91}$ may be O, S, or Se.

In Formulae 4-1 and 4-3, $Ar_{91}$ and $Ar_{92}$ may each independently be a substituted or unsubstituted benzene group and a substituted or unsubstituted naphthalene group.

In Formulae 4-1 and 4-3, c91 and c92 indicate the number of $Ar_{91}$ and the number of $Ar_{92}$, respectively, and may each independently be an integer from 1 to 5.

In Formulae 4-1 and 4-3, n91 indicates the number of a group represented by *-$(L_{92})_{a92}$—$(Ar_{92})_{c92}$, and may be an integer from 0 to 5.

In Formula 4-2, TPh may be a group represented by Formula 4B.

In Formula 4-2, m91 and m92 each indicate the number of TPh, and may each independently be an integer from 0 to 2, wherein the sum of m91 and m92 may be 1 or more.

In Formulae 4-1 to 4-3, $L_{91}$ to $L_{94}$, a91 to a94, $R_{91}$ to $R_{99}$, $Z_{91}$ to $Z_{93}$, b91 to b99, and d91 to d93 may each be the same as described in the present specification.

In an embodiment, in Formulae 4-1 and 4-3, a group represented by *-$(L_{91})_{a91}$-$(Ar_{91})_{c91}$ and a group represented by *-$(L_{92})_{a92}$-$(Ar_{92})_{c92}$ may each independently be a group represented by one of Formulae 4-11 to 4-15:

4-11

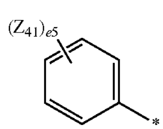

4-12

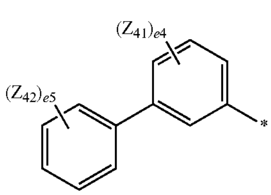

-continued 4-13

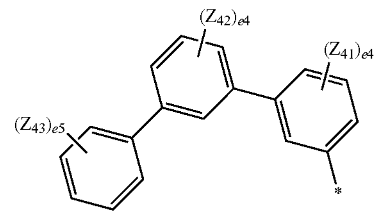

4-14

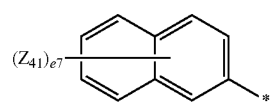

4-15

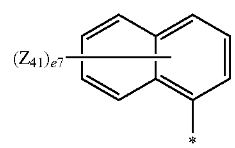

wherein, in Formulae 4-11 to 4-15, $Z_{41}$ to $Z_{43}$ may each independently be hydrogen, deuterium, —F, —Cl, —Br, —I, a hydroxyl group, a cyano group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, and —Si$(Q_{33})(Q_{34})(Q_{35})$, e4 may be an integer from 1 to 4, e5 may be an integer from 1 to 5, e7 may be an integer from 1 to 7, $Q_{33}$ to $Q_{35}$ may each independently be hydrogen, deuterium, a $C_1$-$C_{20}$ alkyl group, a $C_1$-$C_{20}$ alkoxy group, a phenyl group, and a biphenyl group,

* indicates a binding site to a neighboring atom.

In an embodiment, TPh may be a group represented by Formula 4B(1) or 4B(2):

4B(1)
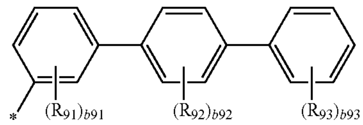
4B(2)
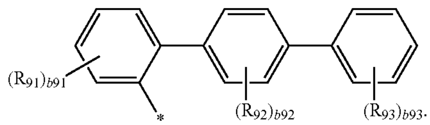
In Formulae 4B(1) and 4B(2), $R_{91}$ to $R_{93}$ and b91 to b93 may each be the same as described in the present specification.
In an embodiment, the third compound may be a compound represented by one of Formulae 4-1(1), 4-1(2), 4-2(1) to 4-2(4), and 4-3(1):
Formula 4-1(1)
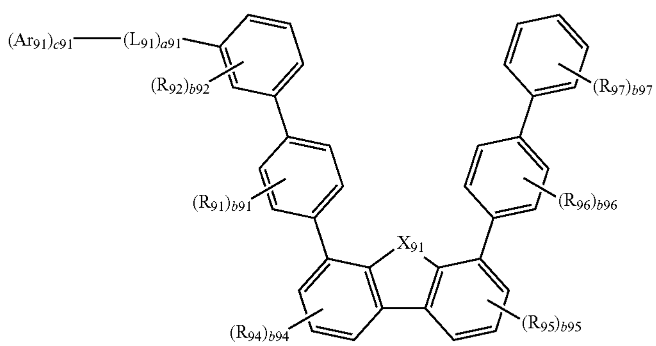
Formula 4-1(2)
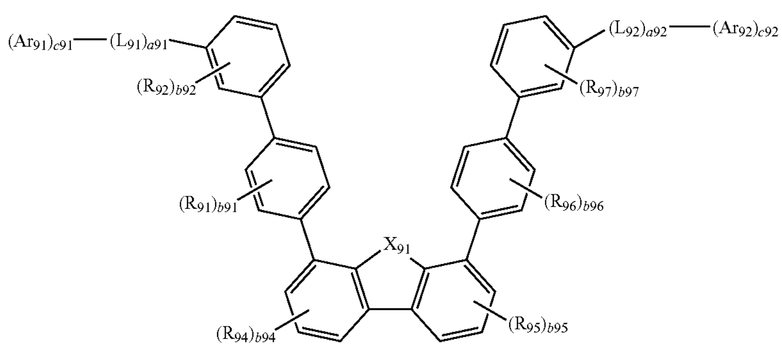
Formula 4-2(1)
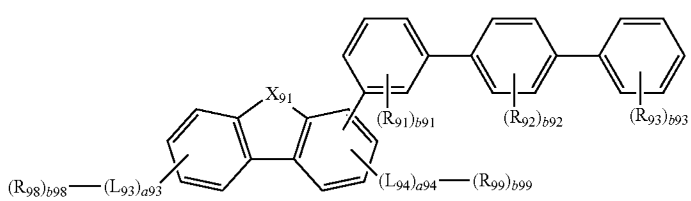
Formula 4-2(2)
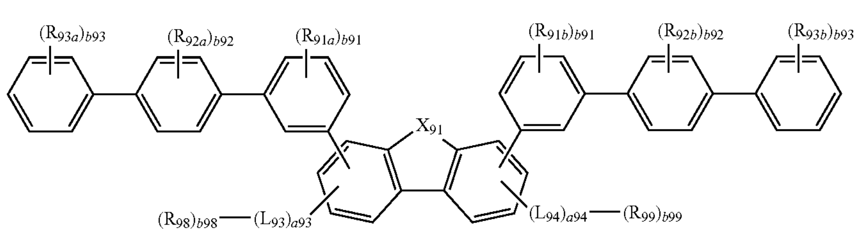

-continued

Formula 4-2(3)

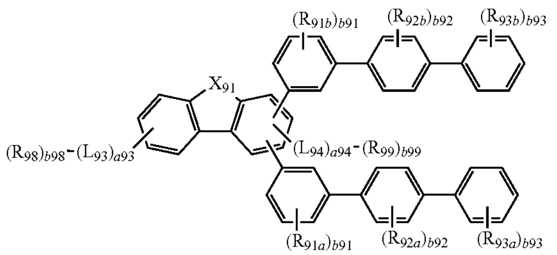

Formula 4-2(4)

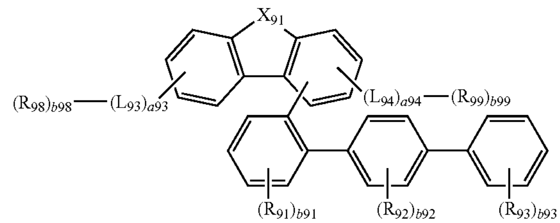

Formula 4-3(1)

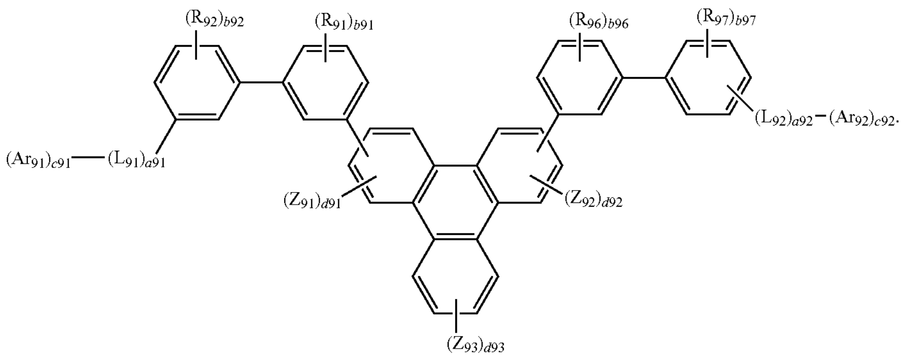

In Formulae 4-1(1), 4-1(2), 4-2(1) to 4-2(4), and 4-3(1), $X_{91}$, $L_{91}$, $L_{92}$, a91, a92, $Ar_{91}$, $Ar_{92}$, c91, c92, $R_{91}$, $R_{92}$, $R_{94}$ to $R_{97}$, $Z_{91}$ to $Z_{93}$, b91, b92, b94 to b97, and d91 to d93 may each be the same as described in the present specification.

In Formulae 1, 2, 3-1 to 3-4, and 4-1 to 4-3, $L_1$ to $L_4$, $L_{61}$, $L_{71}$ to $L_{73}$, $L_{81}$ to $L_{87}$, and $L_{91}$ to $L_{94}$ may each independently be a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

For example, in Formulae 1, 2, 3-1 to 3-4, and 4-1 to 4-3, $L_1$ to $L_4$, $L_{61}$, $L_{71}$ to $L_{73}$, $L_{81}$ to $L_{87}$, and $L_{91}$ to $L_{93}$ may each independently be a unsubstituted or substituted with at least one of $R_{10a}$, a benzene group, a heptalene group, an indene group, a naphthalene group, an azulene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, a furan group, a thiophene group, an isoindole group, an indole group, an indene group, a benzofuran group, a benzothiophene group, a benzosilole group, a naphthopyrrole group, a naphthofuran group, a naphthothiophene group, a naphthosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenantridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azacarbazole group, an azadibenzofuran group, an azadibenzothiophene group, an azadibenzosilole group, a benzonaphthofuran group, a benzonaphthothiophene group, an indolophenanthrene group, a benzofuranophenanthrene group, or a (benzothienophenanthrene group.

In an embodiment, in Formula 4-1, $L_{91}$ and $L_{92}$ may each independently be a single bond or a benzene group that is unsubstituted or substituted with at least one $R_{10a}$.

For example, in Formulae 4-1 and 4-3, $(L_{91})_{a91}$ and $(L_{92})_{a92}$ may each independently be a single bond and groups represented by Formulae 4(1) and 4(2):

4(1)

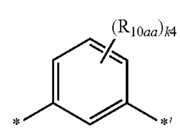

4(2)

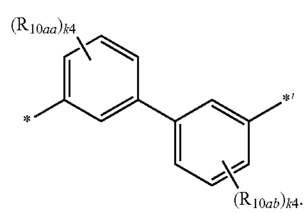

In Formulae 4(1) and 4(2), $R_{10a}$ and $R_{10ab}$ may each be the same as described in connection with $R_{10a}$, k4 may be an integer from 1 to, and

* and *' each indicate a binding site to a neighboring atom.

In Formulae 1, 2, 3-1 to 3-4, and 4-1 to 4-3, a1 to a4, a61, a71 to a73, a81 to a87, and a91 to a94 indicate the number of $L_1$ to $L_4$, the number of $L_{61}$, the number of $L_{71}$ to $L_{73}$, the number of $L_{81}$ to $L_{87}$, and the number of $L_{91}$ to $L_{94}$, respectively, and may each independently be an integer from 1 to 10.

In Formulae 1, 2, 3-1 to 3-4, 4-1 to 4-3, and 4B, $R_a$, $R_b$, $R_1$ to $R_4$, $R_{51}$ to $R_{56}$, $R_{61}$, $R_{62}$, $R_{71}$ to $R_{74}$, $R_{81}$ to $R_{86}$, $R_{91}$ to $R_{93}$, and $Z_{91}$ to $Z_{93}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$.

In an embodiment, in Formulae 1, 2, 3-1 to 3-4, 4-1 to 4-3, and 4B, $R_a$, $R_b$, $R_1$ to $R_4$, $R_{51}$ to $R_{56}$, $R_{61}$, $R_{62}$, $R_{71}$ to $R_{74}$, $R_{51}$ to $R_{86}$, $R_{91}$ to $R_{97}$, and $Z_{91}$ to $Z_{93}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group; a $C_1$-$C_{20}$ alkyl group and a $C_1$-$C_{20}$ alkoxy group, each substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a biheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or any combination thereof; a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, am azadibenzofuranyl group, an azadibenzothiophenyl group, —$Si(Q_{33})(Q_{34})(Q_{35})$, or any combination thereof; or —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, and $Q_1$ to $Q_9$ and $Q_{33}$ to $Q_{35}$ may each independently be: —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one deuterium, a $C_1$-$C_{10}$ alkyl group, a phenyl group, or any combination thereof.

In one or more embodiments, in Formulae 1, 2, 3-1 to 3-4, 4-1 to 4-3, and 4B, $R_a$, $R_b$, $R_1$ to $R_4$, $R_{51}$ to $R_{56}$, $R_{61}$, $R_{62}$, $R_{71}$ to $R_{74}$, $R_{81}$ to $R_{86}$, $R_{91}$ to $R_{97}$, and $Z_{91}$ to $Z_{93}$ may each independently be hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, a group represented by one of Formulae 9-1 to 9-66, a group represented by one of Formulae 9-1 to 9-66 in which at least one hydrogen is substituted with deuterium, a group represented by one of Formulae 10-1 to 10-249, a group represented by one of Formulae 10-1 to 10-249 in which at least one hydrogen is substituted with deuterium, —N($Q_1$)($Q_2$), —Si($Q_3$)($Q_4$)($Q_5$), or —B($Q_6$)($Q_7$):

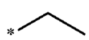
9-1

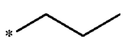
9-2

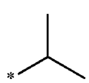
9-3

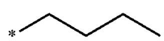
9-4

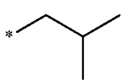
9-5

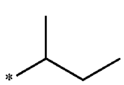
9-6

9-7

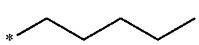
9-8

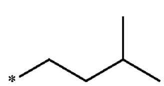
9-9

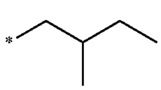
9-10

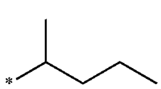
9-11

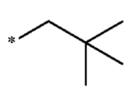
9-12

-continued

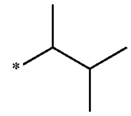
9-13

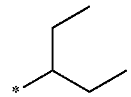
9-14

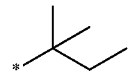
9-15

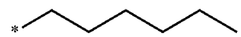
9-16

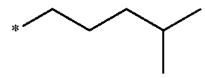
9-17

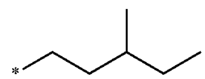
9-18

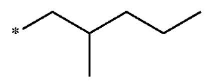
9-19

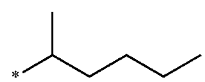
9-20

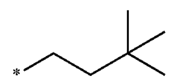
9-21

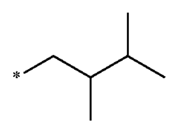
9-22

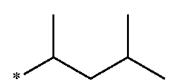
9-23

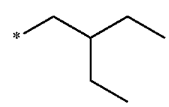
9-24

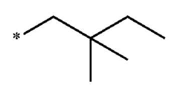
9-25

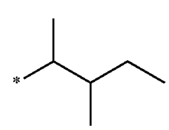
9-26

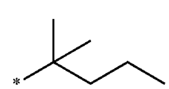
9-27

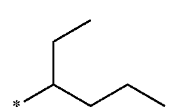
9-28

-continued
9-29
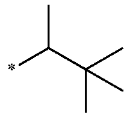
9-30
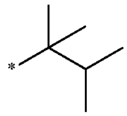
9-31
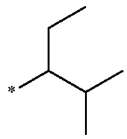
9-32
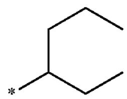
9-33
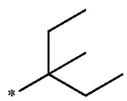
9-34
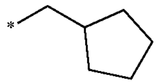
9-35
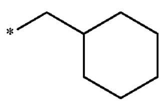
9-36
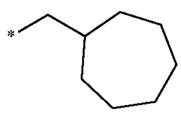
9-37
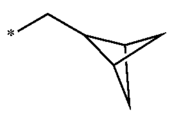
9-38
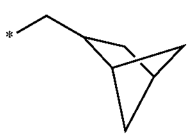
9-39
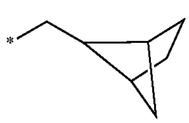
9-40
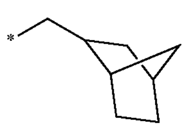
9-41
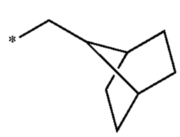
-continued
9-42
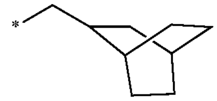
9-43
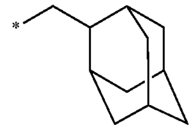
9-44
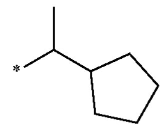
9-45
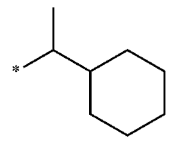
9-46
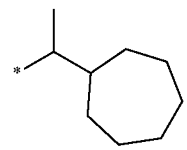
9-47
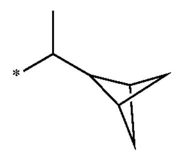
9-48
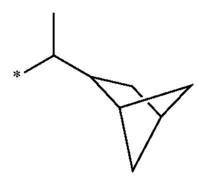
9-49
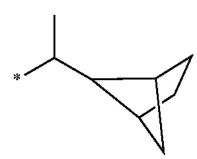
9-50
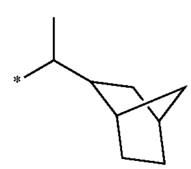
9-51
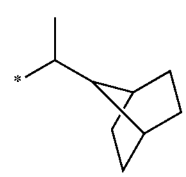

-continued
9-52
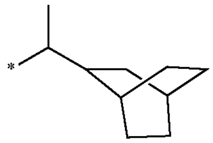
9-53
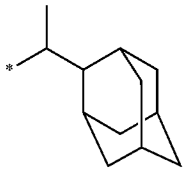
9-54
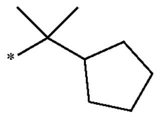
9-55
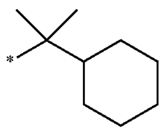
9-56
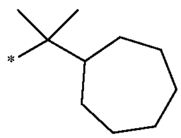
9-57
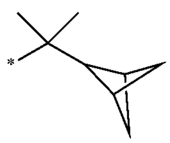
9-58
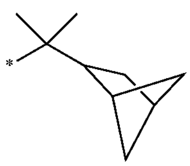
9-59
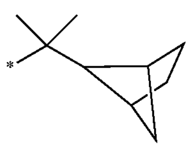
9-60
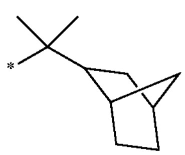
9-61
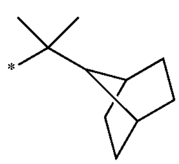
-continued
9-62
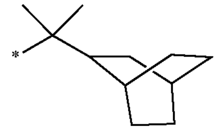
9-63
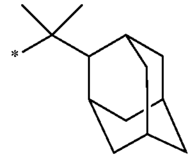
9-64
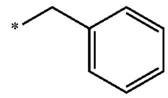
9-65
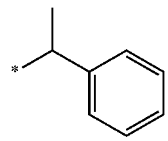
9-66
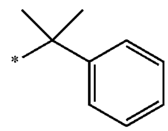
10-2
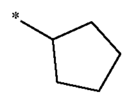
10-3
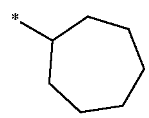
10-4
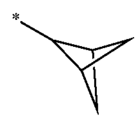
10-5
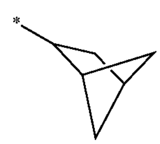
10-6
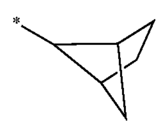
10-7
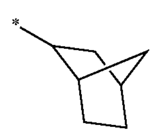
10-8
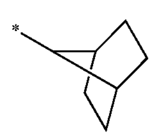

-continued
10-9
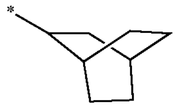
10-10
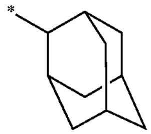
10-11
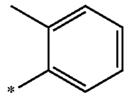
10-12
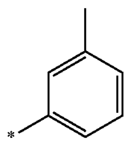
10-13
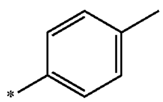
10-14
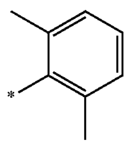
10-15
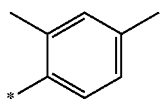
10-16
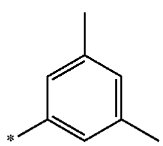
10-17
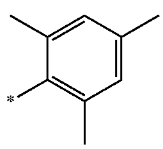
10-18
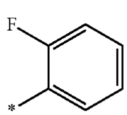
10-19
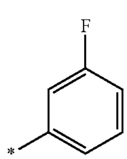
10-20
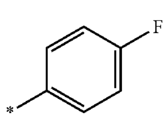
-continued
10-21
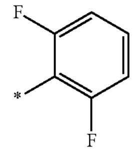
10-22
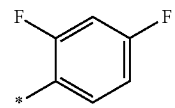
10-23
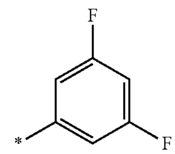
10-24
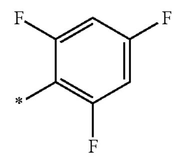
10-25
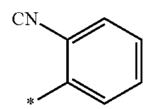
10-26
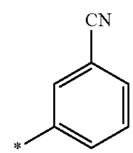
10-27
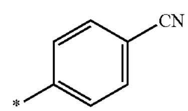
10-28
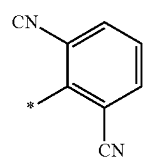
10-29
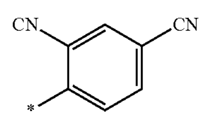
10-30
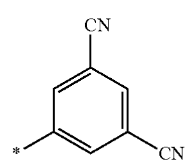
10-31
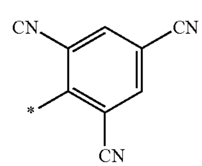

-continued
10-32
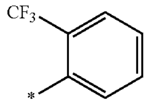
10-33
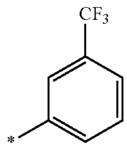
10-34
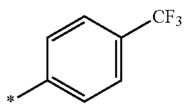
10-35
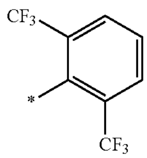
10-36
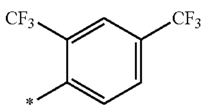
10-37
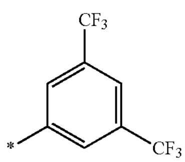
10-38
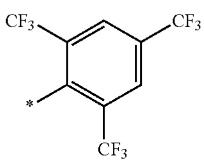
10-39
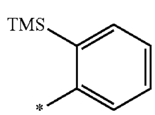
10-40
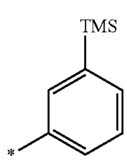
10-41
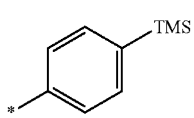
10-42
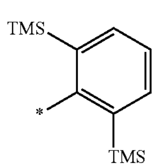
-continued
10-43
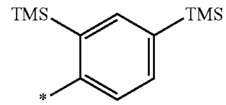
10-44
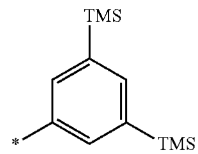
10-45
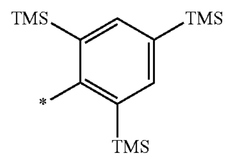
10-46
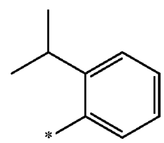
10-47
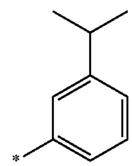
10-48
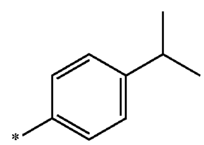
10-49
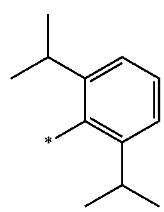
10-50
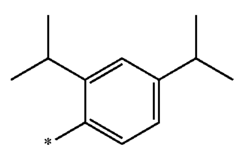
10-51
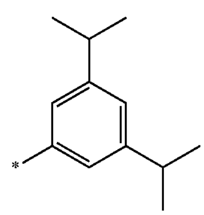

-continued
10-52
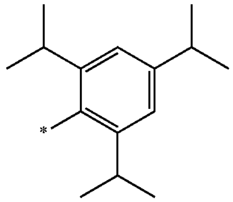
10-53
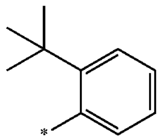
10-54
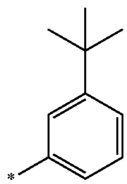
10-55
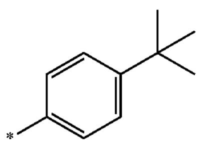
10-56
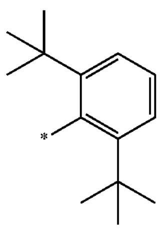
10-57
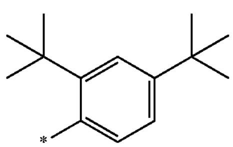
10-58
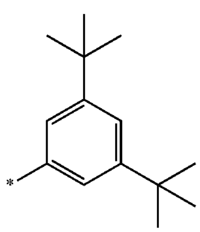
10-59
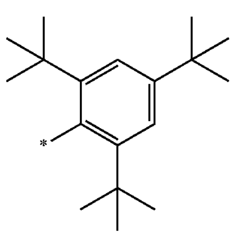
-continued
10-60
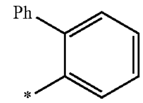
10-61
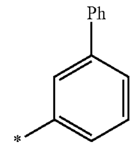
10-62
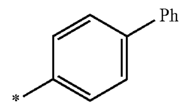
10-63
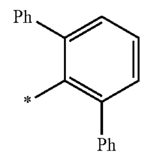
10-64
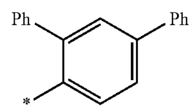
10-65
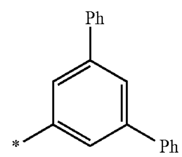
10-66
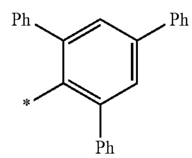
10-67
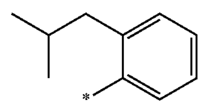
10-68
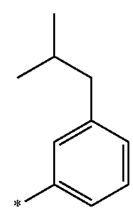
10-69
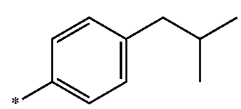
10-70
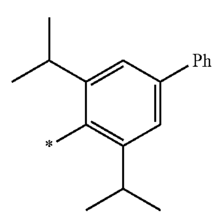

-continued
10-71
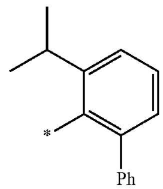
10-72
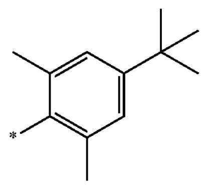
10-73
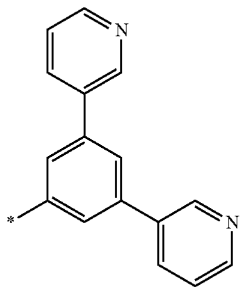
10-74
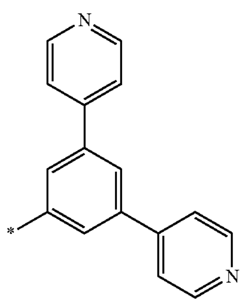
10-75
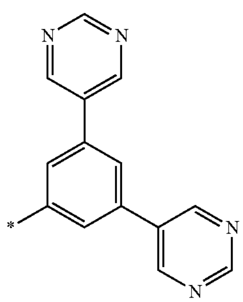
10-76
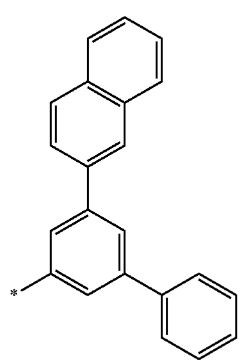
-continued
10-77
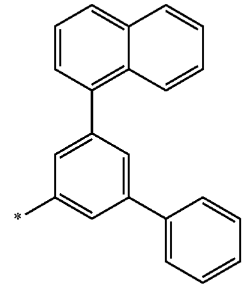
10-78
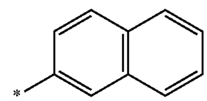
10-79
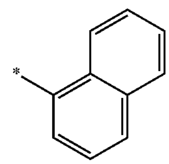
10-80
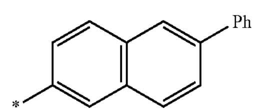
10-81
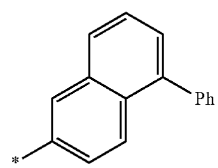
10-82
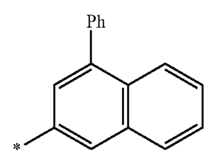
10-83
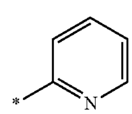
10-84
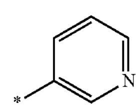
10-85
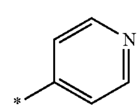
10-86
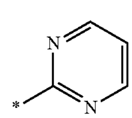
10-87
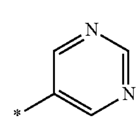

-continued
10-88
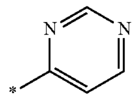
10-89
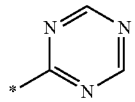
10-90
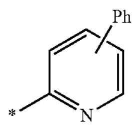
10-91
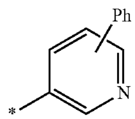
10-92
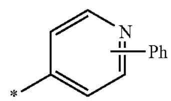
10-93
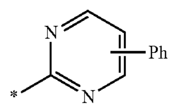
10-94
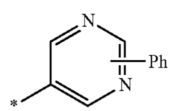
10-95
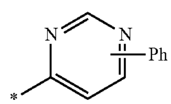
10-96
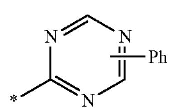
10-97
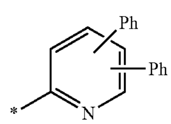
10-98
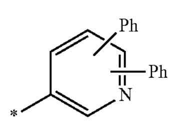
10-99
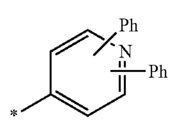
10-100
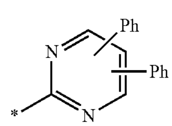
-continued
10-101
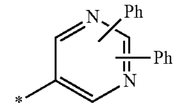
10-102
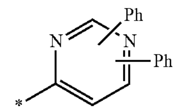
10-103
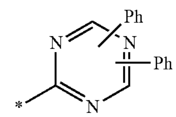
10-104
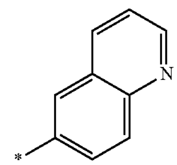
10-105
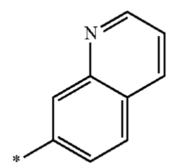
10-106
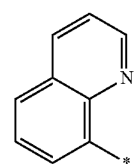
10-107
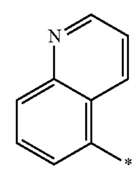
10-108
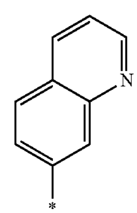
10-109
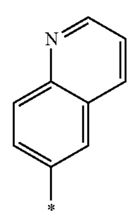

-continued
10-110
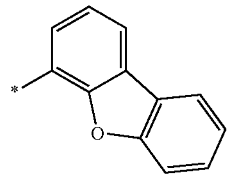
10-111
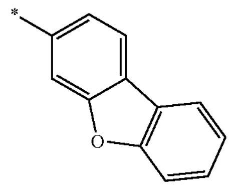
10-112
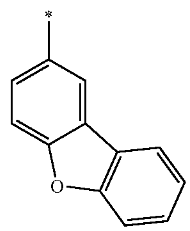
10-113
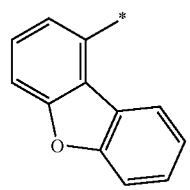
10-114
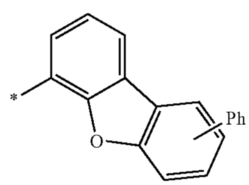
10-115
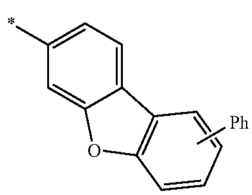
10-116
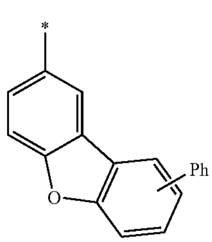
10-117
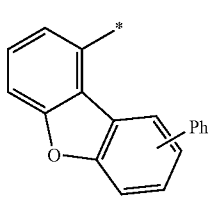
-continued
10-118
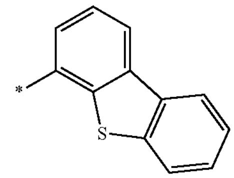
10-119
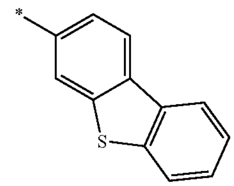
10-120
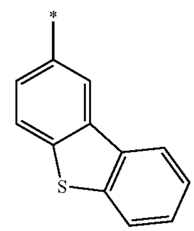
10-121
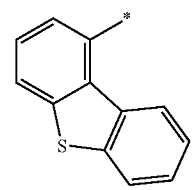
10-122
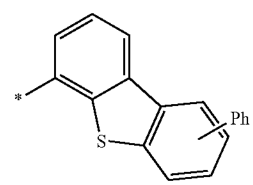
10-123
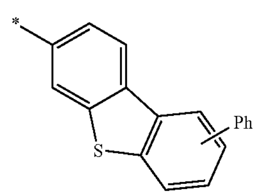
10-124
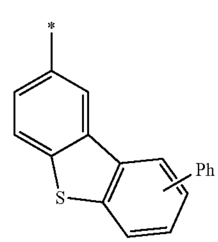
10-125
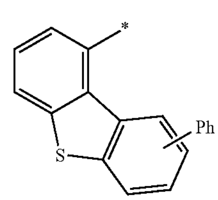

-continued
10-126
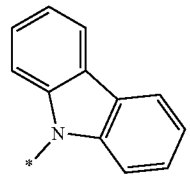
10-127
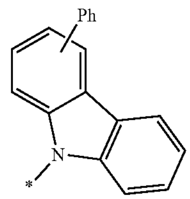
10-128
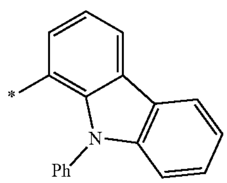
10-129
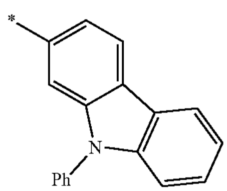
10-130
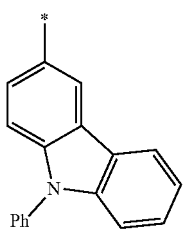
10-131
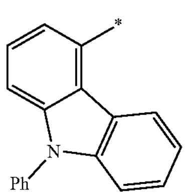
10-132
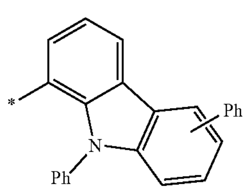
10-133
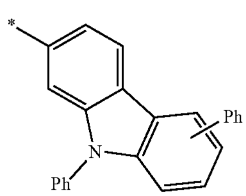
-continued
10-134
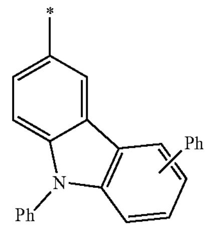
10-135
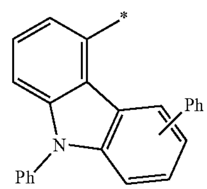
10-136
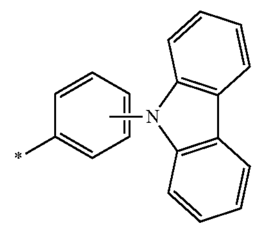
10-137
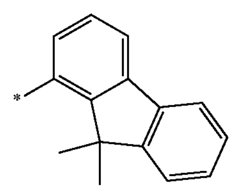
10-138
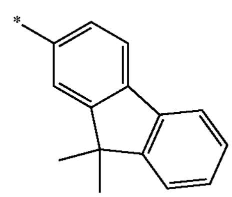
10-139
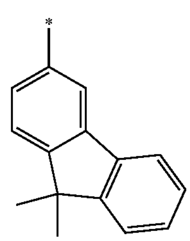
10-140
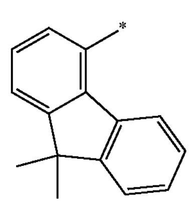

-continued
10-141
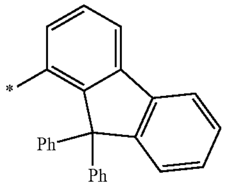
10-142
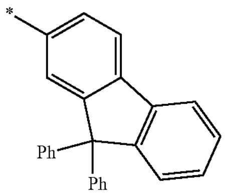
10-143
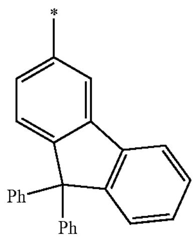
10-144
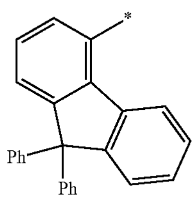
10-145
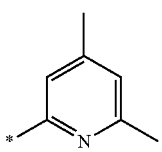
10-146
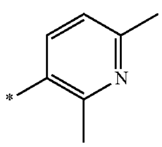
10-147
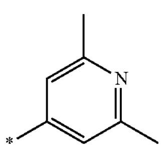
10-148
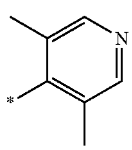
10-149
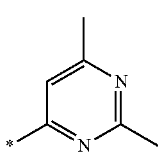
-continued
10-150
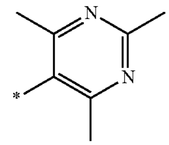
10-151
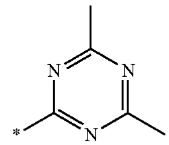
10-152
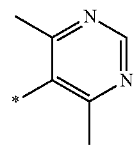
10--153
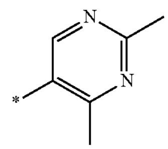
10-154
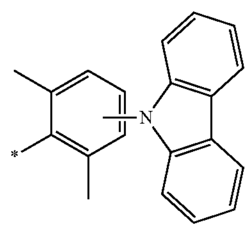
10-155
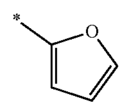
10-156
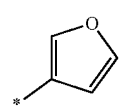
10-157
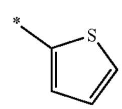
10-158
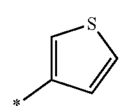
10-159
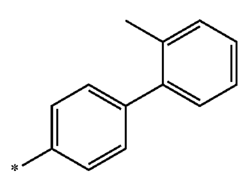

10-160
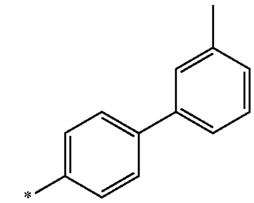
10-161
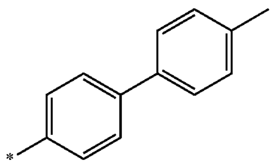
10-162
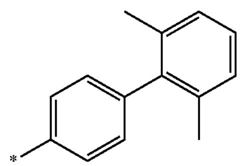
10-163
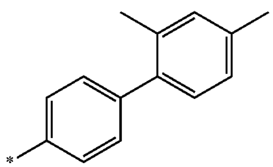
10-164
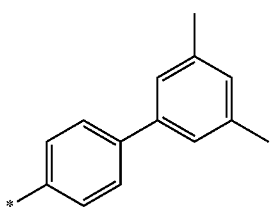
10-165
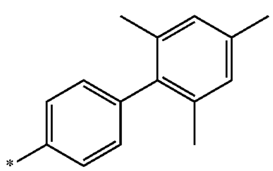
10-166
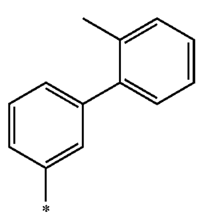
10-167
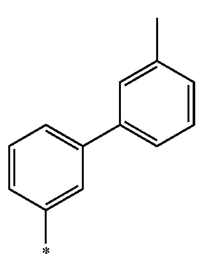
10-168
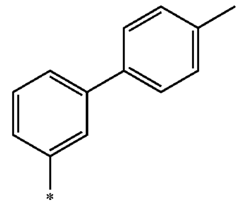
10-169
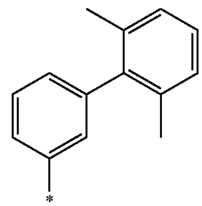
10-170
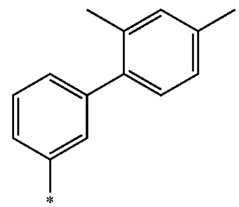
10-171
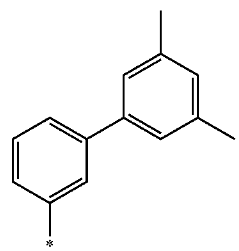
10-172
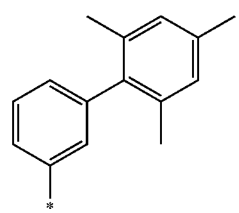
10-173
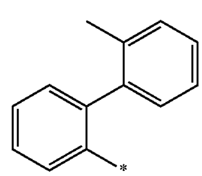
10-174
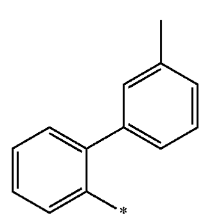

-continued
10-175
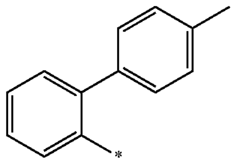
10-176
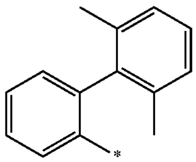
10-177
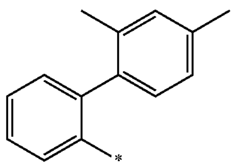
10-178
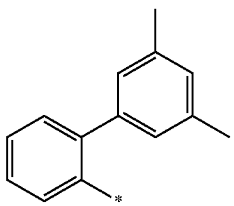
10-179
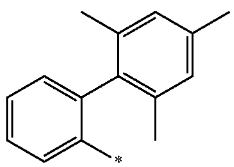
10-180
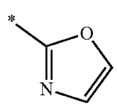
10-181
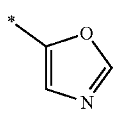
10-182
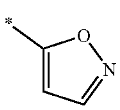
10-183
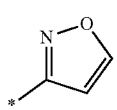
10-184
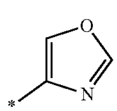
10-185
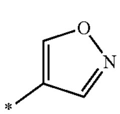
-continued
10-186
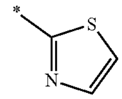
10-187
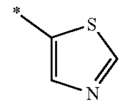
10-188
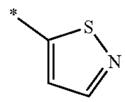
10-189
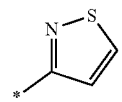
10-190
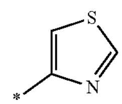
10-191
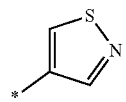
10-192
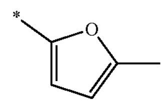
10-193
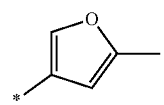
10-194
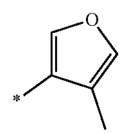
10-195
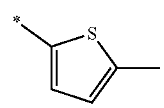
10-196
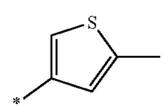
10-197
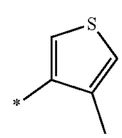
10-198
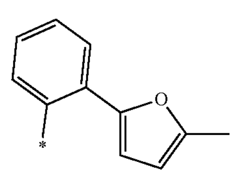

-continued
10-199
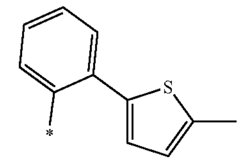
10-200
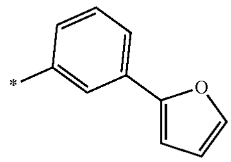
10-201
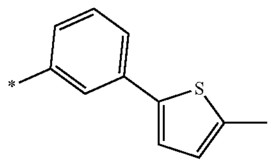
10-202
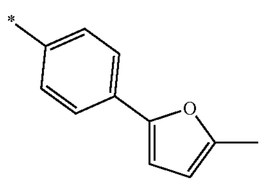
10-203
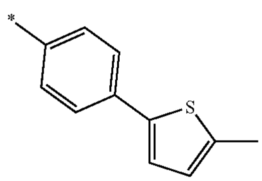
10-204
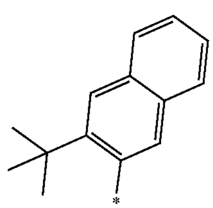
10-205
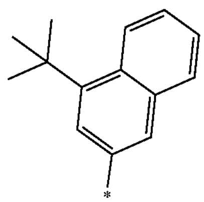
10-206
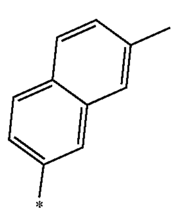
-continued
10-207
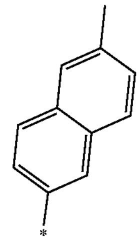
10-208
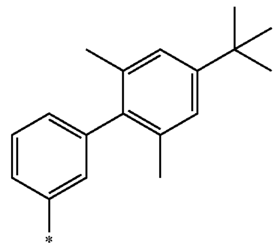
10-209
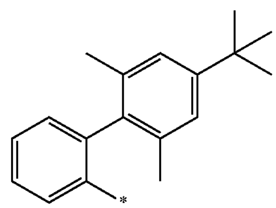
10-210
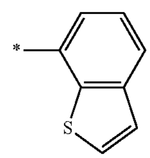
10-211
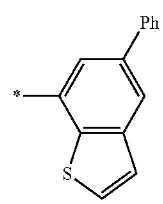
10-212
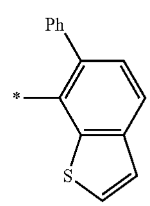
10-213
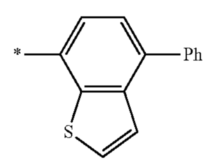

-continued
10-214
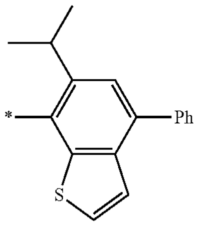
10-215
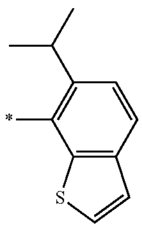
10-216
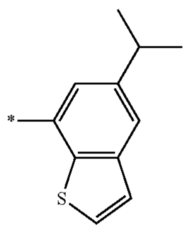
10-217
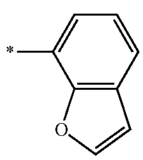
10-218
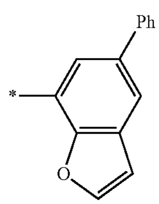
10-219
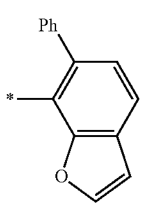
10-220
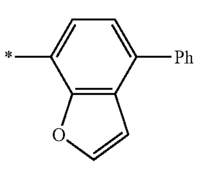
-continued
10-221
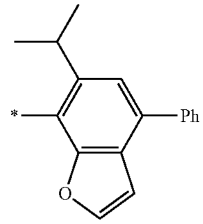
10-222
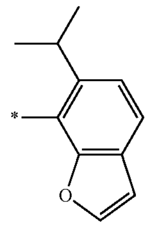
10-223
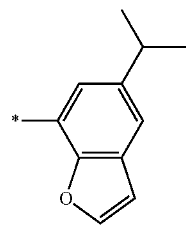
10-224
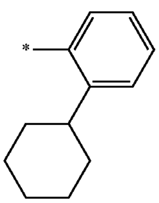
10-225
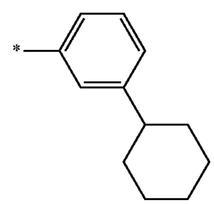
10-226
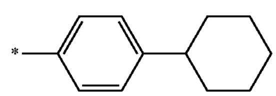
10-227
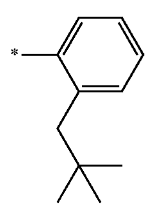
10-228
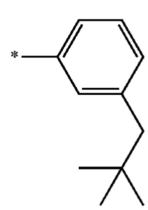

-continued
10-229
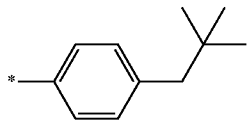
10-230
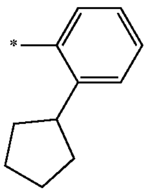
10-231
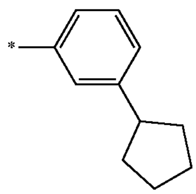
10-232
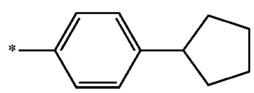
10-233
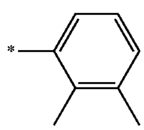
10-234
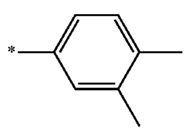
10-235
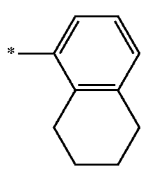
10-236
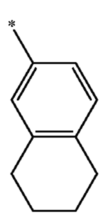
10-237
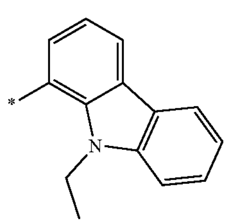
-continued
10-238
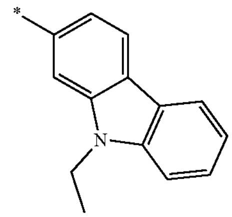
10-239
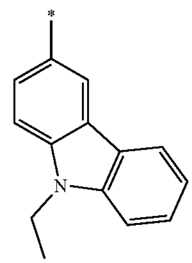
10-240
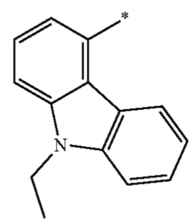
10-241
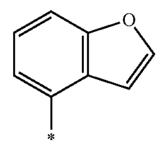
10-242
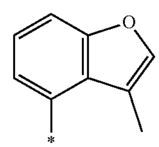
10-243
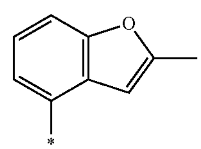
10-244
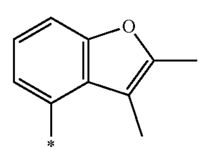
10-245
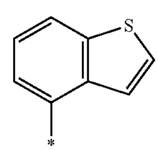
10-246
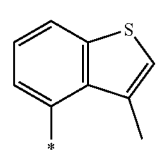

-continued 10-247

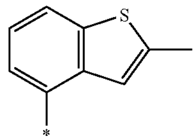

10-248

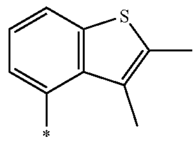

10-249

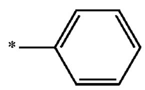

wherein $Q_1$ to $Q_7$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CH_3$, —$CD_2CD_3$, —$CD_2CD_2H$, or —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with at least one deuterium, a $C_1$-$C_{10}$ alkyl group, a phenyl group, or any combination thereof.

In Formulae 9-1 to 9-66 and 10-1 to 10-249,

* indicates a binding site to a neighboring atom, i-Pr is an isopropyl group, and t-Bu is a t-butyl group, Ph is a phenyl group, 1-Nph is a 1-naphthyl group, and 2-Nph is a 2-naphthyl group, 2-Pyr is a 2-pyridyl group, 3-Pyr is a 3-pyridyl group, and 4-Pyr is a 4-pyridyl group, and TMS is a trimethylsilyl group.

The "group represented by one of Formulae 9-1 to 9-66 in which at least one hydrogen is substituted with deuterium" may be a group represented by one of Formulae 9-501 to 9-552:

9-501

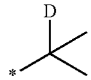

9-502

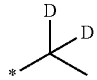

9-503

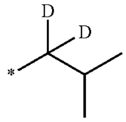

-continued 9-504

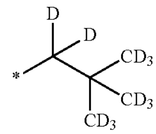

9-505

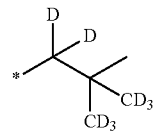

9-506

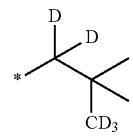

9-507

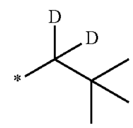

9-508

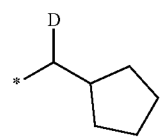

9-509

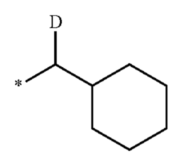

9-510

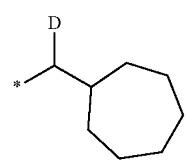

9-511

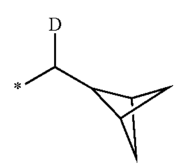

9-512

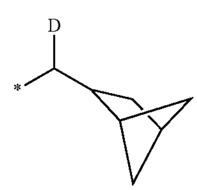

9-513

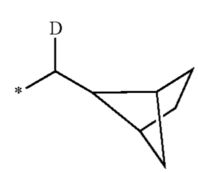

-continued
9-514
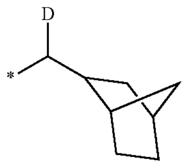
9-515
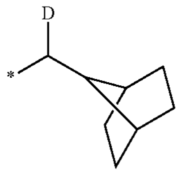
9-516
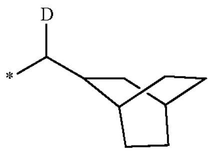
9-517
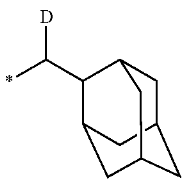
9-518
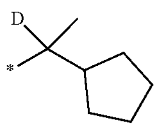
9-519
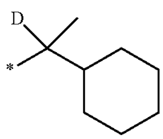
9-520
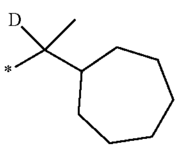
9-521
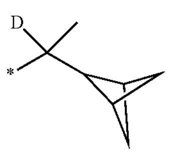
9-522
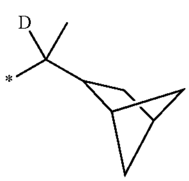
9-523
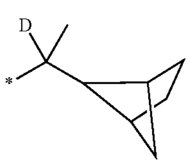
-continued
9-524
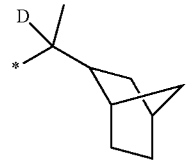
9-525
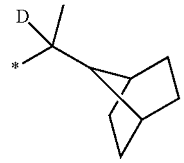
9-526
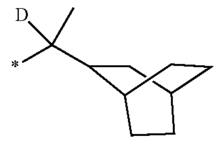
9-527
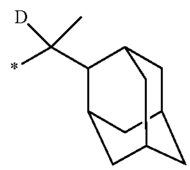
9-528
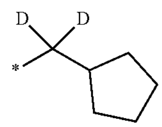
9-529
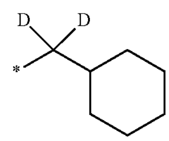
9-530
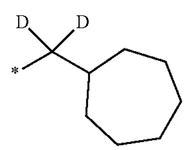
9-531
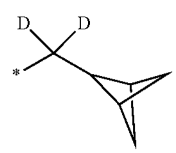
9-532
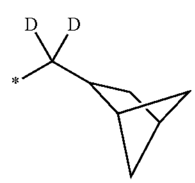
9-533
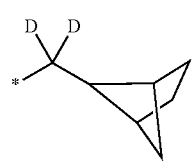

-continued
9-534
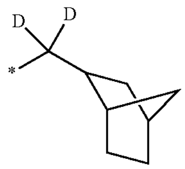
9-535
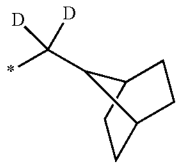
9-536
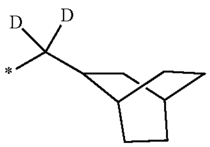
9-537
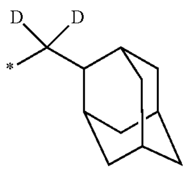
9-538
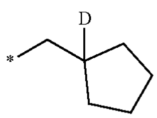
9-539
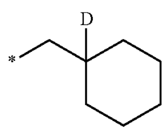
9-540
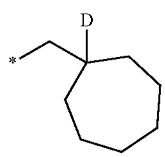
9-541
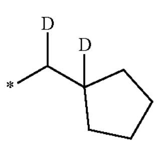
9-542
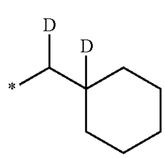
9-543
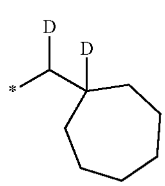
-continued
9-544
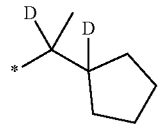
9-545
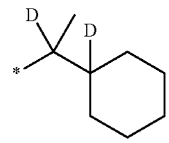
9-546
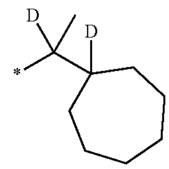
9-547
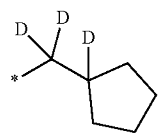
9-548
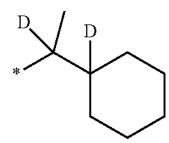
9-549
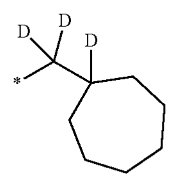
9-550
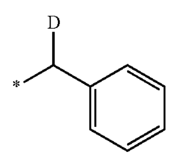
9-551
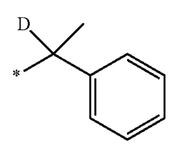
9-552
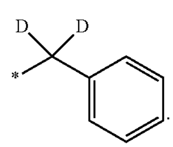
The "group represented by one of Formulae 10-1 to 10-249 in which at least one hydrogen is substituted with deuterium" may be a group represented by one of Formulae 10-501 to 10-513:

-continued 10-501

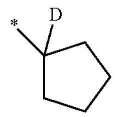

10-502

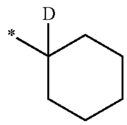

10-503

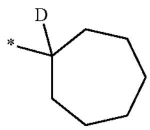

10-504

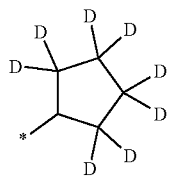

10-505

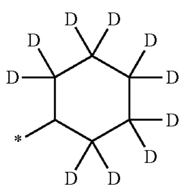

10-506

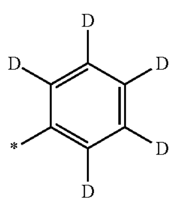

10-507

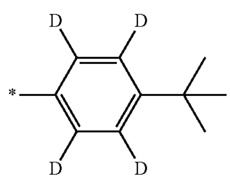

10-508

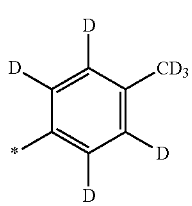

10-509

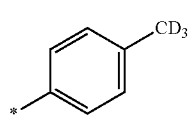

10-510

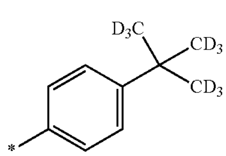

10-511

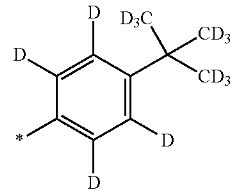

10-512

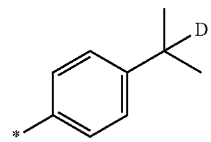

10-513

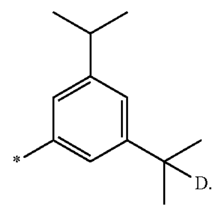

In Formulae 1, 2, 3-1 to 3-4, and 4-2, b1 to b4, b61, b62, b71, b72, b81 to b86, b98, and b99 indicate the number of $R_1$ to $R_4$, the number of $R_{61}$, the number of $R_{62}$, the number of $R_{71}$, the number of $R_{72}$, the number of $R_{51}$ to $R_{86}$, the number of $R_{98}$, and the number of $R_{99}$, respectively, and may each independently be an integer from 1 to 10.

In Formulae 4-1, 4-3, and 4B, b91, b92, b96, and d93 indicate the number of $R_{91}$, the number of $R_{92}$, the number of $R_{96}$, and the number of $Z_{93}$, respectively, and may each independently be an integer from 1 to 4.

In Formulae 4-1 and 4B, b93 and b97 indicate the number of $R_{93}$ and the number of $R_{97}$, respectively, and may each independently be an integer from 1 to 5.

In Formulae 4-1 and 4-3, n91 indicates the number of a group represented by $*\text{-}(L_{92})_{a92}\text{—}(Ar_{92})_{c92}$, and may be an integer from 0 to 5.

In Formulae 4-1 and 4-3, b94, b95, d91, and d92 indicate the number of $R_{94}$, the number of $R_{95}$, the number of $R_{91}$, and the number of $Z_{92}$, respectively, and may each independently be an integer from 1 to 3.

In Formula 1, two or more groups $R_a$, $R_b$, $R_1$ to $R_4$, and $R_{51}$ to $R_{56}$ may optionally be linked together to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$.

$R_{10a}$ may be the same as described in connection with $R_1$.

* and *' each indicate a binding site to a neighboring atom.

In the present specification, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(=O)(Q_2)(Q_{29})$, or any combination thereof; or —$N(Q_{31})(Q_{32})$, —$Si(Q_{33})(Q_{34})(Q_{35})$, —$B(Q_{36})(Q_{37})$, or —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one deuterium, a $C_1$-$C_{60}$ alkyl group, a $C_6$-$C_{60}$ aryl group, or any combination thereof, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one deuterium, a $C_1$-$C_{60}$ alkyl group, a $C_6$-$C_{60}$ aryl group, or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

The platinum-containing organometallic compound may be one of Compounds 1-1 to 1-88, 2-1 to 2-47, 3-1 to 3-591, 4-1 to 4-3344, and D1 to D24, but embodiments of the present disclosure are not limited thereto:

1-1

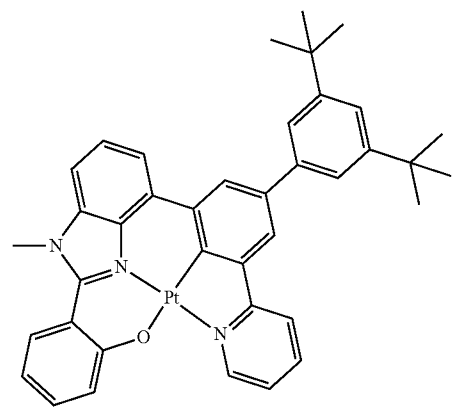

1-2

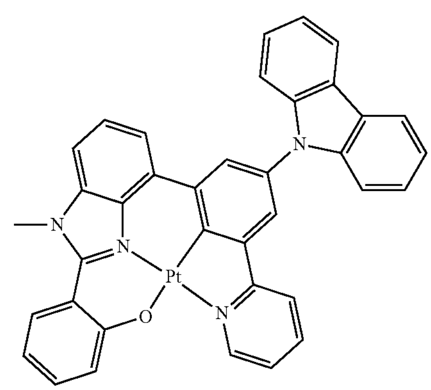

1-3

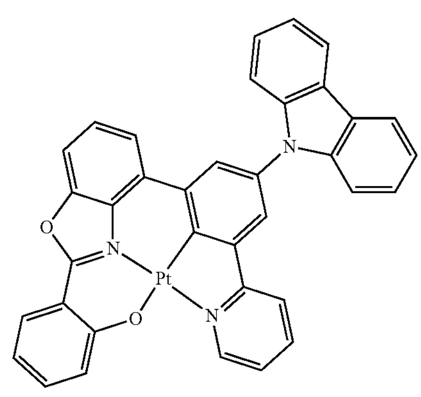

-continued
1-4
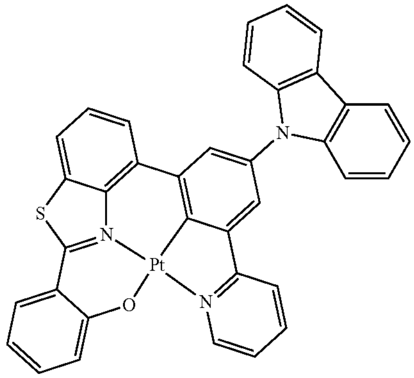
1-5
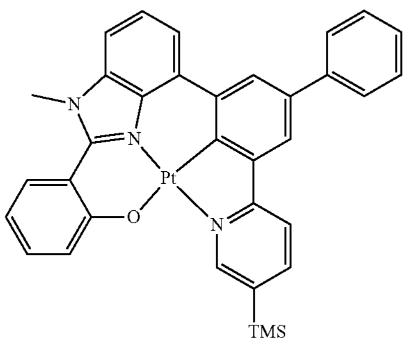
1-6
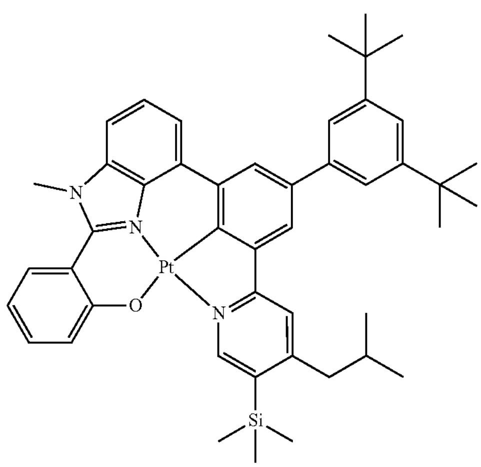
1-7
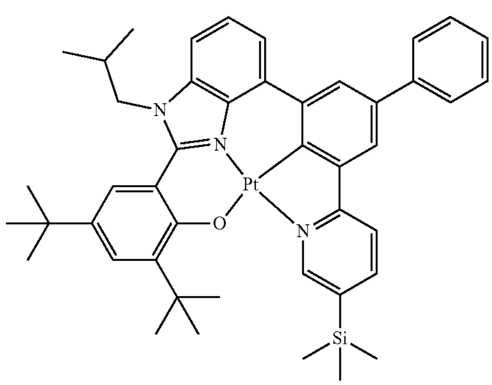
-continued
1-8
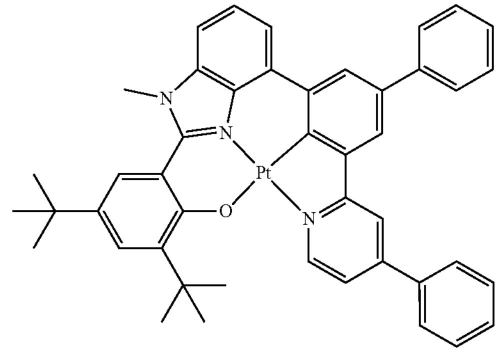
1-9
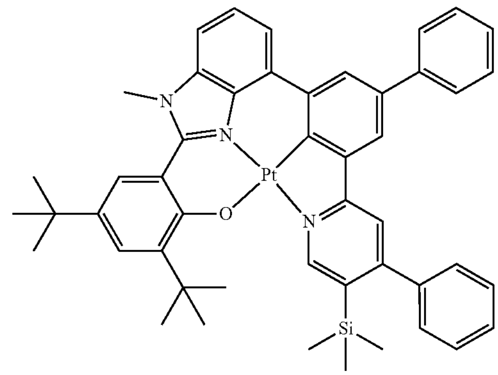
1-10
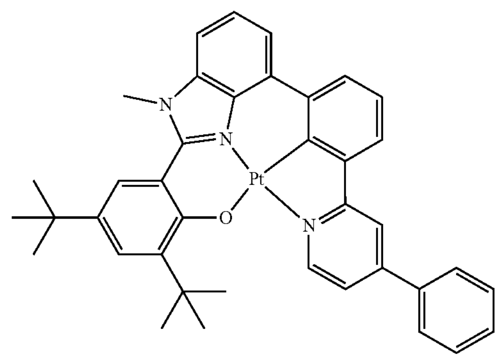
1-11
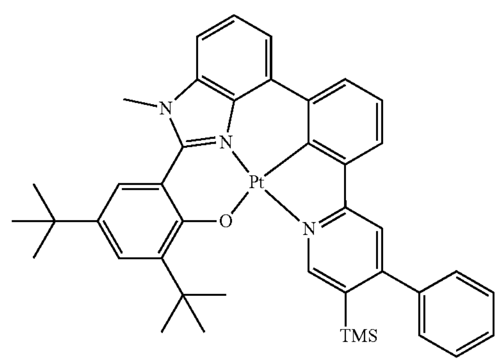

-continued
1-12
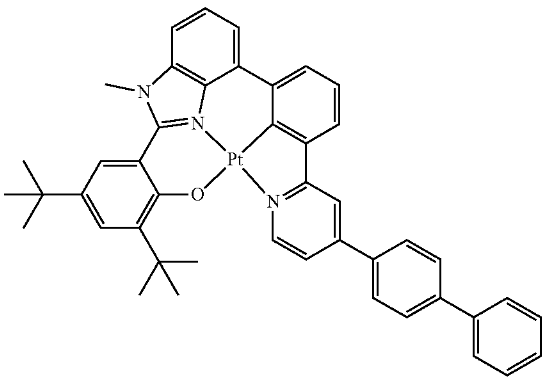
1-13
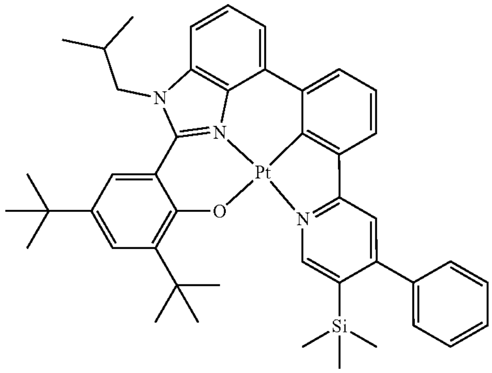
1-14
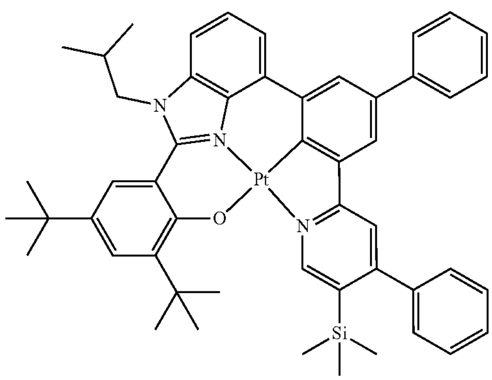
1-15
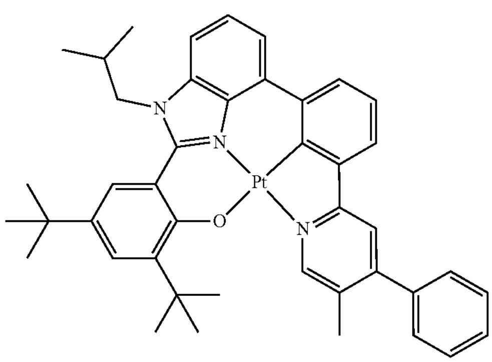
-continued
1-16
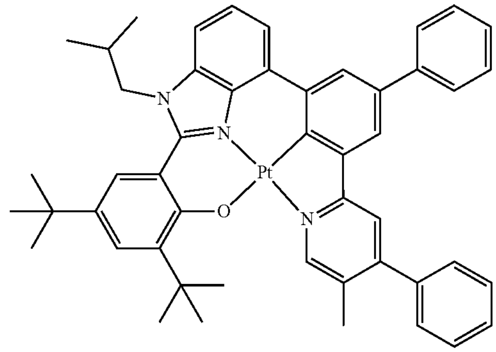
1-17
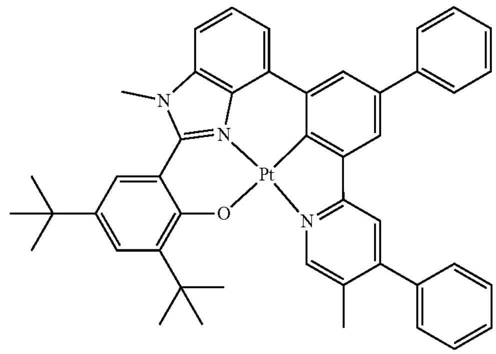
1-18
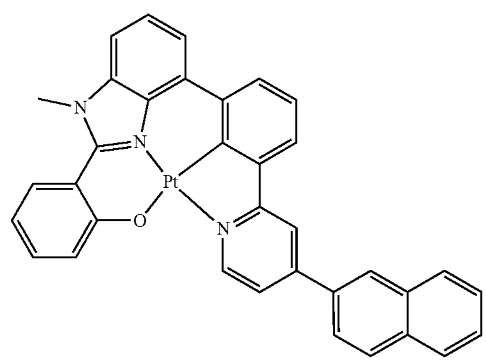
1-19
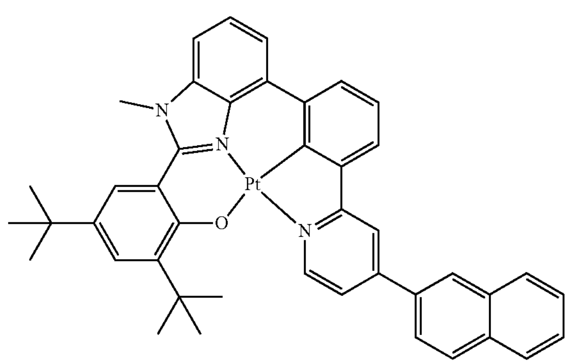

-continued
1-20
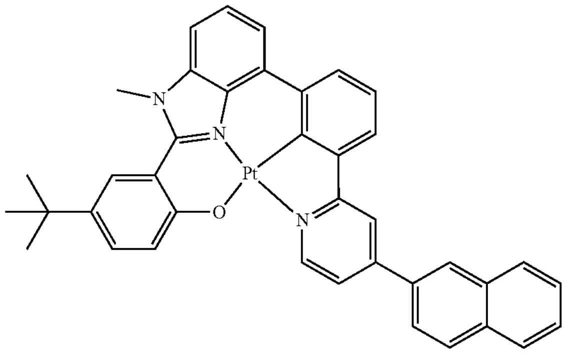
1-21
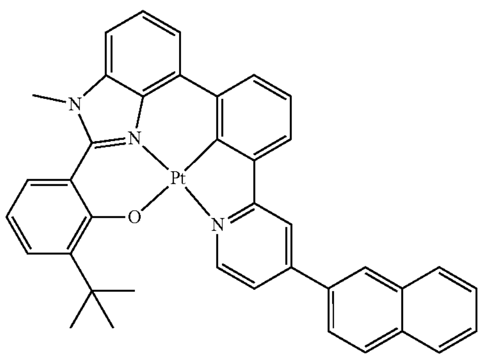
1-22
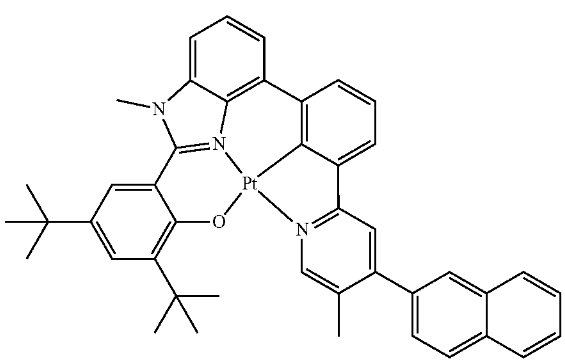
1-23
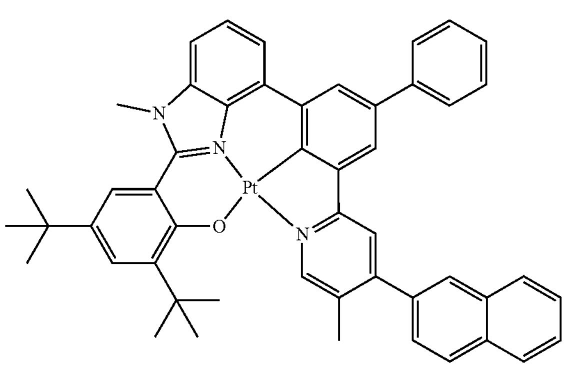
-continued
1-24
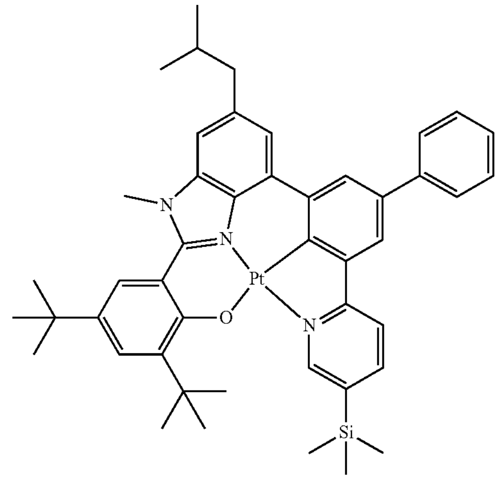
1-25
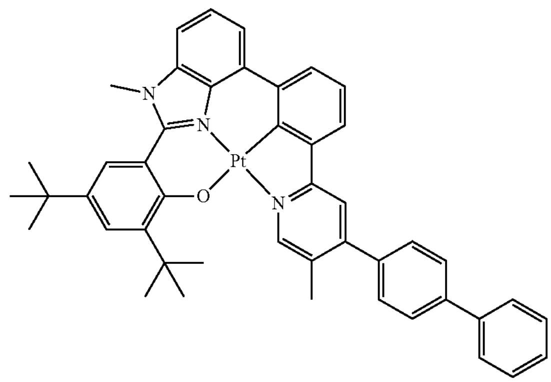
1-26
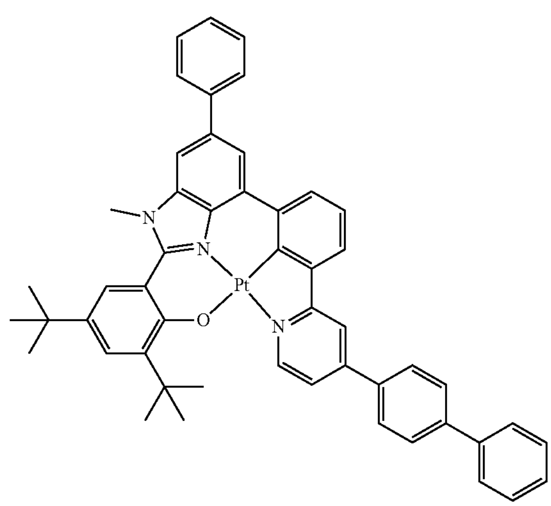

1-27
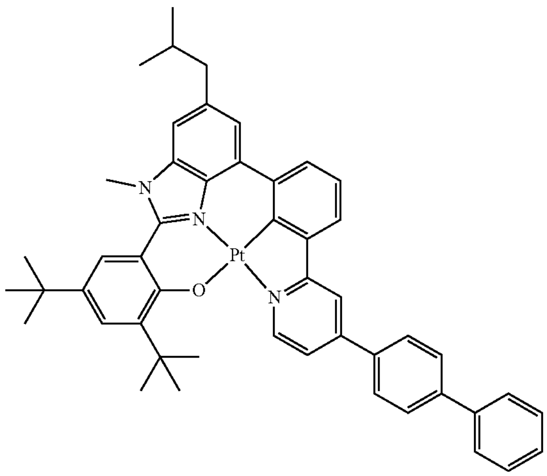
1-28
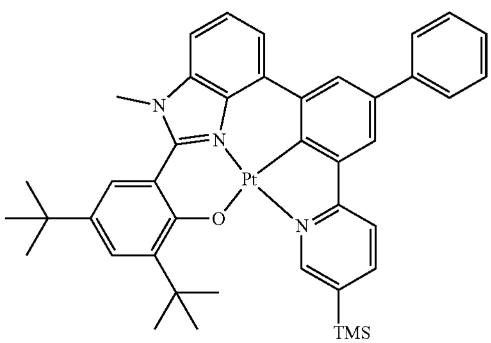
1-29
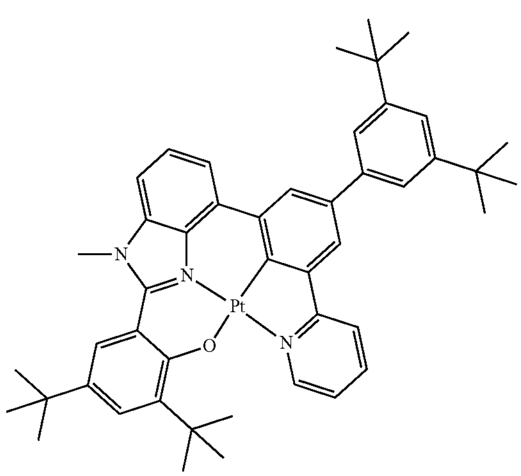
1-30
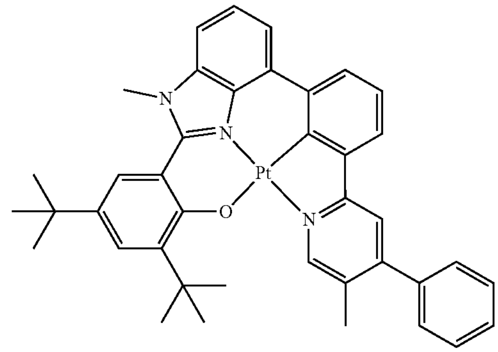
1-31
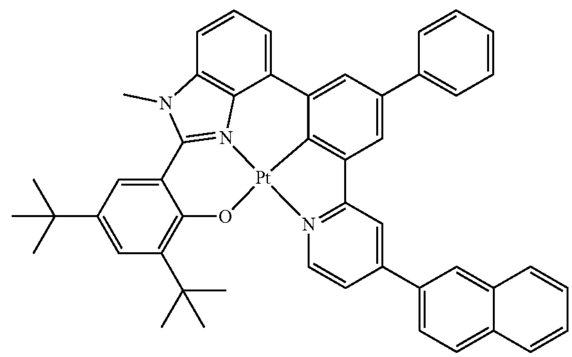
1-32
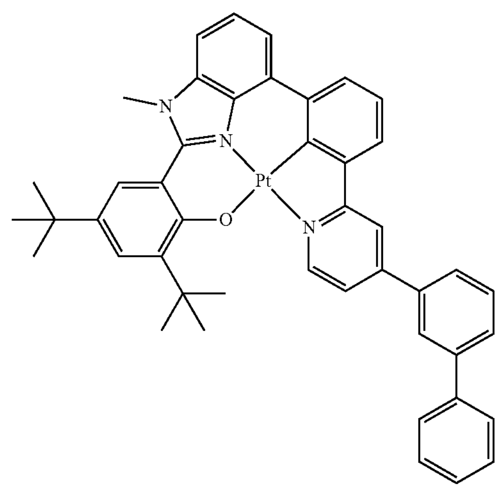
1-33
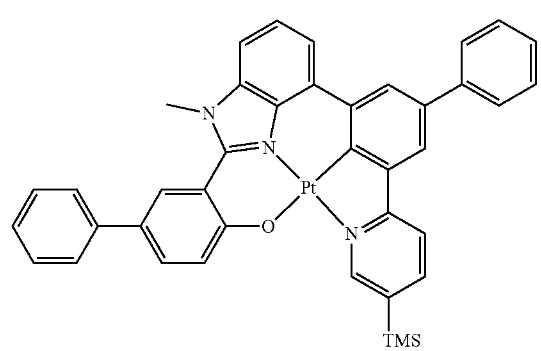

-continued
1-34
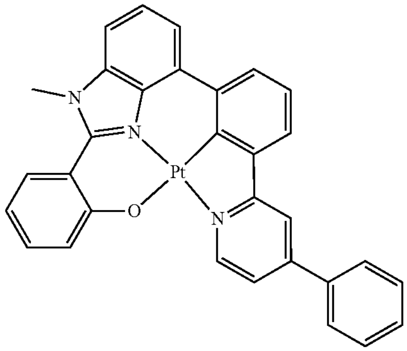
1-35
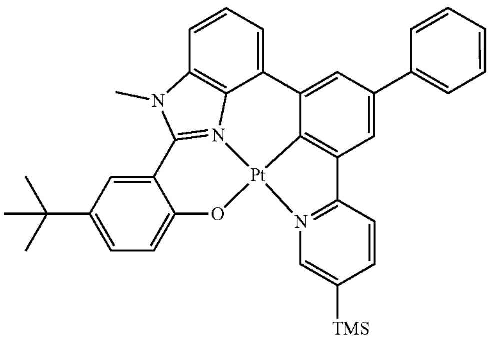
1-36
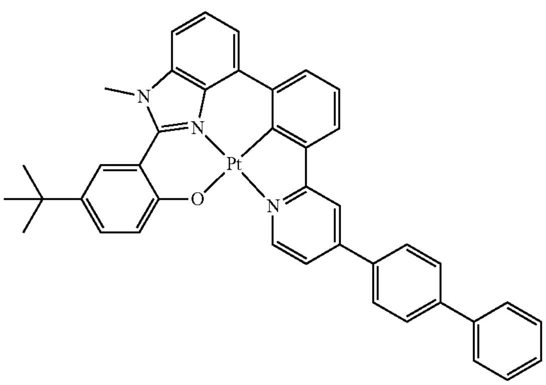
1-37
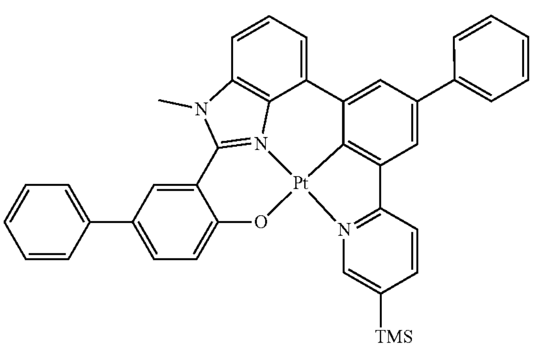
-continued
1-38
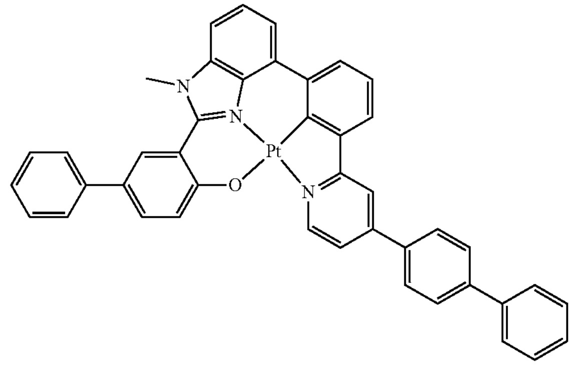
1-39
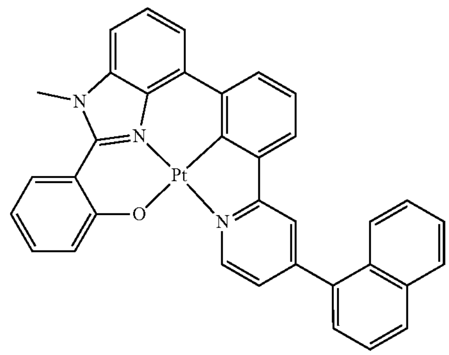
1-40
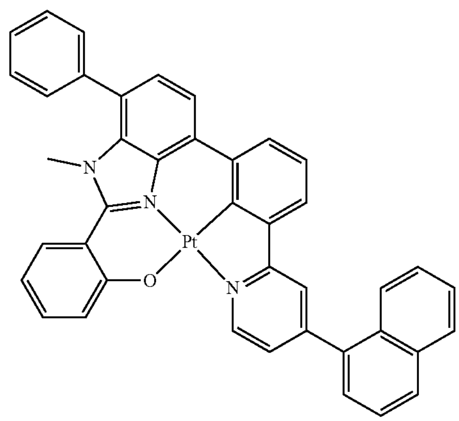
1-41
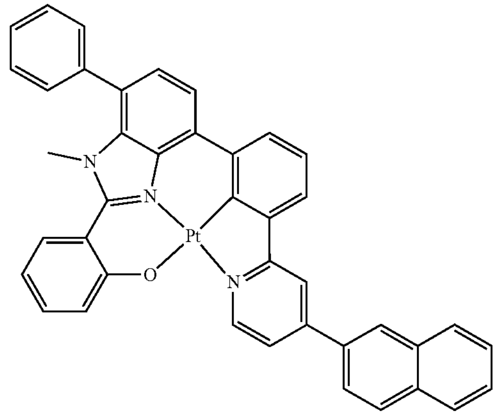

-continued
1-42
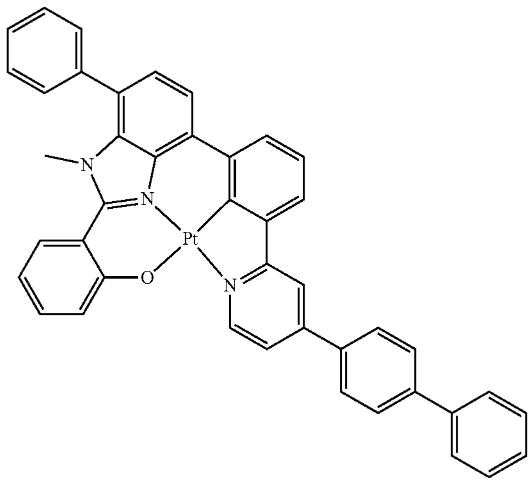
1-43
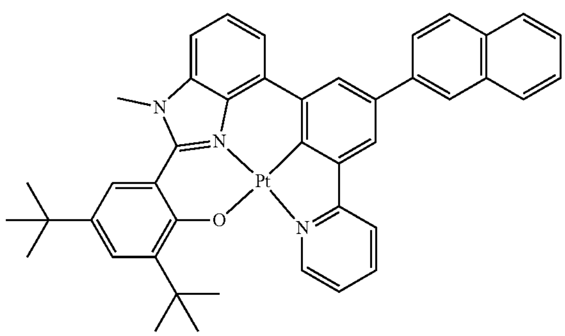
1-44
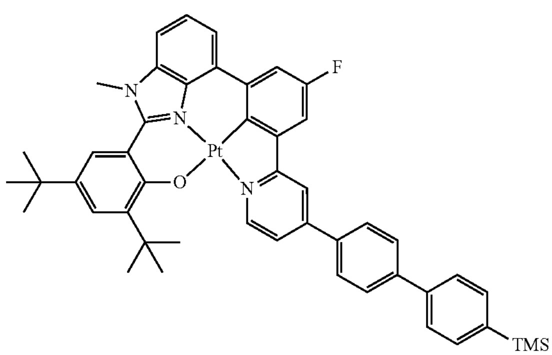
1-45
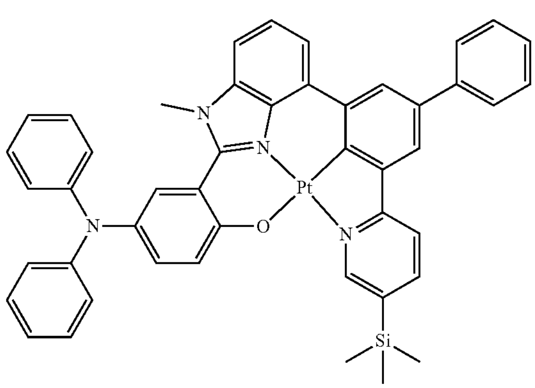
-continued
1-46
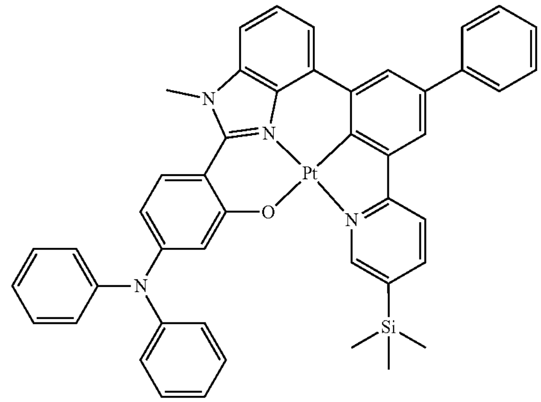
1-47
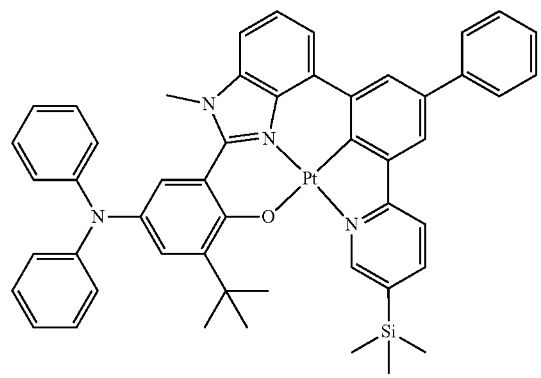
1-48
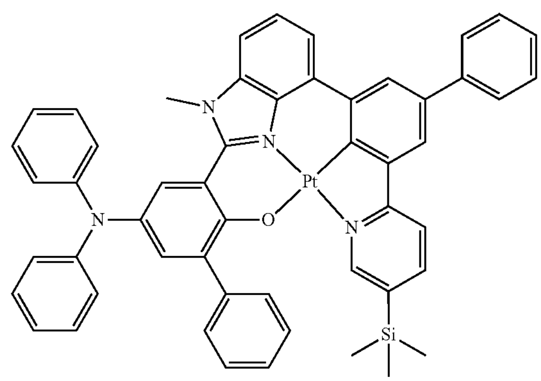
1-49
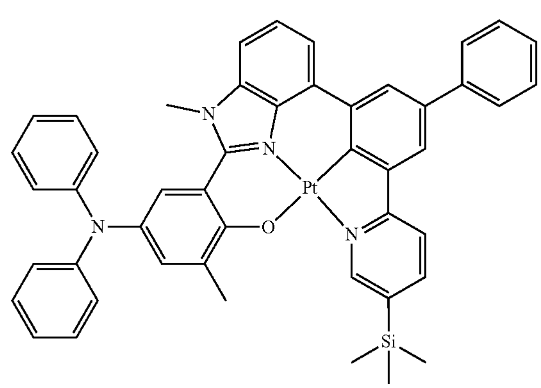

-continued
1-50
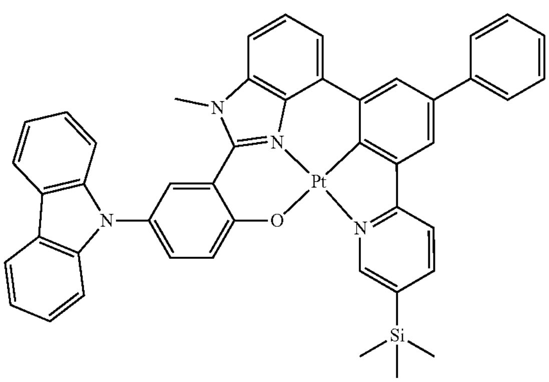
1-51
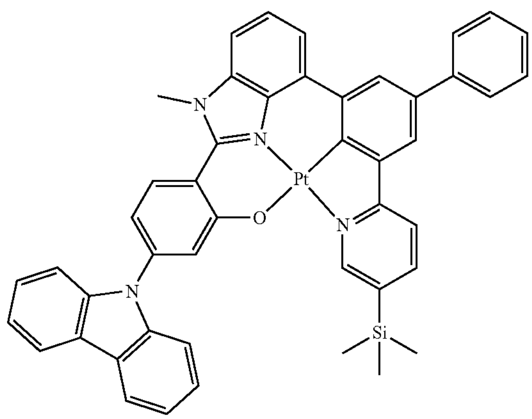
1-52
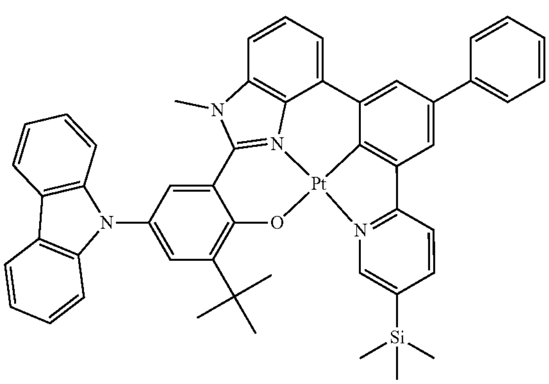
1-53
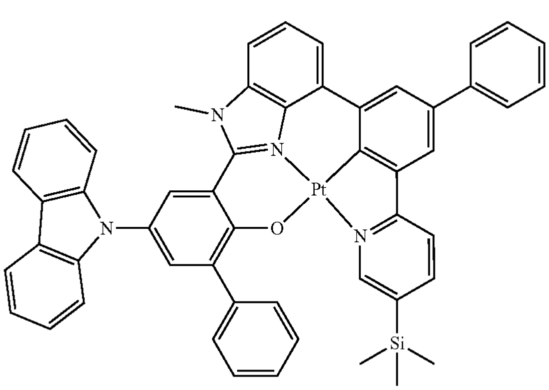
-continued
1-54
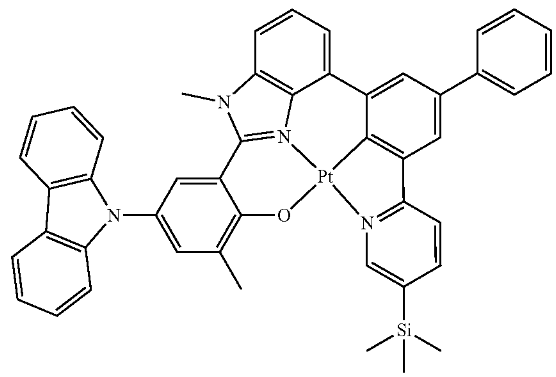
1-55
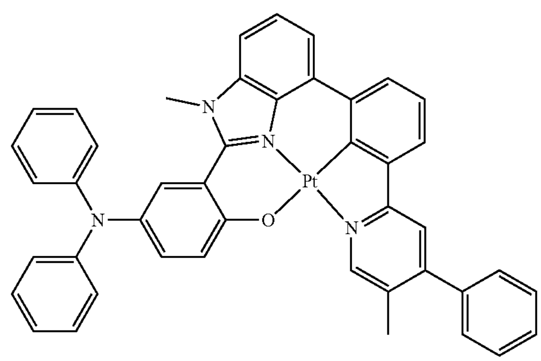
1-56
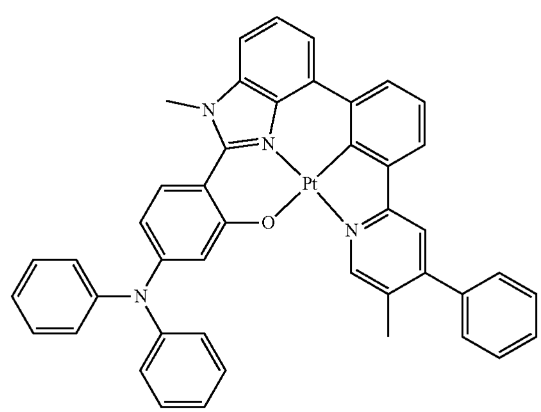
1-57
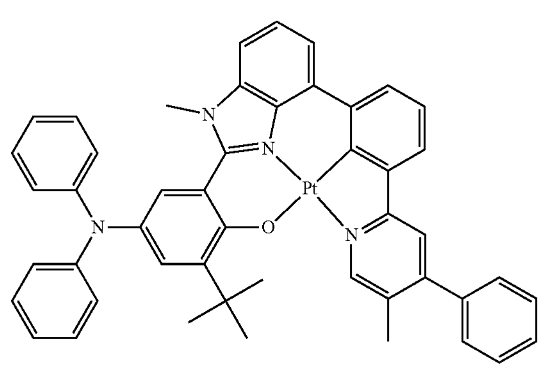

-continued
1-58
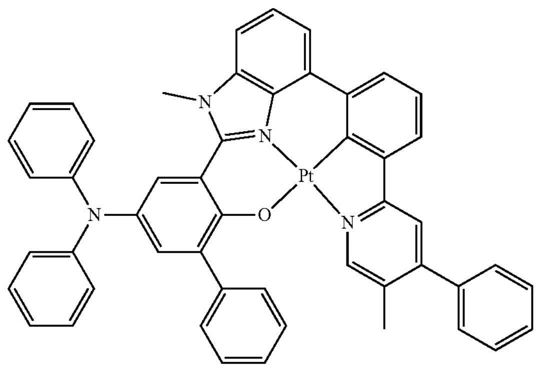
1-59
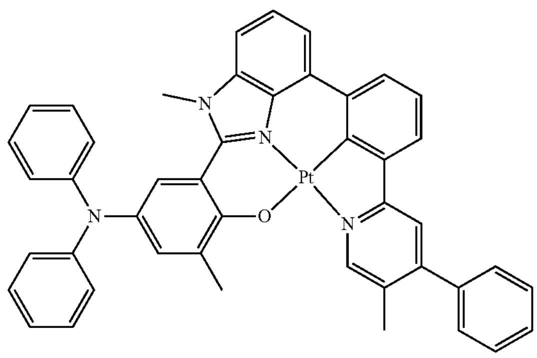
1-60
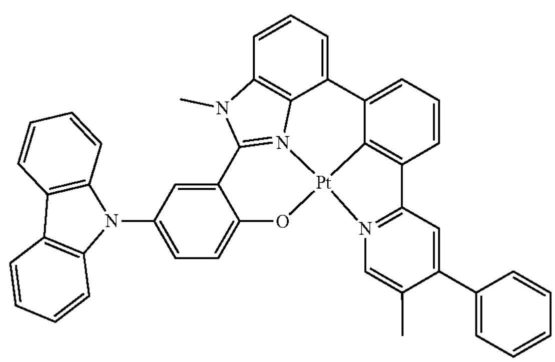
1-61
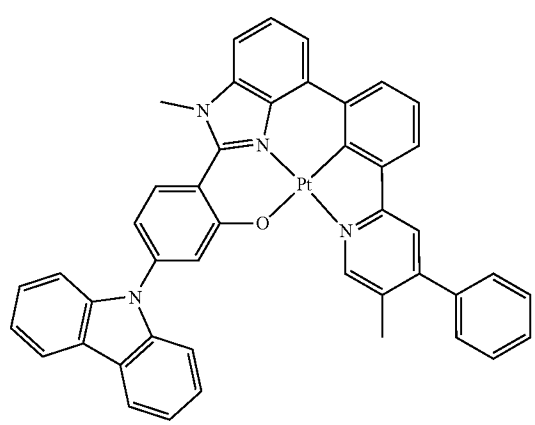
-continued
1-62
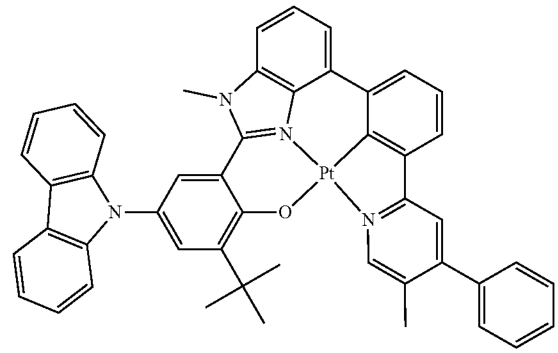
1-63
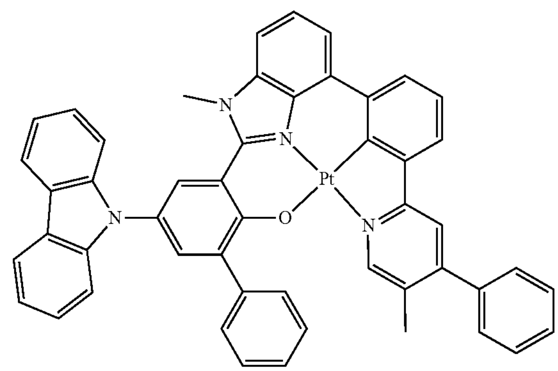
1-64
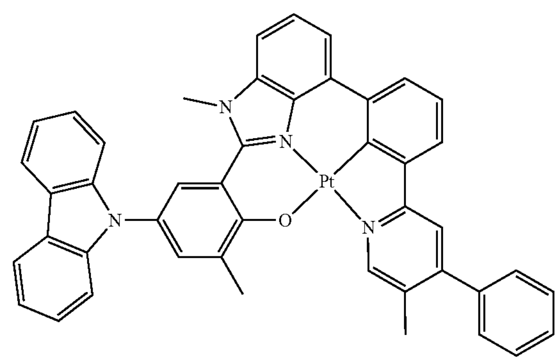
1-65
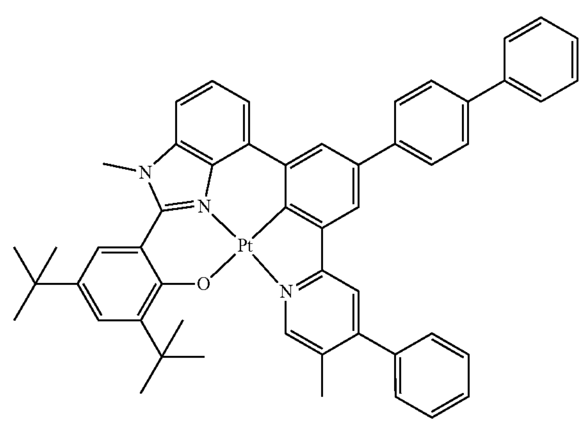

-continued
1-66
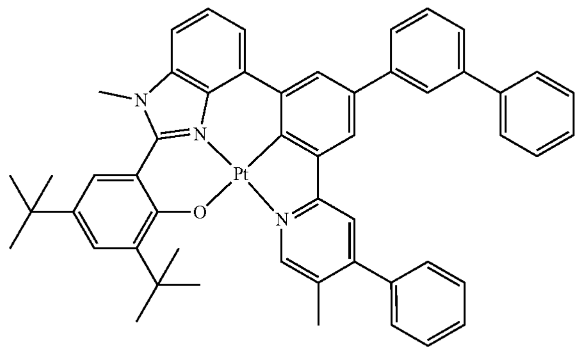
1-67
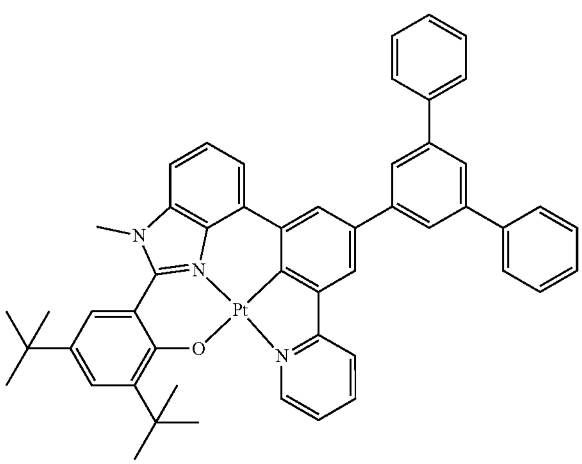
1-68
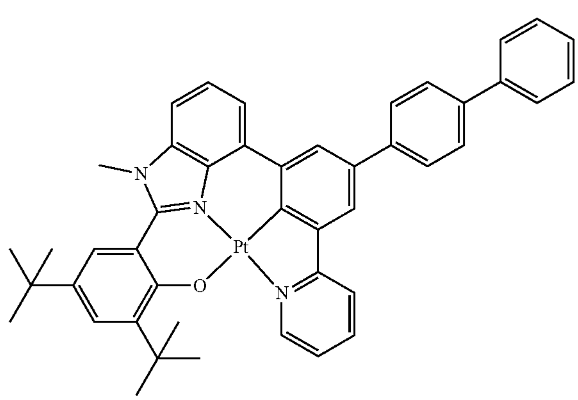
-continued
1-69
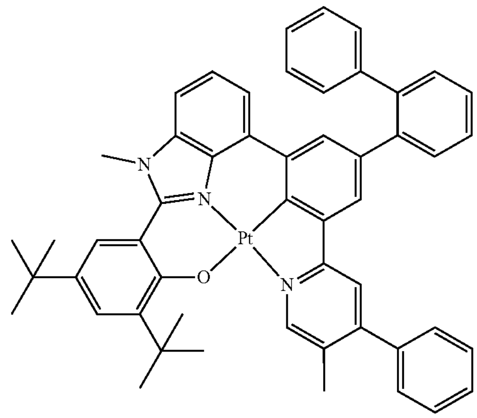
1-70
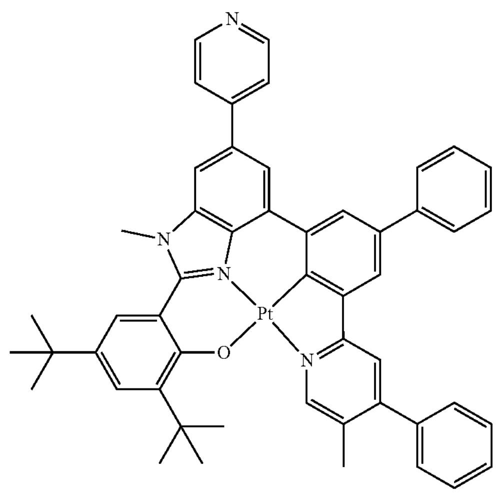
1-71
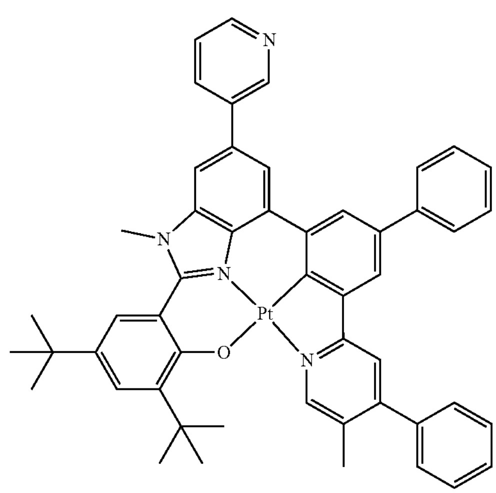

-continued
1-72
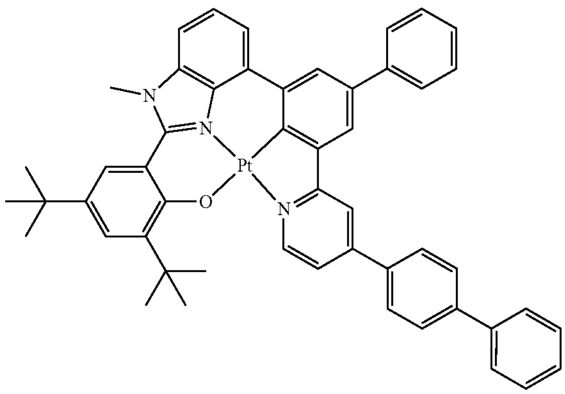
1-73
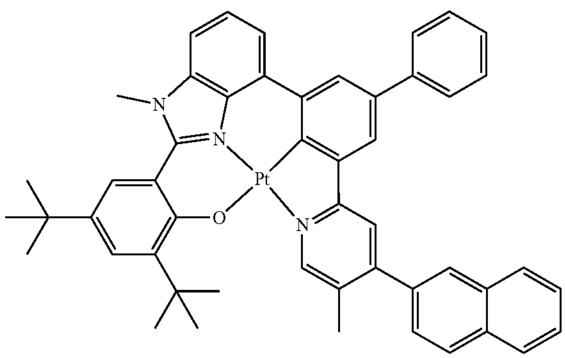
1-74
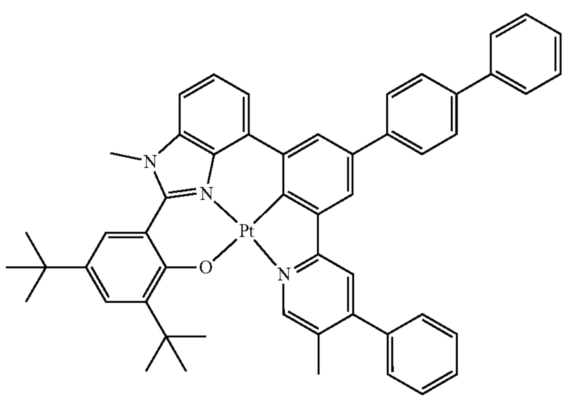
1-75
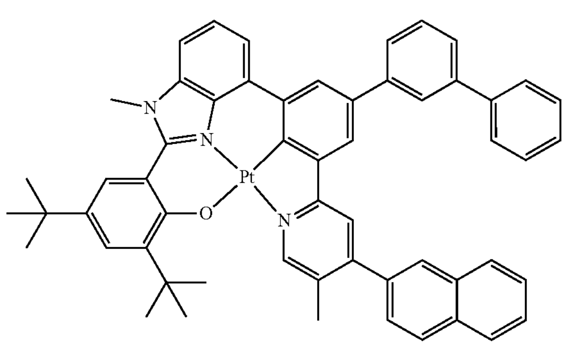
-continued
1-76
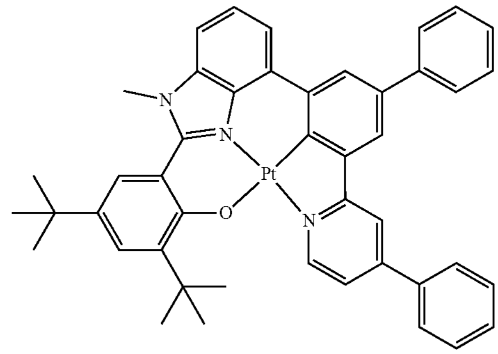
1-77
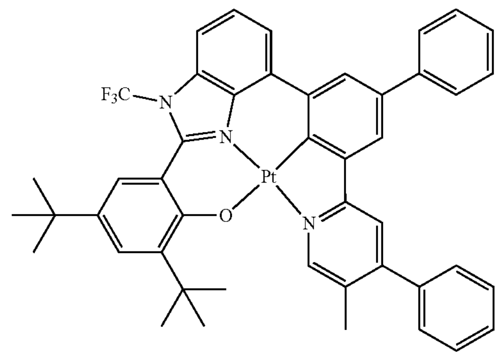
1-78
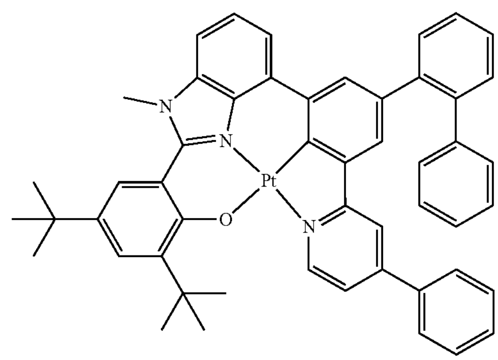
1-79
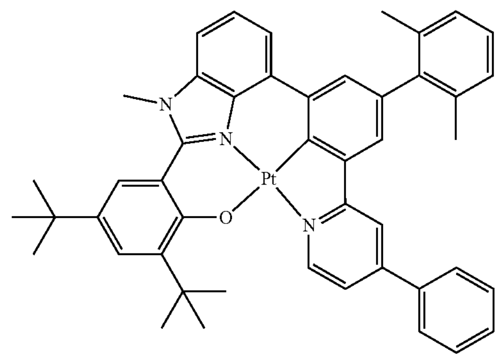

-continued
1-80
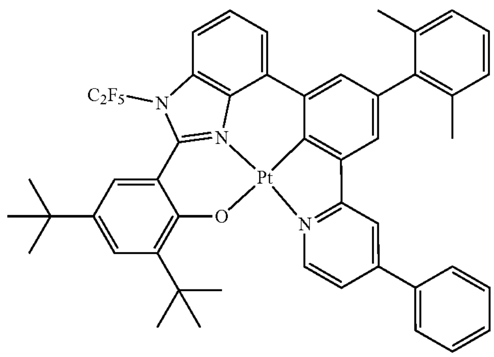
1-81
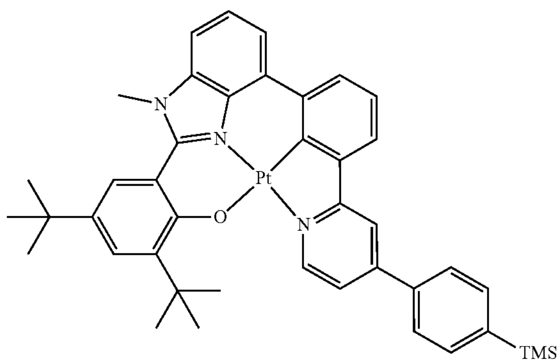
1-82
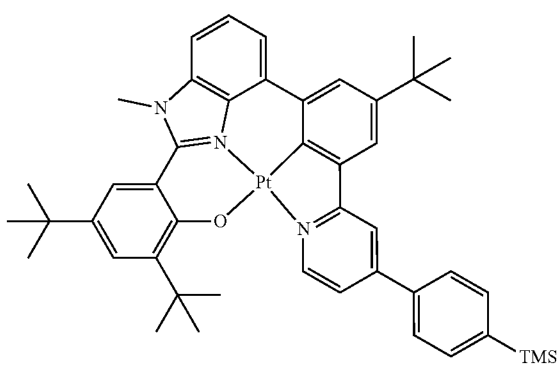
1-83
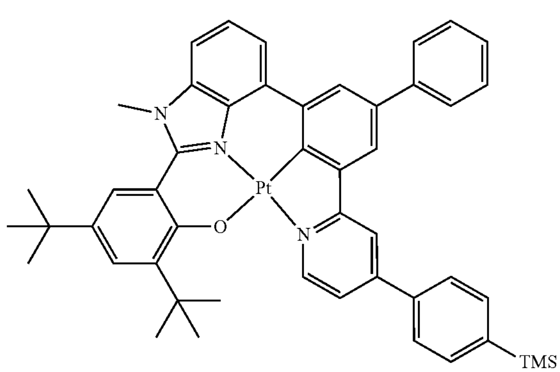
-continued
1-84
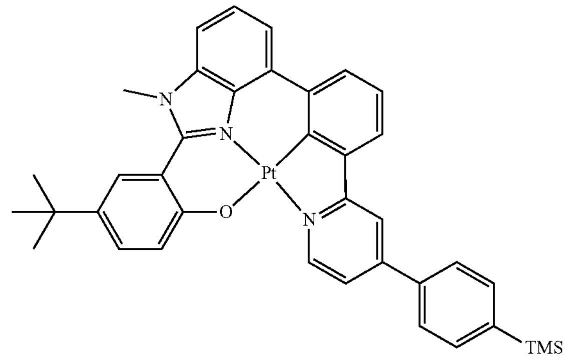
1-85
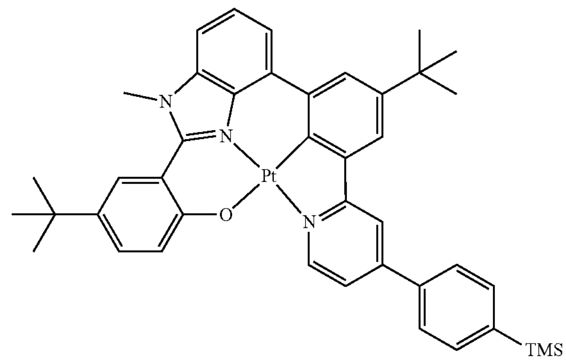
1-86
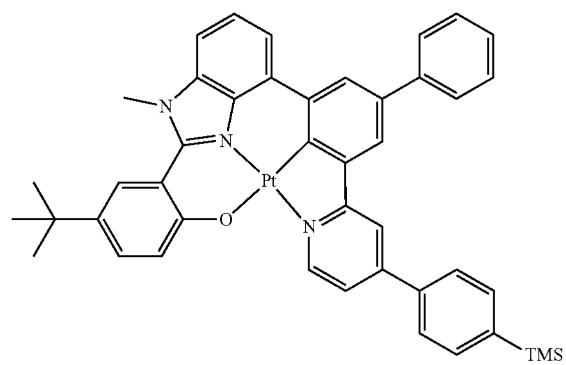
1-87
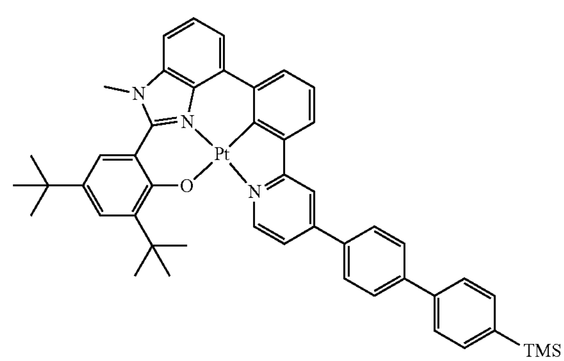

1-88
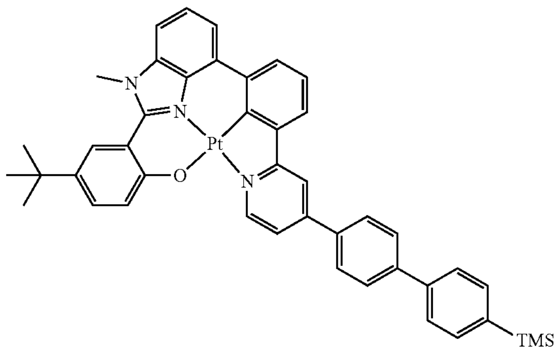
2-1
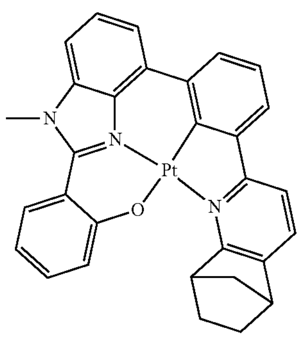
2-2
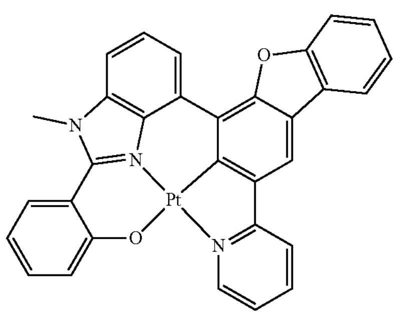
2-3
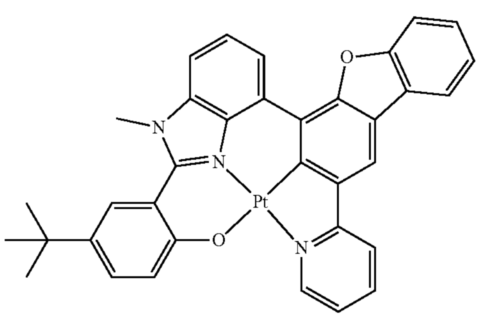
2-4
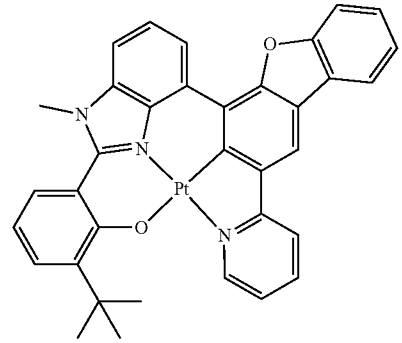
2-5
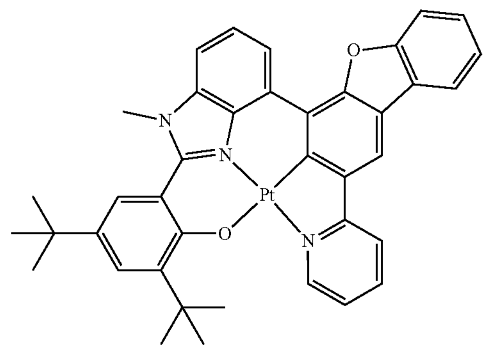
2-6
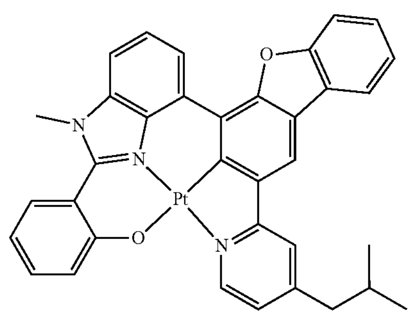
2-7
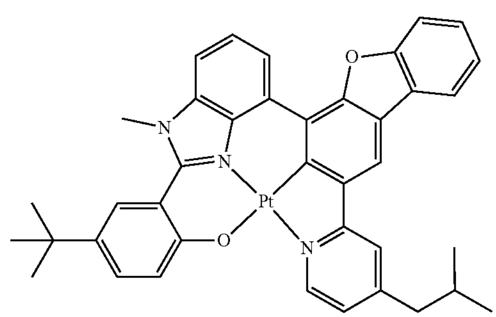

-continued
2-8
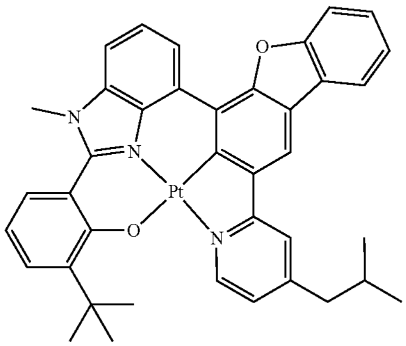
2-9
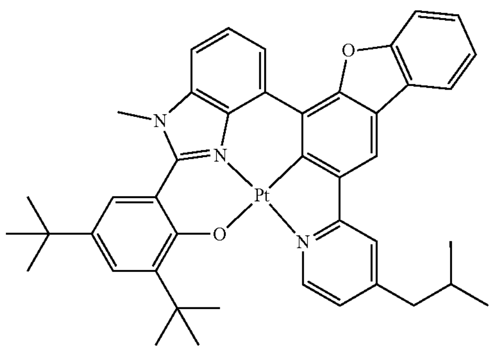
2-10
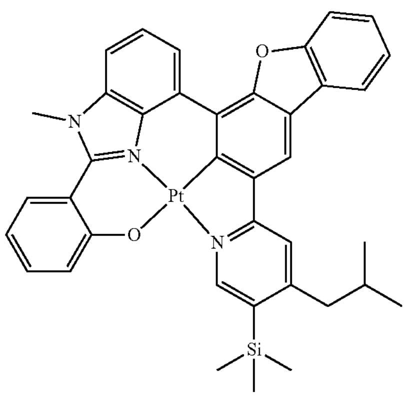
2-11
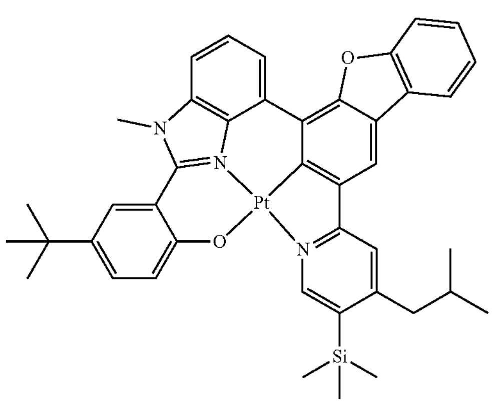
-continued
2-12
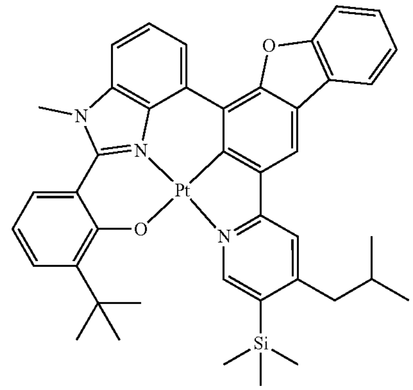
2-13
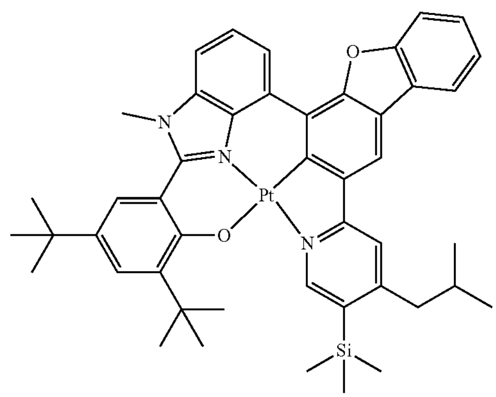
2-14
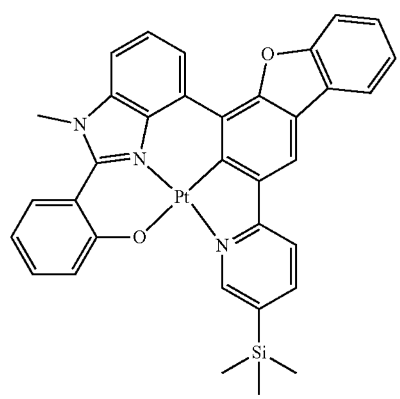

-continued
2-15
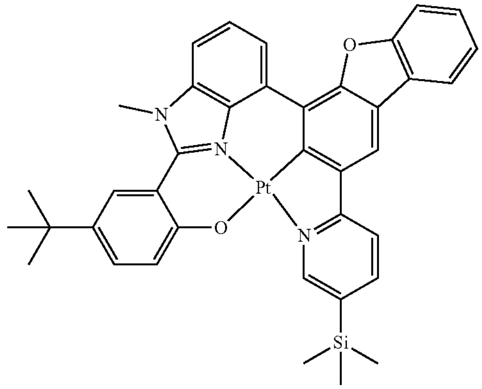
2-16
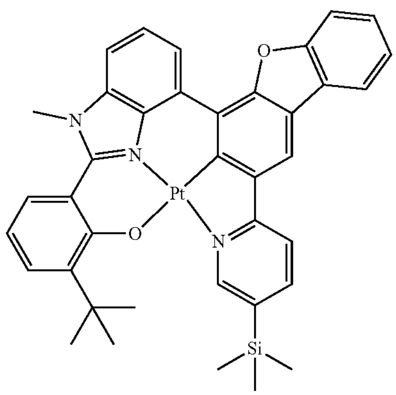
2-17
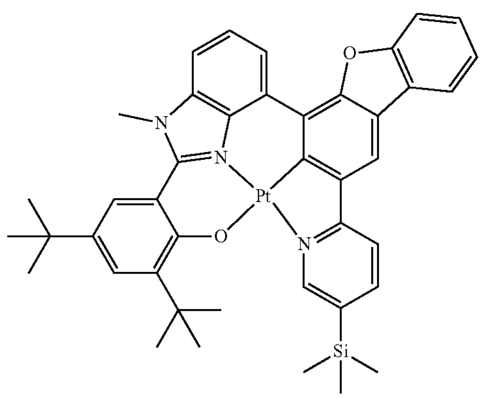
2-18
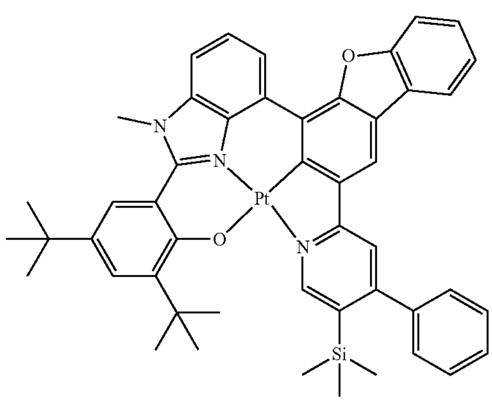
-continued
2-19
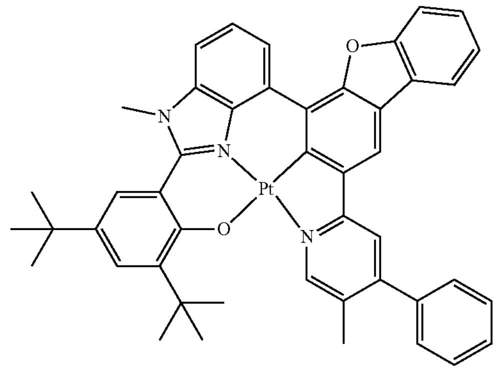
2-20
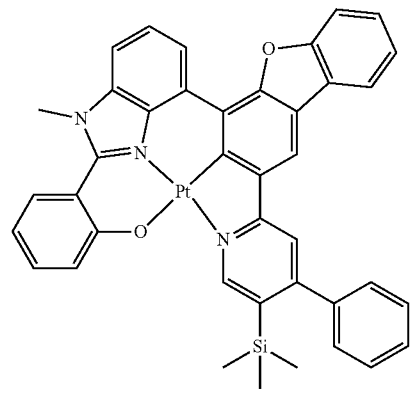
2-21
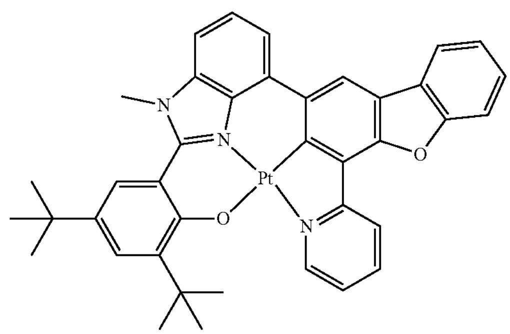
2-22
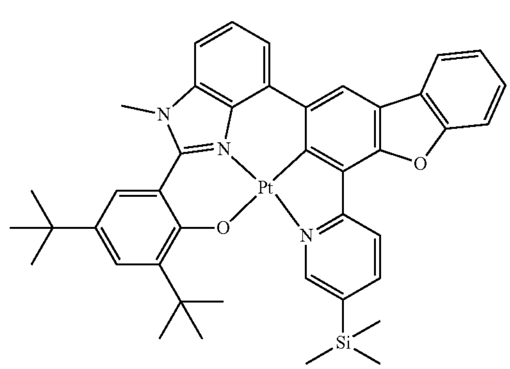

-continued
2-23
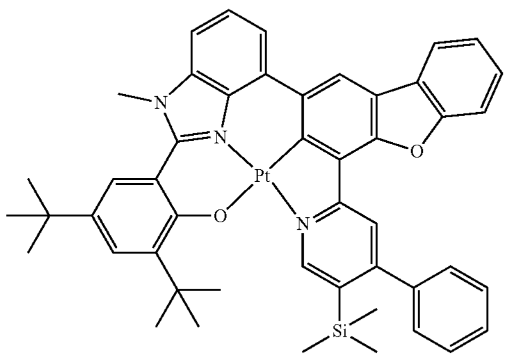
2-24
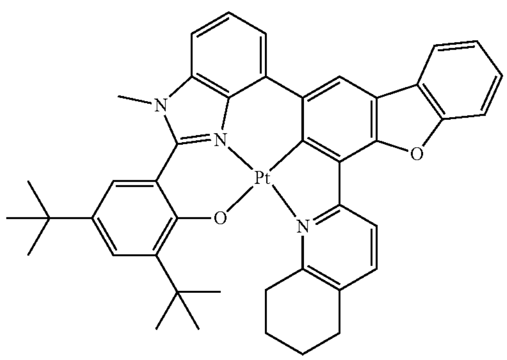
2-25
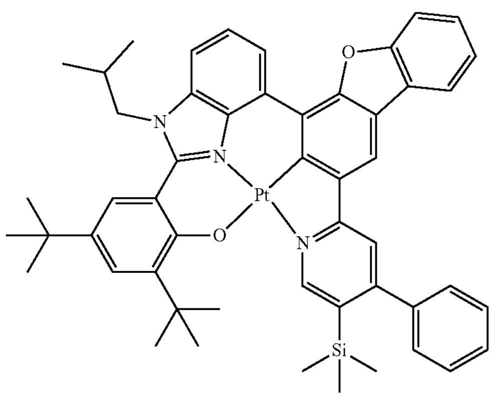
2-26
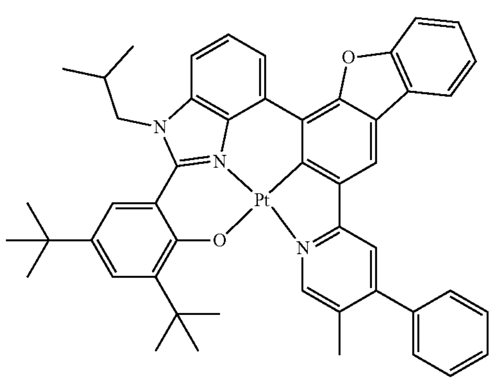
-continued
2-27
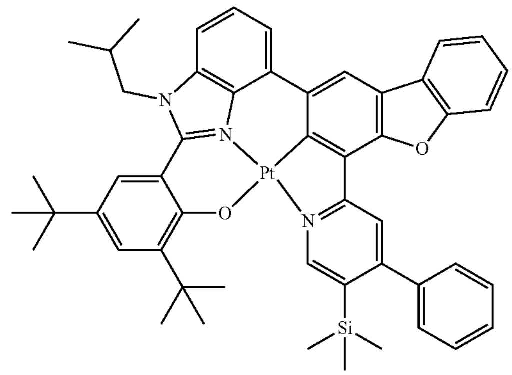
2-28
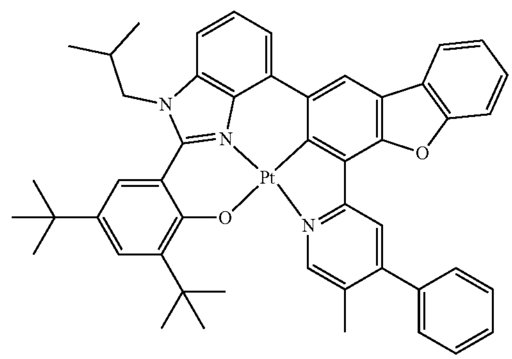
2-29
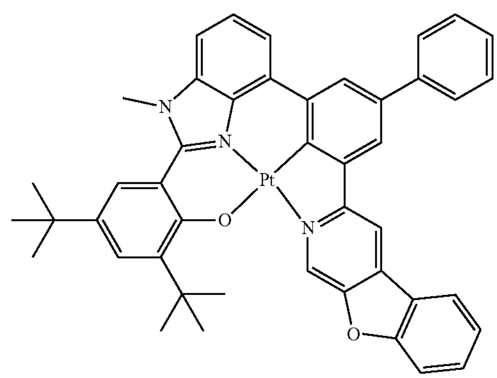
2-30
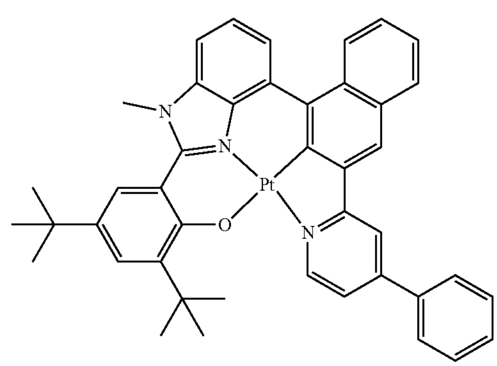

-continued
2-31
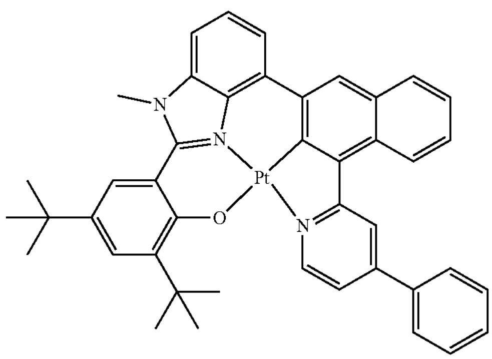
2-32
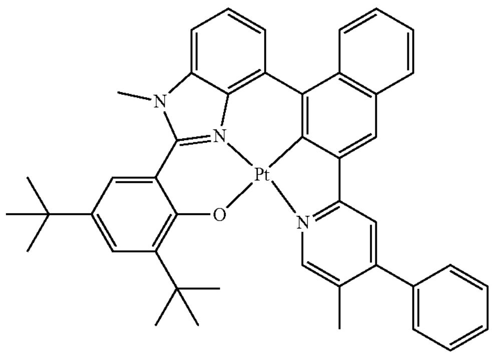
2-33
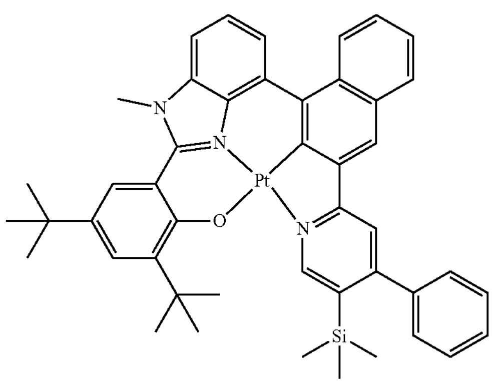
2-34
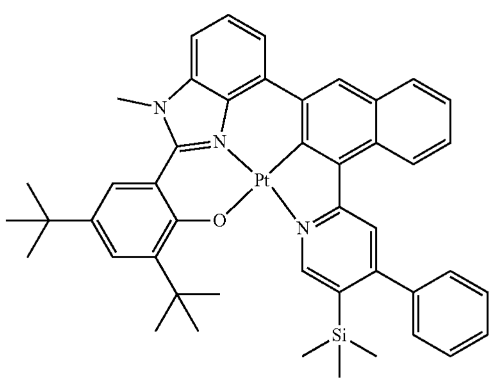
-continued
2-35
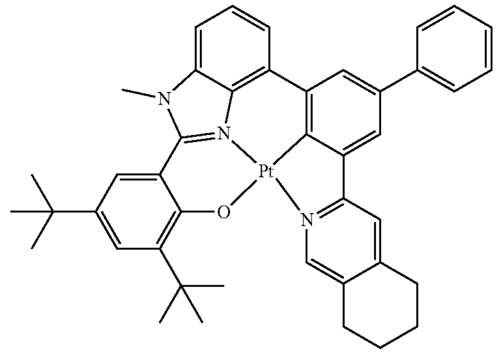
2-36
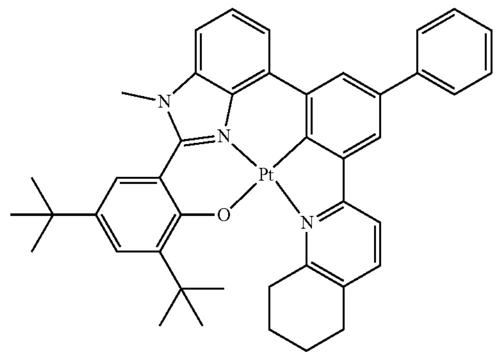
2-37
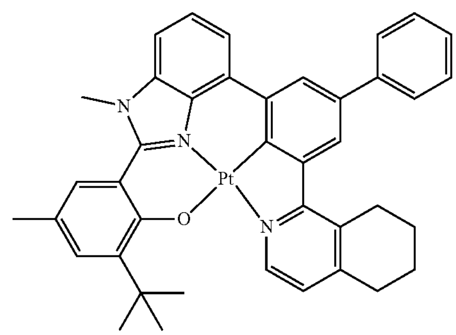
2-38
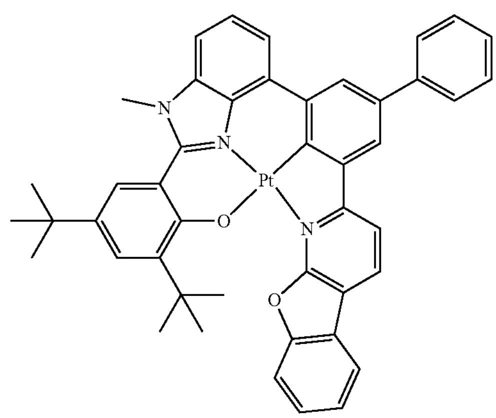

-continued
2-39
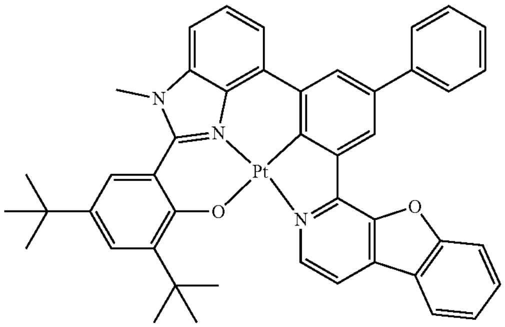
2-40
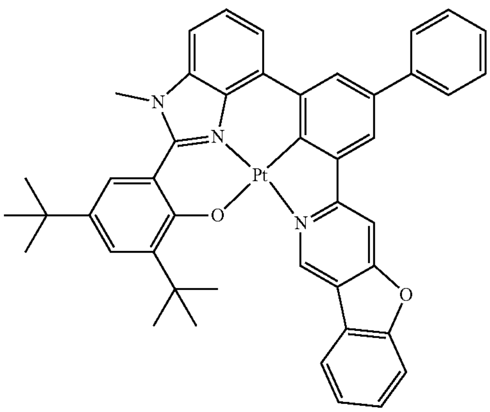
2-41
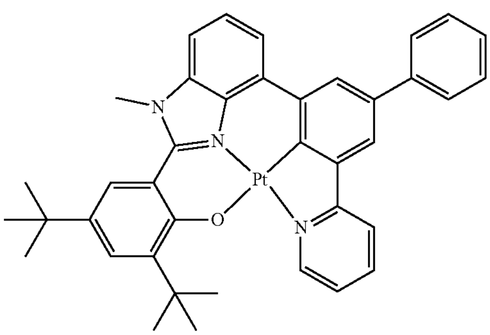
2-42
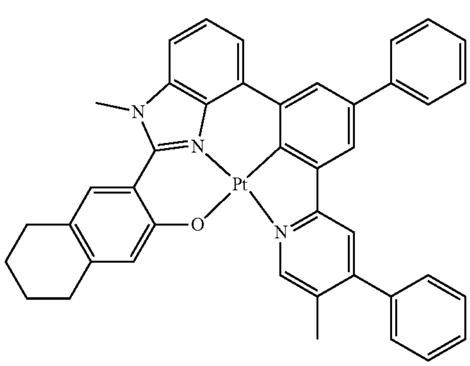
-continued
2-43
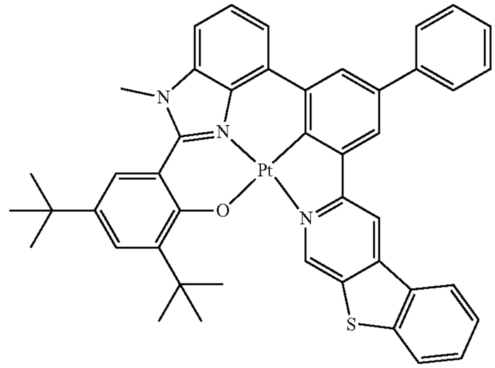
2-44
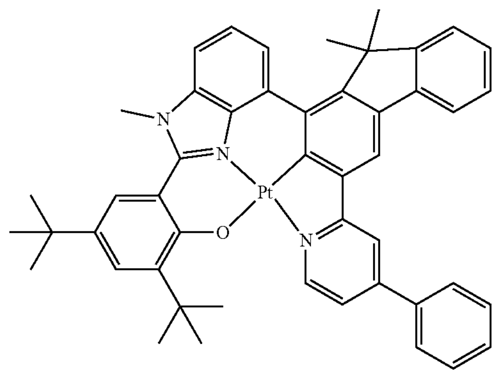
2-45
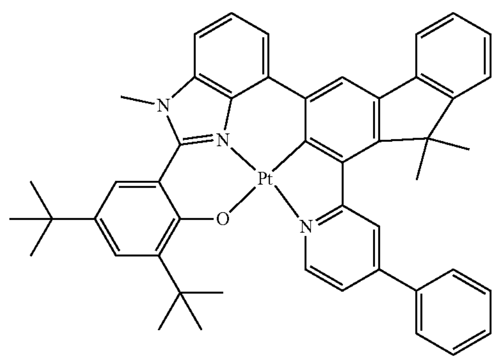
2-46
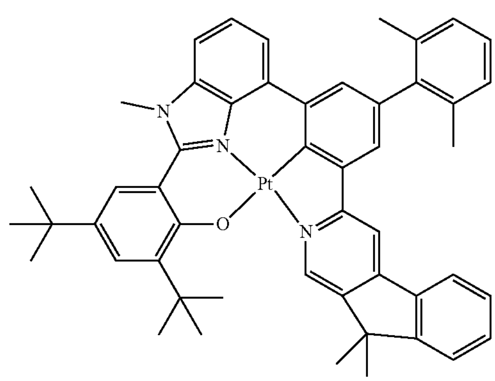

-continued
2-47
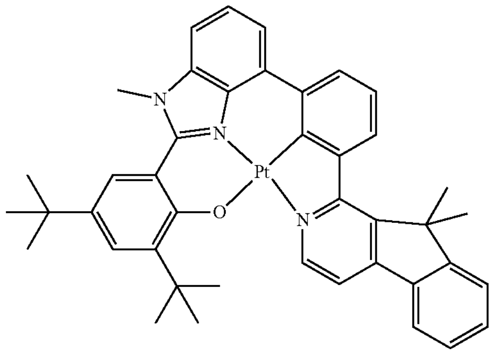
3-1
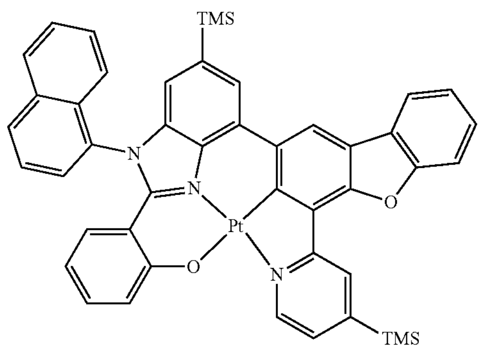
3-2
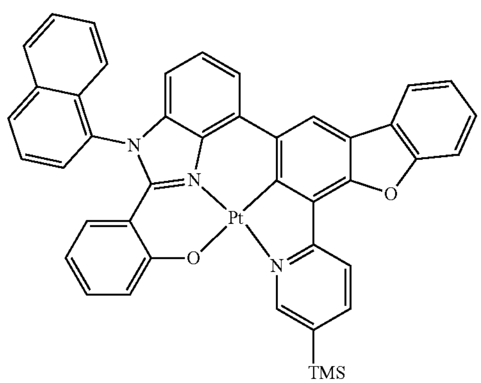
3-3
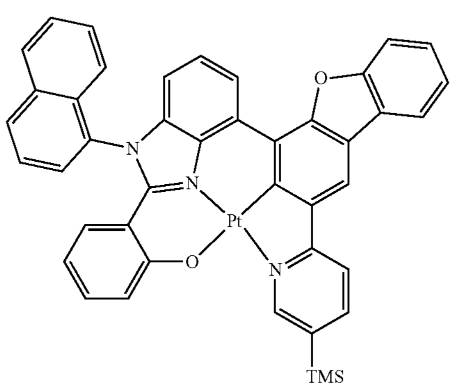
-continued
3-4
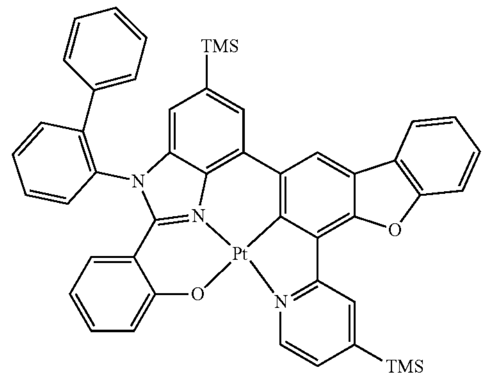
3-5
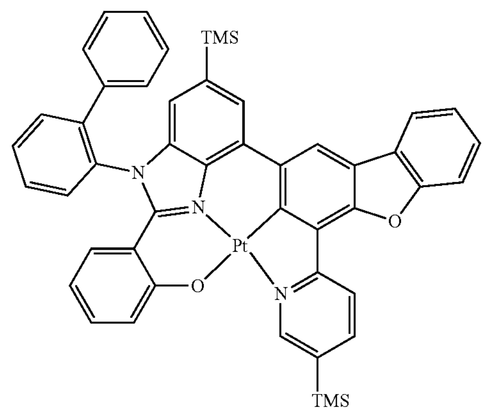
3-6
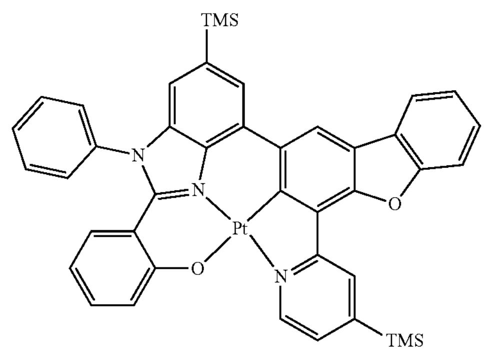
3-7
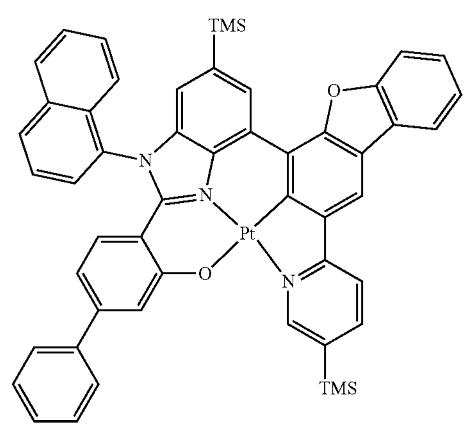

-continued
3-8
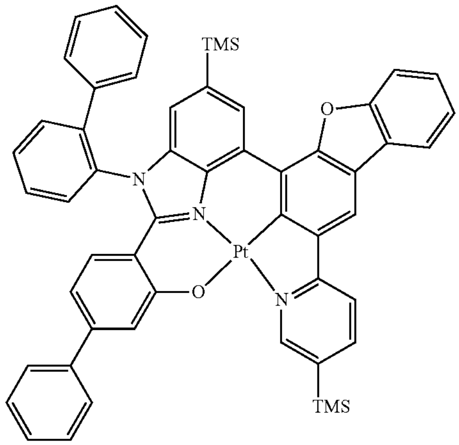
3-9
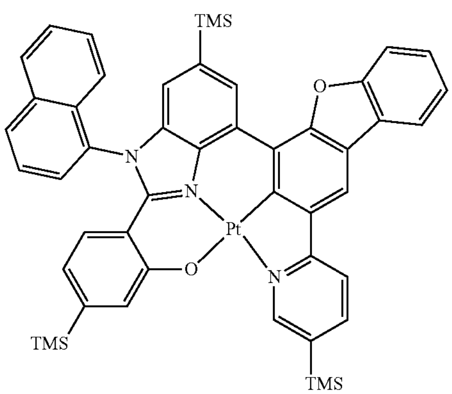
3-10
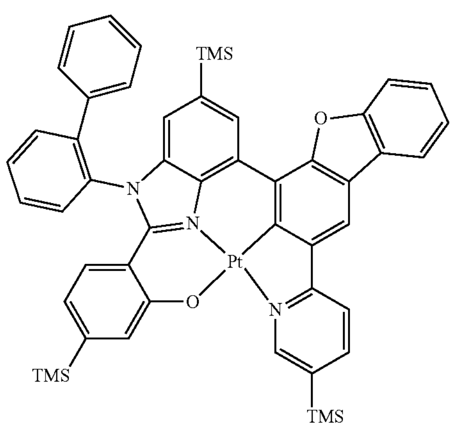
-continued
3-11
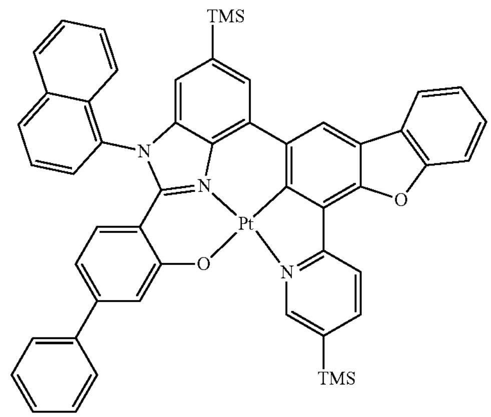
3-12
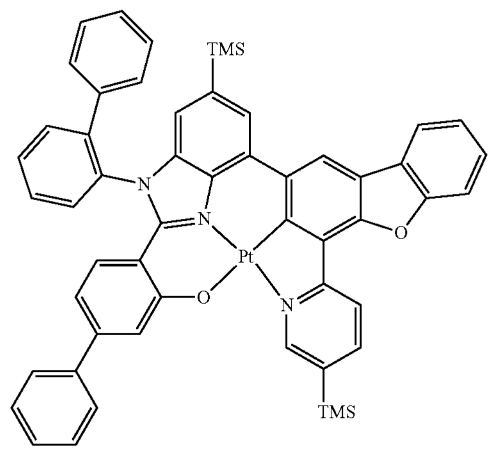
3-13
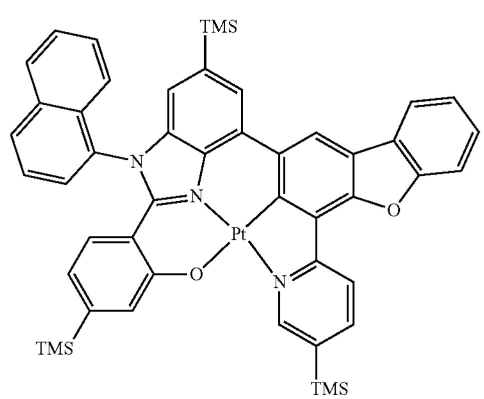

-continued
3-14
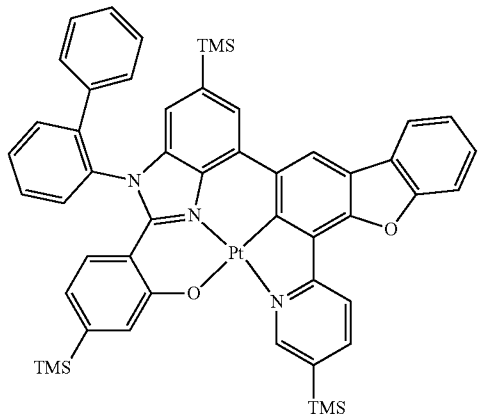
3-15
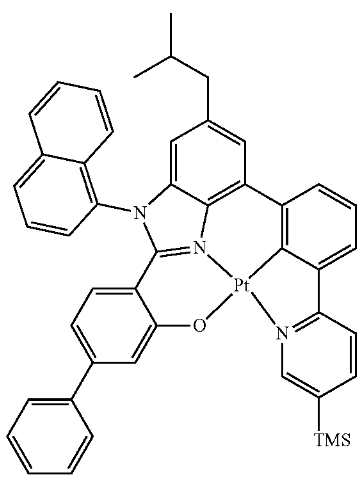
3-16
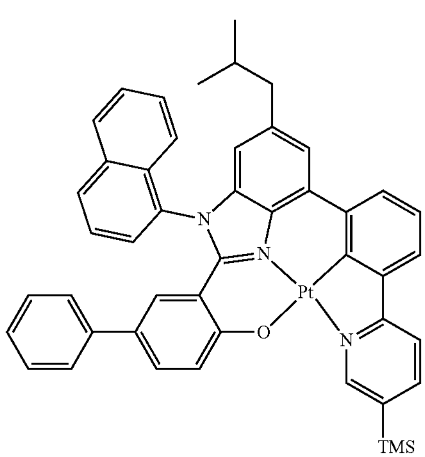
-continued
3-17
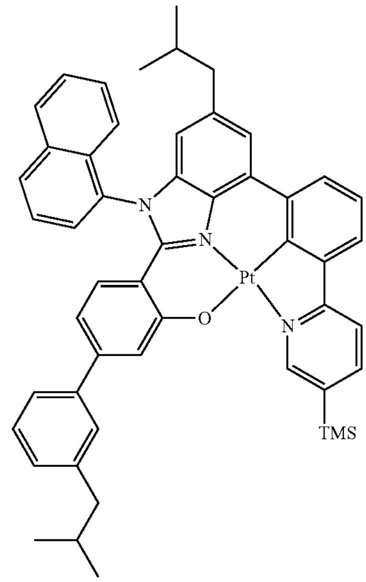
3-18
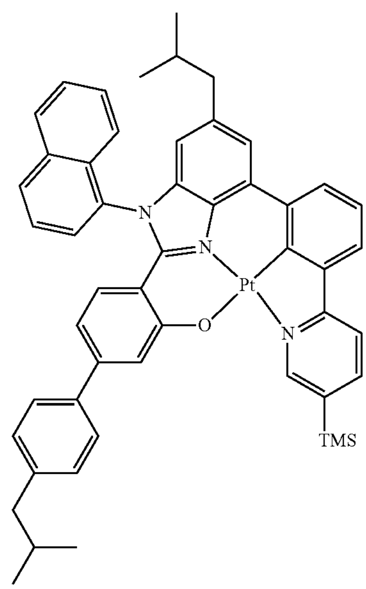
3-19
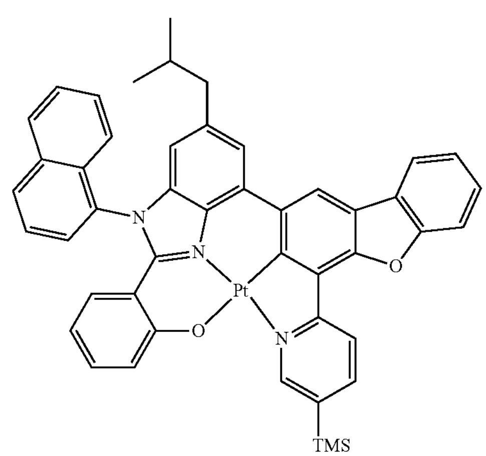

-continued
3-20
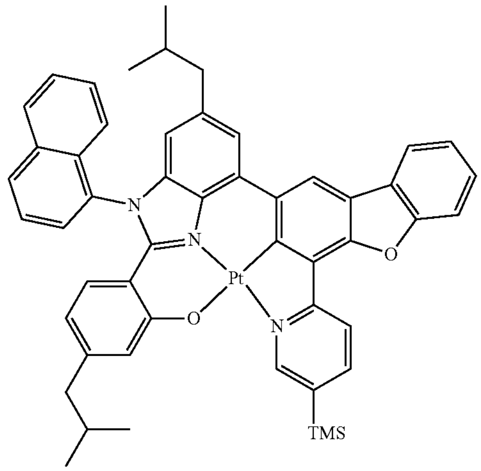
3-21
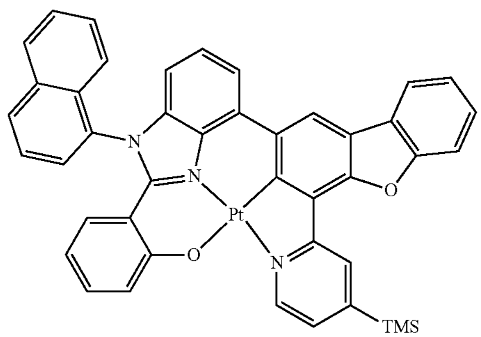
3-22
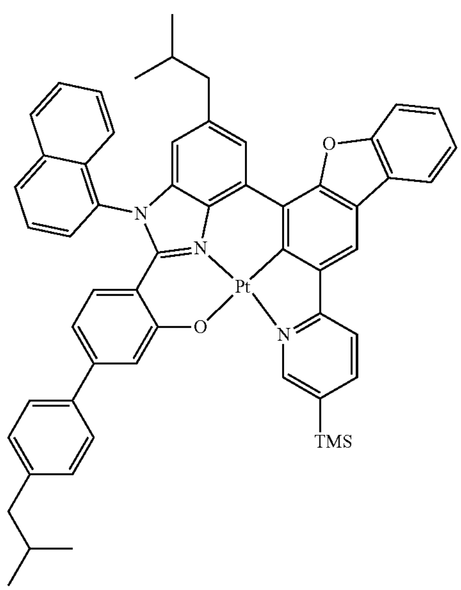
-continued
3-23
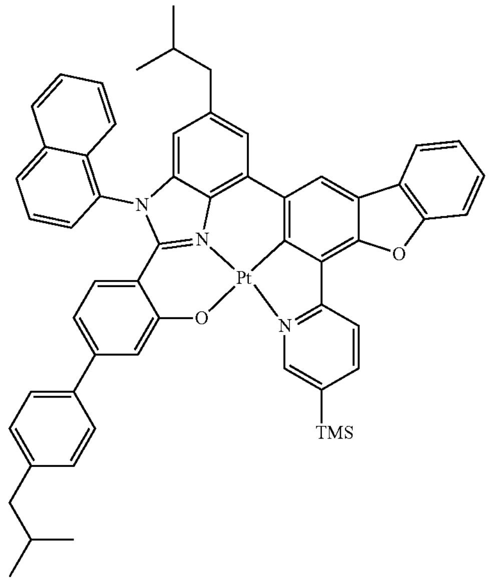
3-24
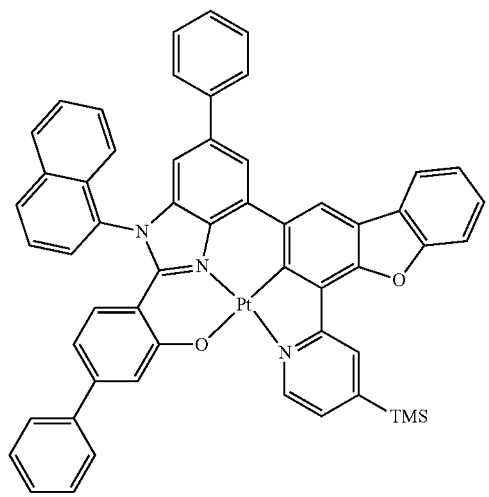
3-25
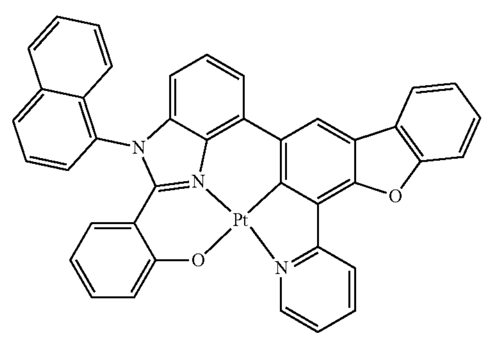

-continued
3-26
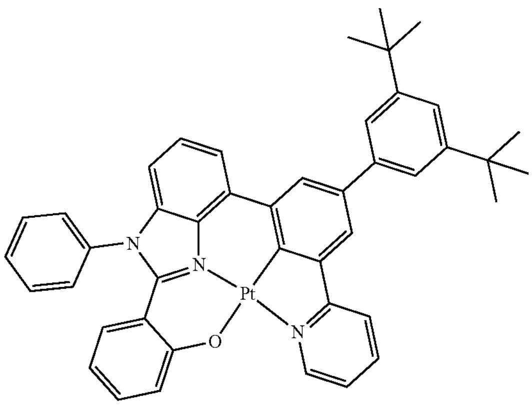
3-27
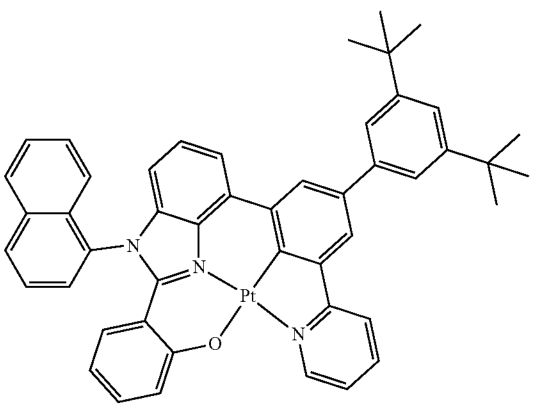
3-28
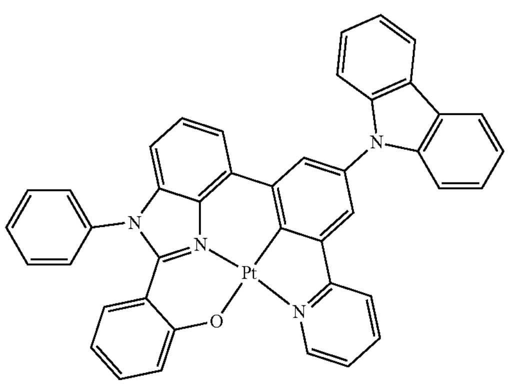
3-29
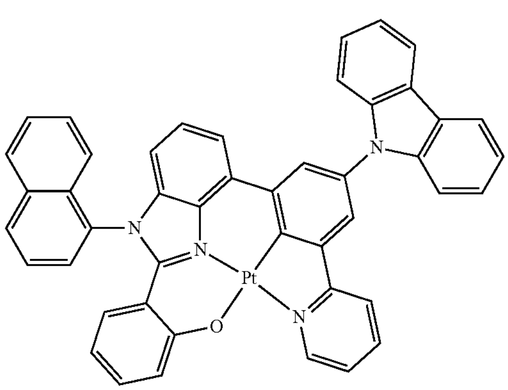
-continued
3-30
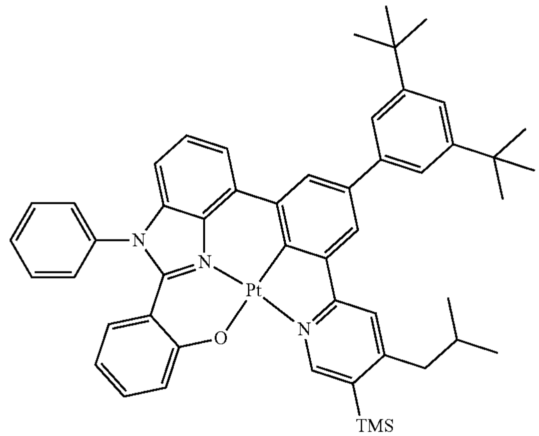
3-31
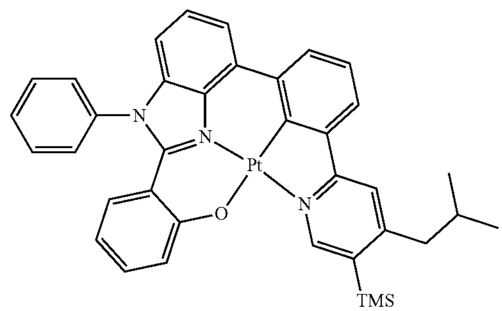
3-32
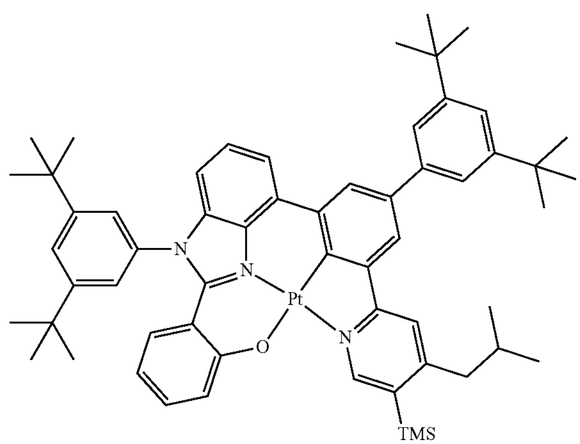
3-33
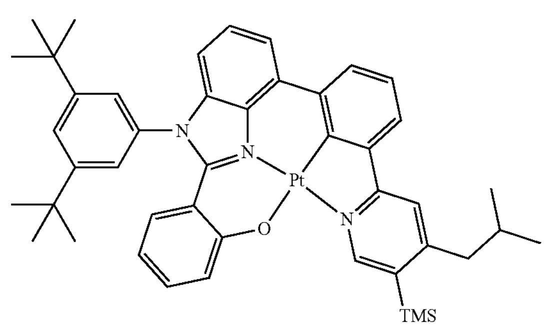

-continued
3-34
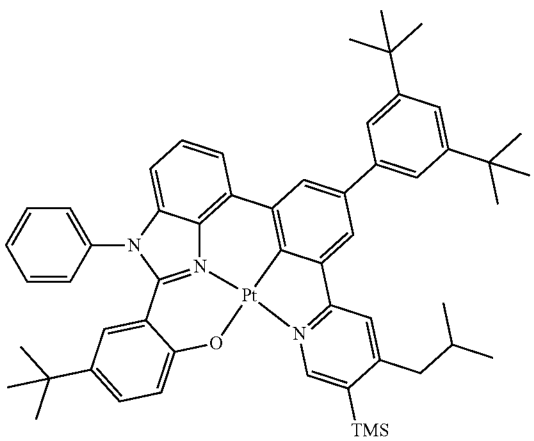
3-35
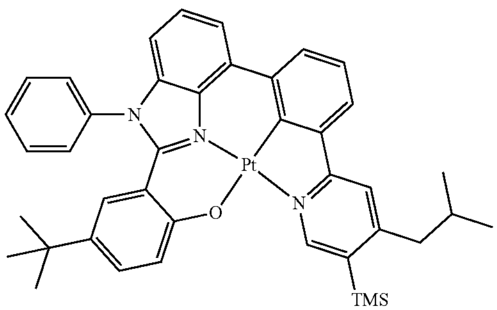
3-36
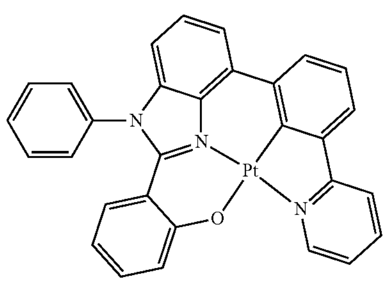
3-37
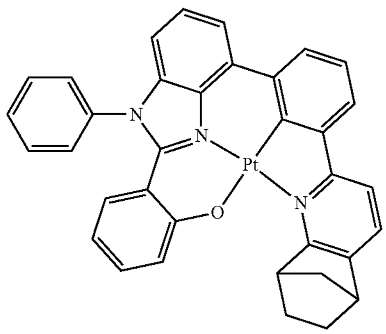
-continued
3-38
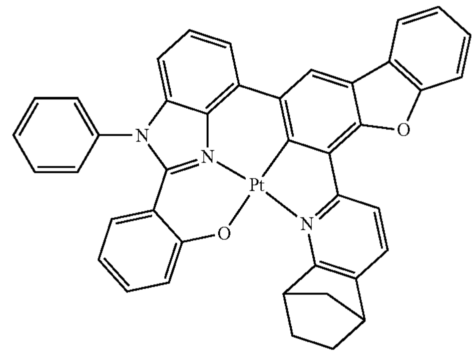
3-39
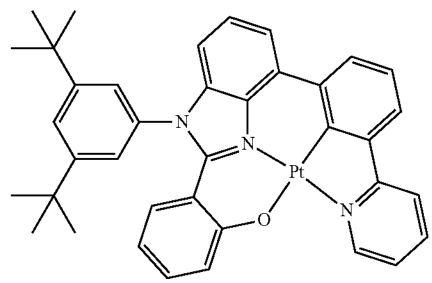
3-40
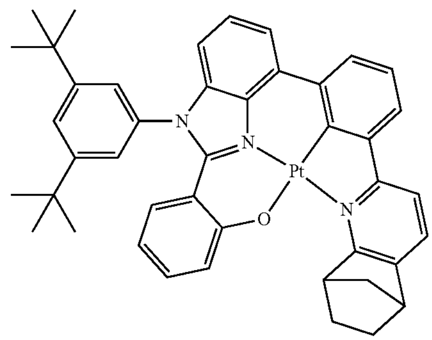
3-41
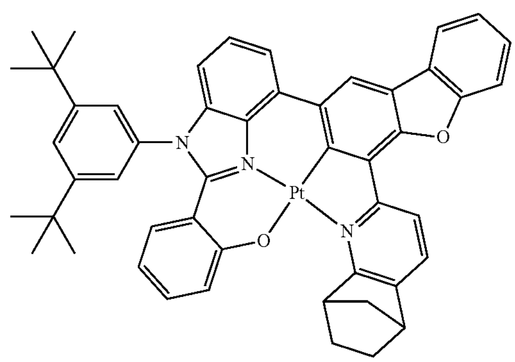
3-42
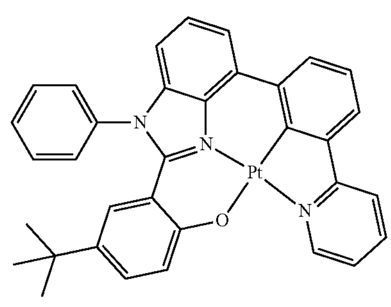

-continued
3-43
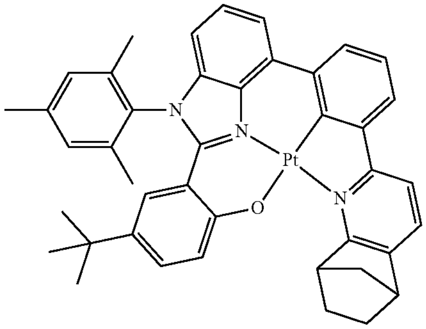
3-44
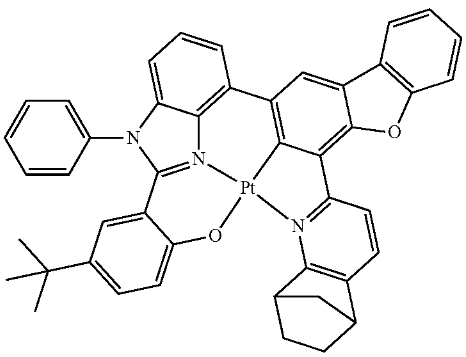
3-45
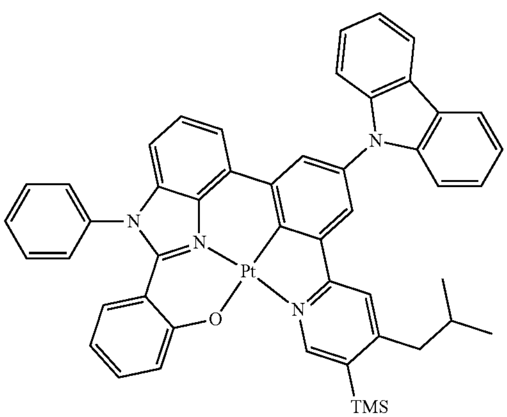
3-46
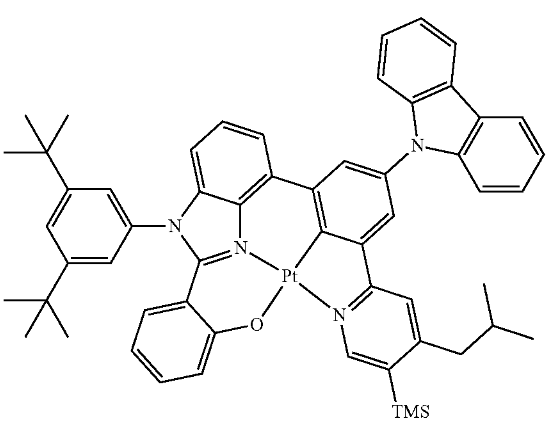
-continued
3-47
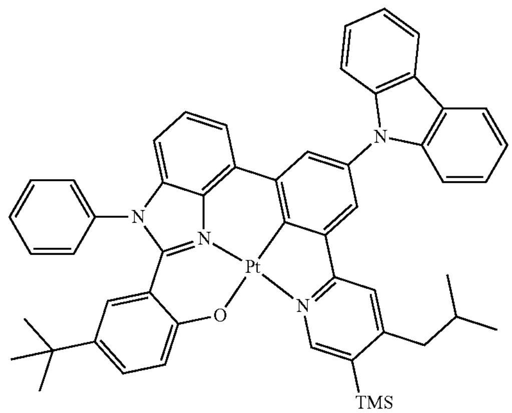
3-48
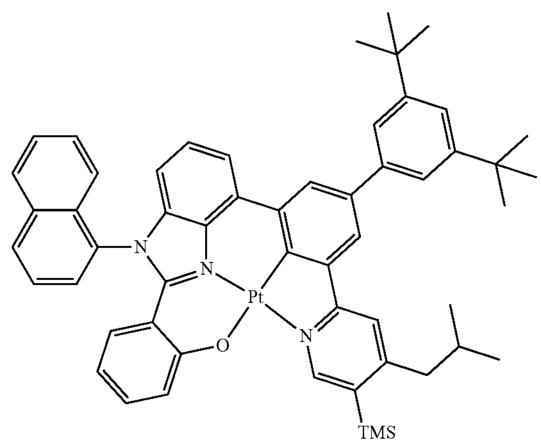
3-49
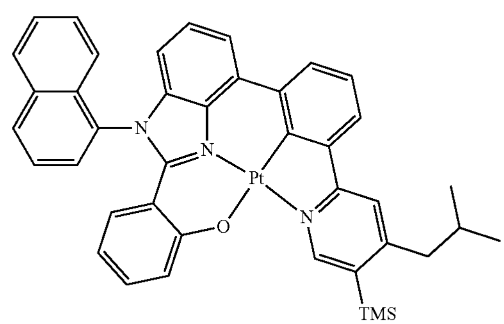

3-50
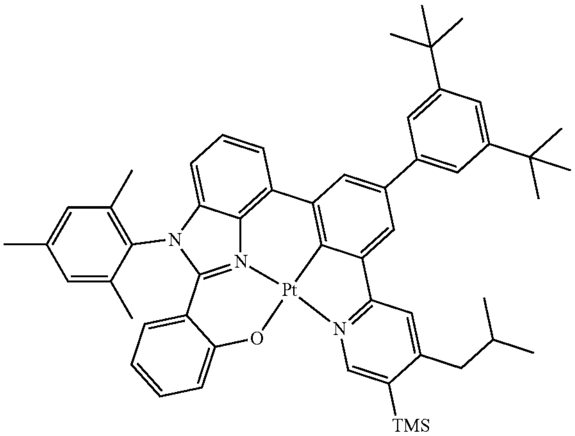
3-51
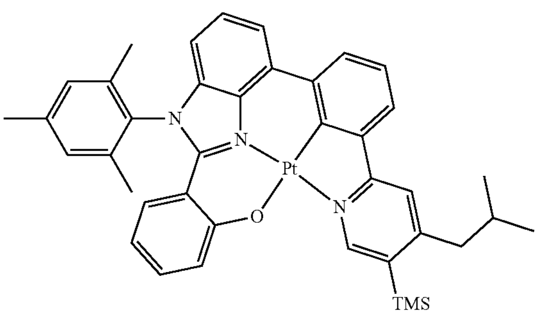
3-52
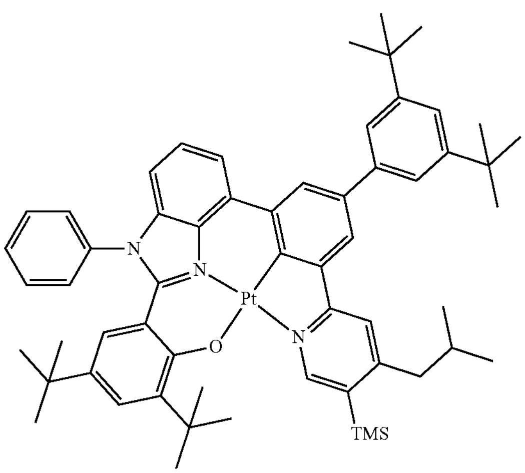
3-53
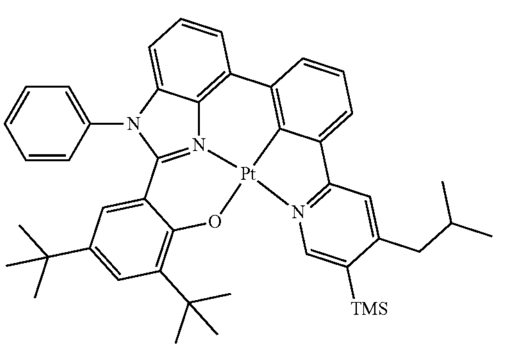
3-54
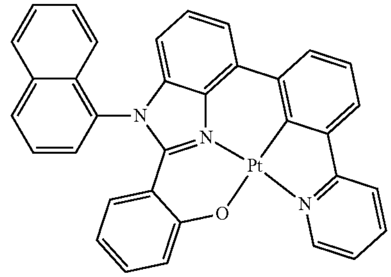
3-55
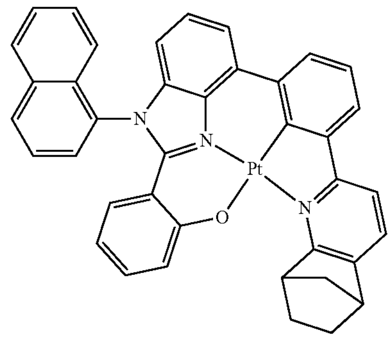
3-56
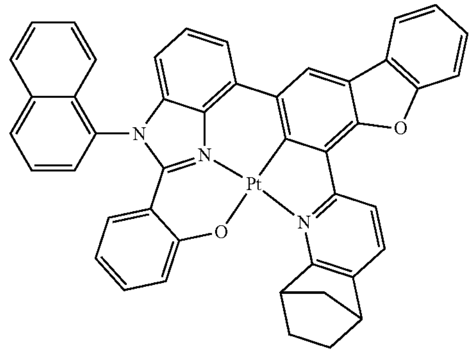
3-57
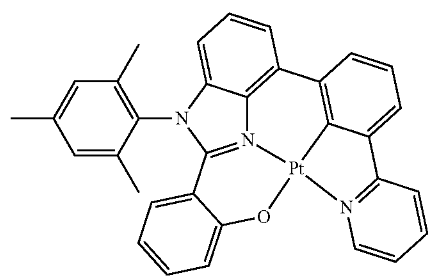
3-58
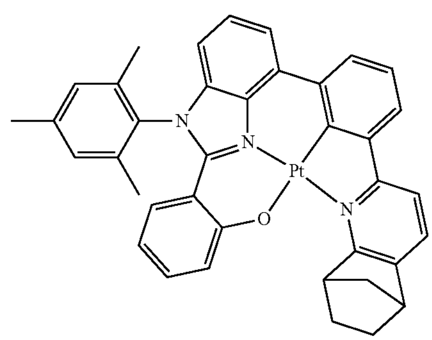

-continued
3-59
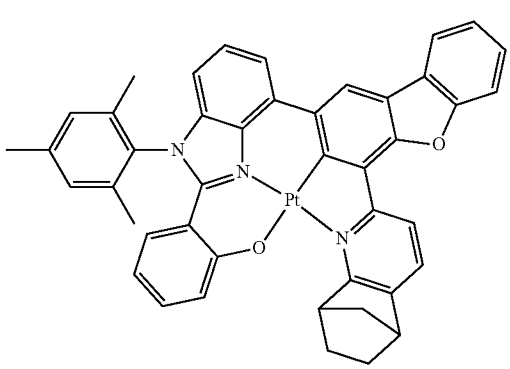
3-60
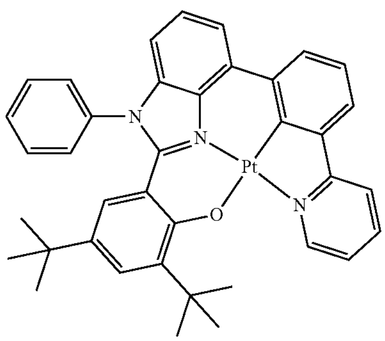
3-61
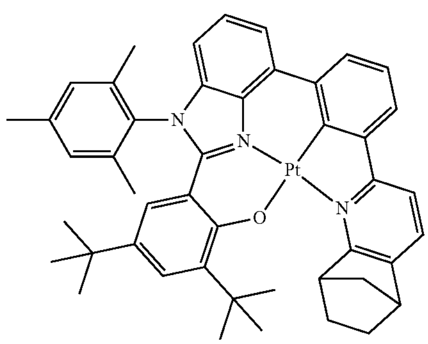
3-62
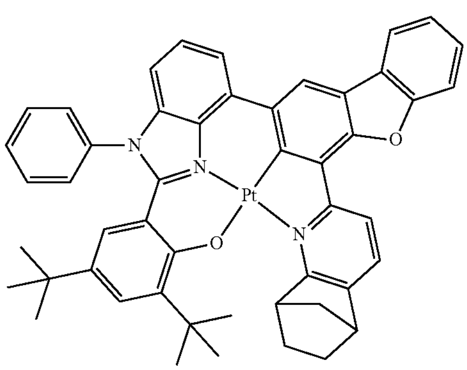
-continued
3-63
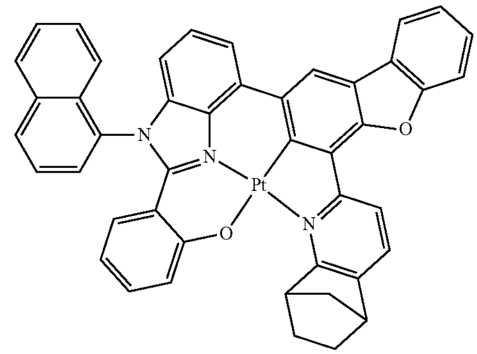
3-64
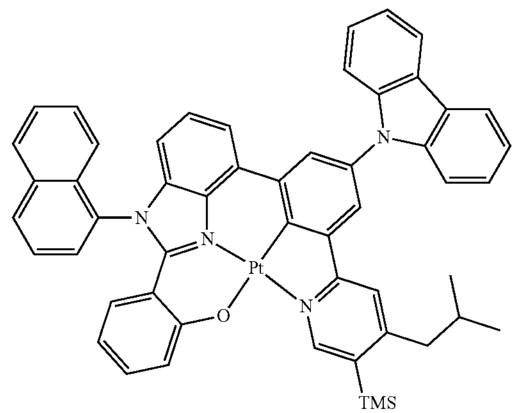
3-65
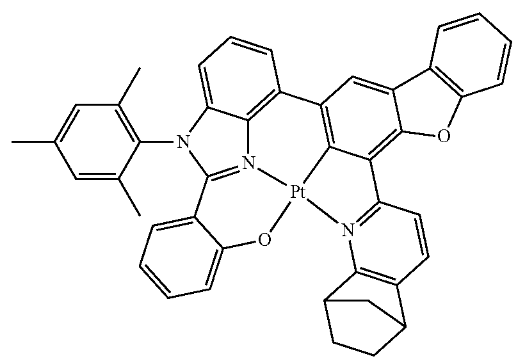
3-66
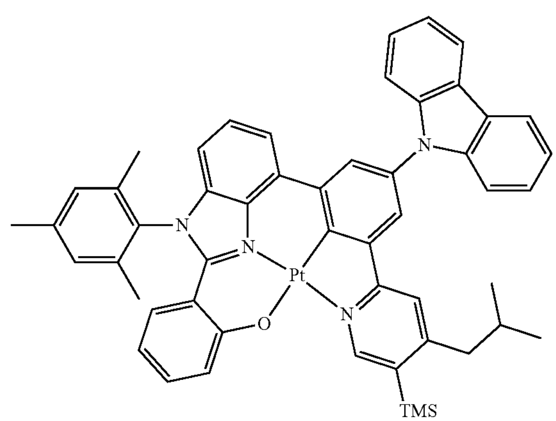

3-67
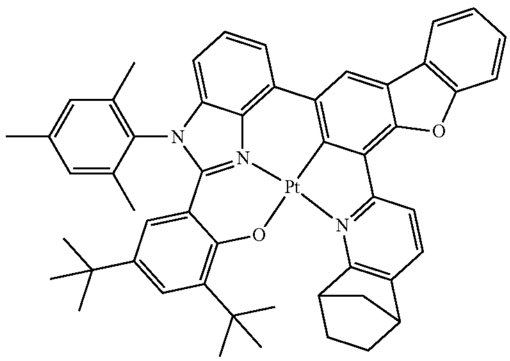
3-68
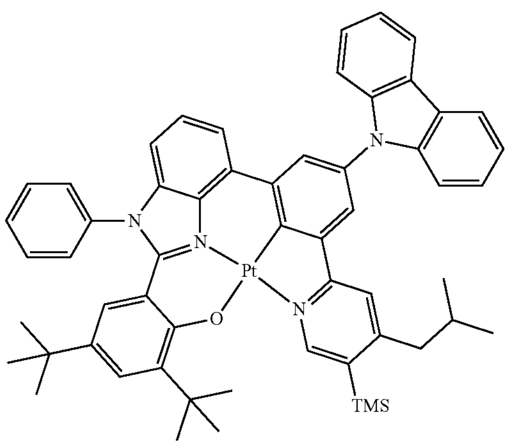
3-69
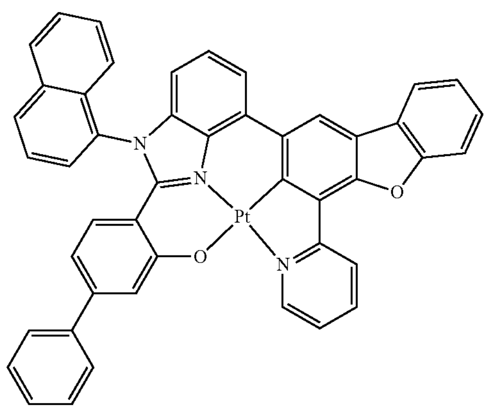
3-70
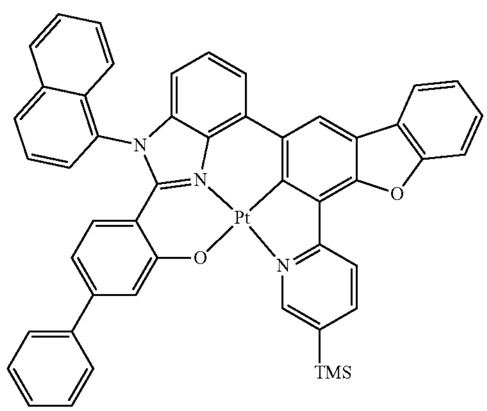
3-71
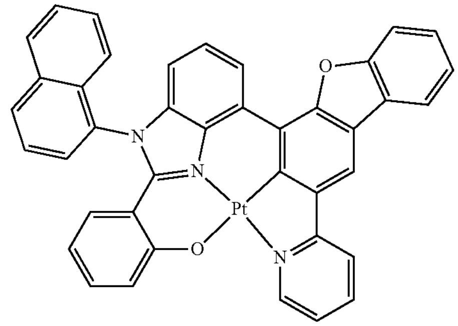
3-72
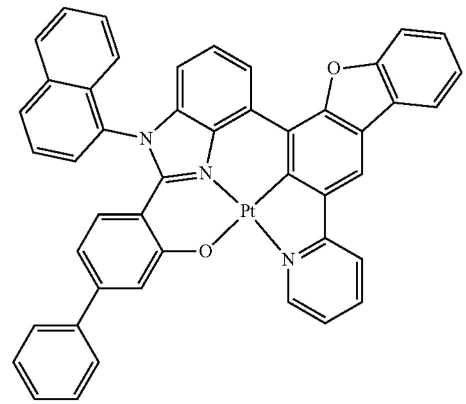
3-73
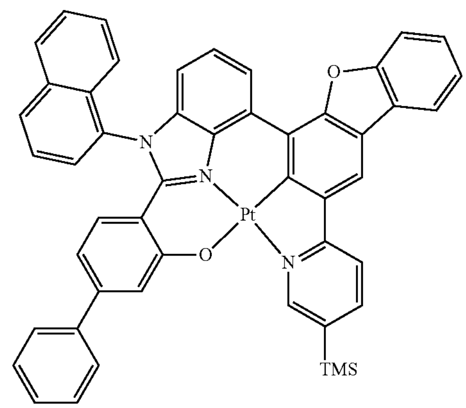
3-74
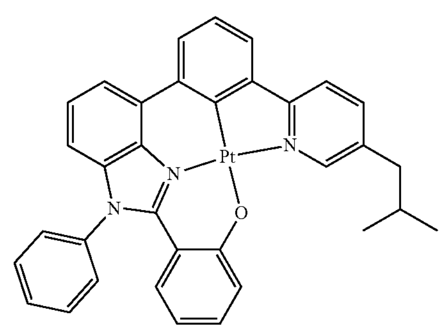

-continued
3-75
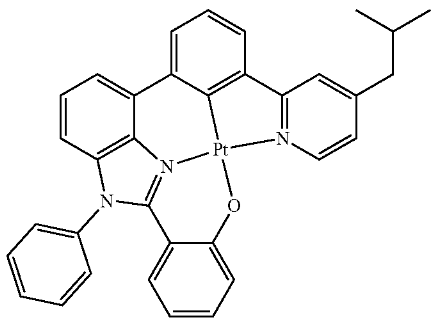
3-76
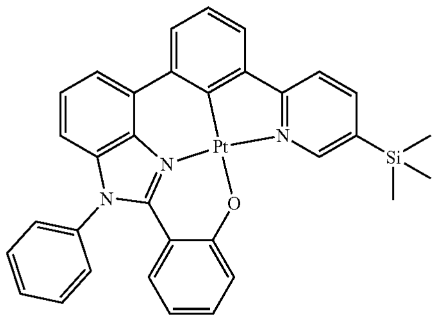
3-77
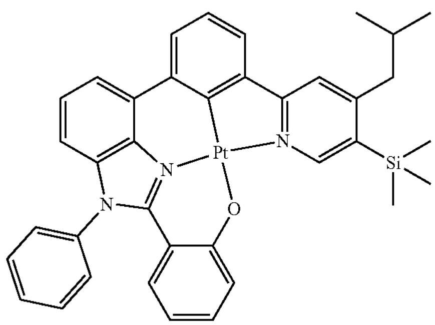
3-78
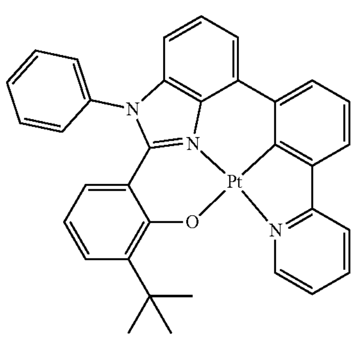
3-79
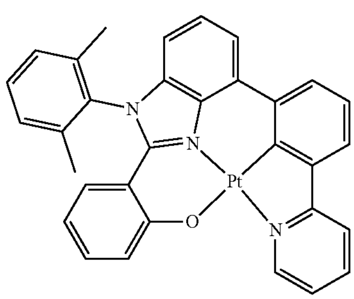
-continued
3-80
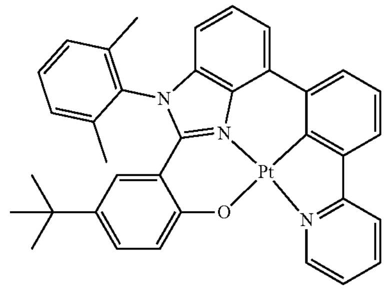
3-81
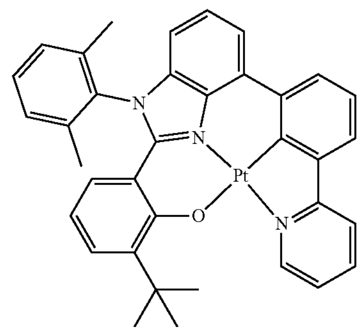
3-82
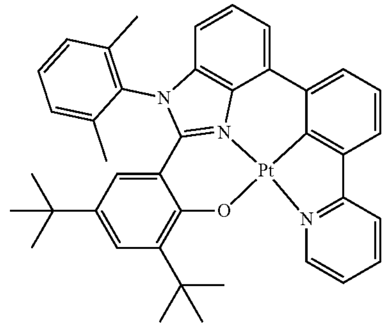
3-83
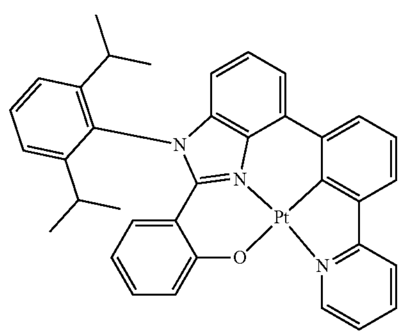
3-84
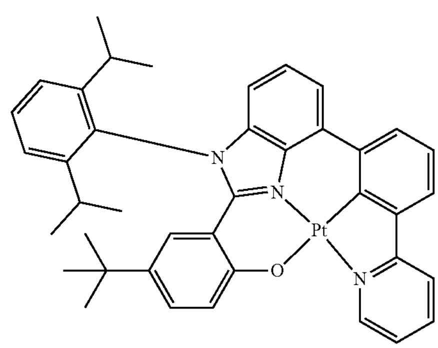

3-85
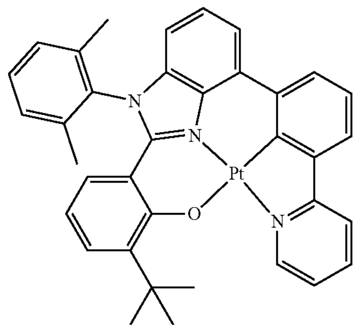
3-86
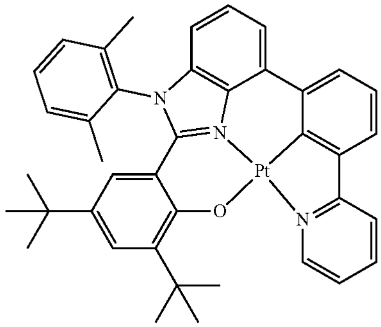
3-87
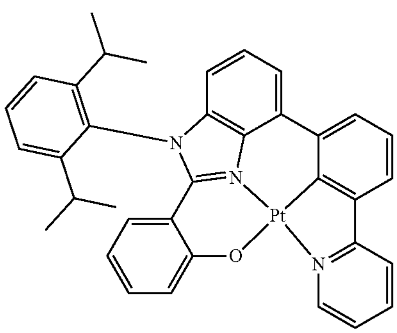
3-88
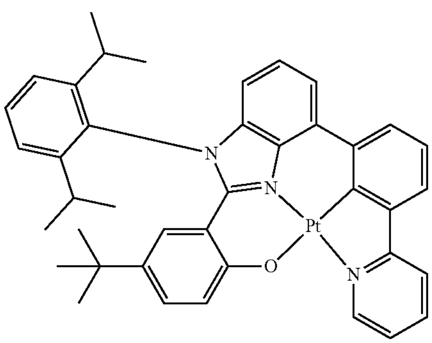
3-89
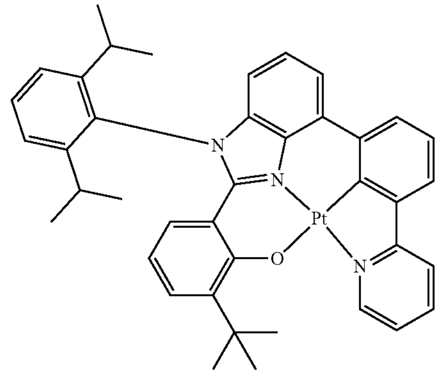
3-90
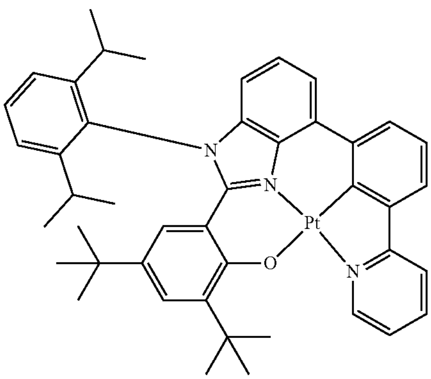
3-91
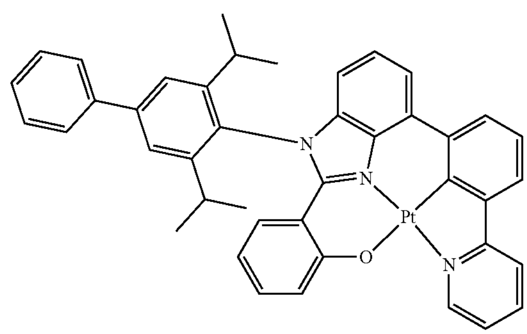
3-92
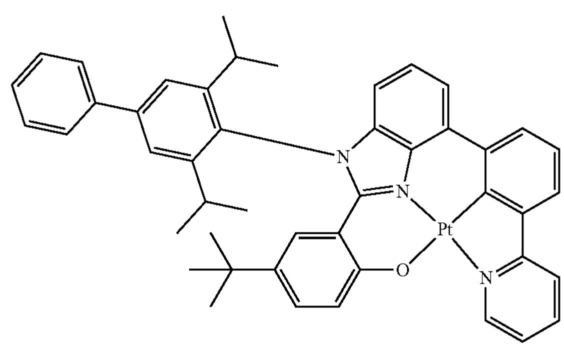

-continued
3-93
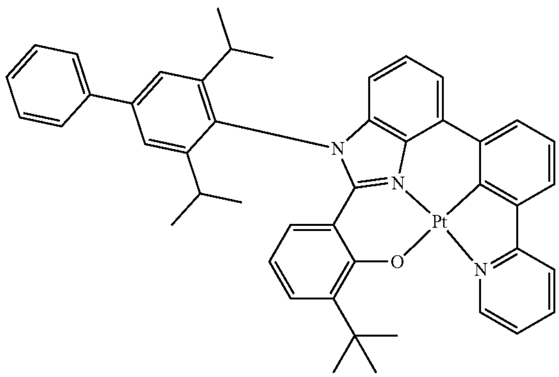
3-94
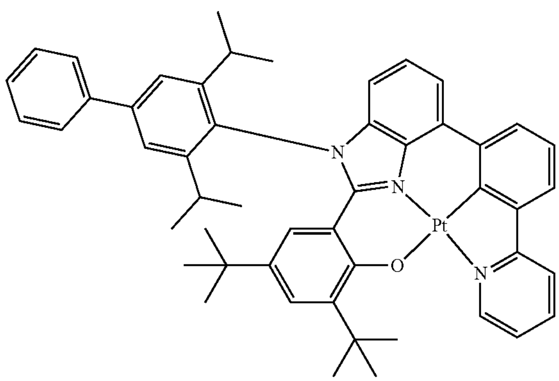
3-95
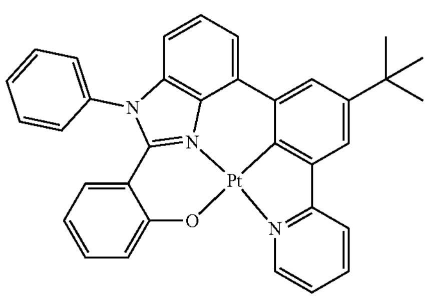
3-96
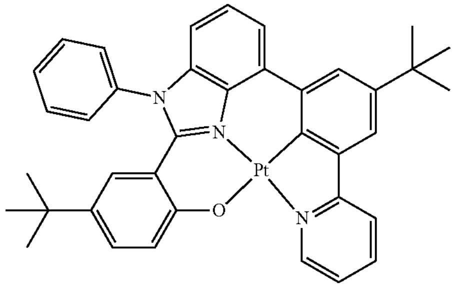
-continued
3-97
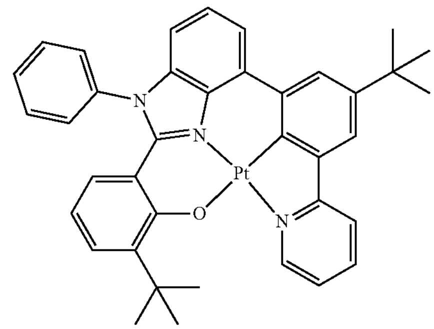
3-98
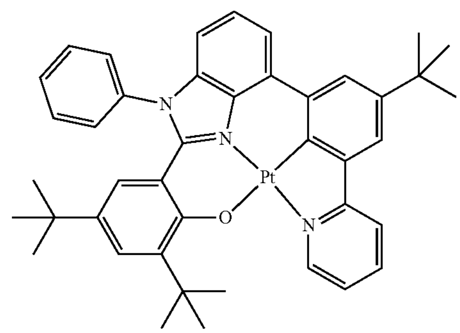
3-99
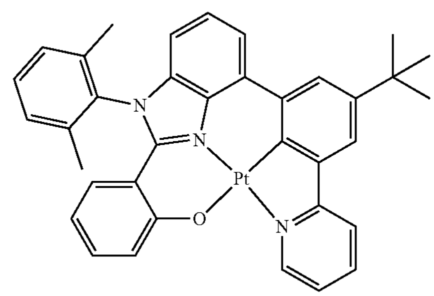
3-100
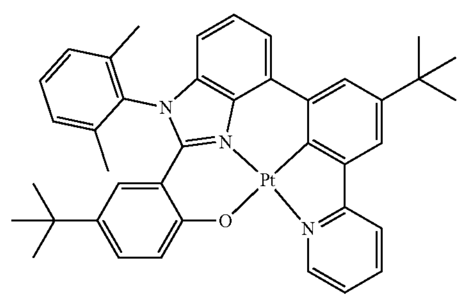
3-101
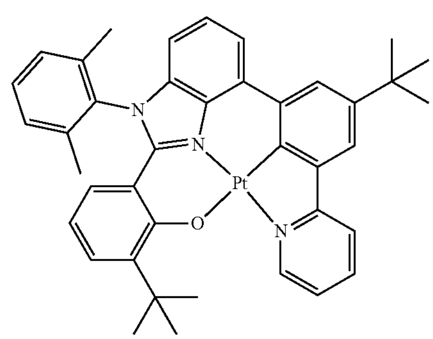

-continued
3-102
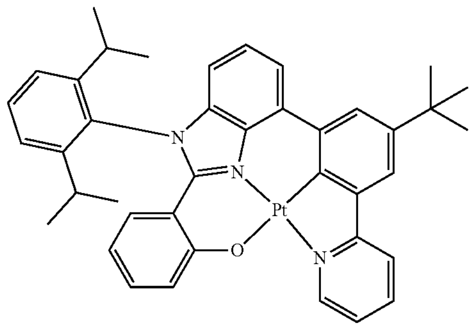
3-103
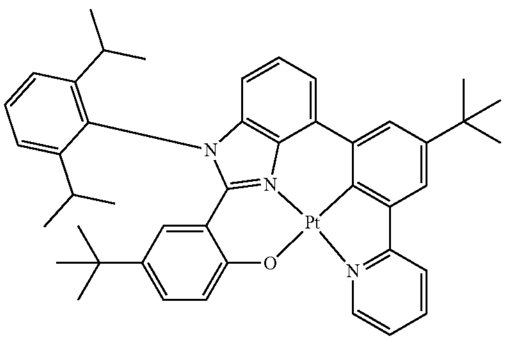
3-104
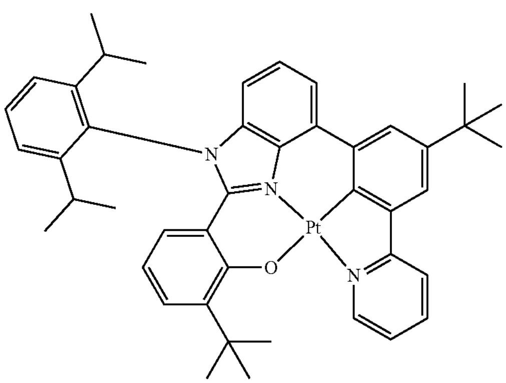
3-105
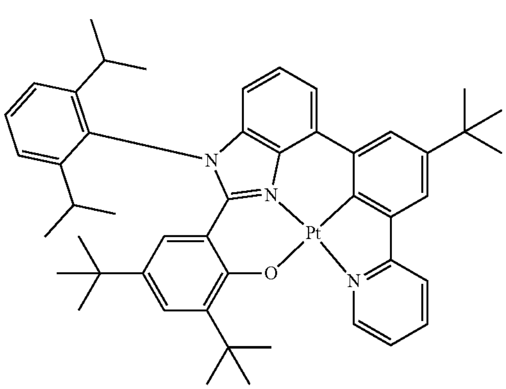
-continued
3-106
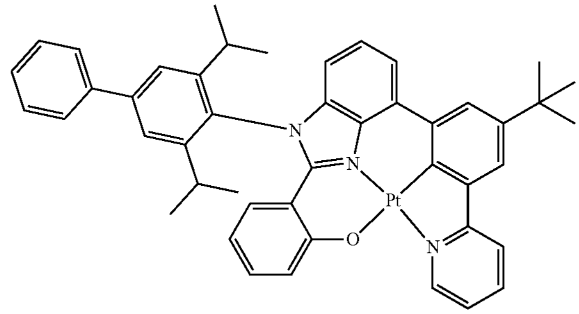
3-107
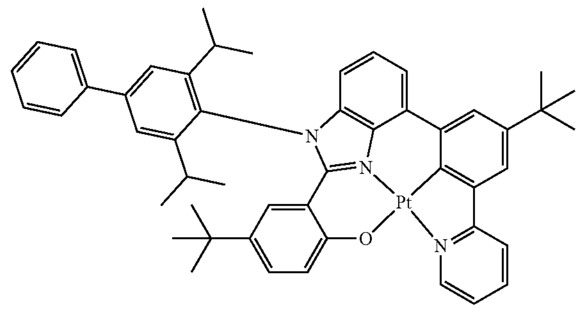
3-108
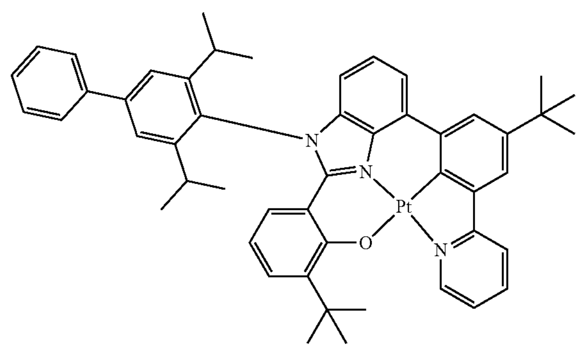
3-109
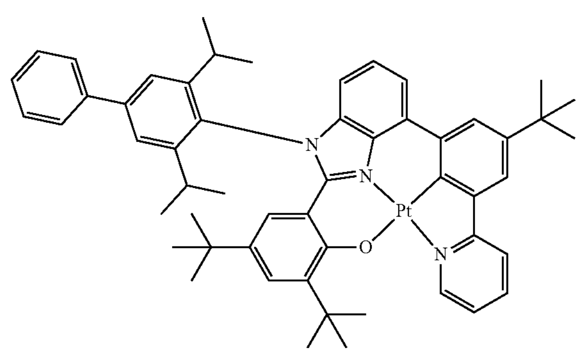

-continued
3-110
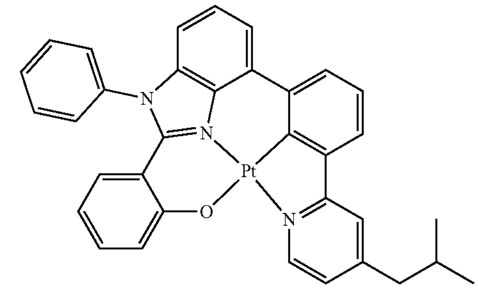
3-111
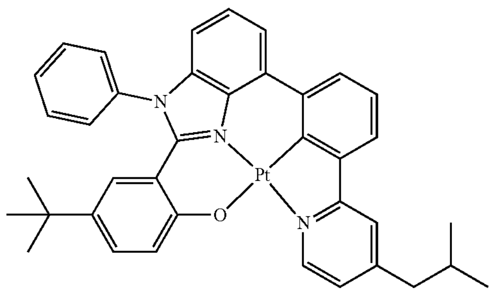
3-112
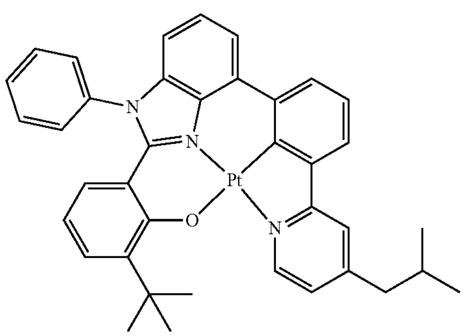
3-113
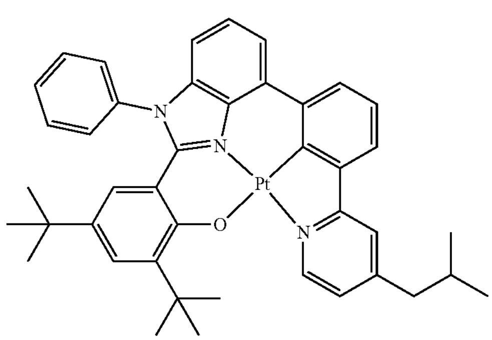
-continued
3-114
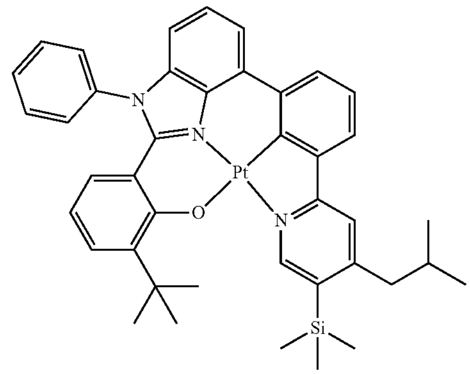
3-115
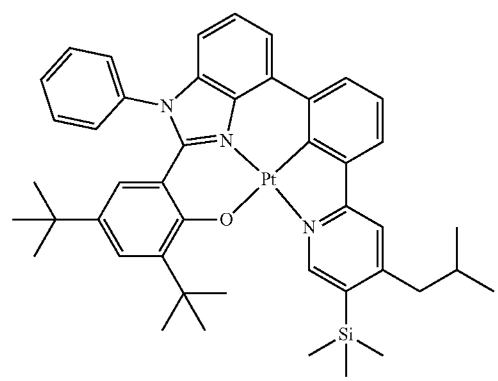
3-116
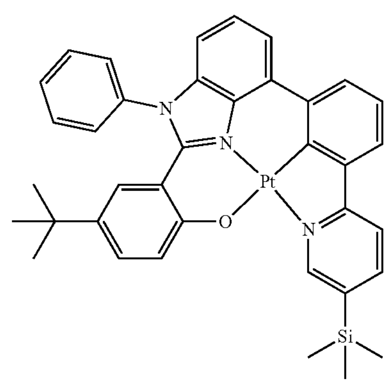
3-117
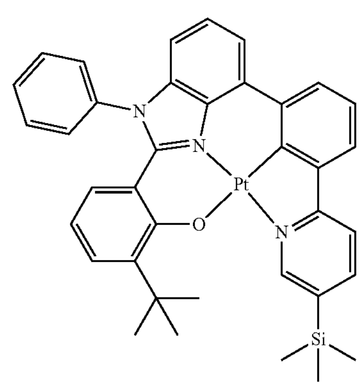

3-118
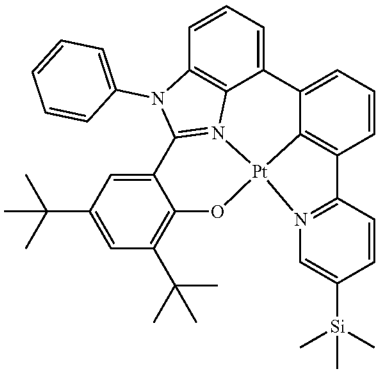
3-119
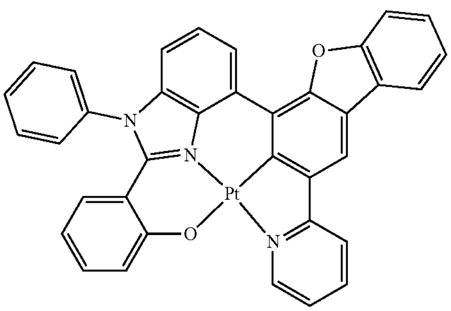
3-120
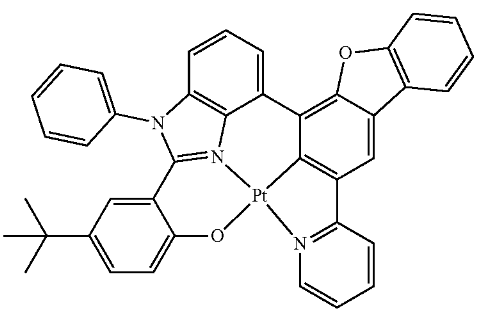
3-121
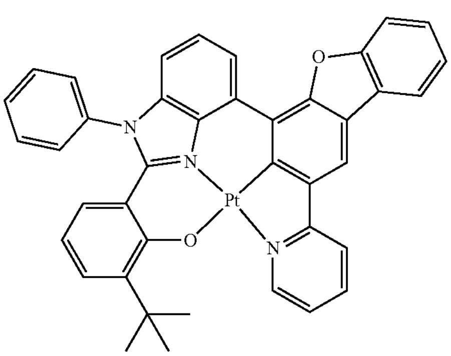
3-122
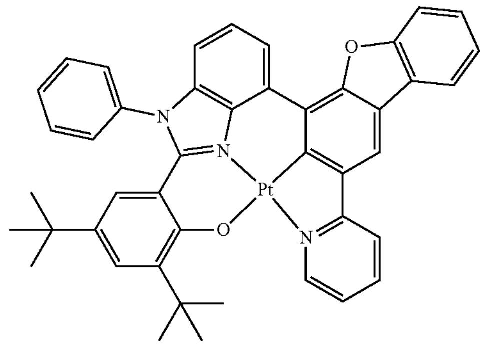
3-123
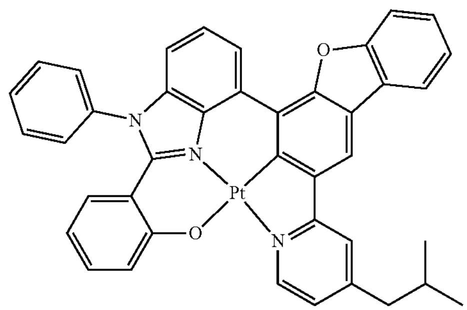
3-124
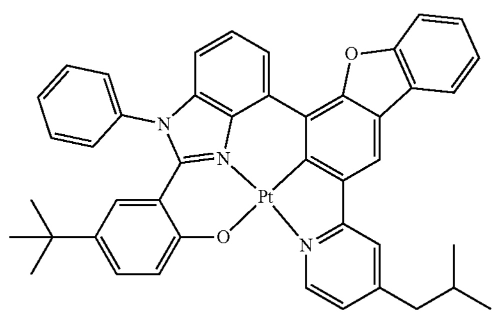
3-125
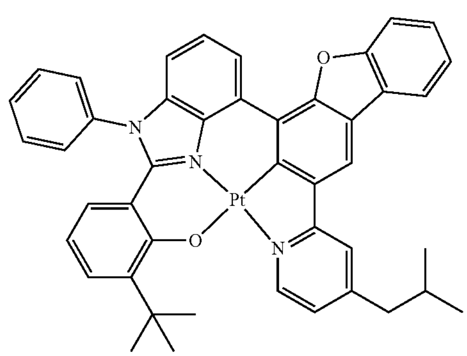

3-126
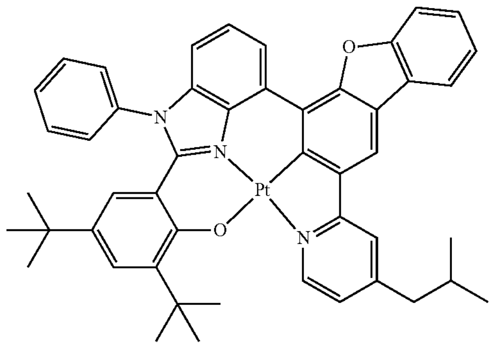
3-127
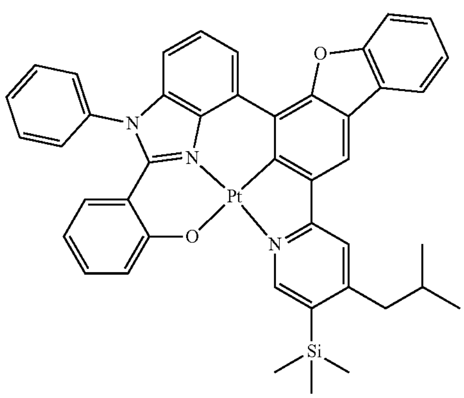
3-128
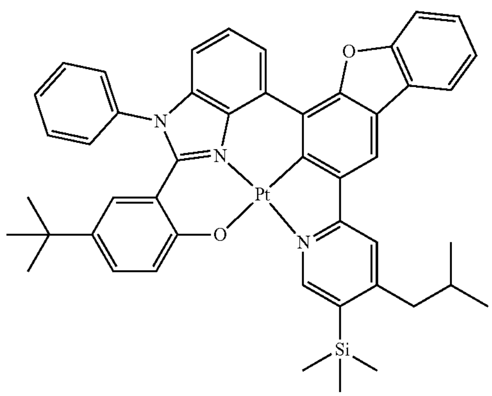
3-129
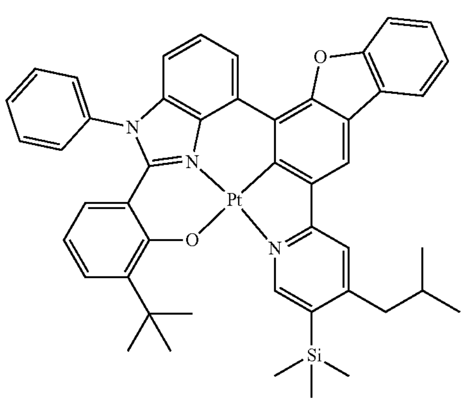
3-130
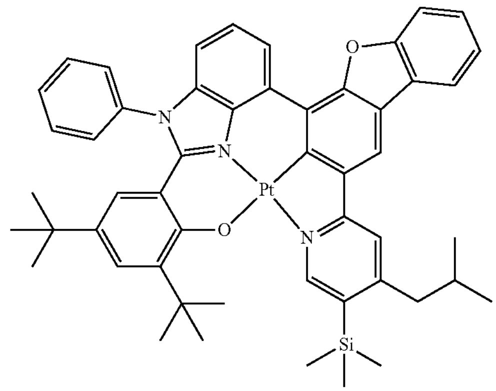
3-131
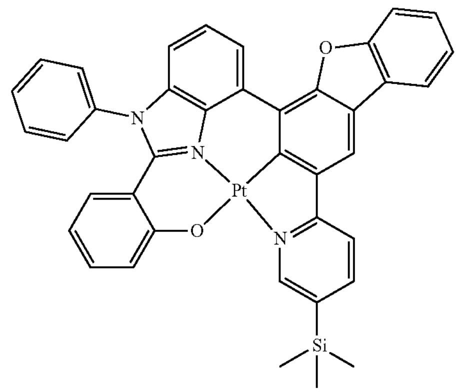
3-132
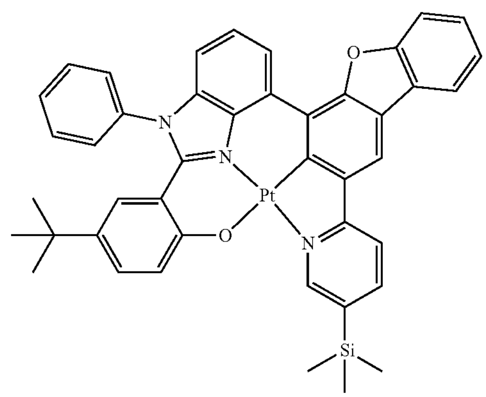
3-133
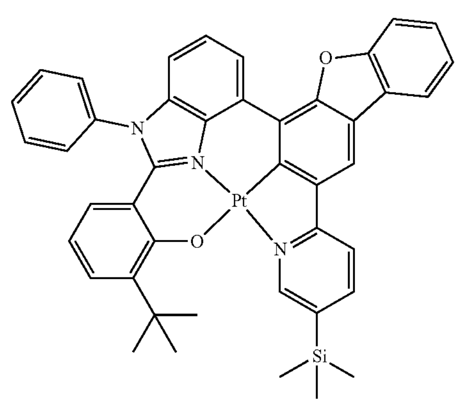

-continued
3-134
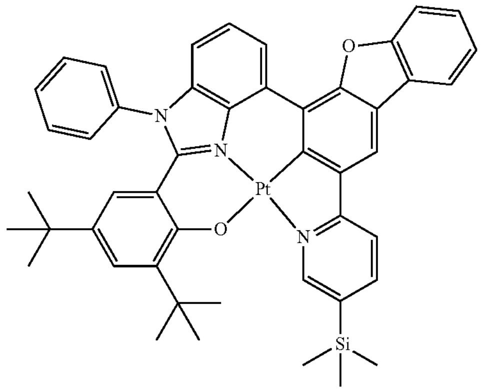
3-135
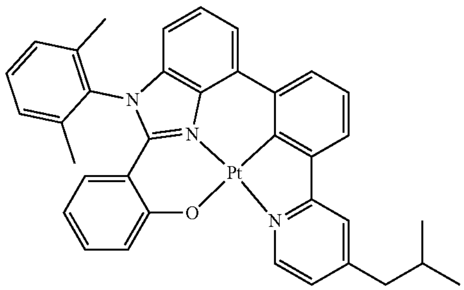
3-136
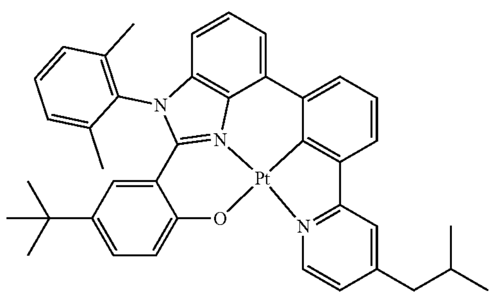
3-137
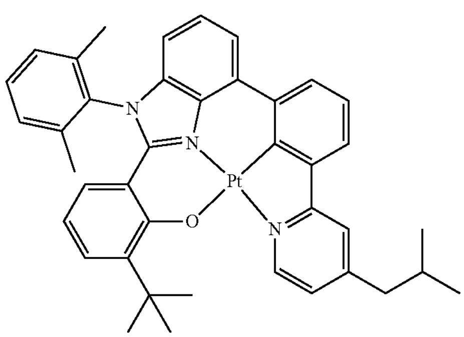
3-138
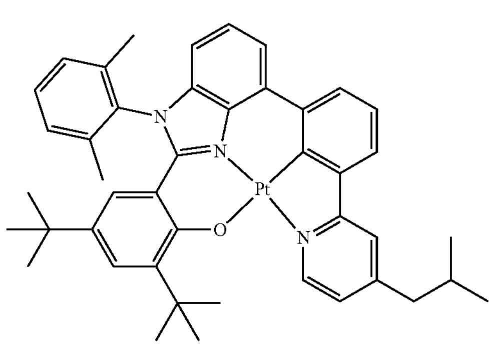
-continued
3-139
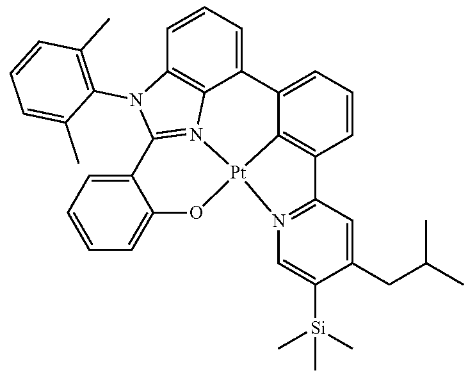
3-140
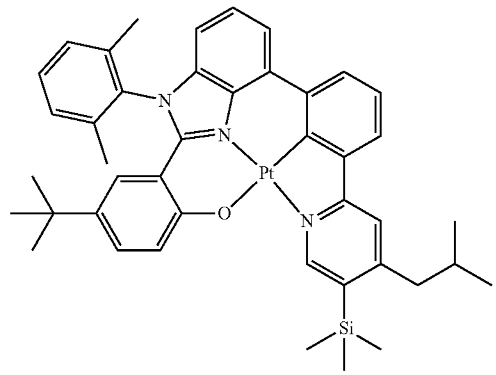
3-141
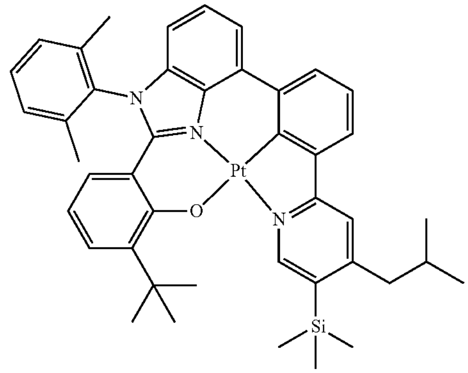
3-142
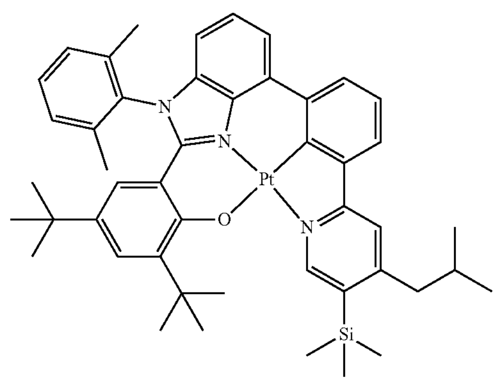

-continued
3-143
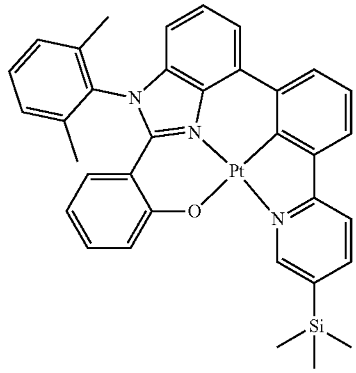
3-144
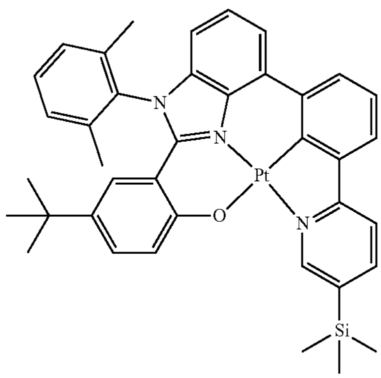
3-145
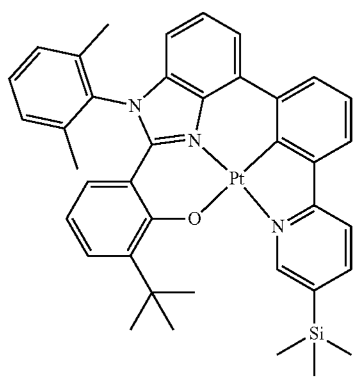
3-146
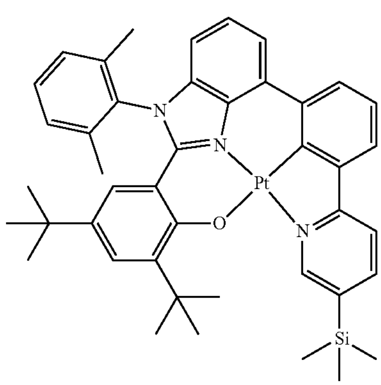
-continued
3-147
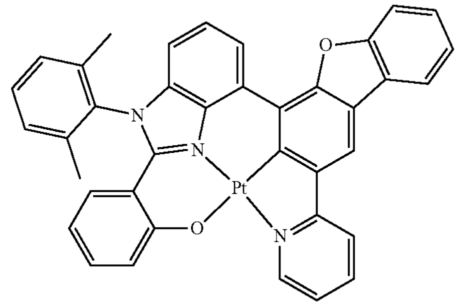
3-148
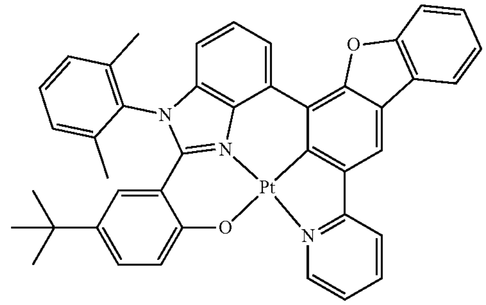
3-149
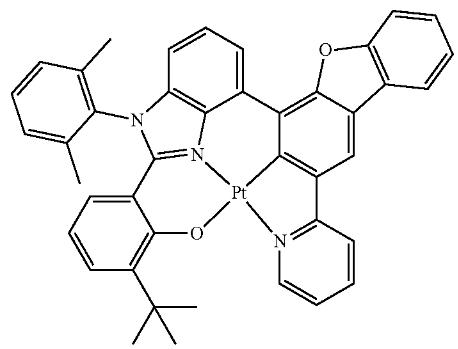
3-150
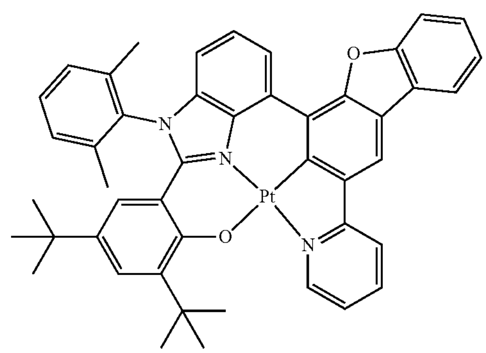
3-151
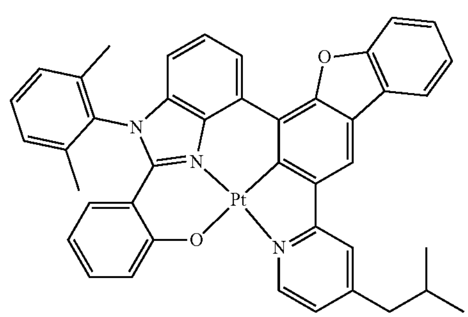

-continued
3-152
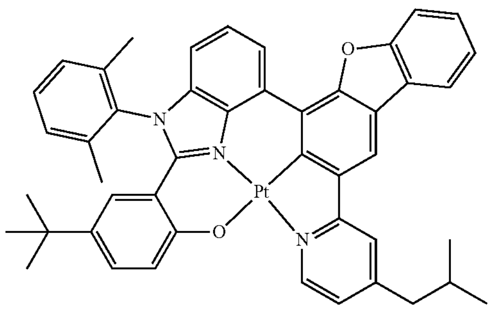
3-153
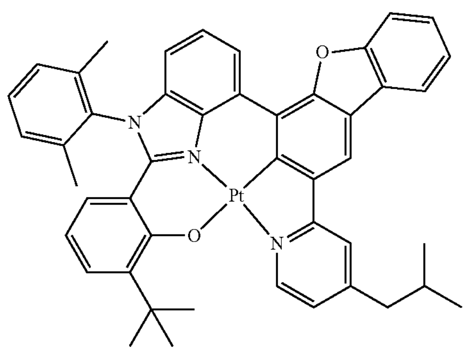
3-154
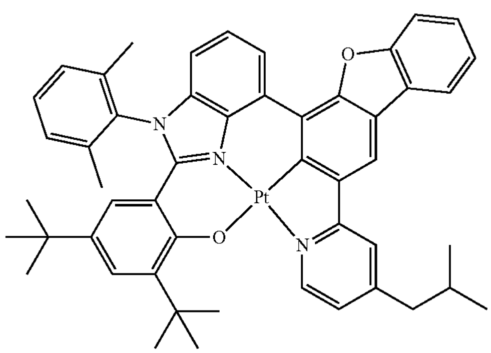
3-155
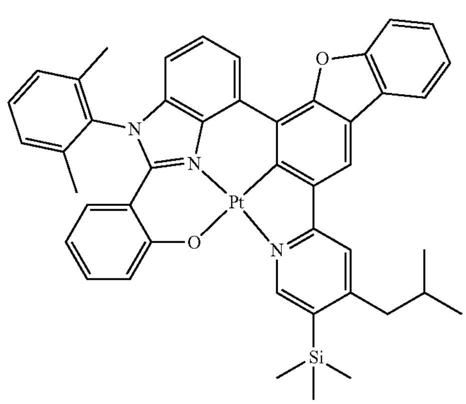
-continued
3-156
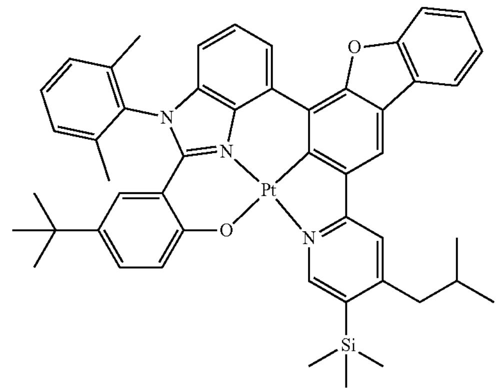
3-157
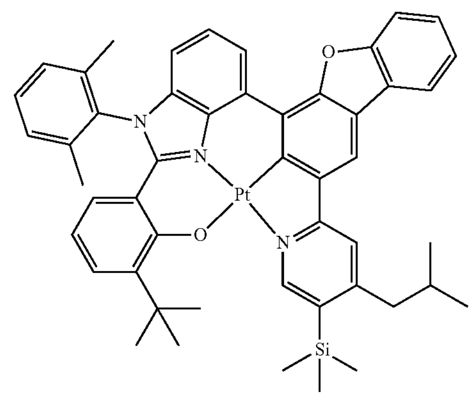
3-158
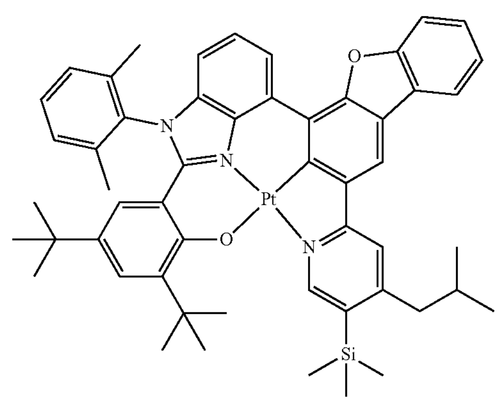
3-159
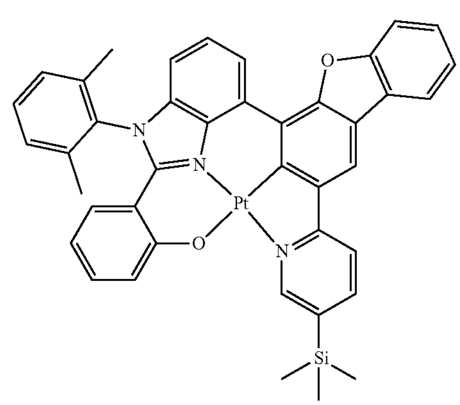

-continued
3-160
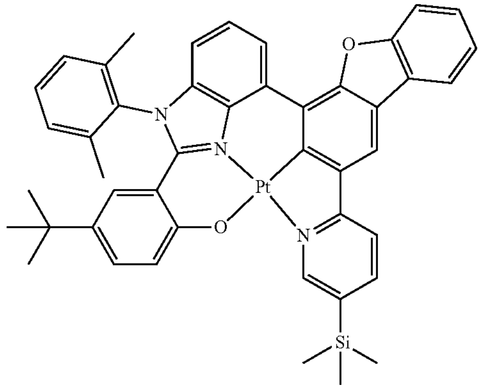
3-161
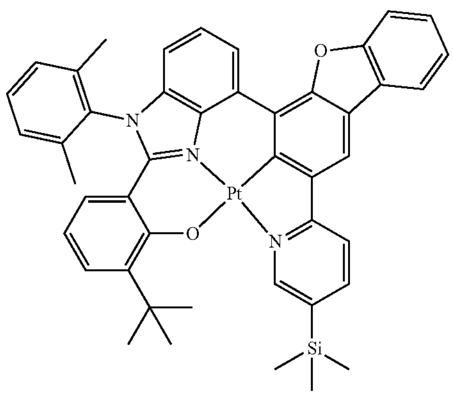
3-162
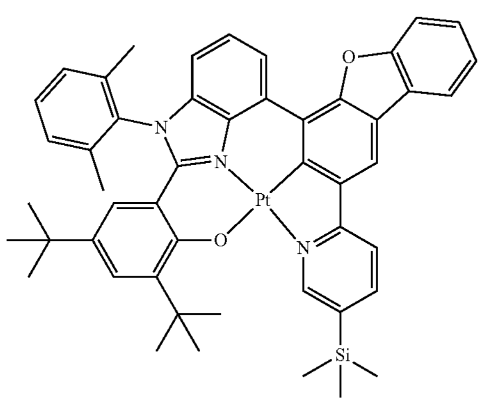
3-163
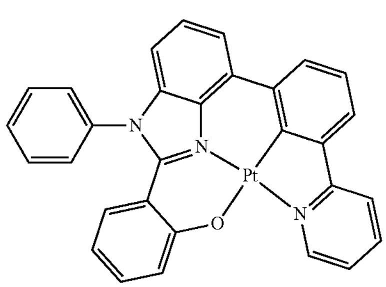
-continued
3-164
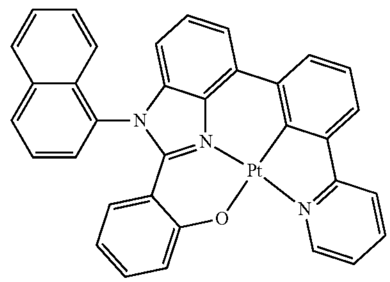
3-165
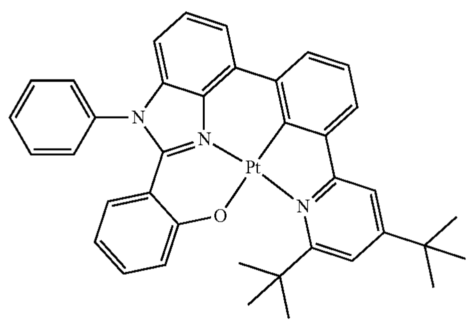
3-166
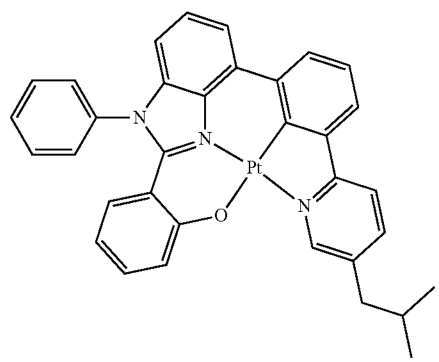
3-167
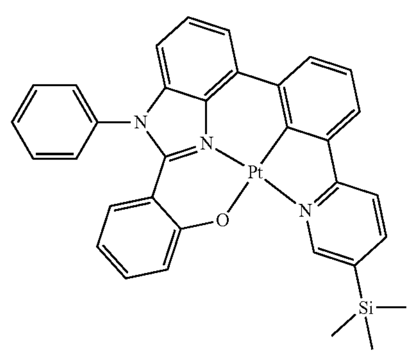

-continued
3-168
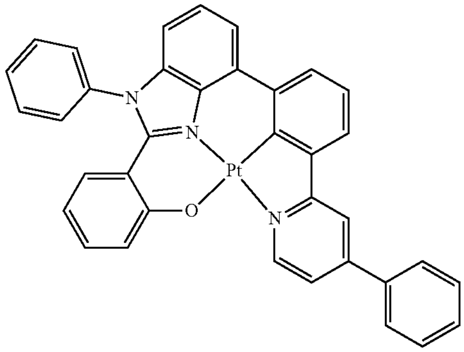
3-169
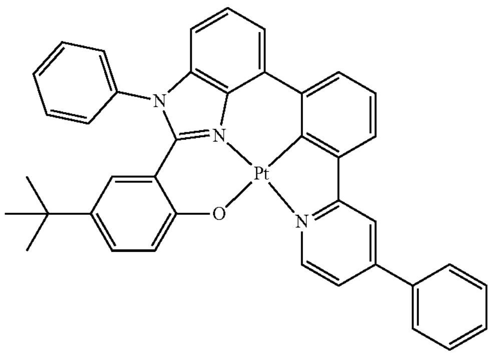
3-170
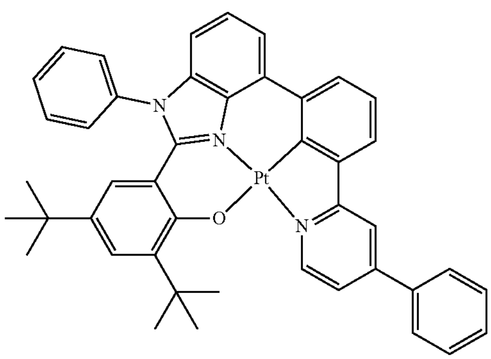
3-171
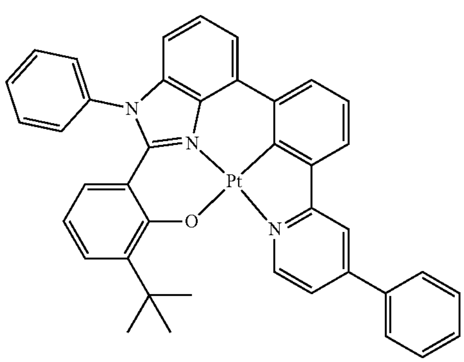
-continued
3-172
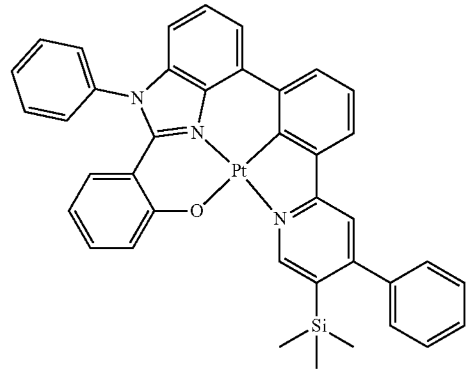
3-173
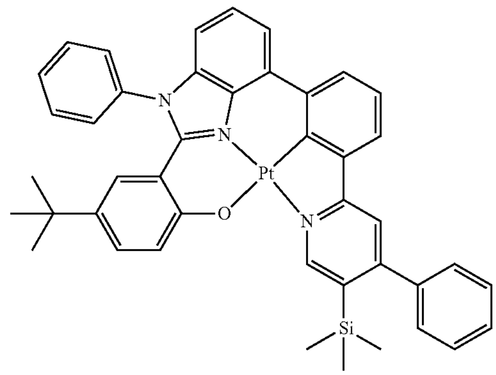
3-174
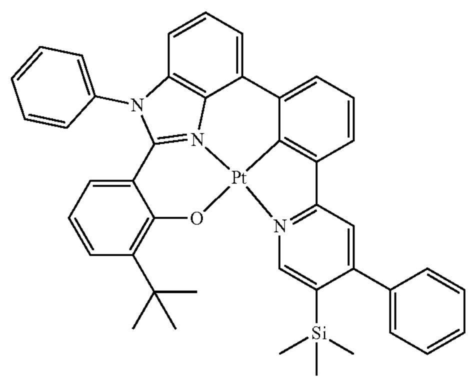
3-175
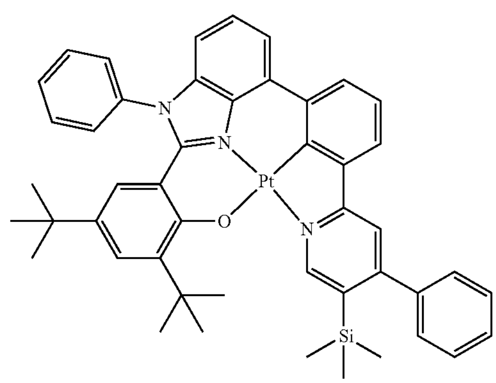

3-176
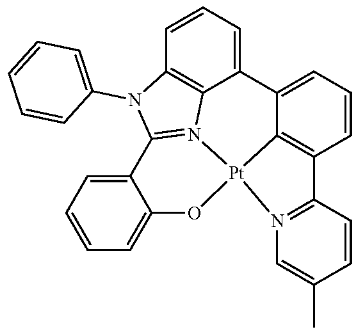
3-177
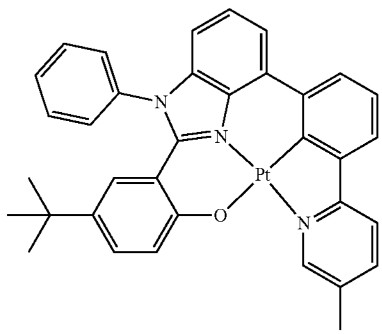
3-178
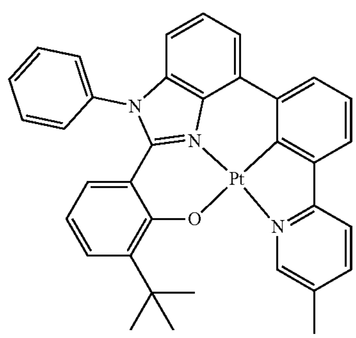
3-179
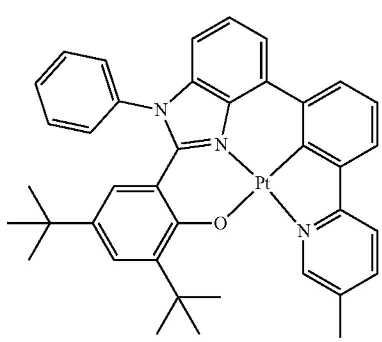
3-180
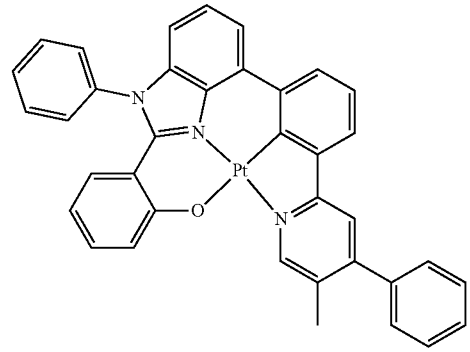
3-181
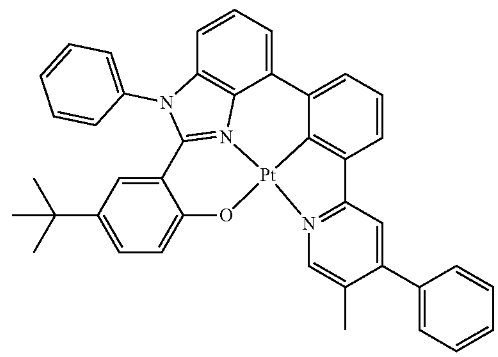
3-182
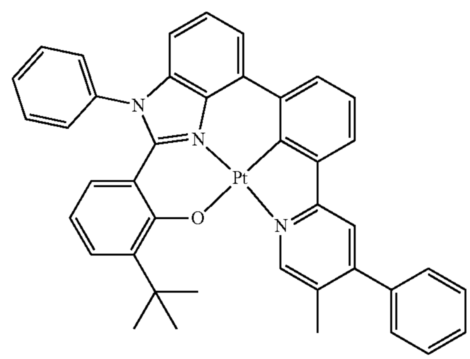
3-183
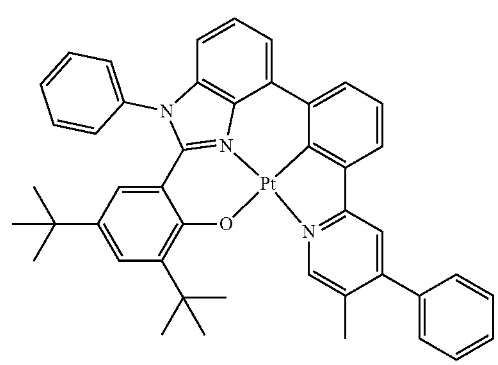

-continued
3-184
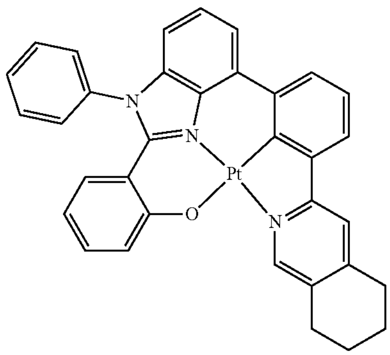
3-185
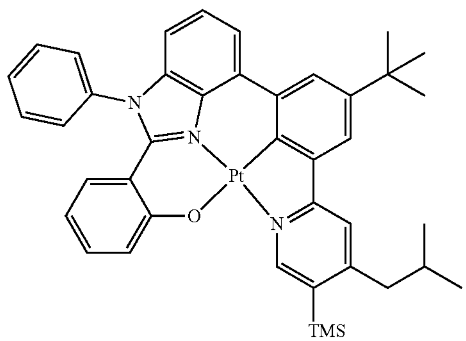
3-186
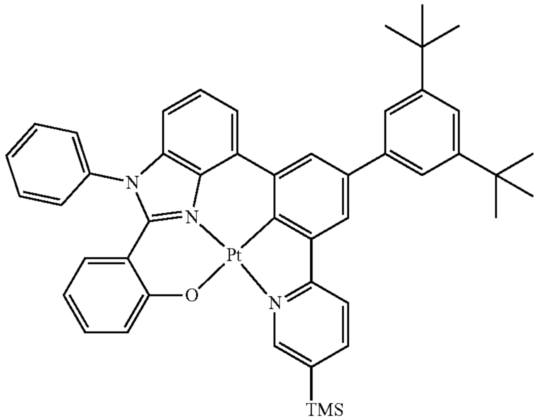
3-187
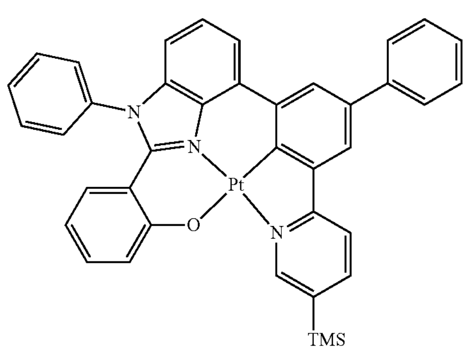
3-188
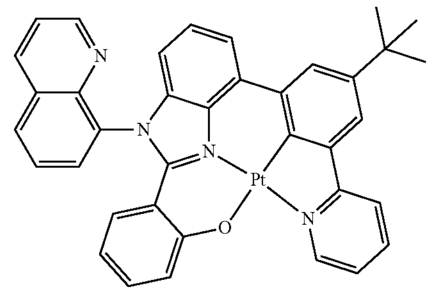
3-189
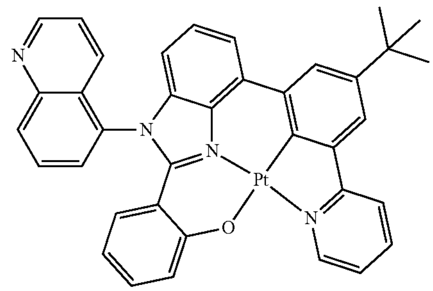
3-190
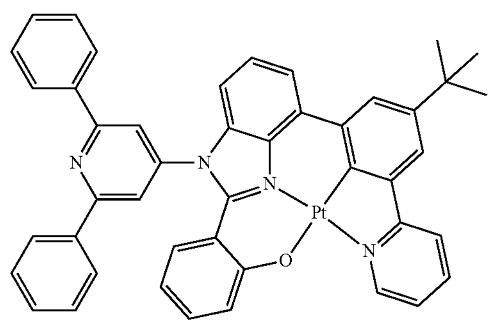
3-191
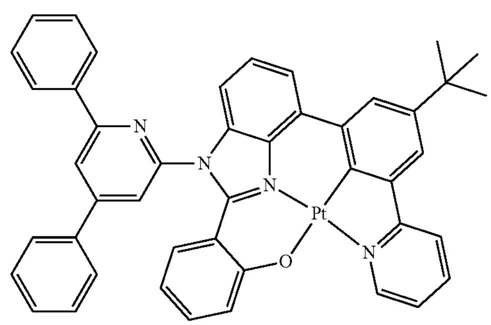
3-192
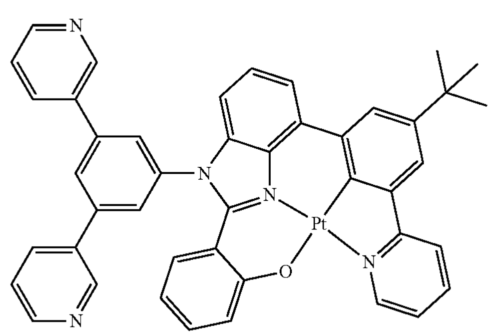

-continued
3-193
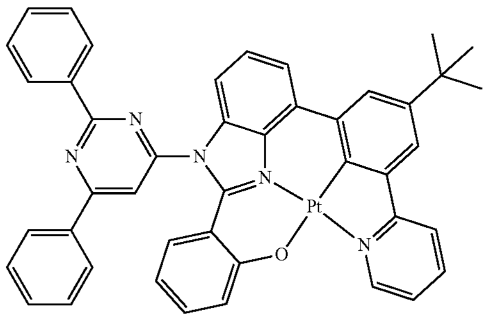
3-194
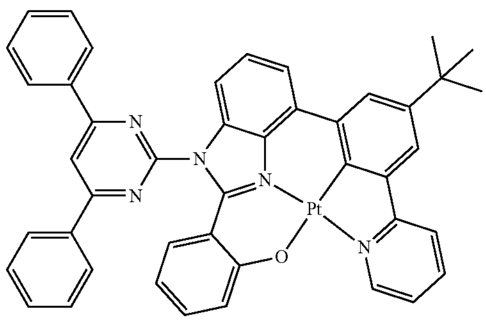
3-195
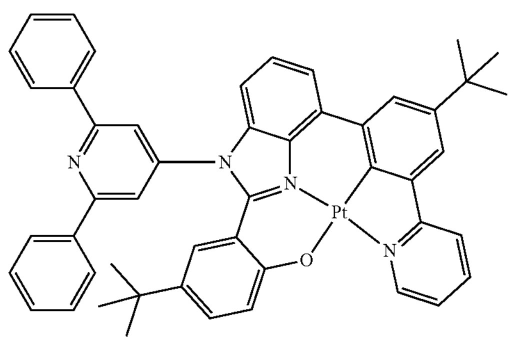
3-196
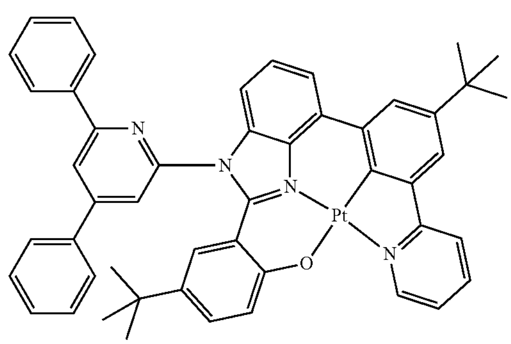
-continued
3-197
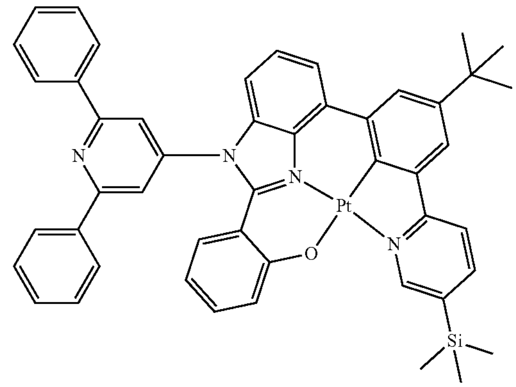
3-198
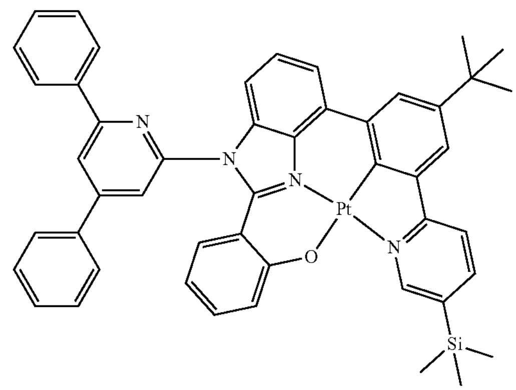
3-199
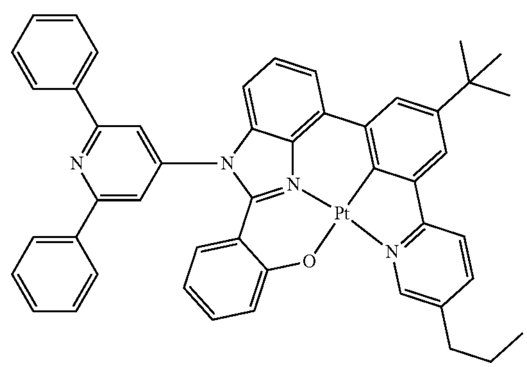
3-200
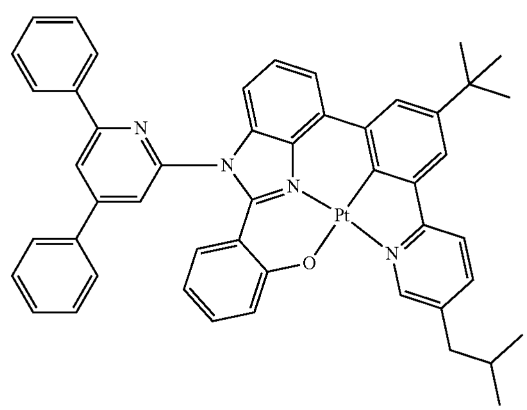

-continued
3-201
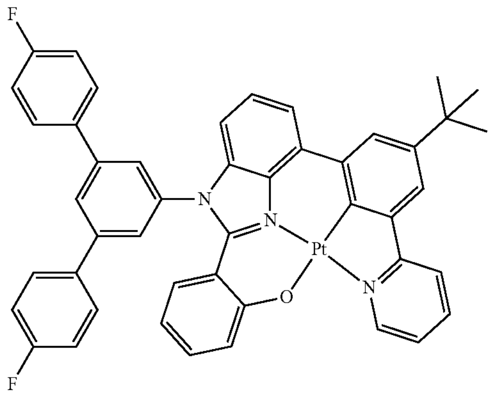
3-202
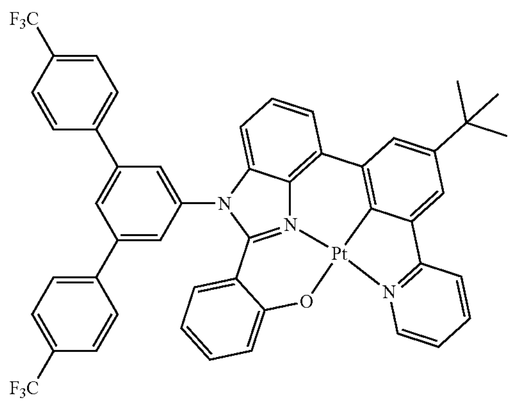
3-203
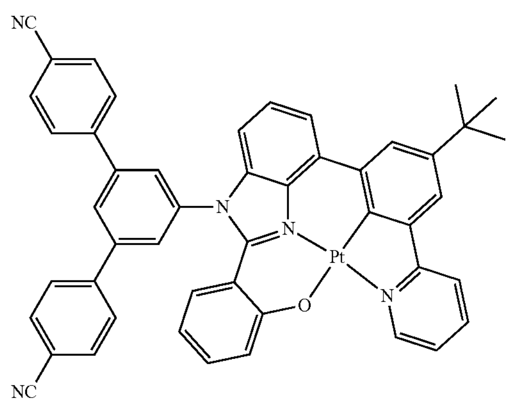
3-204
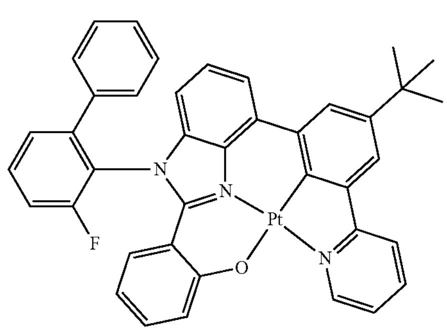
-continued
3-205
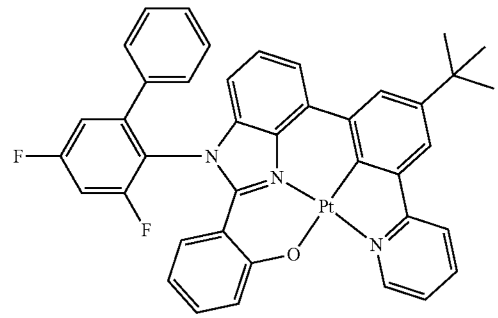
3-206
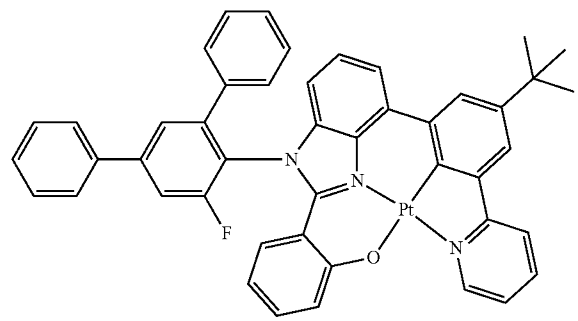
3-207
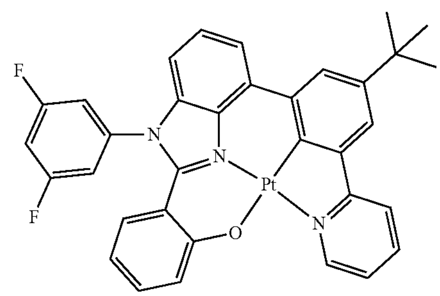
3-208
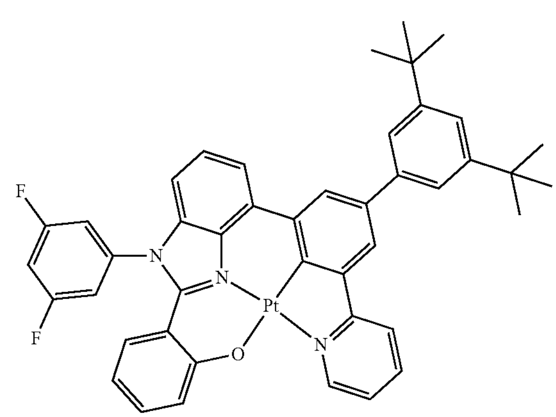

3-209
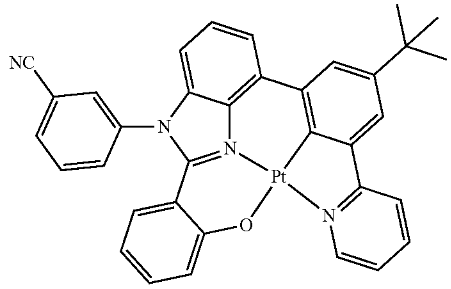
3-210
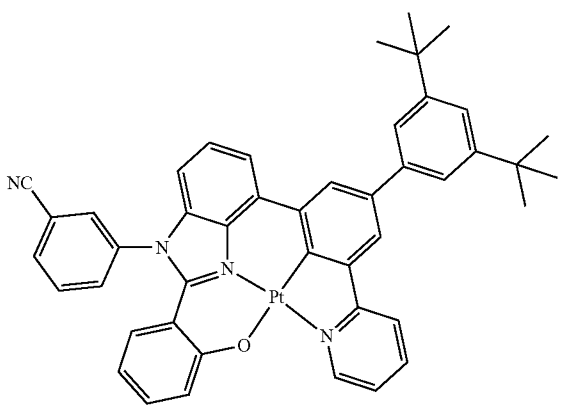
3-211
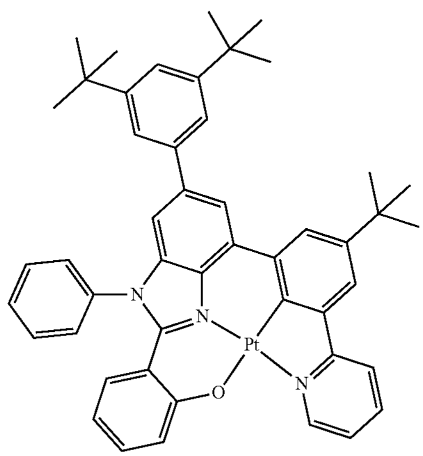
3-212
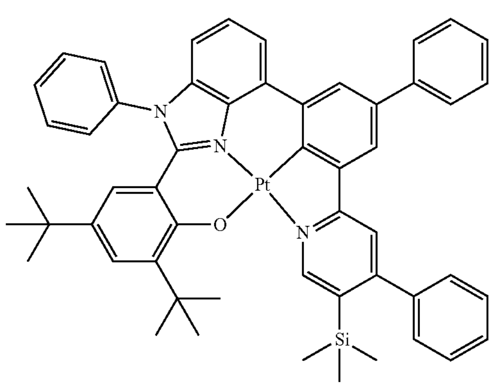
3-213
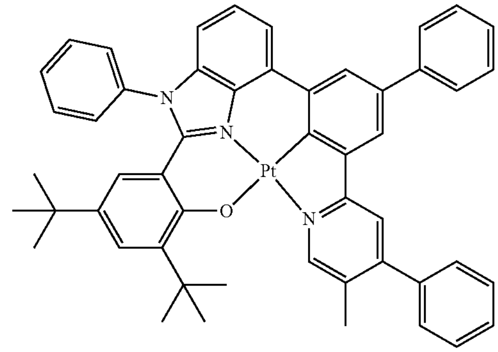
3-214
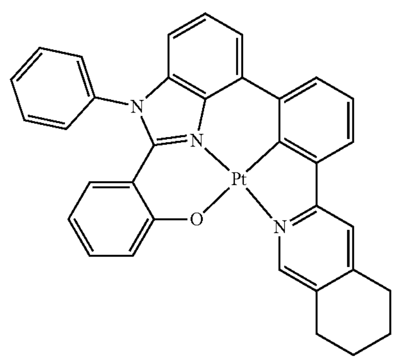
3-215
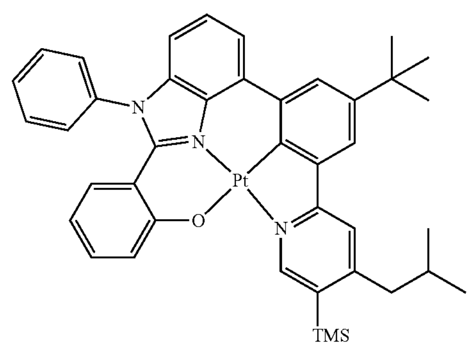
3-216
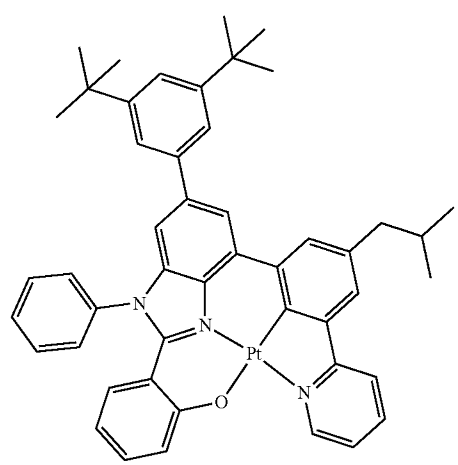

-continued
3-217
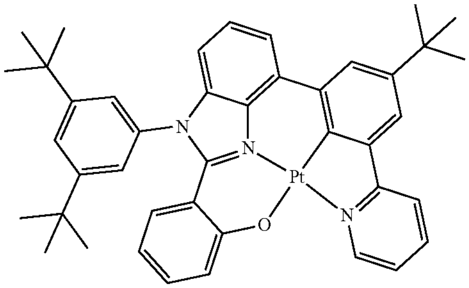
3-218
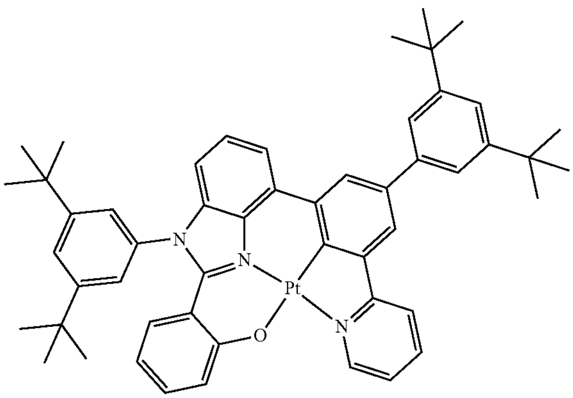
3-219
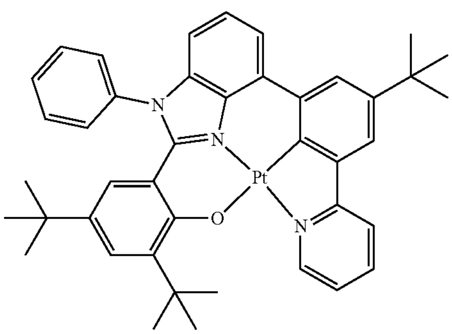
3-220
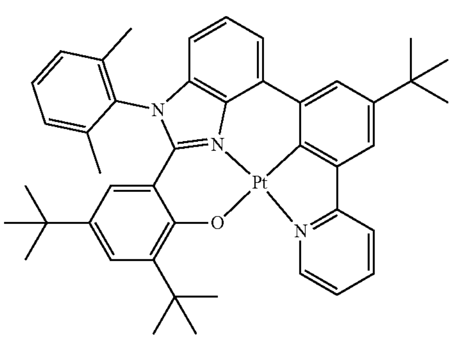
-continued
3-221
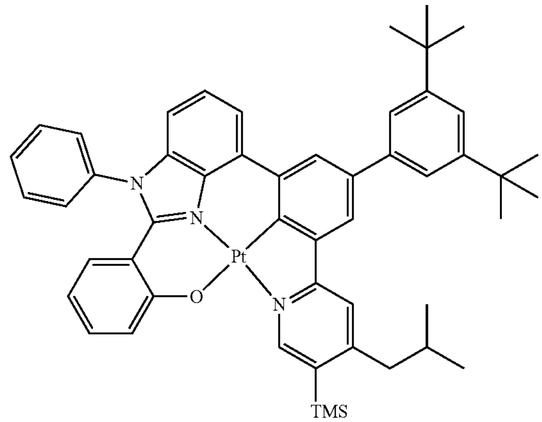
3-222
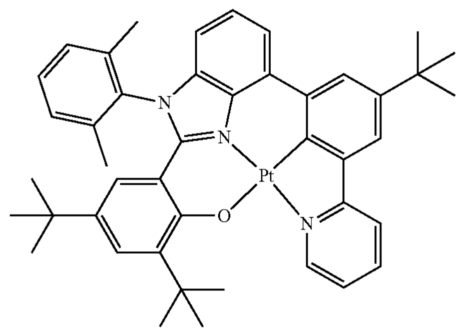
3-223
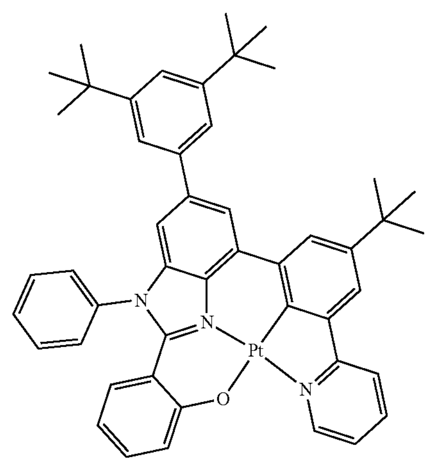
3-224
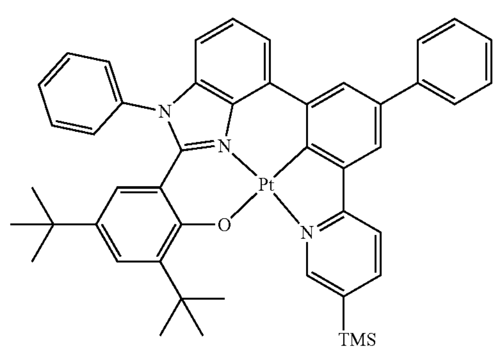

-continued
3-225
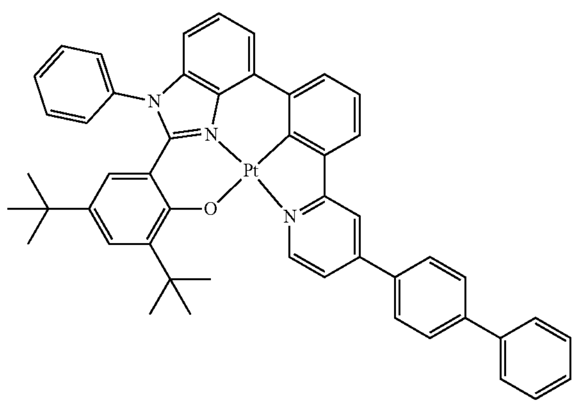
3-226
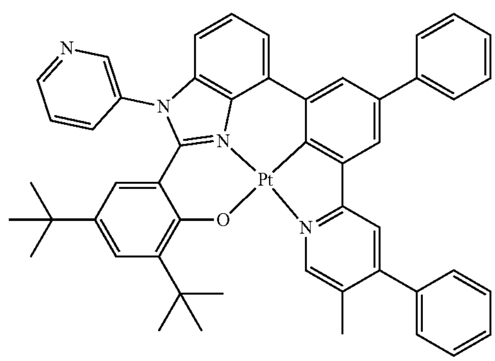
3-227
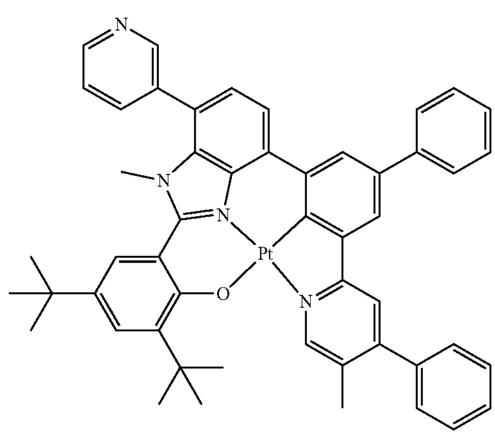
3-228
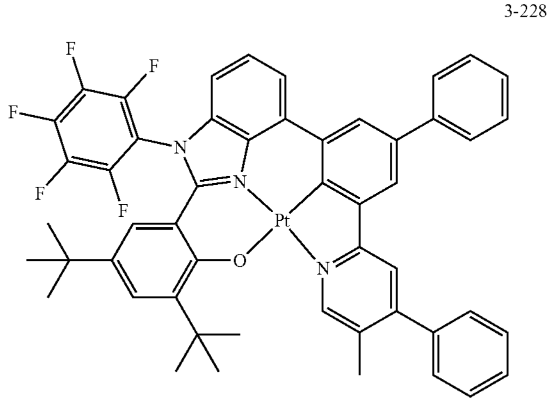
-continued
3-229
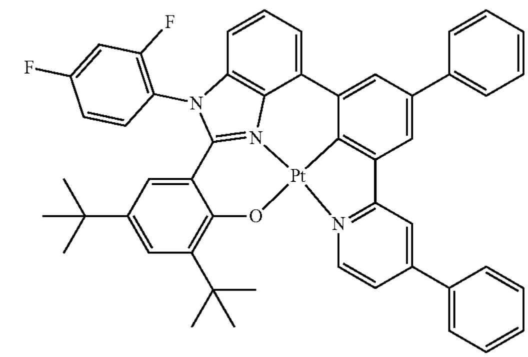
3-230
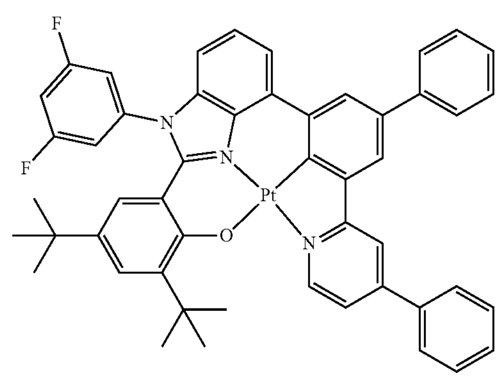
3-231
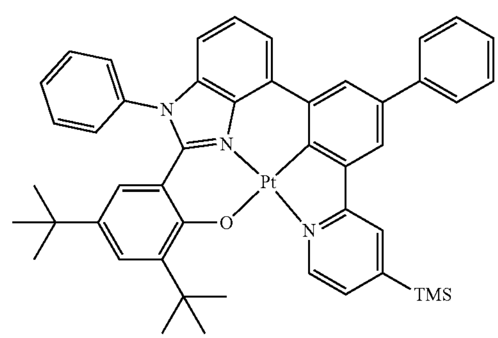
3-232
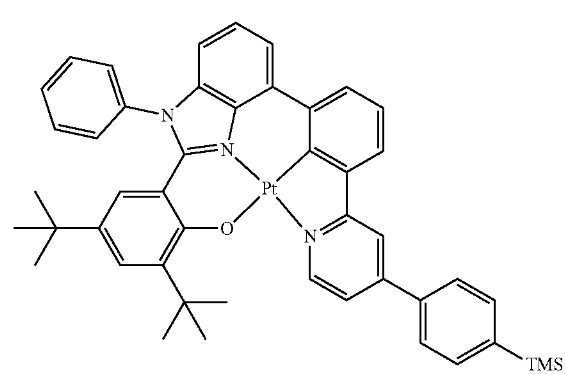

-continued
3-233
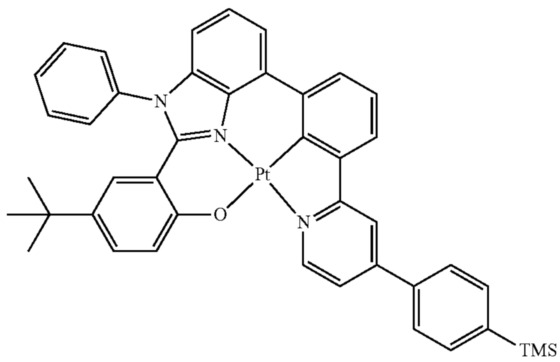
3-234
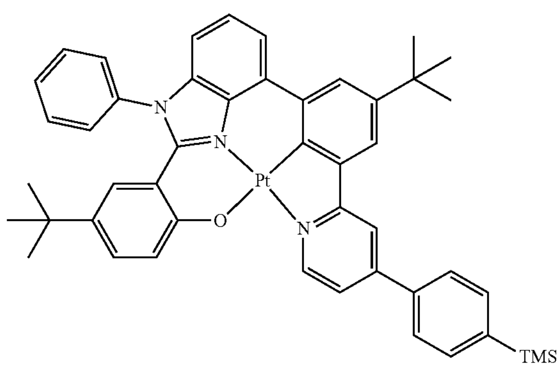
3-235
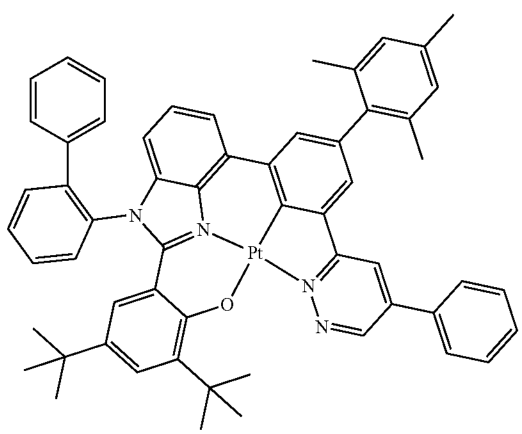
3-236
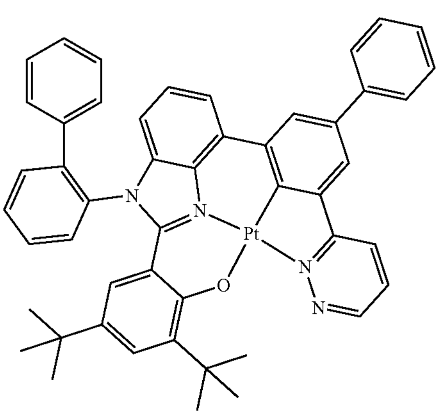
-continued
3-237
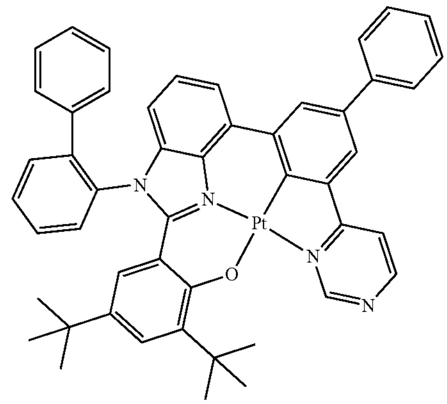
3-238
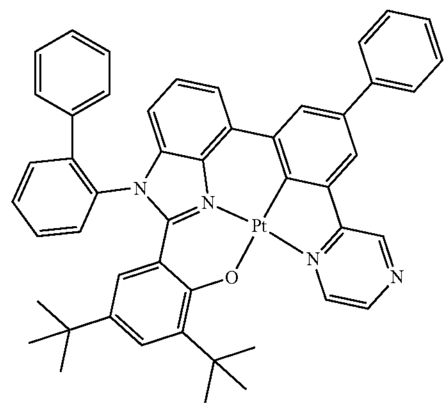
3-239
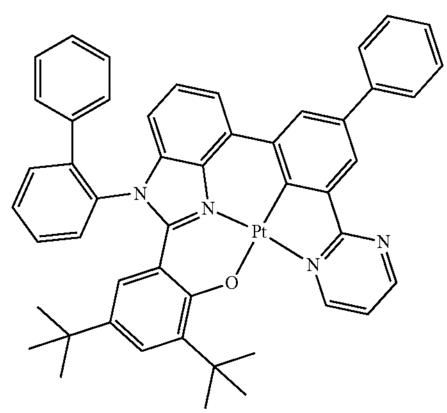
3-240
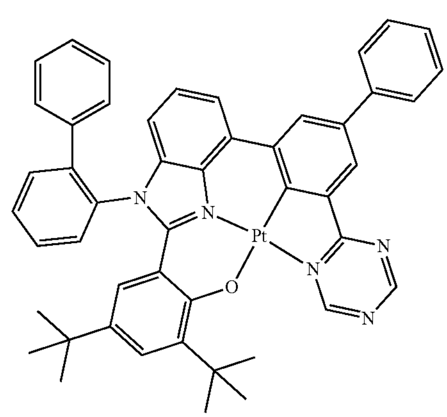

-continued
3-241
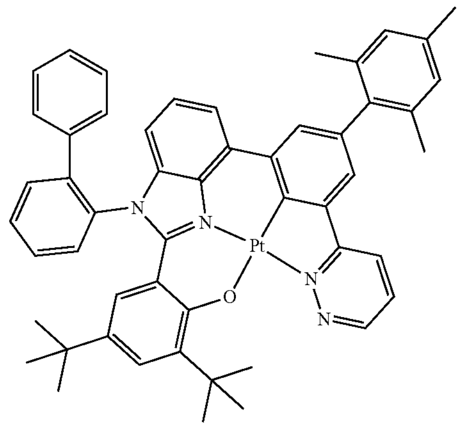
3-242
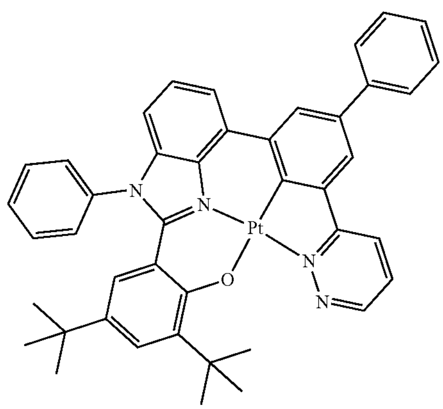
3-243
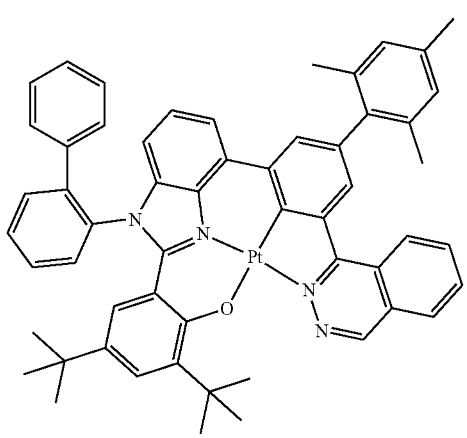
-continued
3-244
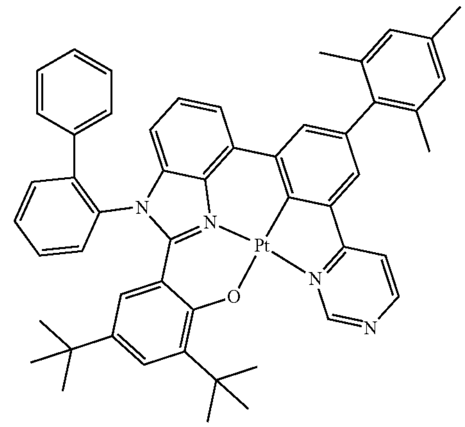
3-245
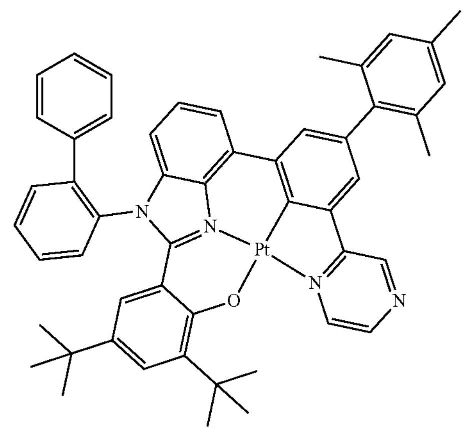
3-246
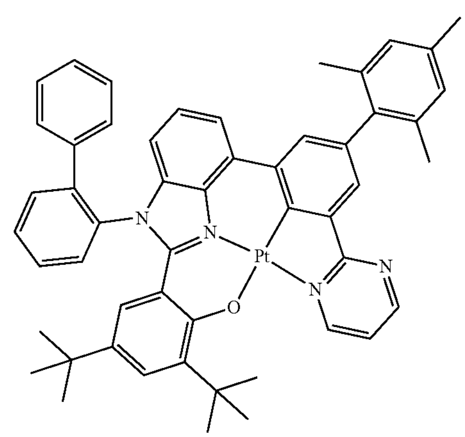

-continued
3-247
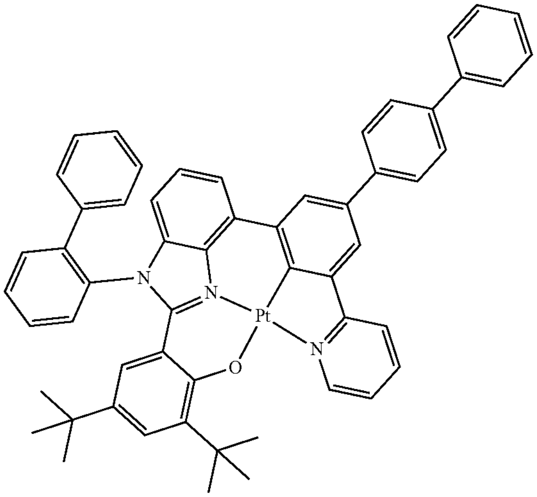
3-248
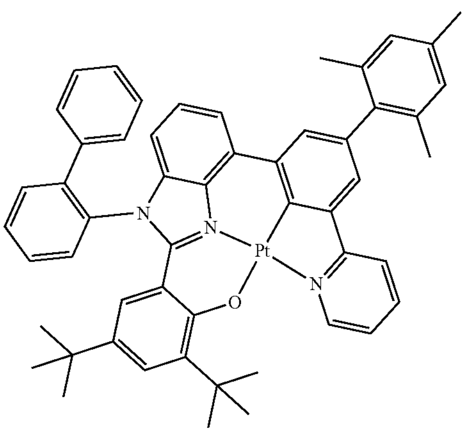
3-249
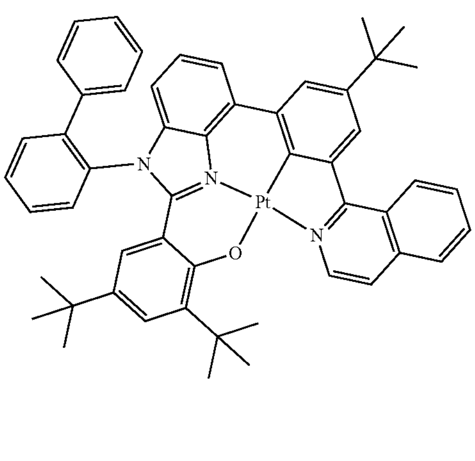
-continued
3-250
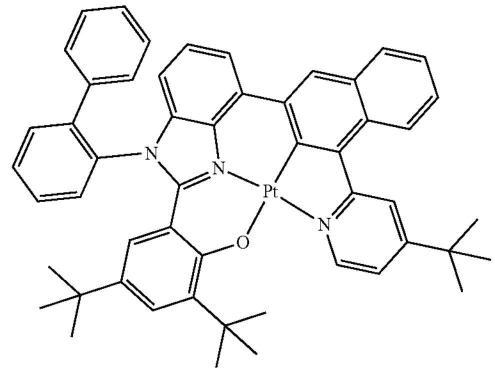
3-251
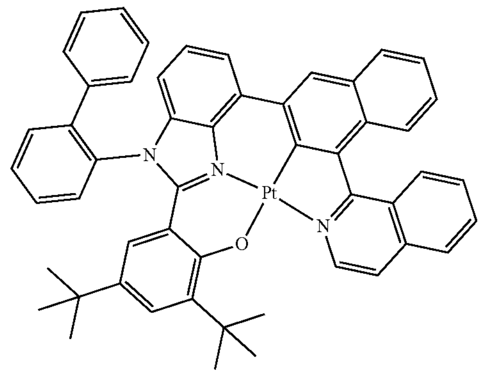
3-252
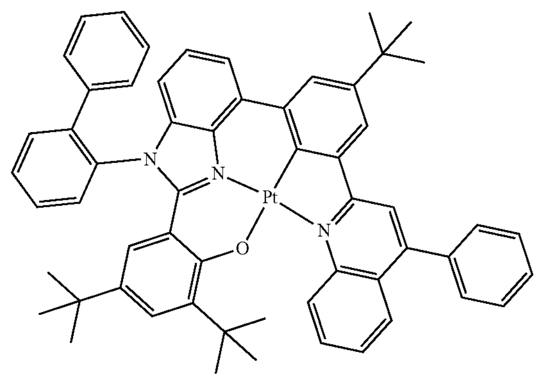
3-253
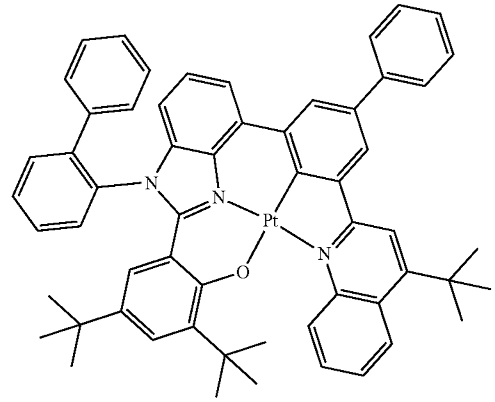

-continued
3-254
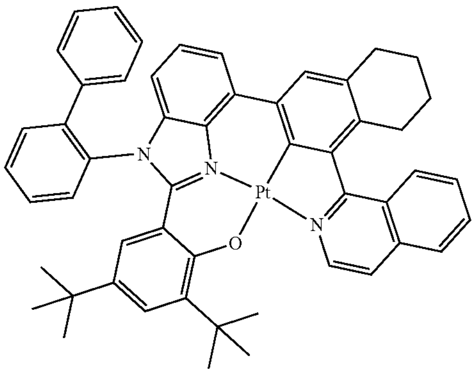
3-255
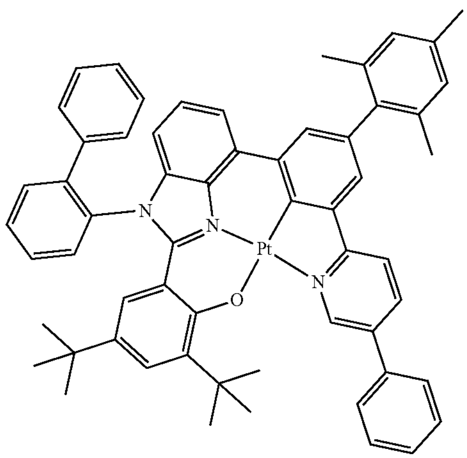
3-256
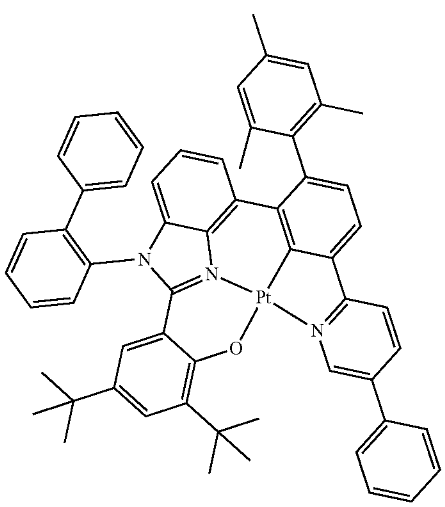
-continued
3-257
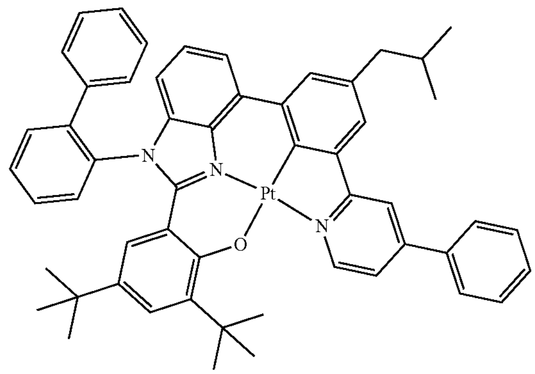
3-258
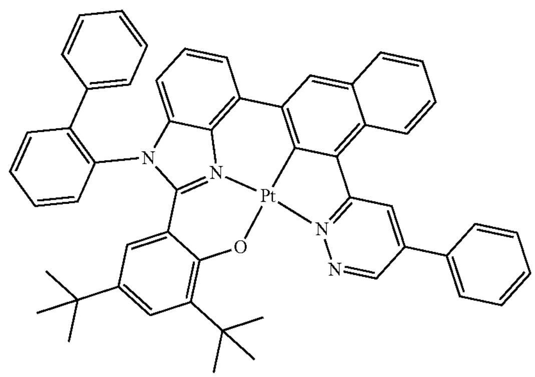
3-259
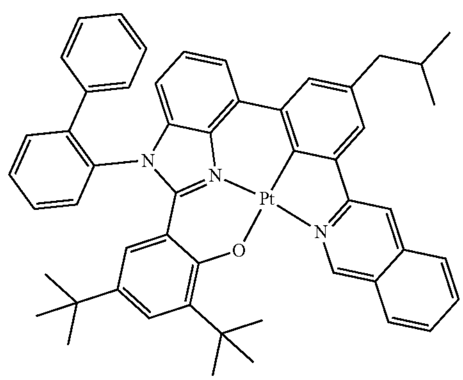
3-260
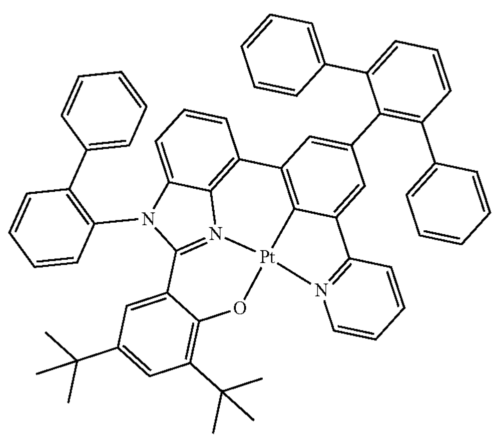

-continued
3-261
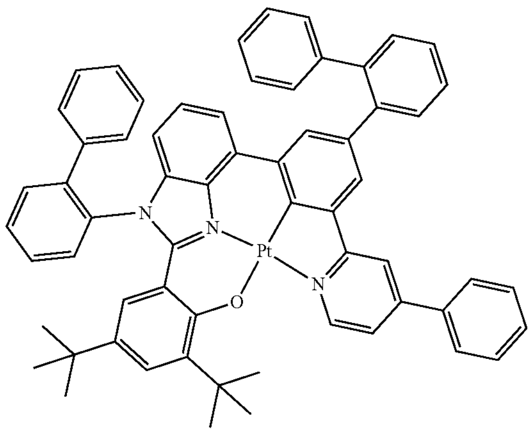
3-262
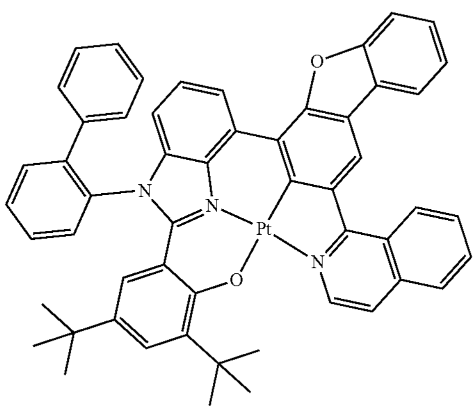
3-263
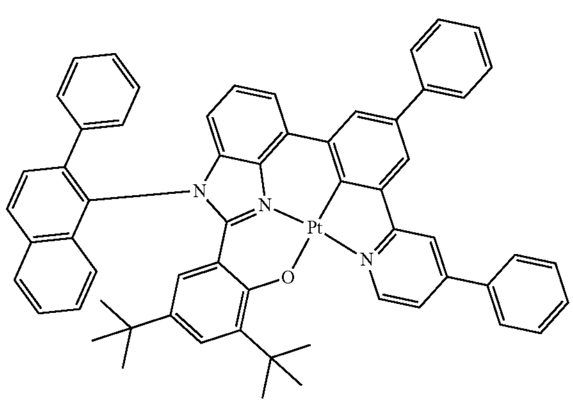
-continued
3-264
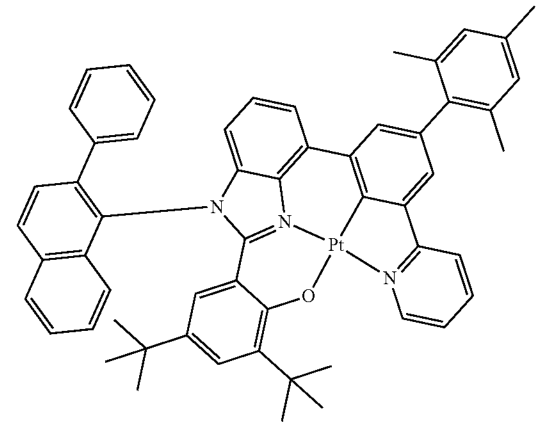
3-265
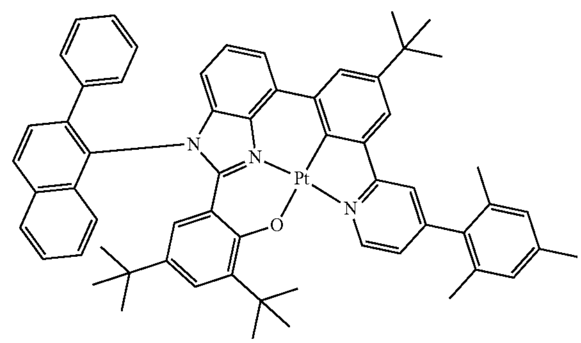
3-266
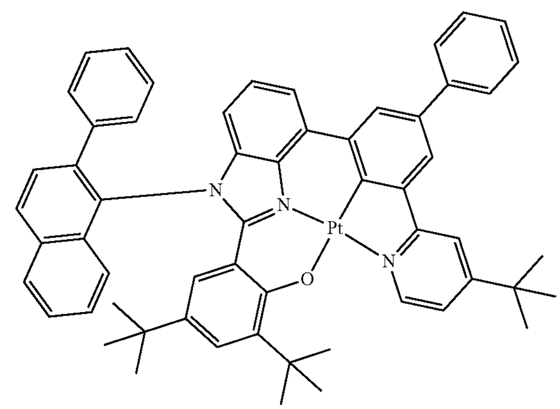
3-267
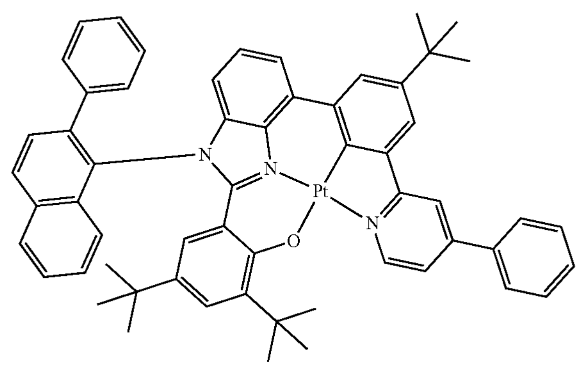

-continued
3-268
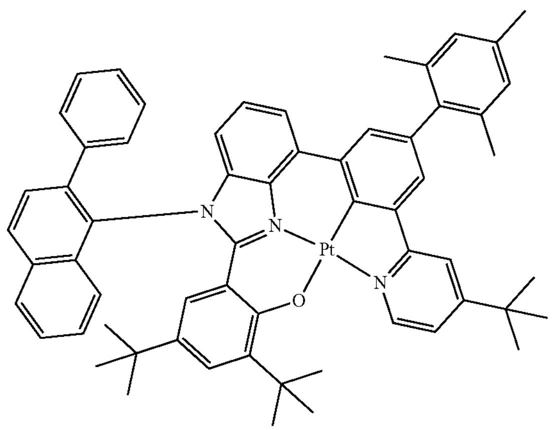
3-269
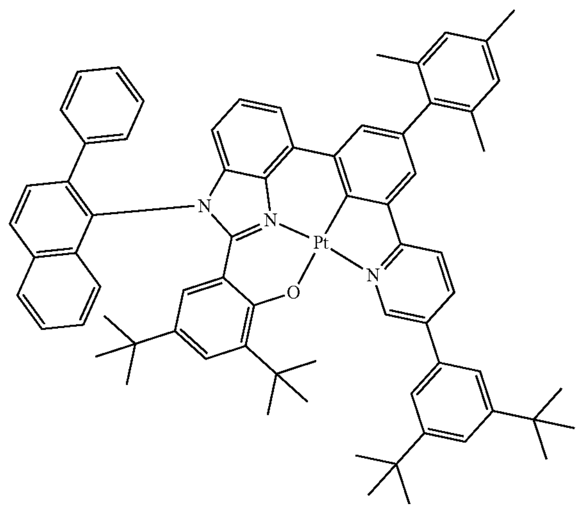
3-270
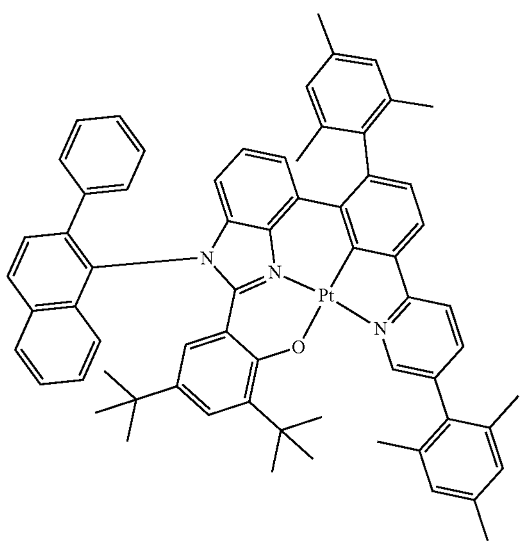
-continued
3-271
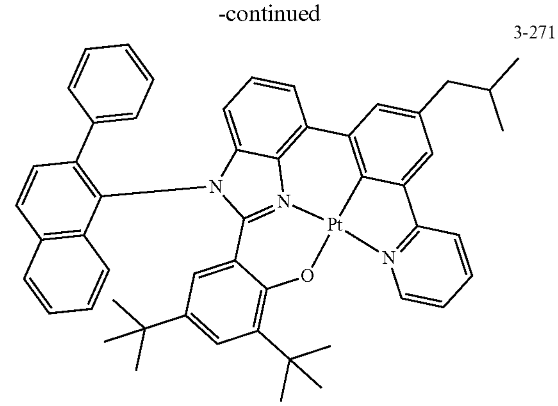
3-272
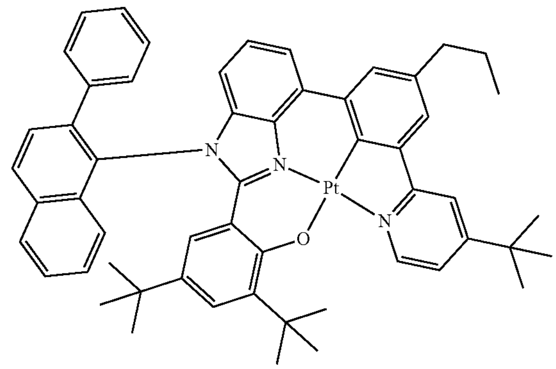
3-273
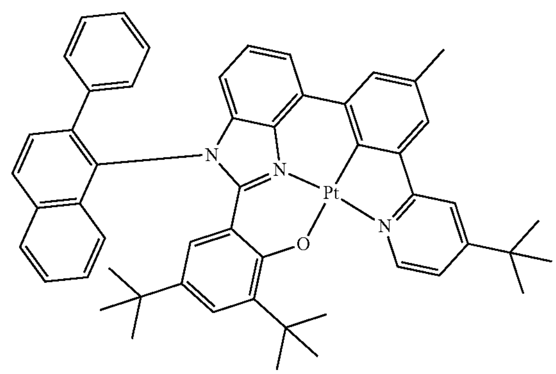
3-274
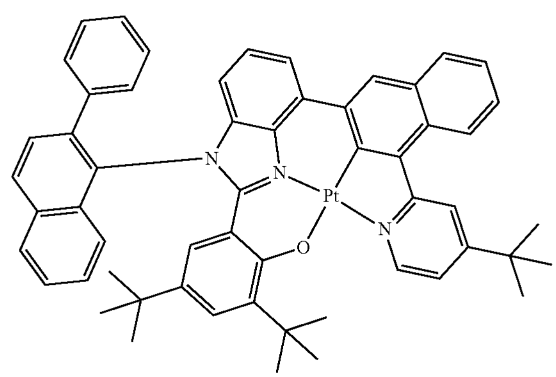

-continued
3-275
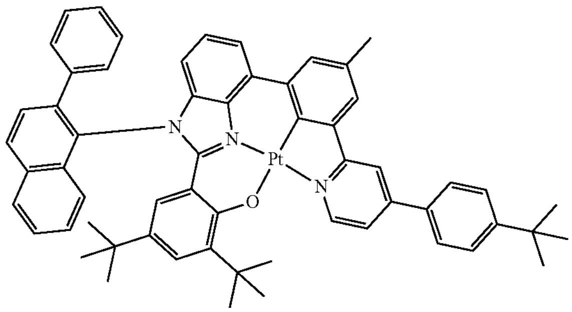
3-276
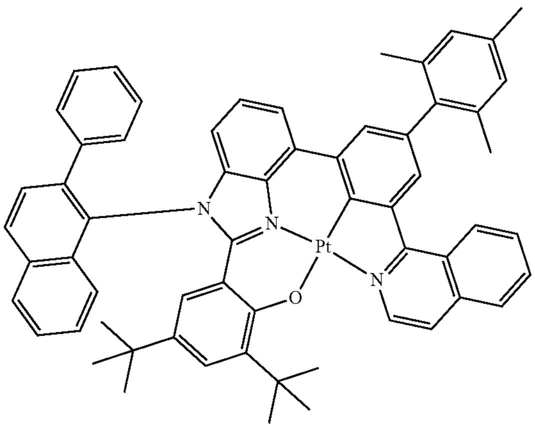
3-277
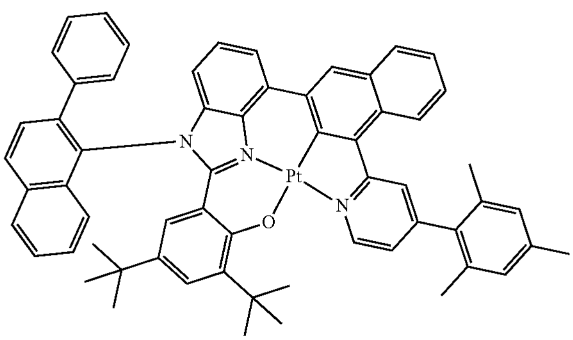
3-278
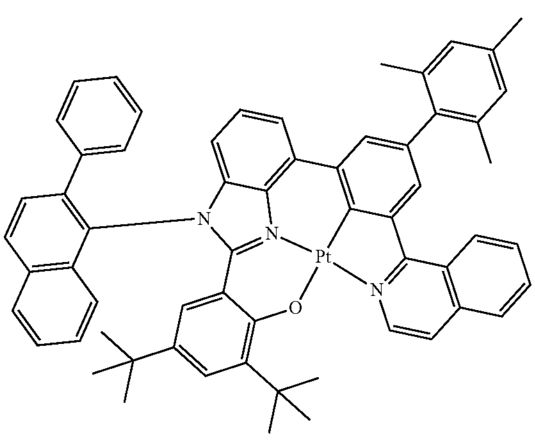
-continued
3-279
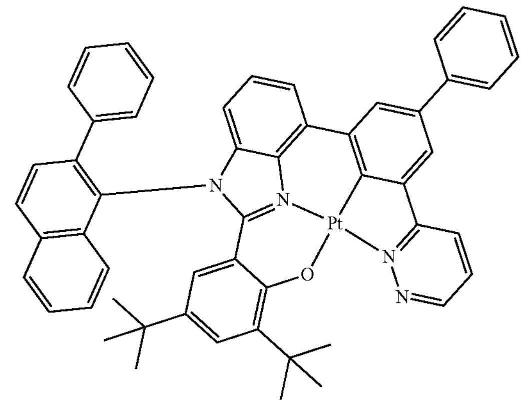
3-280
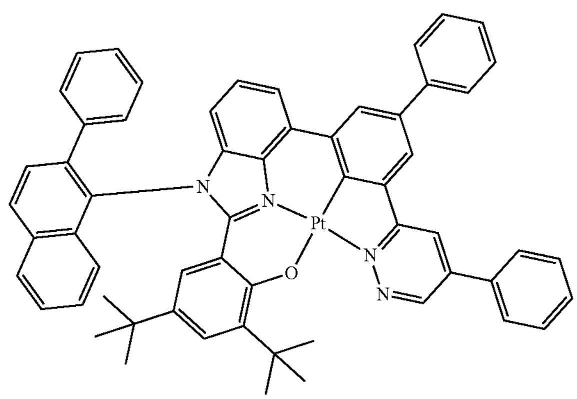
3-281
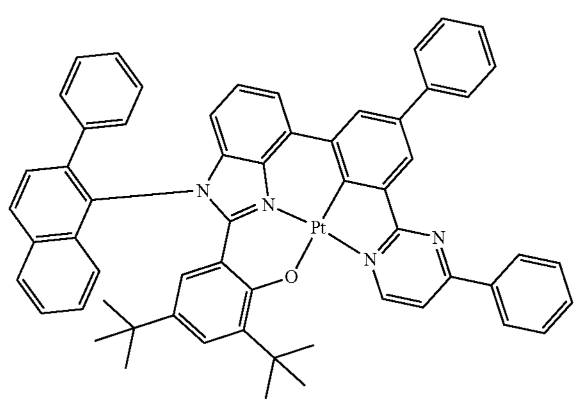

-continued
3-282
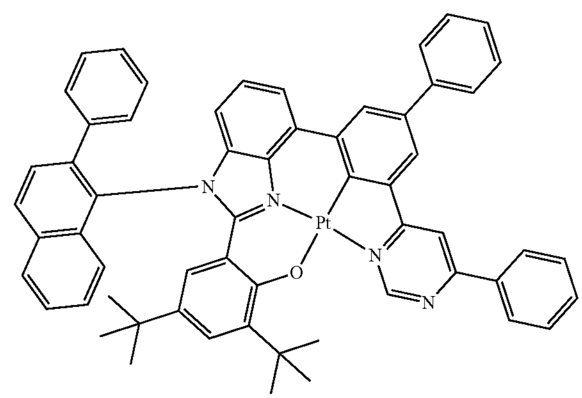
3-283
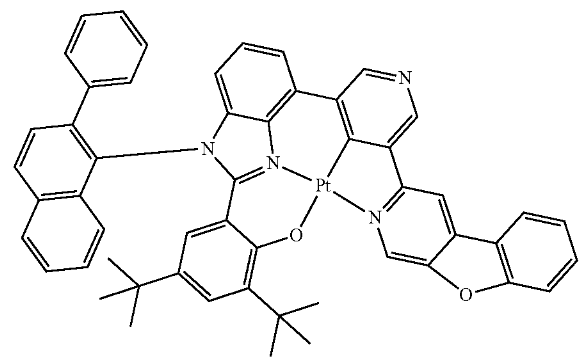
3-284
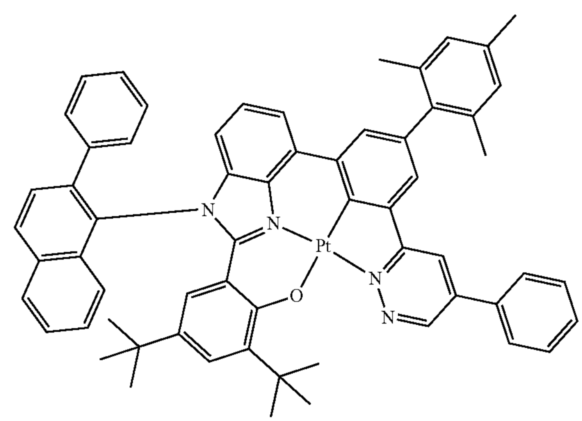
3-285
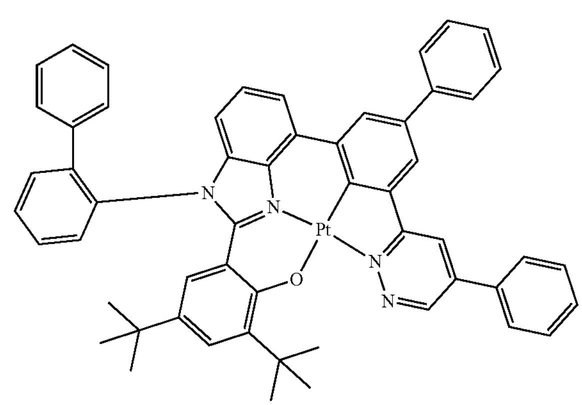
-continued
3-286
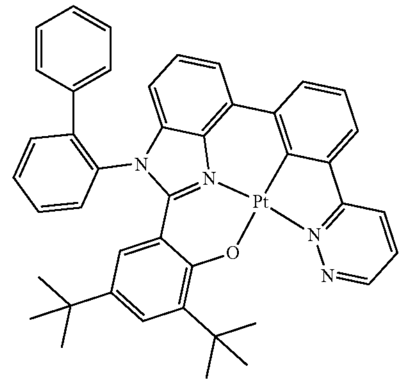
3-287
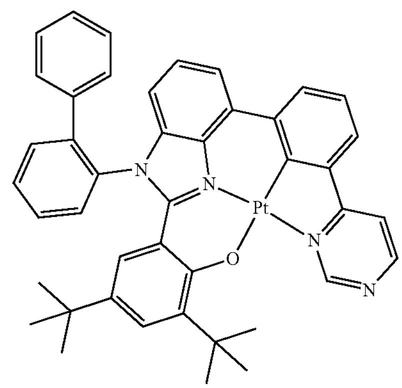
3-288
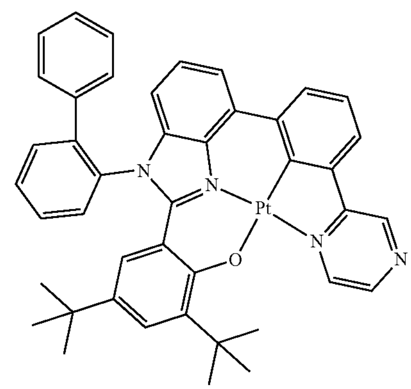
3-289
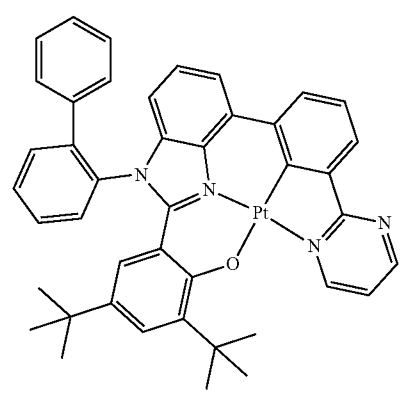

-continued
3-290
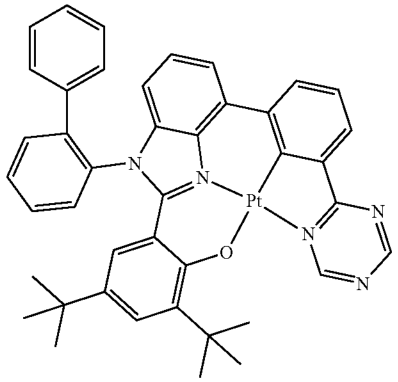
3-291
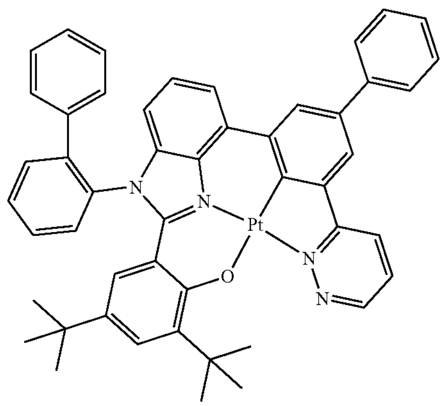
3-292
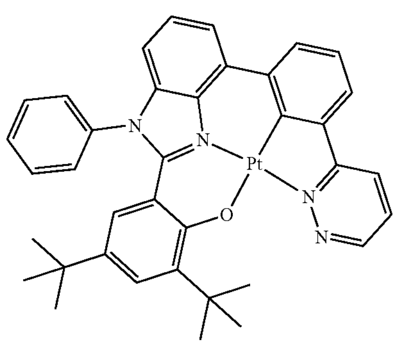
3-293
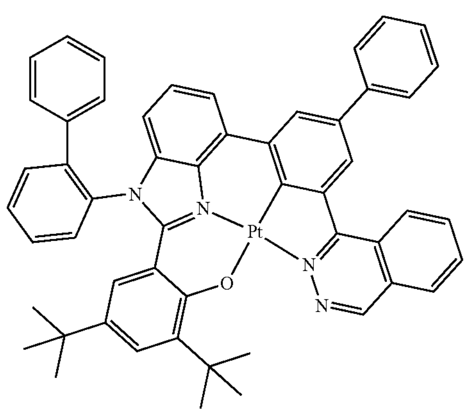
-continued
3-294
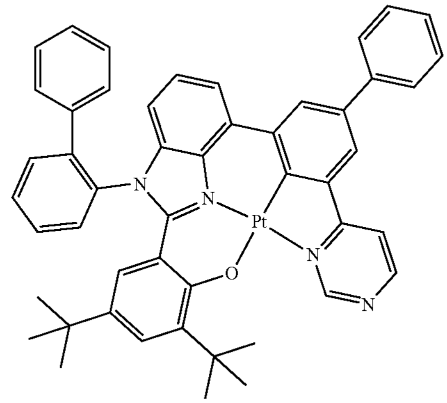
3-295
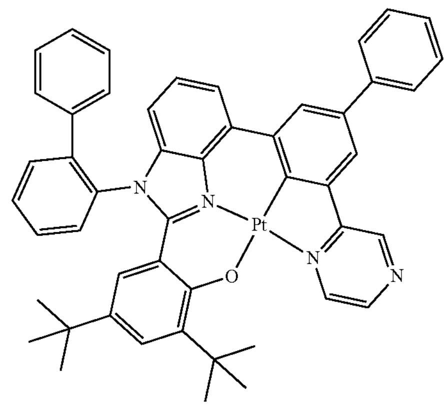
3-296
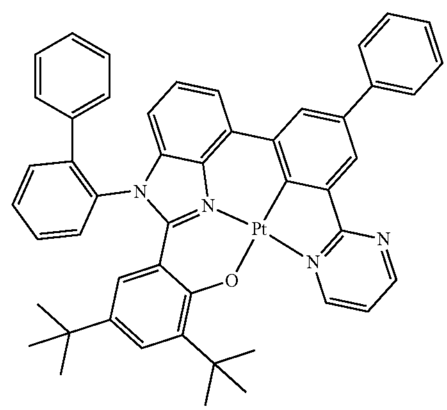
3-297
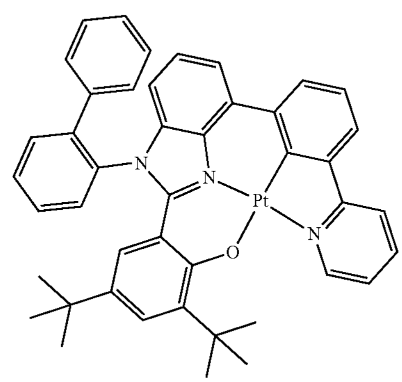

-continued
3-298
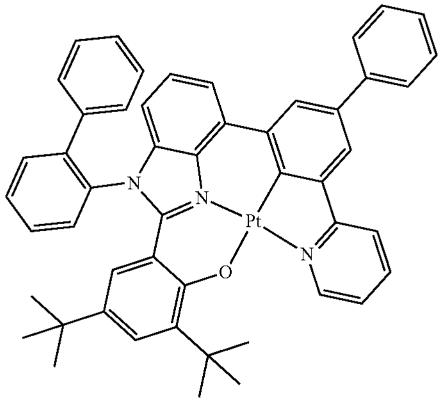
3-299
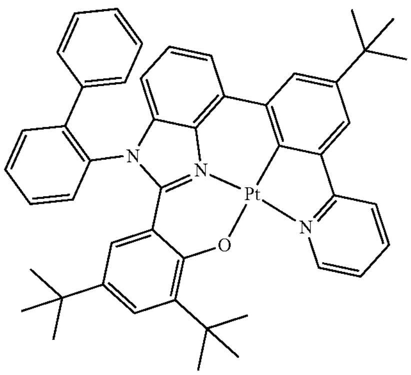
3-300
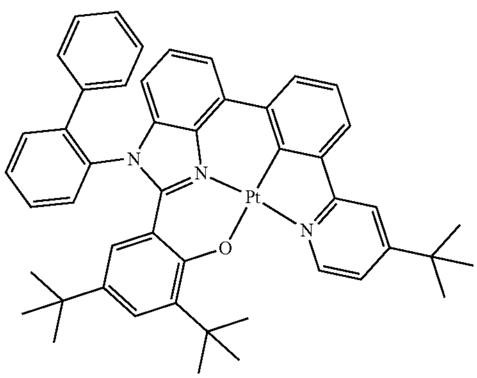
3-301
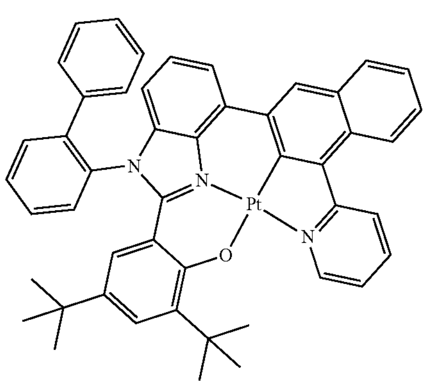
-continued
3-302
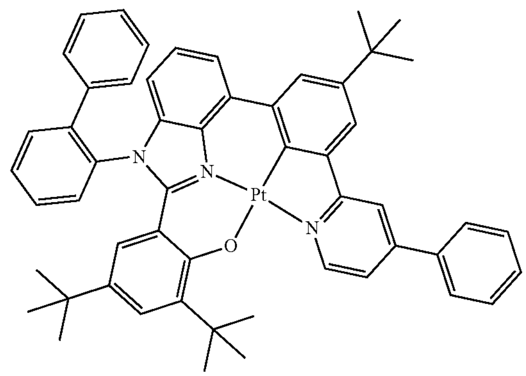
3-303
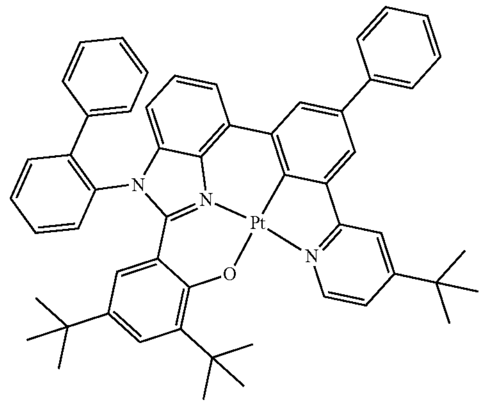
3-304
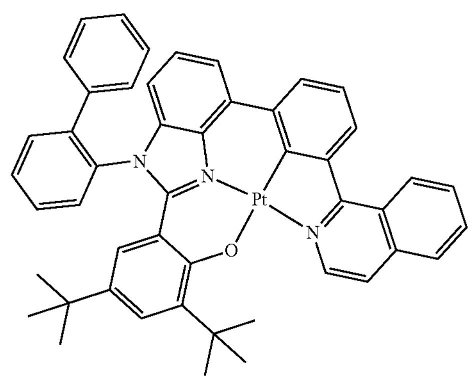
3-305
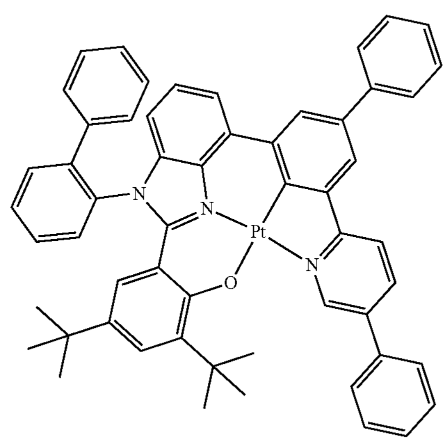

-continued
3-306
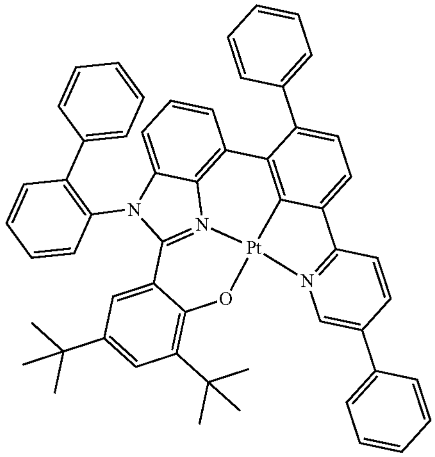
3-307
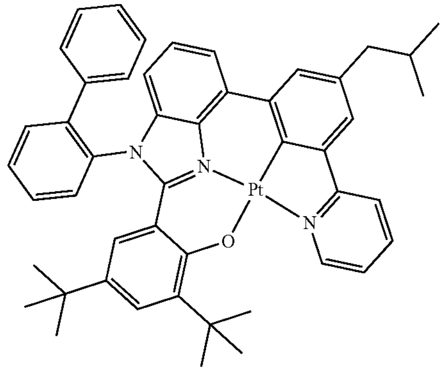
3-308
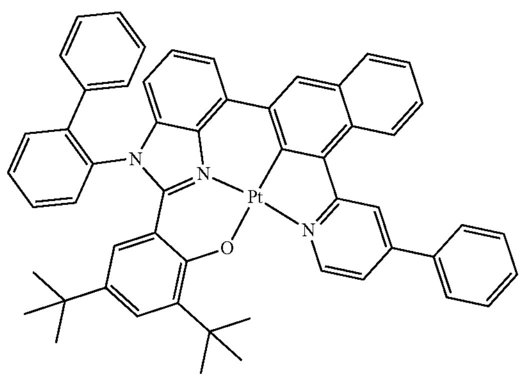
3-309
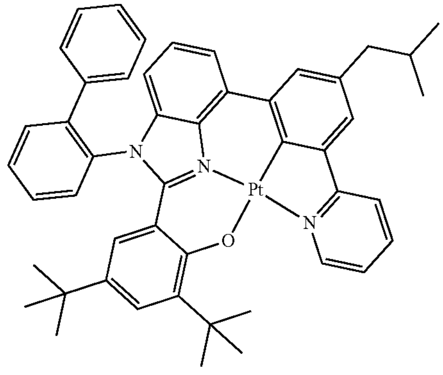
-continued
3-310
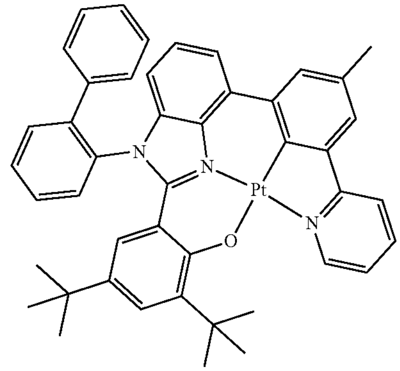
3-311
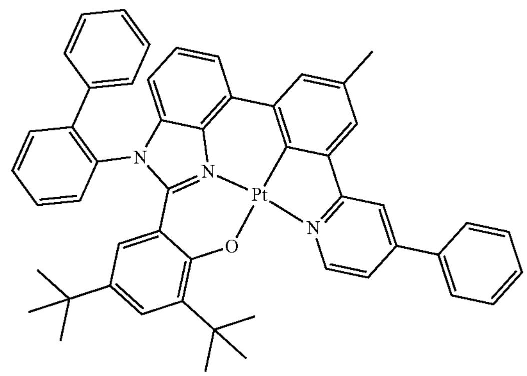
3-312
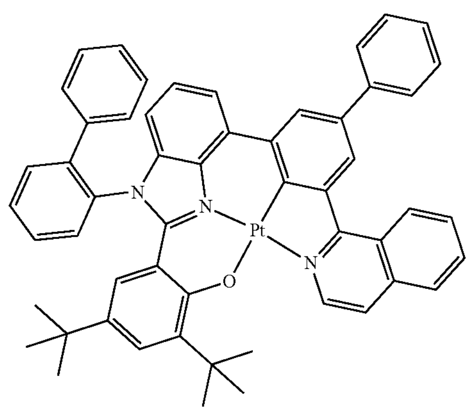
3-313
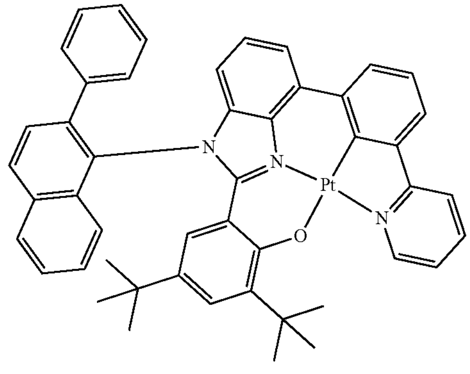

3-314
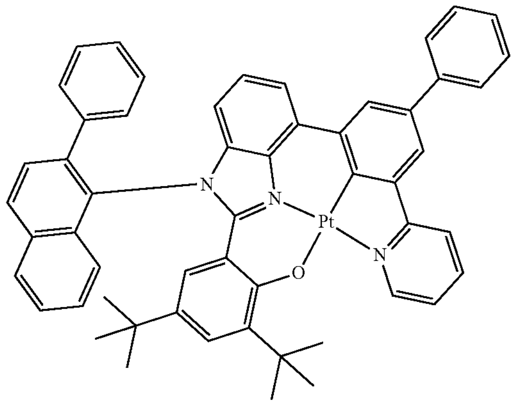
3-315
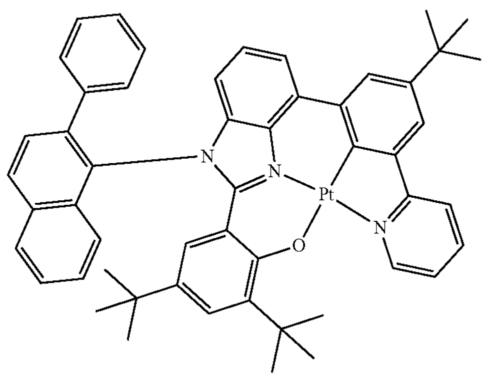
3-316
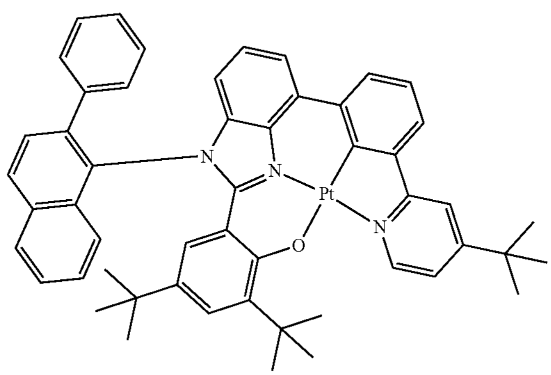
3-317
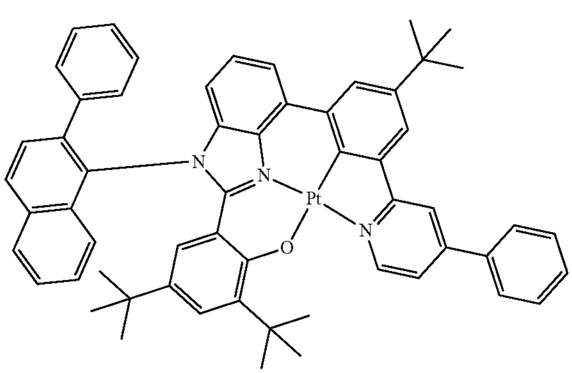
3-318
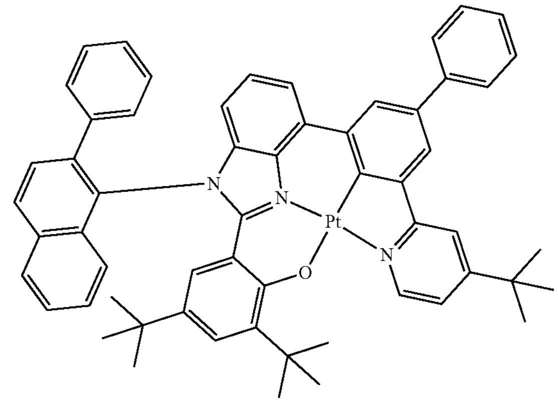
3-319
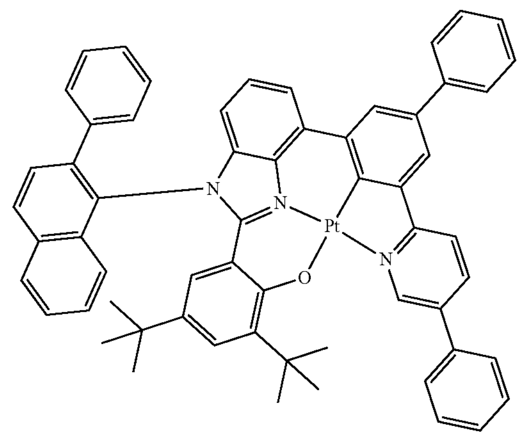
3-320
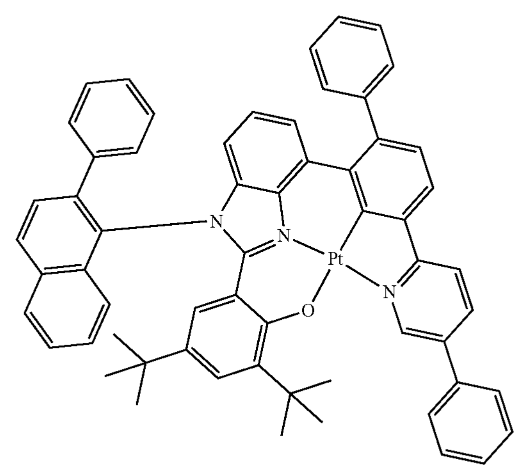

-continued
3-321
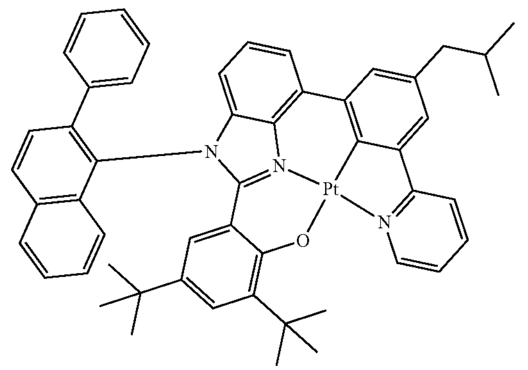
3-322
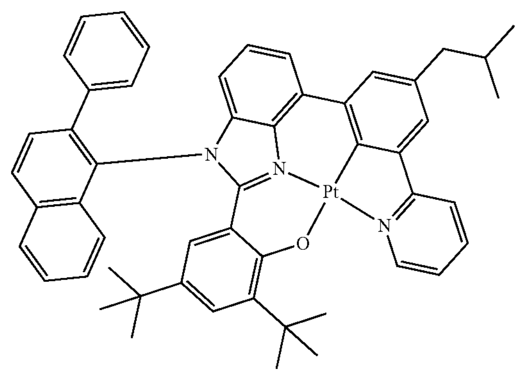
3-323
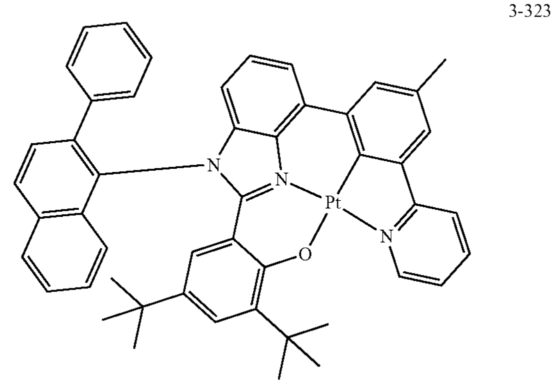
3-324
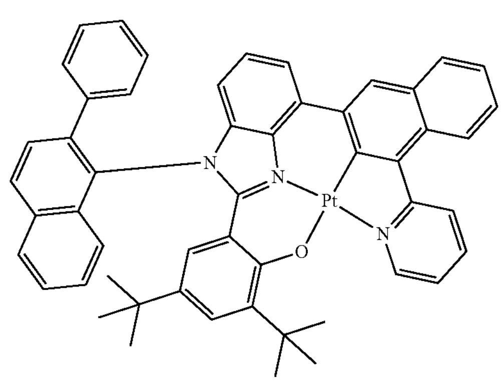
-continued
3-325
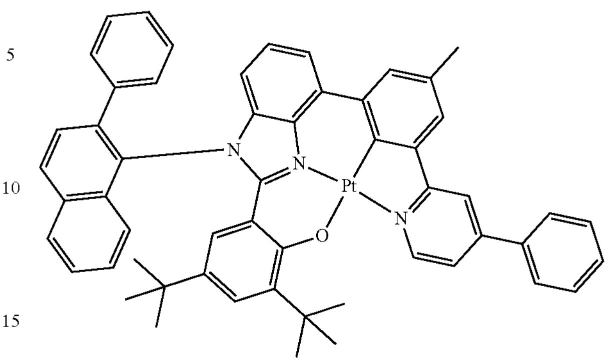
3-326
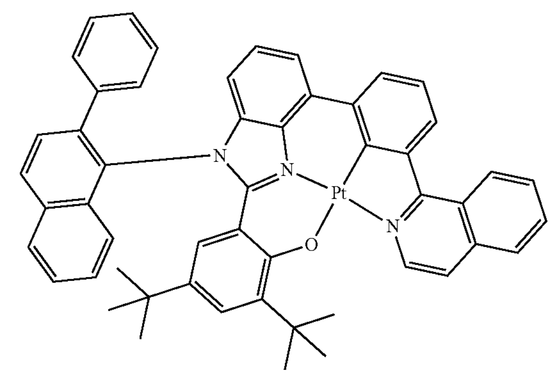
3-327
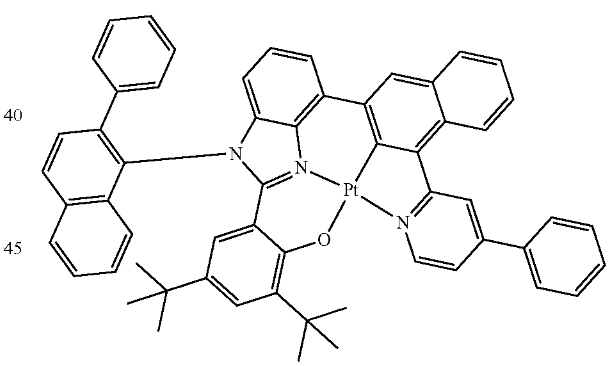
3-328
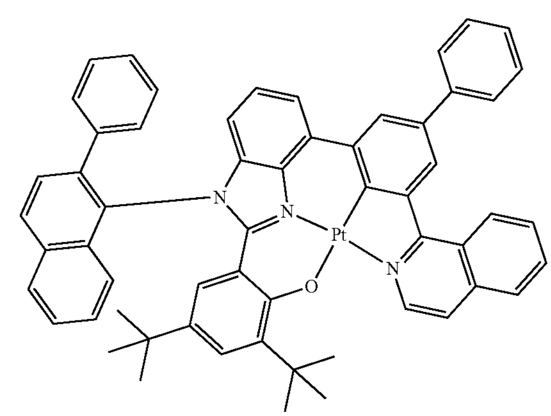

-continued
3-329
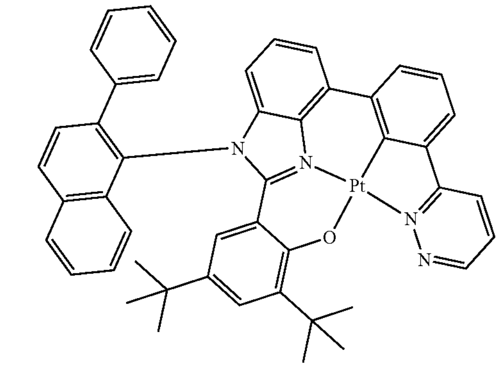
3-330
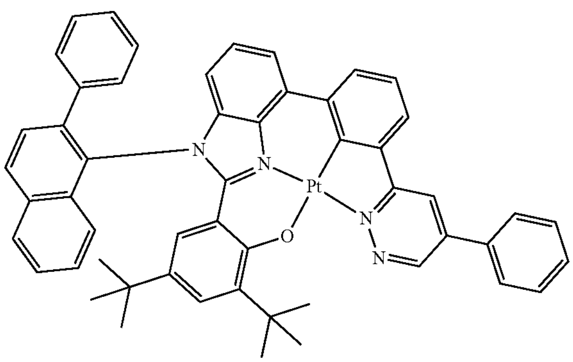
3-331
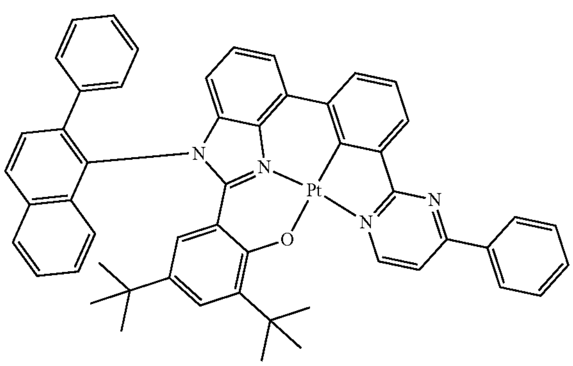
3-332
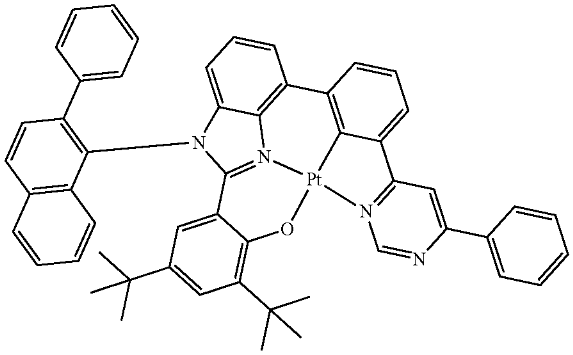
-continued
3-333
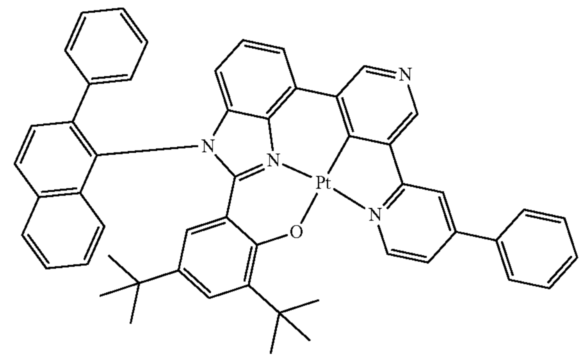
3-334
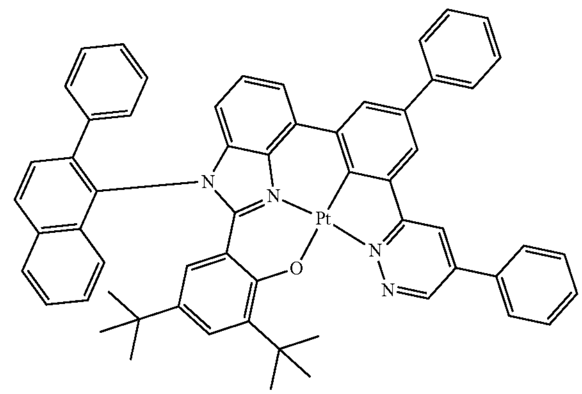
3-335
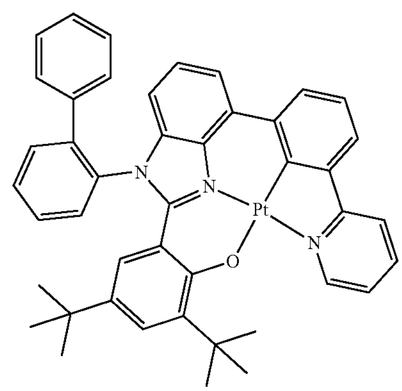
3-336
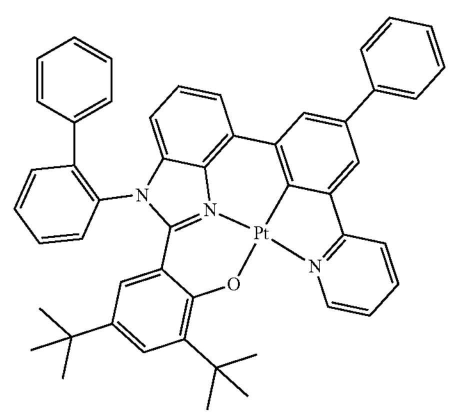

3-337
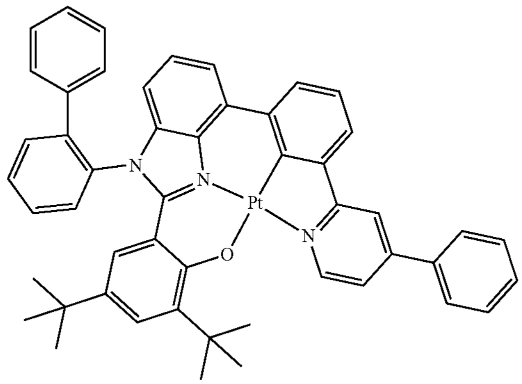
3-338
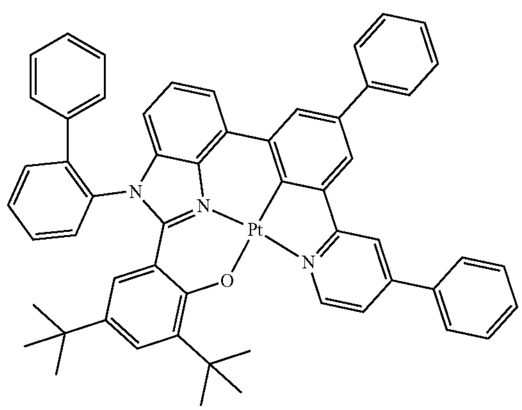
3-339
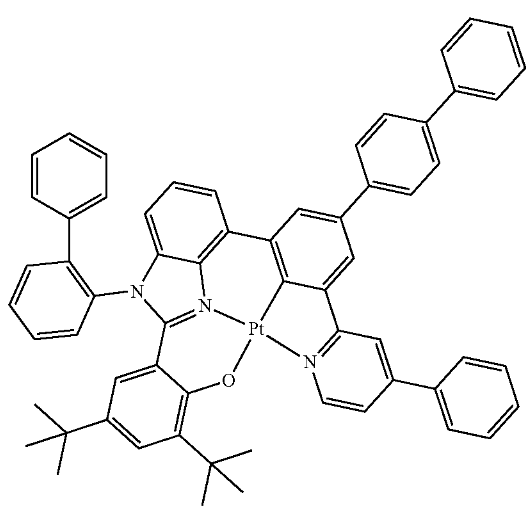
3-340
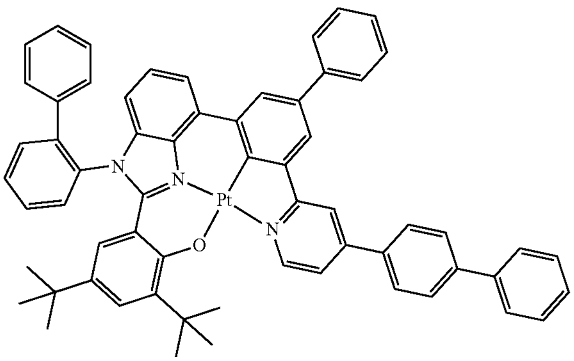
3-341
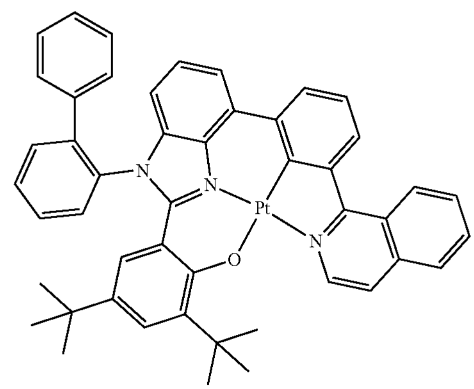
3-342
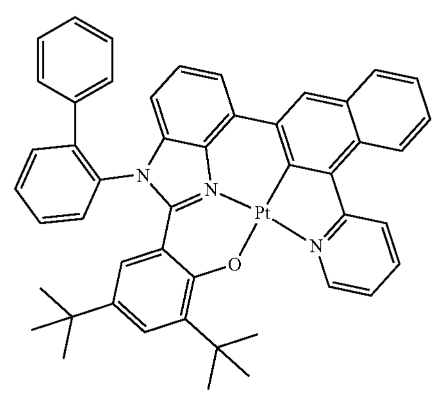
3-343
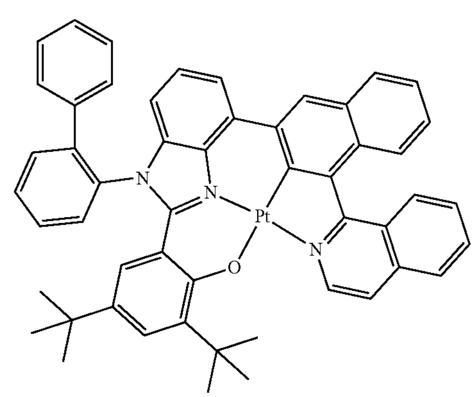

-continued
3-344
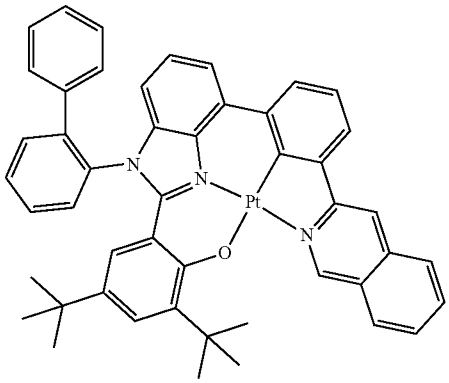
3-345
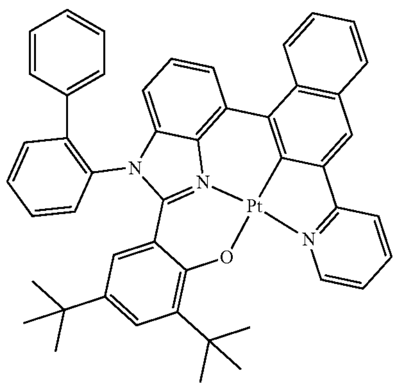
3-346
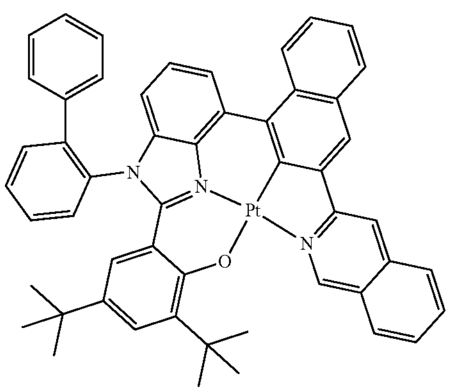
3-347
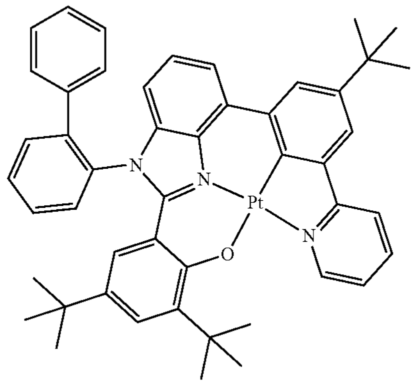
-continued
3-348
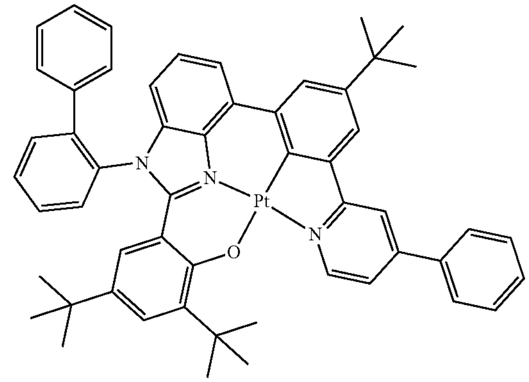
3-349
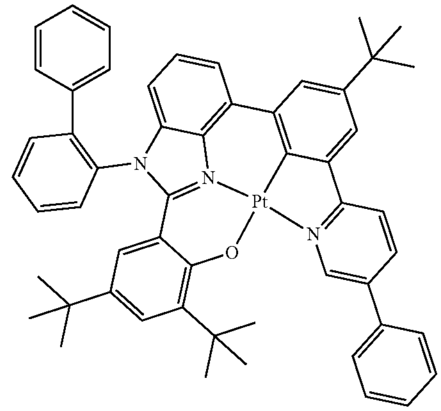
3-350
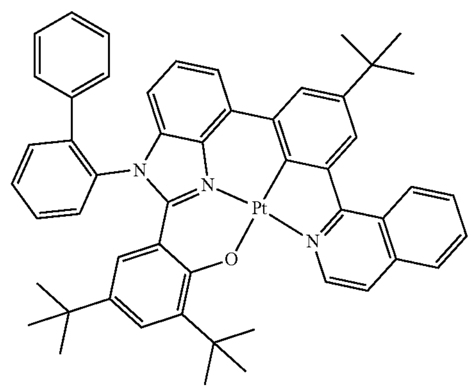
3-351
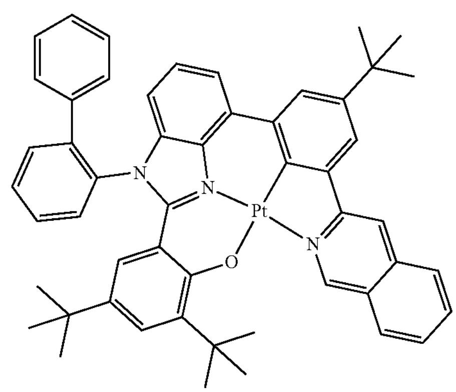

-continued
3-352
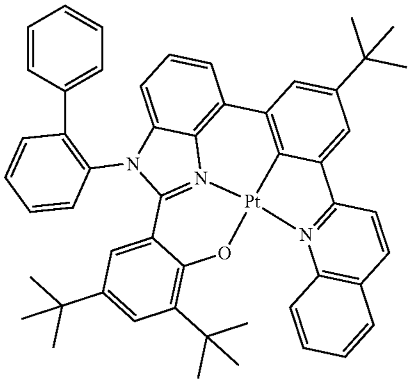
3-353
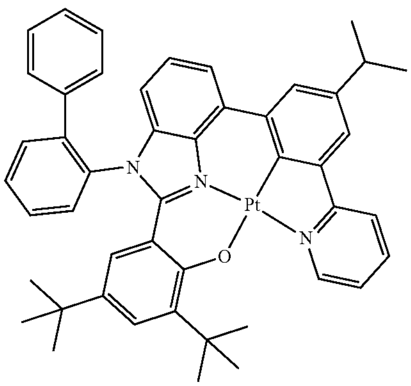
3-354
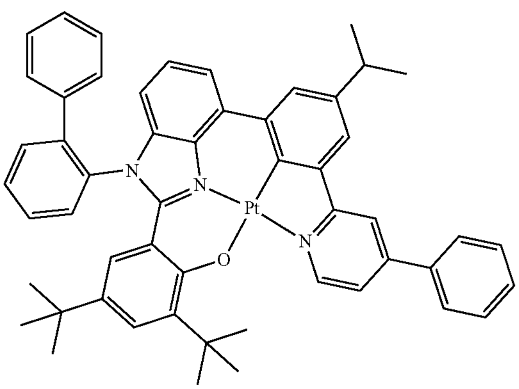
3-355
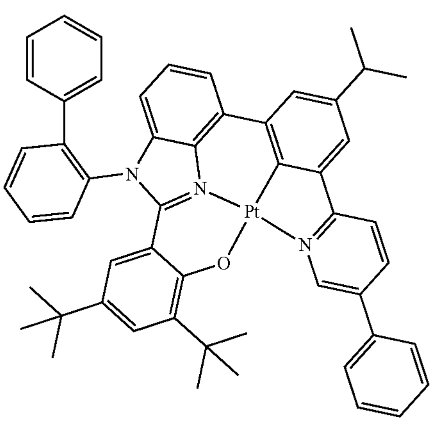
-continued
3-356
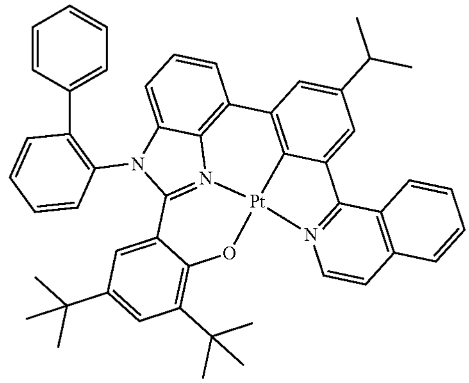
3-357
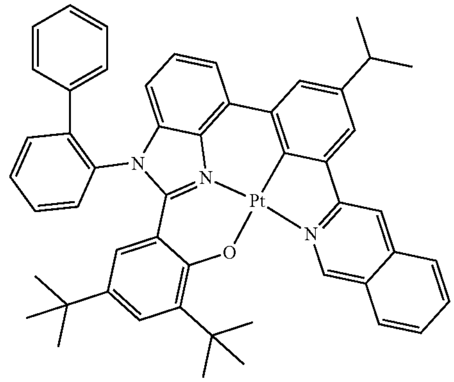
3-358
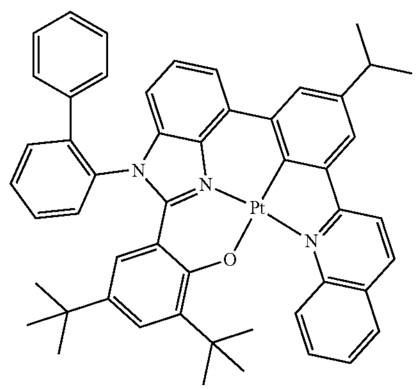
3-359
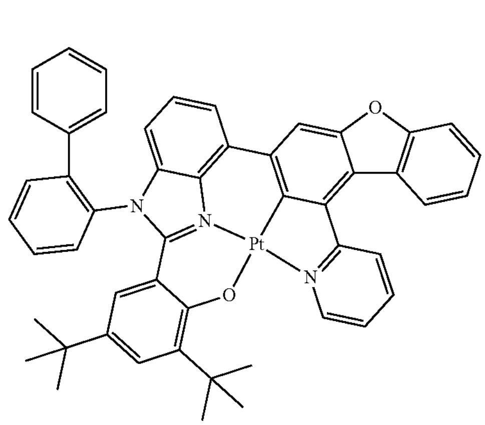

-continued
3-360
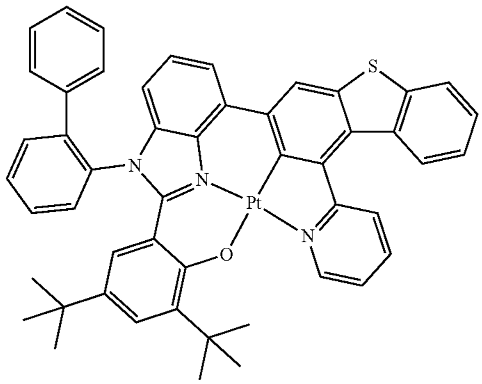
3-361
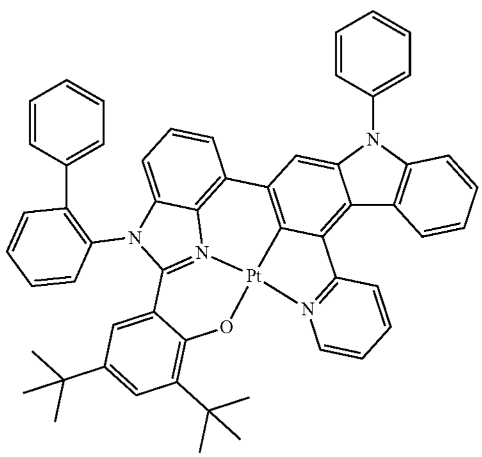
3-362
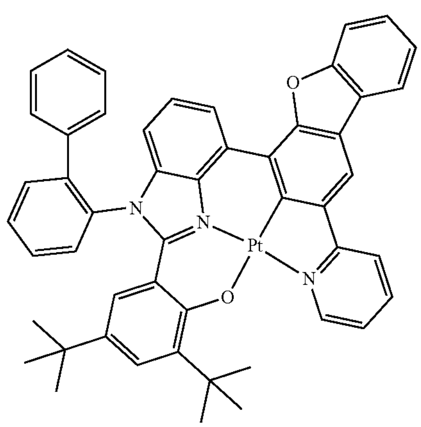
-continued
3-363
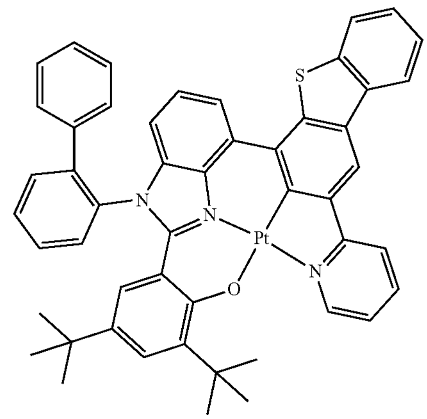
3-364
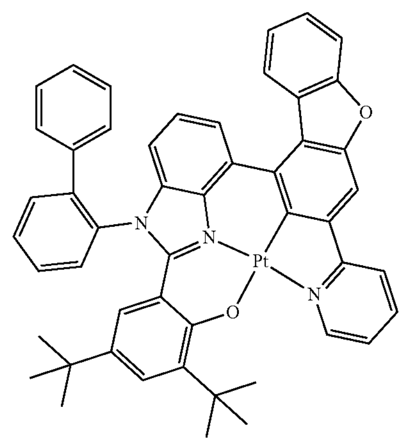
3-365
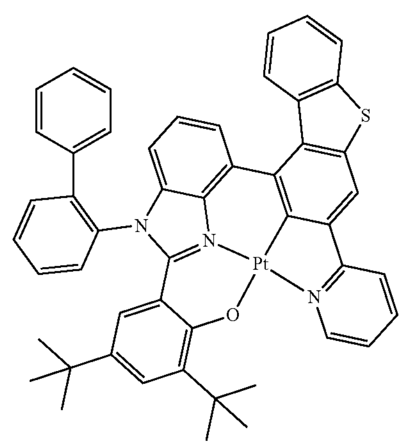

-continued
3-366
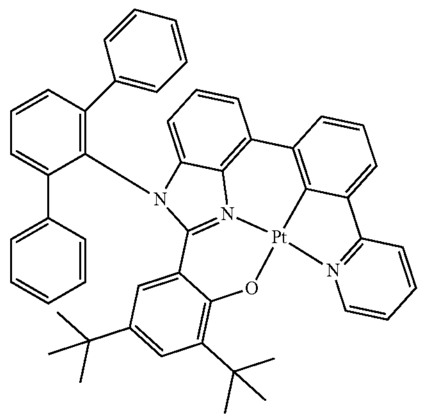
3-367
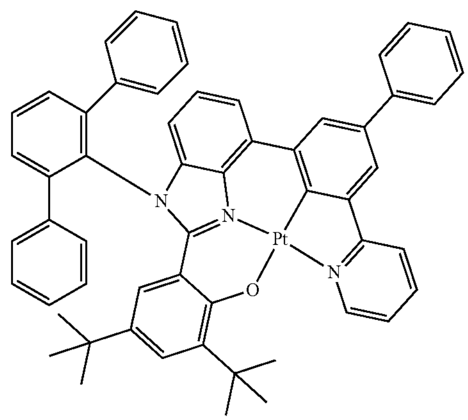
3-368
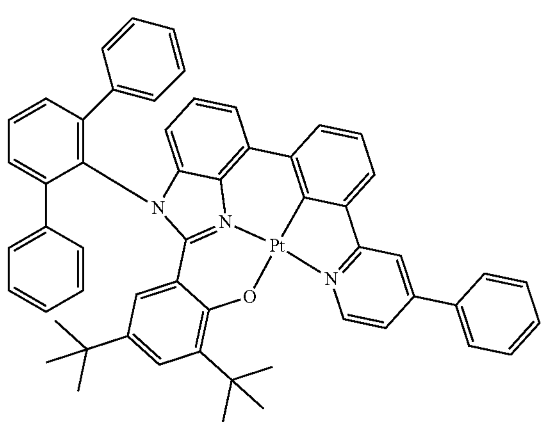
-continued
3-369
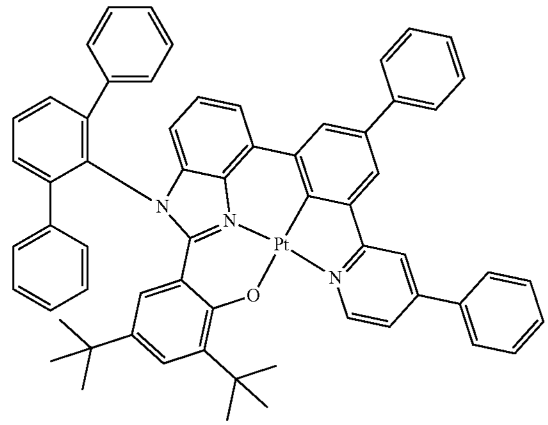
3-370
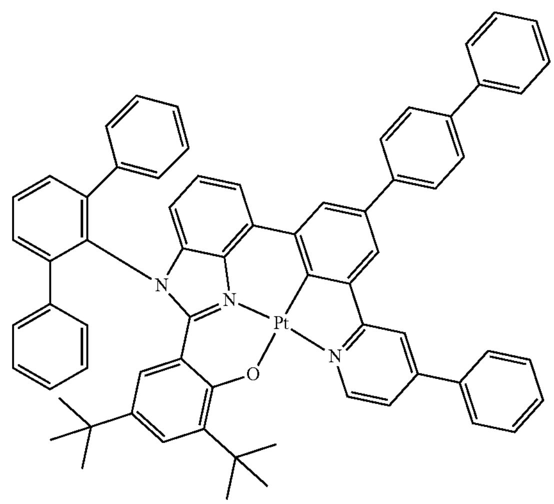
3-371
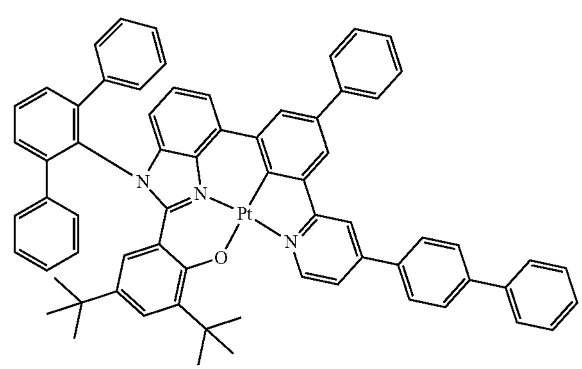

-continued
3-372
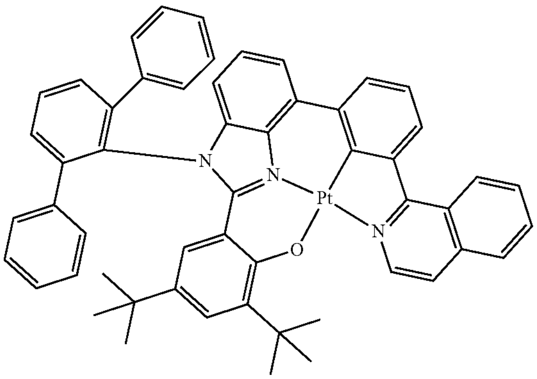
3-373
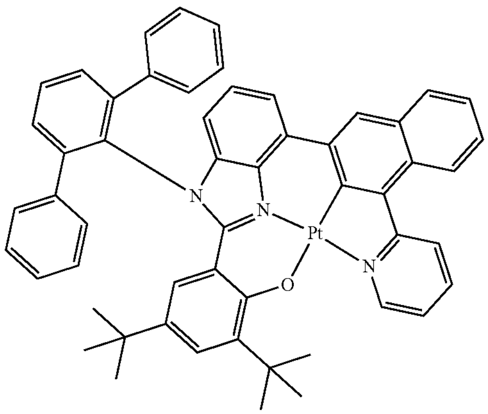
3-374
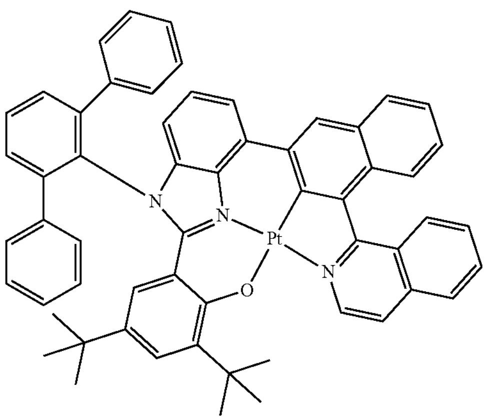
3-375
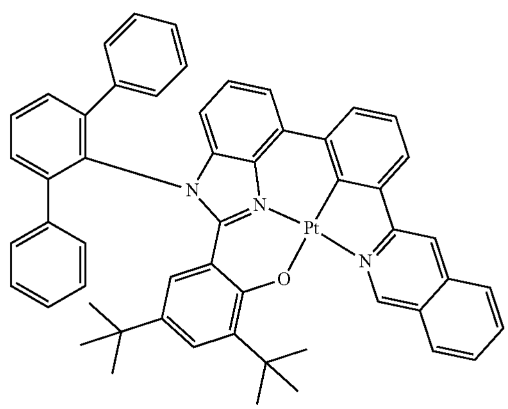
-continued
3-376
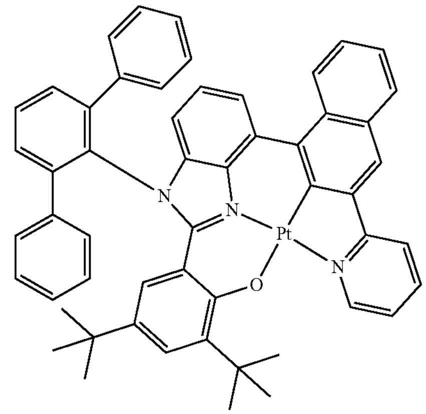
3-377
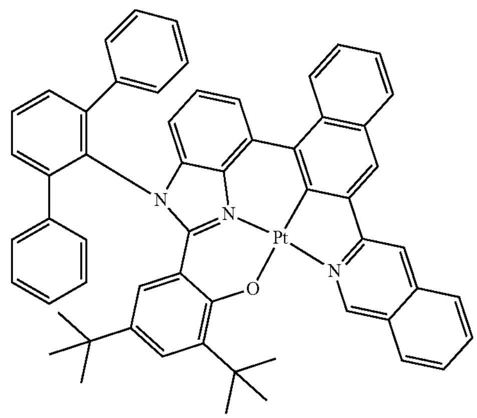
3-378
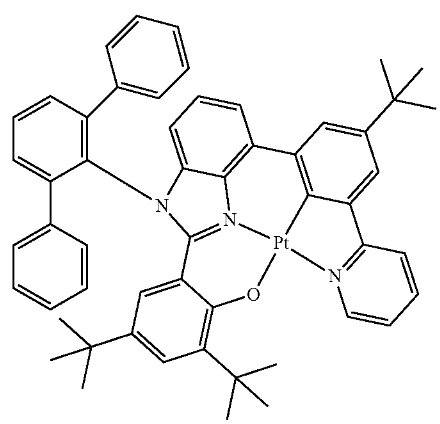

3-379
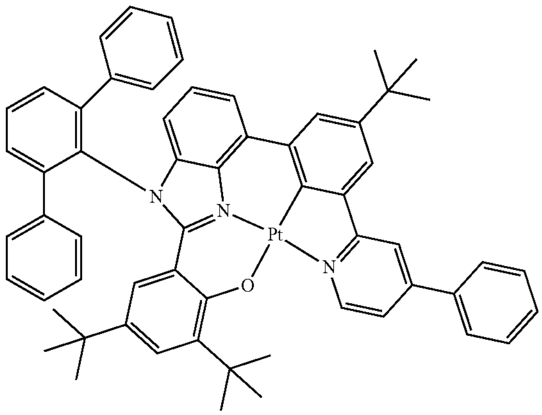
3-380
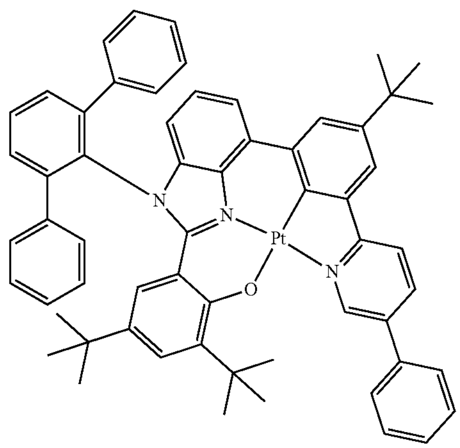
3-381
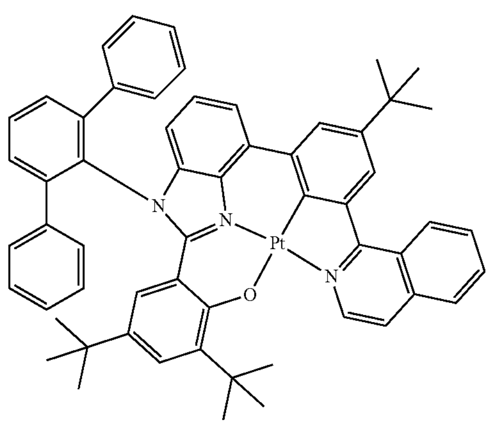
3-382
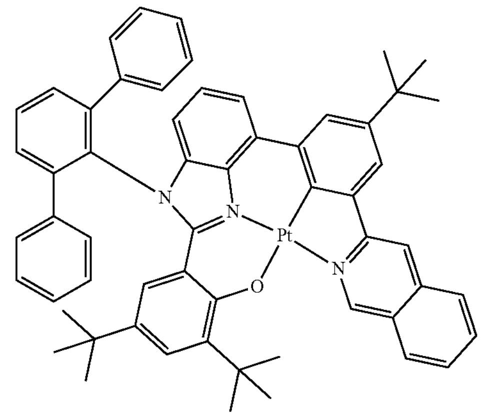
3-383
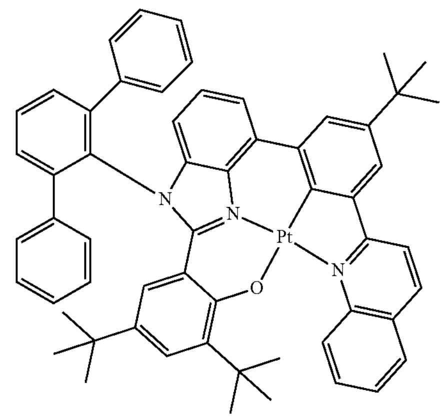
3-384
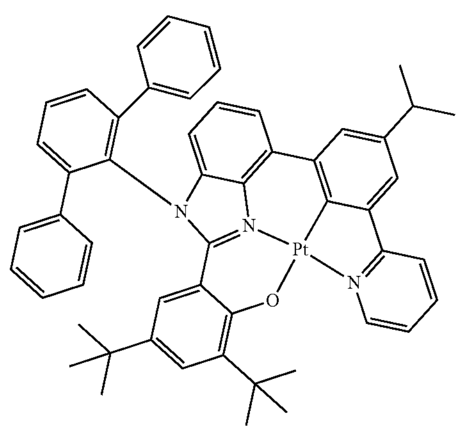

3-385
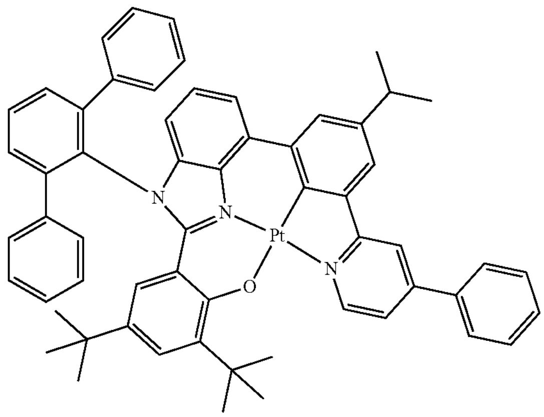
3-386
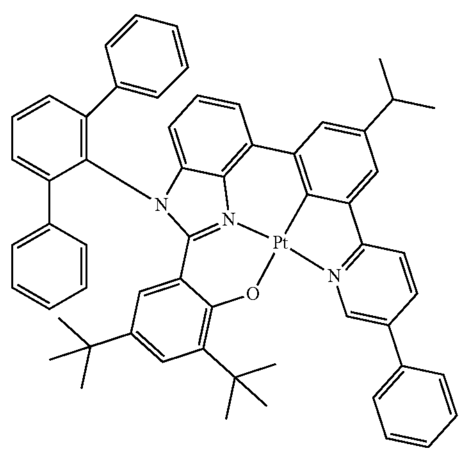
3-387
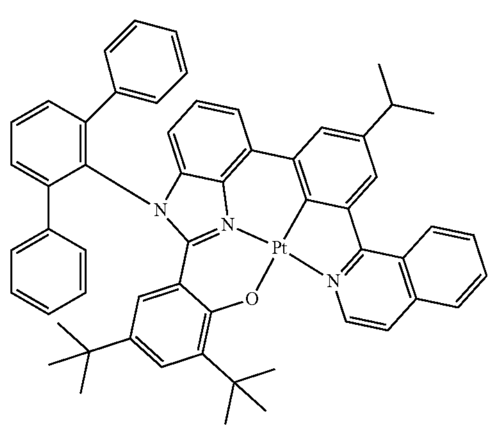
3-388
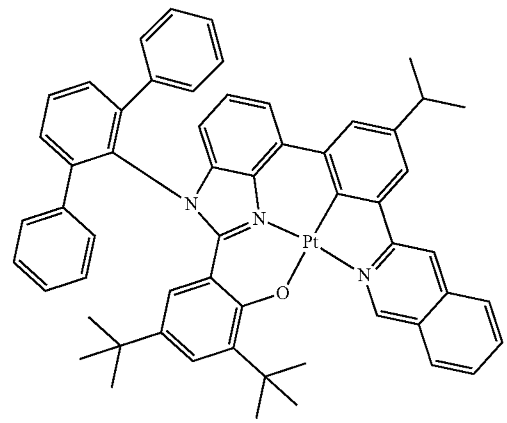
3-389
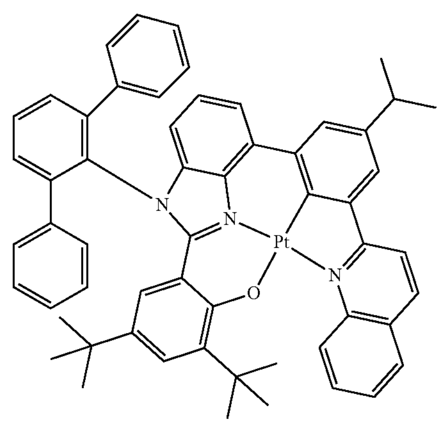
3-390
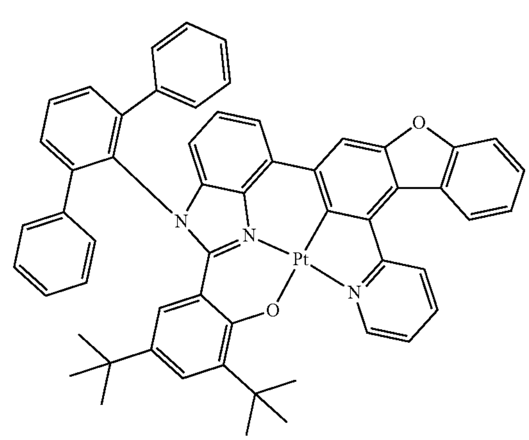

-continued
3-391
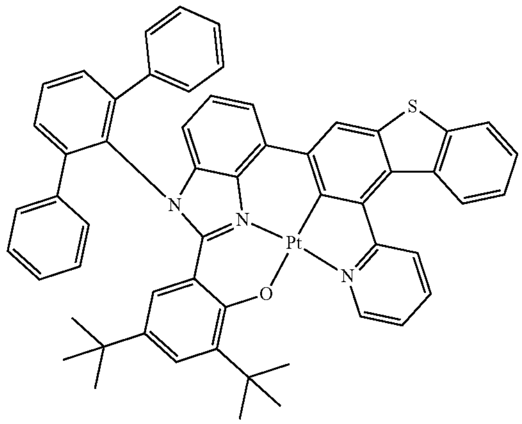
3-392
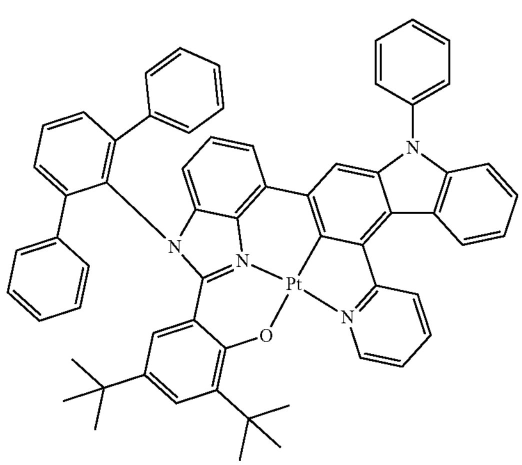
3-393
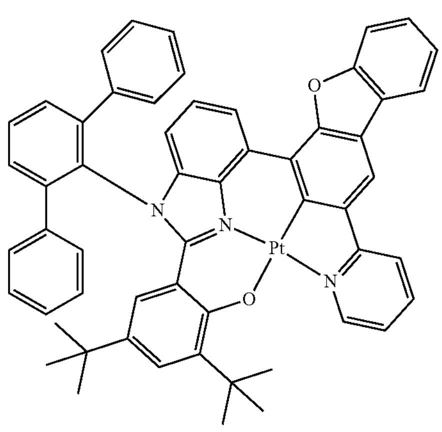
-continued
3-394
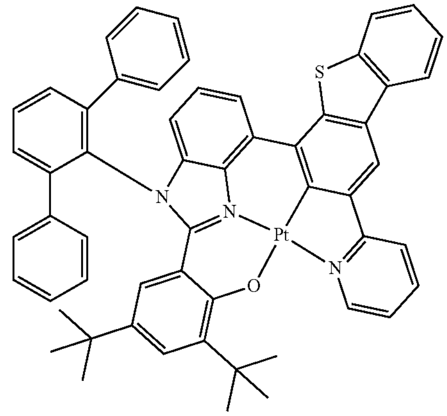
3-395
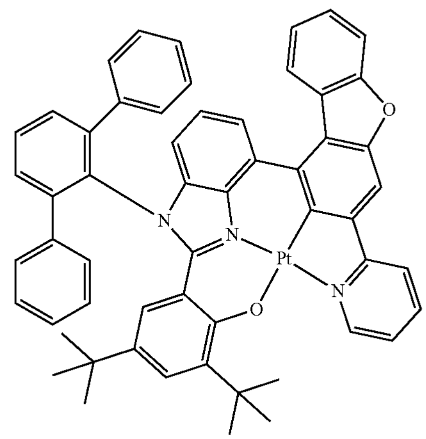
3-396
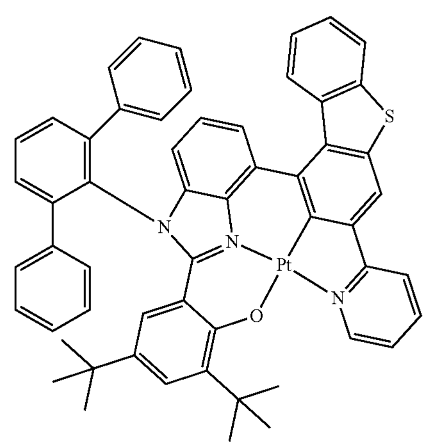

3-397
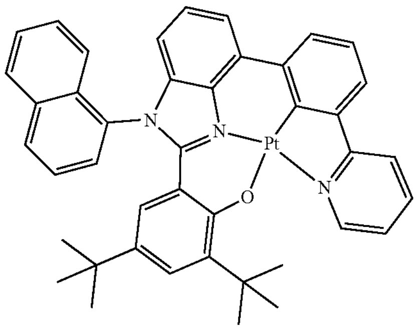
3-398
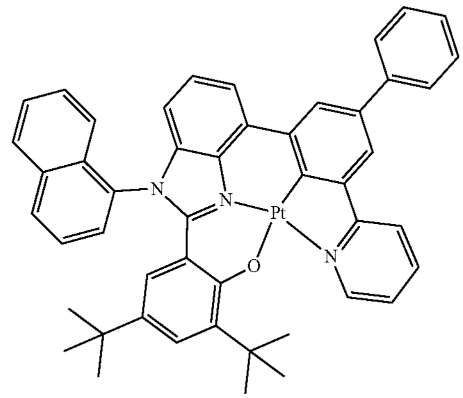
3-399
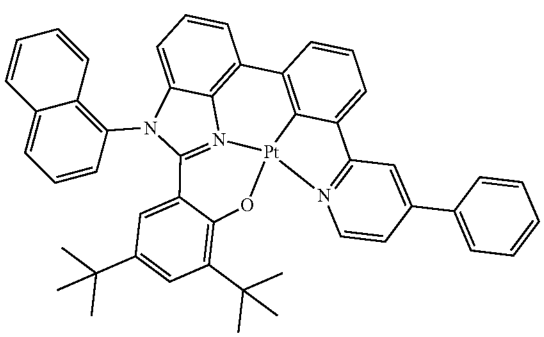
3-400
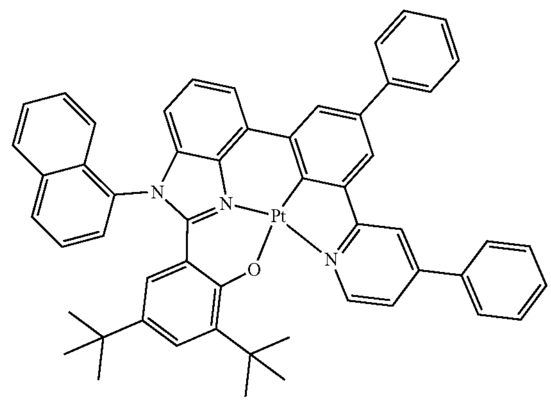
3-401
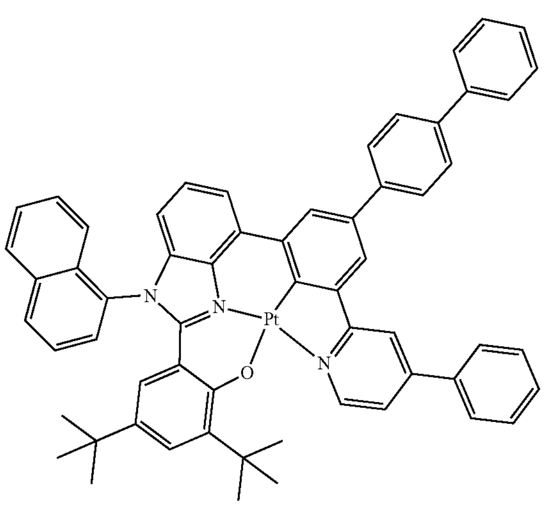
3-402
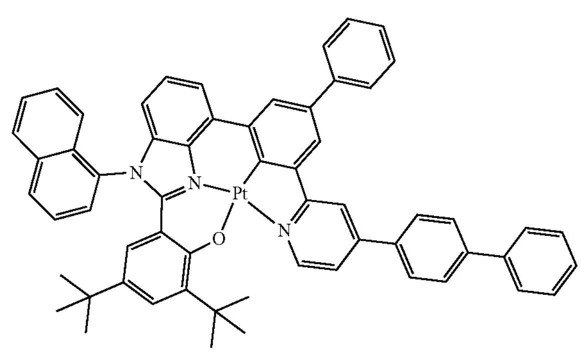

-continued
3-403
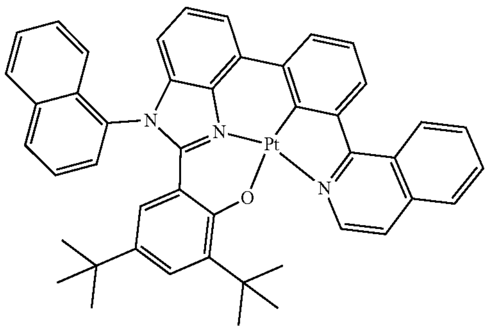
3-404
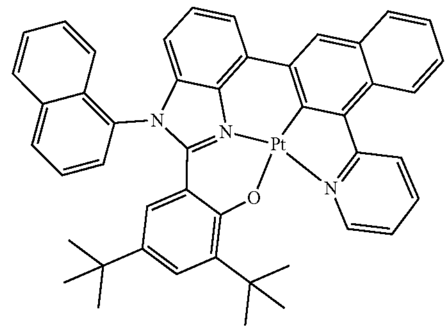
3-405
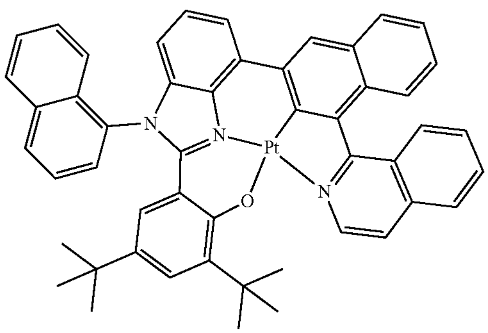
3-406
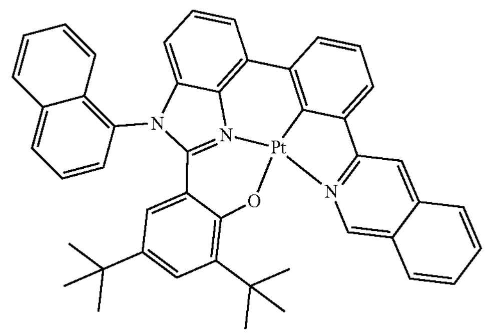
3-407
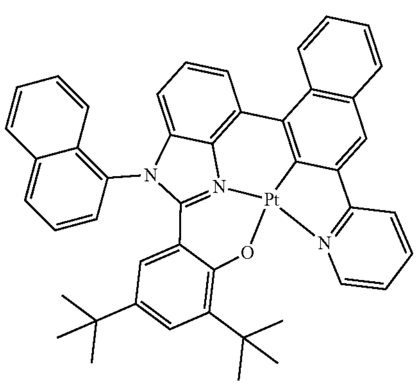
3-408
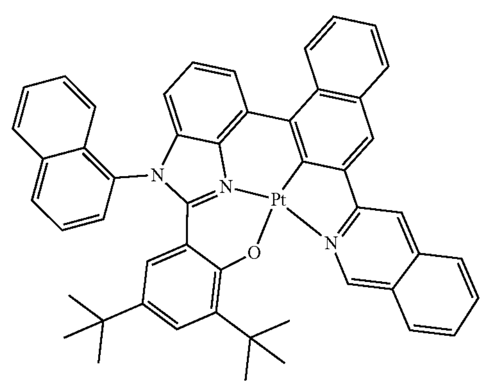
3-409
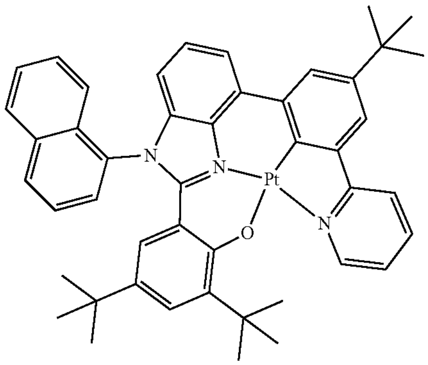
3-410
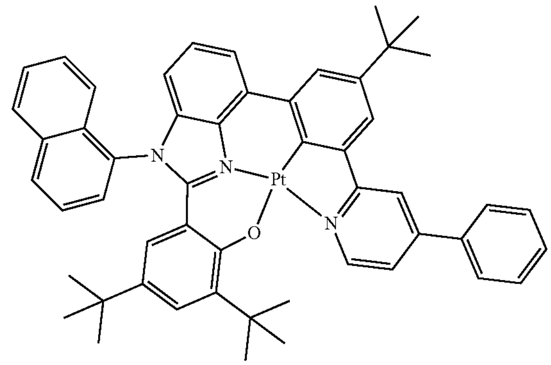

-continued
3-411
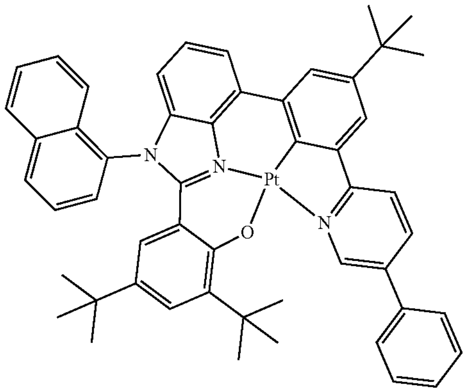
3-412
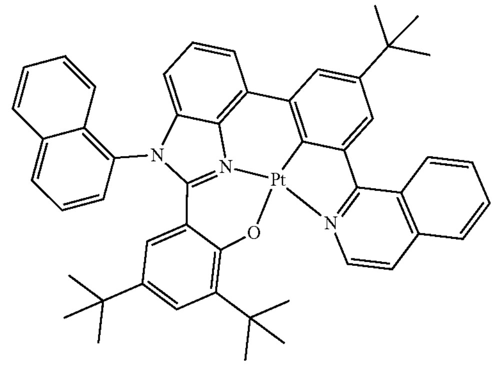
3-413
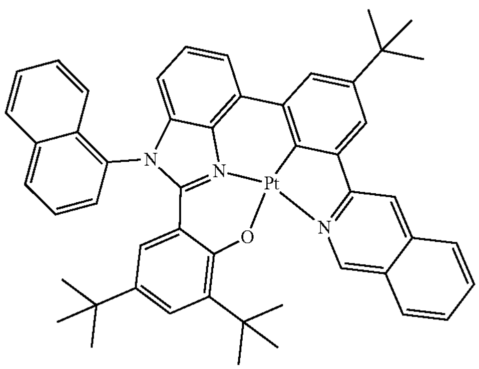
3-414
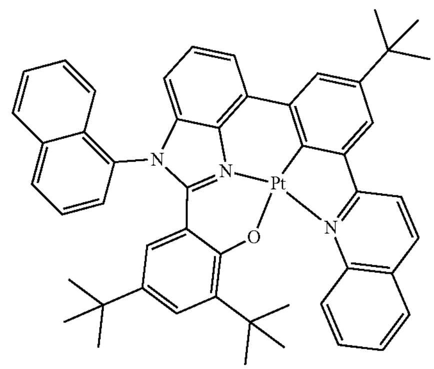
3-415
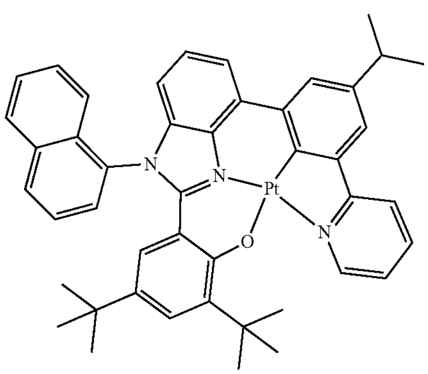
3-416
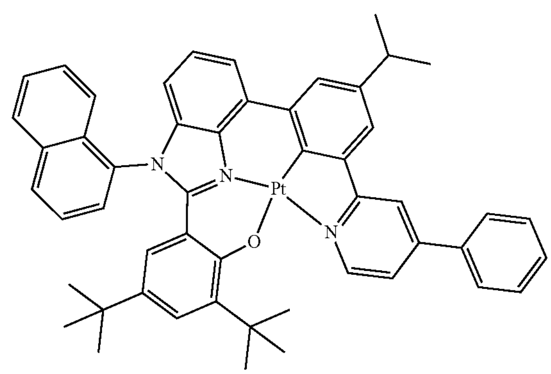
3-417
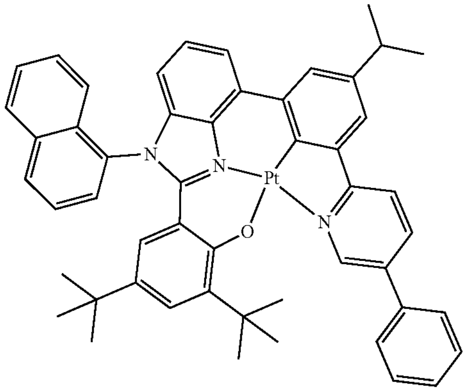
3-418
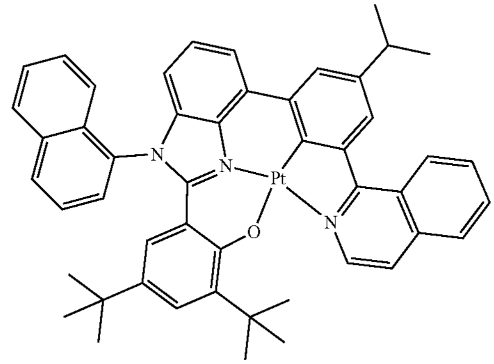

-continued
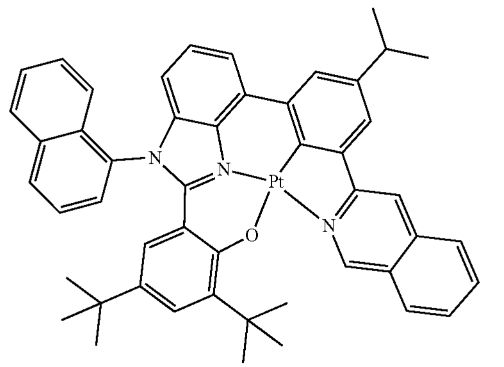
3-419
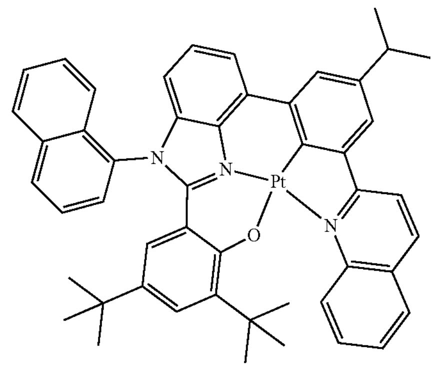
3-420
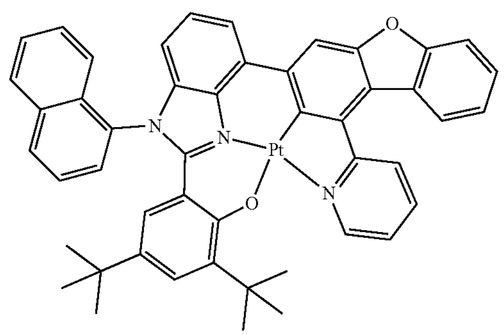
3-421
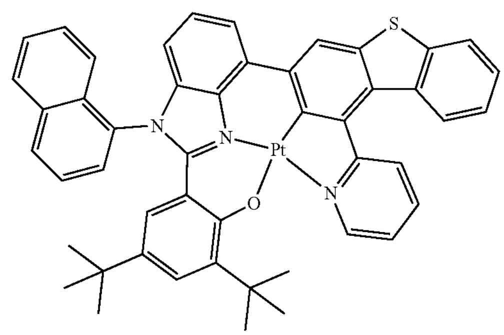
3-422
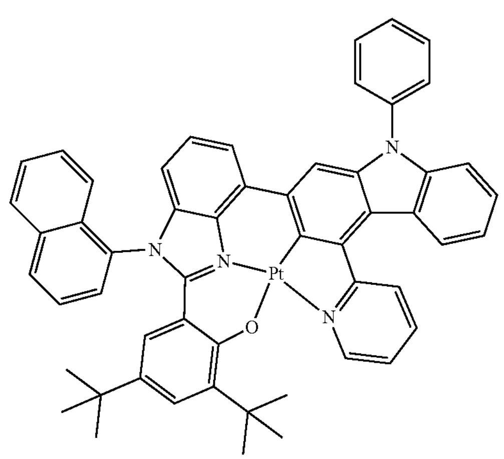
3-423
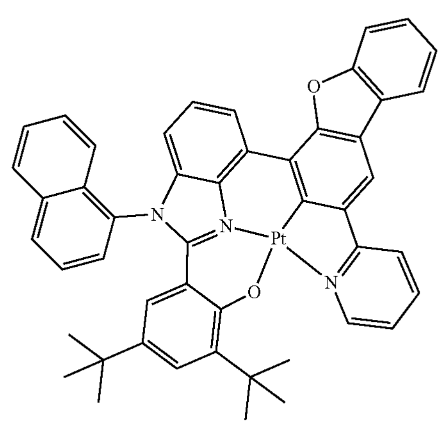
3-424
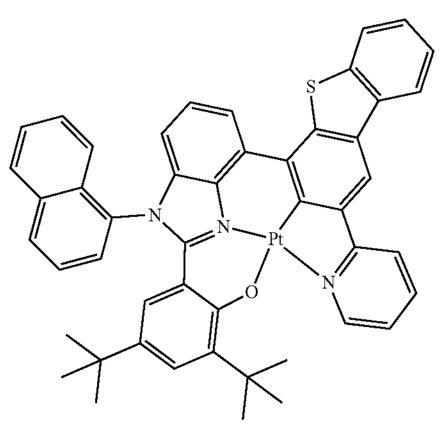
3-425
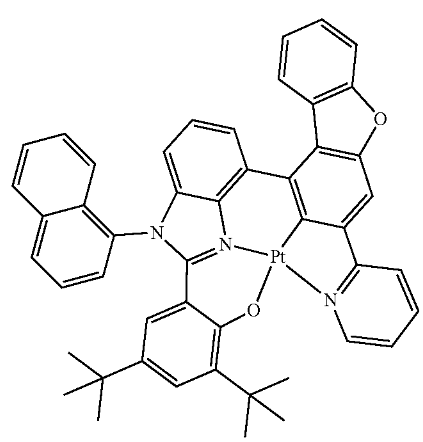
3-426

-continued
3-427
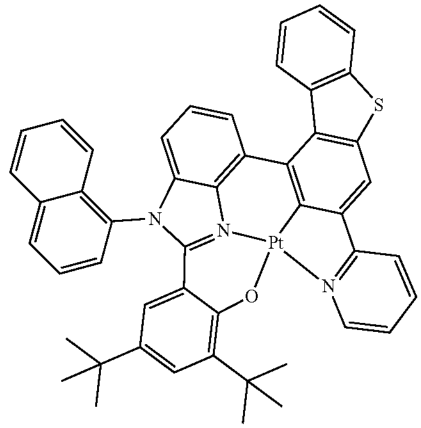
3-428
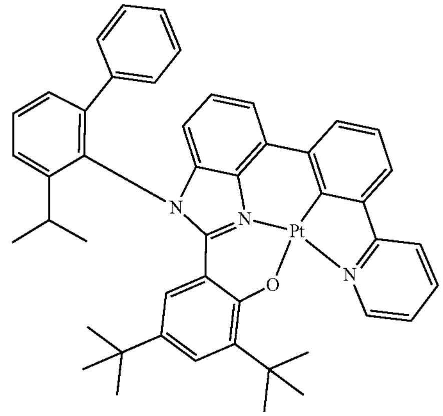
3-429
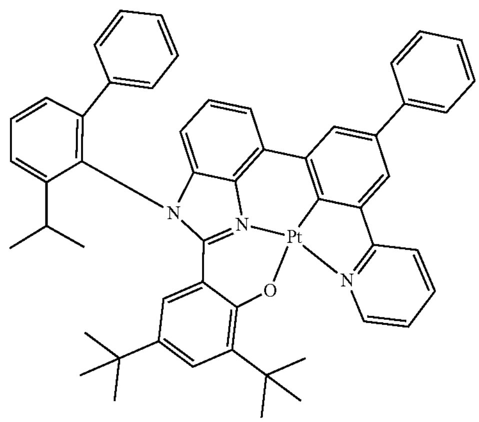
3-430
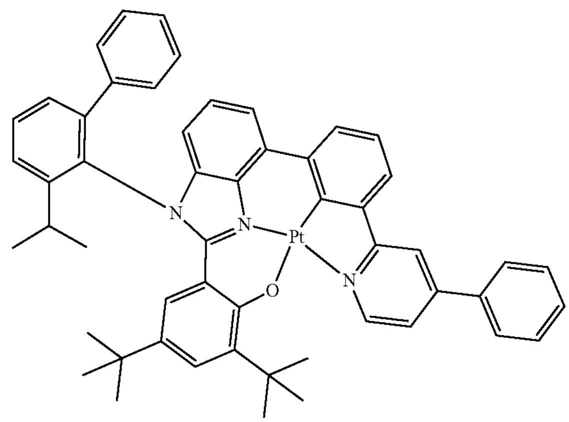
3-431
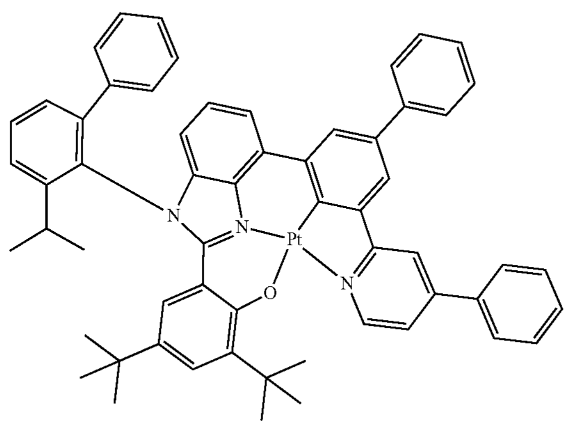
3-432
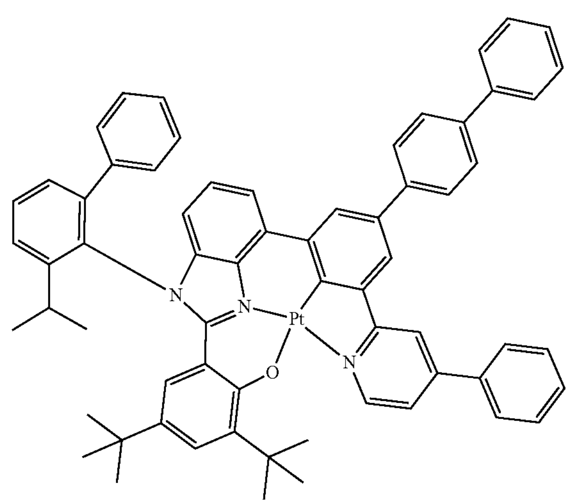

-continued
3-433
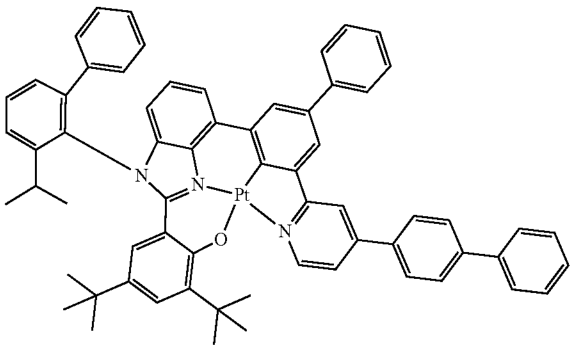
3-434
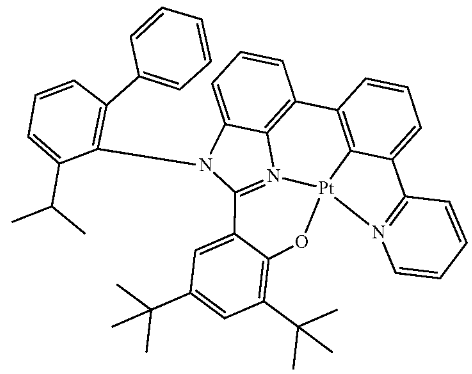
3-435
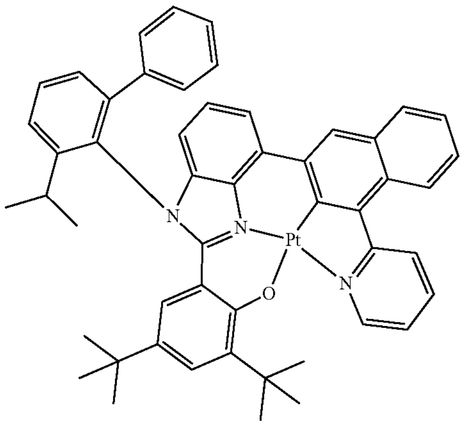
3-436
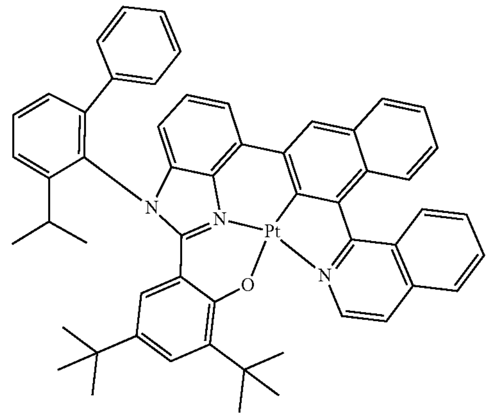
3-437
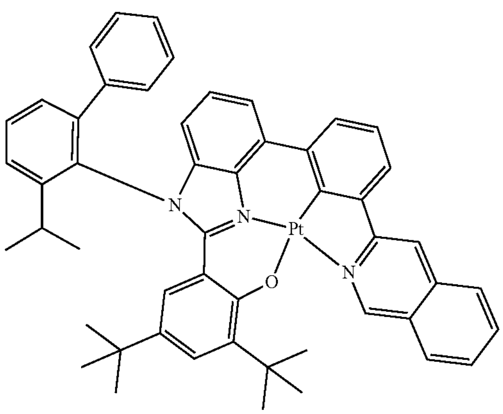
3-438
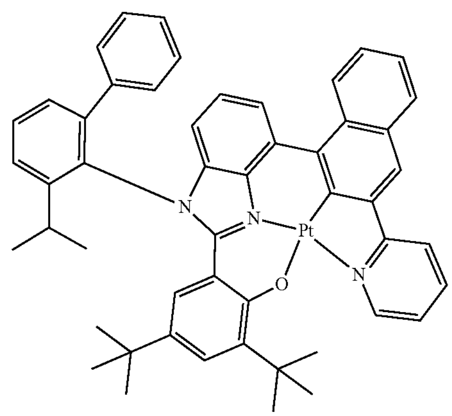
3-439
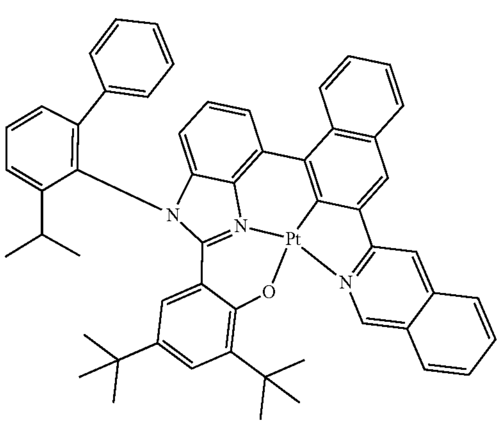
3-440
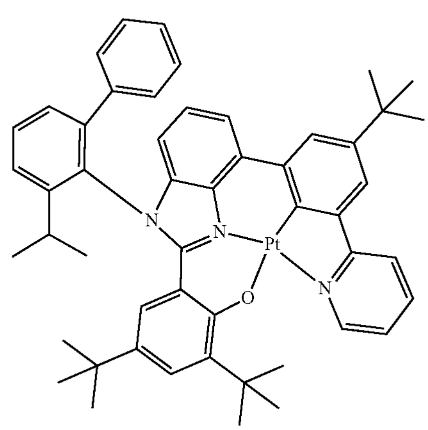

-continued
3-441
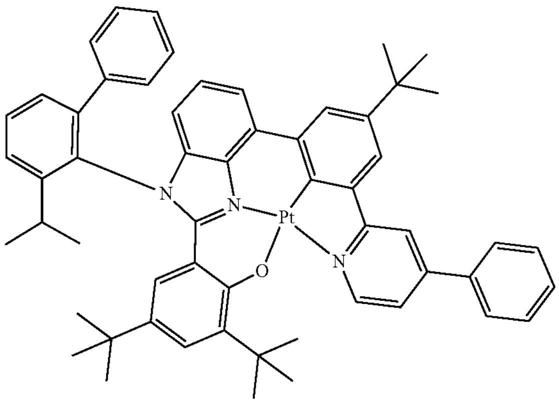
3-442
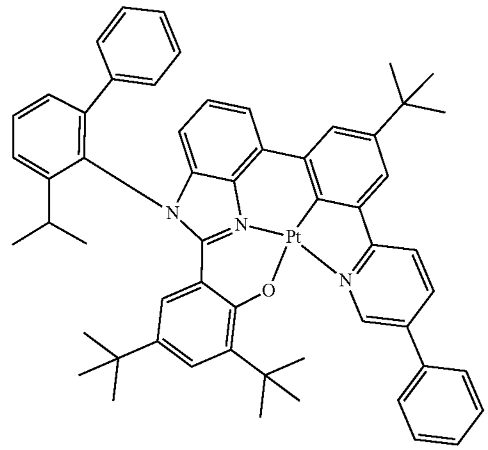
3-443
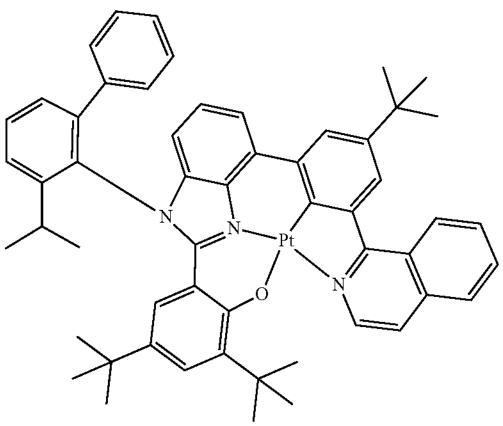
3-444
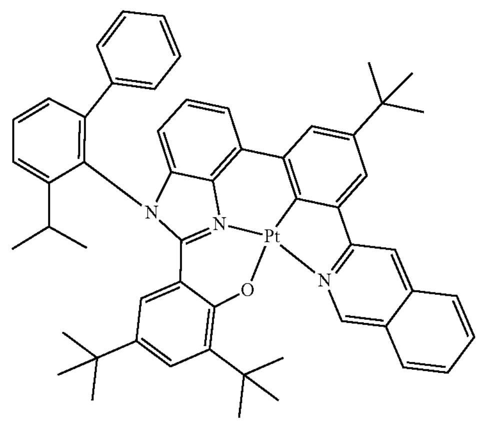
3-445
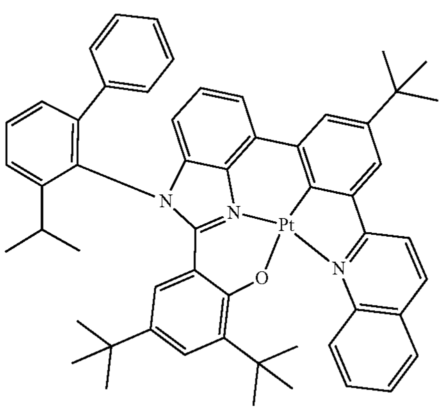
3-446
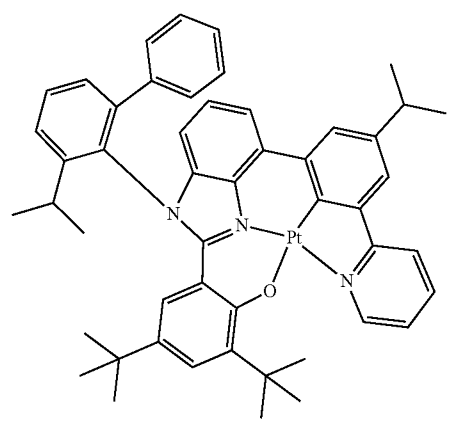

-continued
3-447
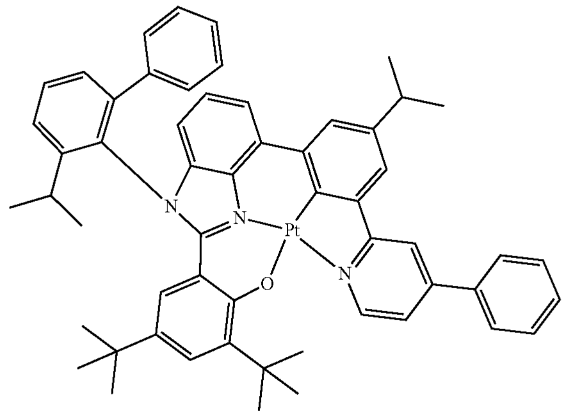
3-448
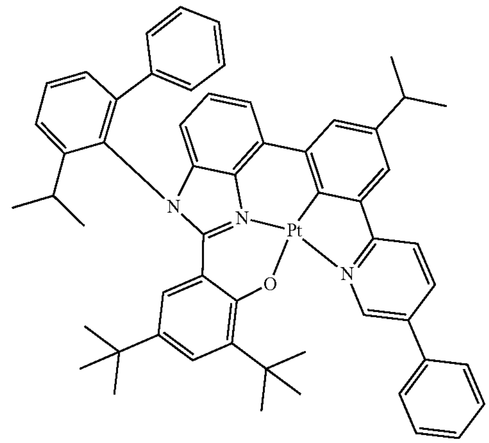
3-449
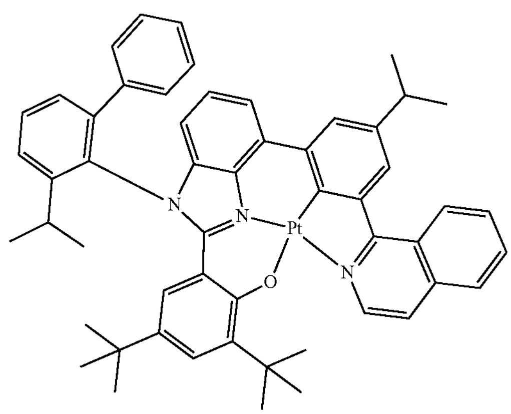
3-450
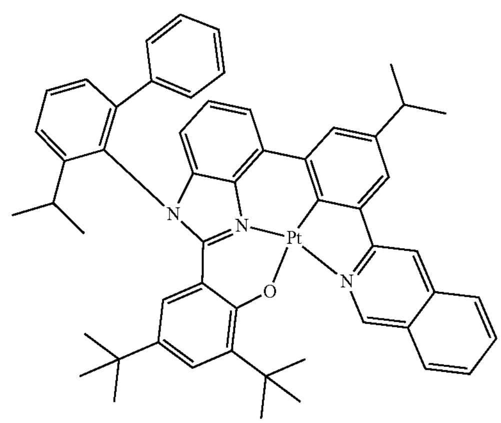
3-451
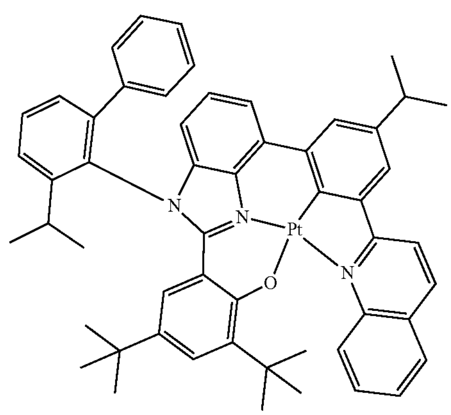
3-452
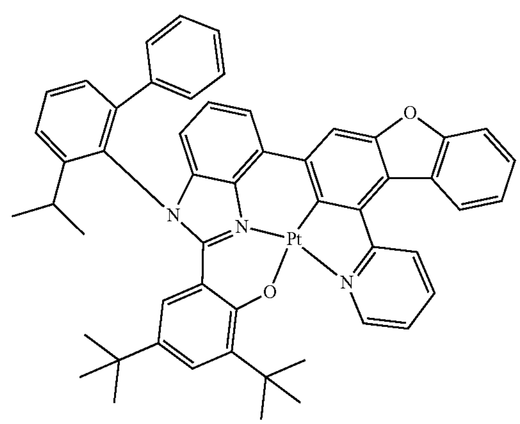

-continued
3-453
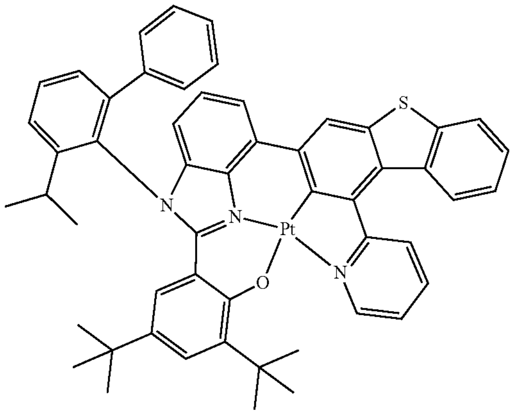
3-454
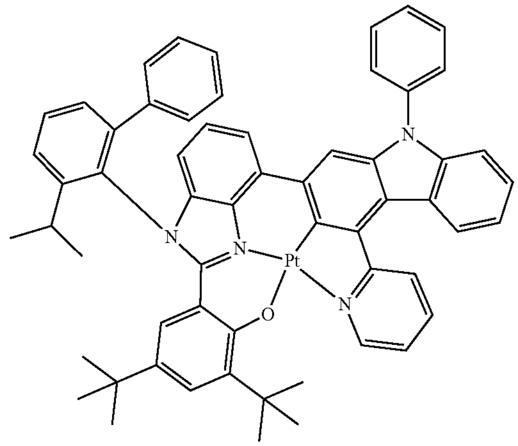
3-455
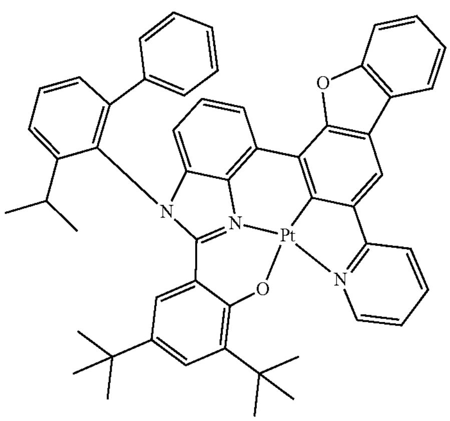
3-456
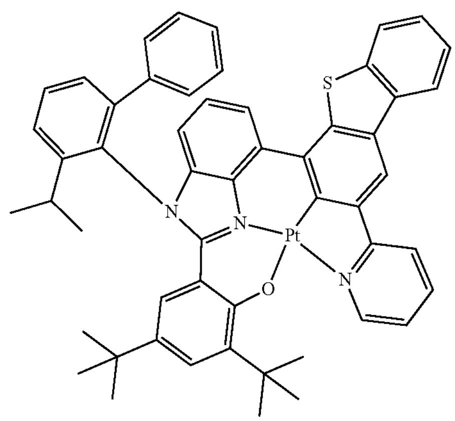
3-457
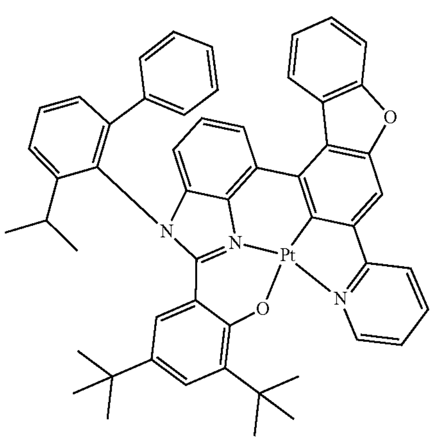
3-458
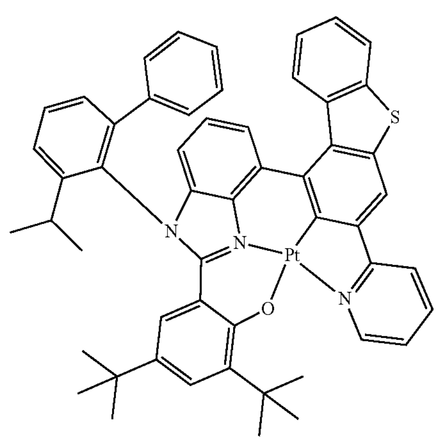

-continued
3-459
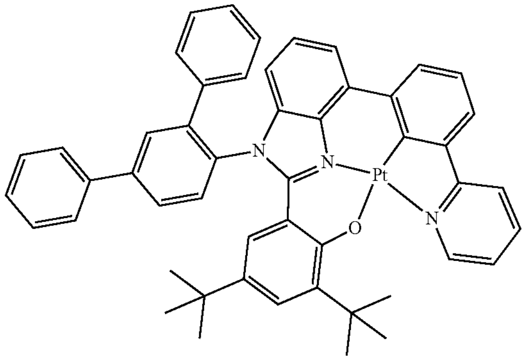
3-460
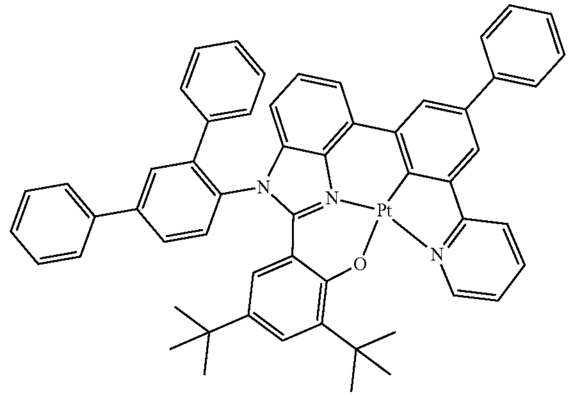
3-461
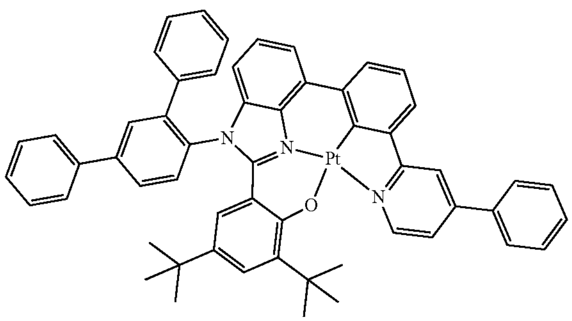
3-462
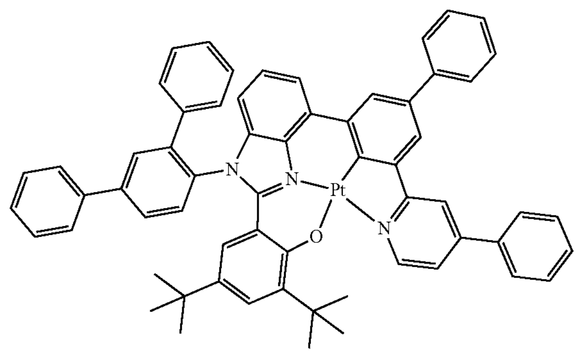
3-463
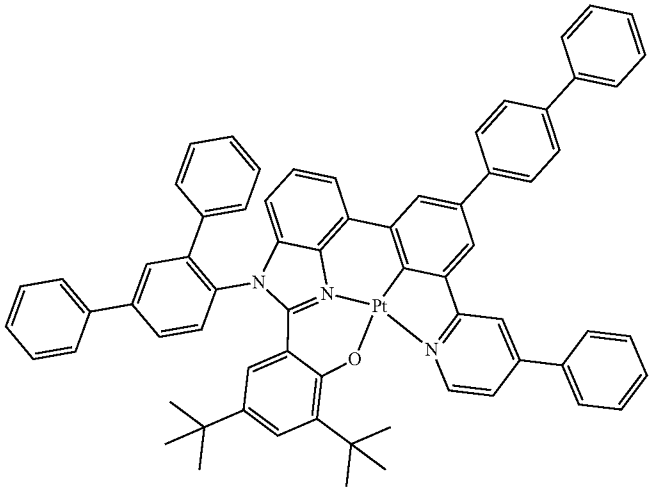

-continued
3-464
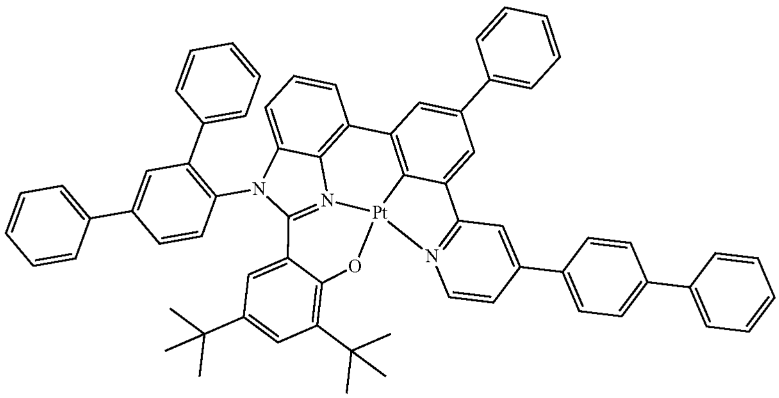
3-465
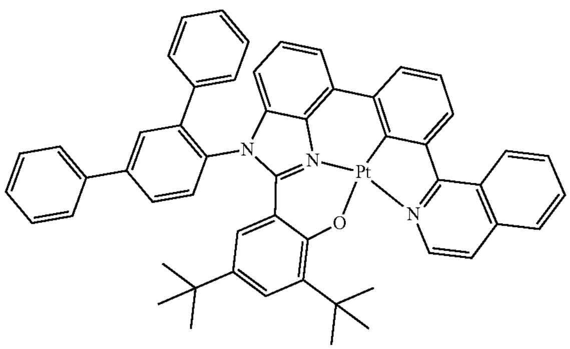
3-466
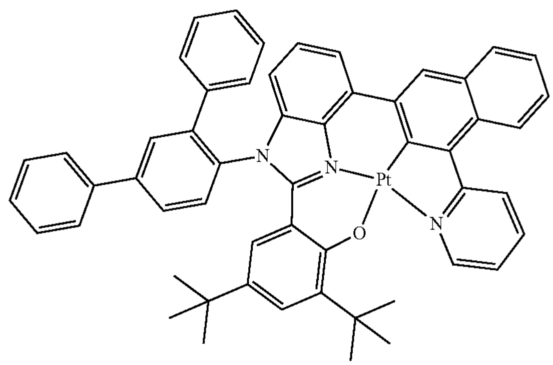
3-467
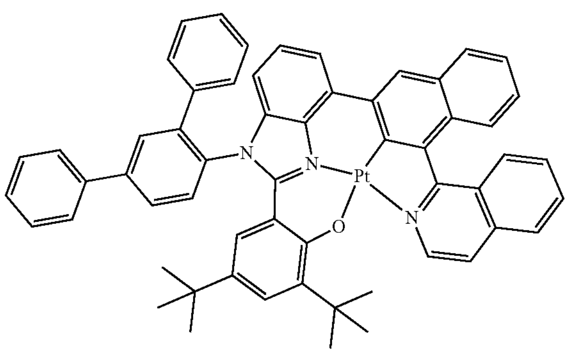
3-468
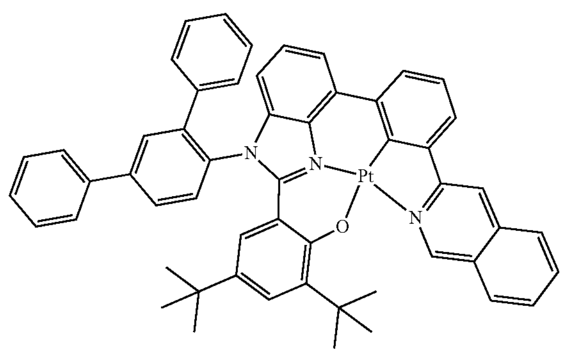
3-469
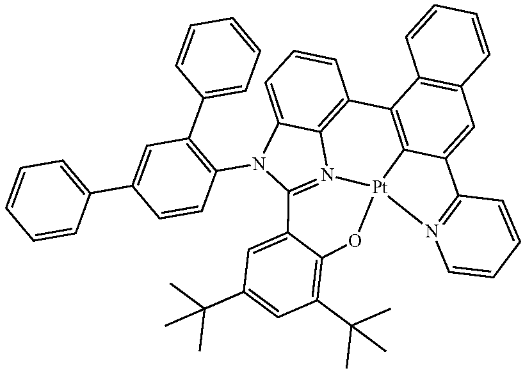
3-470
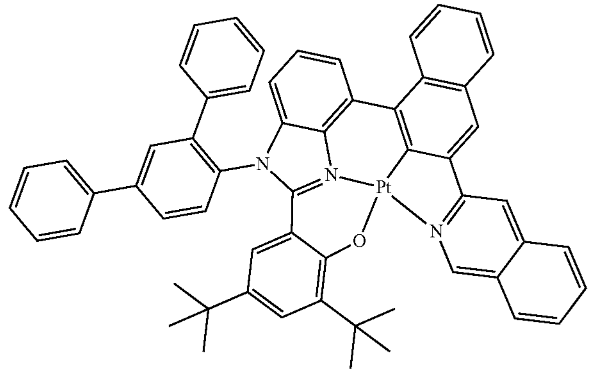

-continued
3-471
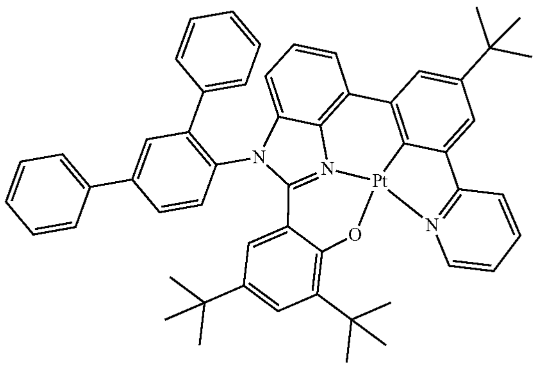
3-472
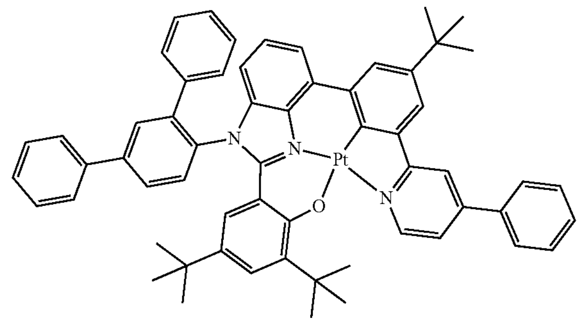
3-473
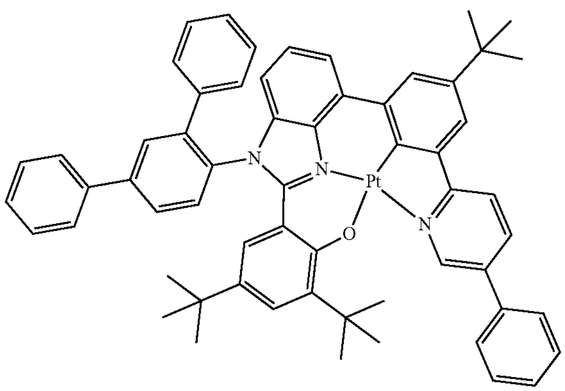
3-474
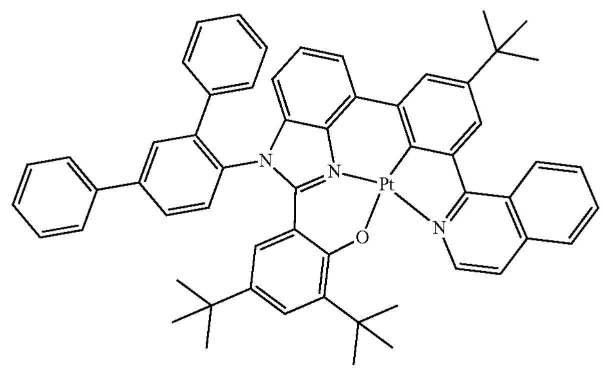
3-475
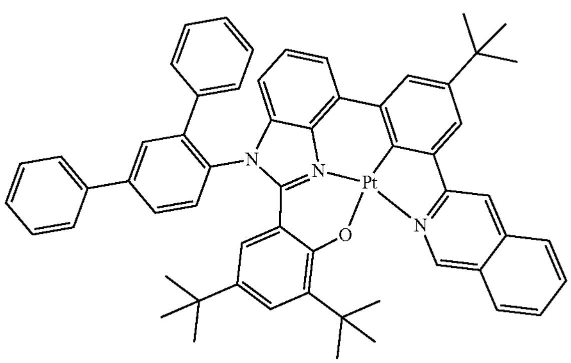
3-476
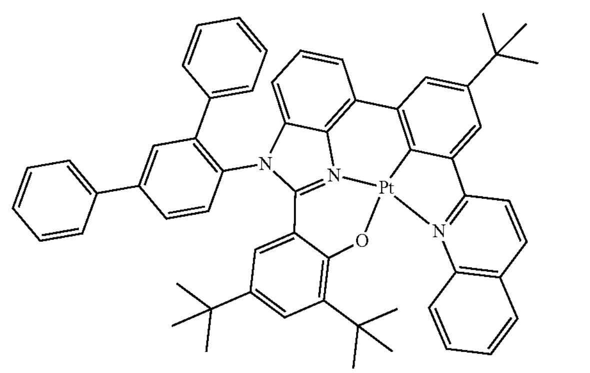
3-477
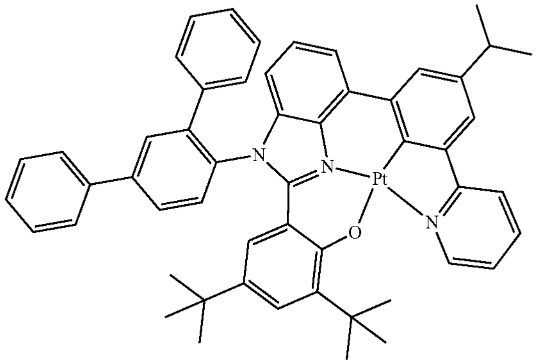
3-478
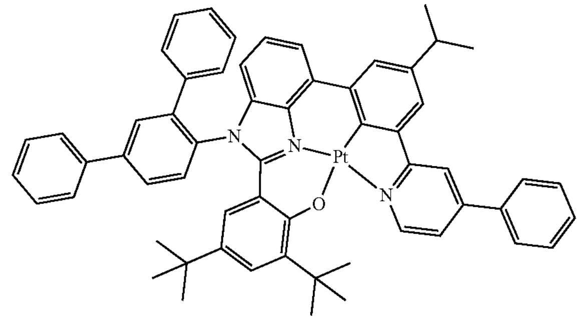

-continued
3-479
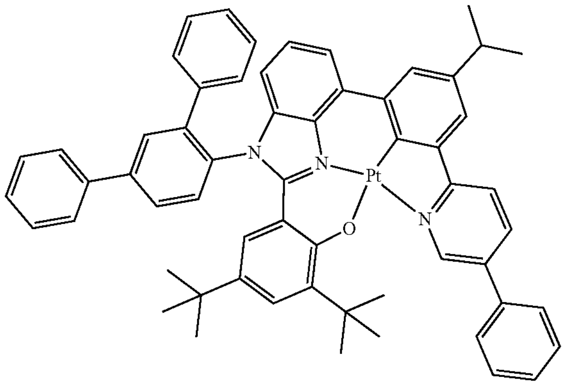
3-480
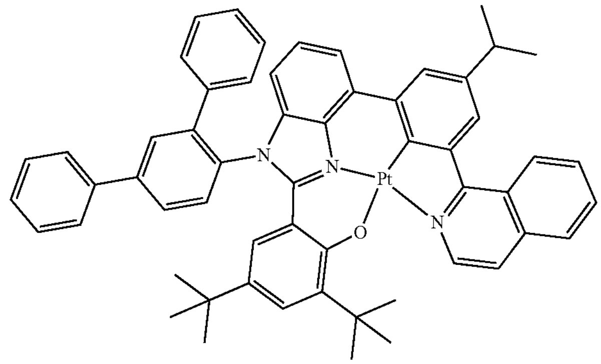
3-481
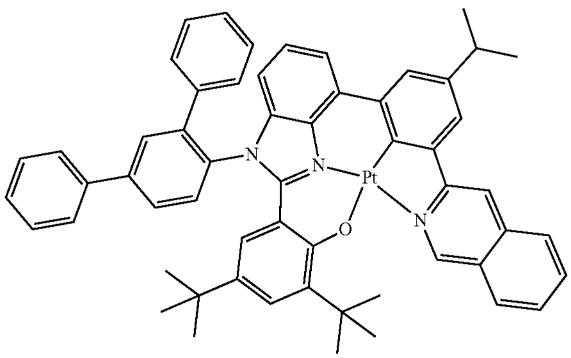
3-482
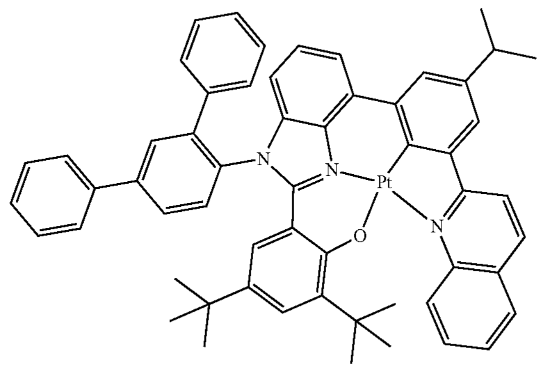
3-483
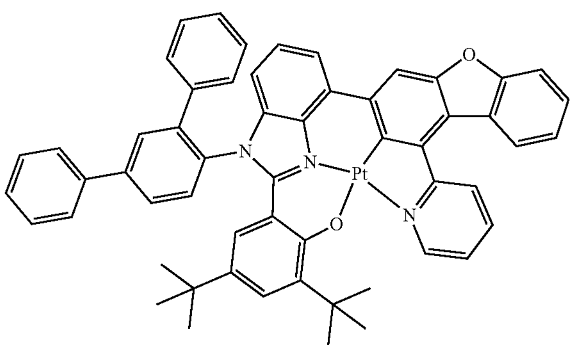
3-484
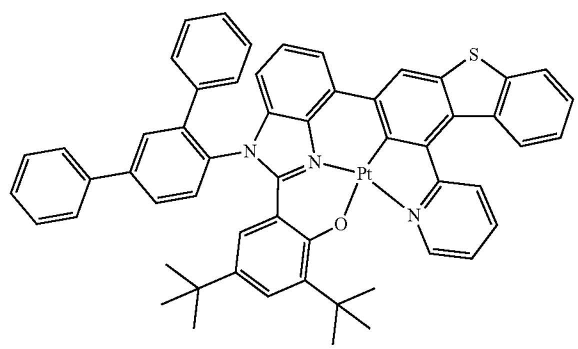
3-485
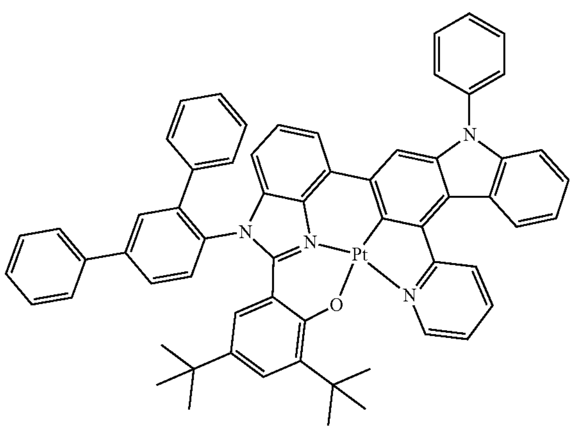
3-486
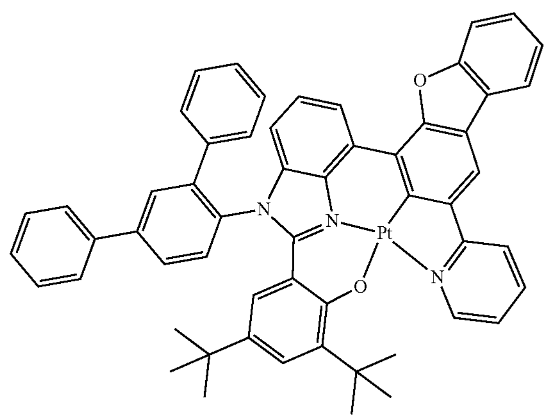

-continued
3-487
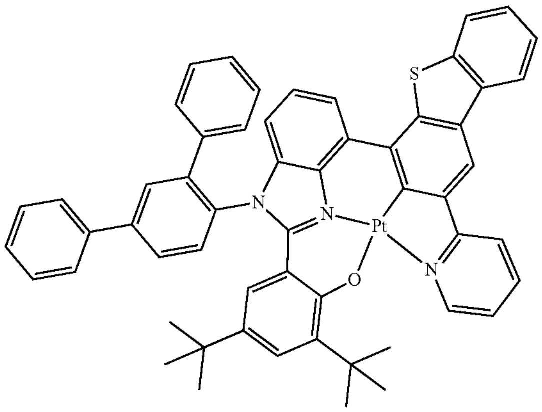
3-488
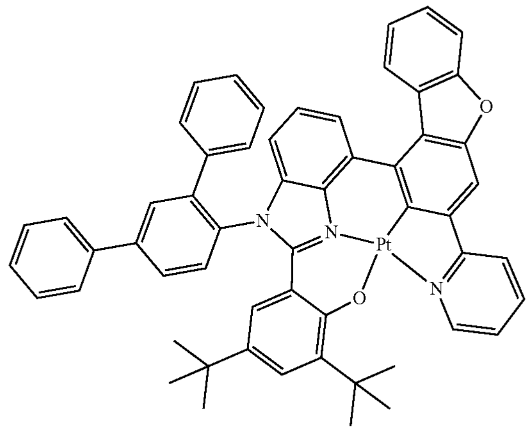
3-489
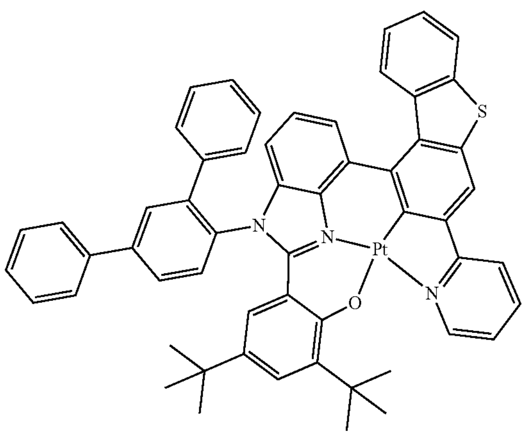
3-490
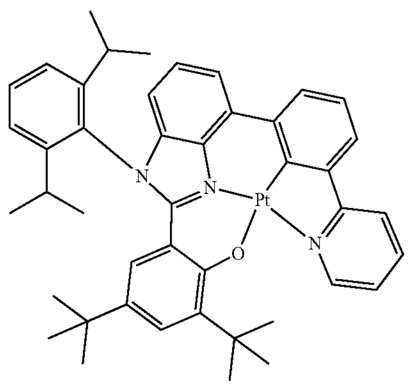
3-491
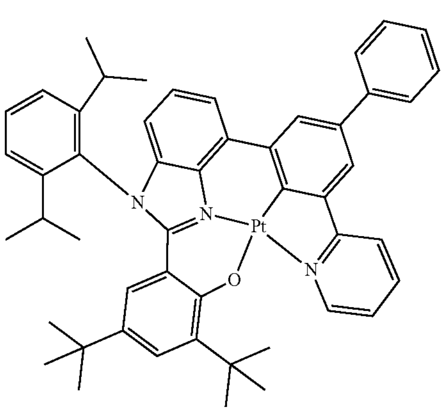
3-492
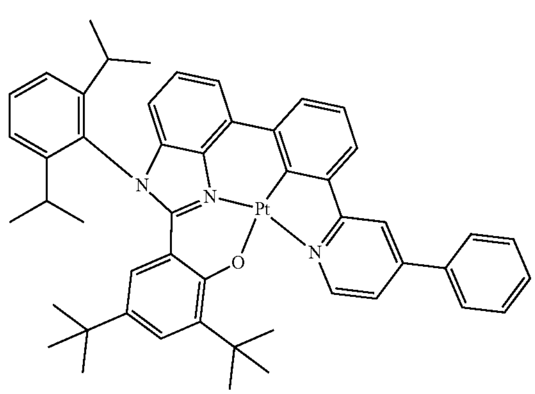

-continued
3-493
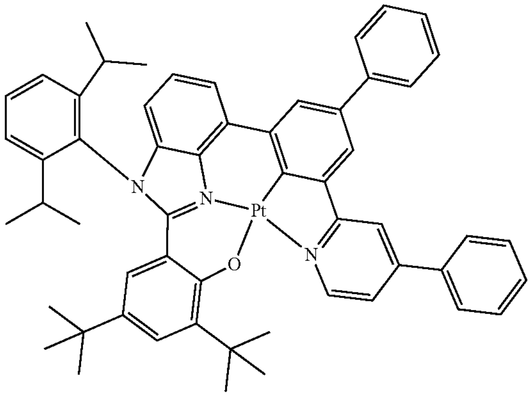
3-494
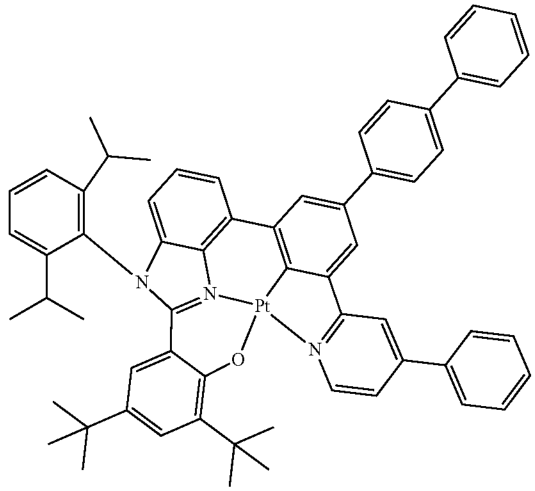
3-495
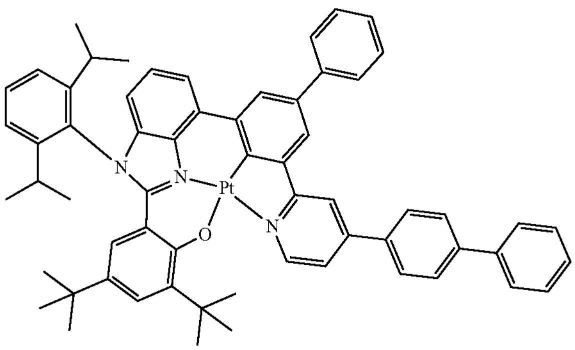
3-496
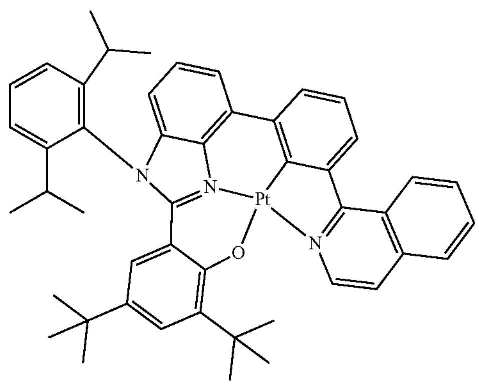
3-497
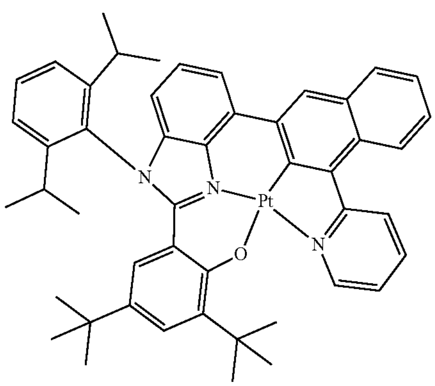
3-498
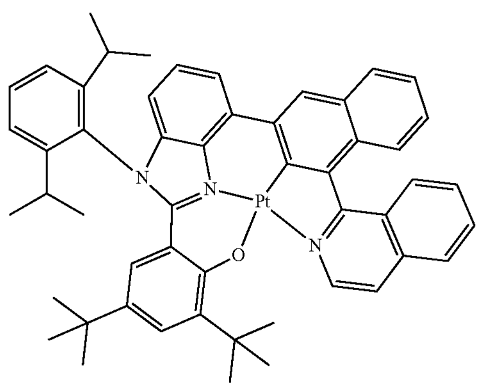
3-499
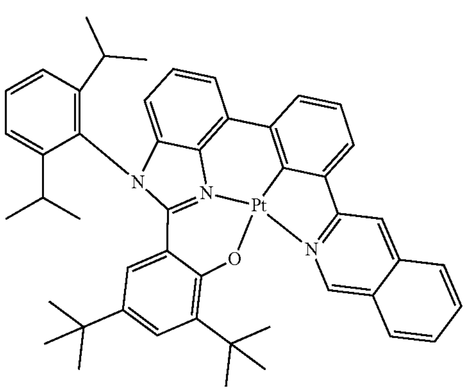
3-500
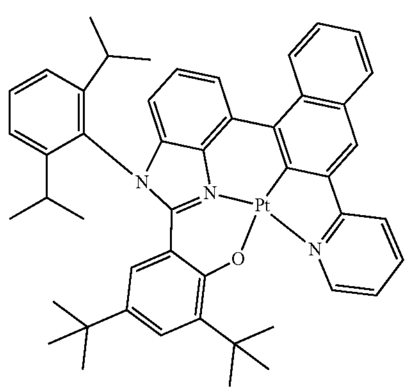

-continued
3-501
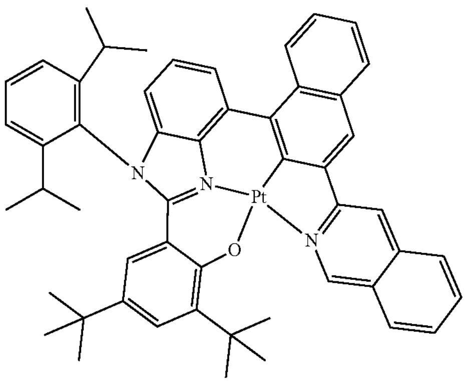
3-502
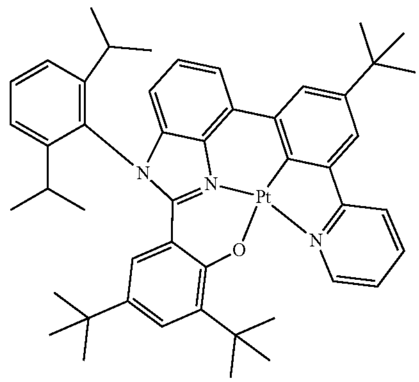
3-503
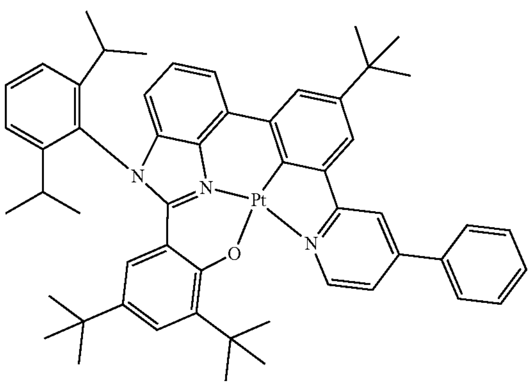
3-504
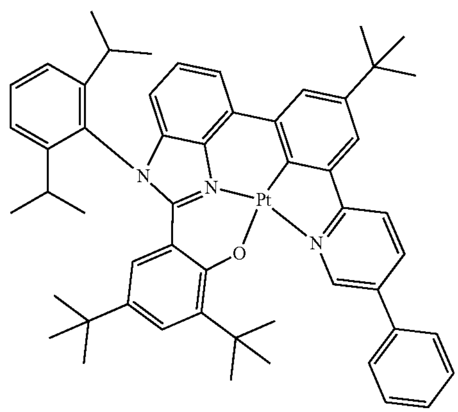
3-505
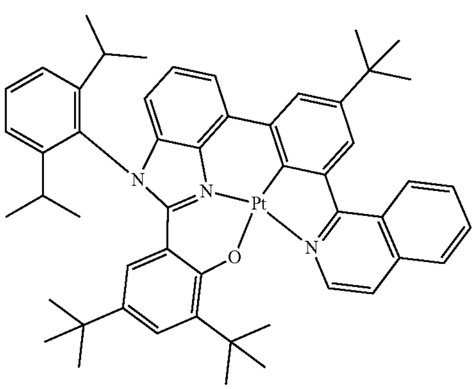
3-506
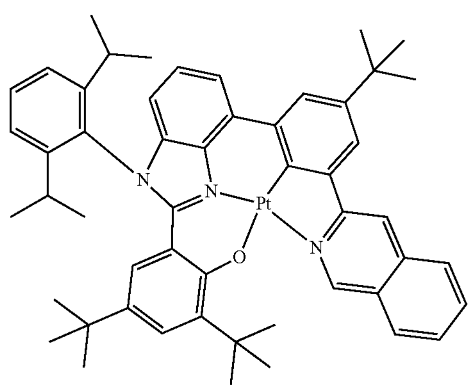
3-507
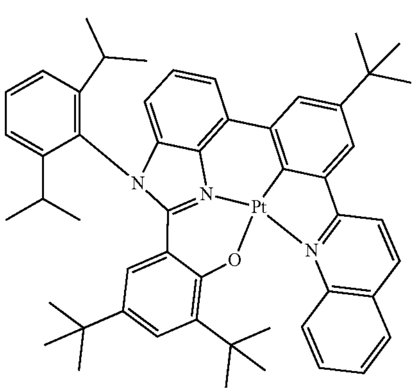
3-508
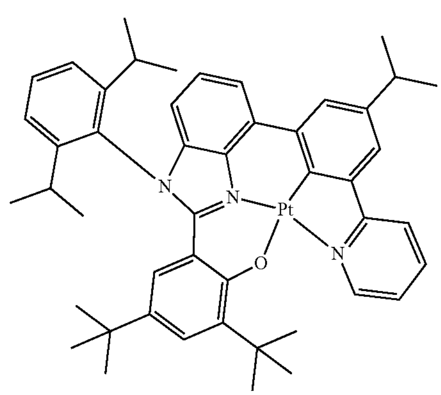

-continued
3-509
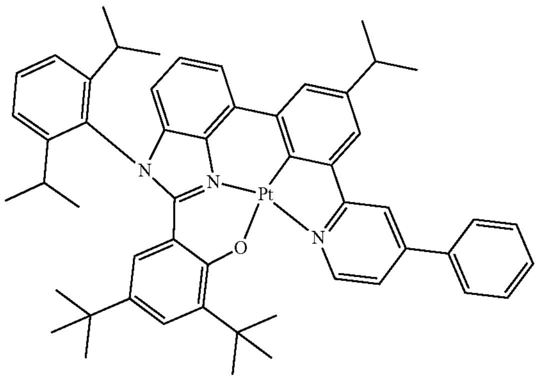
3-510
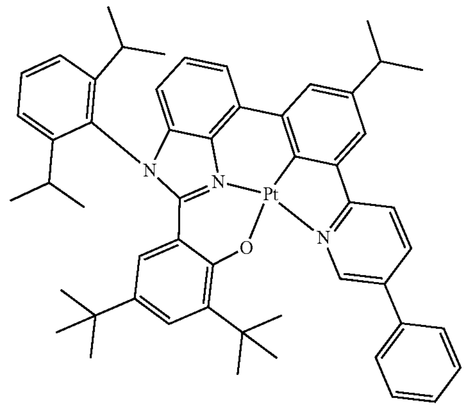
3-511
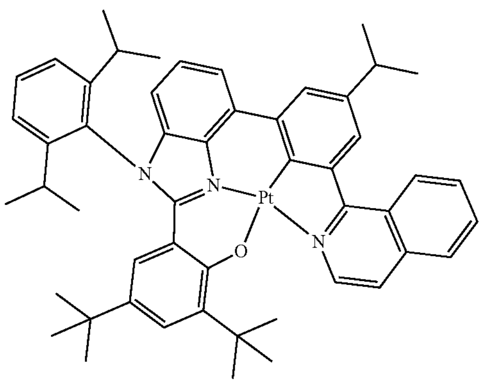
3-512
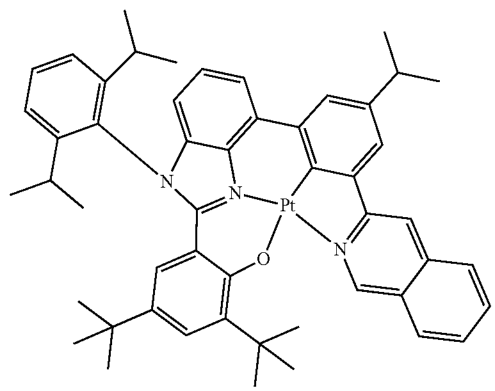
3-513
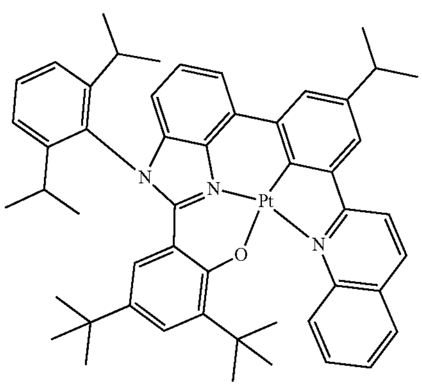
3-514
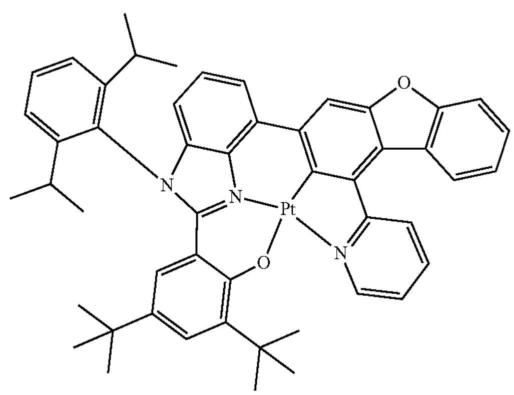
3-515
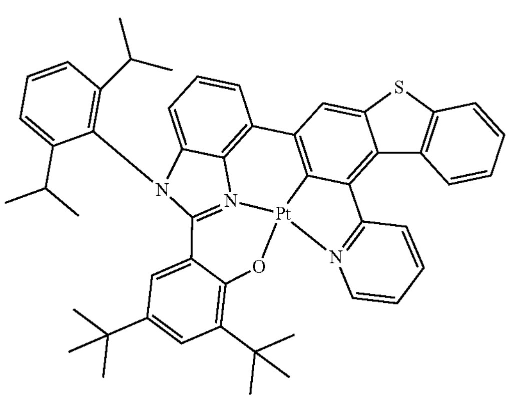
3-516
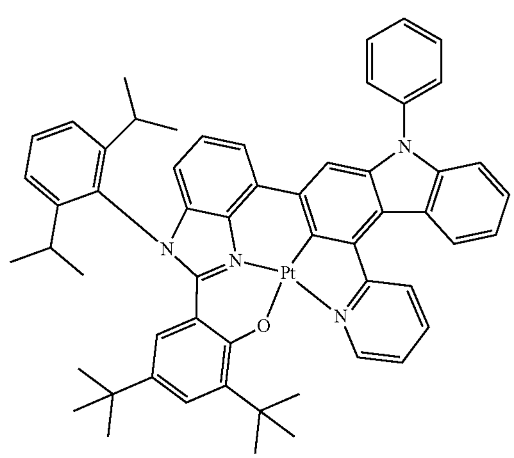

-continued
3-517
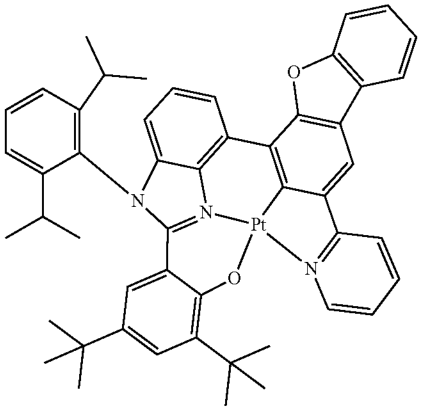
3-518
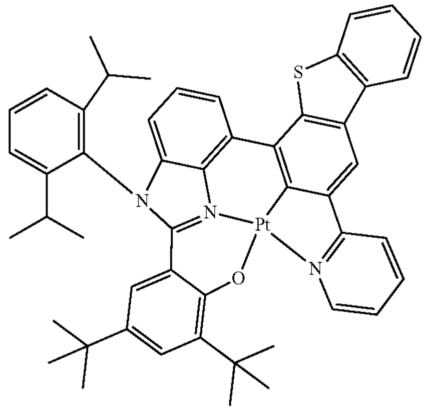
3-519
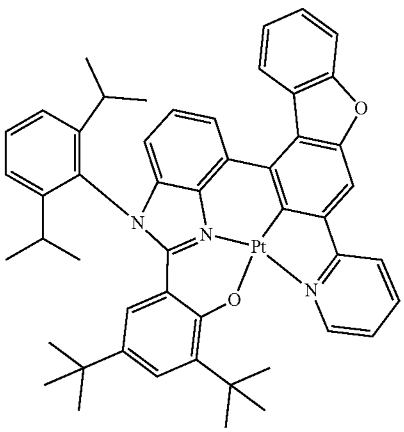
3-520
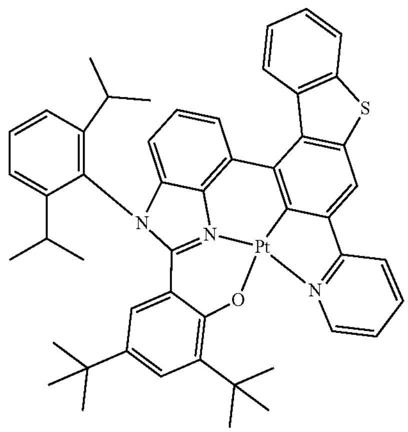
3-521
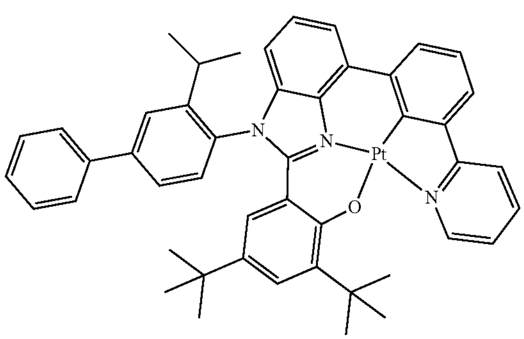
3-522
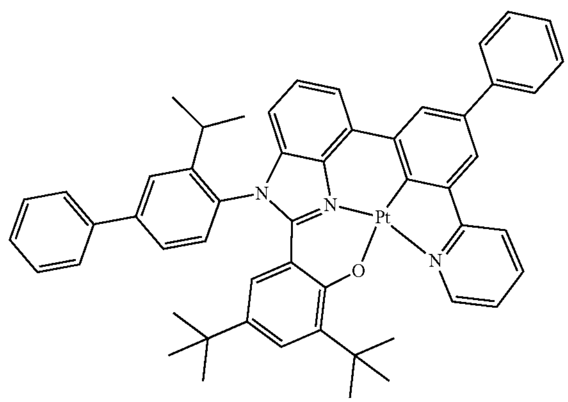
3-523
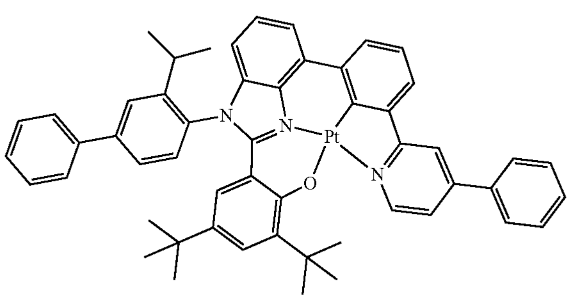
3-524
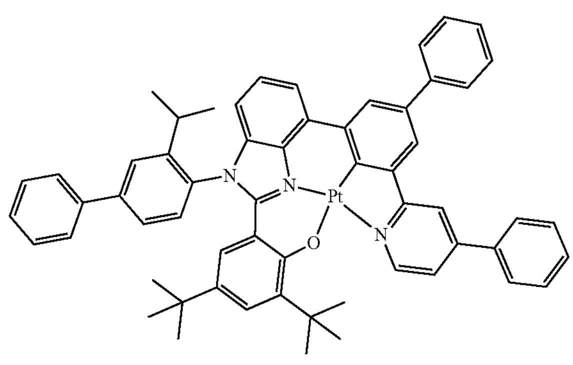

-continued
3-525
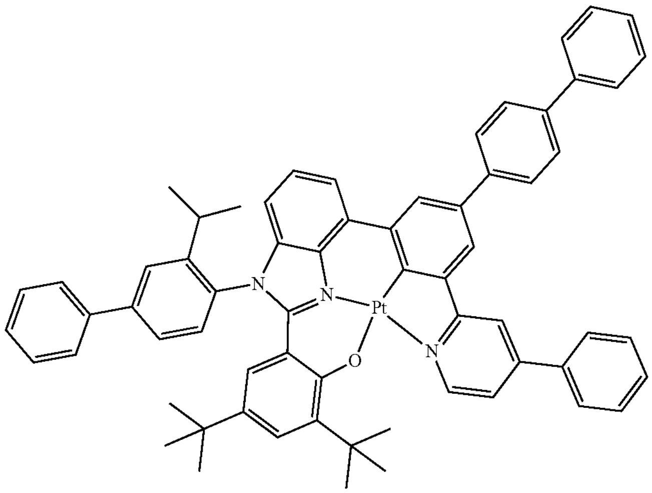
3-526
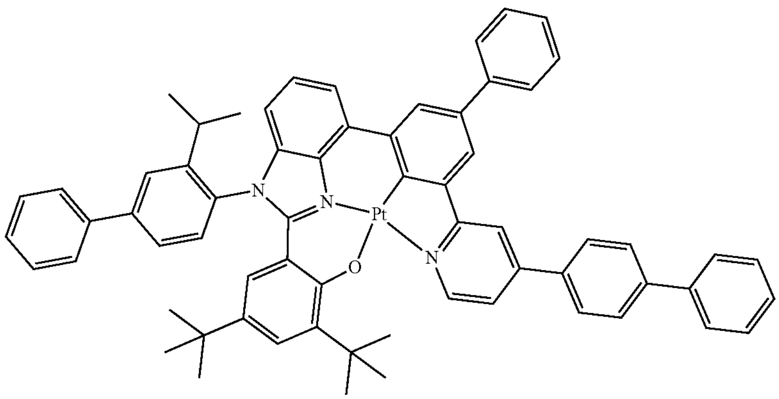
3-527
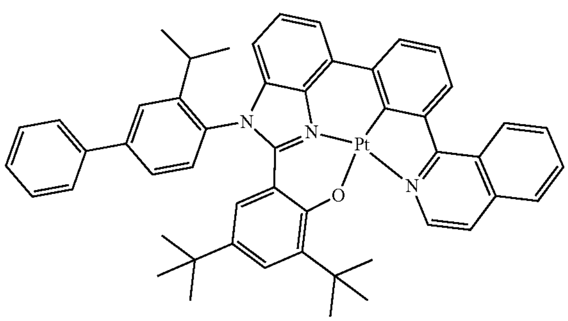
3-528
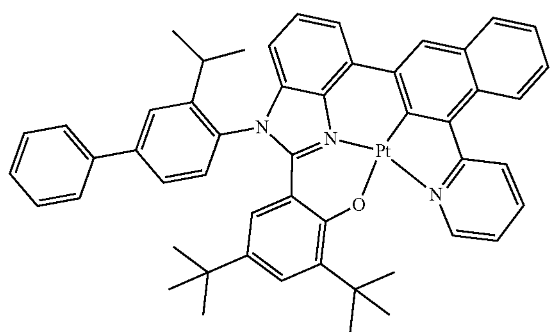
3-529
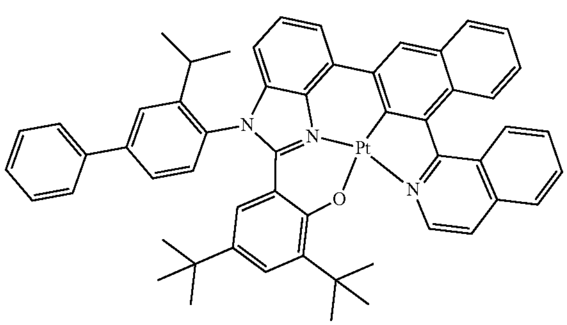
3-530
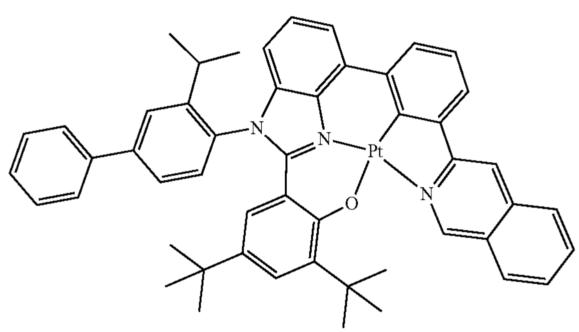

-continued
3-531
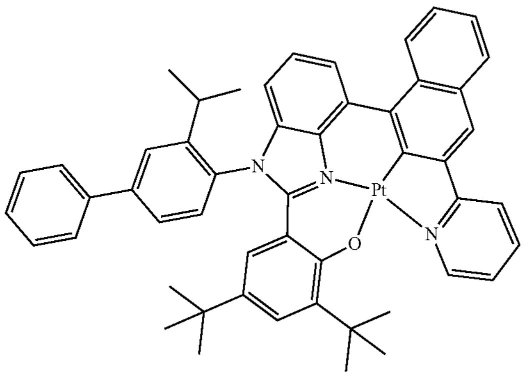
3-532
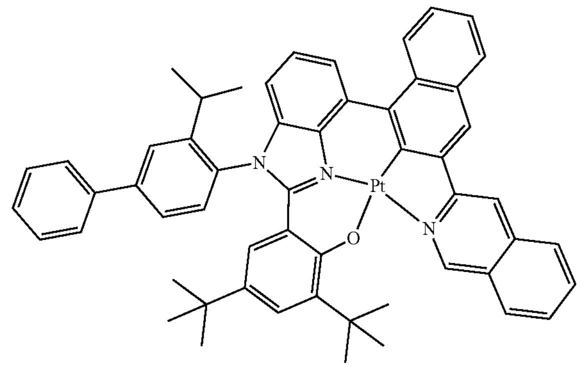
3-533
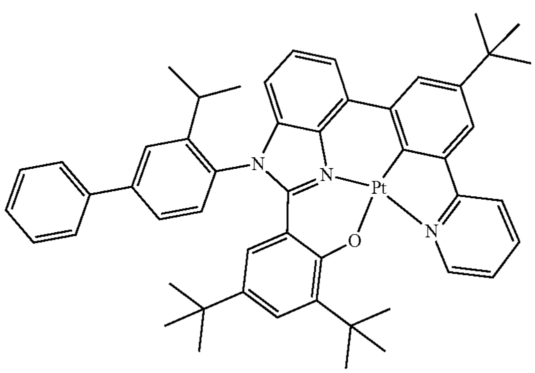
3-534
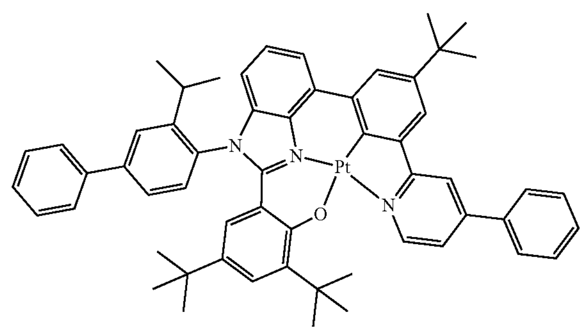
3-535
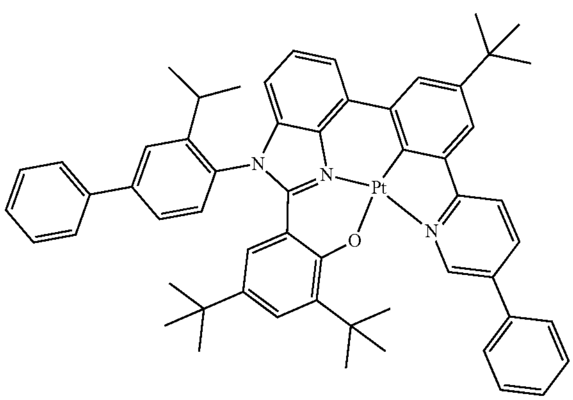
3-536
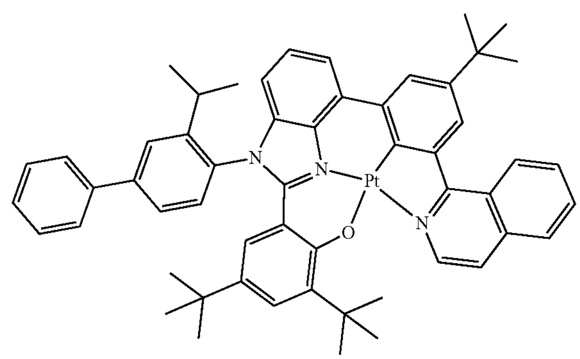
3-537
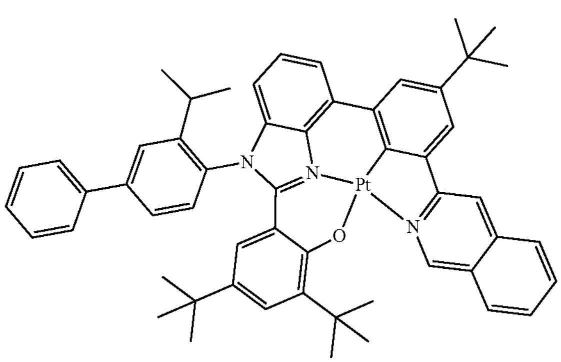
3-538
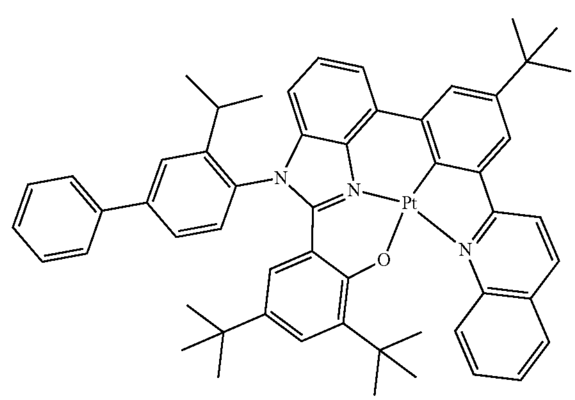

-continued
3-539
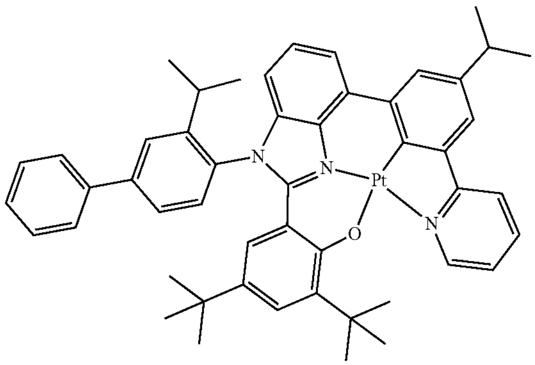
3-540
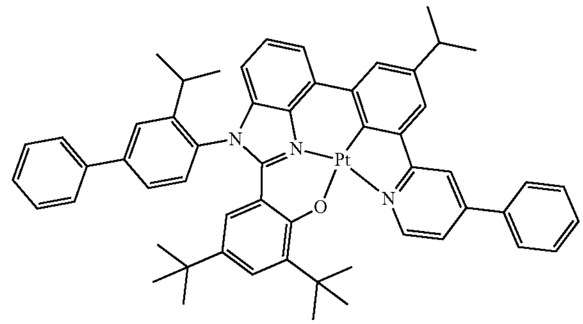
3-541
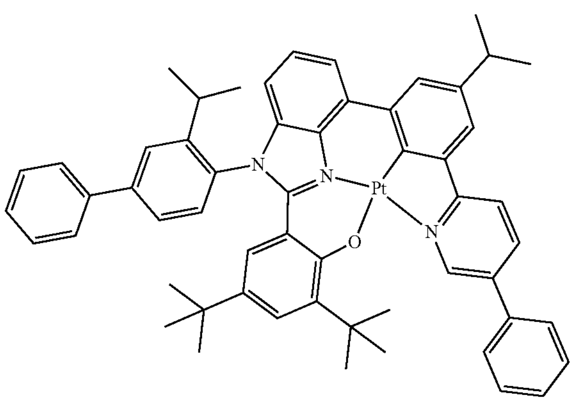
3-542
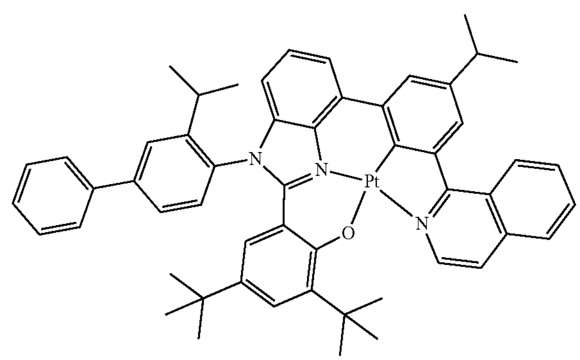
3-543
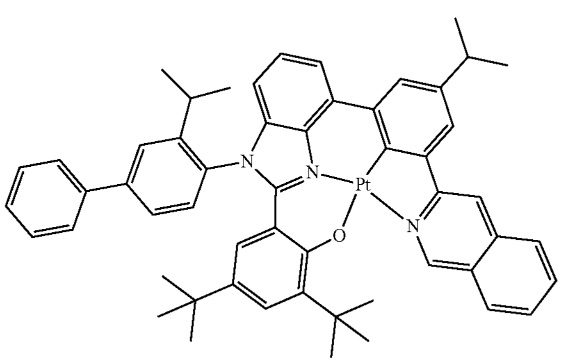
3-544
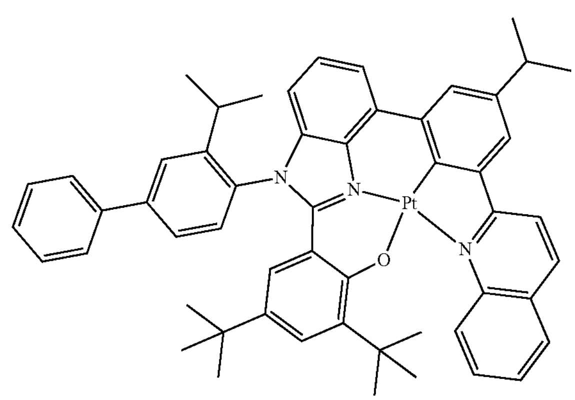
3-545
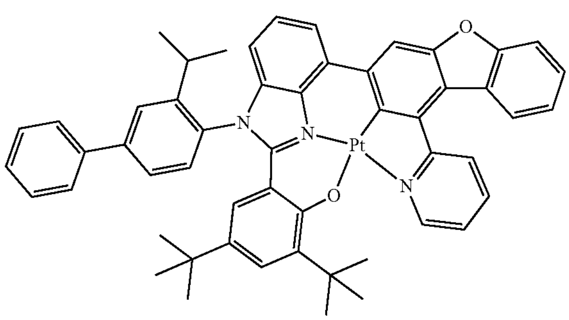
3-546
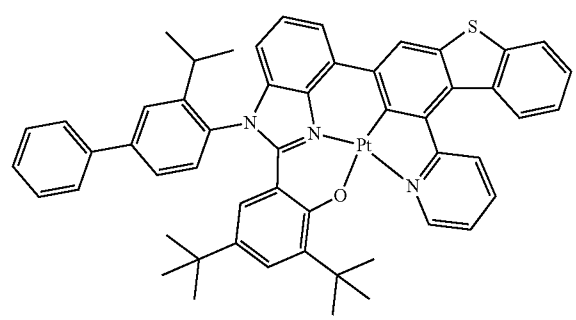

-continued
3-547
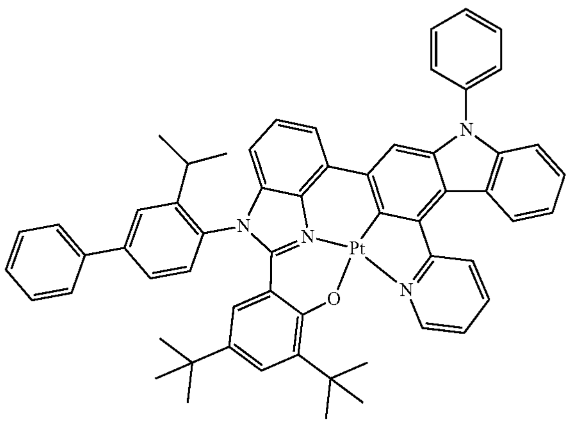
3-548
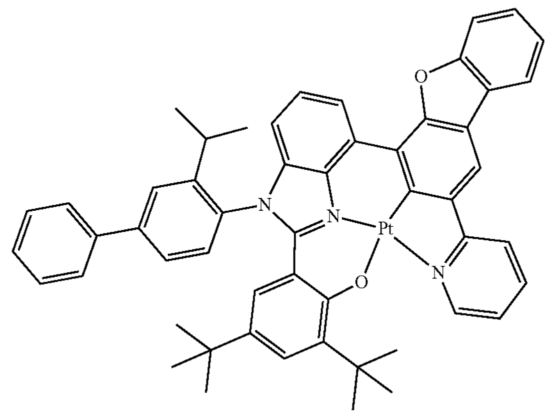
3-549
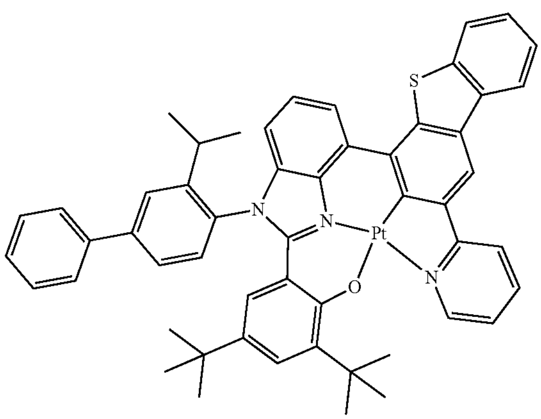
3-550
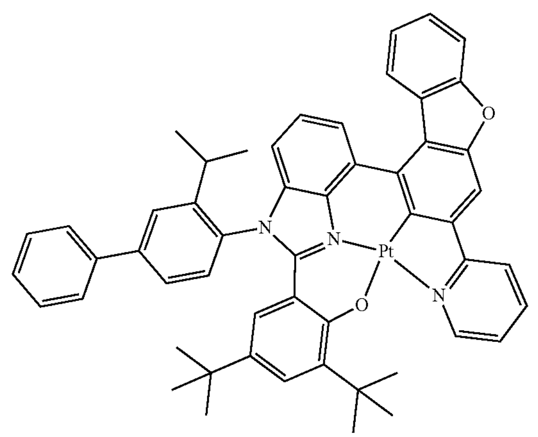
3-551
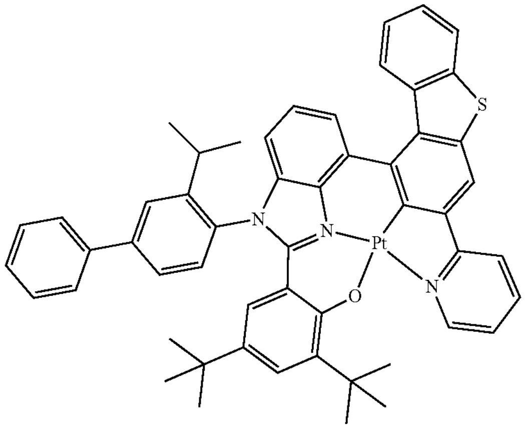
3-552
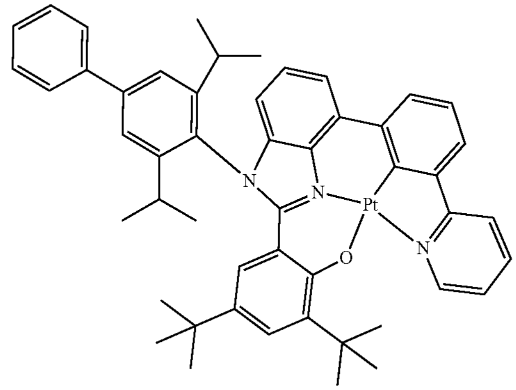

-continued
3-553
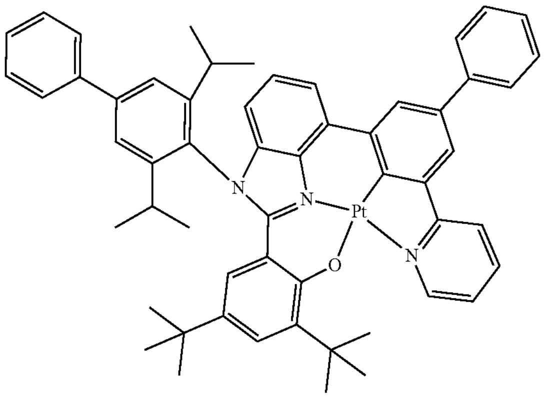
3-554
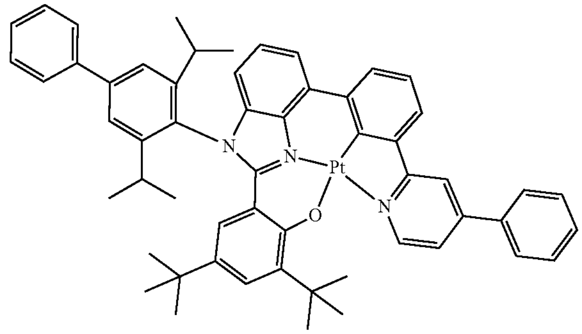
3-555
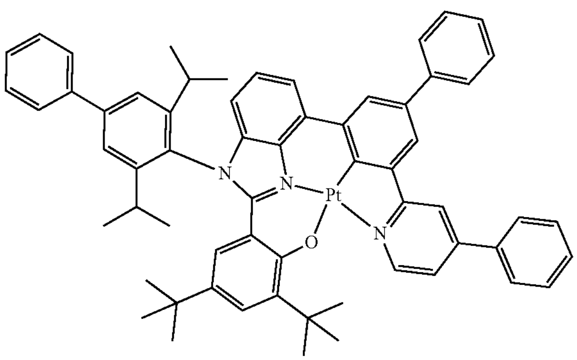
3-556
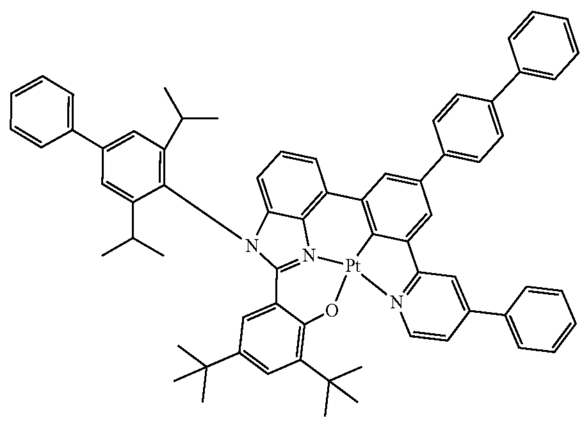
3-557
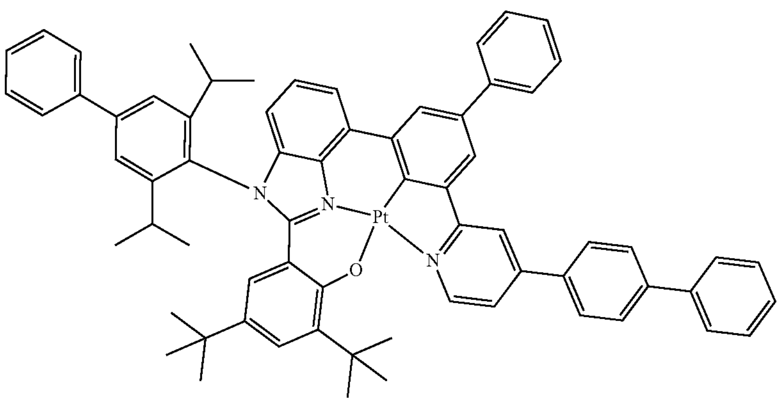

-continued
3-558
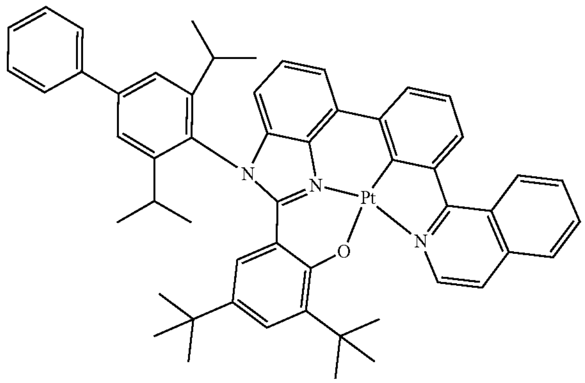
3-559
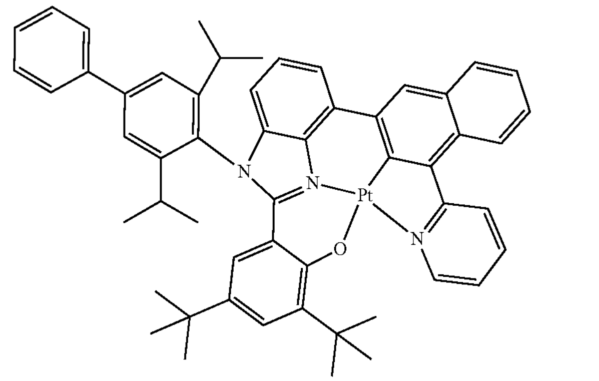
3-560
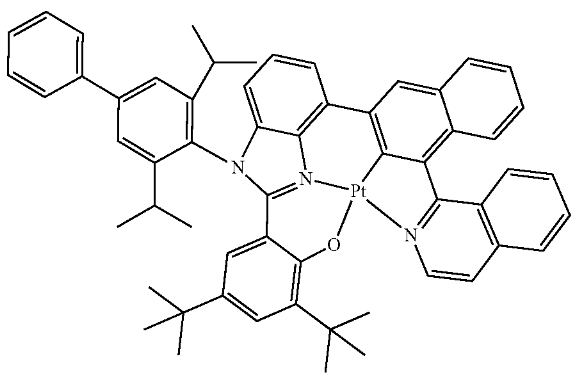
3-561
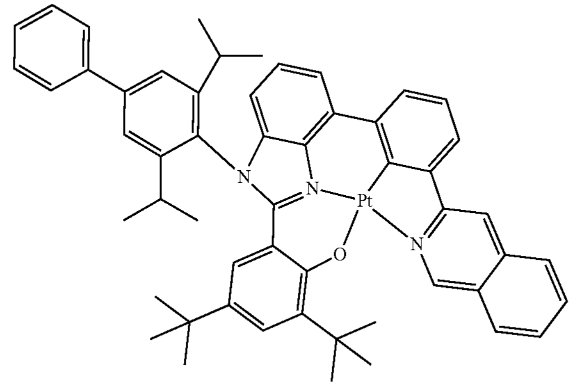
3-562
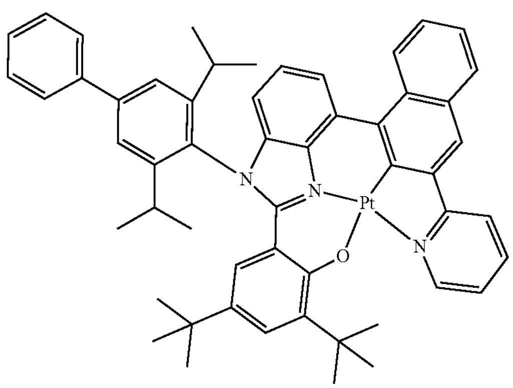
3-563
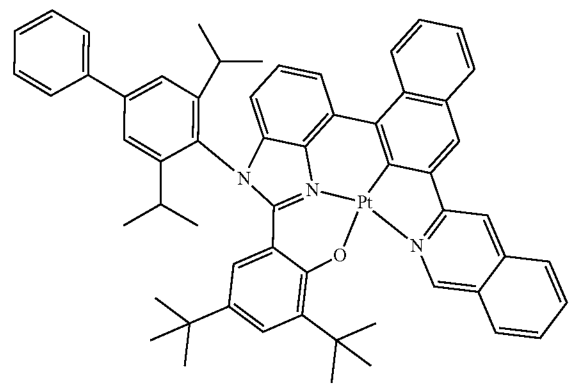
3-564
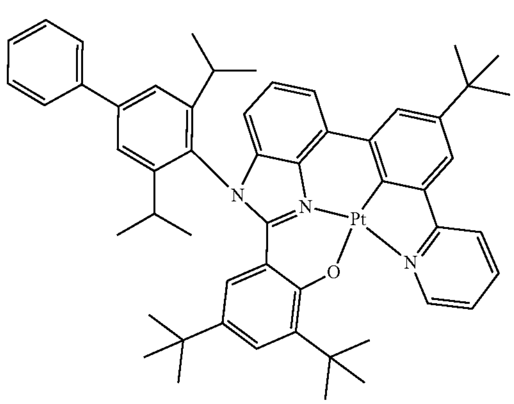
3-565
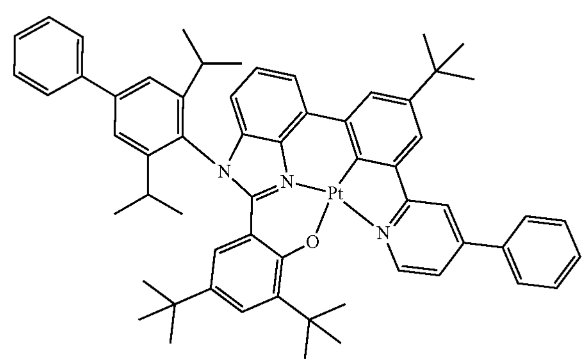

-continued
3-566
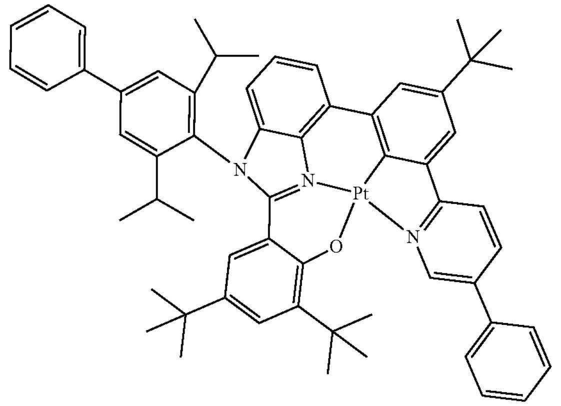
3-567
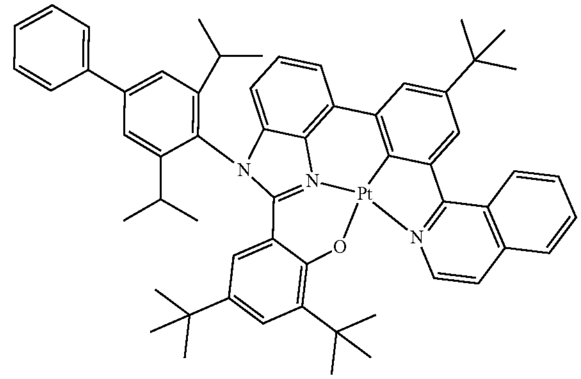
3-568
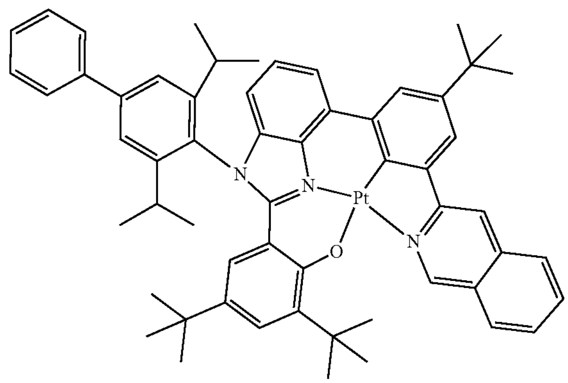
3-569
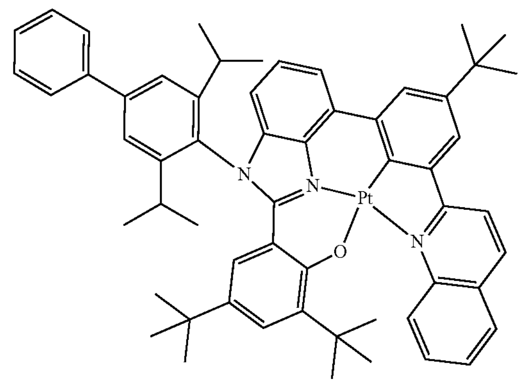
3-570
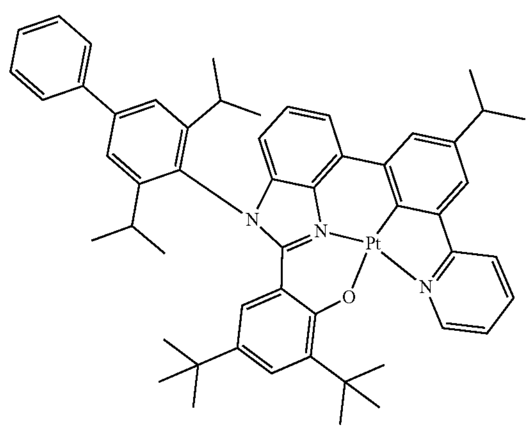
3-571
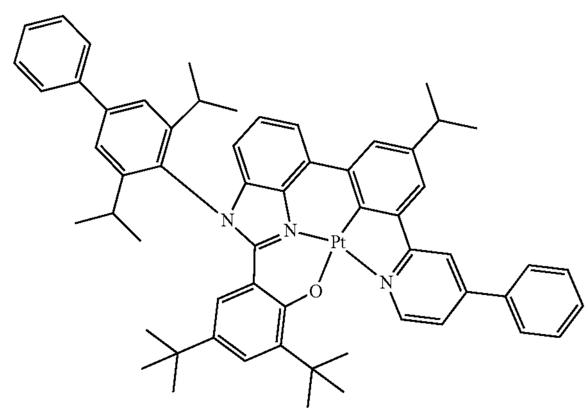

-continued
3-572
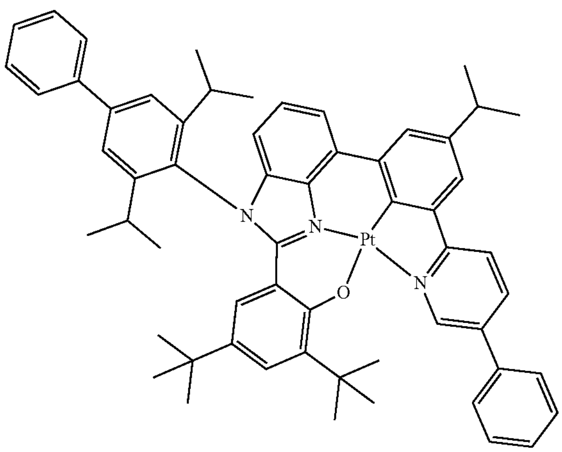
3-573
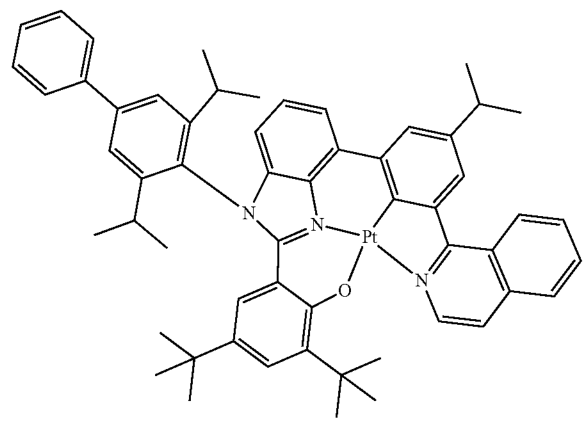
3-574
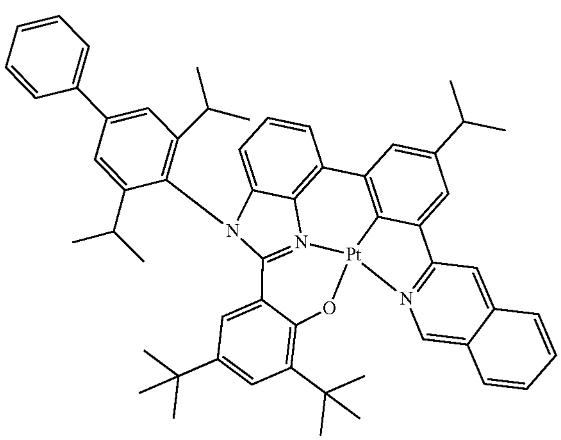
3-575
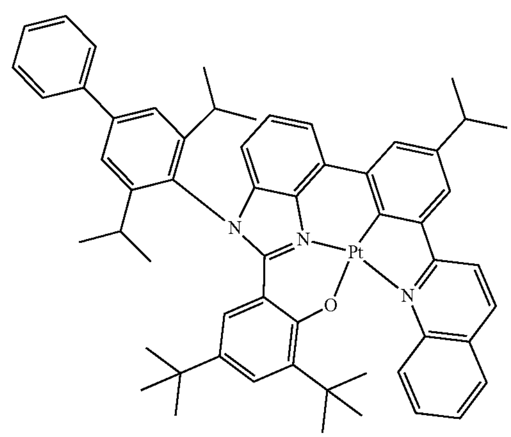
3-576
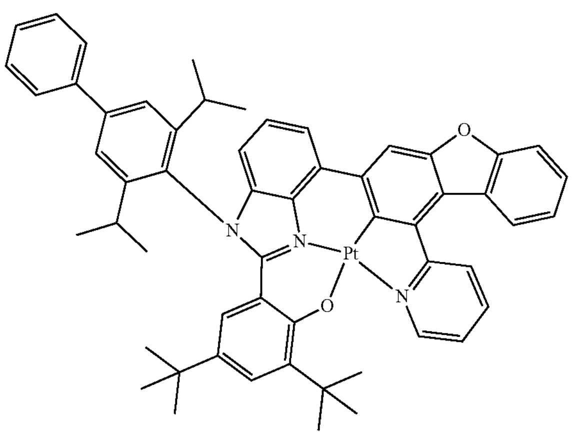
3-577
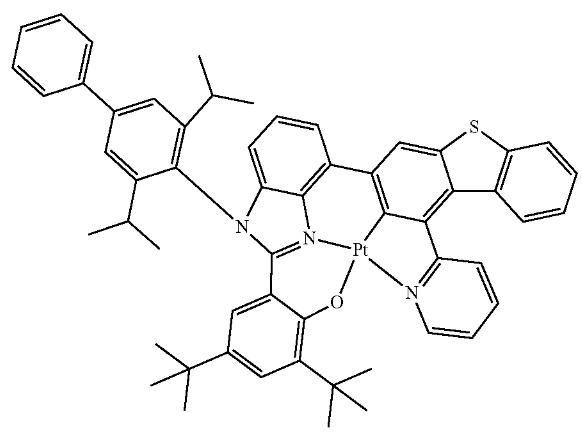

-continued
3-578
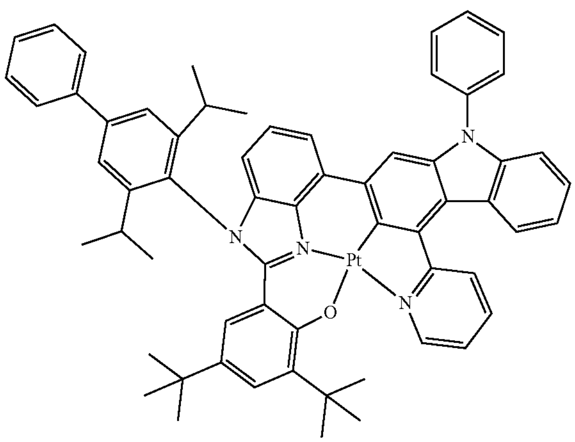
3-579
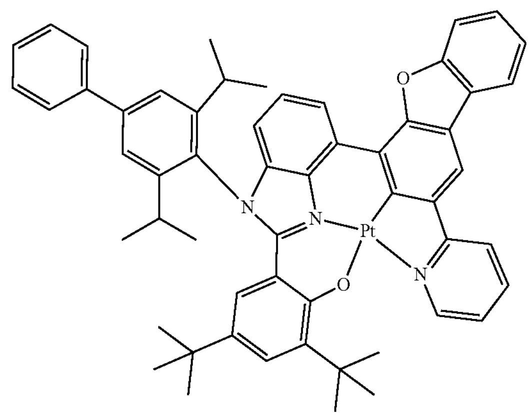
3-580
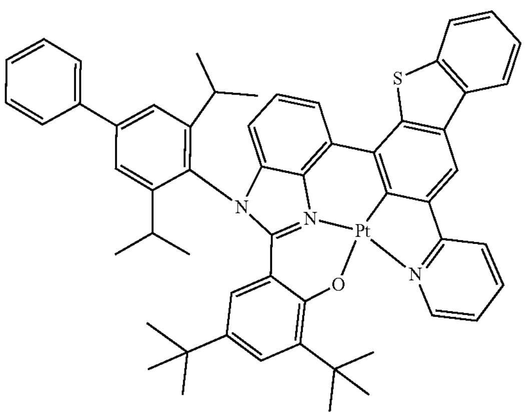
3-581
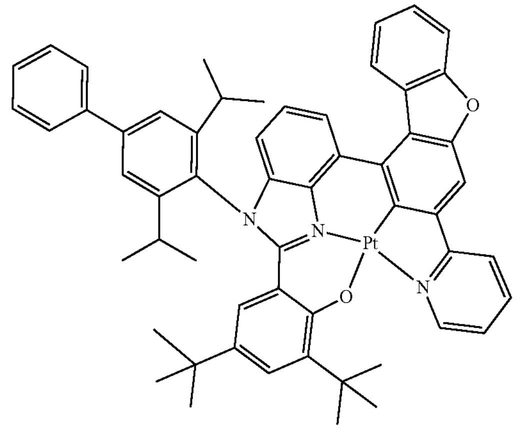
3-582
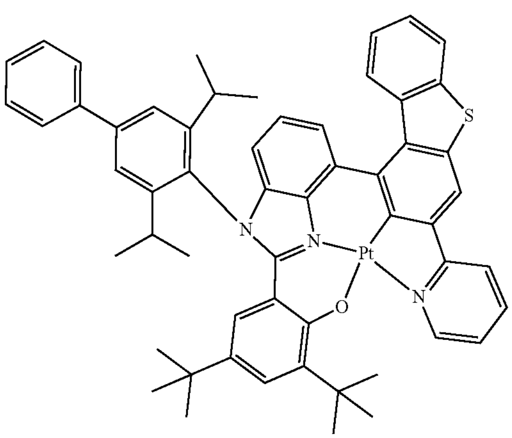
3-583
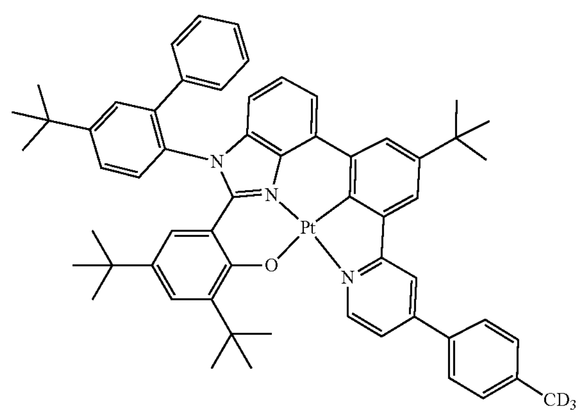

-continued
3-584
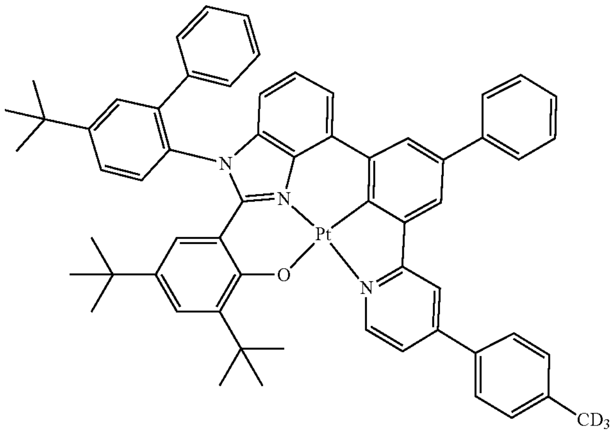
3-585
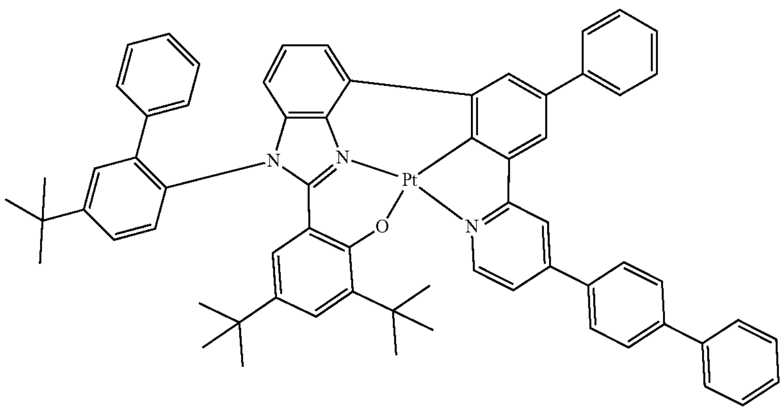
3-586
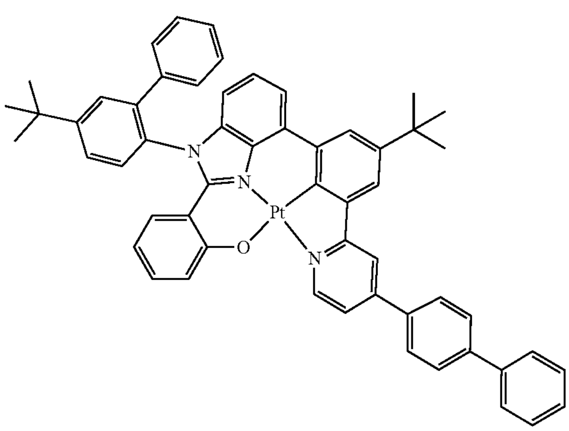
3-587
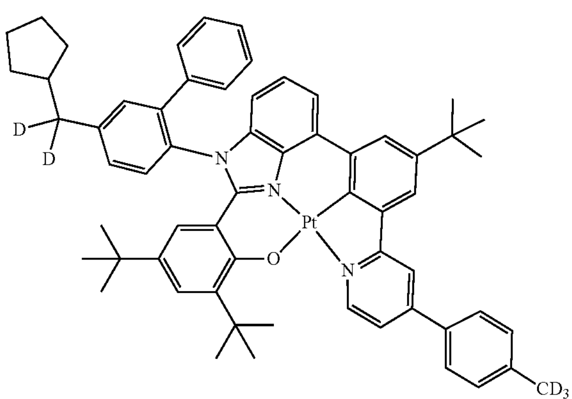

-continued
3-588
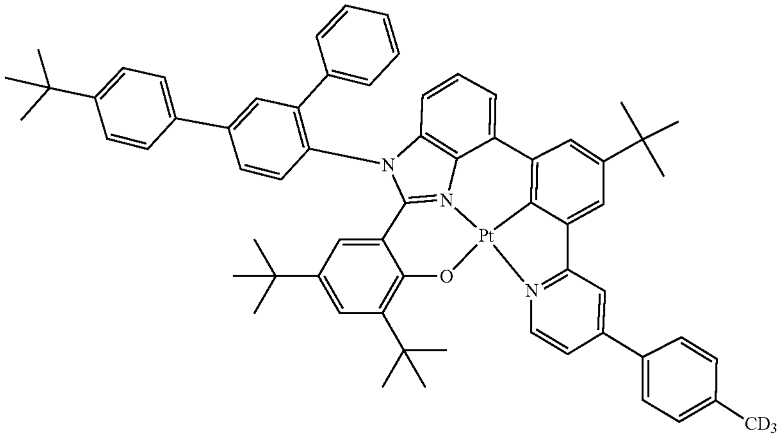
3-589
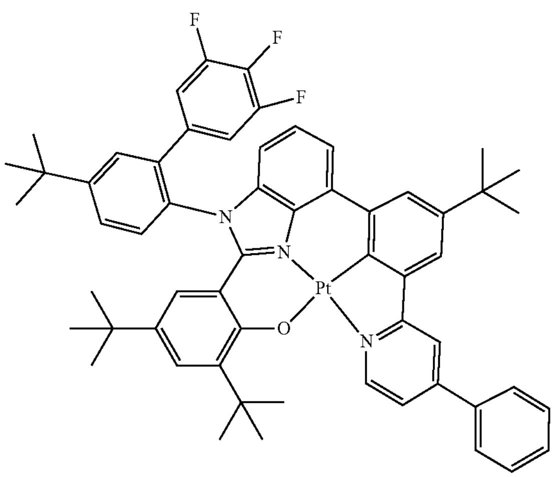
3-590
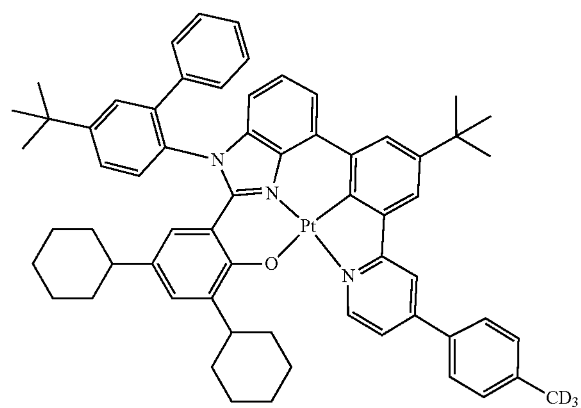
3-591
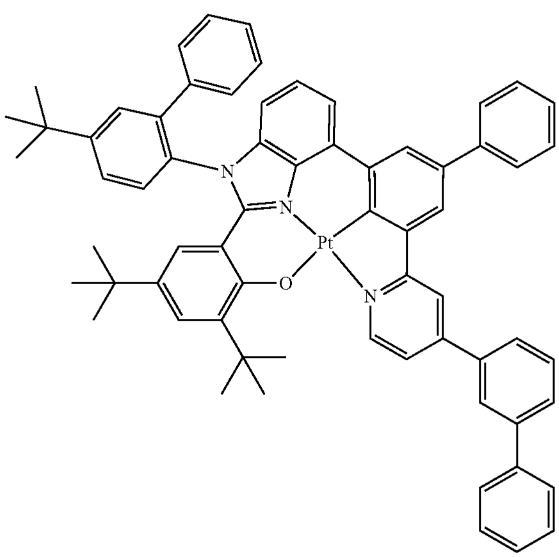
4-1
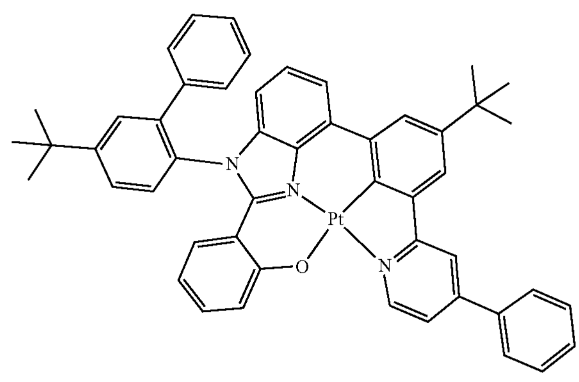

-continued
4-2
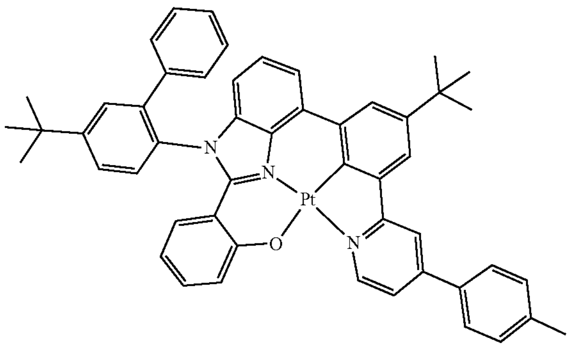
4-3
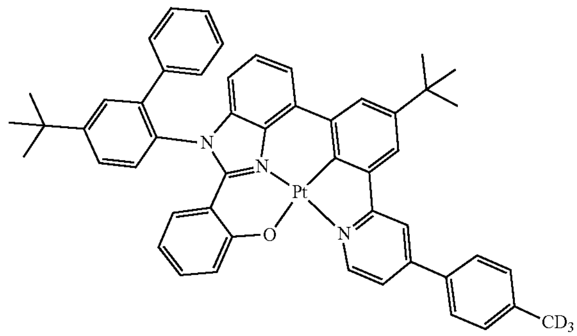
4-4
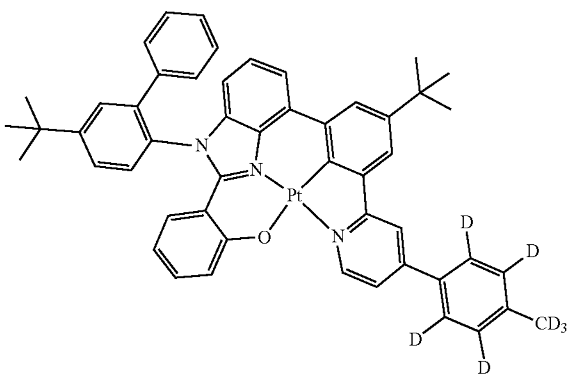
4-5
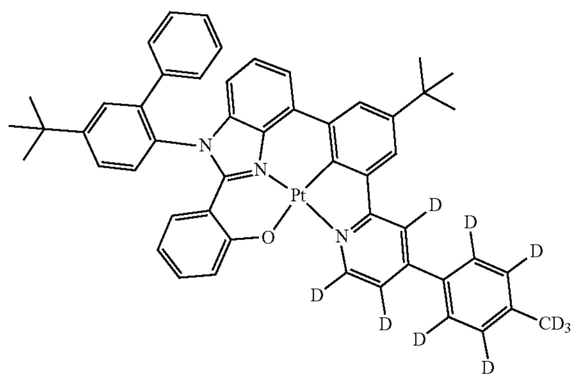
4-6
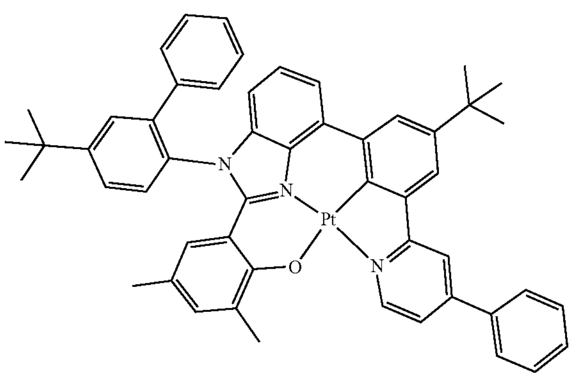
4-7
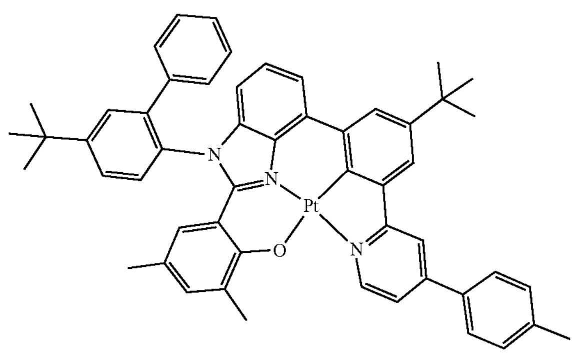
4-8
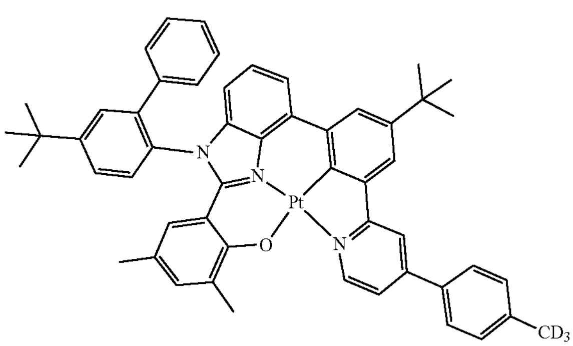
4-9
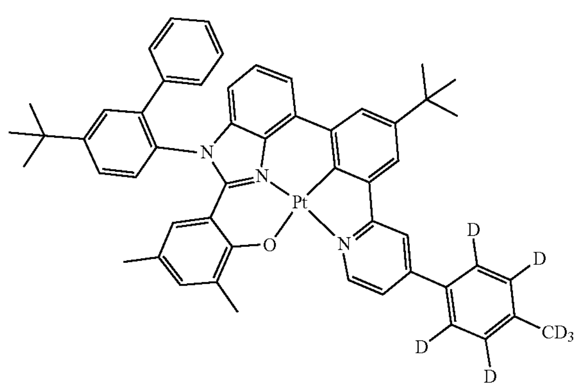

-continued
4-10
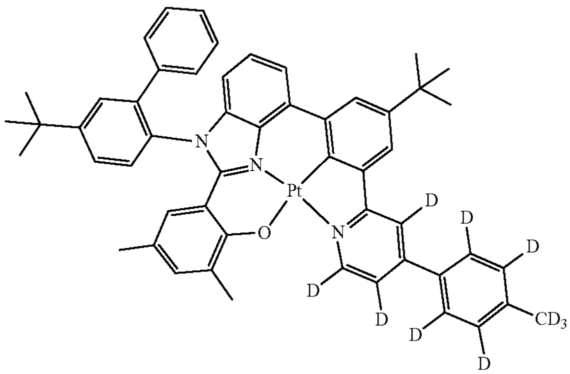
4-11
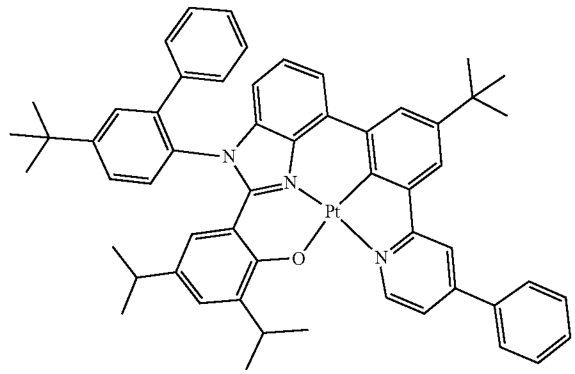
4-12
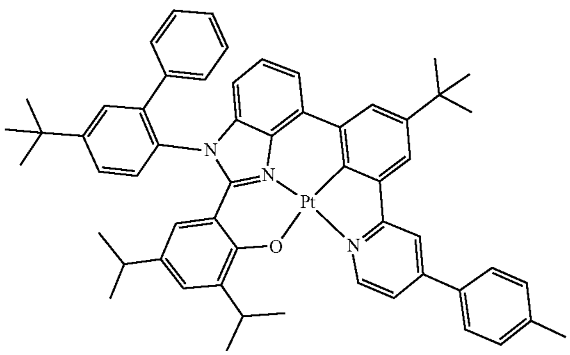
4-13
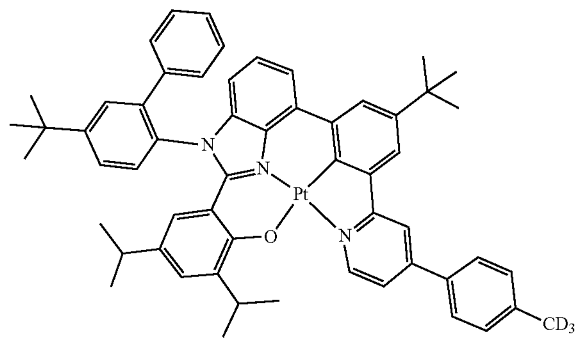
4-14
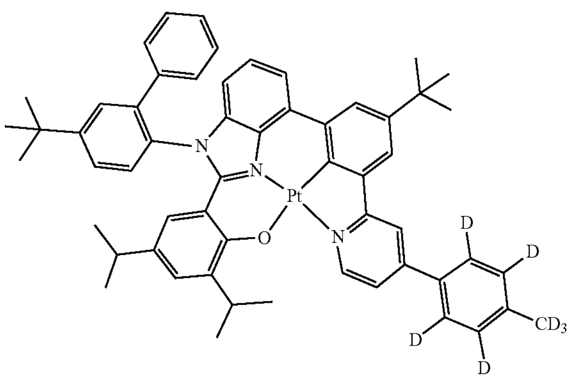
4-15
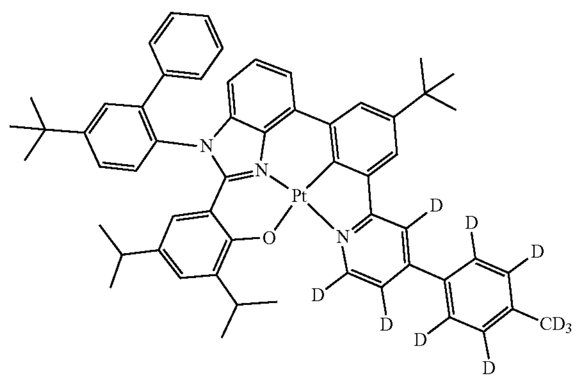
4-16
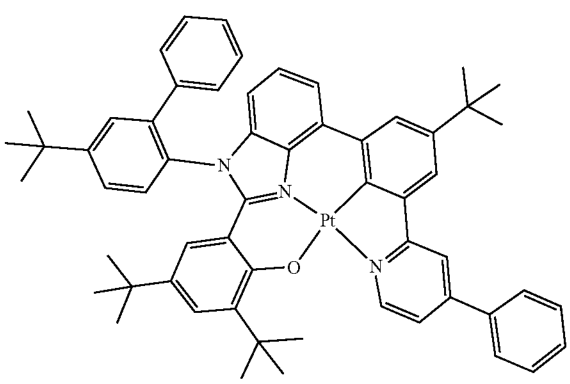
4-17
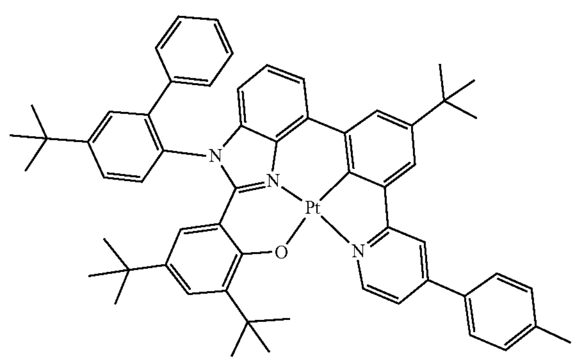

-continued
4-18
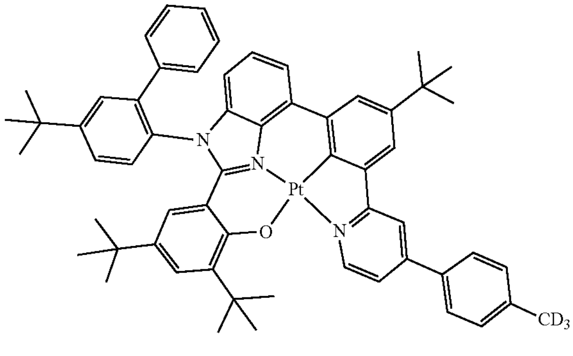
4-19
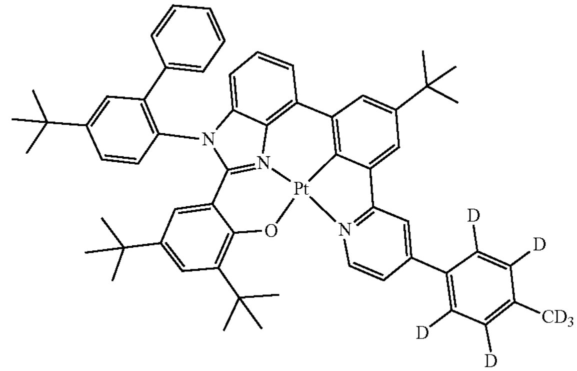
4-20
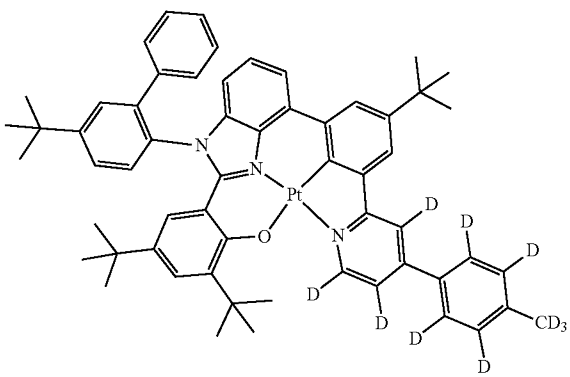
4-21
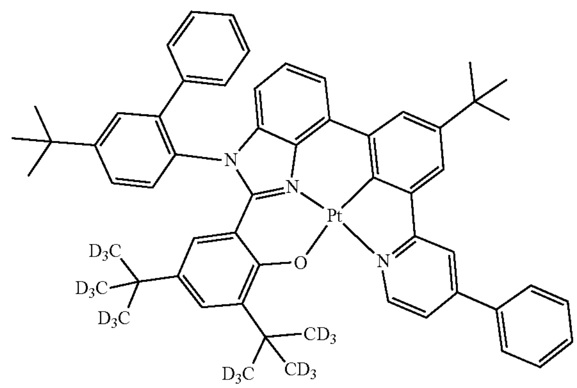
4-22
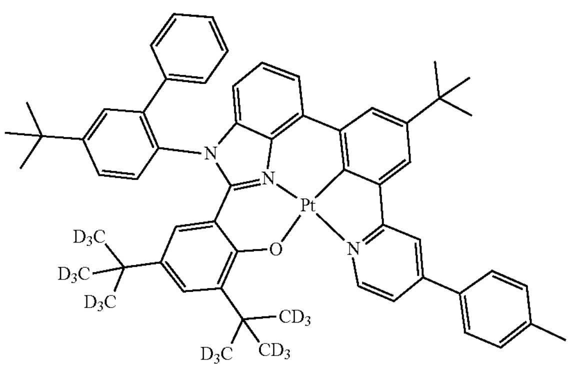
4-23
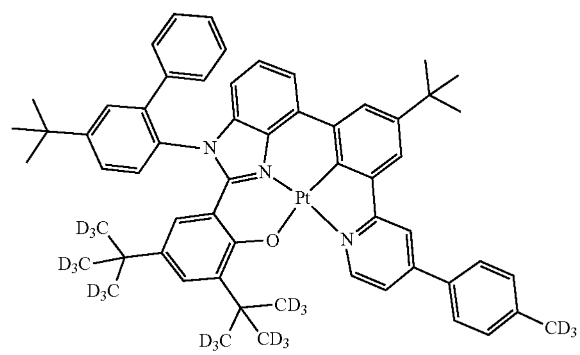
4-24
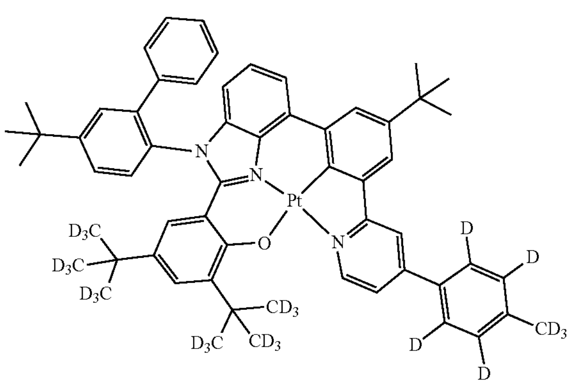
4-25
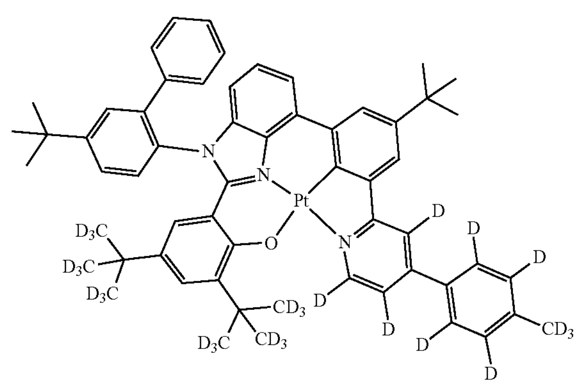

-continued
4-26
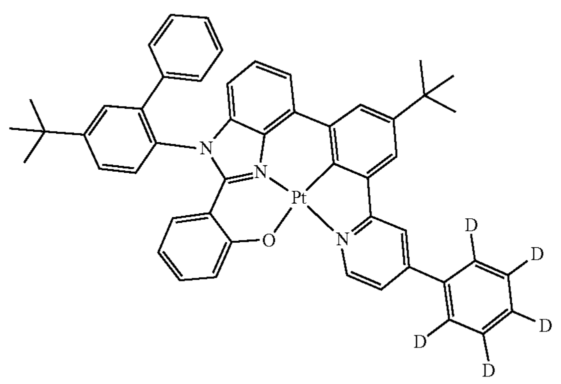
4-27
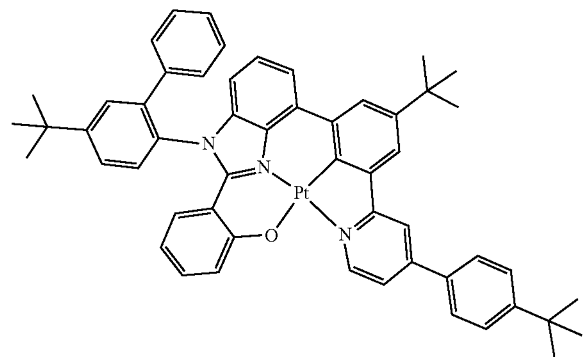
4-28
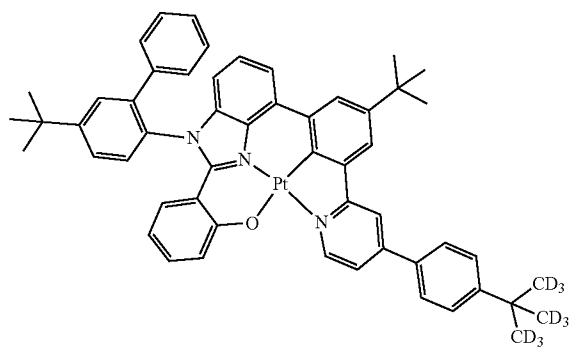
4-29
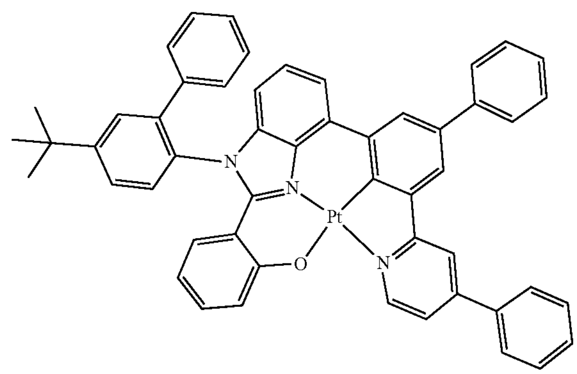
4-30
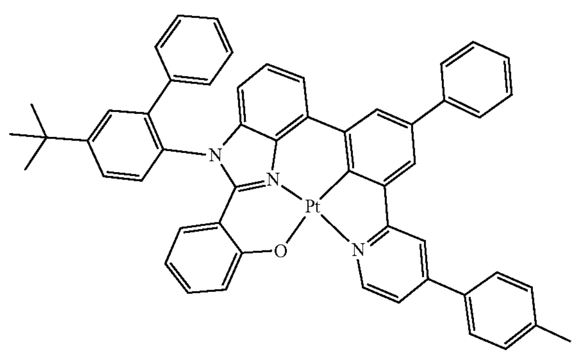
4-31
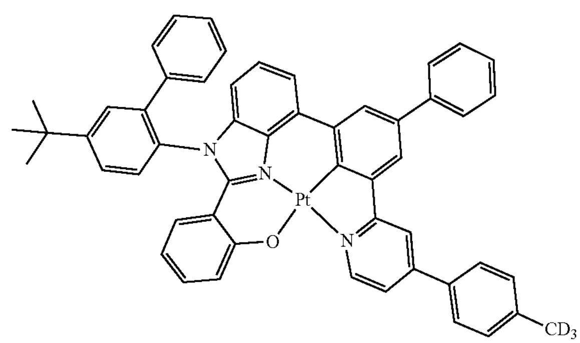
4-32
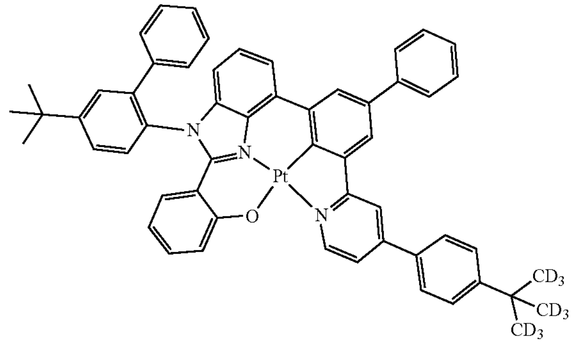
4-33
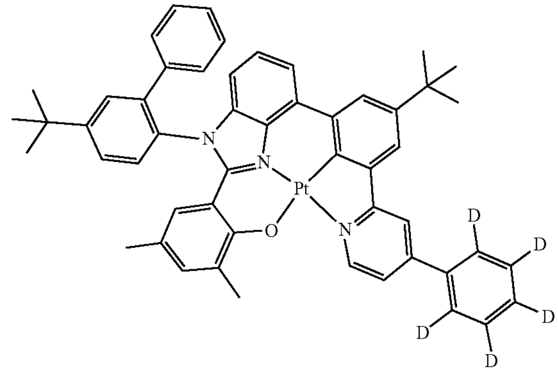

-continued
4-34
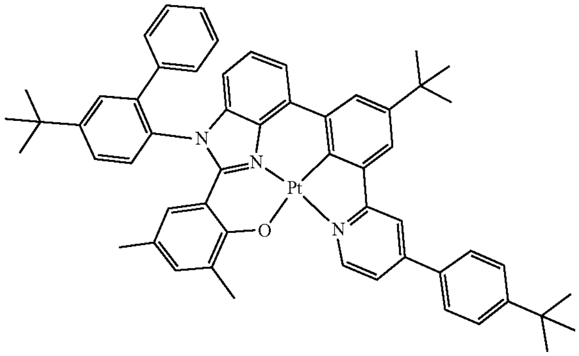
4-35
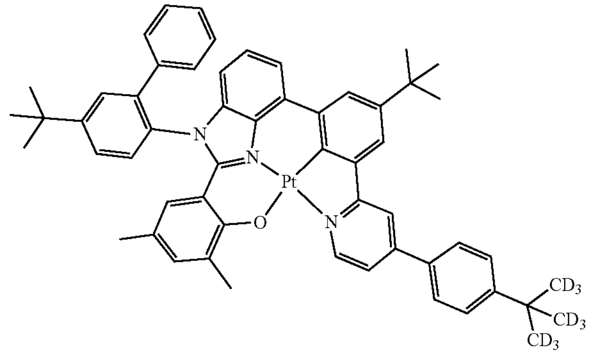
4-36
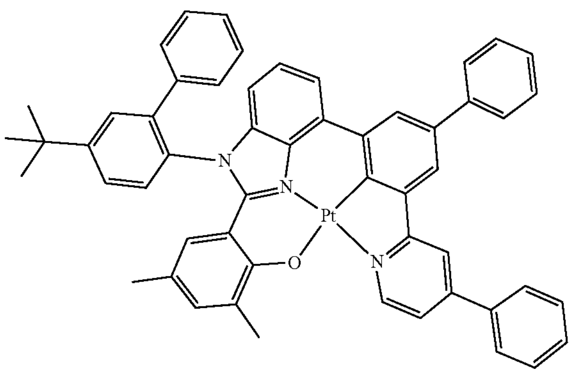
4-37
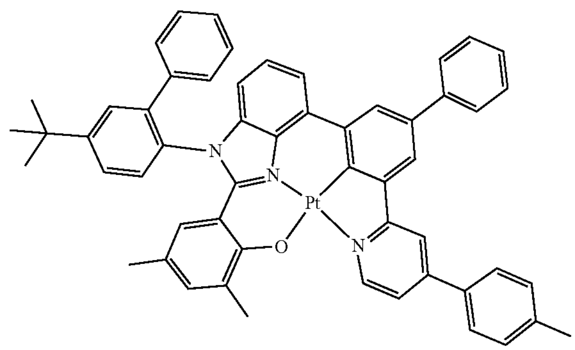
4-38
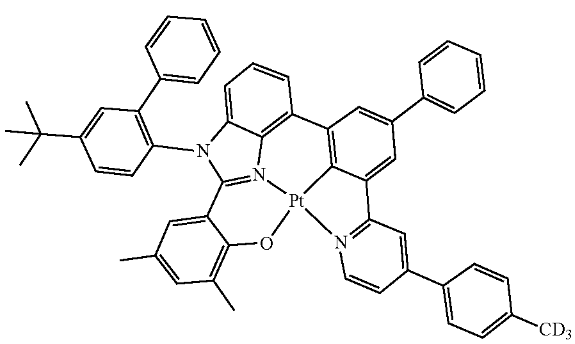
4-39
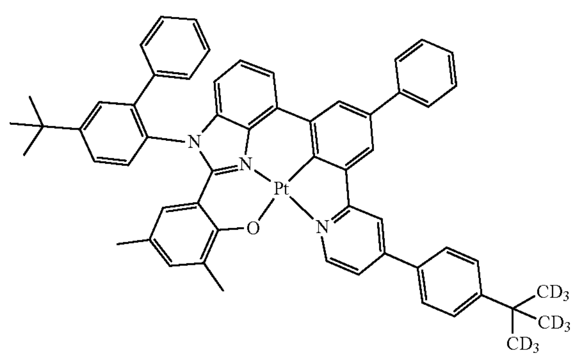
4-40
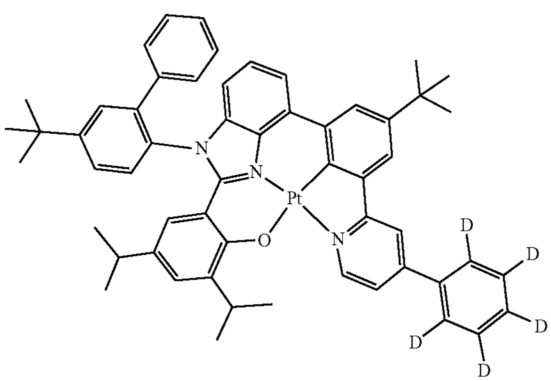
4-41
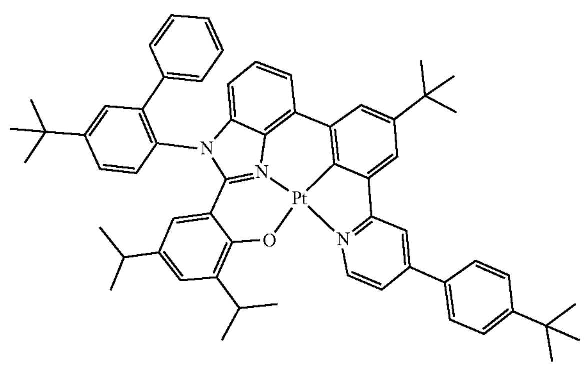

-continued
4-42
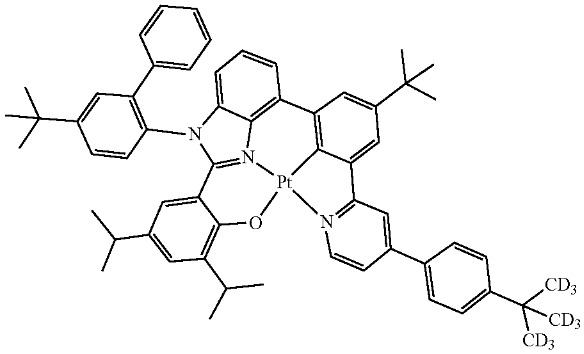
4-43
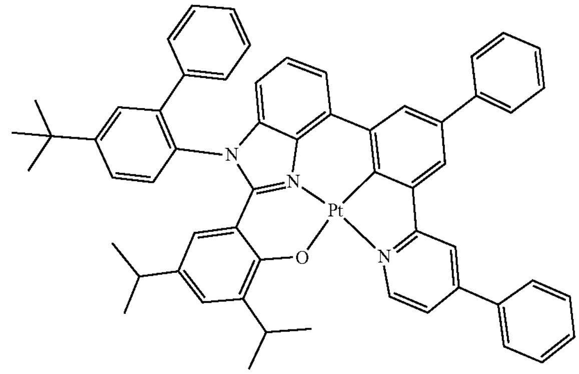
4-44
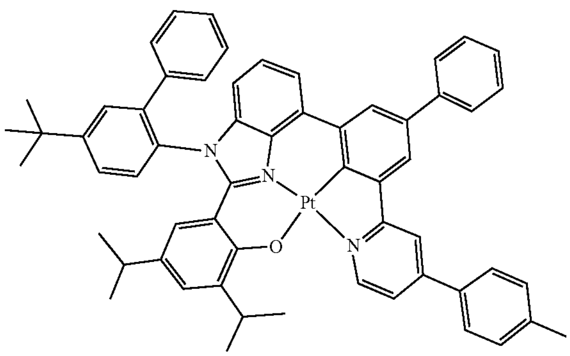
4-45
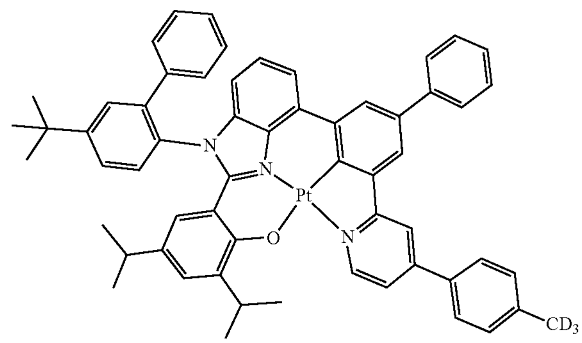
4-46
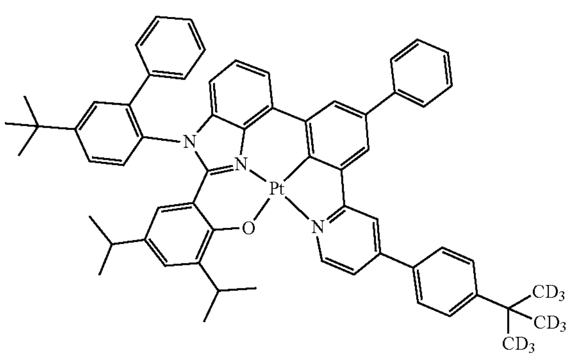
4-47
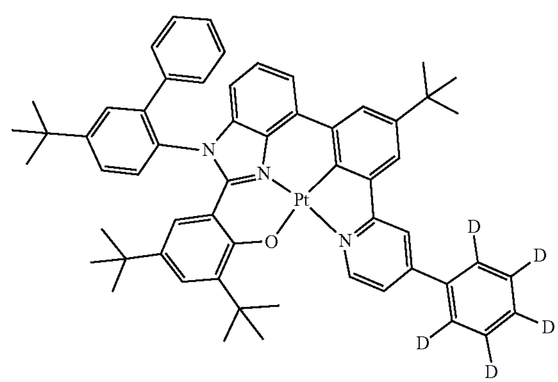
4-48
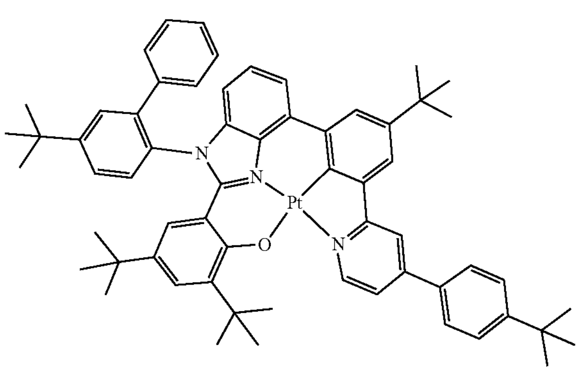
4-49
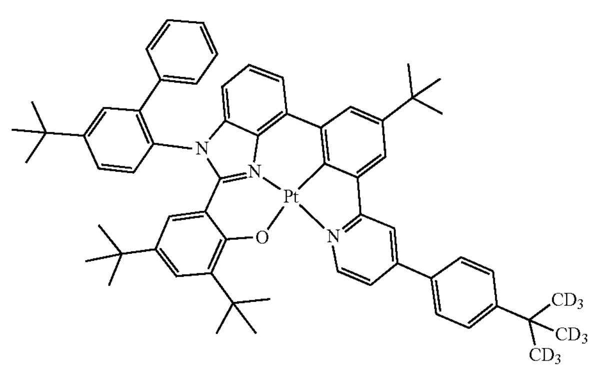

-continued
4-50
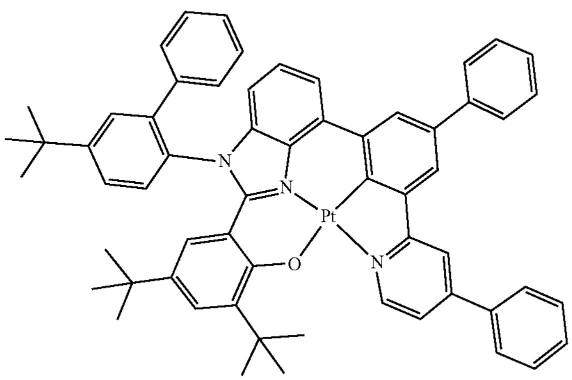
4-51
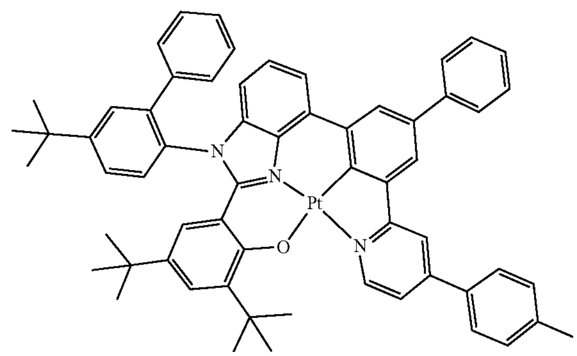
4-52
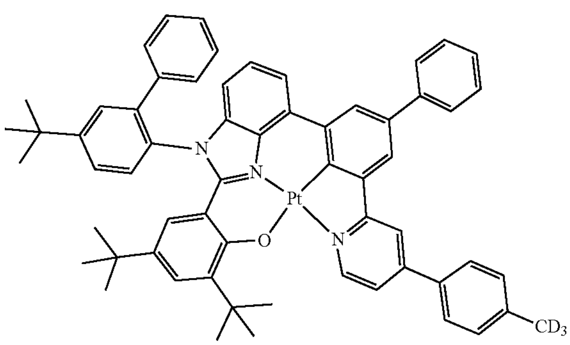
4-53
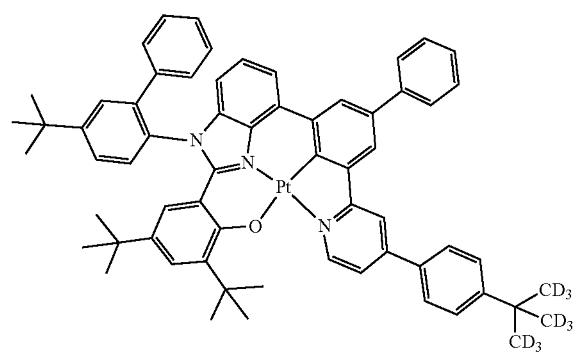
4-54
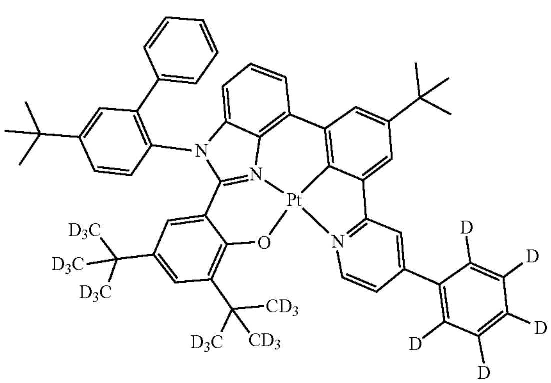
4-55
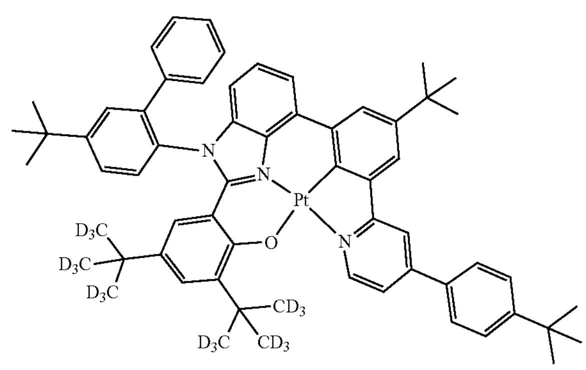
4-56
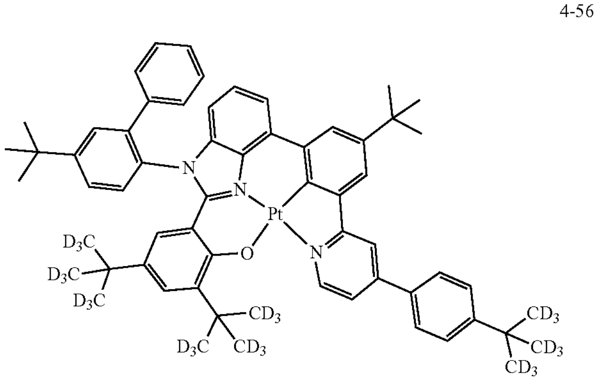
4-57
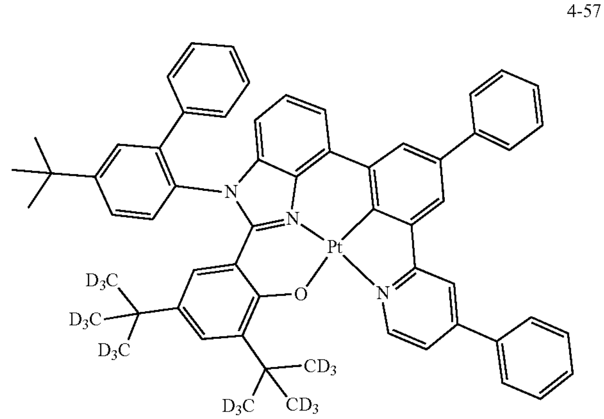

-continued
4-58
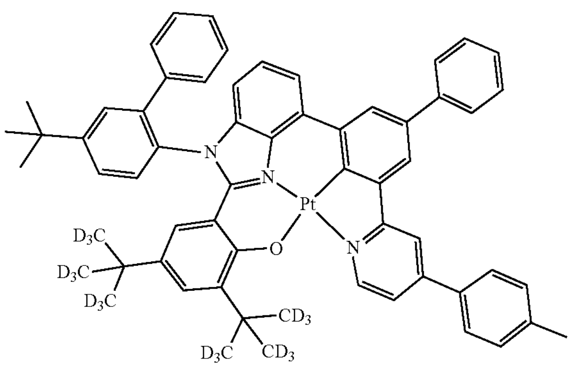
4-59
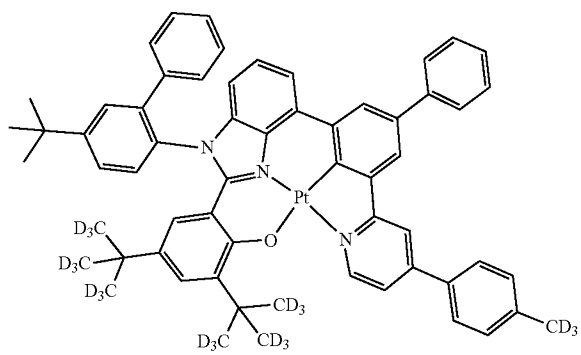
4-60
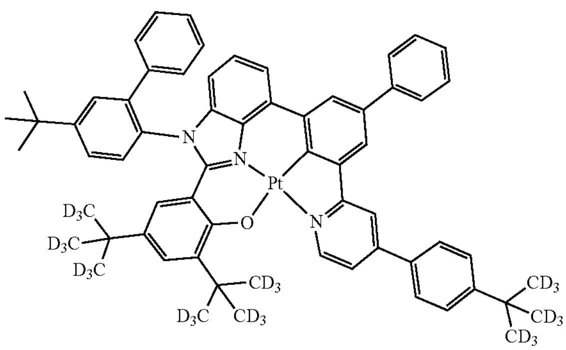
4-61
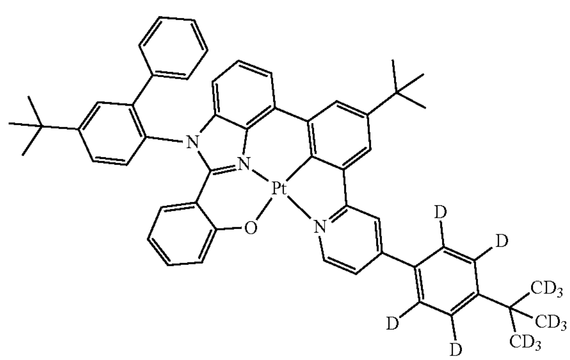
4-62
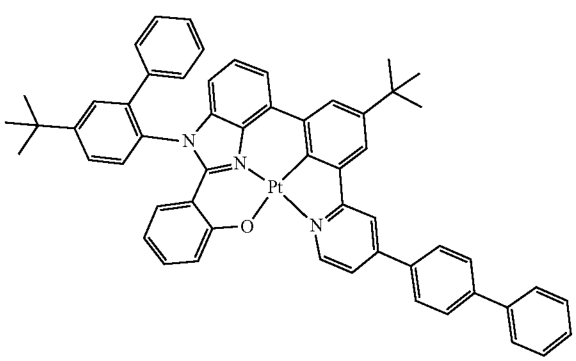
4-63
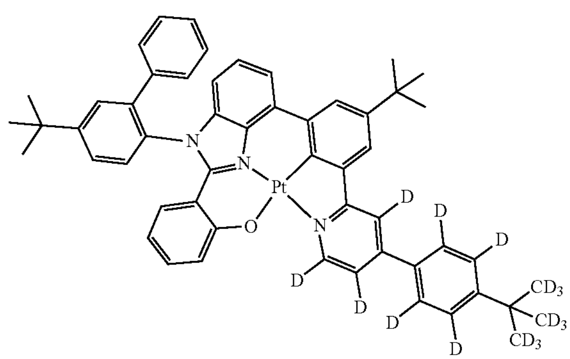
4-64
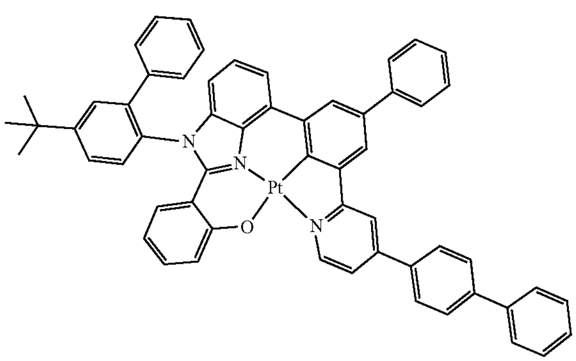
4-65
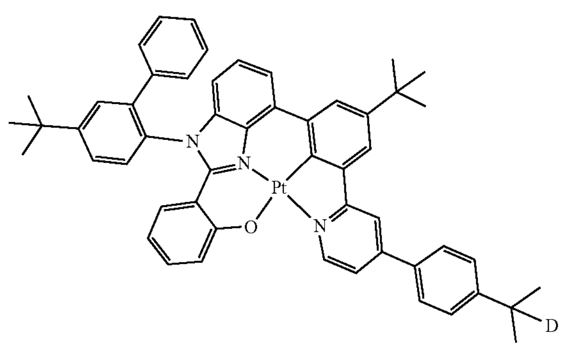

-continued
4-66
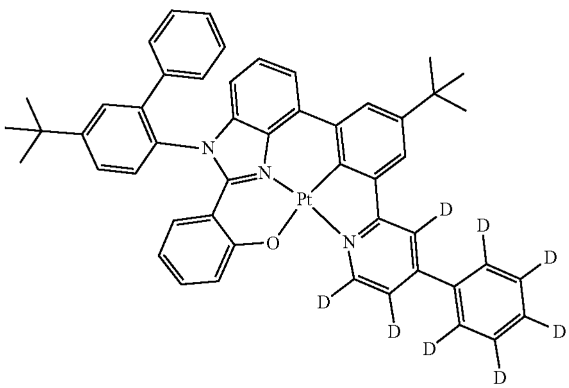
4-67
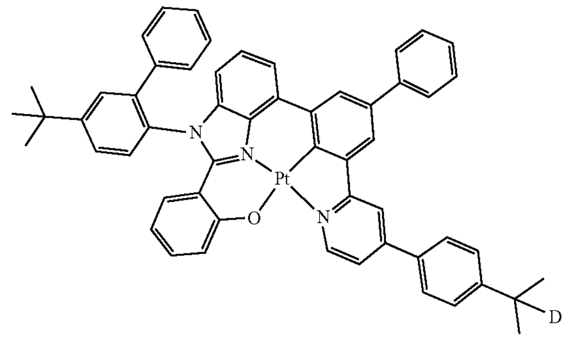
4-68
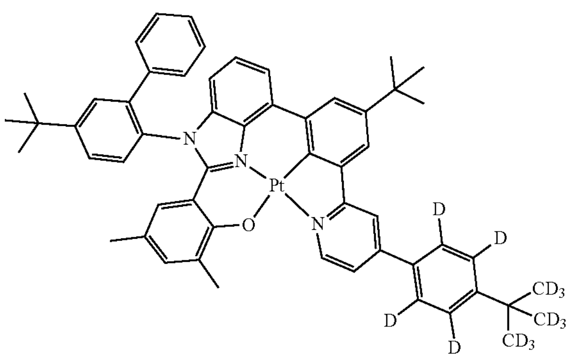
4-69
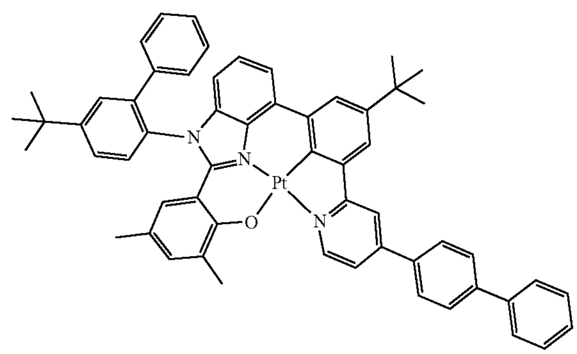
4-70
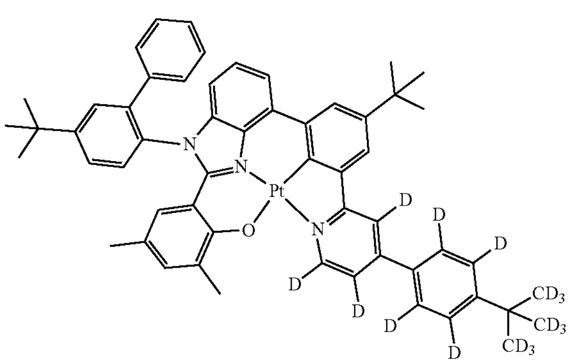
4-71
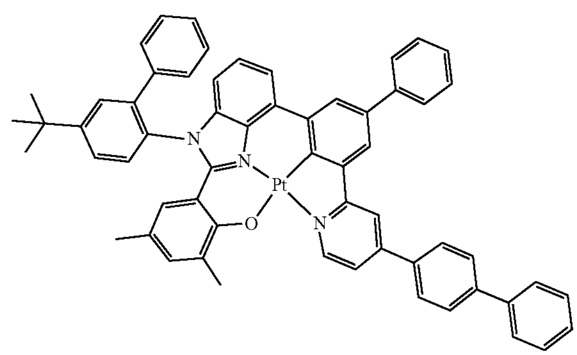
4-72
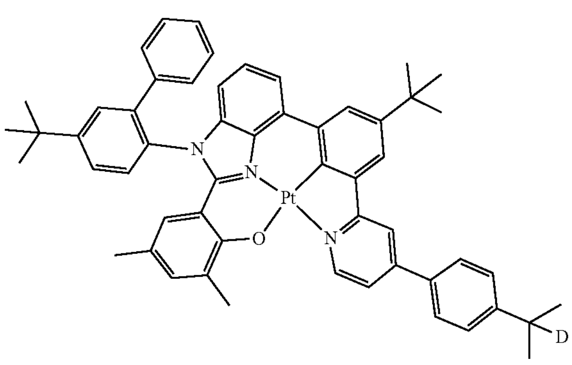
4-73
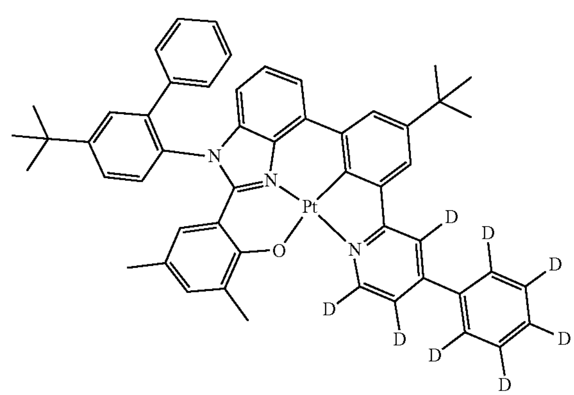

-continued
4-74
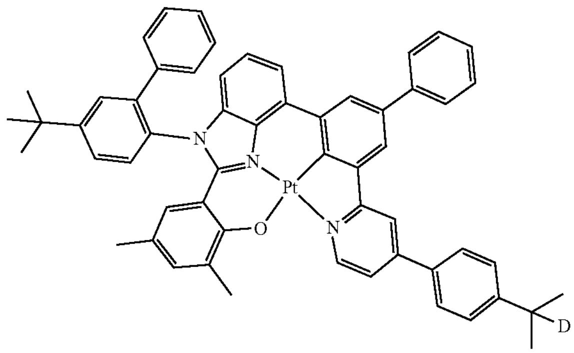
4-75
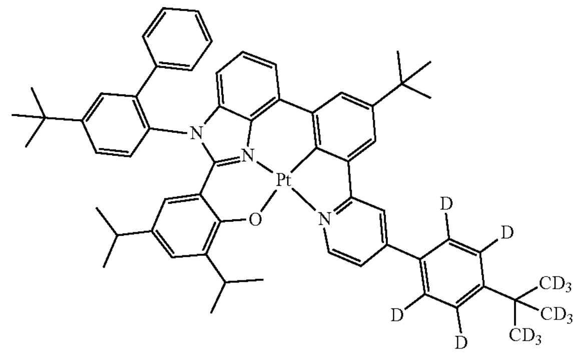
4-76
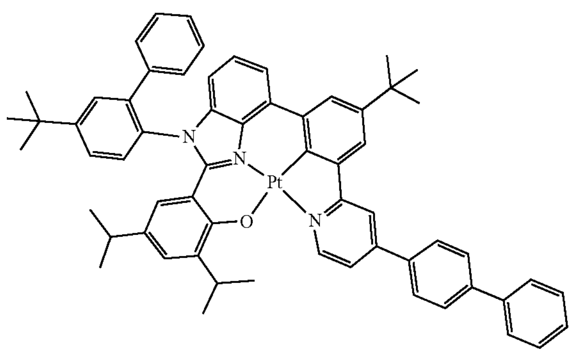
4-77
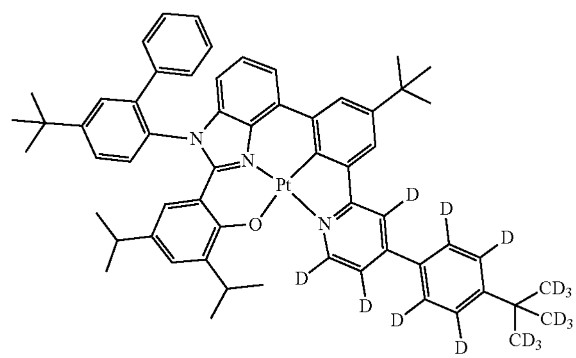
4-78
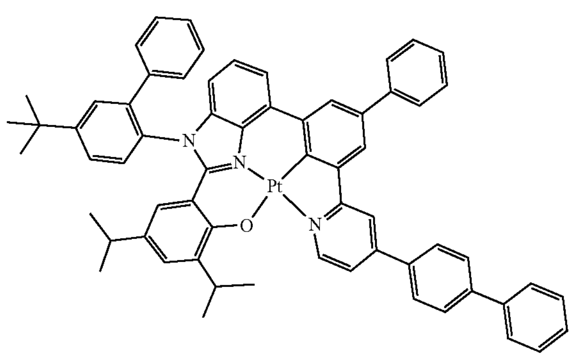
4-79
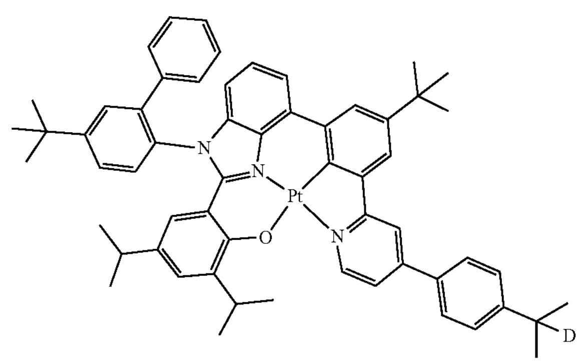
4-80
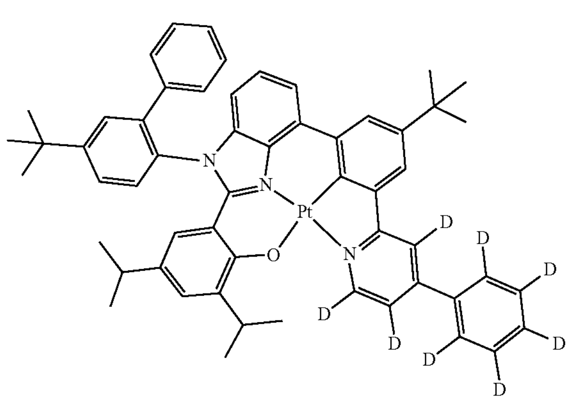
4-81
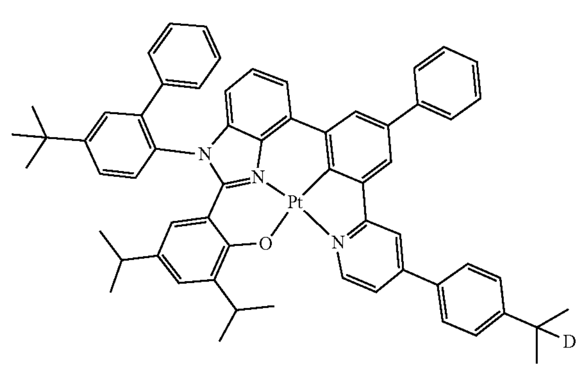

-continued
4-82
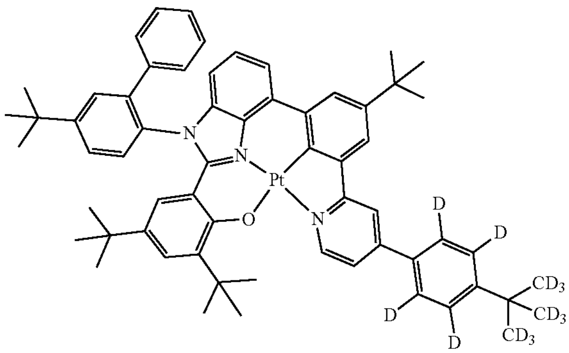
4-83
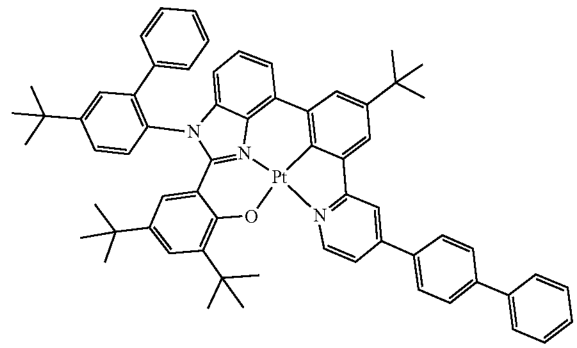
4-84
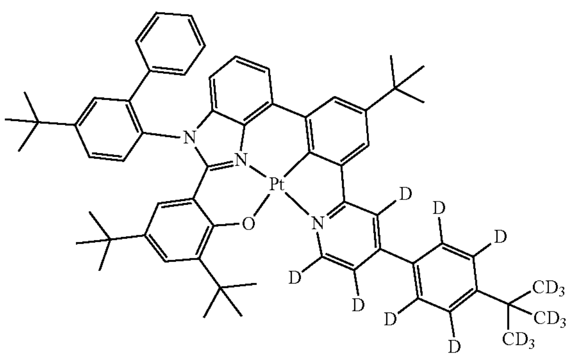
4-85
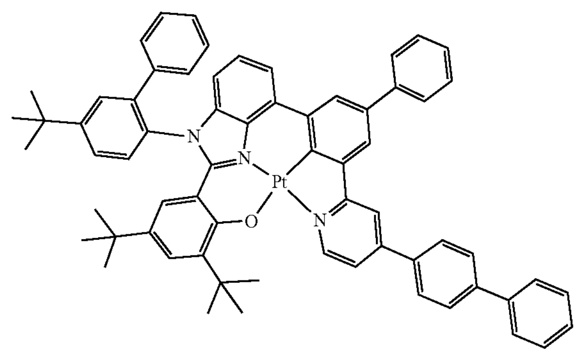
4-86
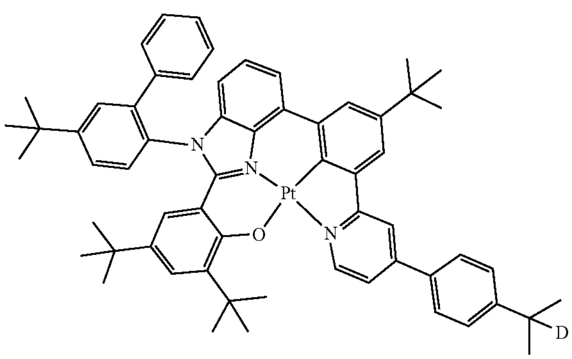
4-87
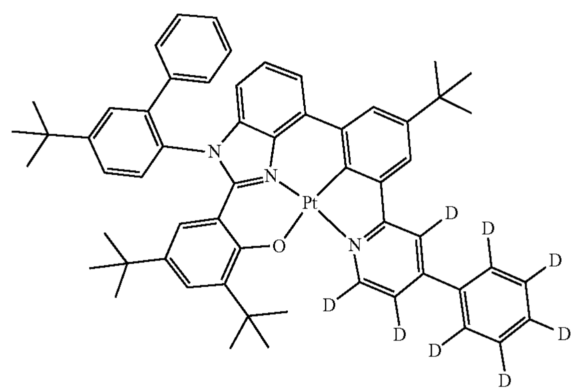
4-88
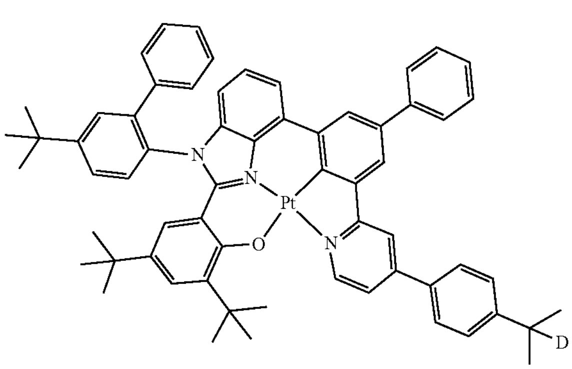
4-89
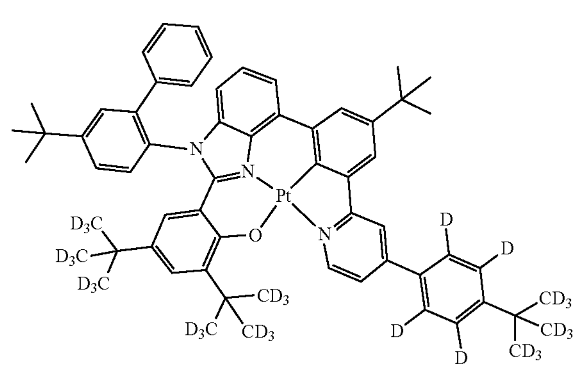

-continued
4-90
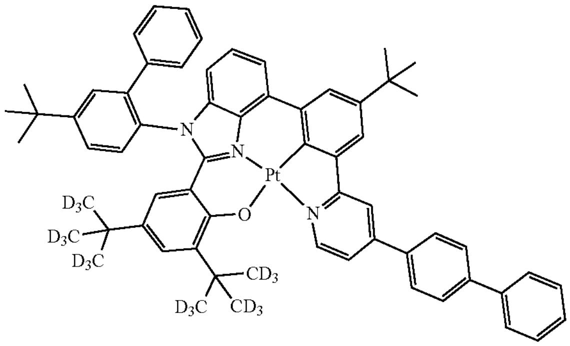
4-91
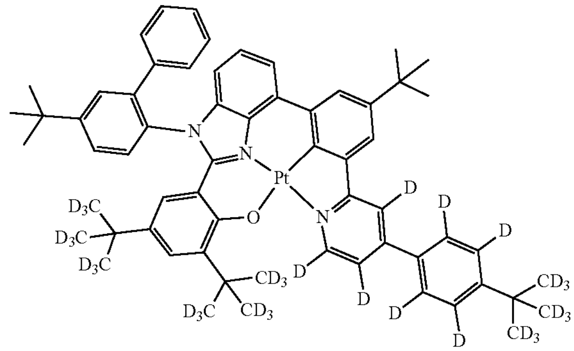
4-92
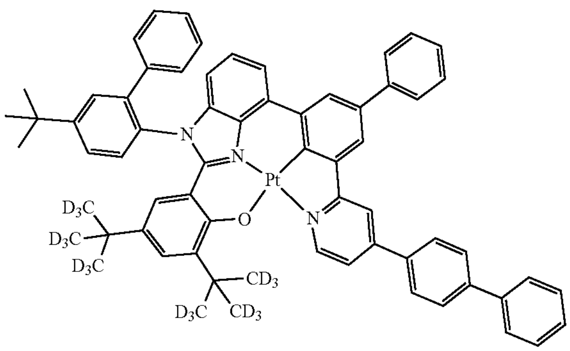
4-93
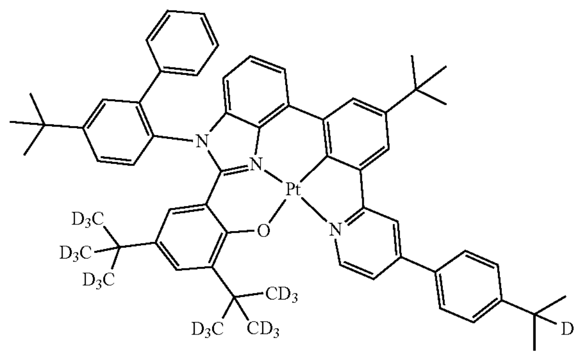
4-94
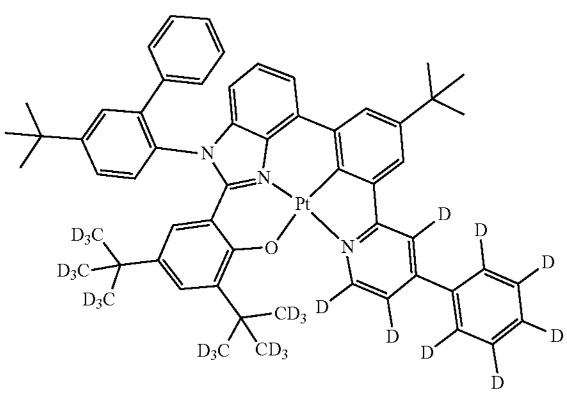
4-95
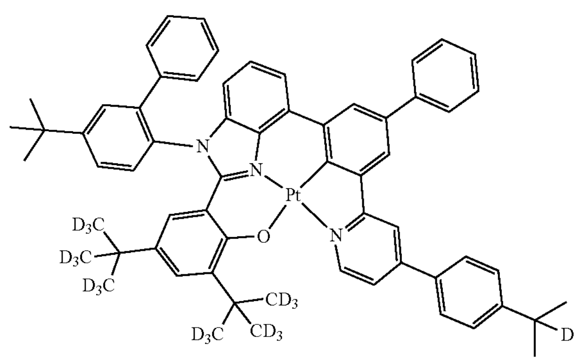
4-96
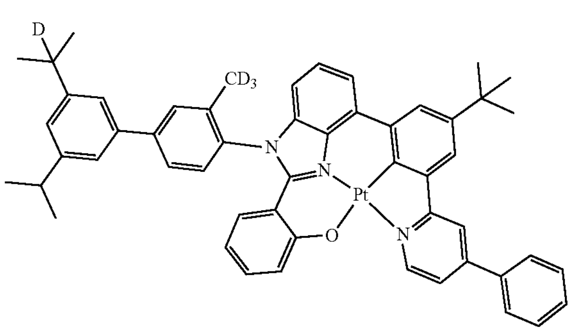
4-97
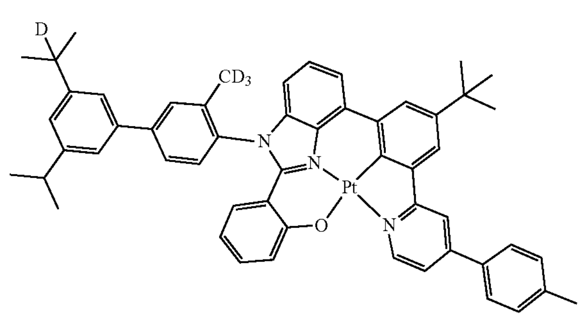

-continued
4-98
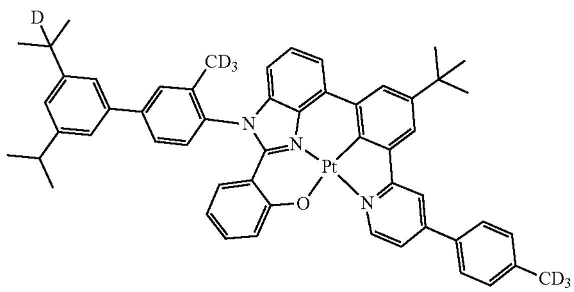
4-99
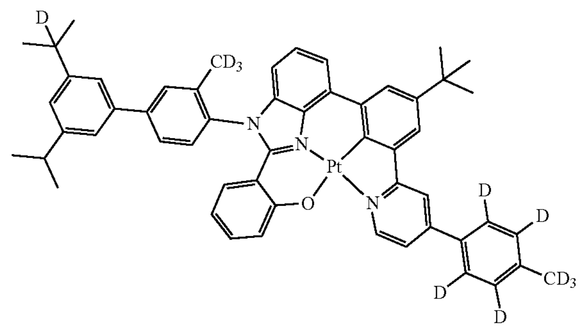
4-100
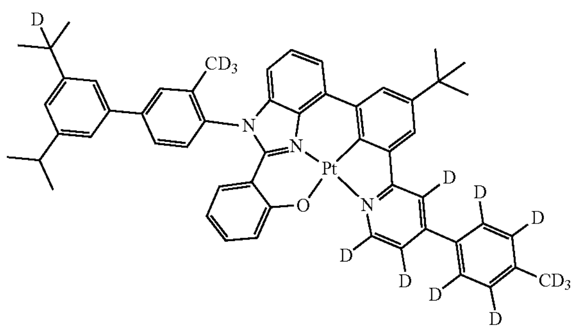
4-101
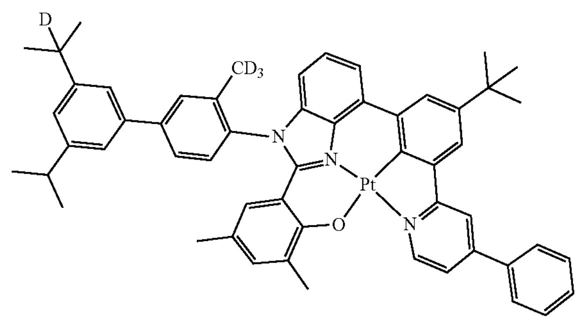
4-102
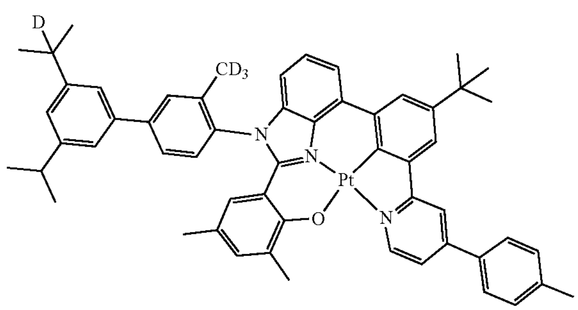
4-103
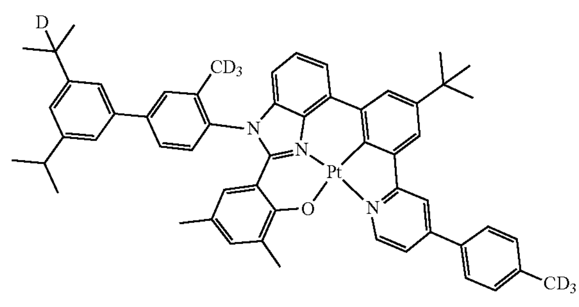
4-104
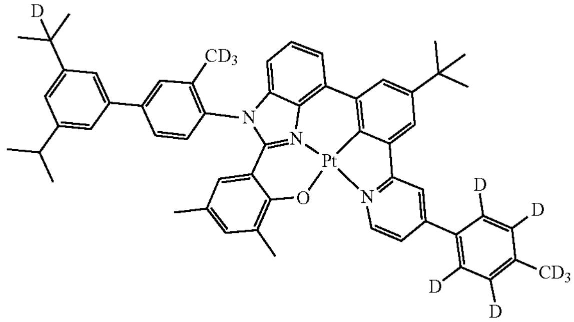
4-105
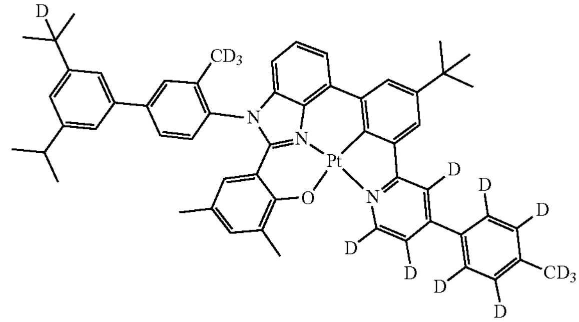

-continued
4-106
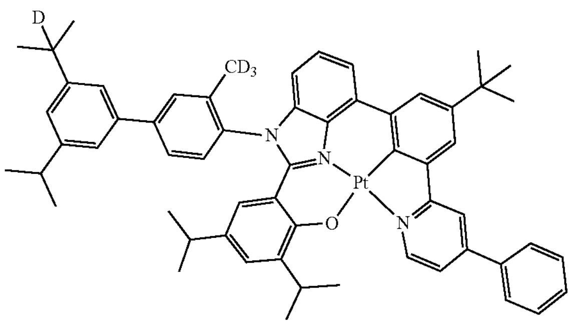
4-107
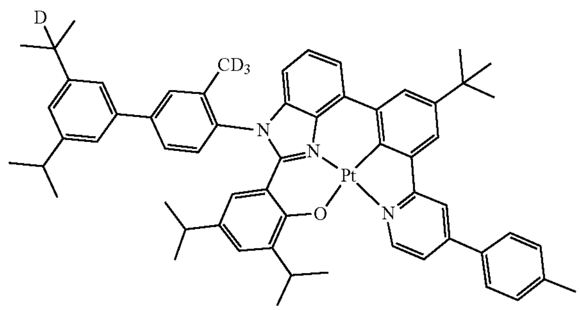
4-108
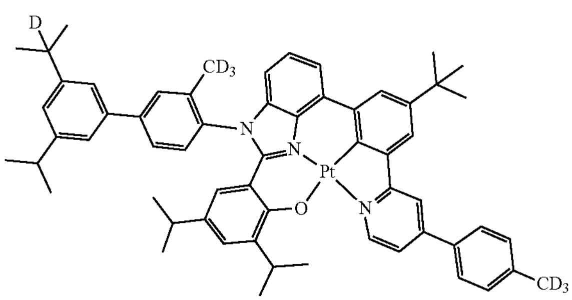
4-109
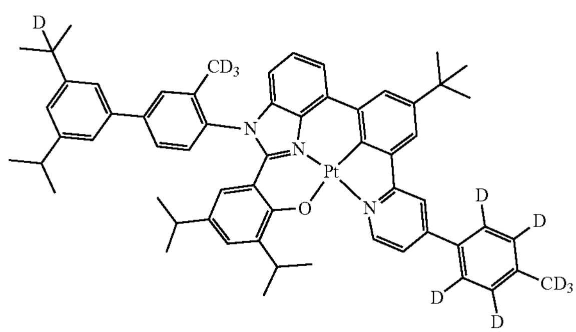
4-110
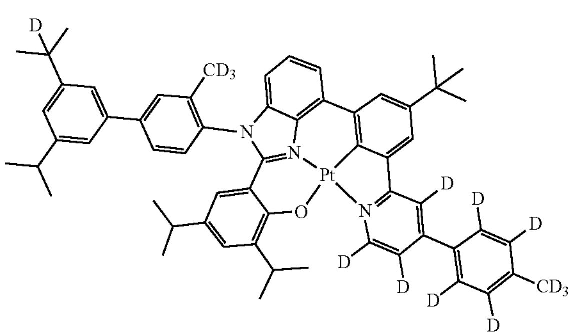
4-111
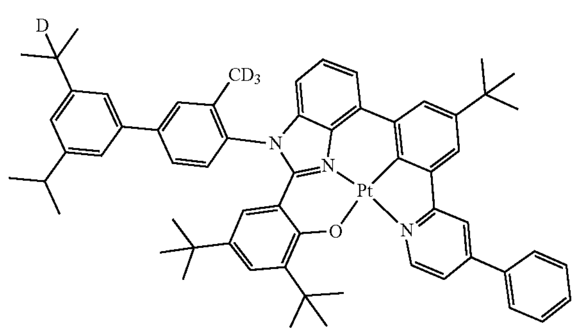
4-112
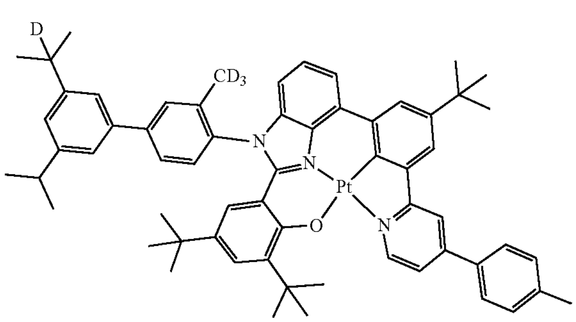
4-113
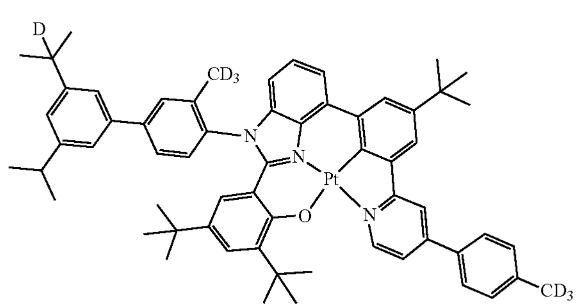

-continued
4-114
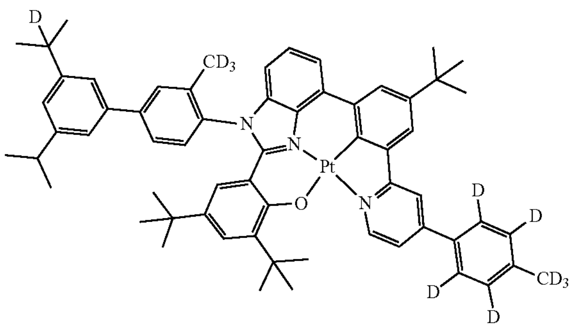
4-115
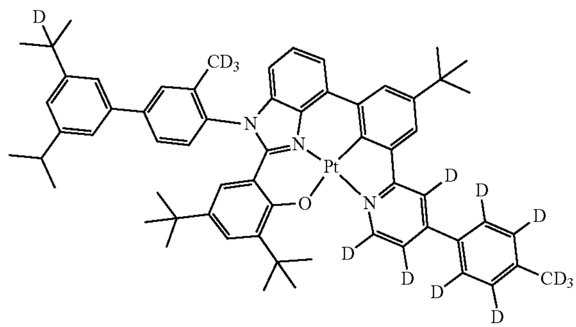
4-116
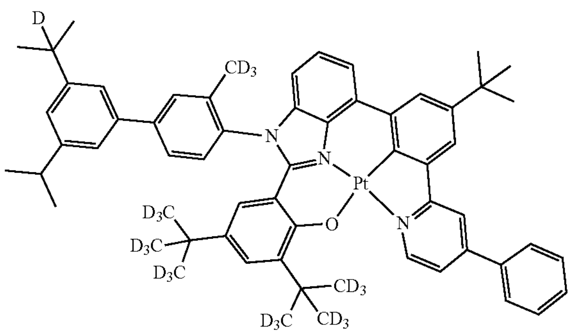
4-117
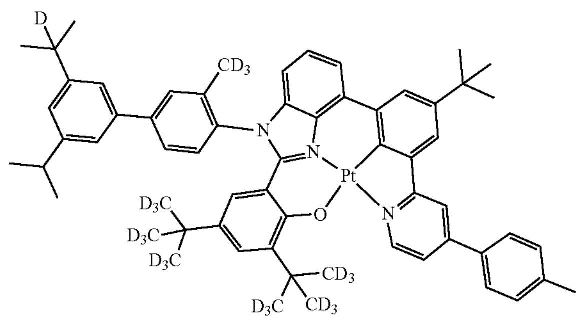
4-118
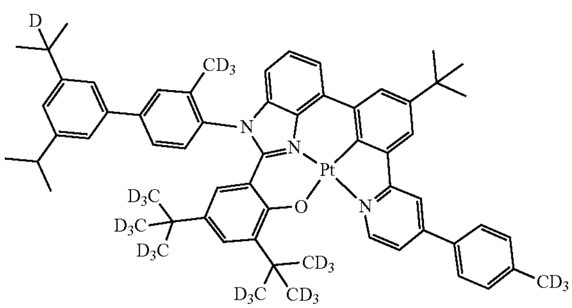
4-119
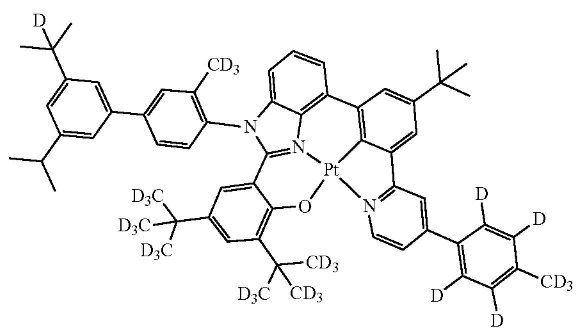
4-120
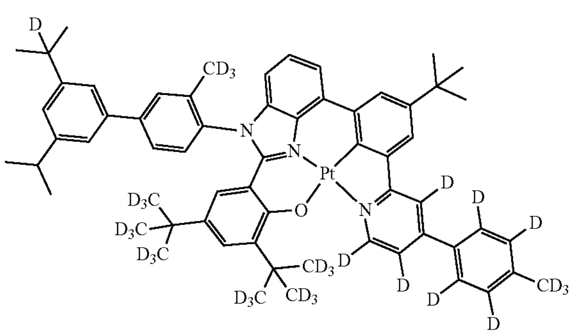
4-121
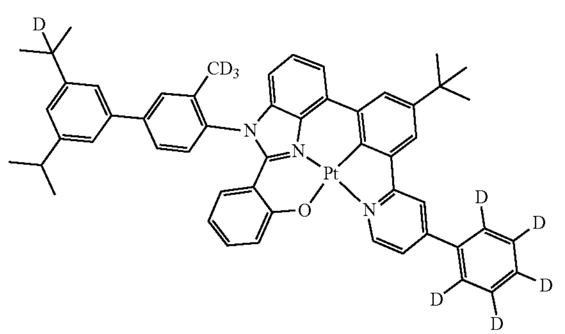

-continued
4-122
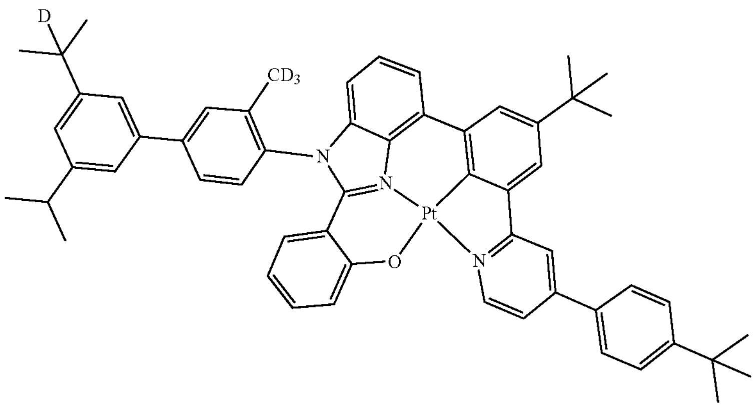
4-123
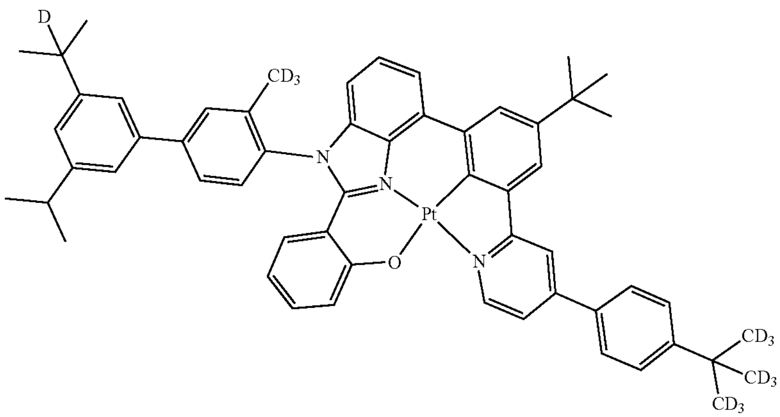
4-124
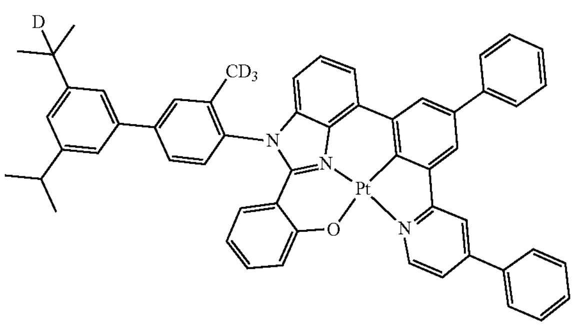
4-125
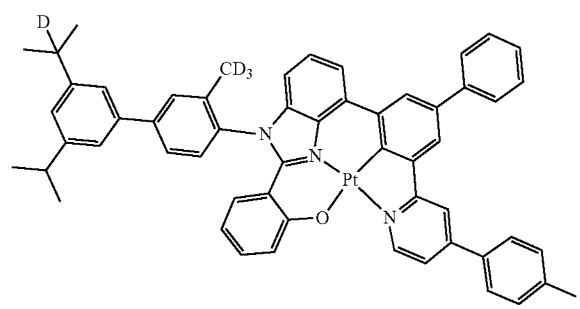
4-126
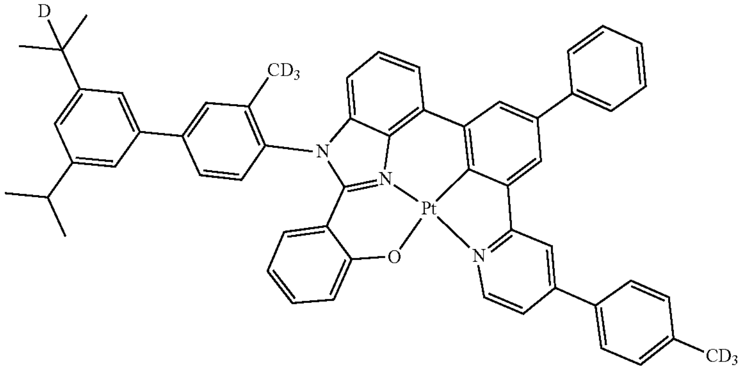

-continued
4-127
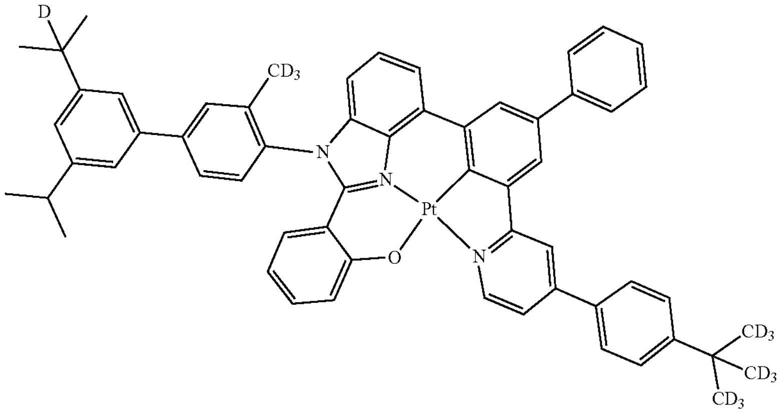
4-128
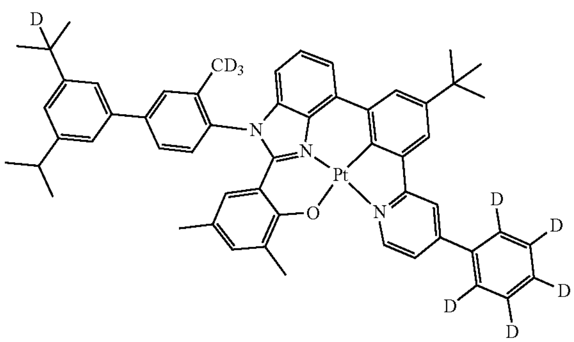
4-129
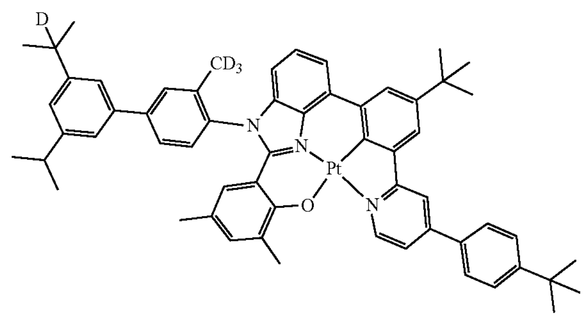
4-130
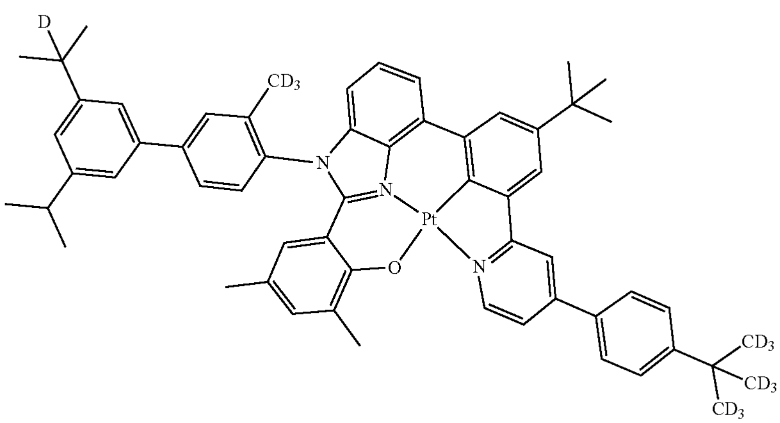
4-131
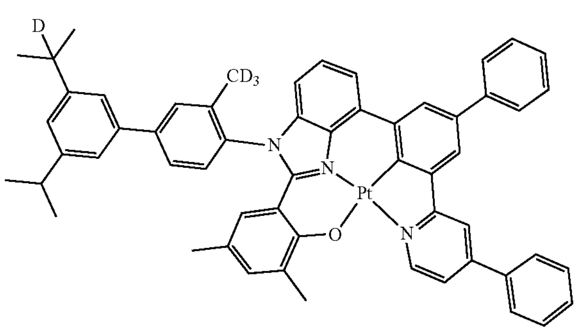
4-132
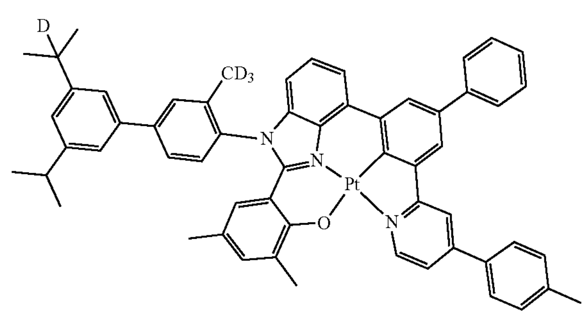

-continued
4-133
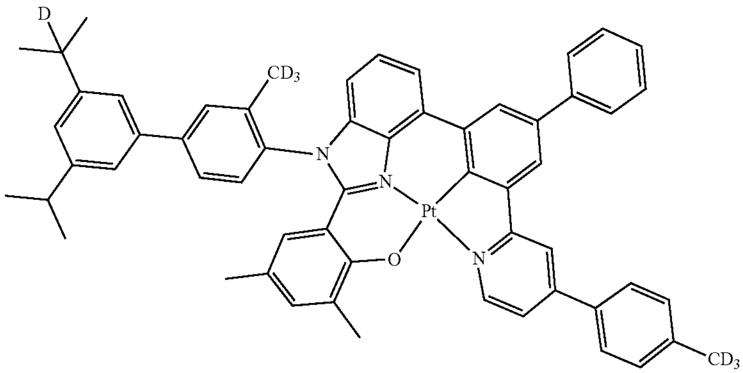
4-134
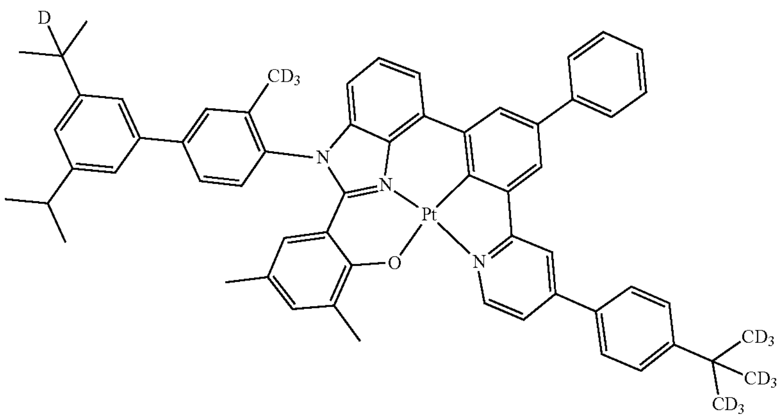
4-135
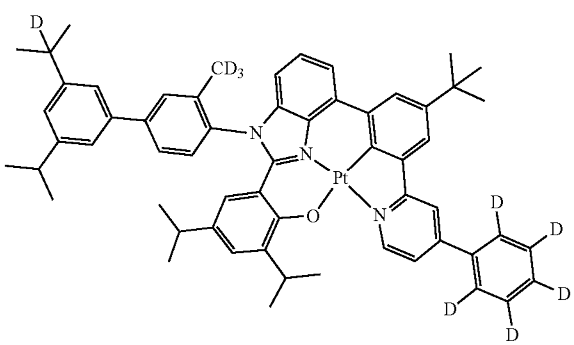
4-136
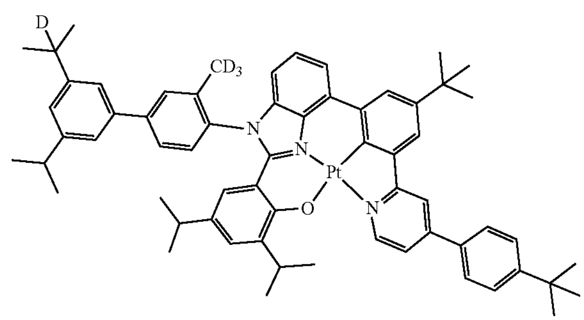
4-137
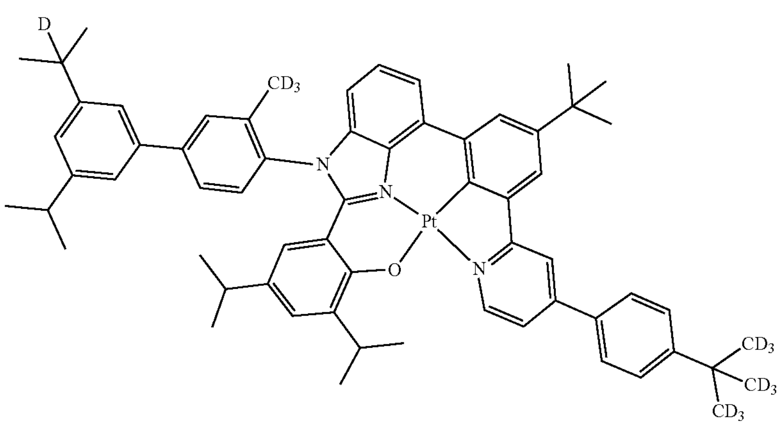

-continued
4-138
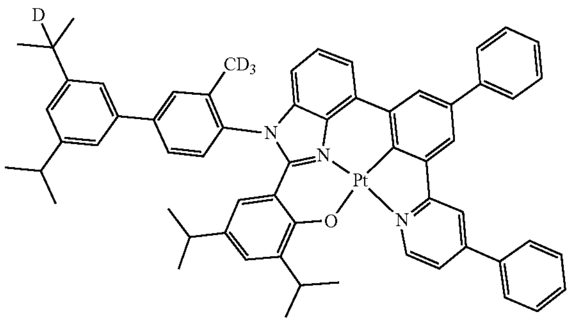
4-139
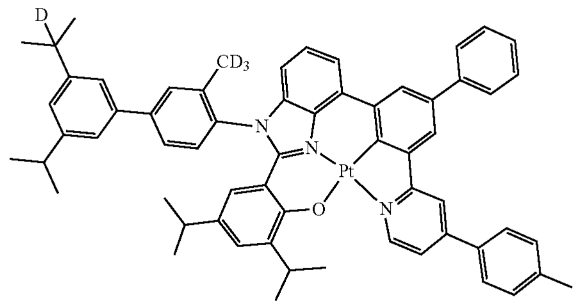
4-140
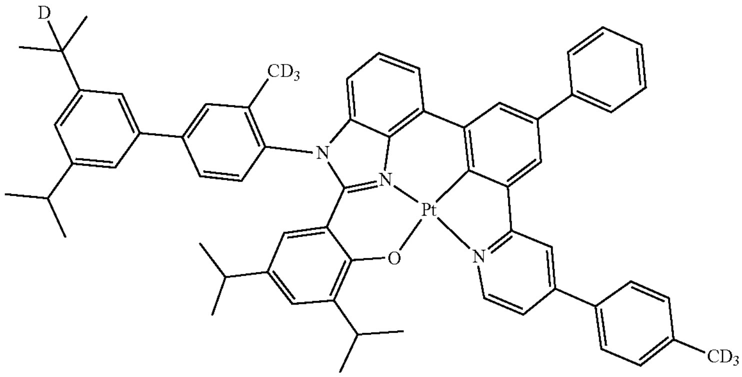
4-141
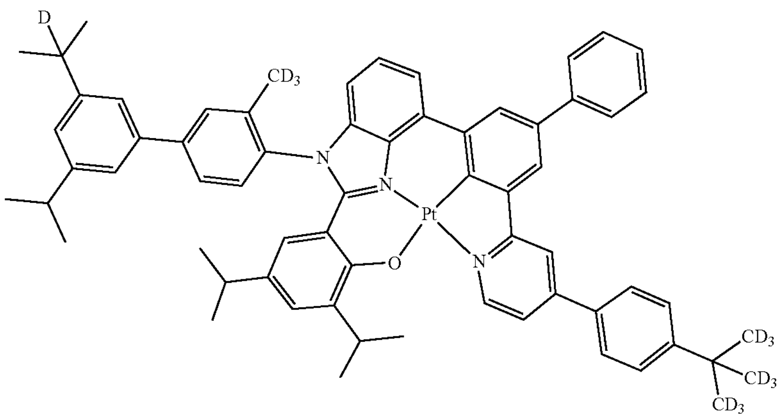
4-142
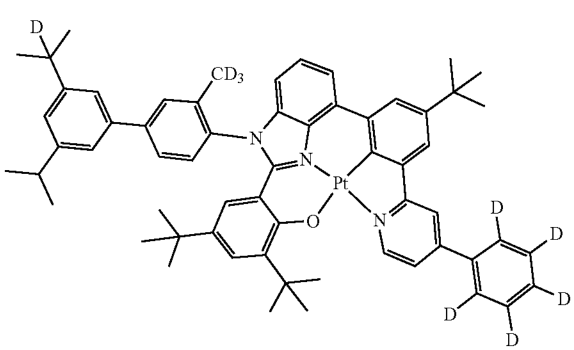
4-143
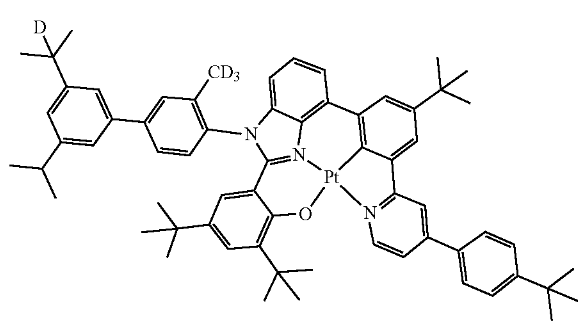

-continued
4-144
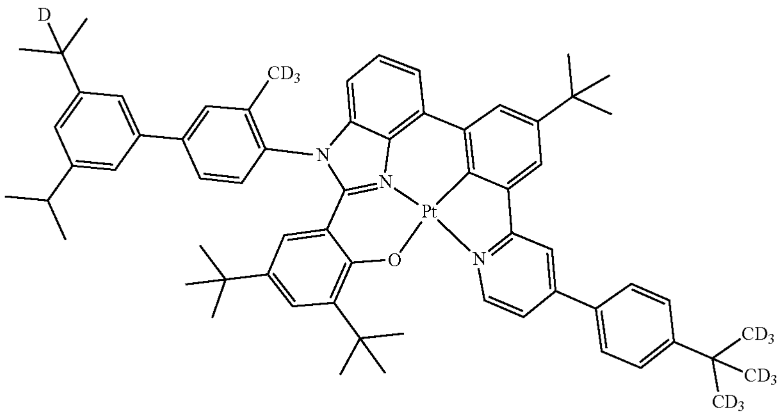
4-145
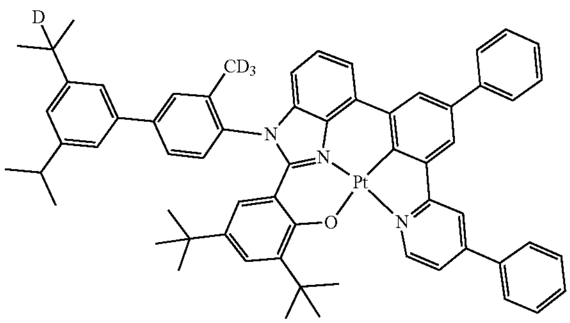
4-146
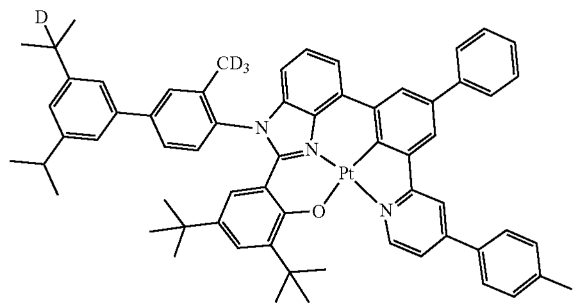
4-147
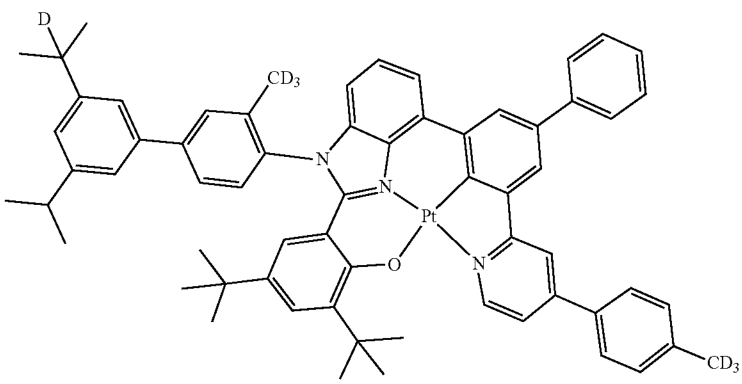
4-148
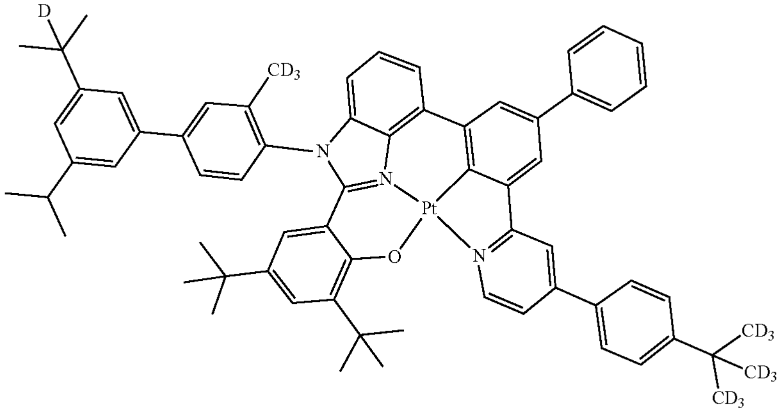

-continued
4-149
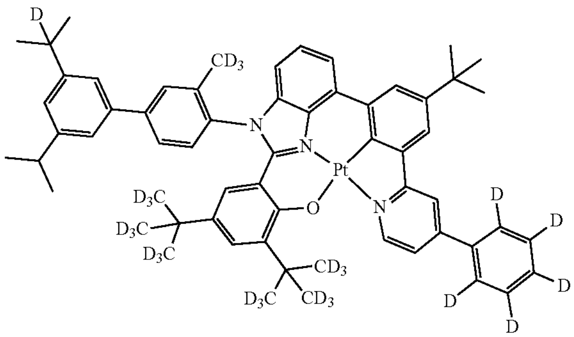
4-150
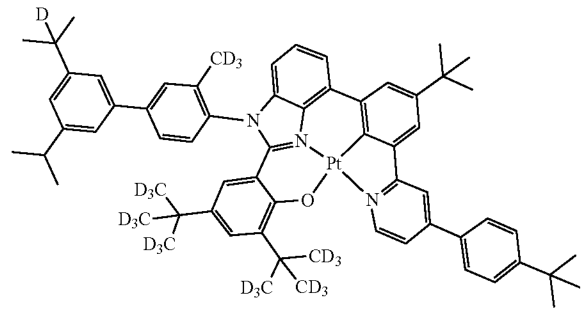
4-151
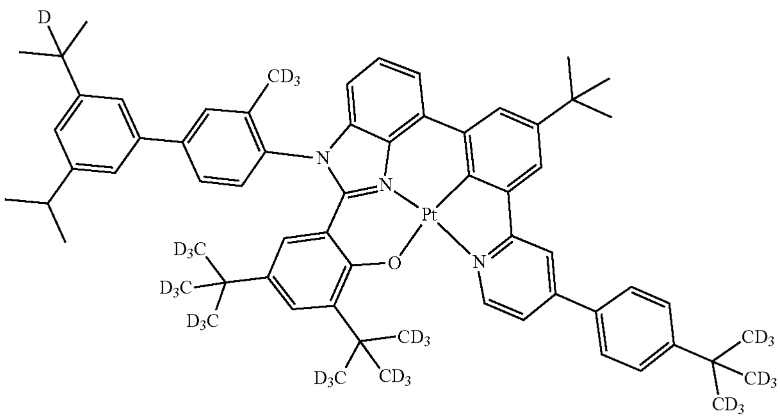
4-152
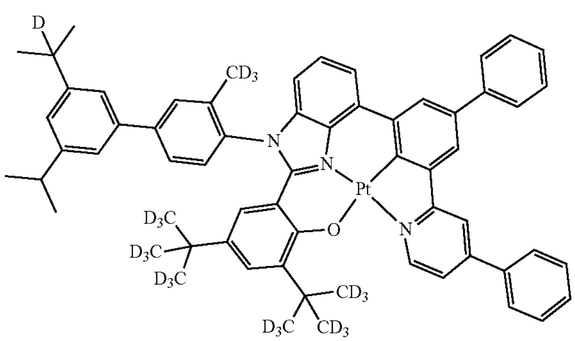
4-153
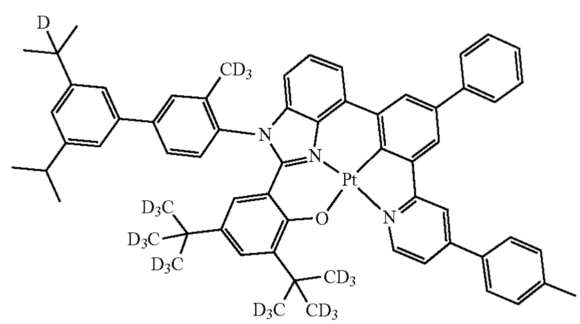
4-154
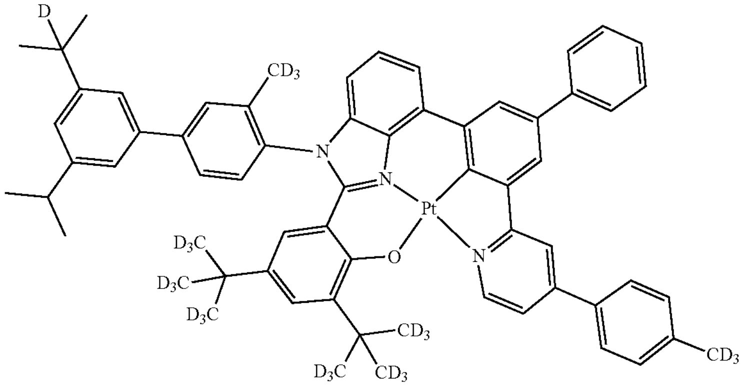

-continued
4-155
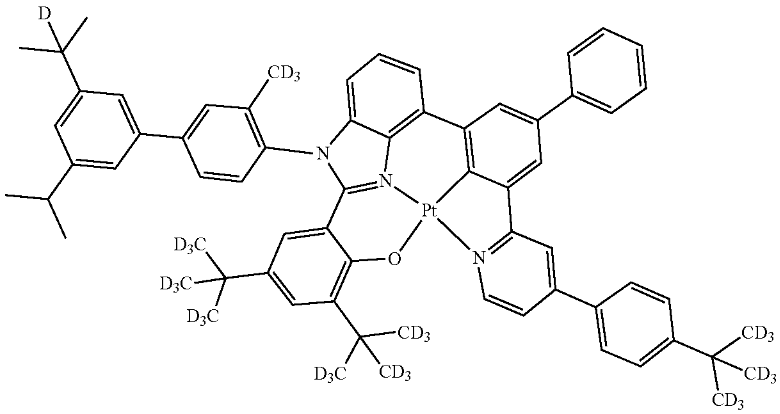
4-156
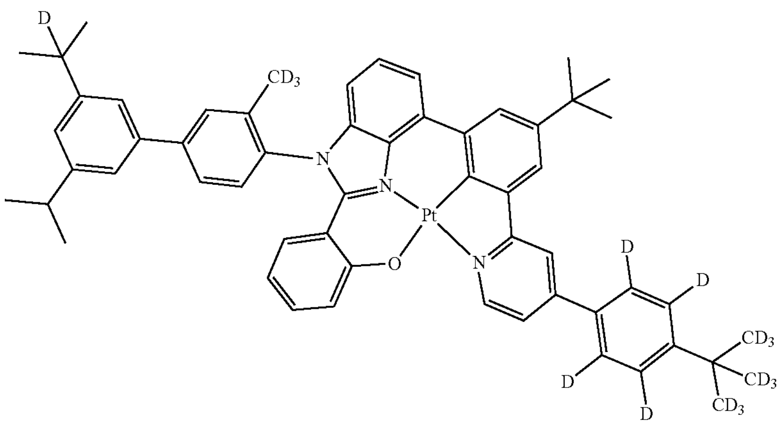
4-157
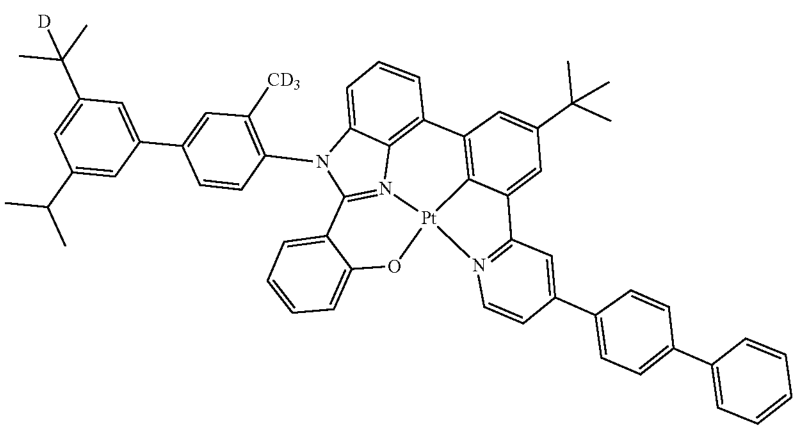

-continued
4-158
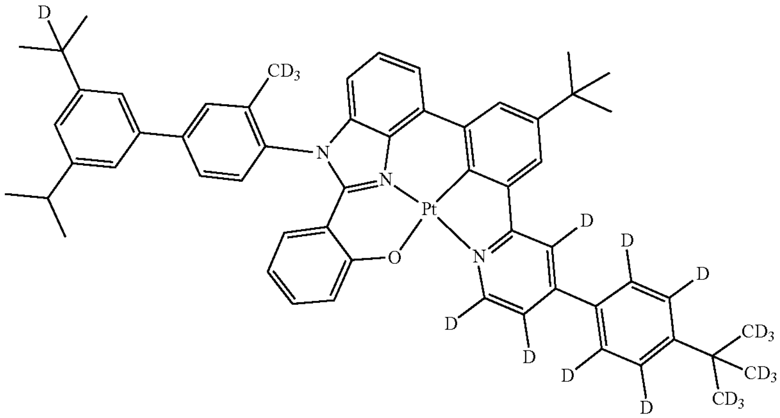
4-159
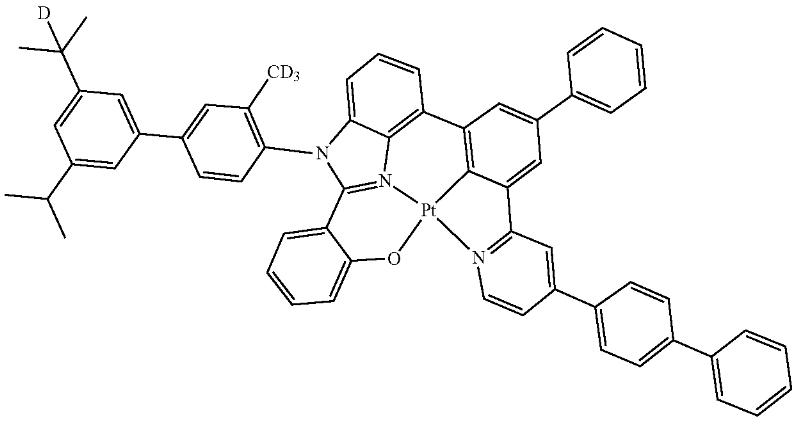
4-160
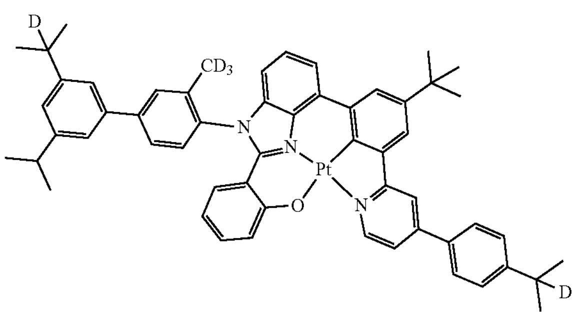
4-161
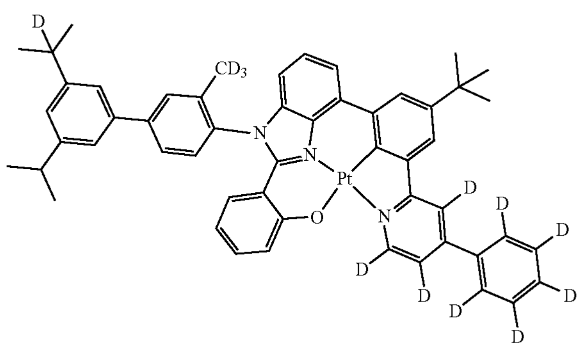
4-162
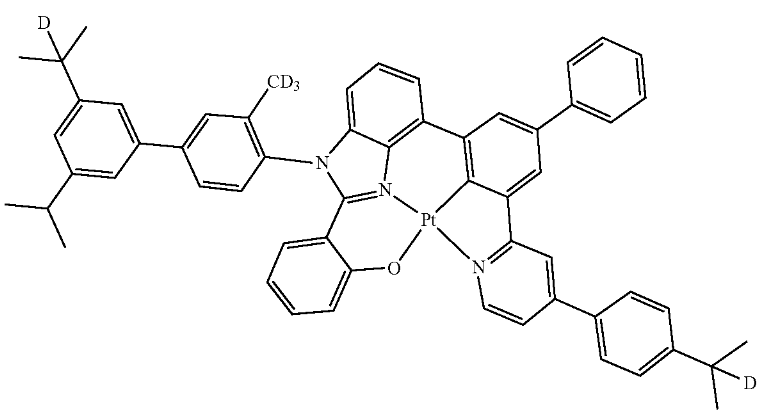

-continued
4-163
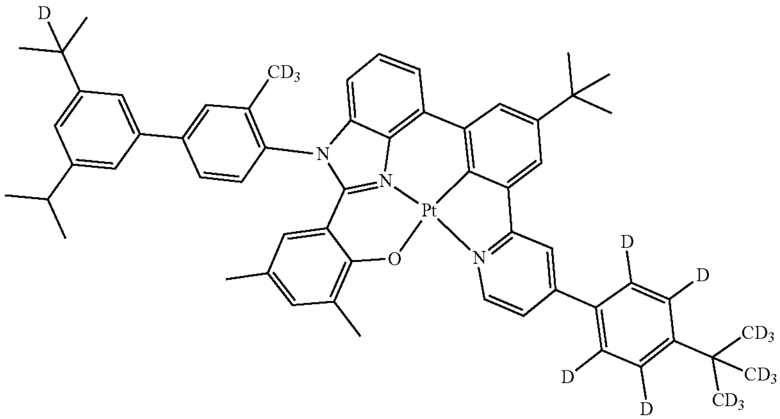
4-164
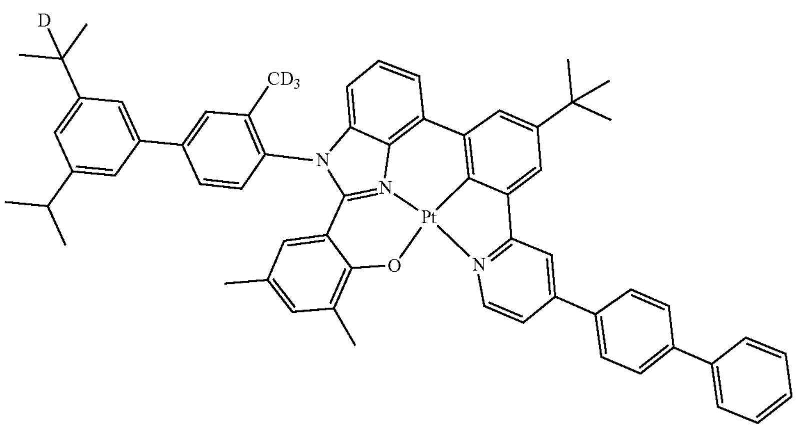
4-165
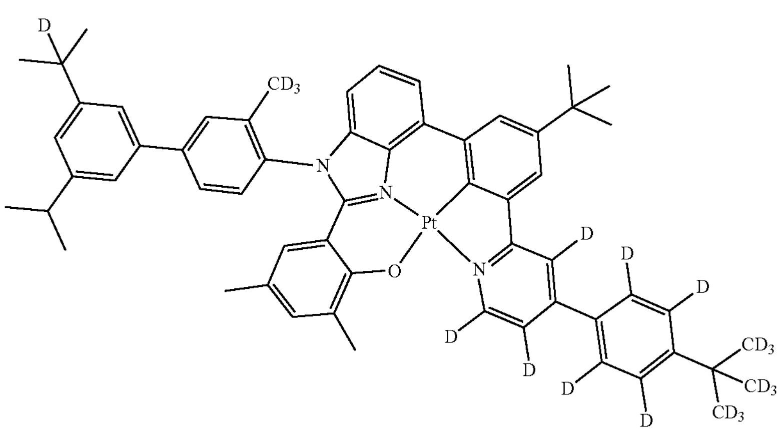

-continued
4-166
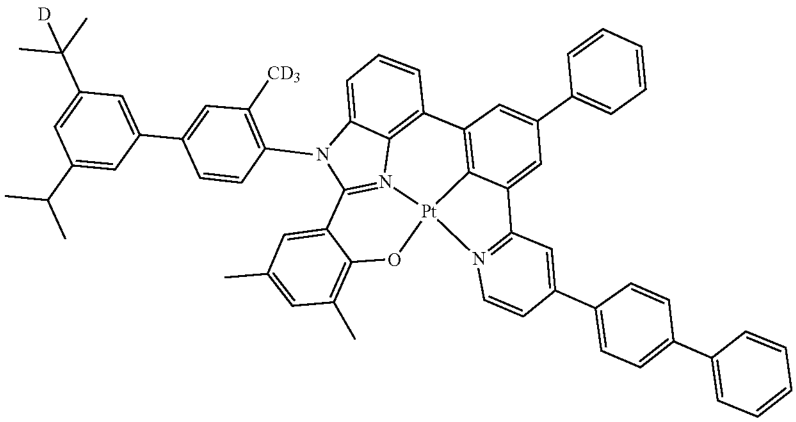
4-167
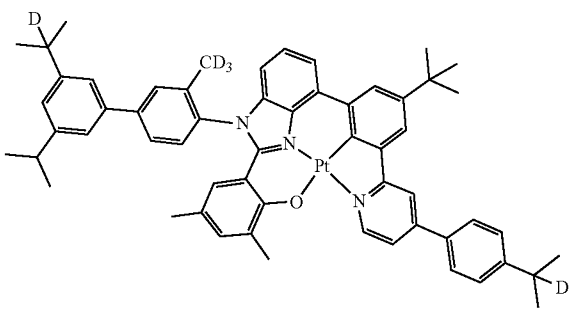
4-168
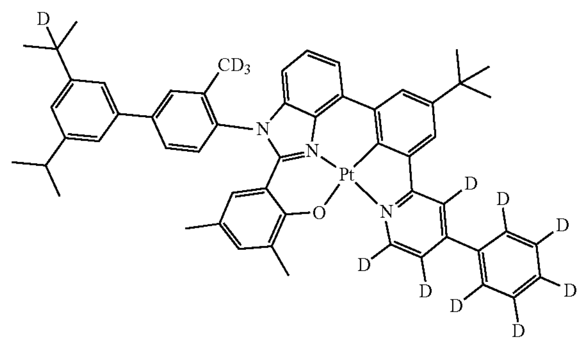
4-169
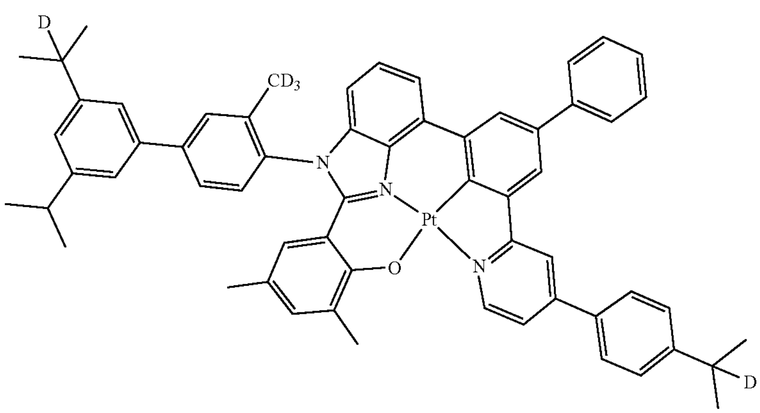
4-170
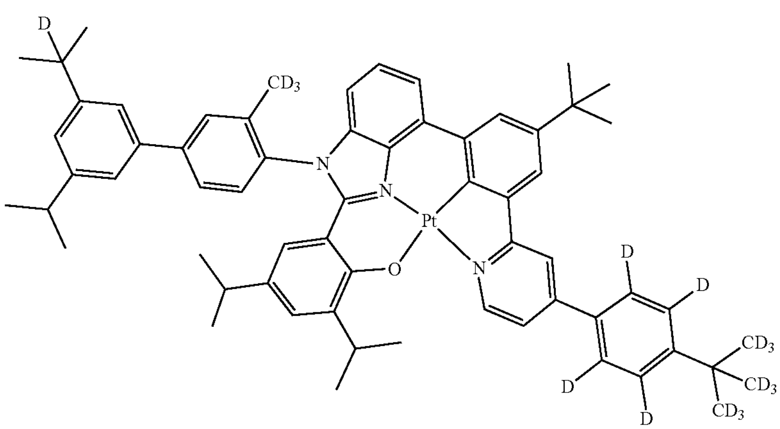

-continued
4-171
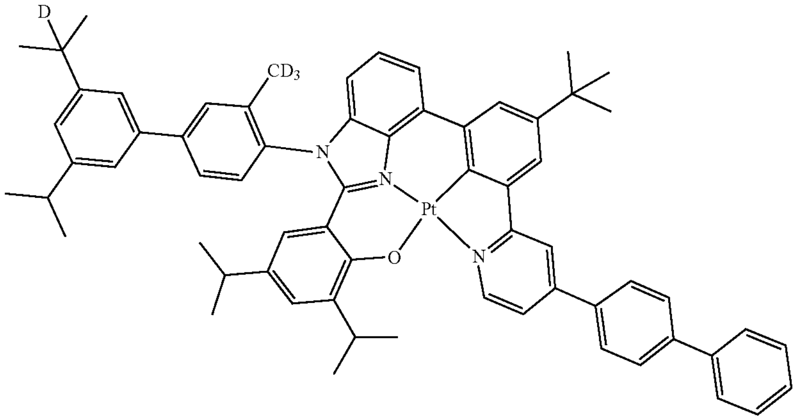
4-172
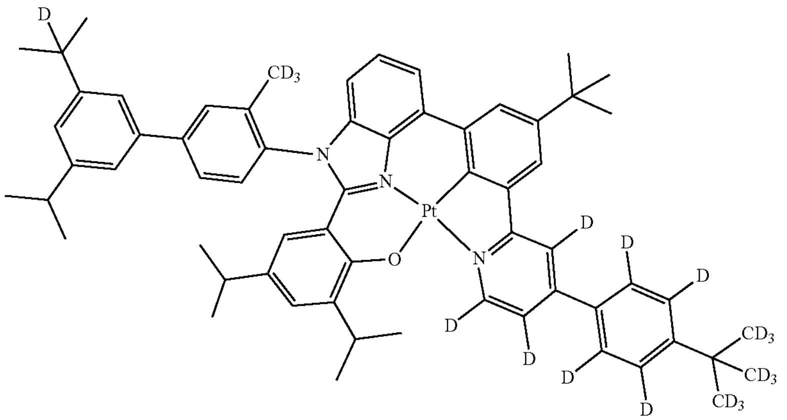
4-173
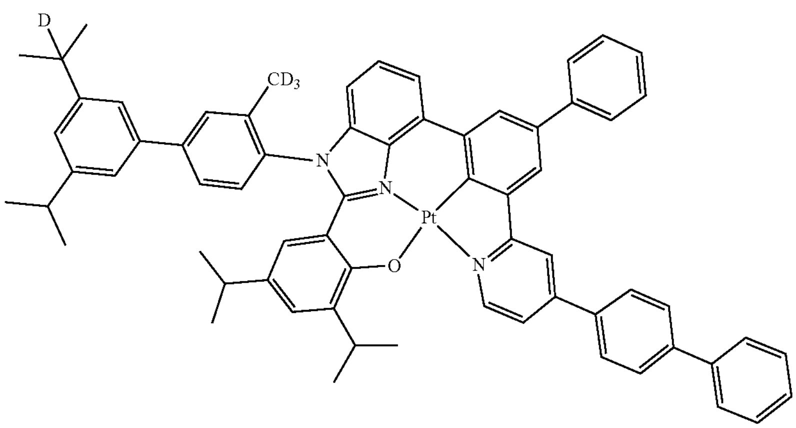
4-174
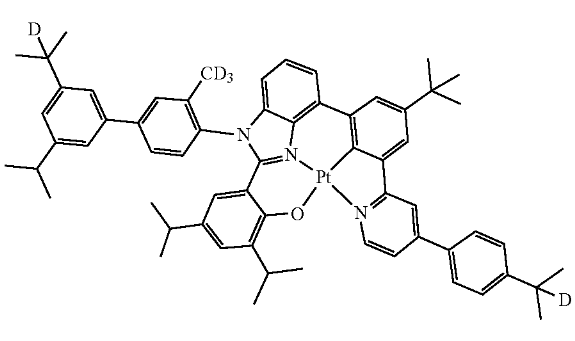
4-175
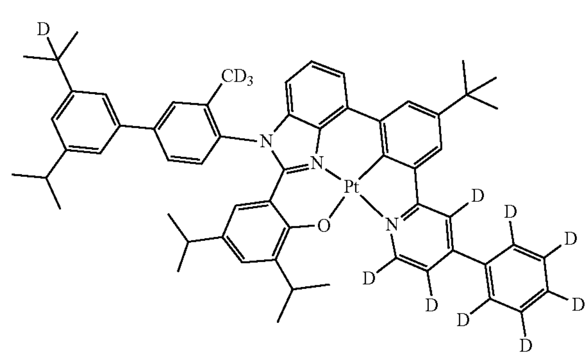

-continued
4-176
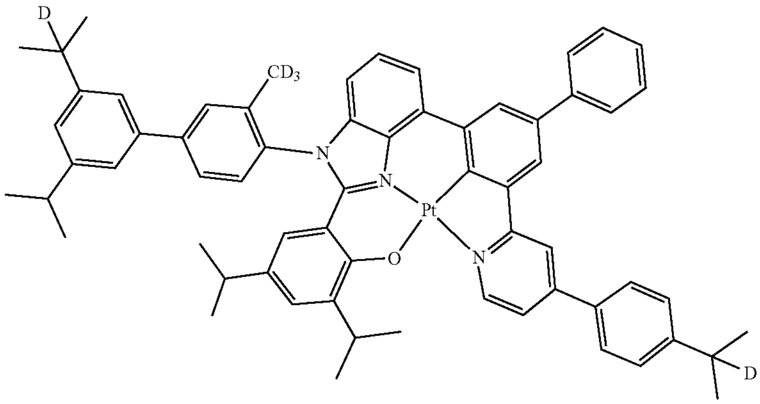
4-177
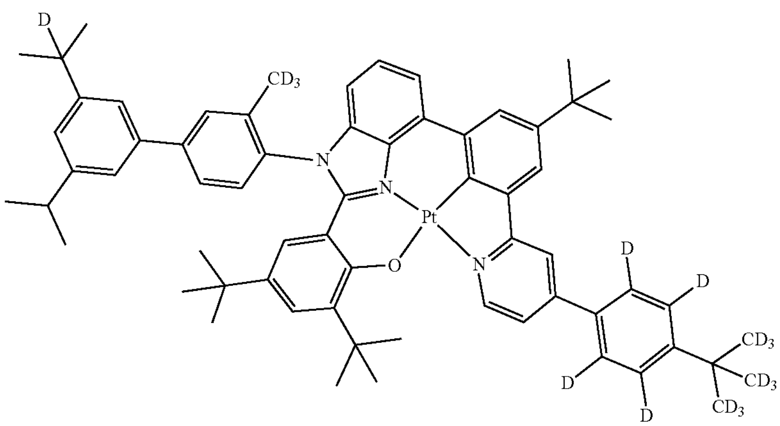
4-178
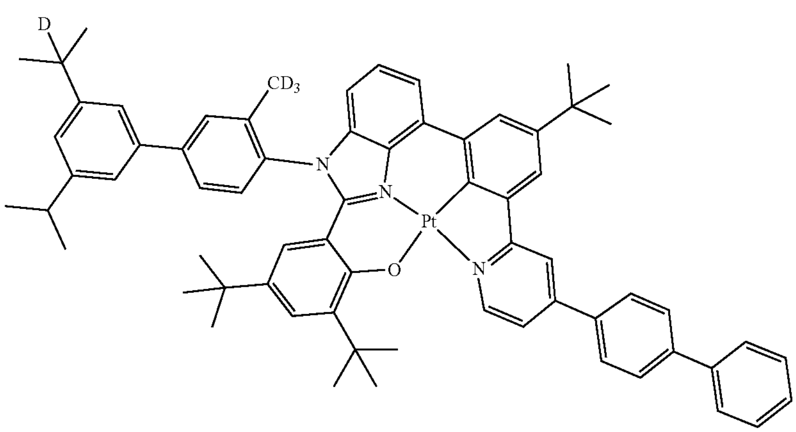

-continued
4-179
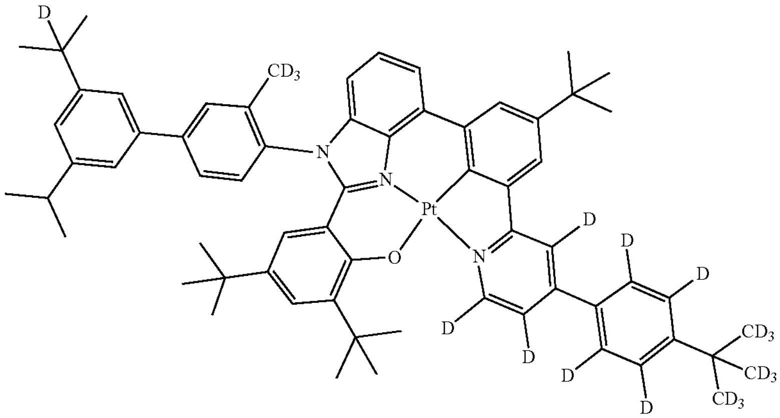
4-180
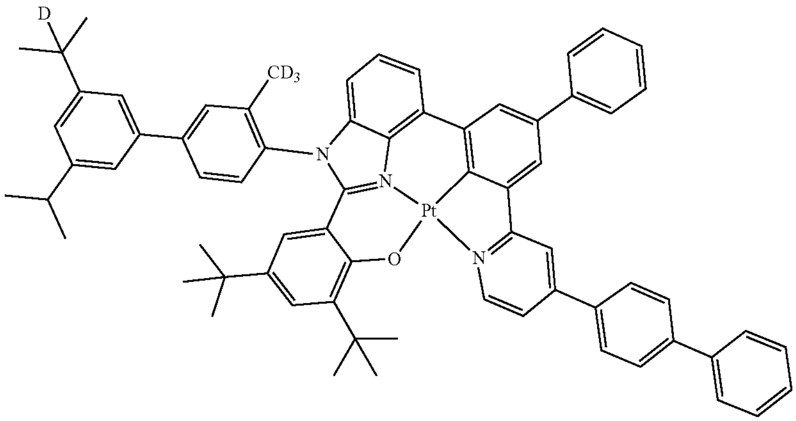
4-181
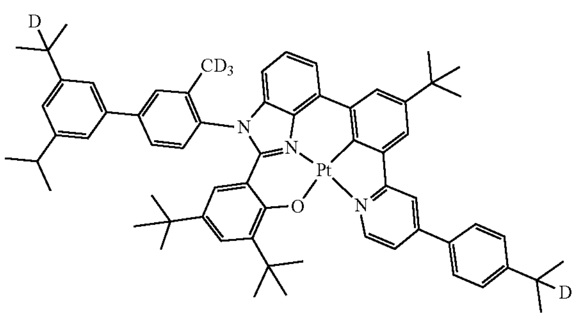
4-182
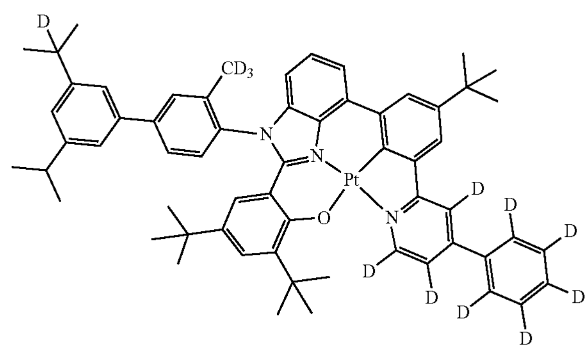
4-183
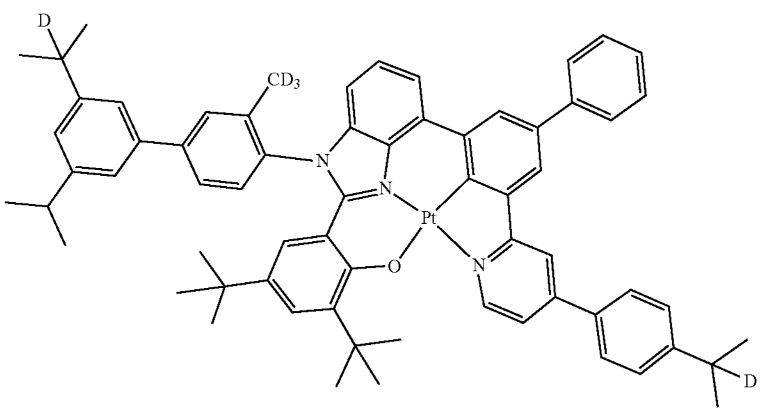

-continued
4-184
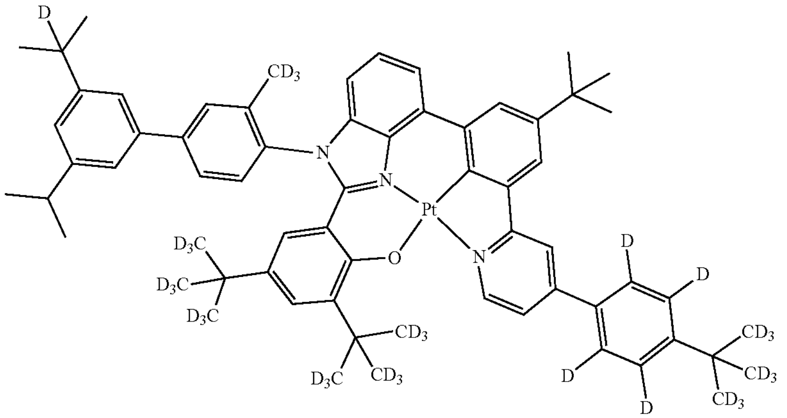
4-185
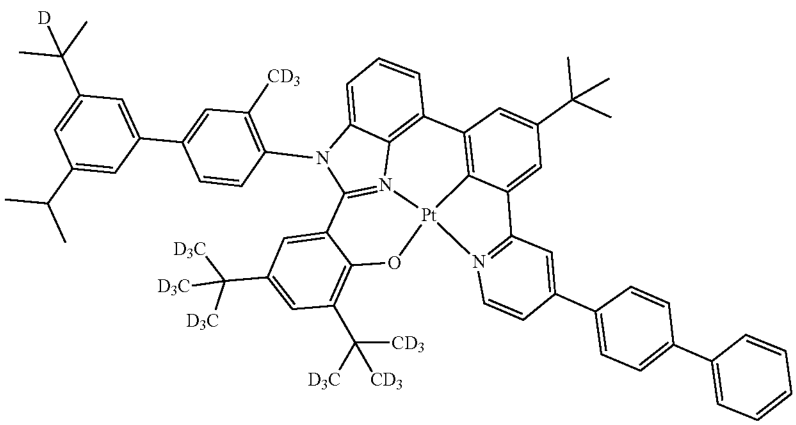
4-186
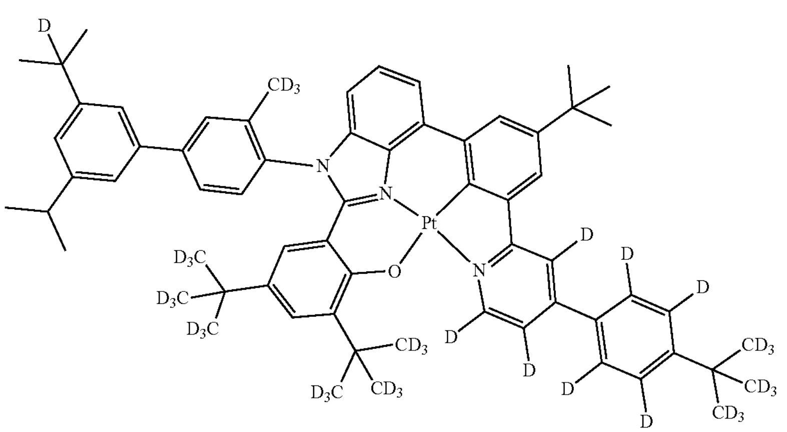

-continued
4-187
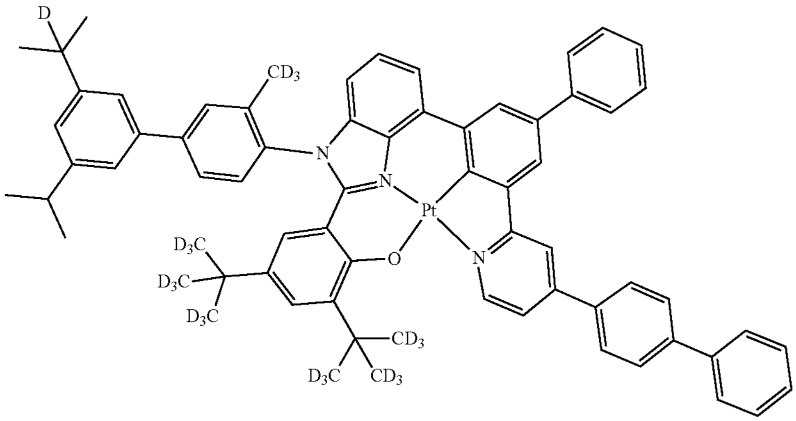
4-188
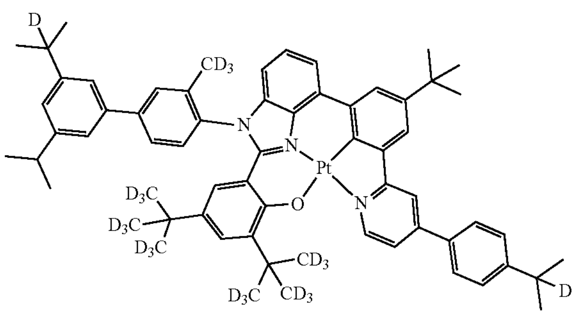
4-189
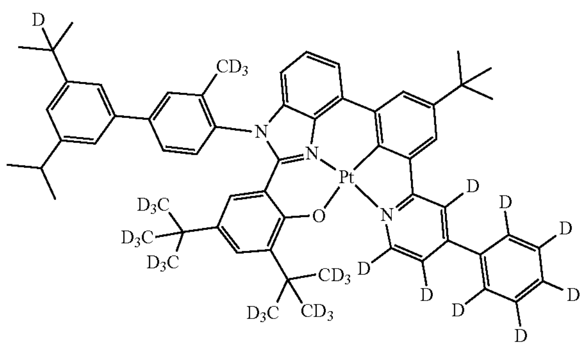
4-190
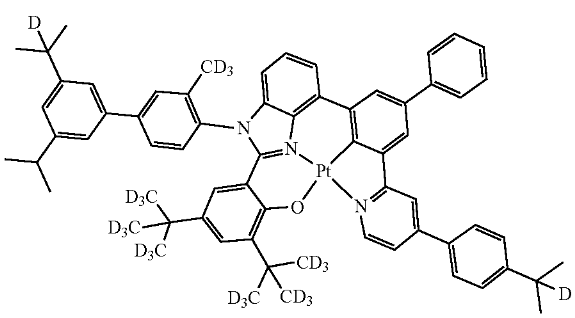
4-191
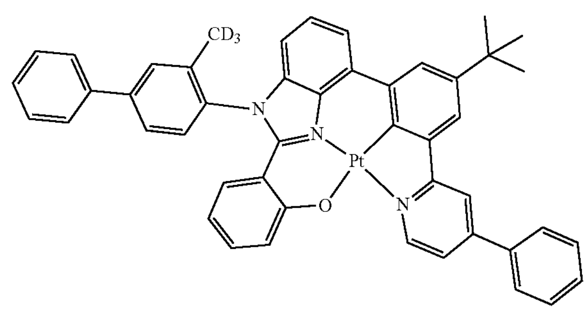
4-192
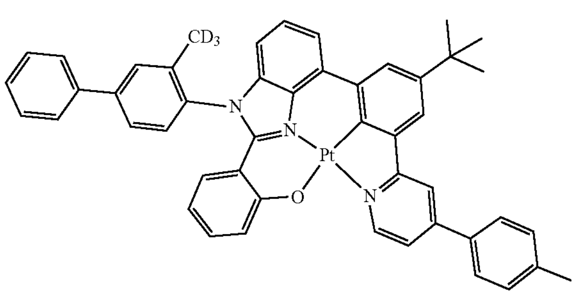
4-193
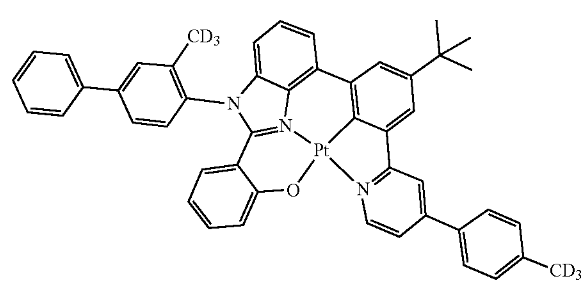

-continued
4-194
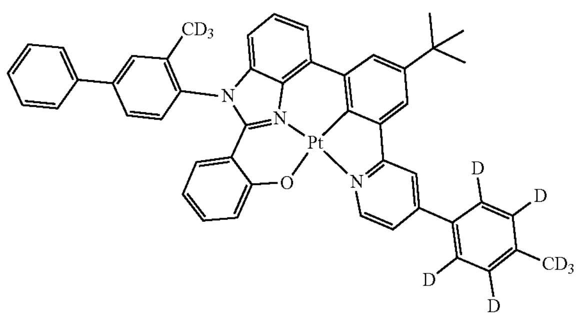
4-195
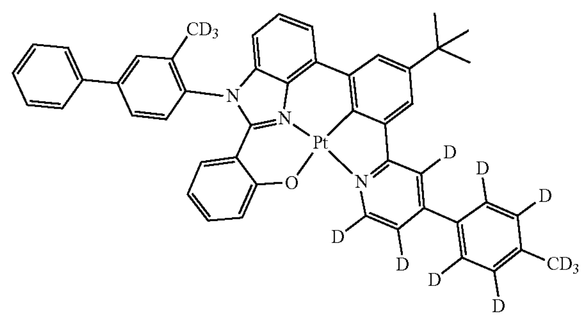
4-196
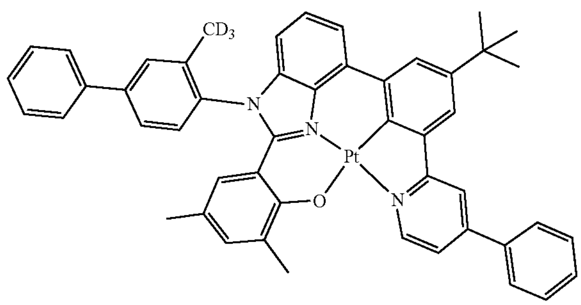
4-197
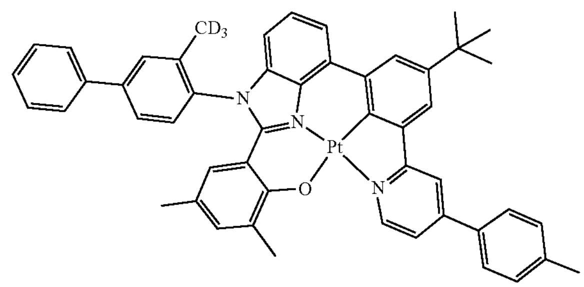
4-198
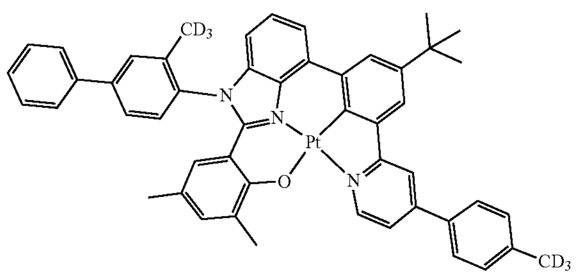
4-199
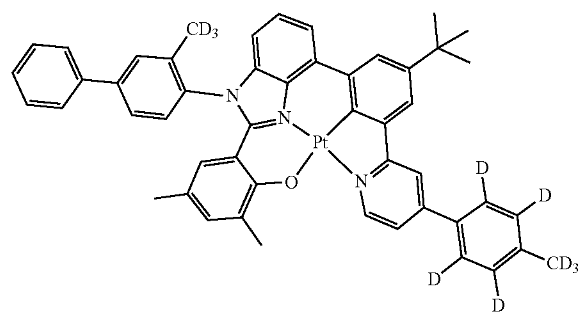
4-200
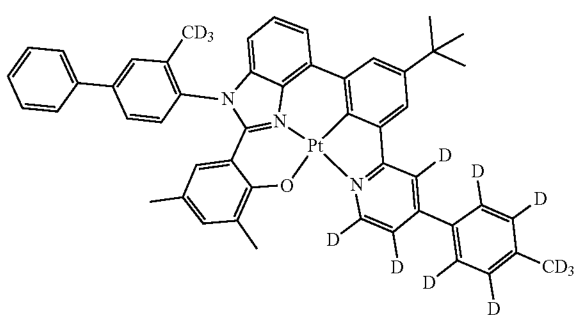
4-201
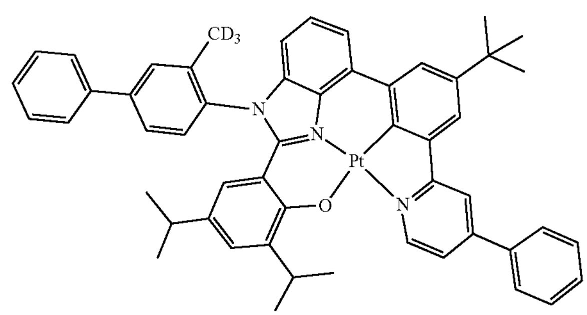
4-202
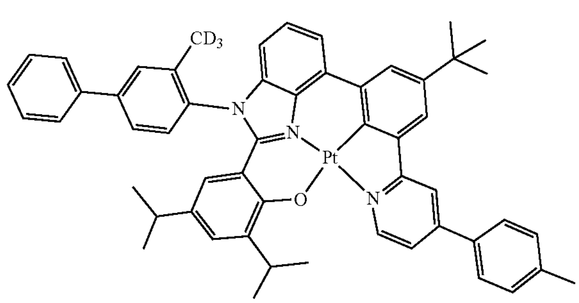
4-203
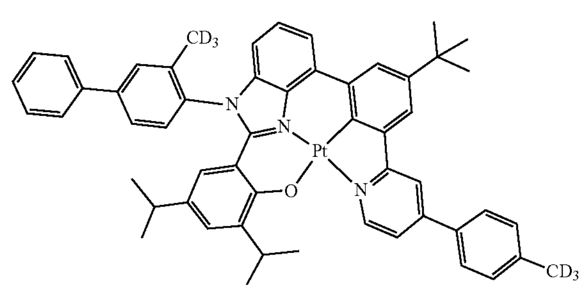

-continued
4-204
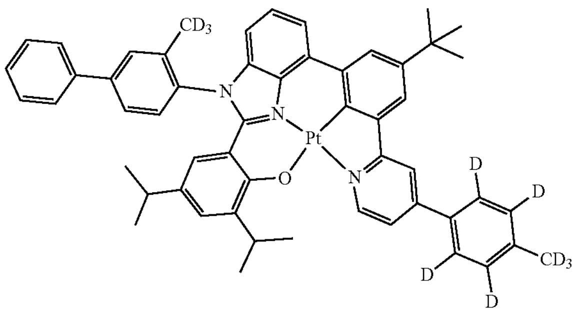
4-205
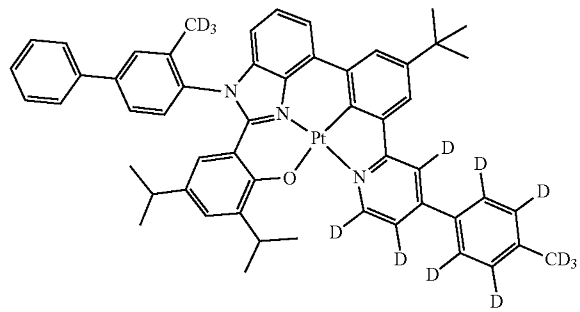
4-206
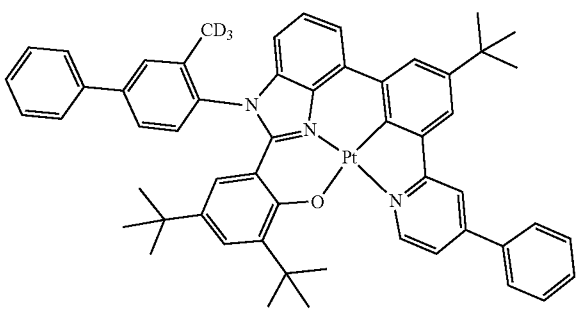
4-207
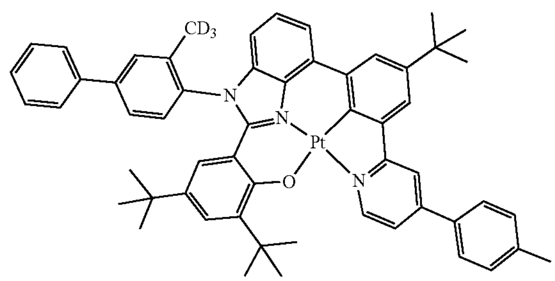
4-208
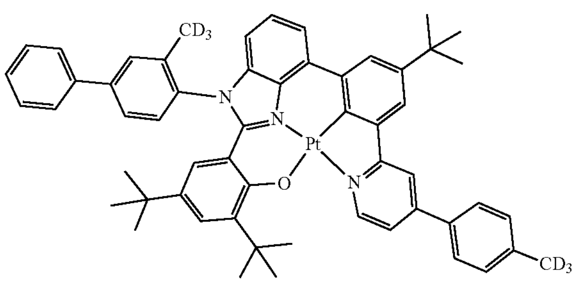
4-209
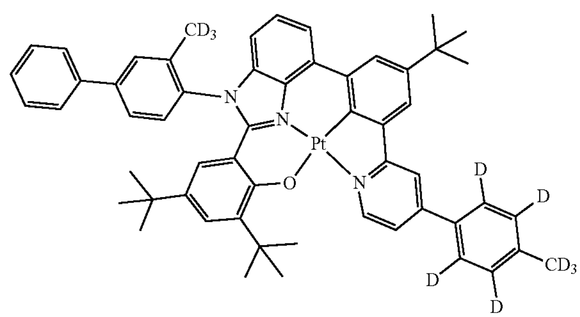
4-210
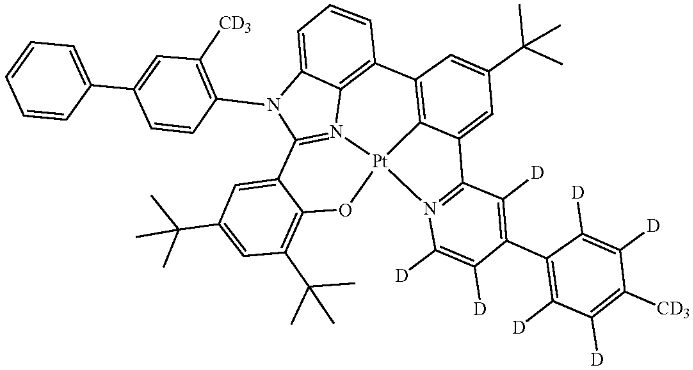

-continued
4-211
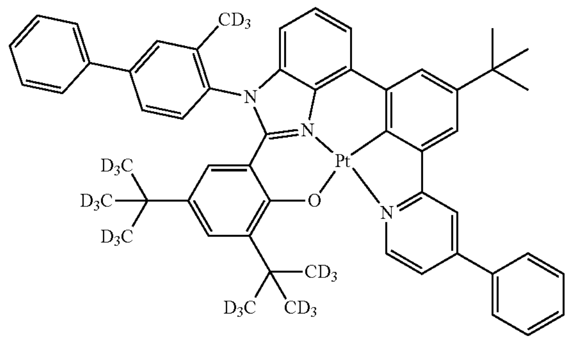
4-212
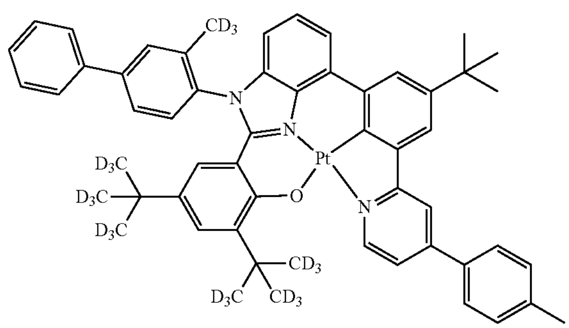
4-213
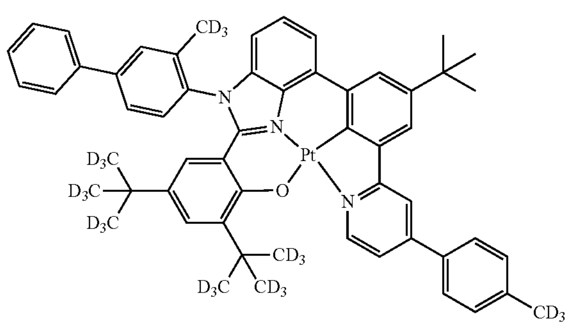
4-214
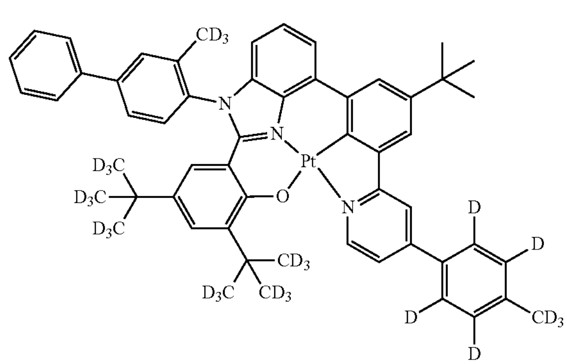
4-215
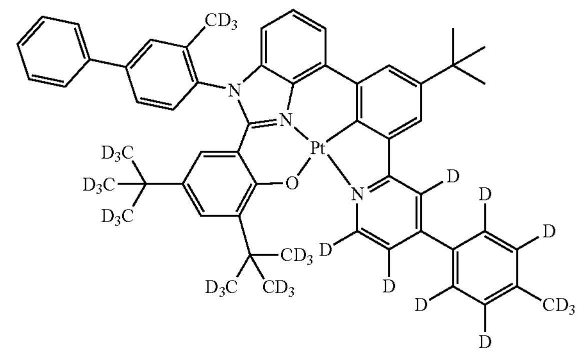
4-216
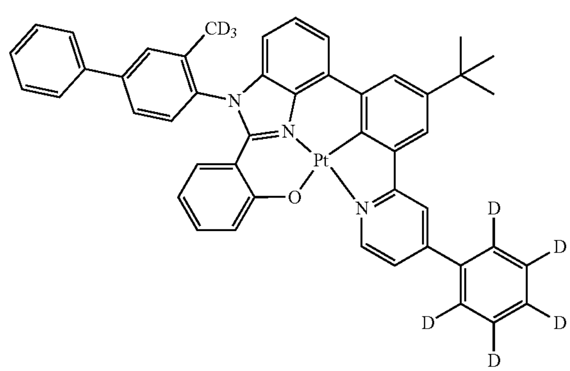
4-217
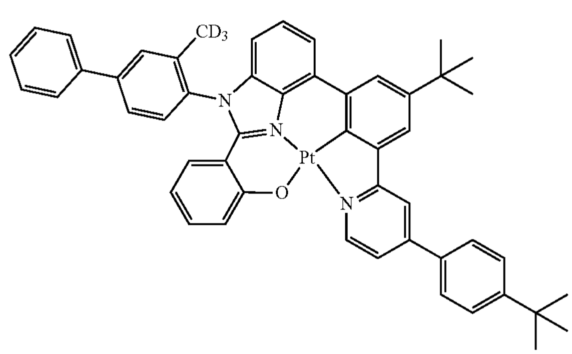
4-218
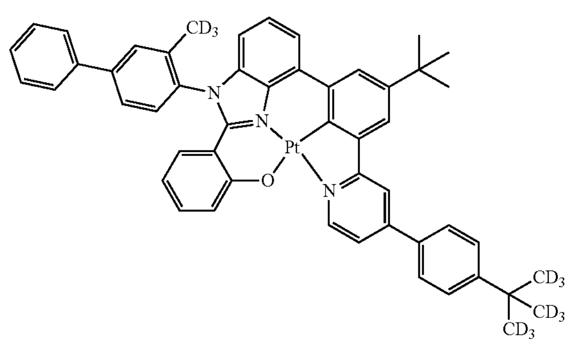

4-219
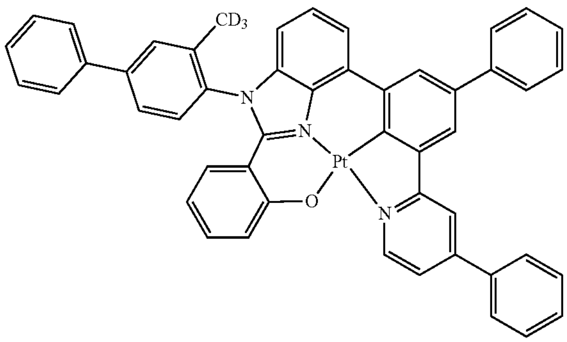
4-220
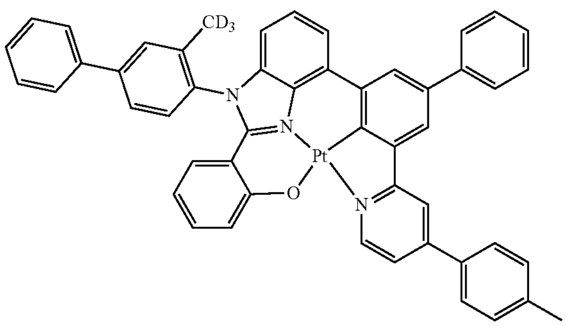
4-221
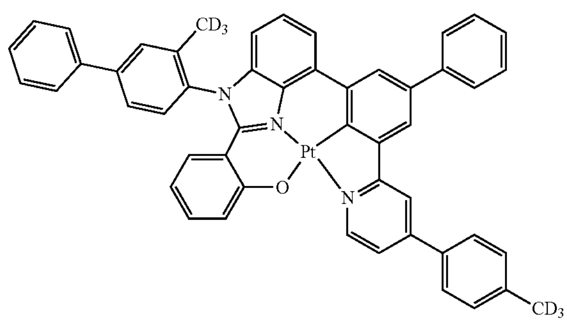
4-222
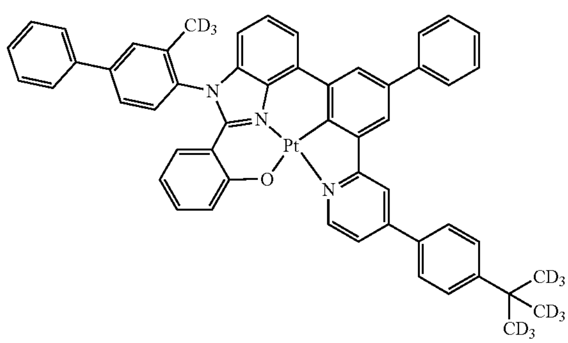
4-223
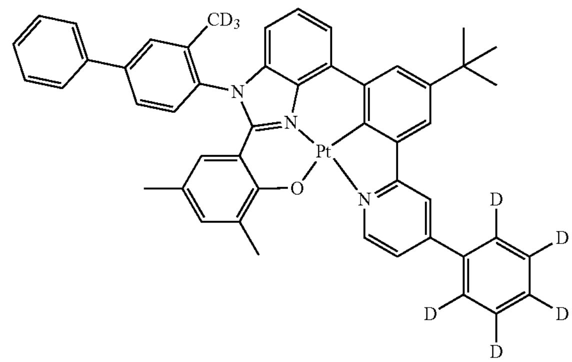
4-224
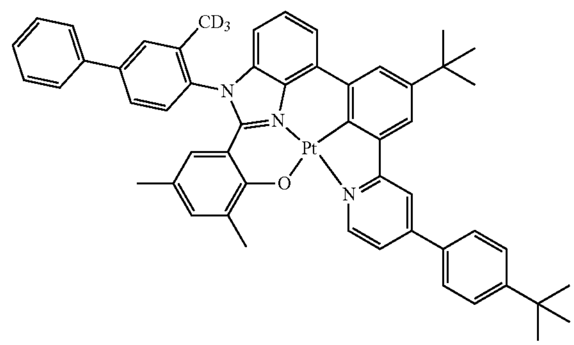
4-225
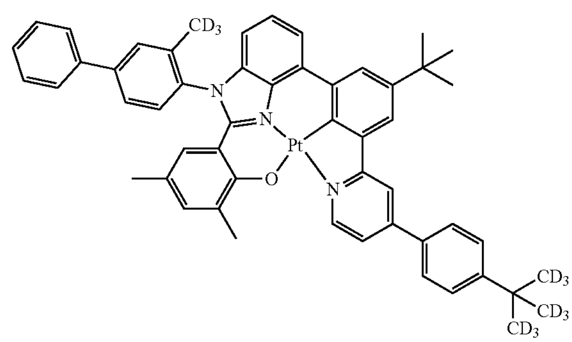
4-226
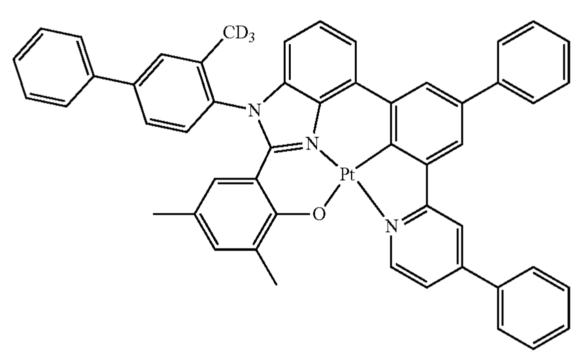

4-227
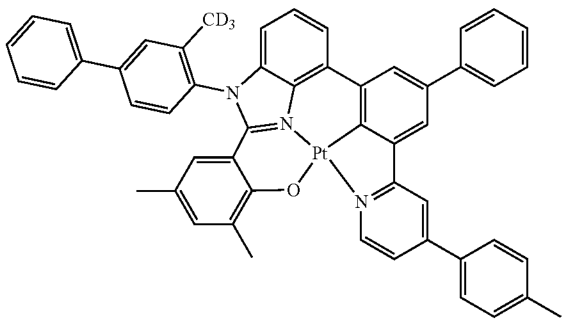
4-228
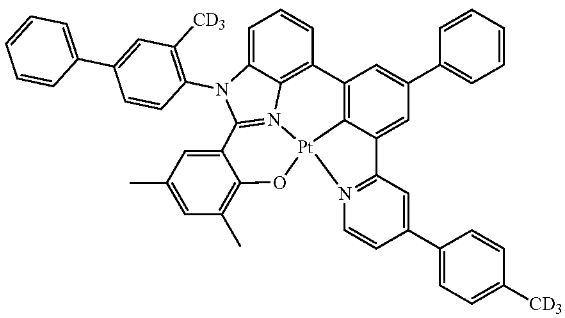
4-229
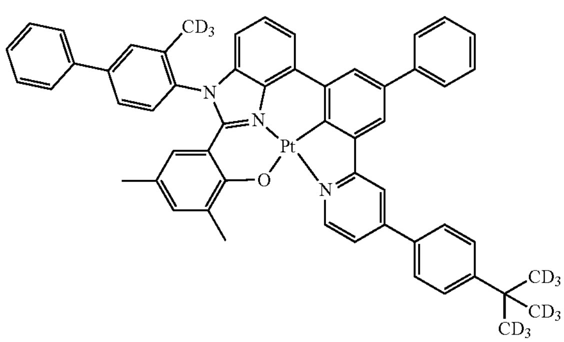
4-230
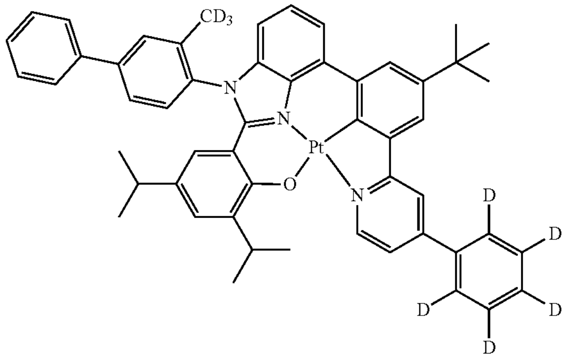
4-231
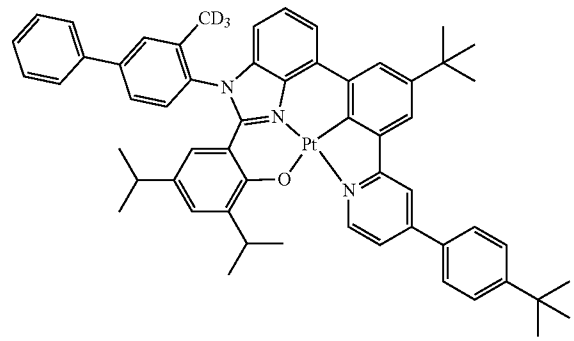
4-232
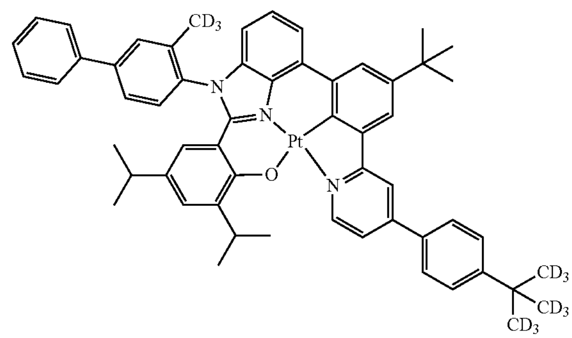
4-233
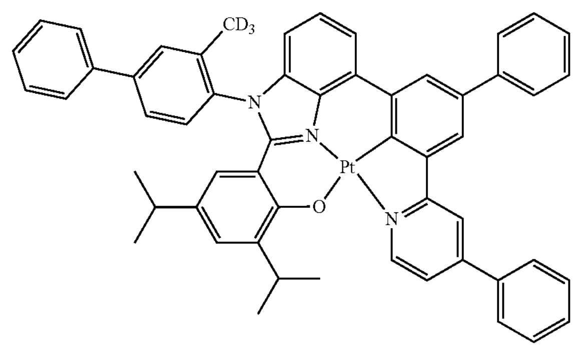
4-234
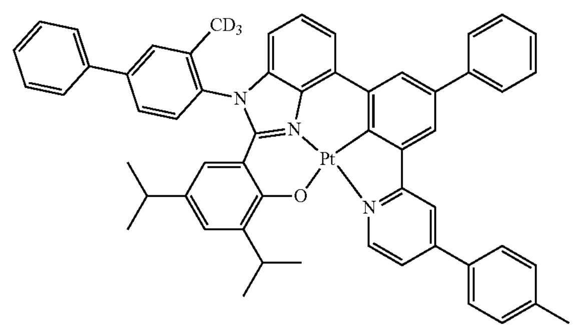

-continued
4-235
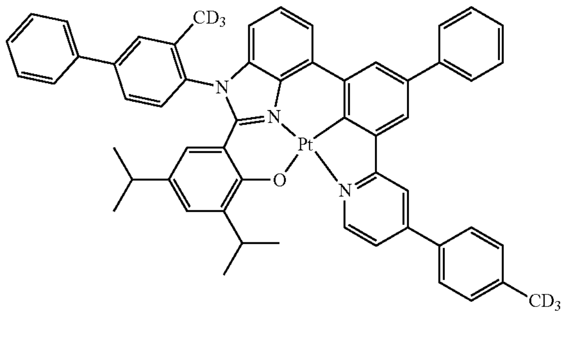
4-236
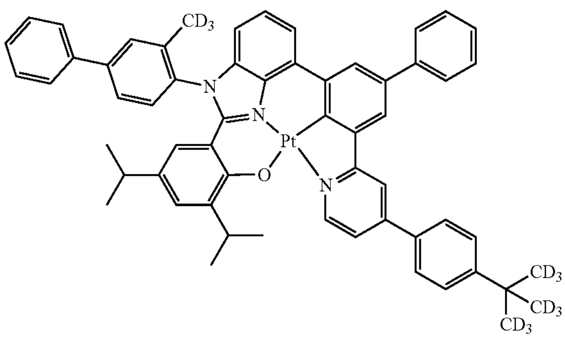
4-237
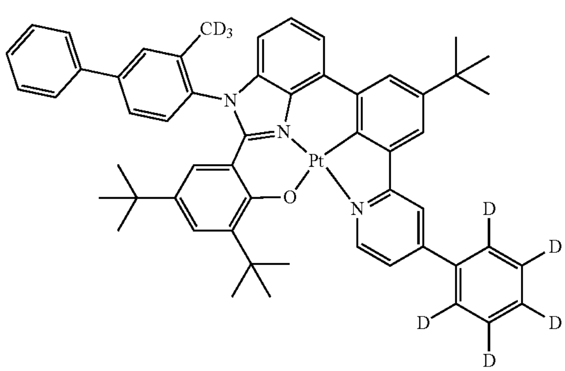
4-238
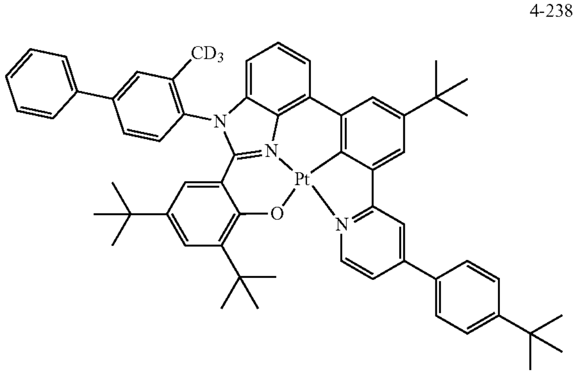
-continued
4-239
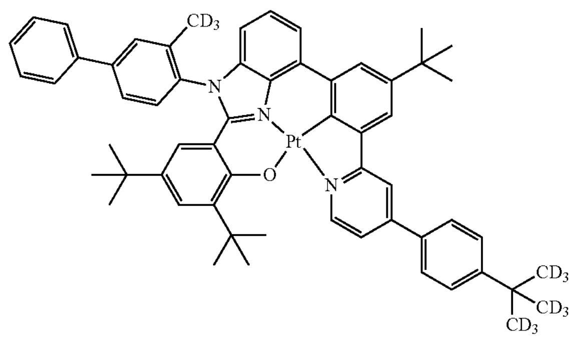
4-240
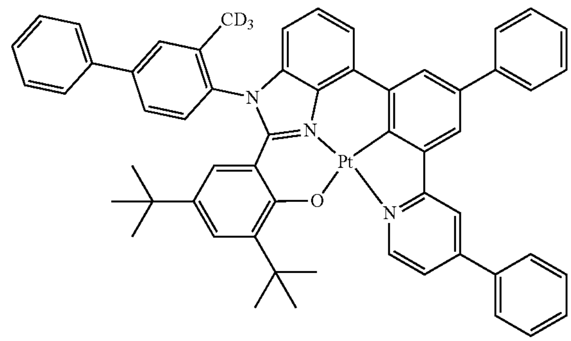
4-241
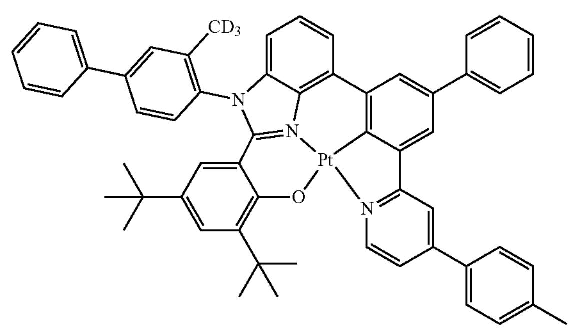
4-242
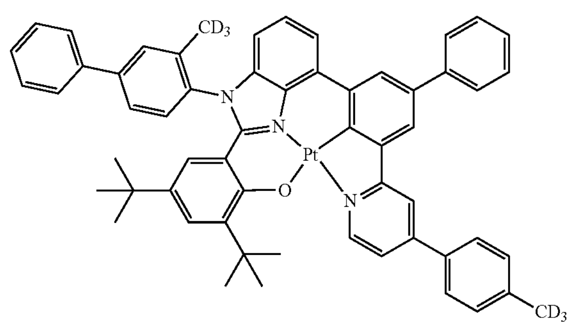

-continued
4-243
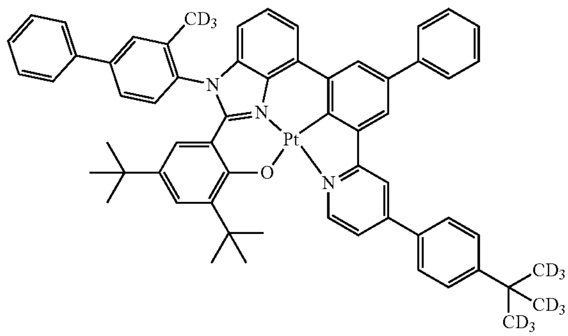
4-244
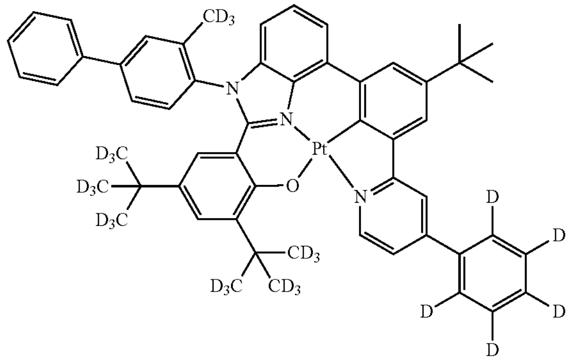
4-245
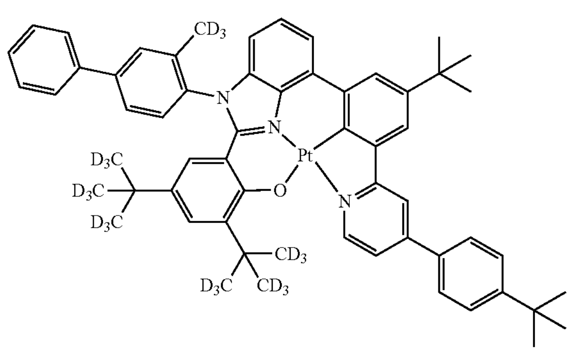
4-246
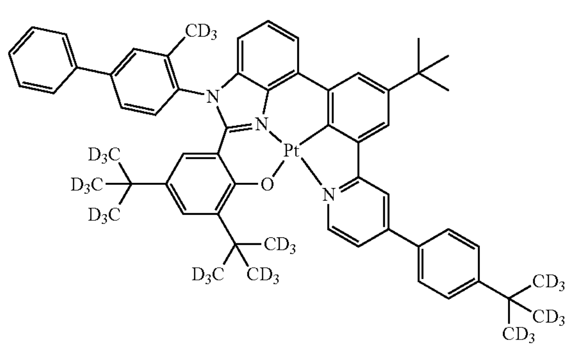
-continued
4-247
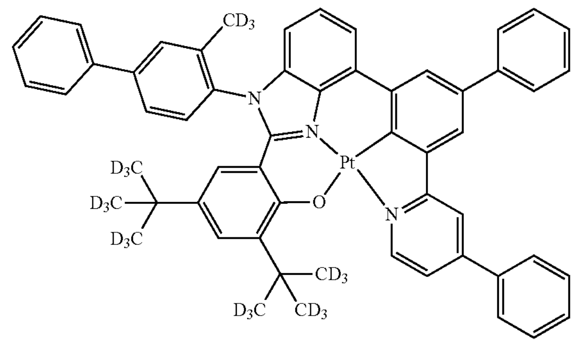
4-248
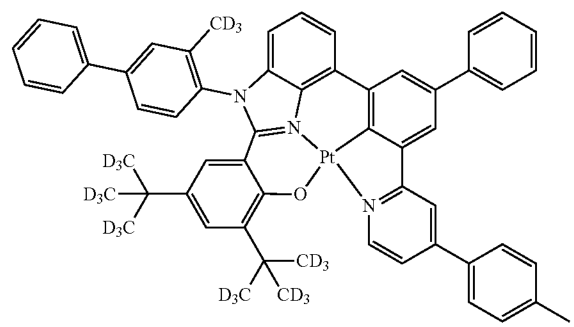
4-249
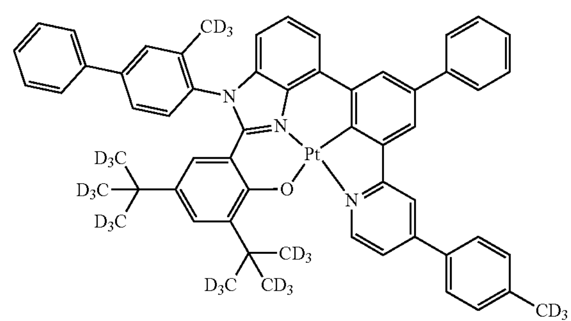
4-250
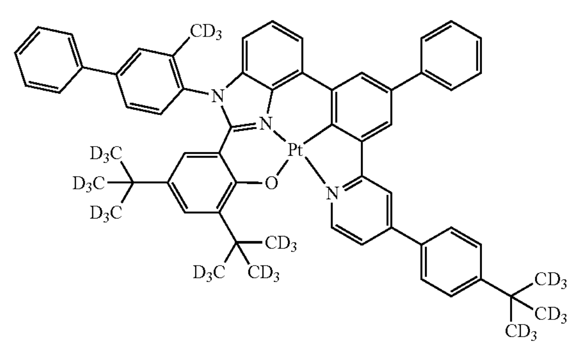

-continued
4-251
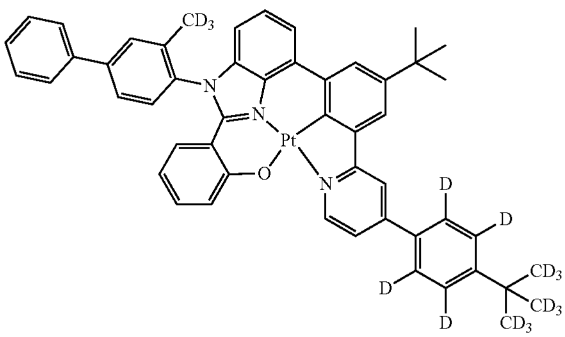
4-252
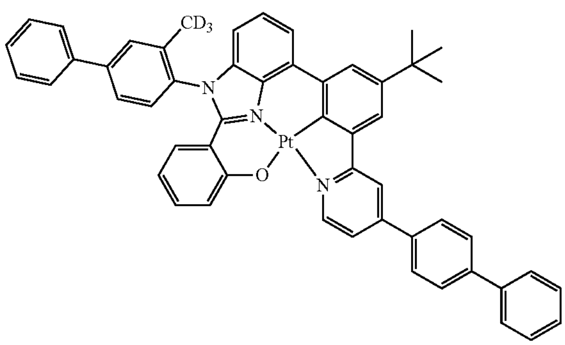
4-253
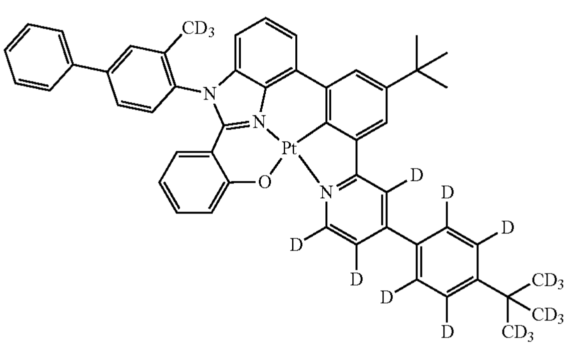
4-254
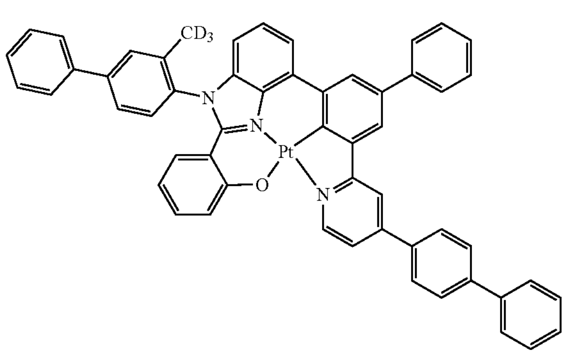
-continued
4-255
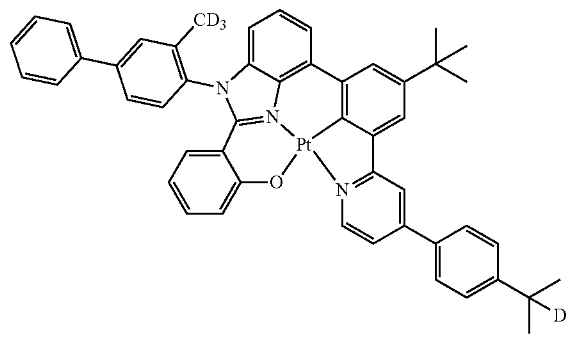
4-256
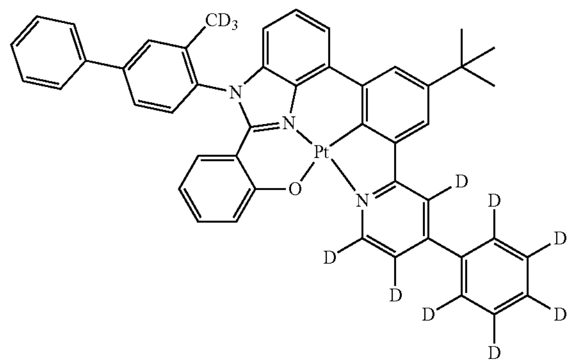
4-257
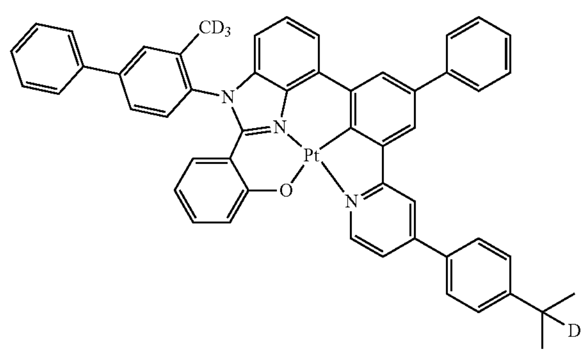
4-258
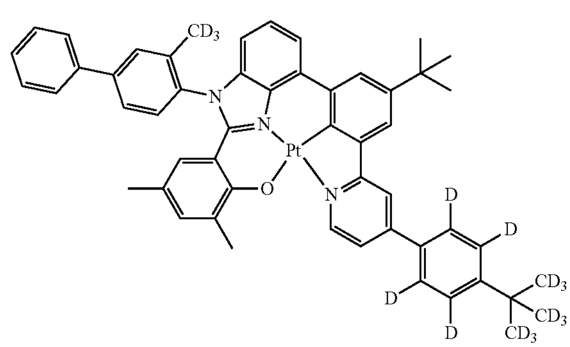

-continued
4-259
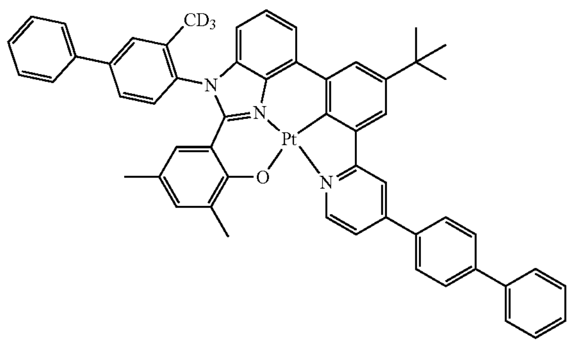
4-260
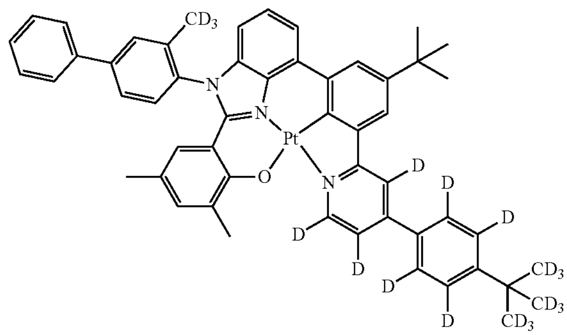
4-261
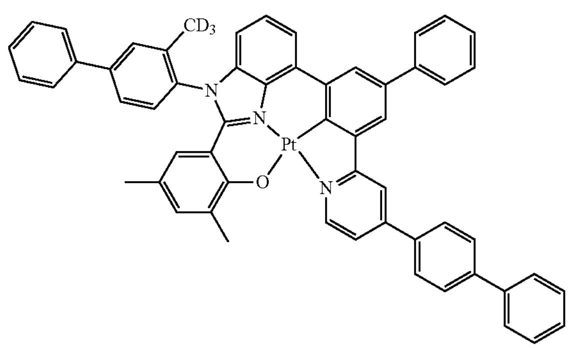
4-262
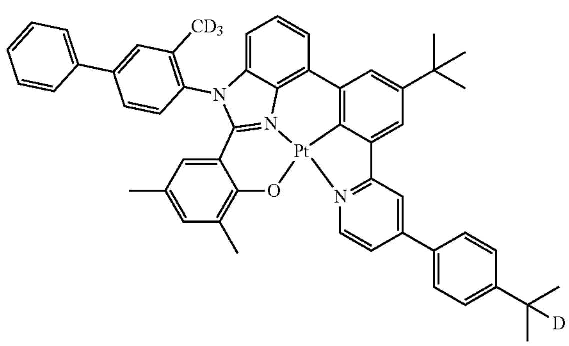
-continued
4-263
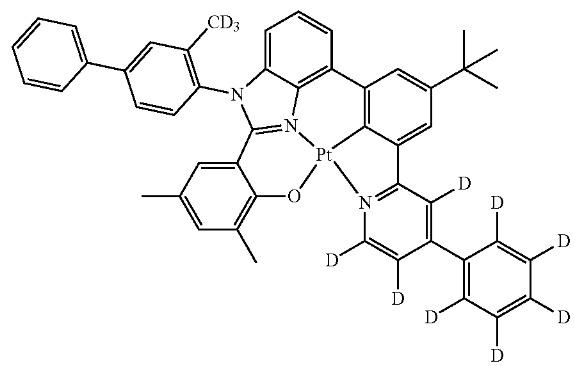
4-264
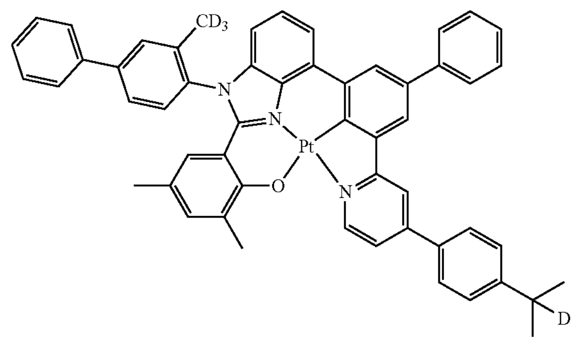
4-265
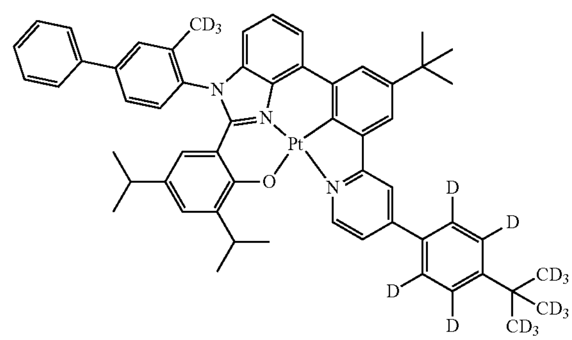
4-266
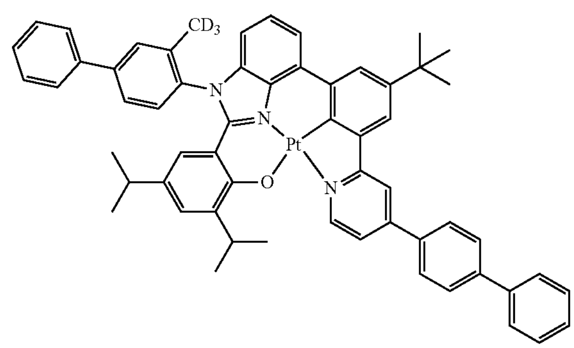

-continued
4-267
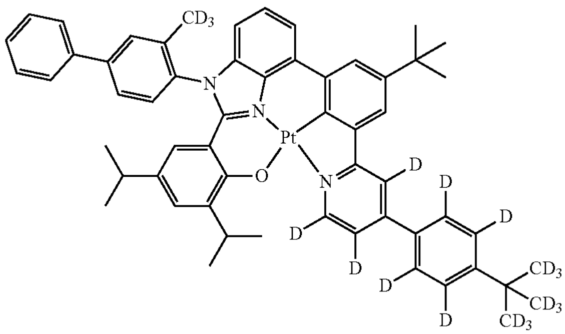
4-268
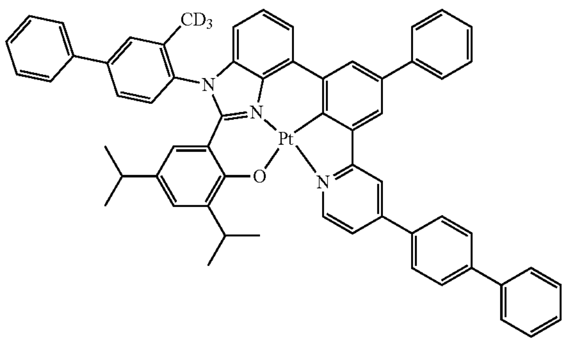
4-269
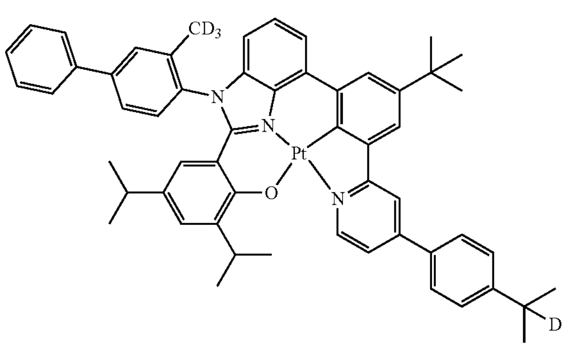
4-270
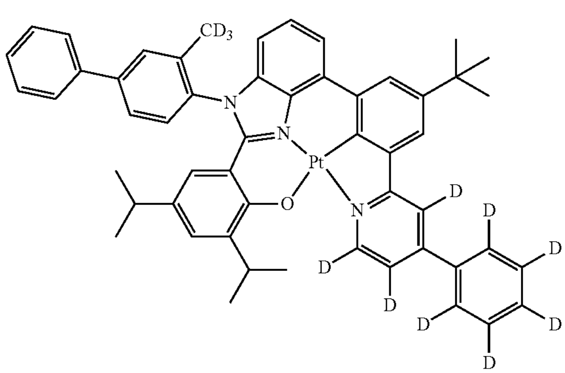
-continued
4-271
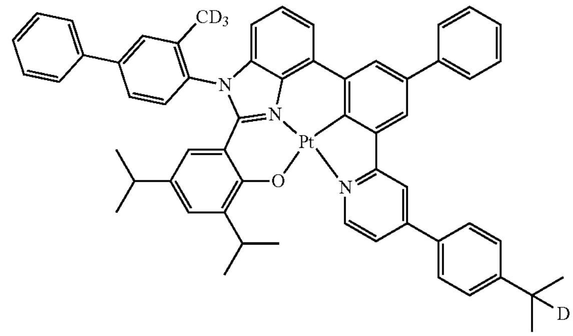
4-272
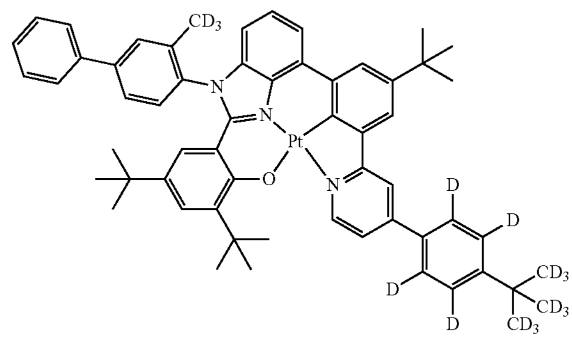
4-273
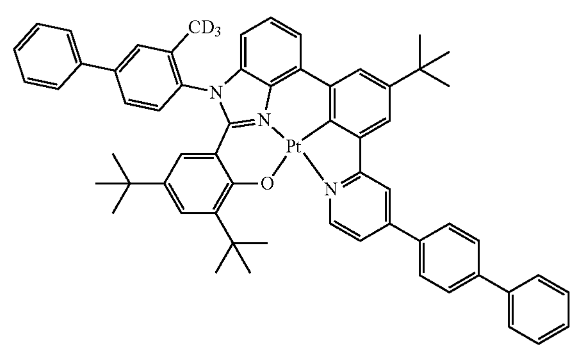
4-274
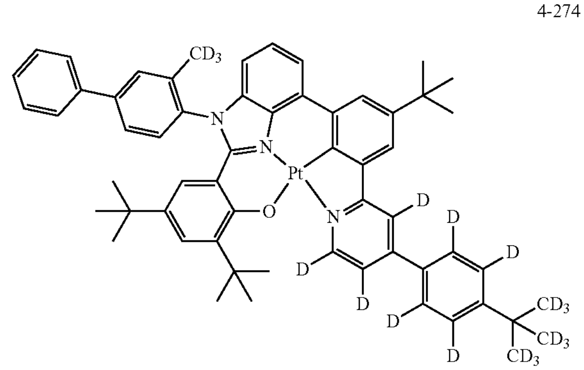

-continued
4-275
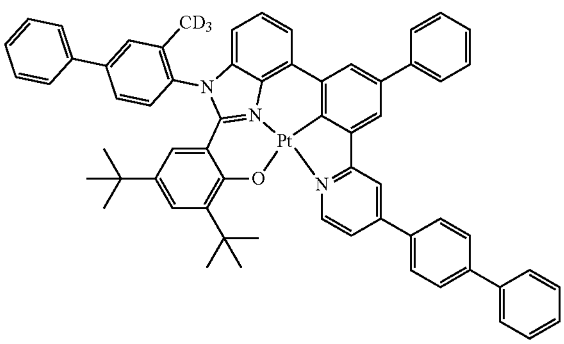
4-276
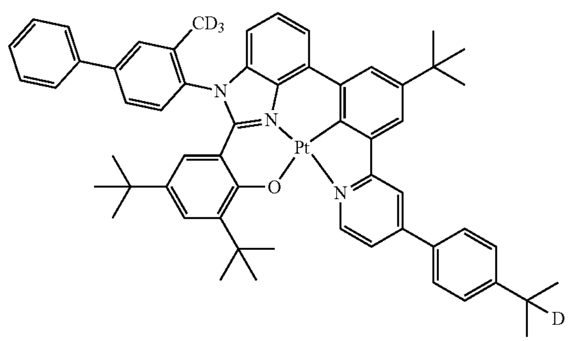
4-277
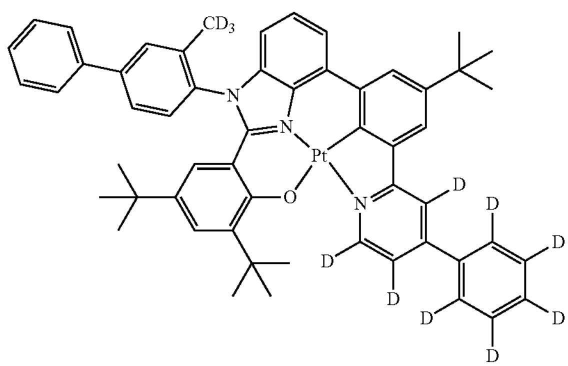
4-278
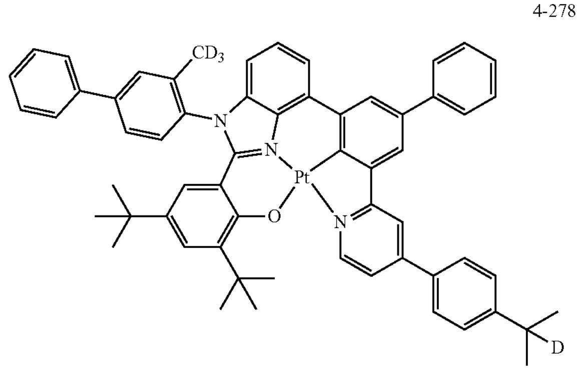
-continued
4-279
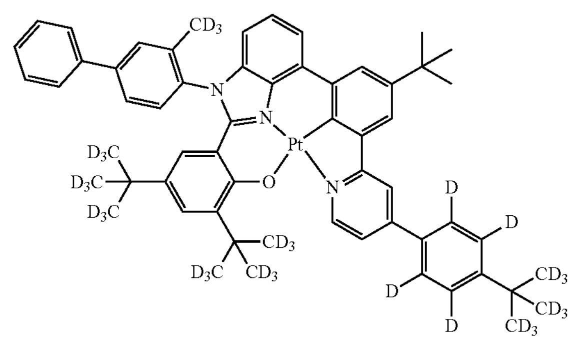
4-280
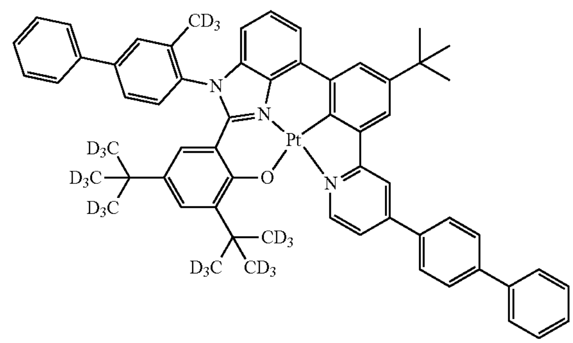
4-281
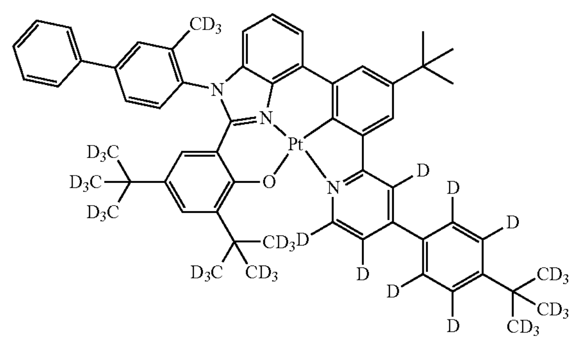
4-282
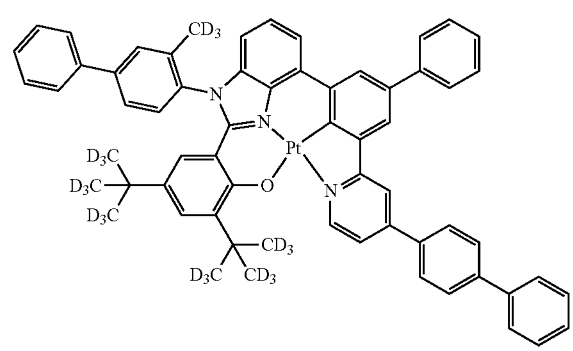

-continued
4-283
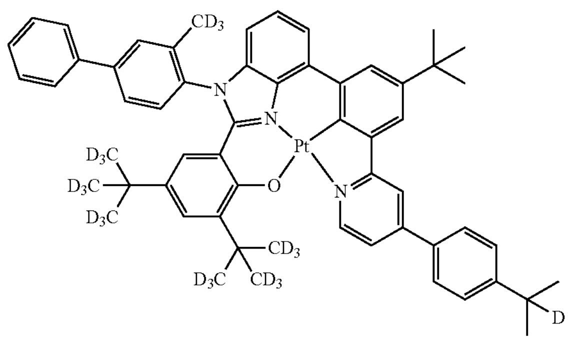
4-284
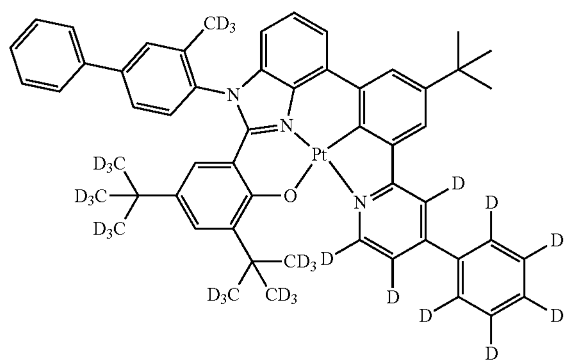
4-285
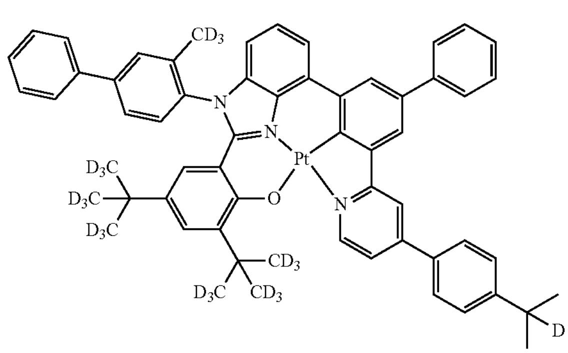
4-286
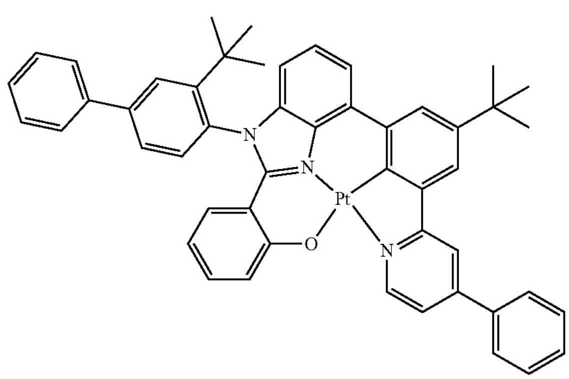
-continued
4-287
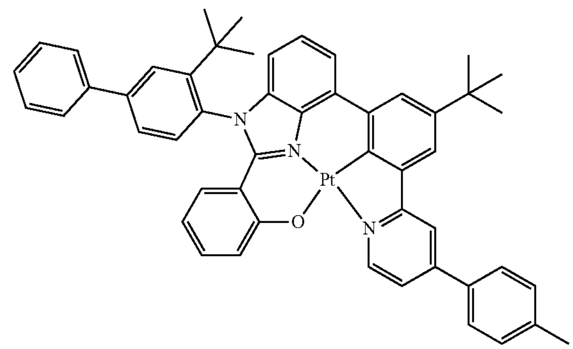
4-288
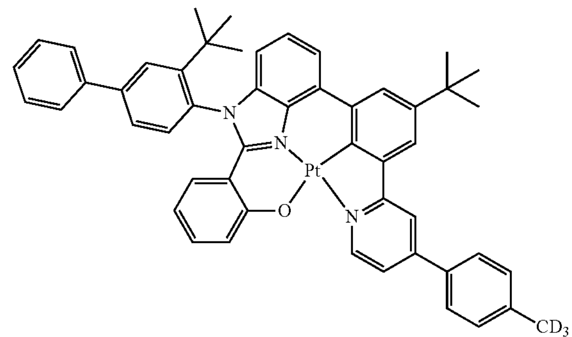
4-289
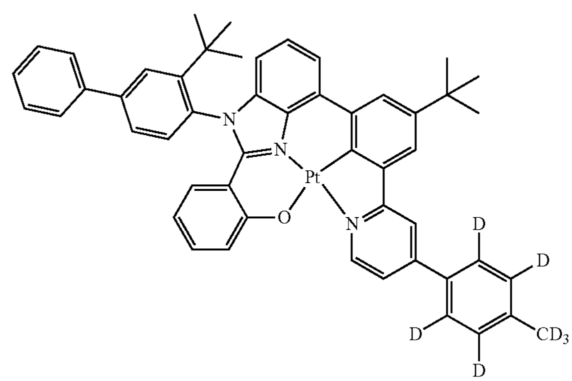
4-290
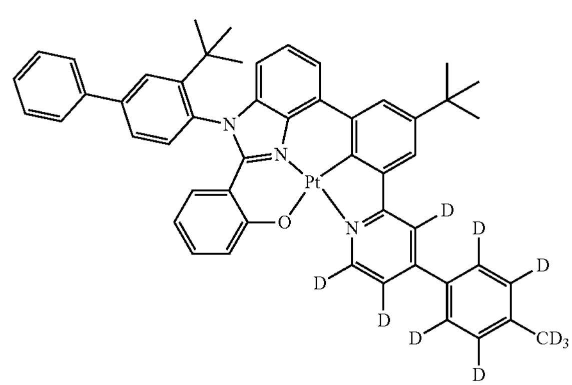

-continued
4-291
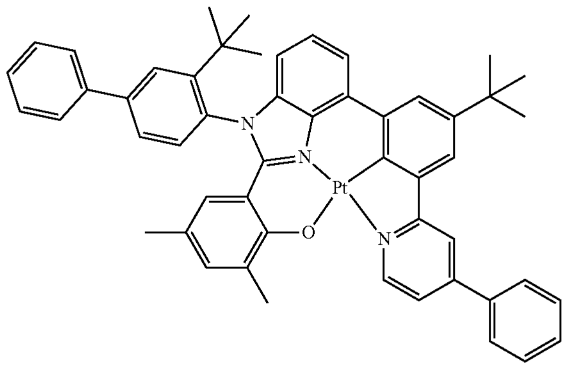
4-292
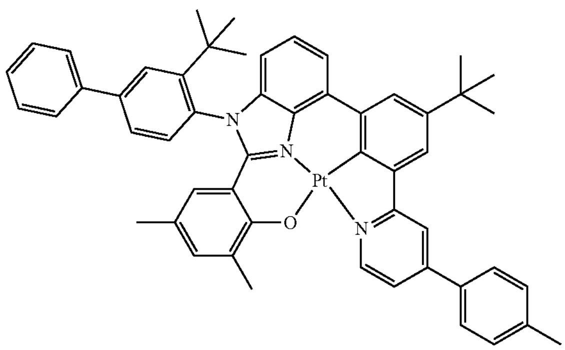
4-293
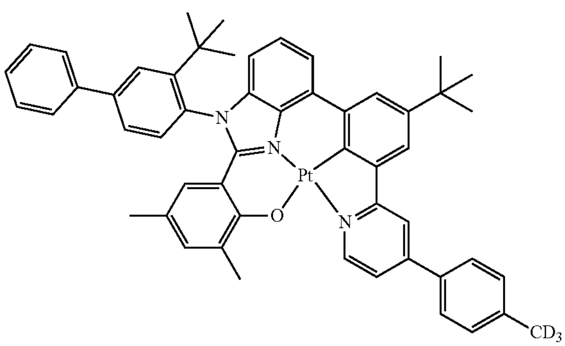
4-294
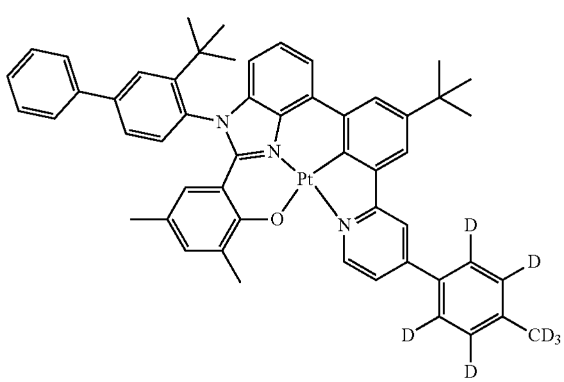
-continued
4-295
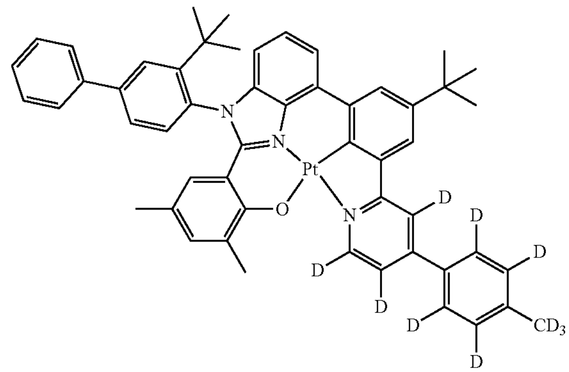
4-296
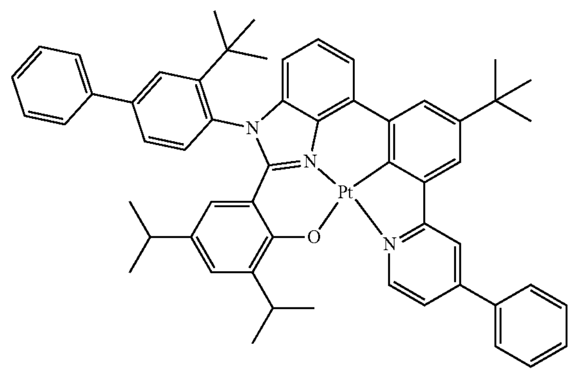
4-297
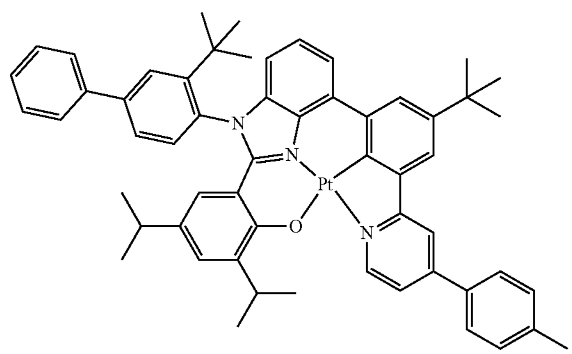
4-298
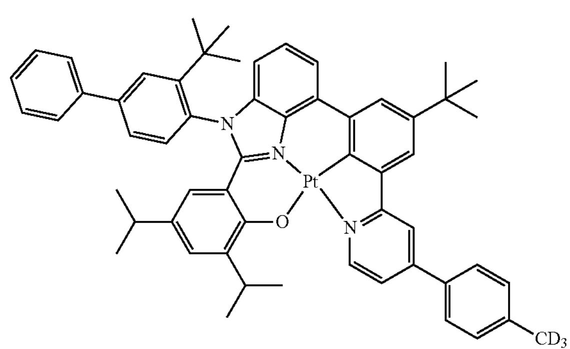

-continued
4-299
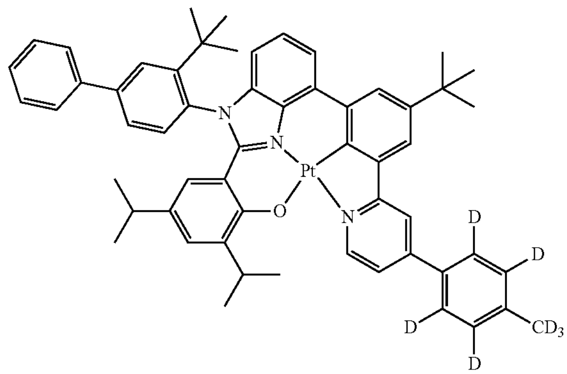
4-300
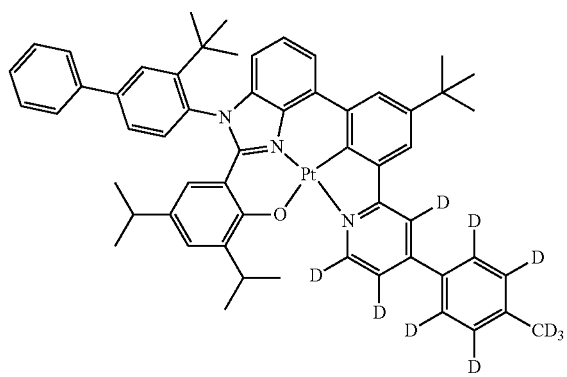
4-301
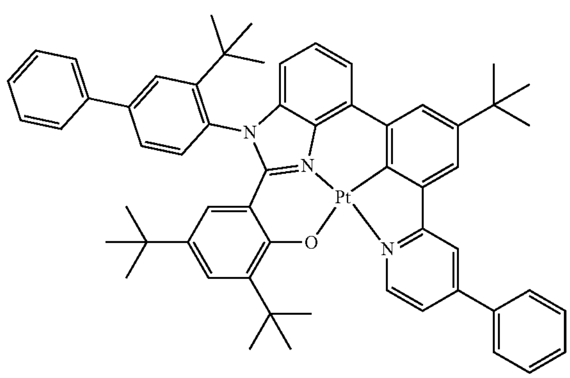
4-302
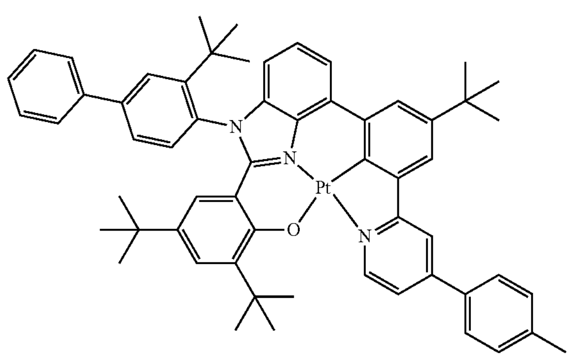
-continued
4-303
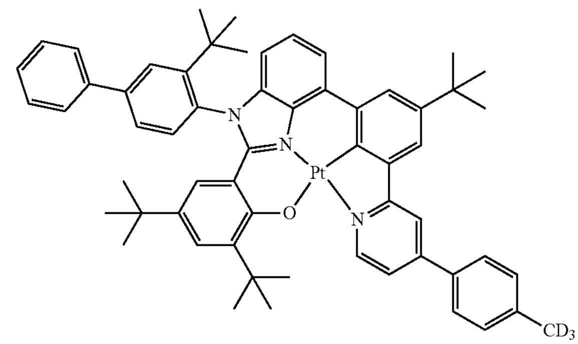
4-304
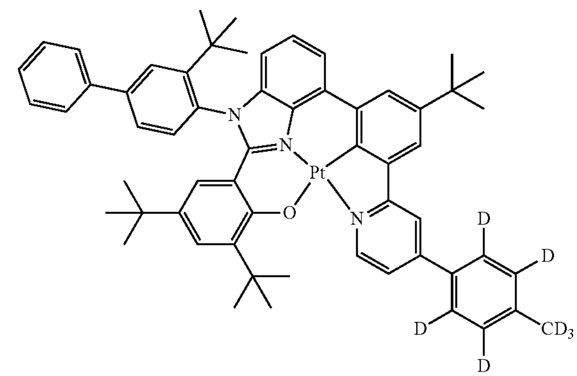
4-305
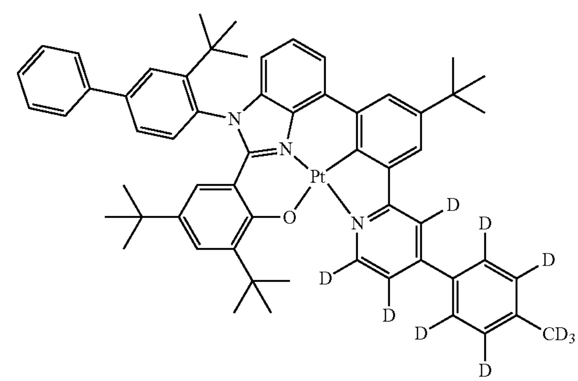
4-306
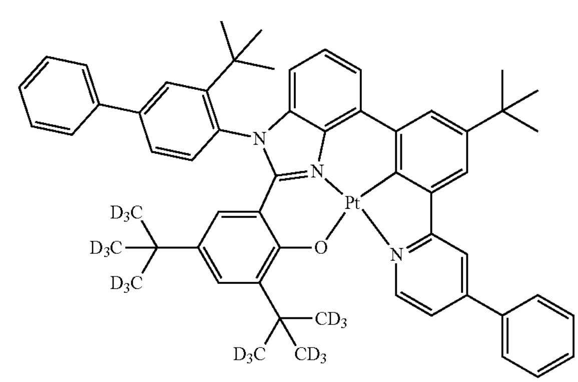

-continued
4-307
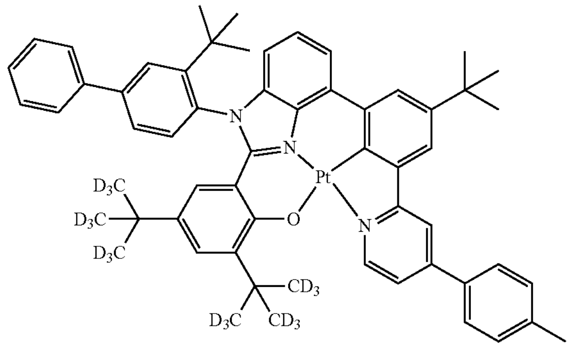
4-308
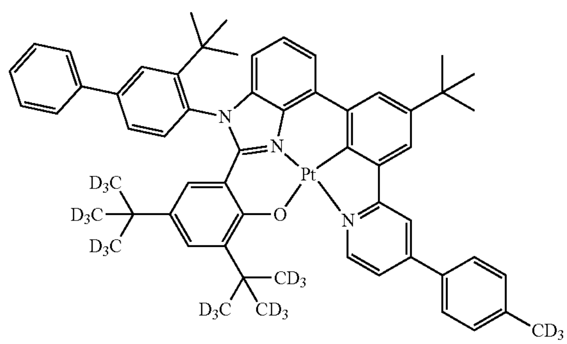
4-309
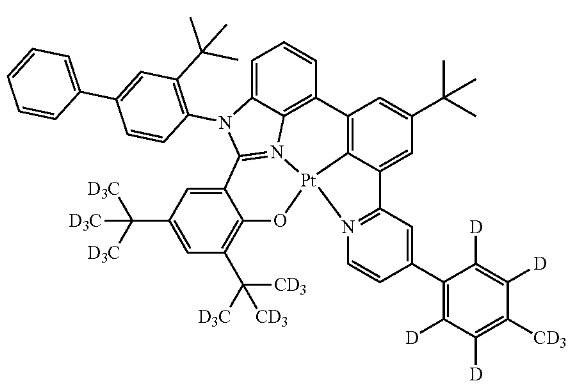
4-310
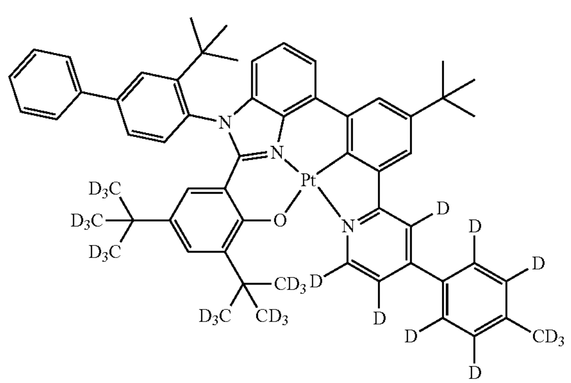
-continued
4-311
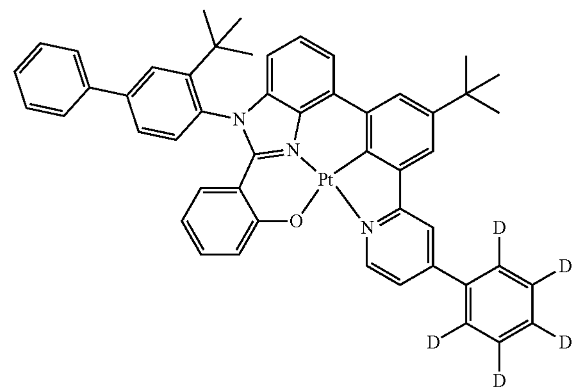
4-312
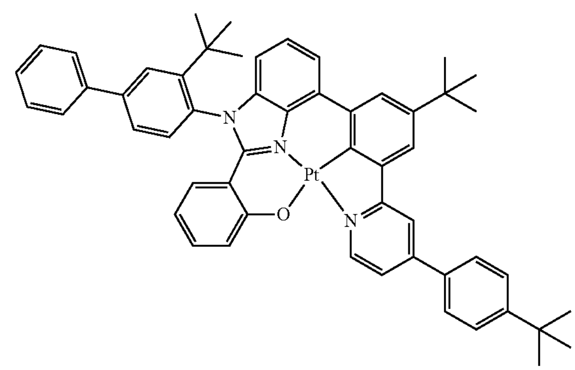
4-313
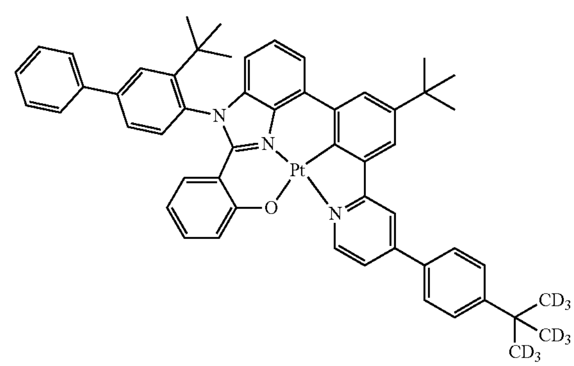
4-314
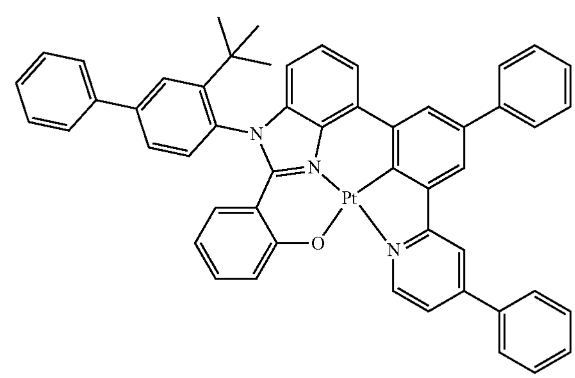

-continued
4-315
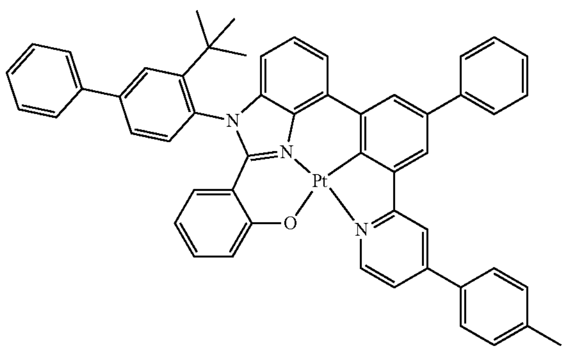
4-316
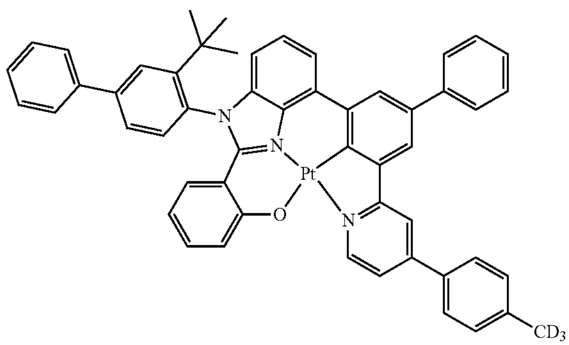
4-317
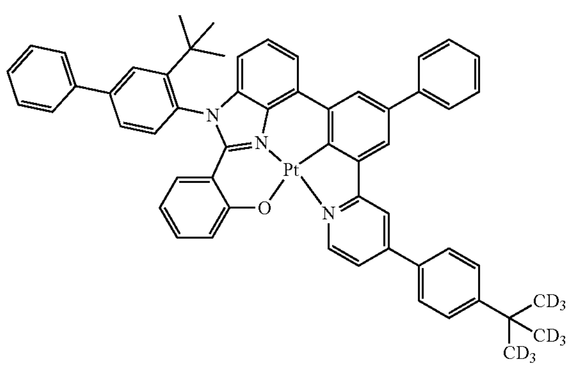
4-318
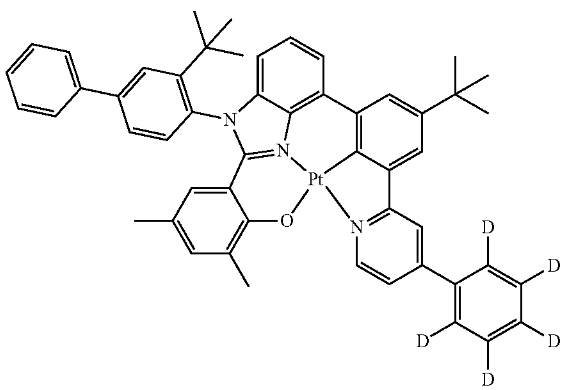
-continued
4-319
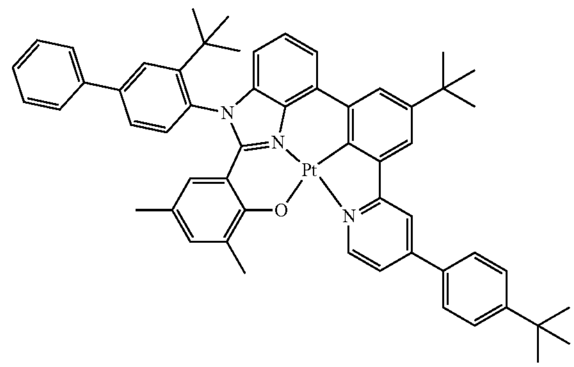
4-320
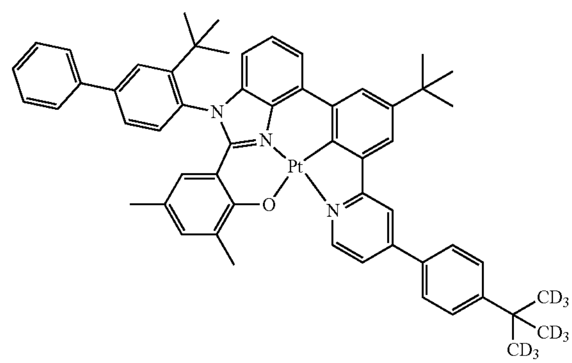
4-321
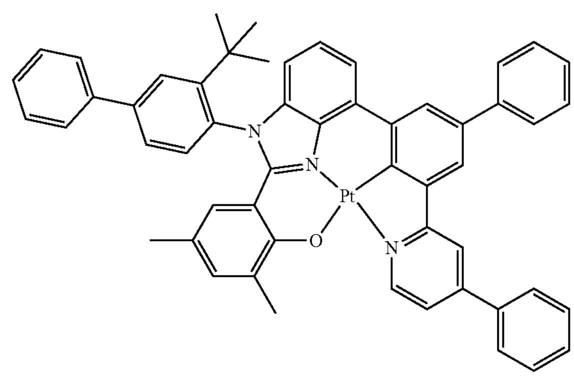
4-322
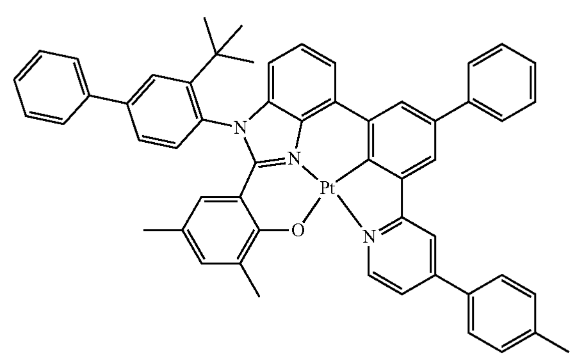

-continued
4-323
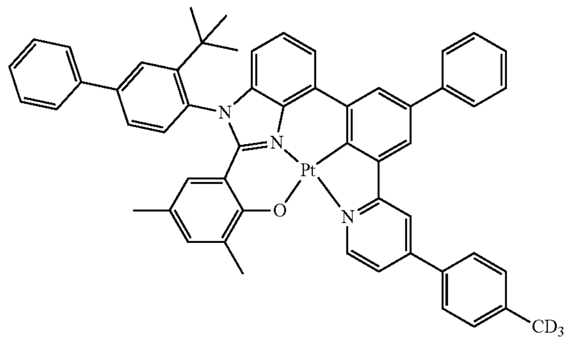
4-324
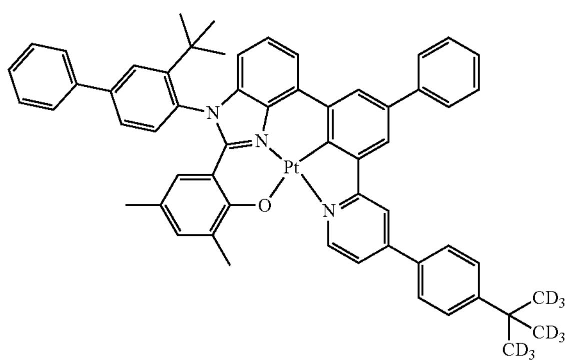
4-325
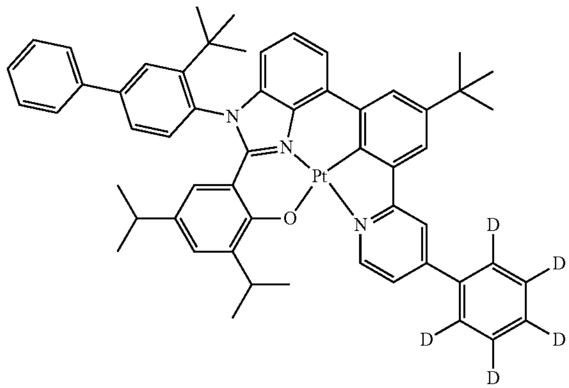
4-326
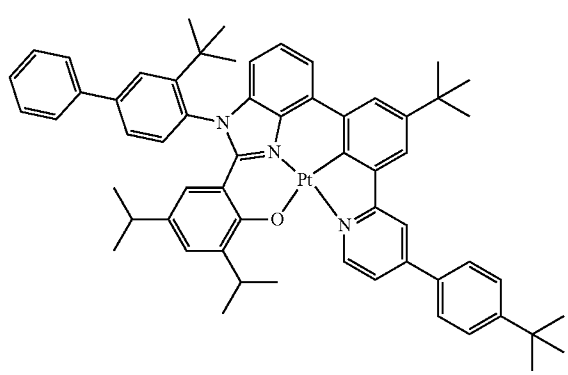
-continued
4-327
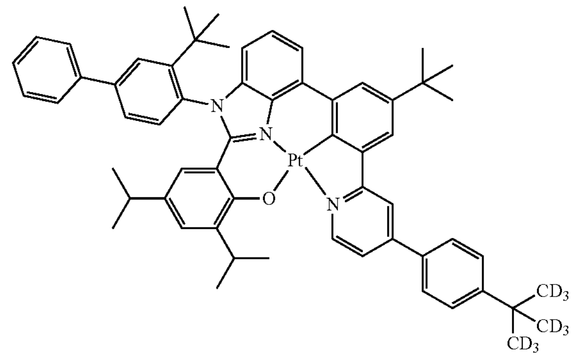
4-328
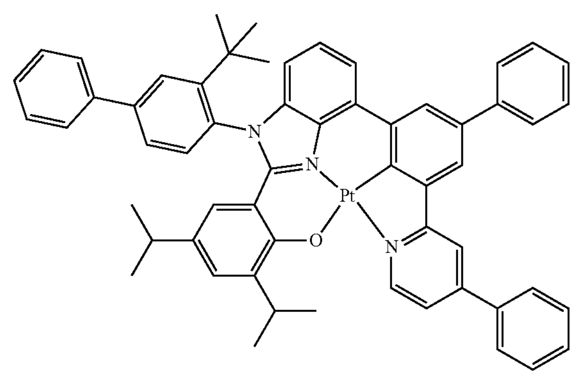
4-329
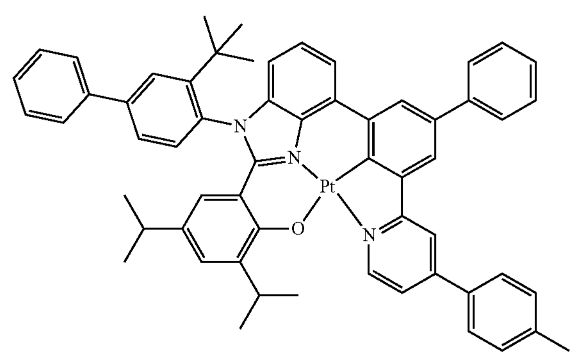
4-330
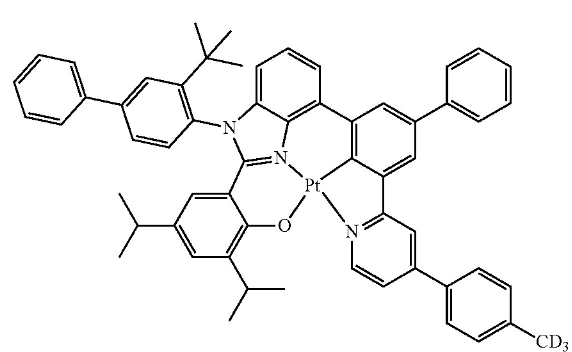

4-331
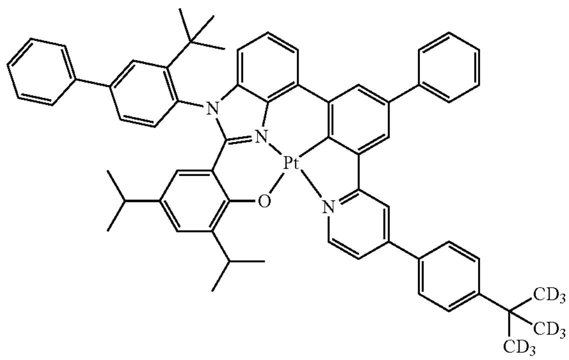
4-332
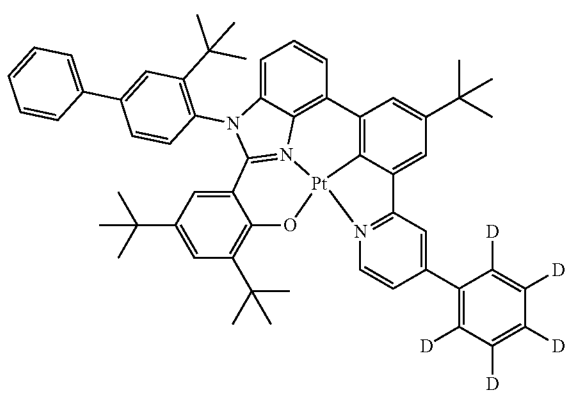
4-333
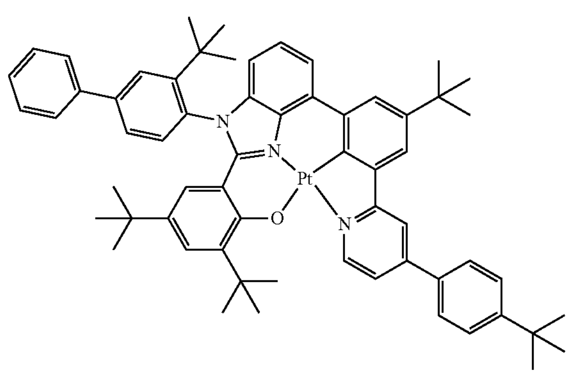
4-334
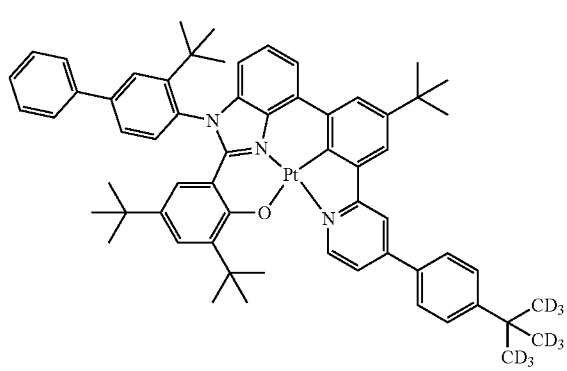
4-335
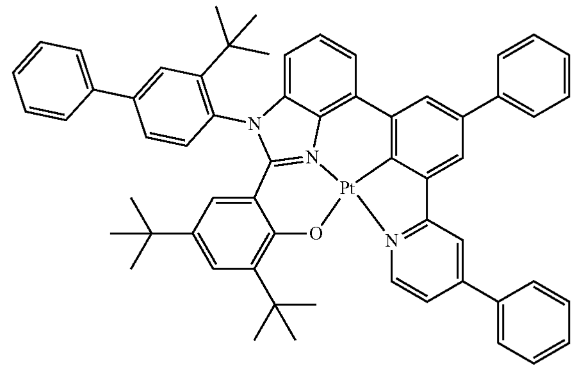
4-336
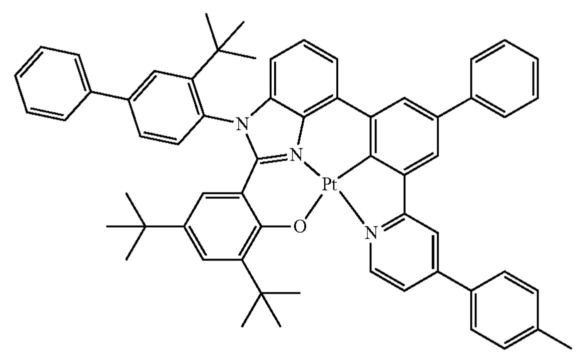
4-337
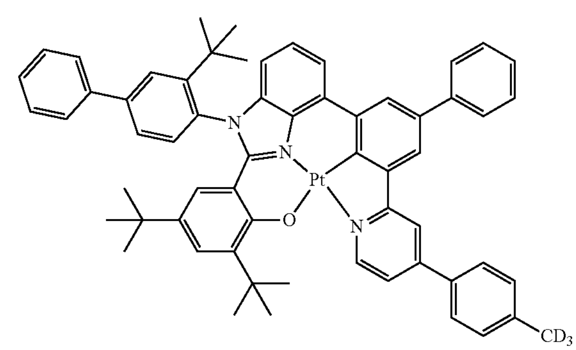
4-338
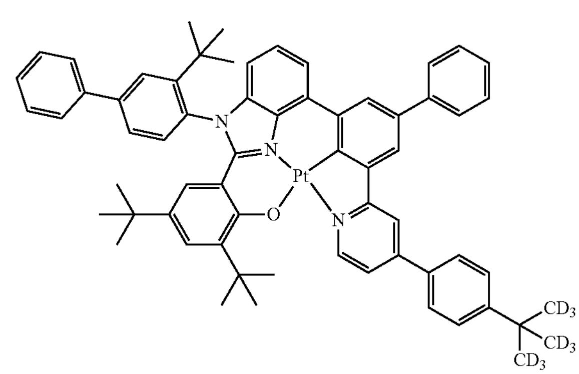

4-339
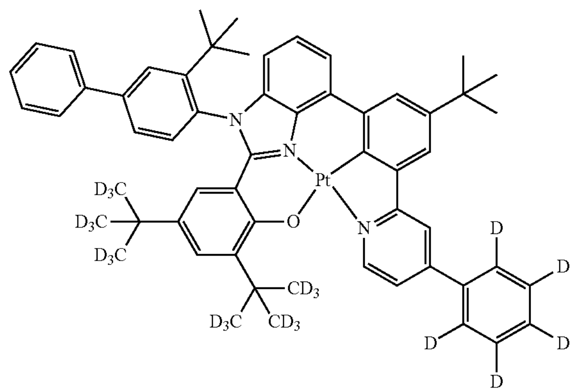
4-340
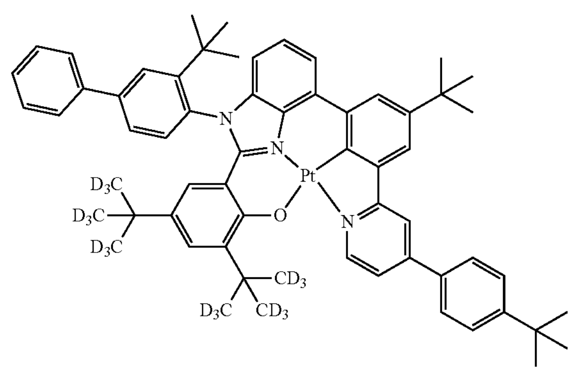
4-341
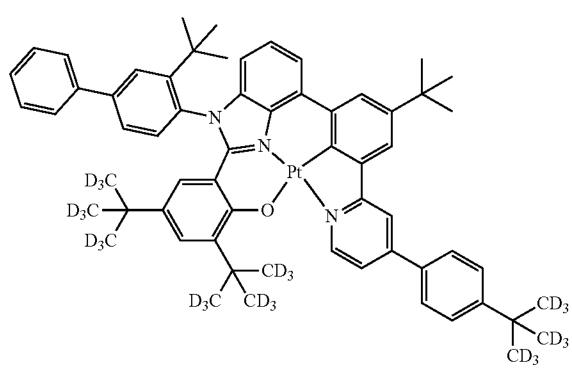
4-342
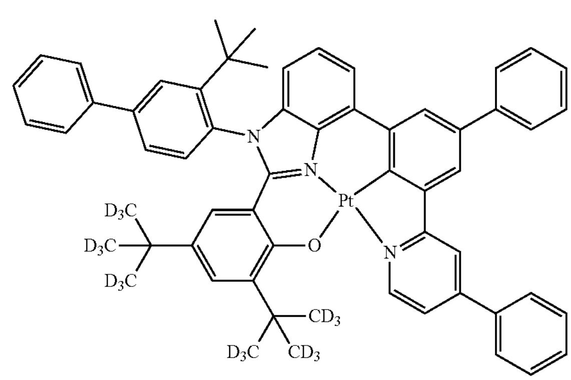
4-343
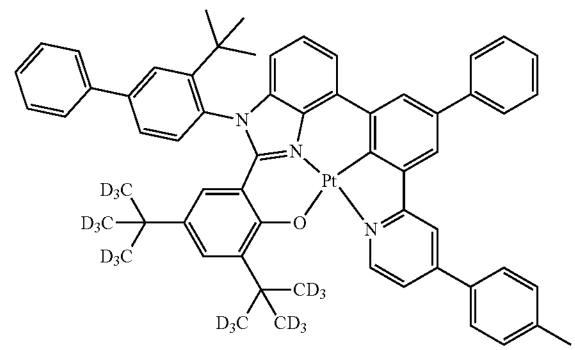
4-344
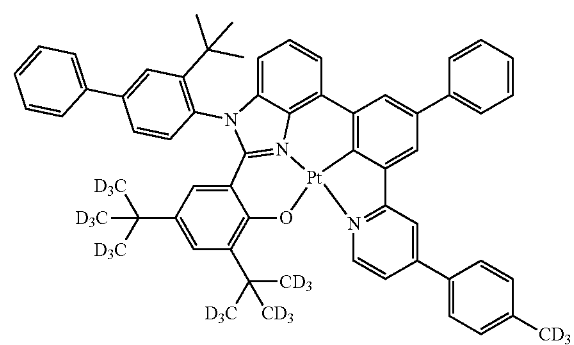
4-345
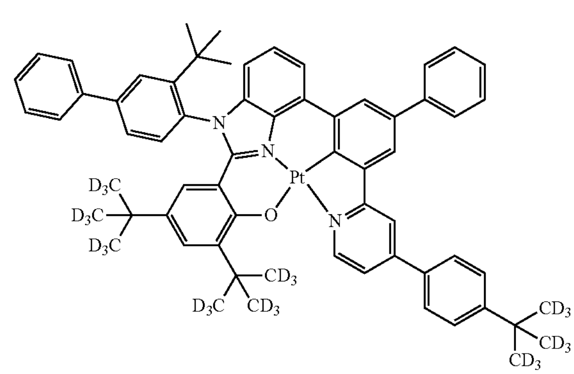
4-346
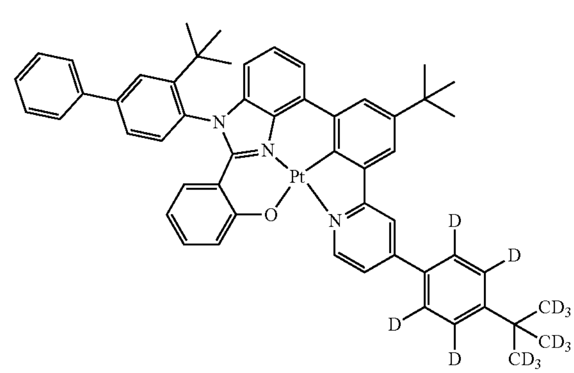

-continued
4-347
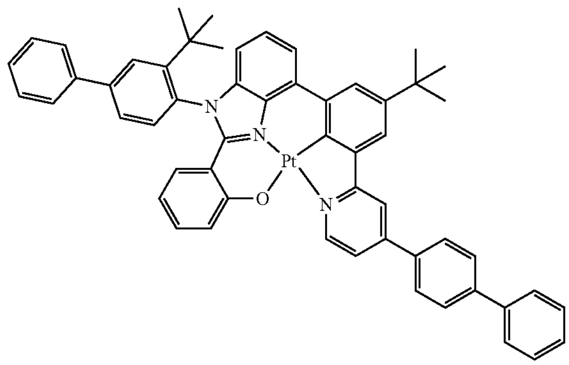
4-348
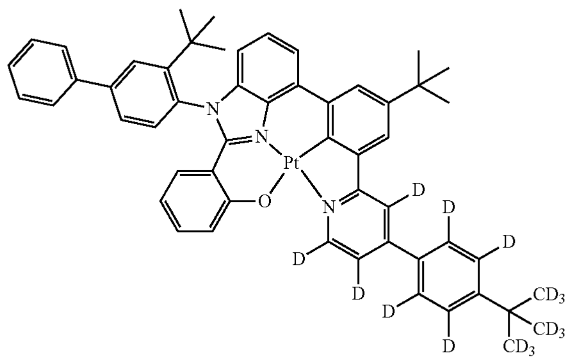
4-349
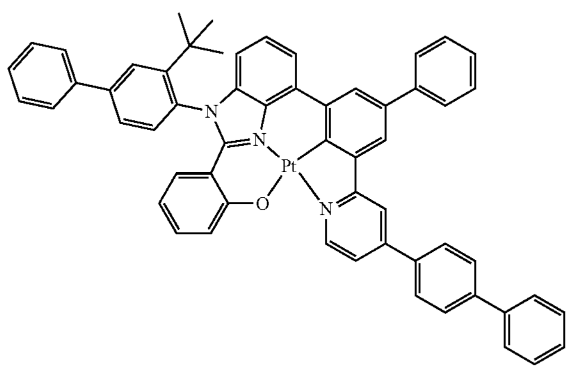
4-350
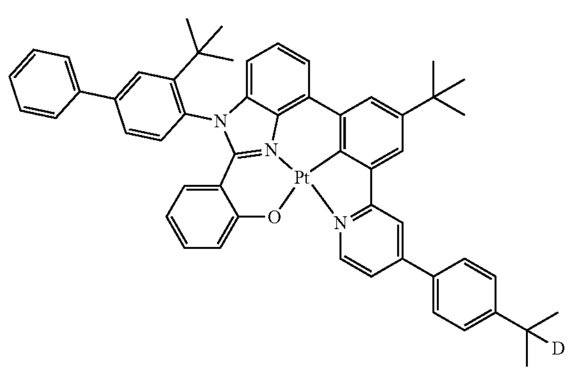
-continued
4-351
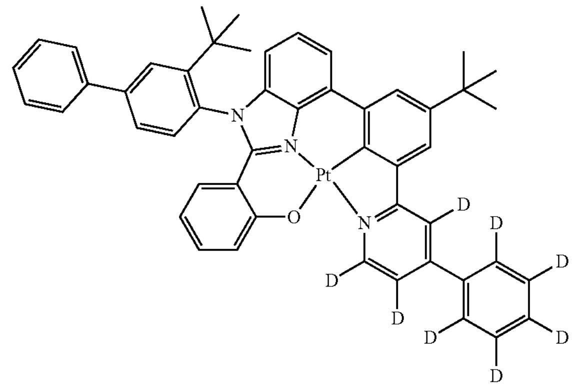
4-352
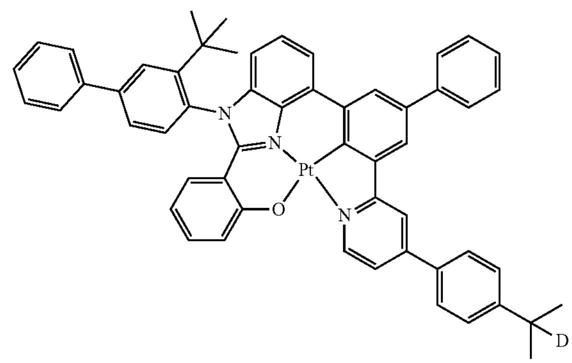
4-353
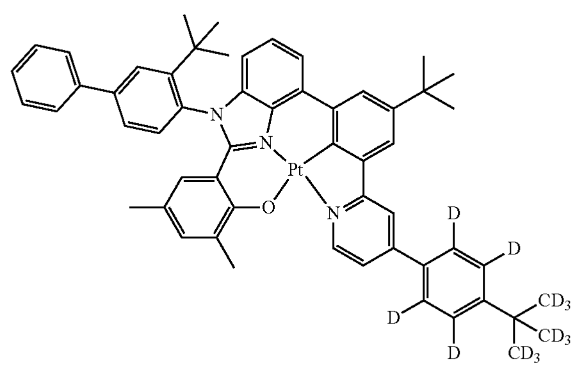
4-354
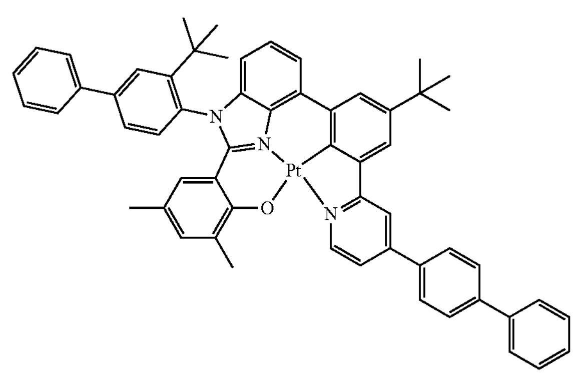

-continued
4-355
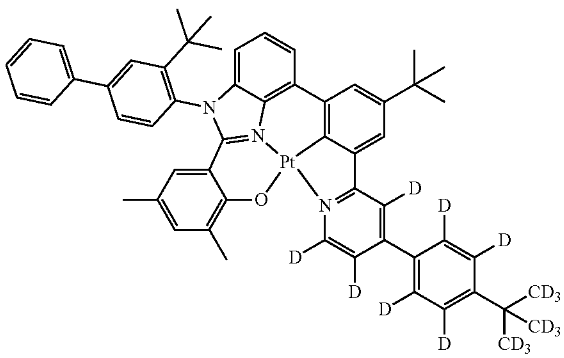
4-356
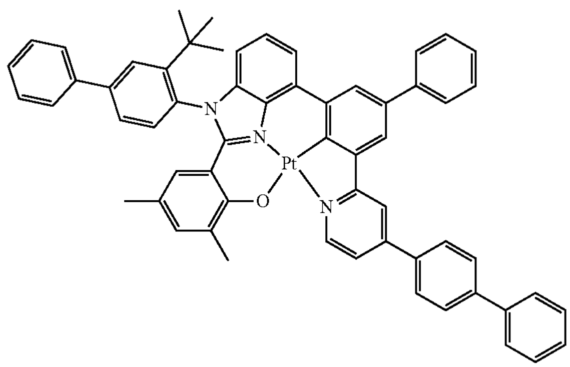
4-357
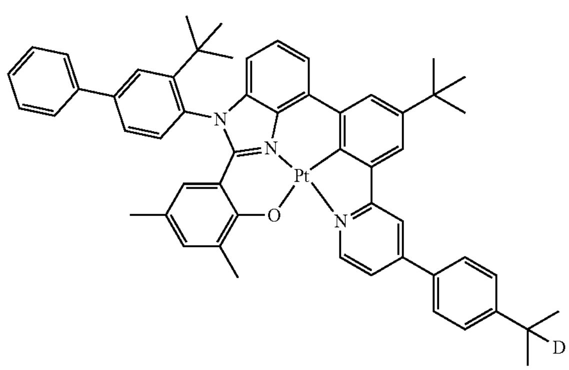
4-358
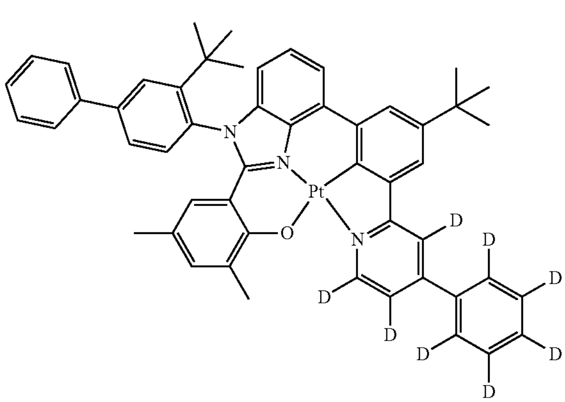
-continued
4-359
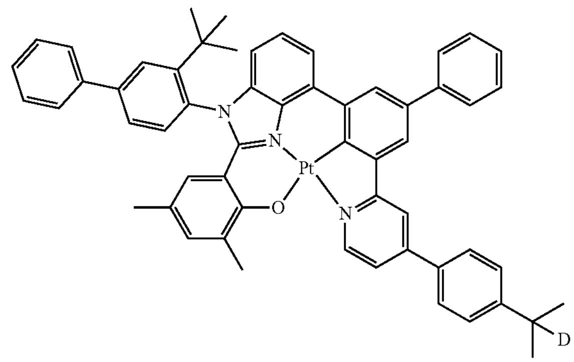
4-360
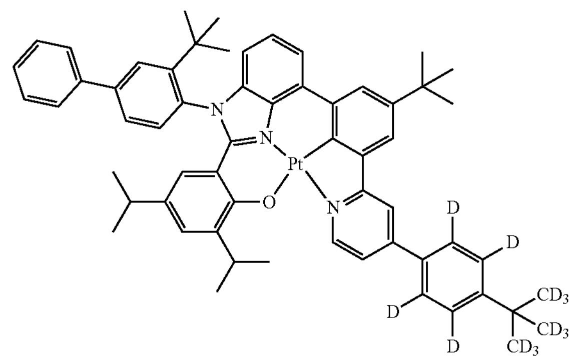
4-361
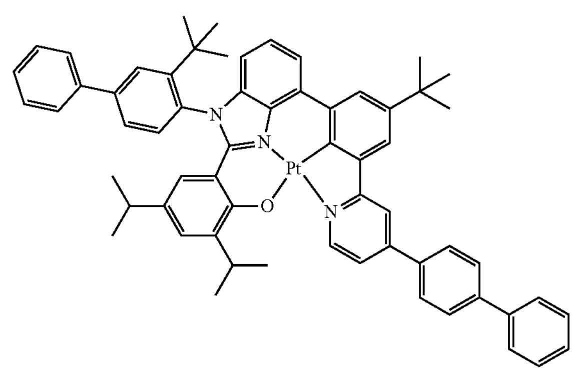
4-362
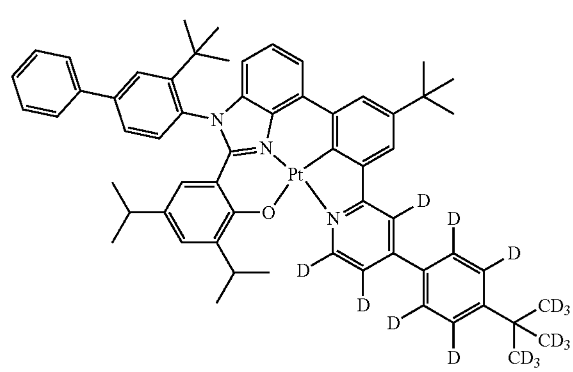

-continued
4-363
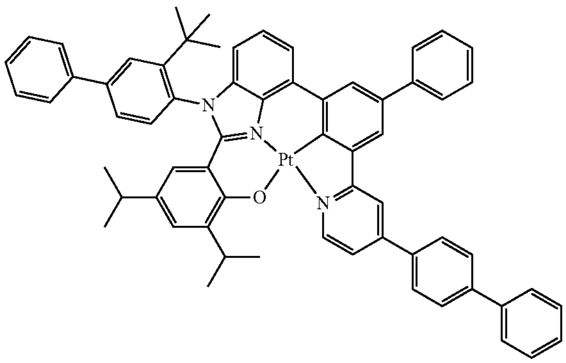
4-364
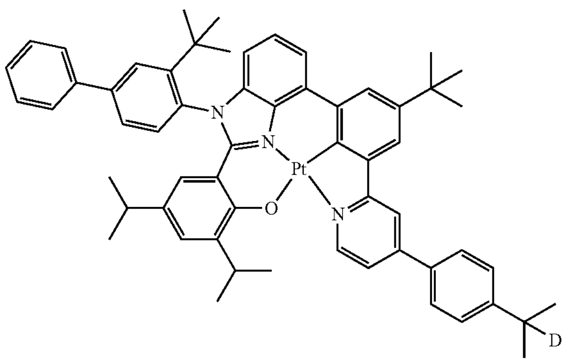
4-365
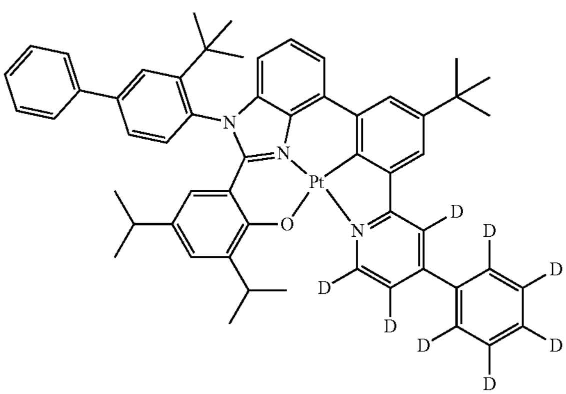
4-366
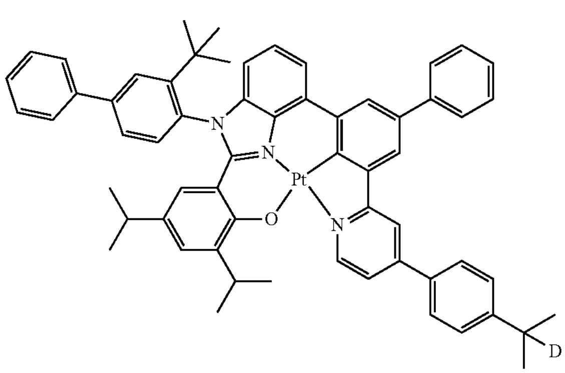
-continued
4-367
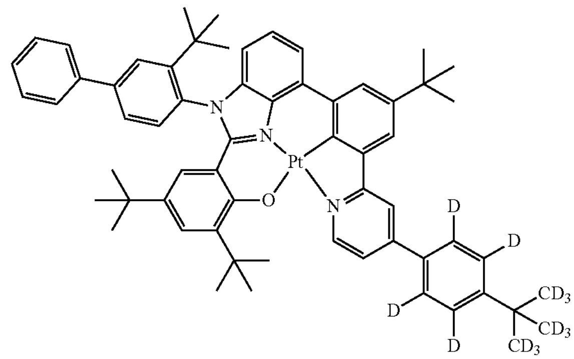
4-368
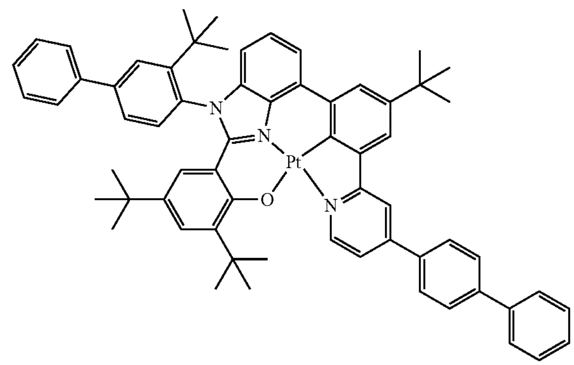
4-369
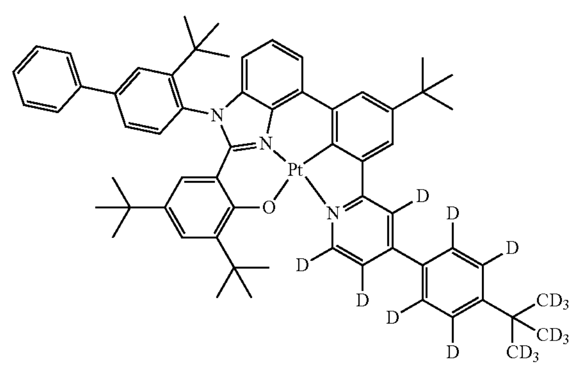
4-370
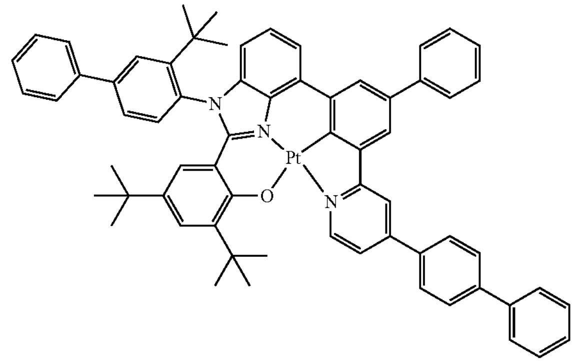

4-371
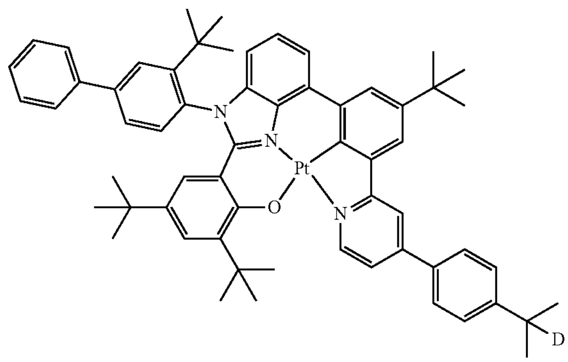
4-372
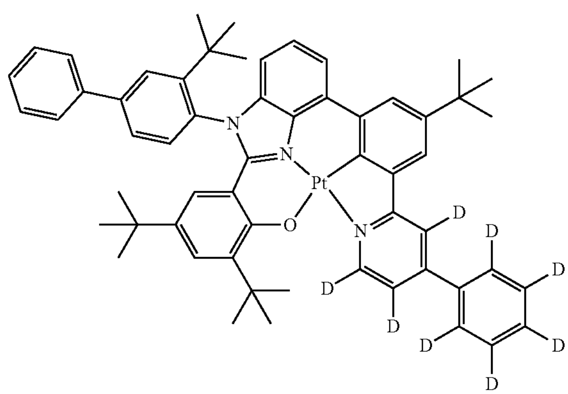
4-373
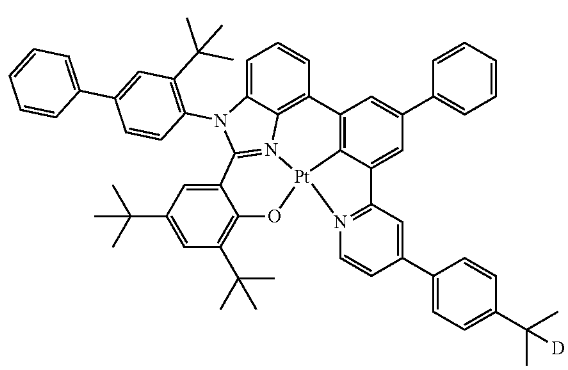
4-374
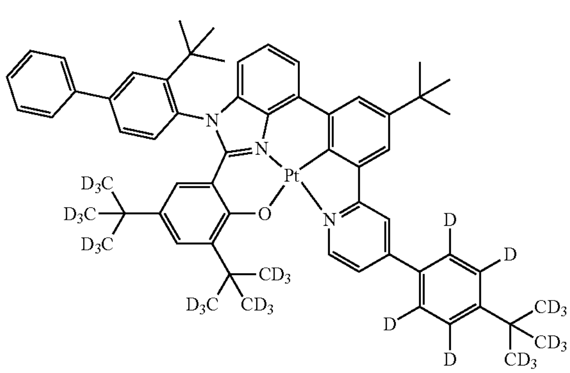
4-375
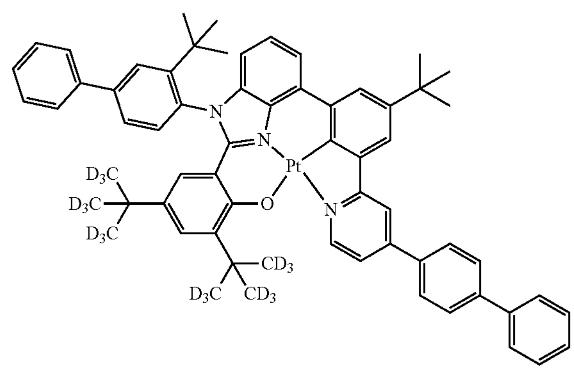
4-376
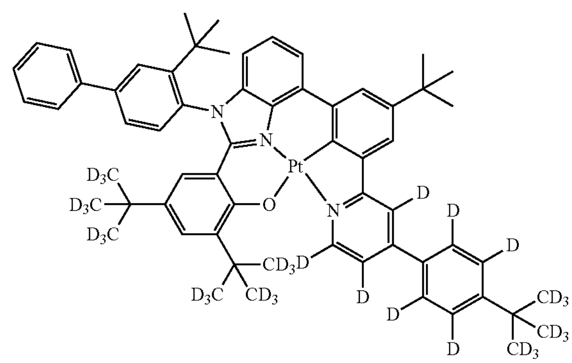
4-377
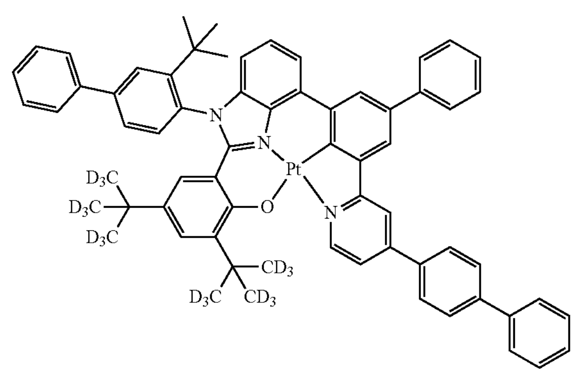
4-378
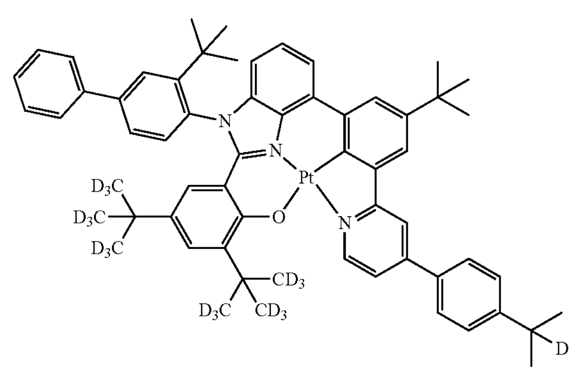

-continued
4-379
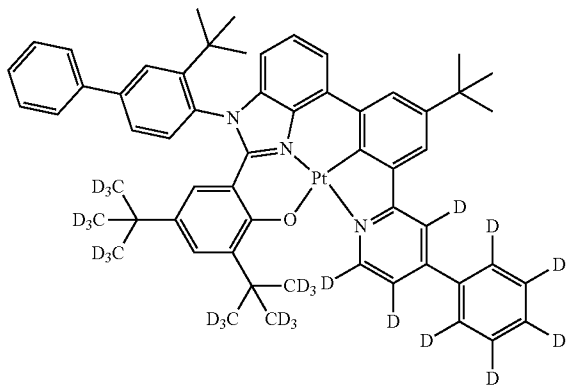
4-380
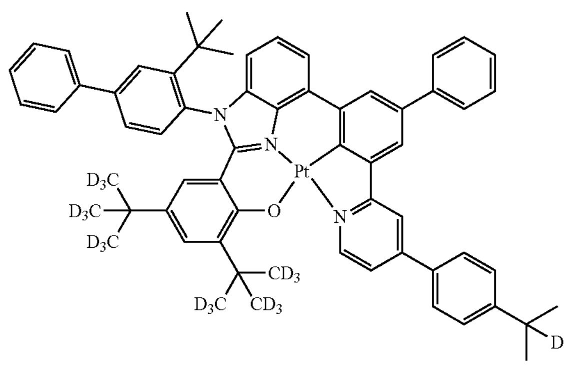
4-381
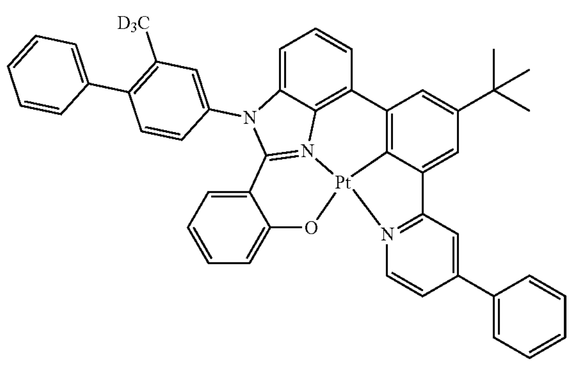
4-382
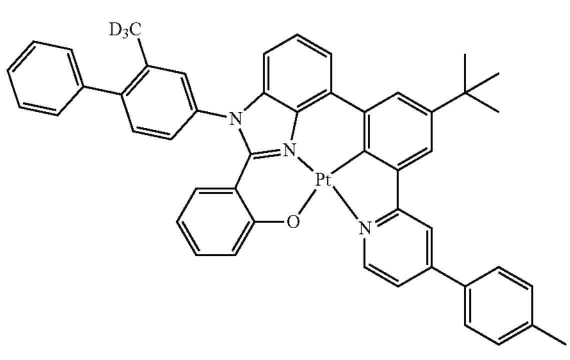
-continued
4-383
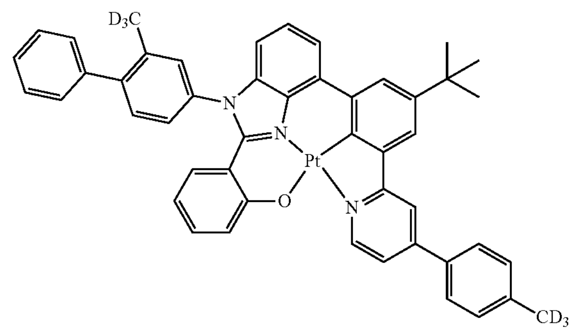
4-384
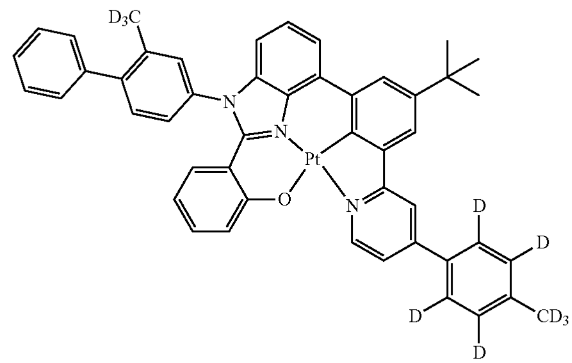
4-385
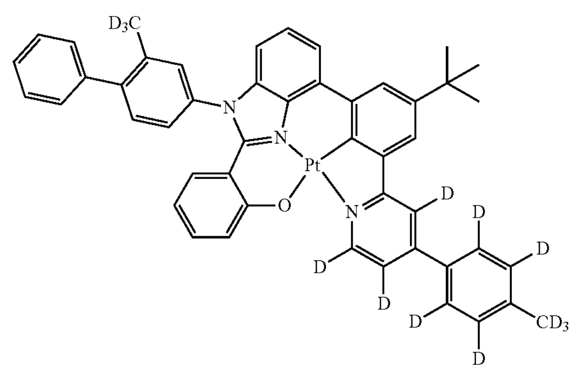
4-386
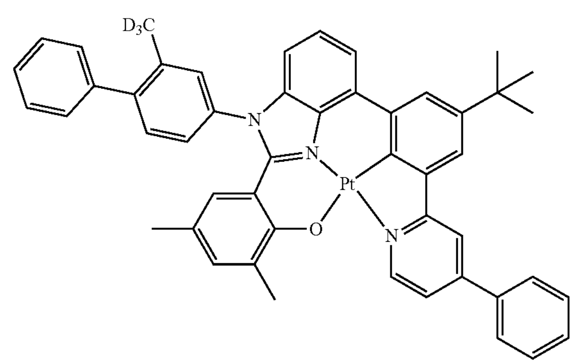

4-387
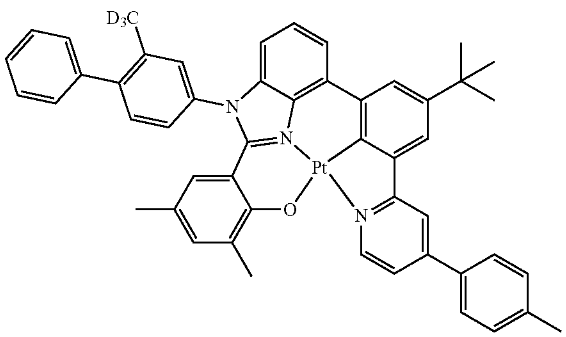
4-388
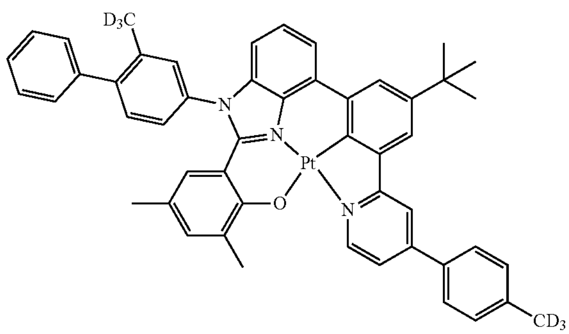
4-389
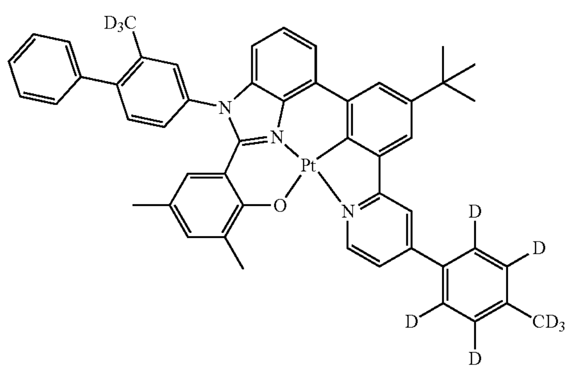
4-390
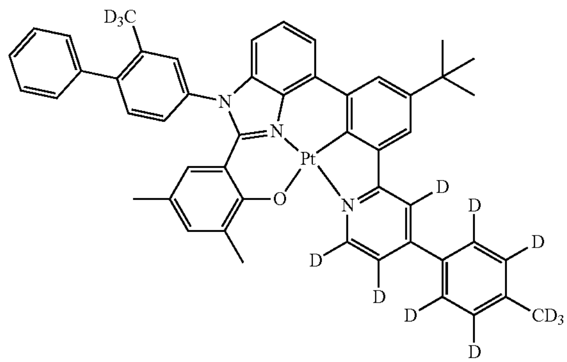
4-391
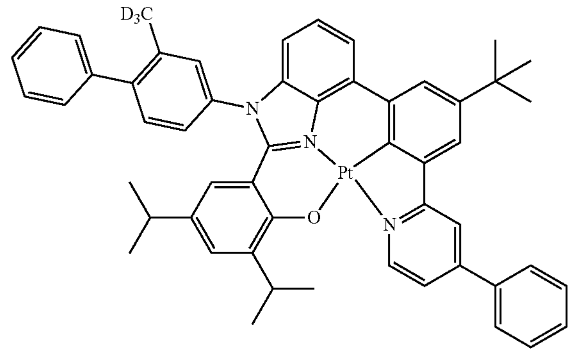
4-392
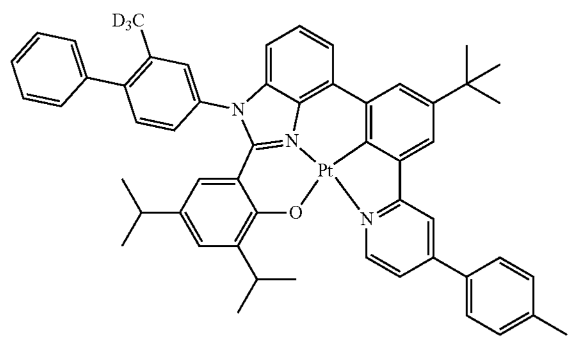
4-393
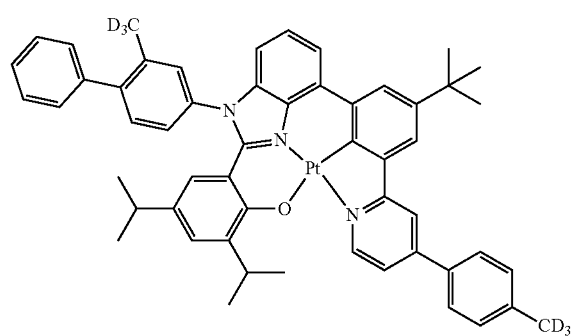
4-394
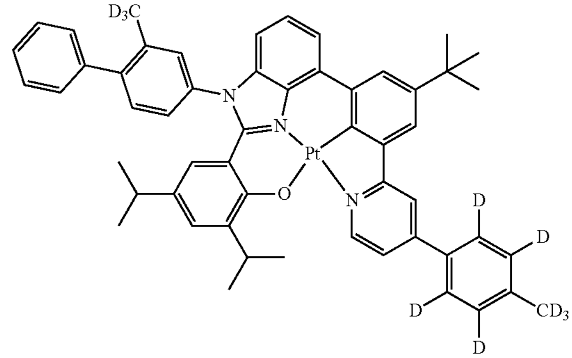

-continued
4-395
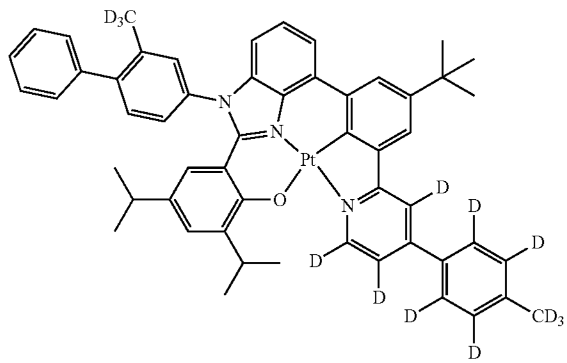
4-396
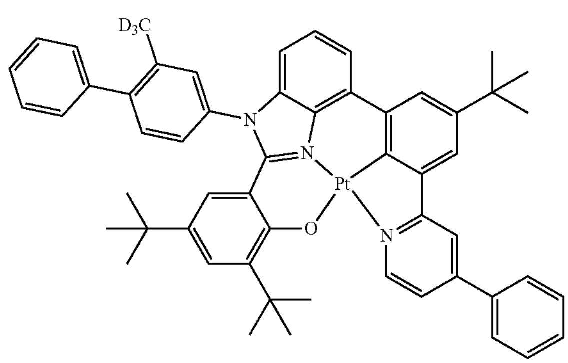
4-397
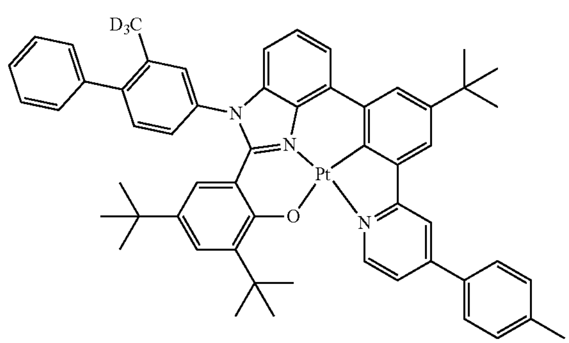
4-398
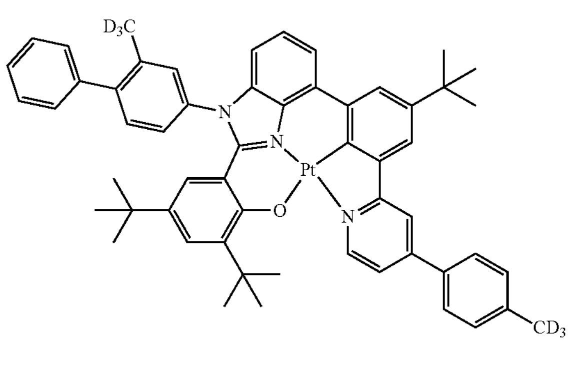
-continued
4-399
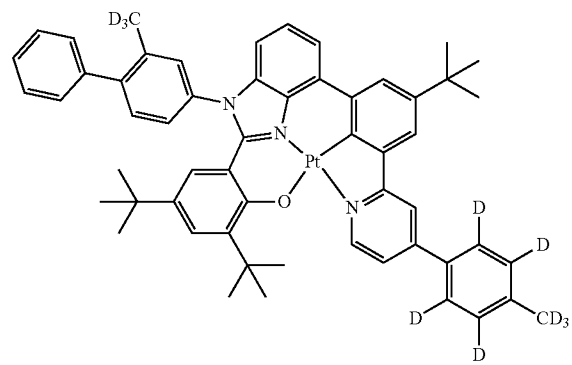
4-400
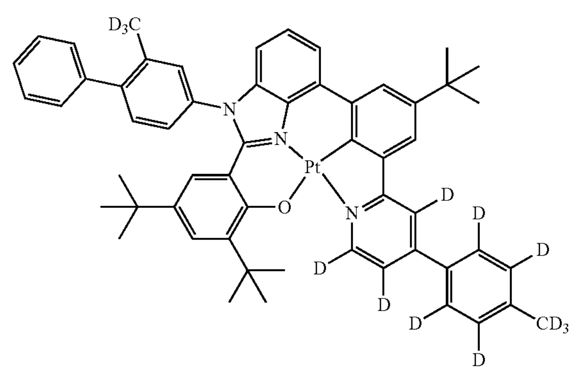
4-401
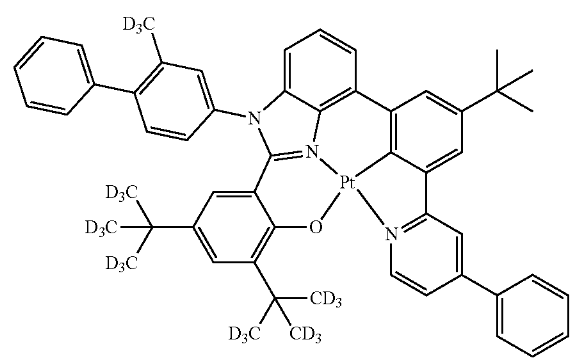
4-402
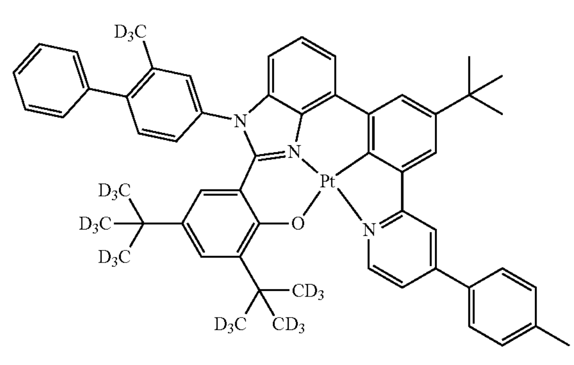

4-403
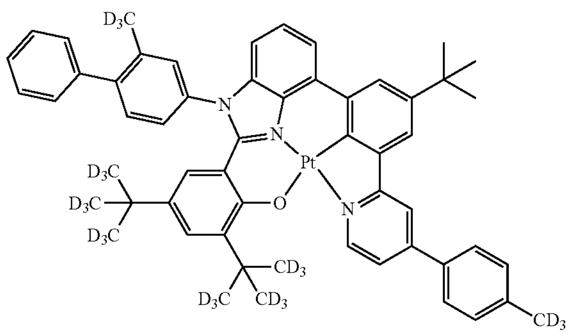
4-404
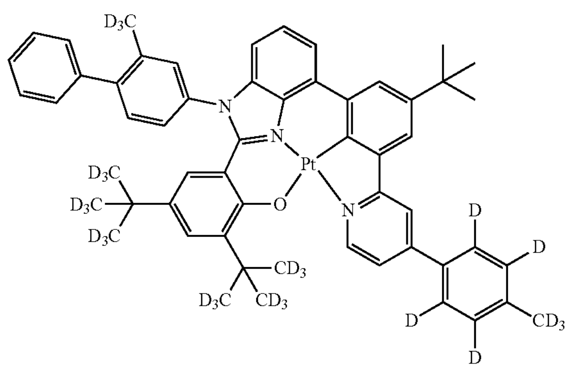
4-405
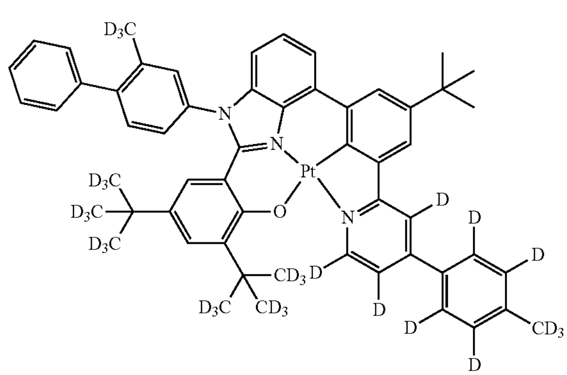
4-406
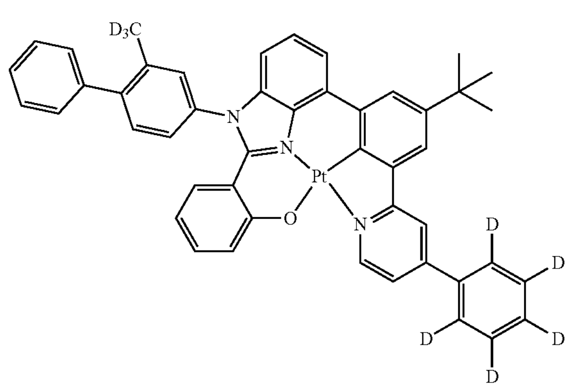
4-407
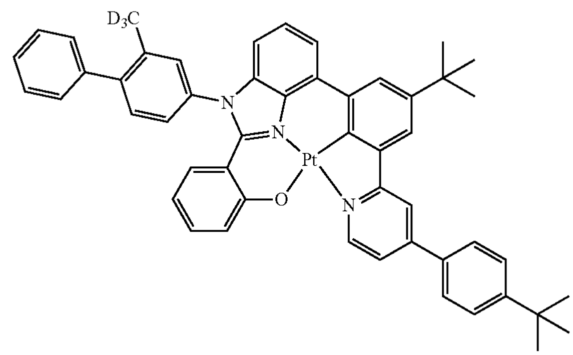
4-408
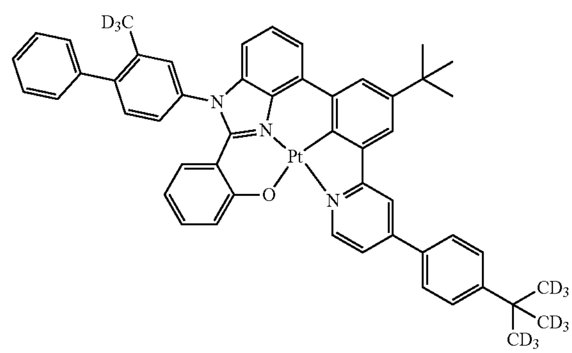
4-409
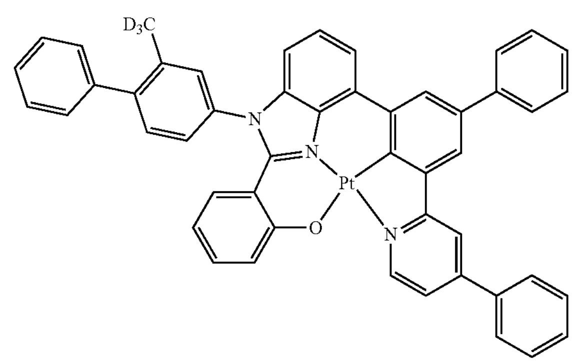
4-410
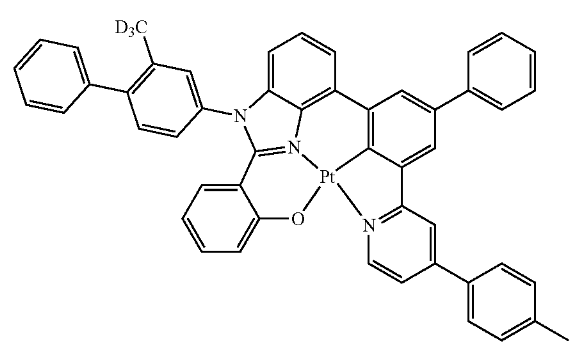

4-411
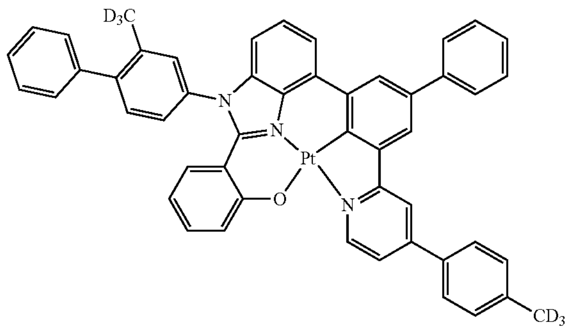
4-412
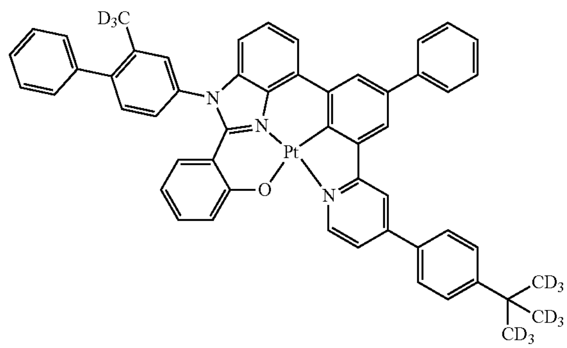
4-413
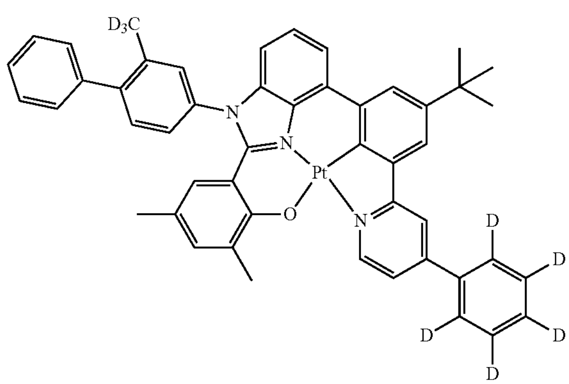
4-414
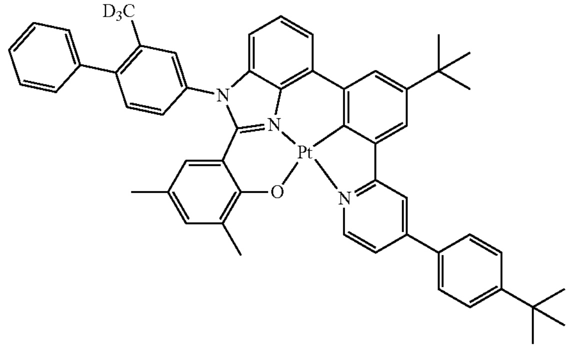
4-415
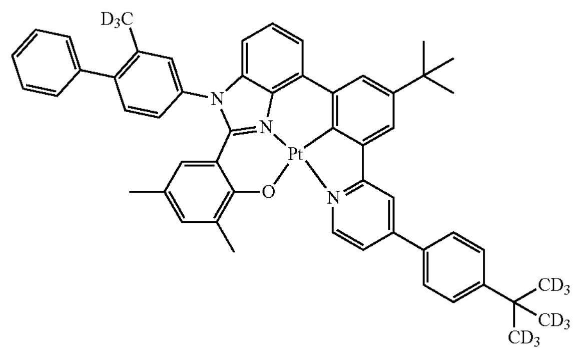
4-416
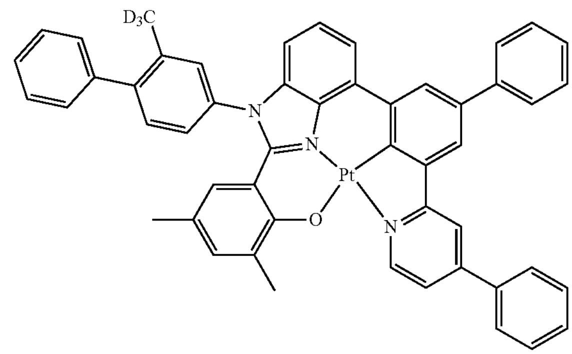
4-417
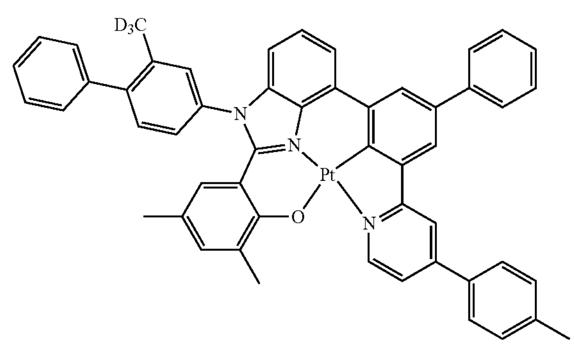
4-418
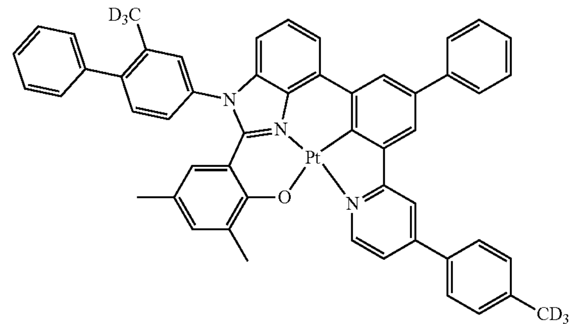

-continued
4-419
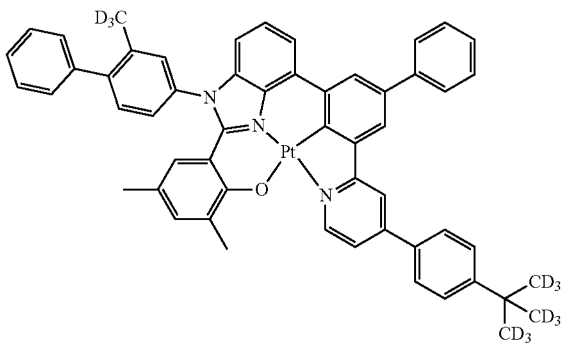
4-420
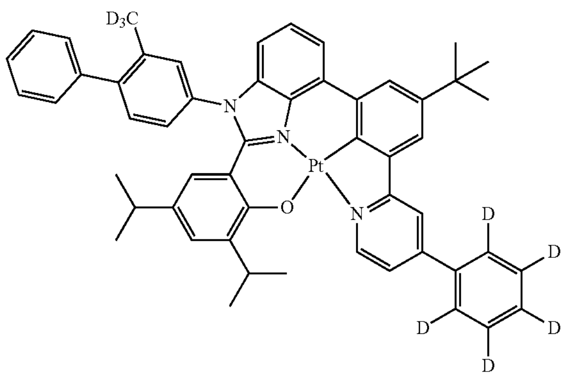
4-421
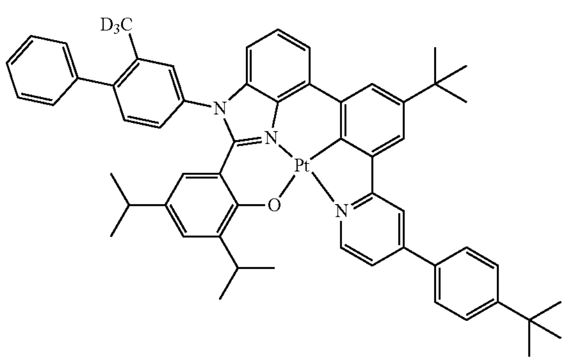
4-422
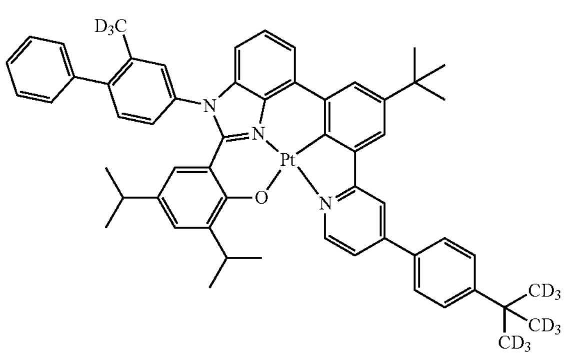
-continued
4-423
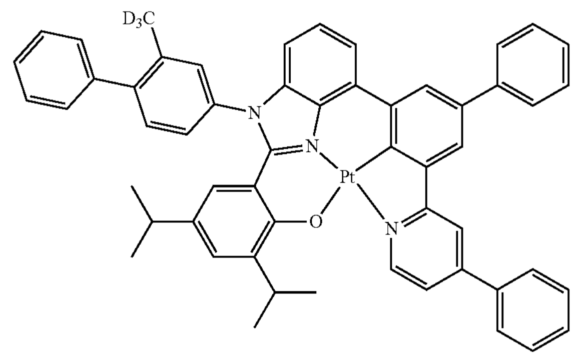
4-424
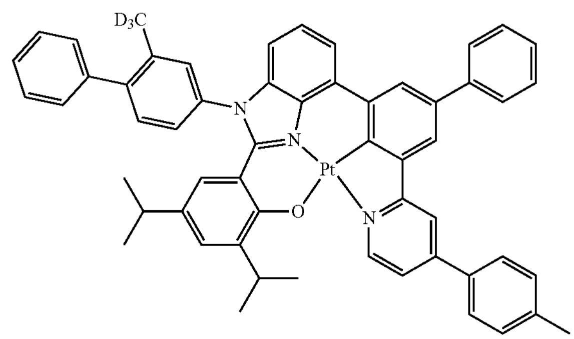
4-425
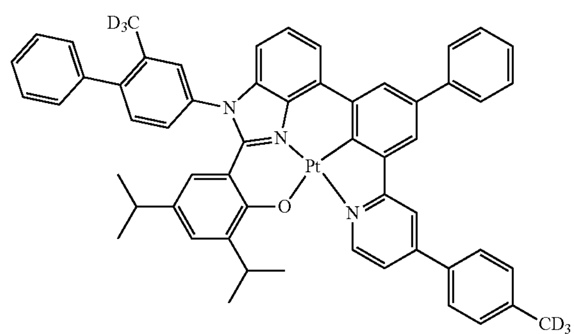
4-426
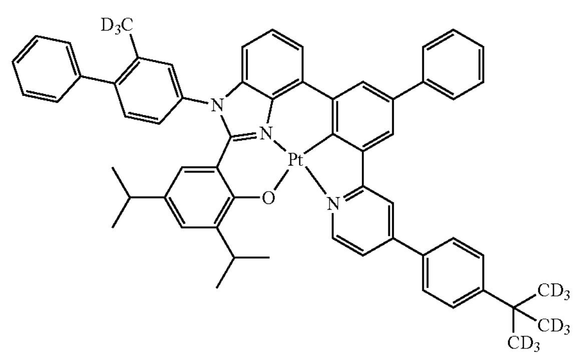

4-427
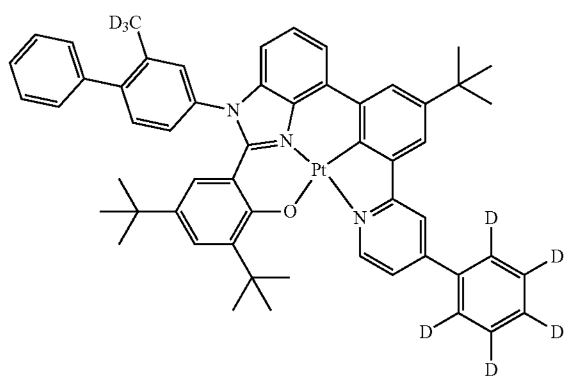
4-428
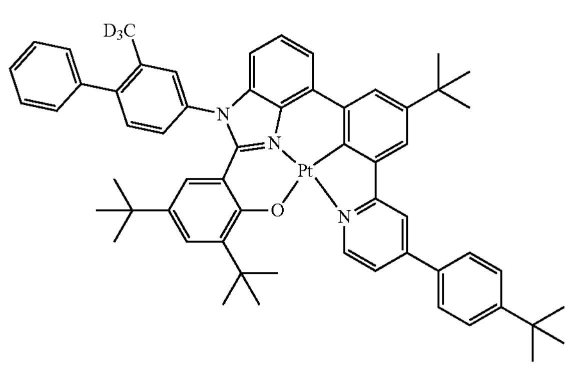
4-429
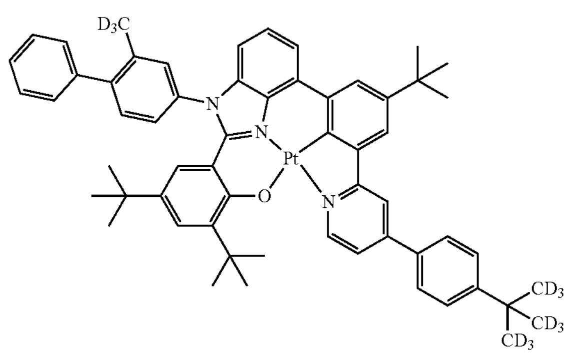
4-430
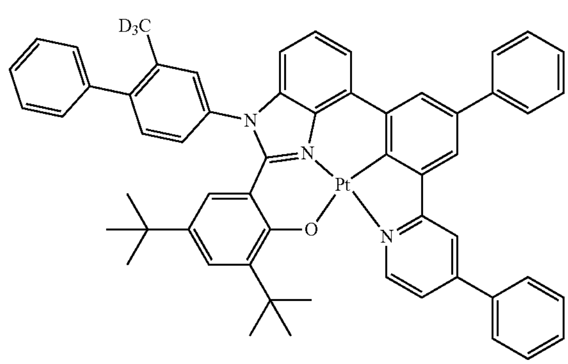
4-431
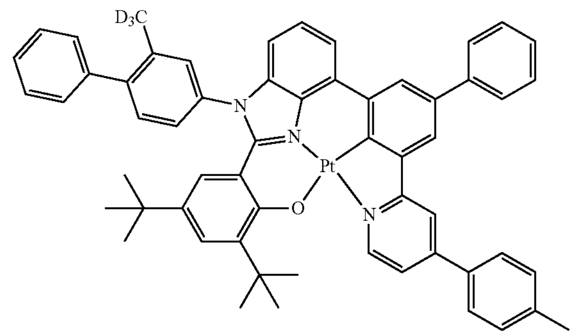
4-432
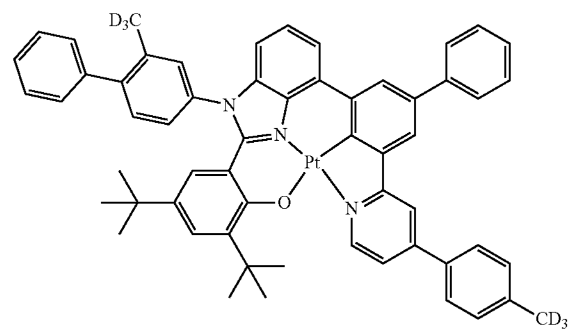
4-433
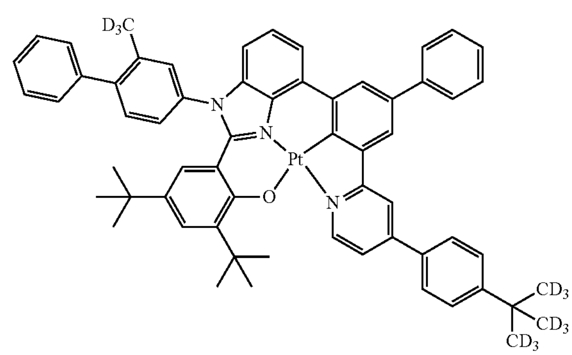
4-434
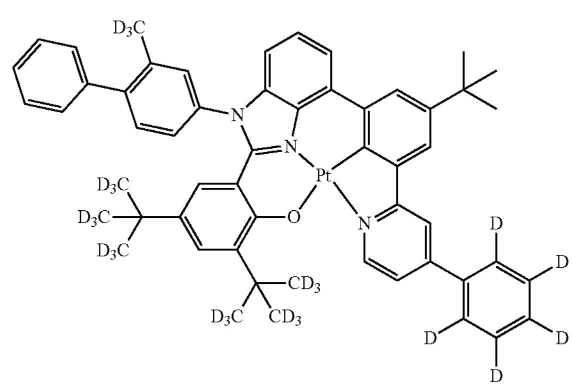

4-435
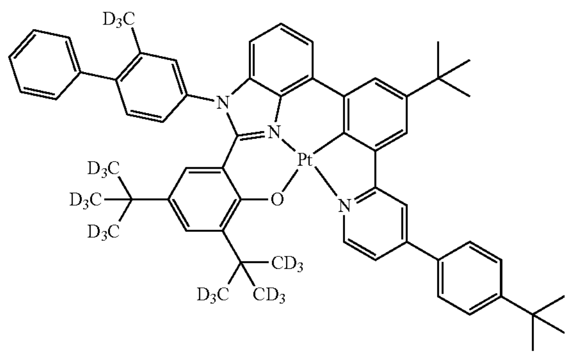
4-436
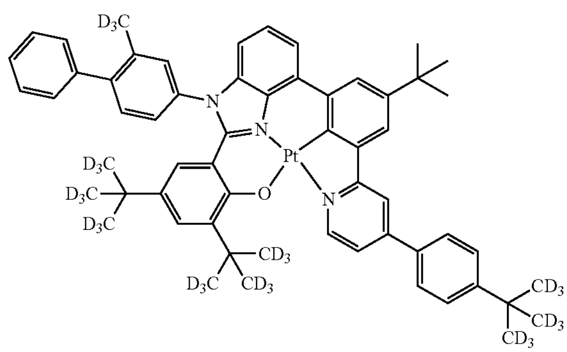
4-437
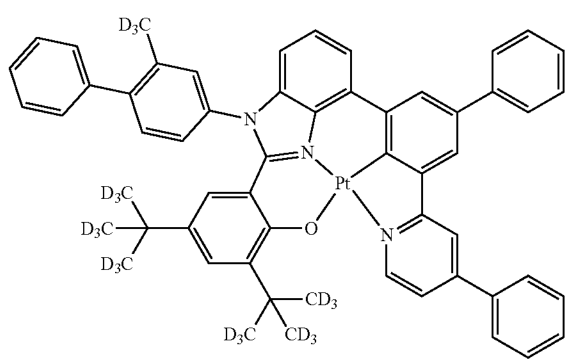
4-438
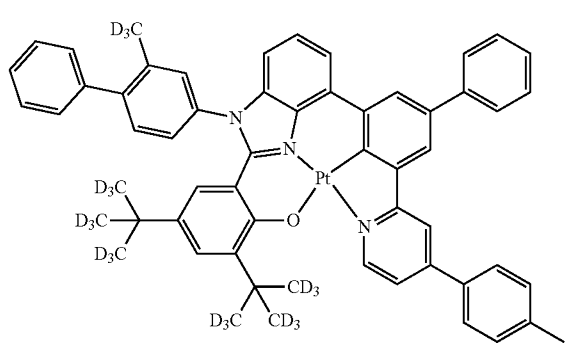
4-439
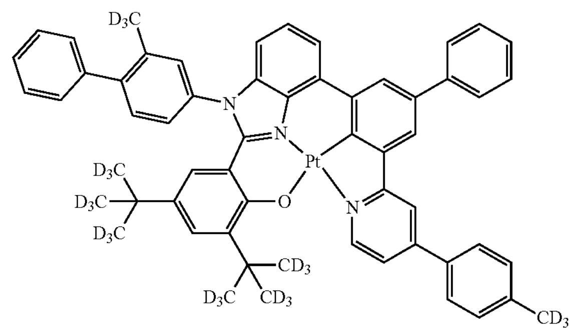
4-440
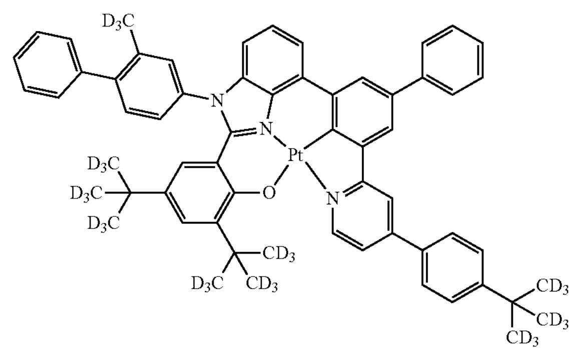
4-441
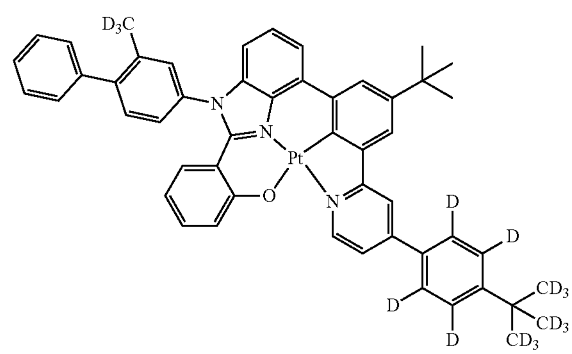
4-442
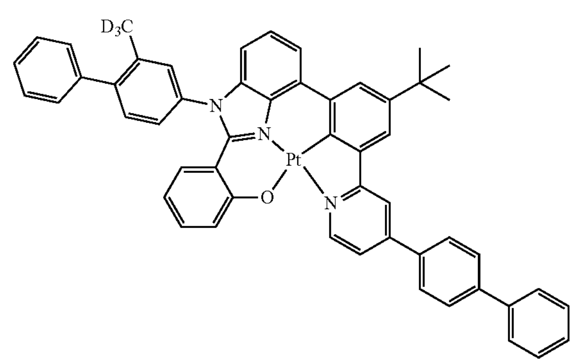

4-443
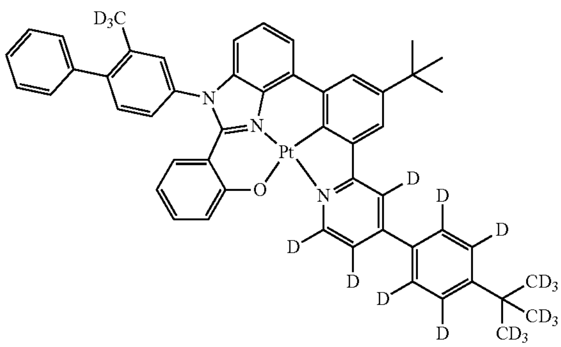
4-444
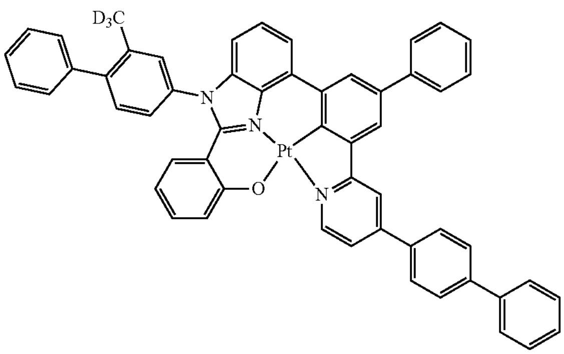
4-445
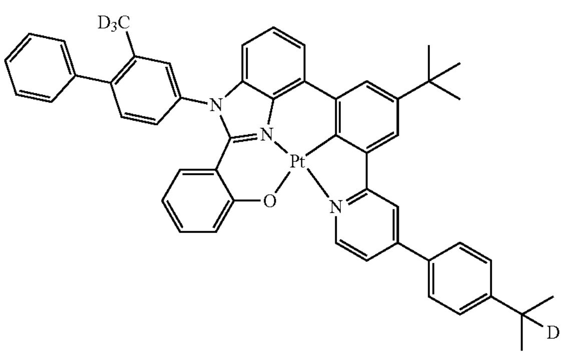
4-446
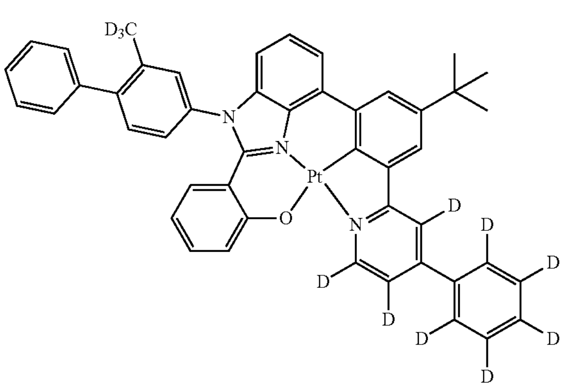
4-447
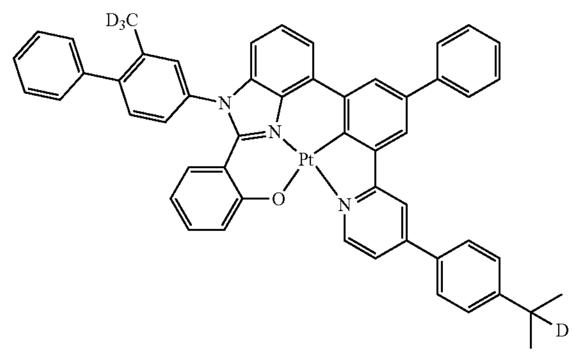
4-448
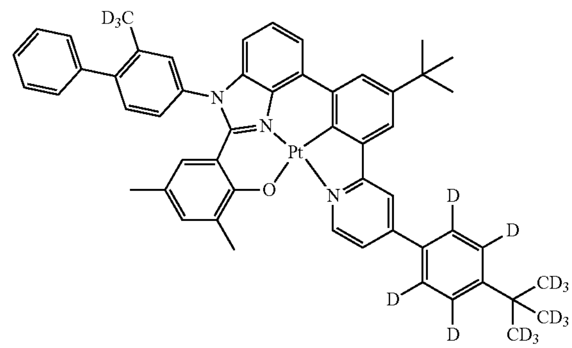
4-449
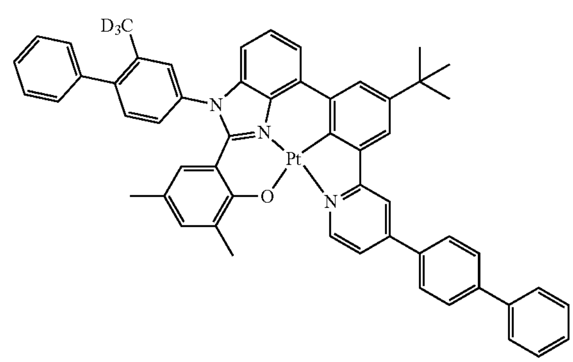
4-450
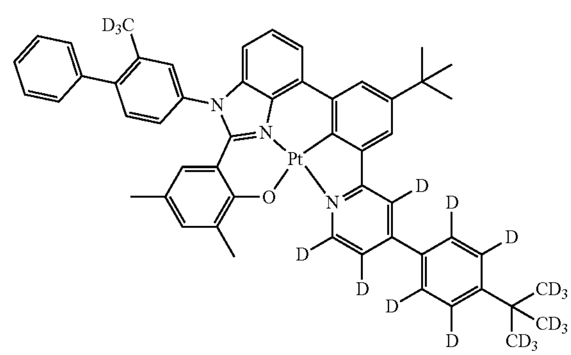

-continued
4-451
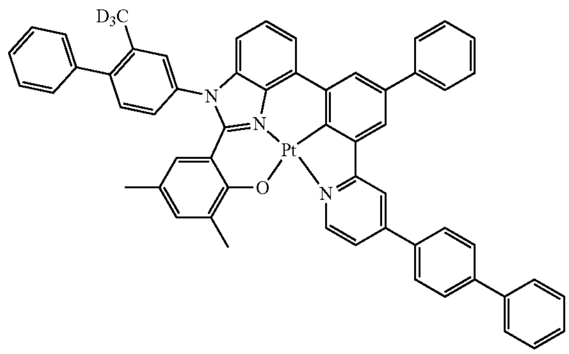
4-452
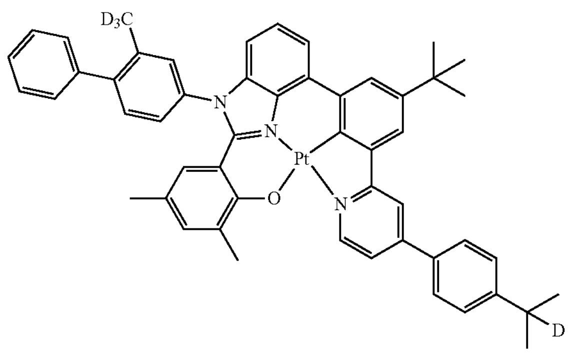
4-453
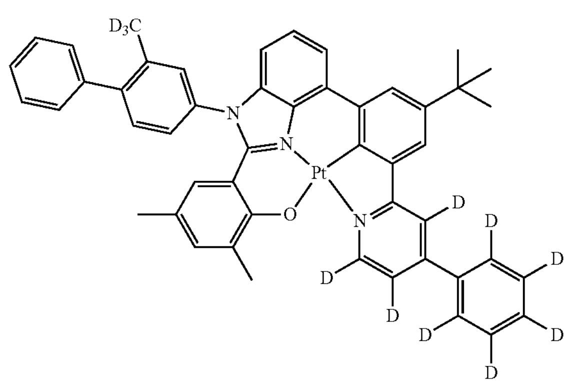
4-454
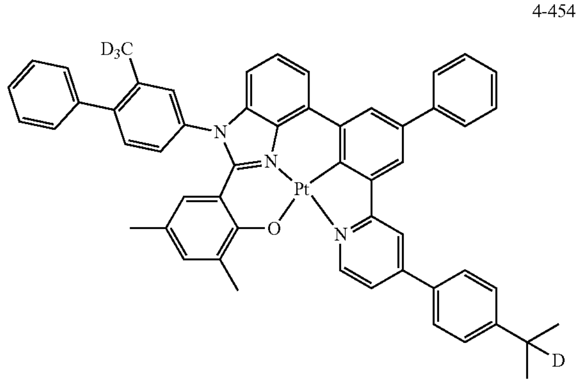
-continued
4-455
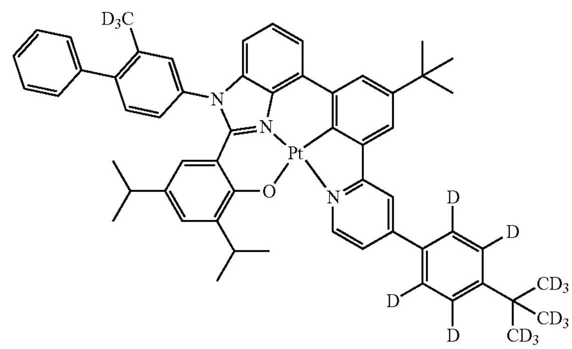
4-456
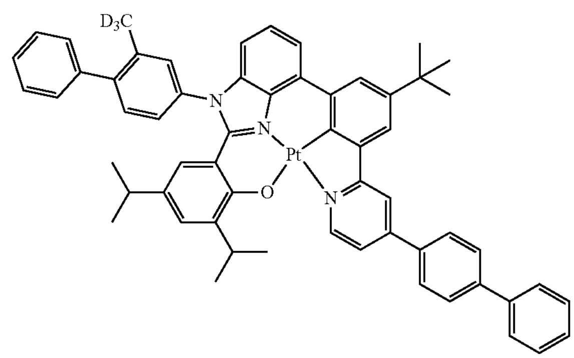
4-457
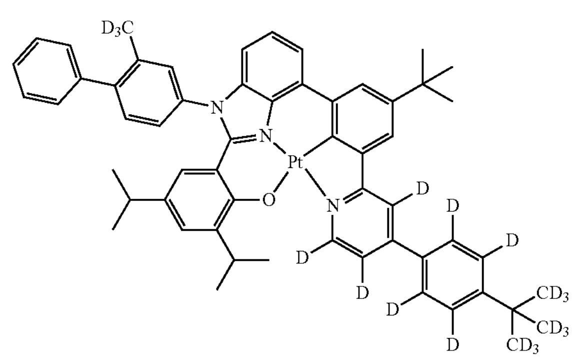
4-458
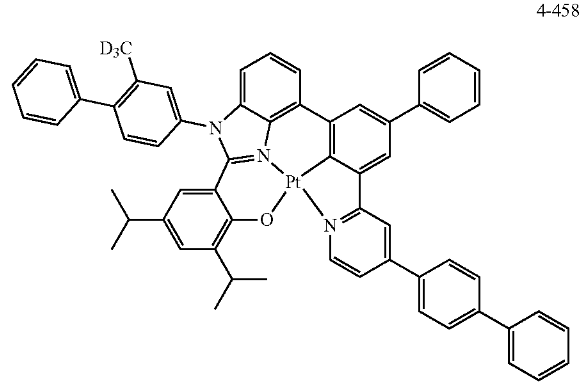

-continued
4-459
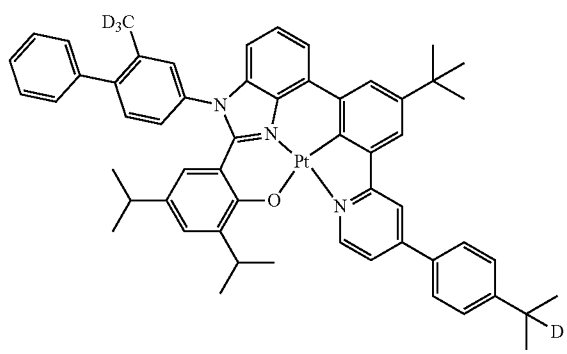
4-460
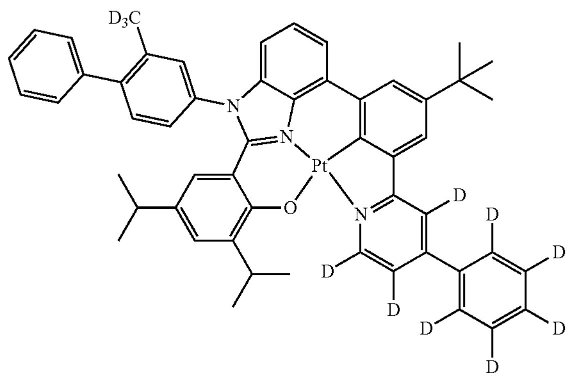
4-461
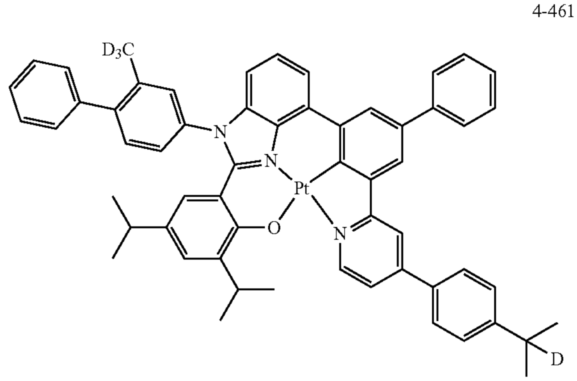
4-462
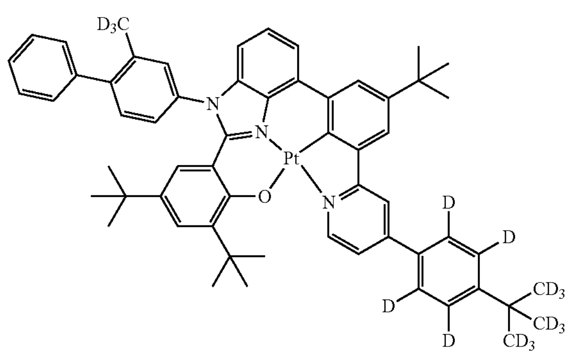
-continued
4-463
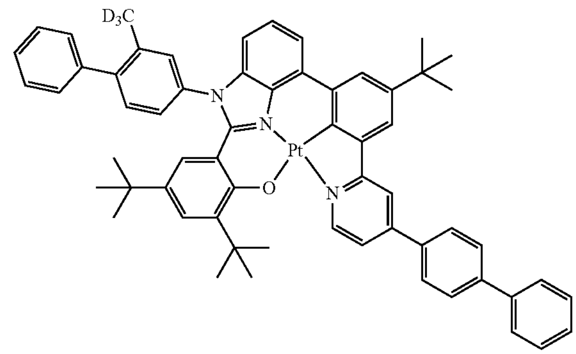
4-464
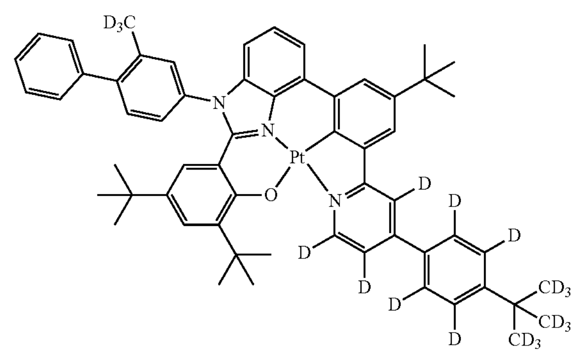
4-465
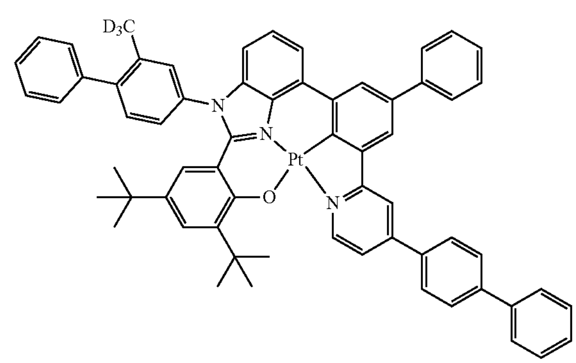
4-466
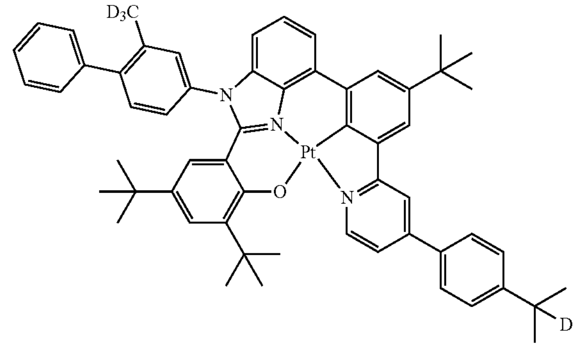

-continued
4-467
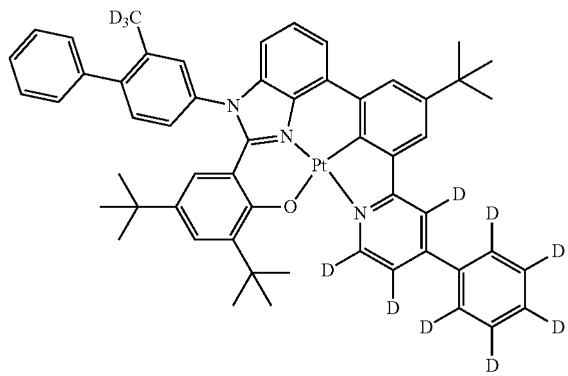
4-468
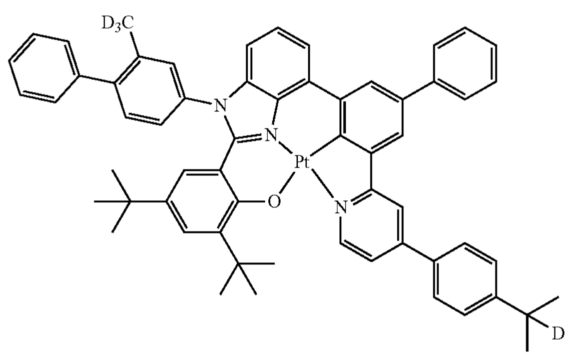
4-469
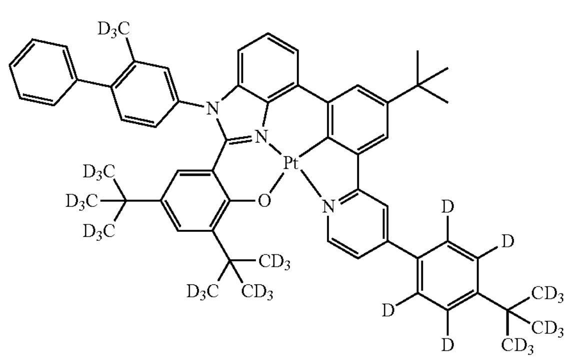
4-470
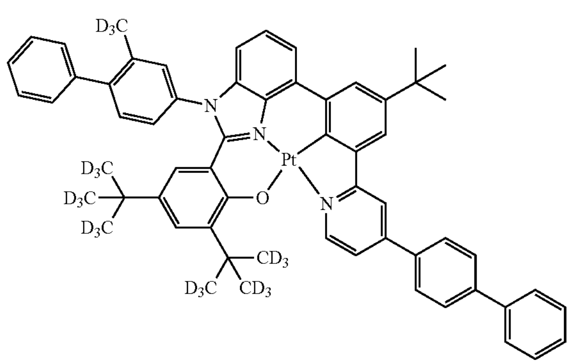
-continued
4-471
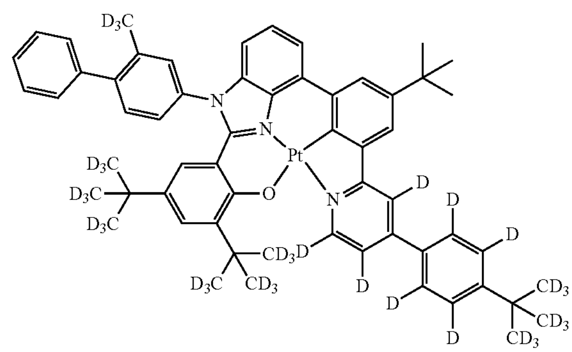
4-472
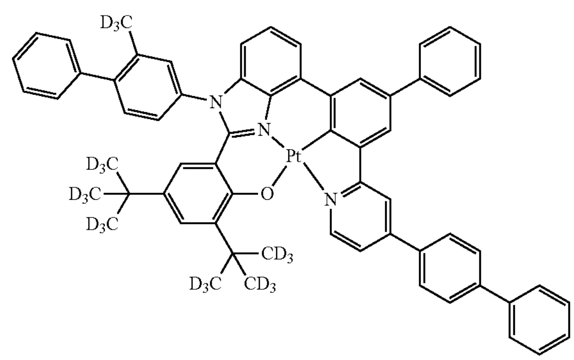
4-473
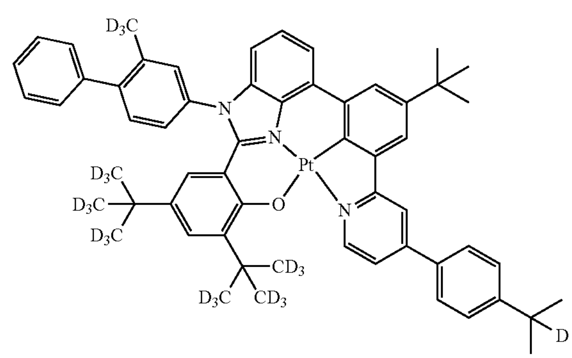
4-474
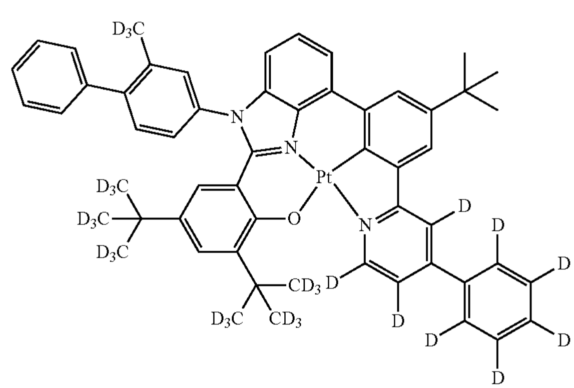

4-475
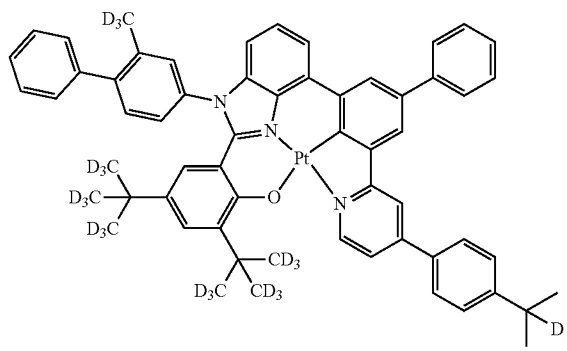
4-476
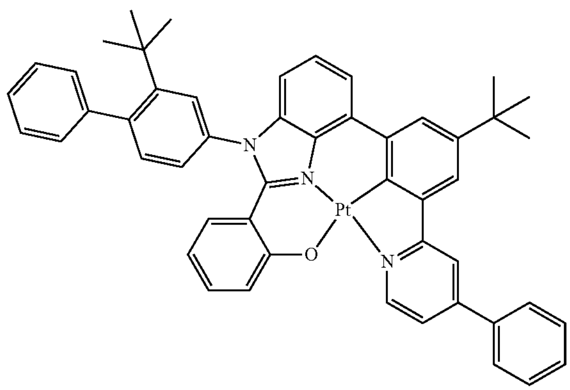
4-477
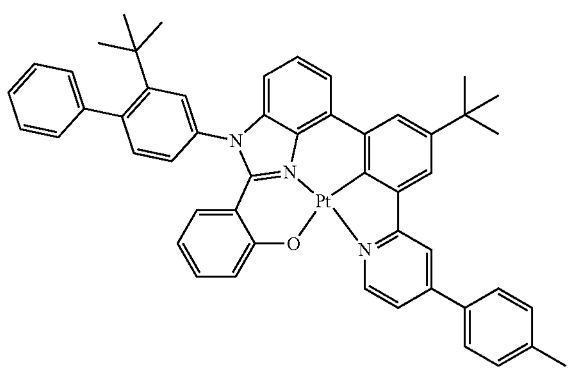
4-478
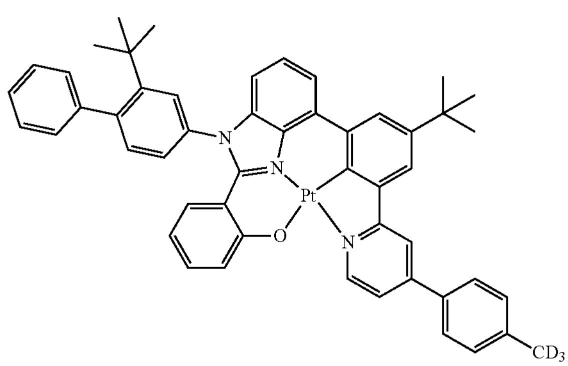
4-479
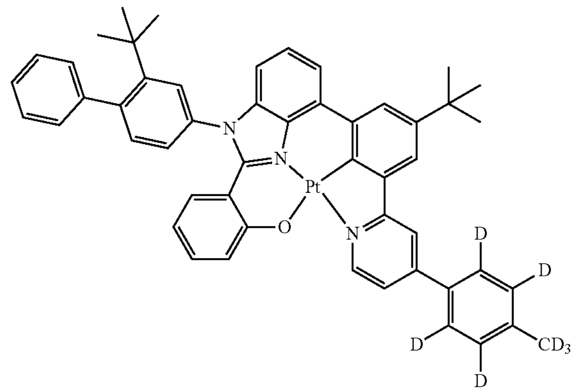
4-480
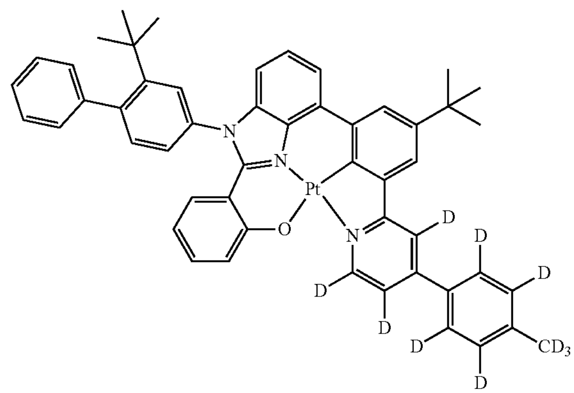
4-481
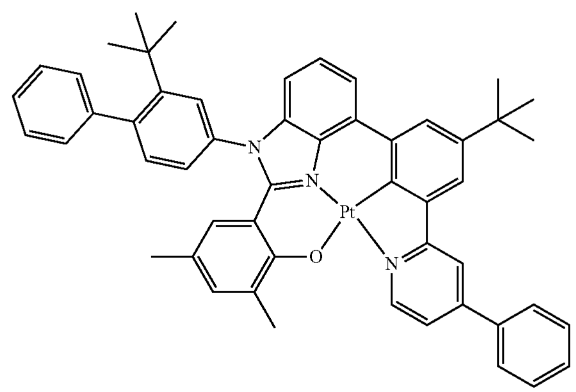
4-482
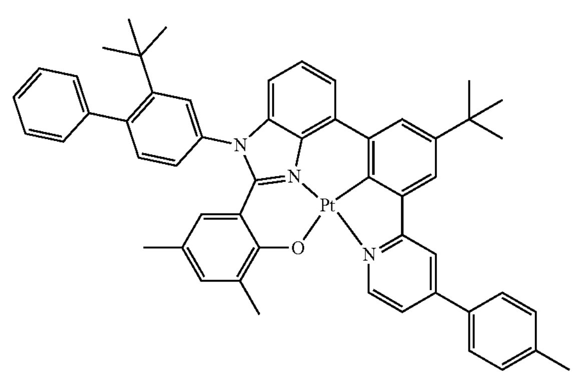

-continued
4-483
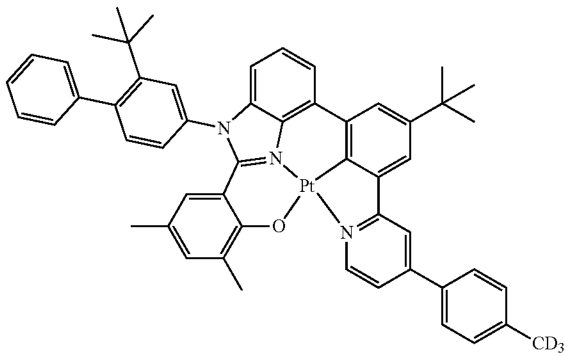
4-484
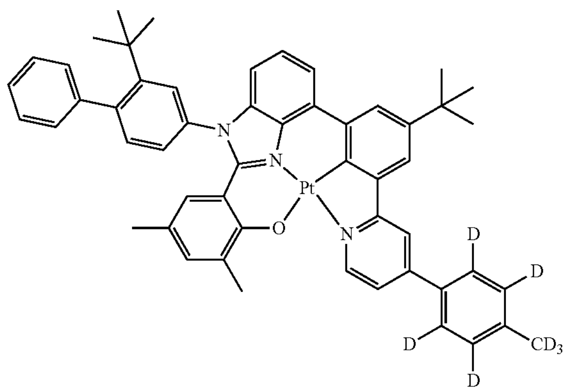
4-485
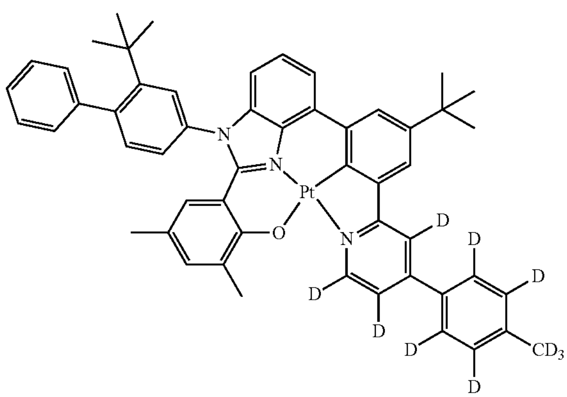
4-486
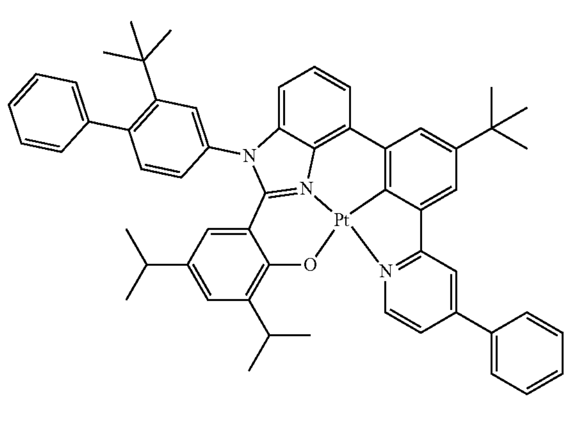
-continued
4-487
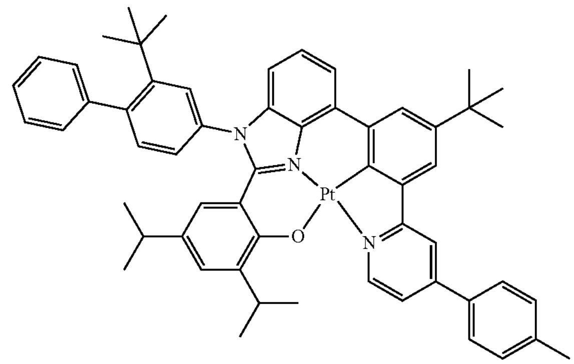
4-488
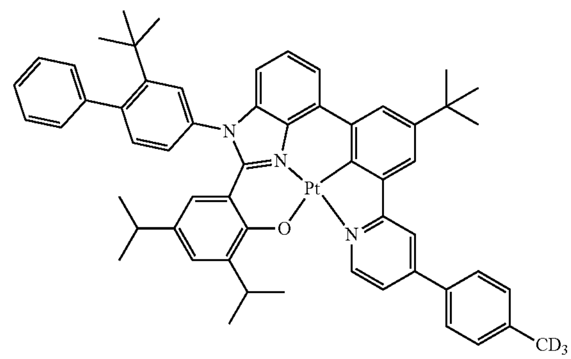
4-489
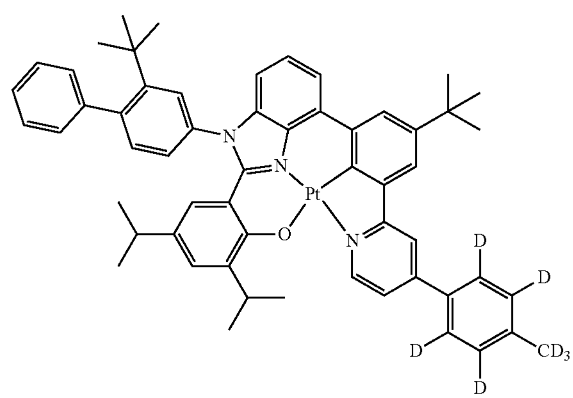
4-490
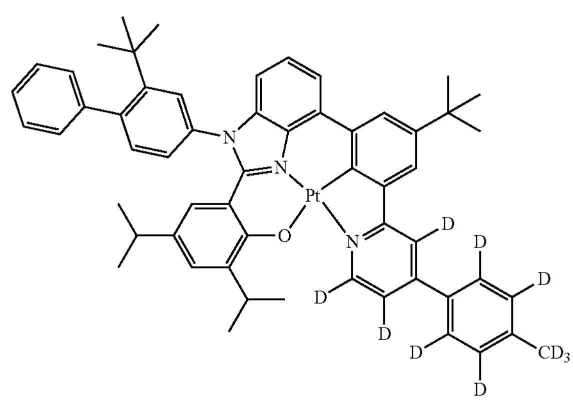

-continued
4-491
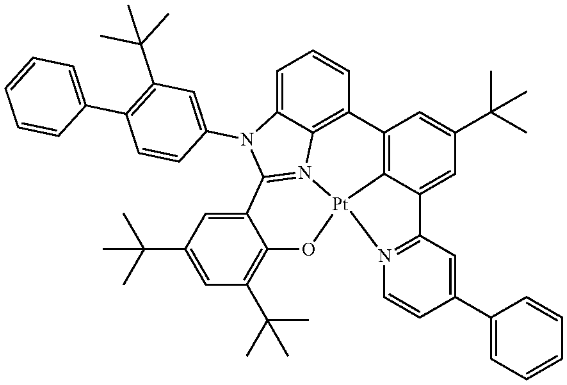
4-492
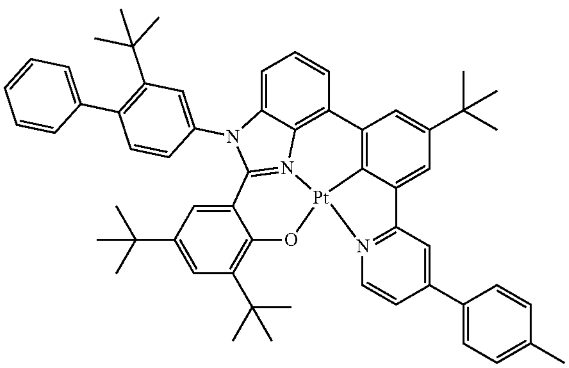
4-493
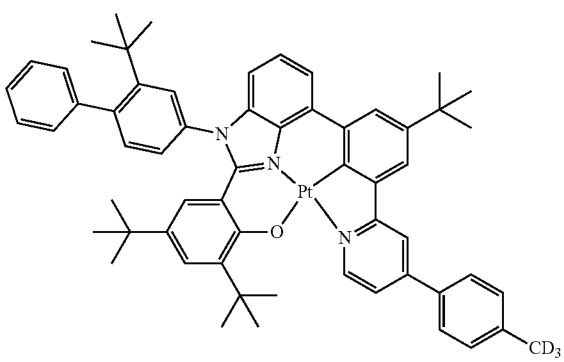
4-494
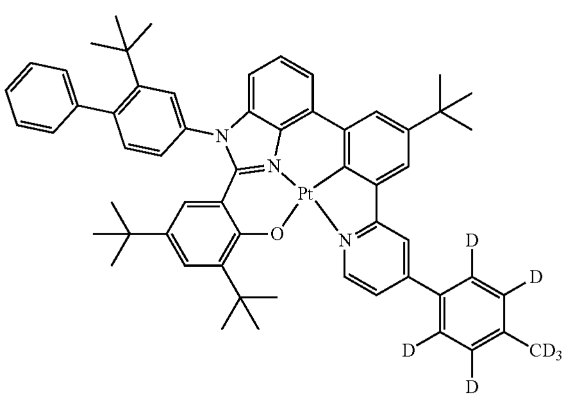
-continued
4-495
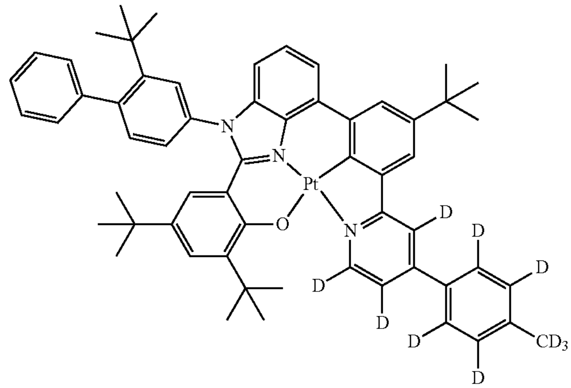
4-496
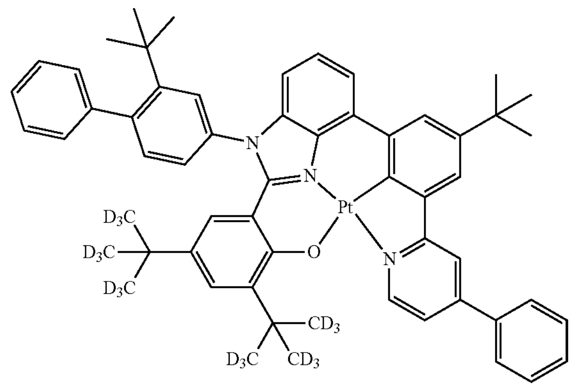
4-497
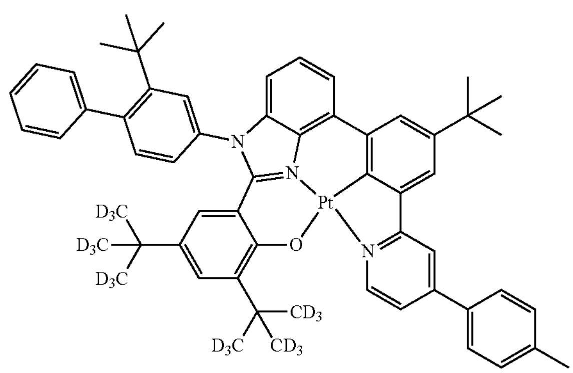
4-498
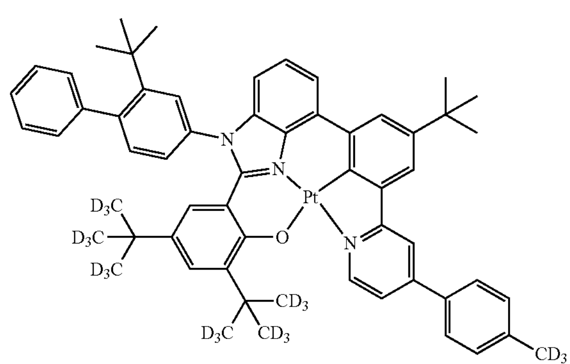

-continued
4-499
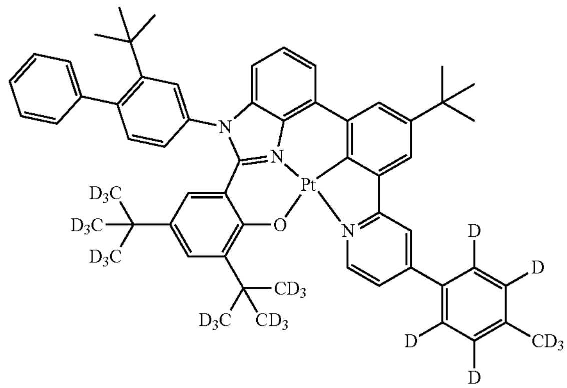
4-500
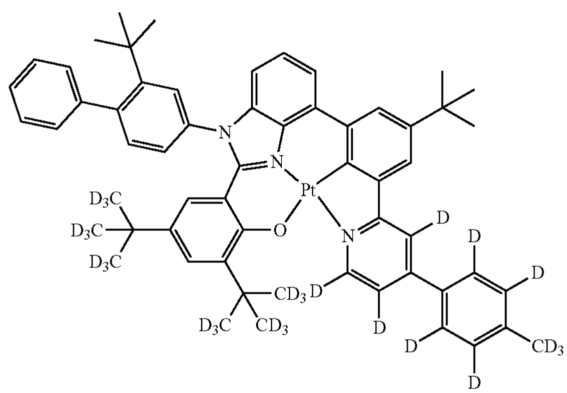
4-501
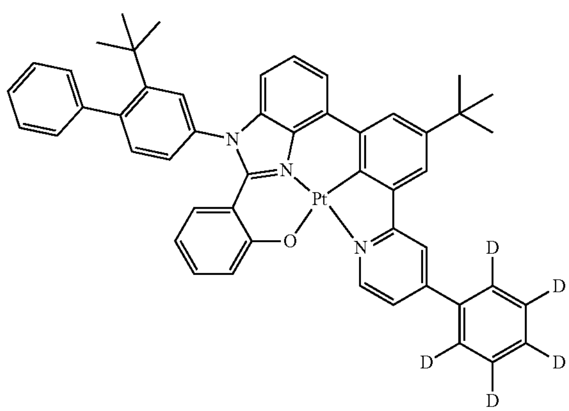
4-502
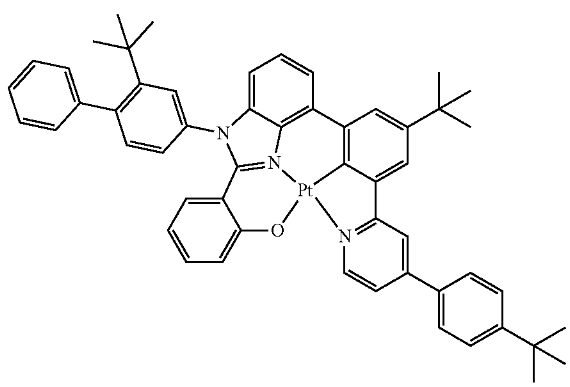
-continued
4-503
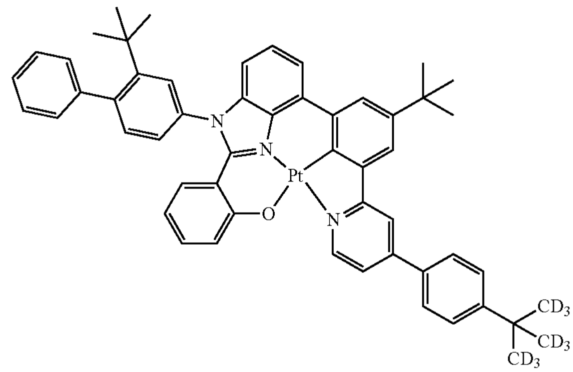
4-504
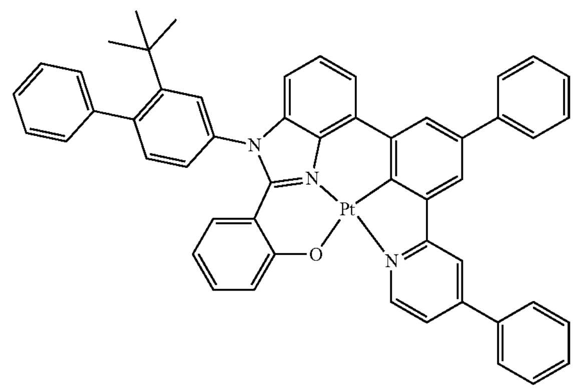
4-505
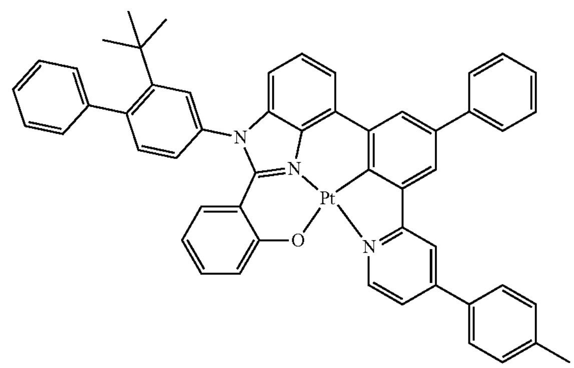
4-506
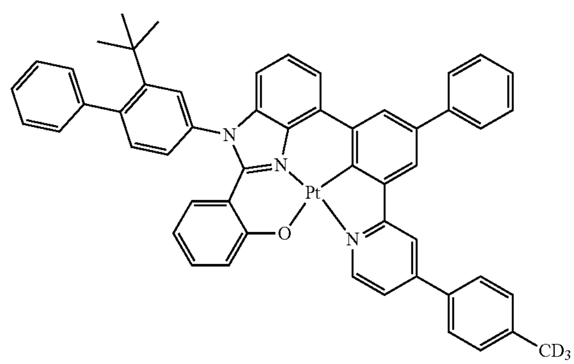

4-507
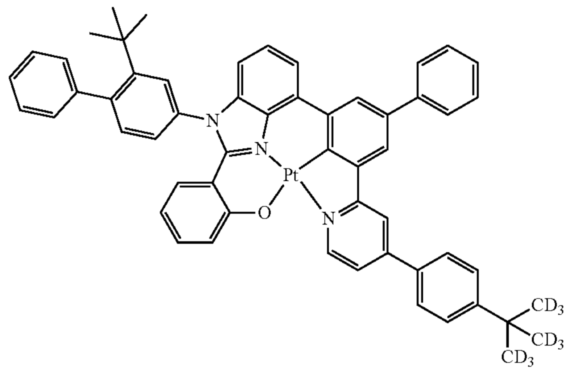
4-508
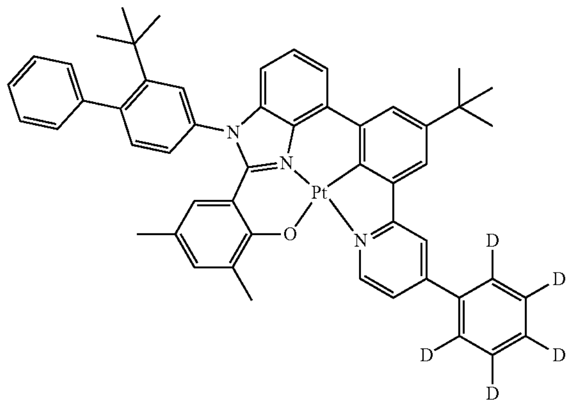
4-509
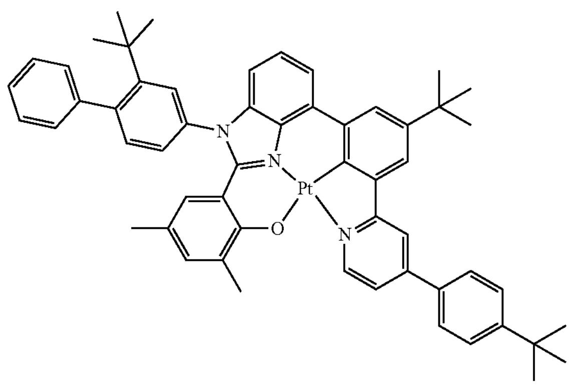
4-510
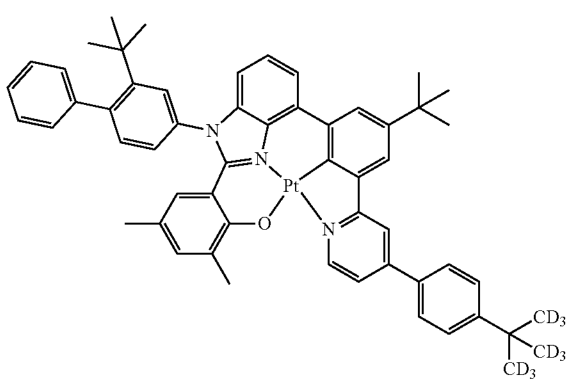
4-511
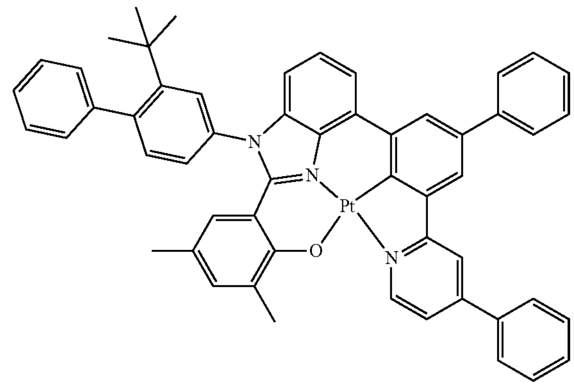
4-512
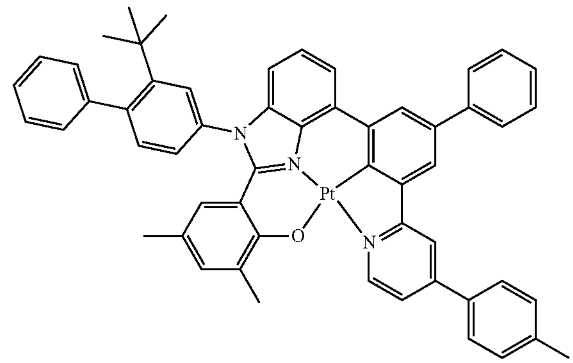
4-513
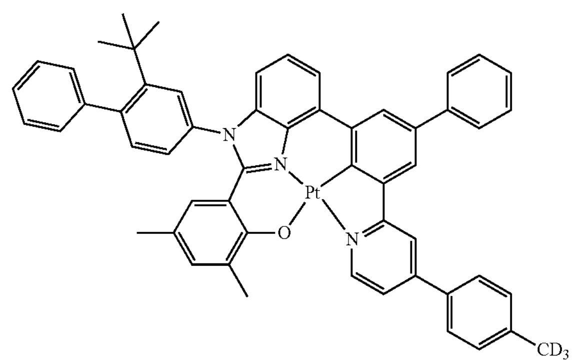
4-514
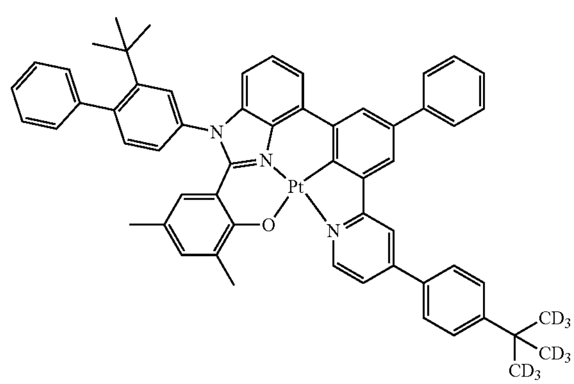

-continued
4-515
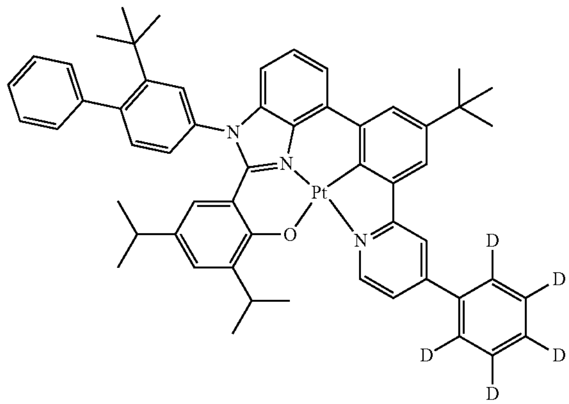
4-516
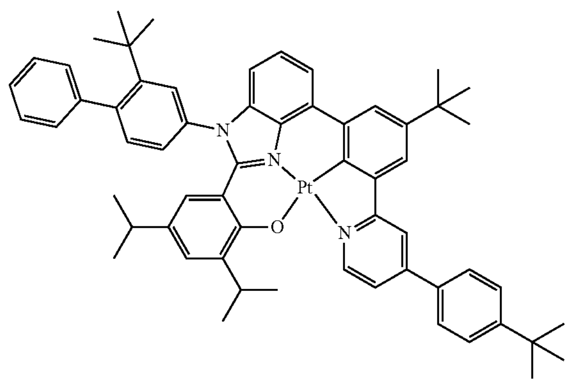
4-517
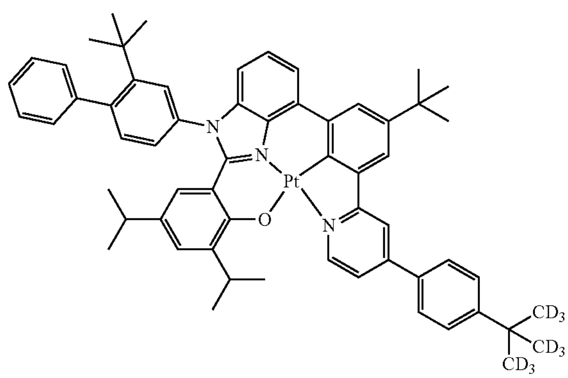
4-518
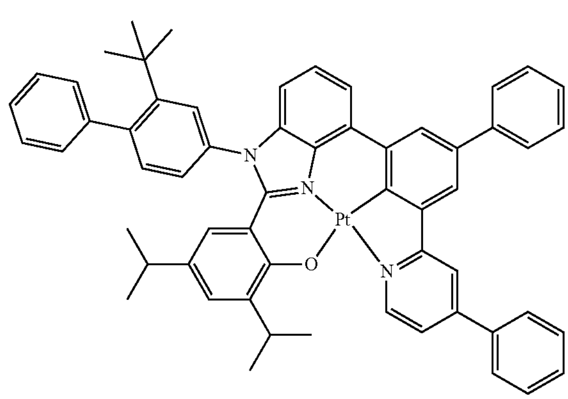
-continued
4-519
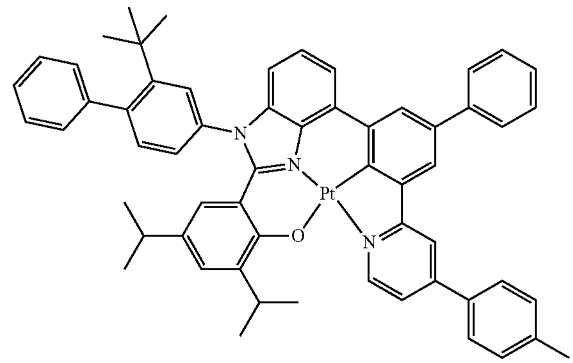
4-520
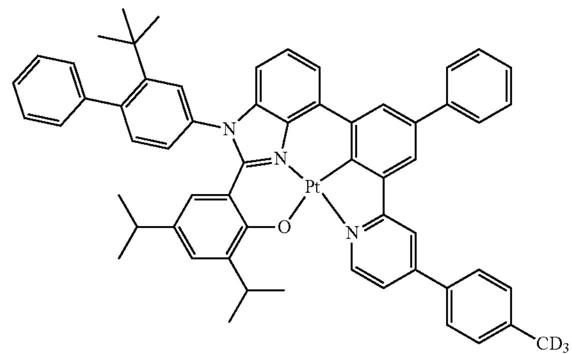
4-521
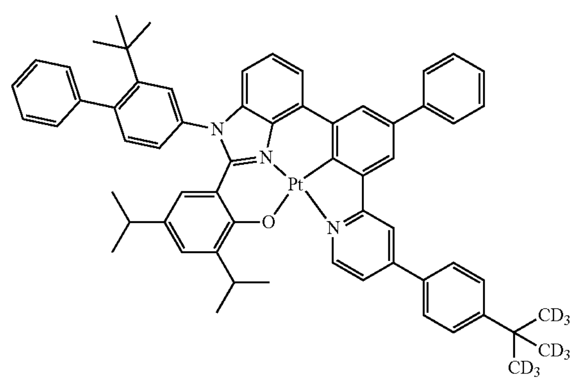
4-522
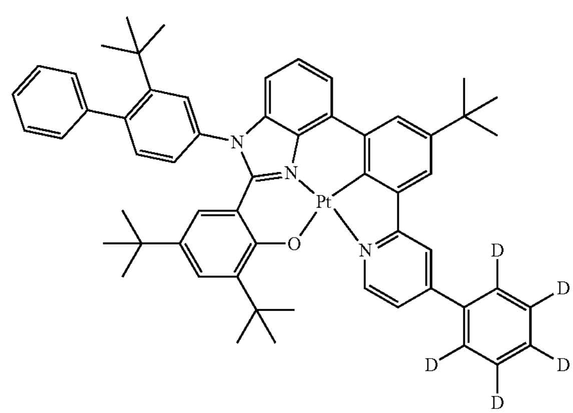

-continued
4-523
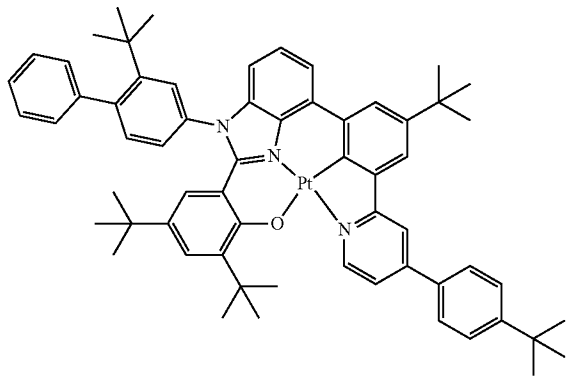
4-524
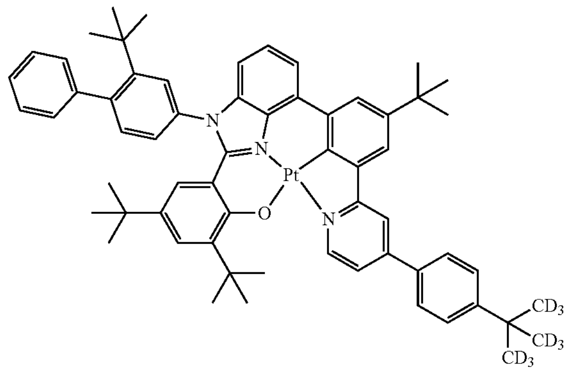
4-525
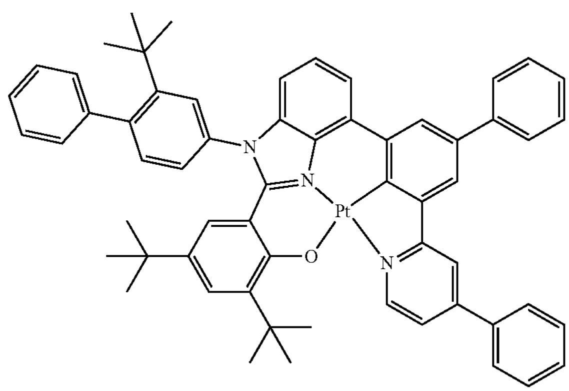
4-526
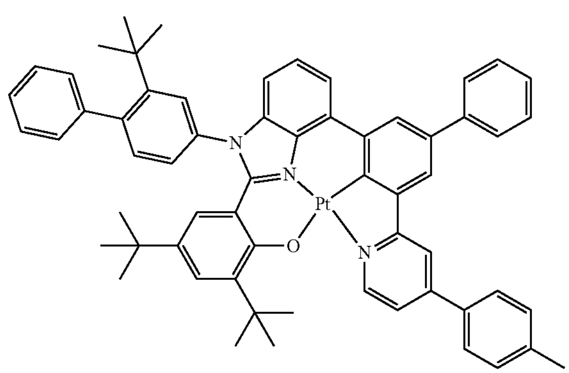
-continued
4-527
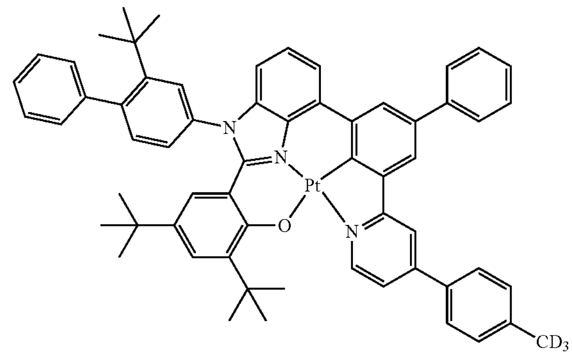
4-528
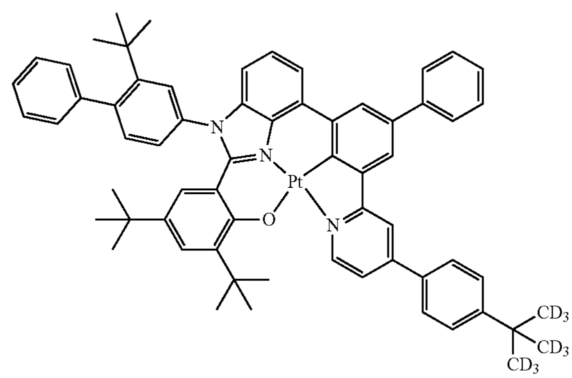
4-529
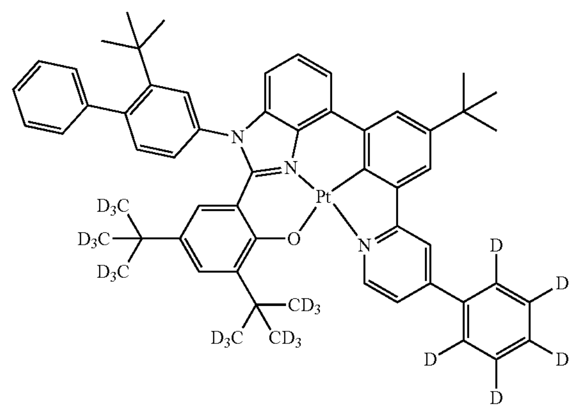
4-530
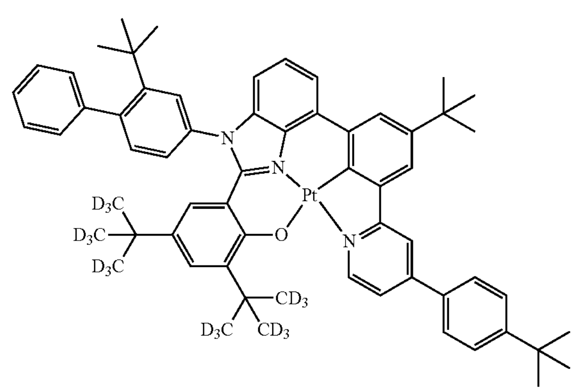

-continued
4-531
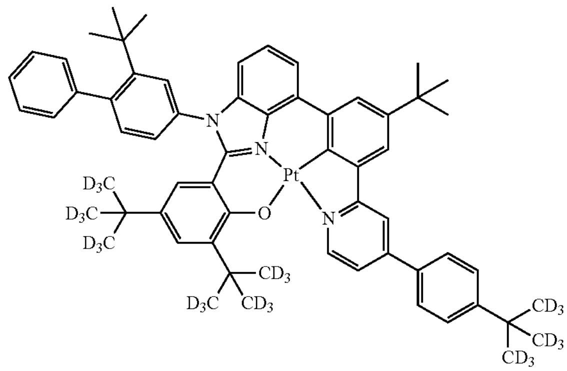
4-532
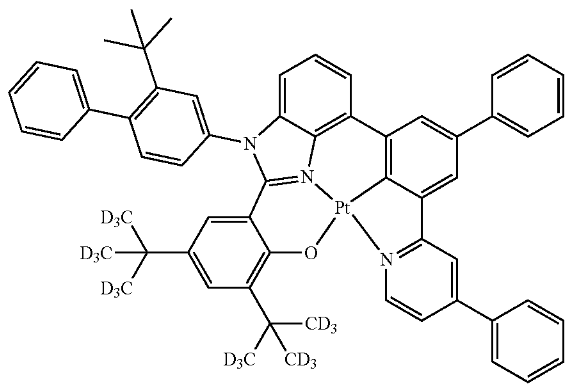
4-533
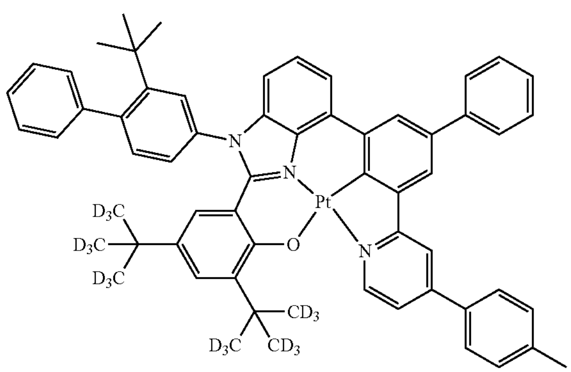
4-534
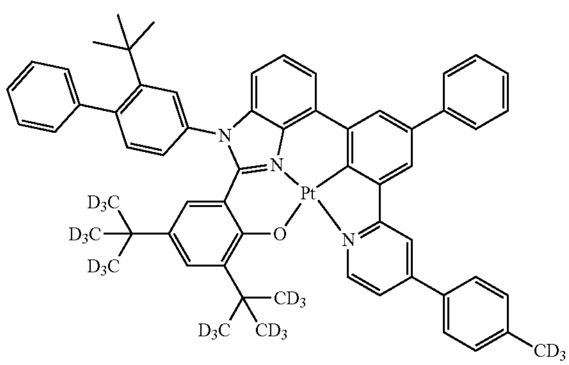
-continued
4-535
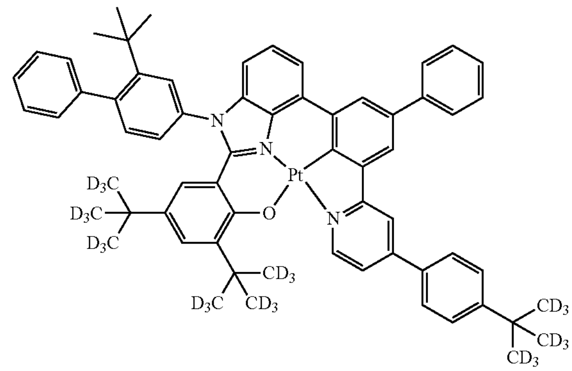
4-536
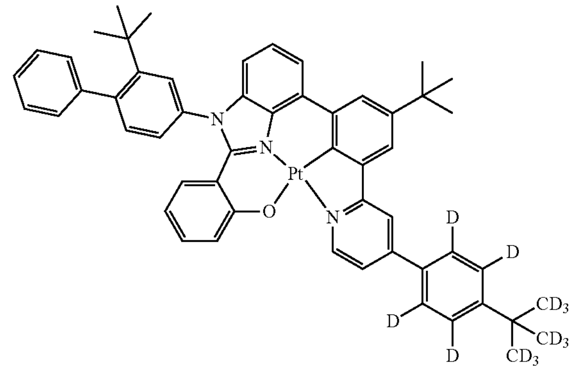
4-537
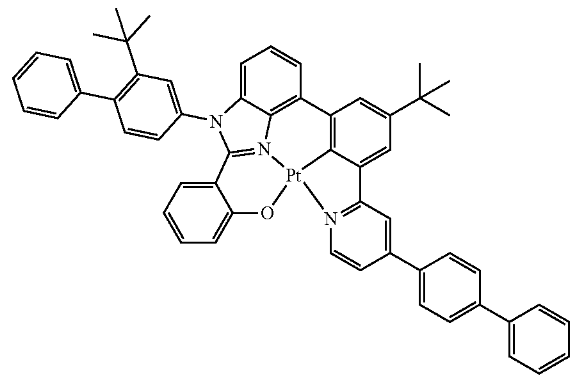
4-538
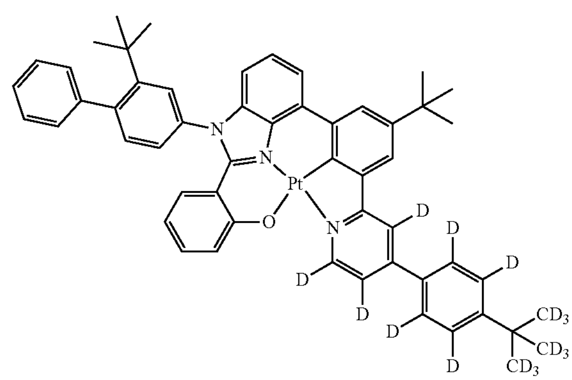

-continued
4-539
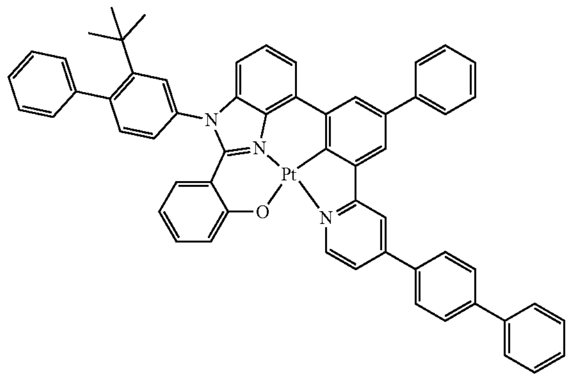
4-540
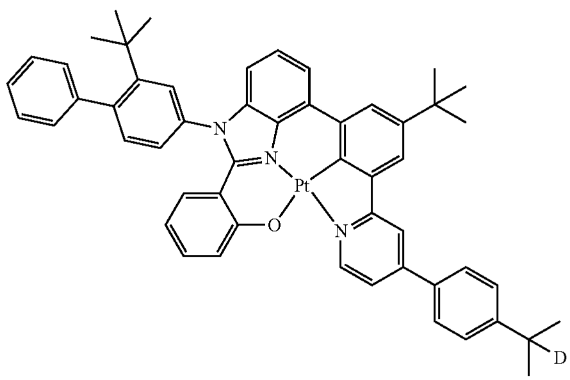
4-541
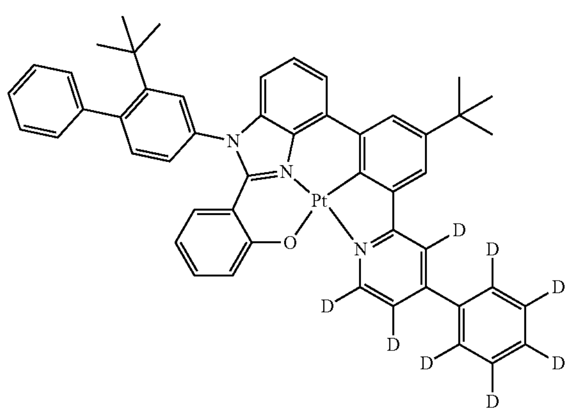
4-542
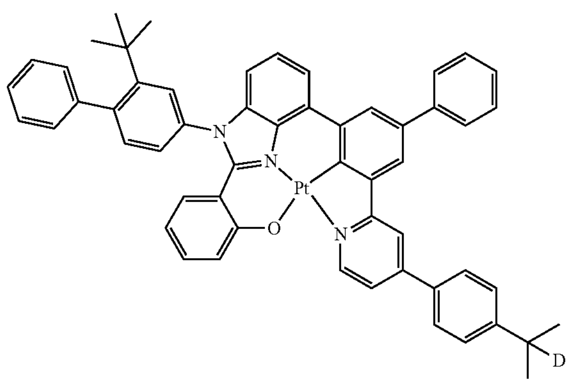
-continued
4-543
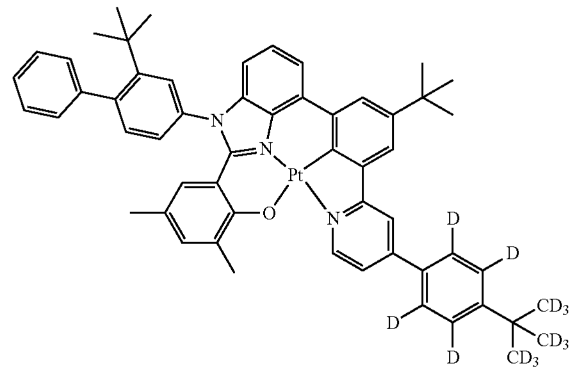
4-544
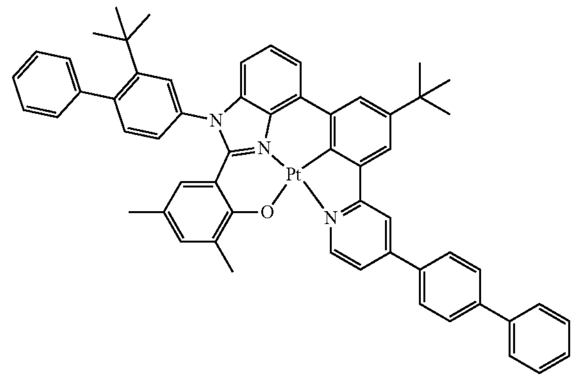
4-545
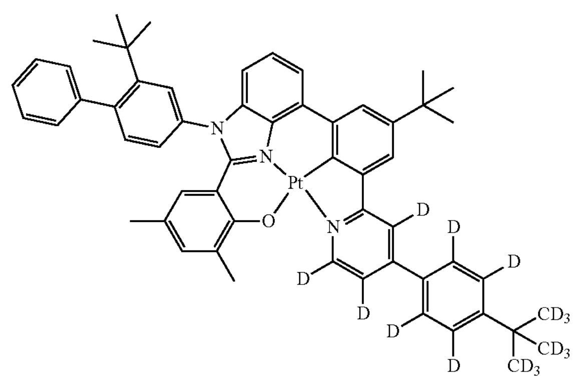
4-546
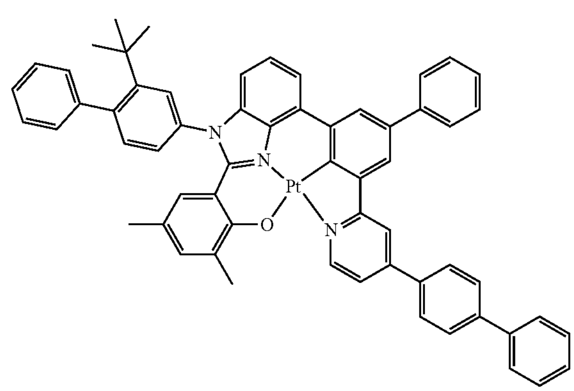

4-547
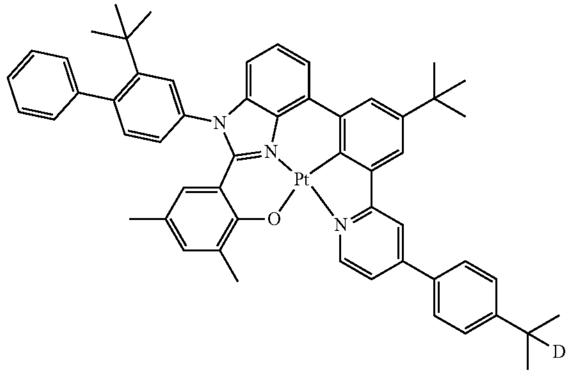
4-548
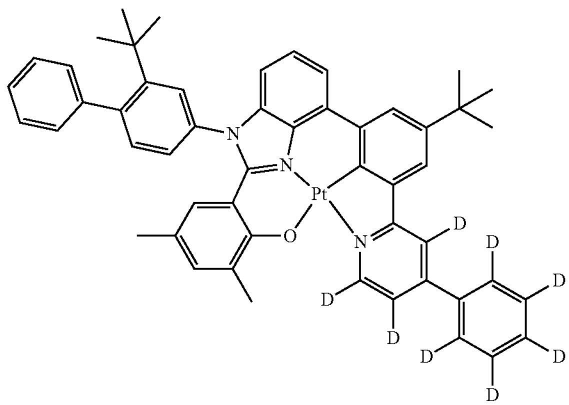
4-549
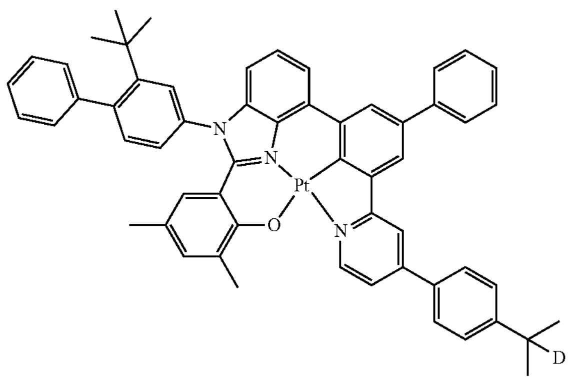
4-550
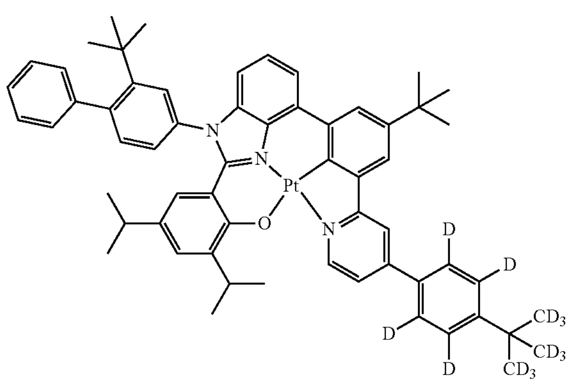
4-551
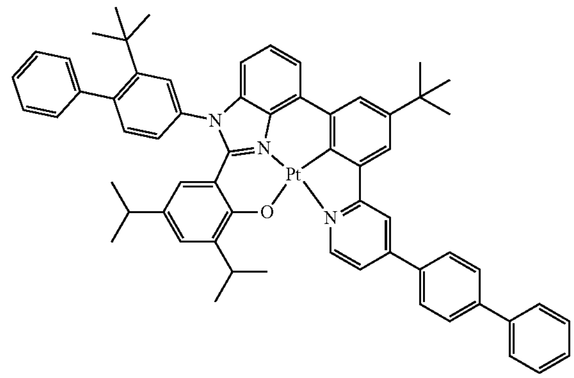
4-552
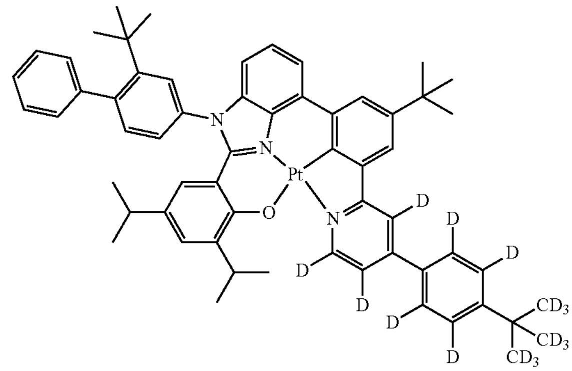
4-553
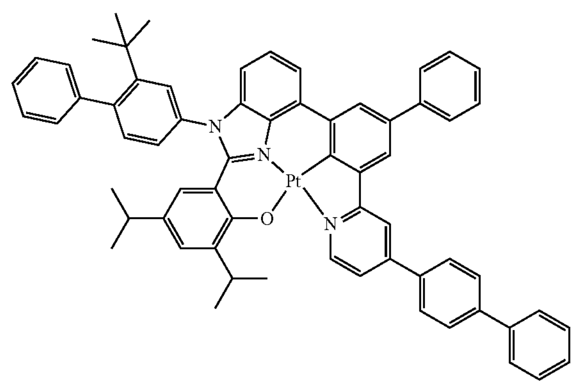
4-554
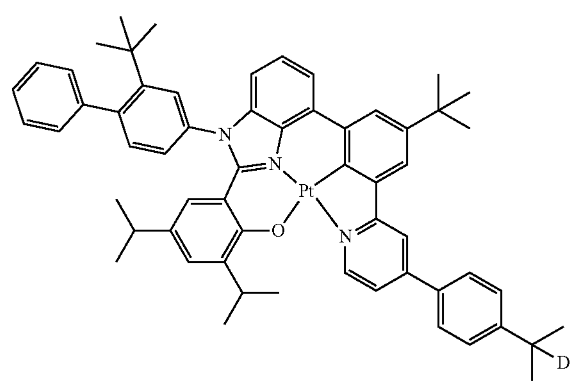

-continued
4-555
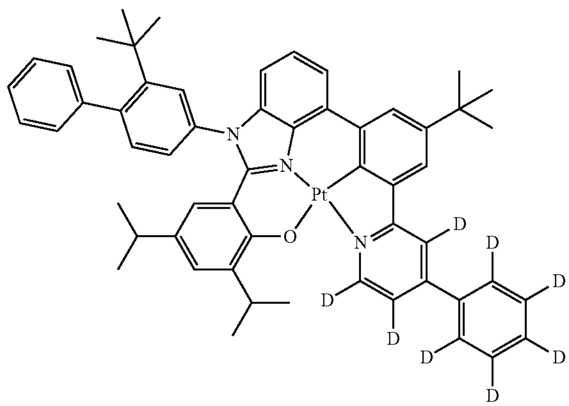
4-556
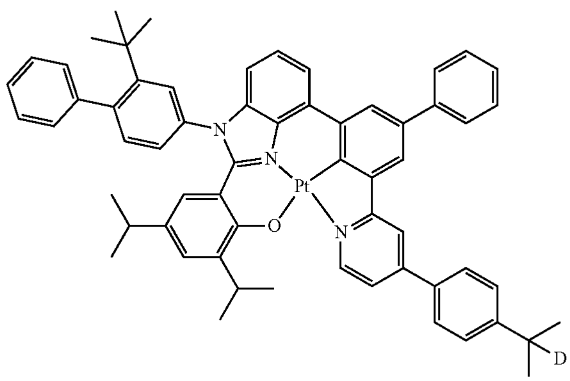
4-557
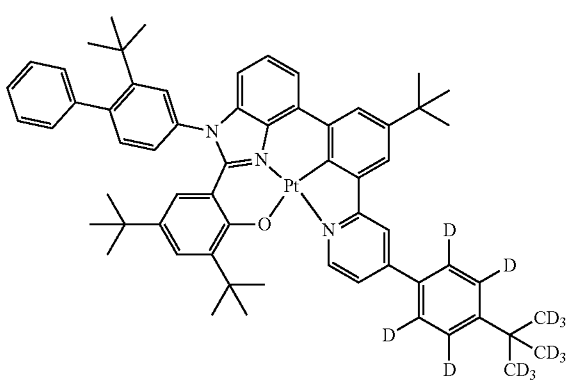
4-558
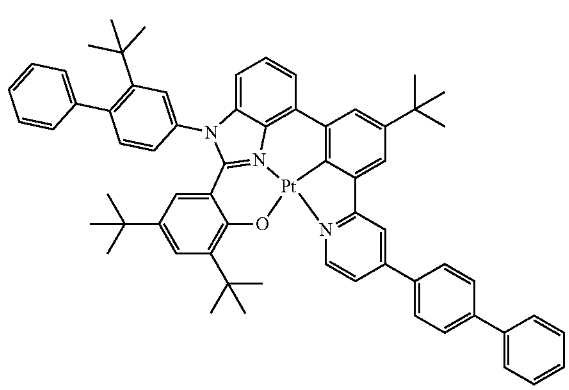
-continued
4-559
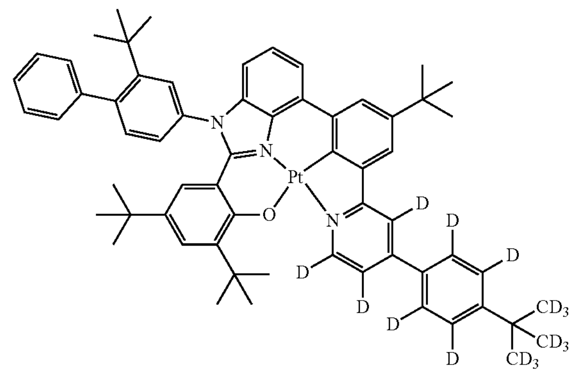
4-560
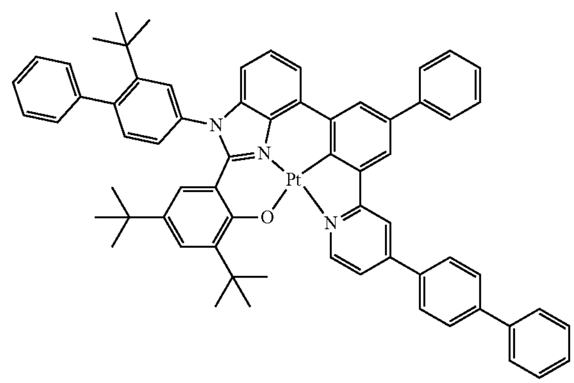
4-561
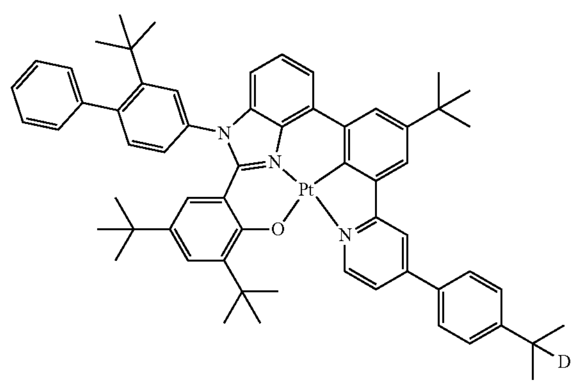
4-562
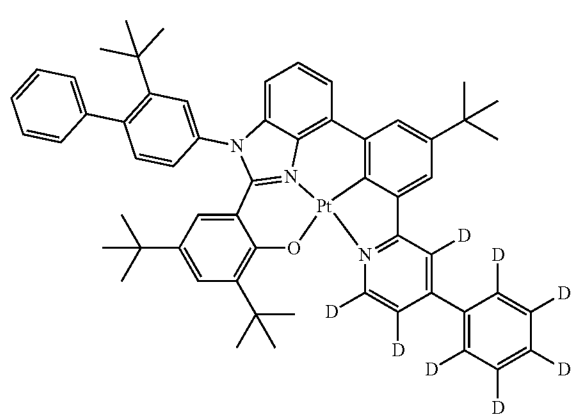

-continued
4-563
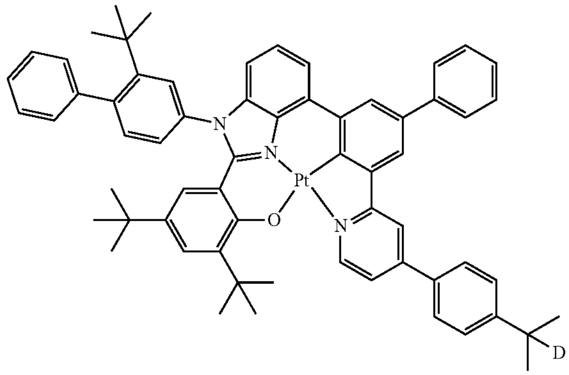
4-564
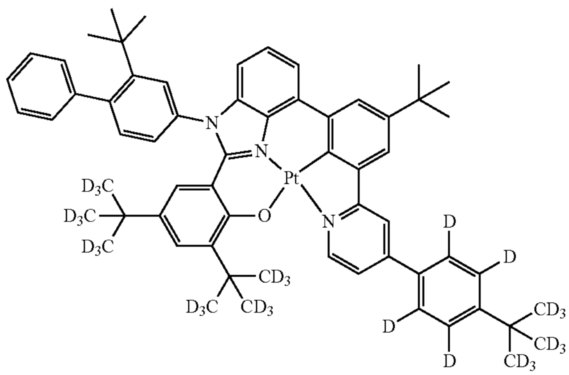
4-565
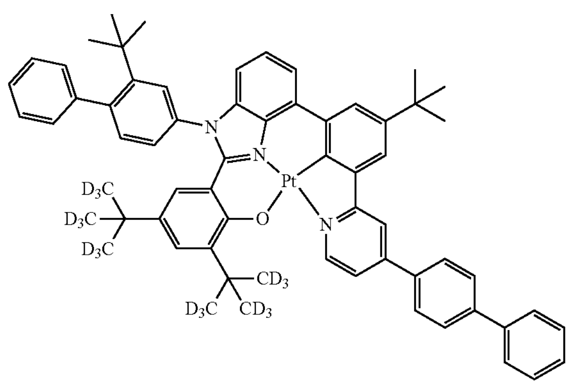
4-566
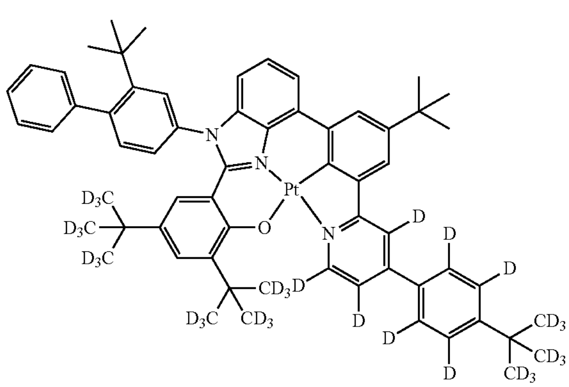
-continued
4-567
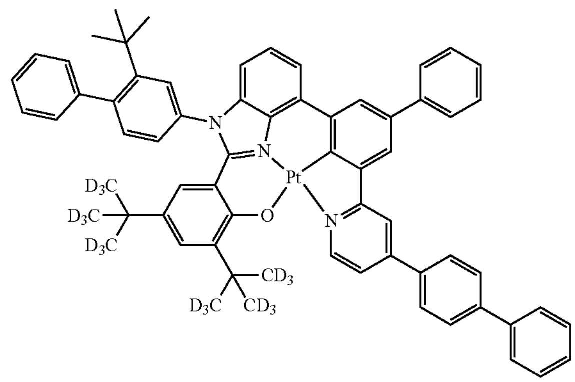
4-568
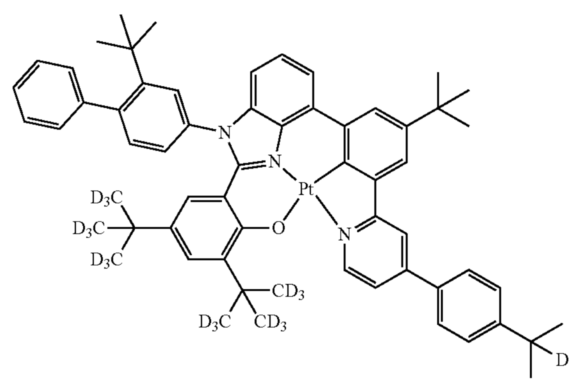
4-569
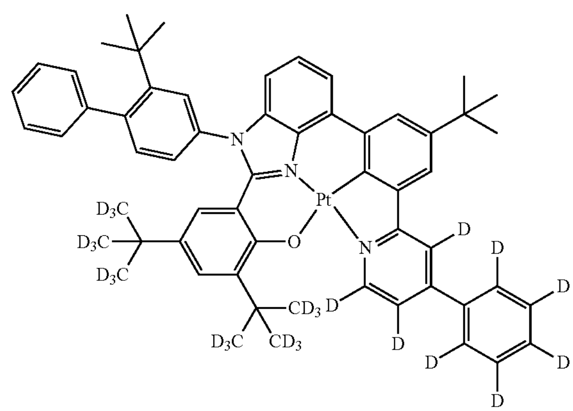
4-570
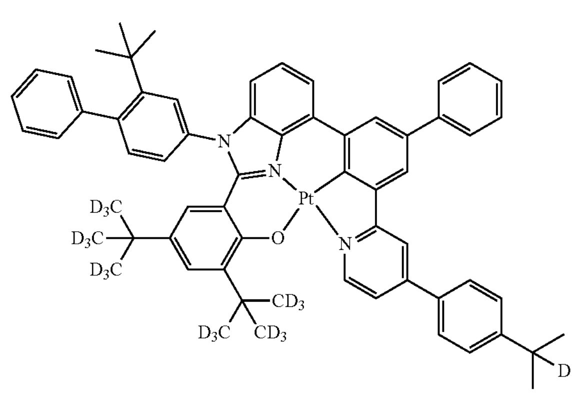

-continued
4-571
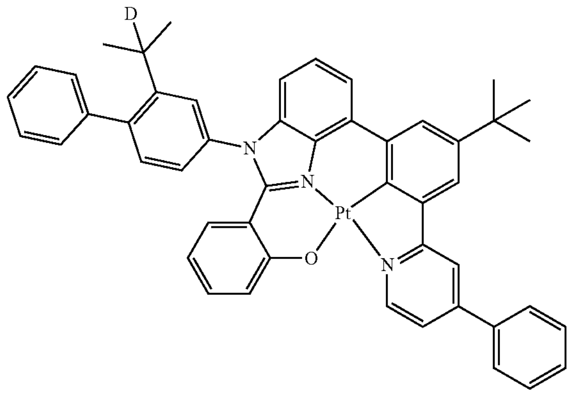
4-572
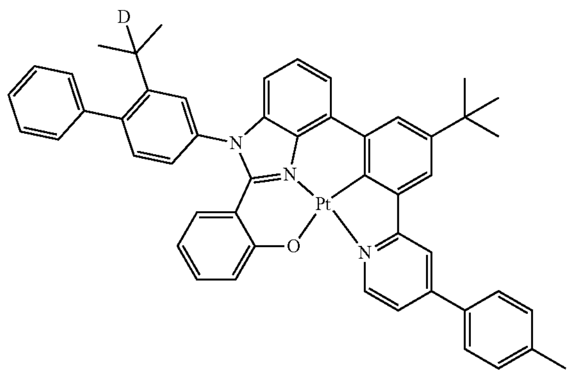
4-573
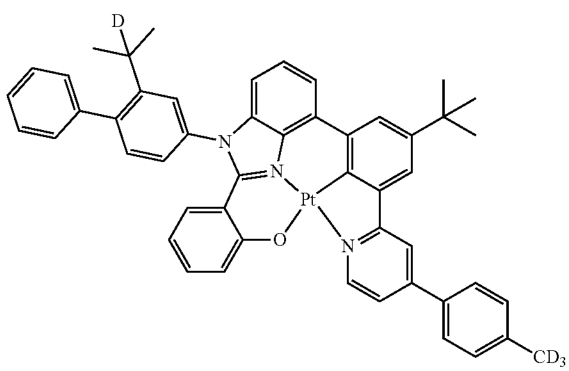
4-574
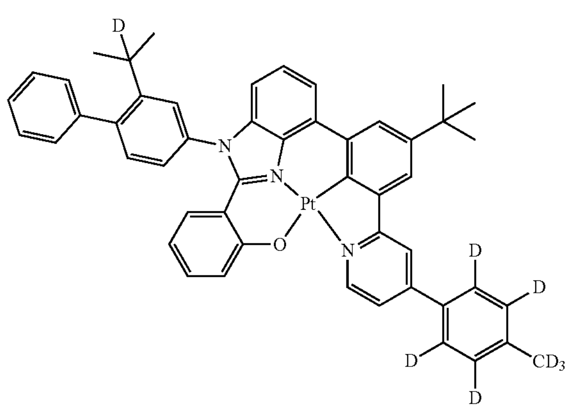
-continued
4-575
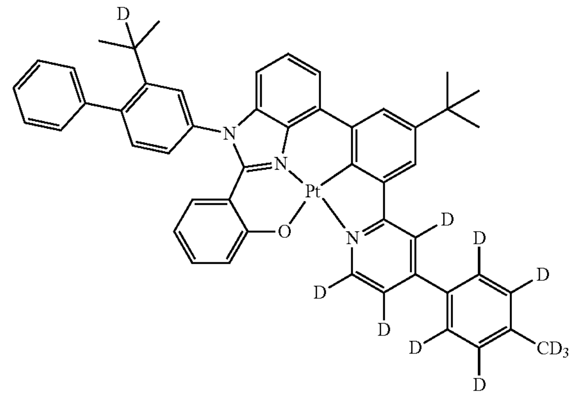
4-576
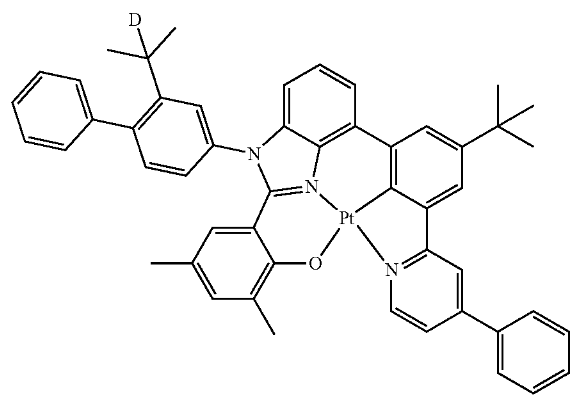
4-577
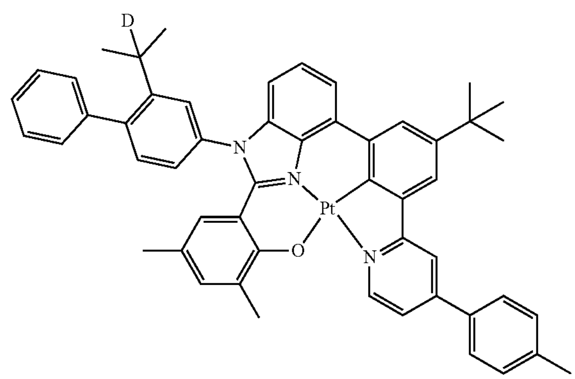
4-578
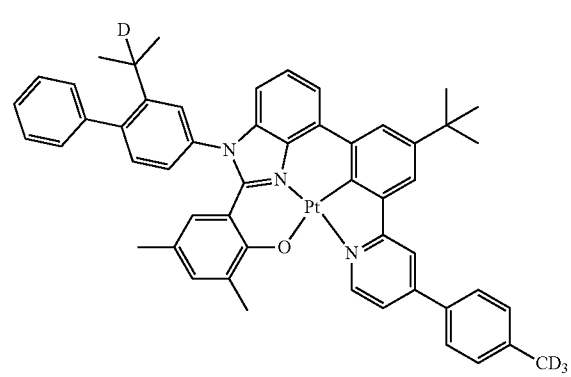

-continued
4-579
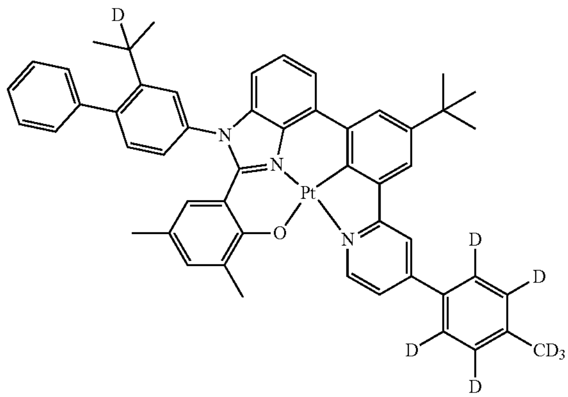
4-580
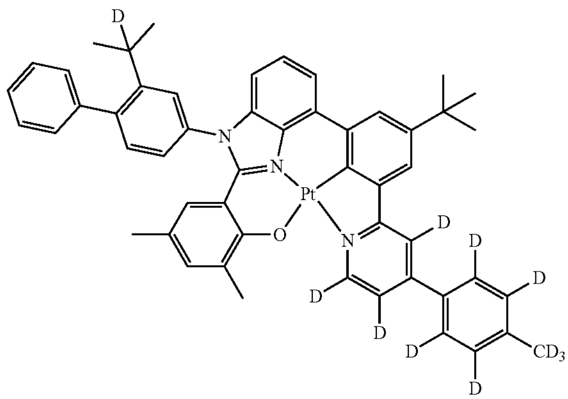
4-581
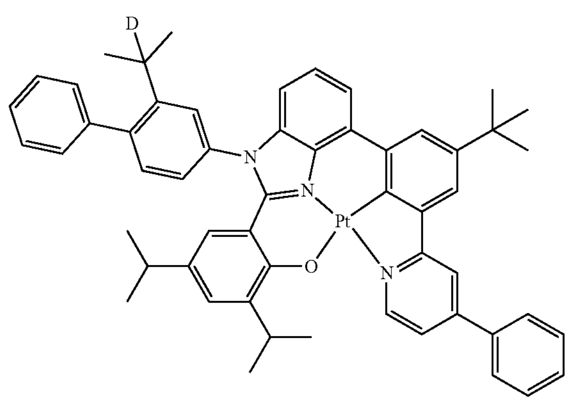
4-582
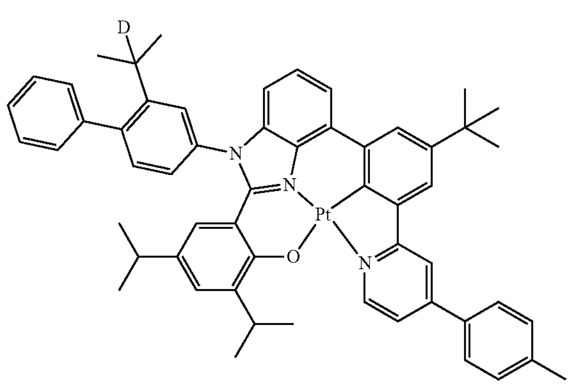
-continued
4-583
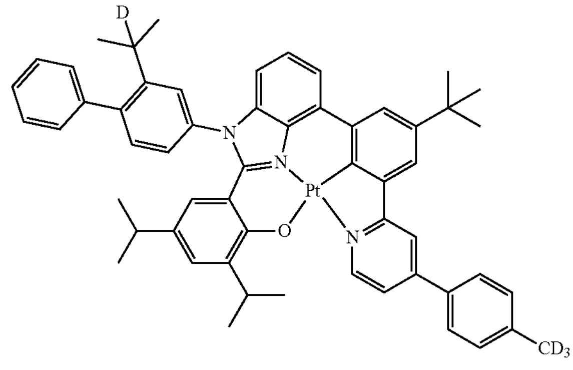
4-584
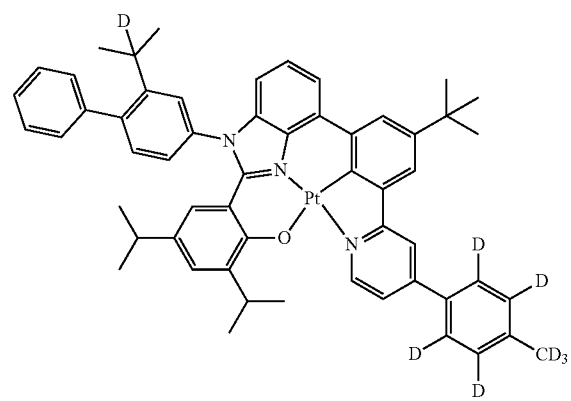
4-585
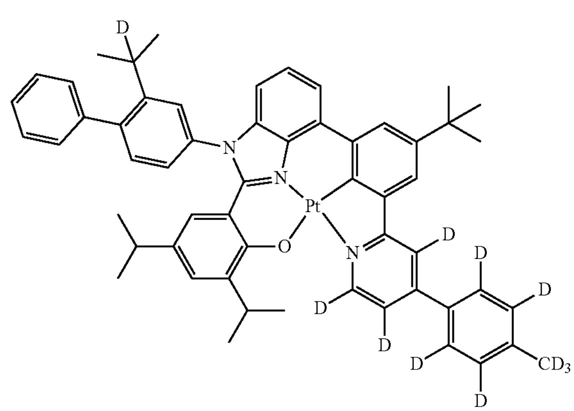

-continued
4-586
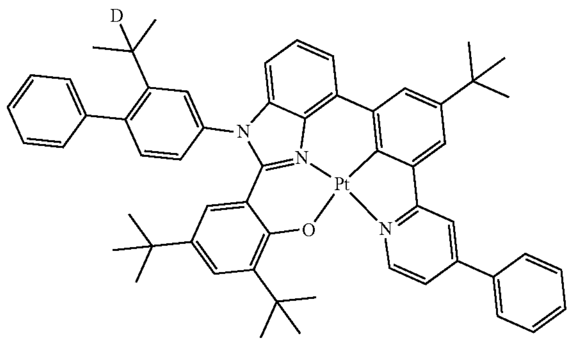
4-587
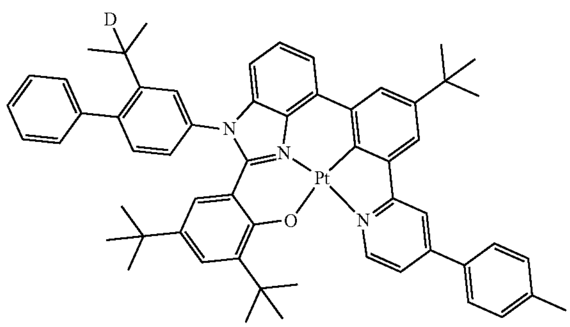
4-588
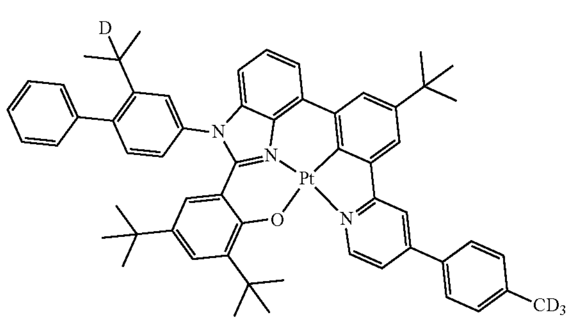
4-589
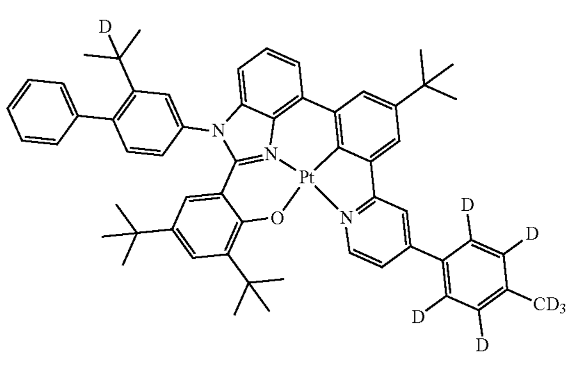
4-590
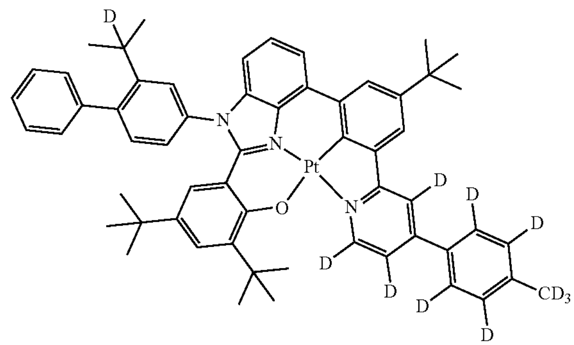
4-591
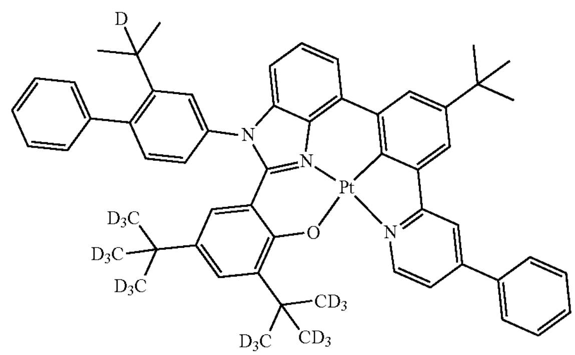
4-592
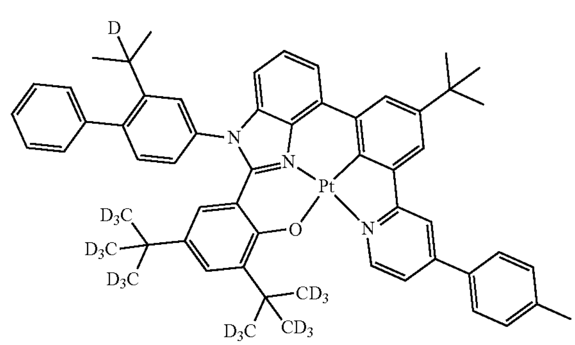
4-593
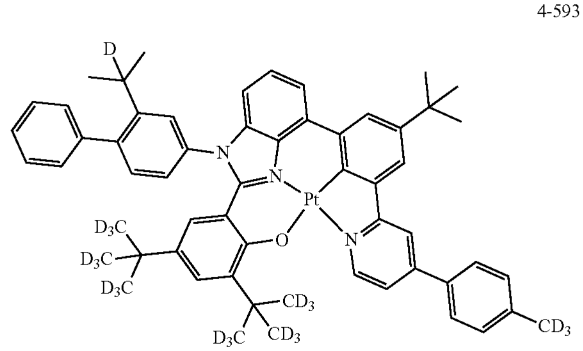

-continued
4-594
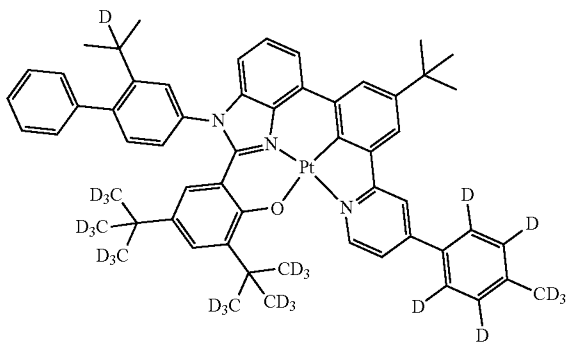
4-595
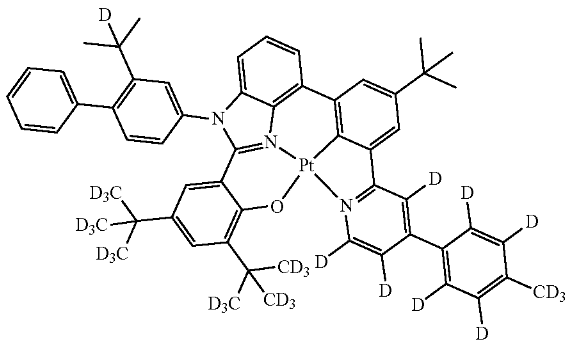
4-596
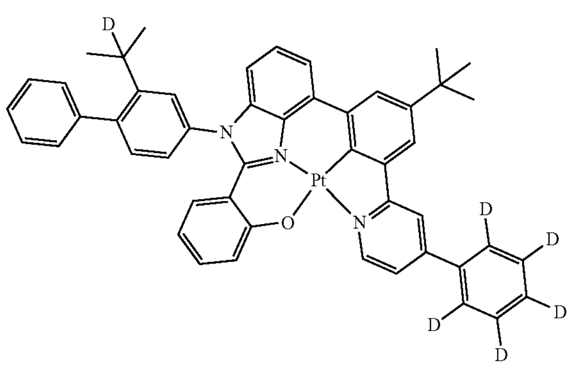
4-597
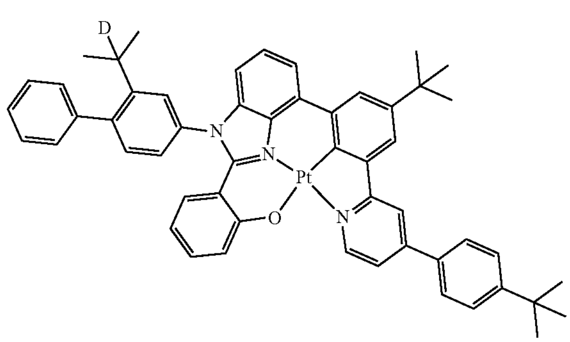
-continued
4-598
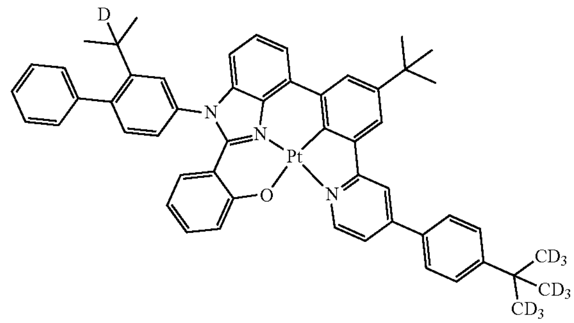
4-599
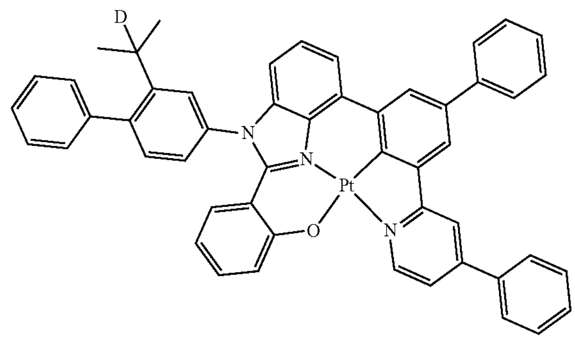
4-600
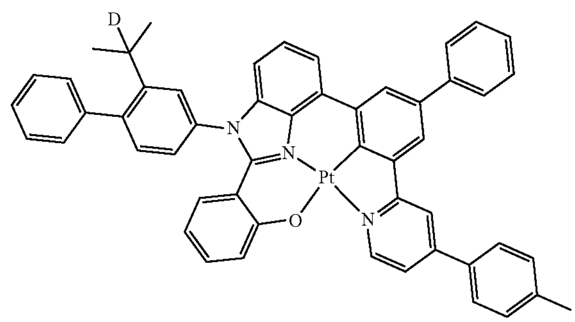
4-601
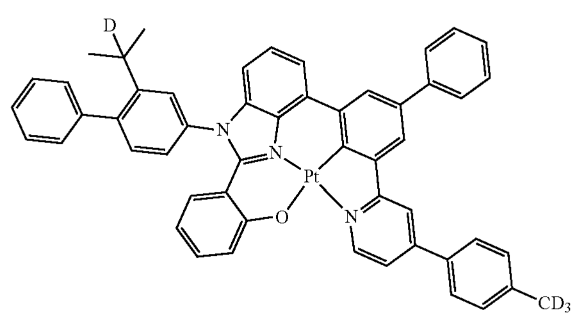

-continued
4-602
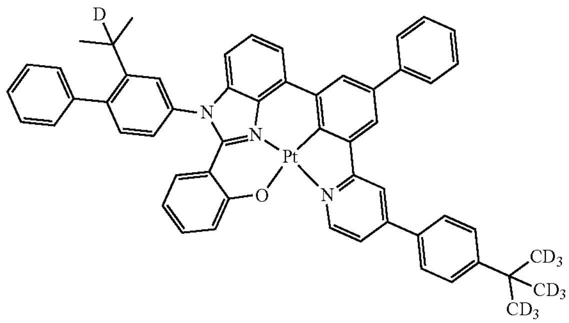
4-603
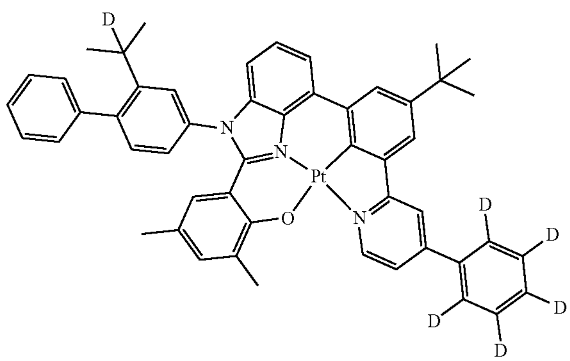
4-604
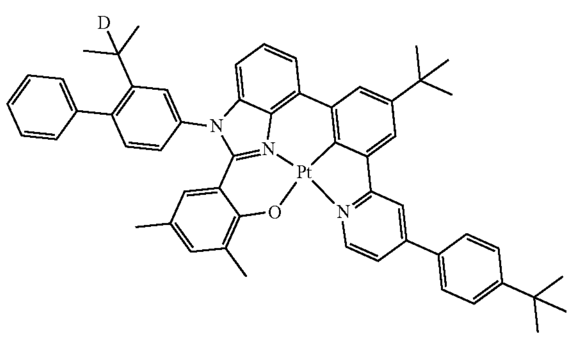
4-605
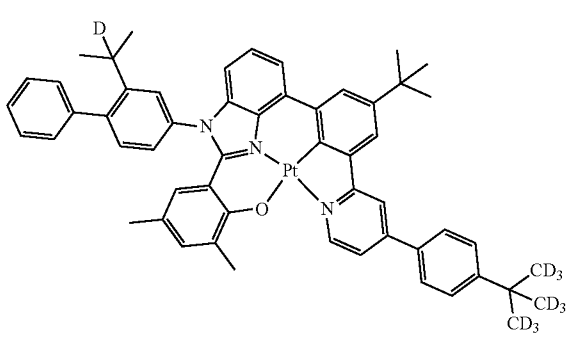
-continued
4-606
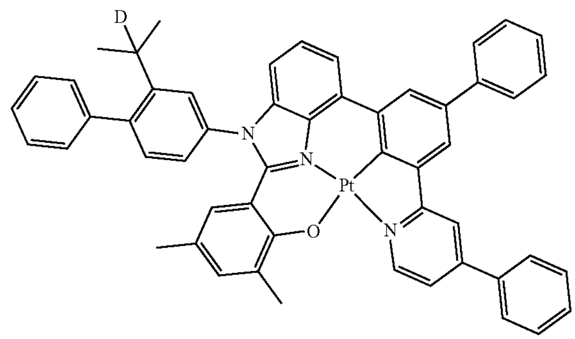
4-607
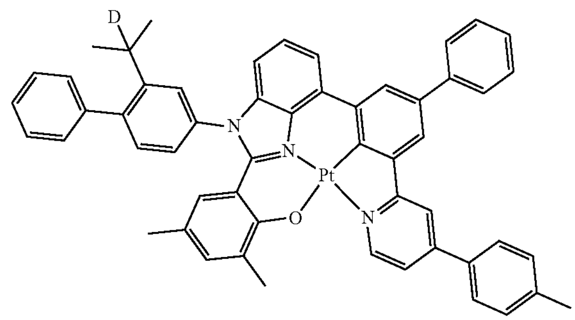
4-608
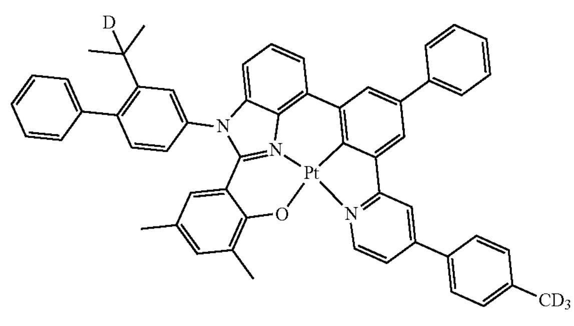
4-609
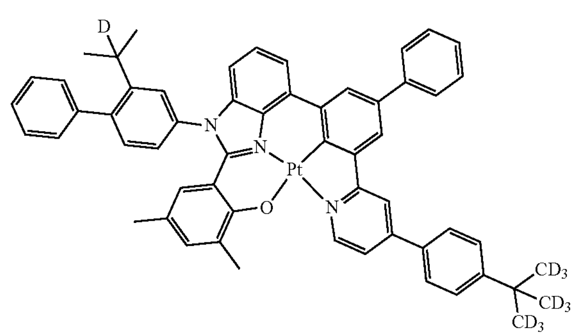

-continued
4-610
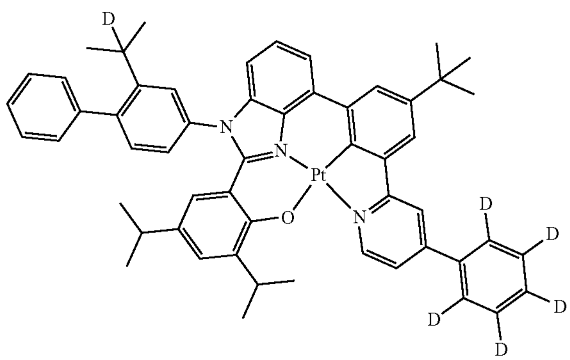
4-611
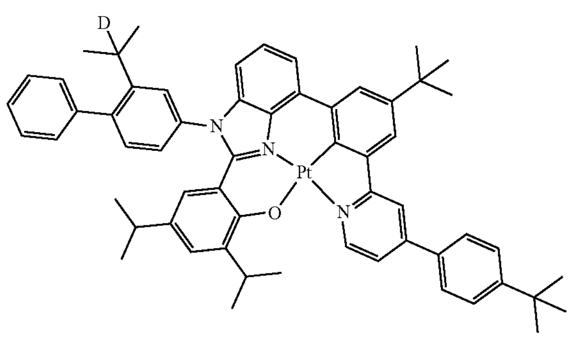
4-612
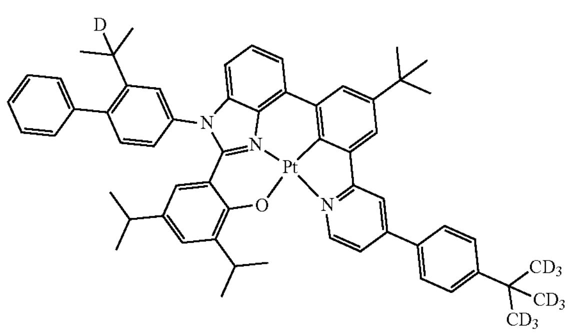
4-613
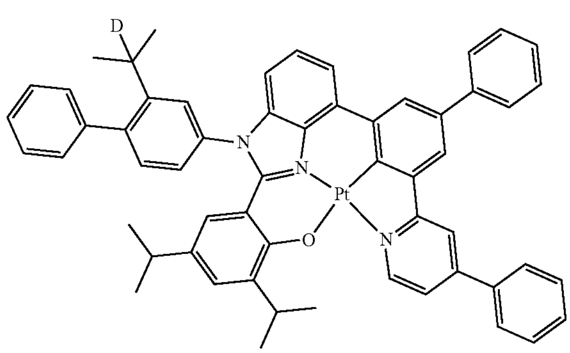
-continued
4-614
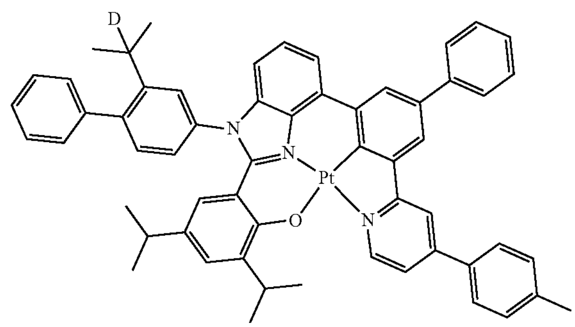
4-615
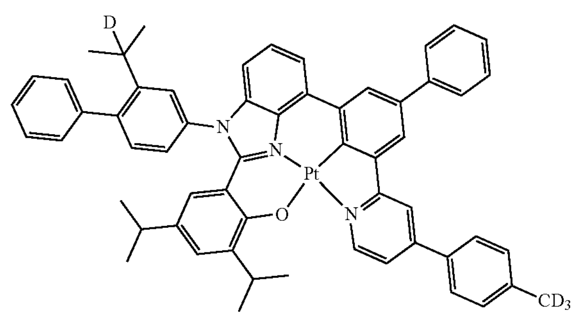
4-616
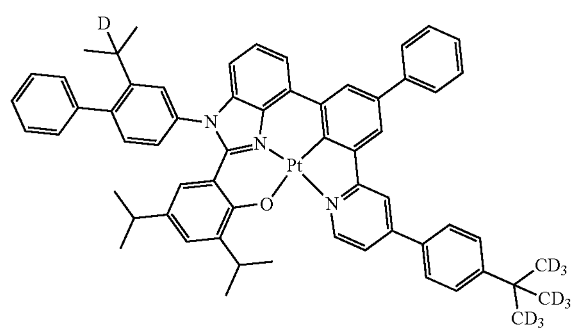
4-617
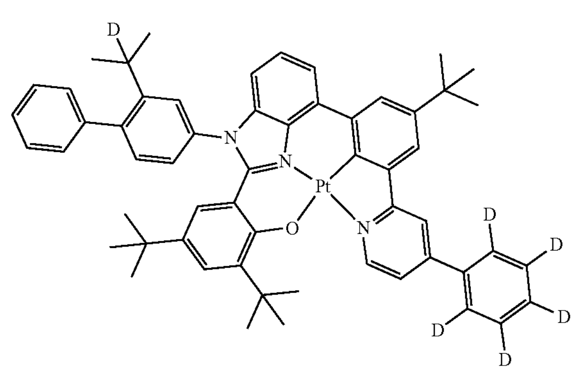

-continued
4-618
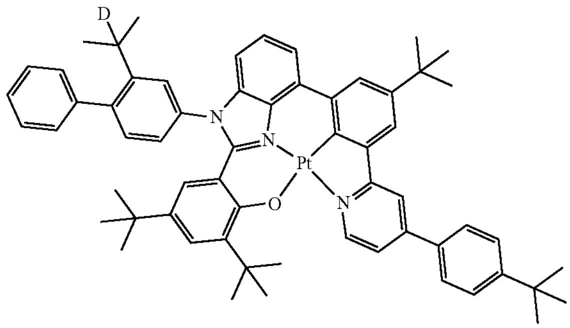
4-619
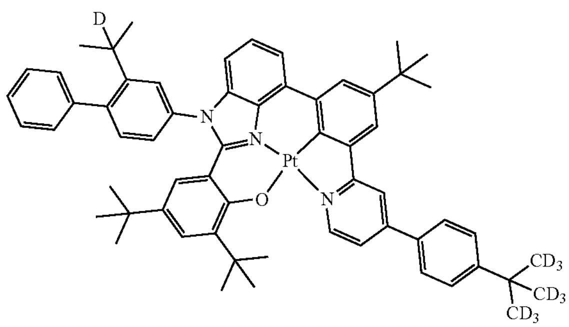
4-620
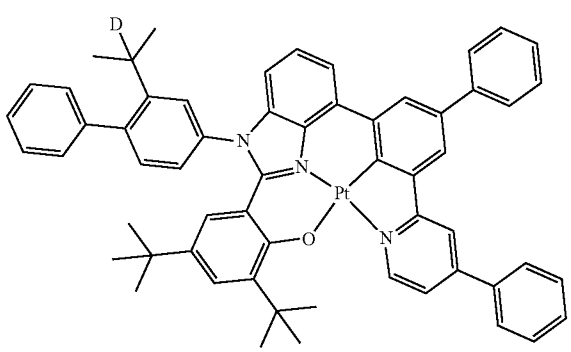
4-621
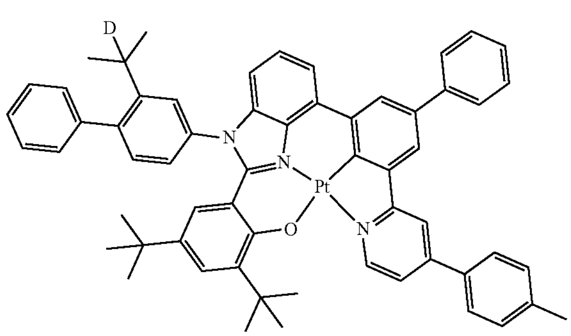
-continued
4-622
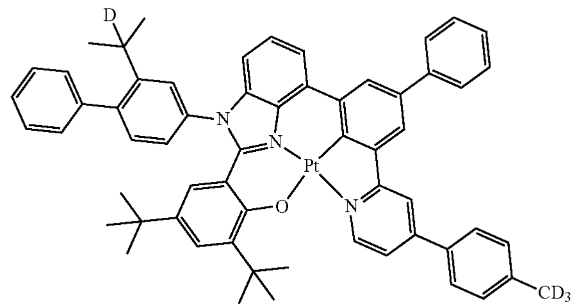
4-623
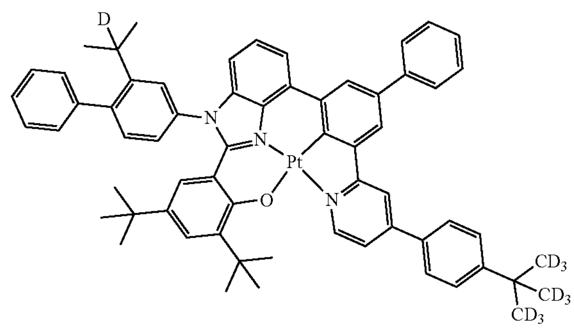
4-624
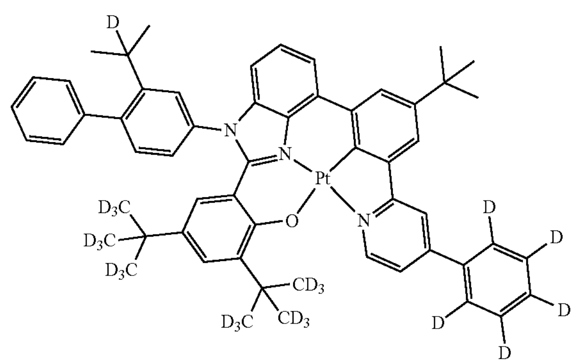
4-625
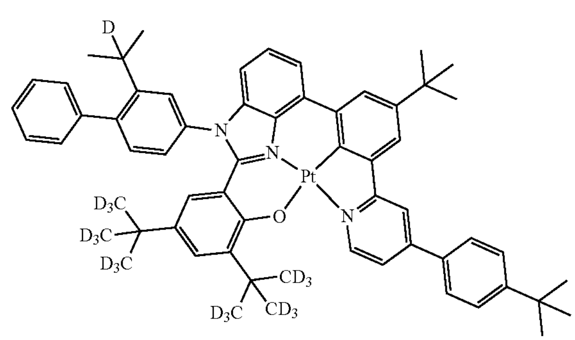

-continued
4-626
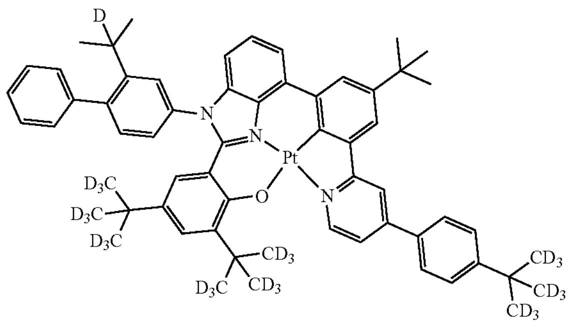
4-627
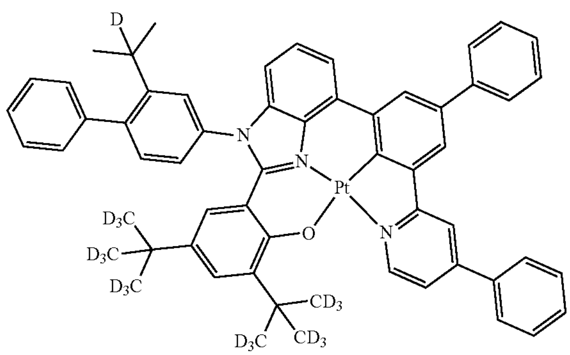
4-628
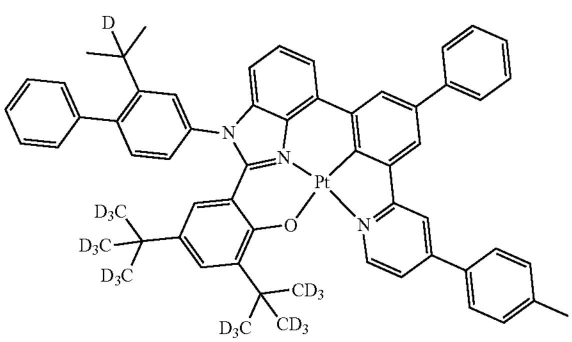
4-629
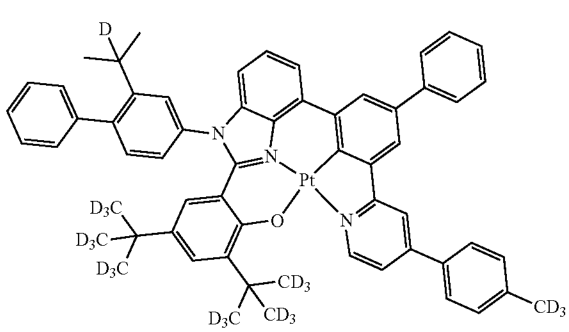
-continued
4-630
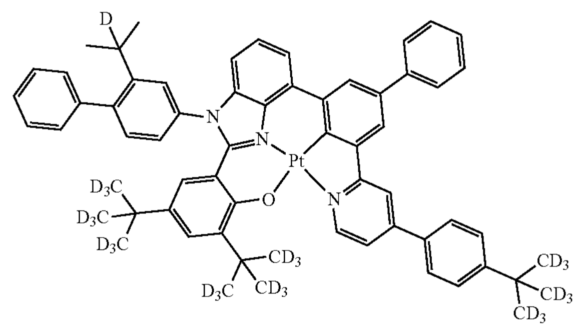
4-631
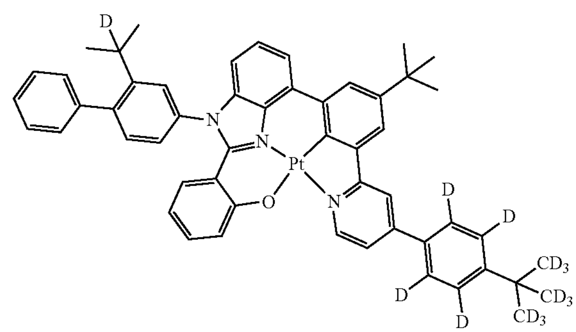
4-632
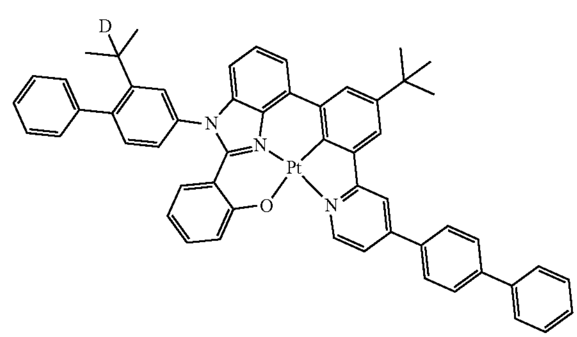
4-633
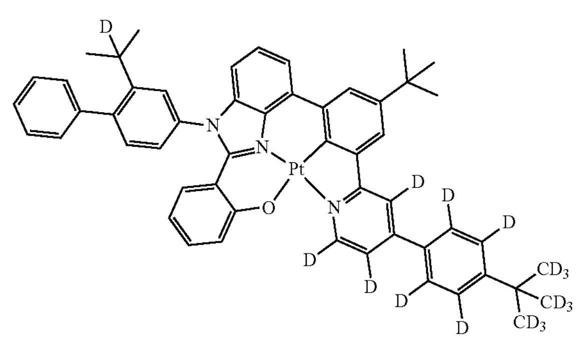

-continued
4-634
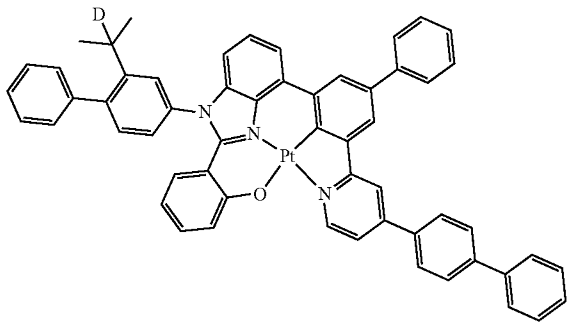
4-635
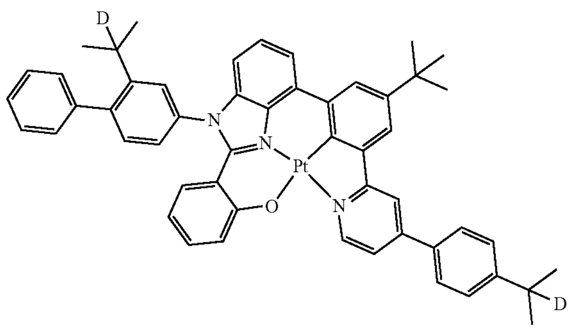
4-636
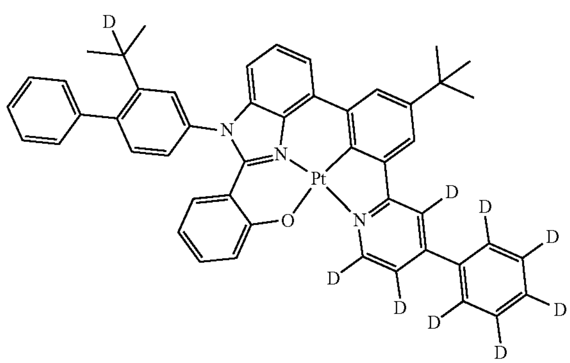
4-637
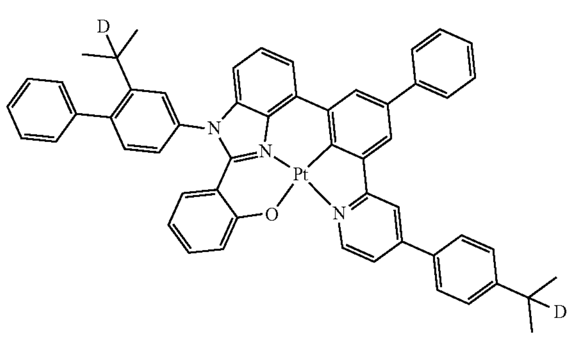
-continued
4-638
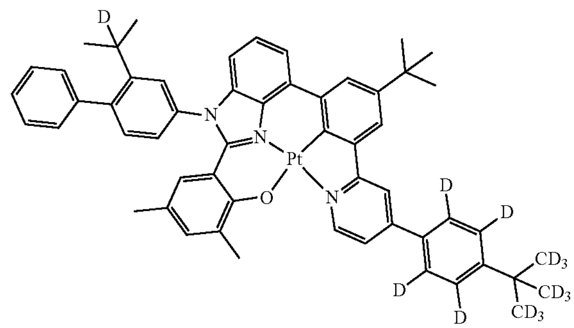
4-639
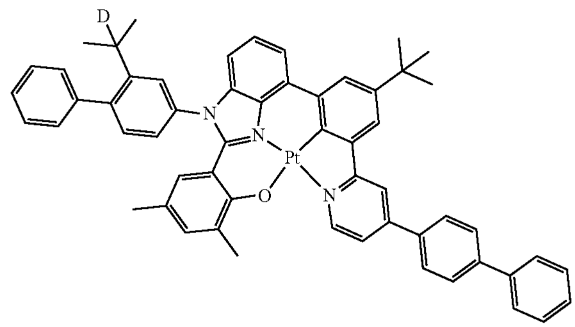
4-640
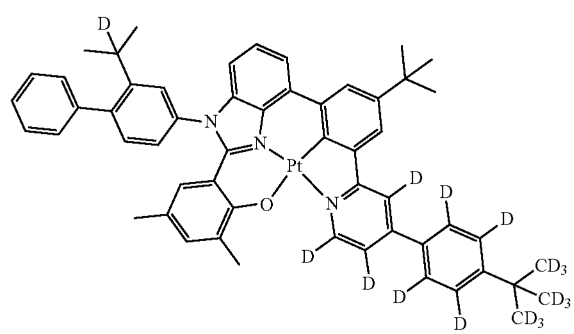
4-641
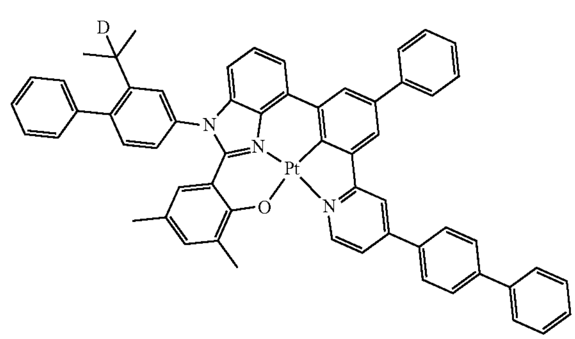

-continued
4-642
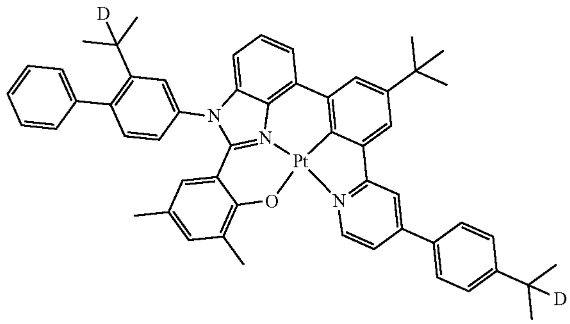
4-643
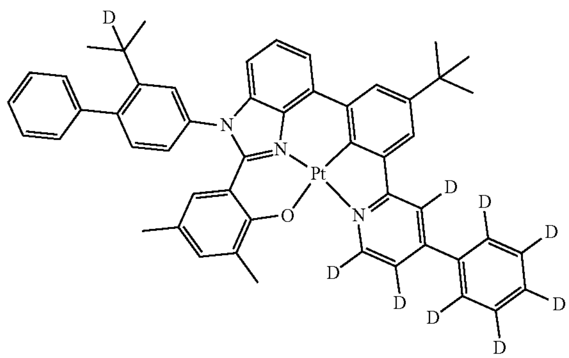
4-644
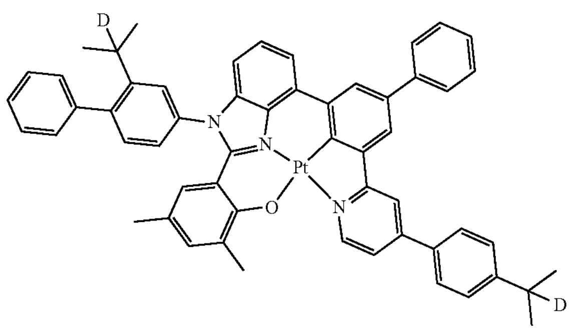
4-645
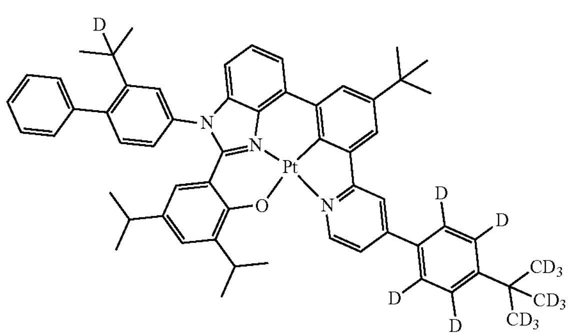
-continued
4-646
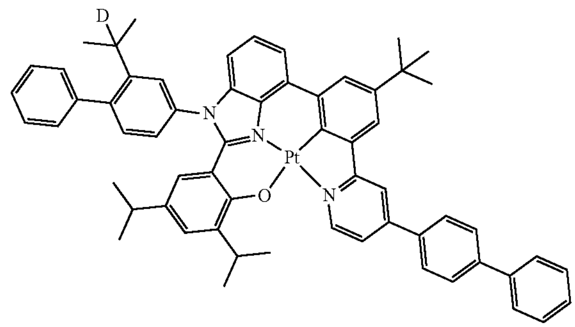
4-647
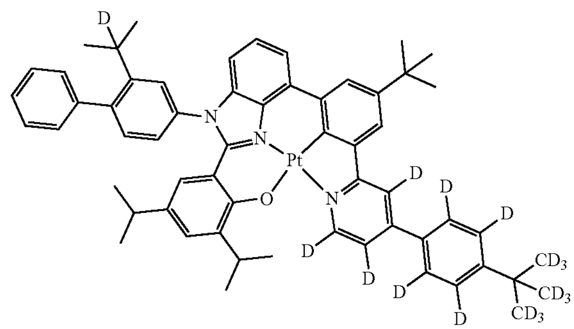
4-648
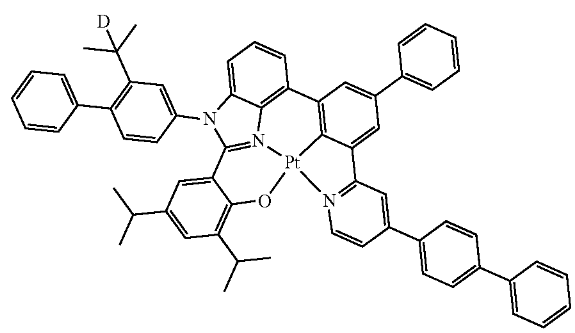
4-649
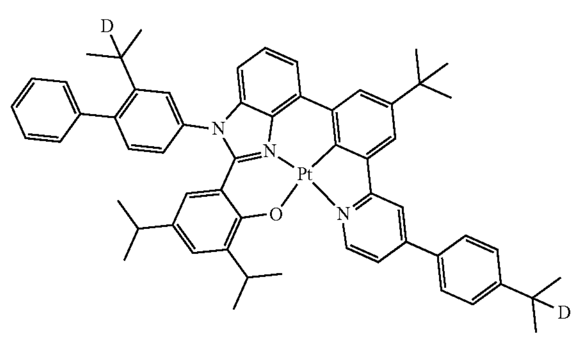

-continued
4-650
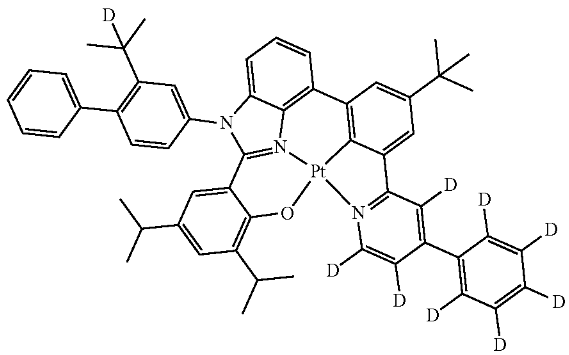
4-651
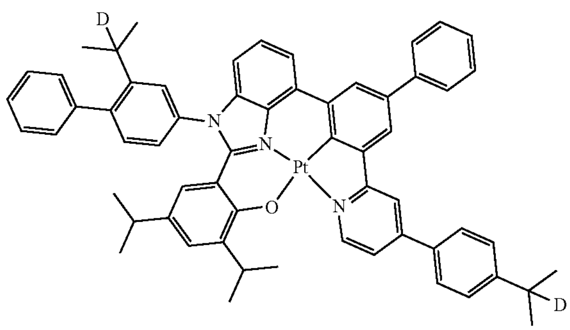
4-652
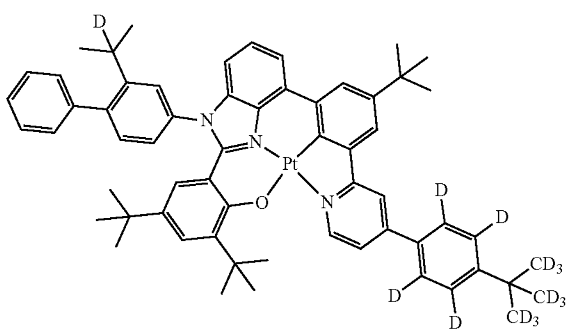
4-653
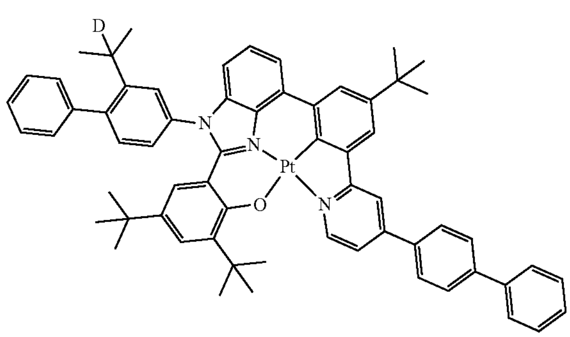
-continued
4-654
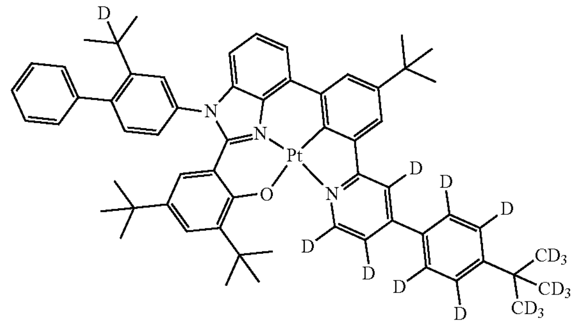
4-655
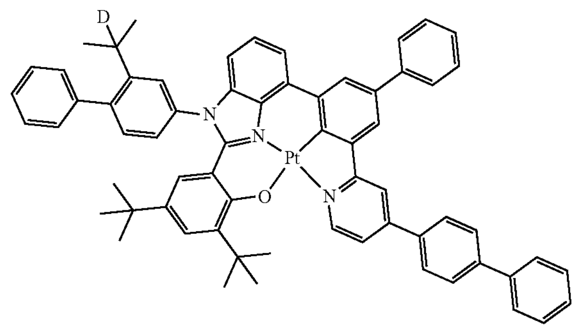
4-656
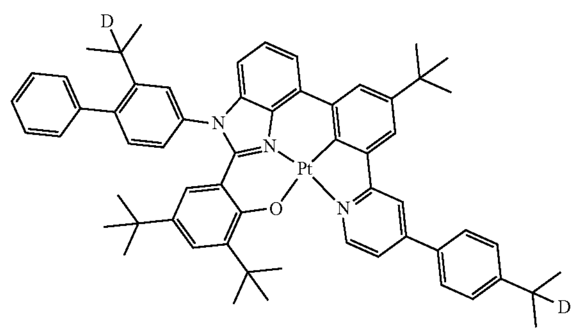
4-657
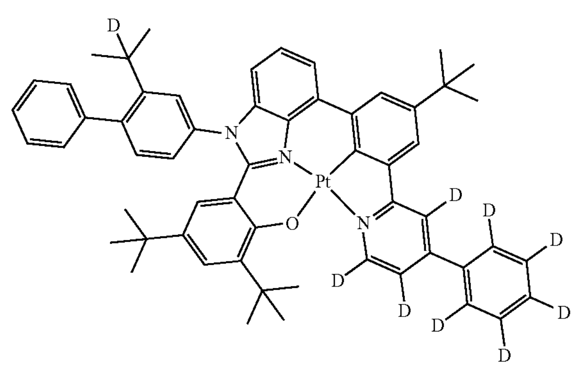

-continued
4-658
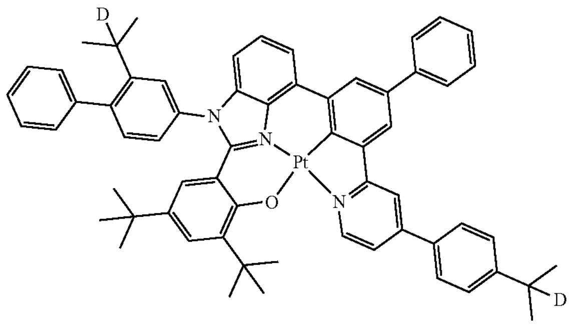
4-659
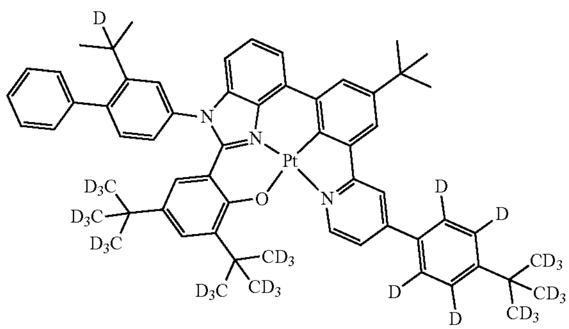
4-660
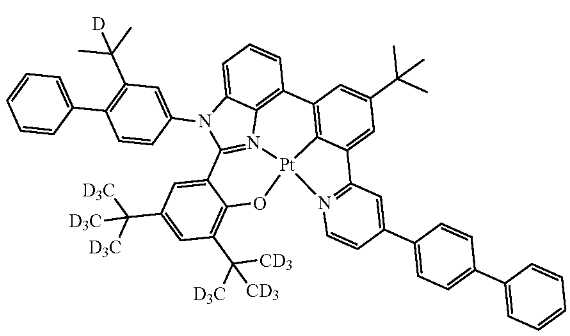
4-661
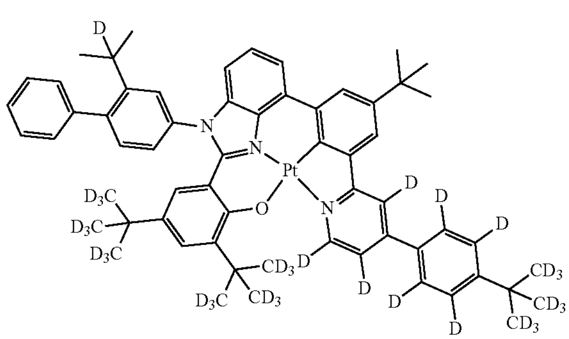
-continued
4-662
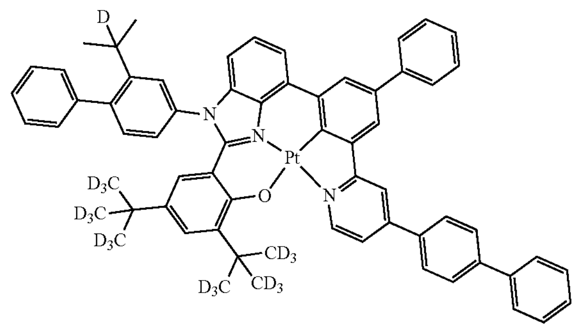
4-663
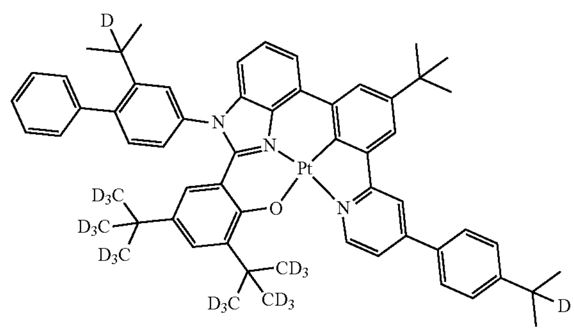
4-664
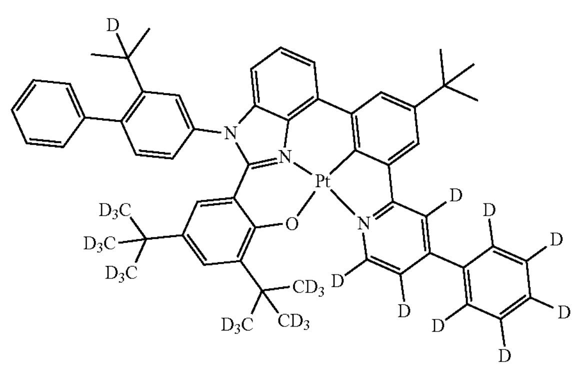
4-665
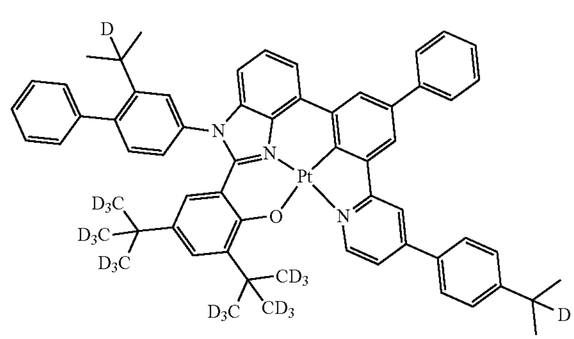

-continued
4-666
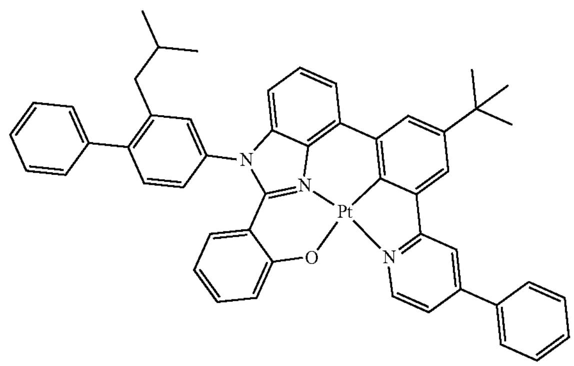
4-667
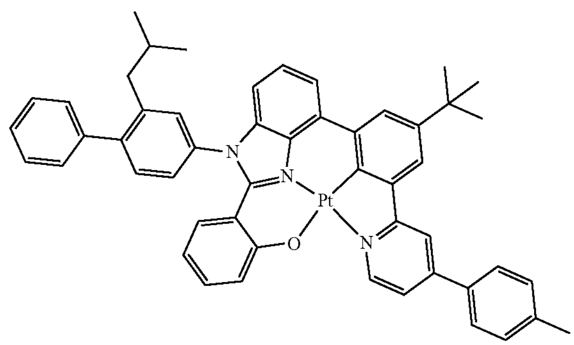
4-668
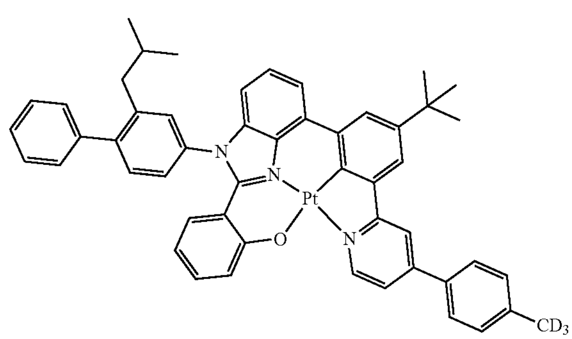
4-669
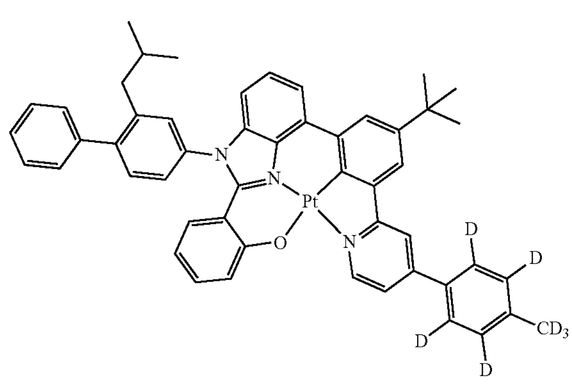
-continued
4-670
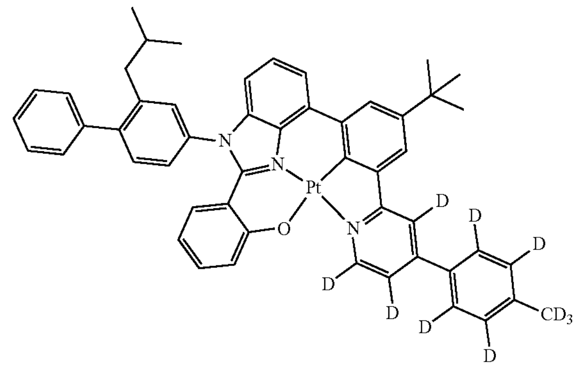
4-671
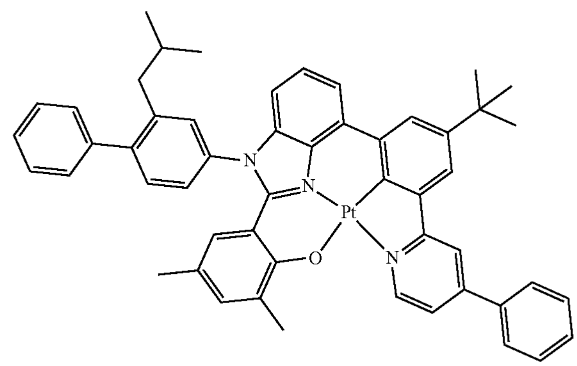
4-672
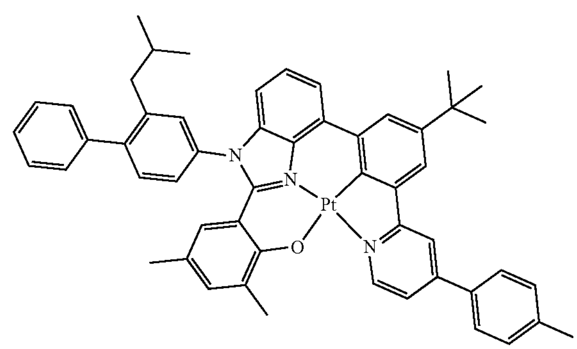
4-673
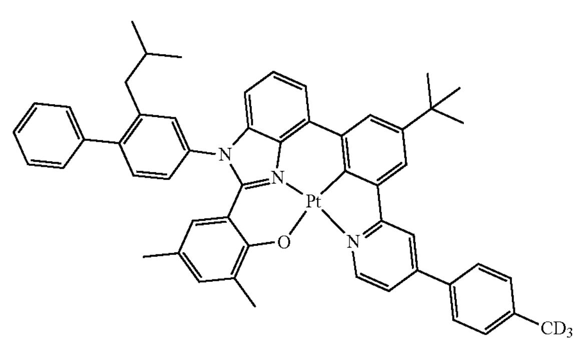

-continued
4-674
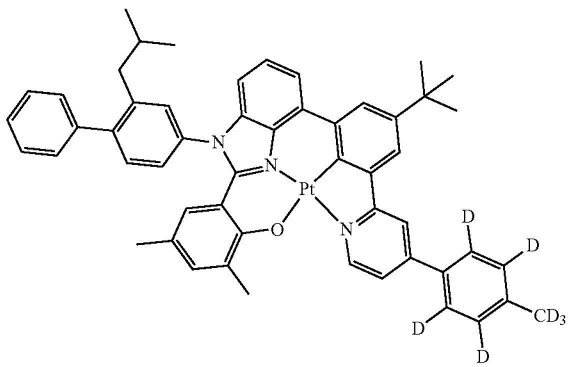
4-675
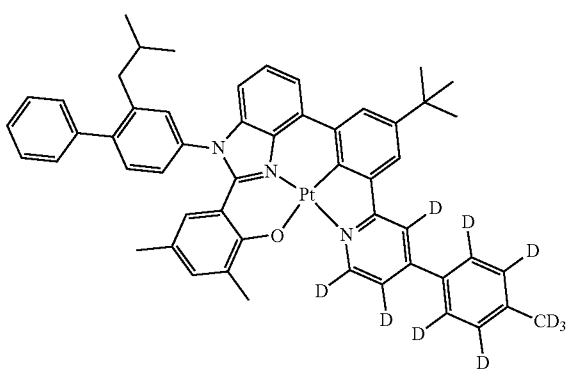
4-676
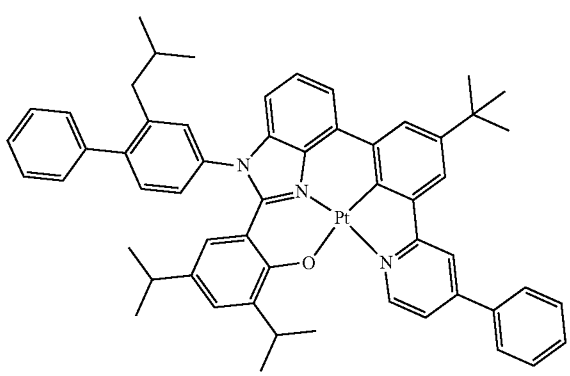
4-677
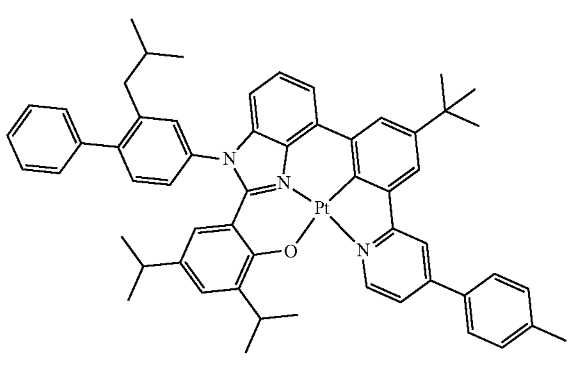
-continued
4-678
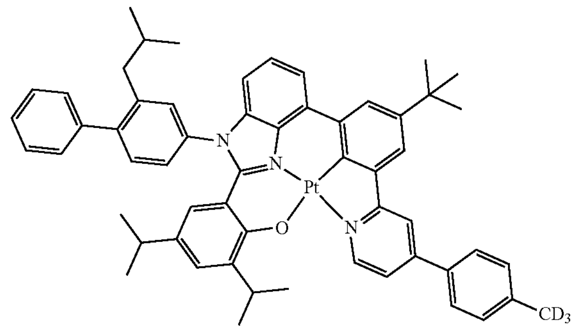
4-679
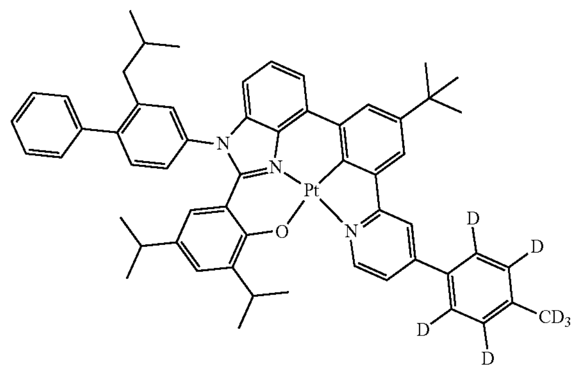
4-680
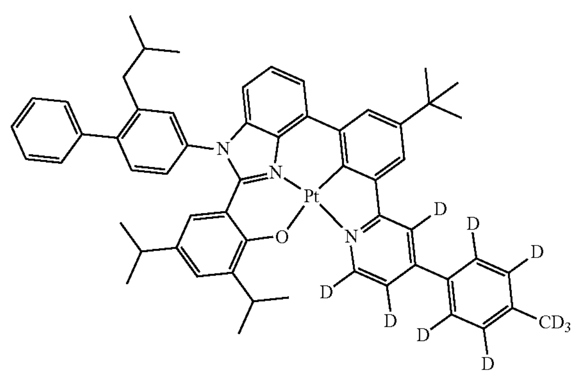
4-681
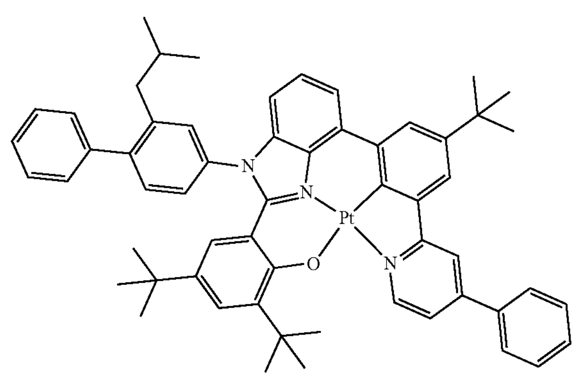

-continued
4-682
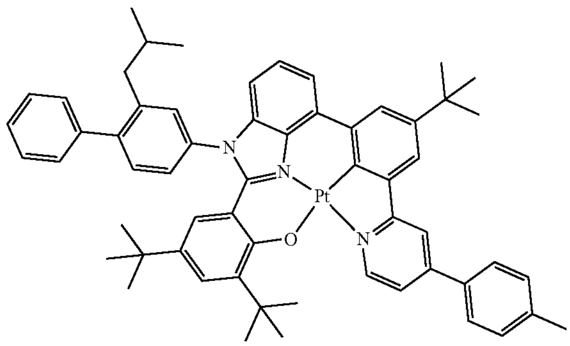
4-683
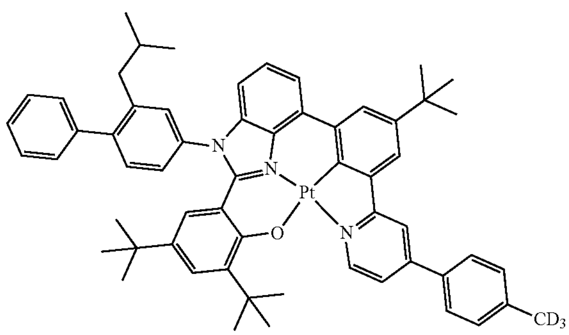
4-684
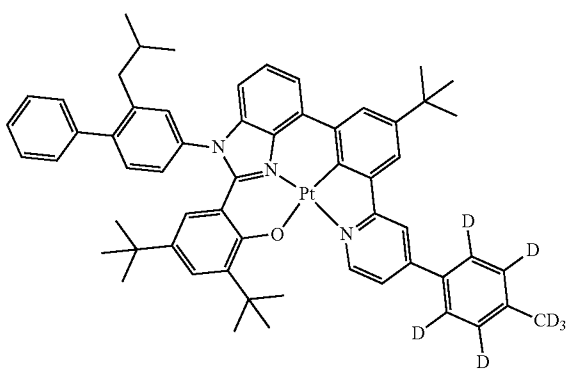
4-685
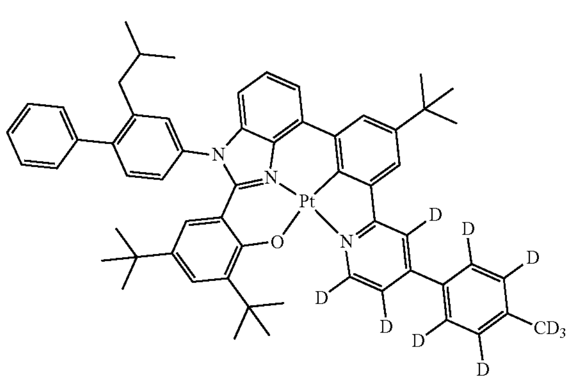
-continued
4-686
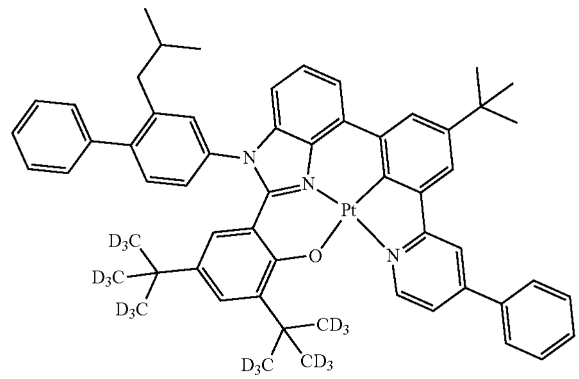
4-687
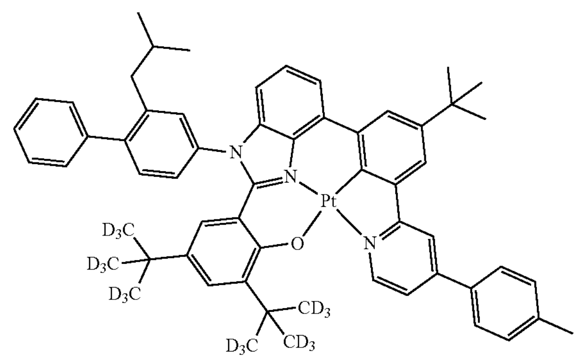
4-688
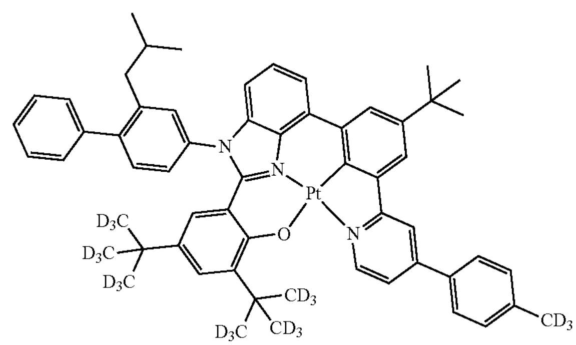
4-689
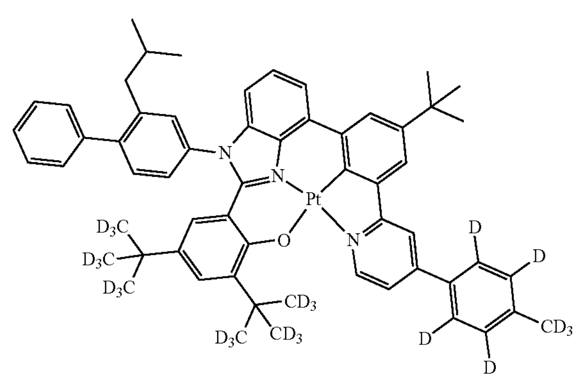

-continued
4-690
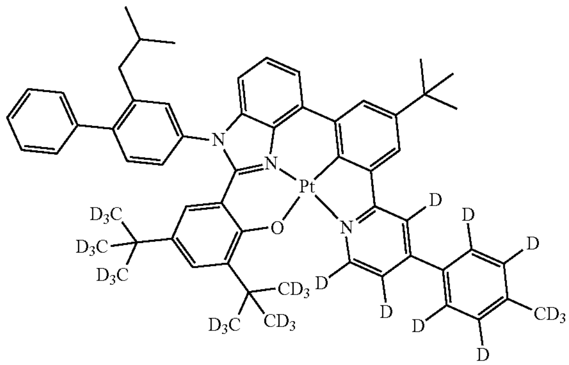
4-691
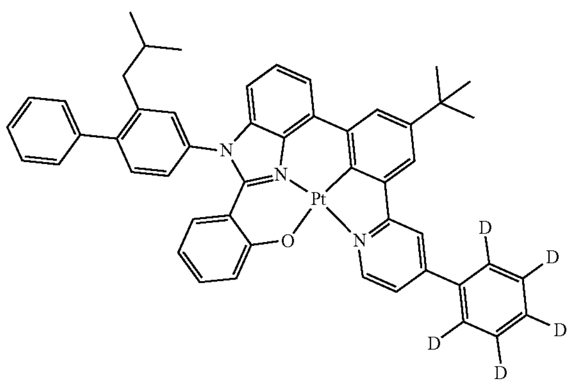
4-692
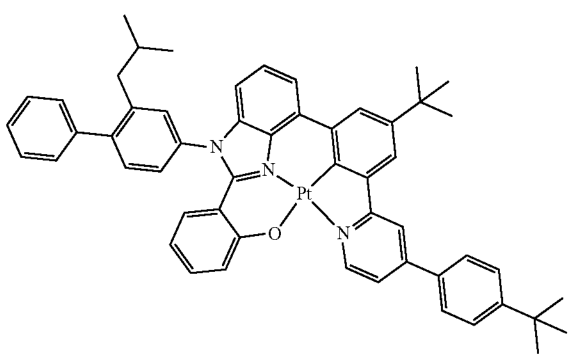
4-693
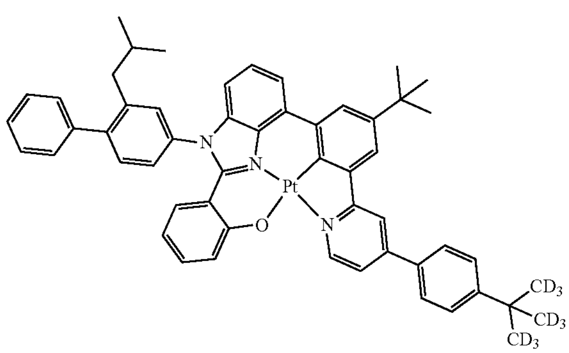
-continued
4-694
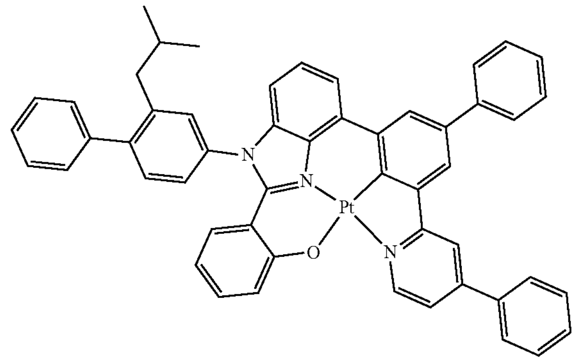
4-695
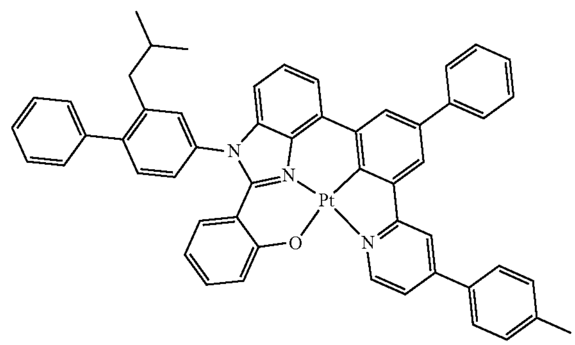
4-696
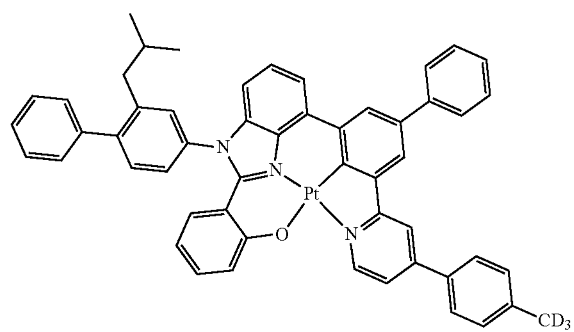
4-697
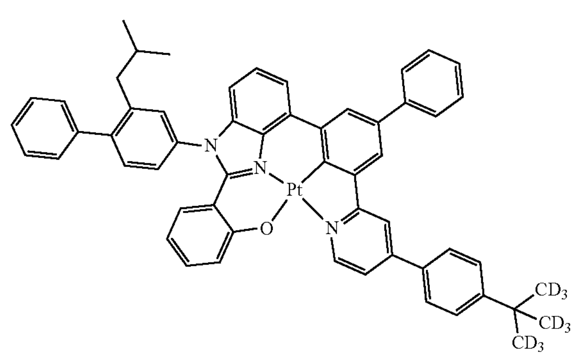

4-698
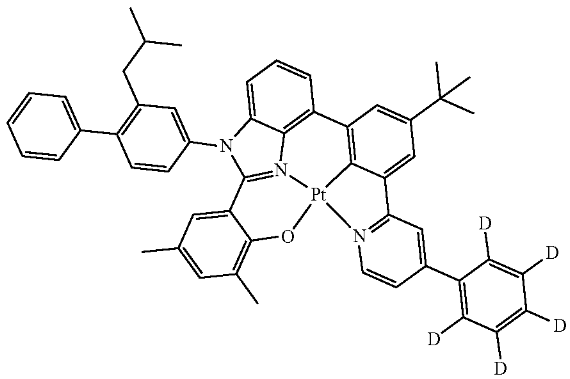
4-699
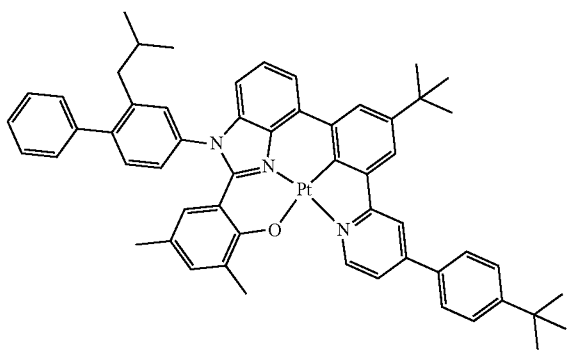
4-700
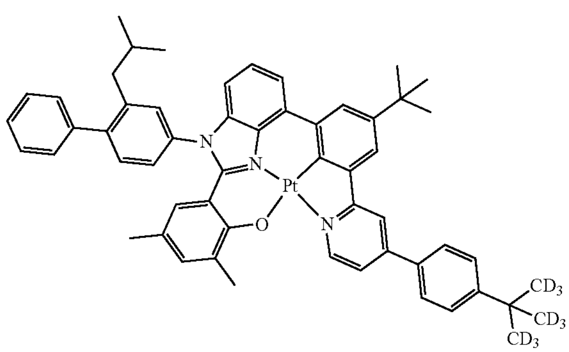
4-701
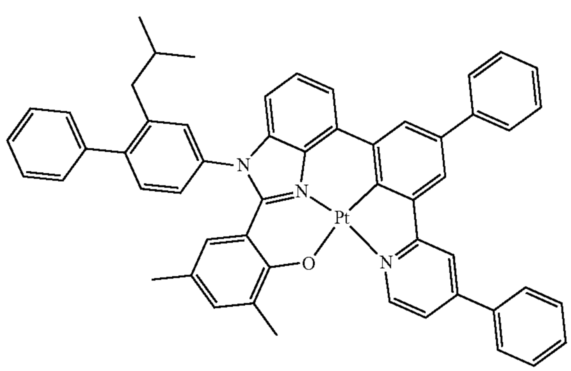
4-702
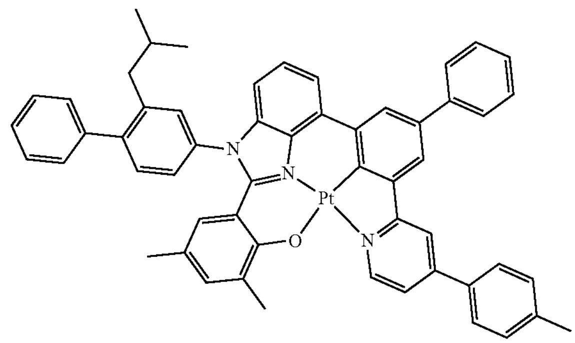
4-703
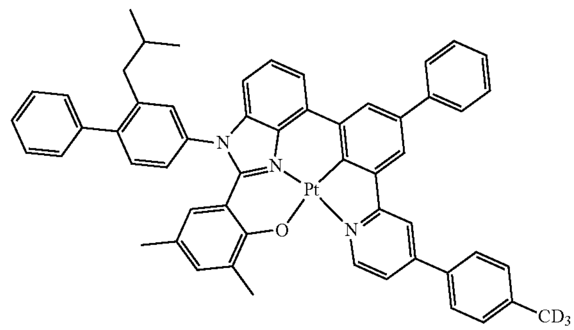
4-704
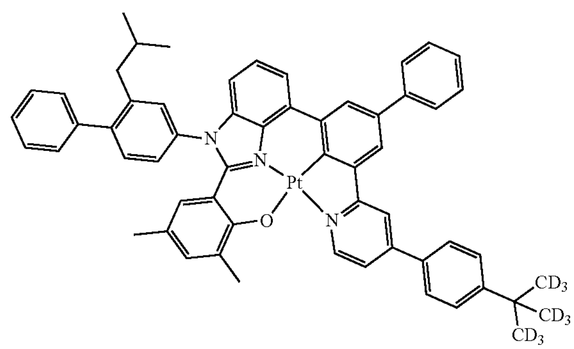
4-705
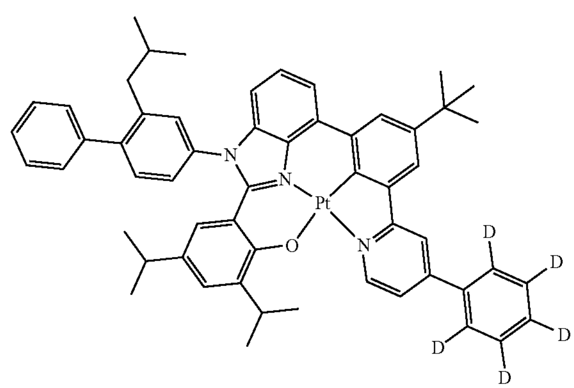

-continued
4-706
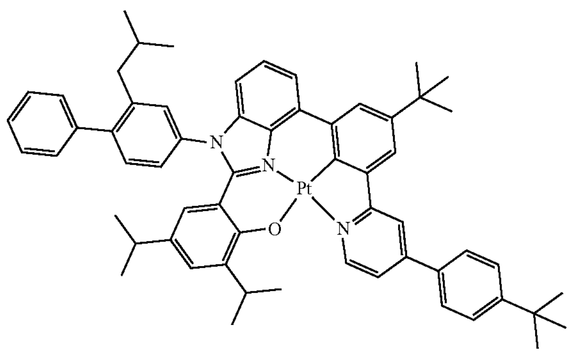
4-707
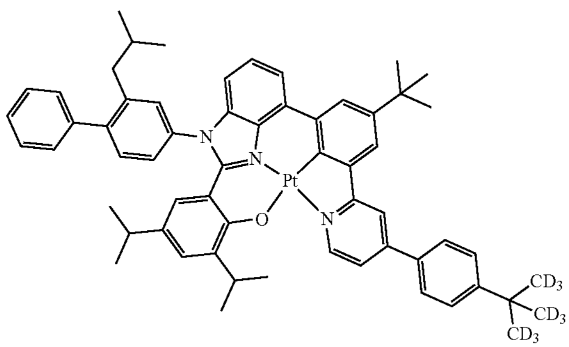
4-708
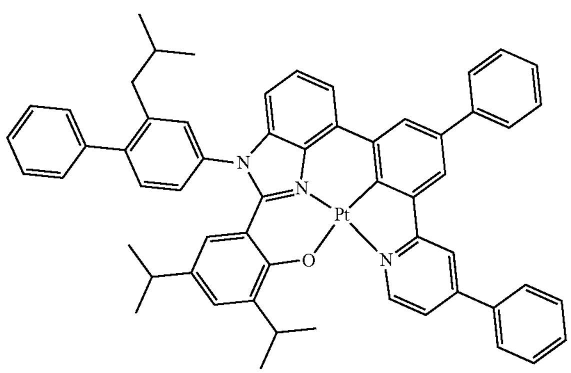
4-709
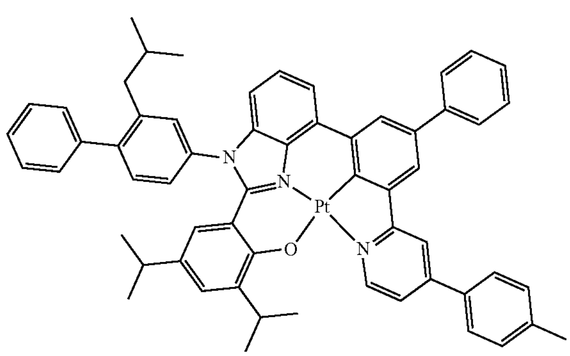
-continued
4-710
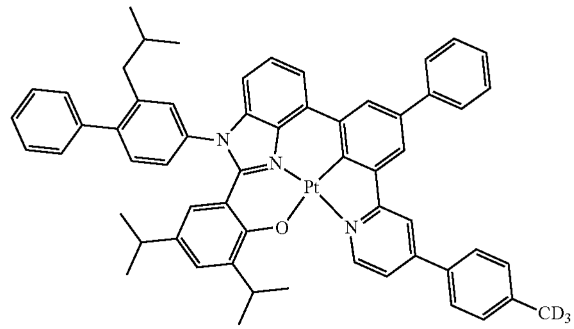
4-711
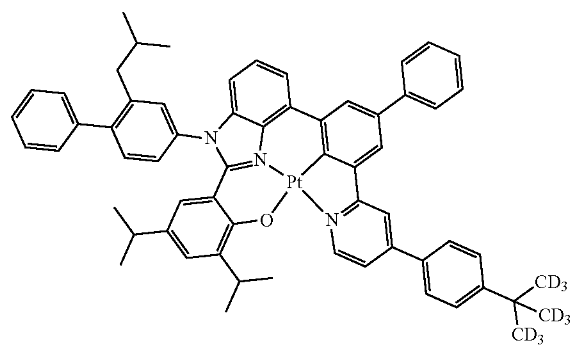
4-712
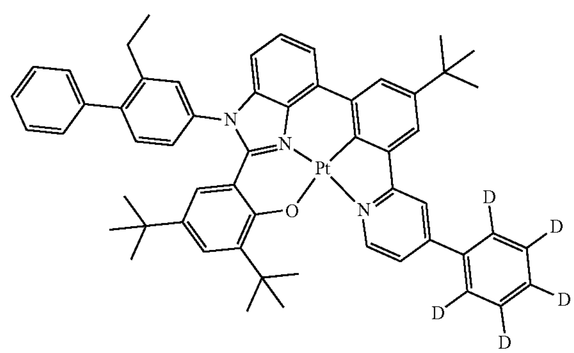
4-713
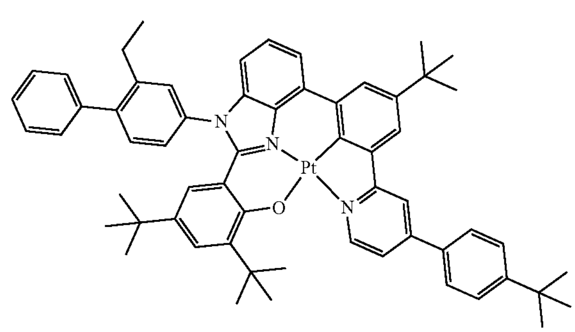

-continued
4-714
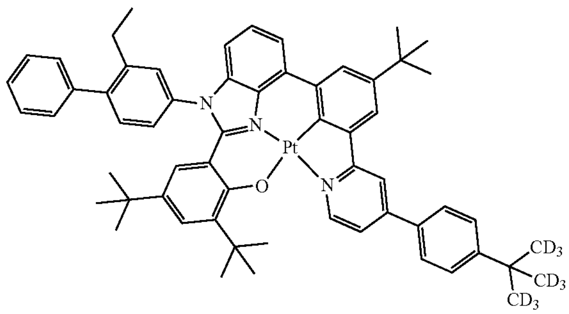
4-715
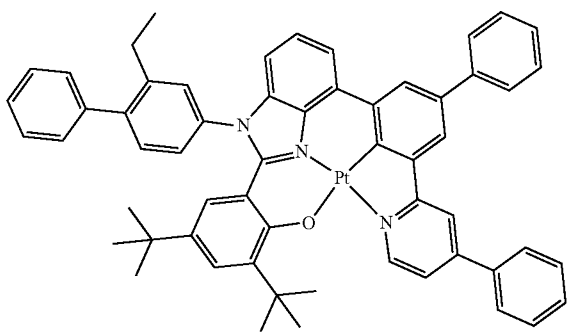
4-716
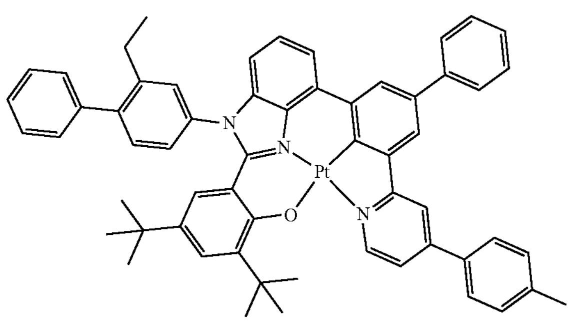
4-717
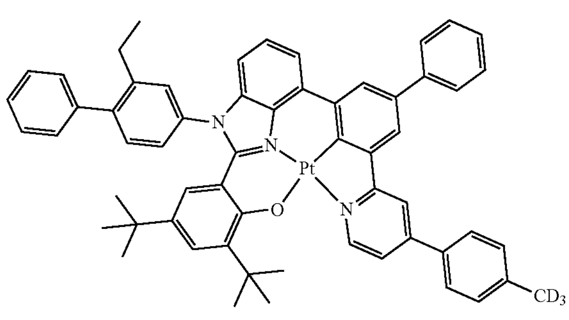
-continued
4-718
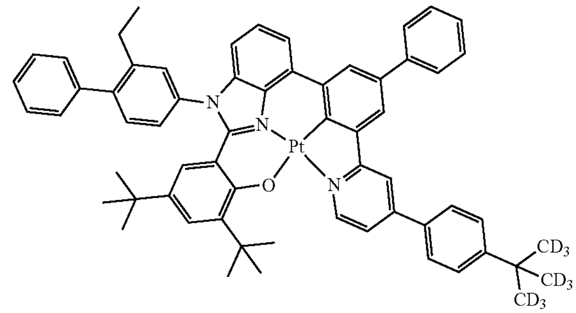
4-719
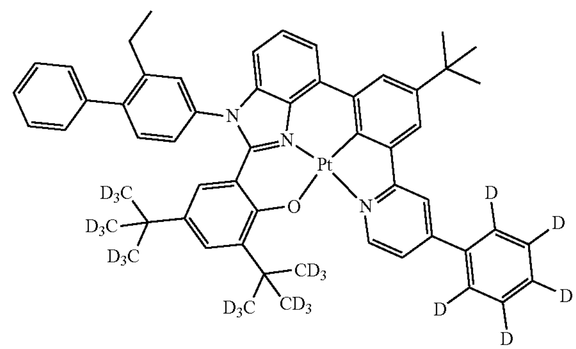
4-720
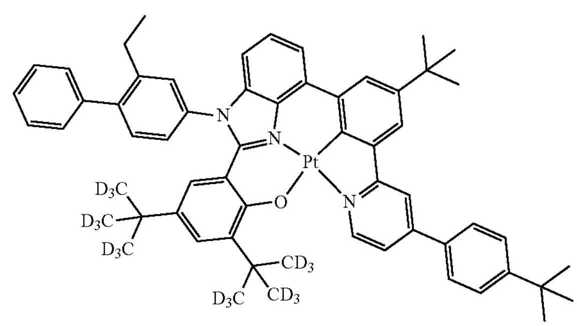
4-721
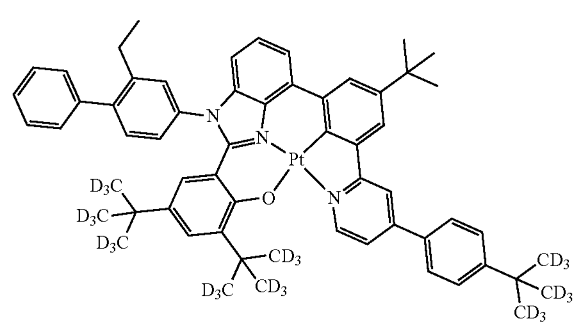

-continued
4-722
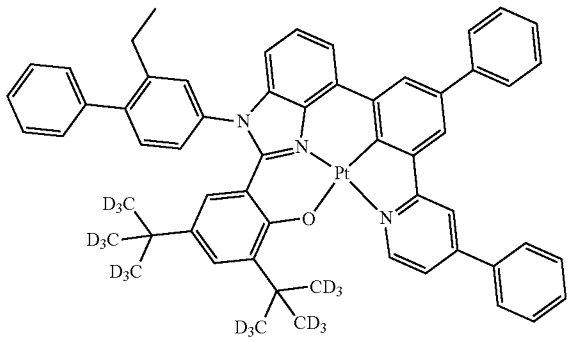
4-723
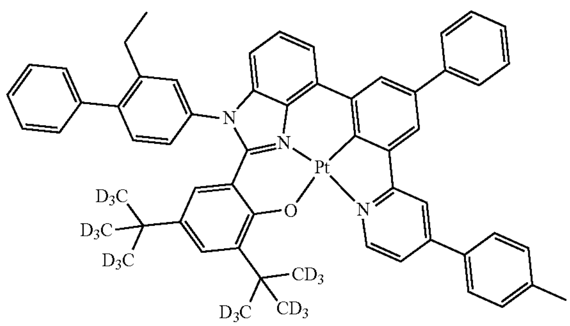
4-724
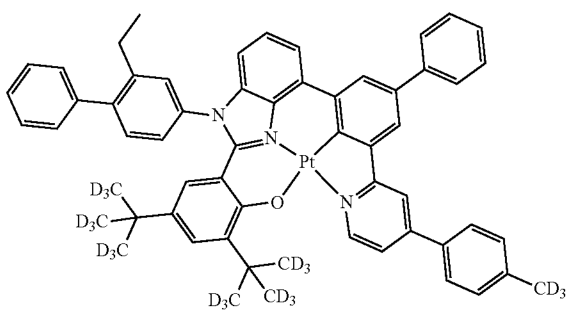
4-725
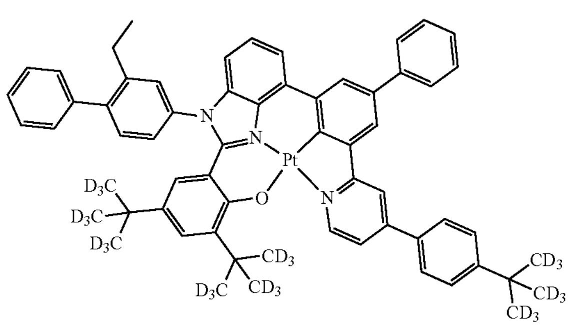
-continued
4-726
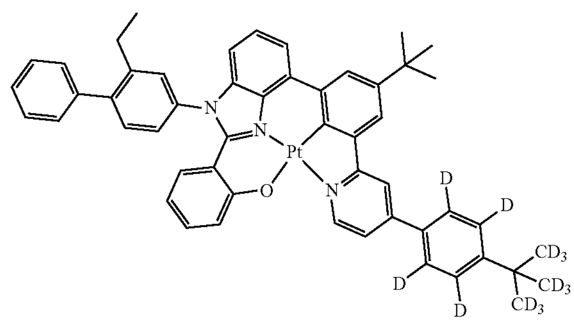
4-727
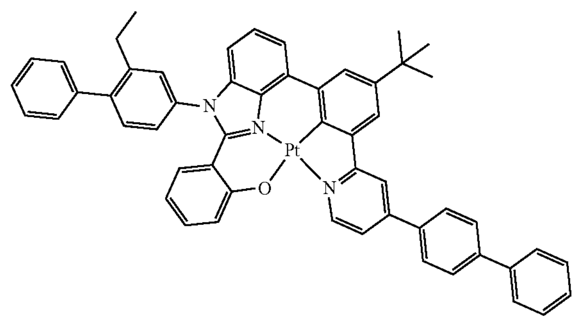
4-728
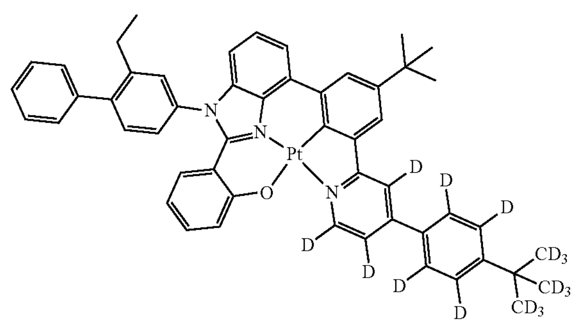
4-729
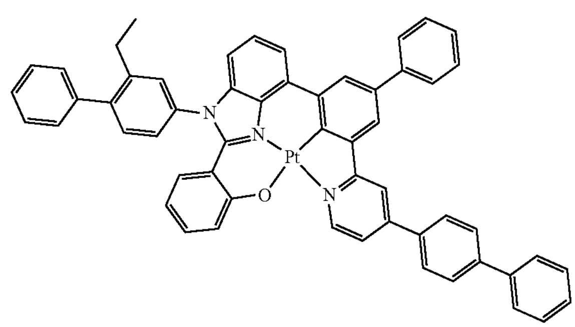

-continued
4-730
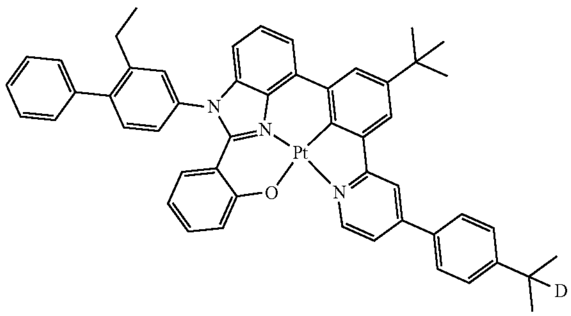
4-731
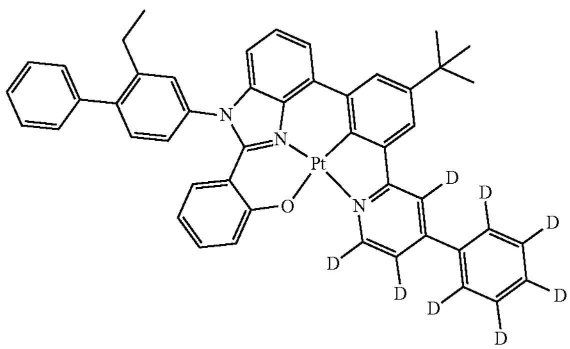
4-732
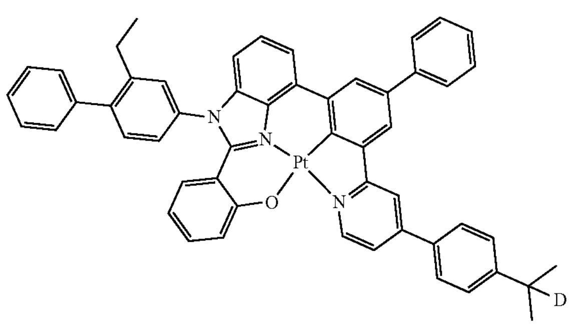
4-733
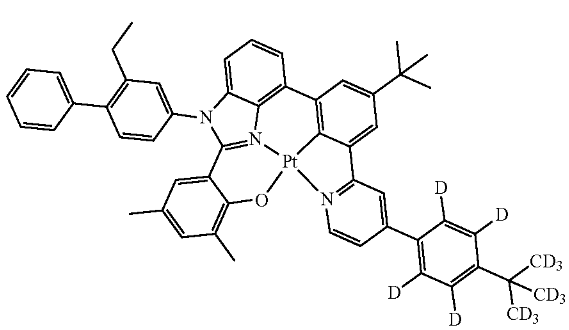
-continued
4-734
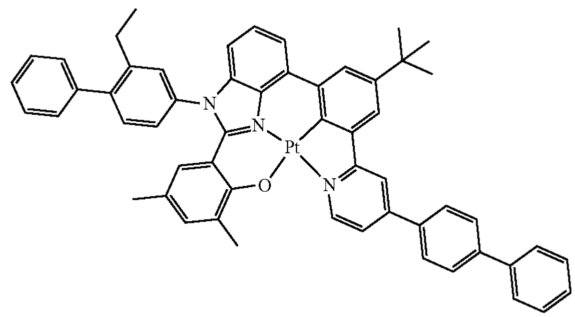
4-735
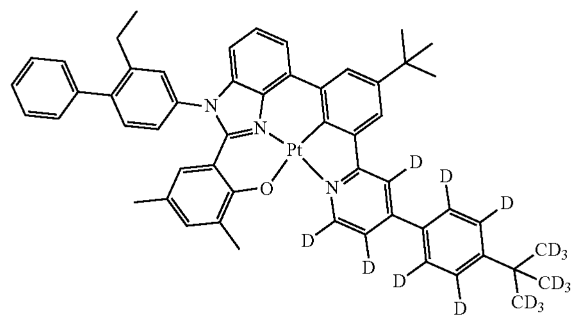
4-736
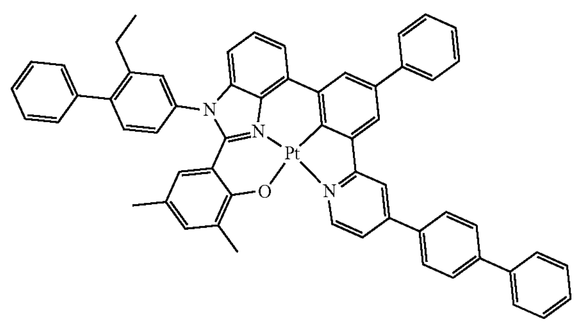
4-737
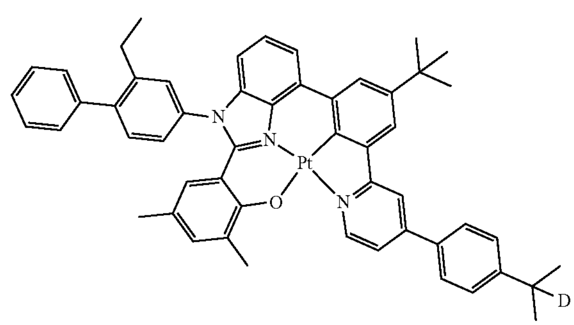

4-738
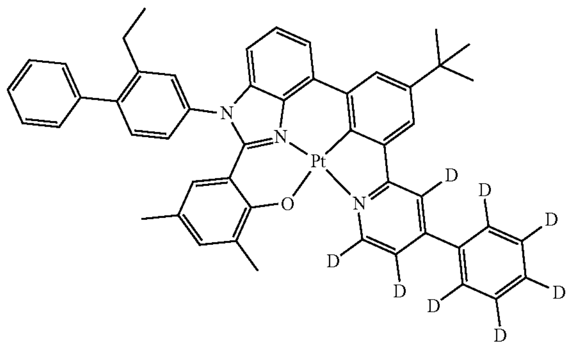
4-739
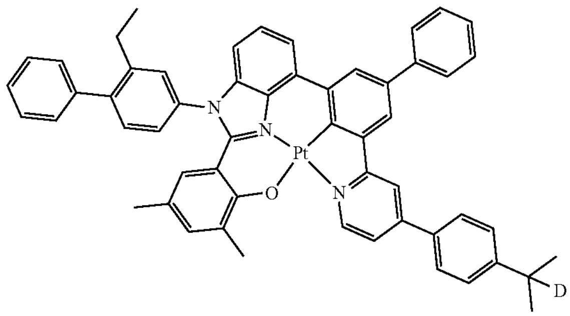
4-740
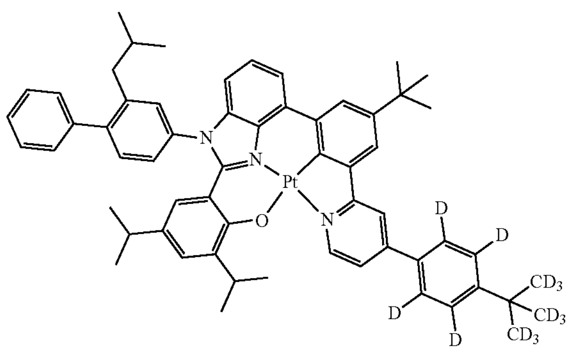
4-741
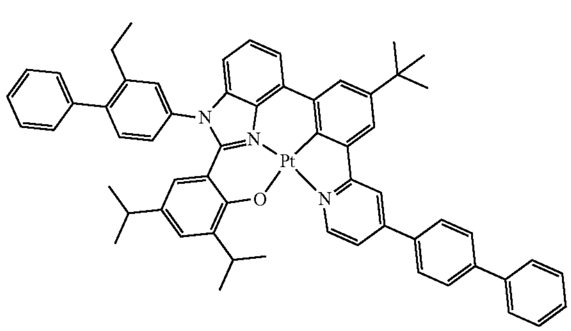
4-742
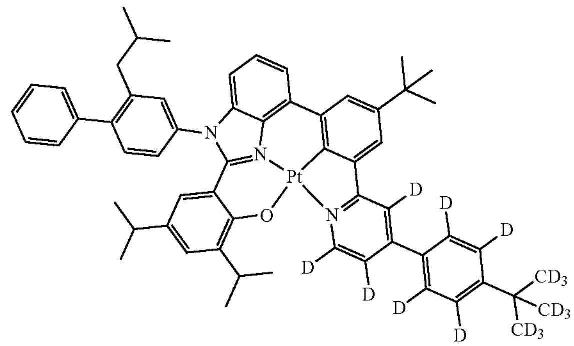
4-743
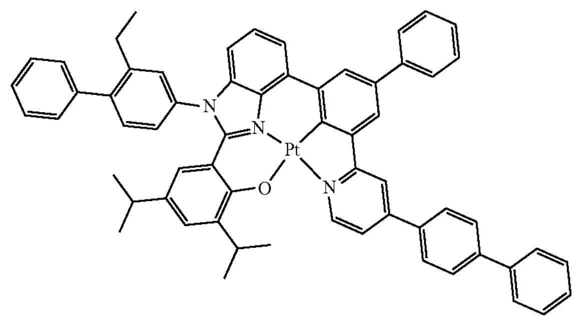
4-744
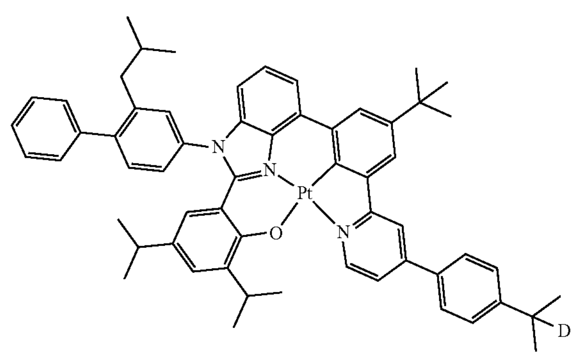
4-745
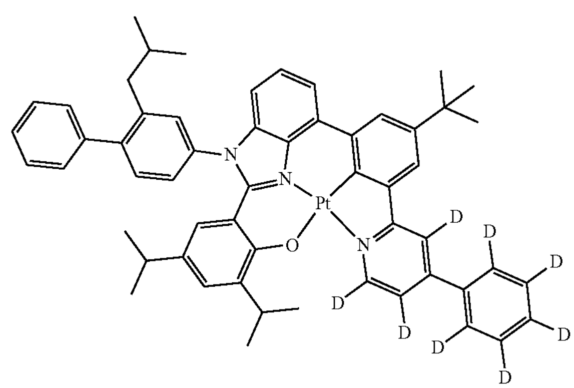

-continued
4-746
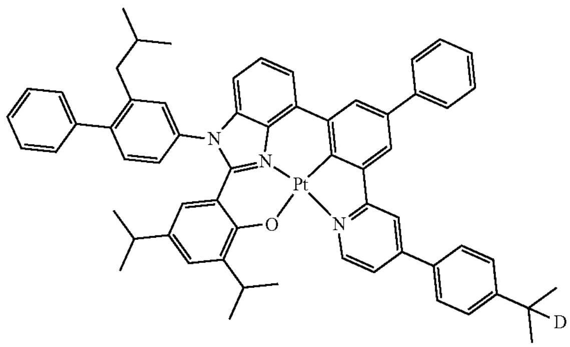
4-747
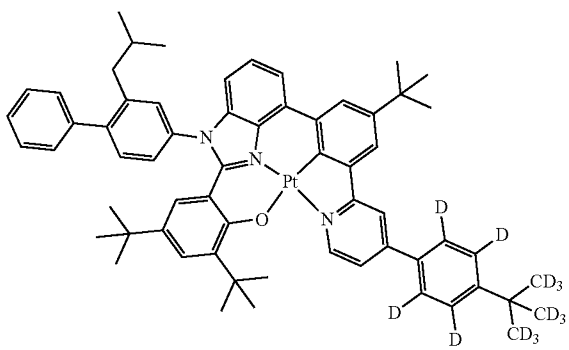
4-748
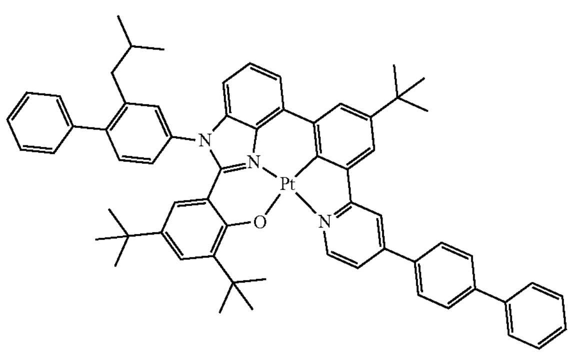
4-749
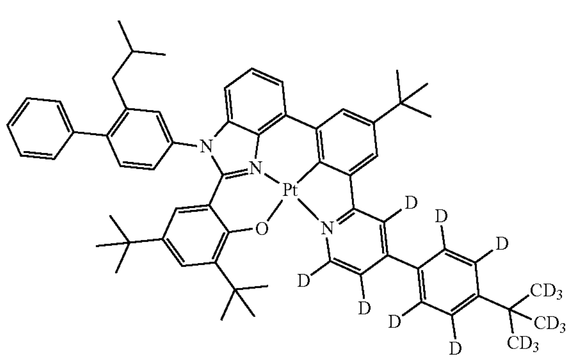
-continued
4-750
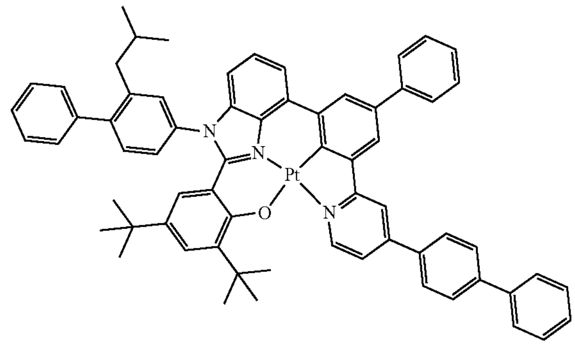
4-751
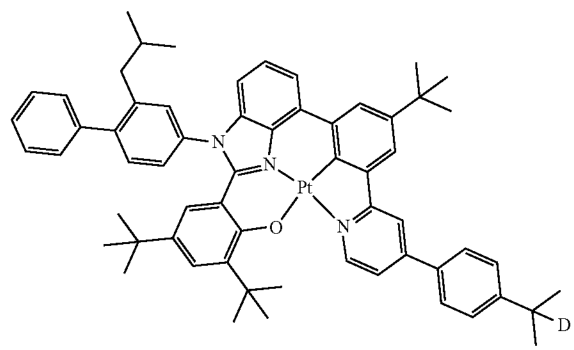
4-752
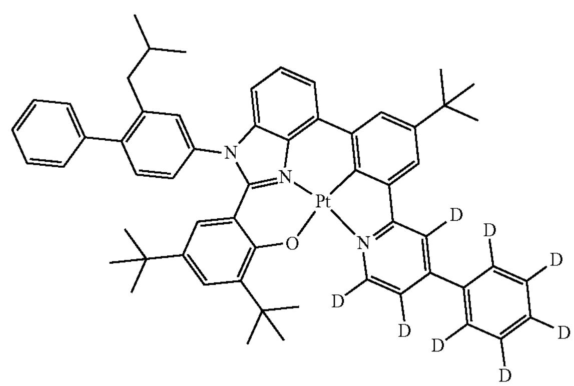
4-753
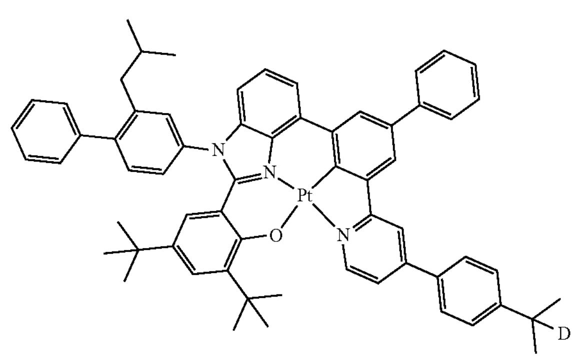

-continued
4-754
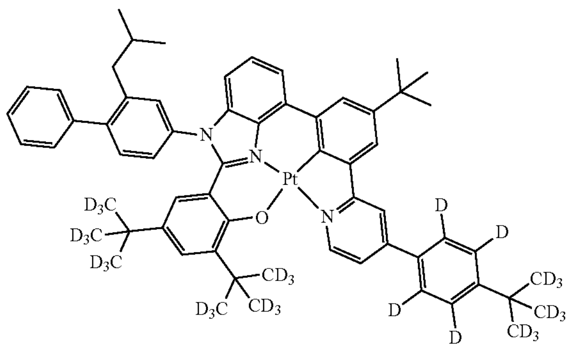
4-755
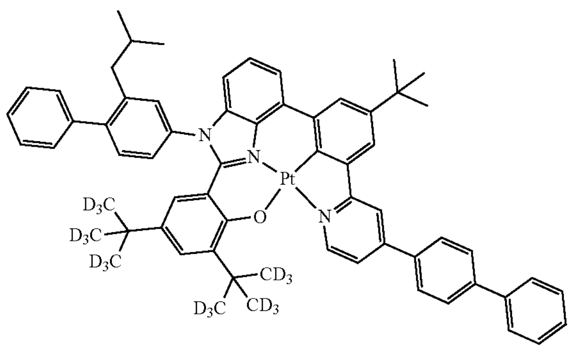
4-756
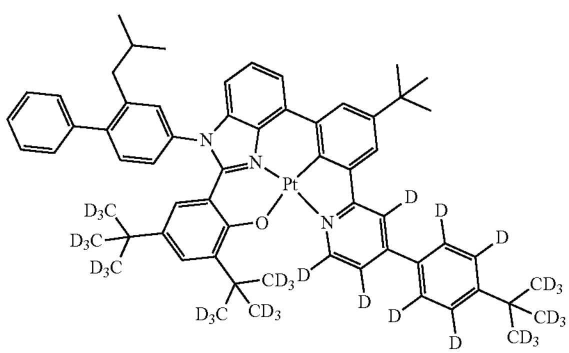
4-757
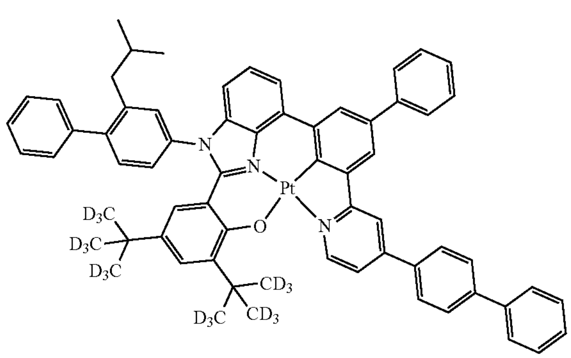
-continued
4-758
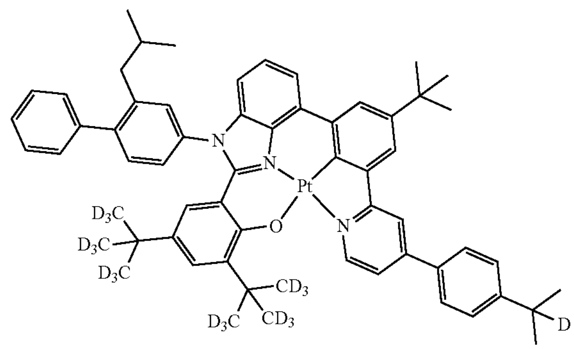
4-759
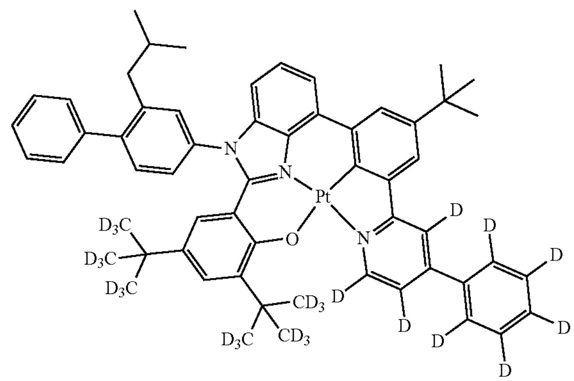
4-760
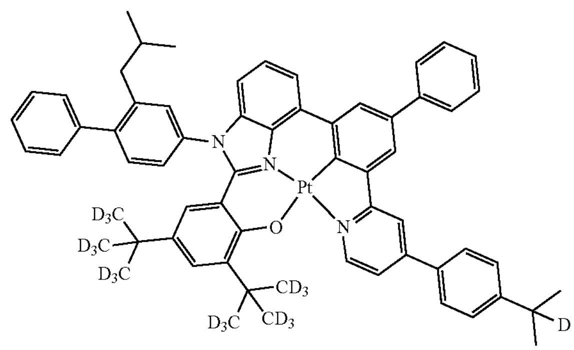
4-761
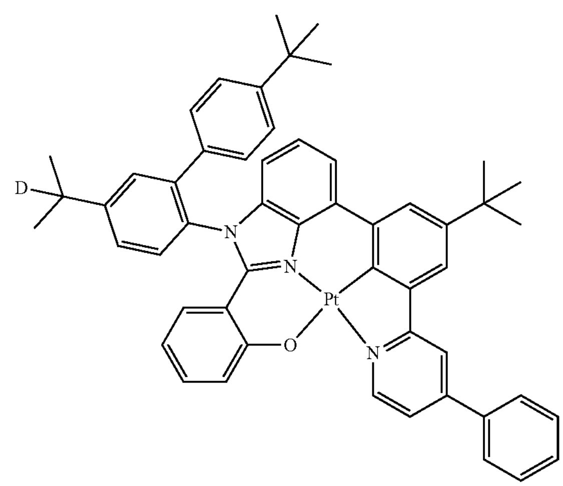

-continued
4-762
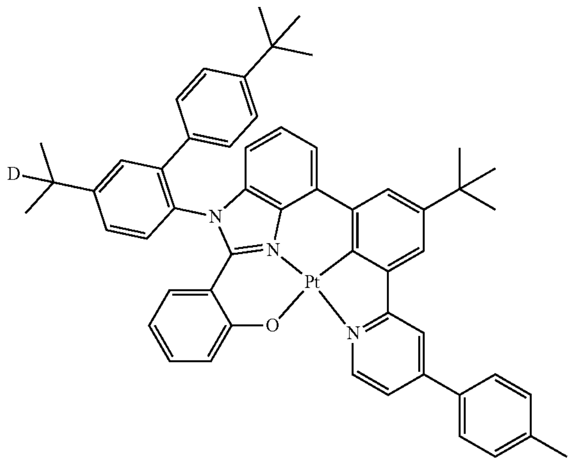
4-763
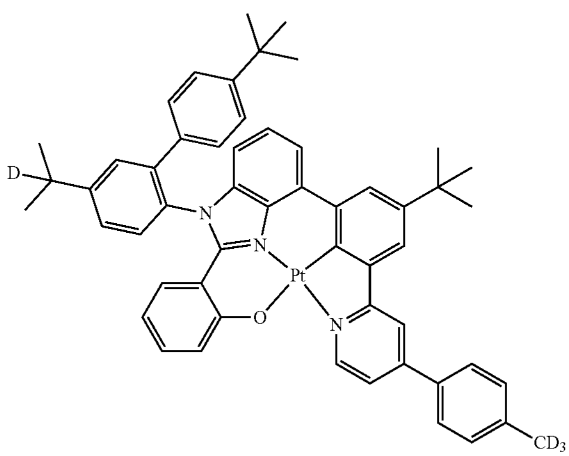
4-764
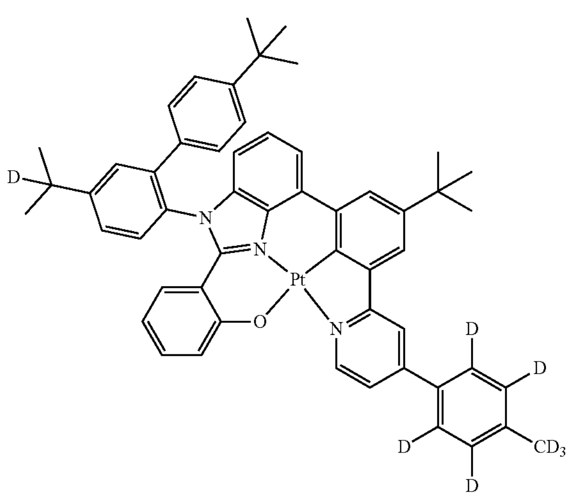
-continued
4-765
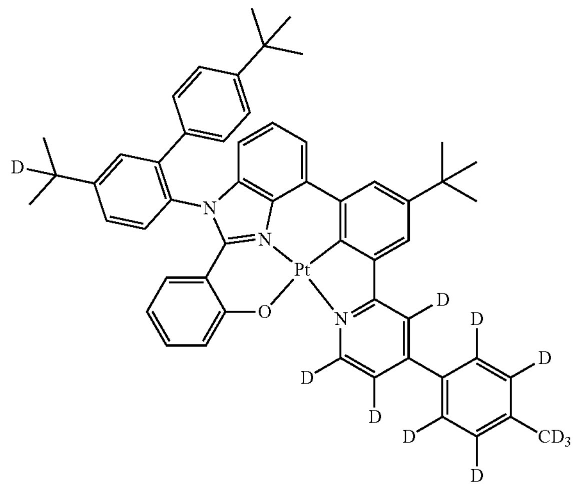
4-766
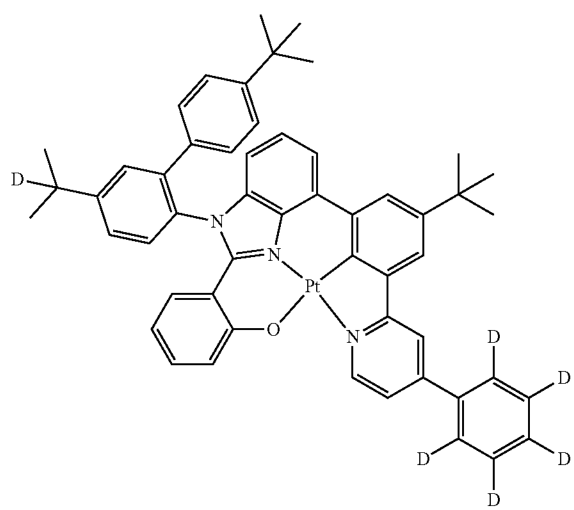
4-767
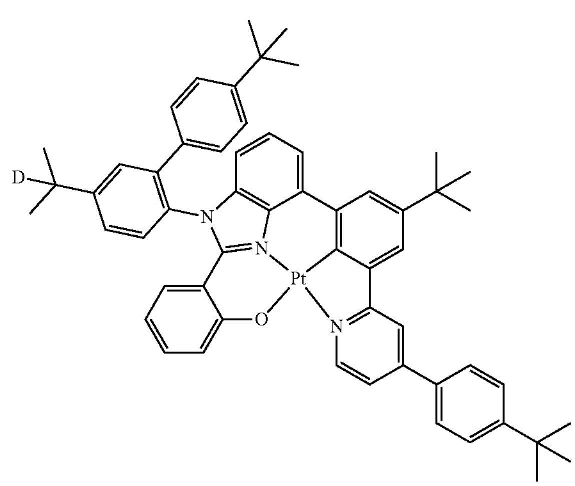

-continued
4-768
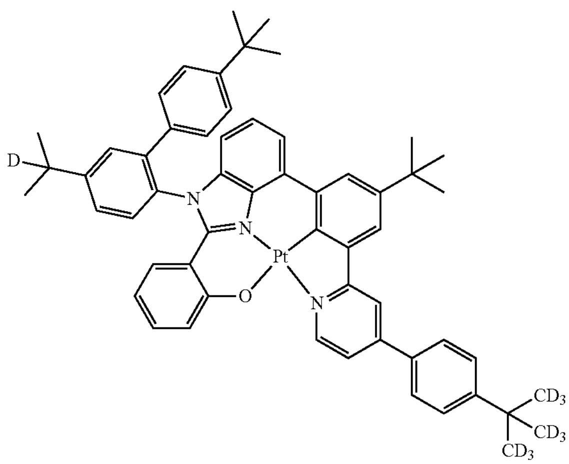
4-769
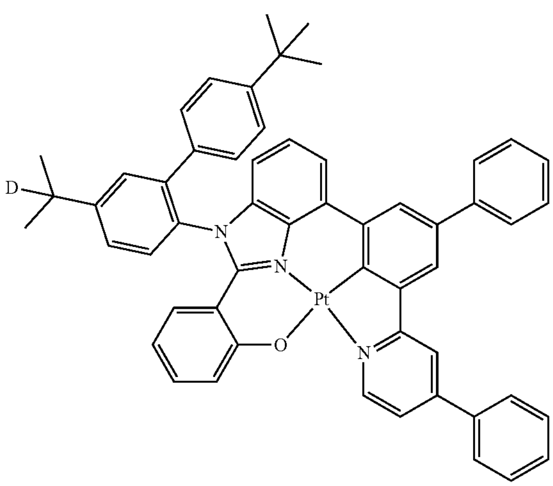
4-770
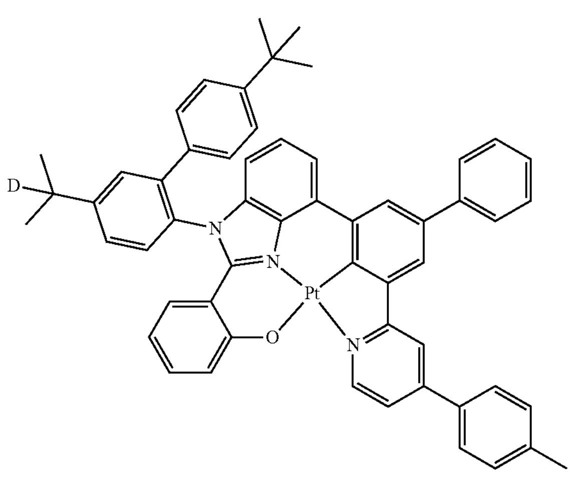
-continued
4-771
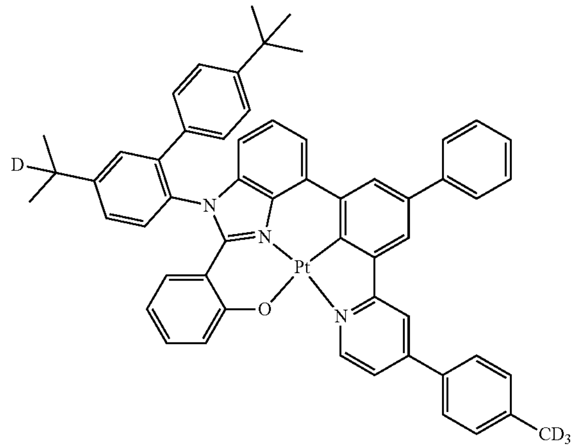
4-772
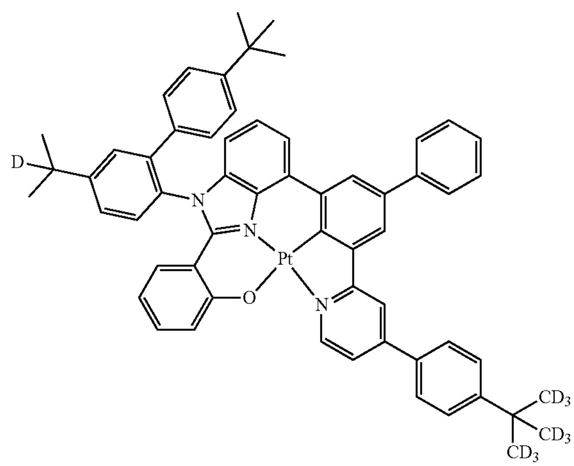
4-773
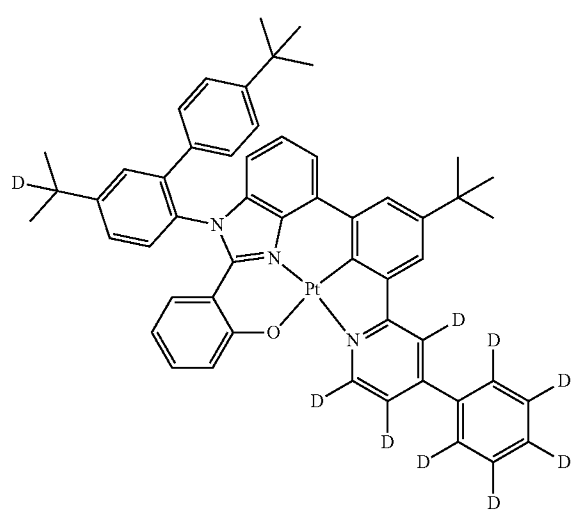

-continued
4-774
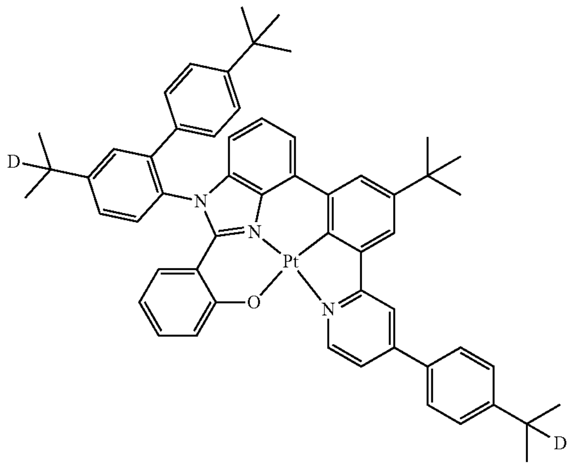
4-775
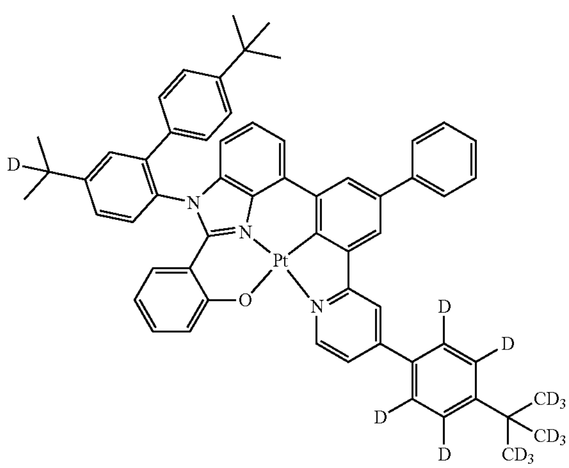
4-776
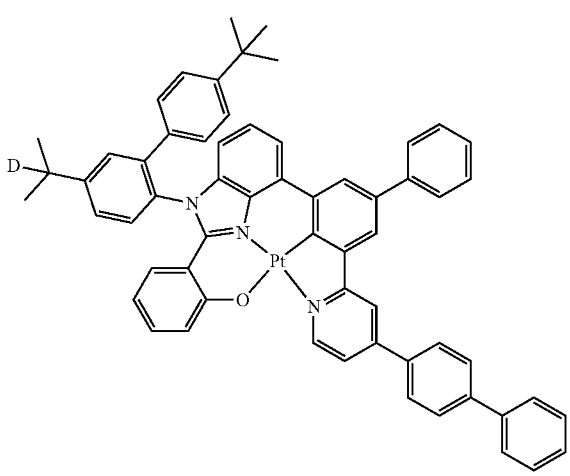
-continued
4-777
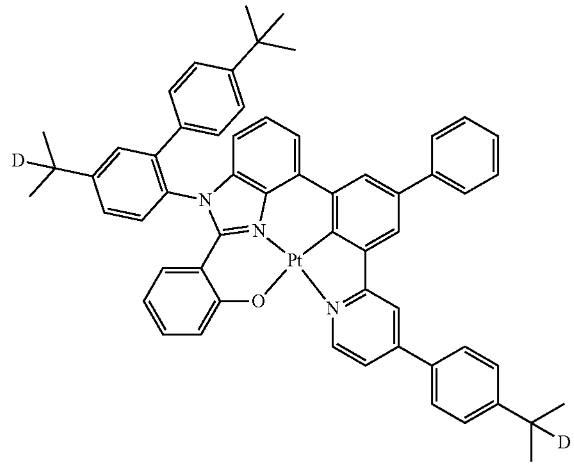
4-778
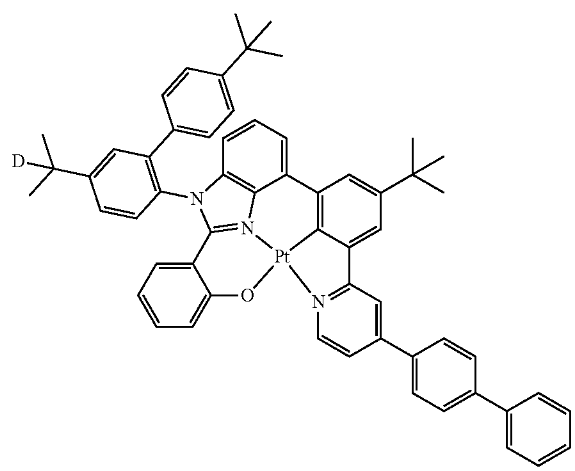
4-779
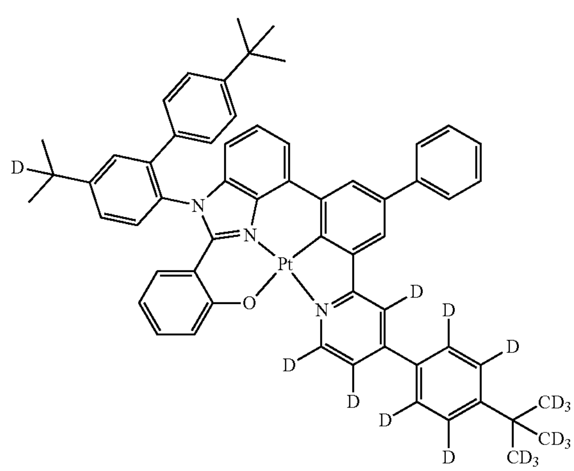

-continued
4-780
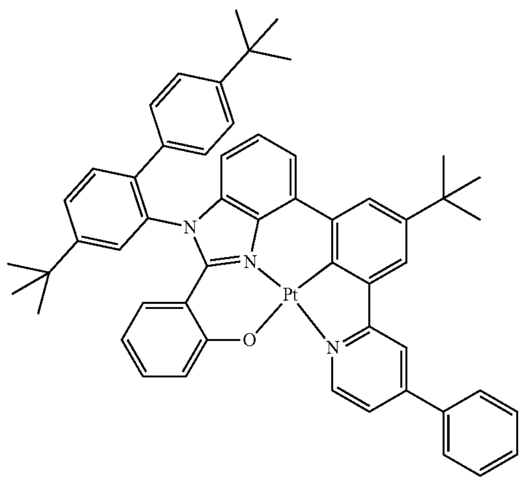
4-781
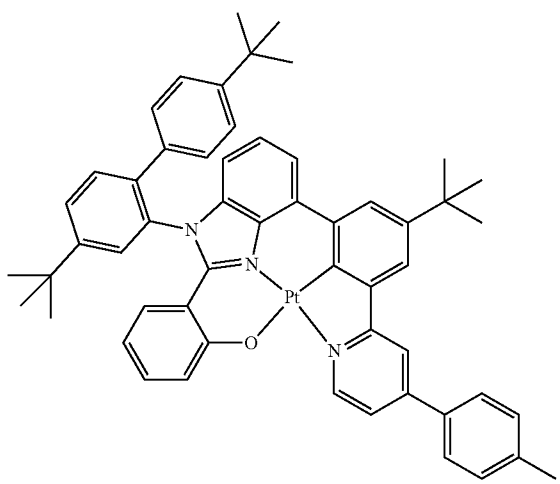
4-782
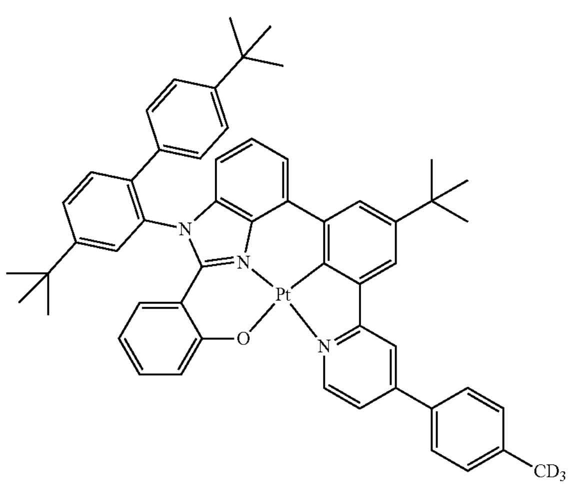
-continued
4-783
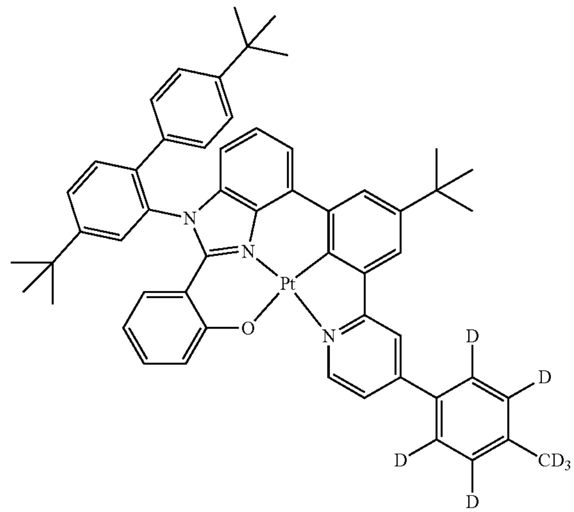
4-784
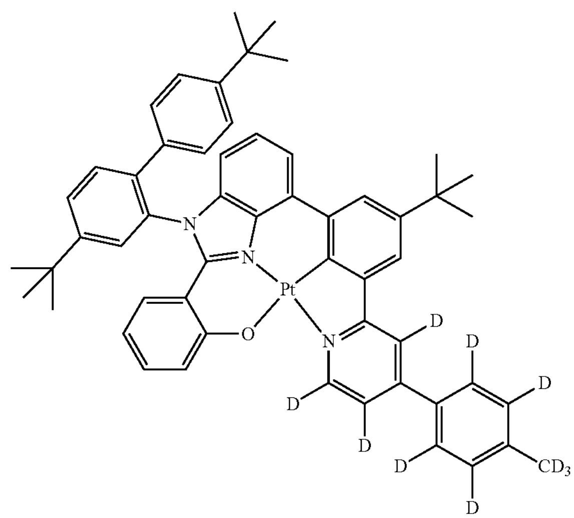
4-785
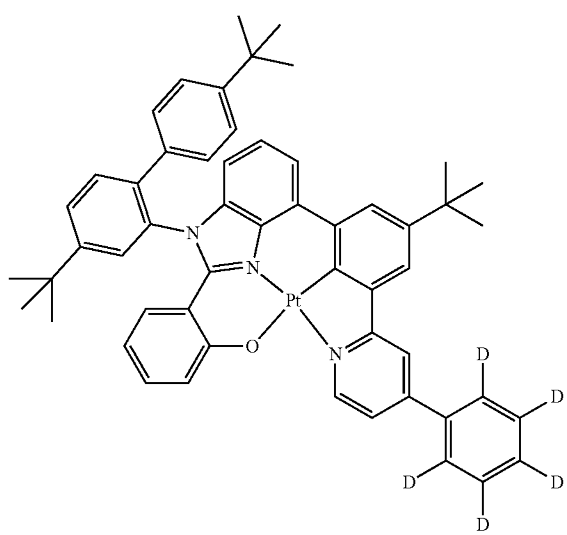

-continued
4-786
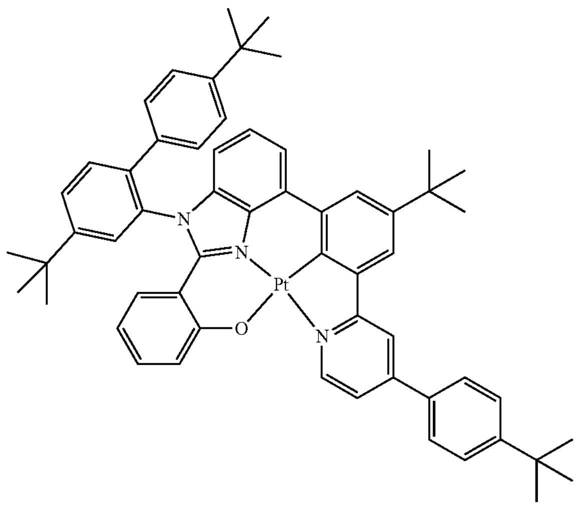
4-787
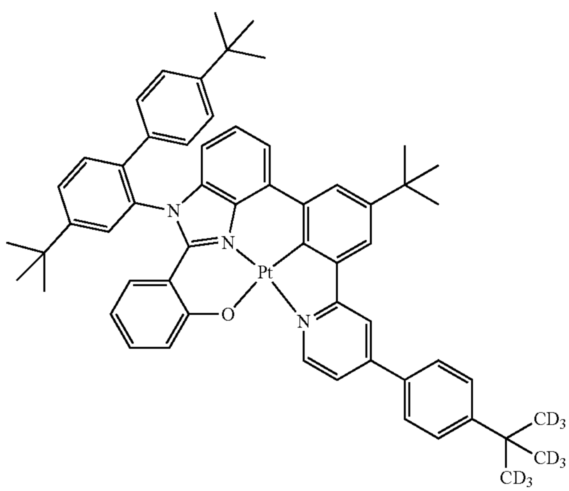
4-788
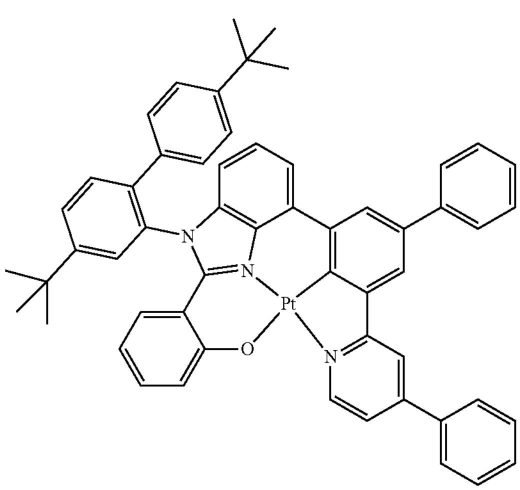
-continued
4-789
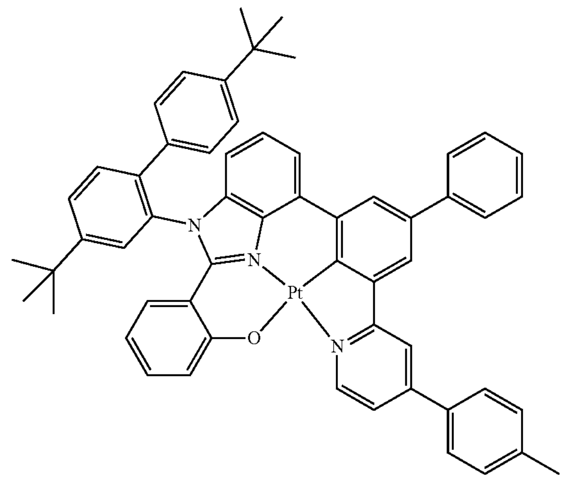
4-790
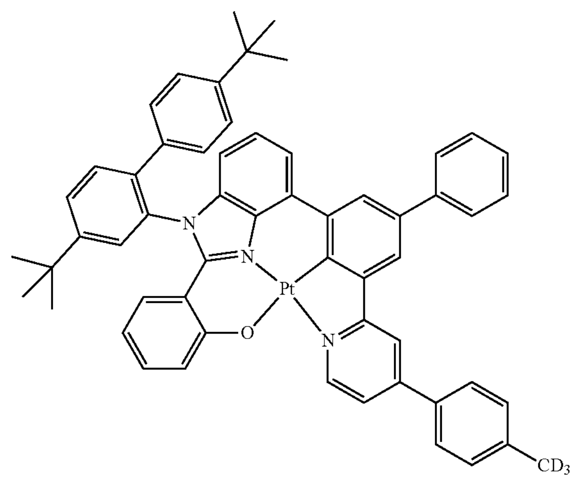
4-791
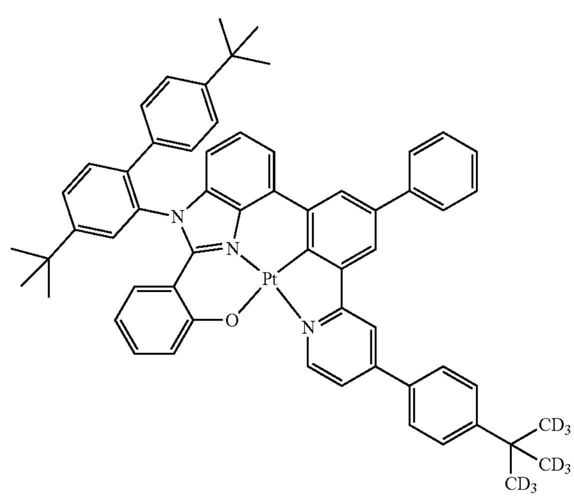

-continued
4-792
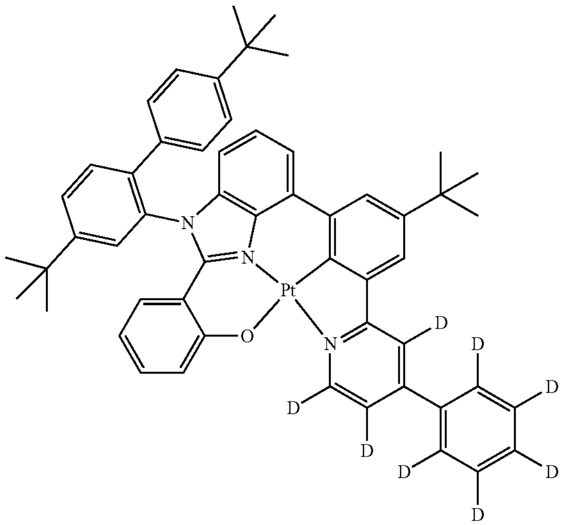
4-793
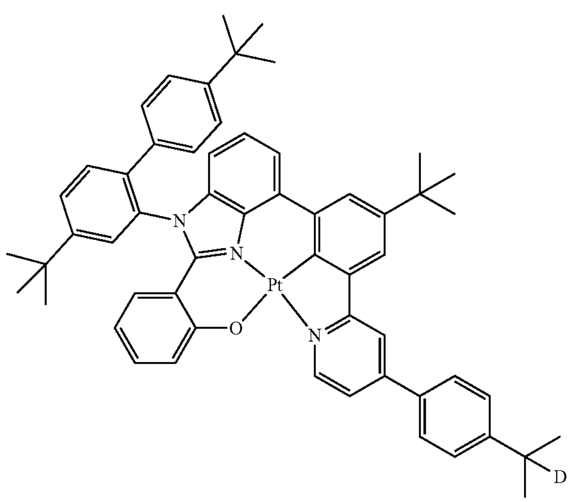
4-794
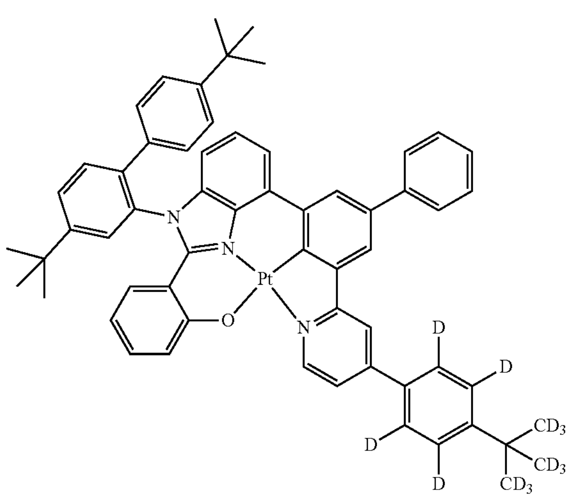
-continued
4-795
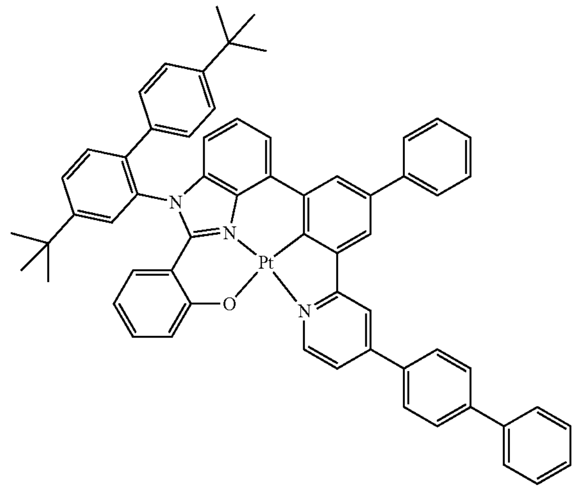
4-796
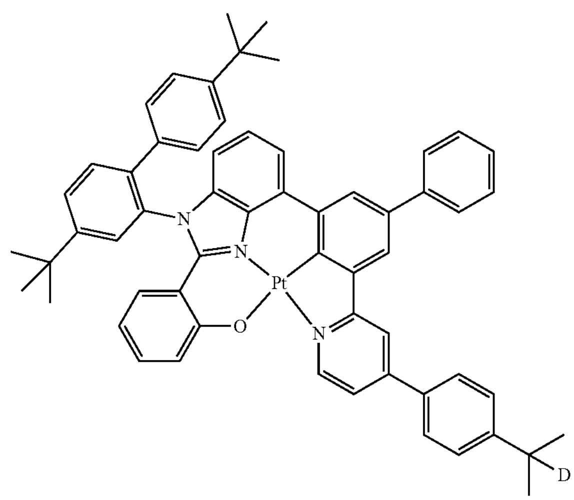
4-797
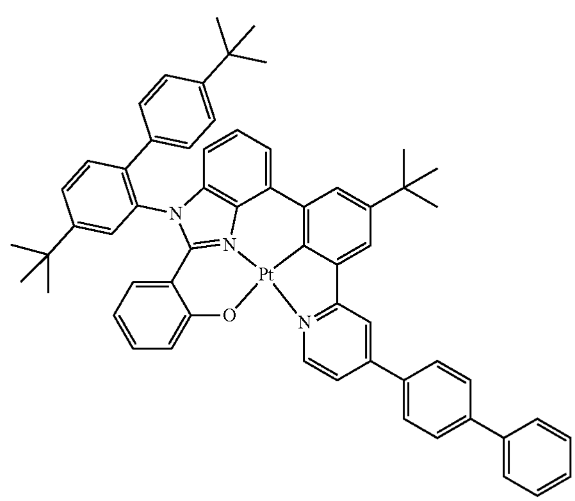

-continued
4-798
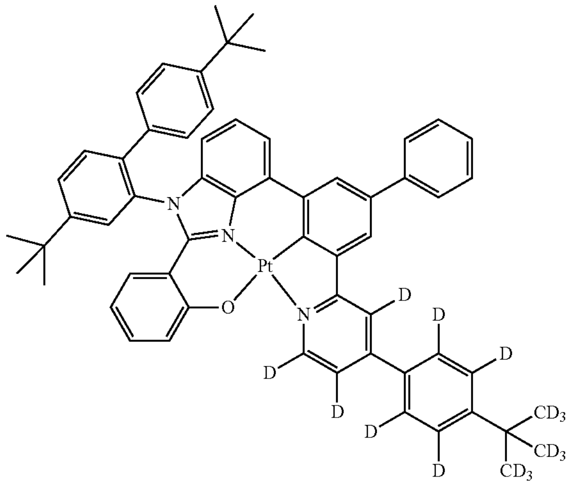
4-799
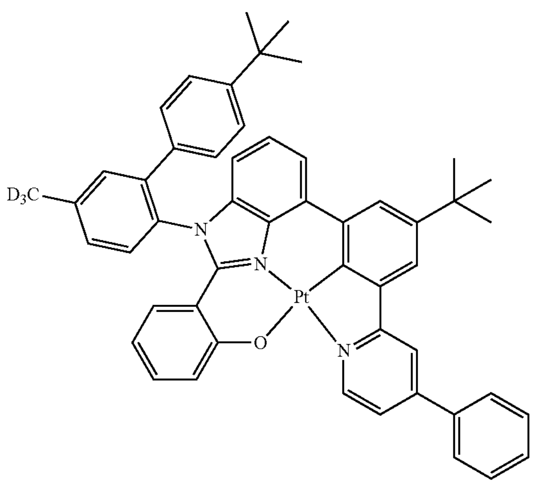
4-800
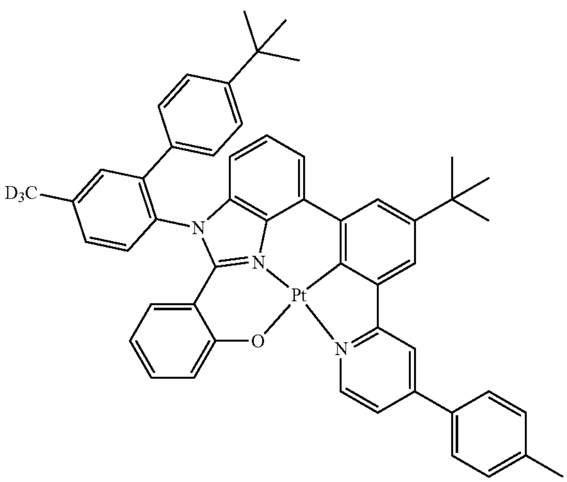
-continued
4-801
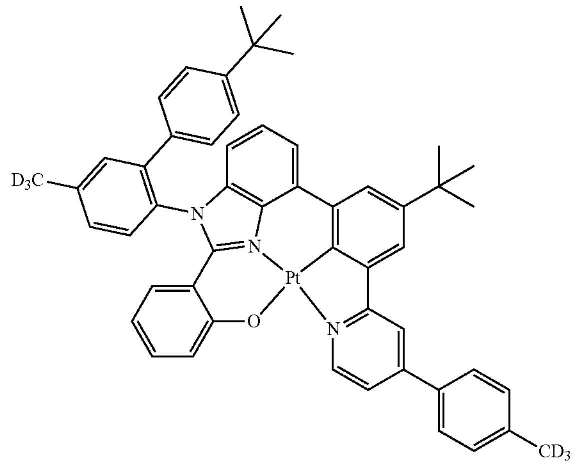
4-802
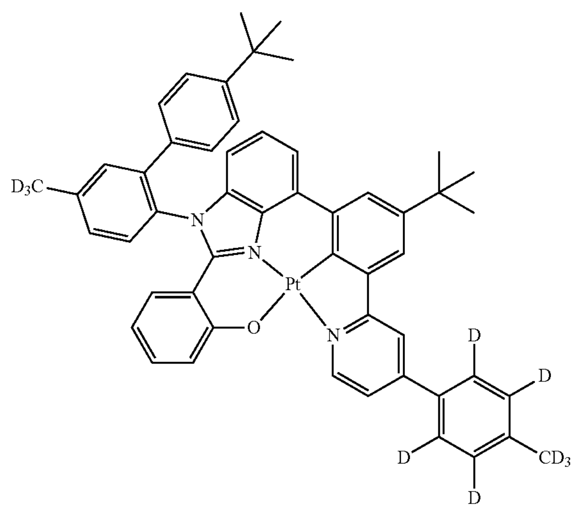
4-803
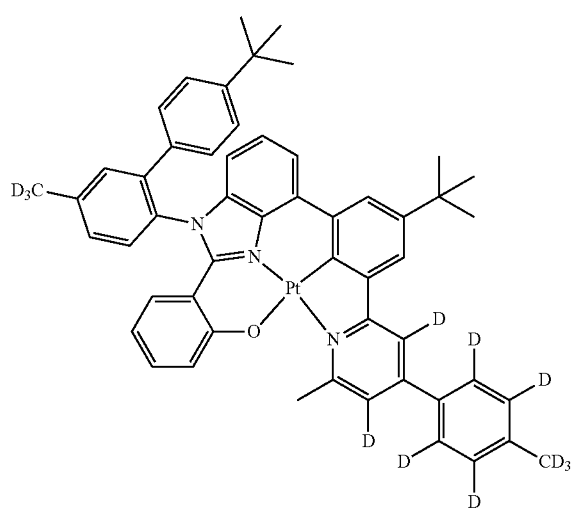

-continued
4-804
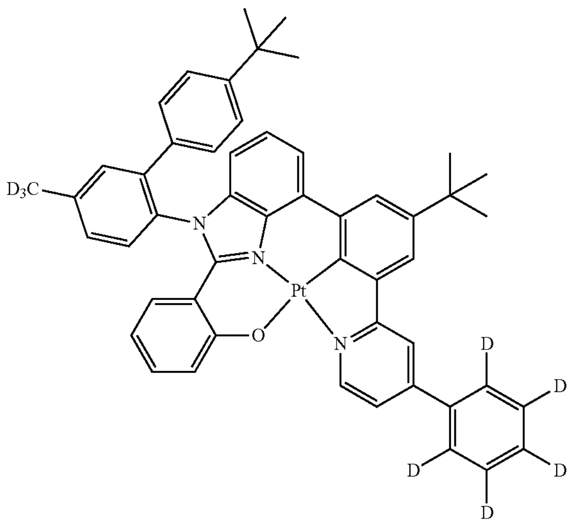
4-805
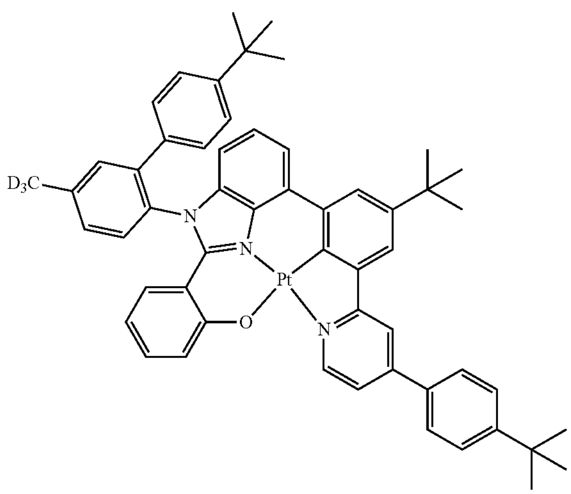
4-806
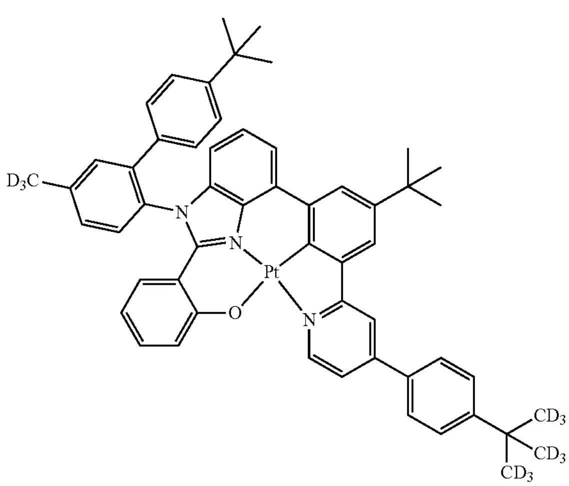
-continued
4-807
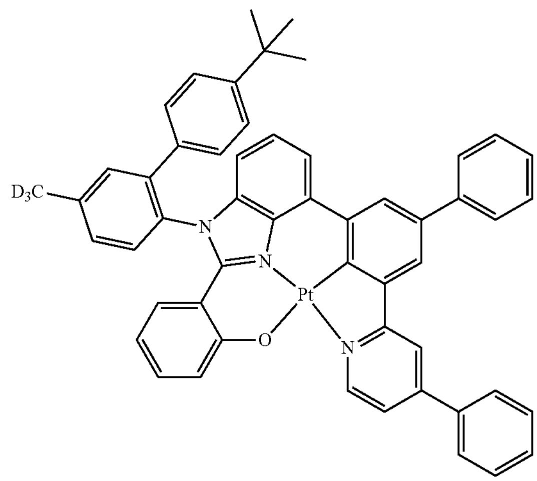
4-808
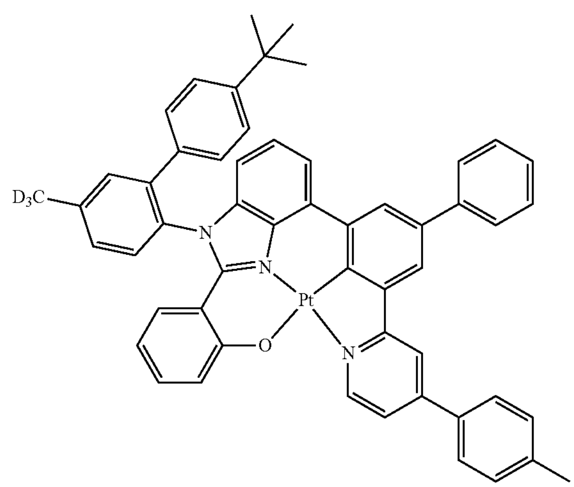
4-809
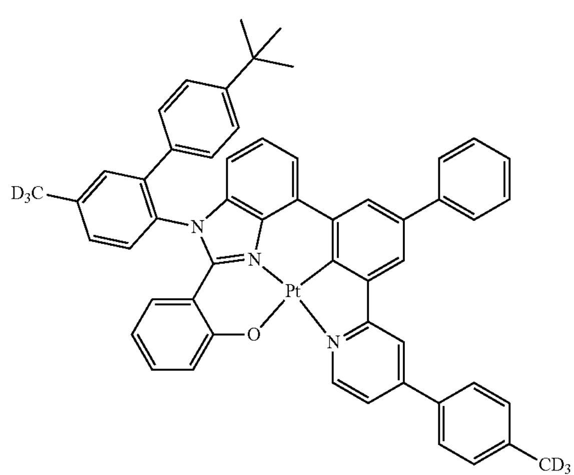

4-810
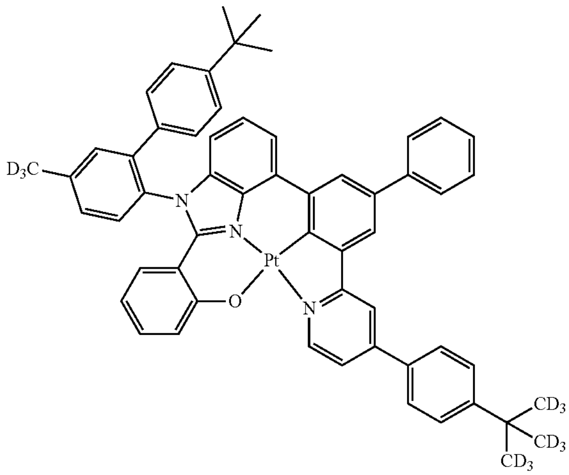
4-811
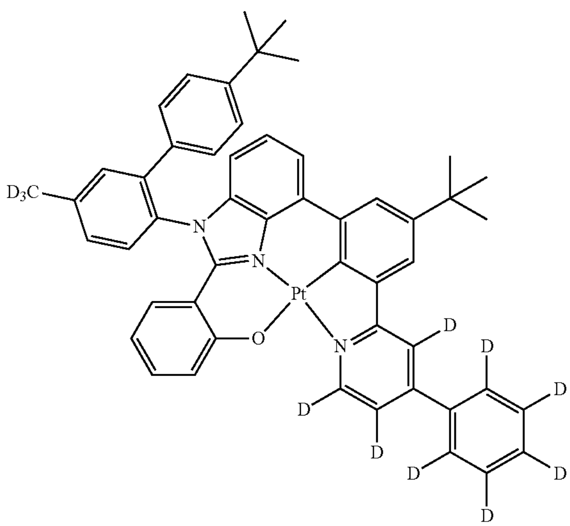
4-812
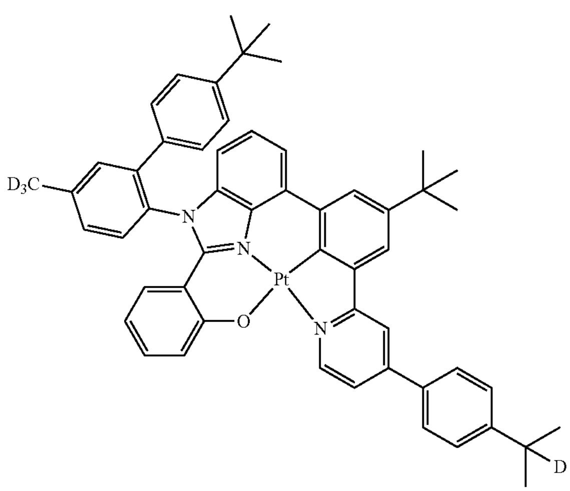
4-813
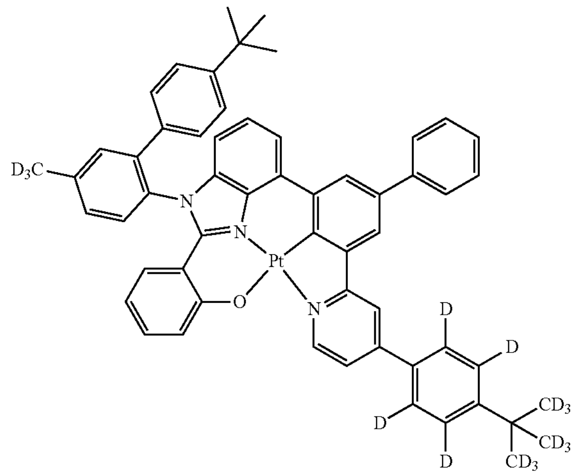
4-814
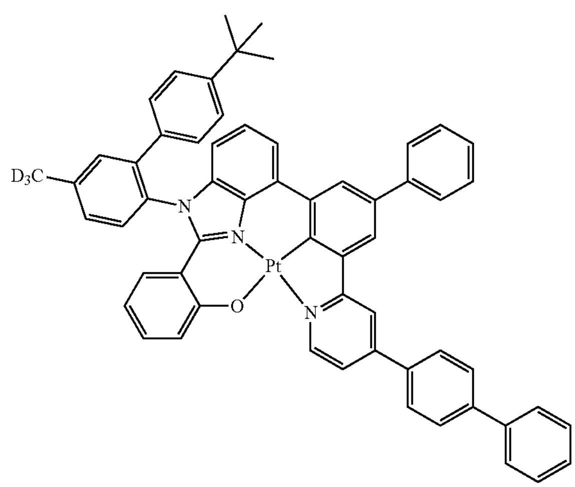
4-815
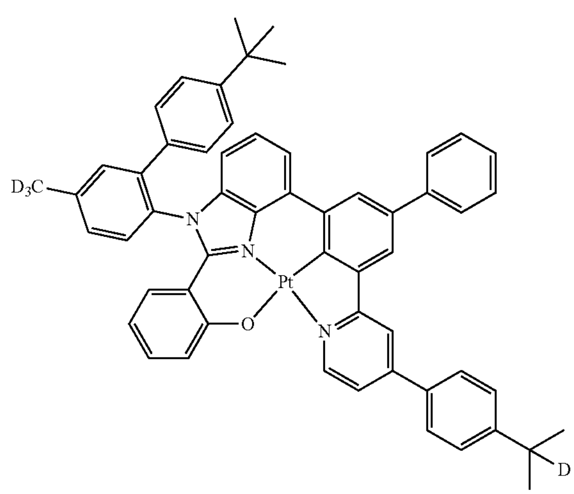

4-816
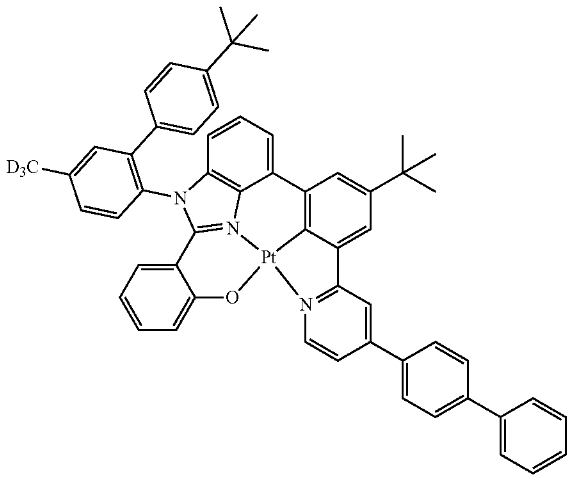
4-817
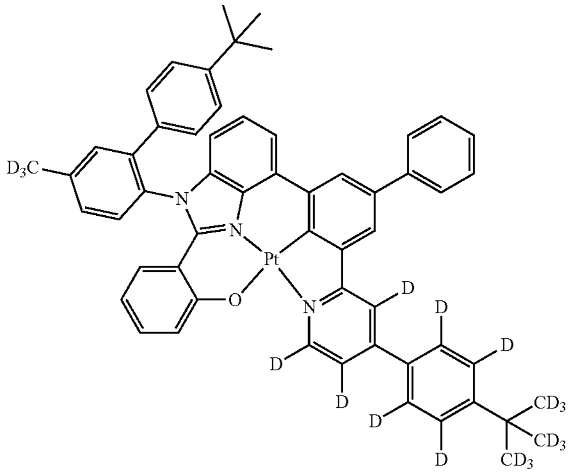
4-818
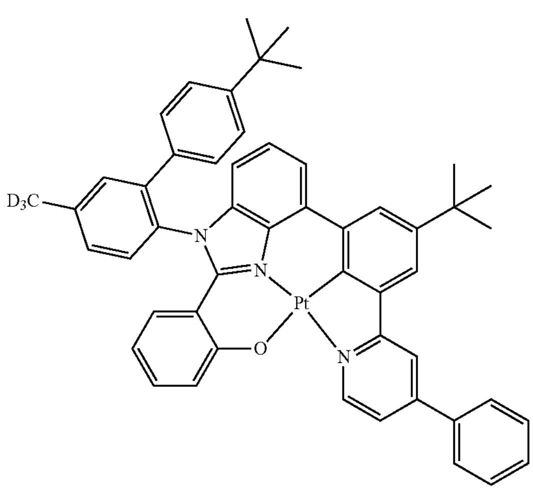
4-819
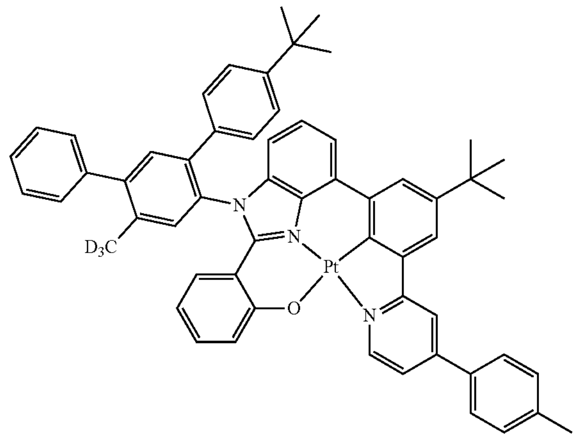
4-820
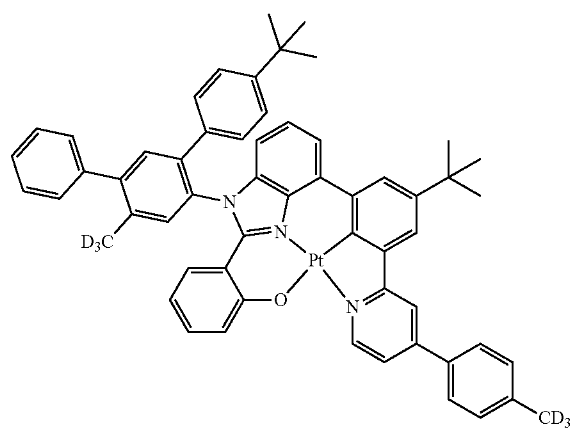
4-821
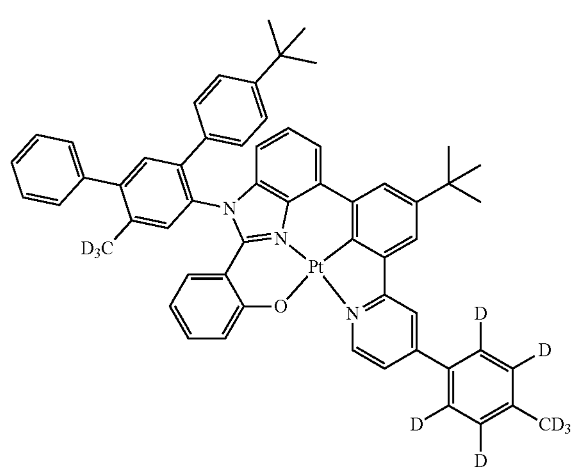

-continued
4-822
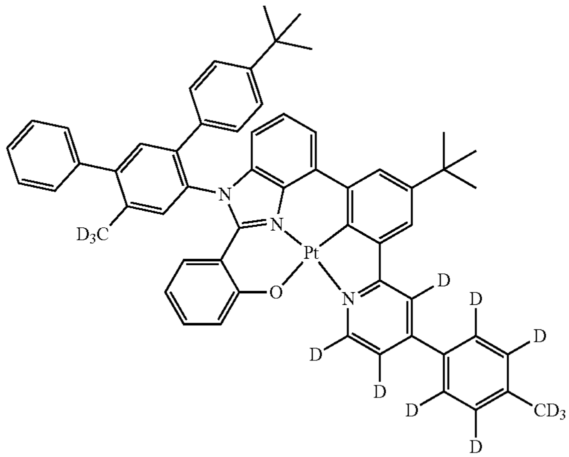
4-823
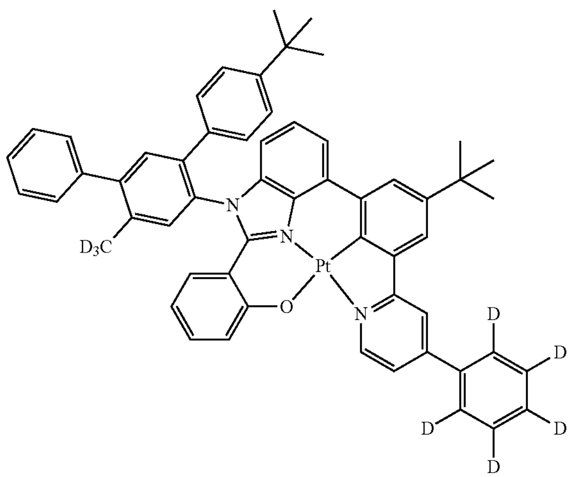
4-824
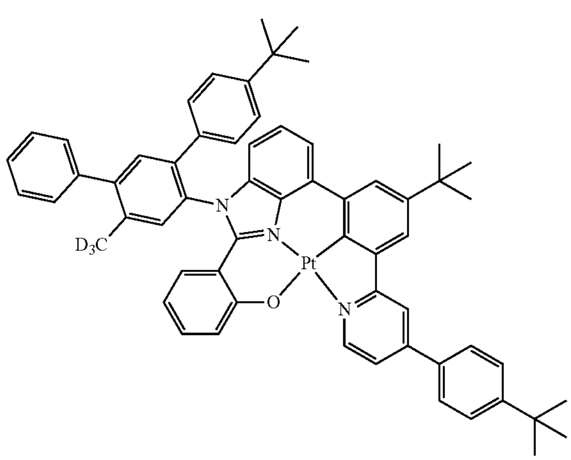
-continued
4-825
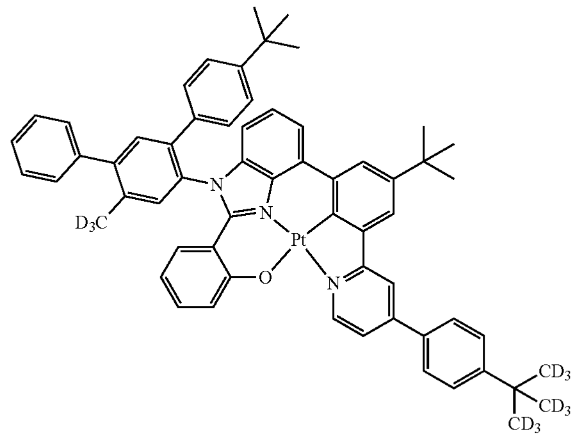
4-826
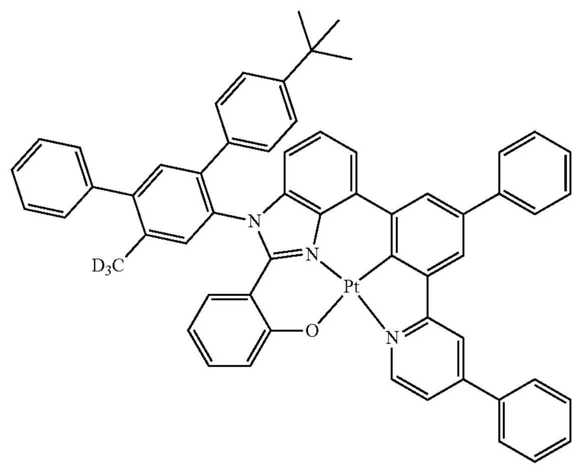
4-827
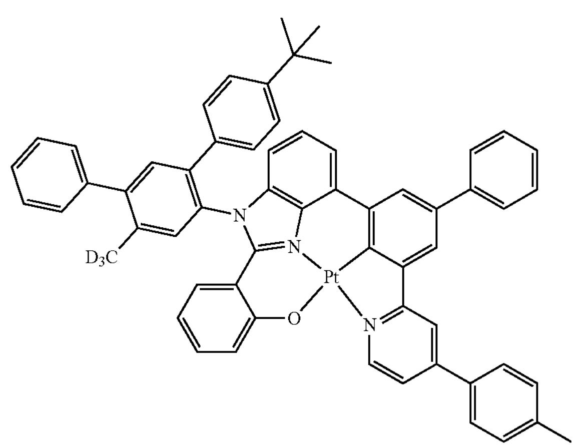

-continued
4-828
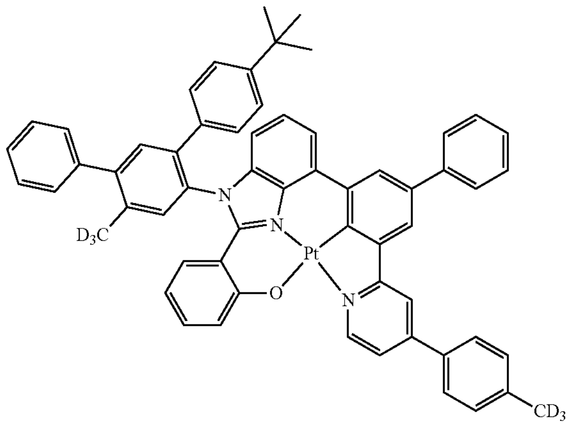
4-829
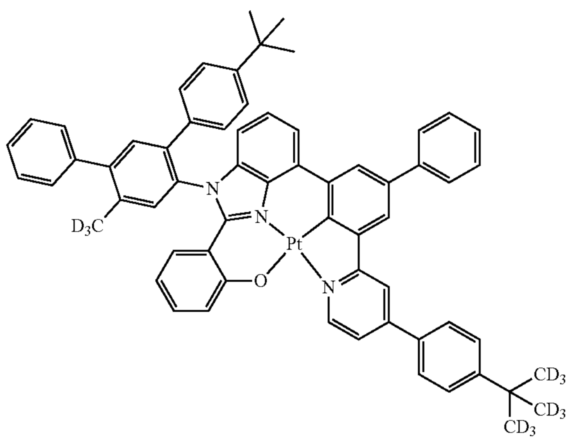
4-830
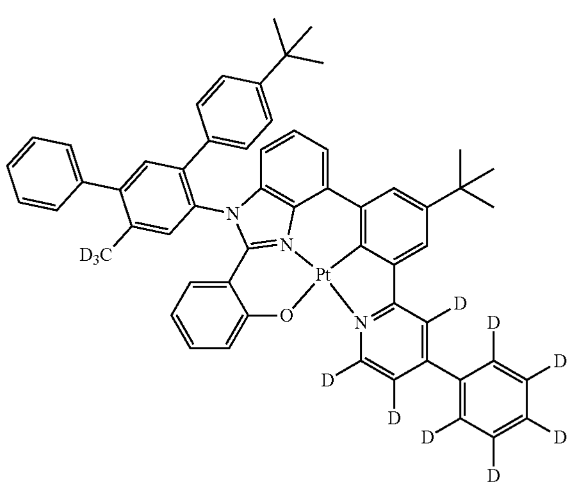
-continued
4-831
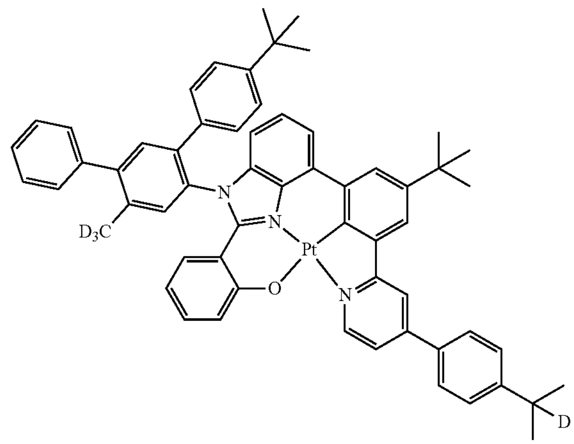
4-832
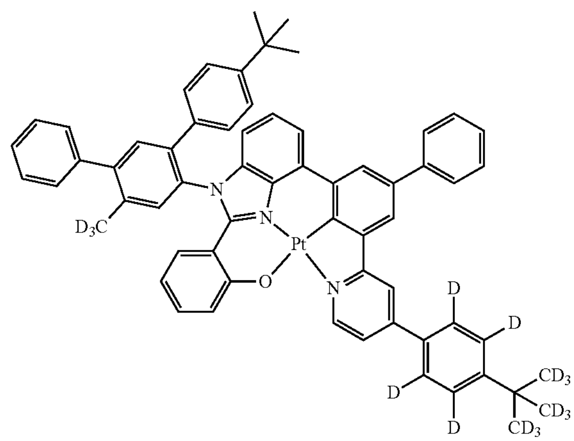
4-833
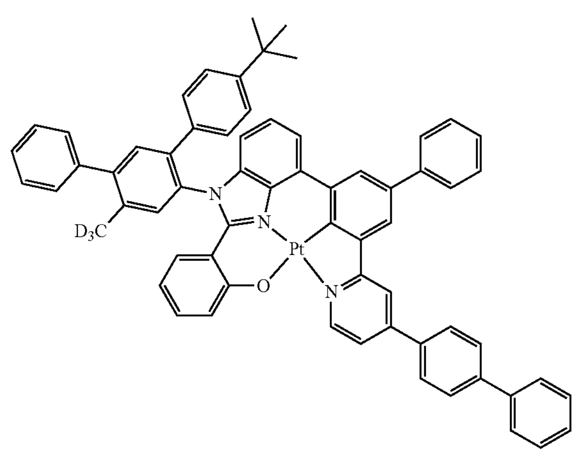

4-834
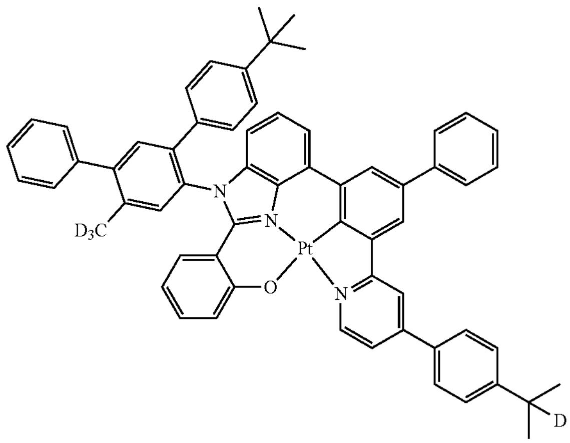
4-835
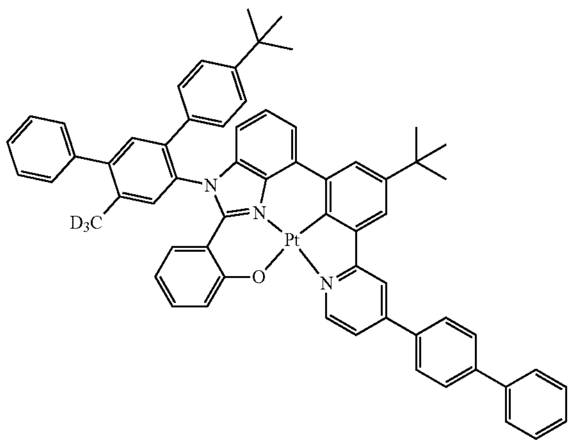
4-836
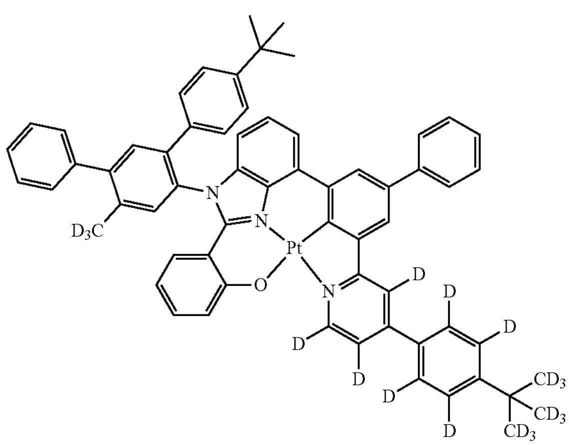
4-837
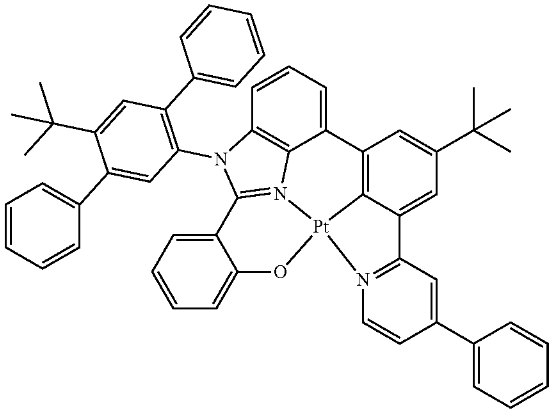
4-838
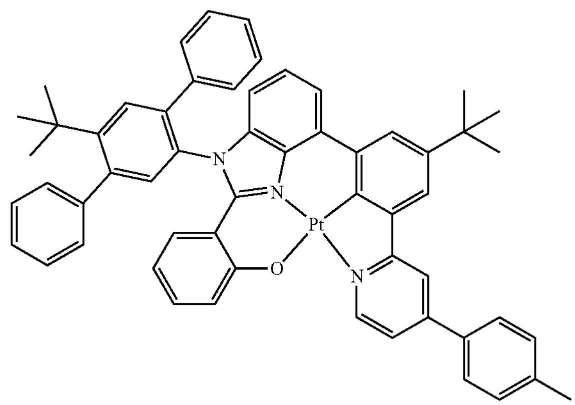
4-839
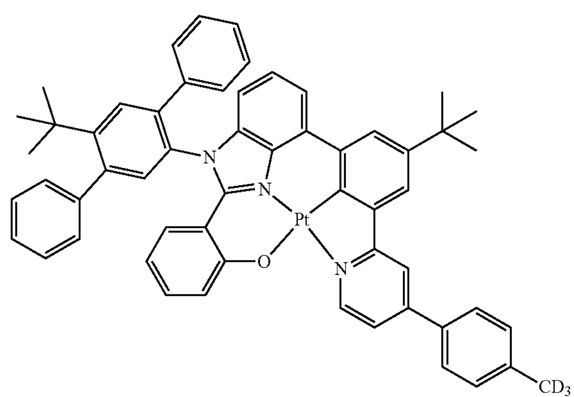

-continued
4-840
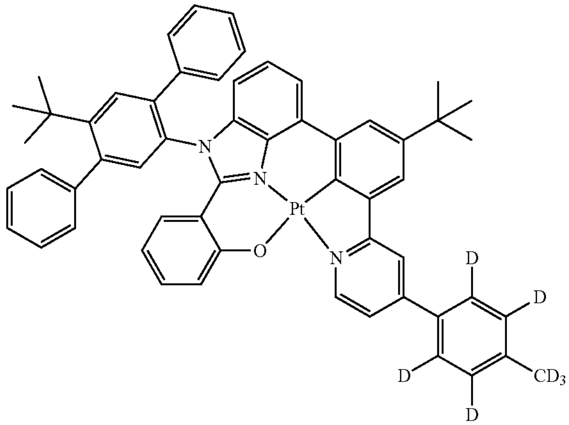
4-841
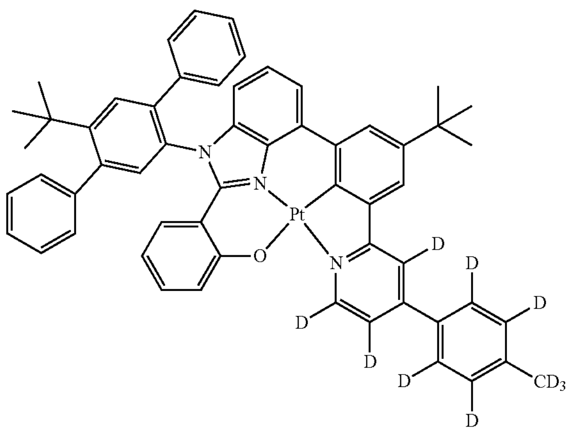
4-842
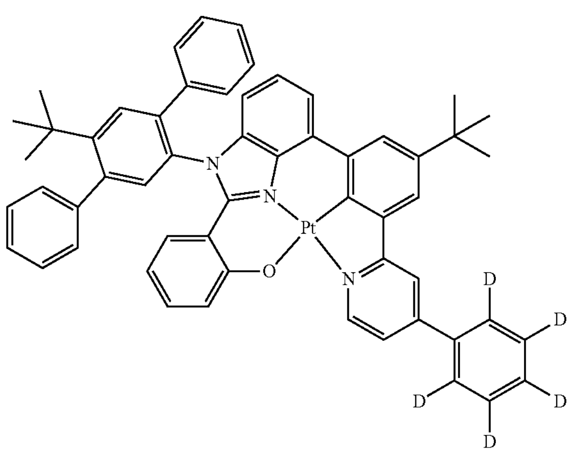
-continued
4-843
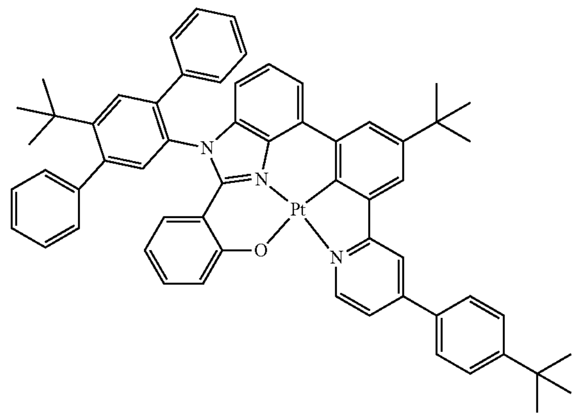
4-844
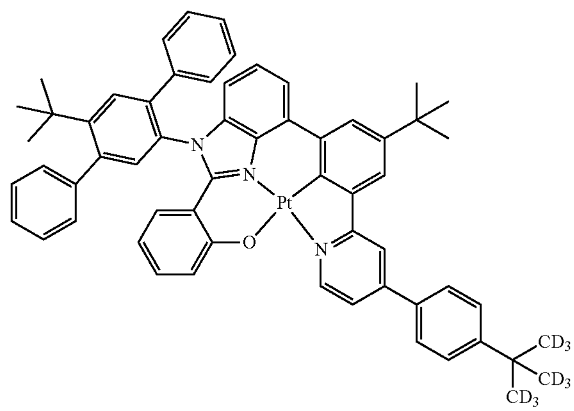
4-845
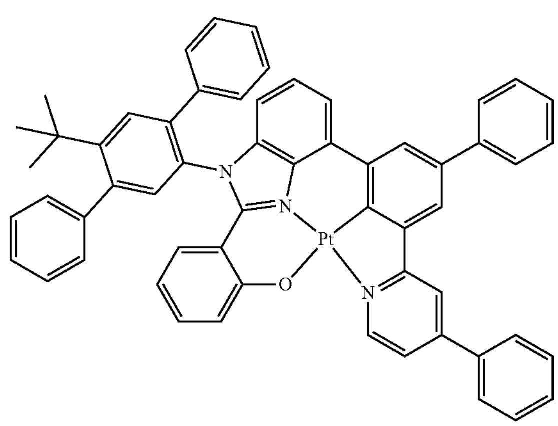

-continued
4-846
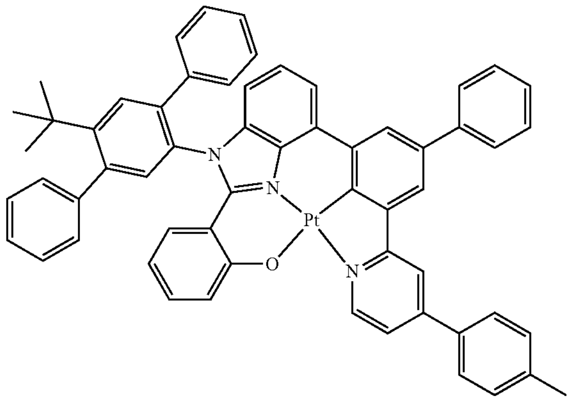
4-847
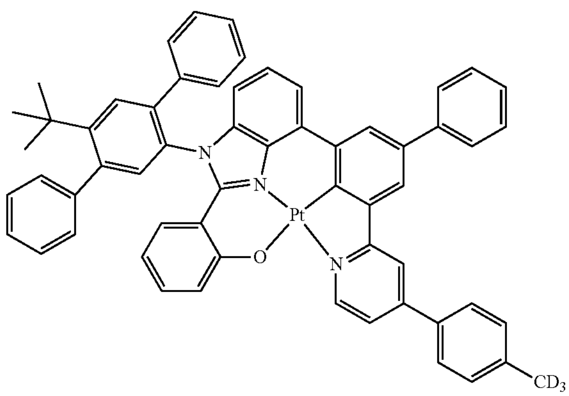
4-848
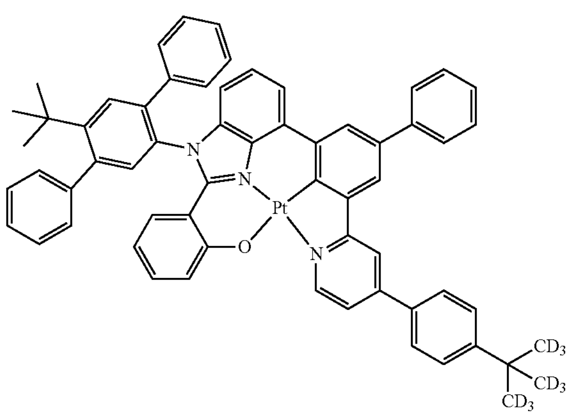
-continued
4-849
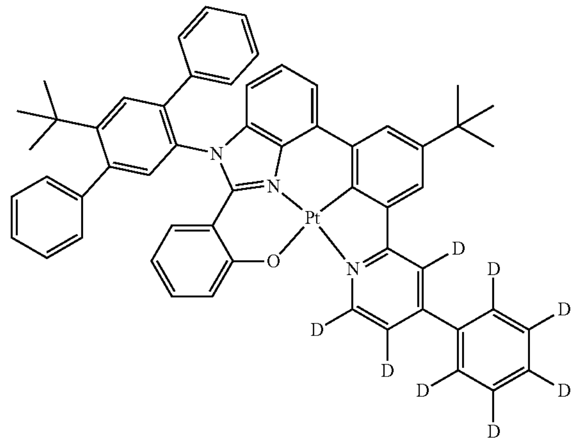
4-850
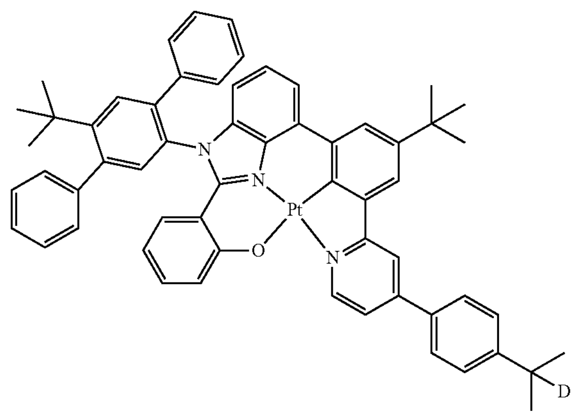
4-851
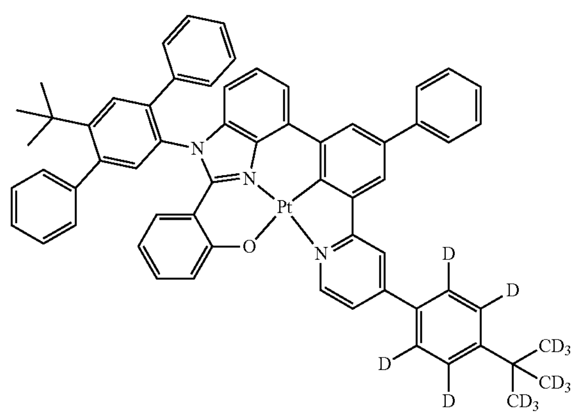

-continued
4-852
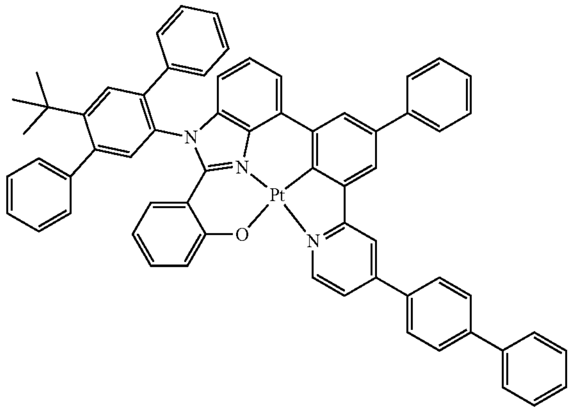
4-853
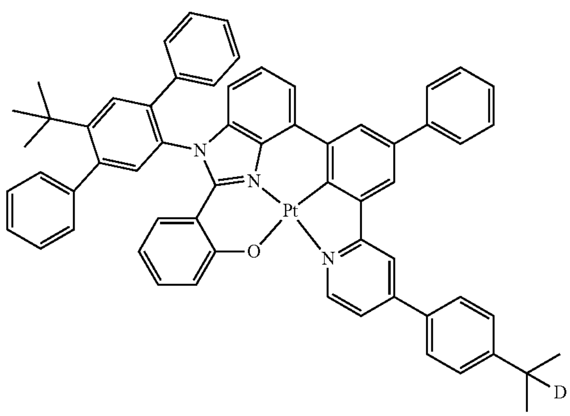
4-854
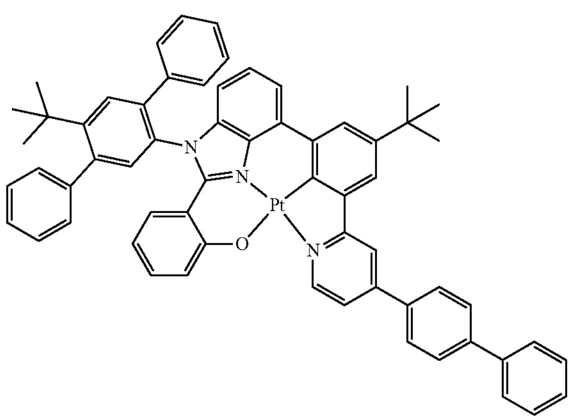
-continued
4-855
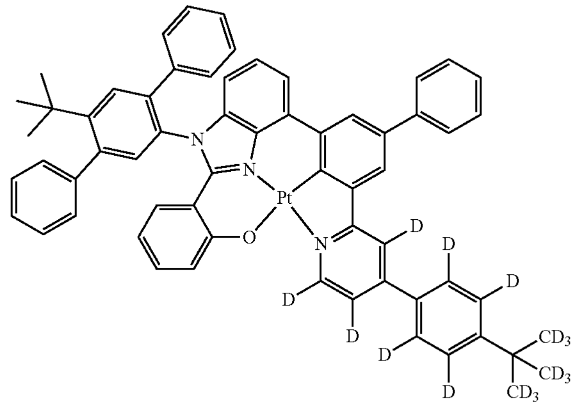
4-856
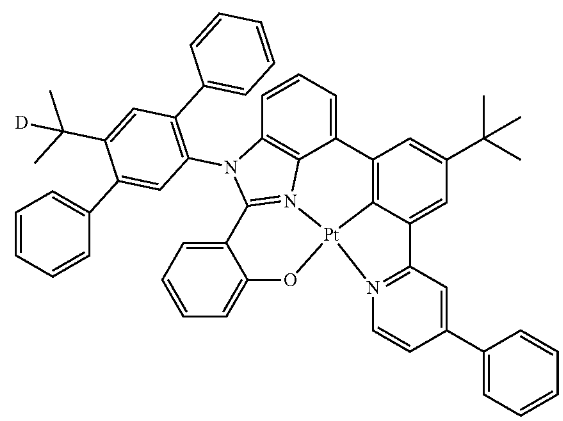
4-857
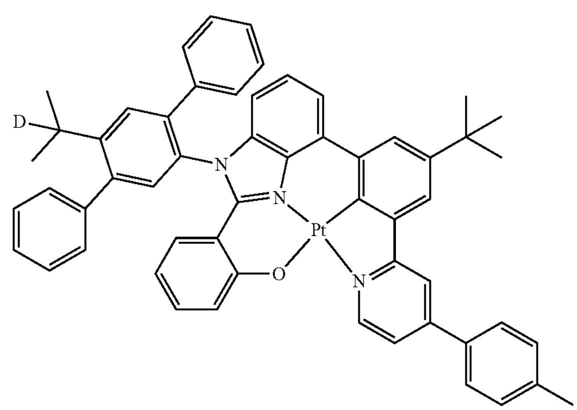

4-858
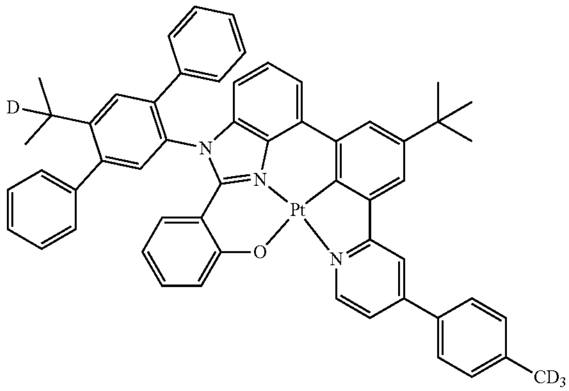
4-859
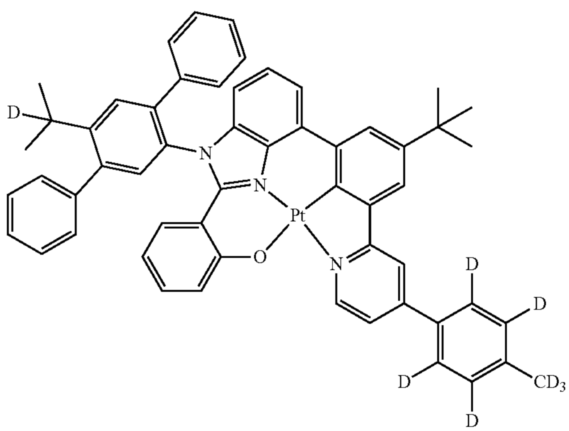
4-860
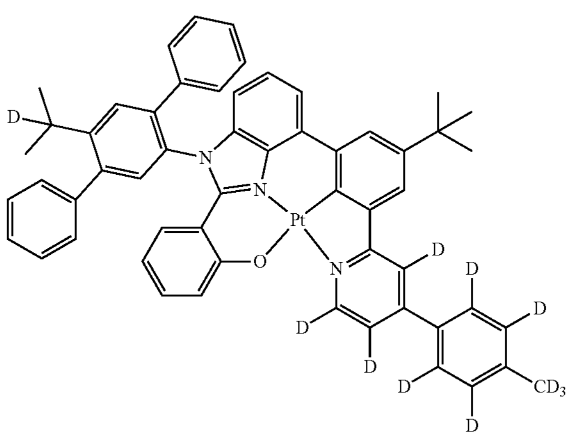
4-861
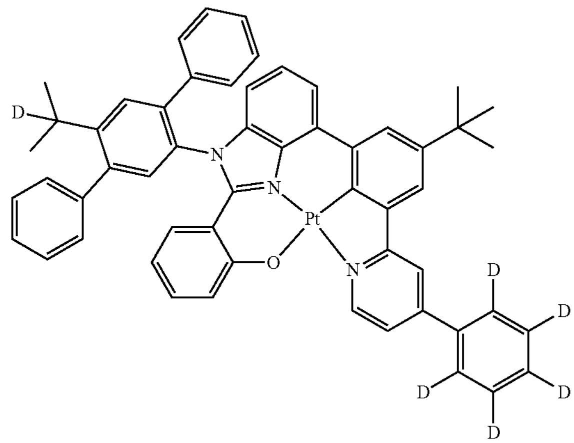
4-862
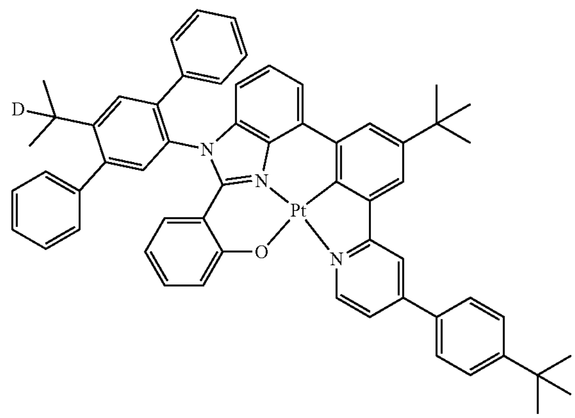
4-863
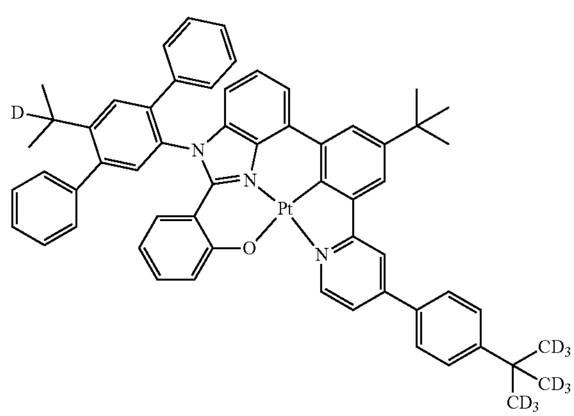

4-864
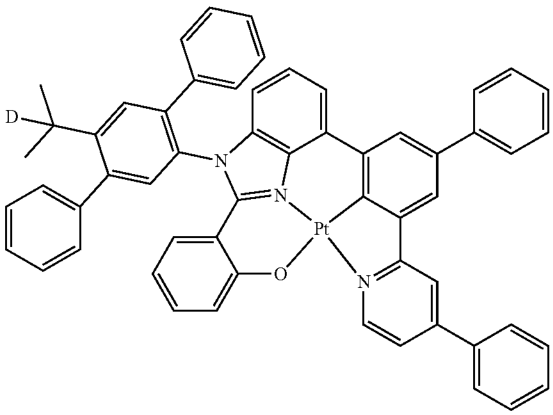
4-865
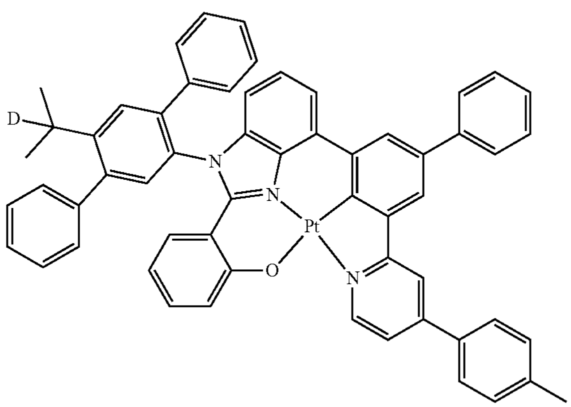
4-866
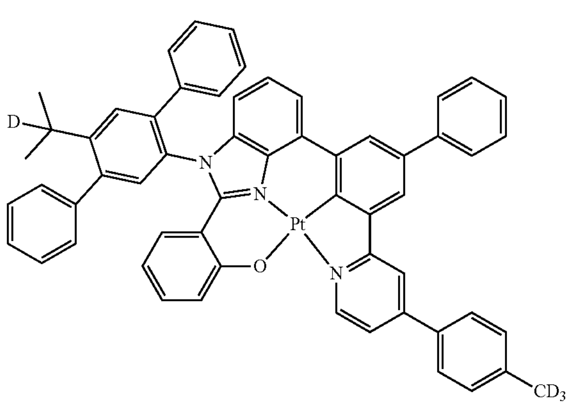
4-867
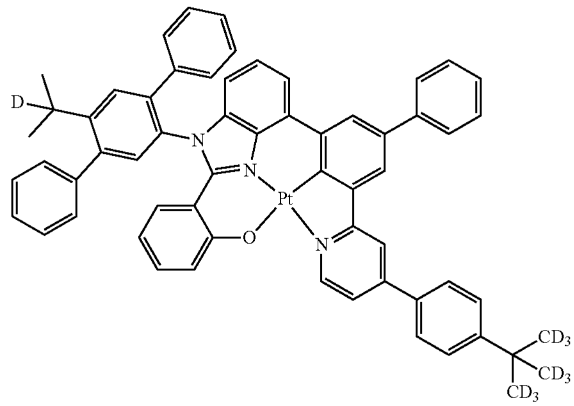
4-868
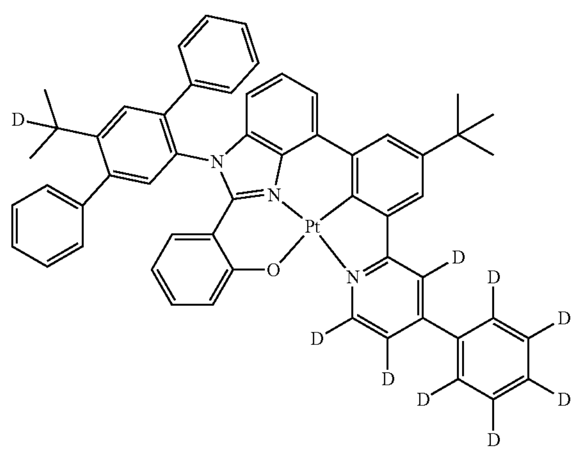
4-869
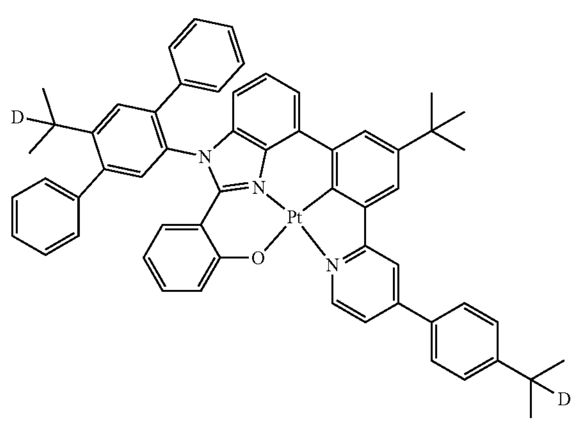

-continued
4-870
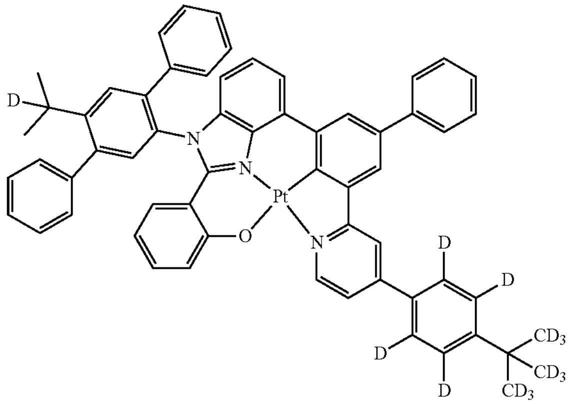
4-871
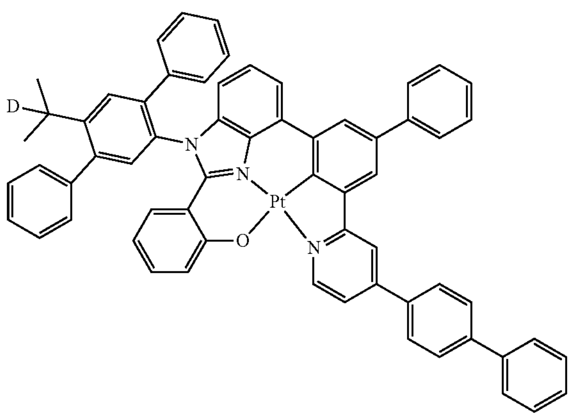
4-872
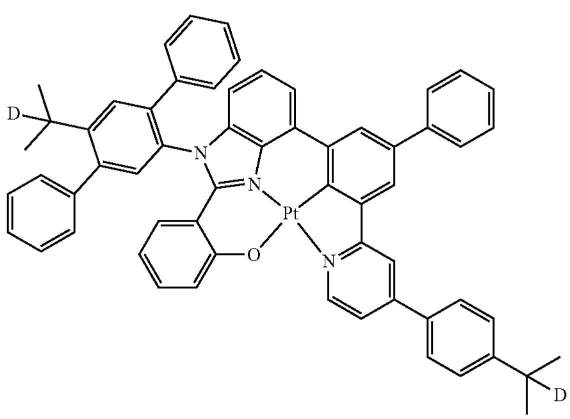
-continued
4-873
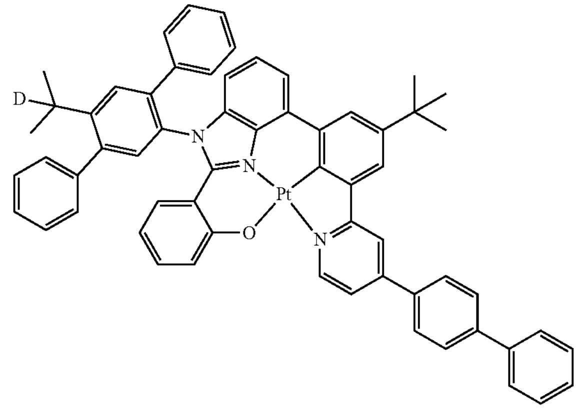
4-874
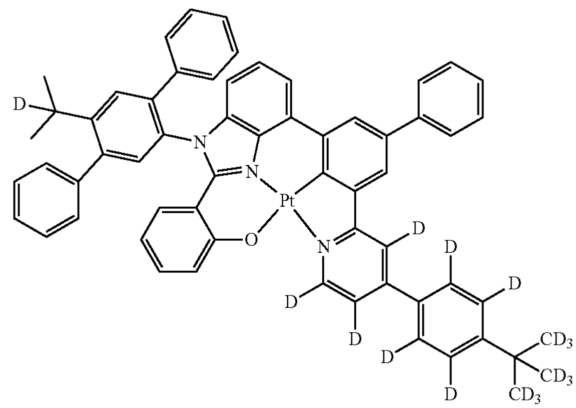
4-875
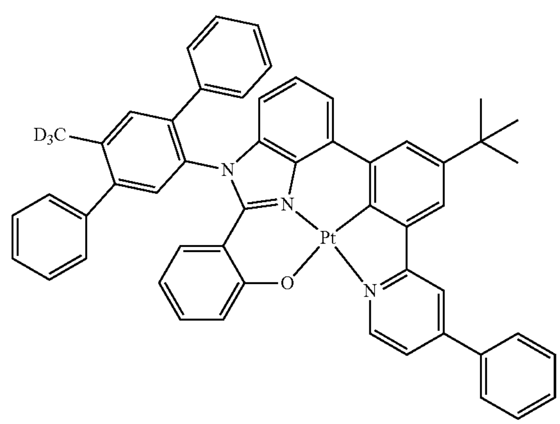

-continued
4-876
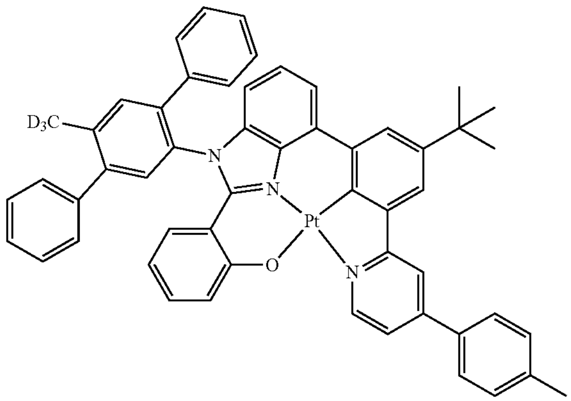
4-877
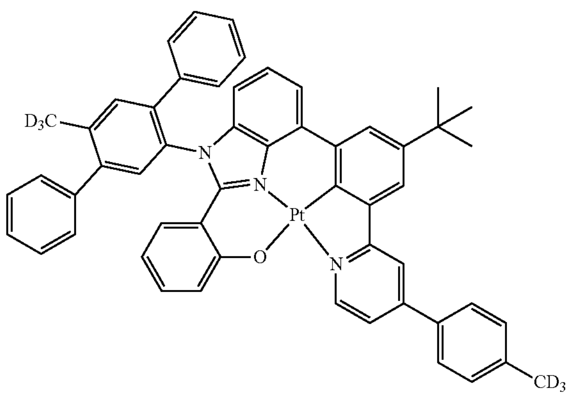
4-878
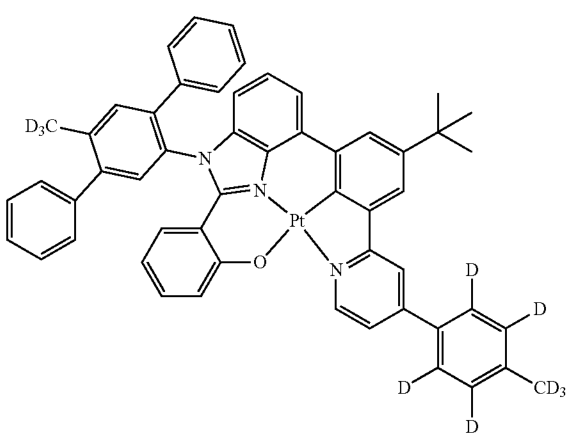
-continued
4-879
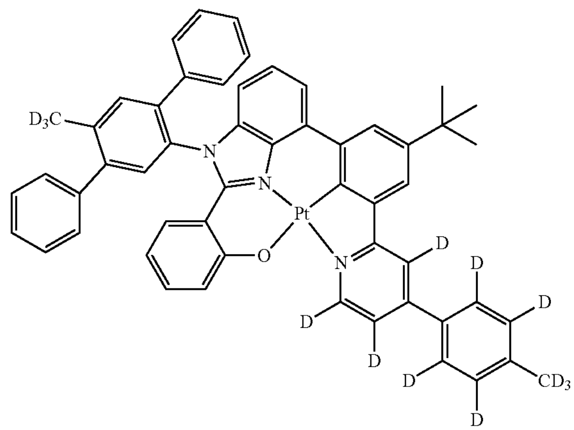
4-880
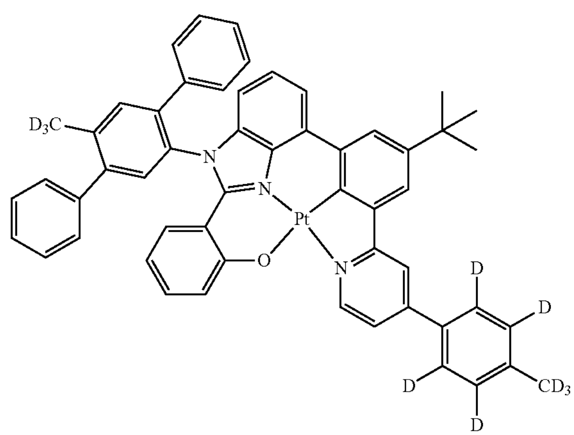
4-881
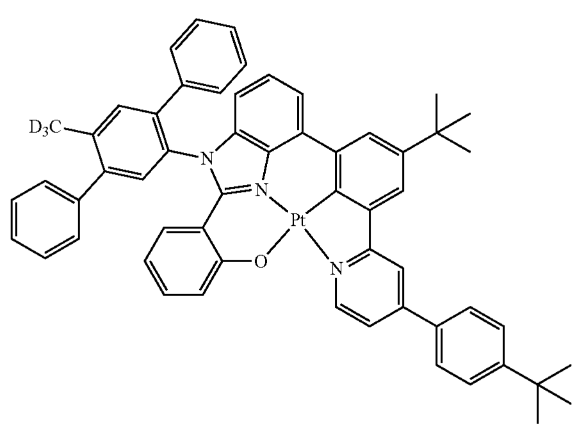

-continued
4-882
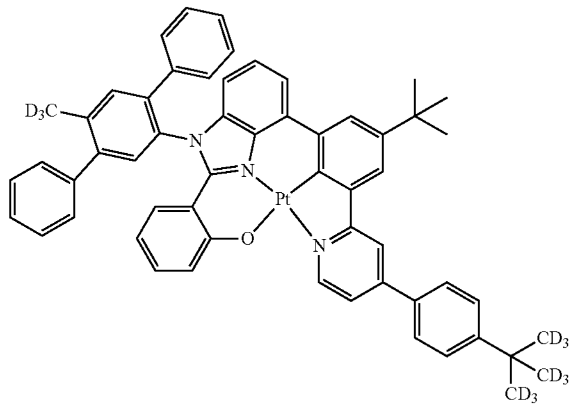
4-883
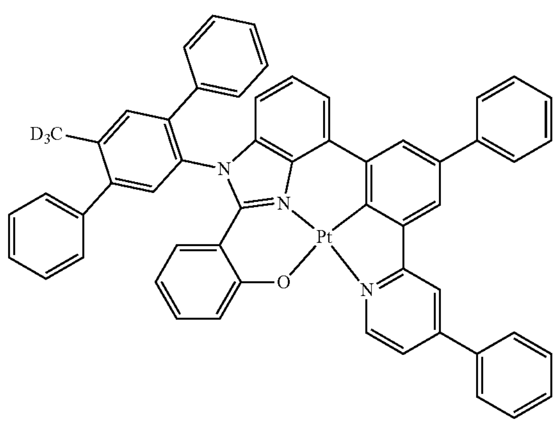
4-884
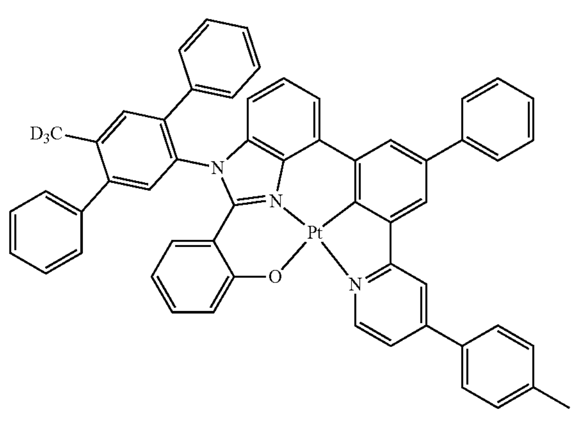
-continued
4-885
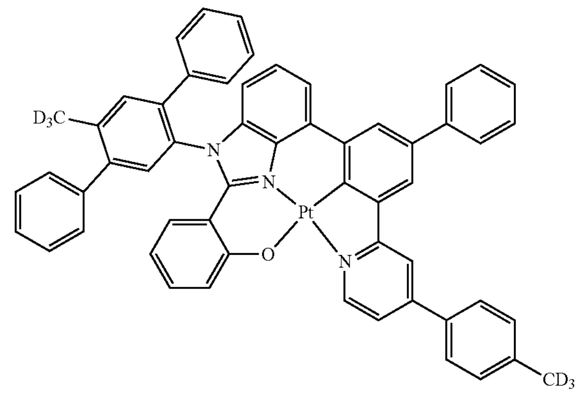
4-886
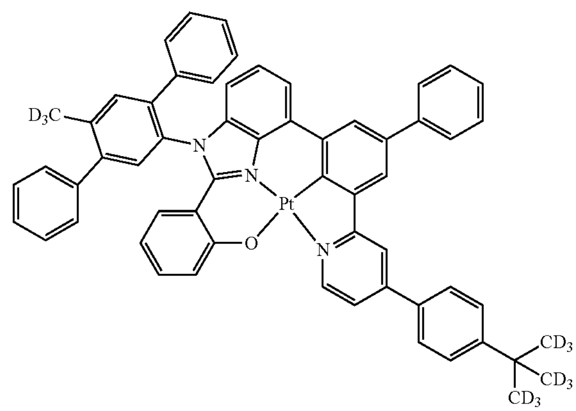
4-887
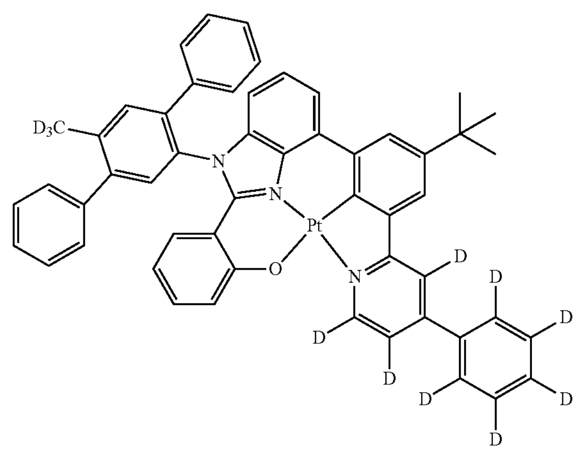

-continued
4-888
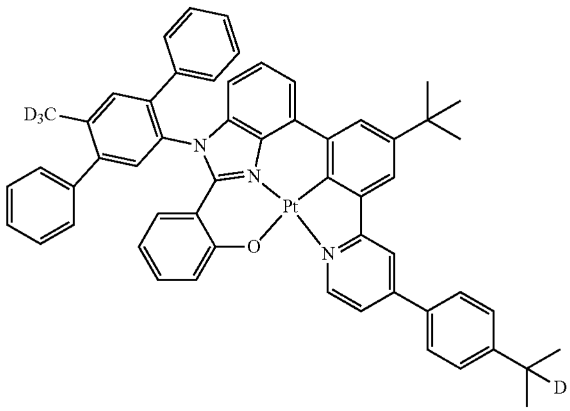
4-889
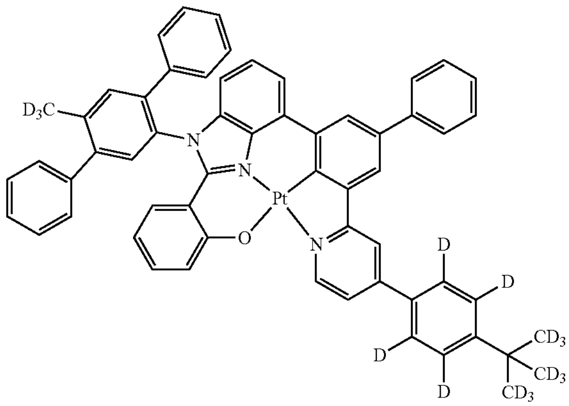
4-890
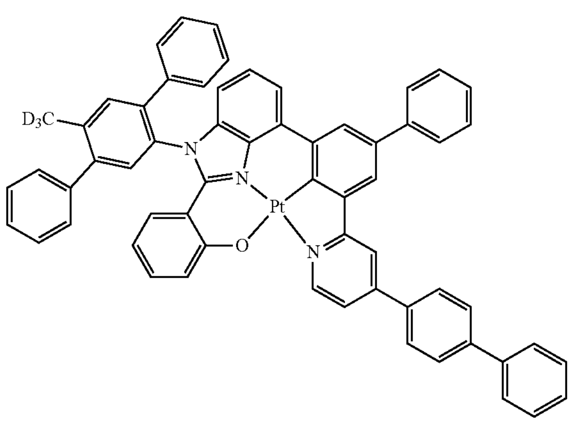
-continued
4-891
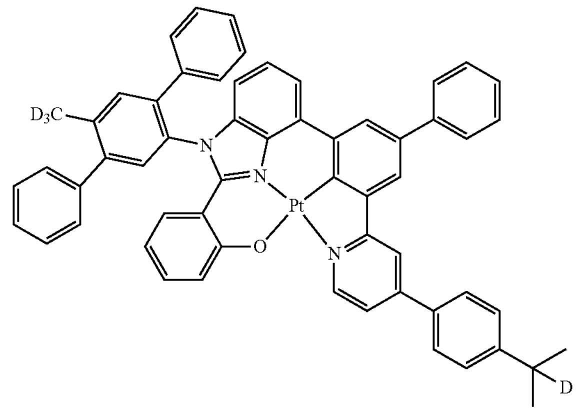
4-892
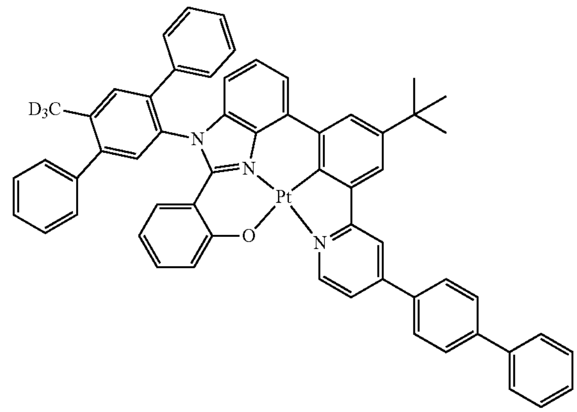
4-893
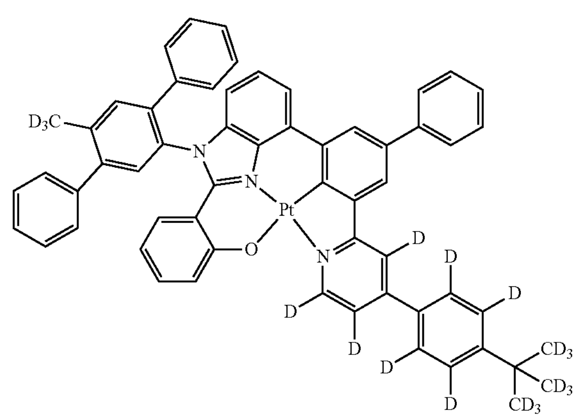

4-894
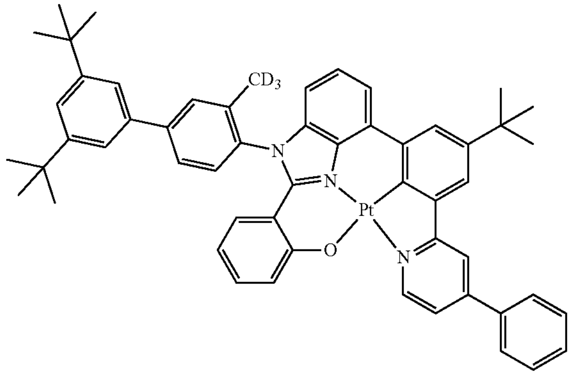
4-895
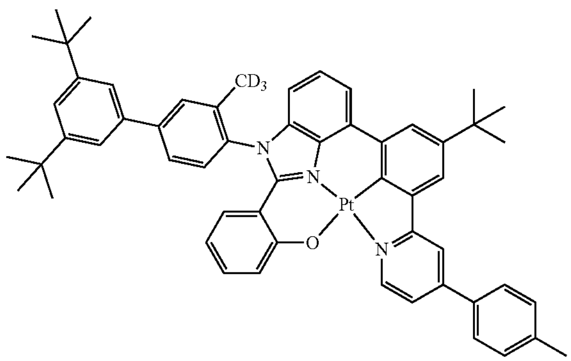
4-896
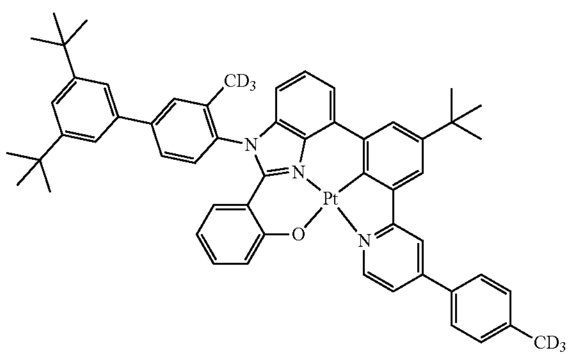
4-897
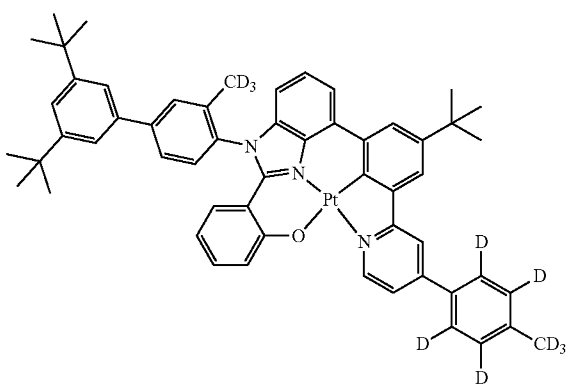
4-898
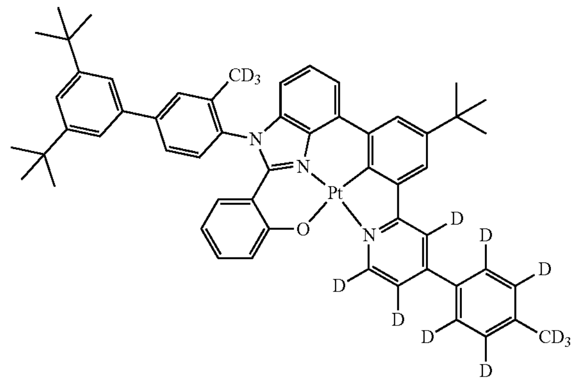
4-899
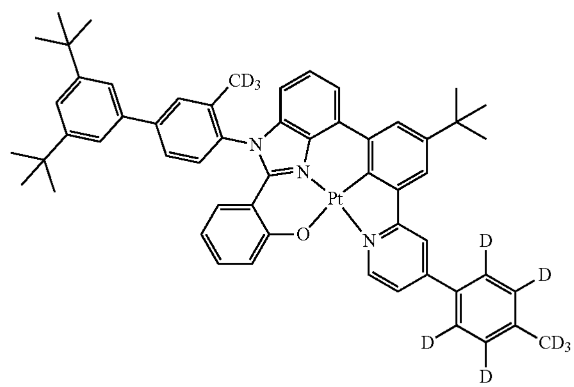
4-900
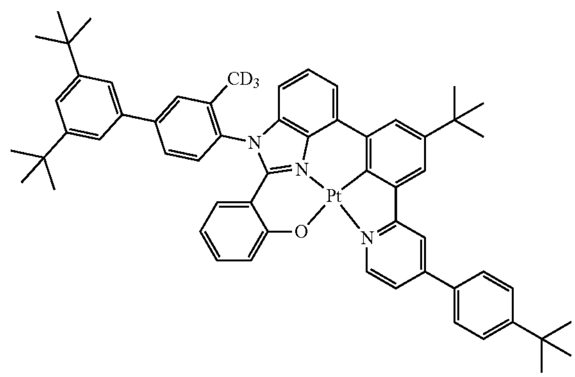
4-901
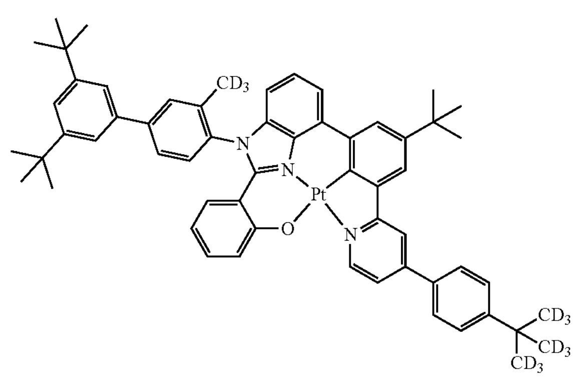

-continued
4-902
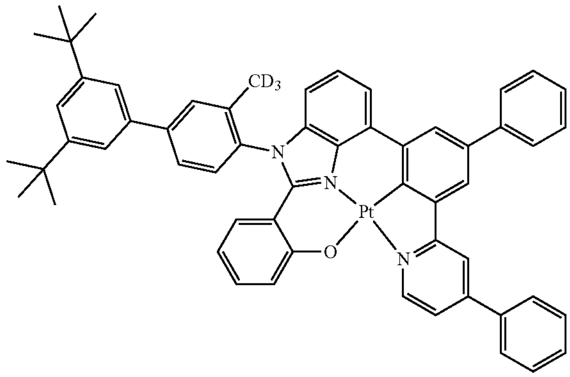
4-903
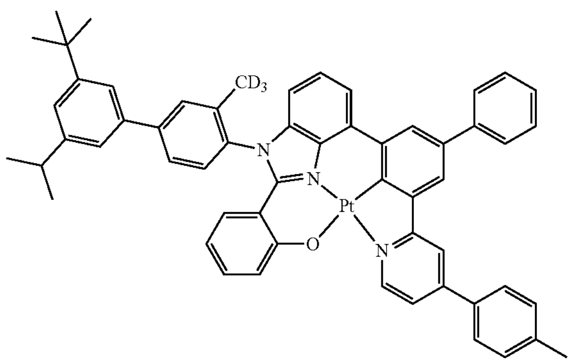
4-904
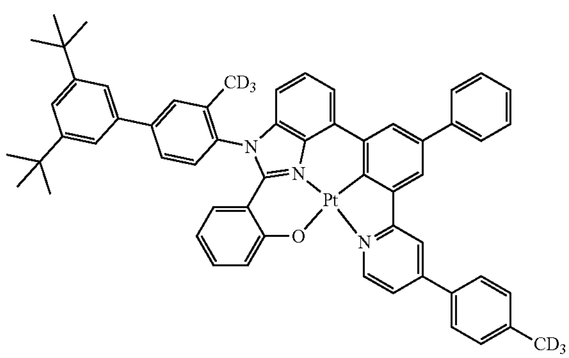
4-905
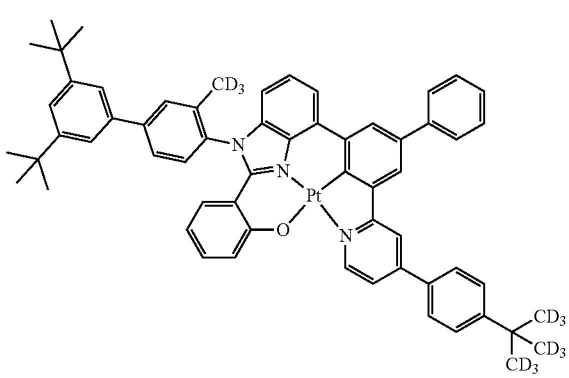
-continued
4-906
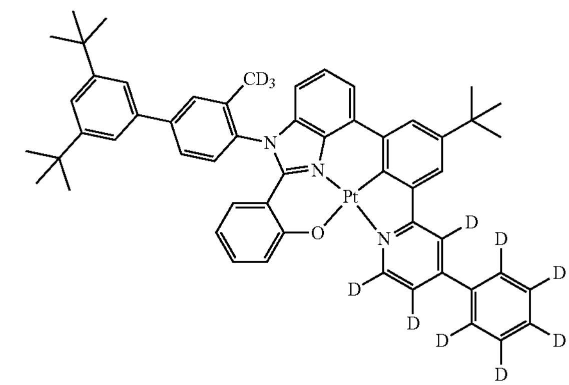
4-907
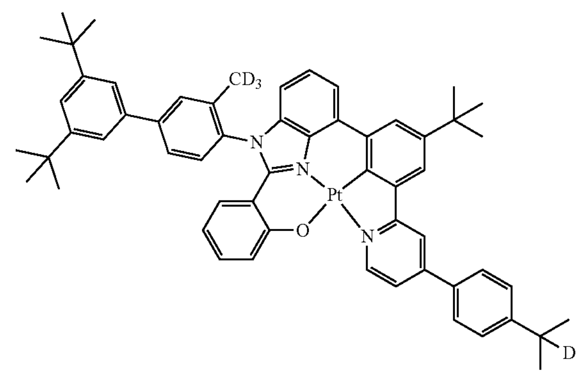
4-908
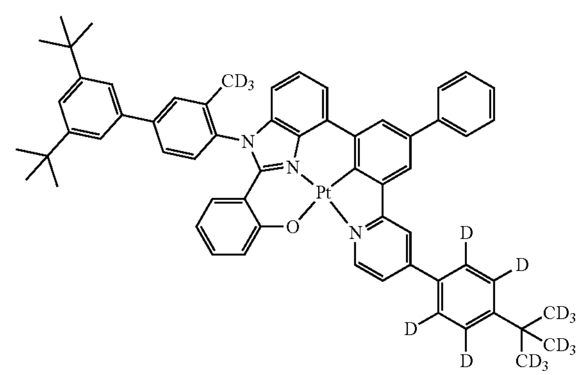
4-909
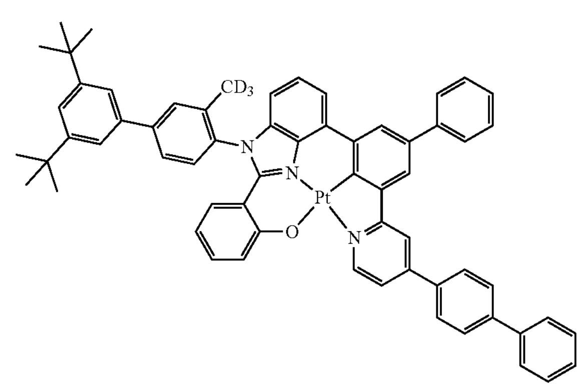

-continued
4-910
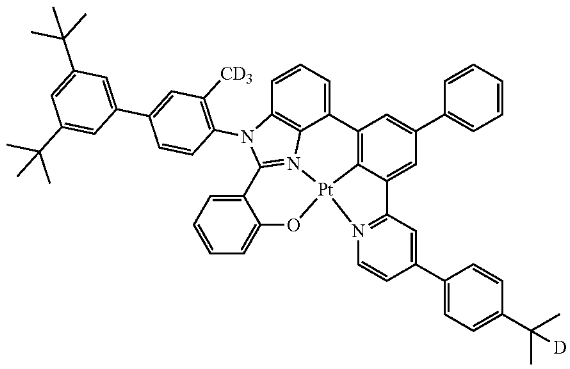
4-911
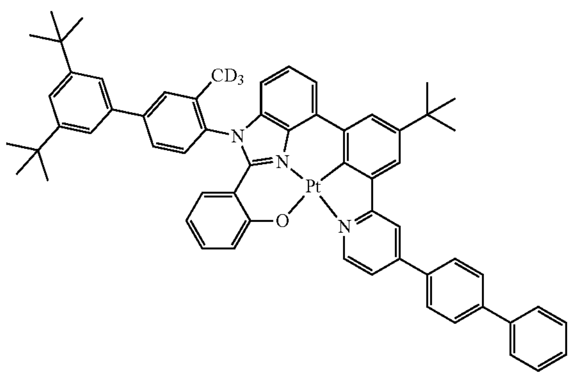
4-912
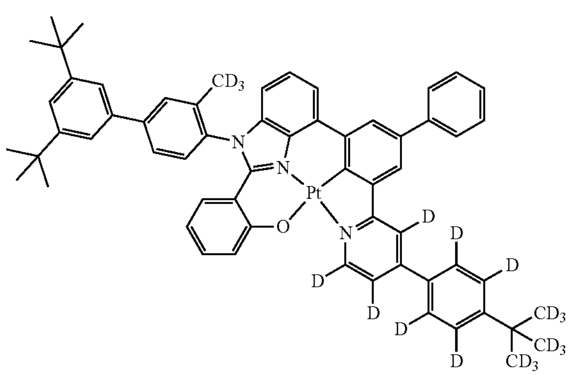
4-913
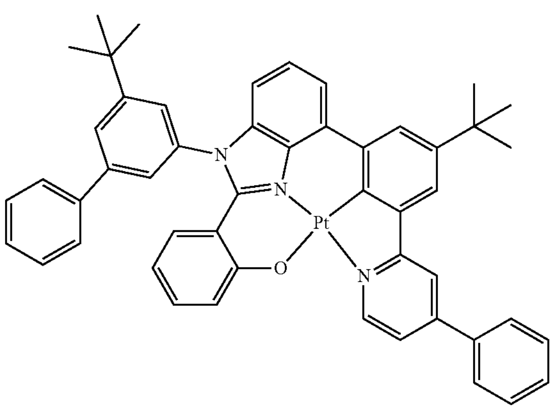
-continued
4-914
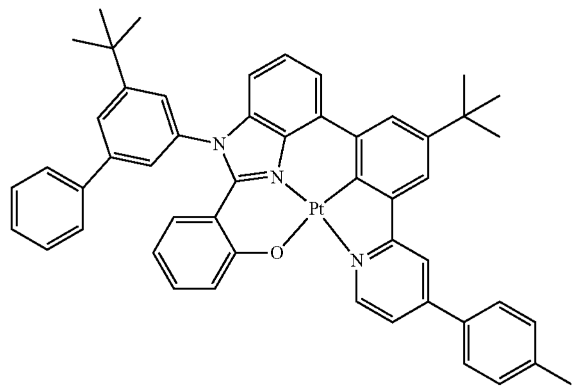
4-915
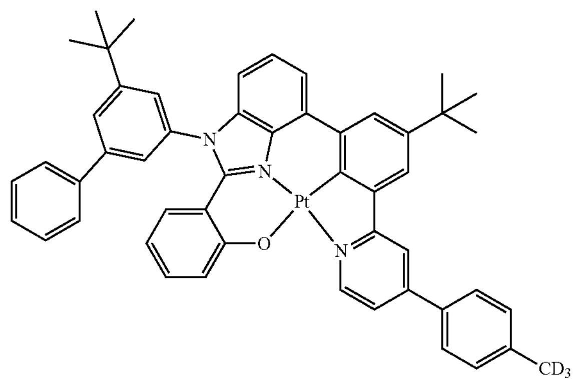
4-916
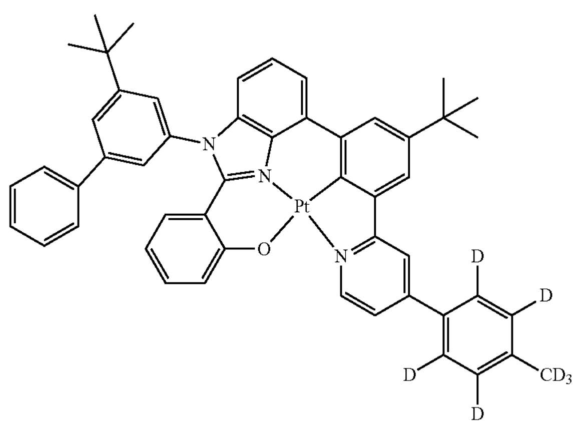

-continued
4-917
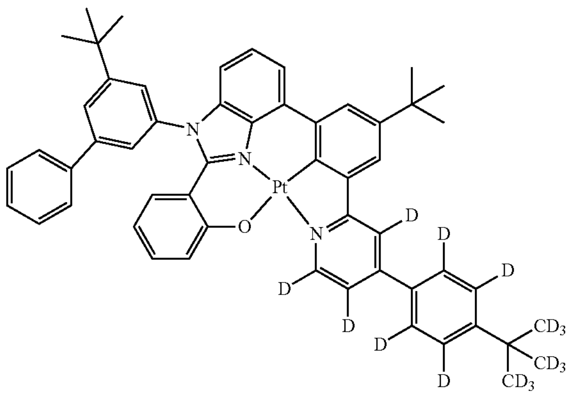
4-918
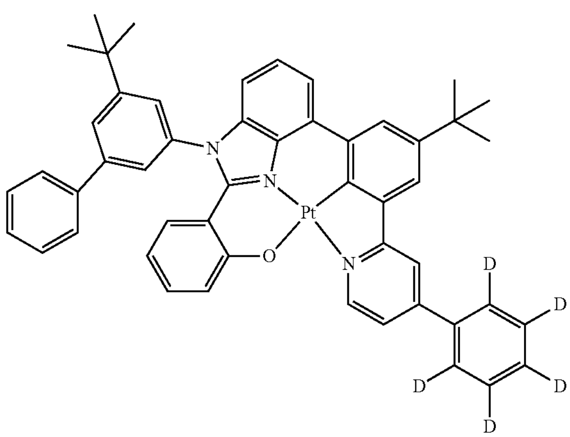
4-919
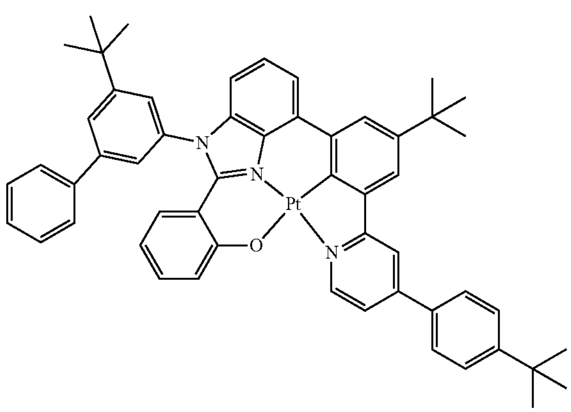
-continued
4-920
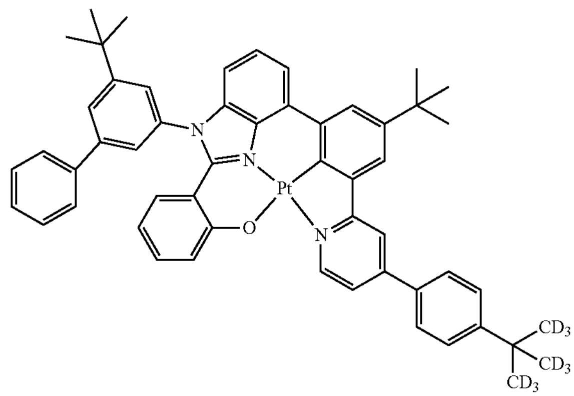
4-921
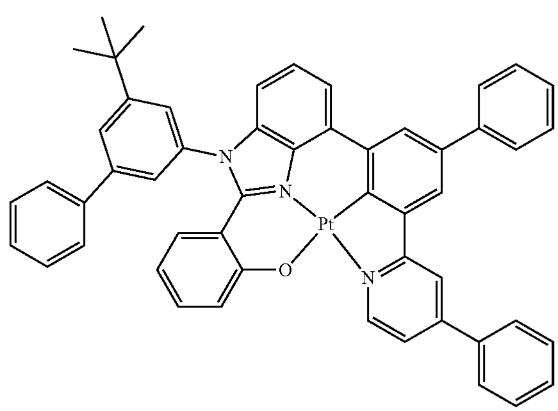
4-922
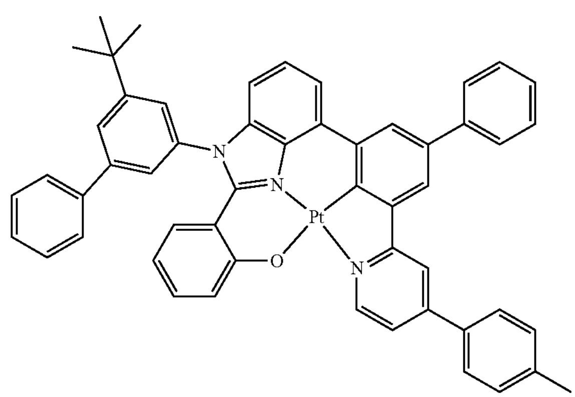

-continued
4-923
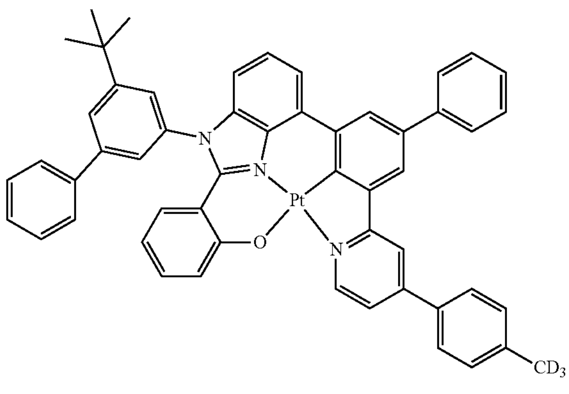
4-924
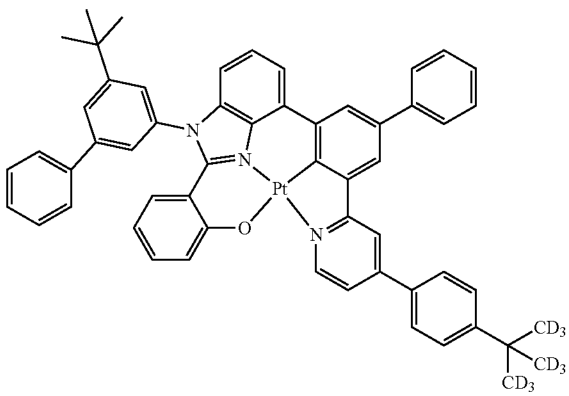
4-925
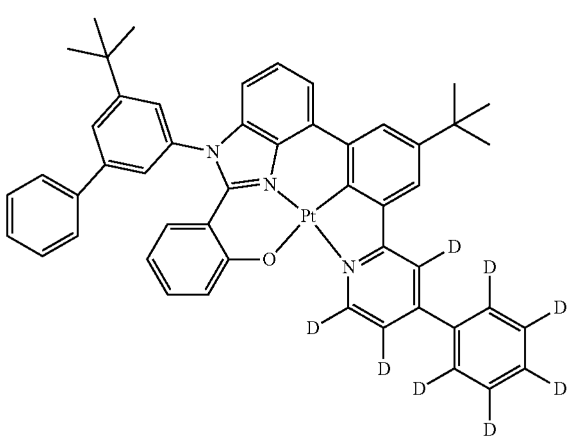
-continued
4-926
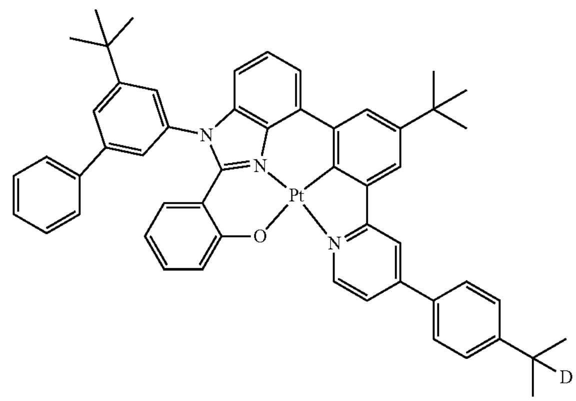
4-927
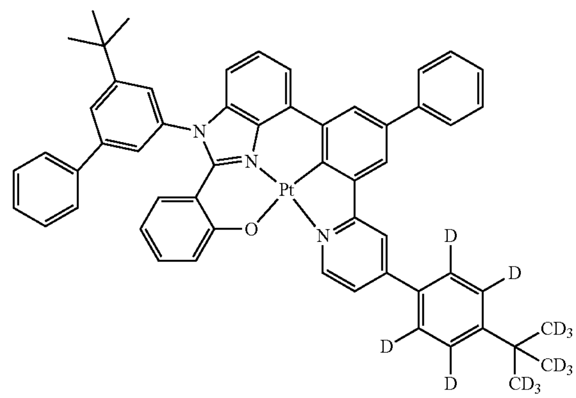
4-928
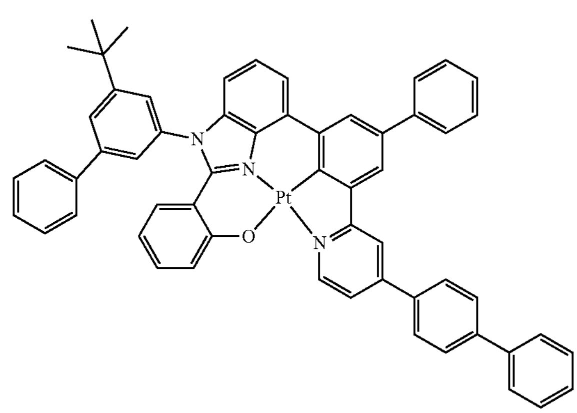

4-929
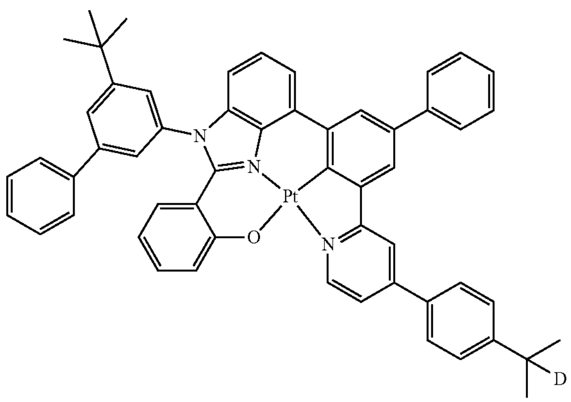
4-930
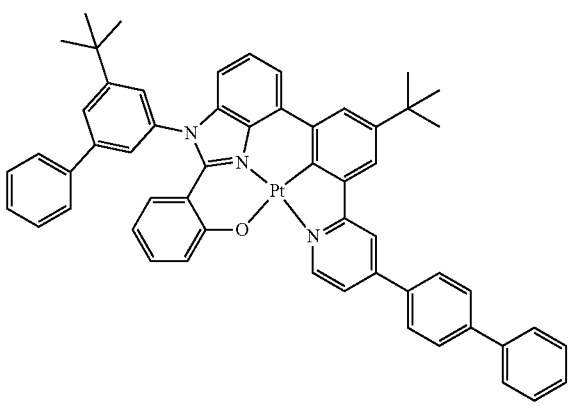
4-931
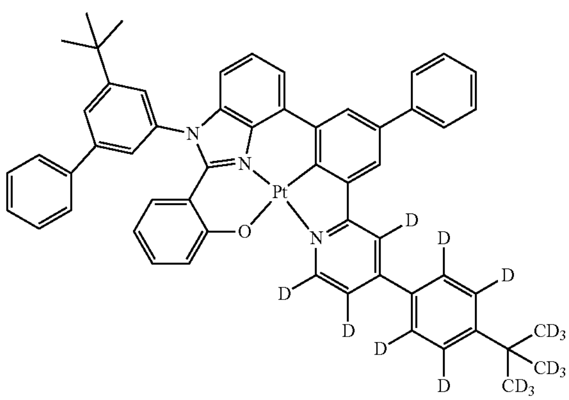
4-932
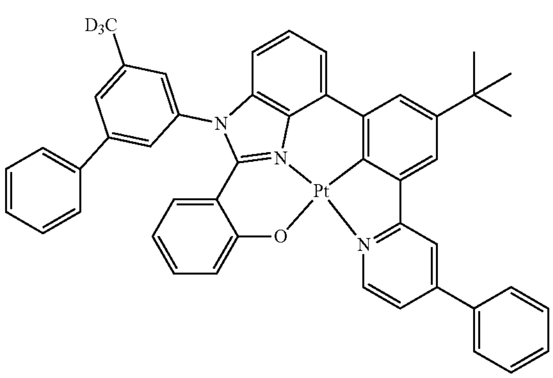
4-933
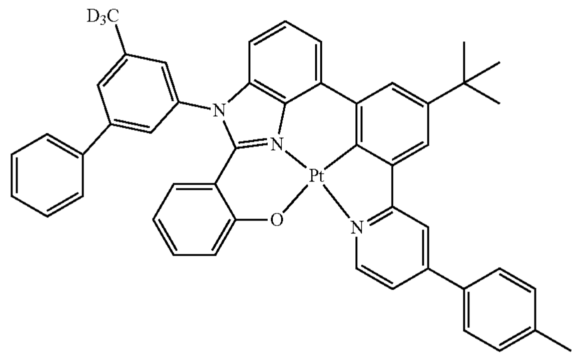
4-934
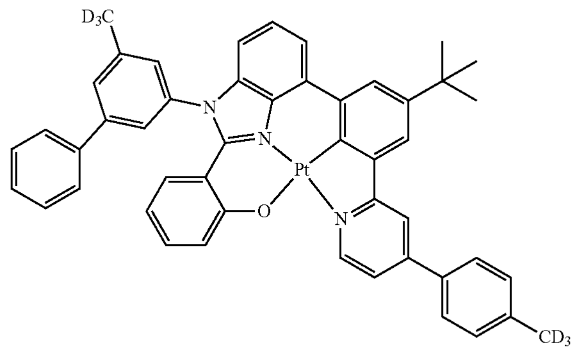
4-935
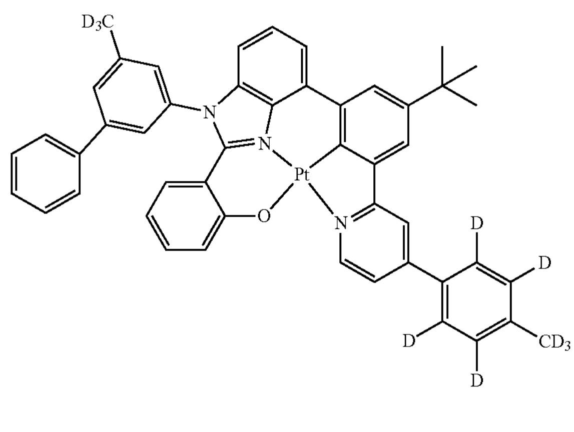
4-936
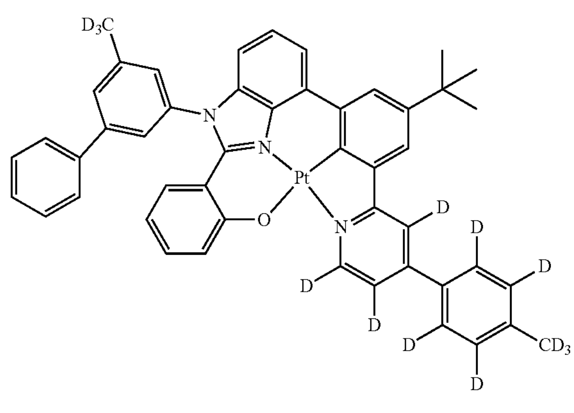

-continued
4-937
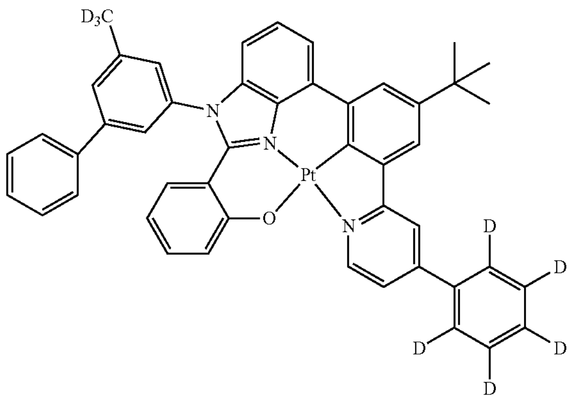
4-938
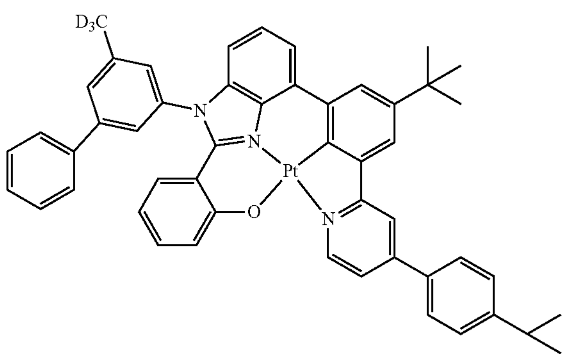
4-939
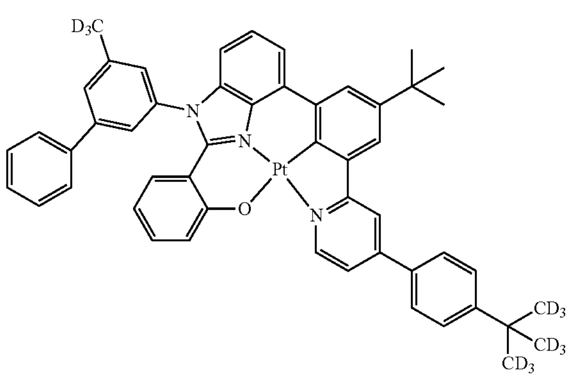
4-940
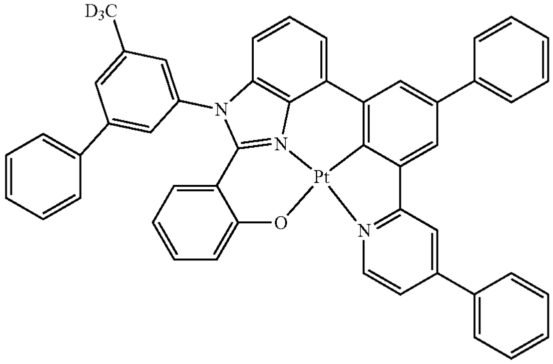
-continued
4-941
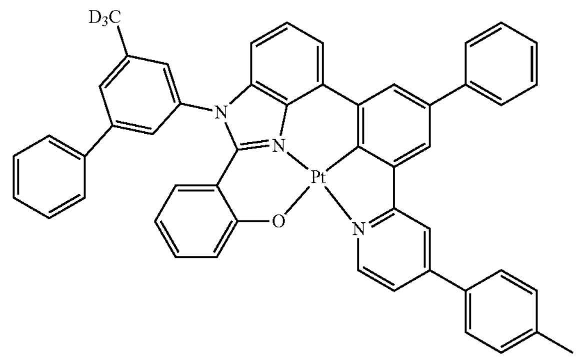
4-942
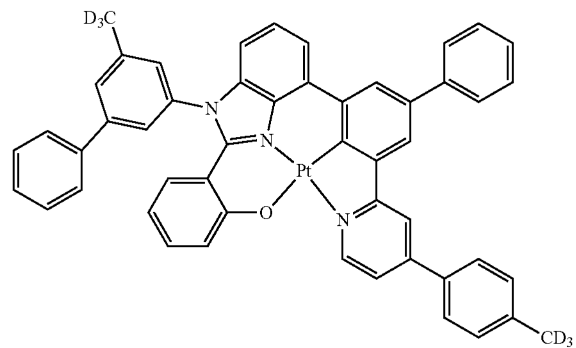
4-943
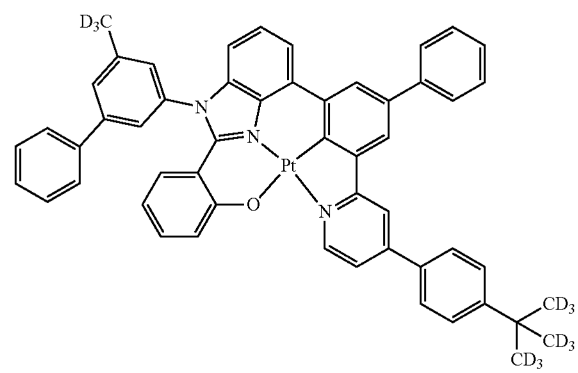
4-944
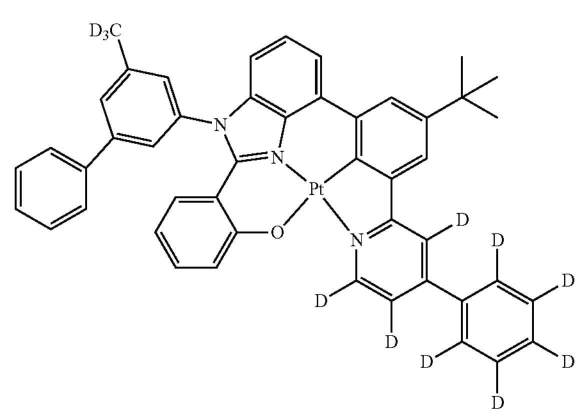

-continued
4-945
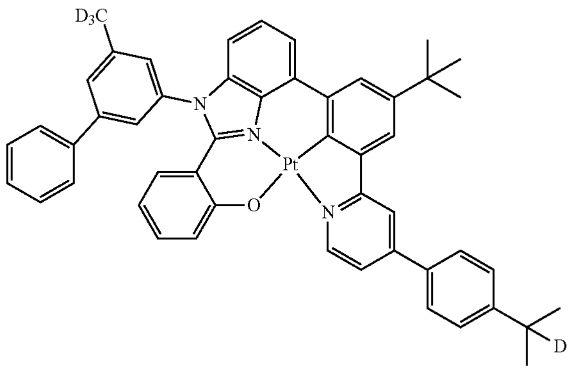
4-946
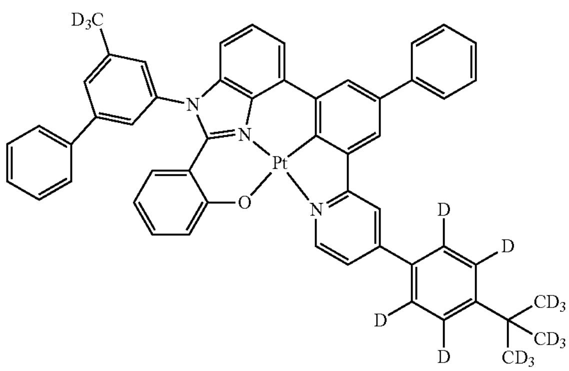
4-947
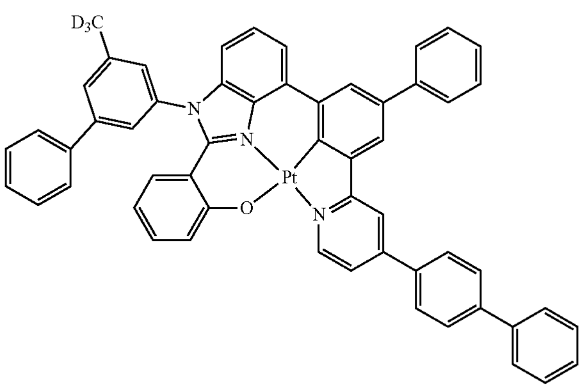
4-948
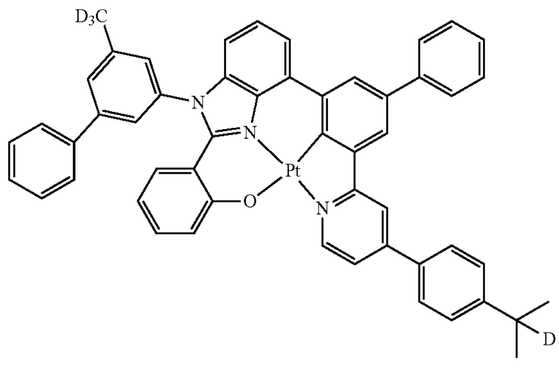
-continued
4-949
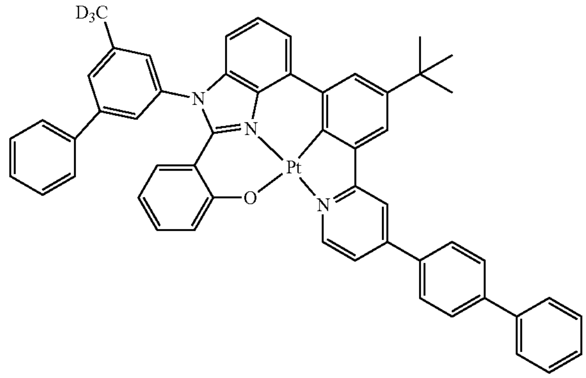
4-950
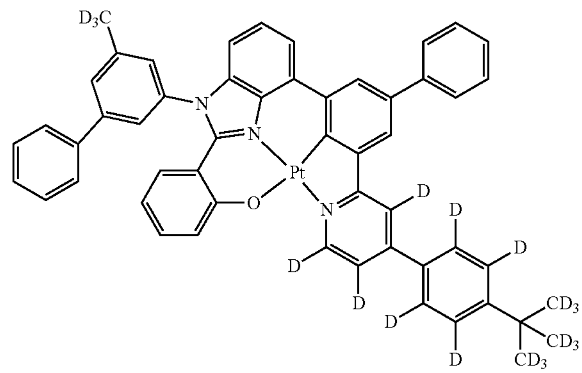
4-951
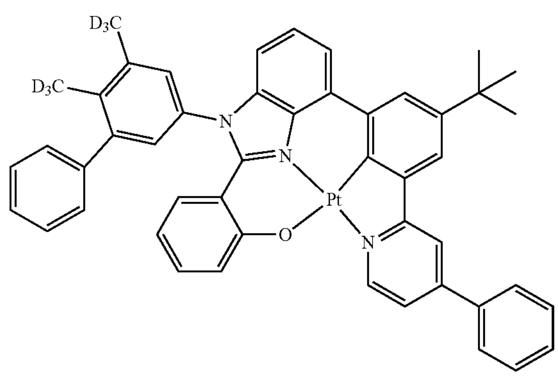
4-952
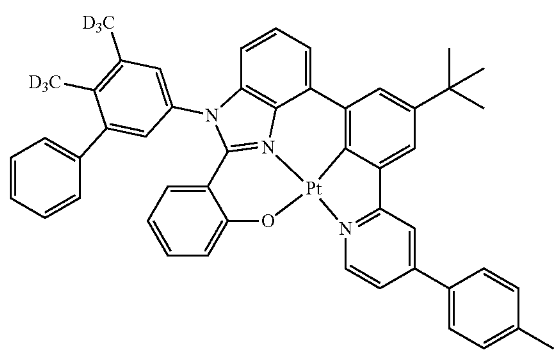

-continued
4-953
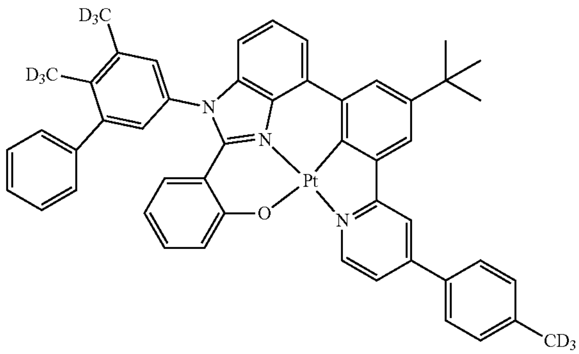
4-954
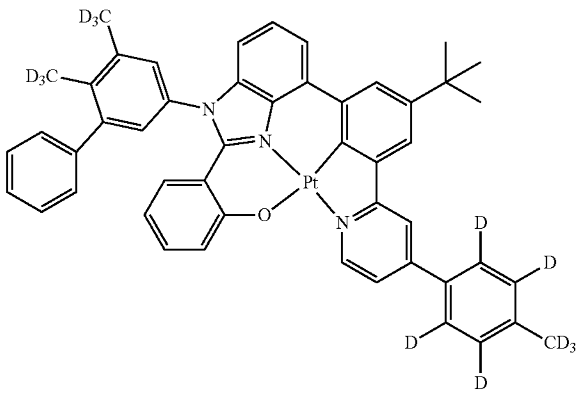
4-955
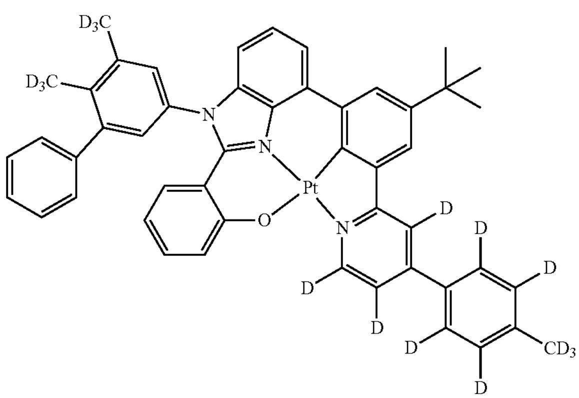
4-956
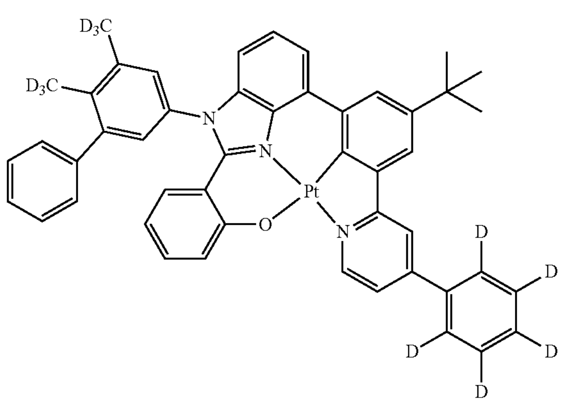
-continued
4-957
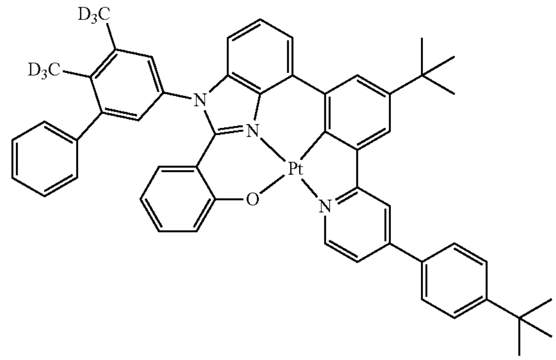
4-958
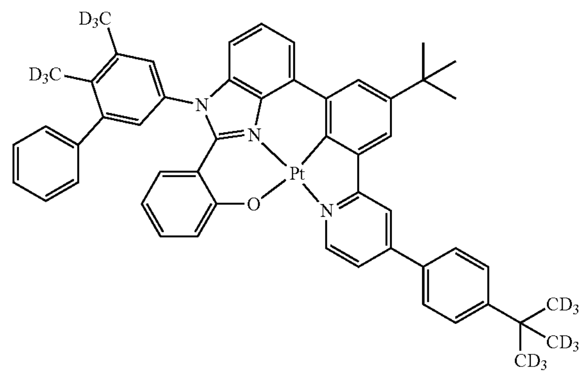
4-959
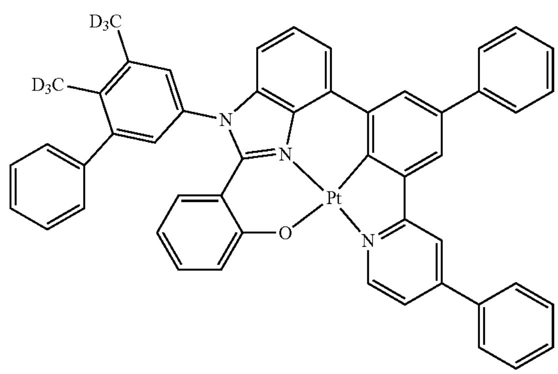
4-960
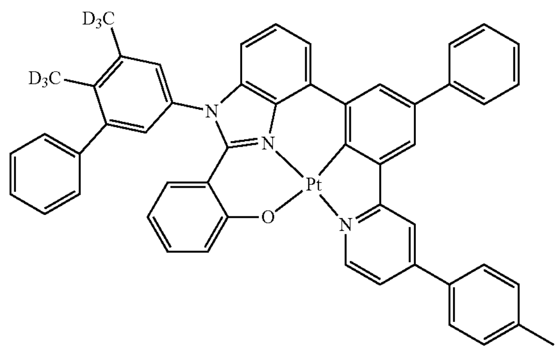

-continued
4-961
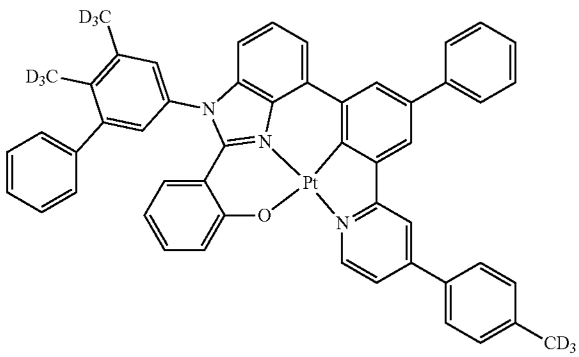
4-962
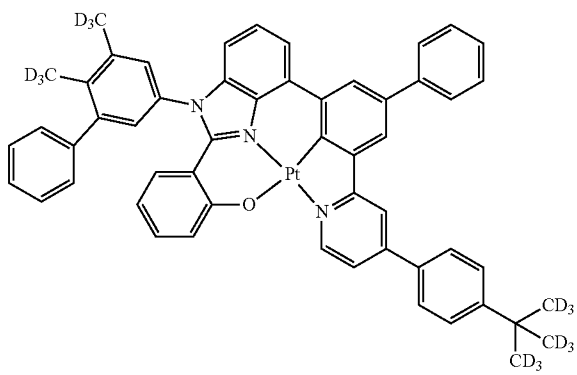
4-963
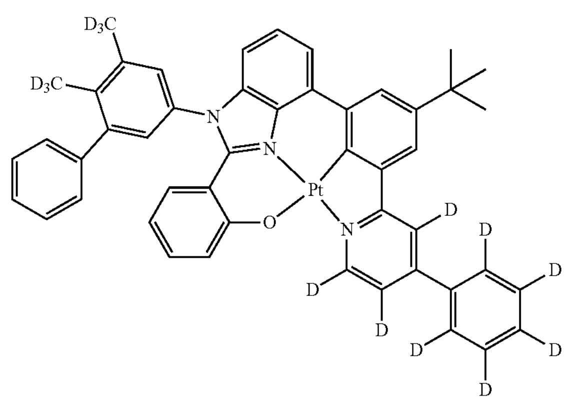
4-964
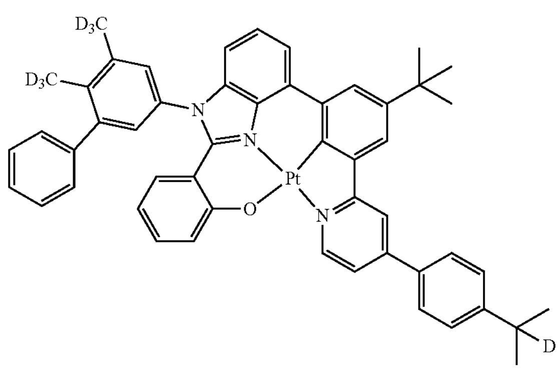
-continued
4-965
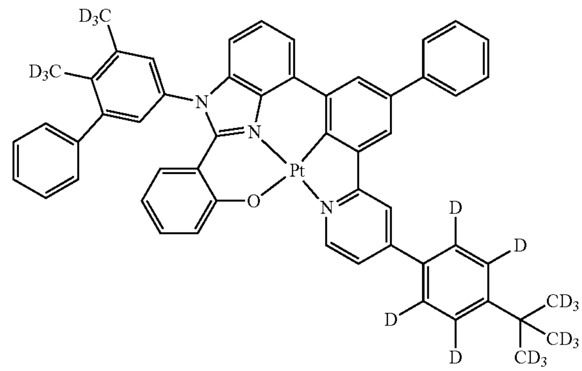
4-966
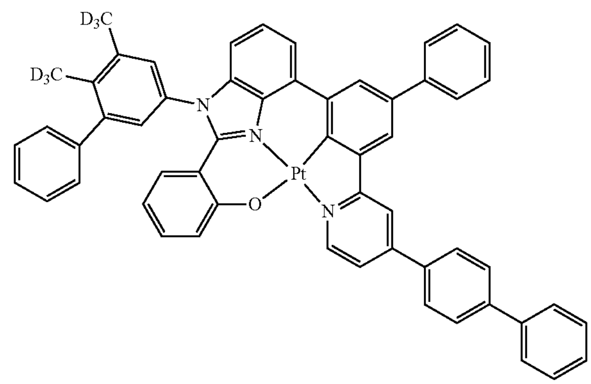
4-967
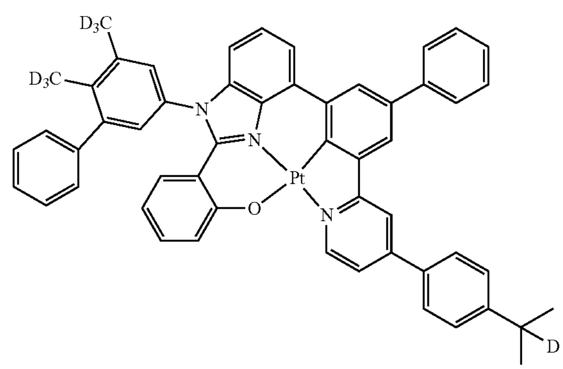
4-968
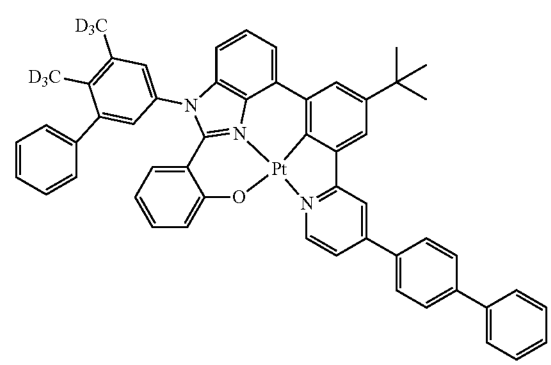

-continued
4-969
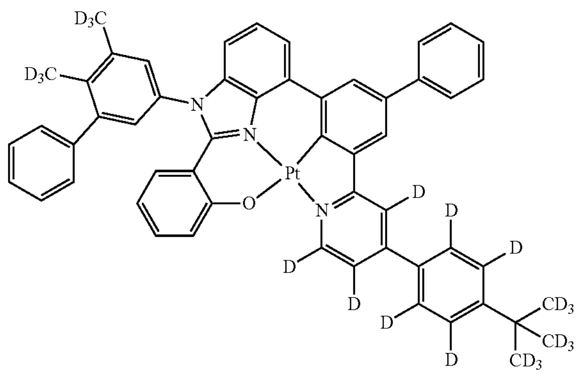
4-970
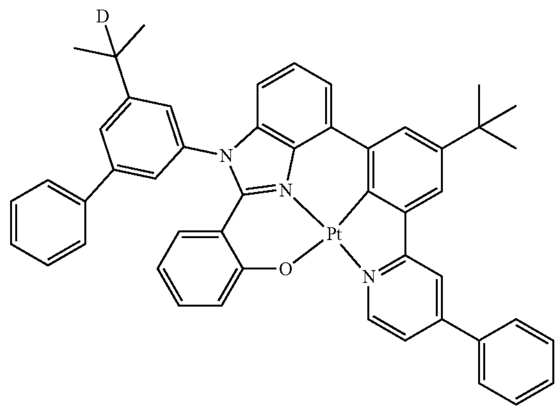
4-971
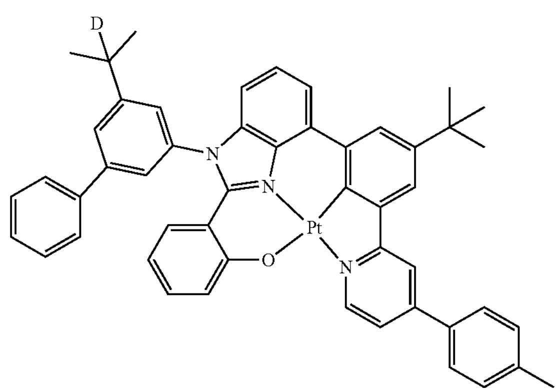
4-972
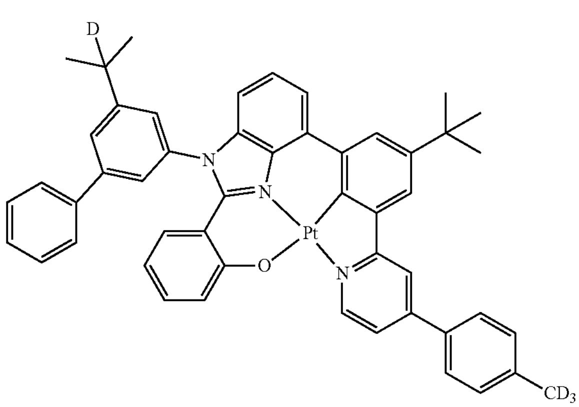
-continued
4-973
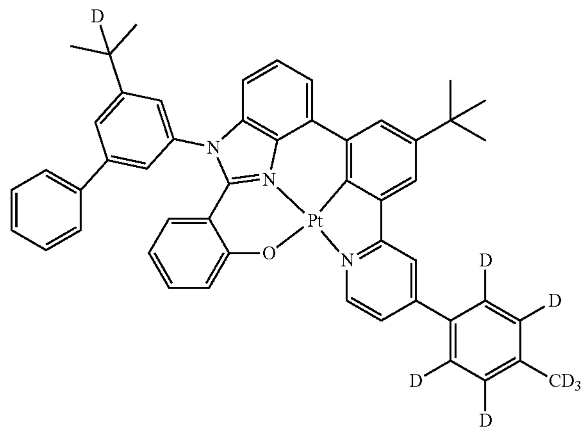
4-974
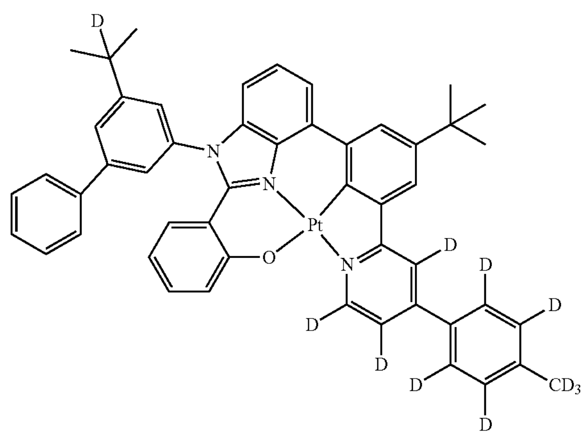
4-975
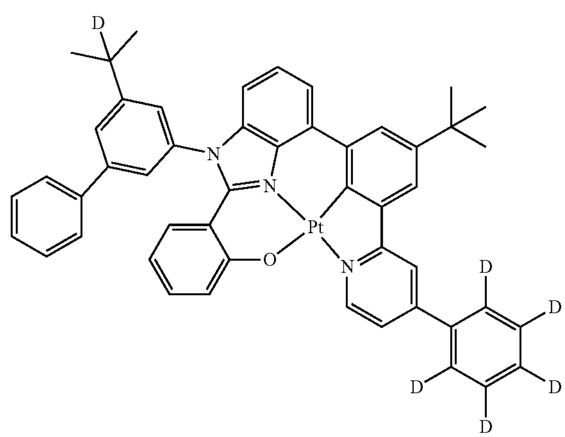

4-976
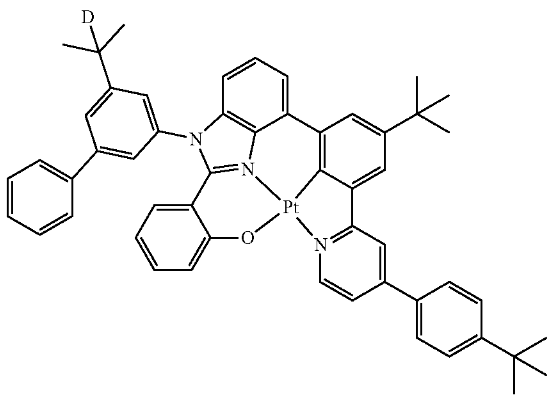
4-977
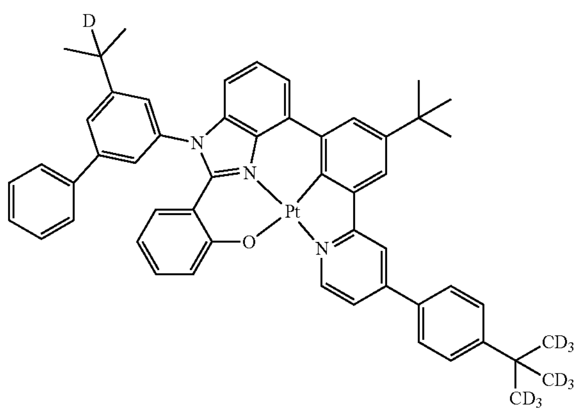
4-978
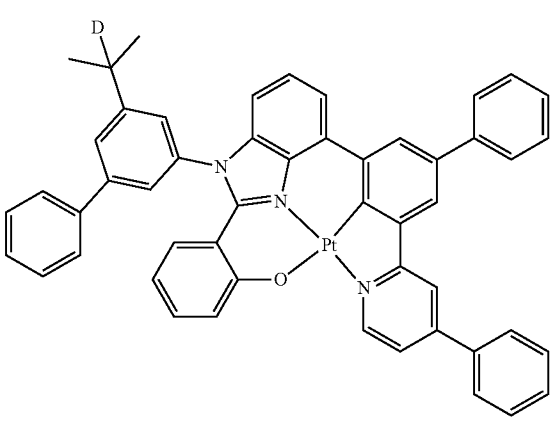
4-979
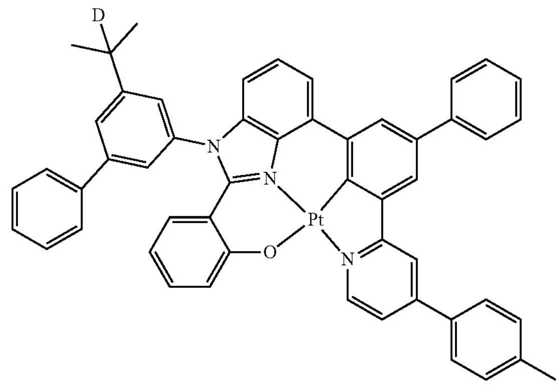
4-980
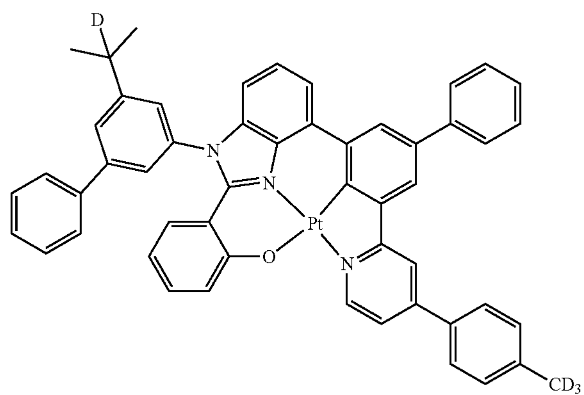
4-981
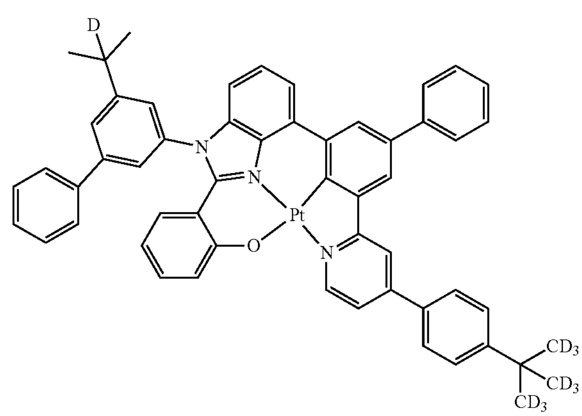

-continued
4-982
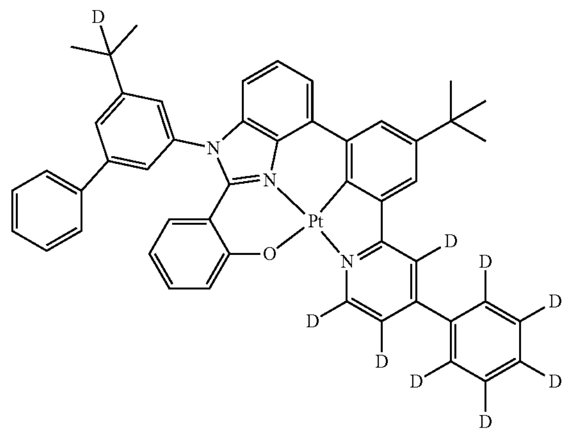
4-983
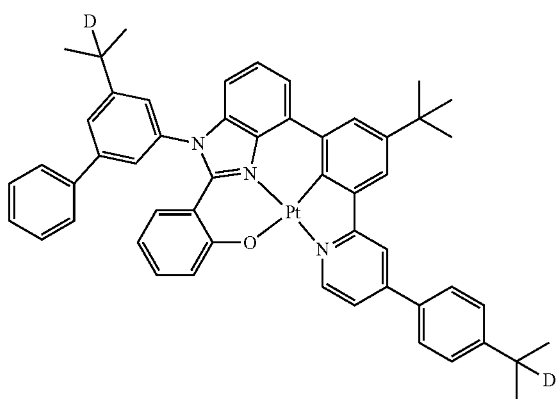
4-984
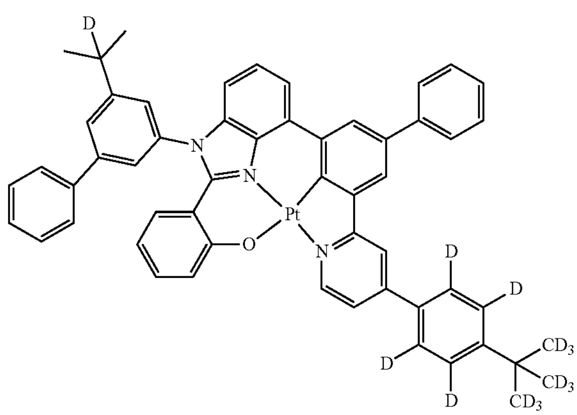
-continued
4-985
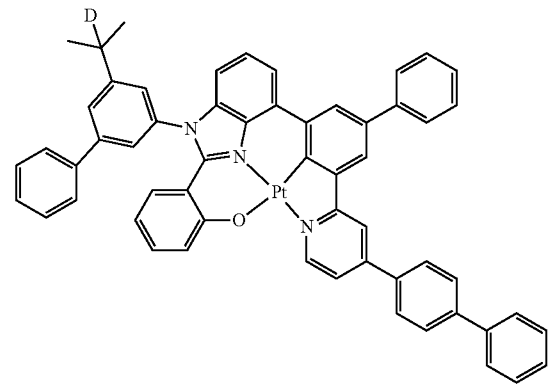
4-986
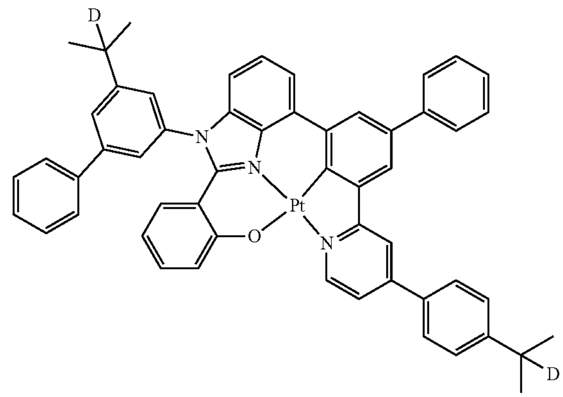
4-987
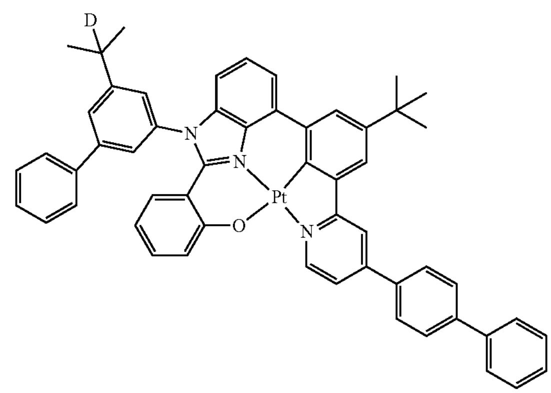
4-988
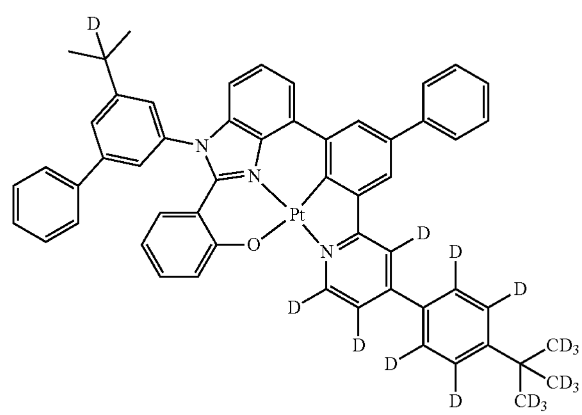

-continued
4-989
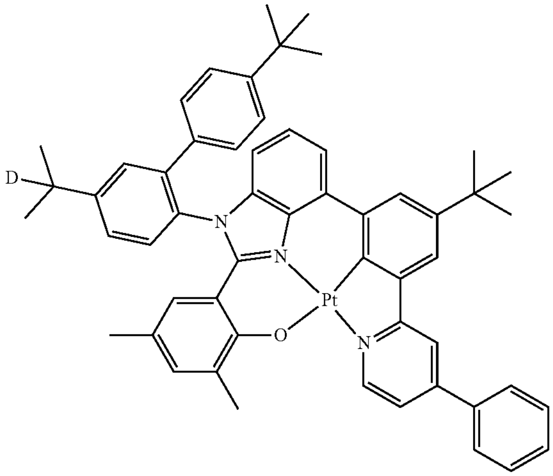
4-990
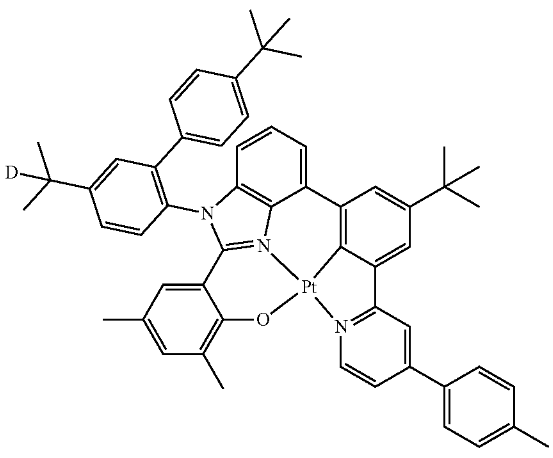
4-991
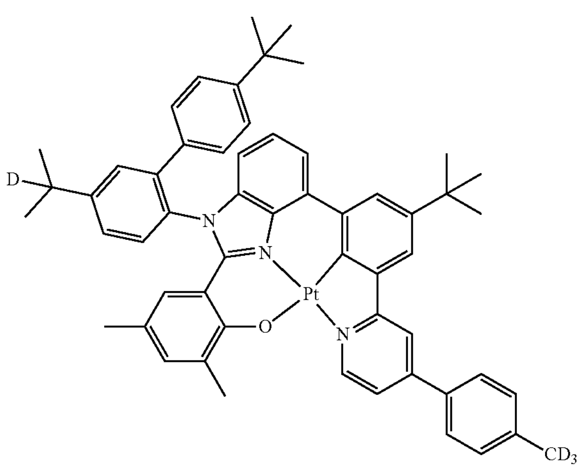
-continued
4-992
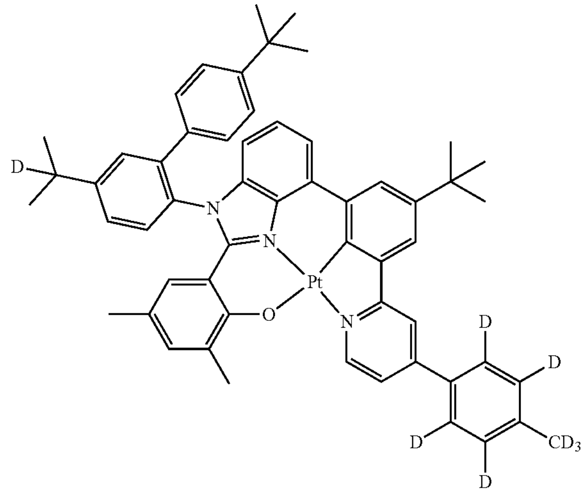
4-993
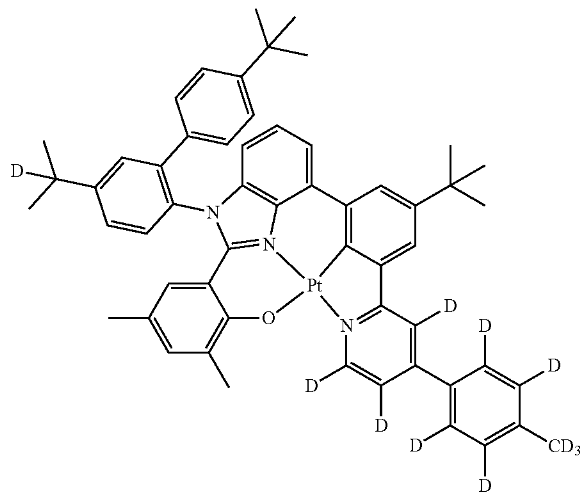
4-994
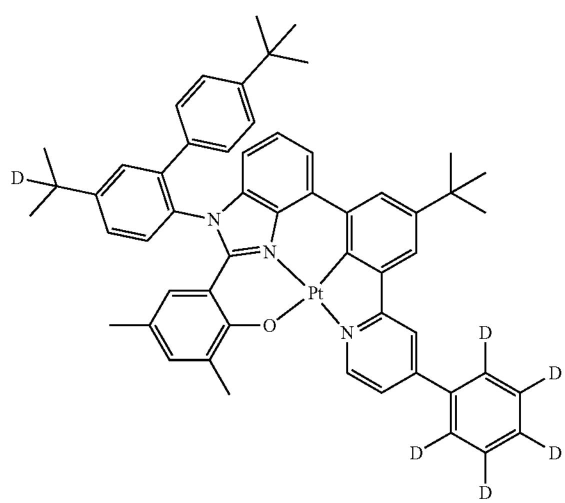

4-995
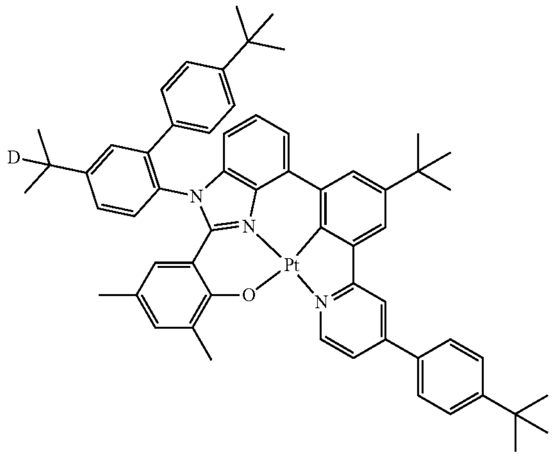
4-996
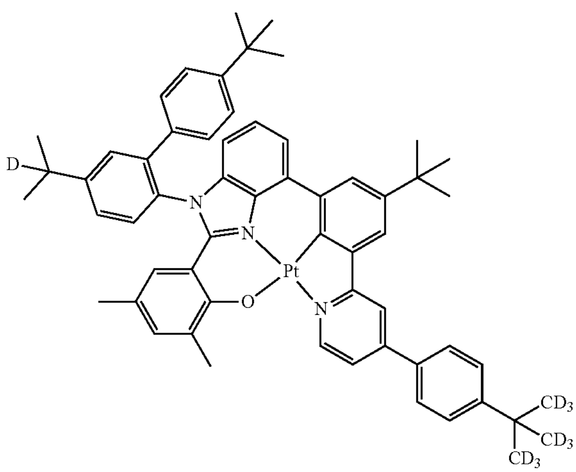
4-997
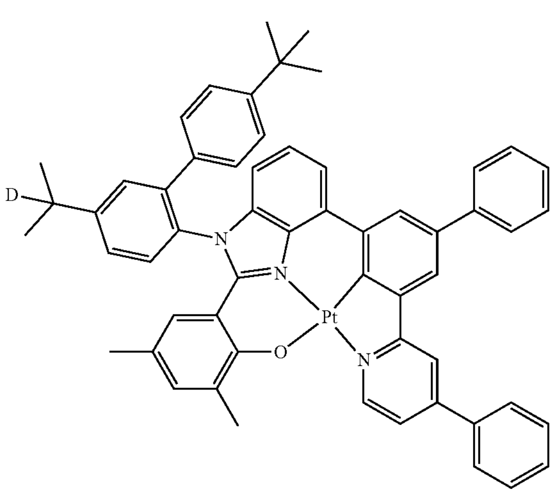
4-998
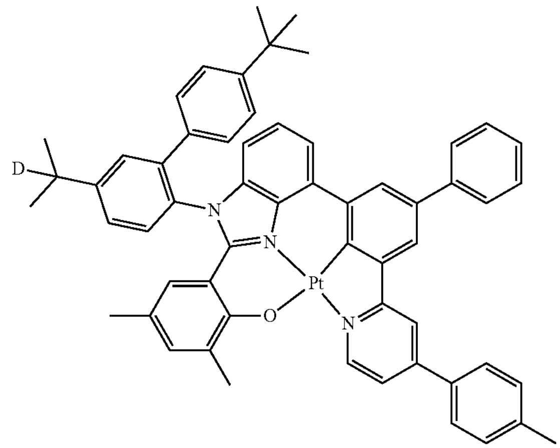
4-999
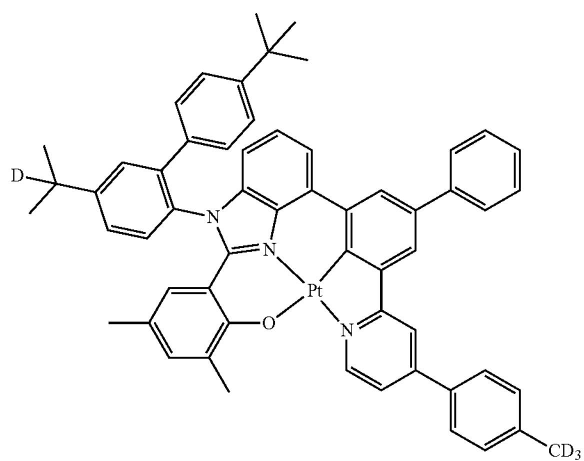
4-1000
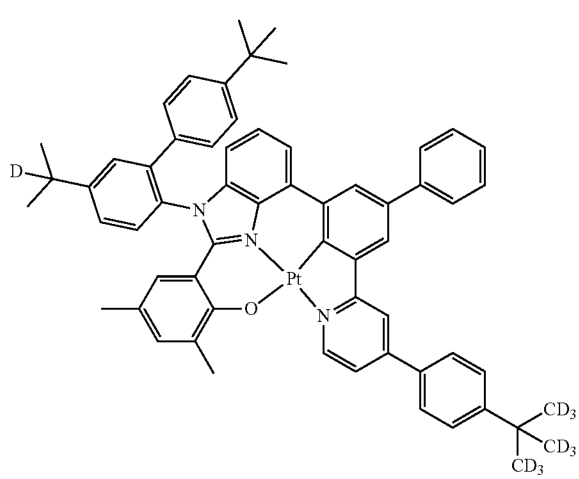

-continued
4-1001
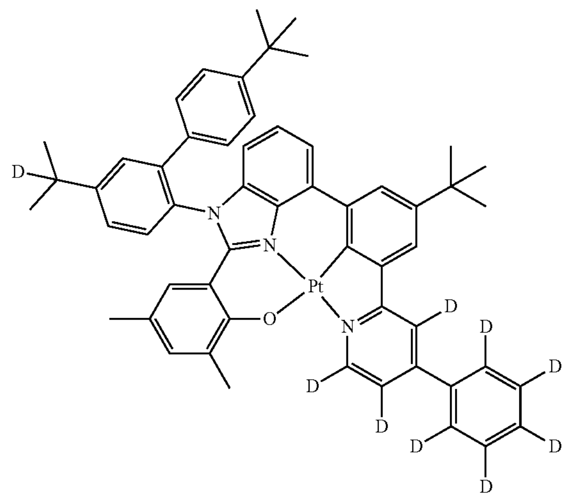
4-1002
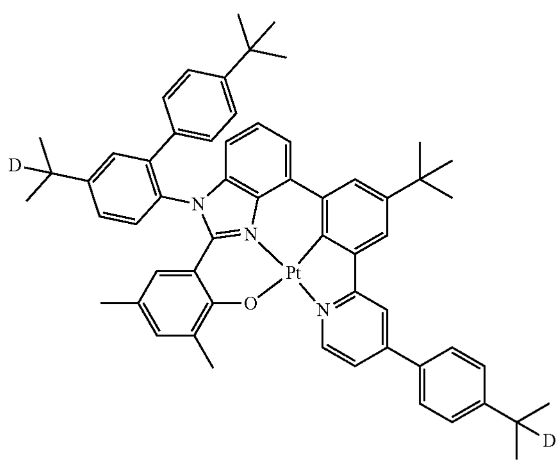
4-1003
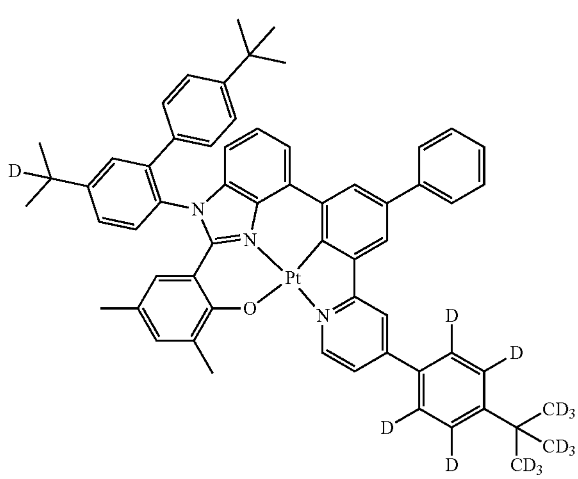
-continued
4-1004
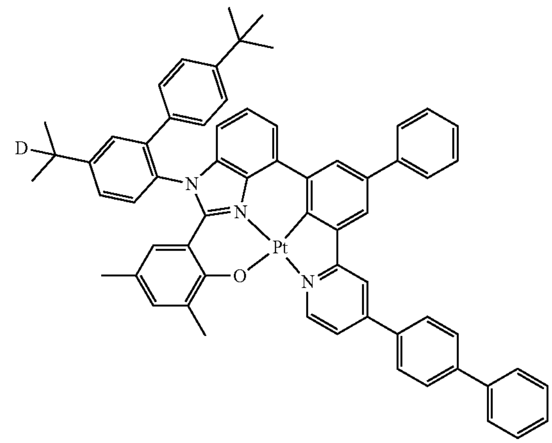
4-1005
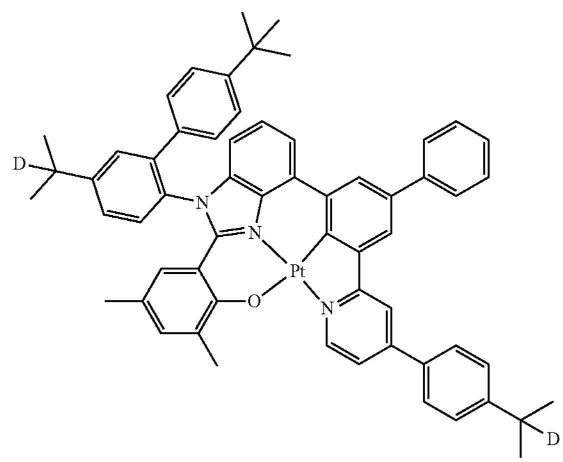
4-1006
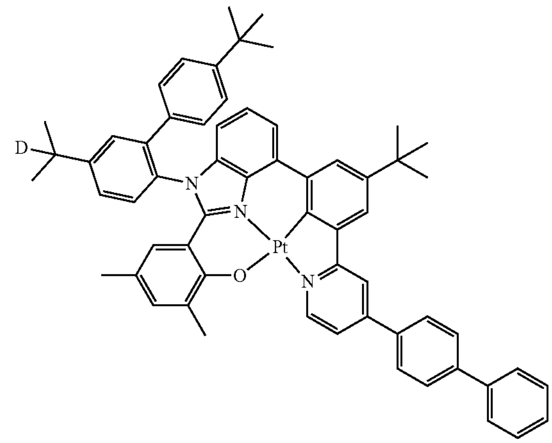

4-1007
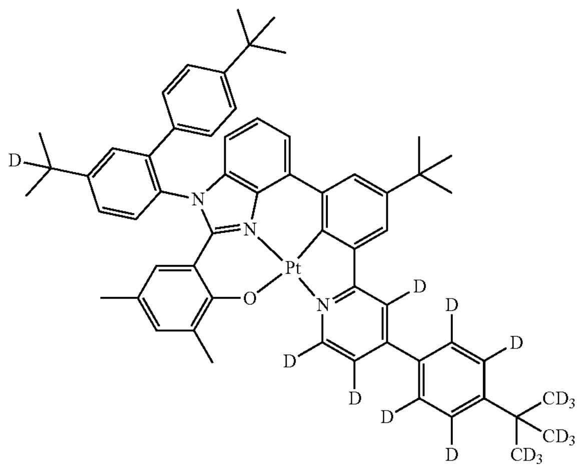
4-1008
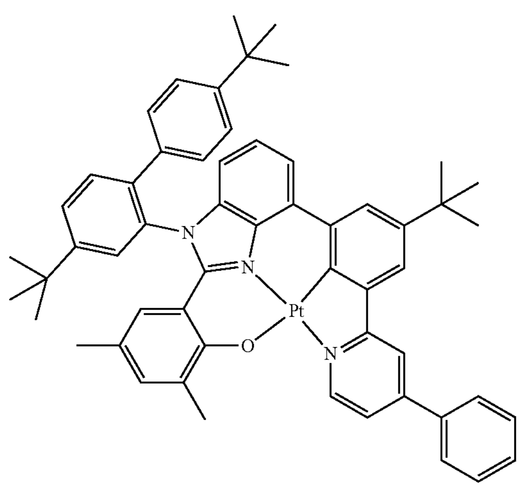
4-1009
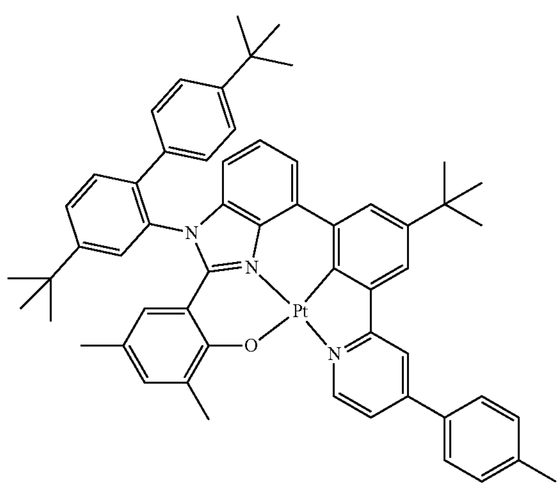
4-1010
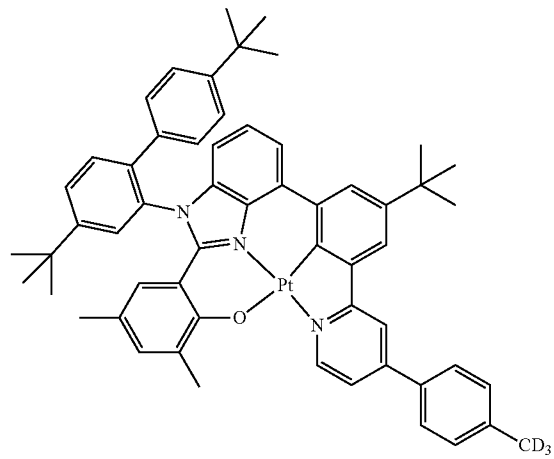
4-1011
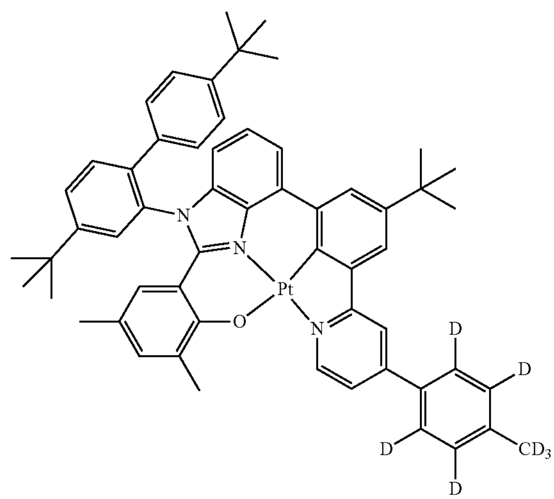
4-1012
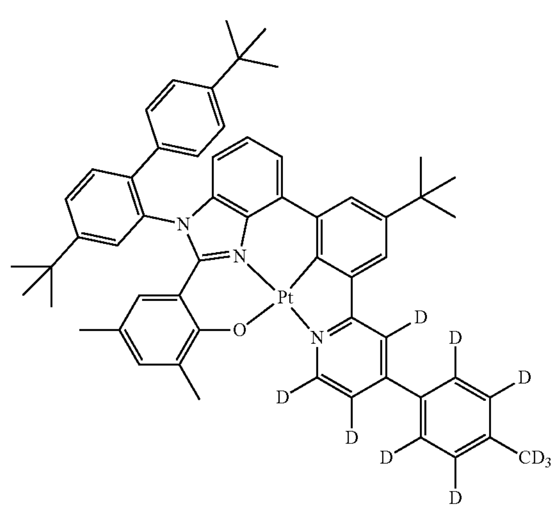

-continued
4-1013
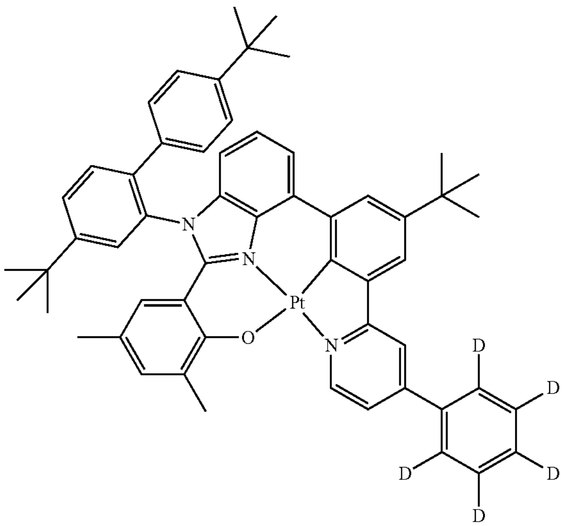
4-1014
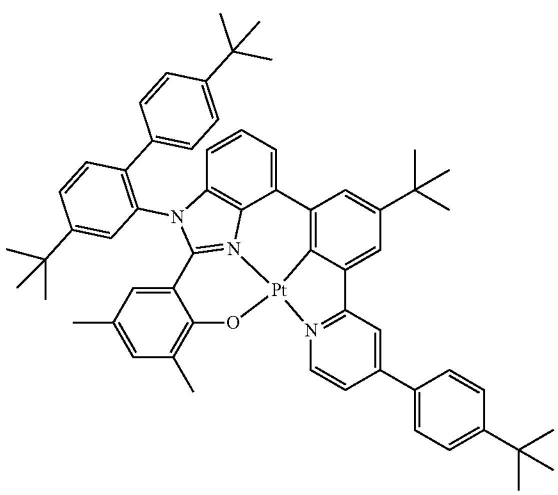
4-1015
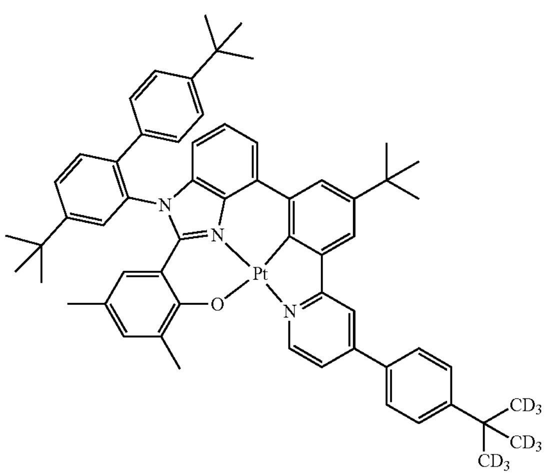
-continued
4-1016
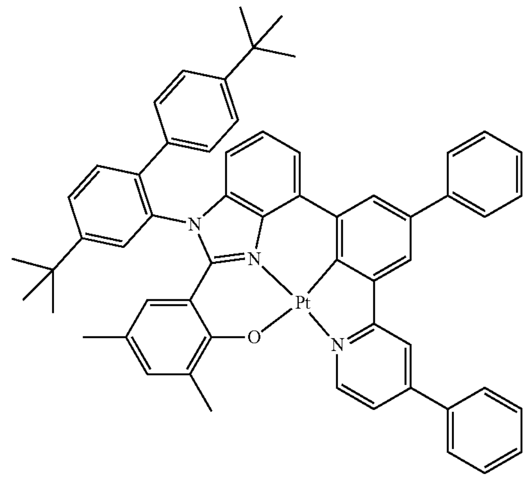
4-1017
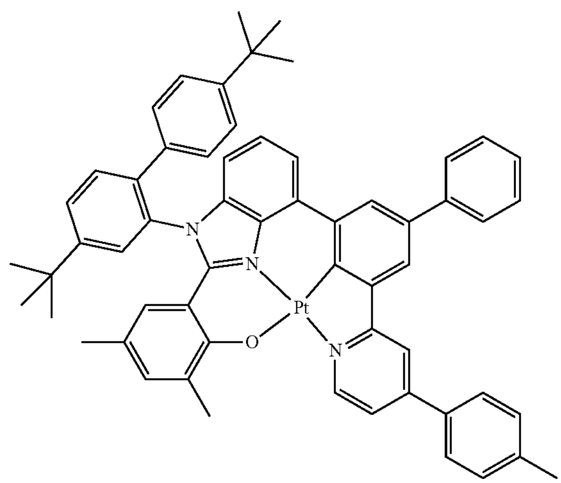
4-1018
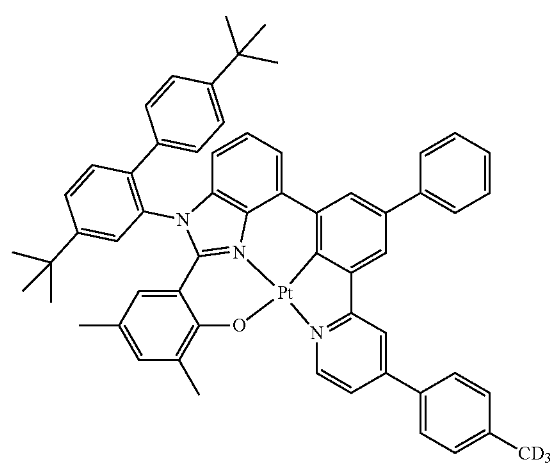

-continued
4-1019
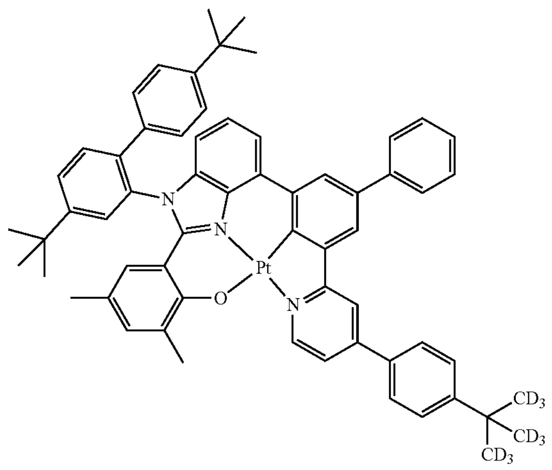
4-1020
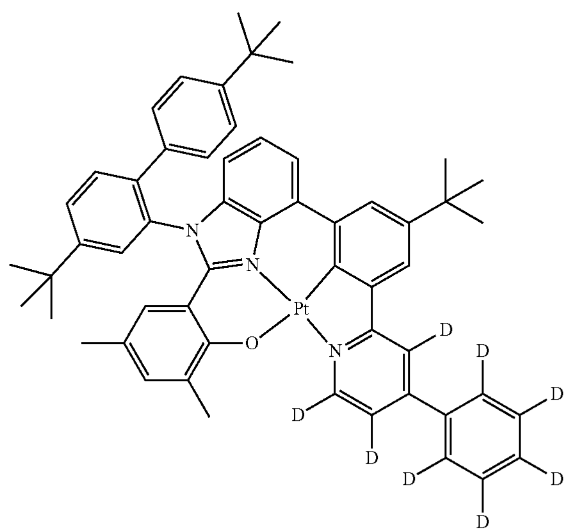
4-1021
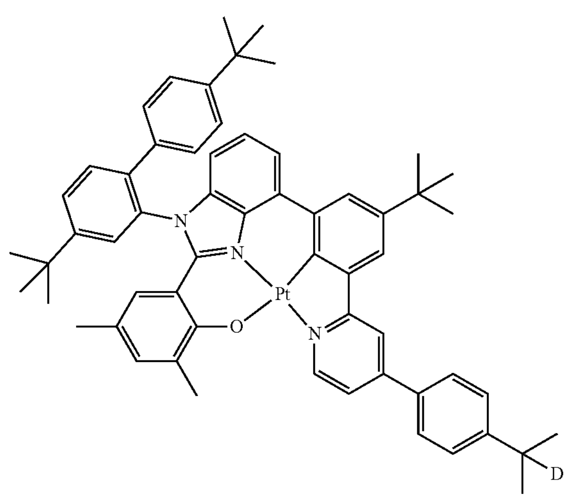
-continued
4-1022
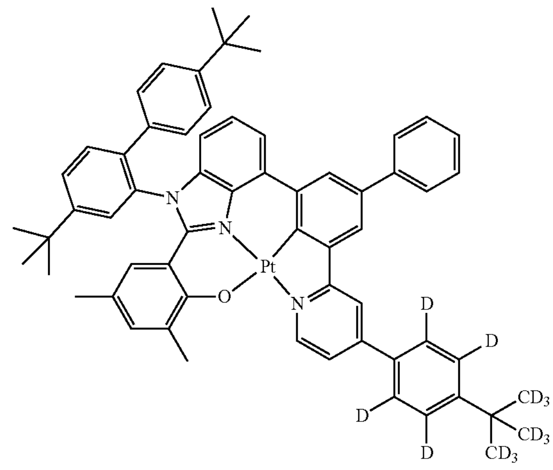
4-1023
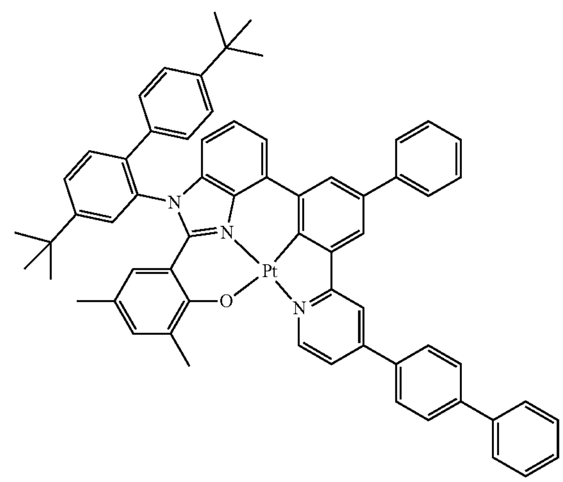
4-1024
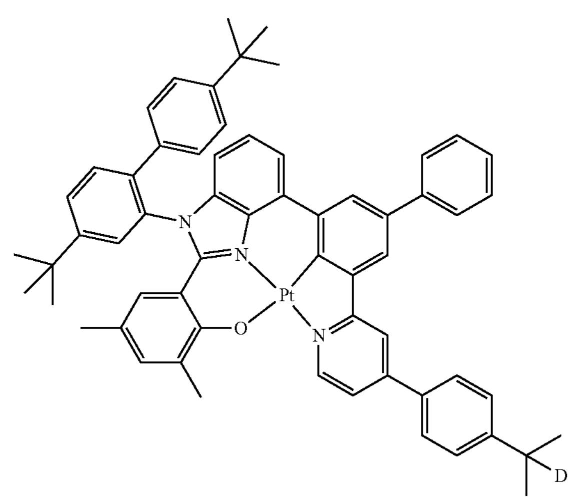

-continued
4-1025
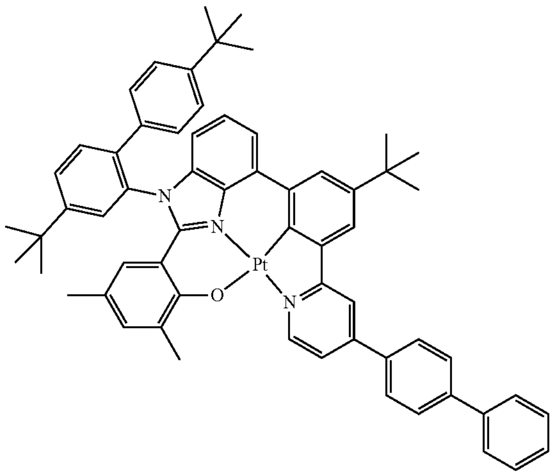
4-1026
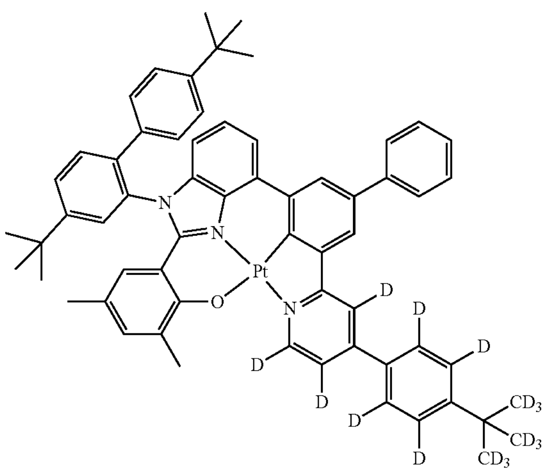
4-1027
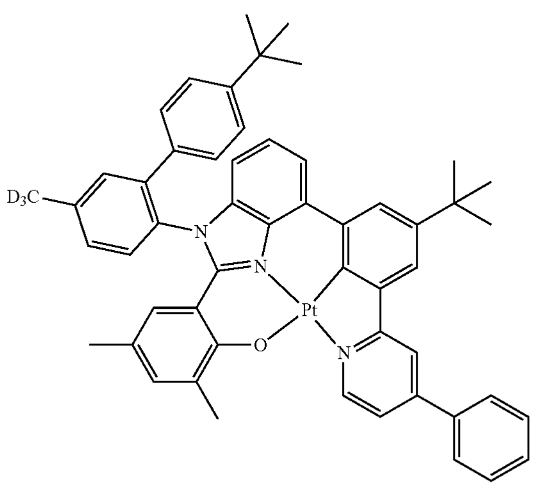
-continued
4-1028
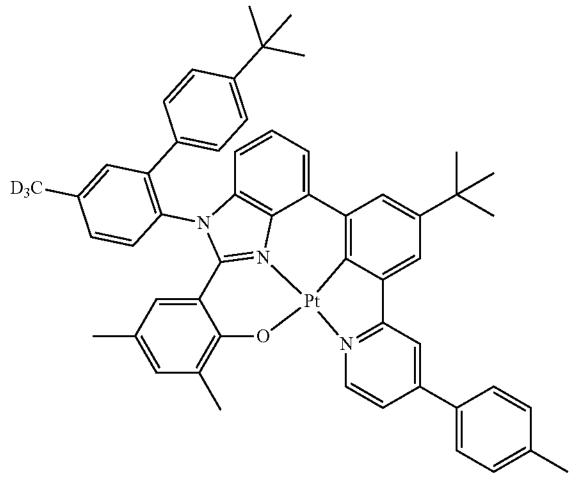
4-1029
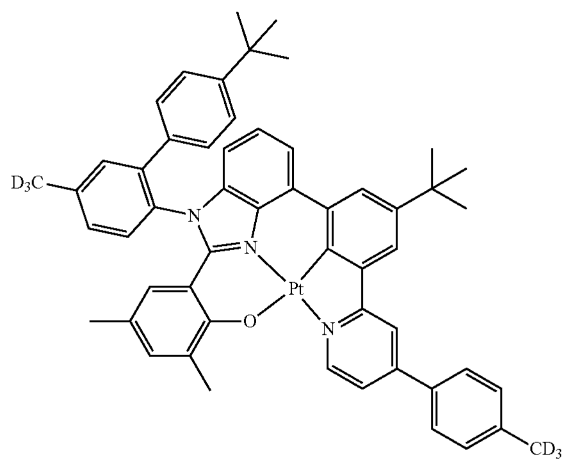
4-1030
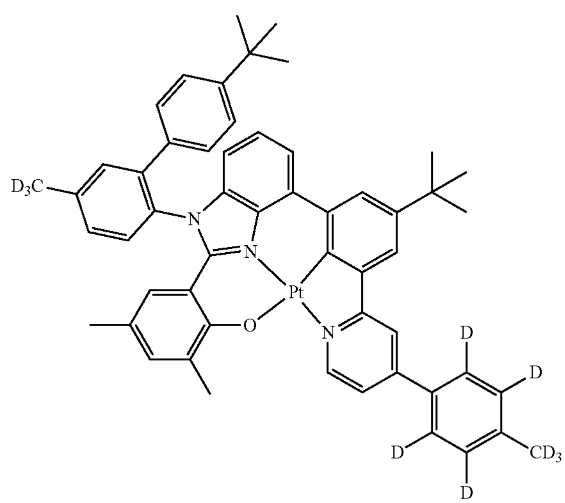

-continued
4-1031
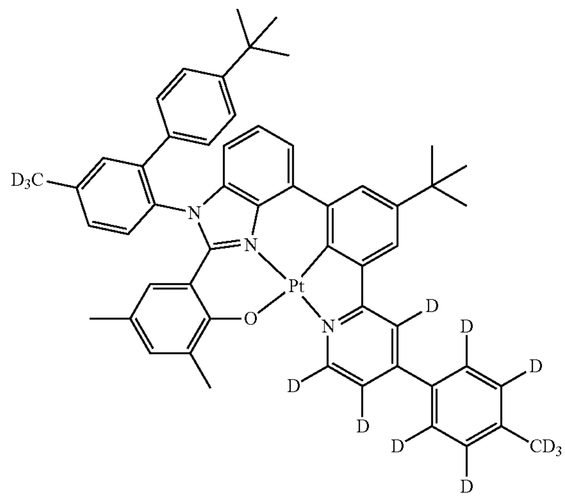
4-1032
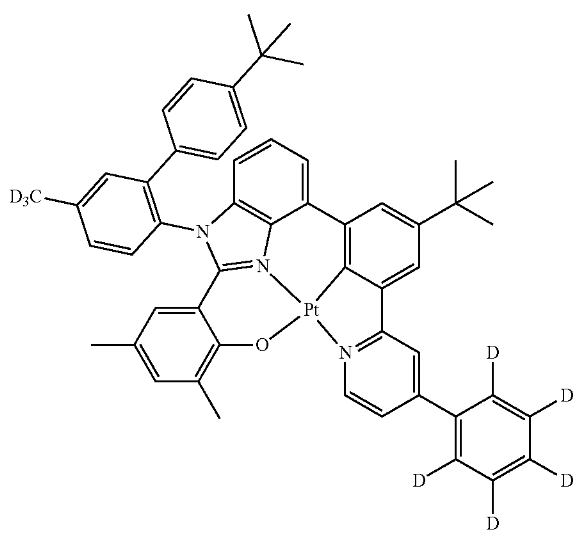
4-1033
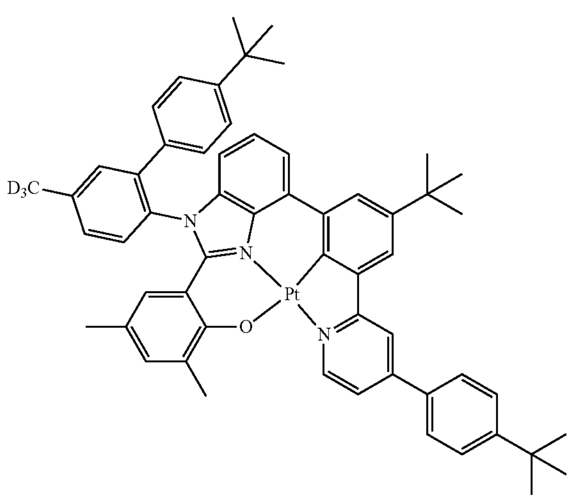
-continued
4-1034
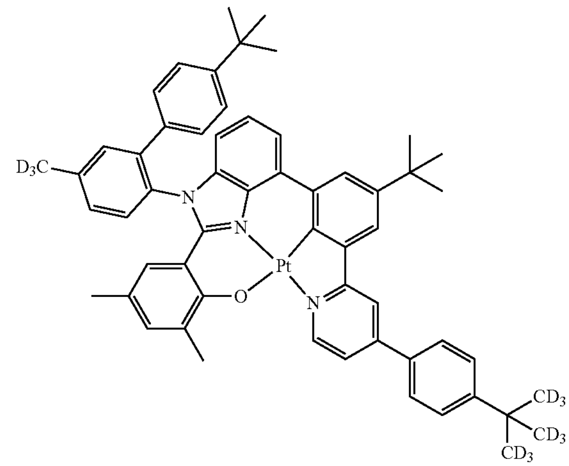
4-1035
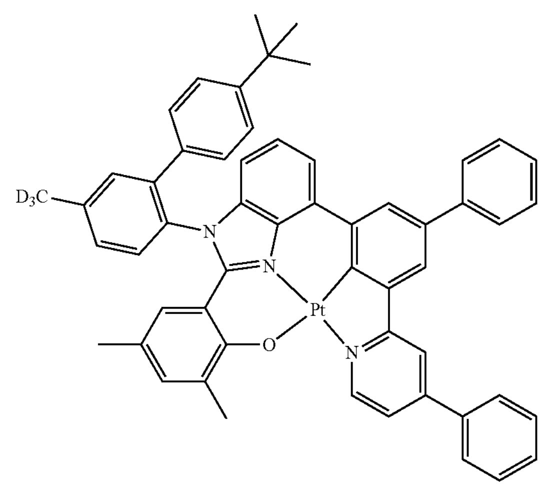
4-1036
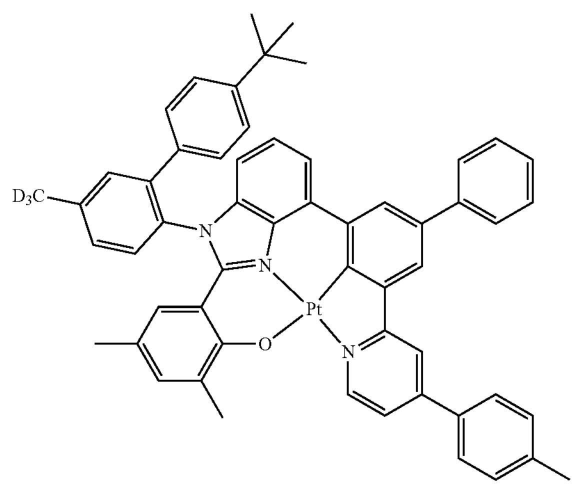

-continued
4-1037
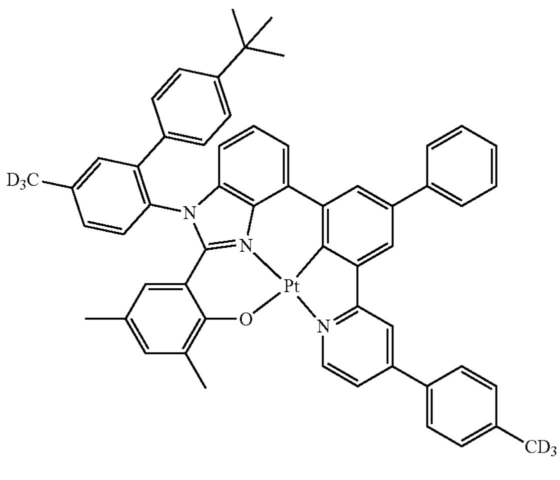
4-1038
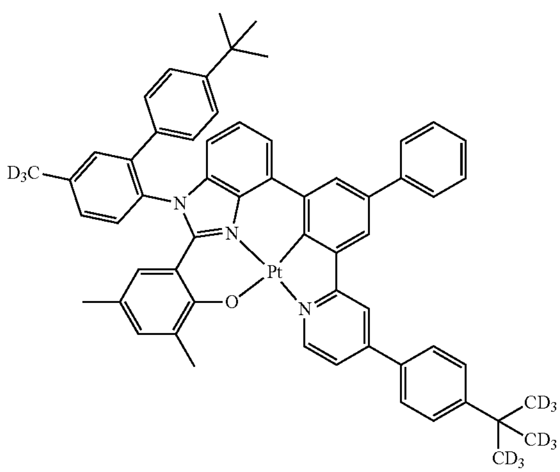
4-1039
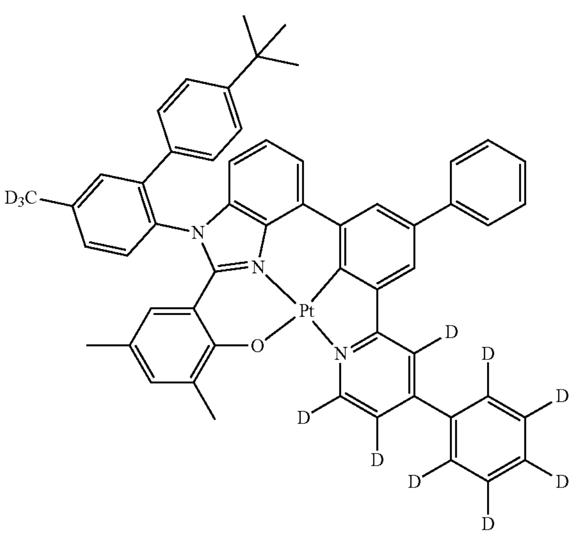
4-1040
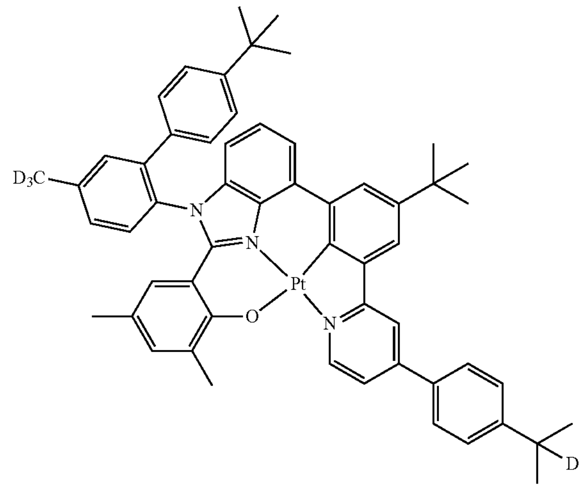
4-1041
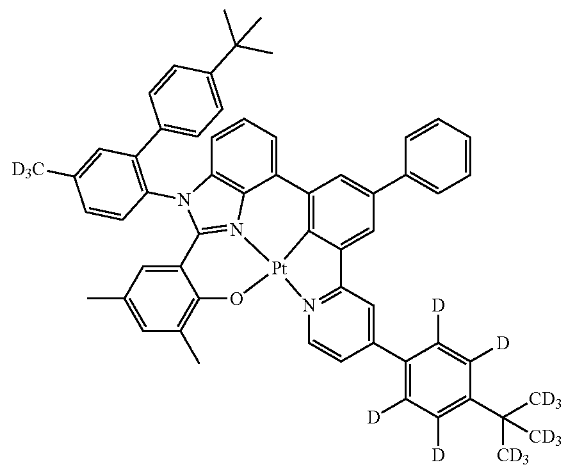
4-1042
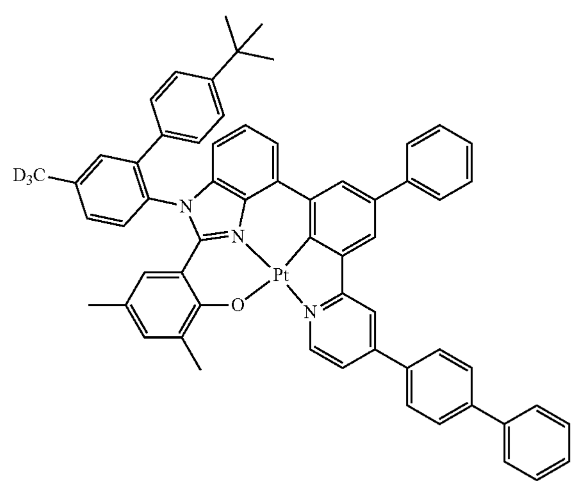

4-1043
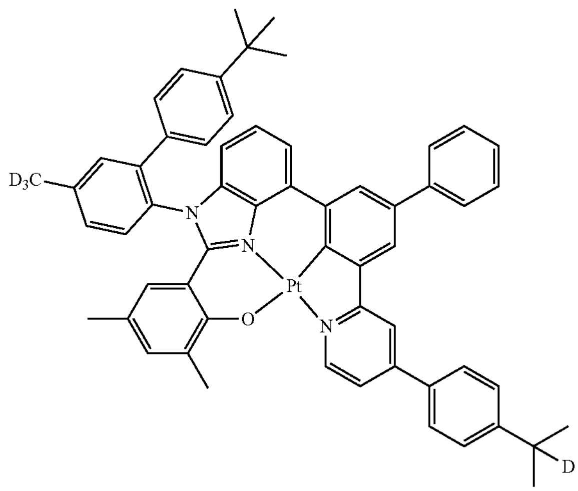
4-1044
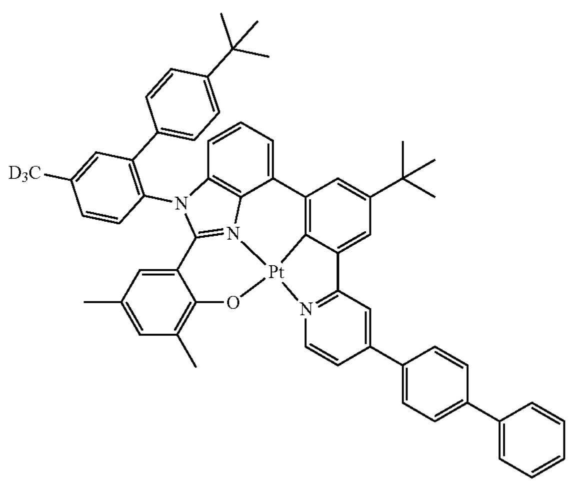
4-1045
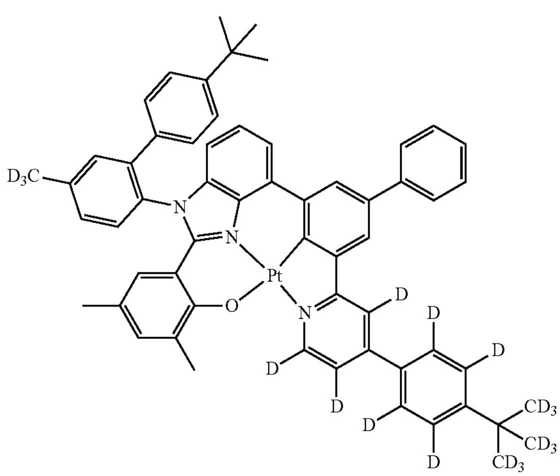
4-1046
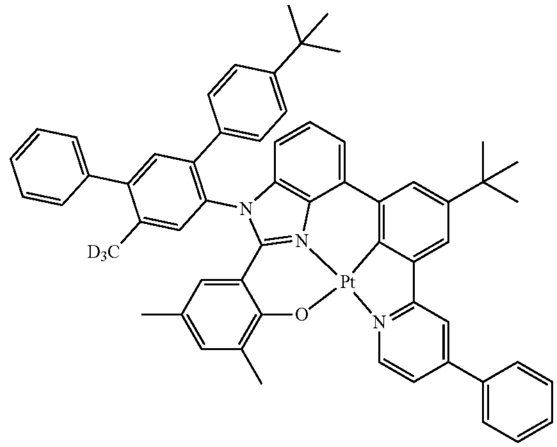
4-1047
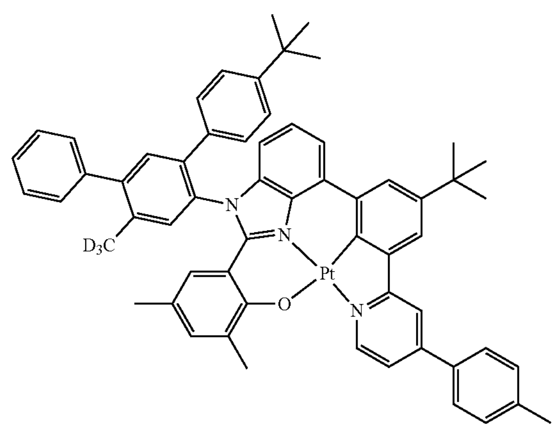
4-1048
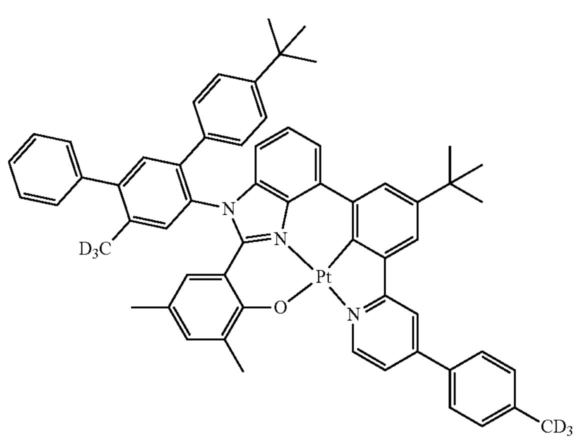

-continued
4-1049
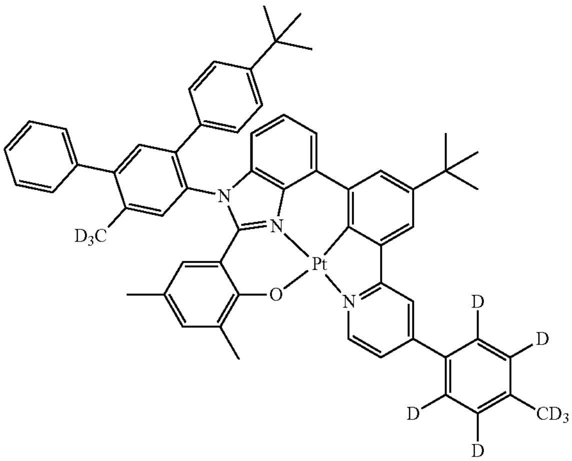
4-1050
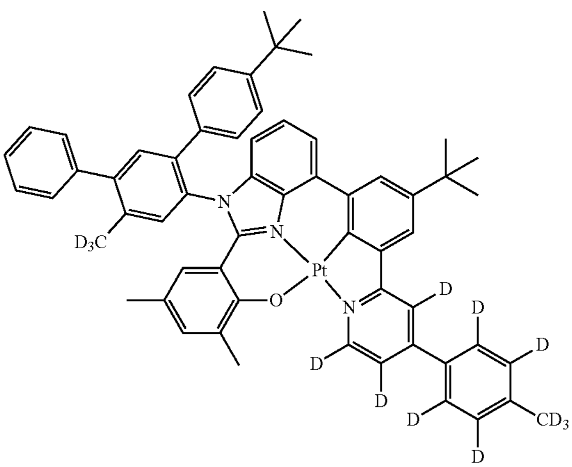
4-1051
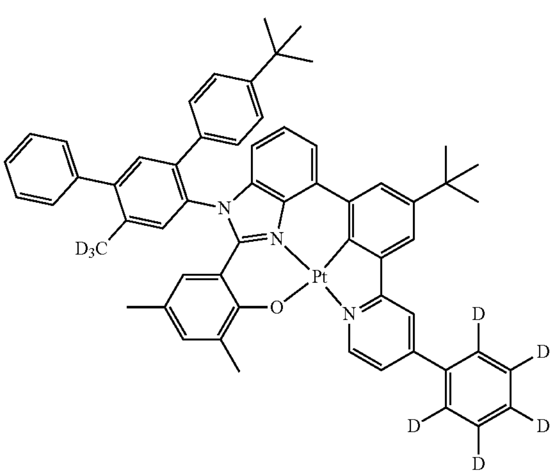
-continued
4-1052
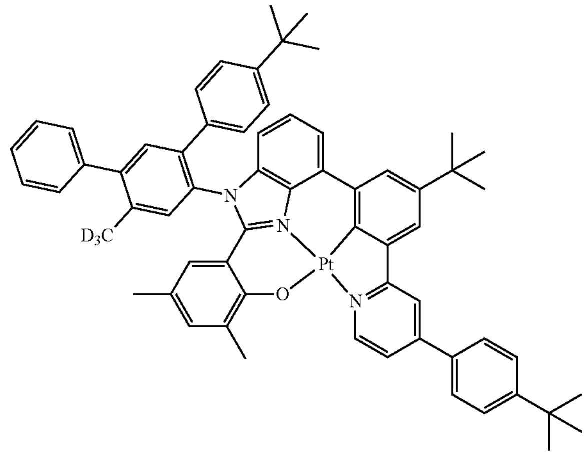
4-1053
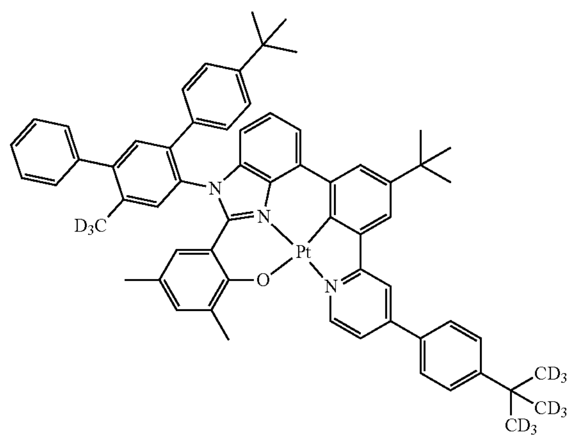
4-1054
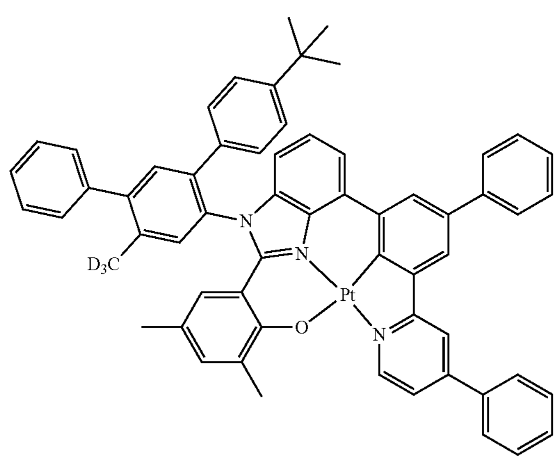

-continued
4-1055
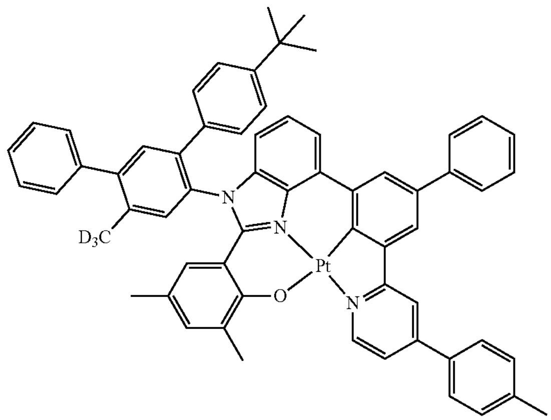
4-1056
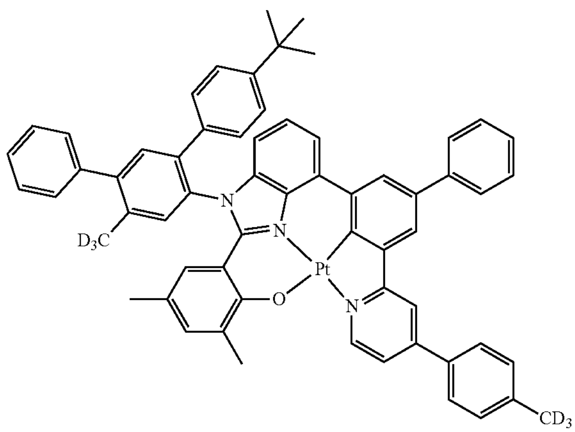
4-1057
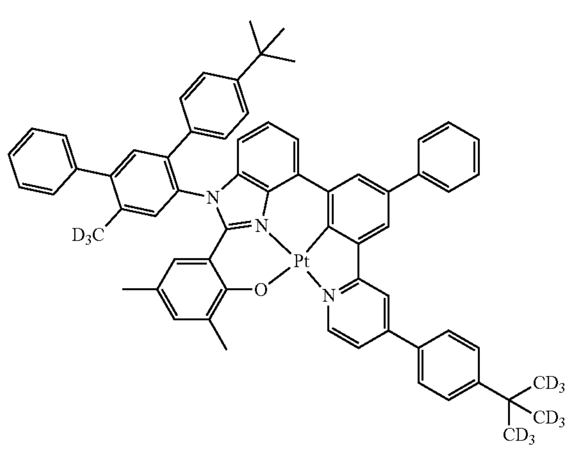
-continued
4-1058
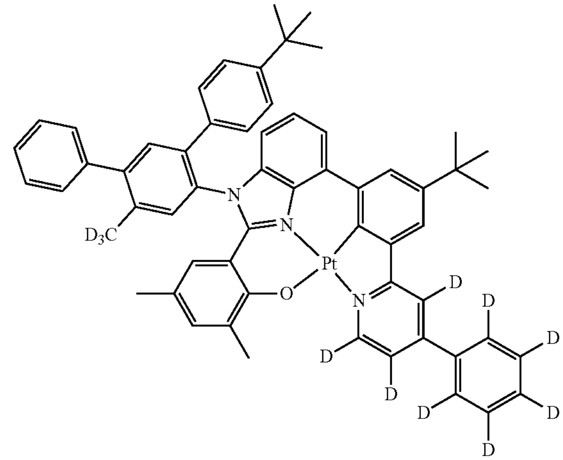
4-1059
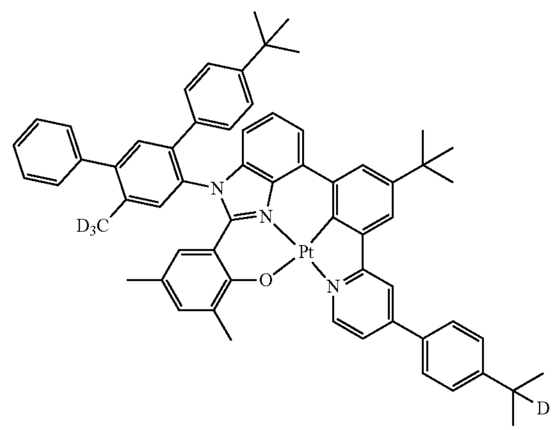
4-1060
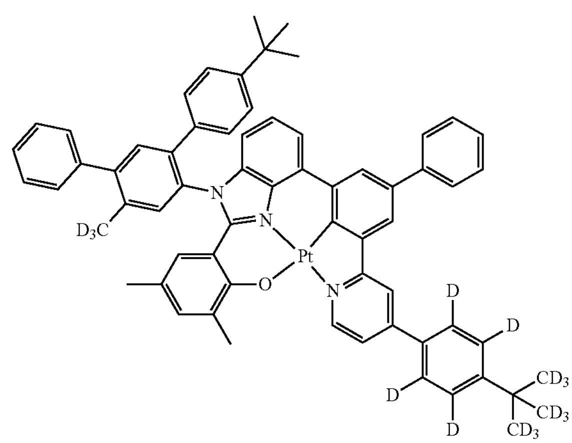

-continued
4-1061
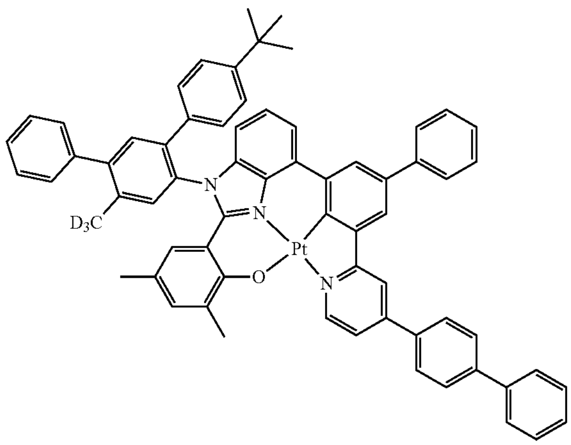
4-1062
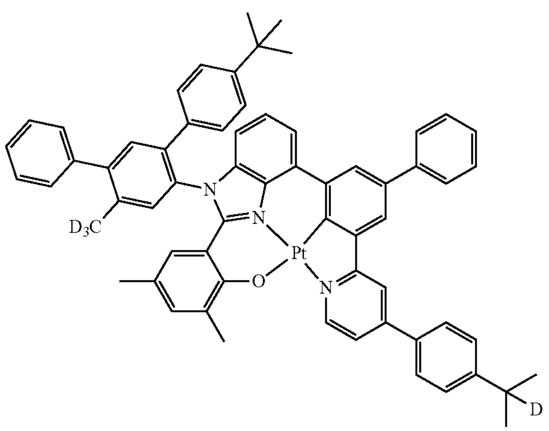
4-1063
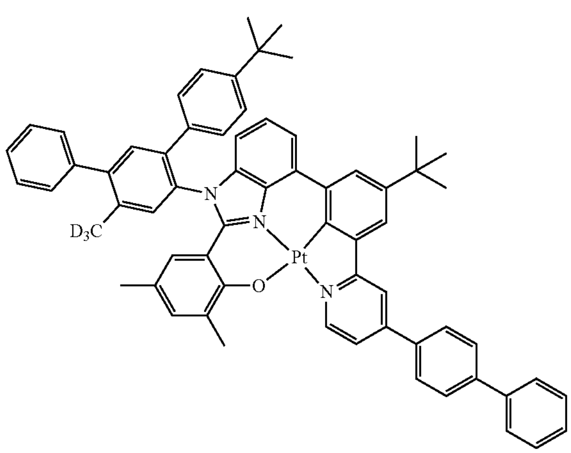
-continued
4-1064
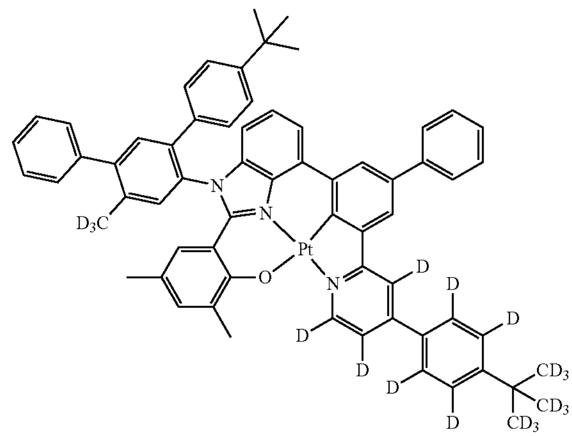
4-1065
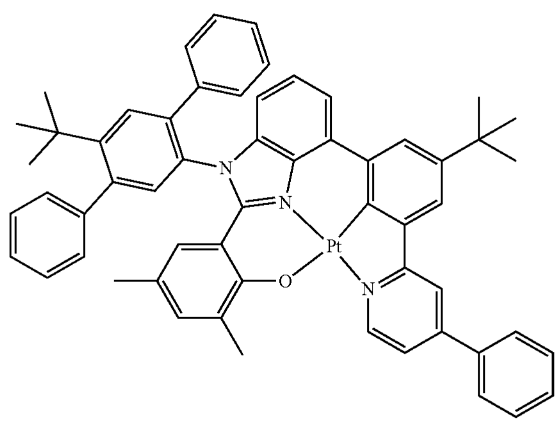
4-1066
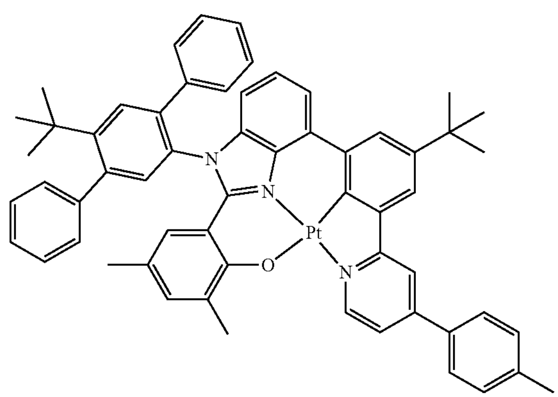

-continued
4-1067
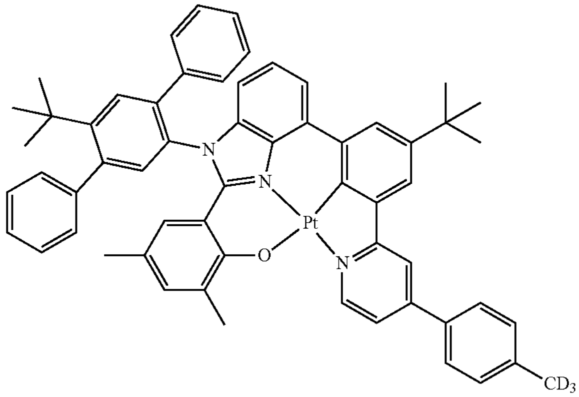
4-1068
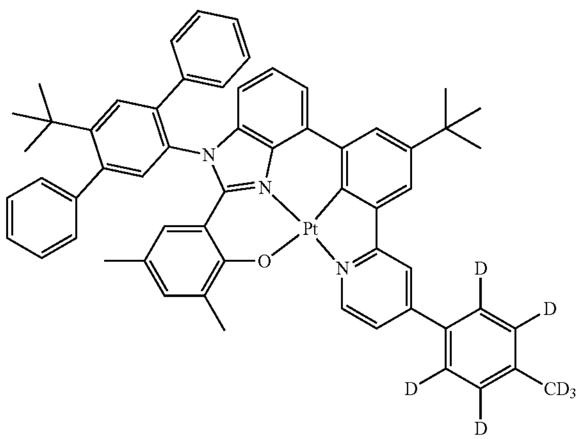
4-1069
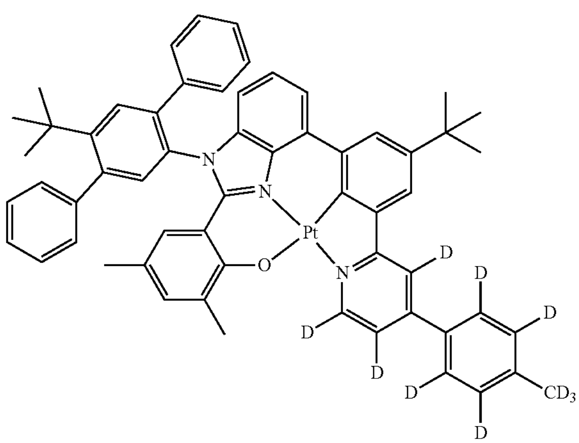
-continued
4-1070
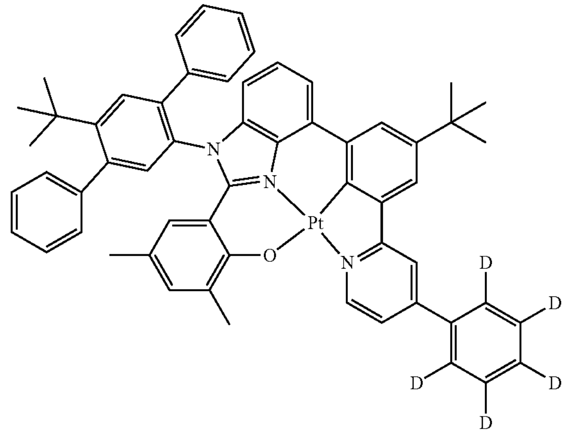
4-1071
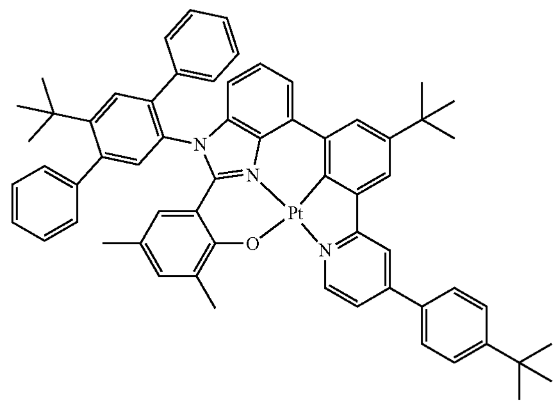
4-1072
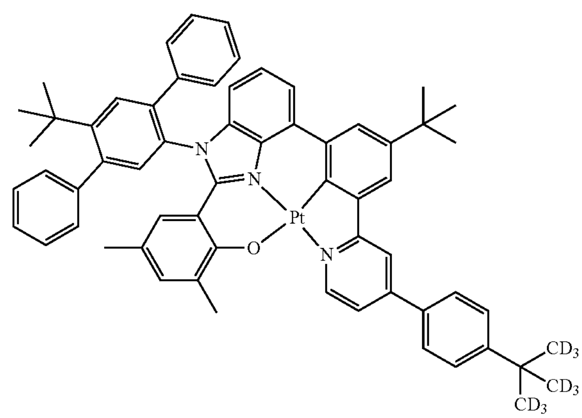

-continued
4-1073
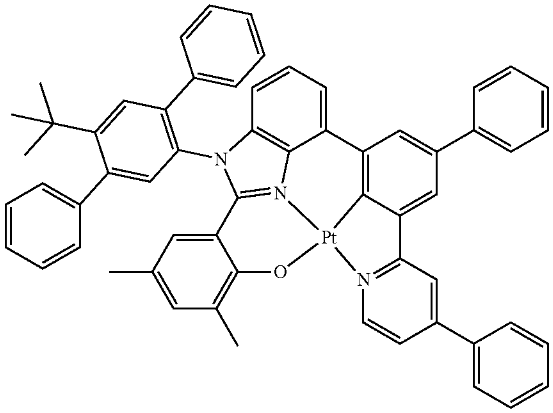
4-1074
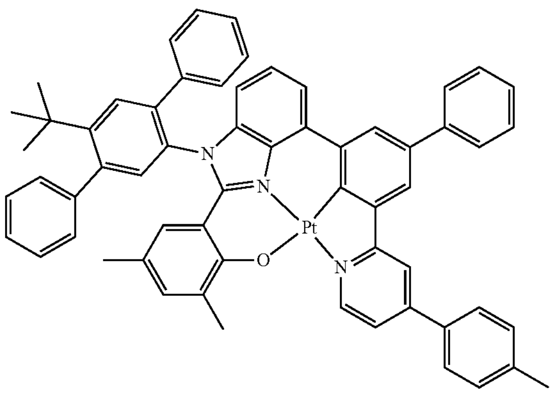
4-1075
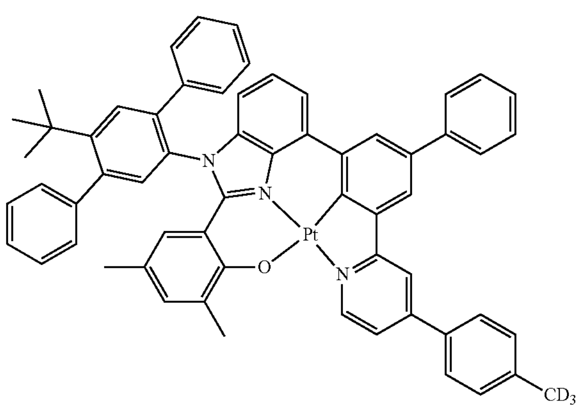
-continued
4-1076
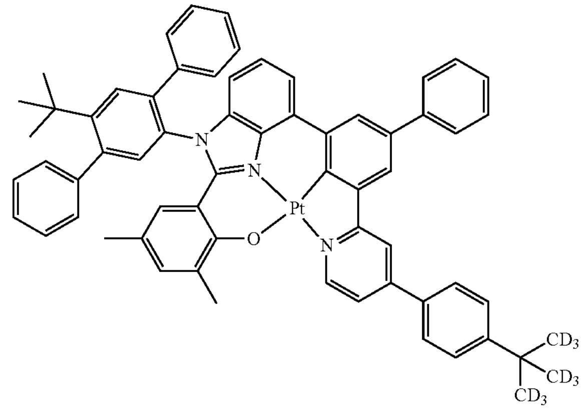
4-1077
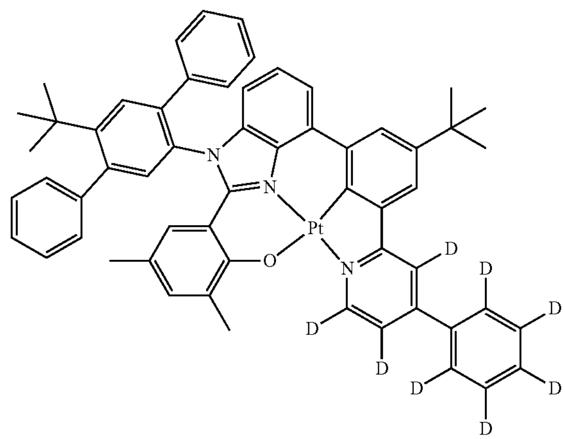
4-1078
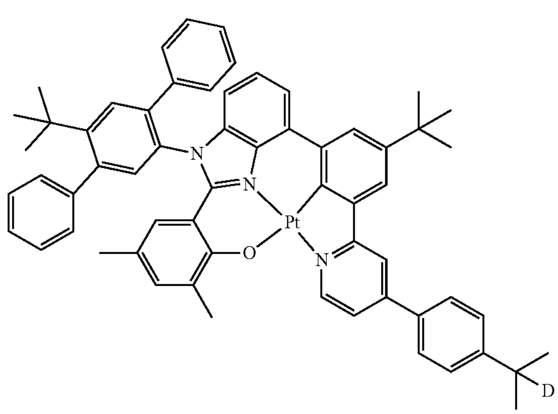

-continued
4-1079
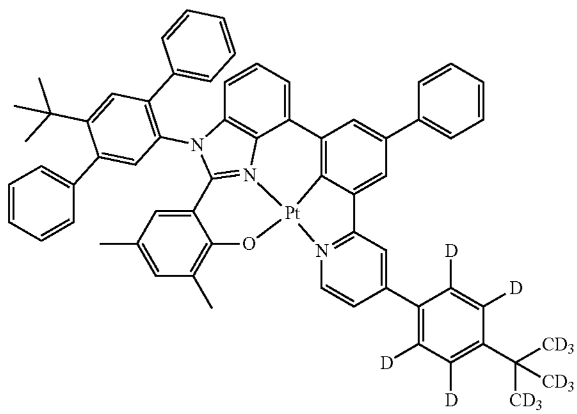
4-1080
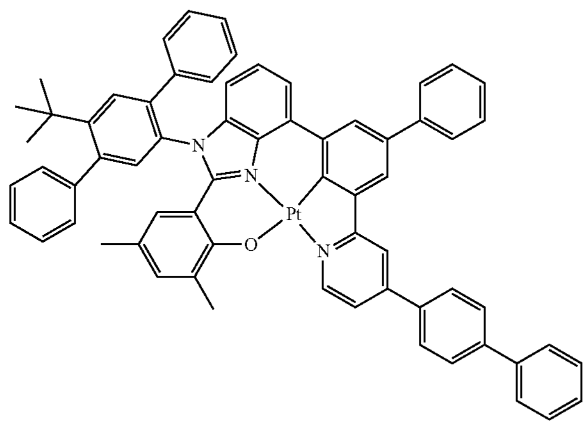
4-1081
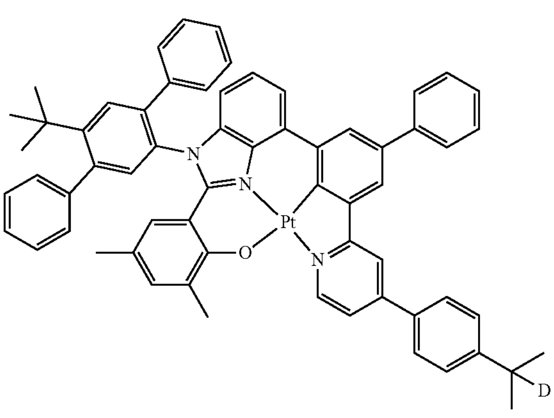
-continued
4-1082
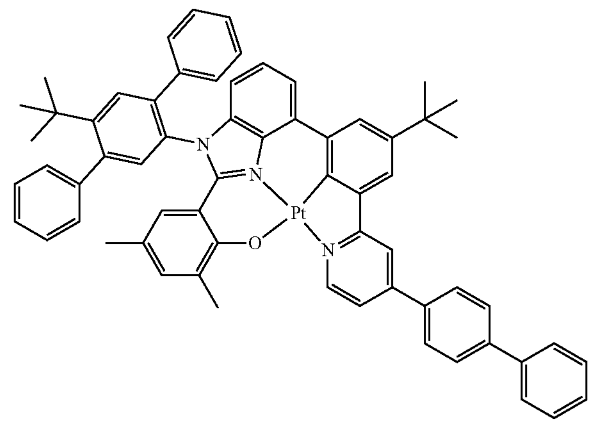
4-1083
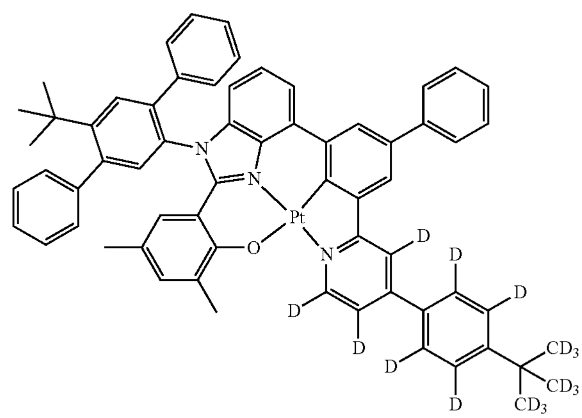
4-1084
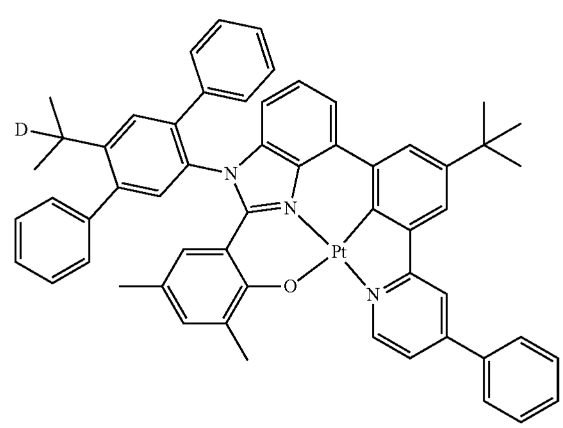

-continued
4-1085
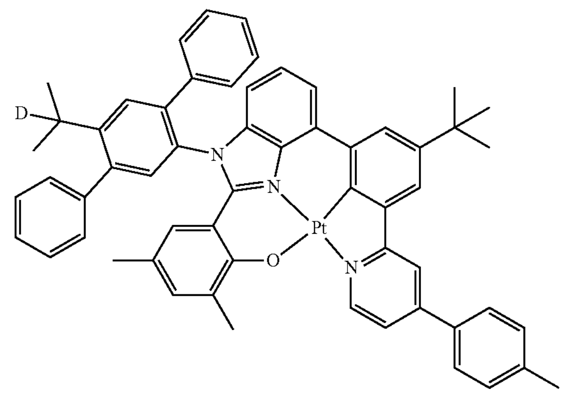
4-1086
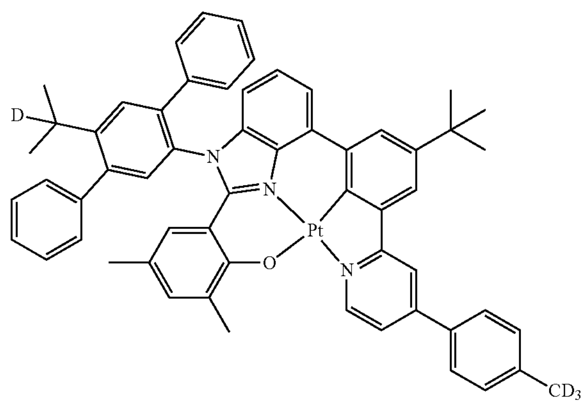
4-1087
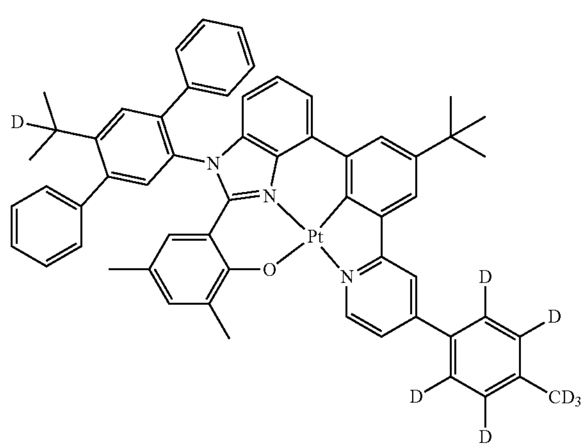
-continued
4-1088
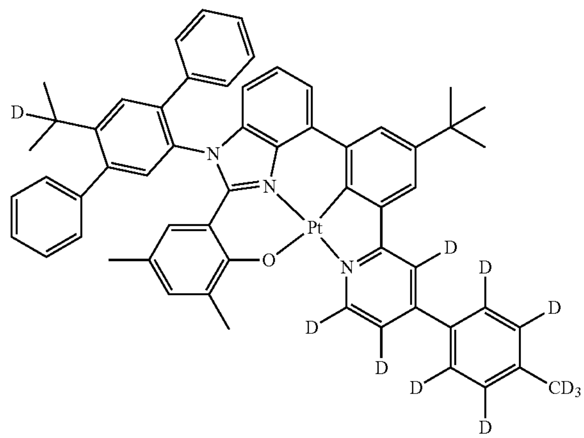
4-1089
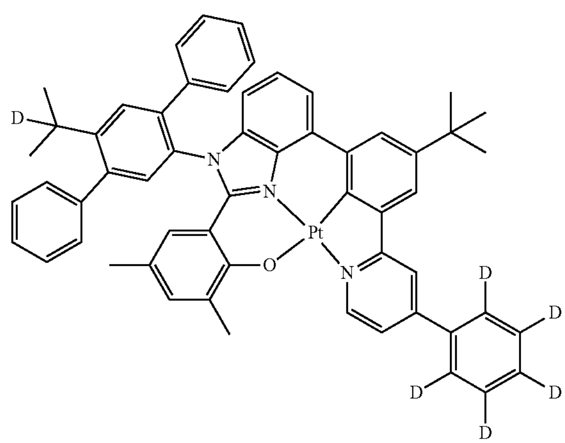
4-1090
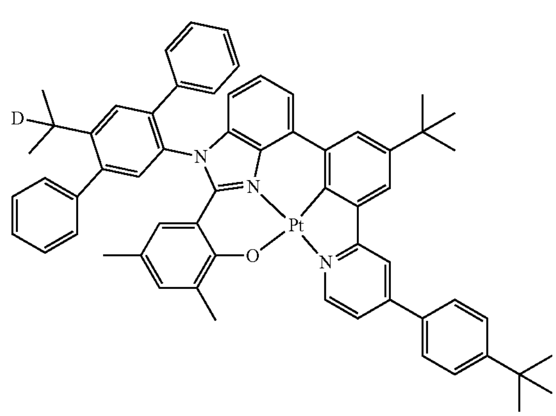

-continued
4-1091
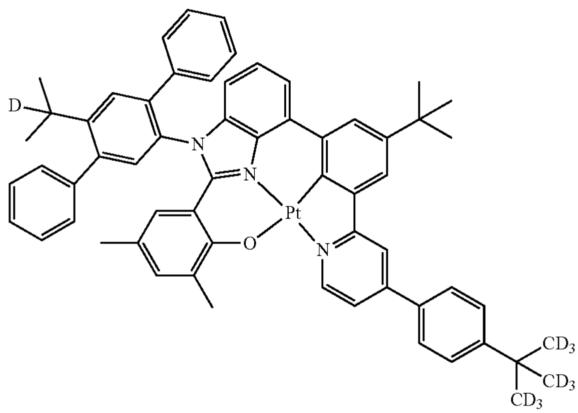
4-1092
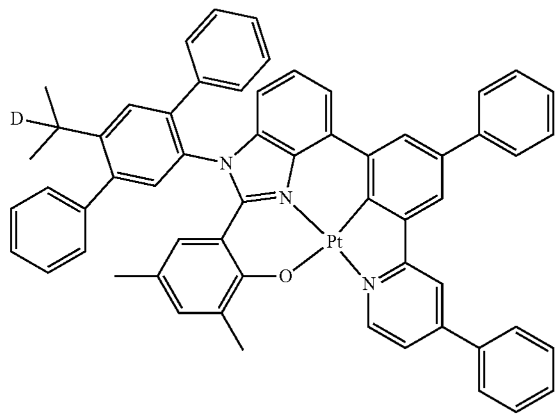
4-1093
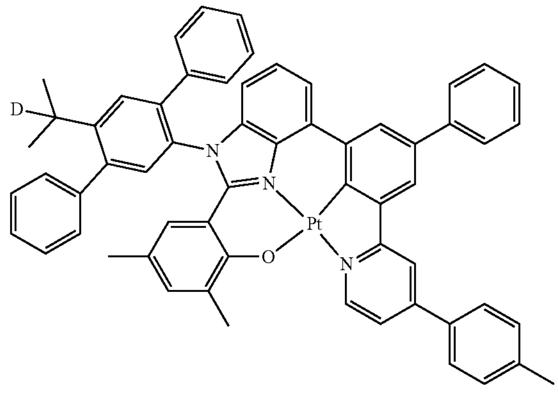
-continued
4-1094
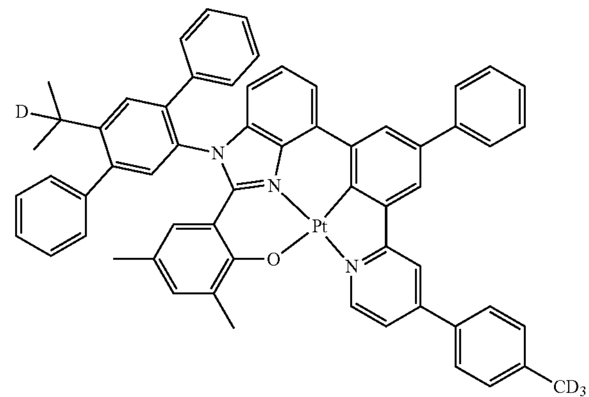
4-1095
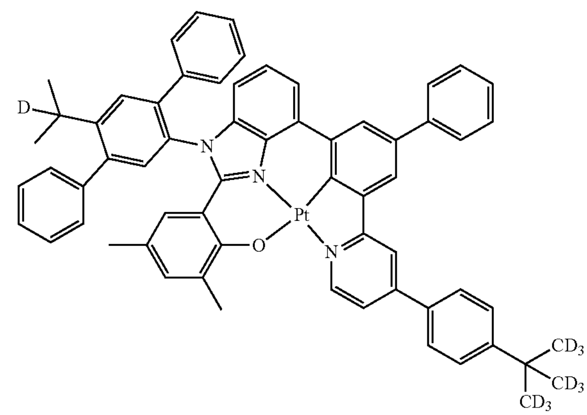
4-1096
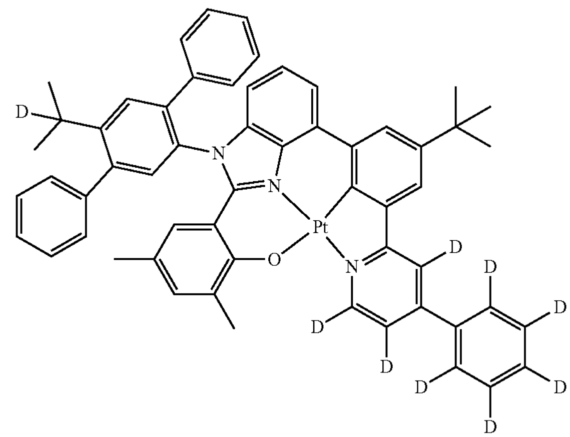

-continued
4-1097
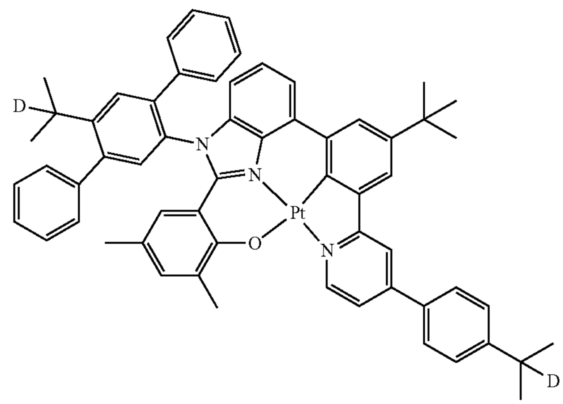
4-1098
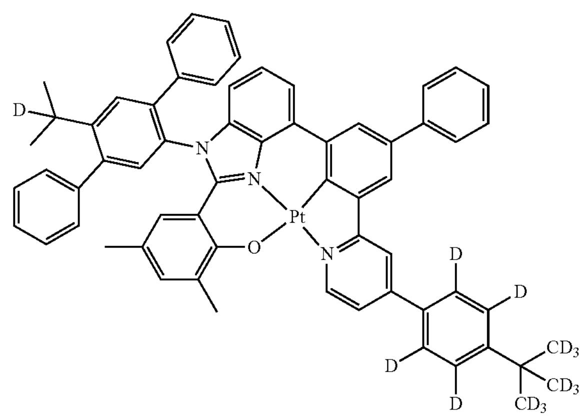
4-1099
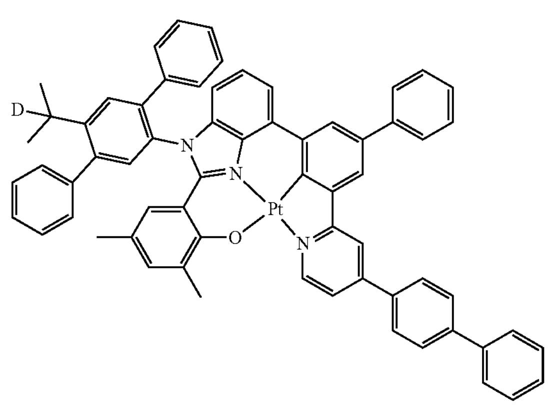
-continued
4-1100
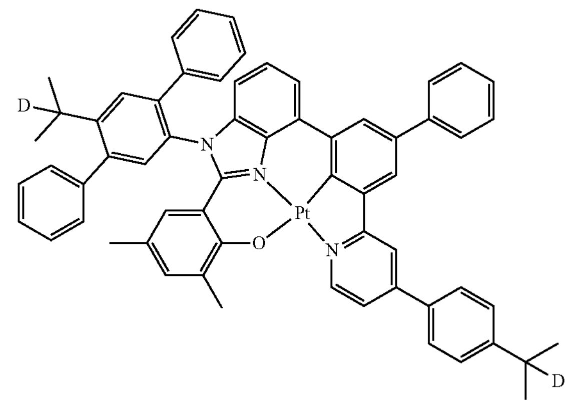
4-1101
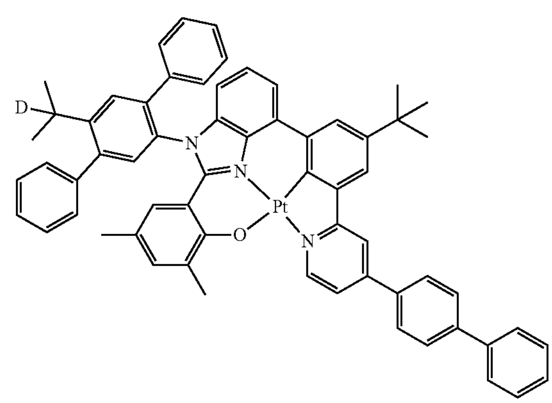
4-1102
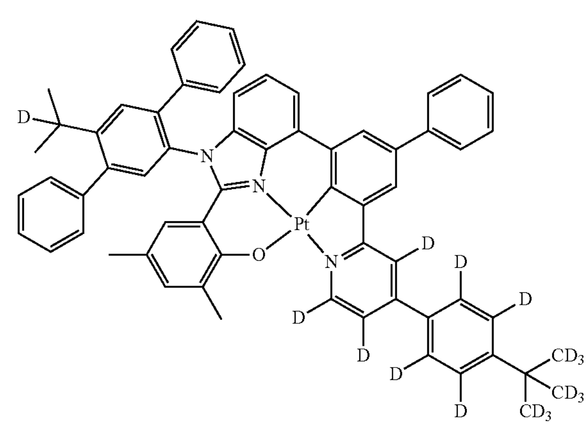

-continued
4-1103
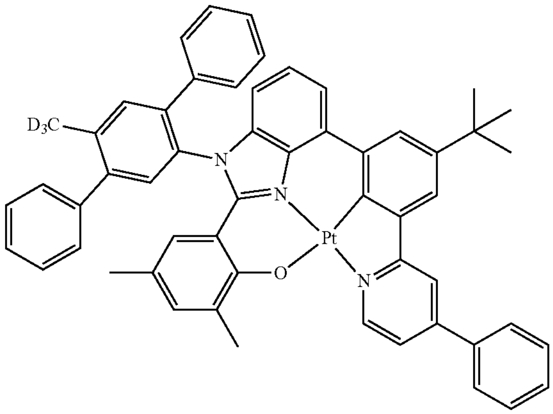
4-1104
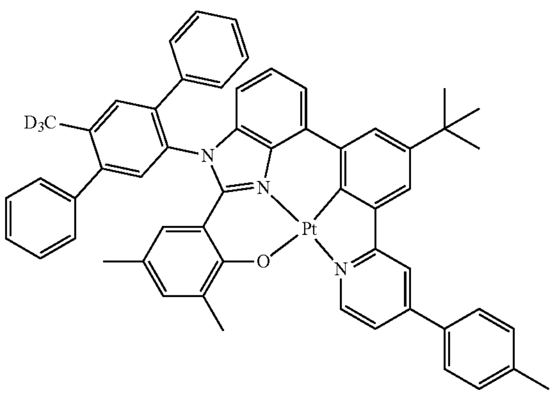
4-1105
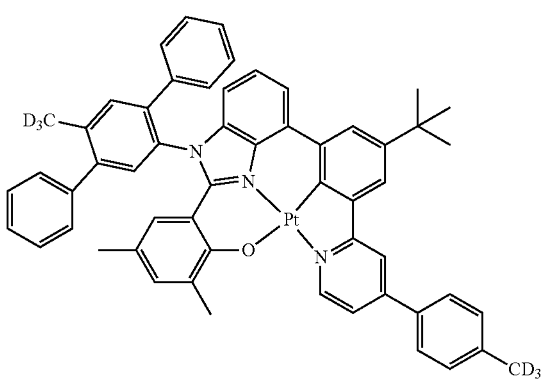
-continued
4-1106
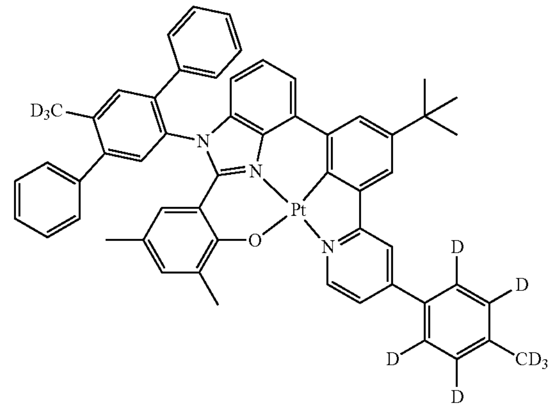
4-1107
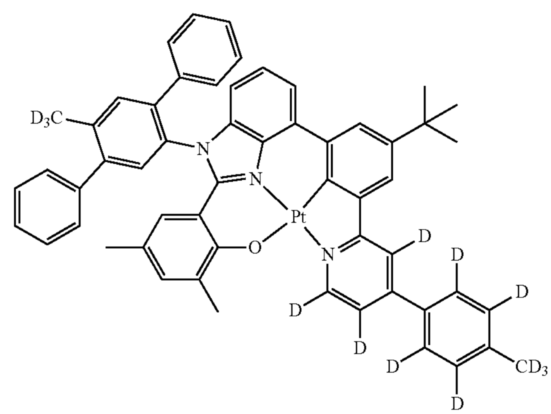
4-1108
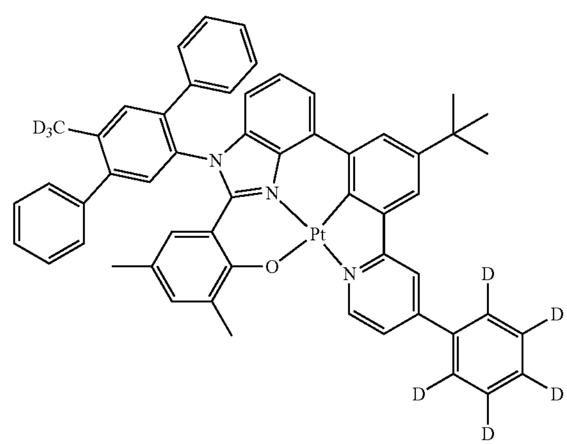

-continued
4-1109
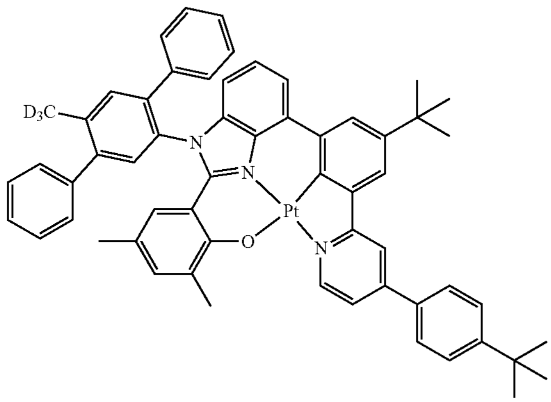
4-1110
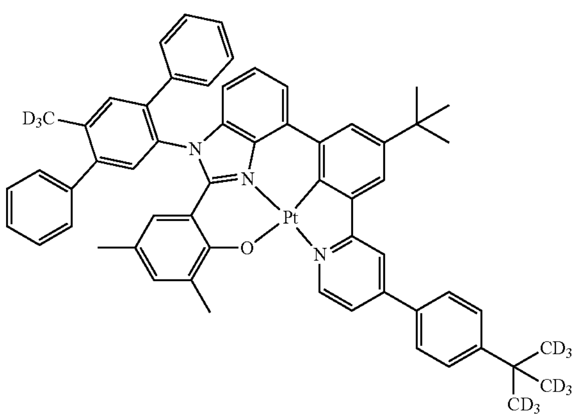
4-1111
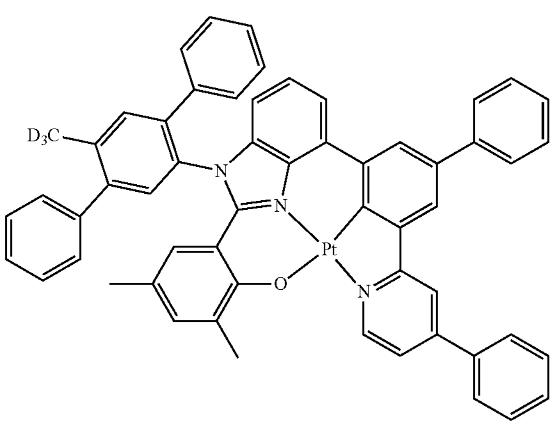
-continued
4-1112
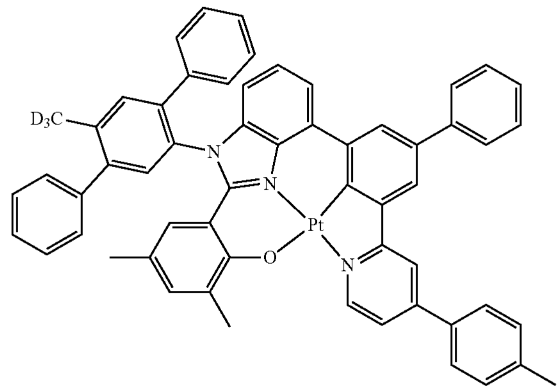
4-1113
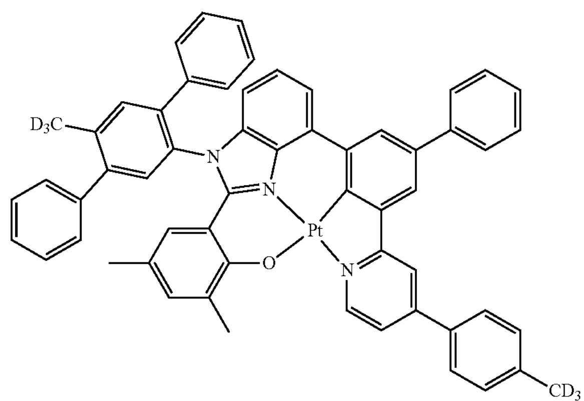
4-1114
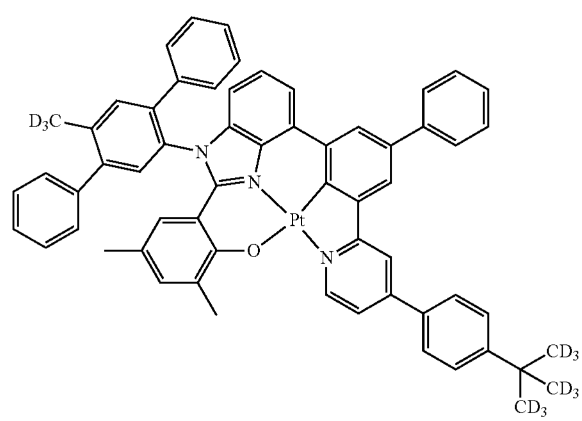

-continued
4-1115
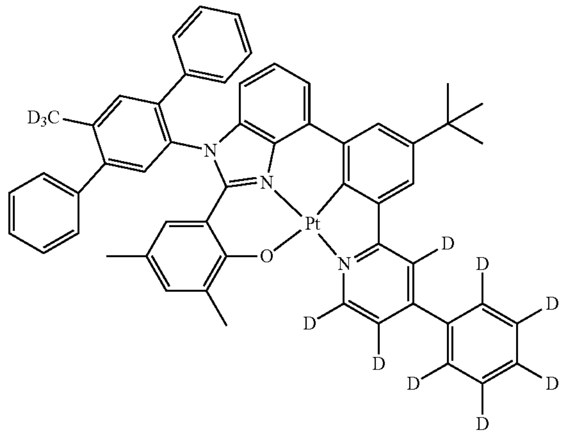
4-1116
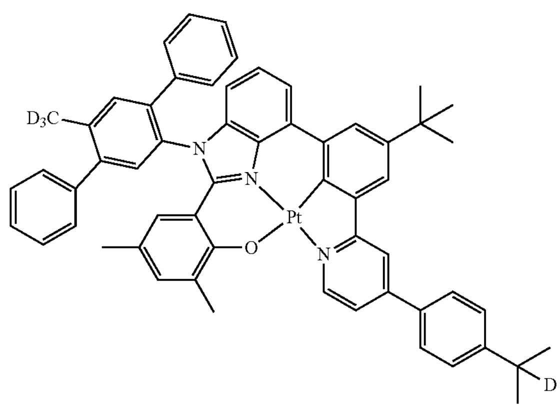
4-1117
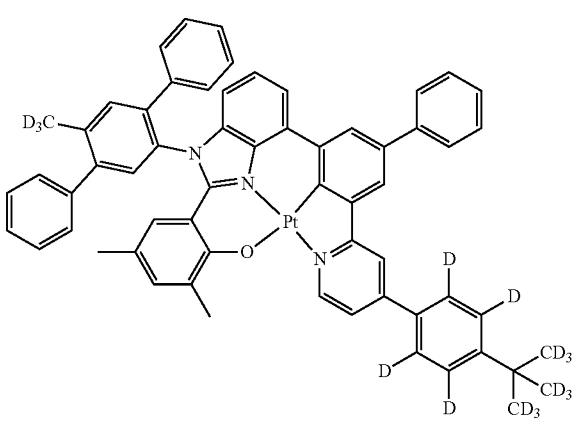
-continued
4-1118
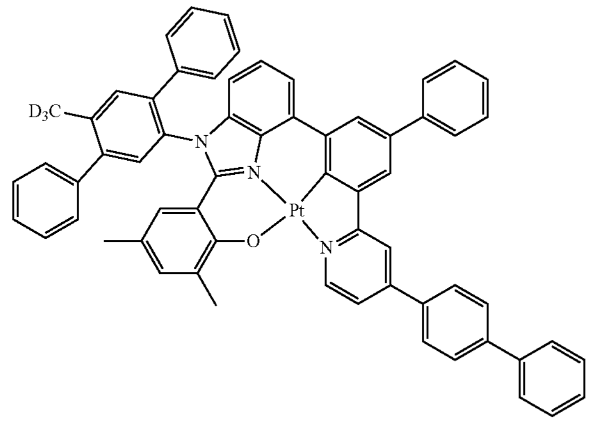
4-1119
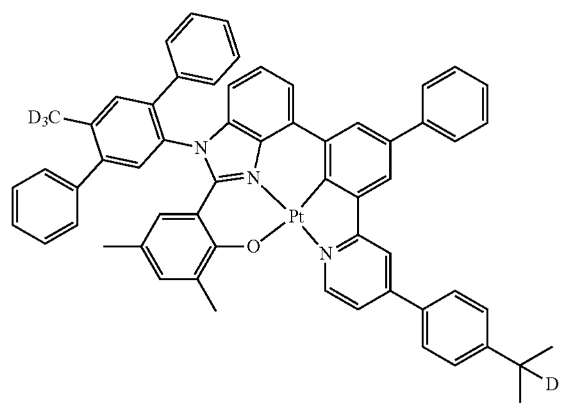
4-1120
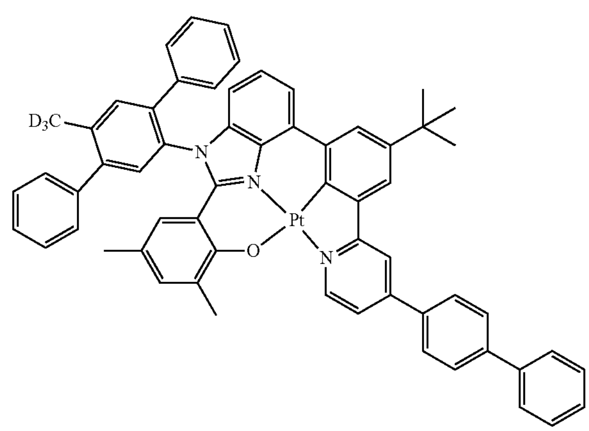

4-1121
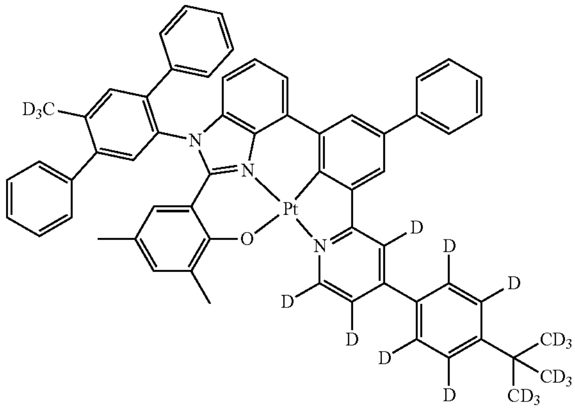
4-1122
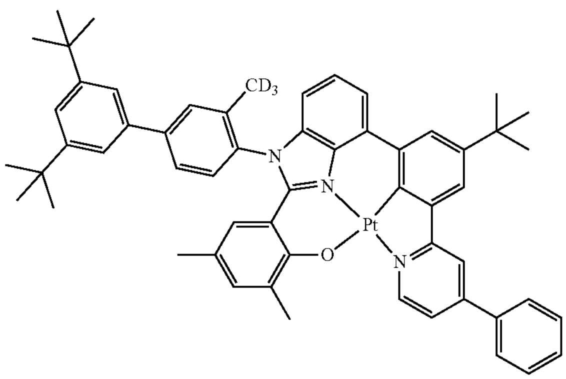
4-1123
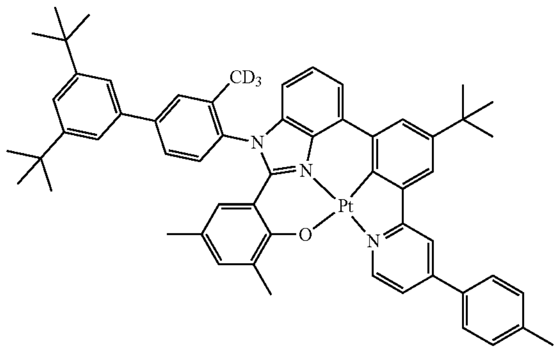
4-1124
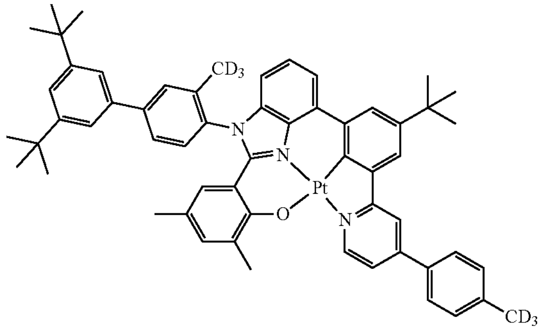
4-1125
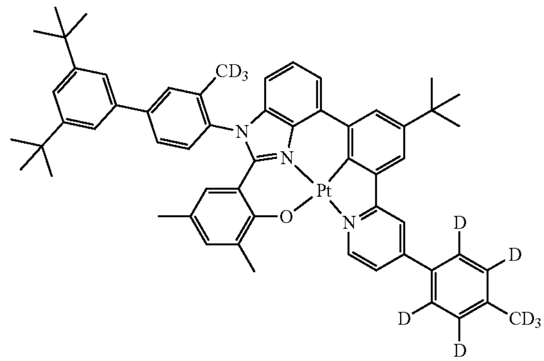
4-1126
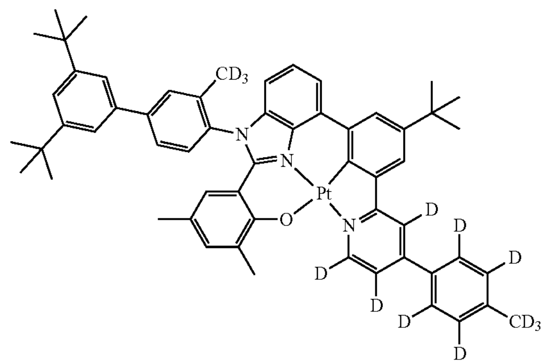
4-1127
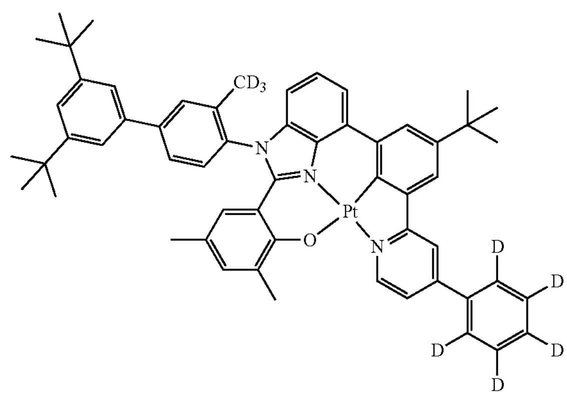
4-1128
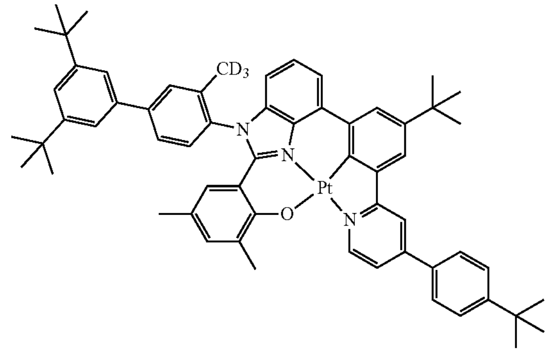

4-1129
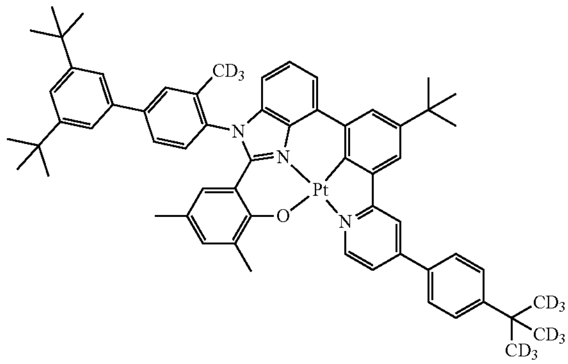
4-1130
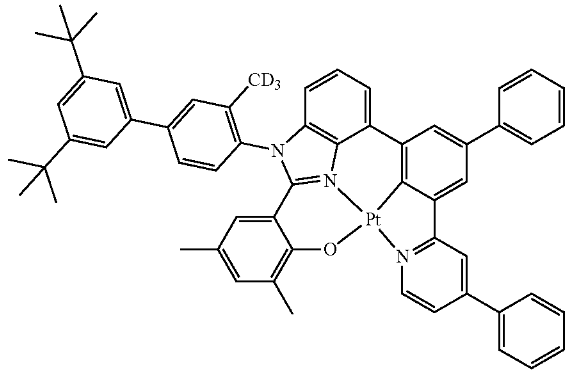
4-1131
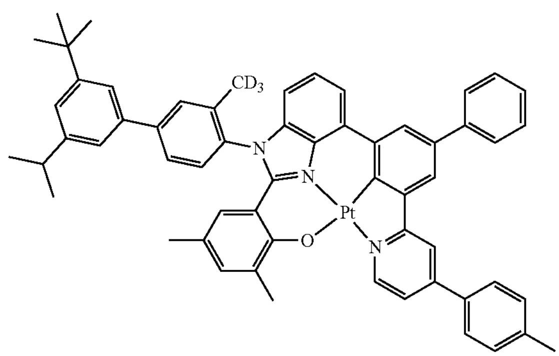
4-1132
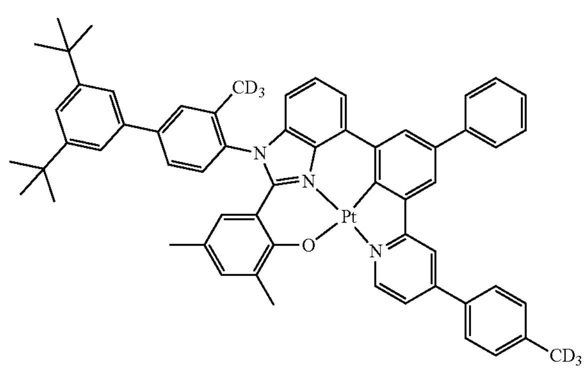
4-1133
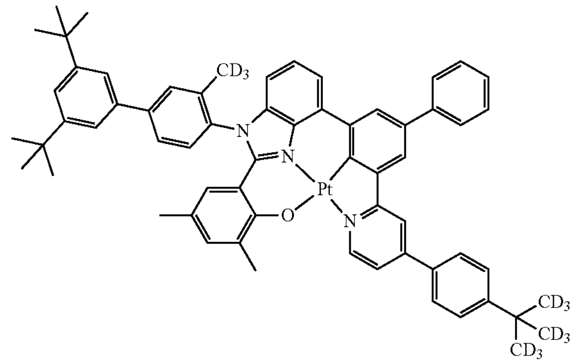
4-1134
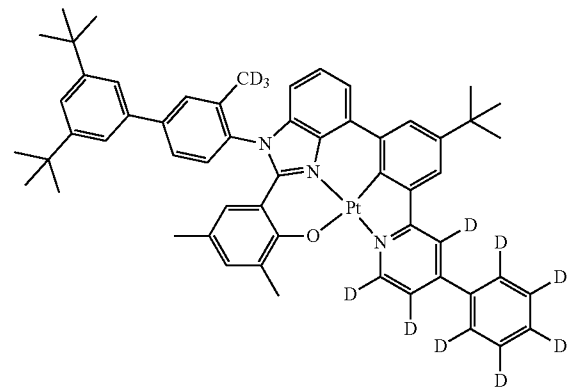
4-1135
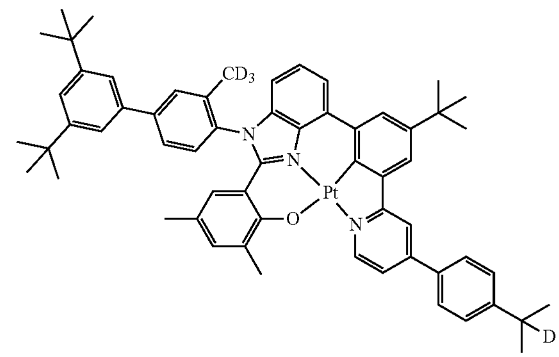
4-1136
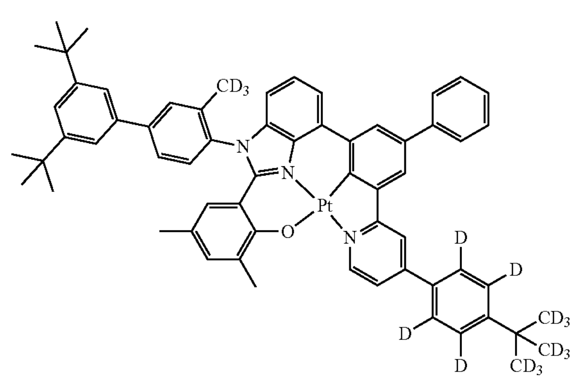

-continued
4-1137
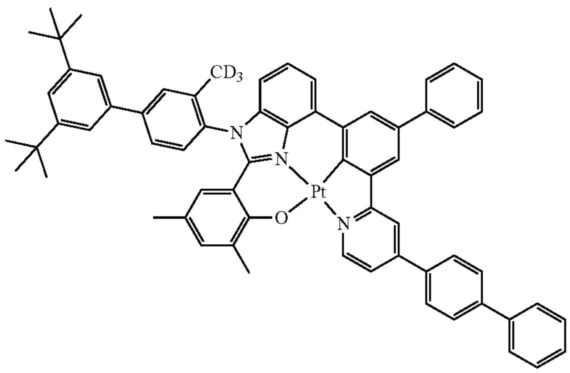
4-1138
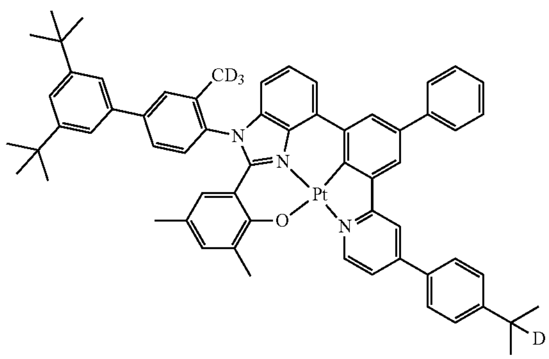
4-1139
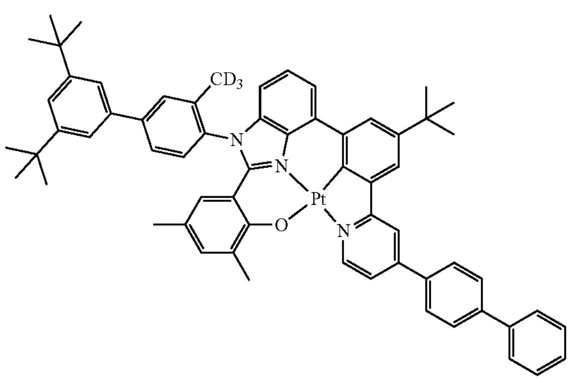
4-1140
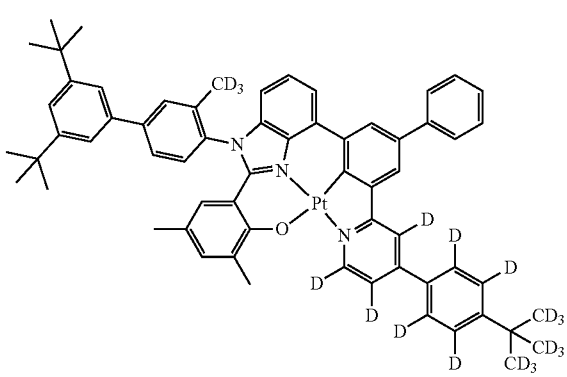
-continued
4-1141
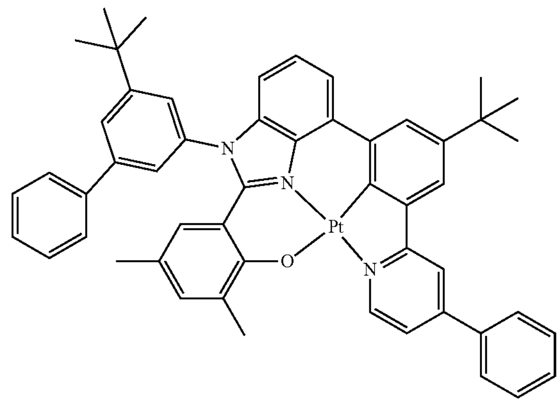
4-1142
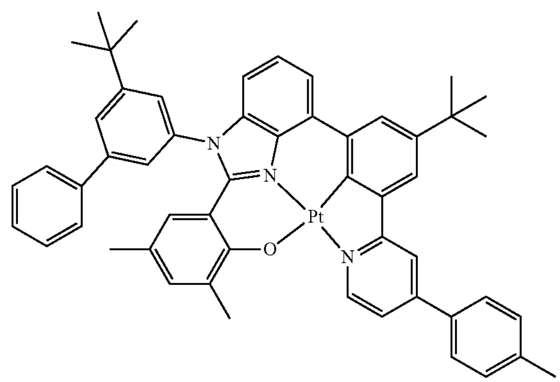
4-1143
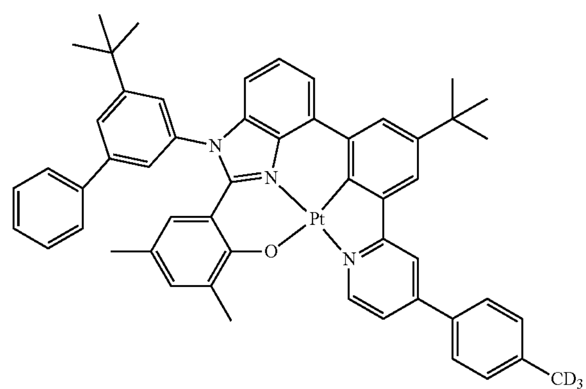

-continued
4-1144
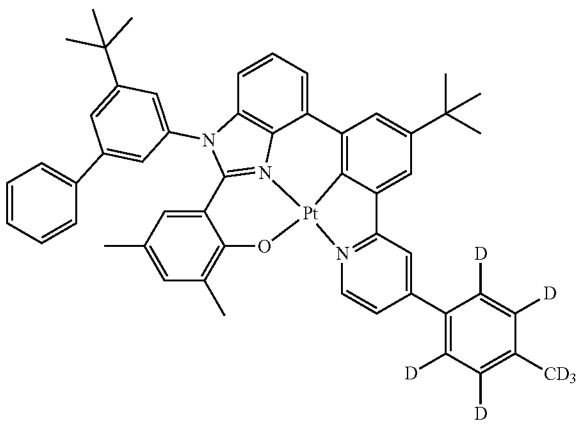
4-1145
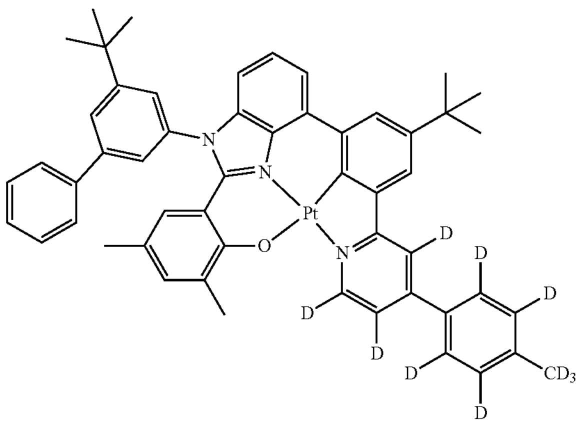
4-1146
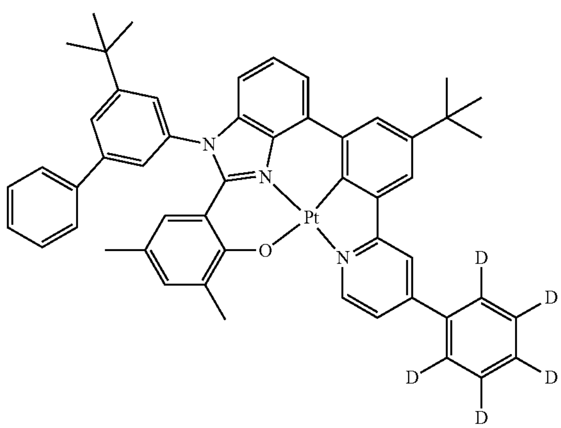
-continued
4-1147
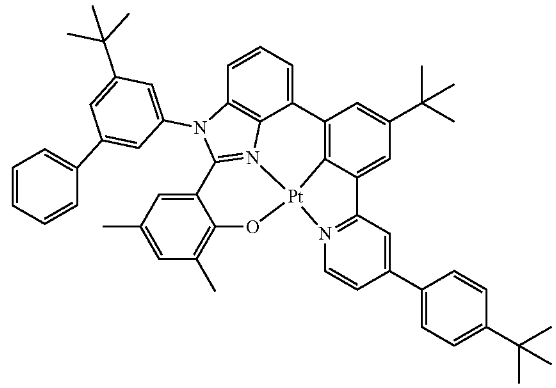
4-1148
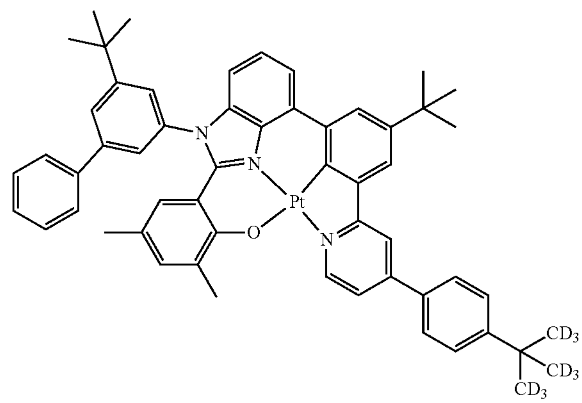
4-1149
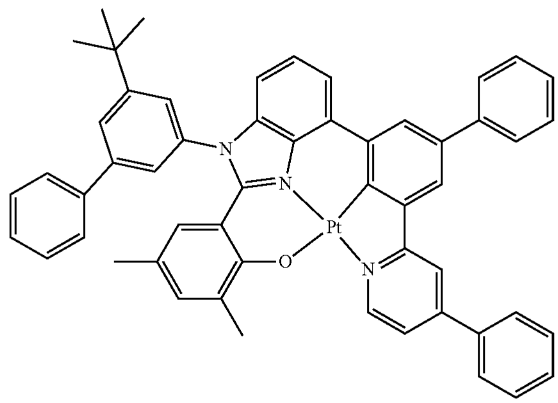
4-1150
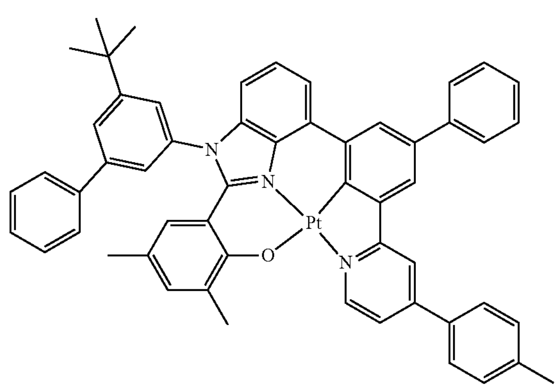

-continued
4-1151
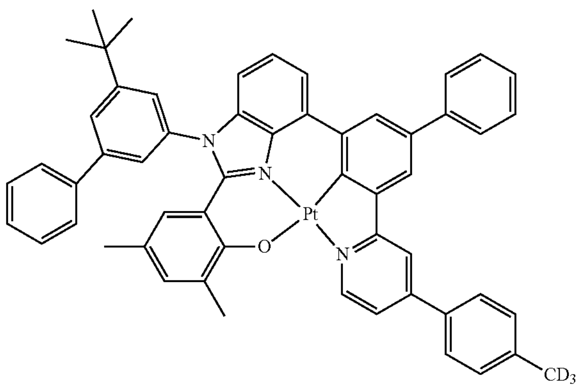
4-1152
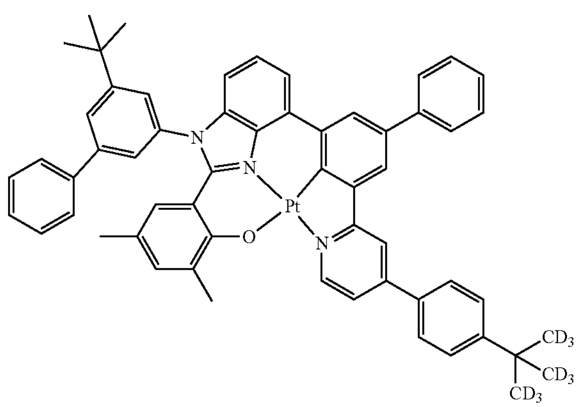
4-1153
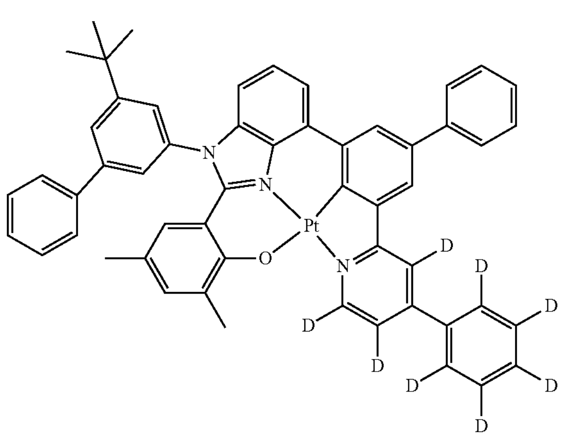
-continued
4-1154
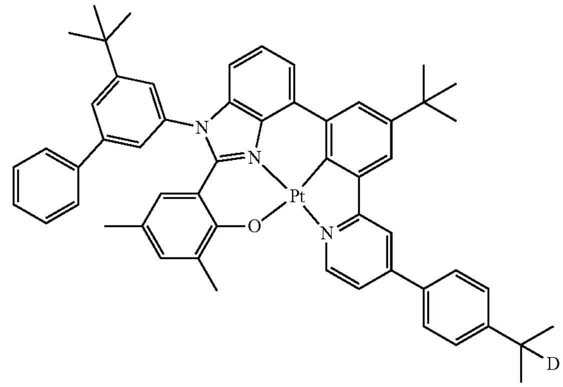
4-1155
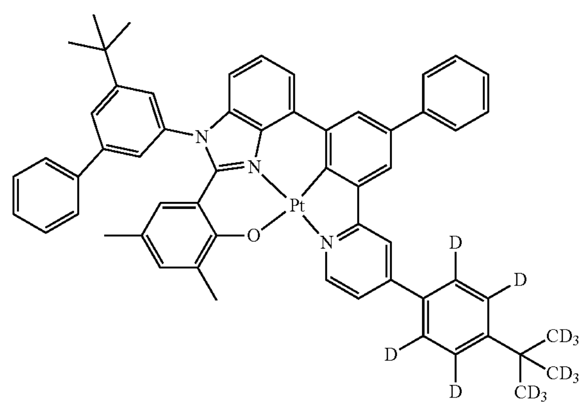
4-1156
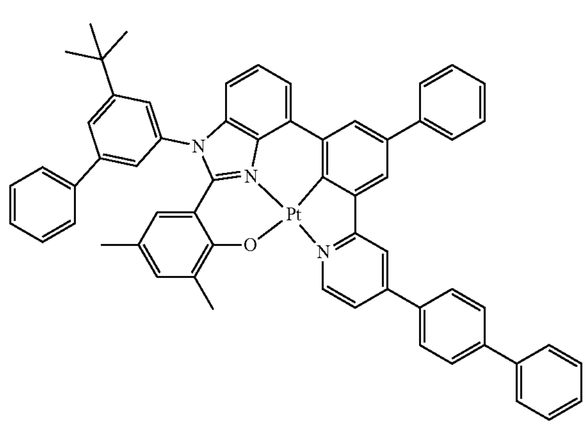

-continued
4-1157
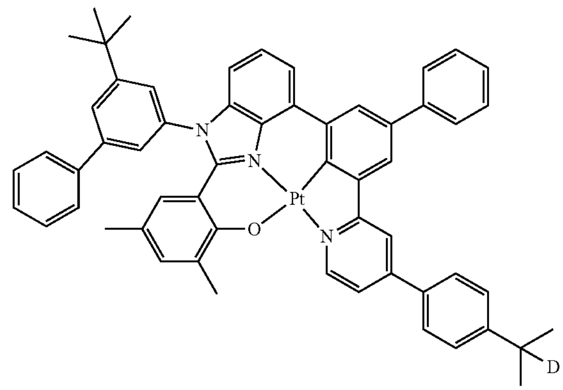
4-1158
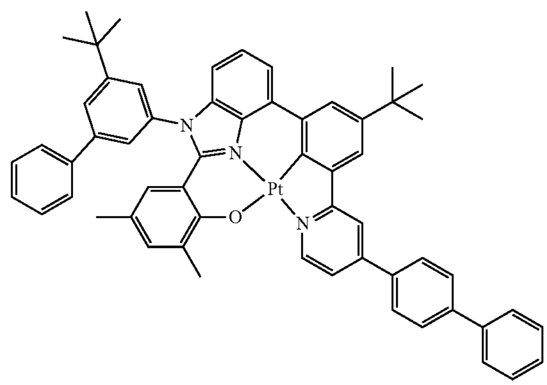
4-1159
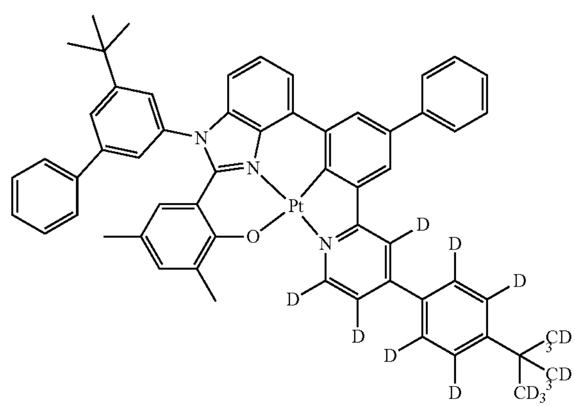
4-1160
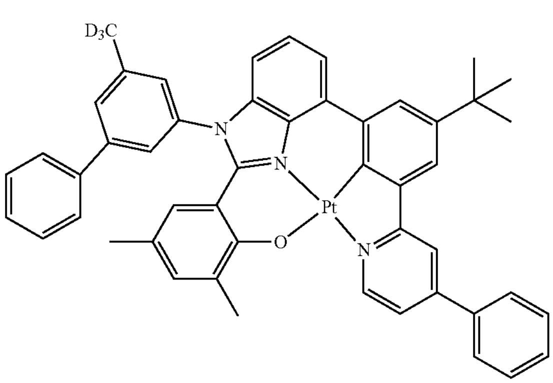
-continued
4-1161
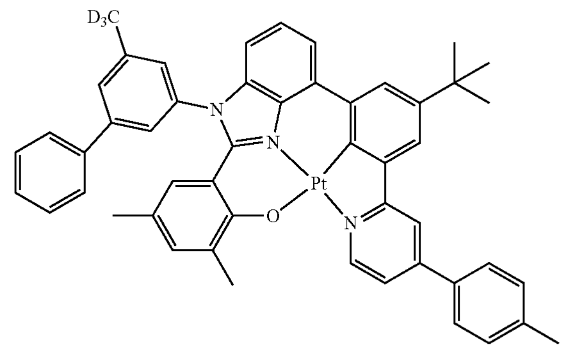
4-1162
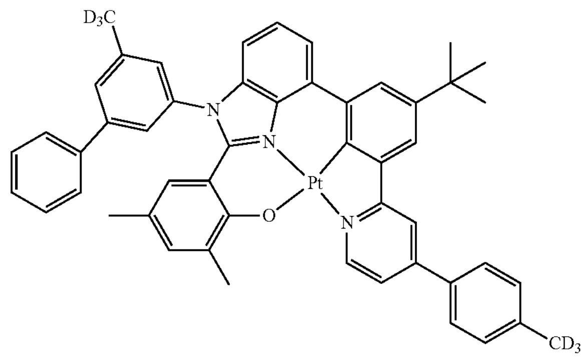
4-1163
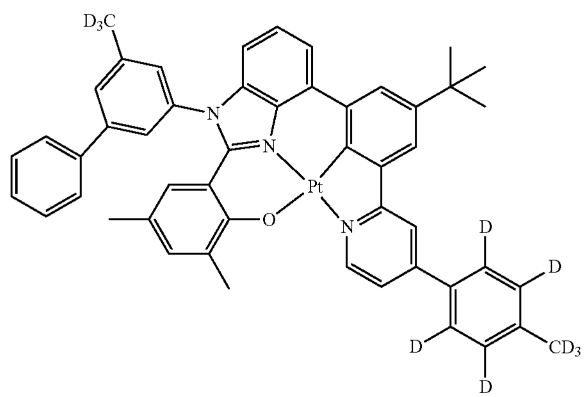
4-1164
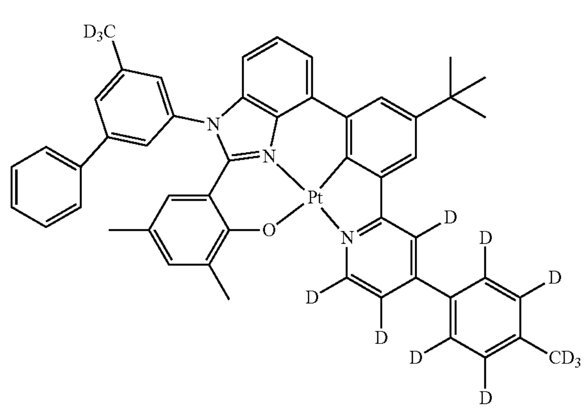

-continued
4-1165
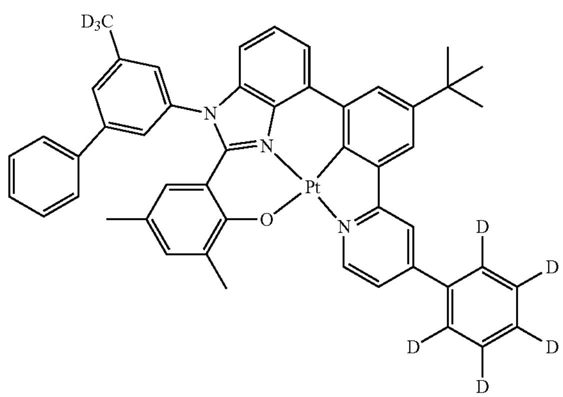
4-1166
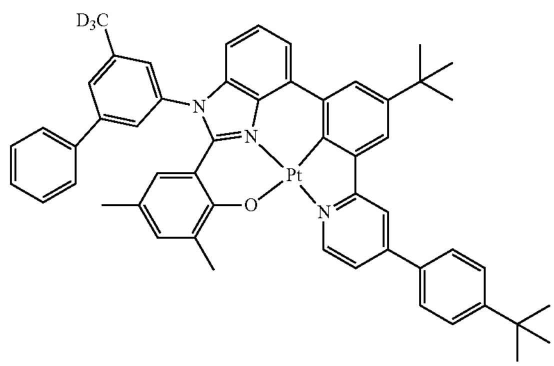
4-1167
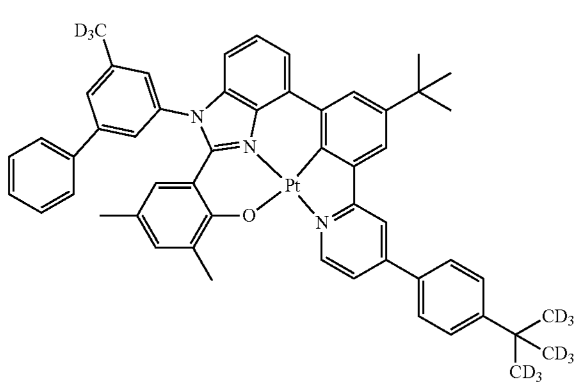
4-1168
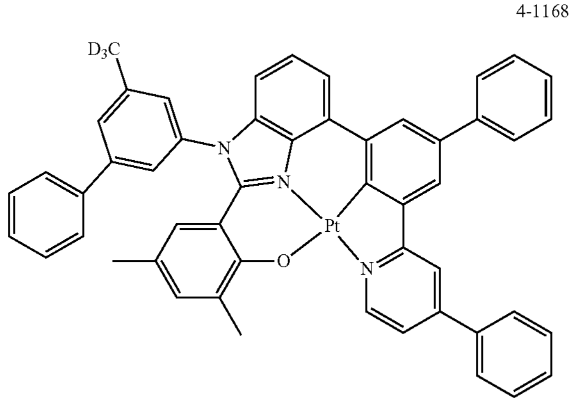
-continued
4-1169
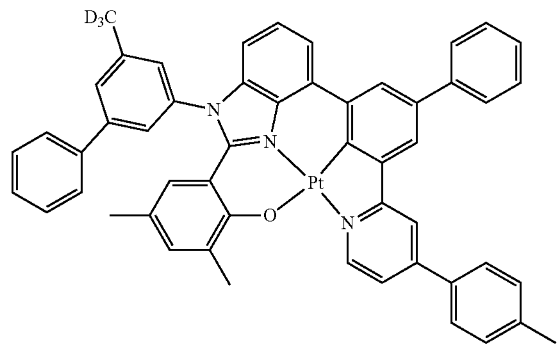
4-1170
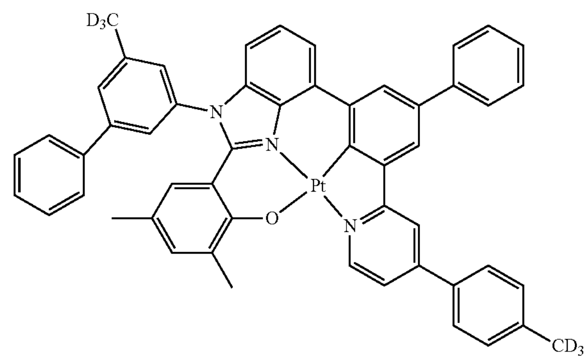
4-1171
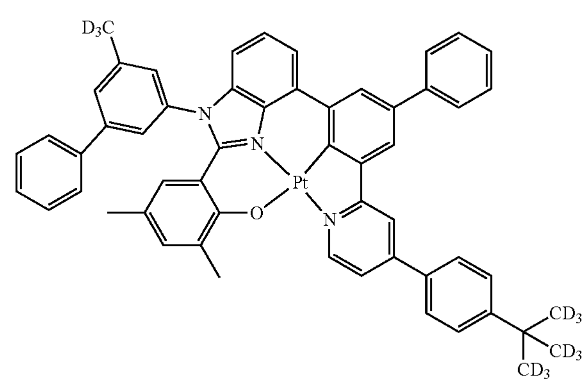
4-1172
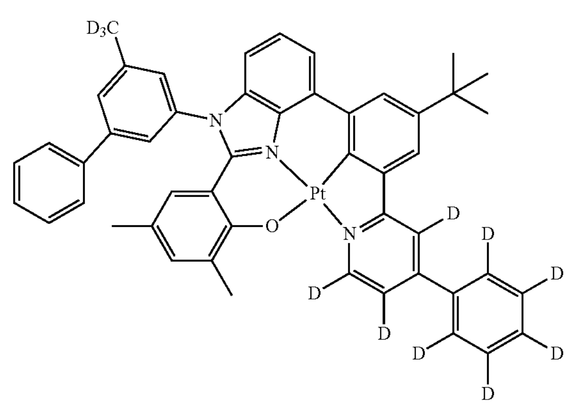

-continued
4-1173
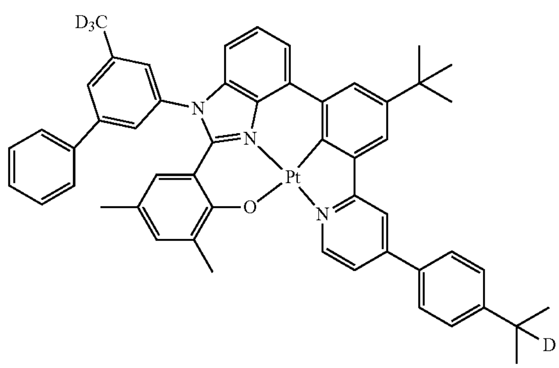
4-1174
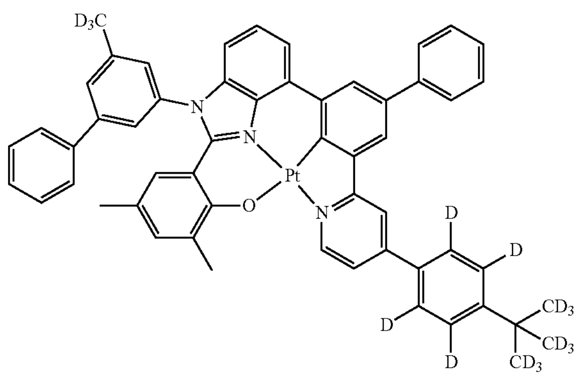
4-1175
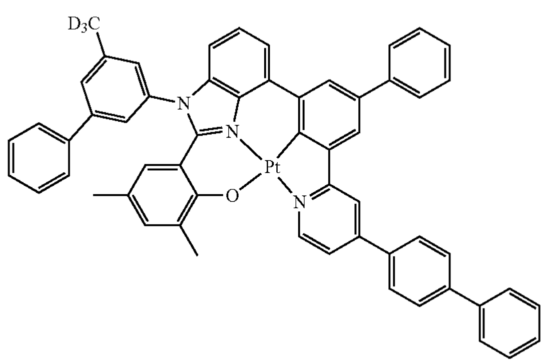
4-1176
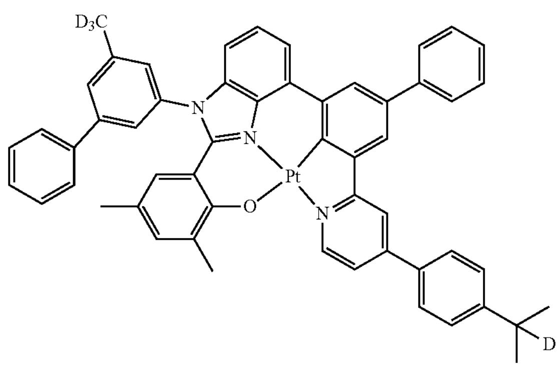
-continued
4-1177
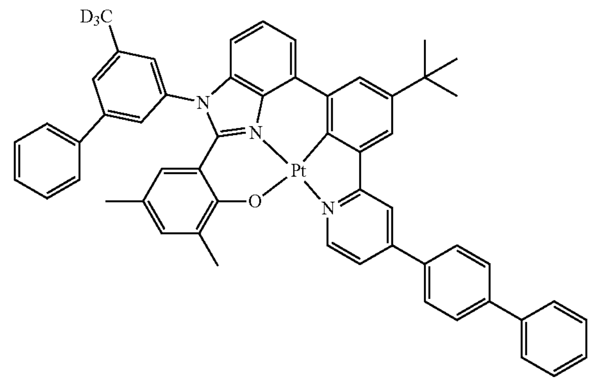
4-1178
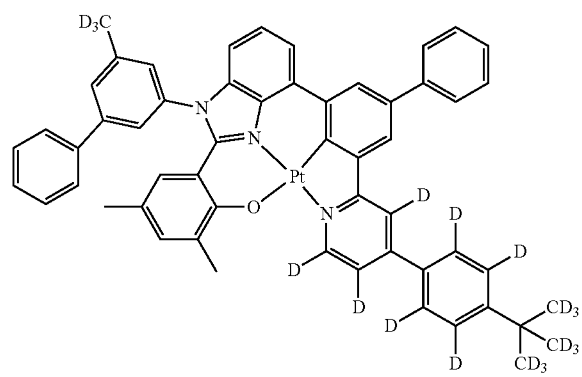
4-1179
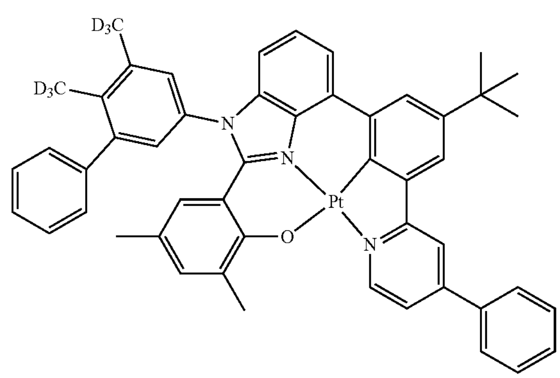
4-1180
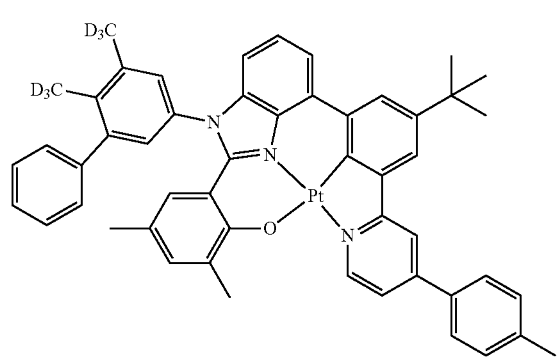

-continued
4-1181
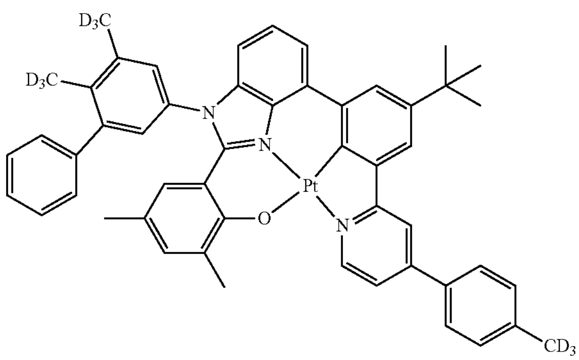
4-1182
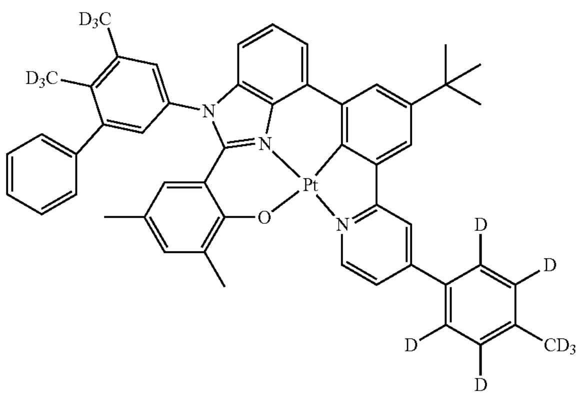
4-1183
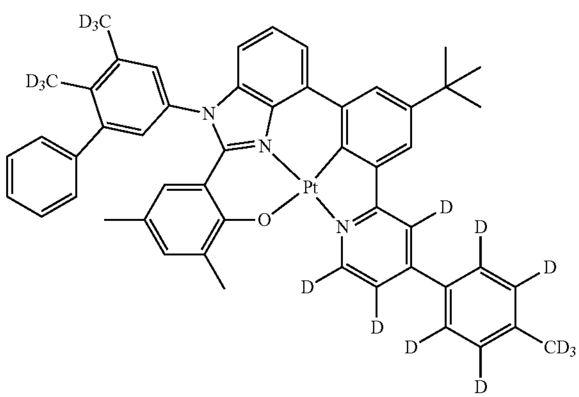
4-1184
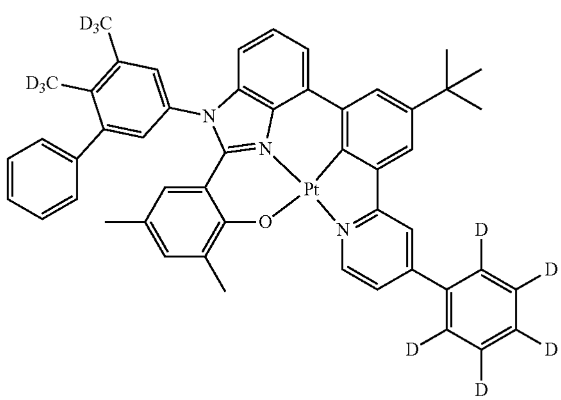
-continued
4-1185
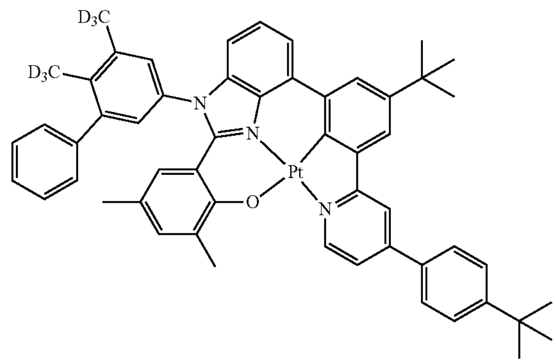
4-1186
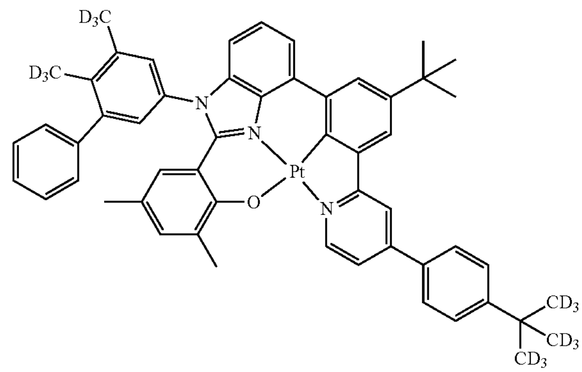
4-1187
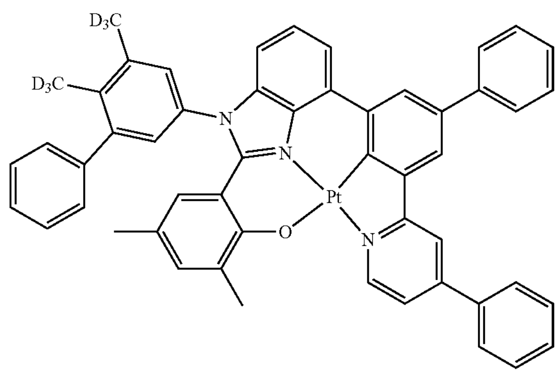
4-1188
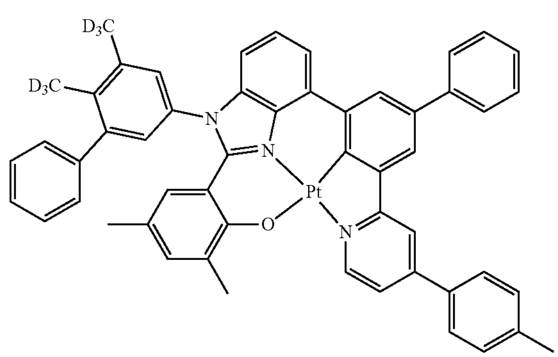

4-1189
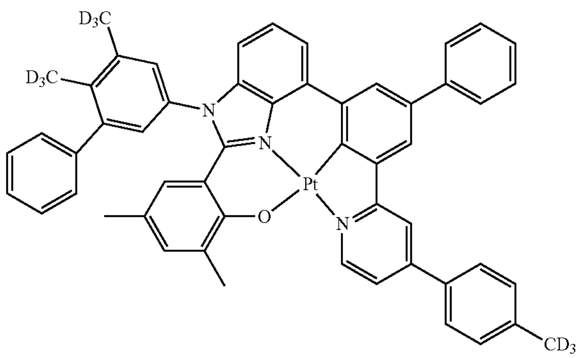
4-1190
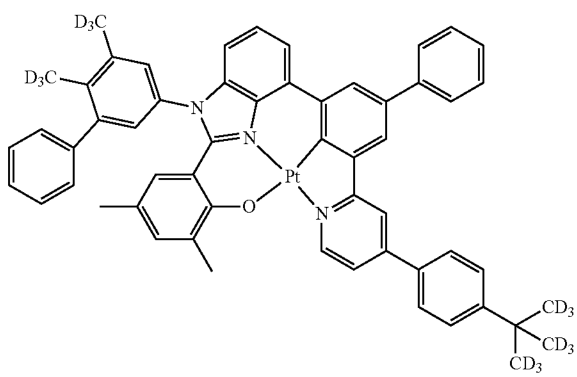
4-1191
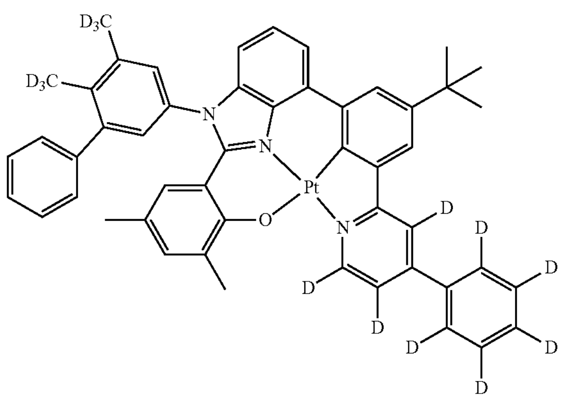
4-1192
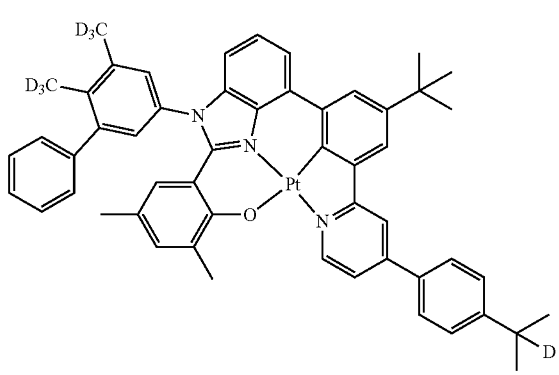
4-1193
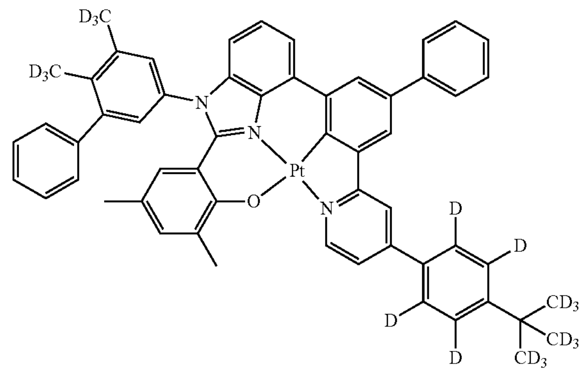
4-1194
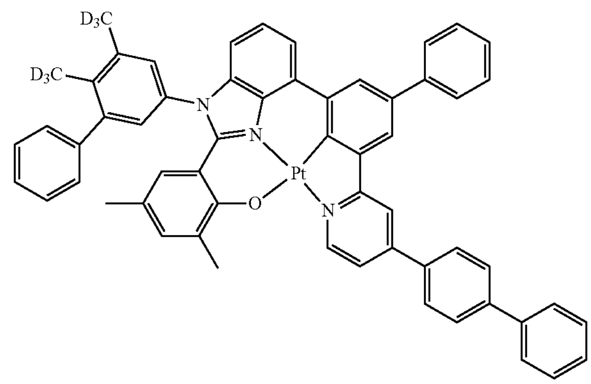
4-1195
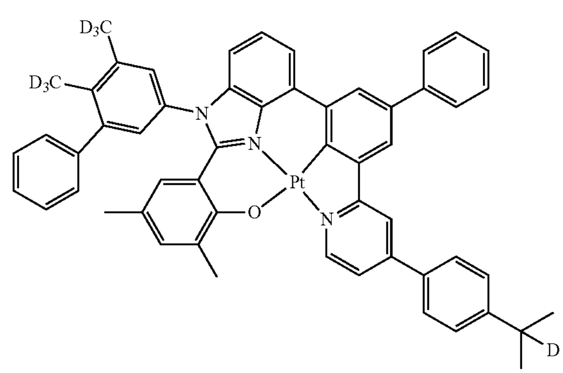
4-1196
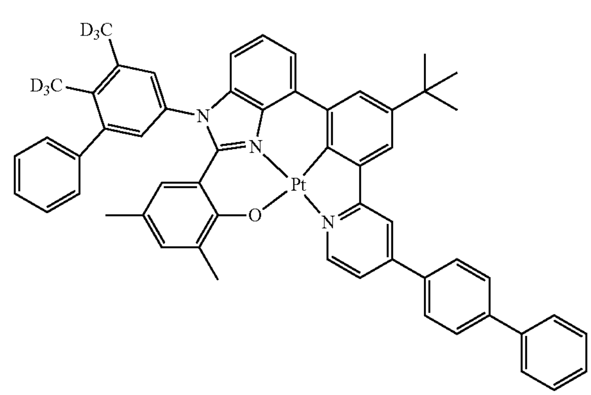

4-1197
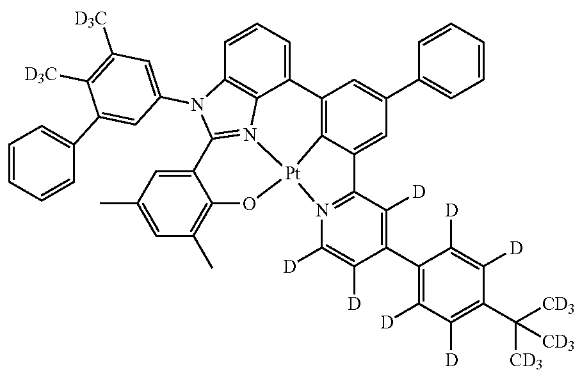
4-1198
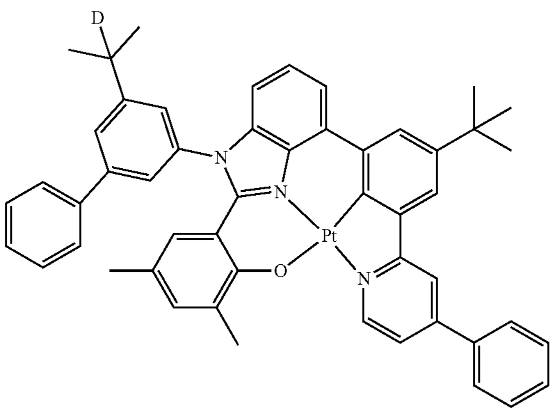
4-1199
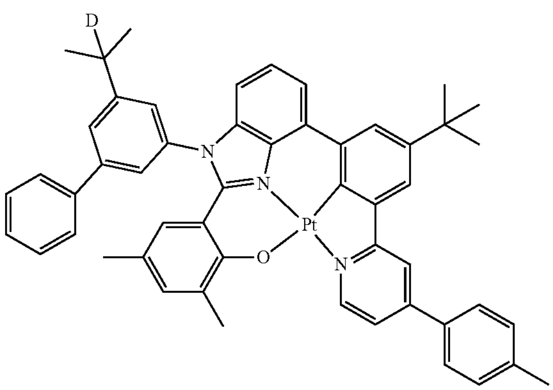
4-1200
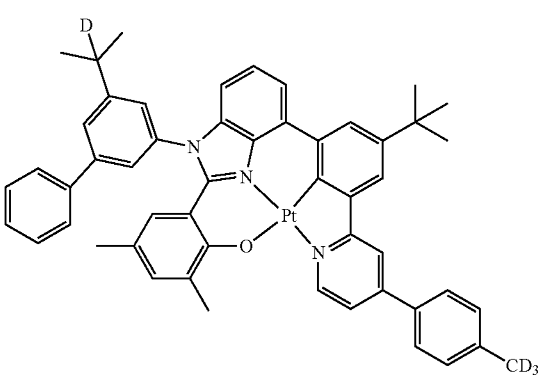
4-1201
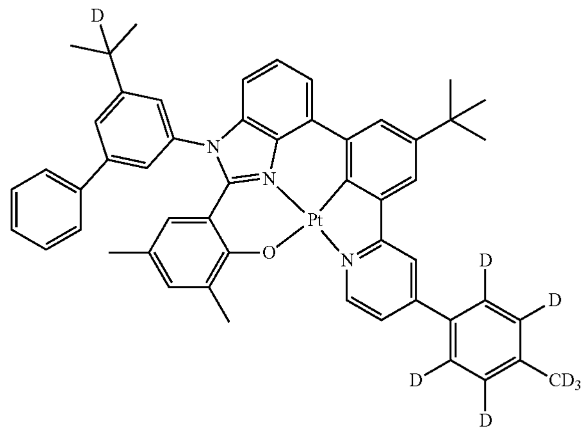
4-1202
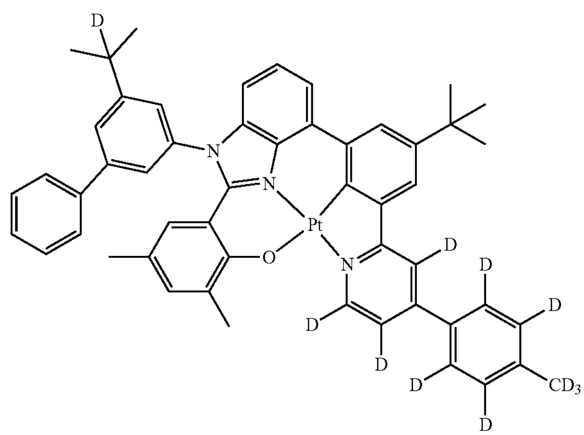
4-1203
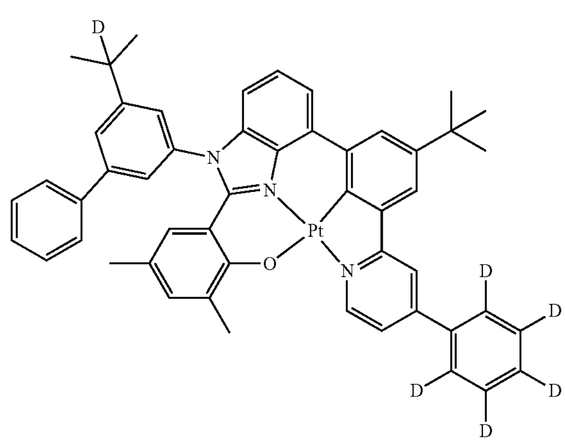

4-1204
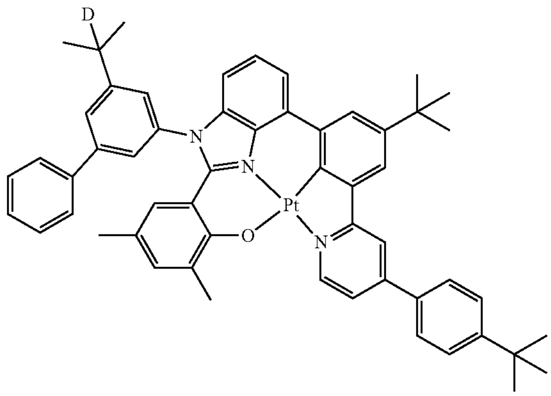
4-1205
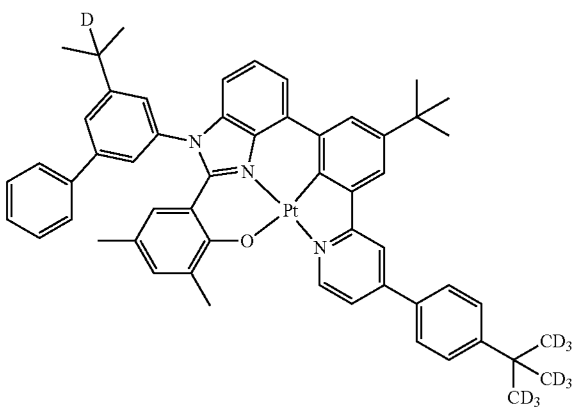
4-1206
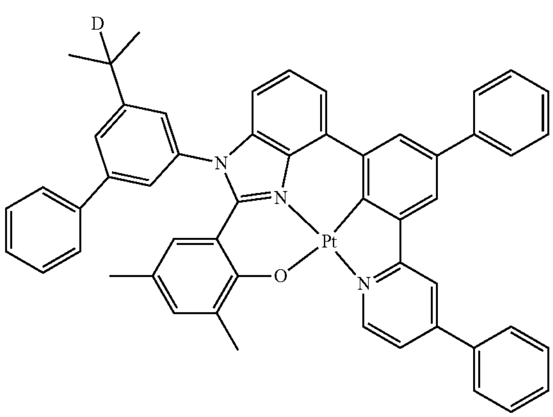
4-1207
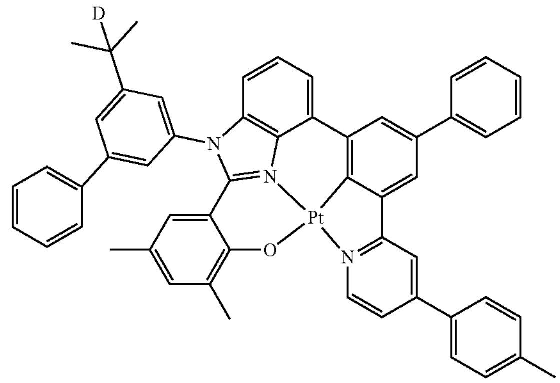
4-1208
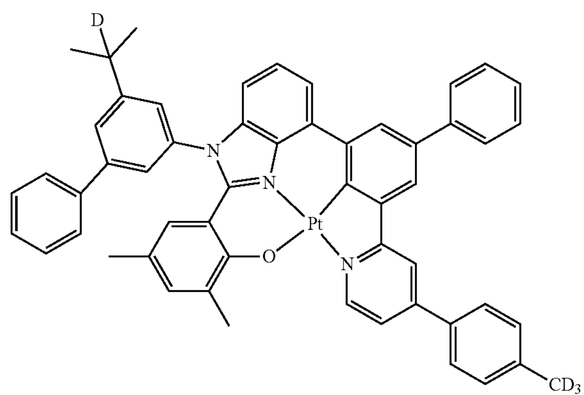
4-1209
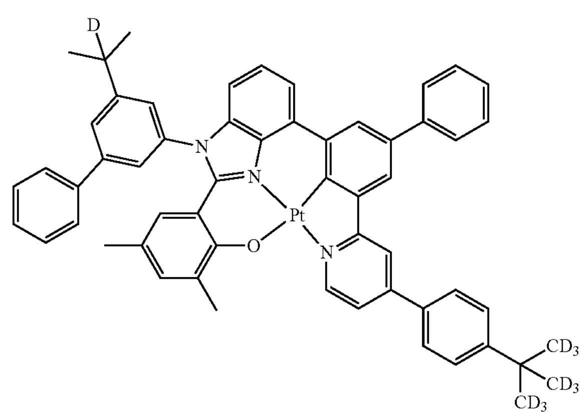

4-1210
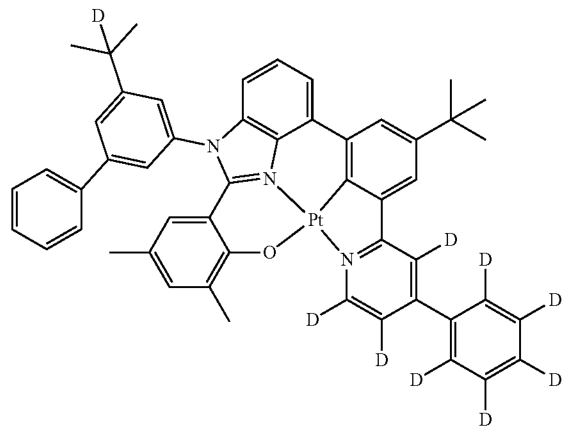
4-1211
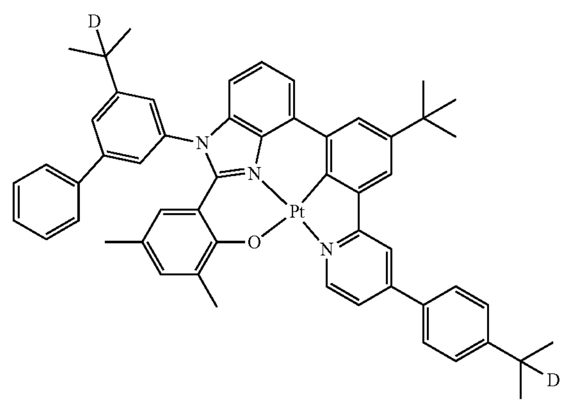
4-1212
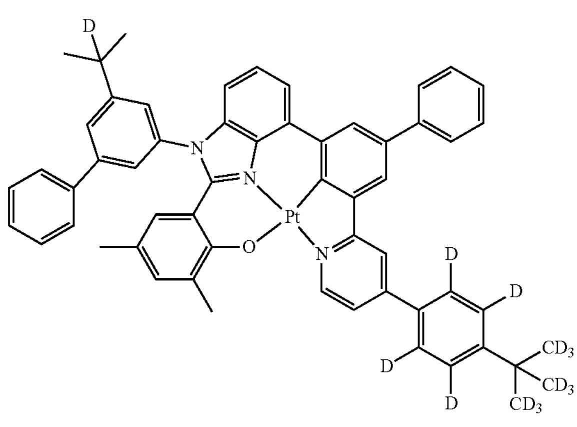
4-1213
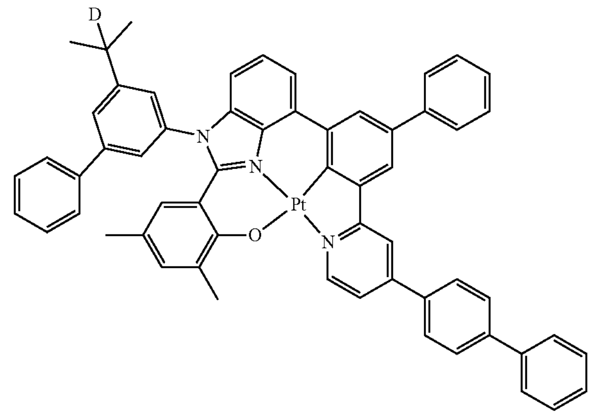
4-1214
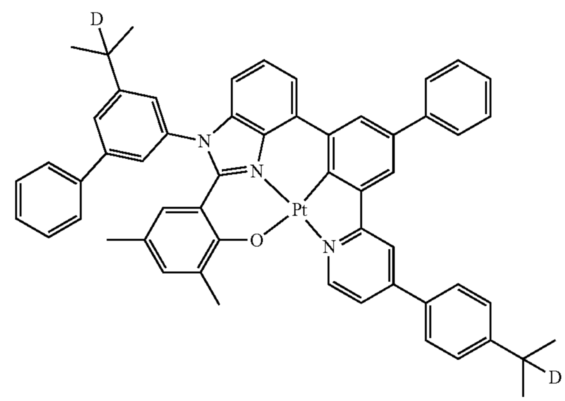
4-1215
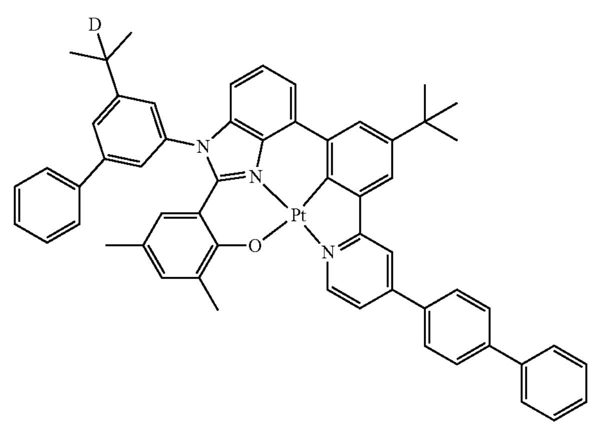

-continued
4-1216
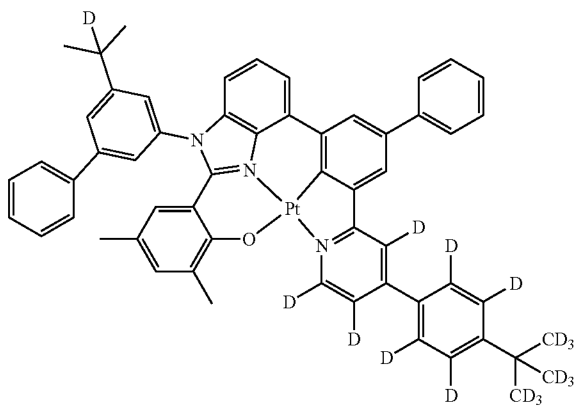
4-1217
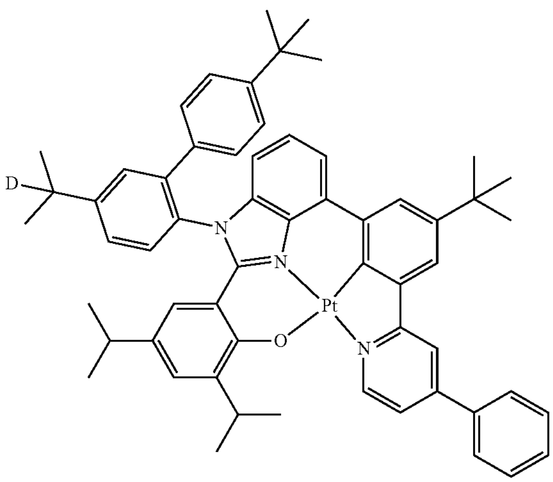
4-1218
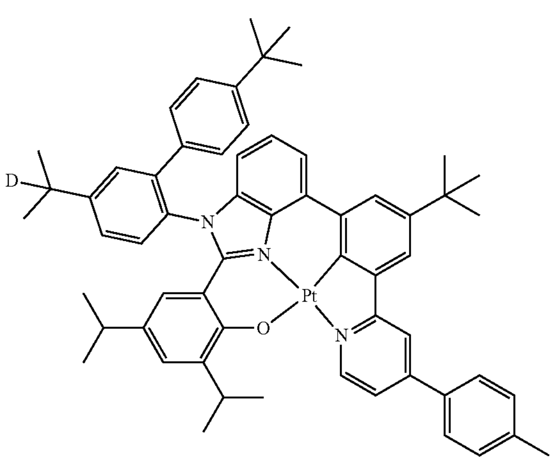
-continued
4-1219
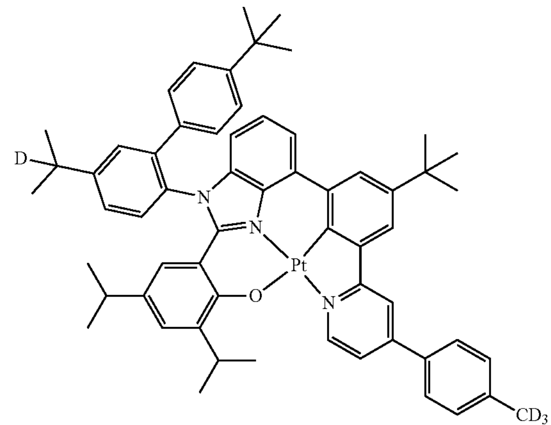
4-1220
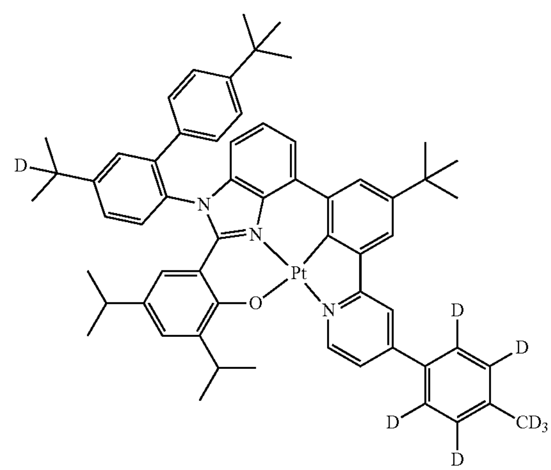
4-1221
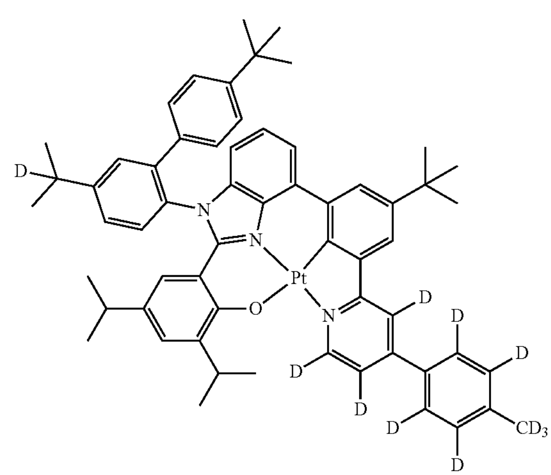

4-1222
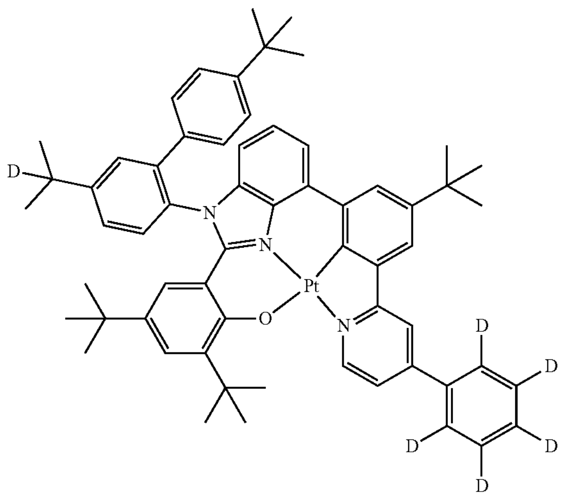
4-1223
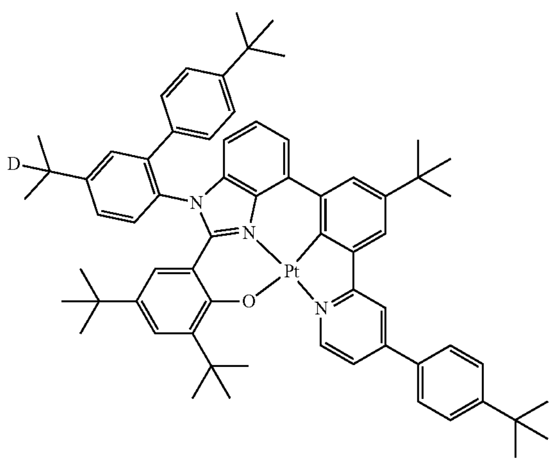
4-1224
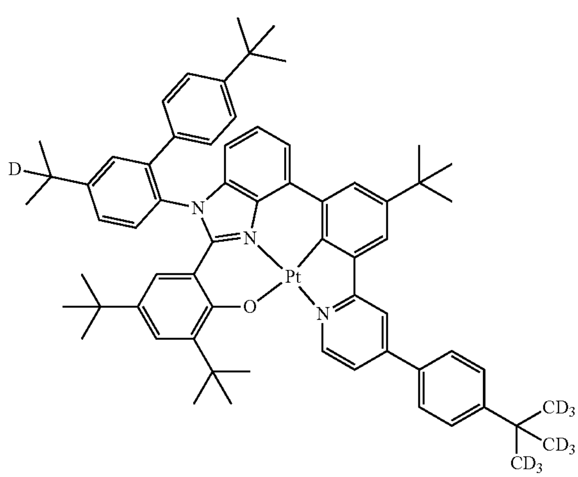
4-1225
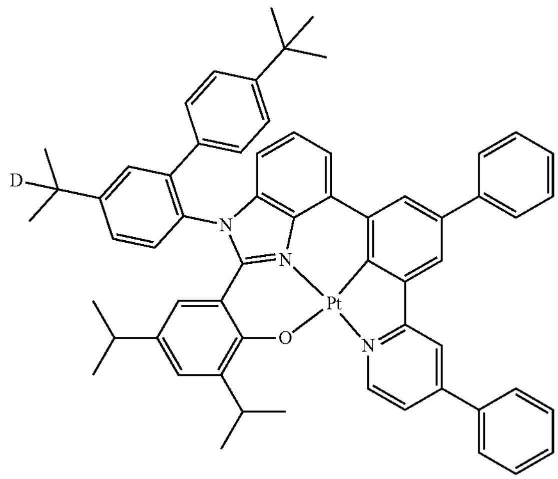
4-1226
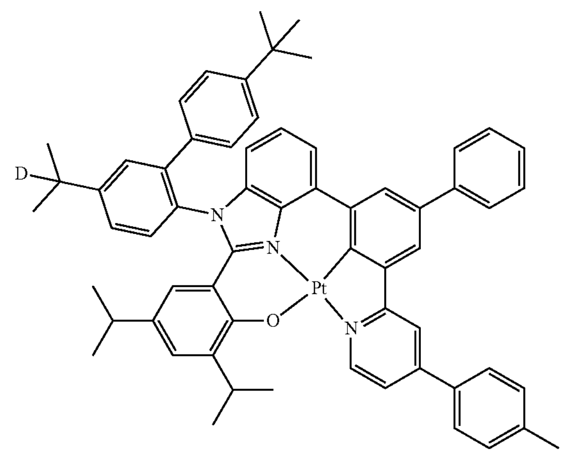
4-1227
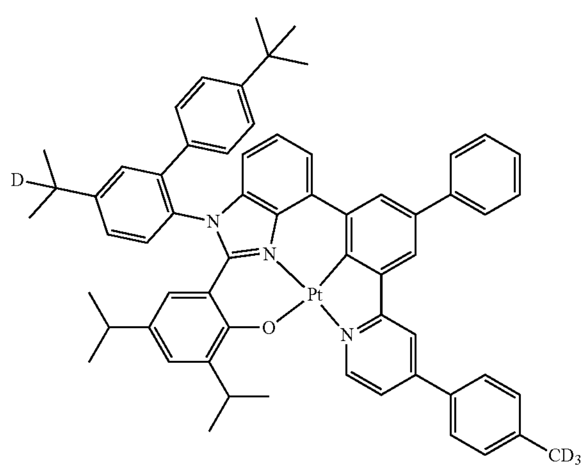

-continued
4-1228
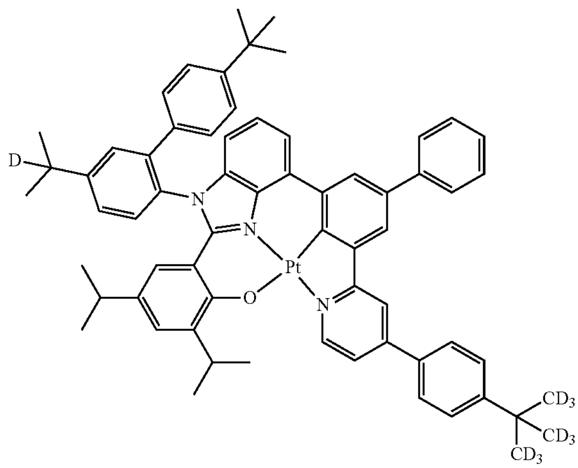
4-1229
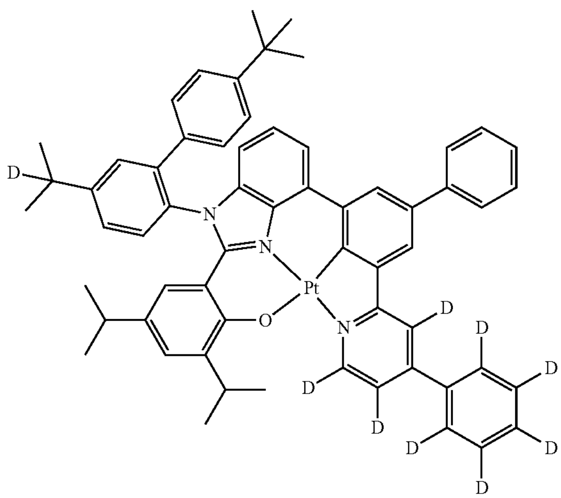
4-1230
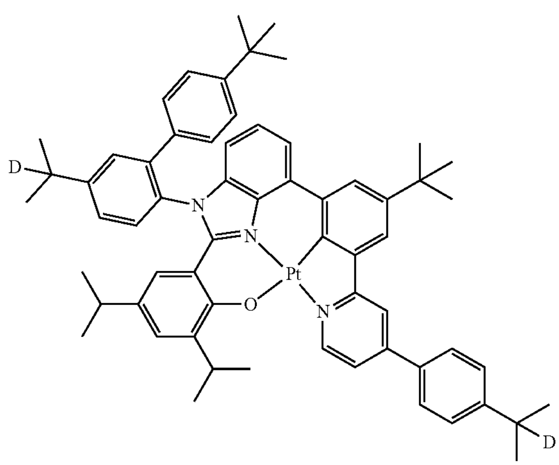
-continued
4-1231
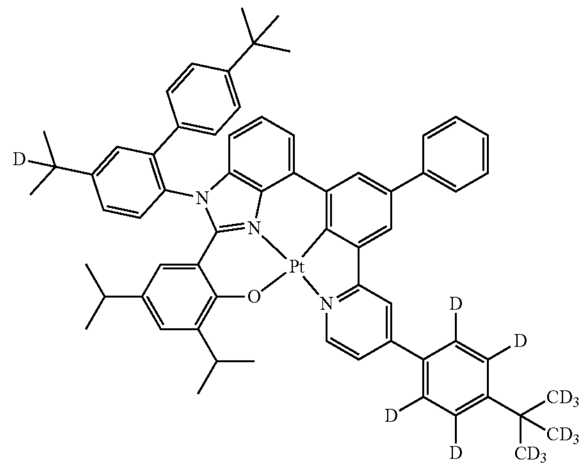
4-1232
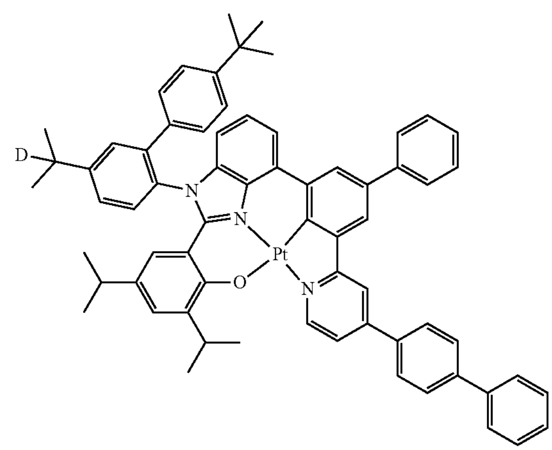
4-1233
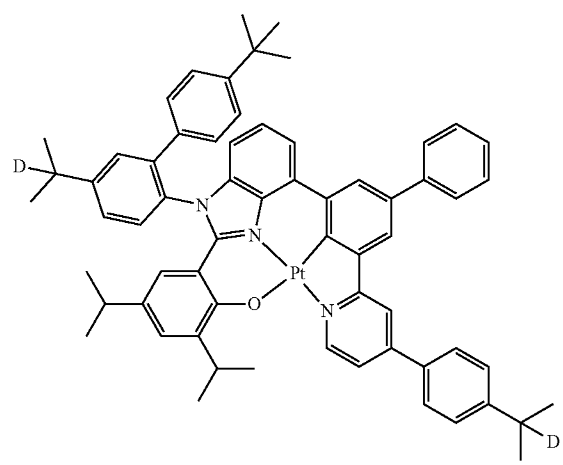

-continued
4-1234
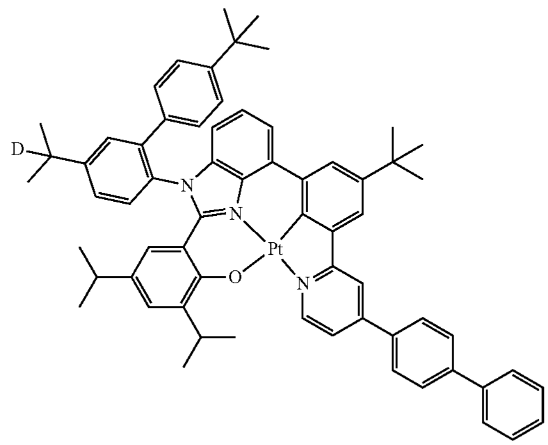
4-1235
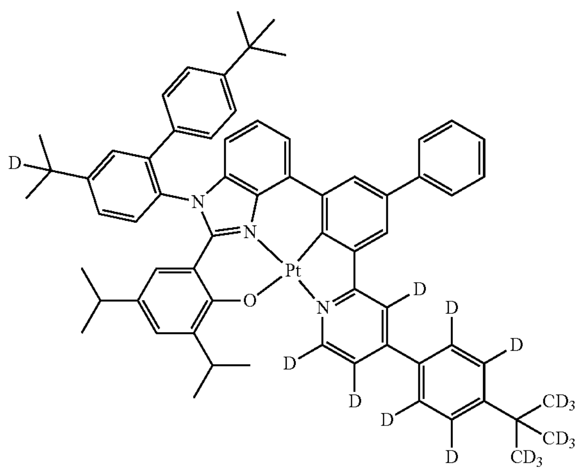
4-1236
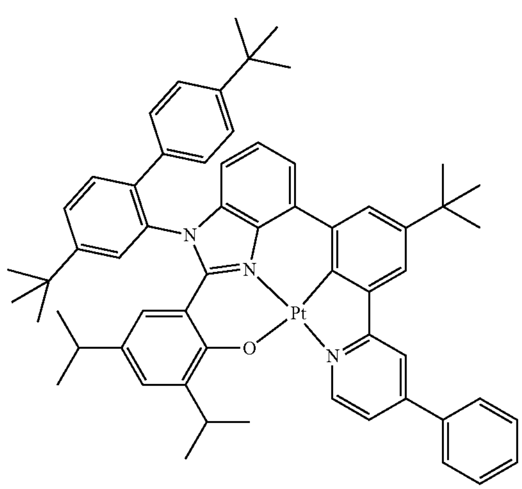
-continued
4-1237
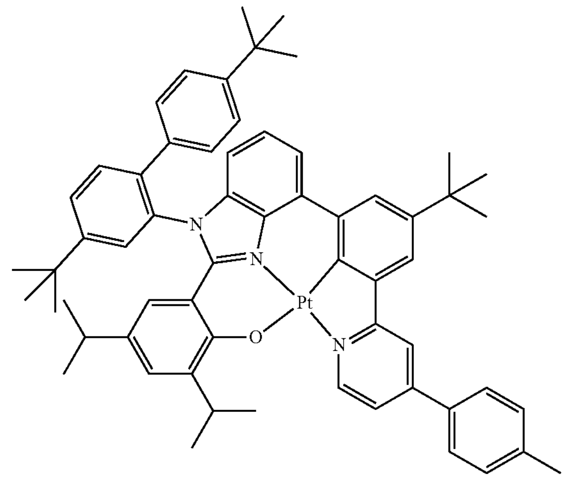
4-1238
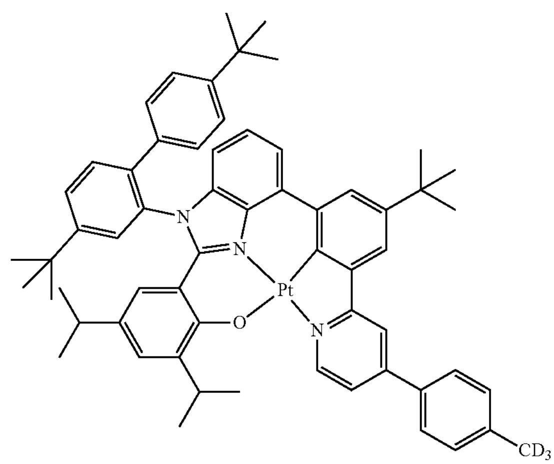
4-1239
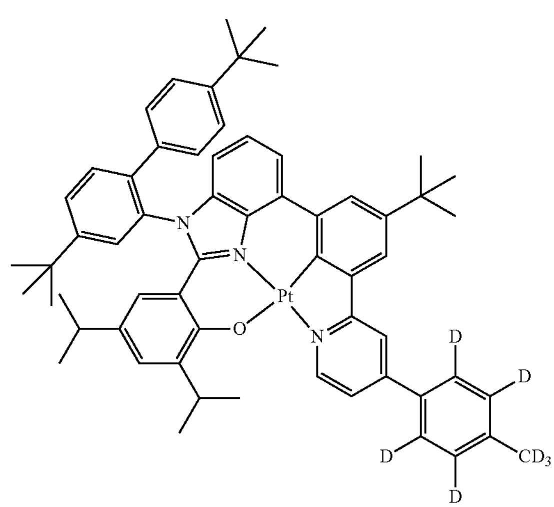

-continued
4-1240
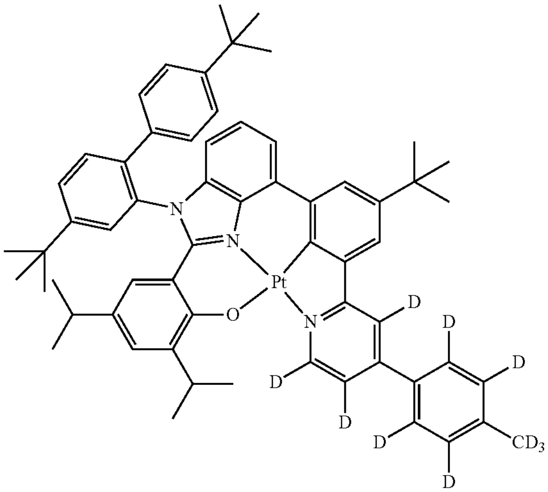
4-1241
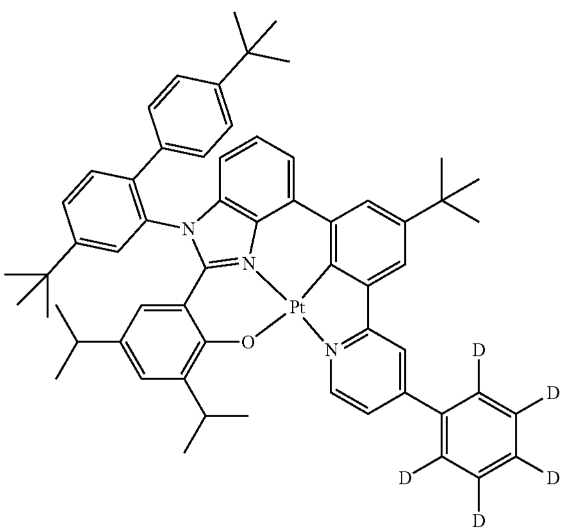
4-1242
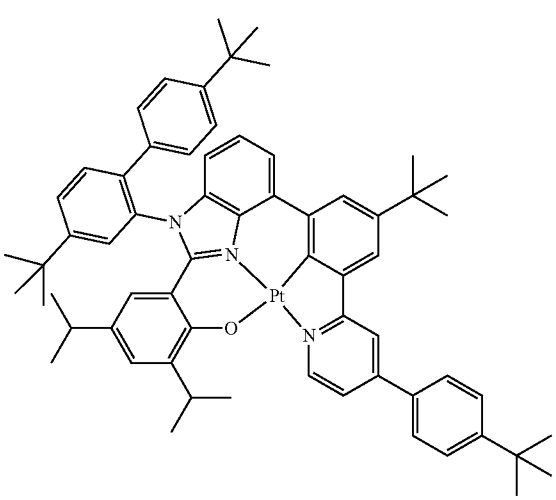
-continued
4-1243
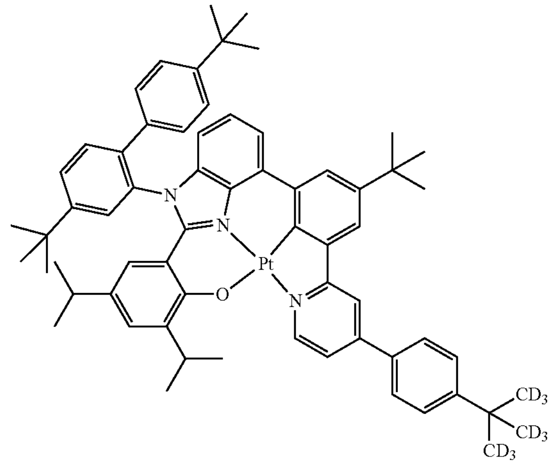
4-1244
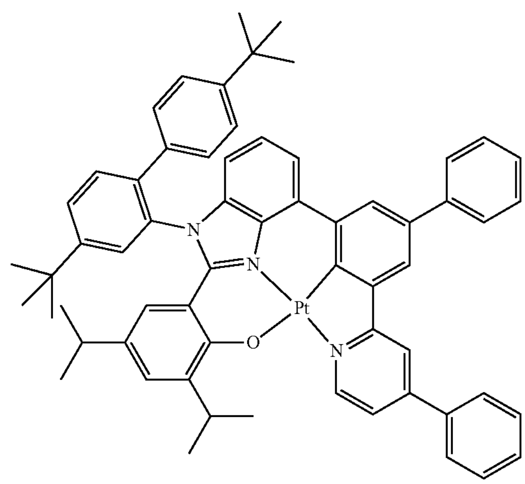
4-1245
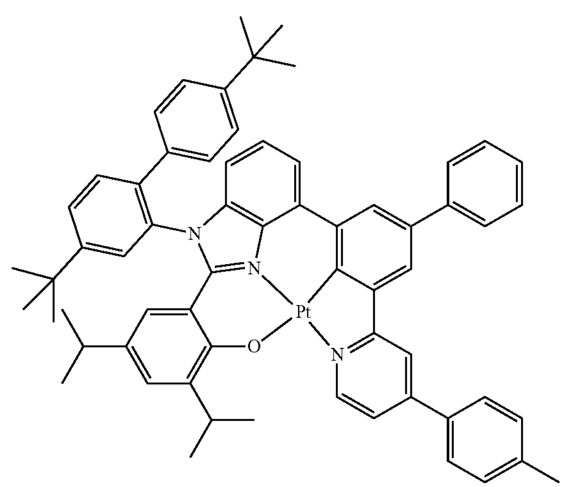

-continued
4-1246
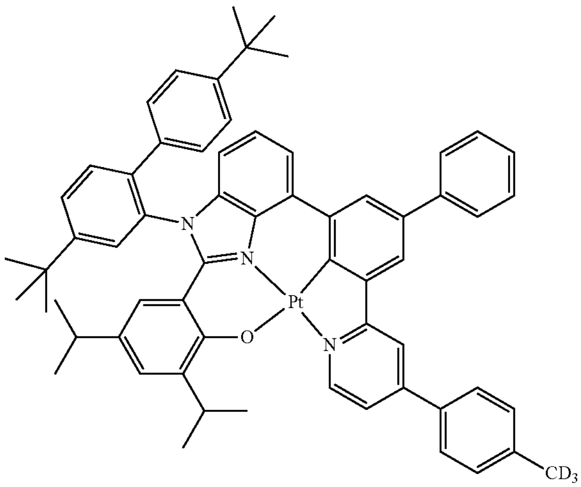
4-1247
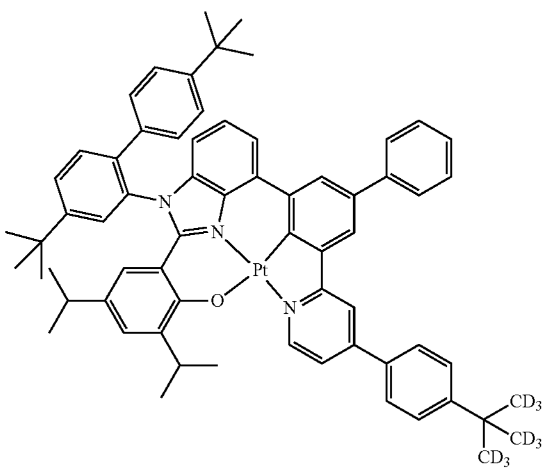
4-1248
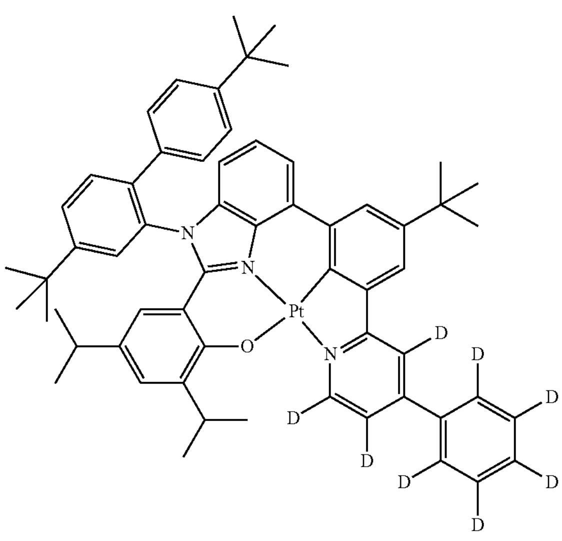
-continued
4-1249
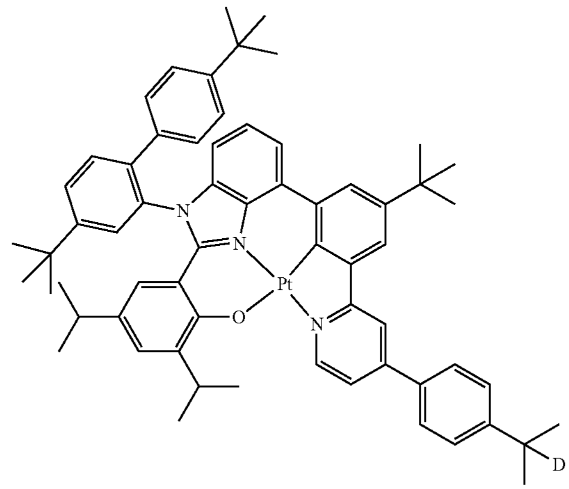
4-1250
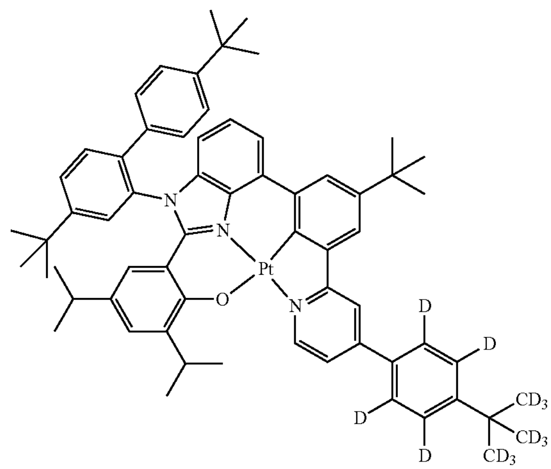
4-1251
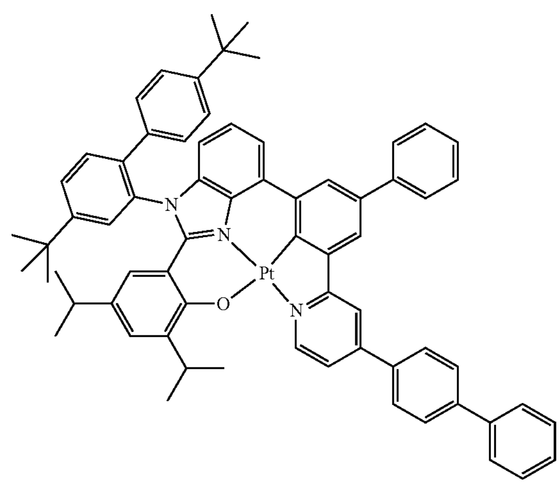

4-1252
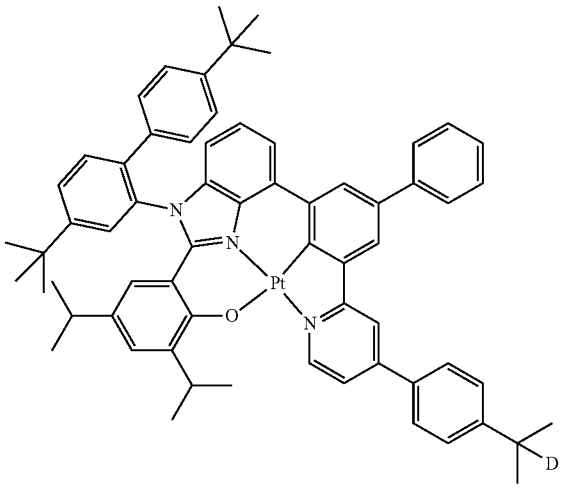
4-1253
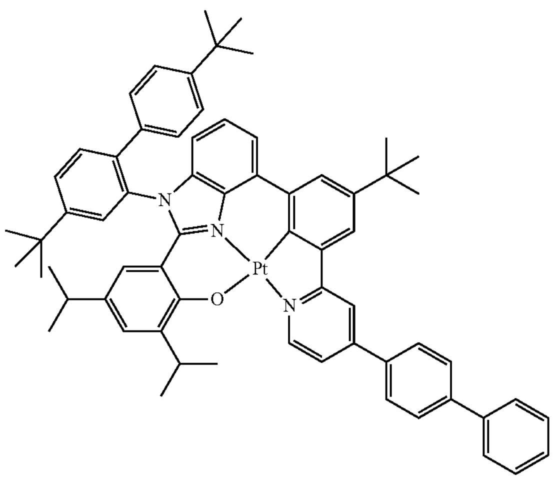
4-1254
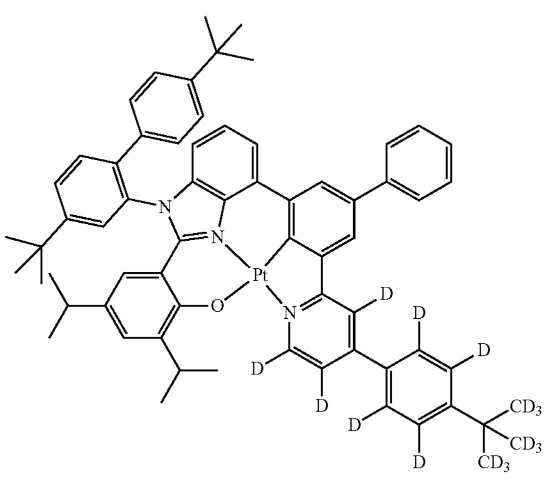
4-1255
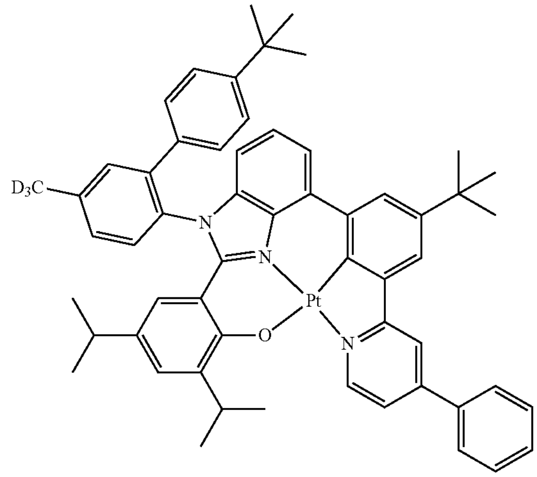
4-1256
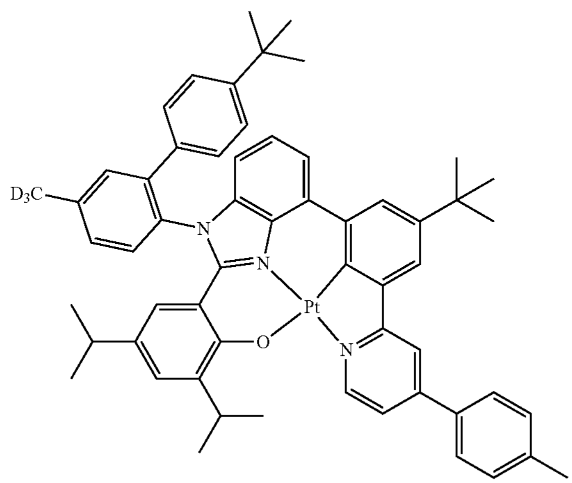
4-1257
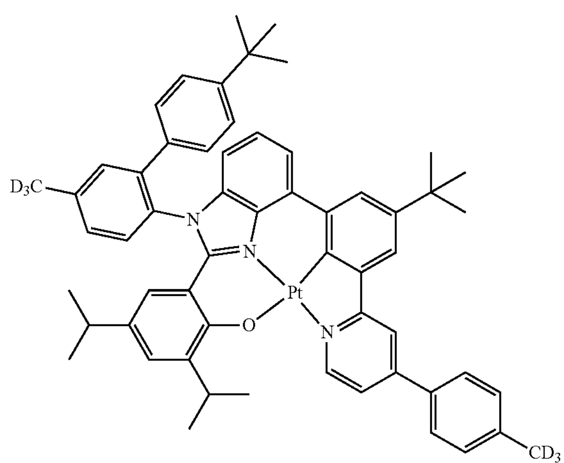

-continued
4-1258
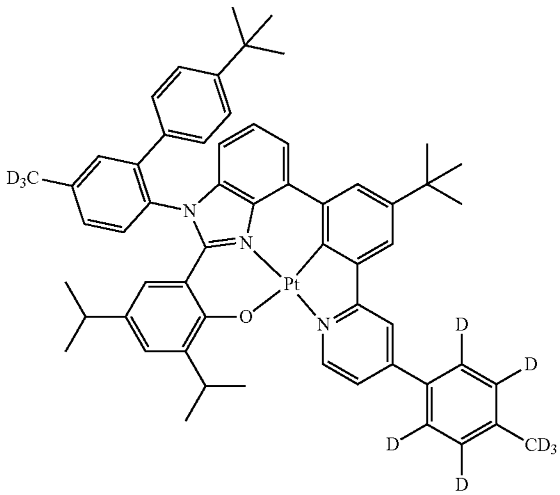
4-1259
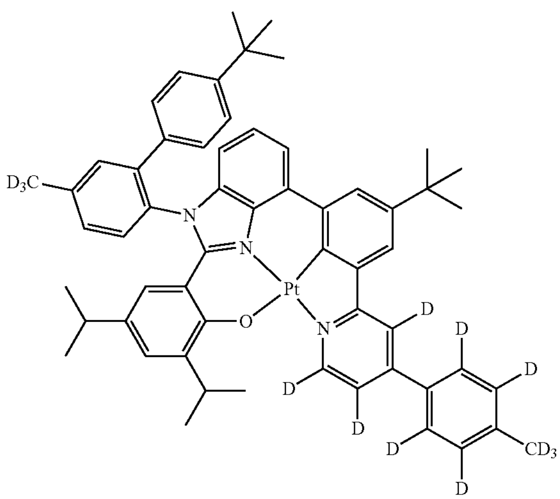
4-1260
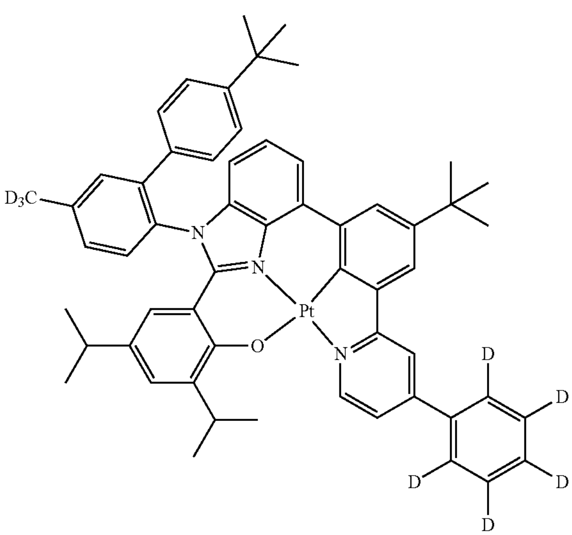
-continued
4-1261
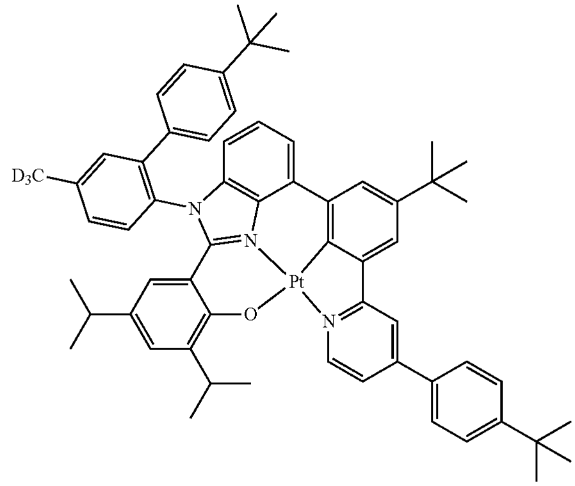
4-1262
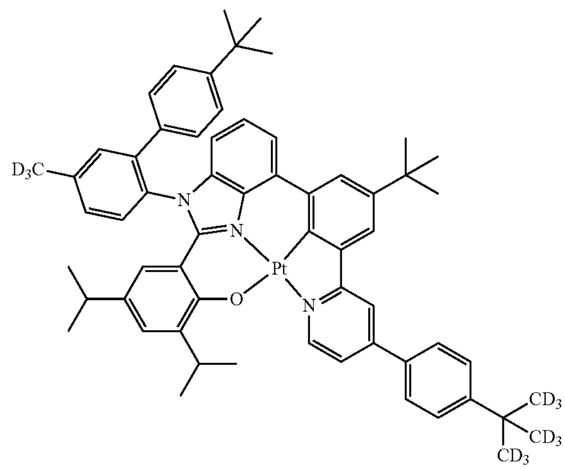
4-1263
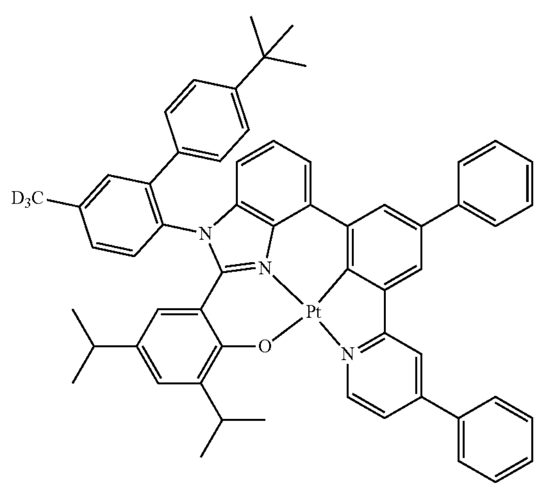

4-1264
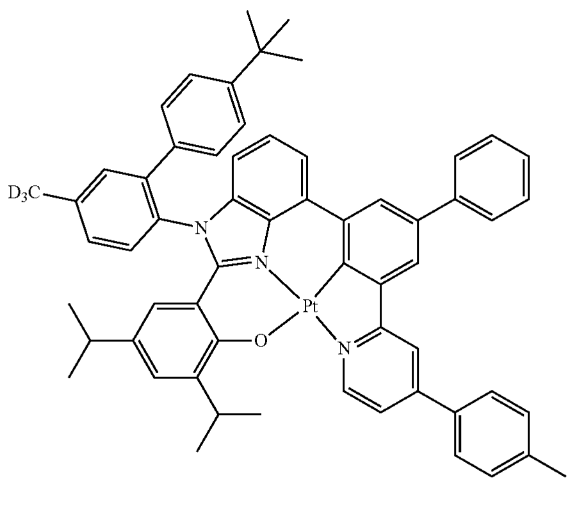
4-1265
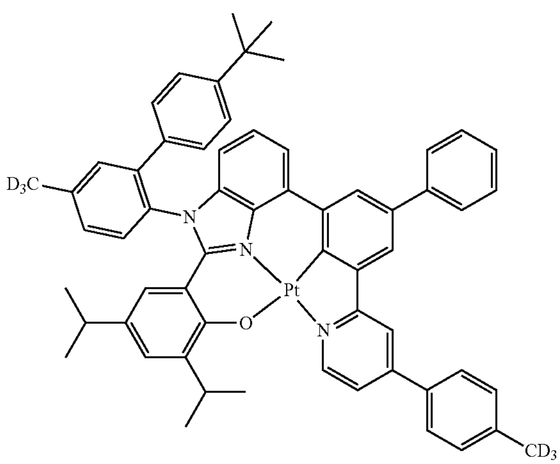
4-1266
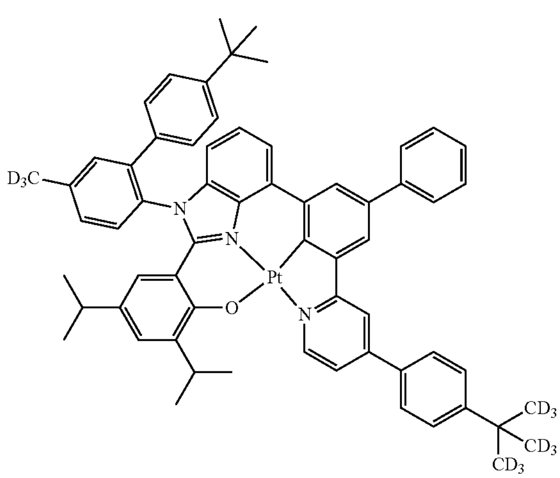
4-1267
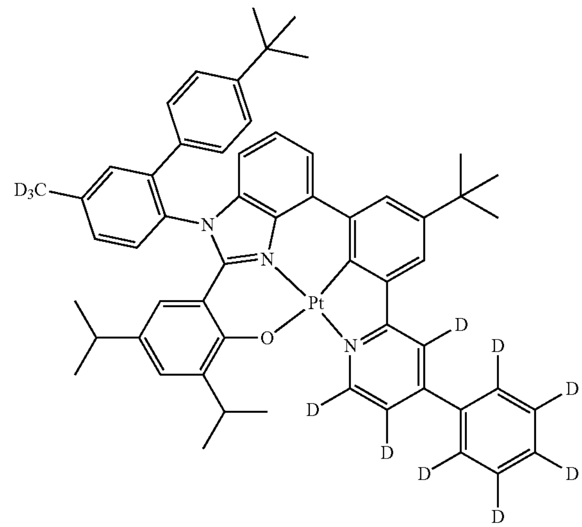
4-1268
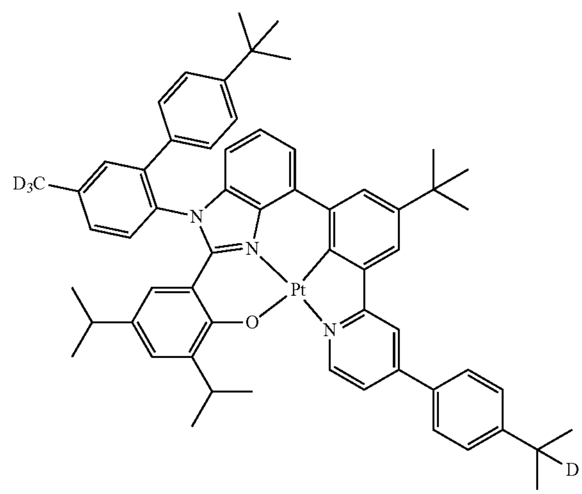
4-1269
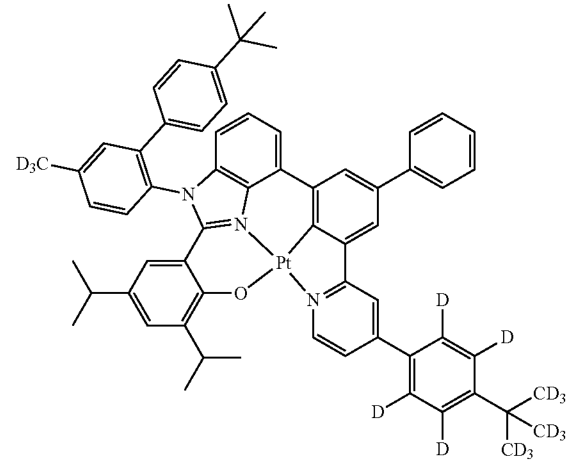

-continued
4-1270
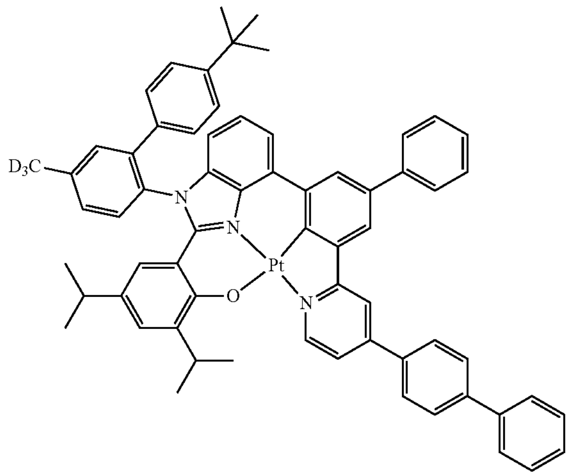
4-1271
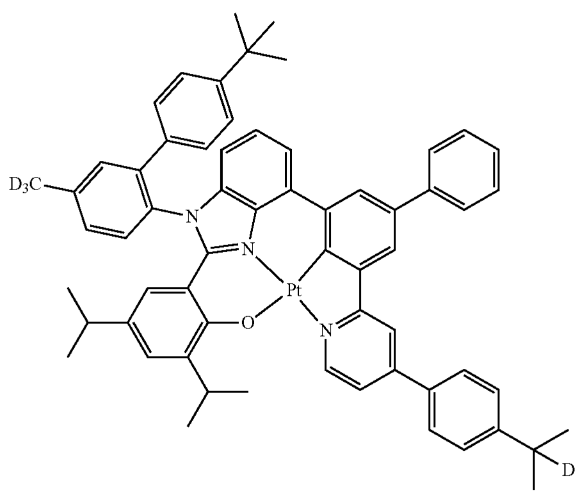
4-1272
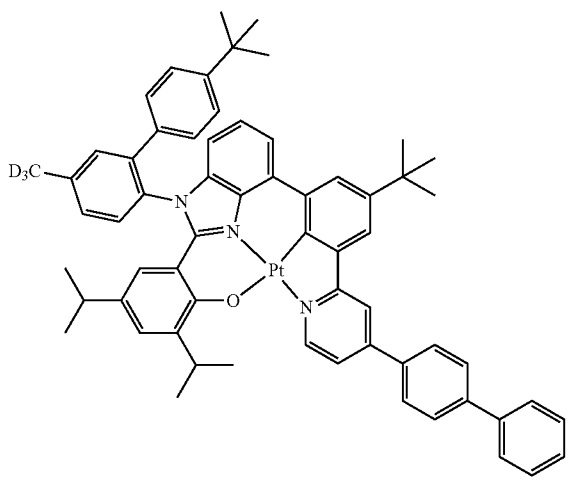
-continued
4-1273
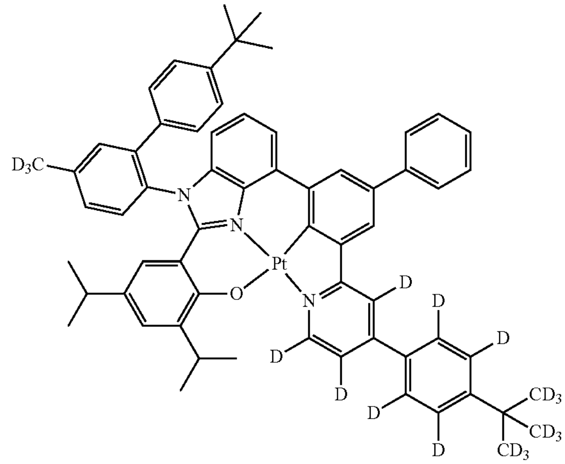
4-1274
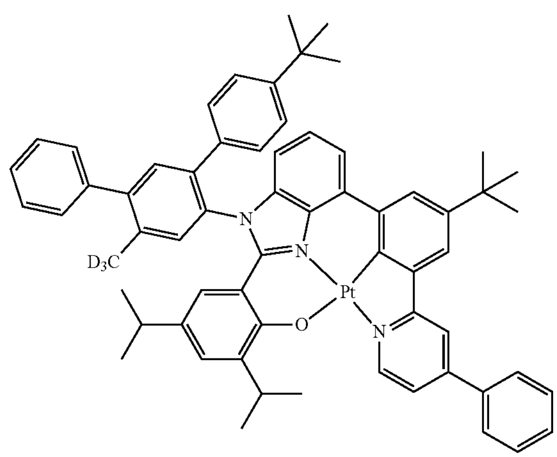
4-1275
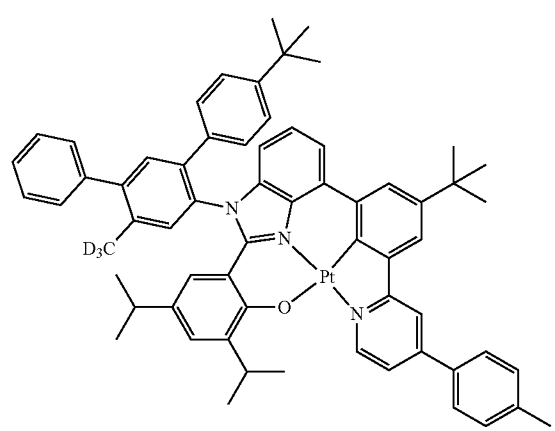

4-1276
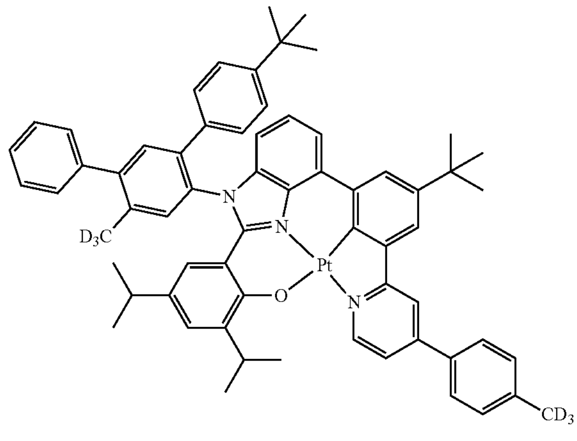
4-1277
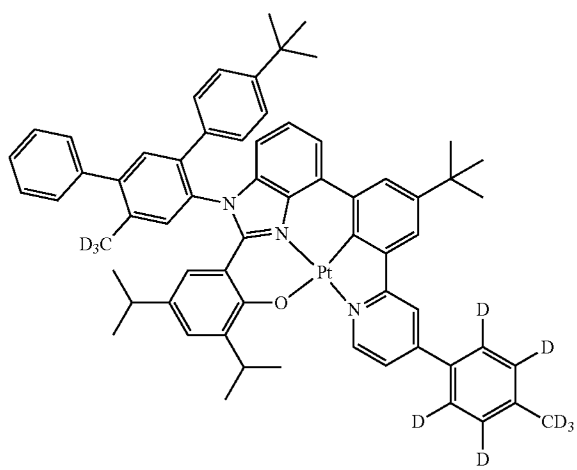
4-1278
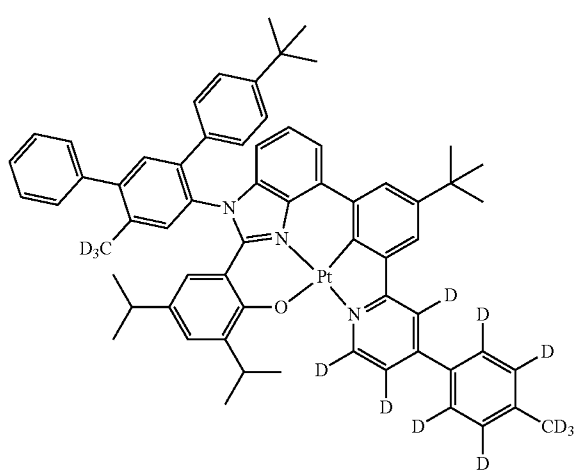
4-1279
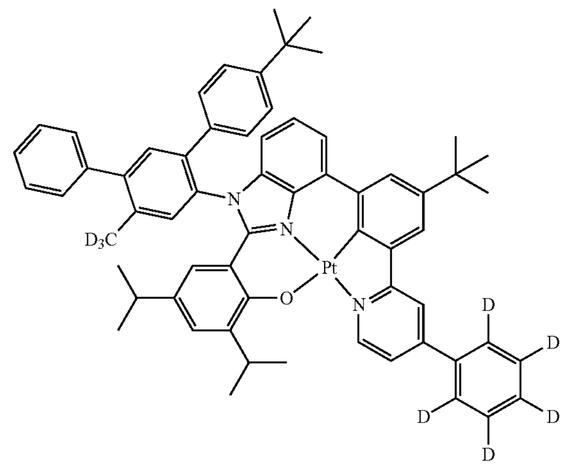
4-1280
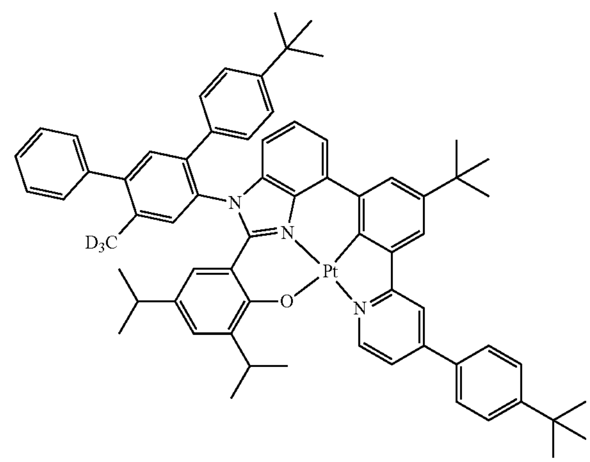
4-1281
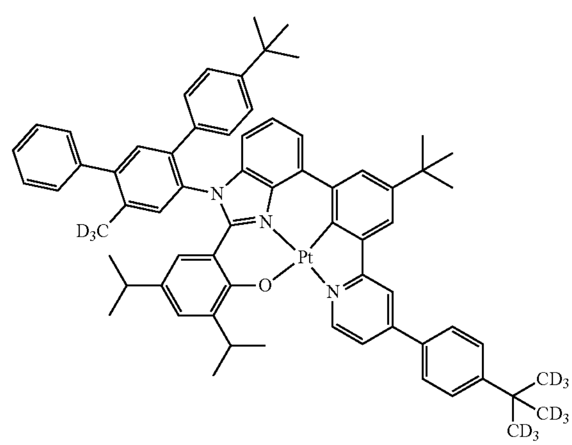

4-1282
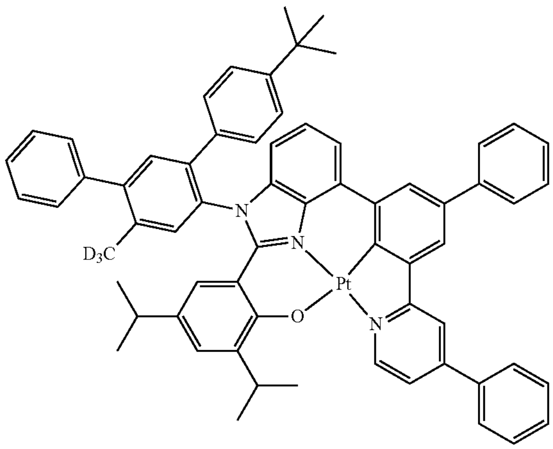
4-1283
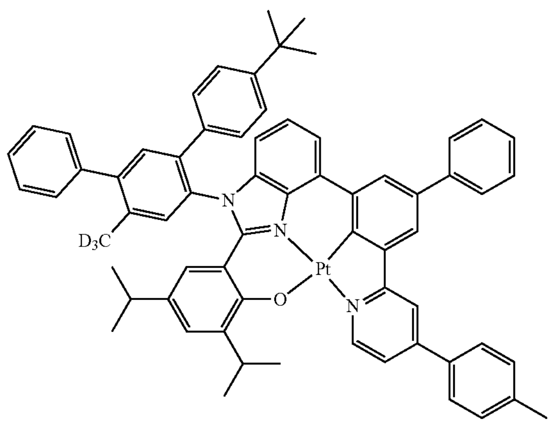
4-1284
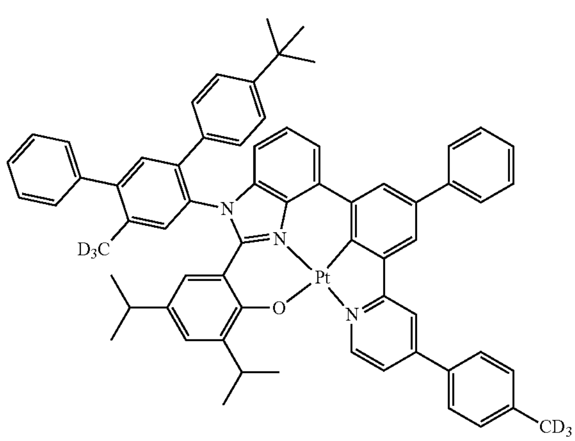
4-1285
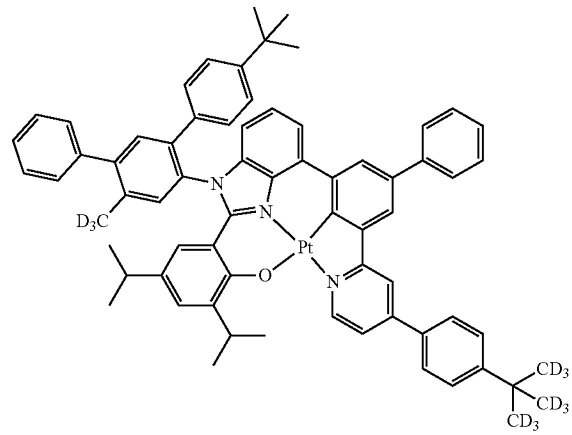
4-1286
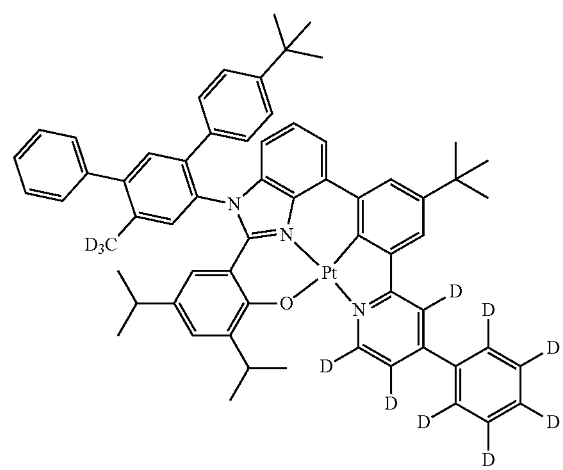
4-1287
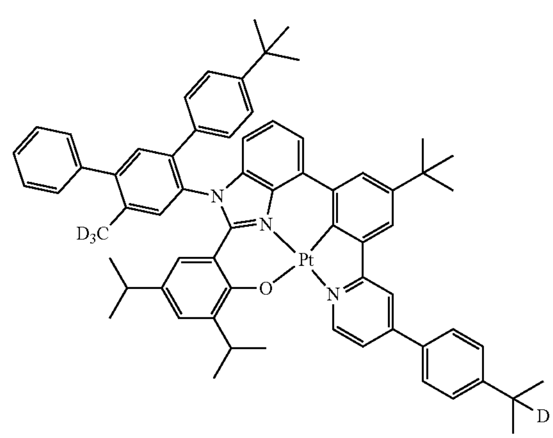

-continued
4-1288
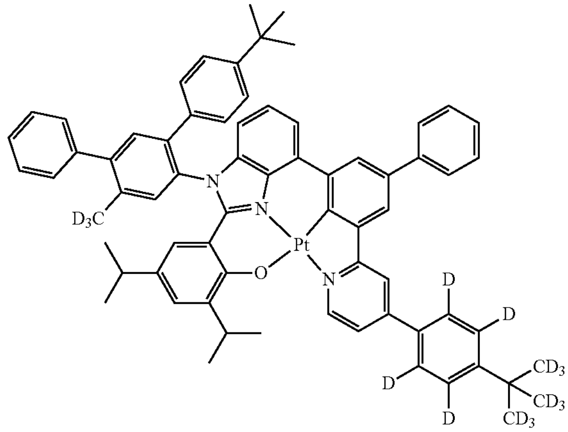
4-1289
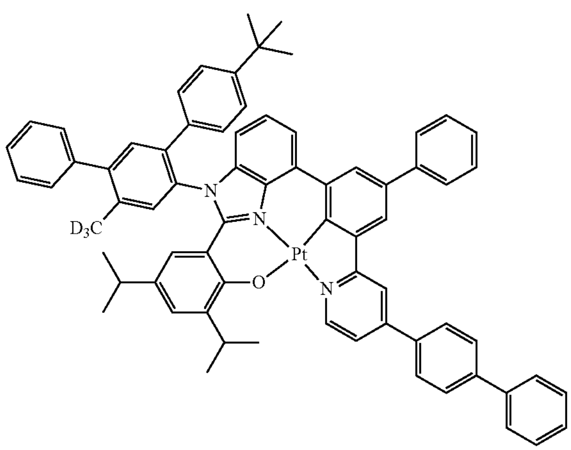
4-1290
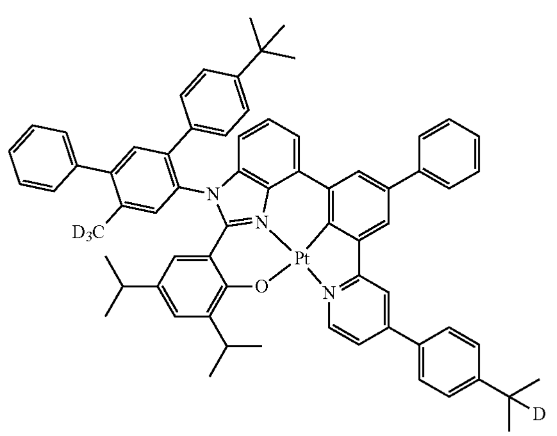
-continued
4-1291
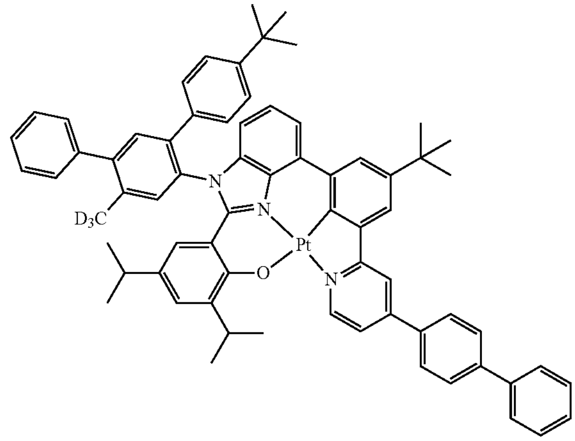
4-1292
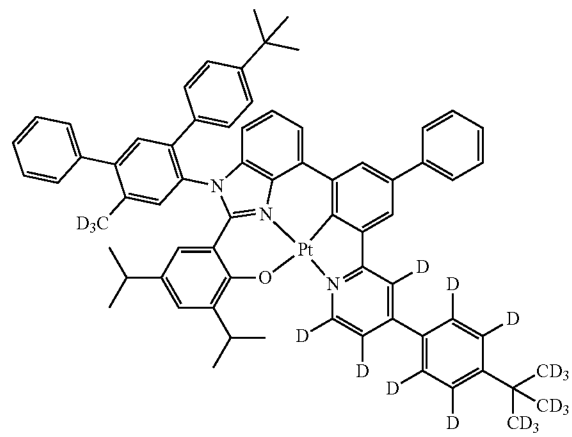
4-1293
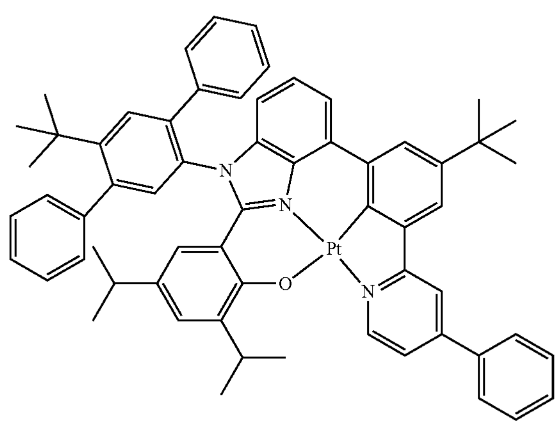

4-1294
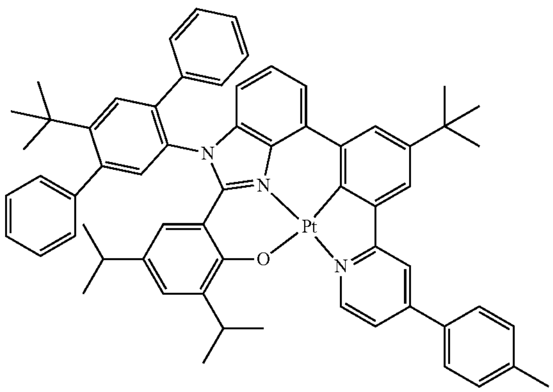
4-1295
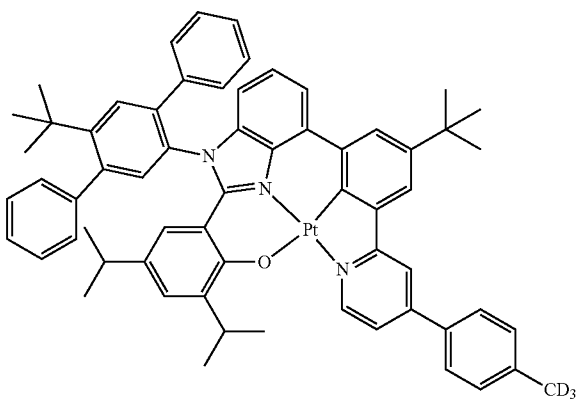
4-1296
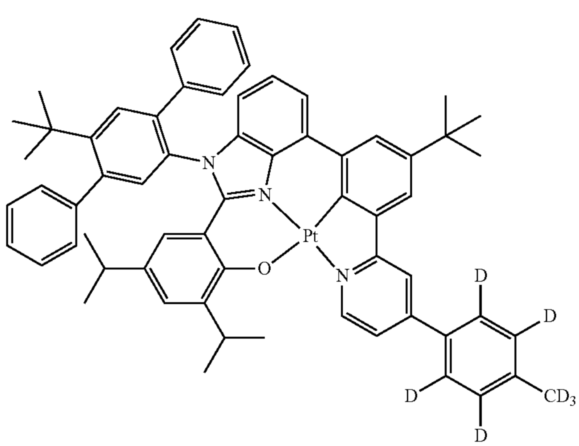
4-1297
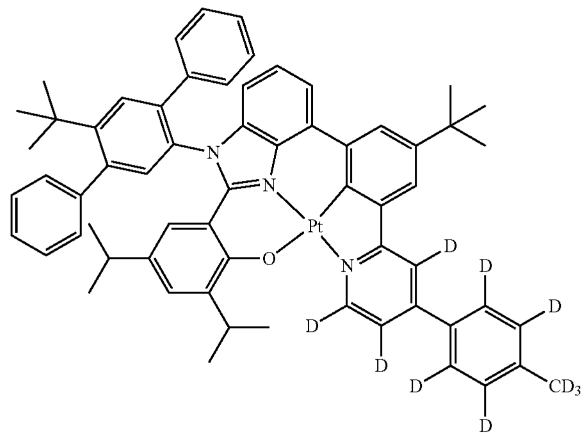
4-1298
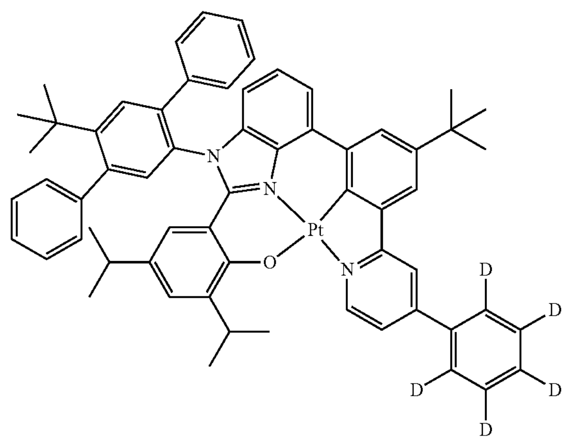
4-1299
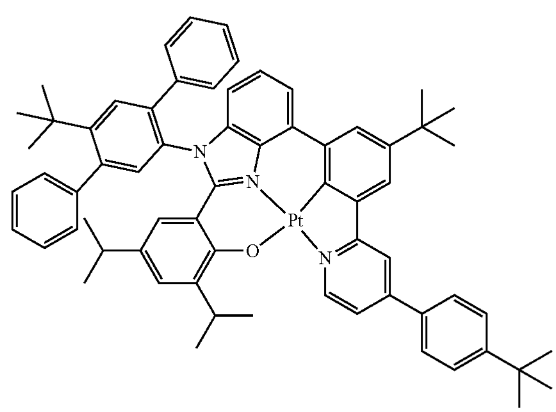

4-1300
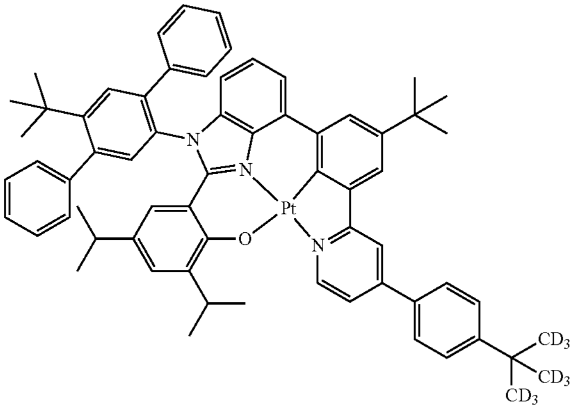
4-1301
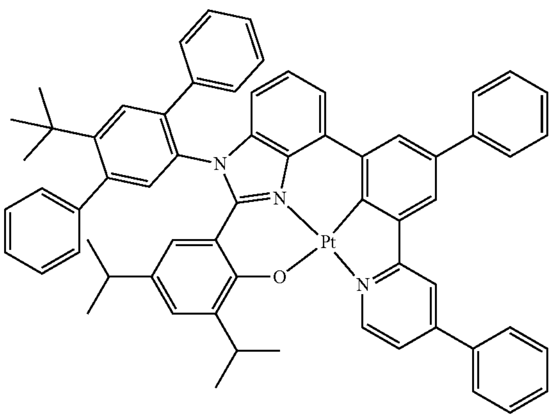
4-1302
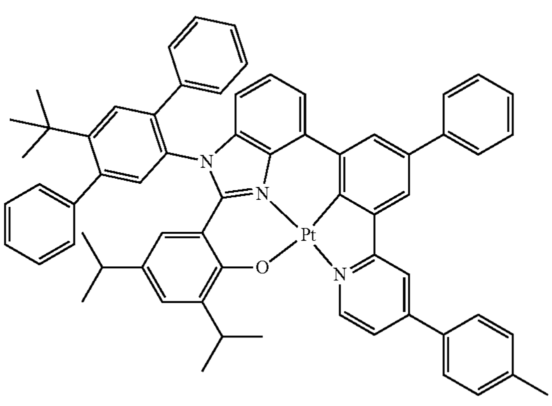
4-1303
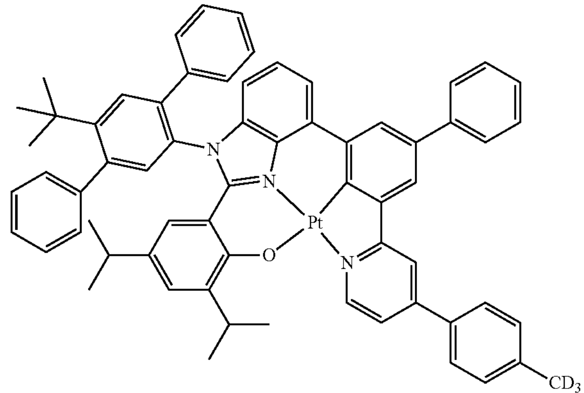
4-1304
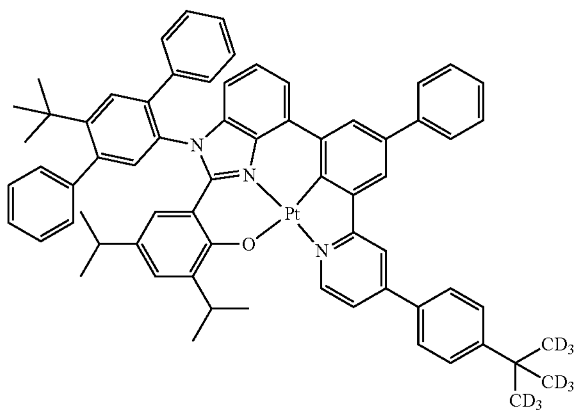
4-1305
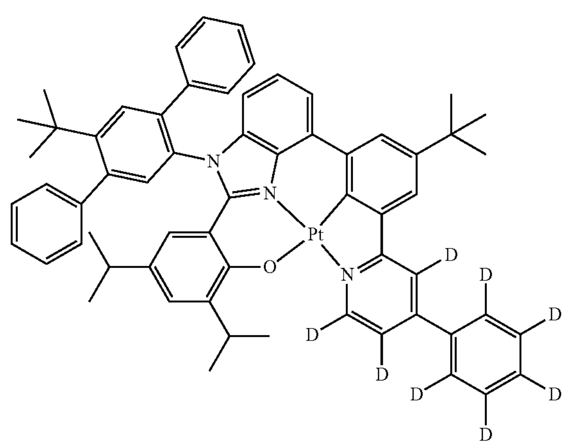

-continued
4-1306
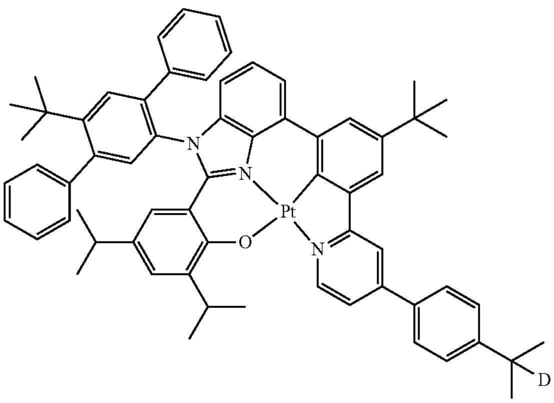
4-1307
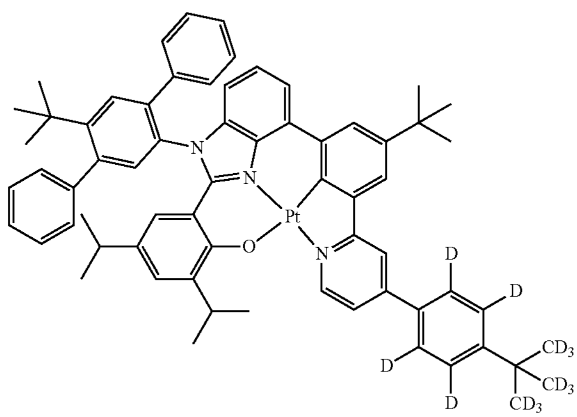
4-1308
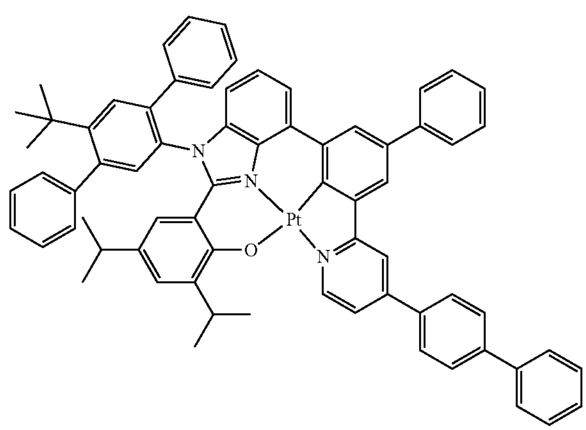
-continued
4-1309
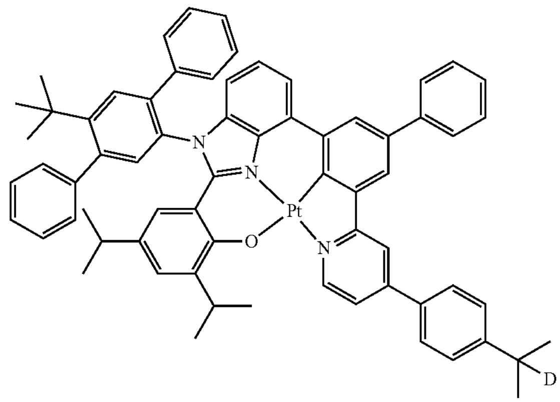
4-1310
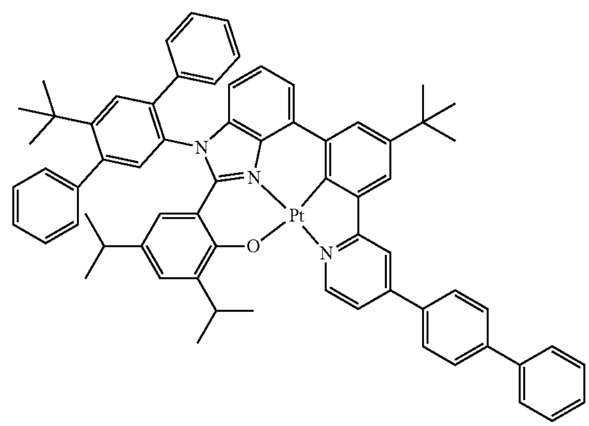
4-1311
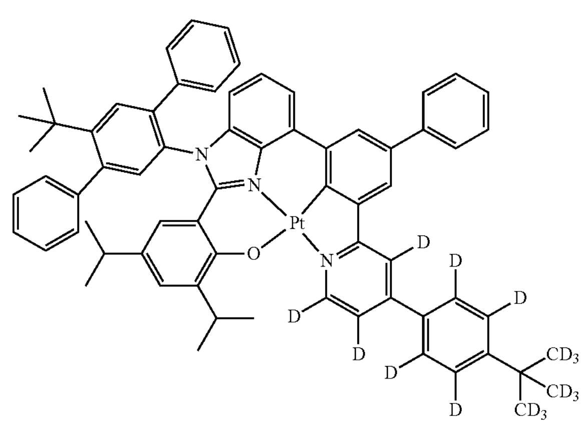

-continued
4-1312
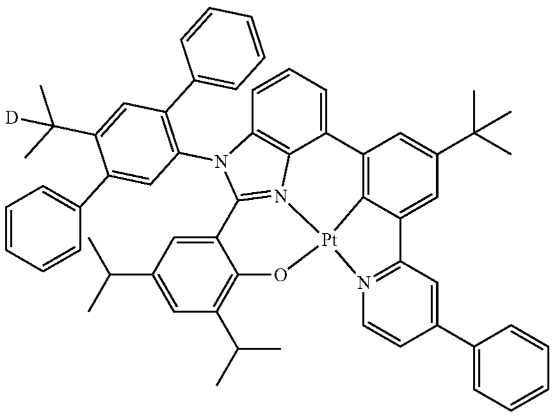
4-1313
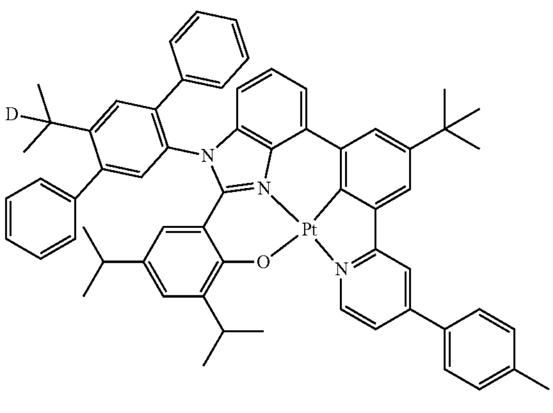
4-1314
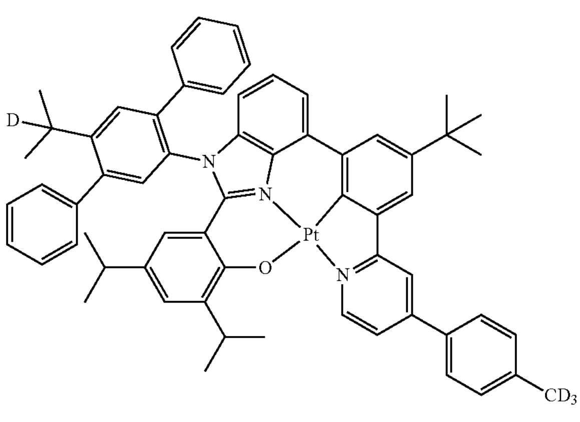
-continued
4-1315
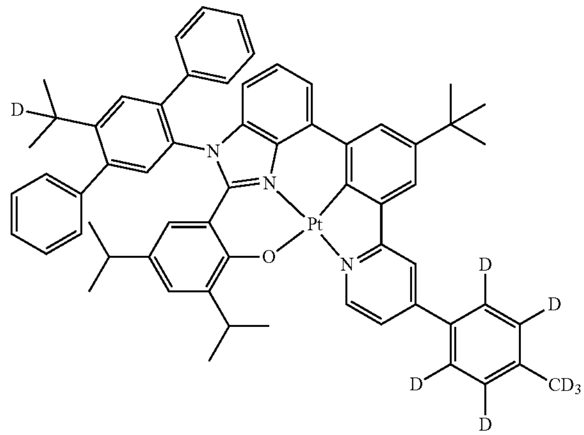
4-1316
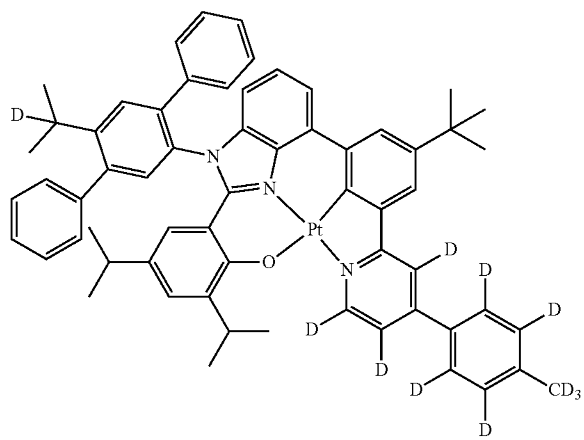
4-1317
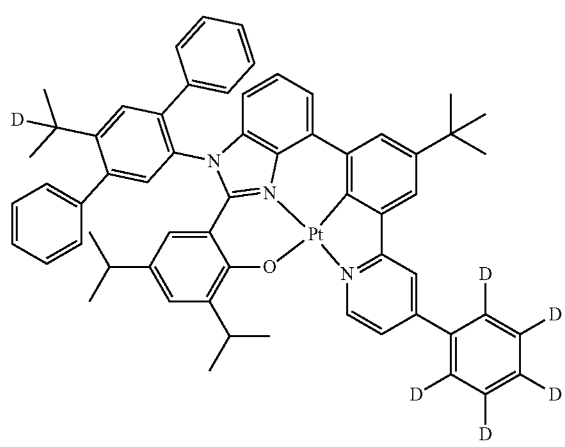

-continued
4-1318
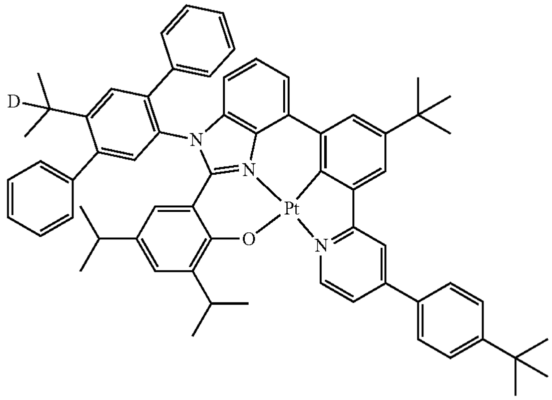
4-1321
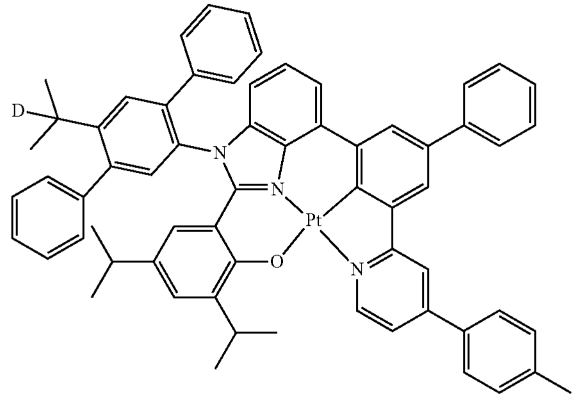
4-1319
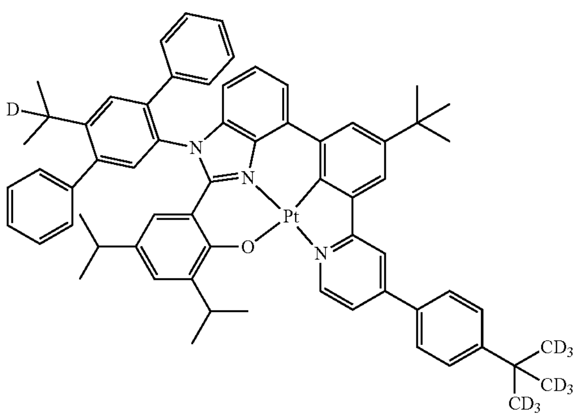
4-1322
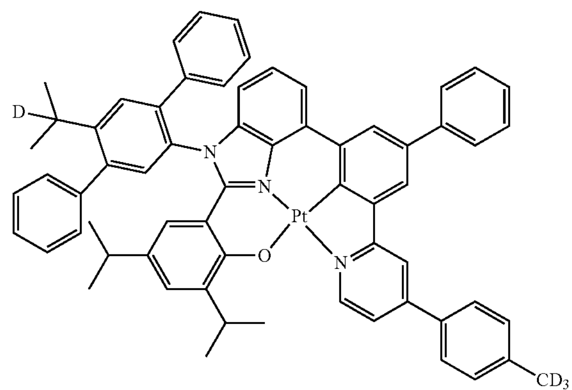
4-1320
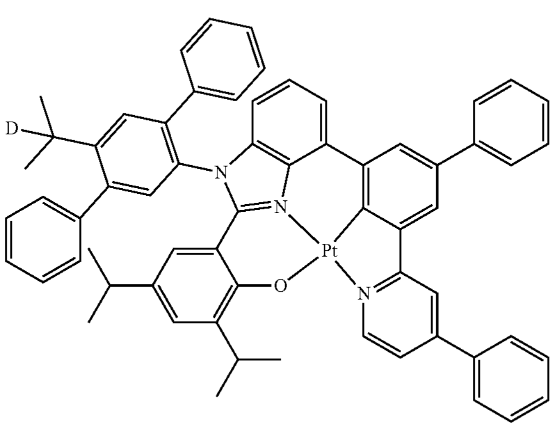
4-1323
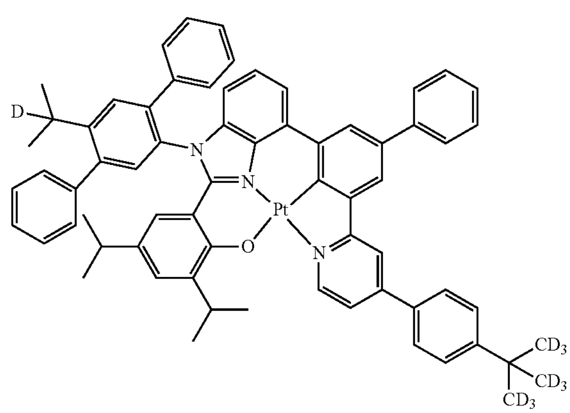

4-1324
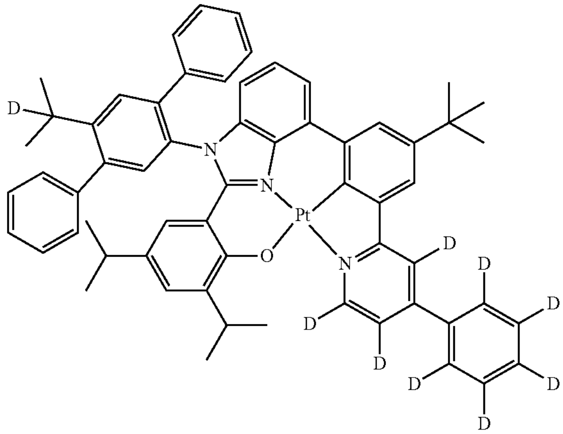
4-1325
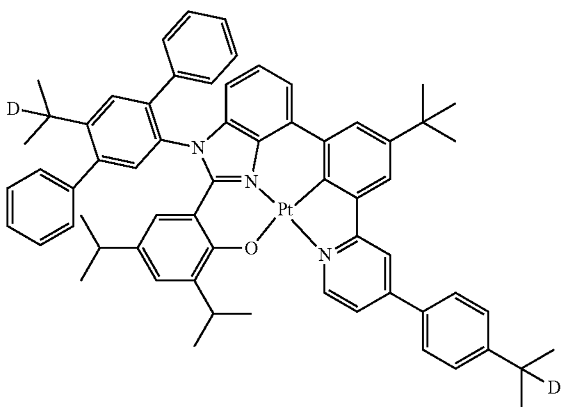
4-1326
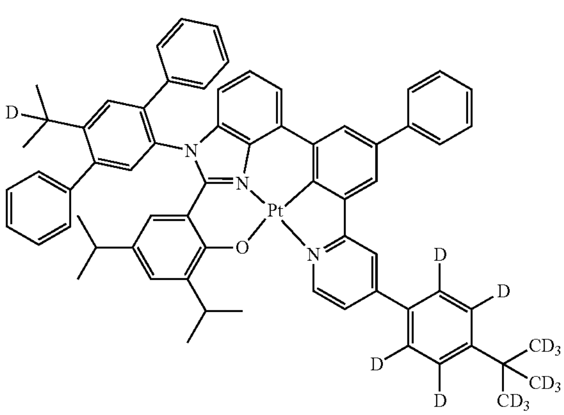
4-1327
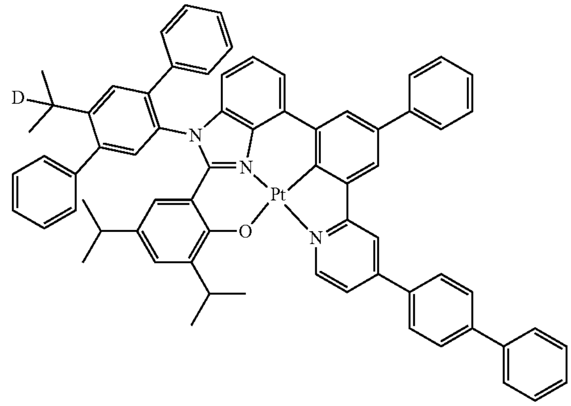
4-1328
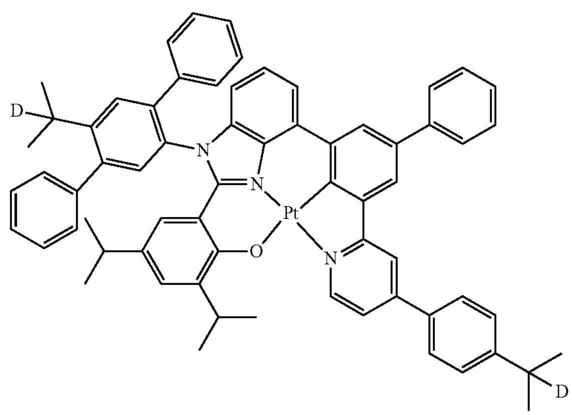
4-1329
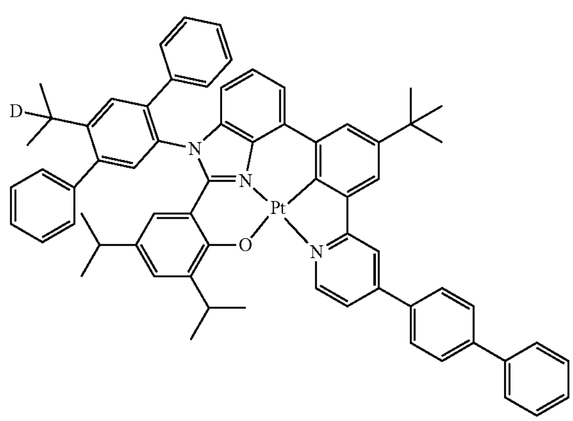

4-1330
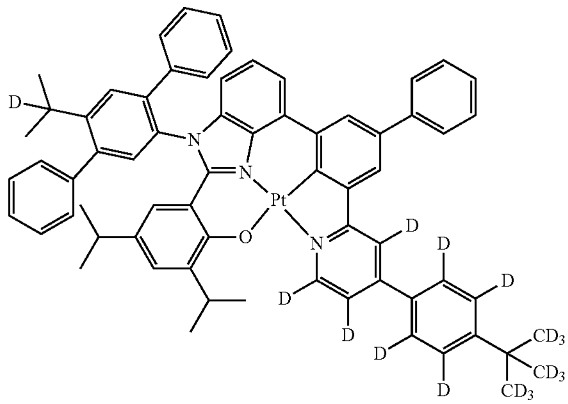
4-1331
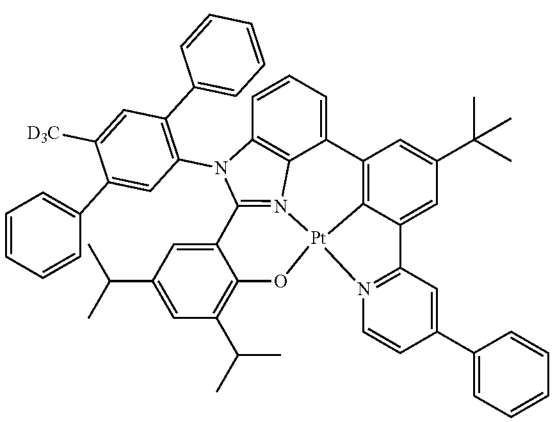
4-1332
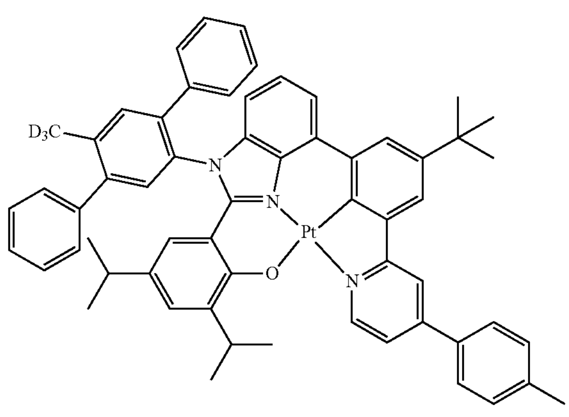
4-1333
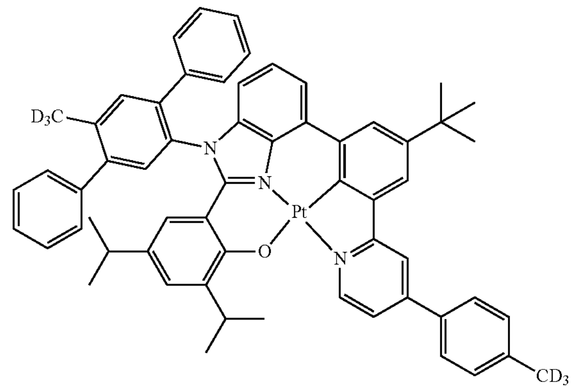
4-1334
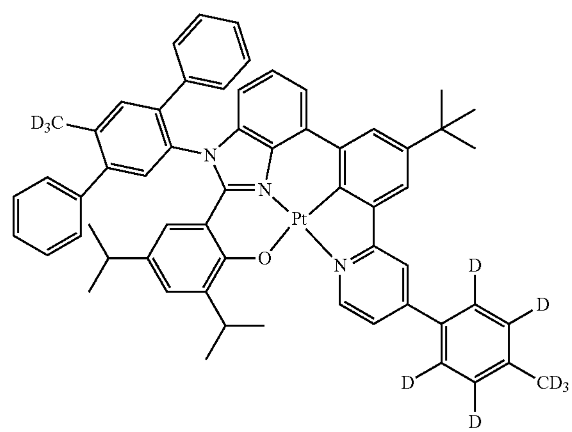
4-1335
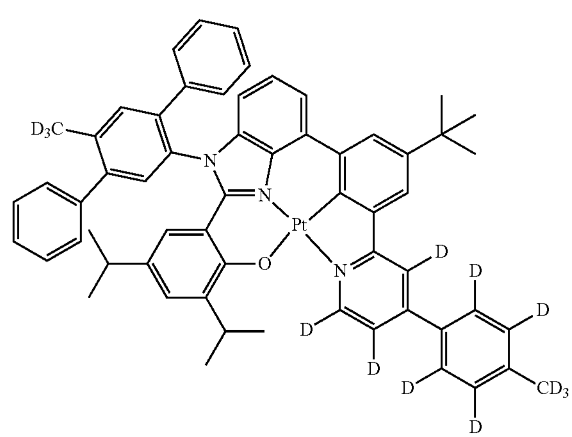

-continued
4-1336
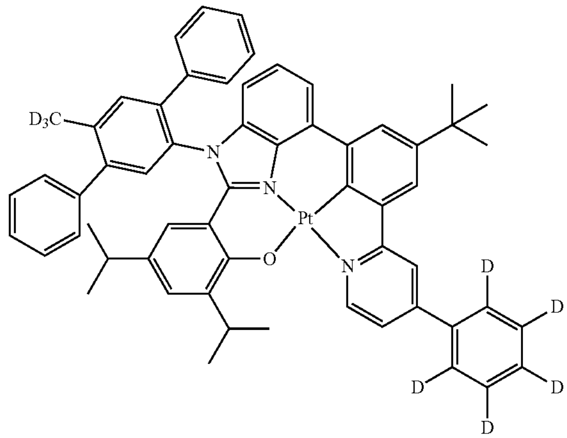
4-1337
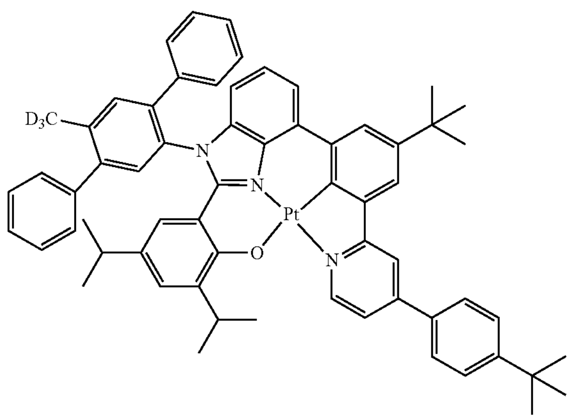
4-1338
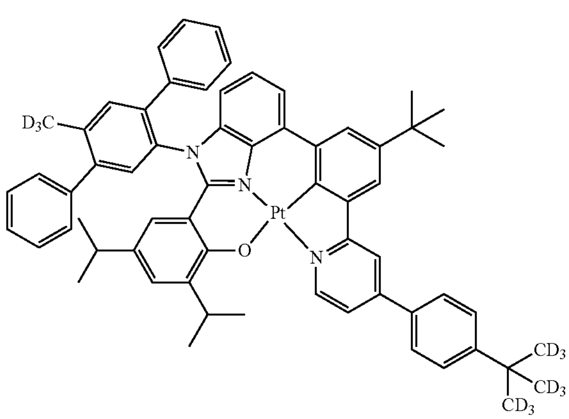
-continued
4-1339
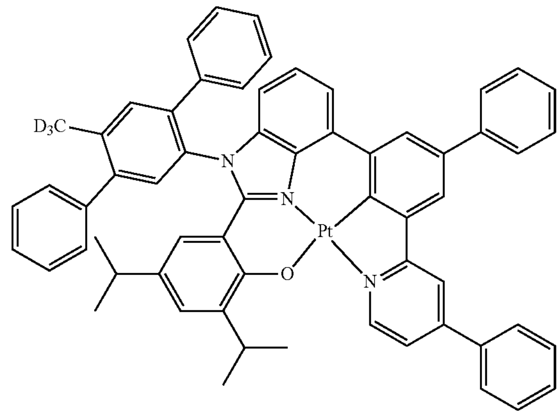
4-1340
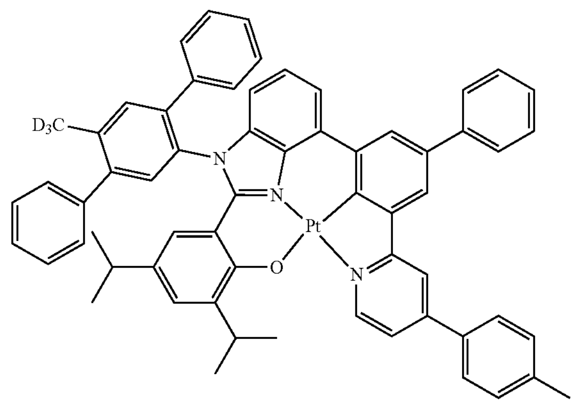
4-1341
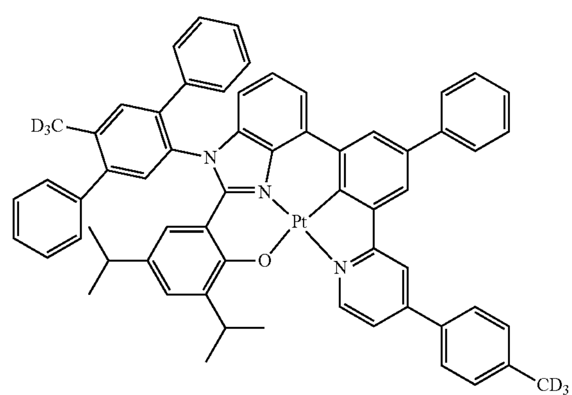

-continued
4-1342
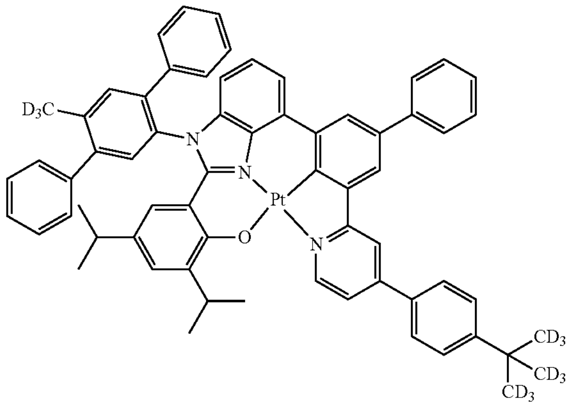
4-1343
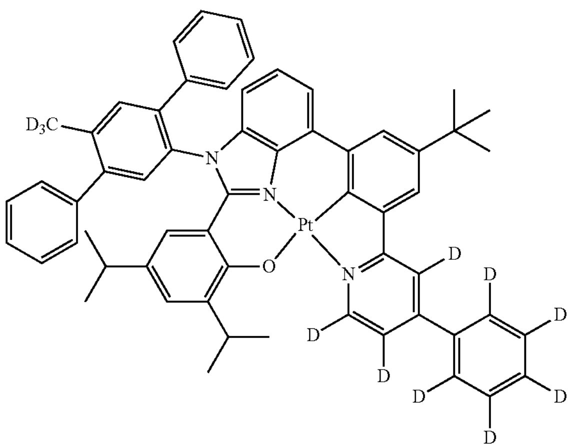
4-1344
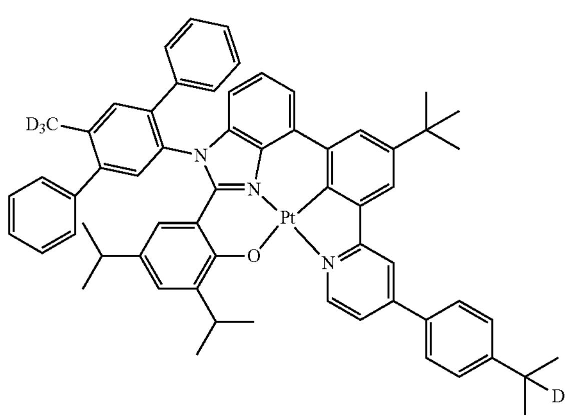
-continued
4-1345
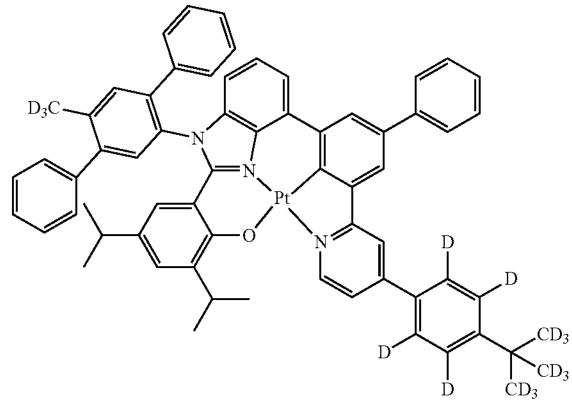
4-1346
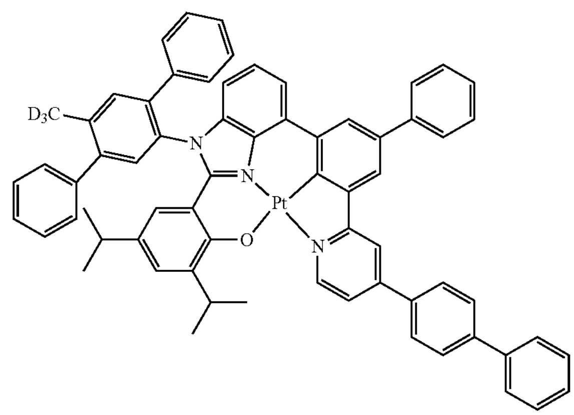
4-1347
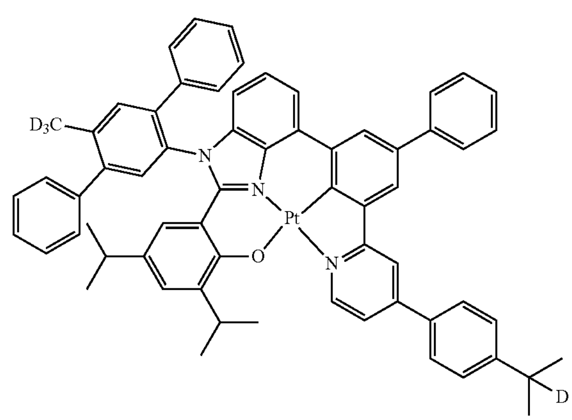

-continued
4-1348
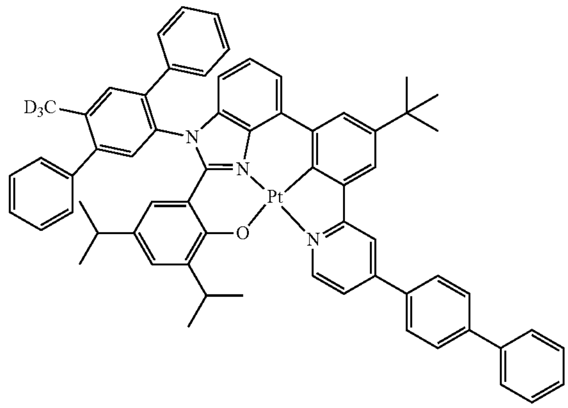
4-1349
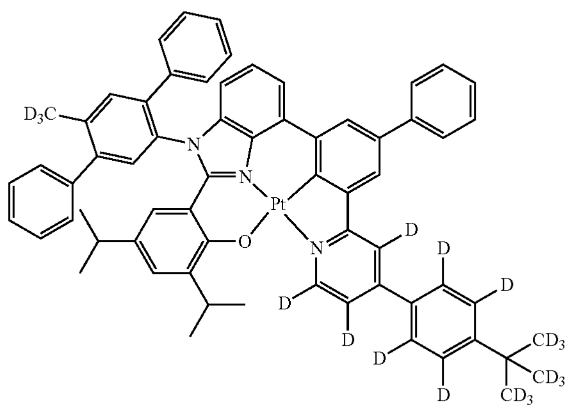
4-1350
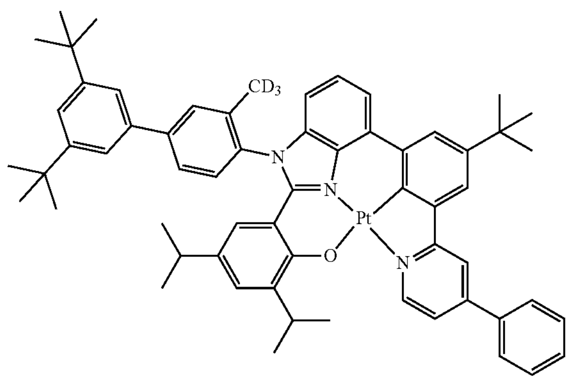
4-1351
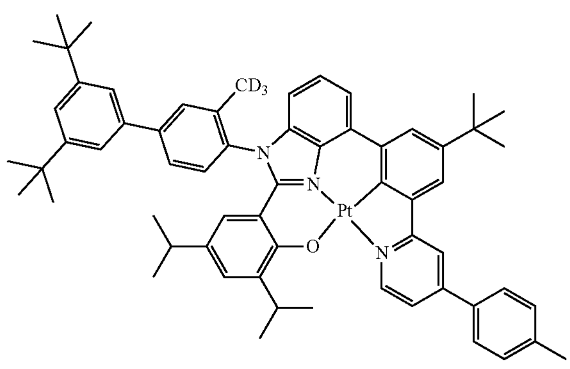
-continued
4-1352
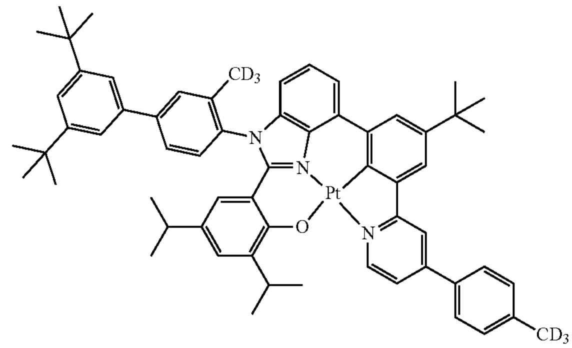
4-1353
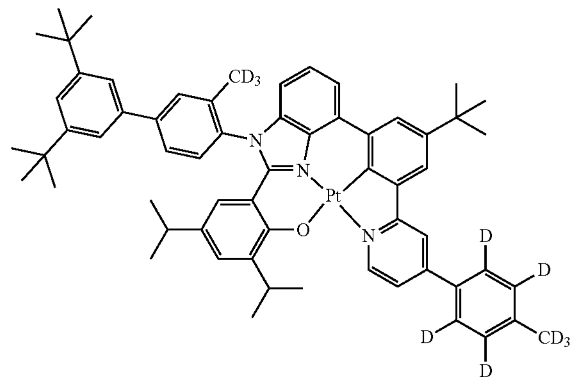
4-1354
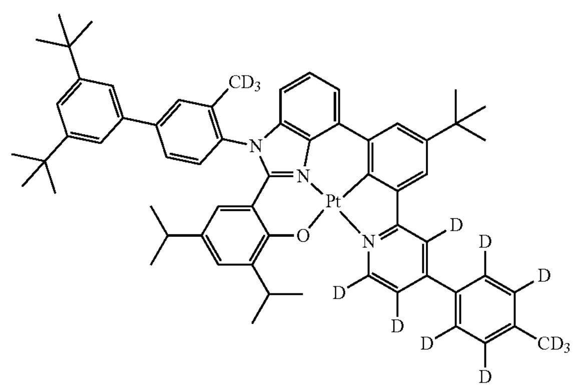
4-1355
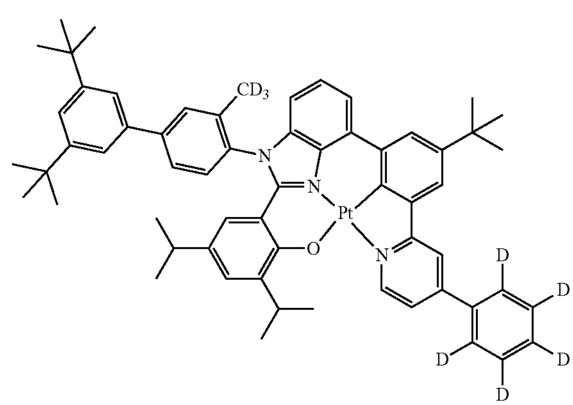

-continued
4-1356
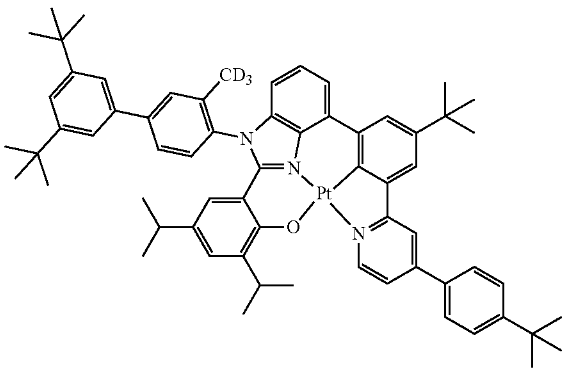
4-1357
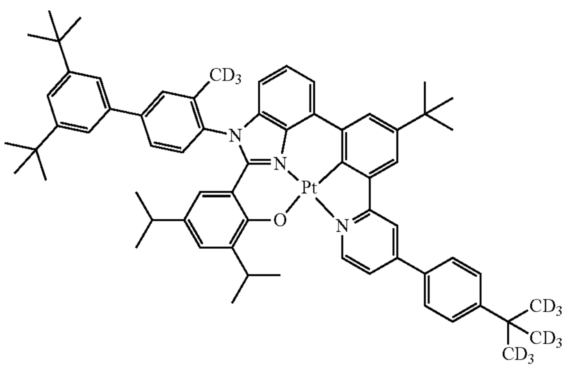
4-1358
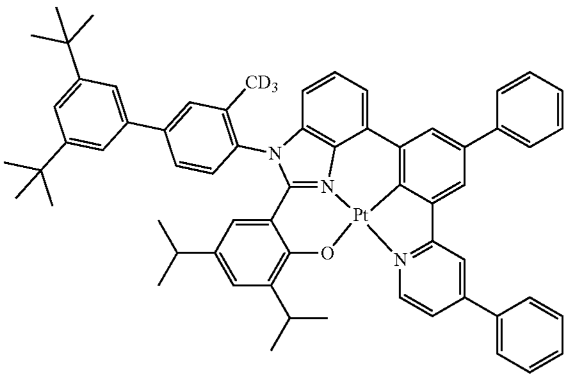
4-1359
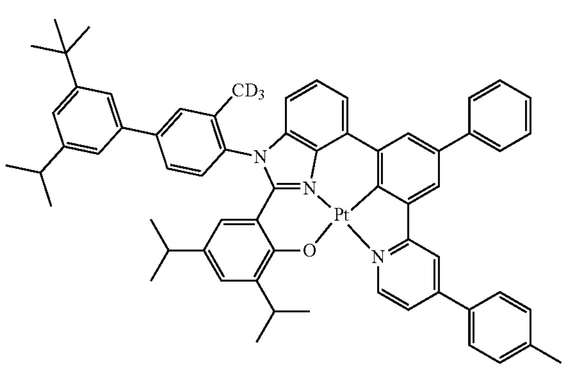
-continued
4-1360
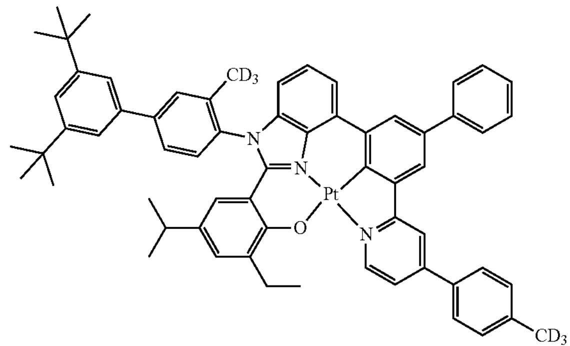
4-1361
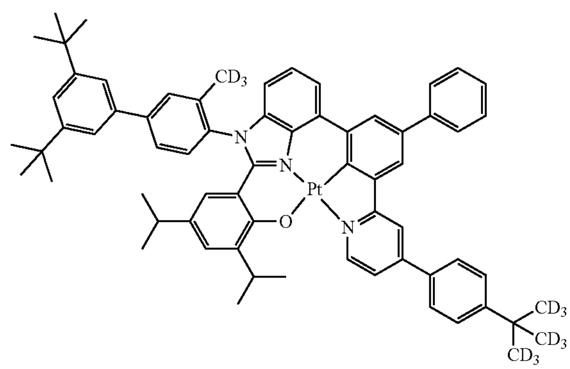
4-1362
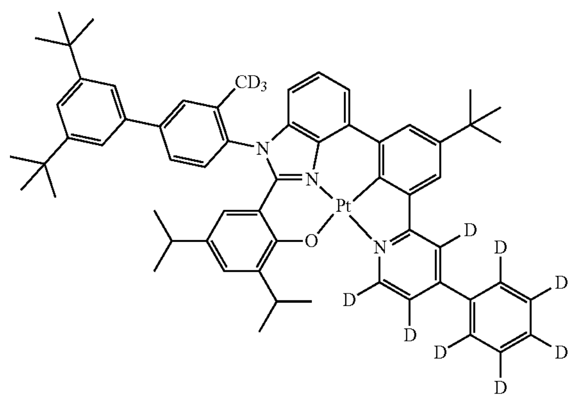
4-1363
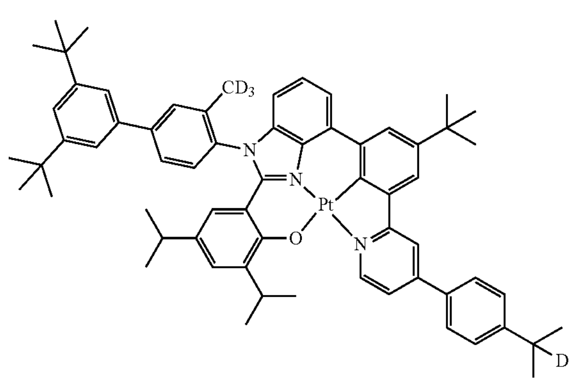

4-1364
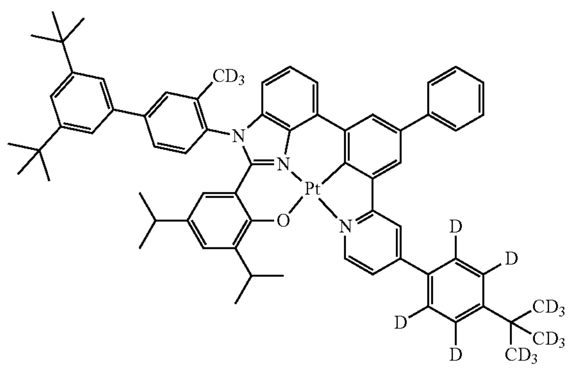
4-1365
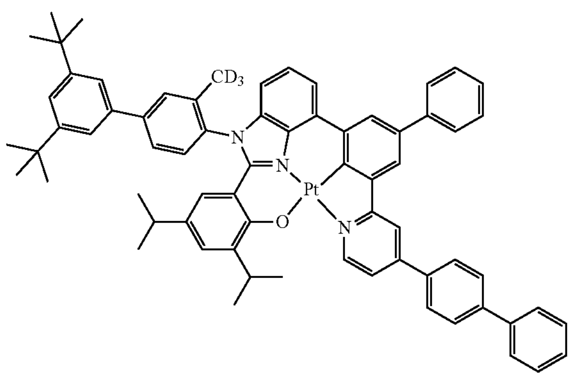
4-1366
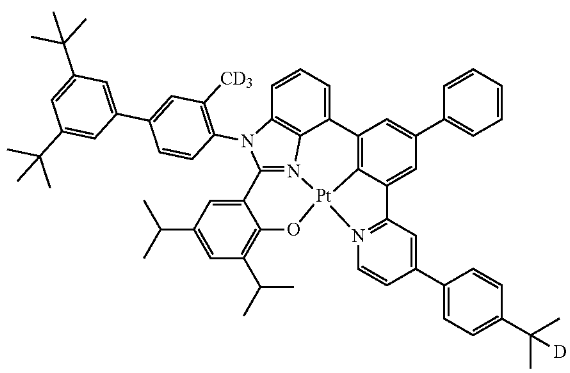
4-1367
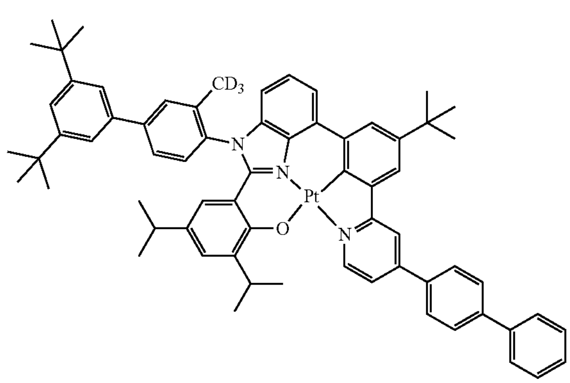
4-1368
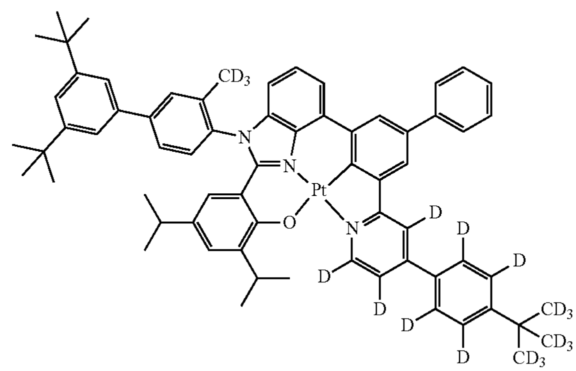
4-1369
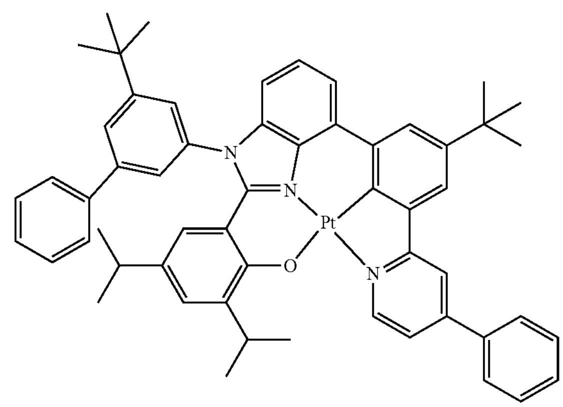
4-1370
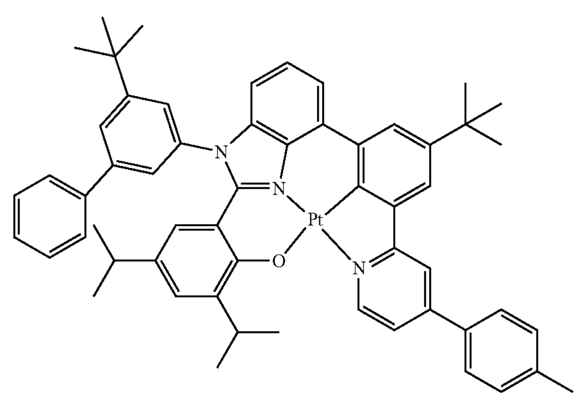
4-1371
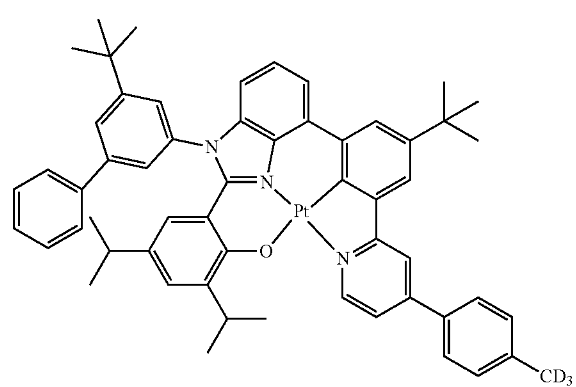

-continued
4-1372
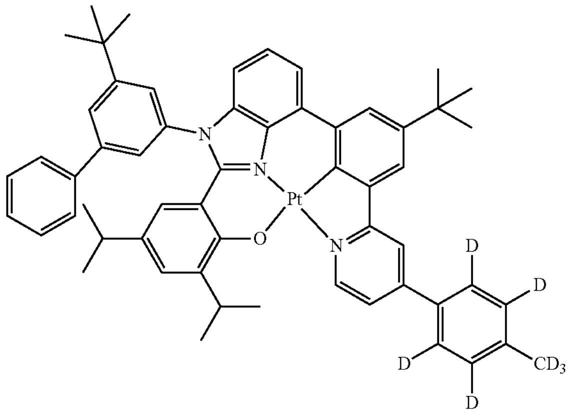
4-1373
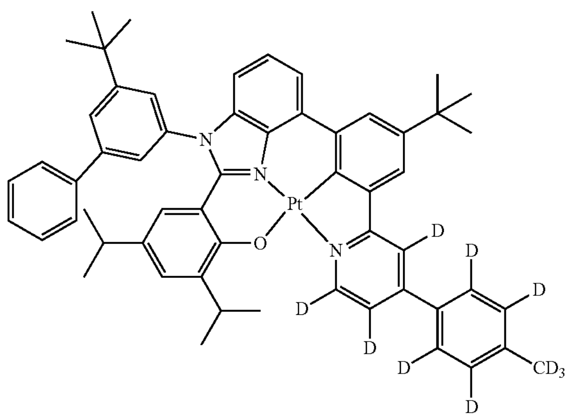
4-1374
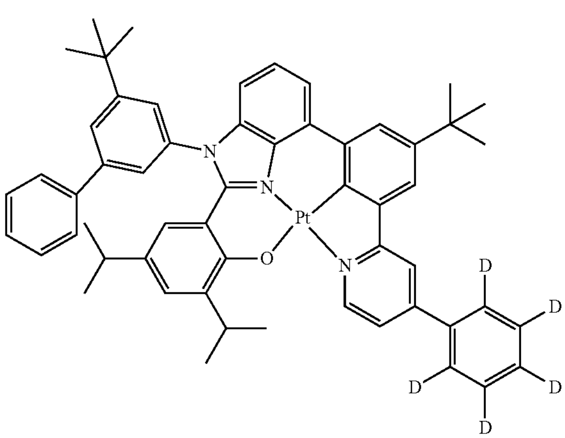
-continued
4-1375
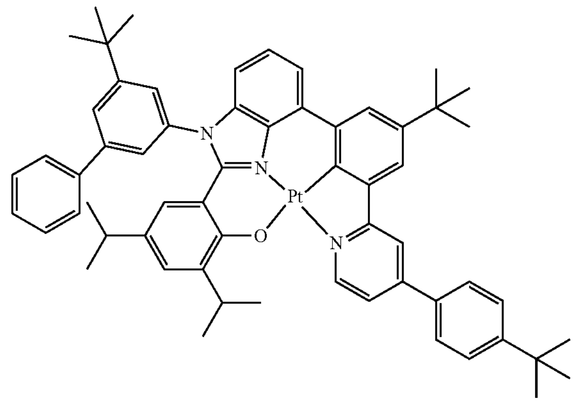
4-1376
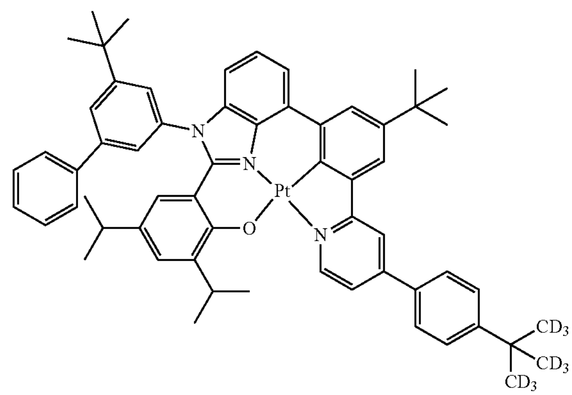
4-1377
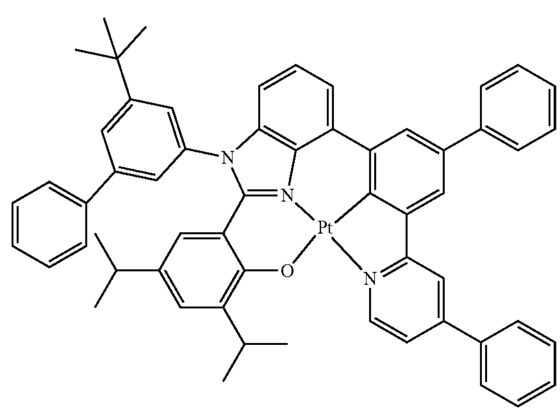

-continued
4-1278
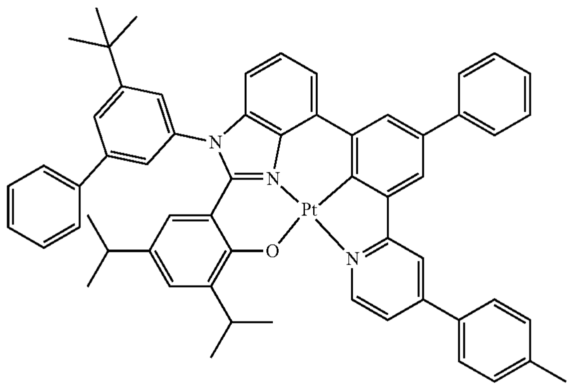
4-1379
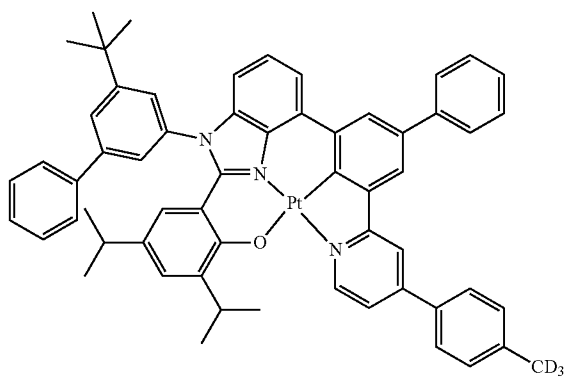
4-1380
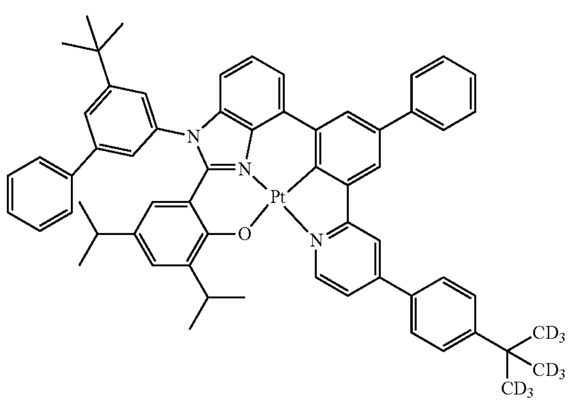
-continued
4-1381
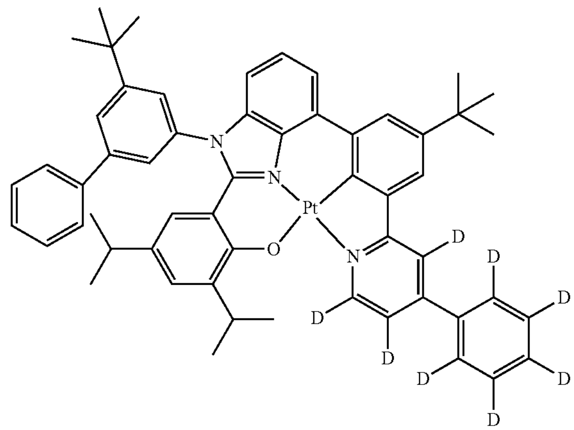
4-1382
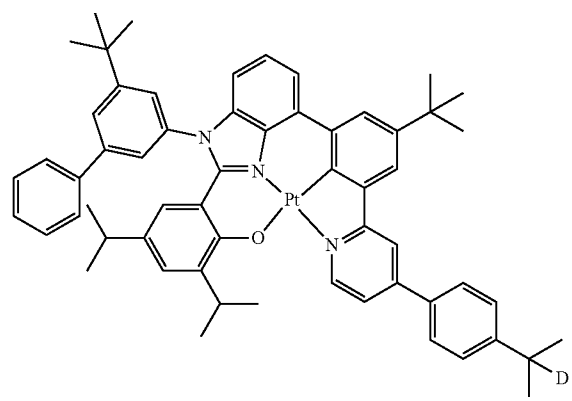
4-1383
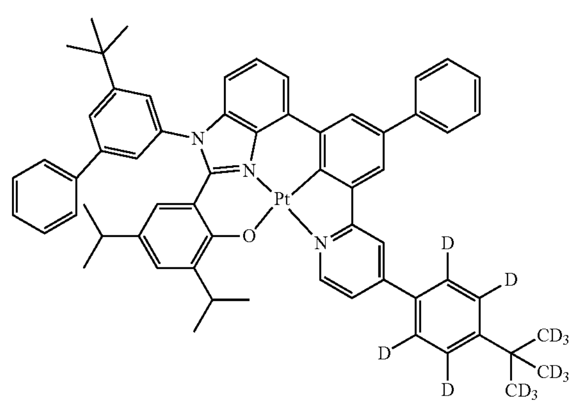

-continued
4-1384
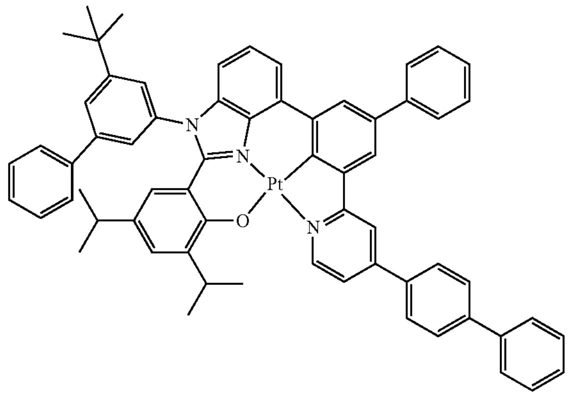
4-1385
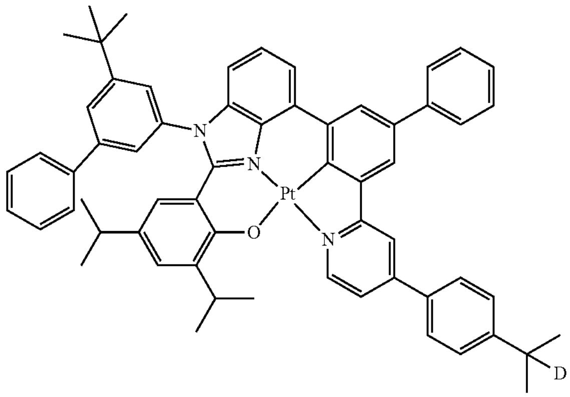
4-1386
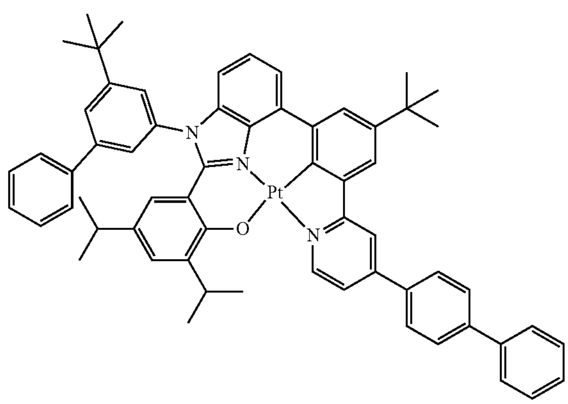
-continued
4-1387
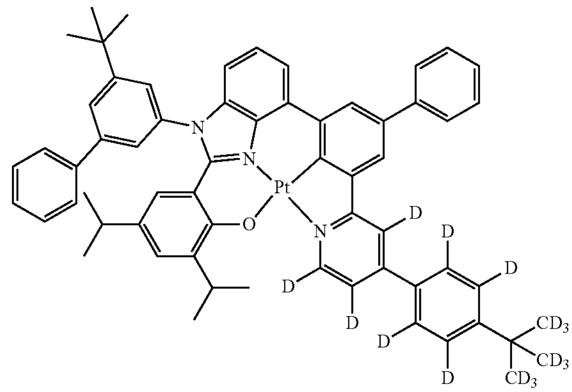
4-1388
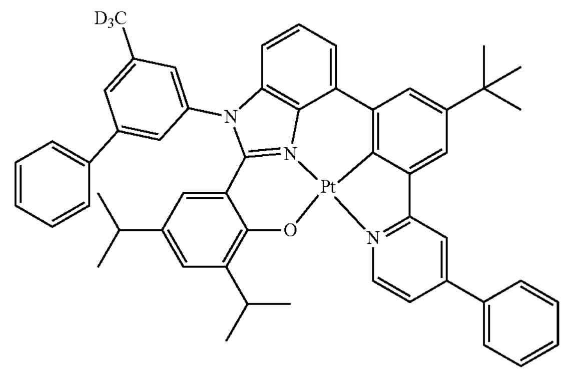
4-1389
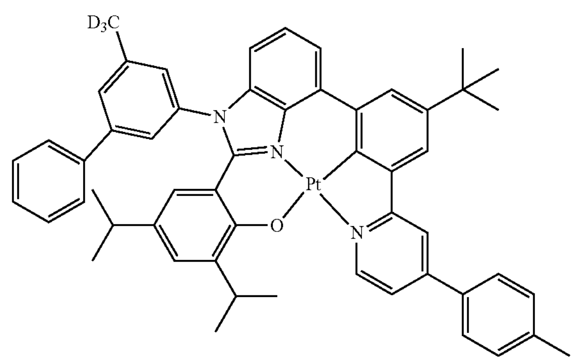
4-1390
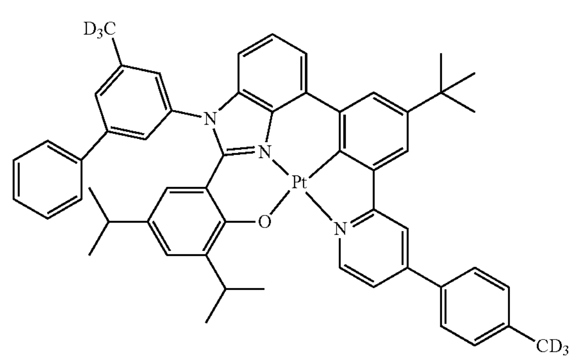

-continued
4-1391
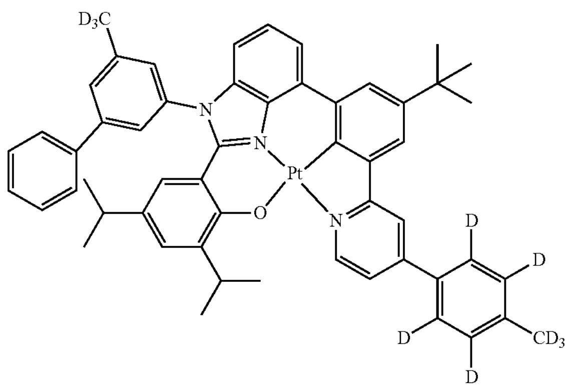
4-1392
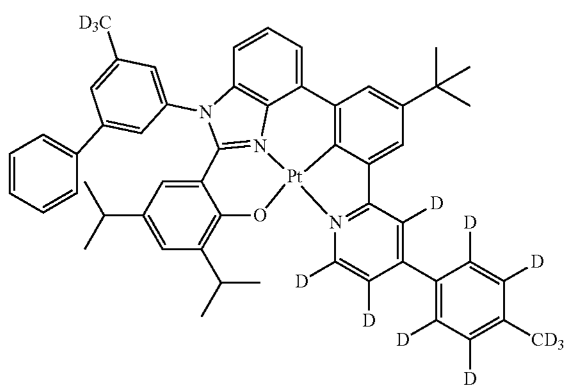
4-1393
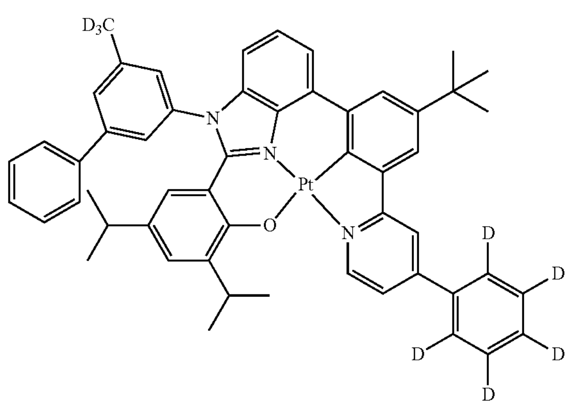
4-1394
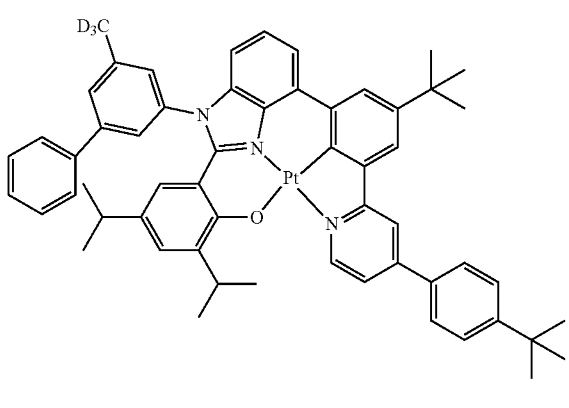
-continued
4-1395
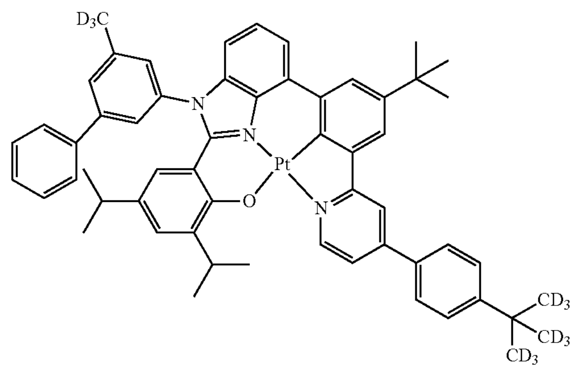
4-1396
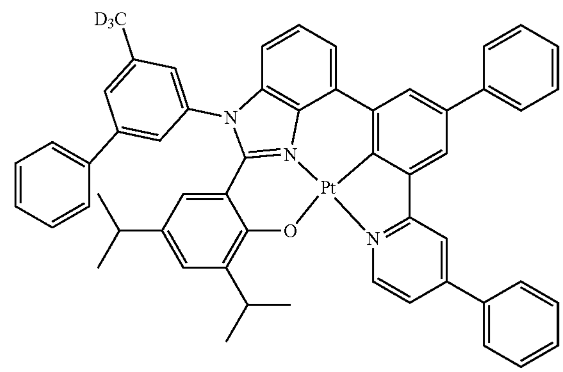
4-1397
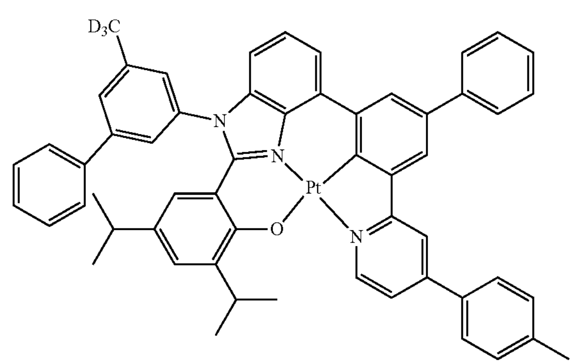
4-1398
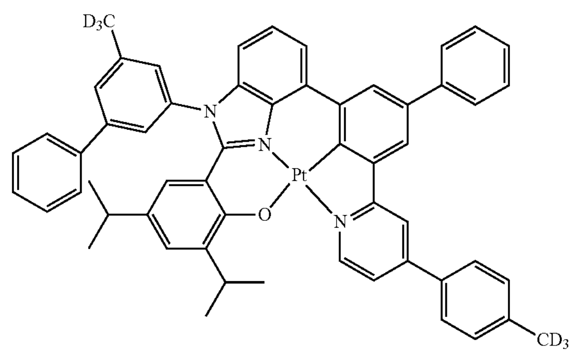

-continued
4-1399
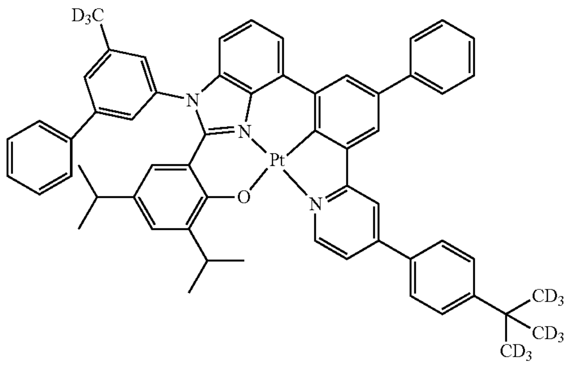
4-1400
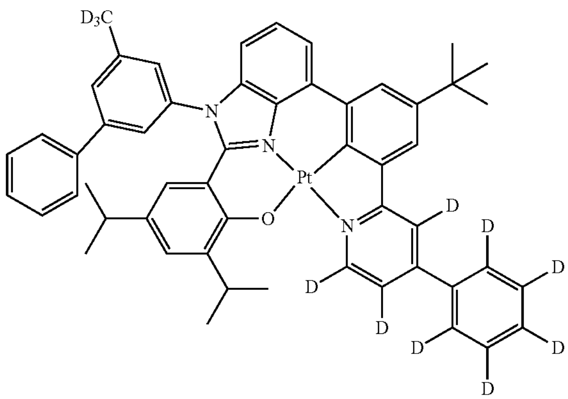
4-1401
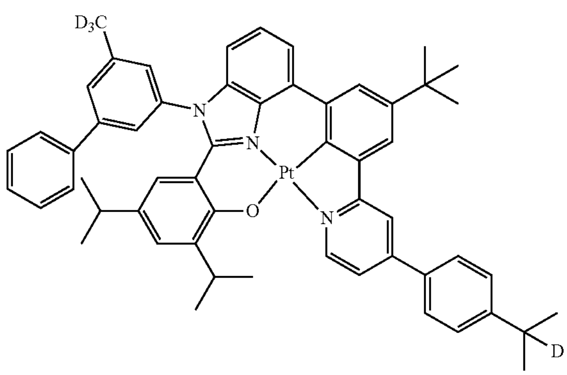
4-1402
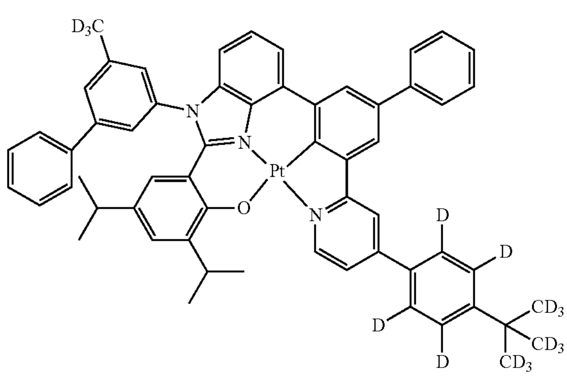
-continued
4-1403
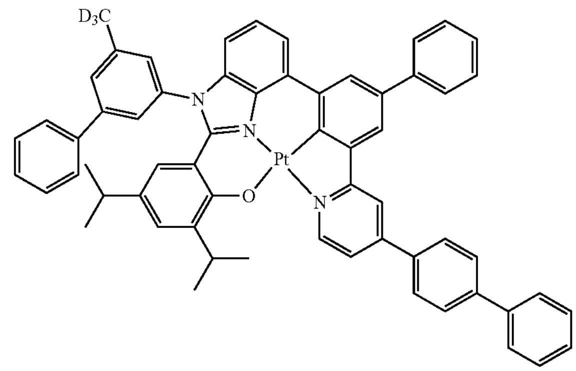
4-1404
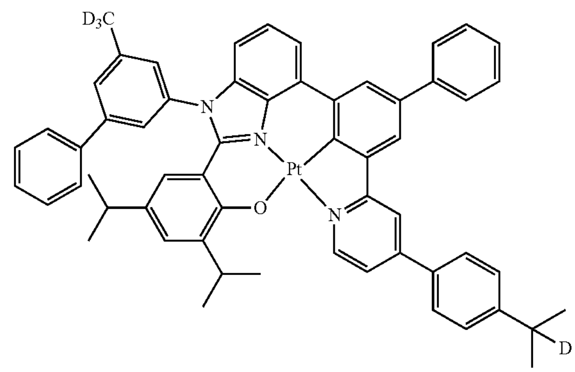
4-1405
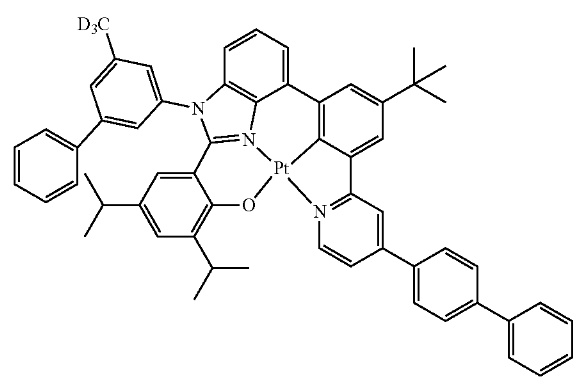
4-1406
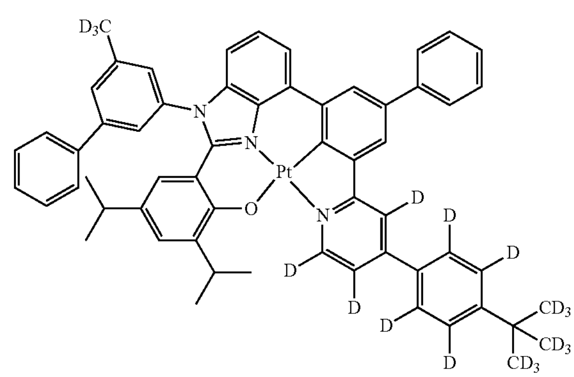

-continued
4-1407
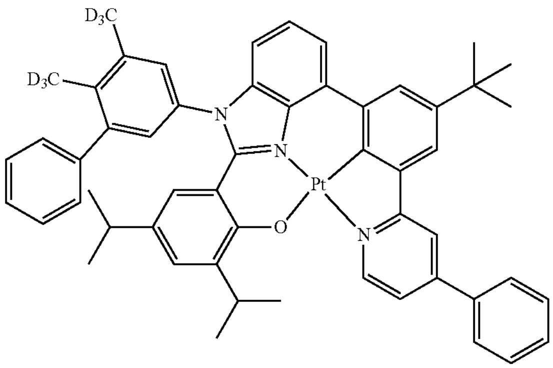
4-1408
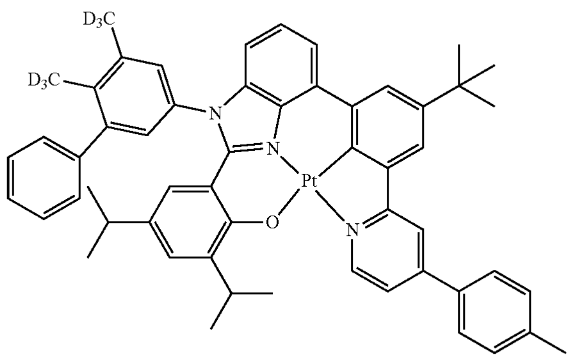
4-1409
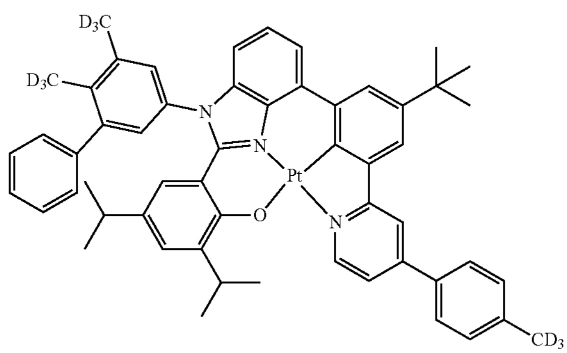
4-1410
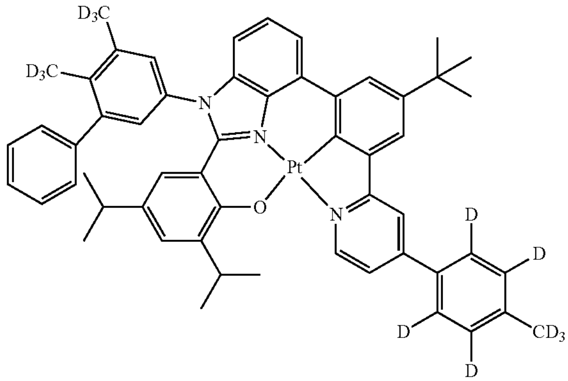
-continued
4-1411
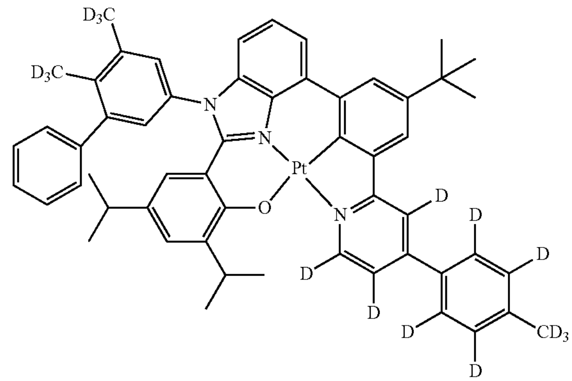
4-1412
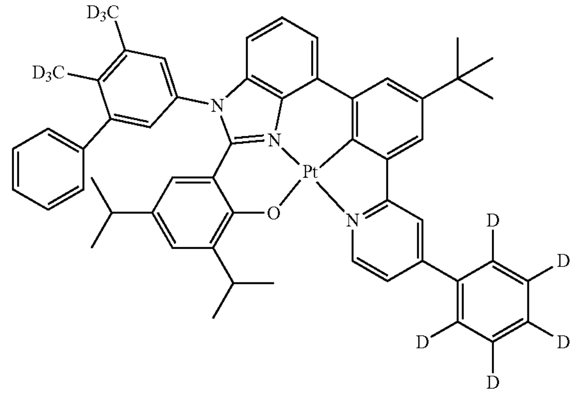
4-1413
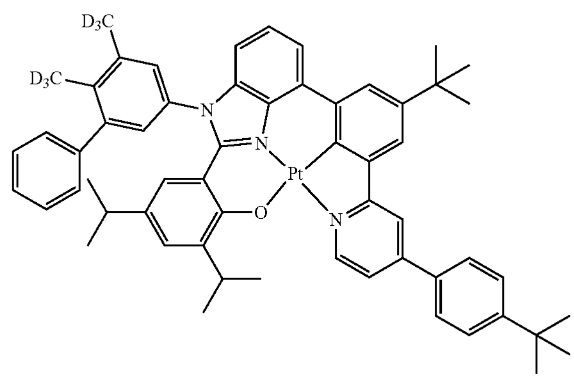
4-1414
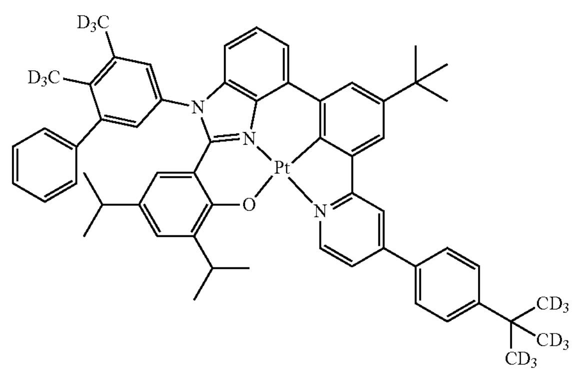

-continued
4-1415
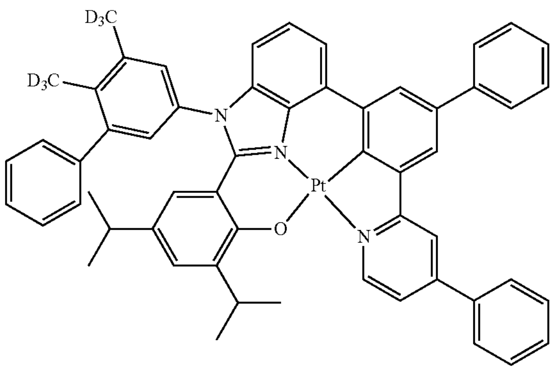
4-1416
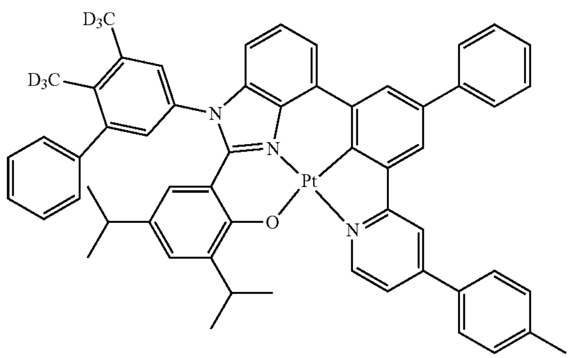
4-1417
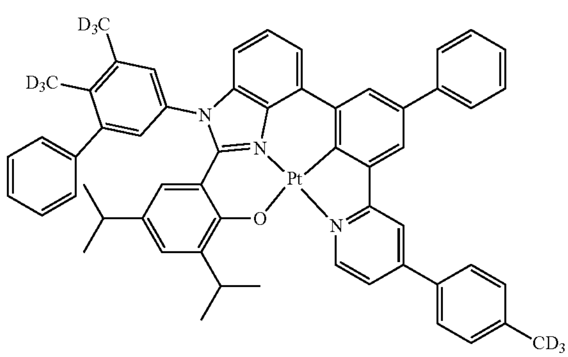
4-1418
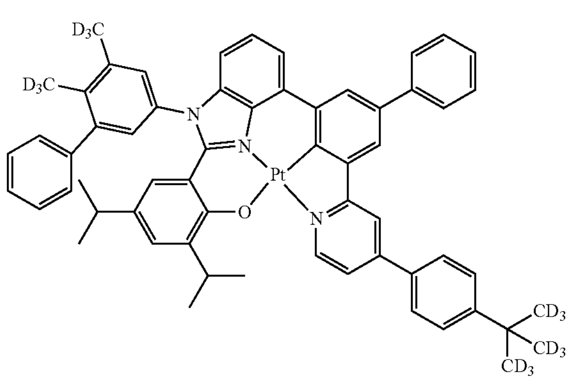
-continued
4-1419
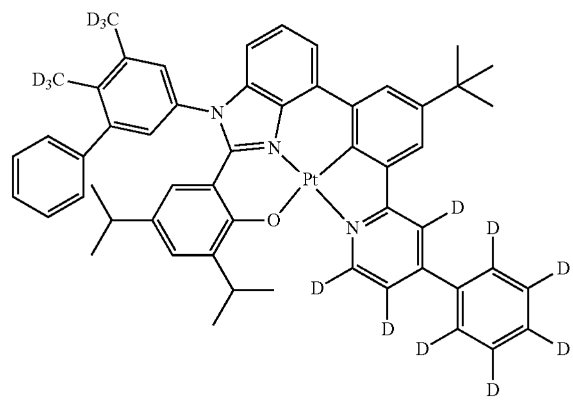
4-1420
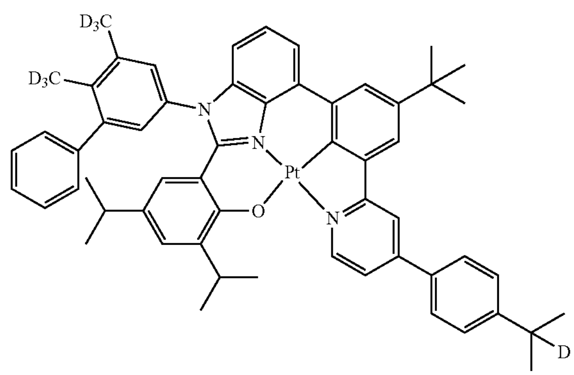
1-1421
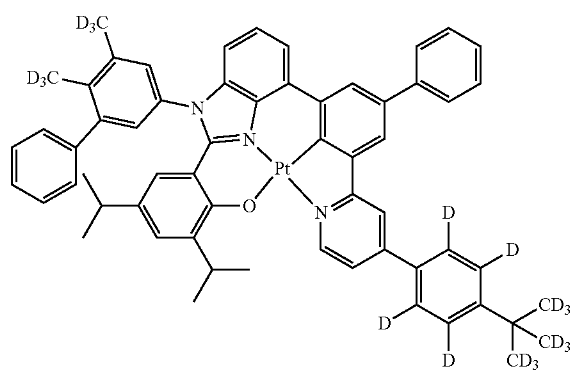
4-1422
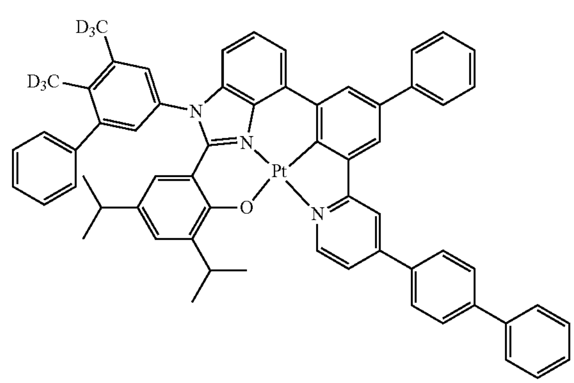

-continued
4-1423
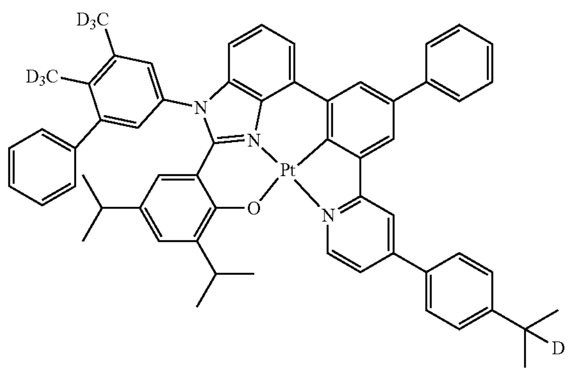
4-1424
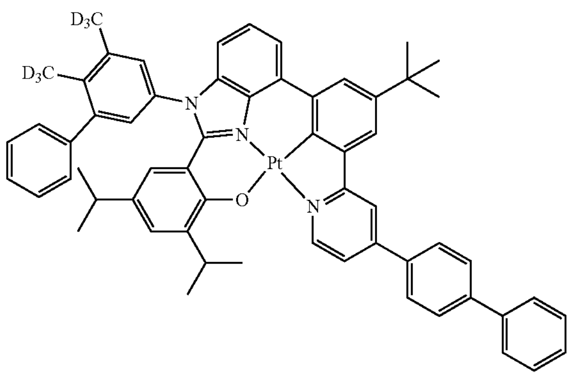
4-1425
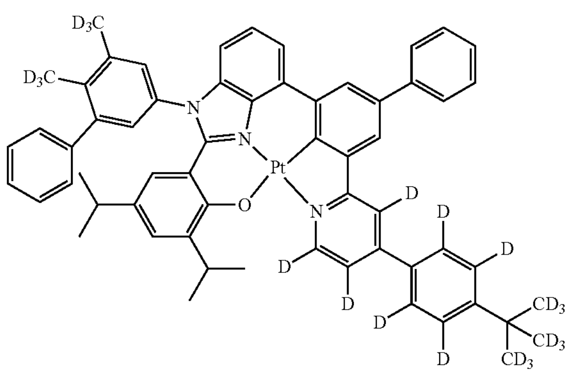
4-1426
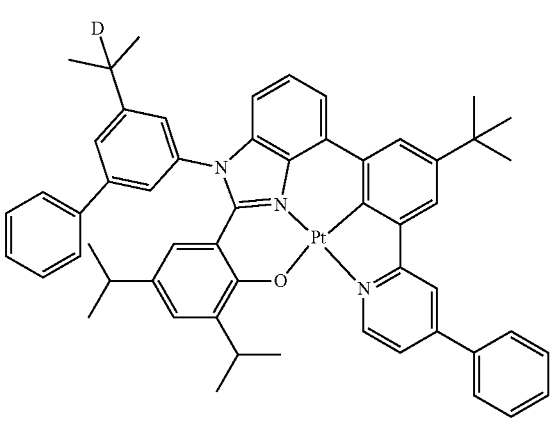
-continued
4-1427
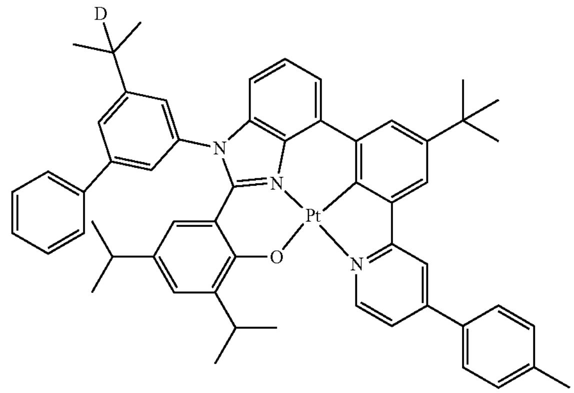
4-1428
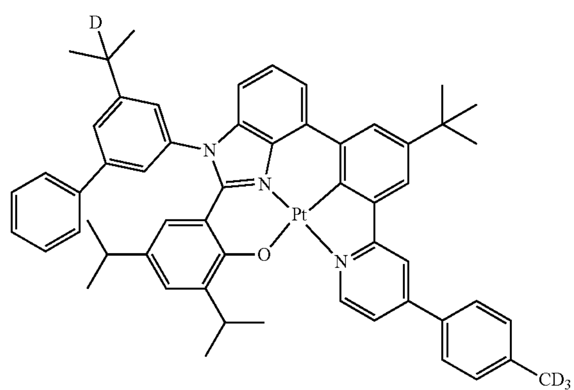
4-1429
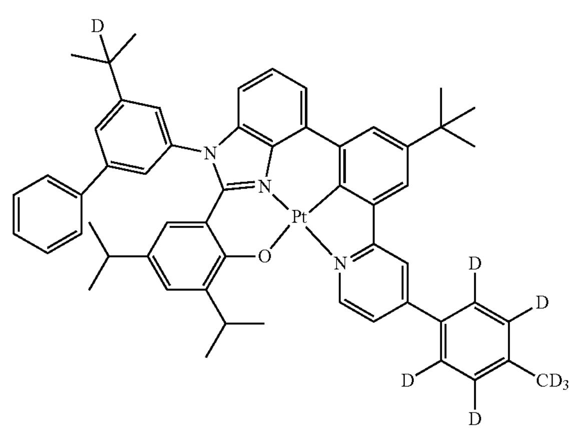

4-1430
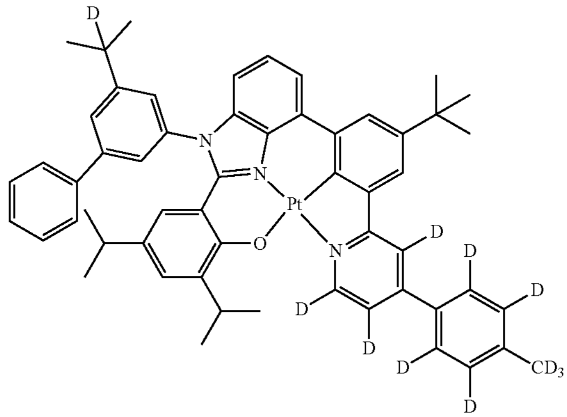
4-1431
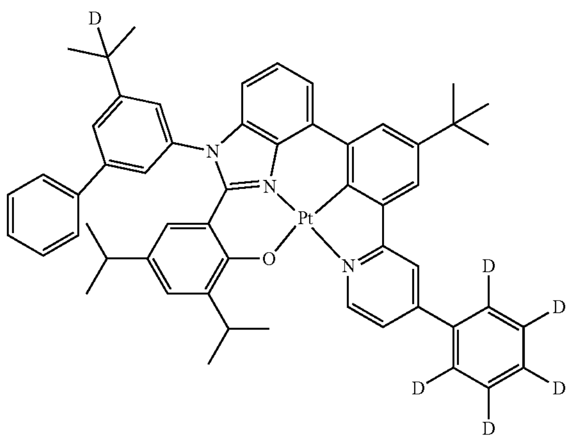
4-1432
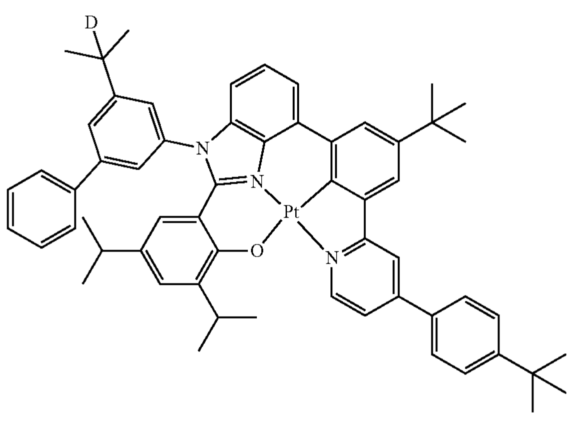
4-1433
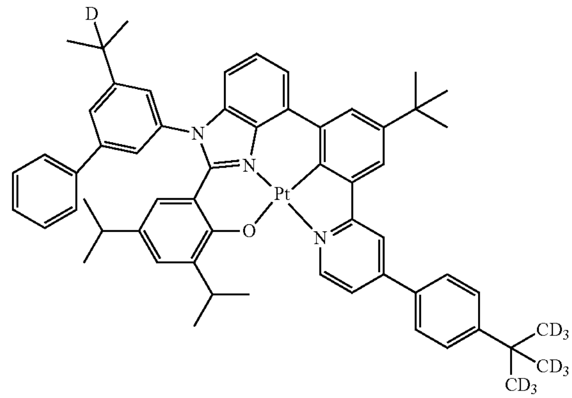
4-1434
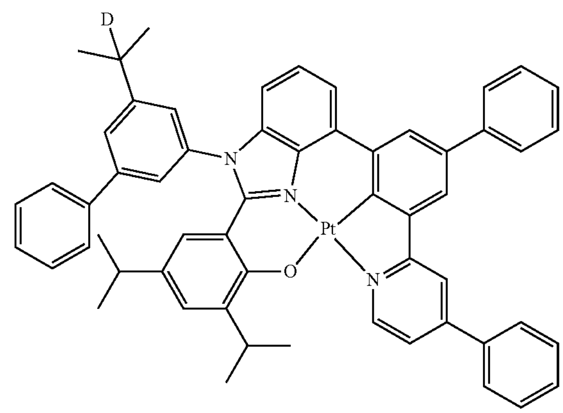
4-1435
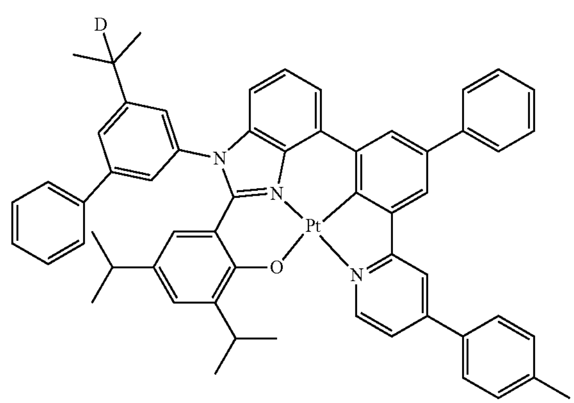

4-1436
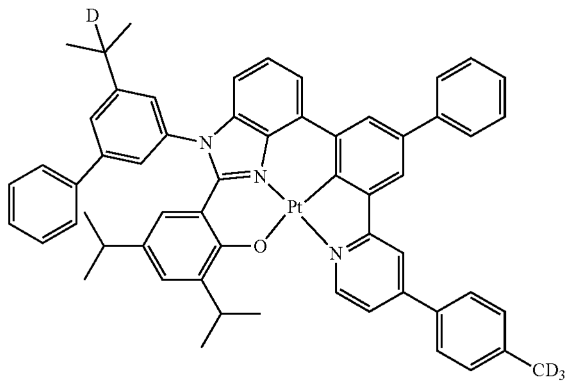
4-1437
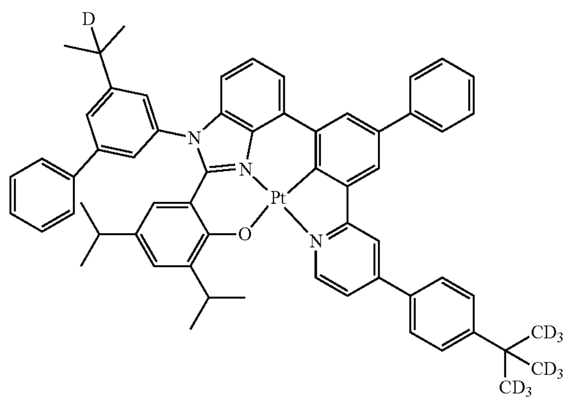
4-1438
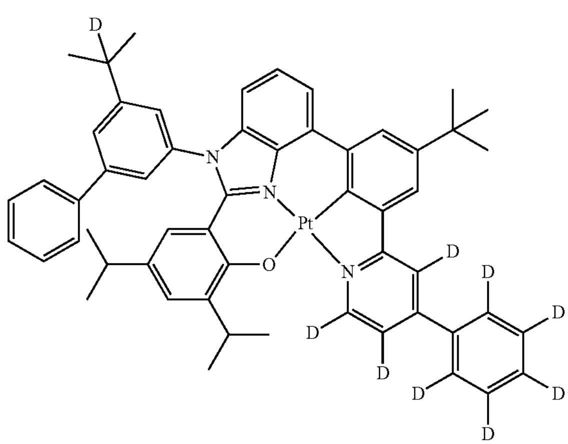
4-1439
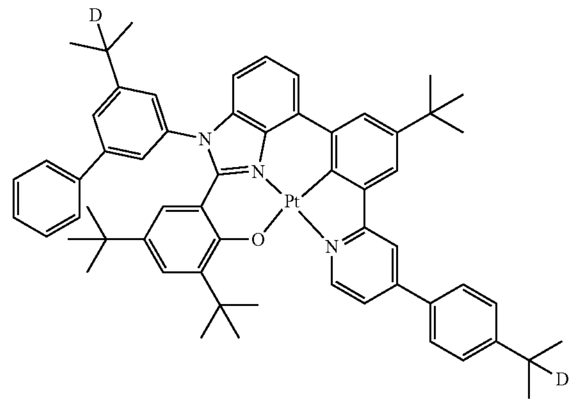
4-1440
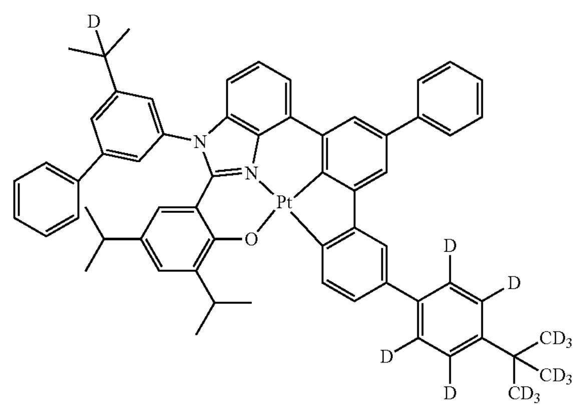
4-1441
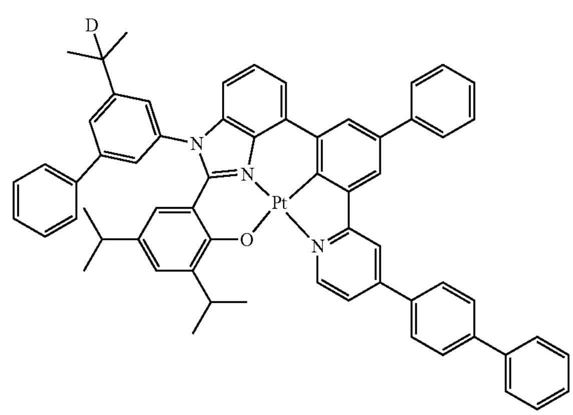

-continued
4-1442
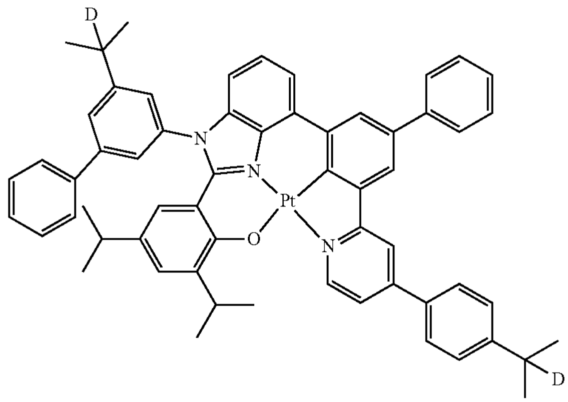
4-1443
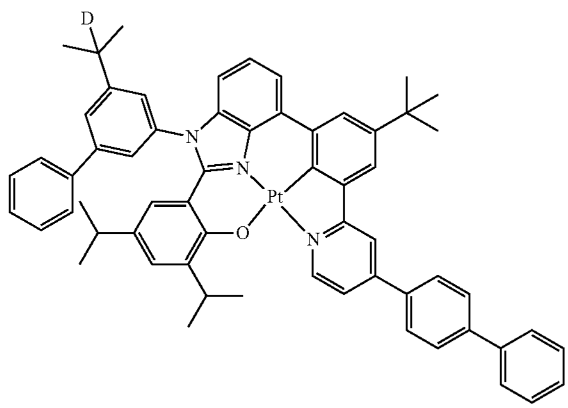
4-1444
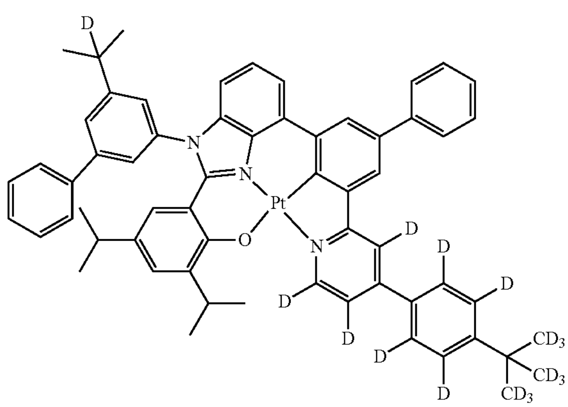
-continued
4-1445
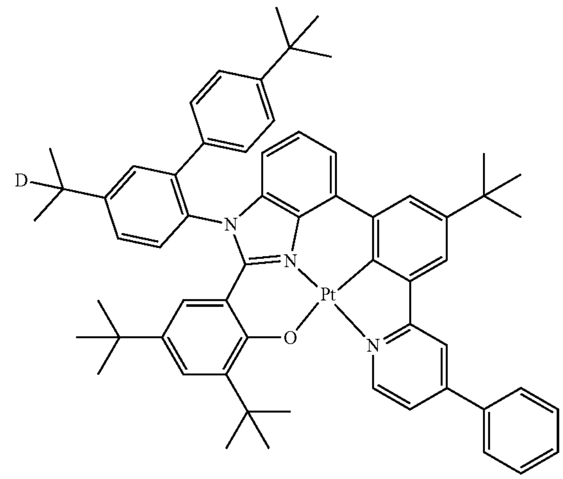
4-1446
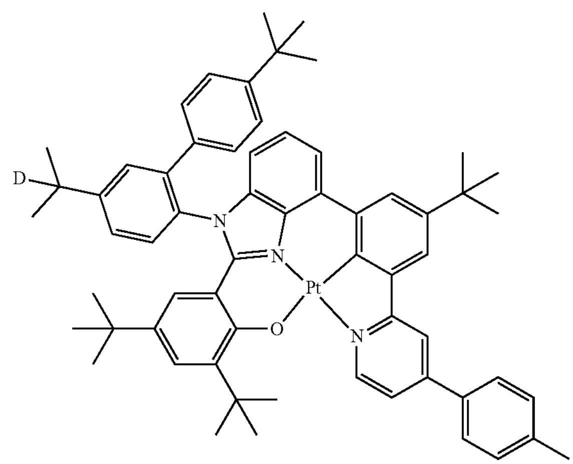
4-1447
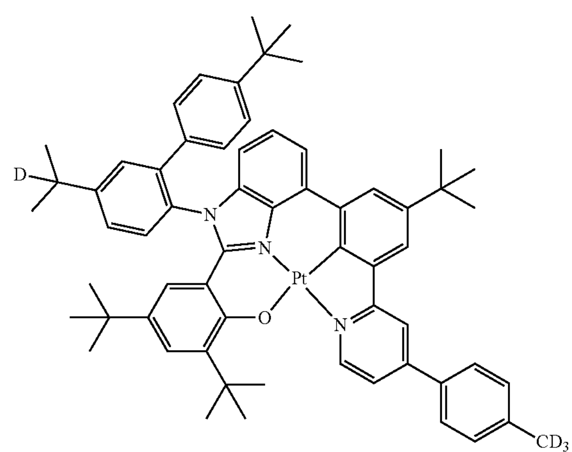

-continued
4-1448
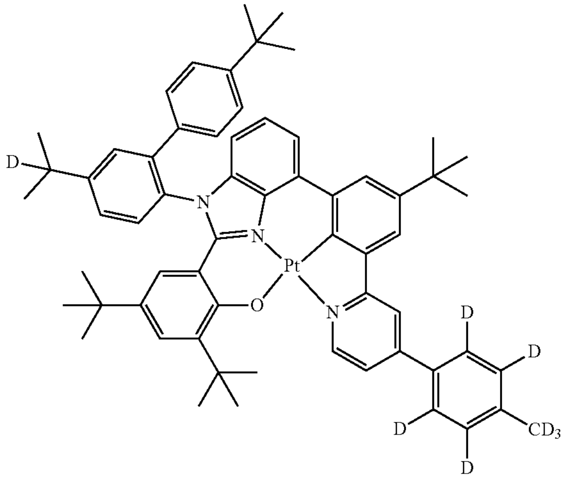
4-1449
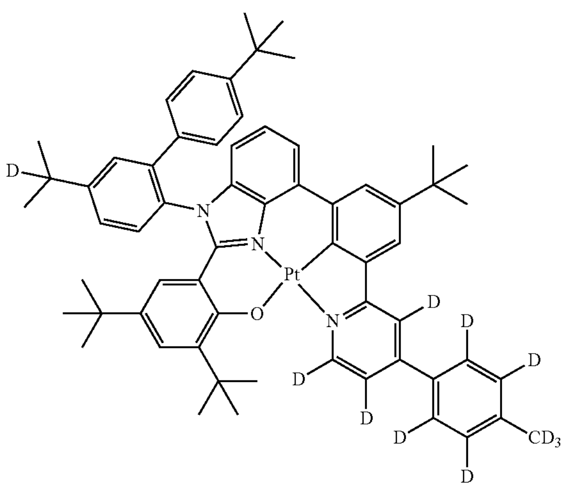
4-1450
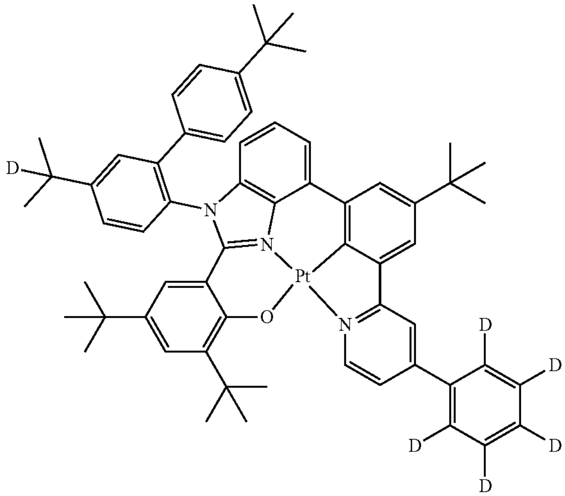
-continued
4-1451
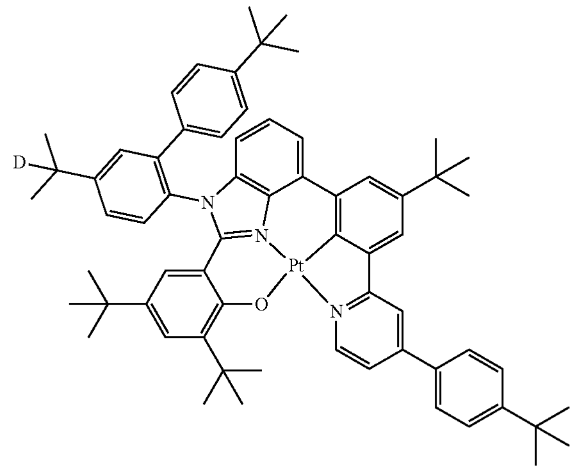
4-1452
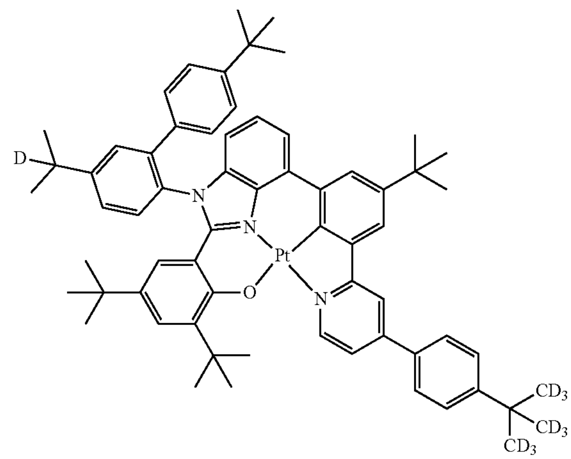
4-1453
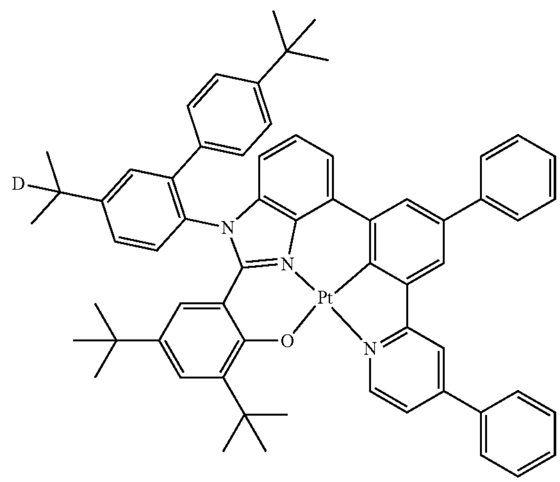

-continued
4-1454
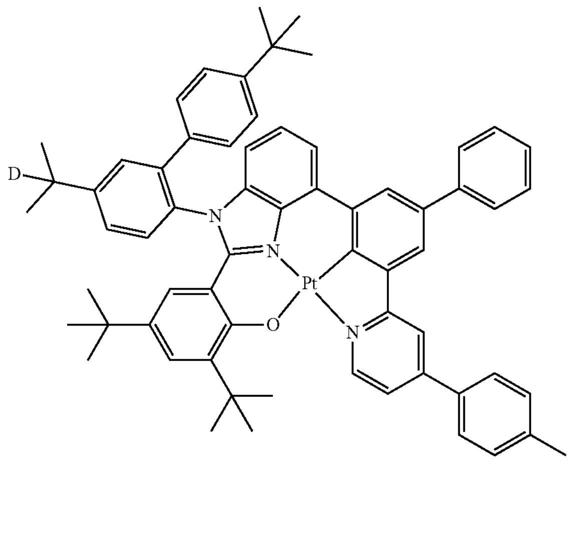
4-1455
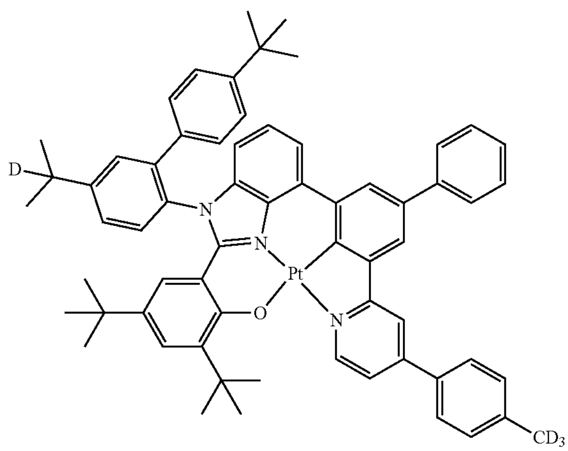
4-1456
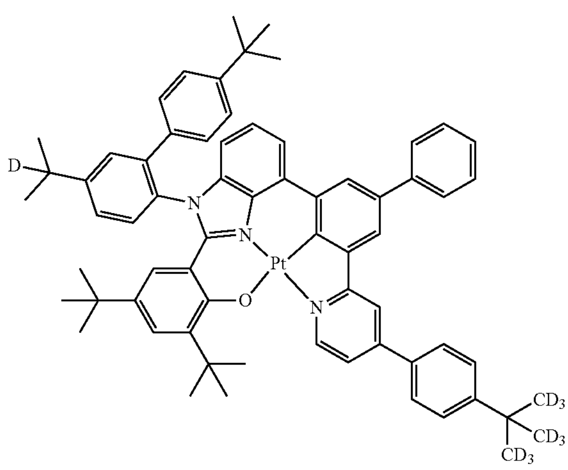
-continued
4-1457
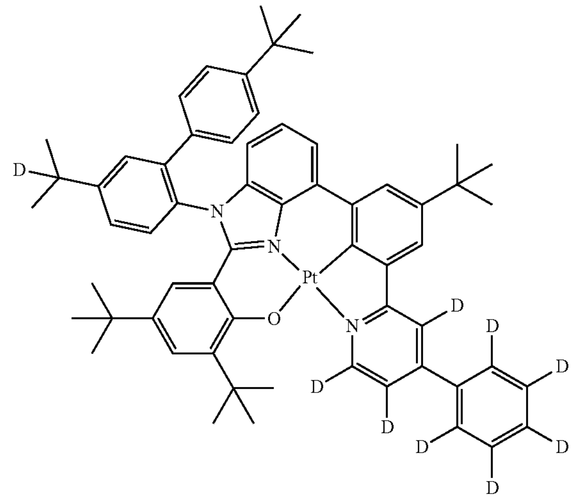
4-1458
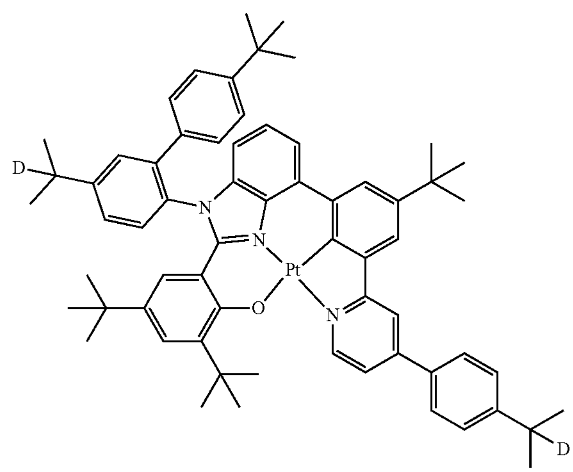
4-1459
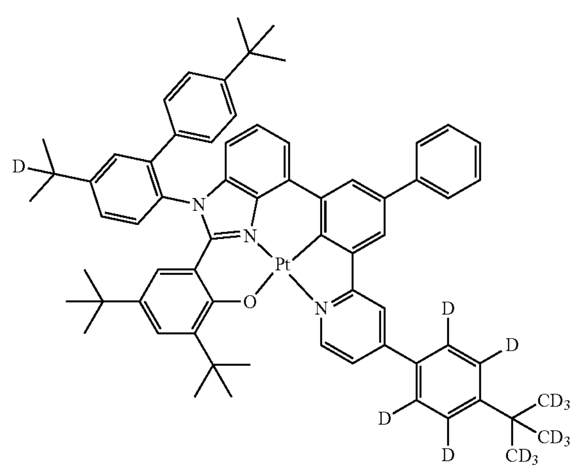

-continued
4-1460
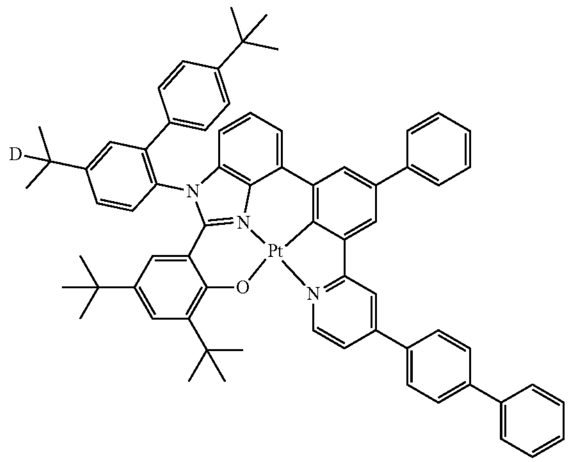
4-1461
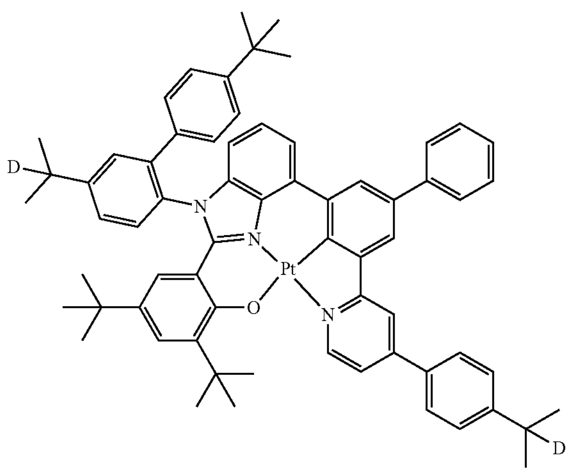
4-1462
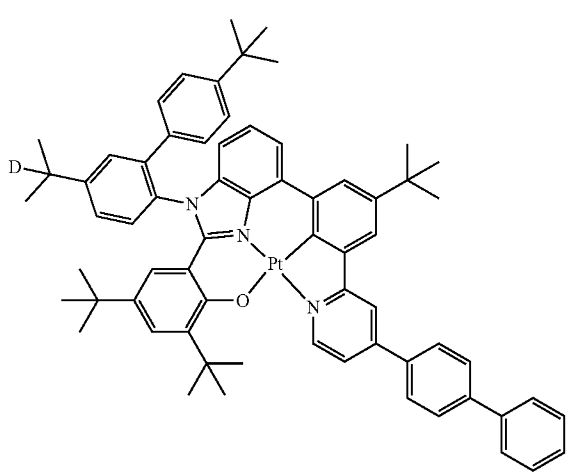
-continued
4-1463
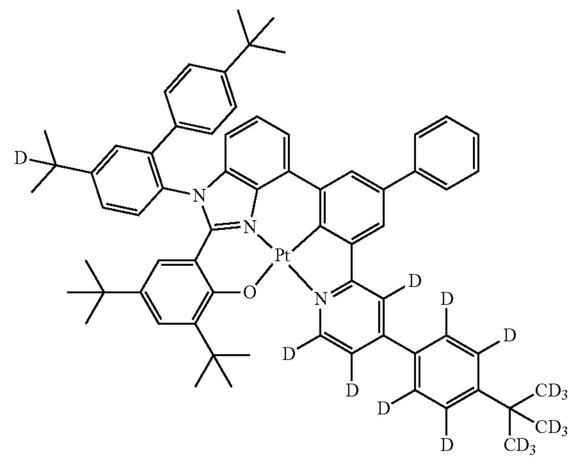
4-1464
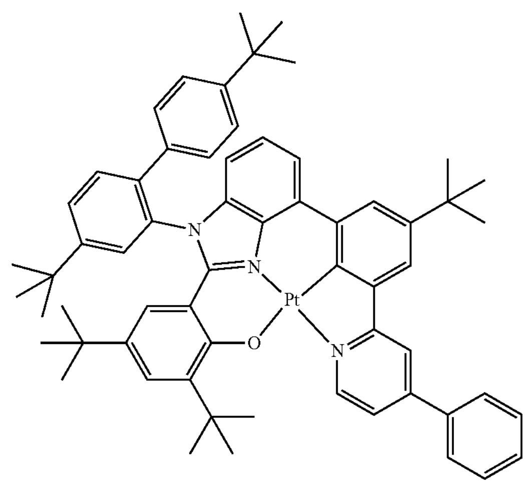
4-1465
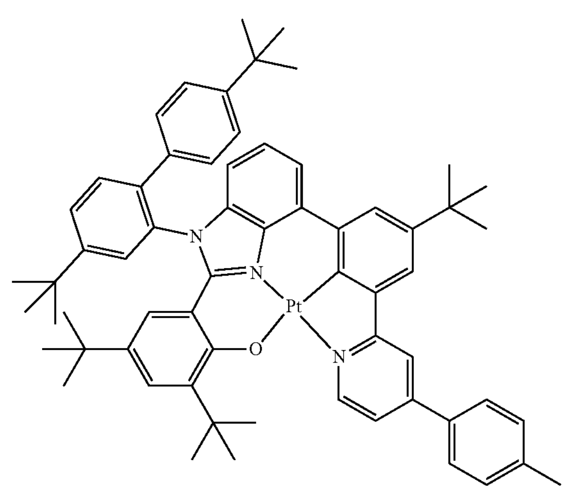

-continued
4-1466
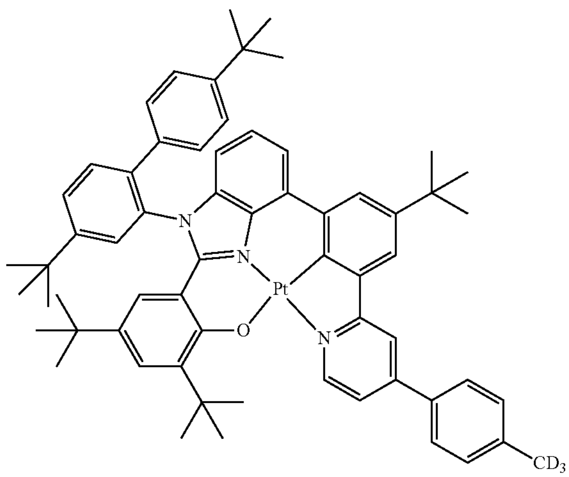
4-1467
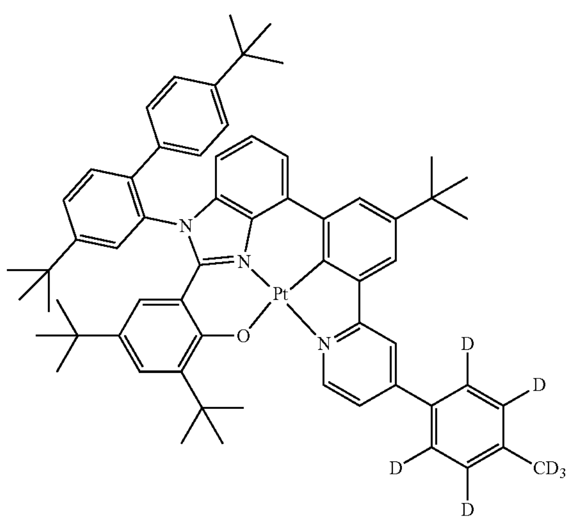
4-1468
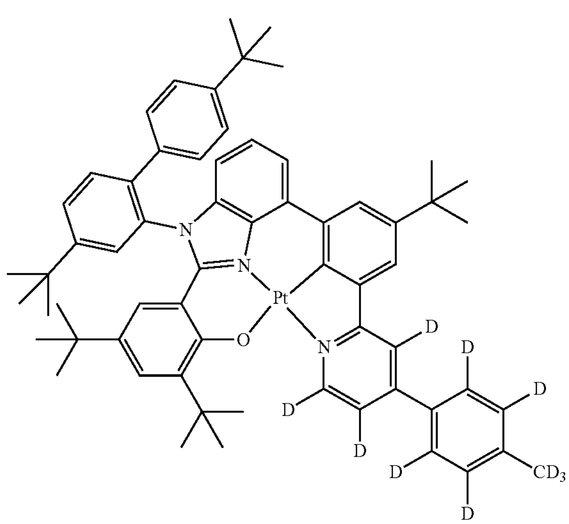
-continued
4-1469
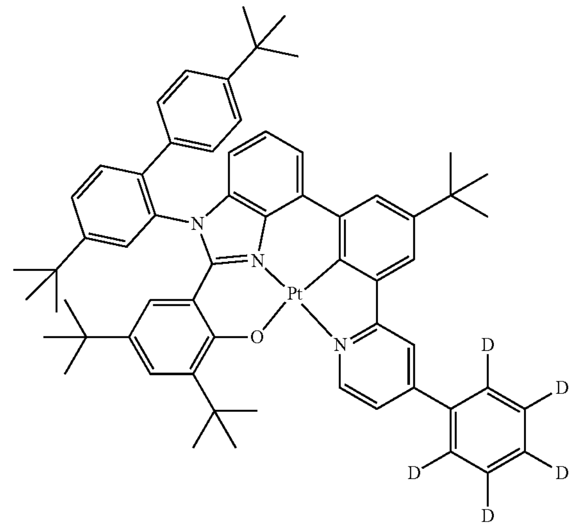
4-1470
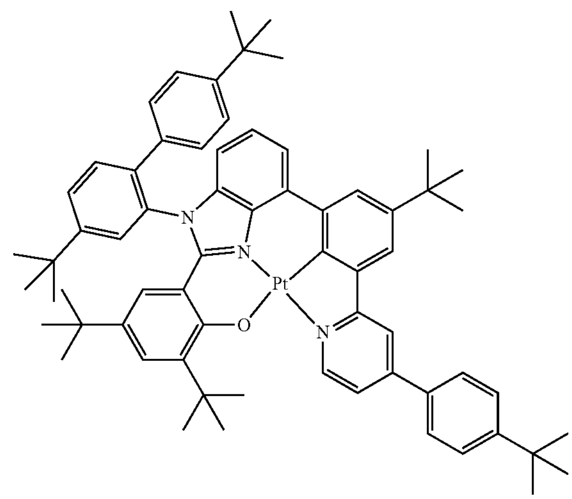
4-1471
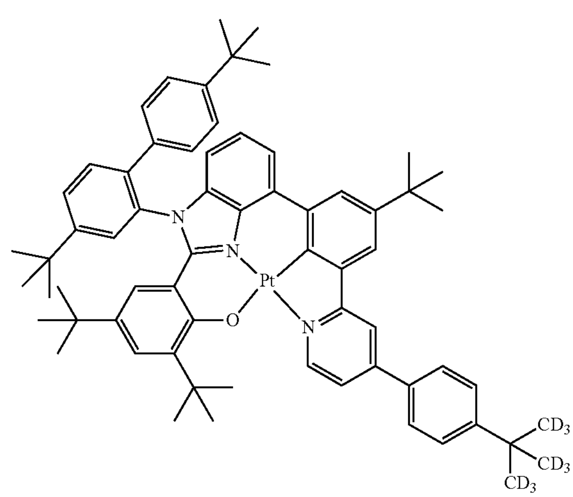

-continued
4-1472
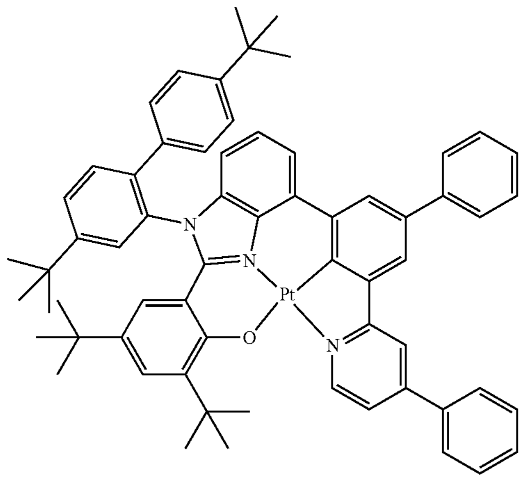
4-1473
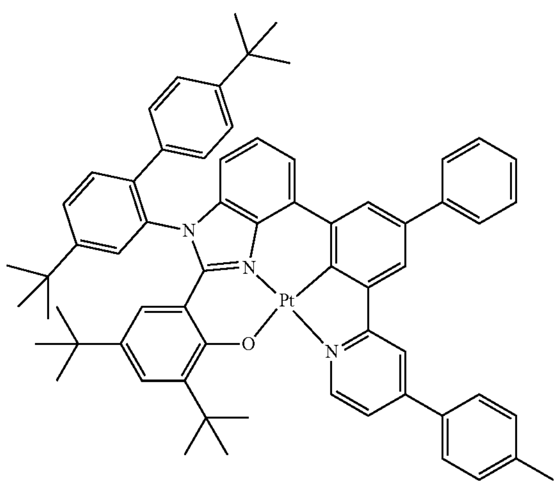
4-1474
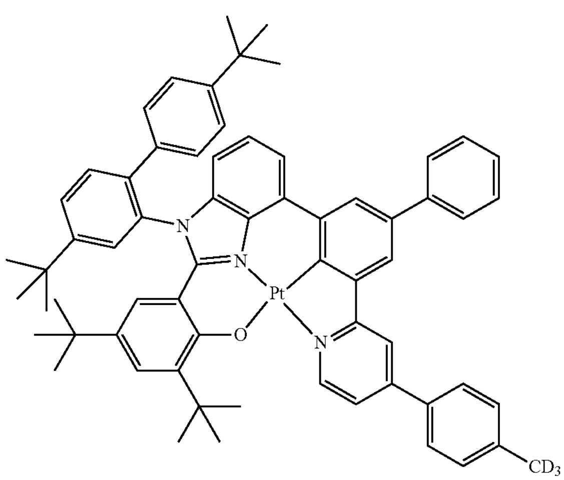
-continued
4-1475
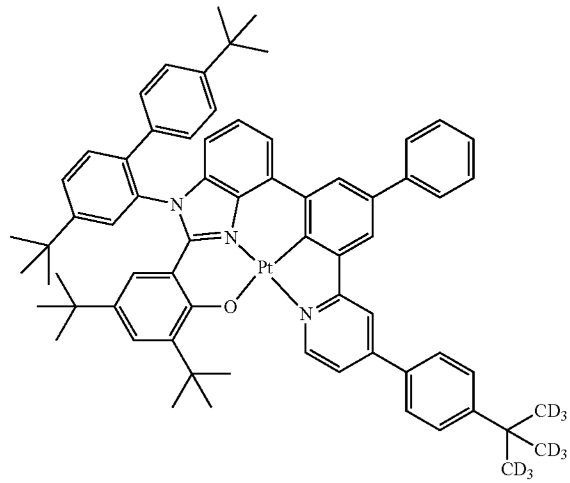
4-1476
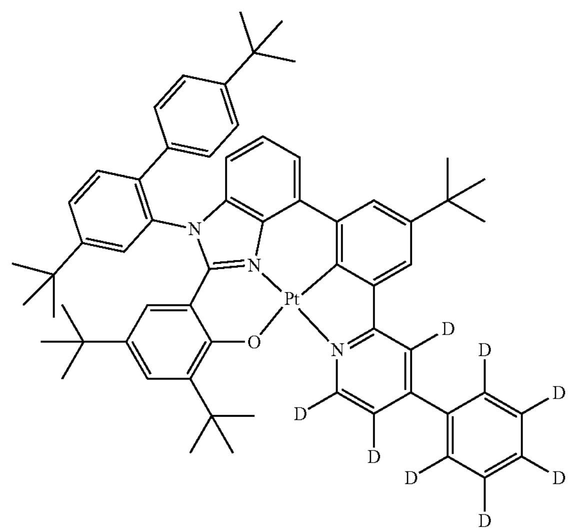
4-1477
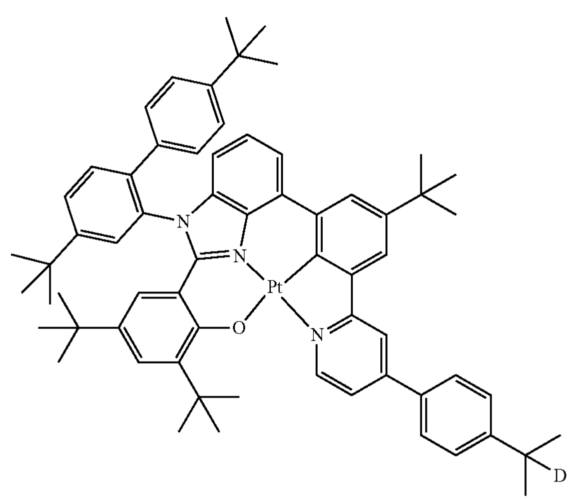

-continued
4-1478
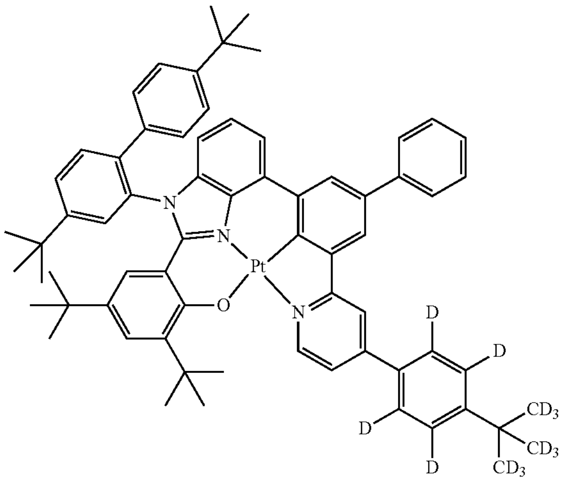
4-1479
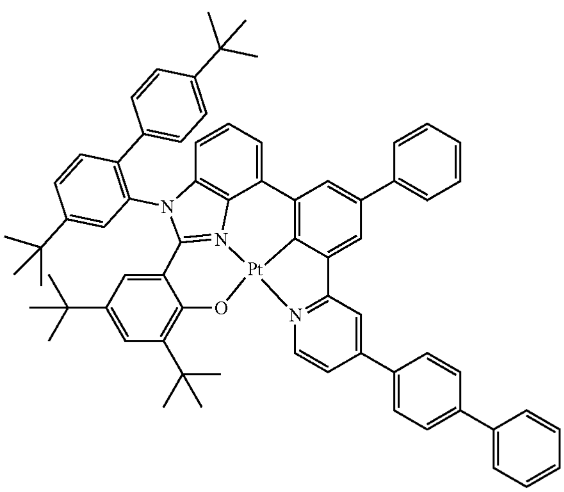
4-1480
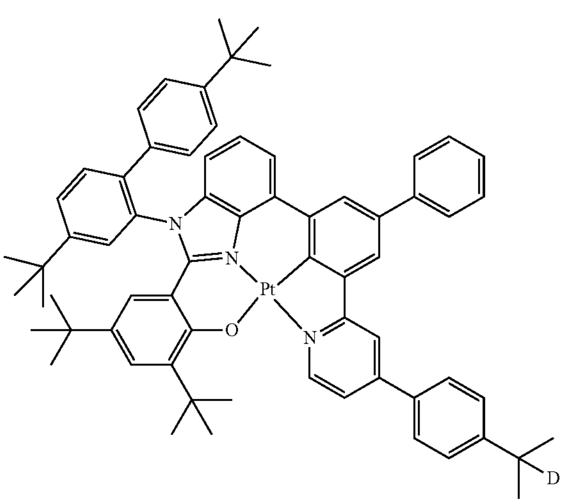
-continued
4-1481
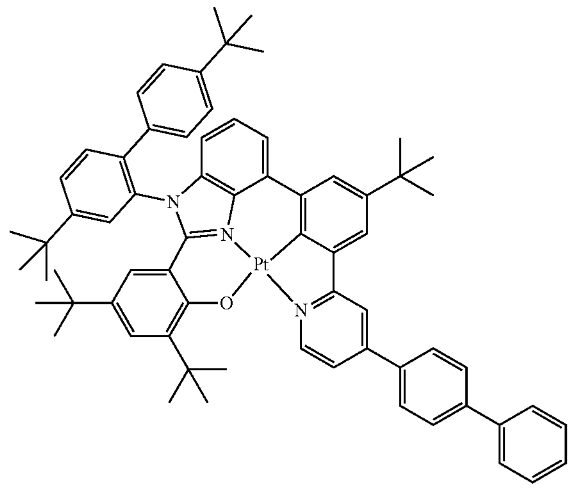
4-1482
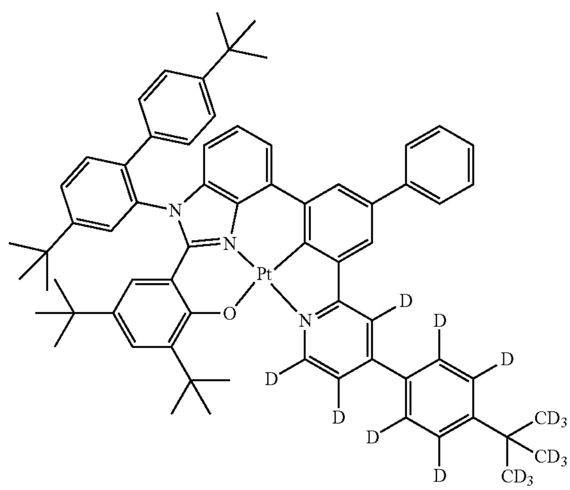
4-1483
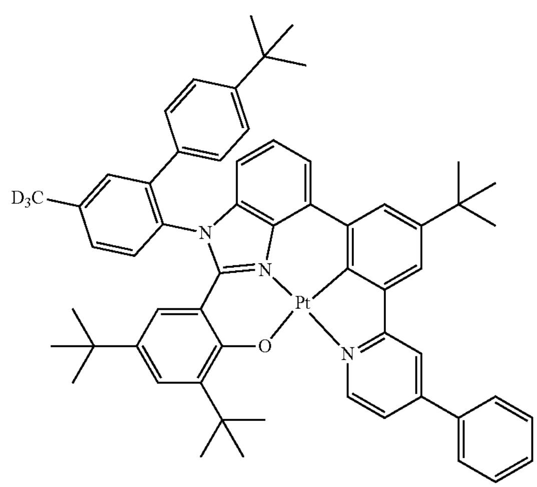

-continued
4-1484
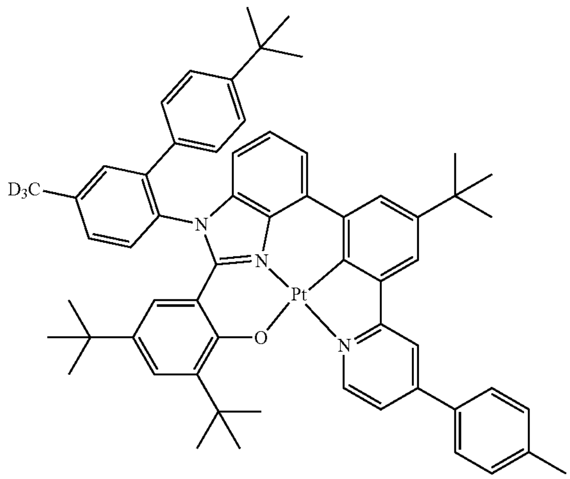
4-1485
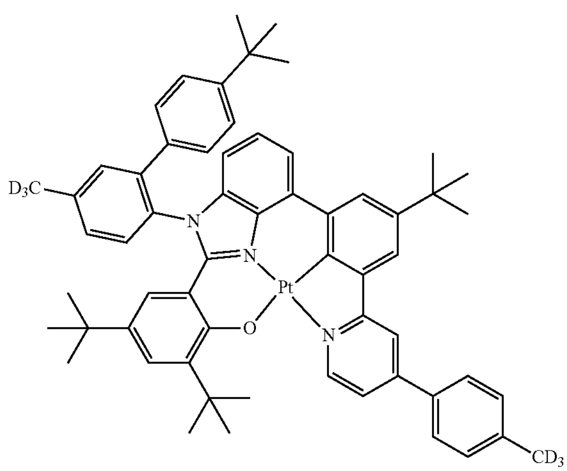
4-1486
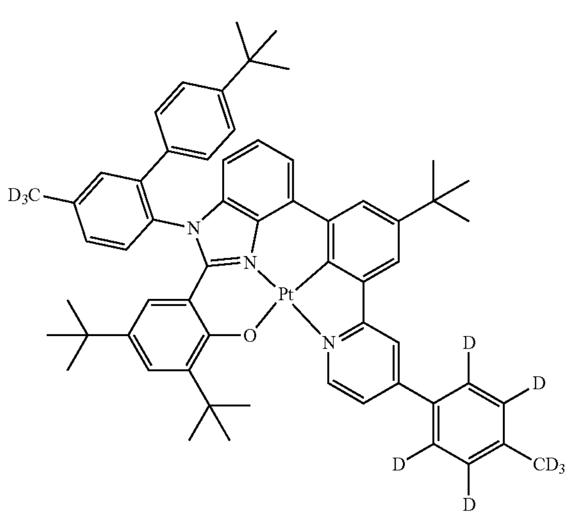
-continued
4-1487
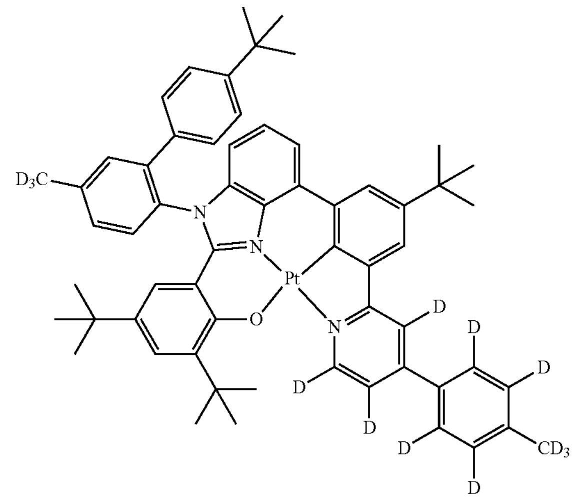
4-1488
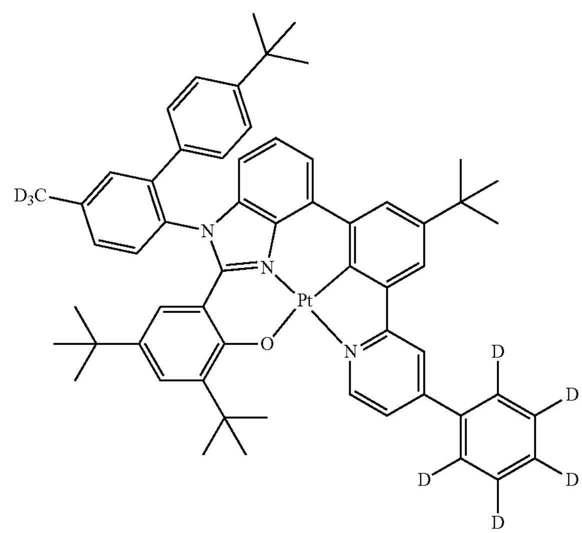
4-1489
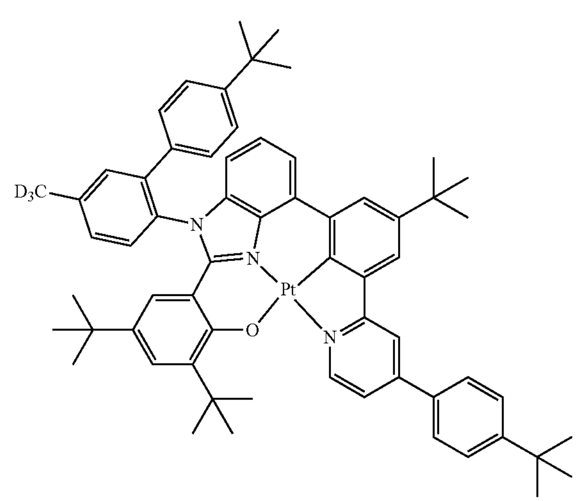

4-1490
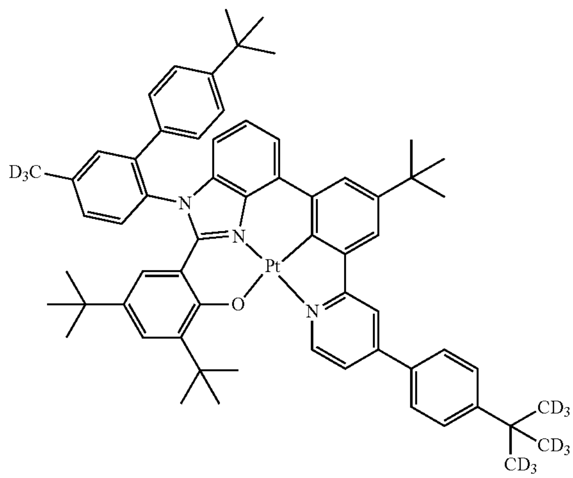
4-1491
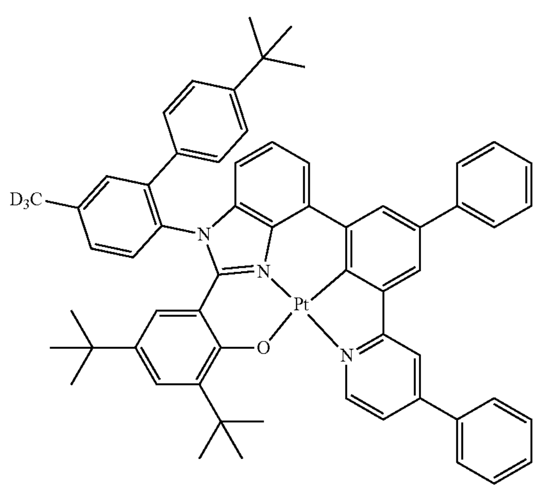
4-1492
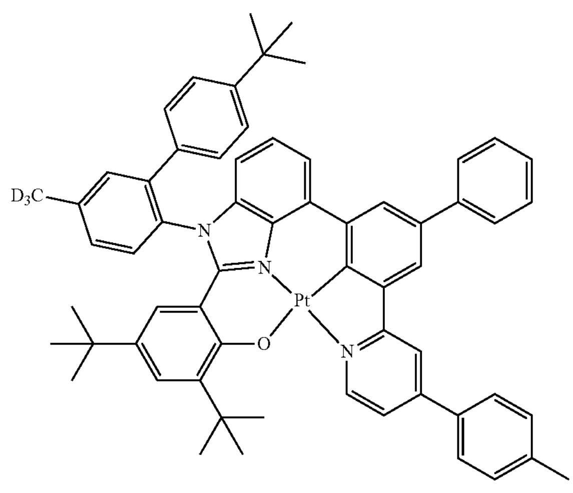
4-1493
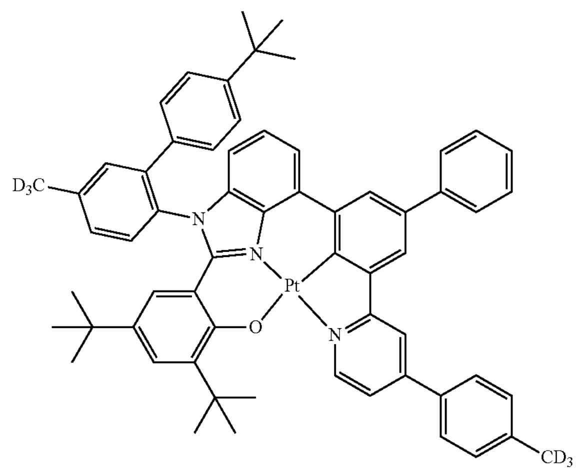
4-1494
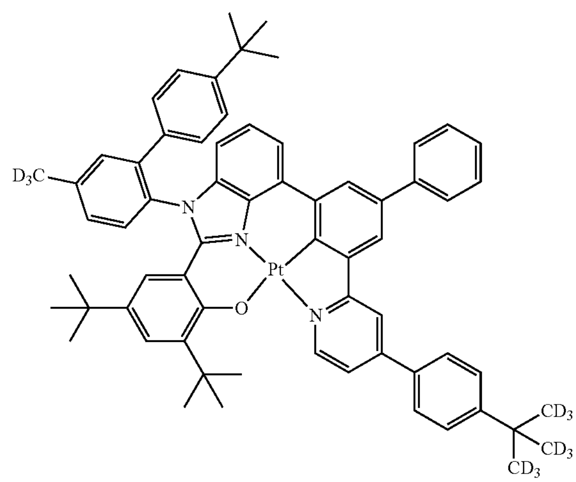
4-1495
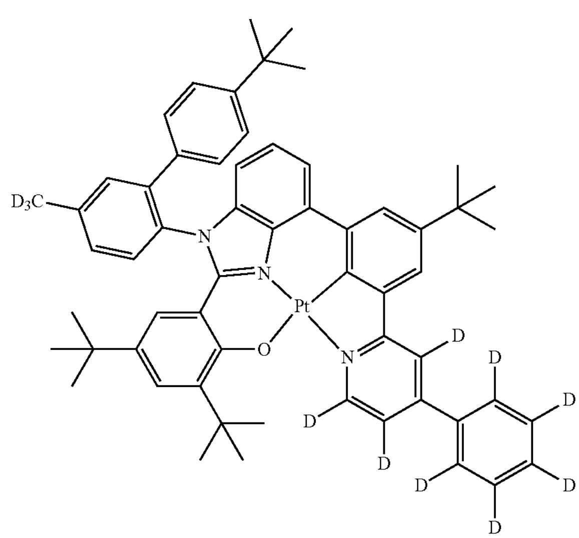

-continued
4-1496
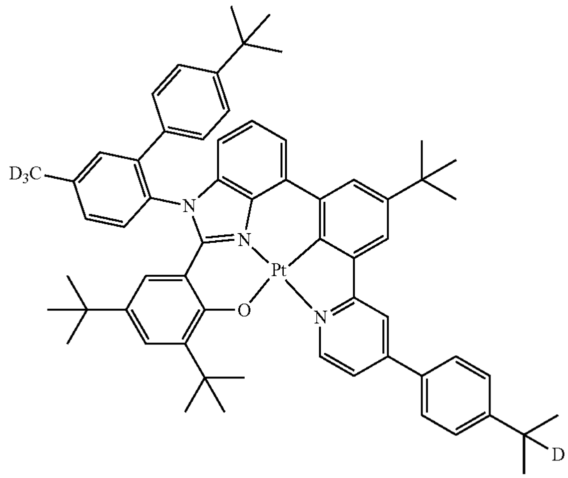
4-1497
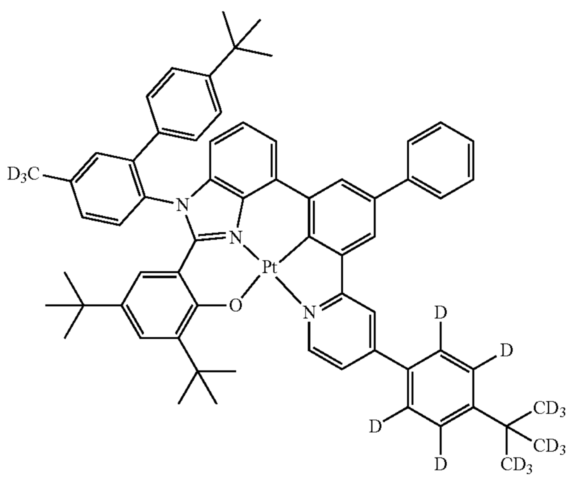
4-1498
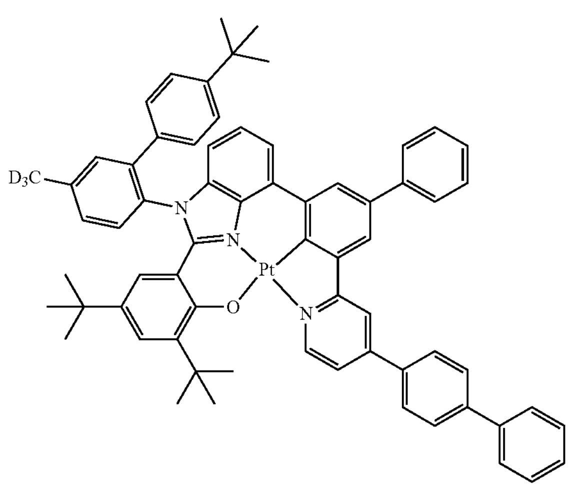
-continued
4-1499
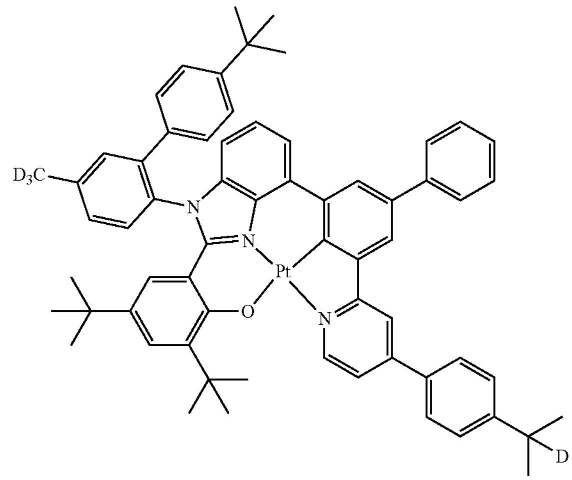
4-1500
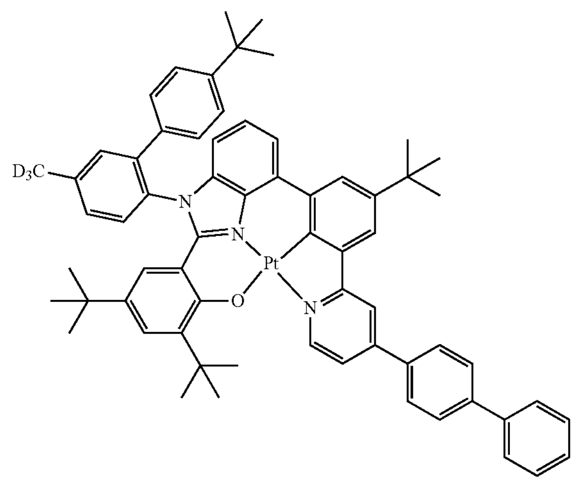
4-1501
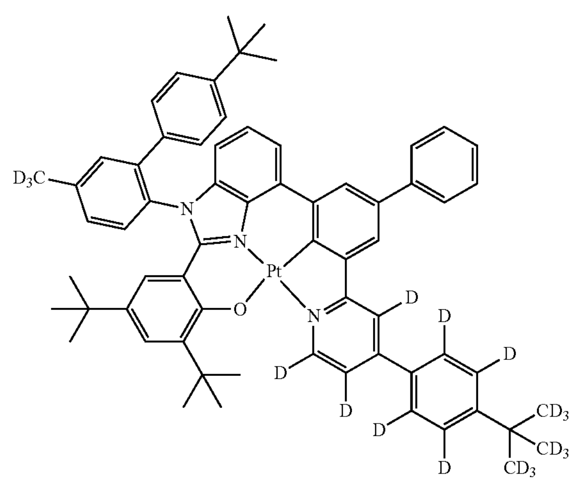

-continued
4-1502
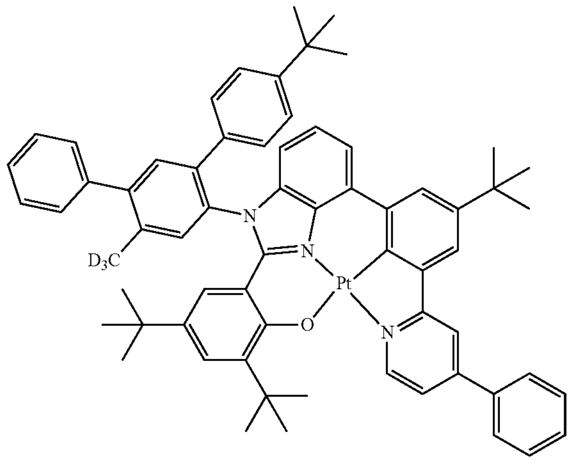
4-1503
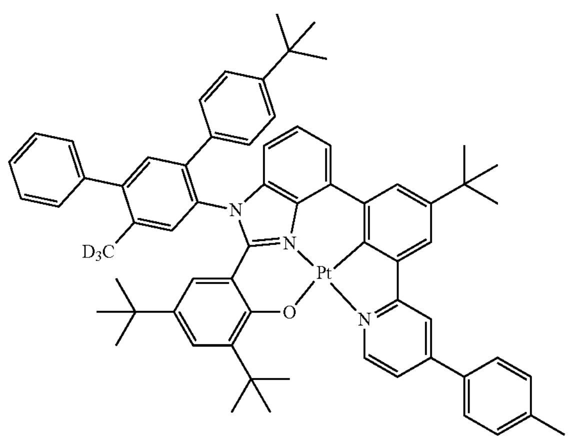
4-1504
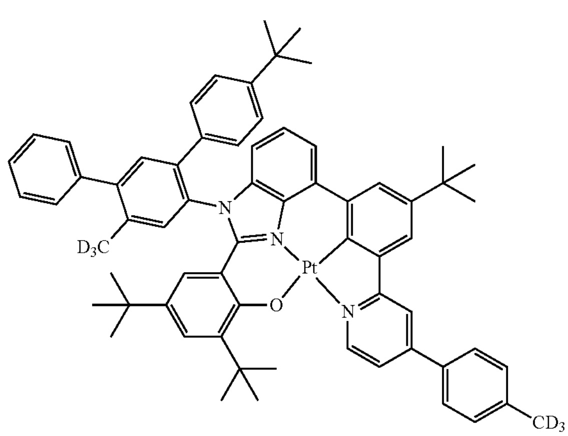
-continued
4-1505
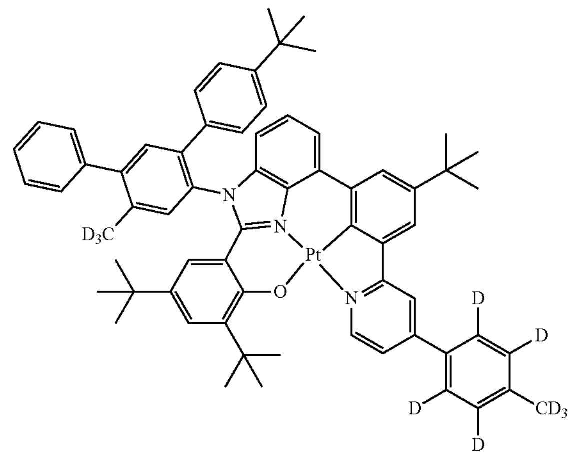
4-1506
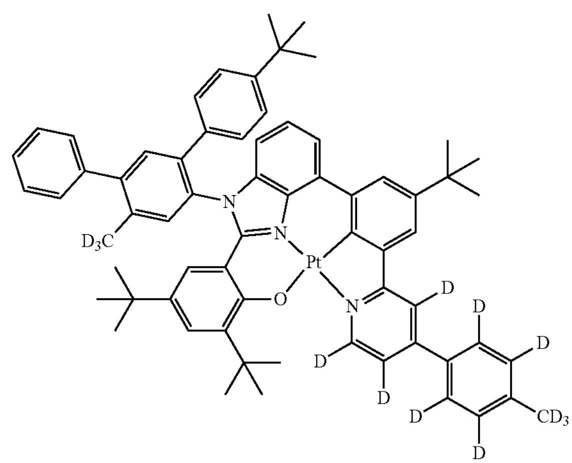
4-1507
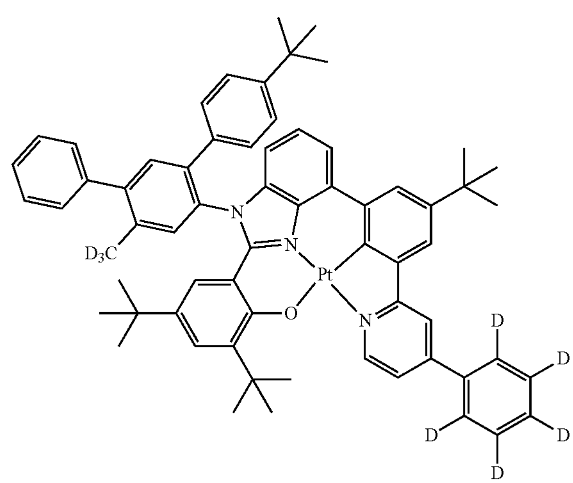

-continued
4-1508
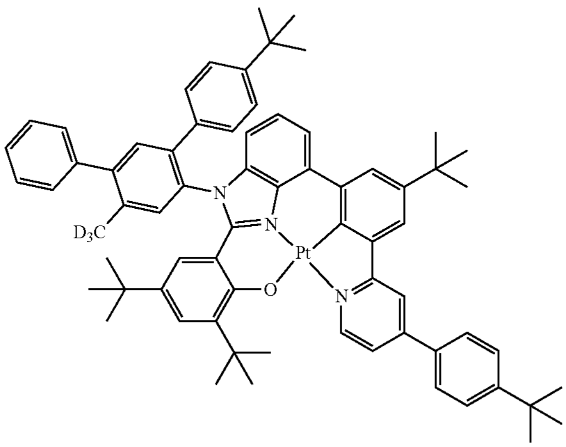
4-1509
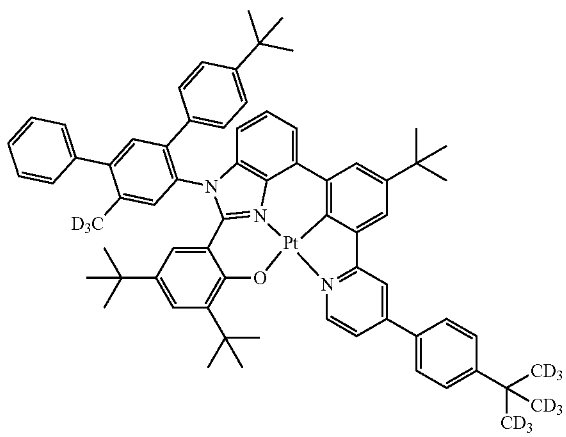
4-1510
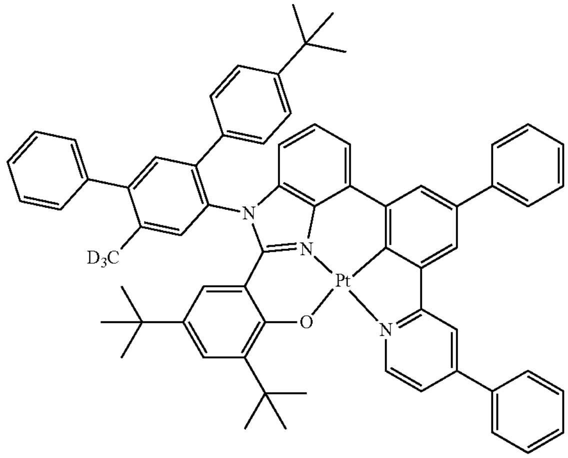
-continued
4-1511
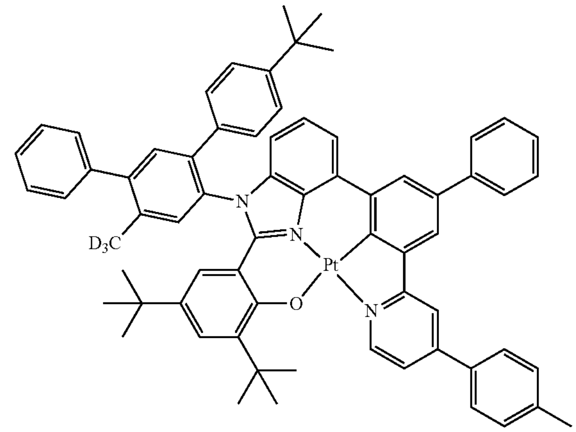
4-1512
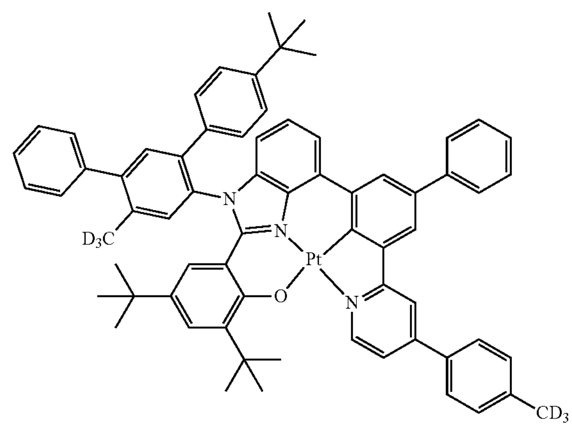
4-1513
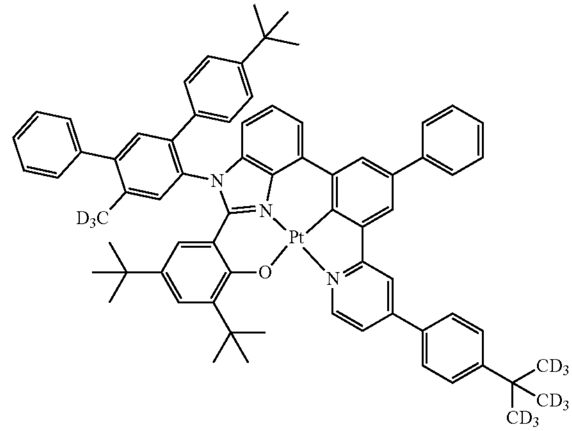

-continued
4-1514
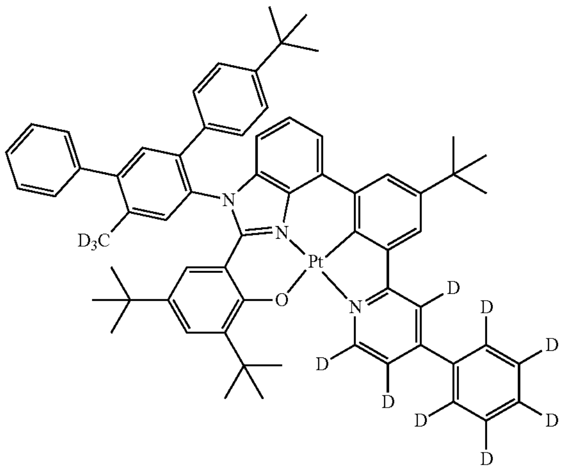
4-1515
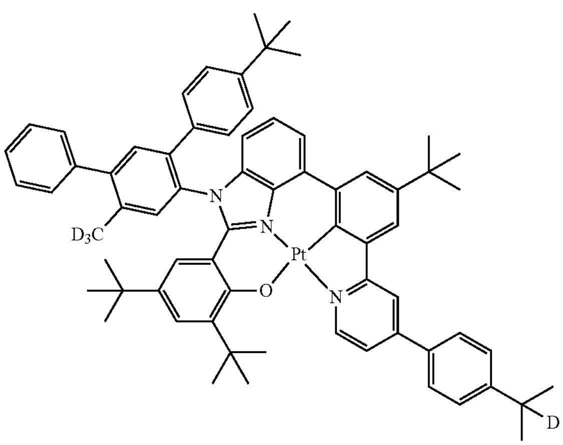
4-1516
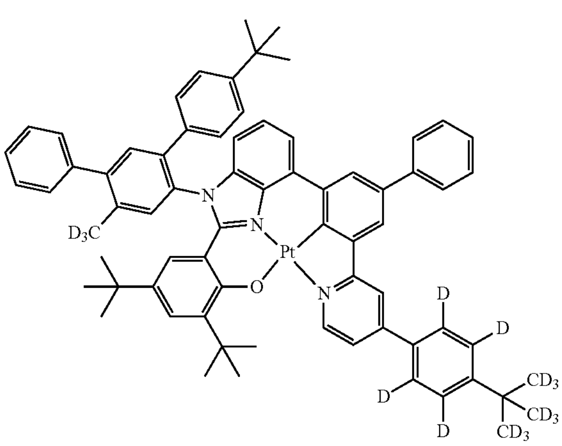
-continued
4-1517
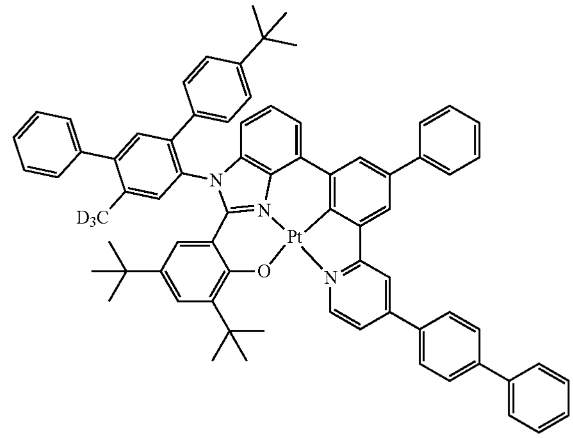
4-1518
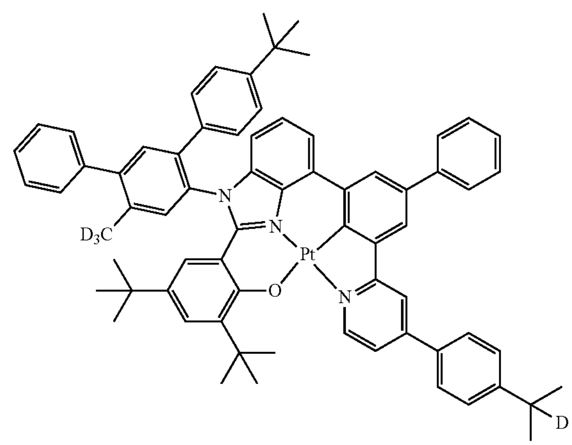
4-1519
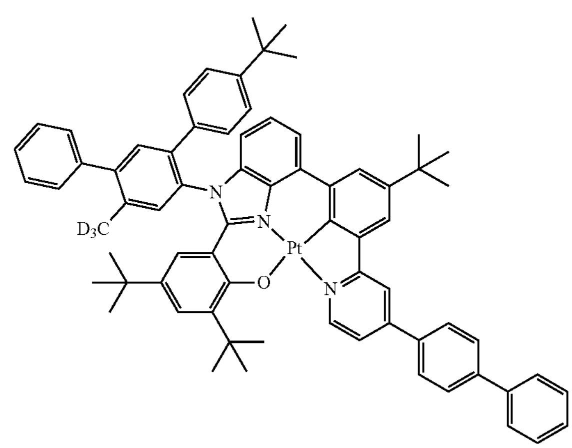

-continued
4-1520
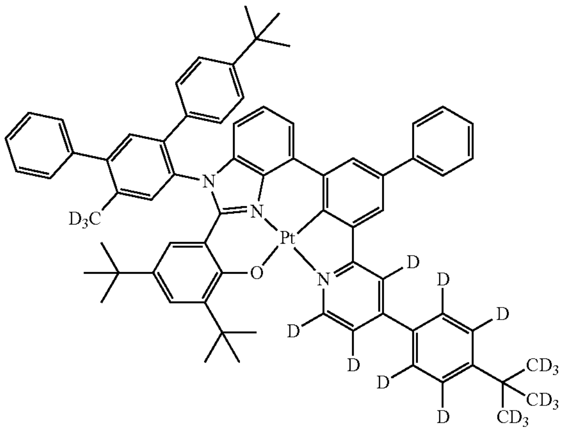
4-1521
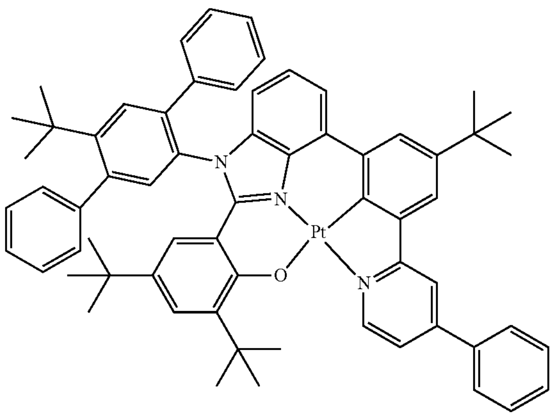
4-1522
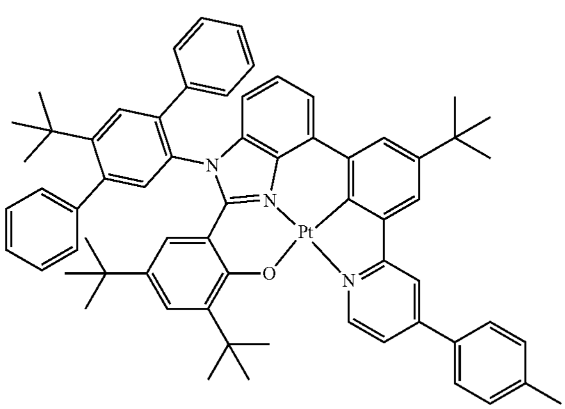
-continued
4-1523
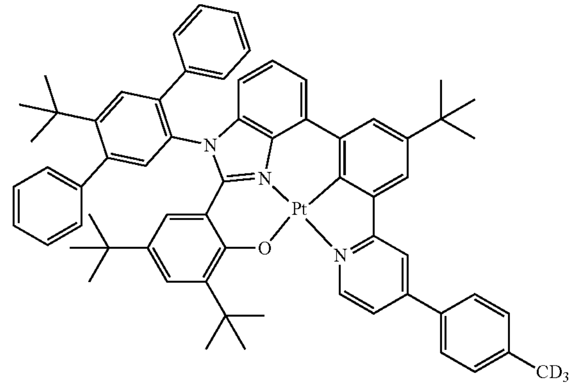
4-1524
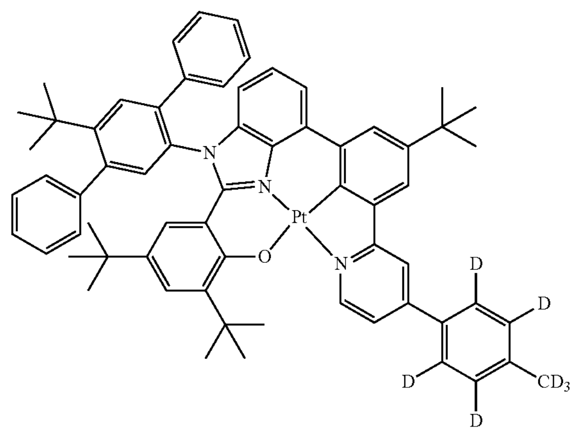
4-1525
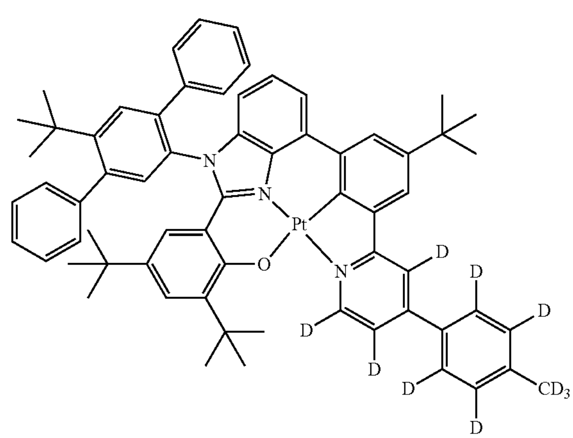

-continued
4-1526
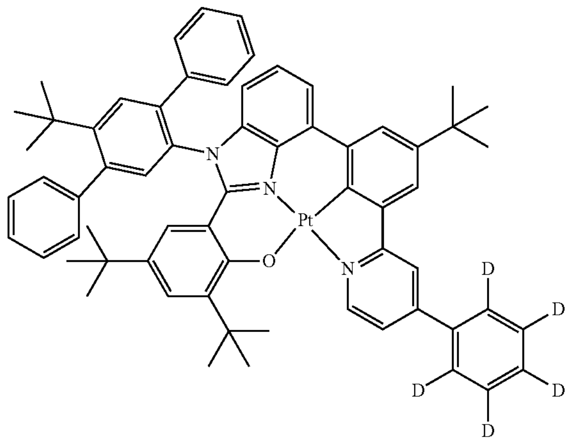
4-1527
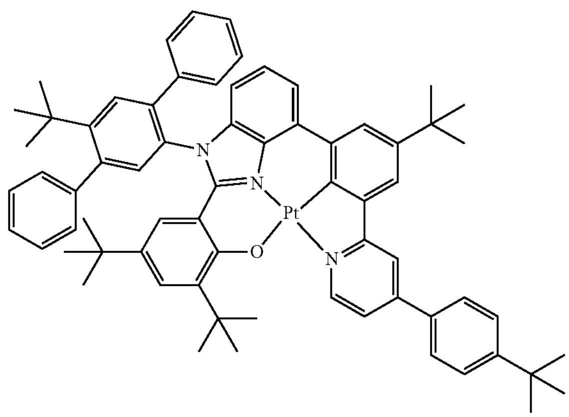
4-1528
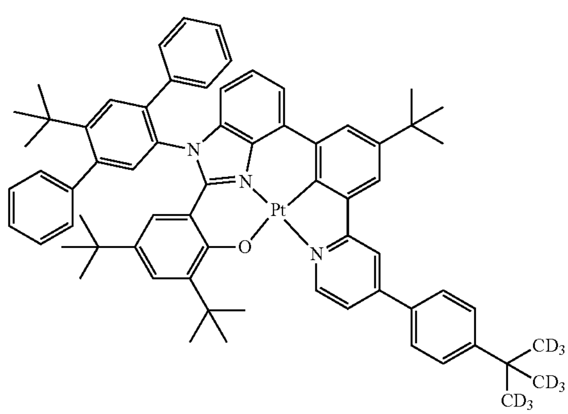
-continued
4-1529
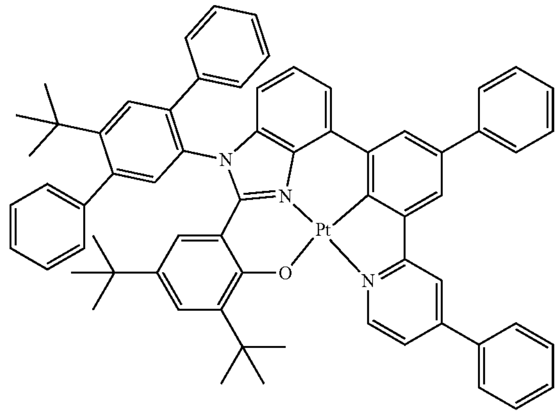
4-1530
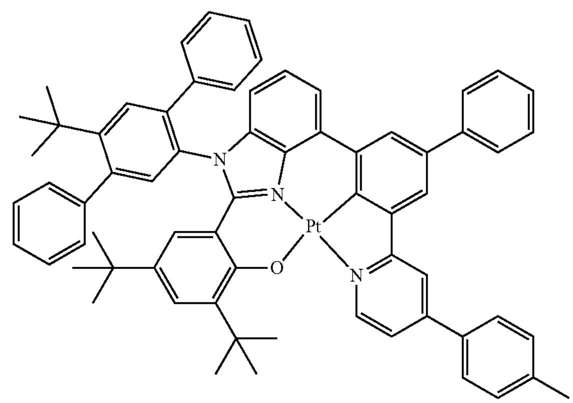
4-1531
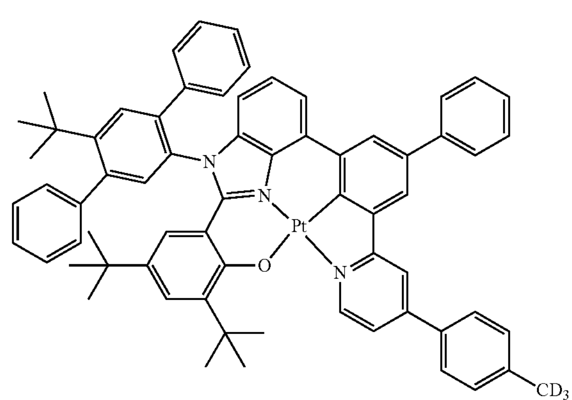

-continued
4-1532
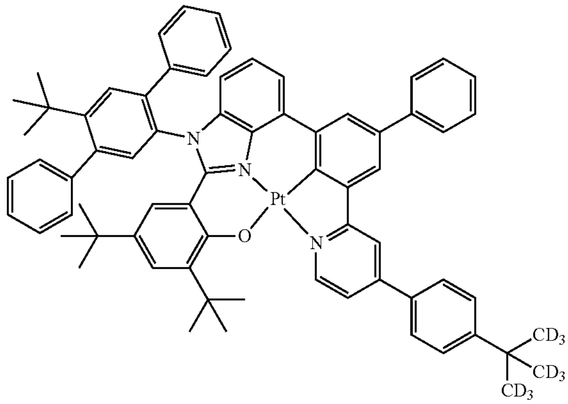
4-1533
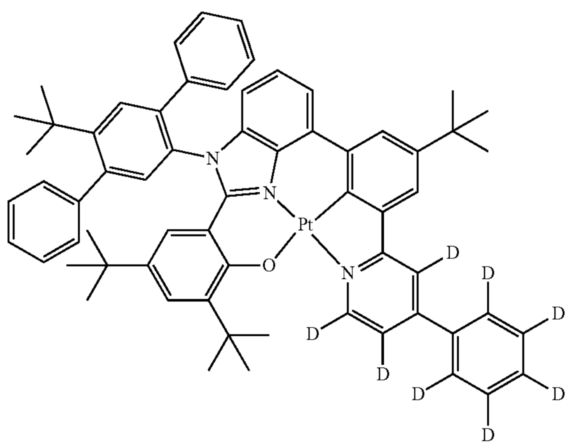
4-1534
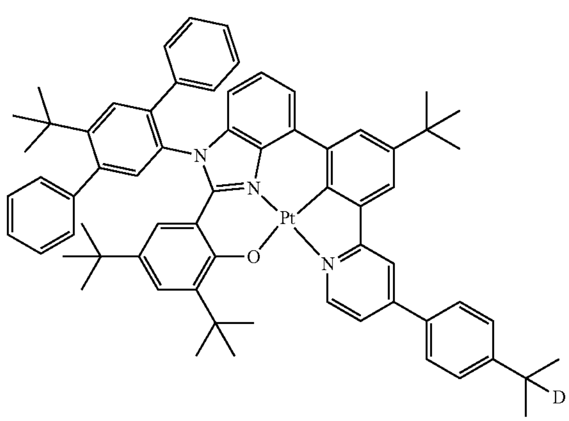
-continued
4-1535
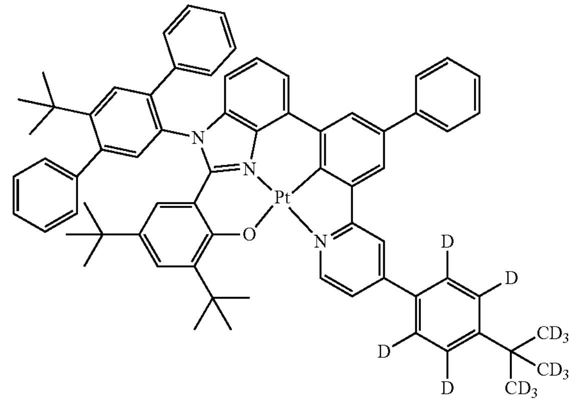
4-1536
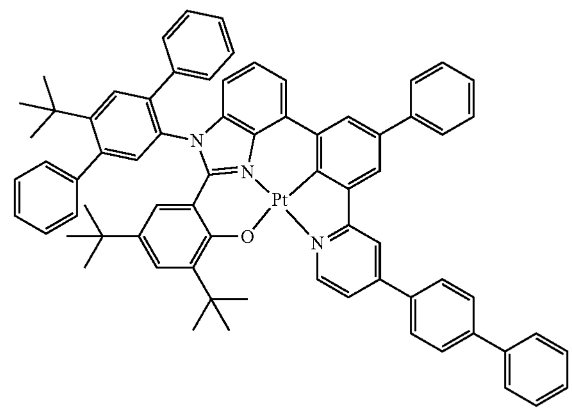
4-1537
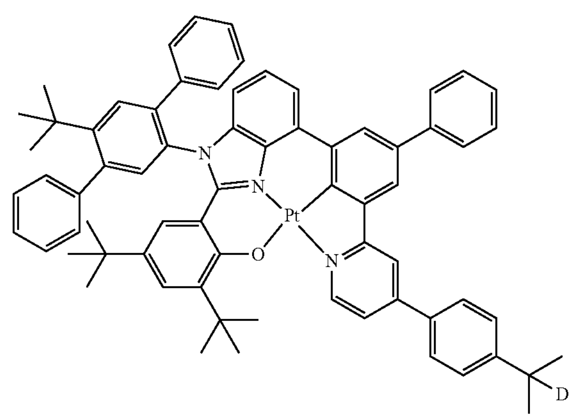

-continued
4-1538
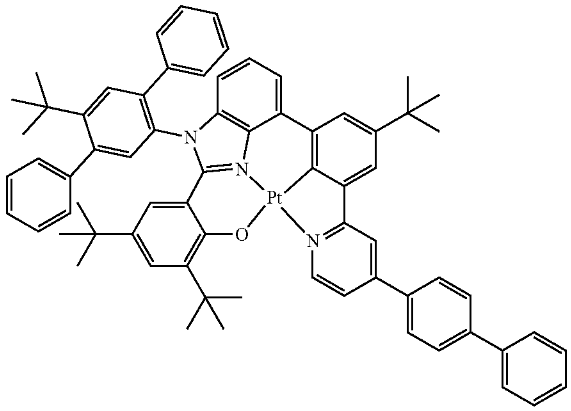
4-1539
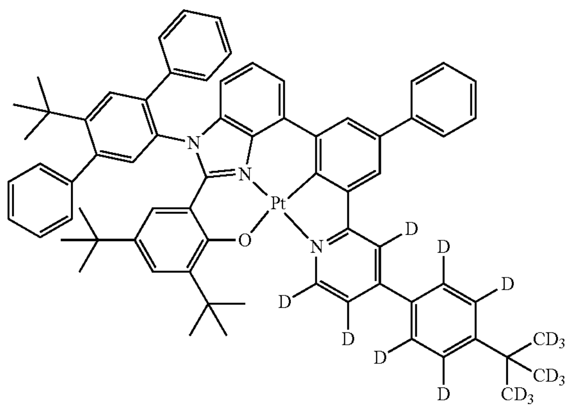
4-1540
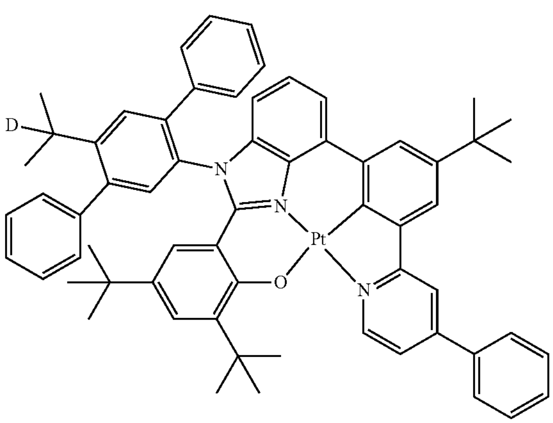
-continued
4-1541
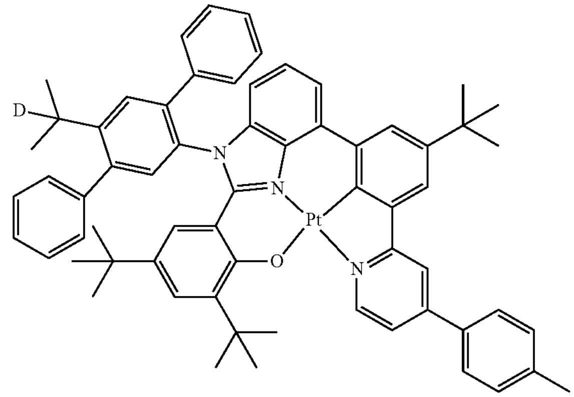
4-1542
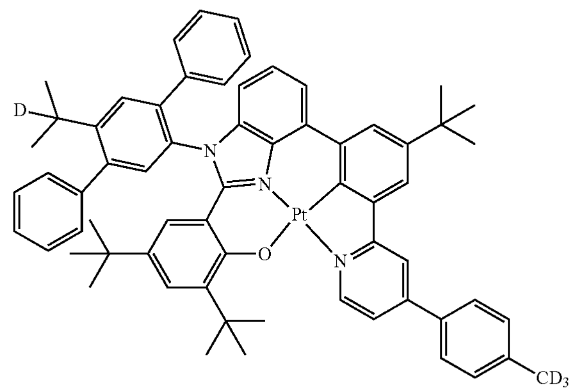
4-1543
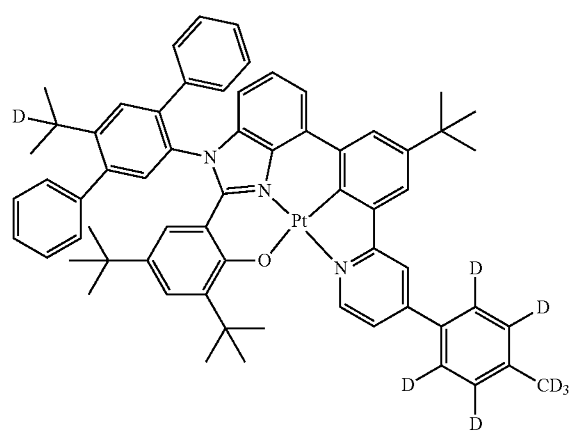

-continued
4-1544
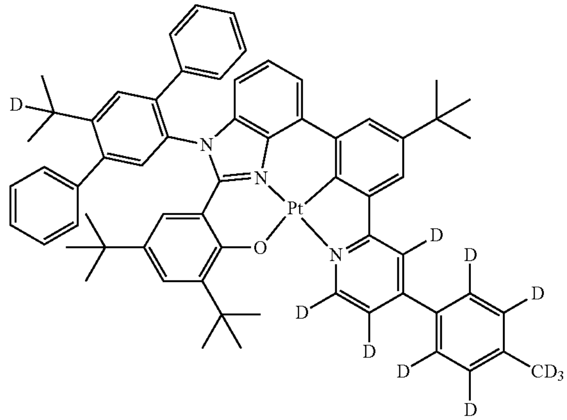
4-1545
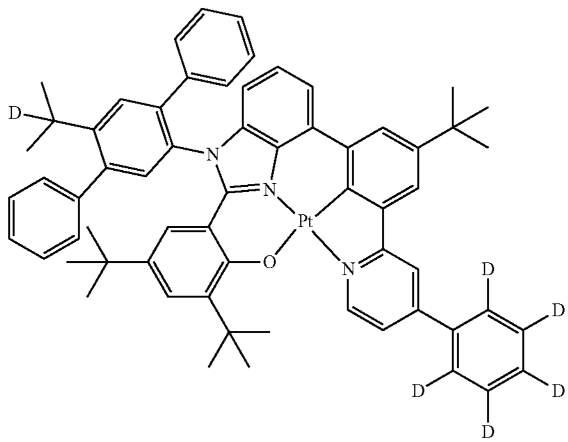
4-1546
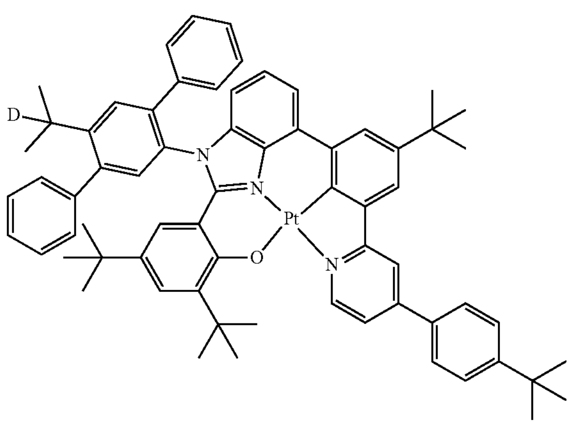
-continued
4-1547
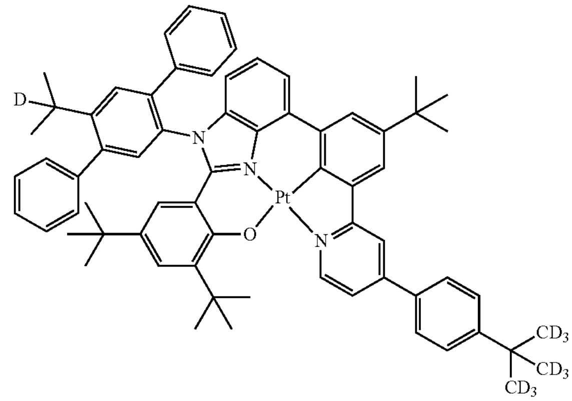
4-1548
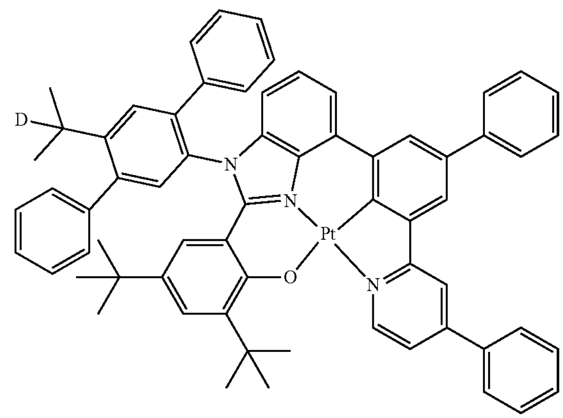
4-1549
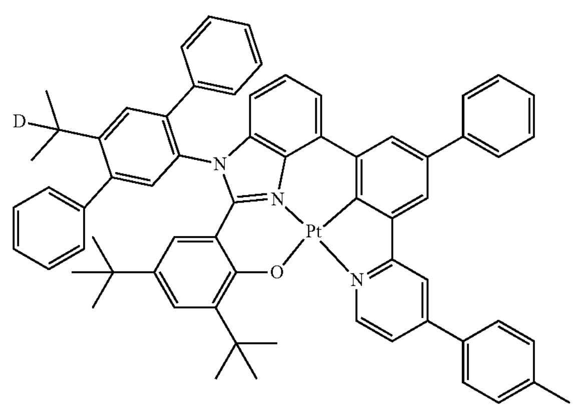

4-1550
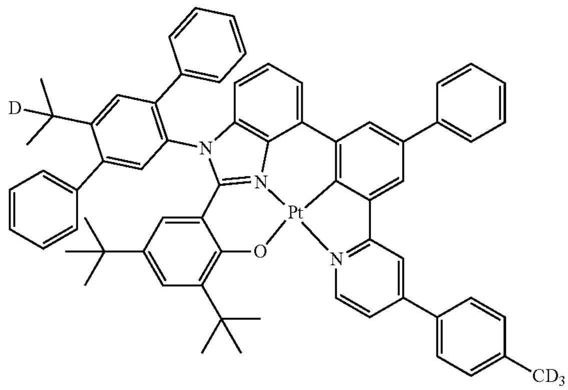
4-1551
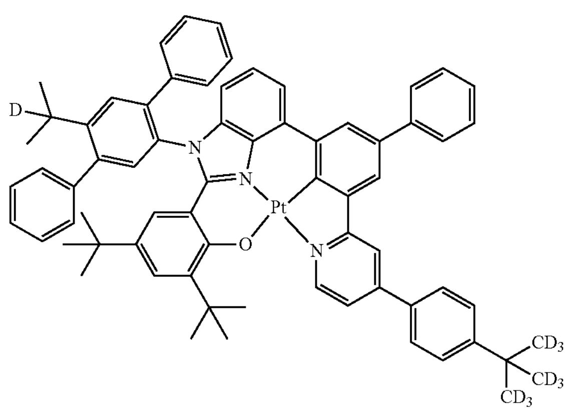
4-1552
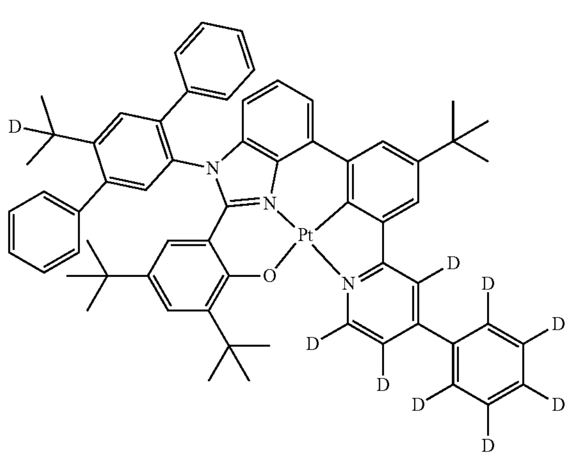
4-1553
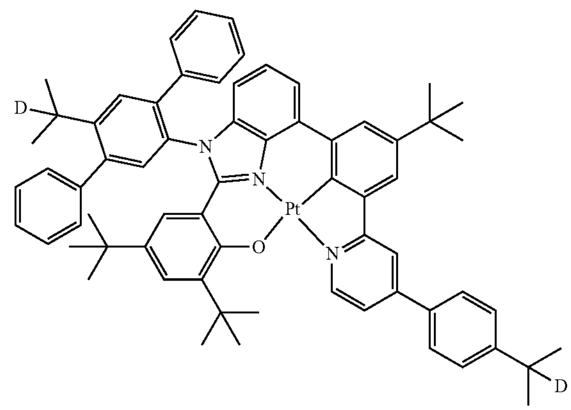
4-1554
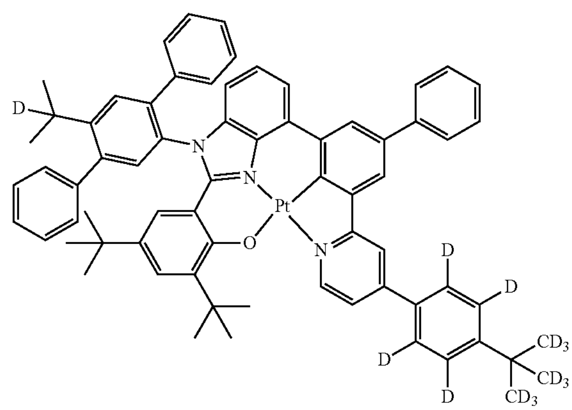
4-1555
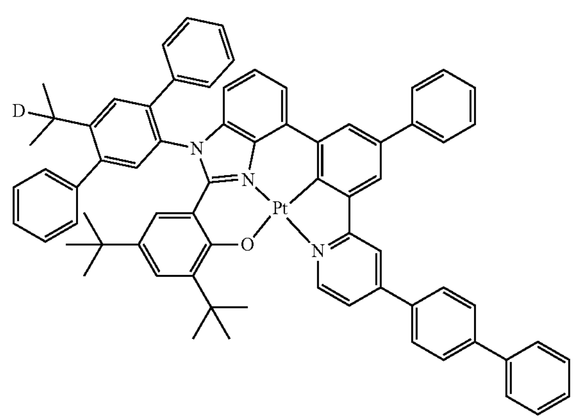

-continued
4-1556
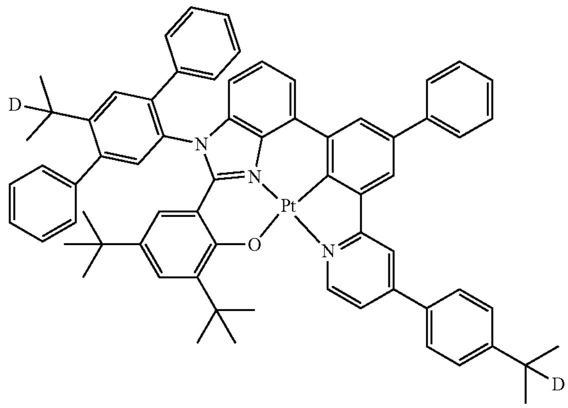
4-1557
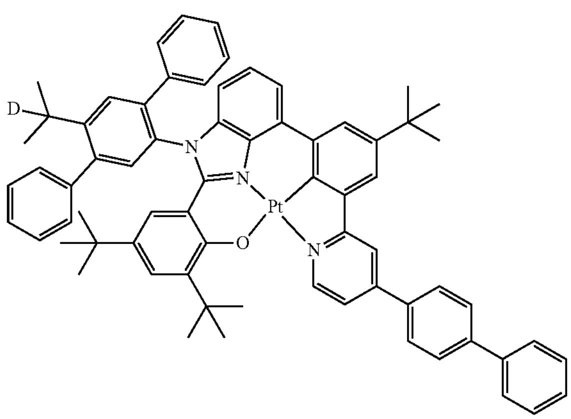
4-1558
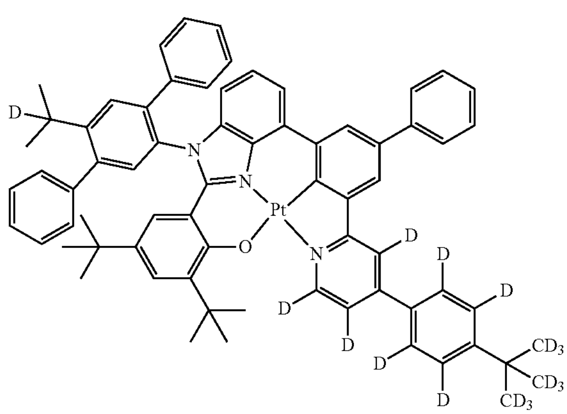
-continued
4-1559
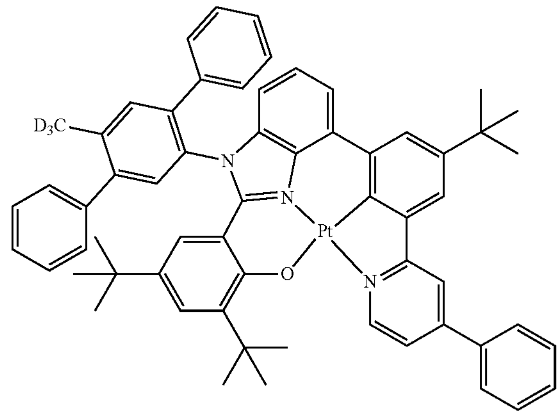
4-1560
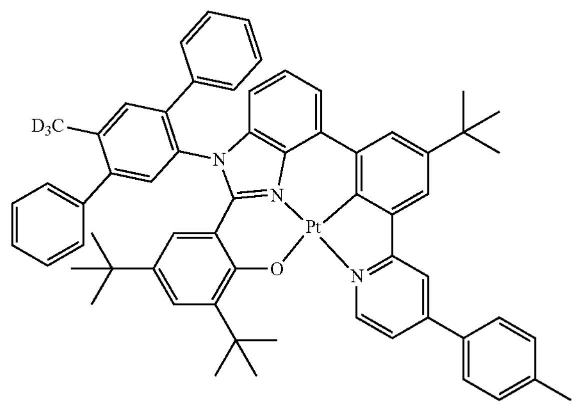
4-1561
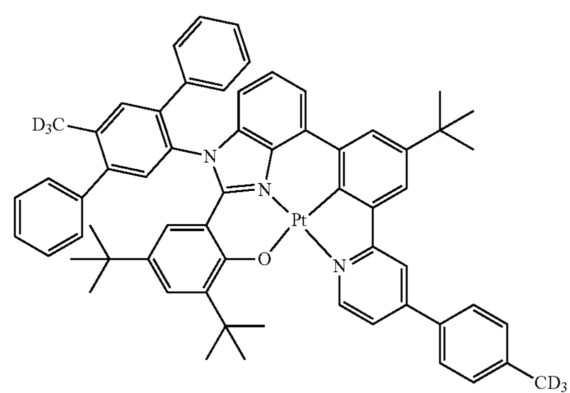

-continued
4-1562
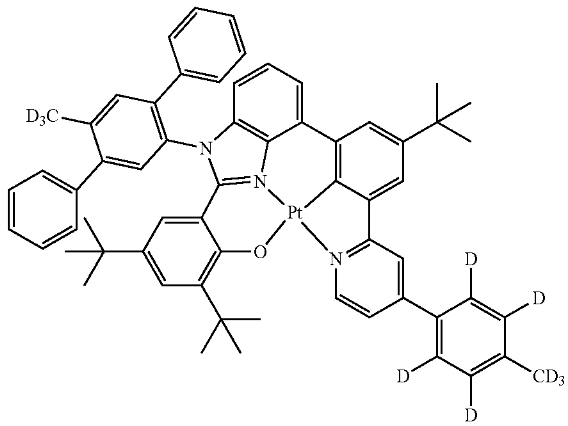
4-1563
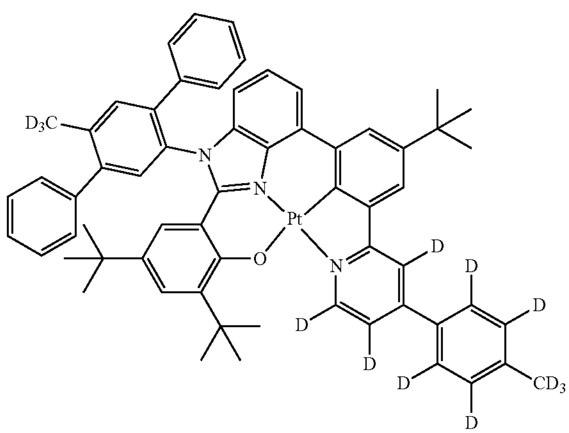
4-1564
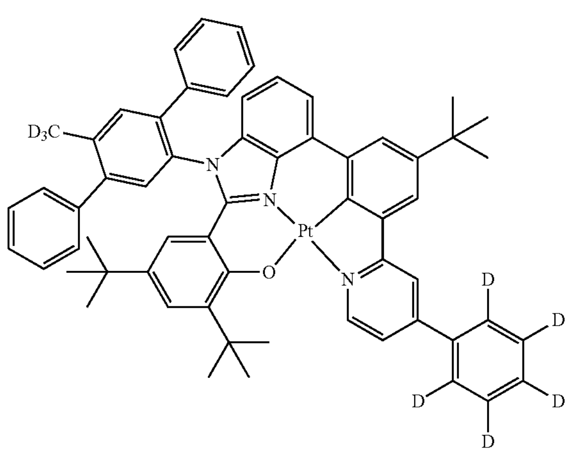
-continued
4-1565
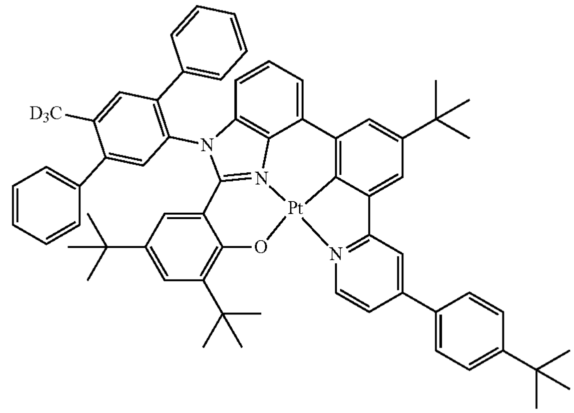
4-1566
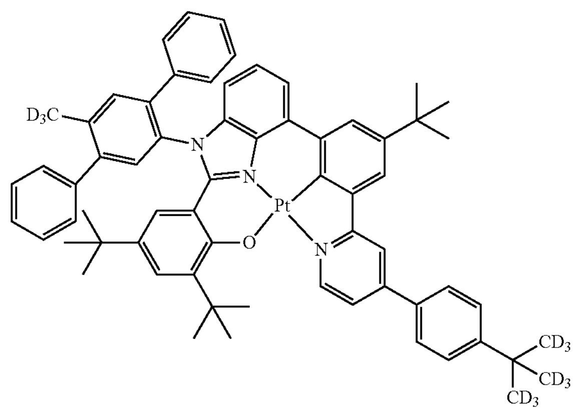
4-1567
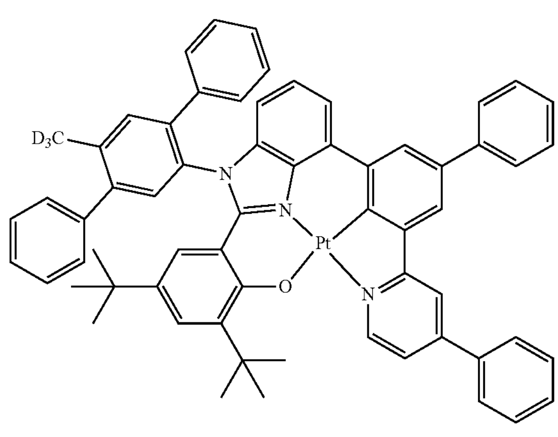

-continued
4-1568
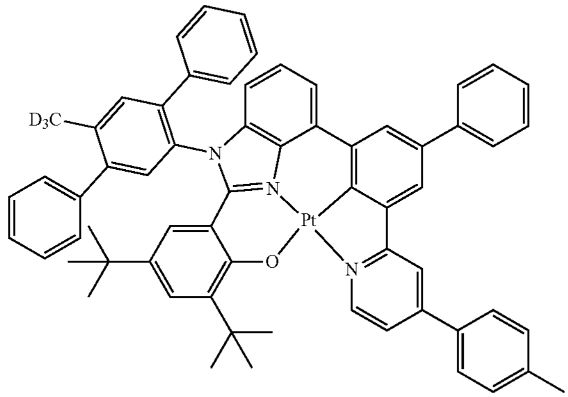
4-1569
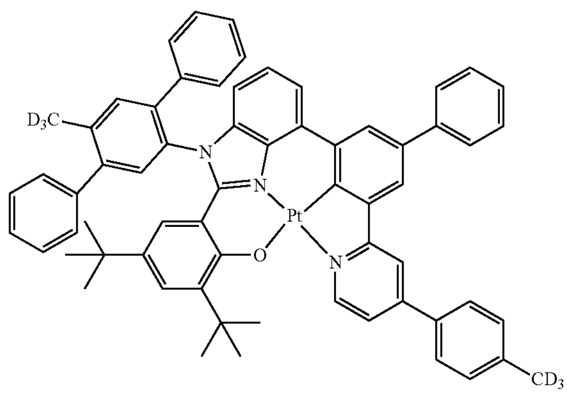
4-1570
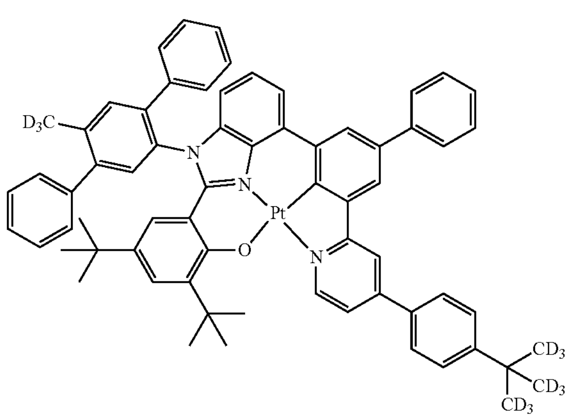
-continued
4-1571
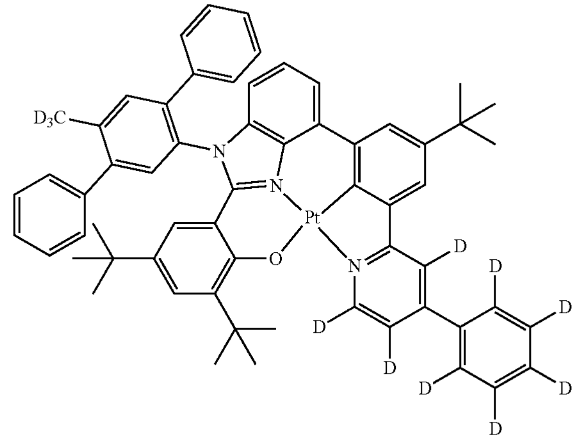
4-1572
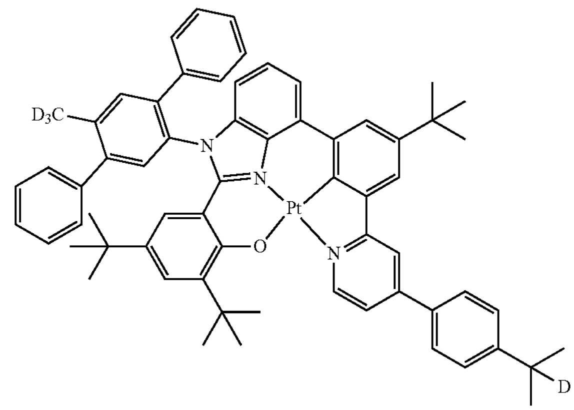
4-1573
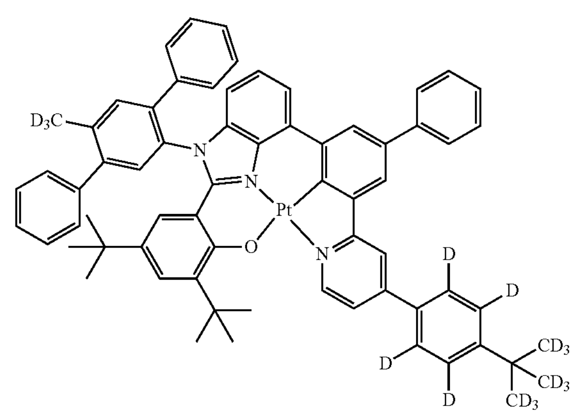

-continued
4-1574
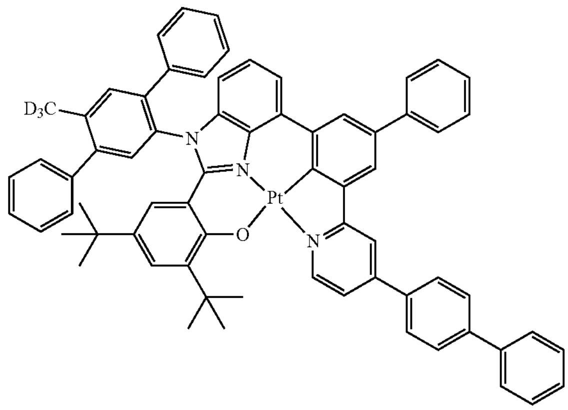
4-1575
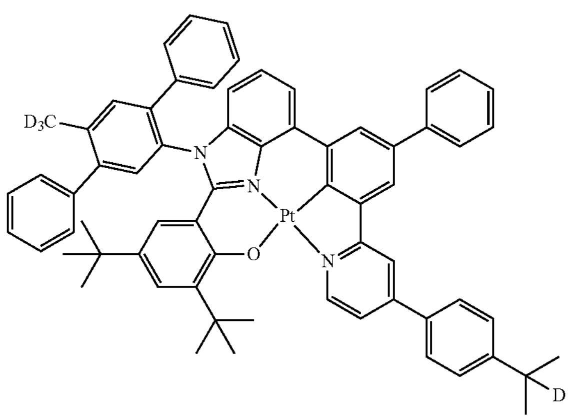
4-1576
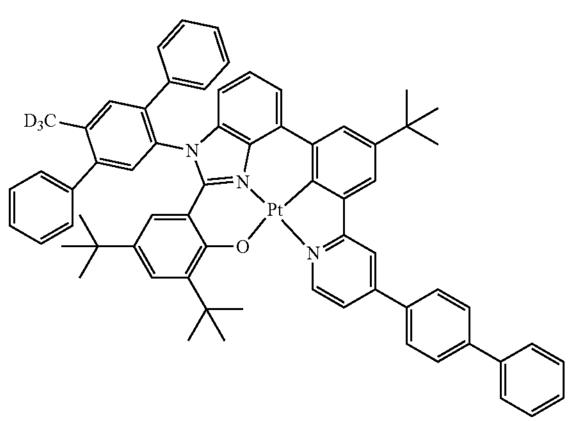
-continued
4-1577
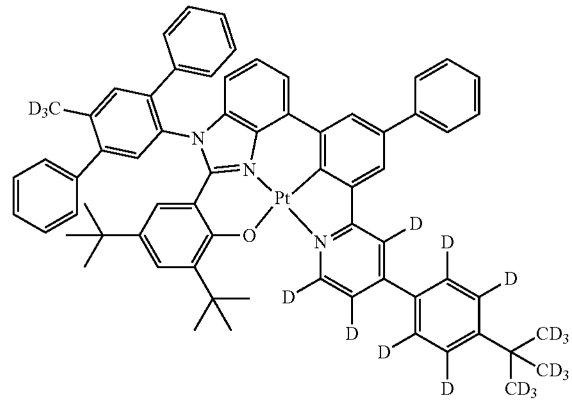
4-1578
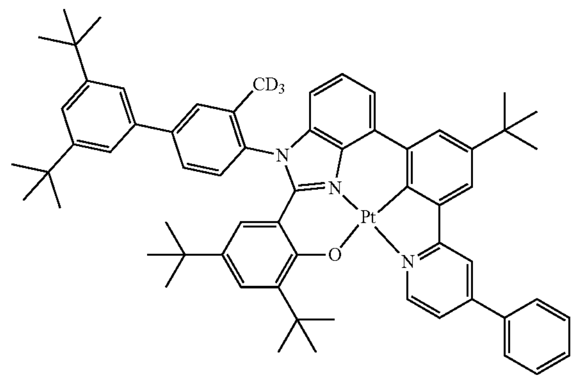
4-1579
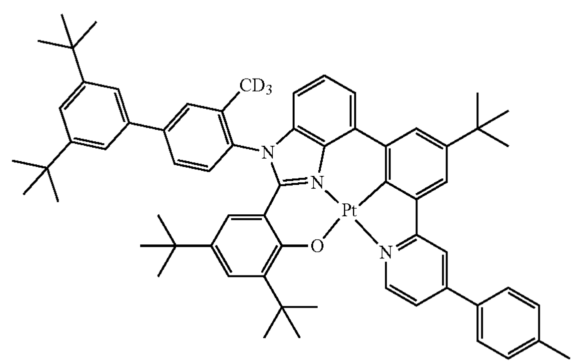
4-1580
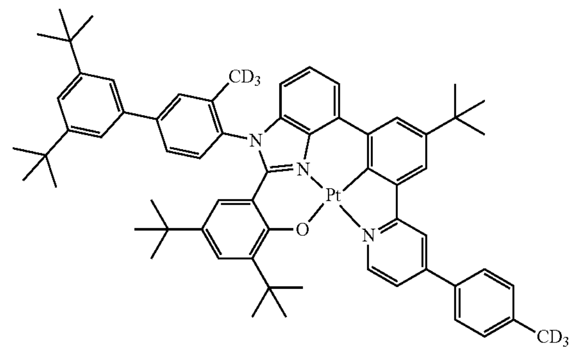

-continued
4-1581
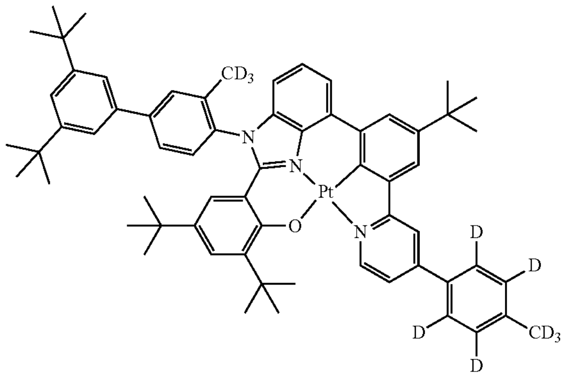
4-1582
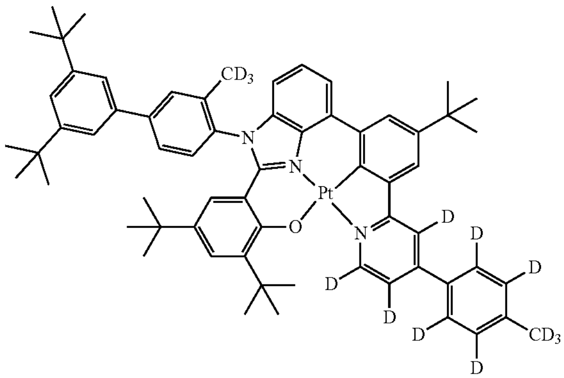
4-1583
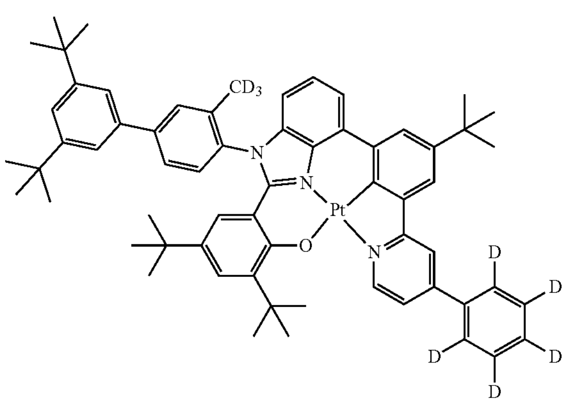
4-1584
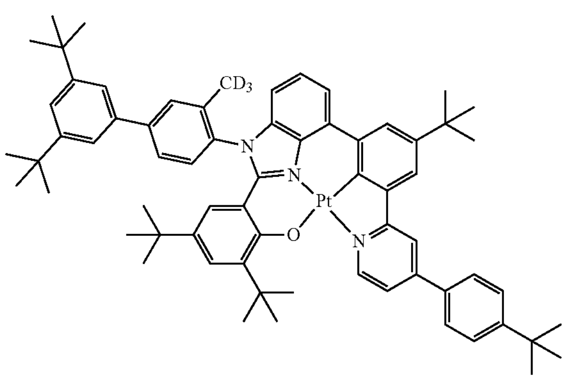
-continued
4-1585
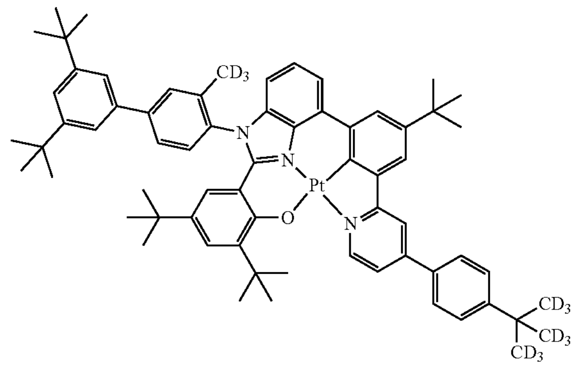
4-1586
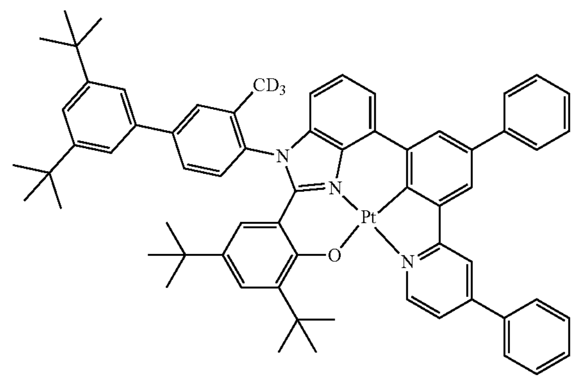
4-1587
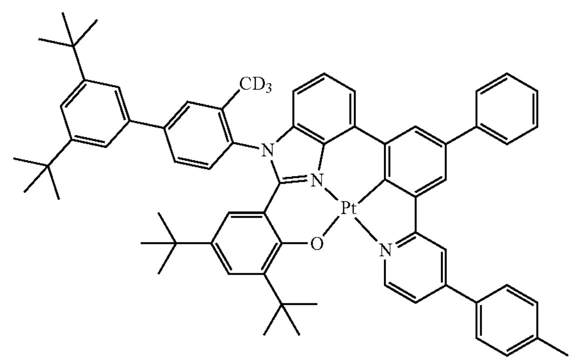
4-1588
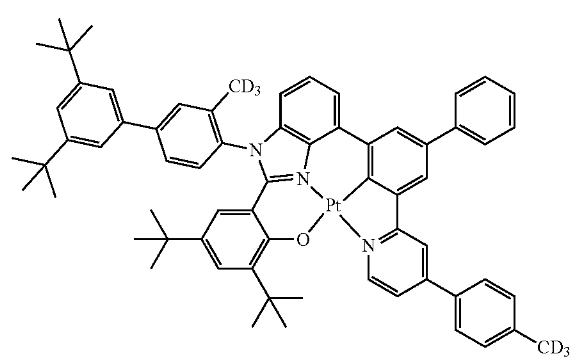

-continued
4-1589
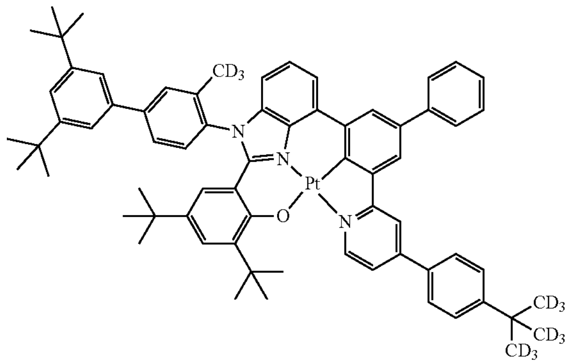
4-1590
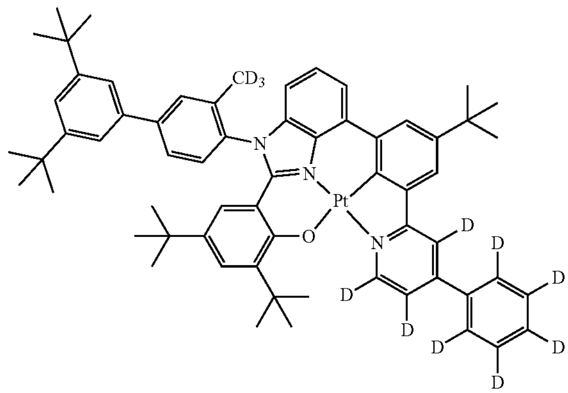
4-1591
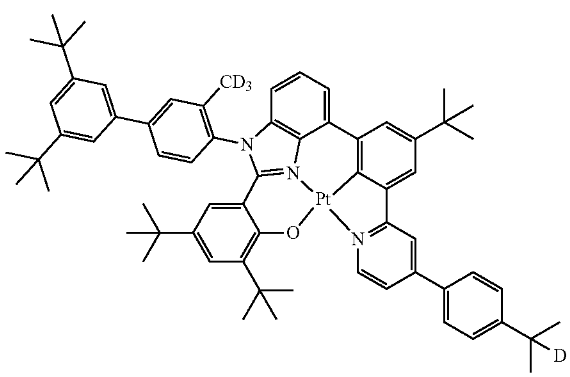
4-1592
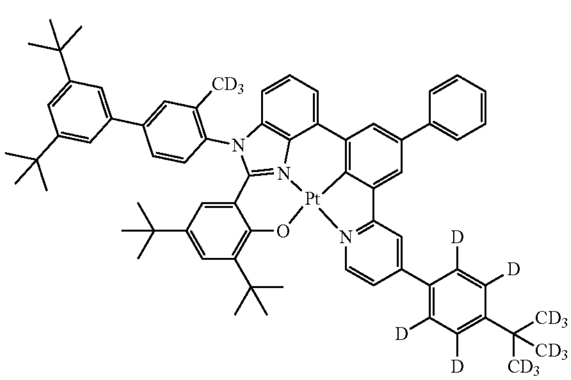
-continued
4-1593
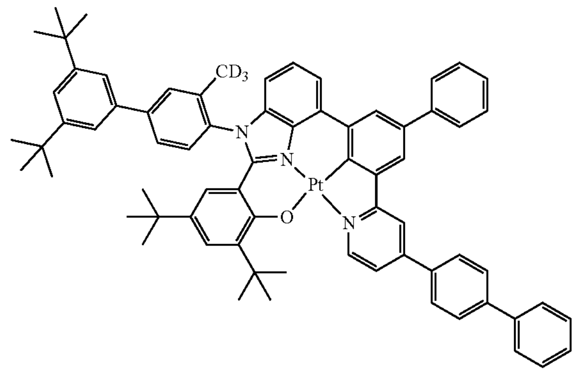
4-1594
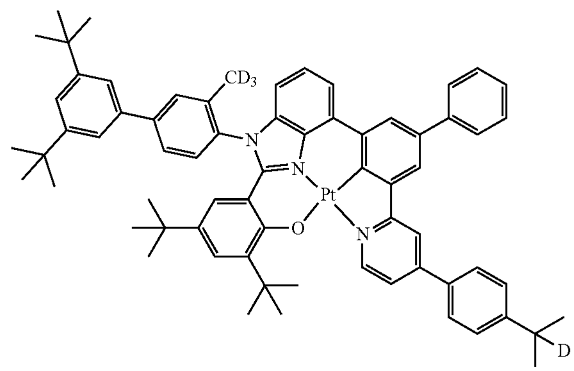
4-1595
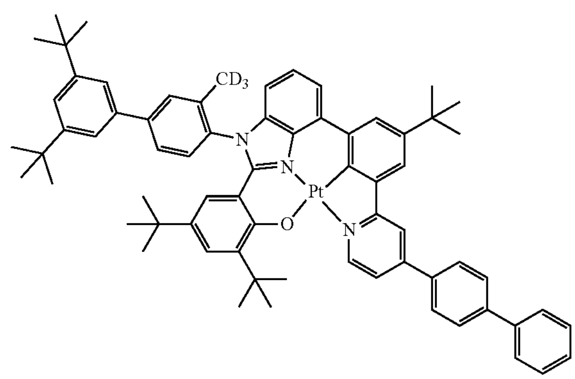
4-1596
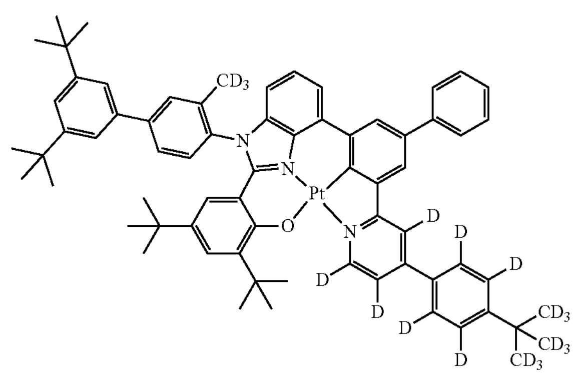

-continued
4-1597
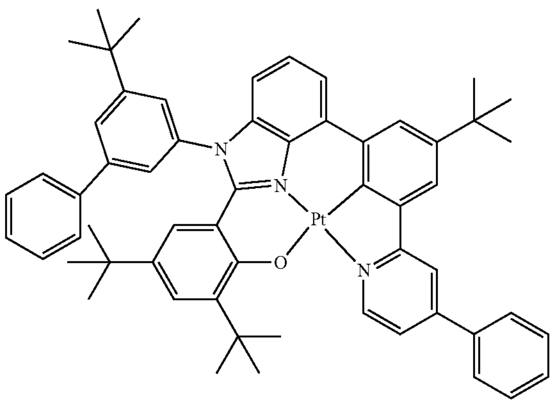
4-1598
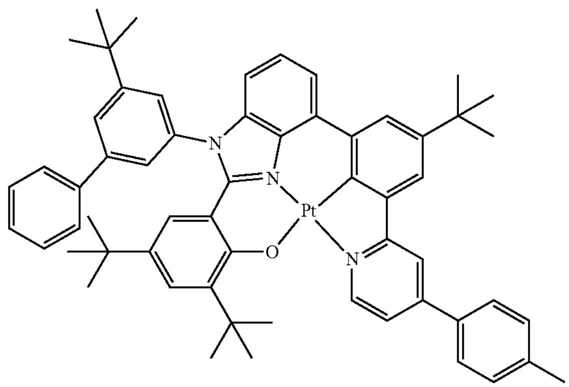
4-1599
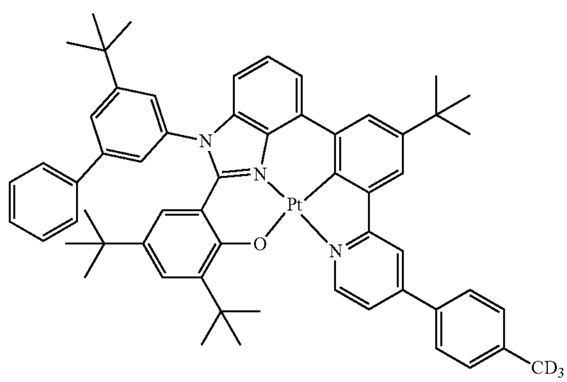
4-1600
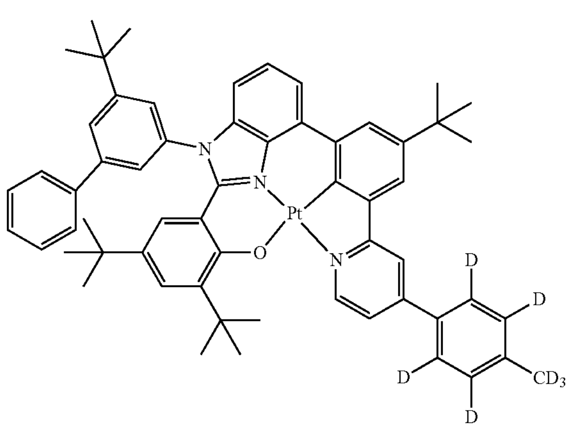
-continued
4-1601
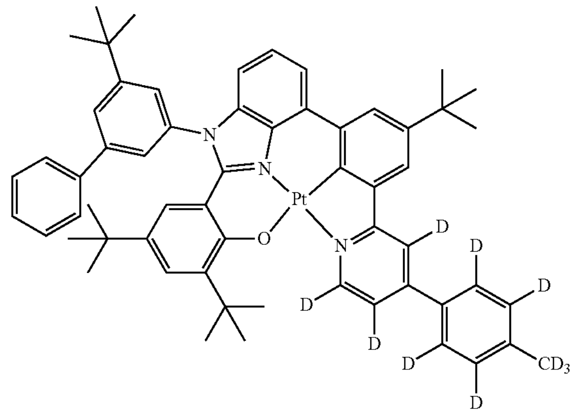
4-1602
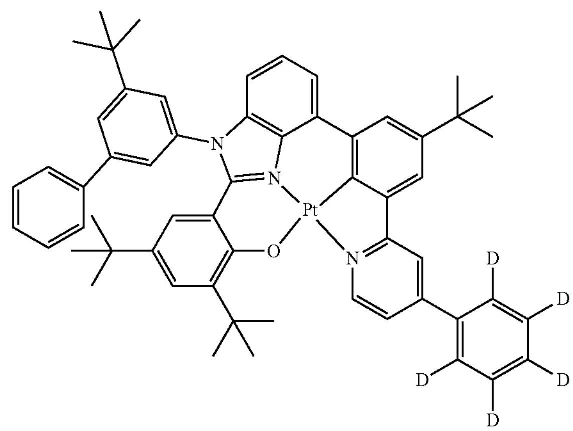
4-1603
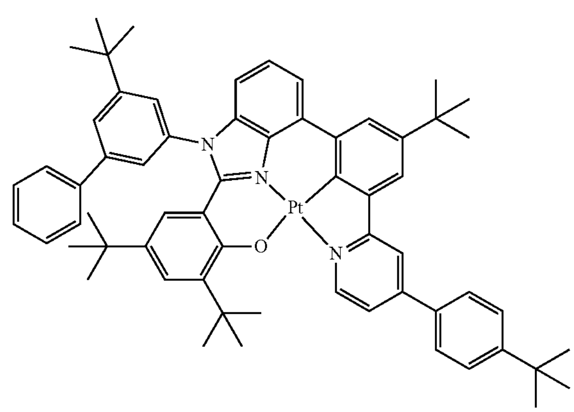

-continued
4-1604
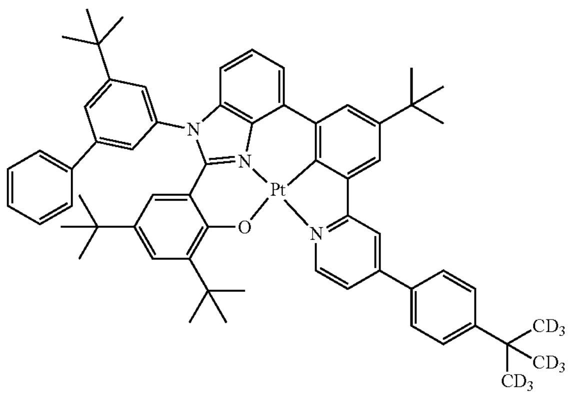
4-1605
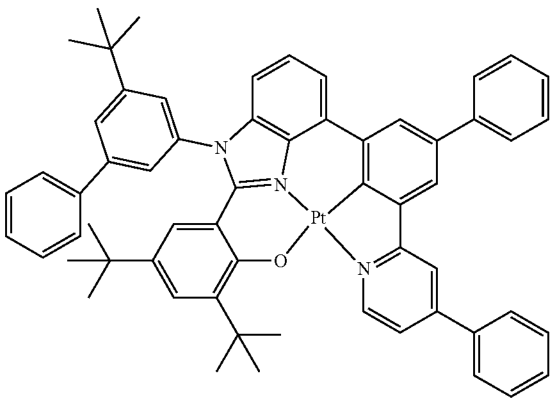
4-1606
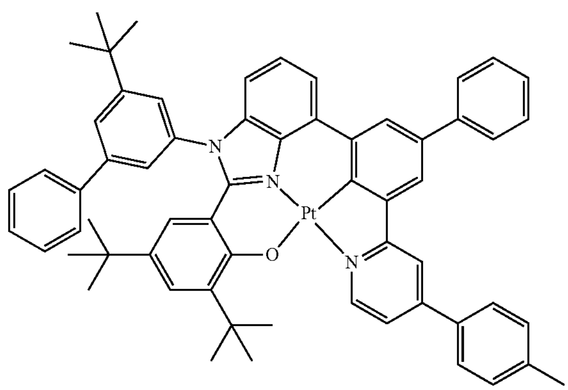
4-1607
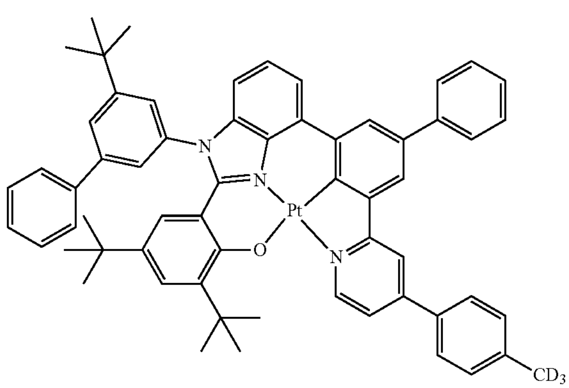
-continued
4-1608
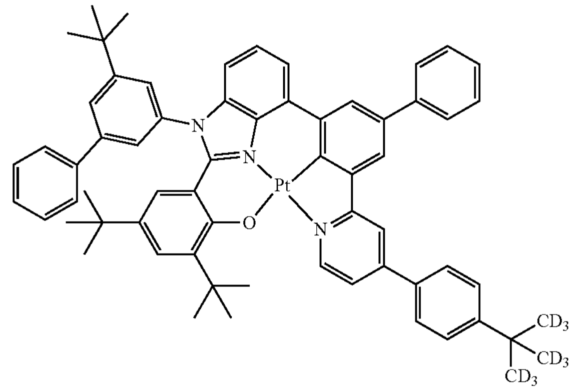
4-1609
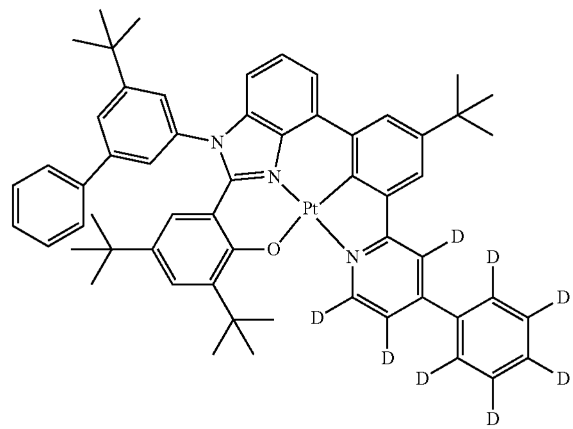
4-1610
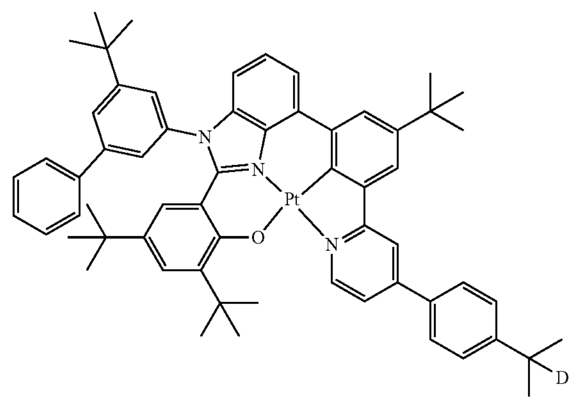

-continued
4-1611
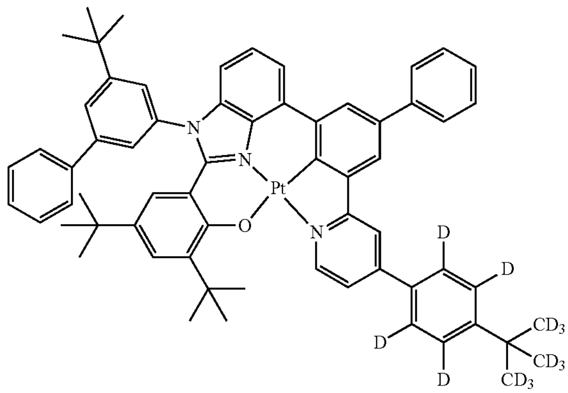
4-1612
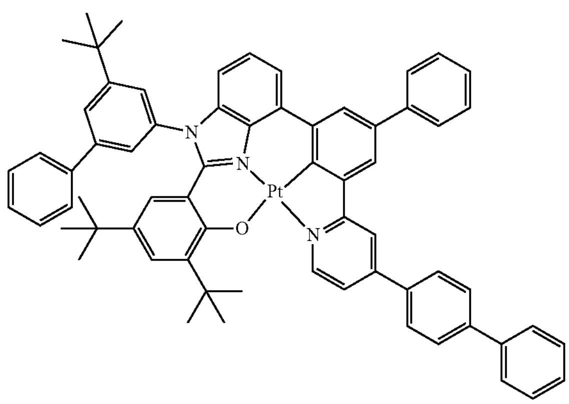
4-1613
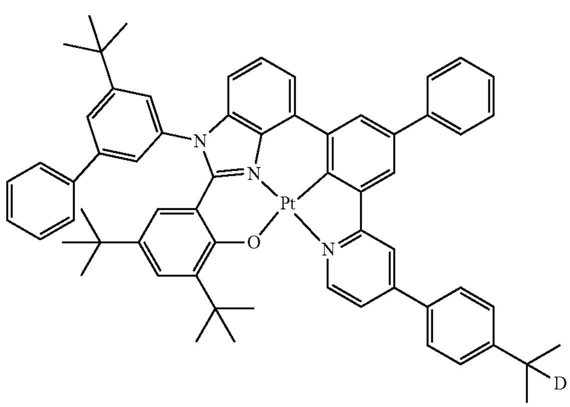
-continued
4-1614
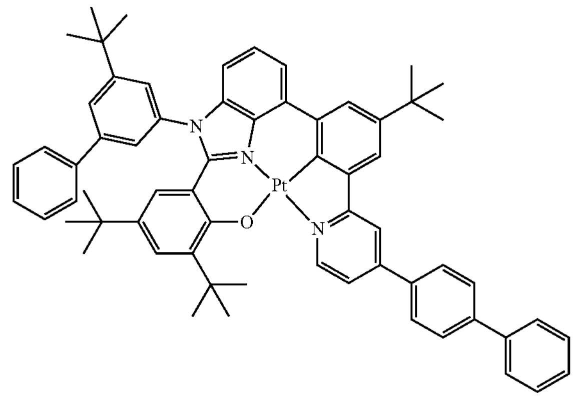
4-1615
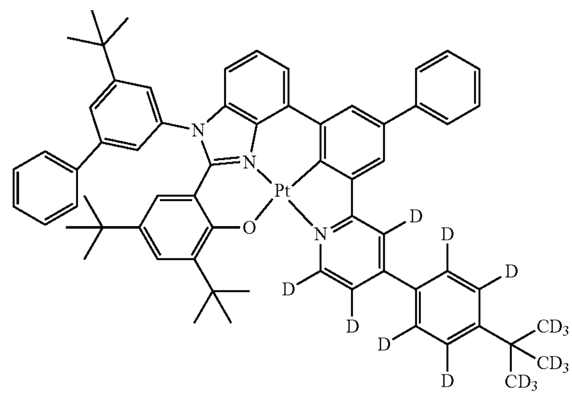
4-1616
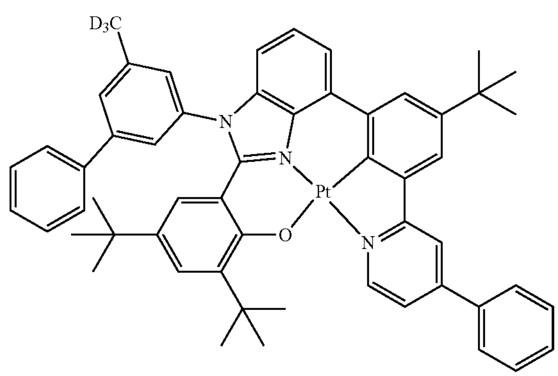
4-1617
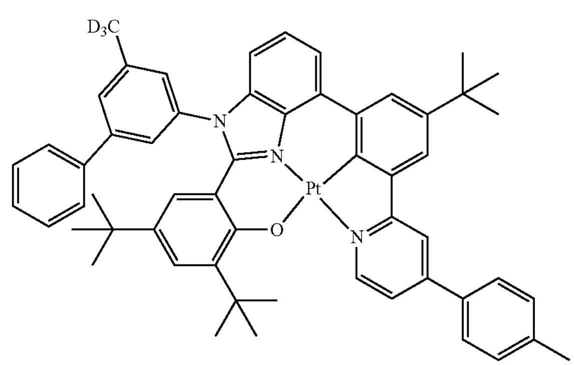

-continued
4-1618
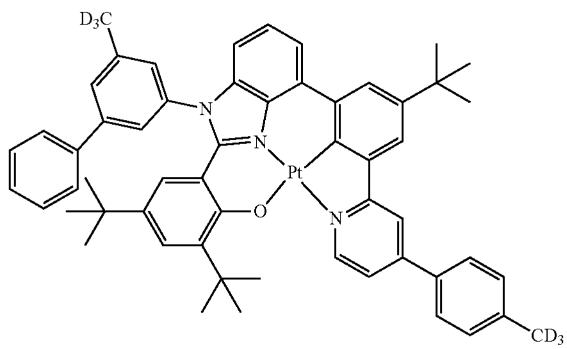
4-1619
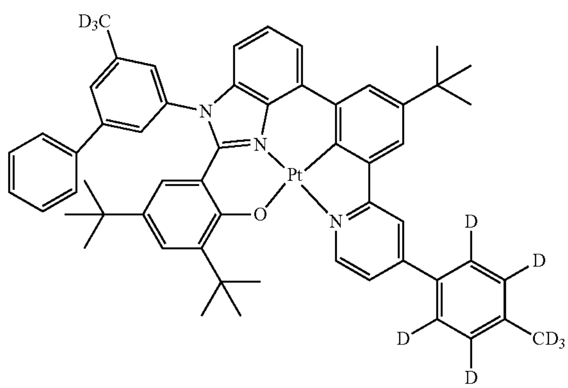
4-1620
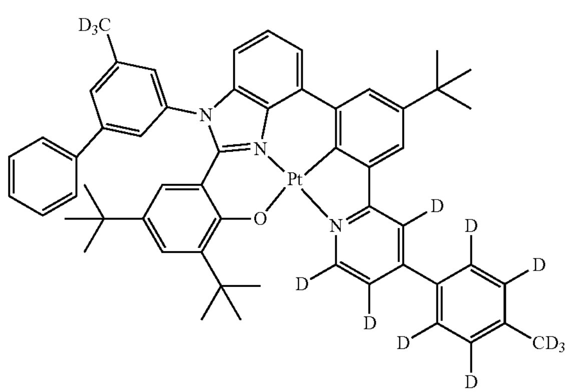
4-1621
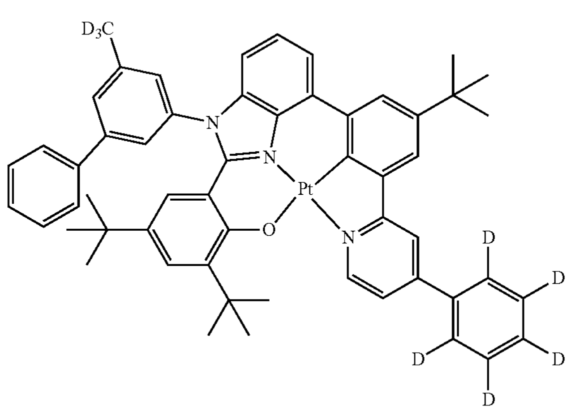
-continued
4-1622
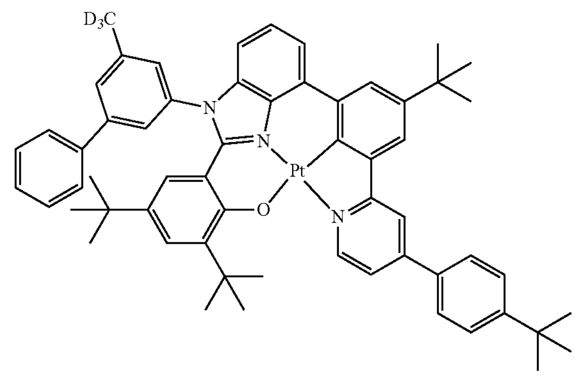
4-1623
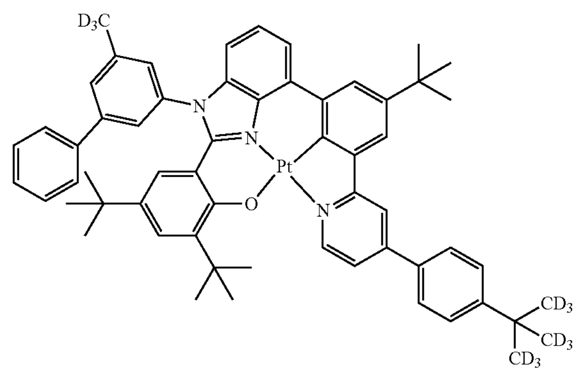
4-1624
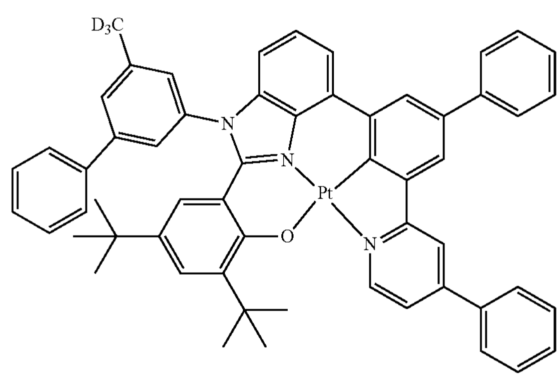
4-1625
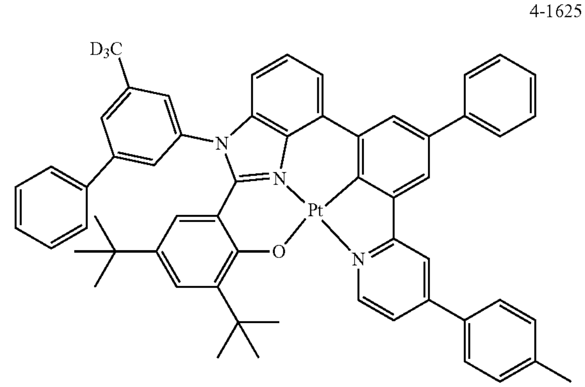

-continued
4-1626
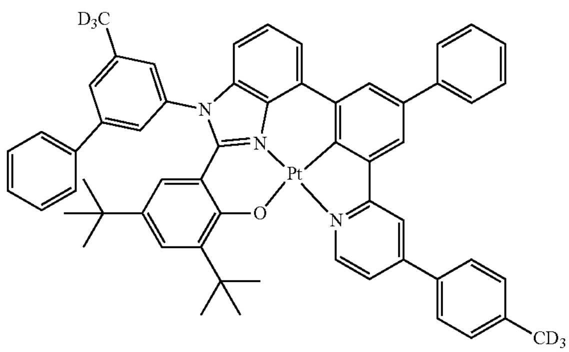
4-1627
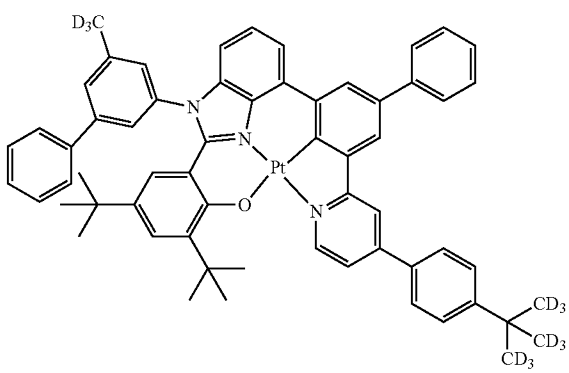
4-1628
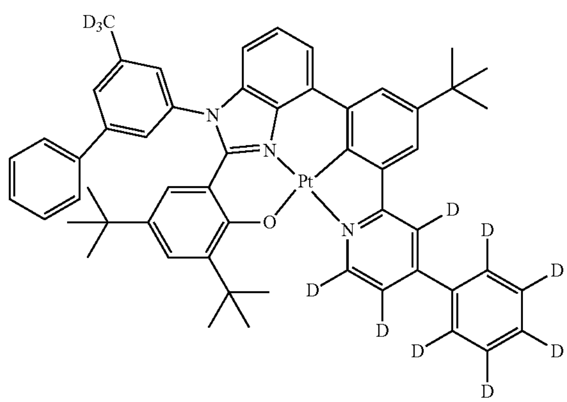
4-1629
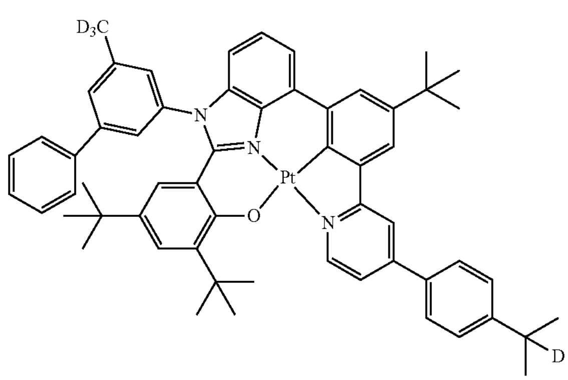
-continued
4-1630
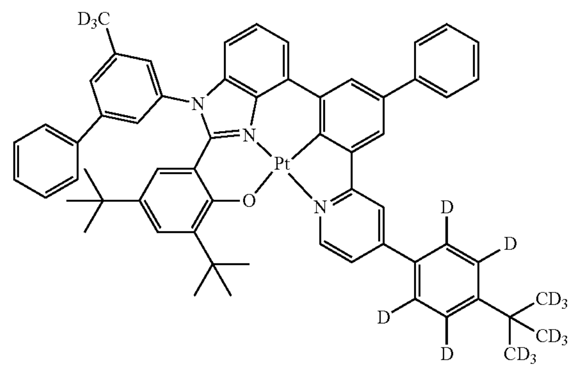
4-1631
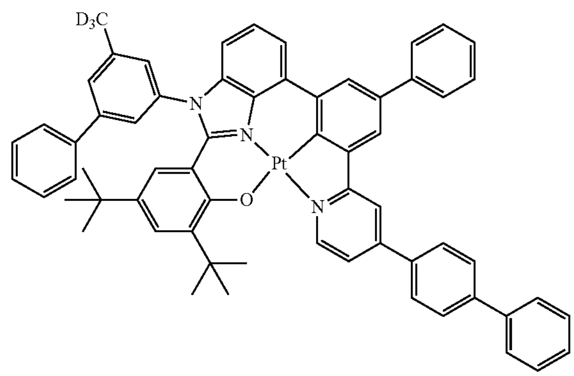
4-1632
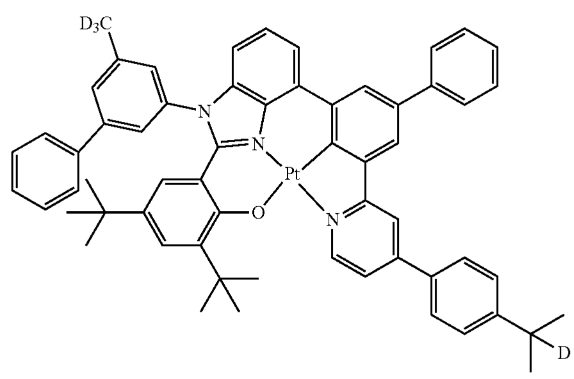
4-1633
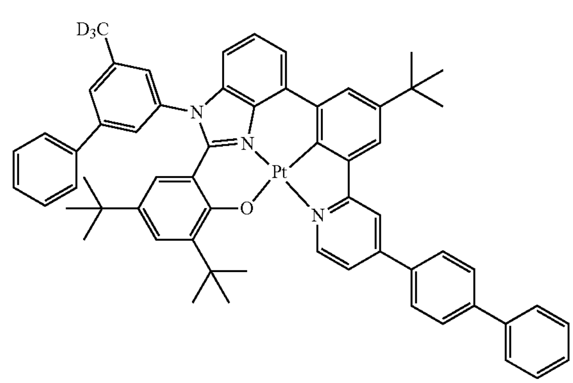

4-1634
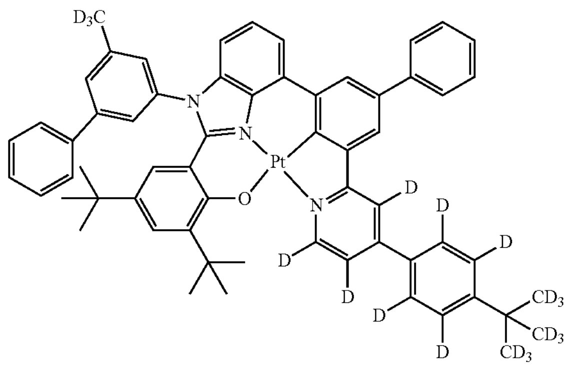
4-1635
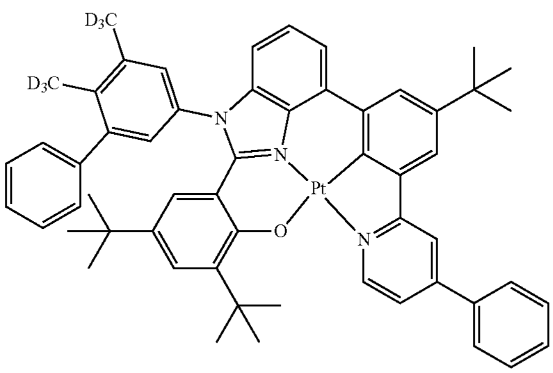
4-1636
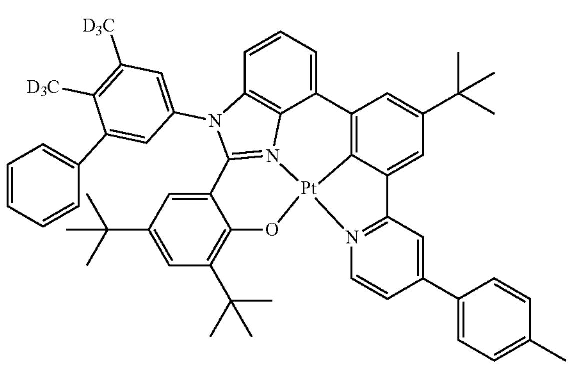
4-1637
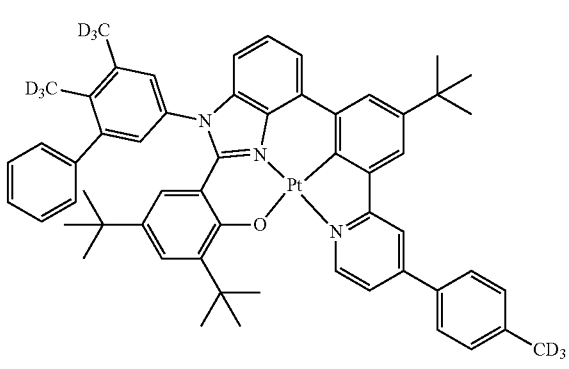
4-1638
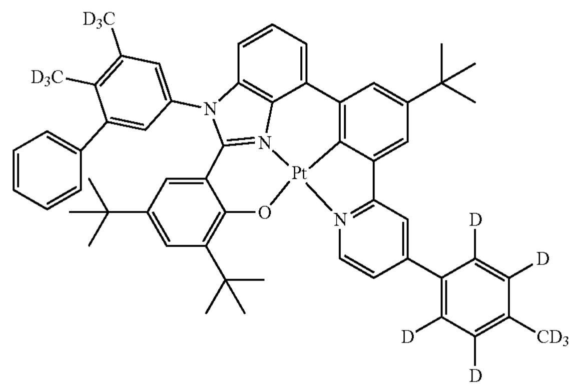
4-1639
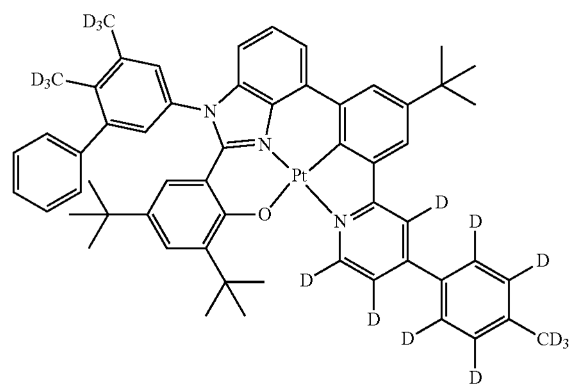
4-1640
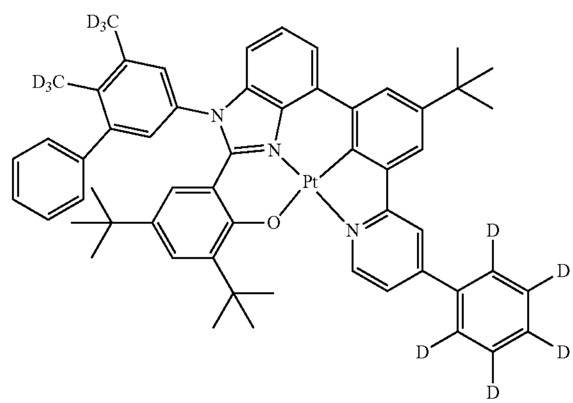
4-1641
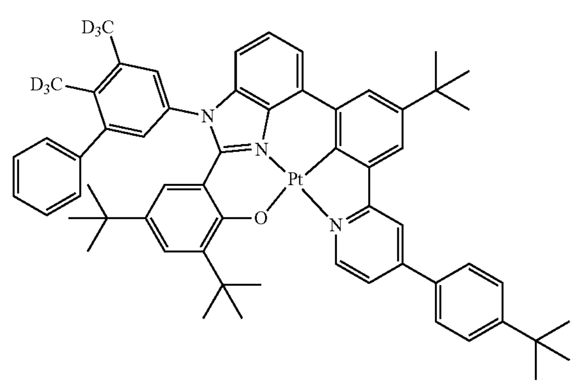

-continued
4-1642
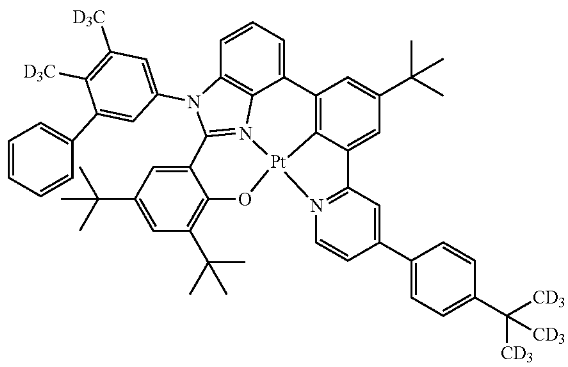
4-1643
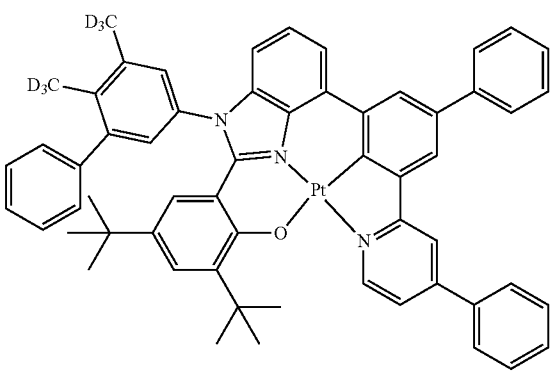
4-1644
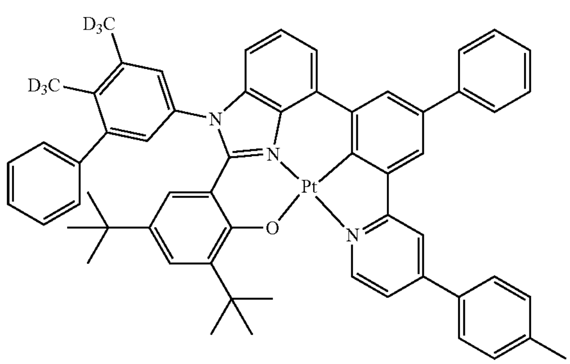
4-1645
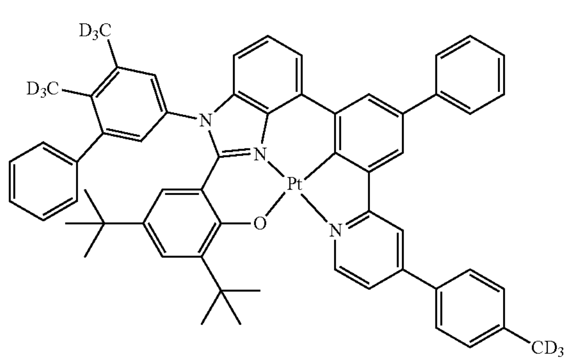
-continued
4-1646
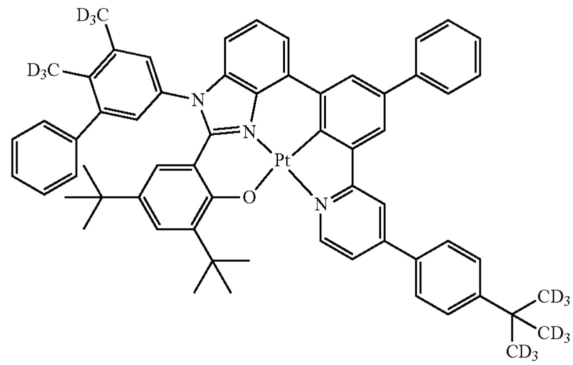
4-1647
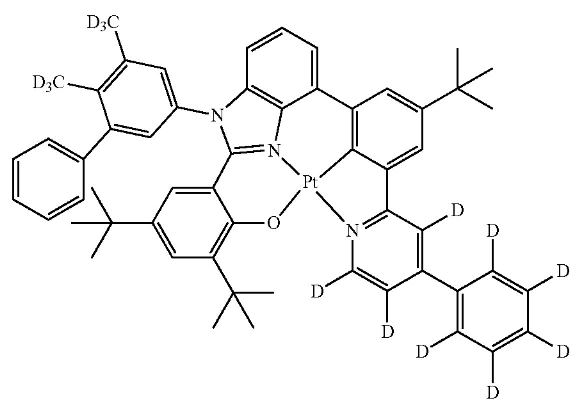
4-1648
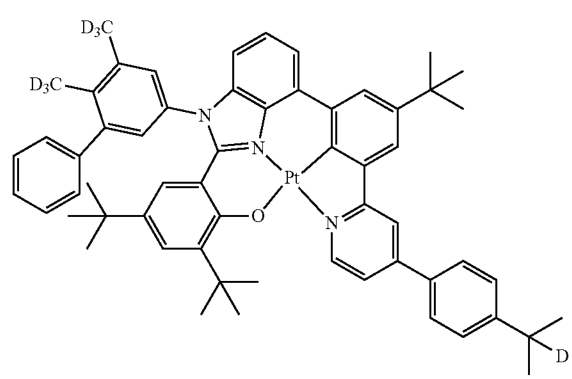
4-1649
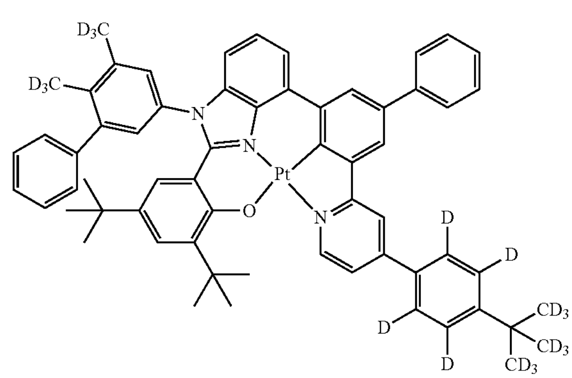

-continued
4-1650
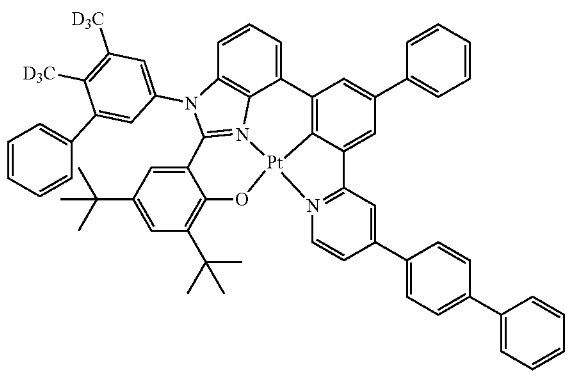
4-1651
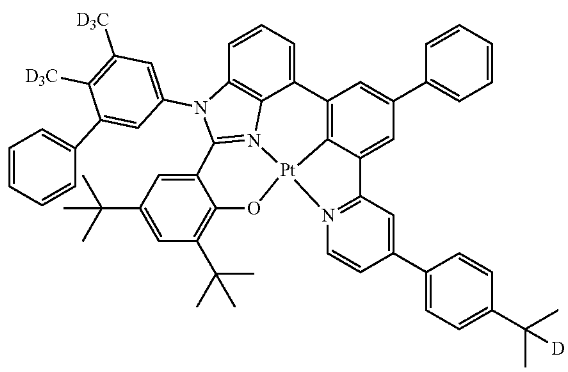
4-1652
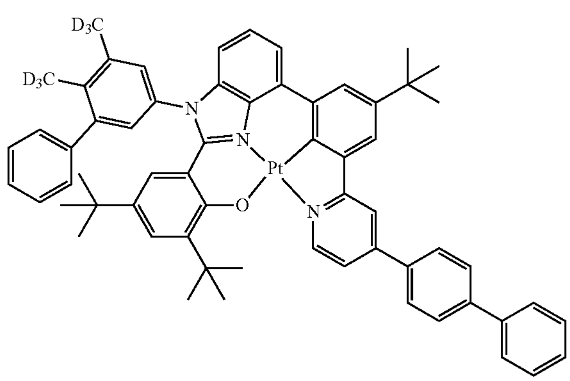
4-1653
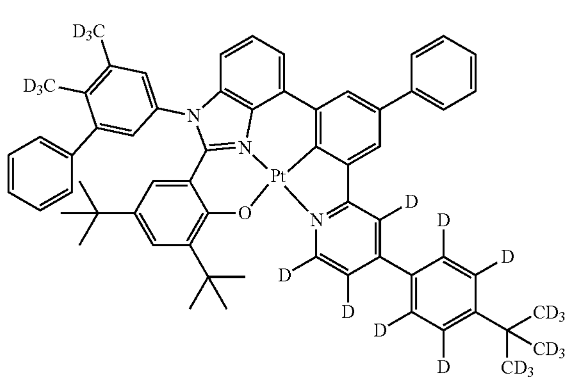
-continued
4-1654
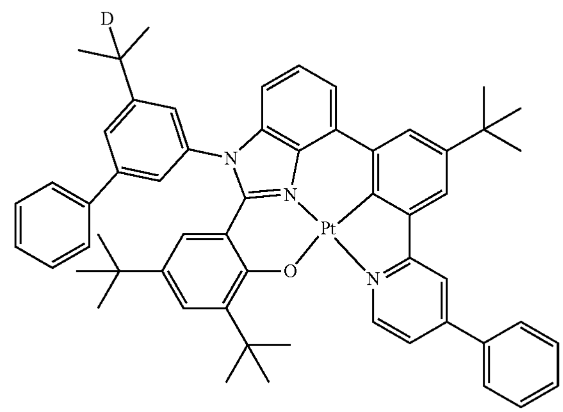
4-1655
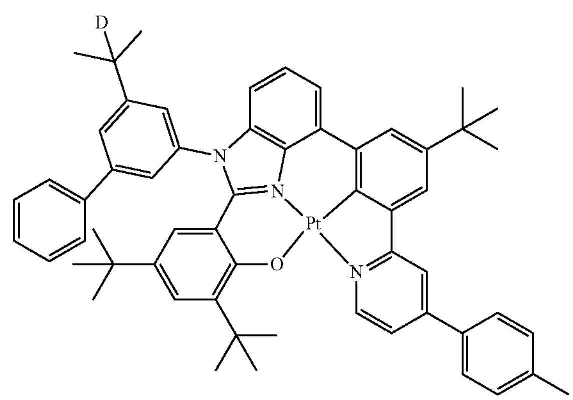
4-1656
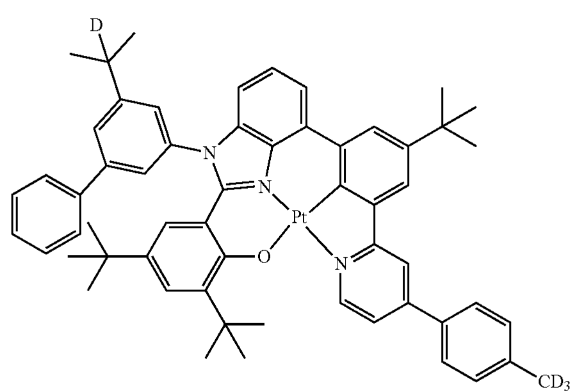

4-1657
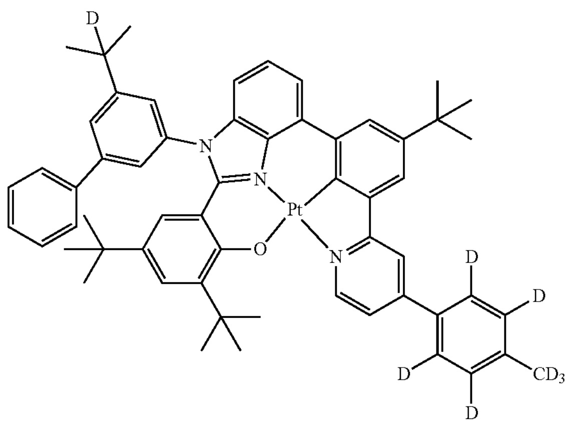
4-1658
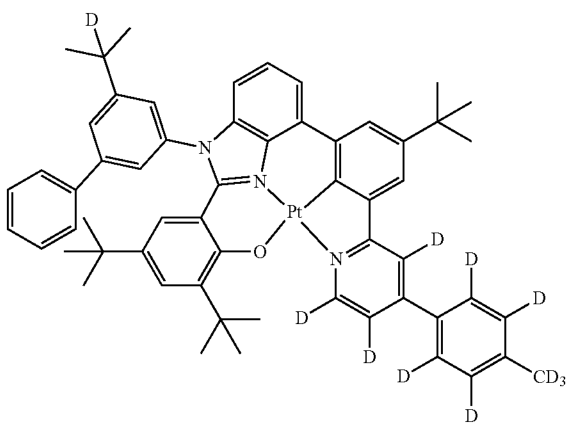
4-1659
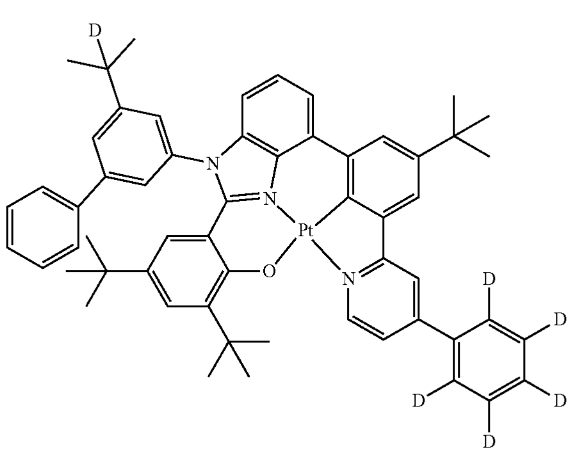
4-1660
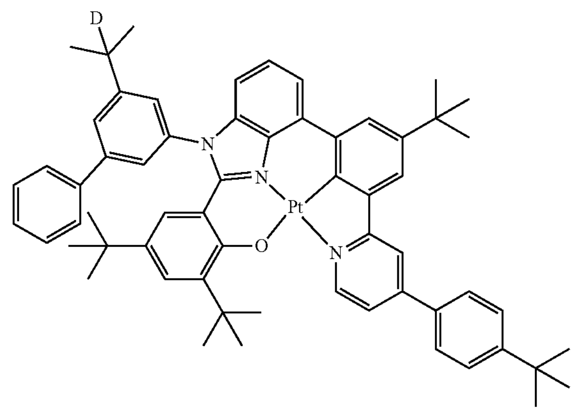
4-1661
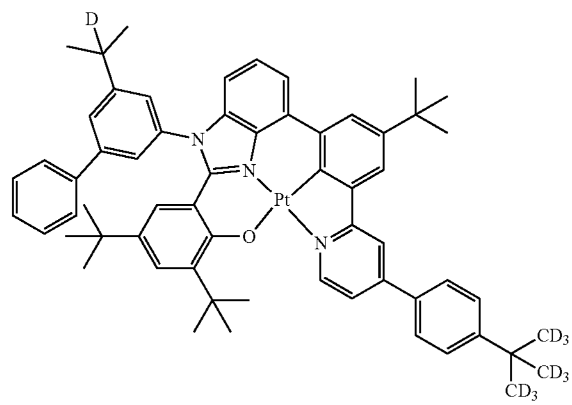
4-1662
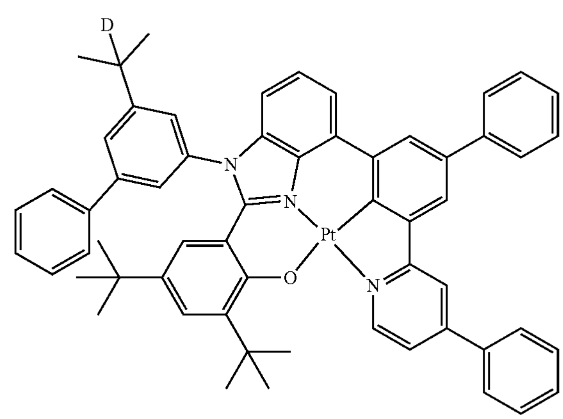

4-1663
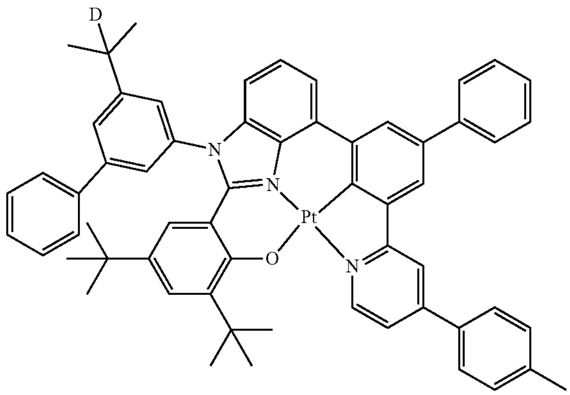
4-1664
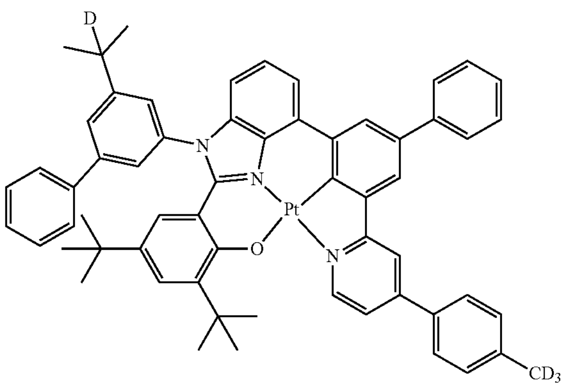
4-1665
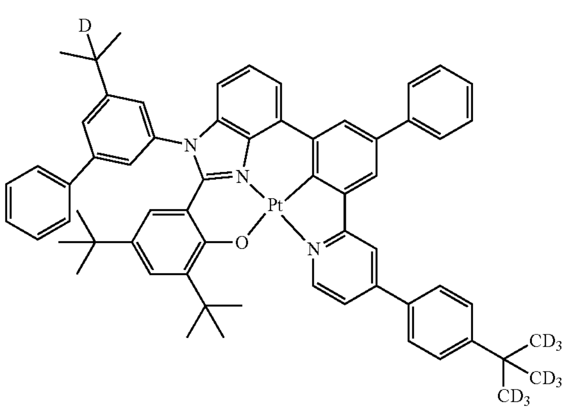
4-1666
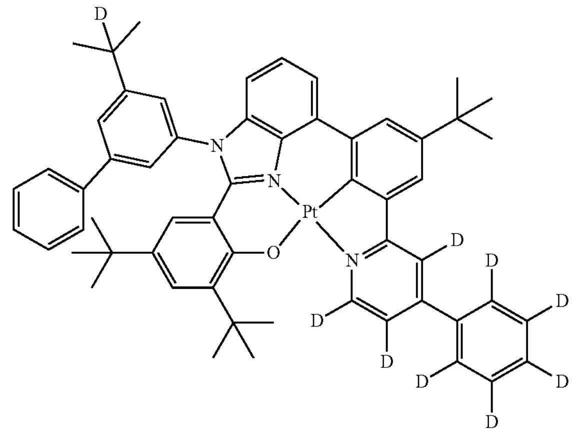
4-1667
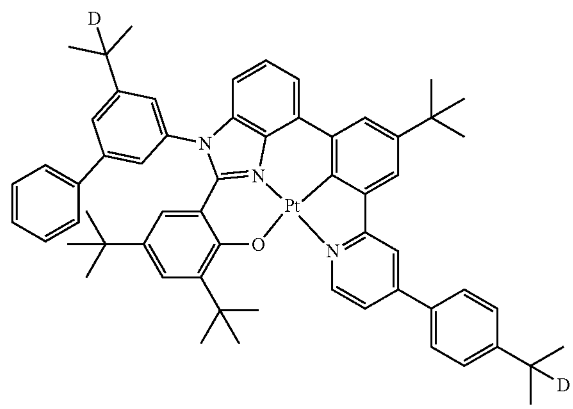
4-1668
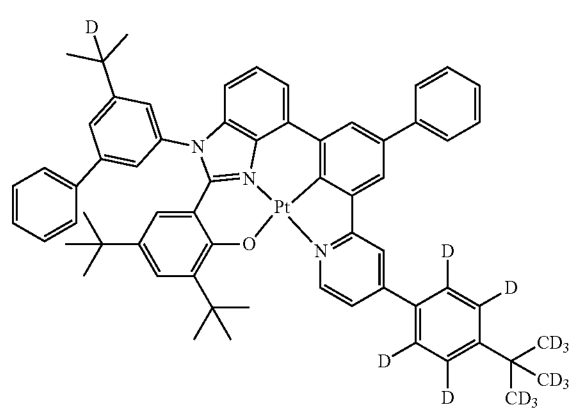

-continued
4-1669
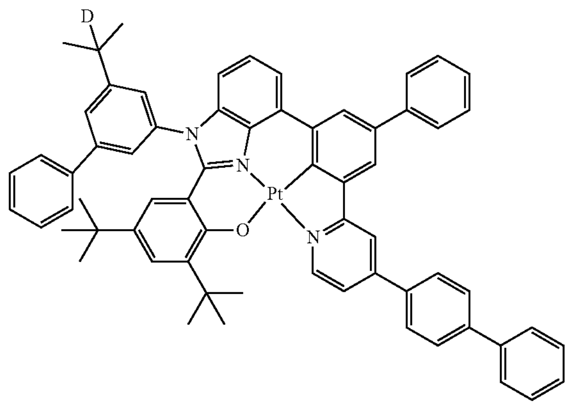
4-1670
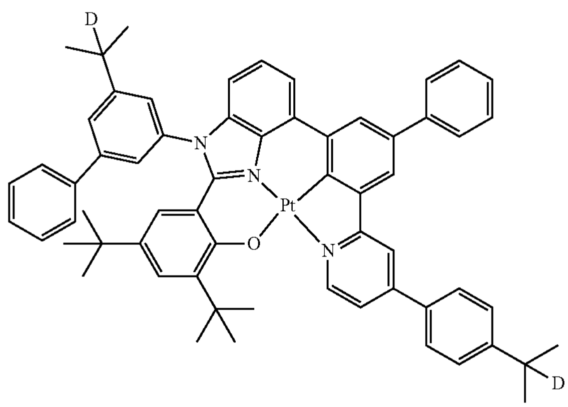
4-1671
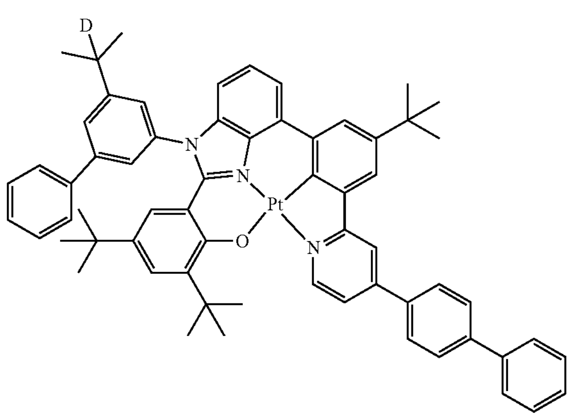
-continued
4-1672
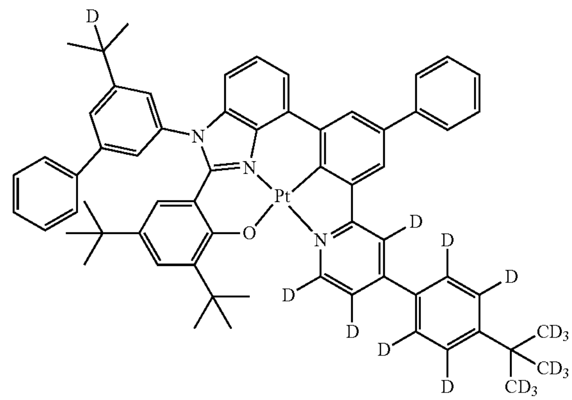
4-1673
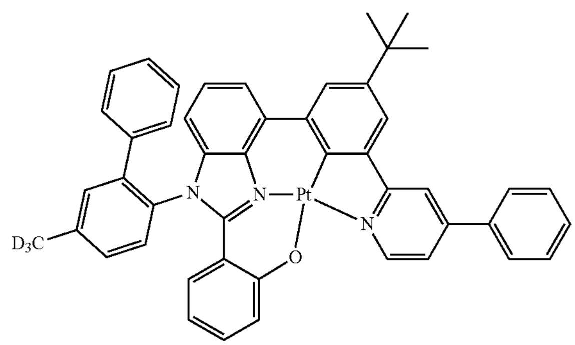
4-1674
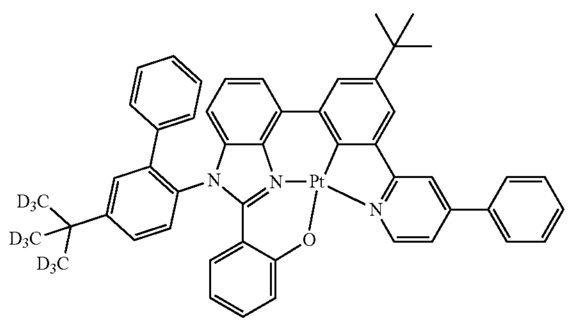
4-1675
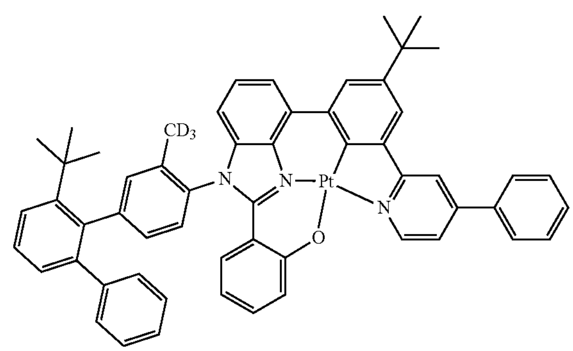

4-1676
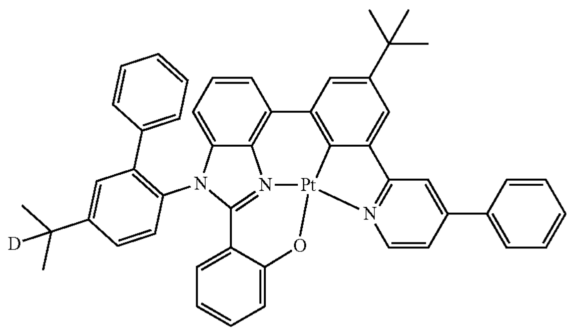
4-1677
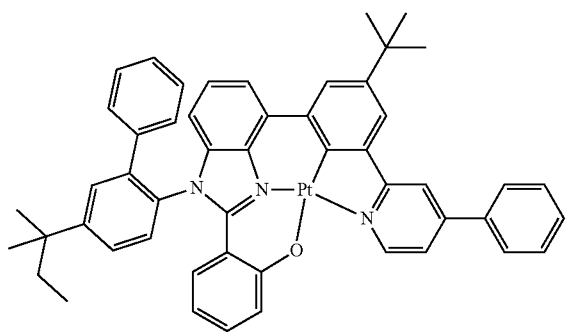
4-1678
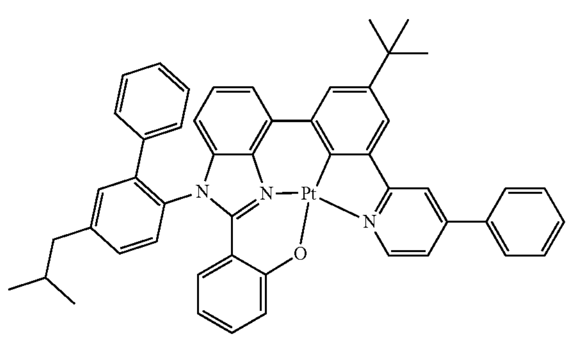
4-1679
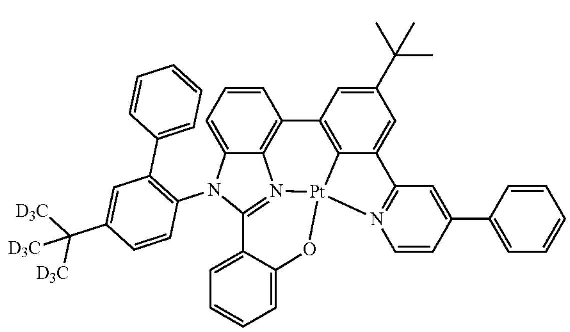
4-1680
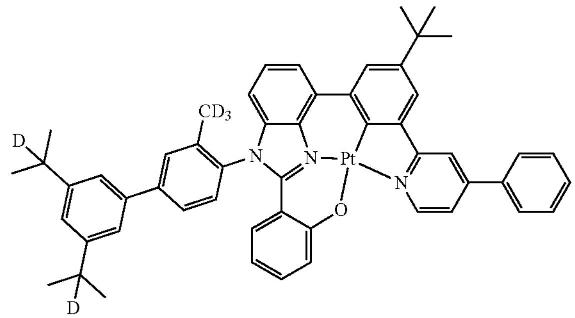
4-1681
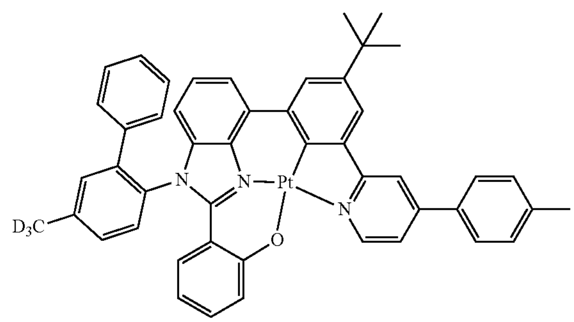
4-1682
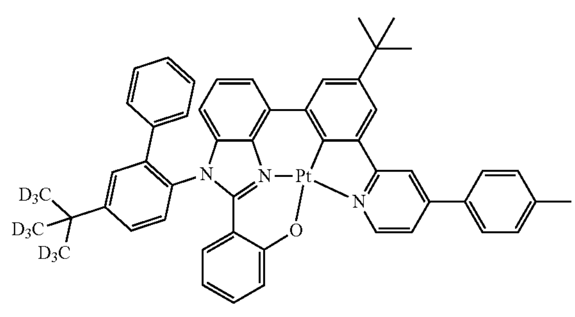
4-1683
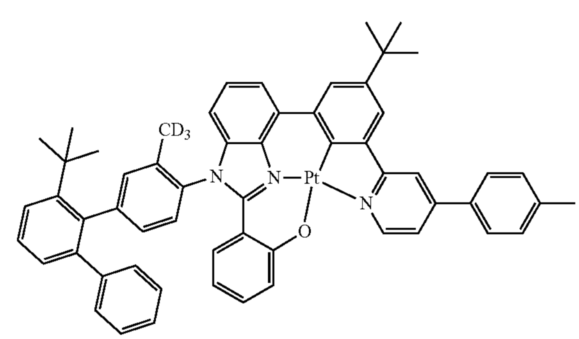

4-1684
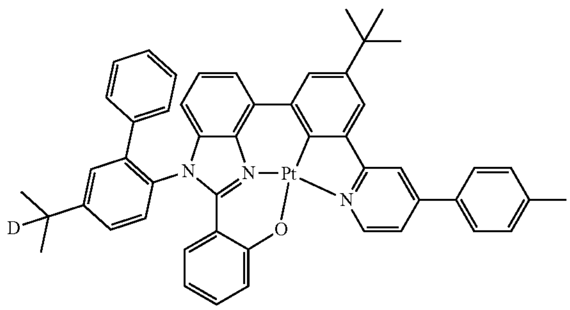
4-1685
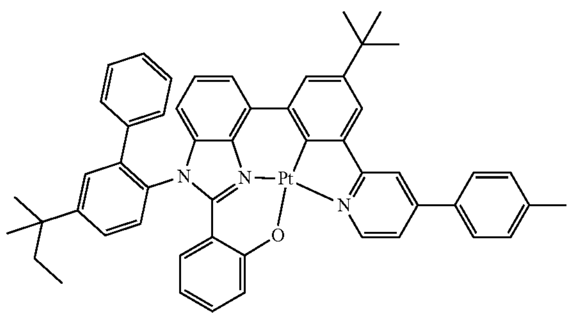
4-1686
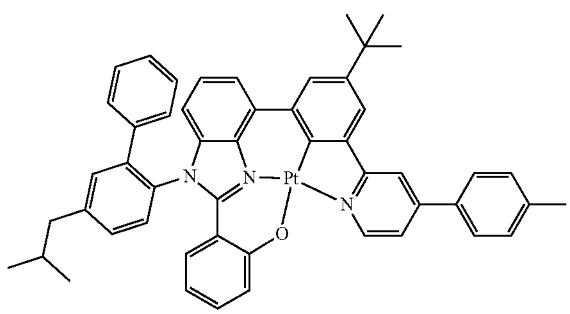
4-1687
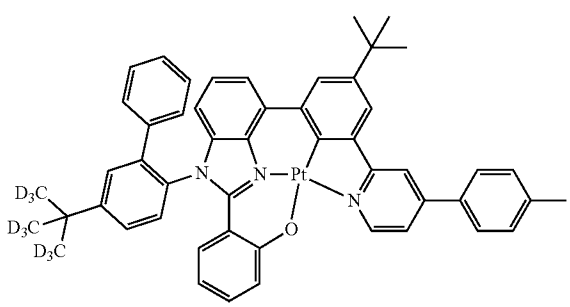
4-1688
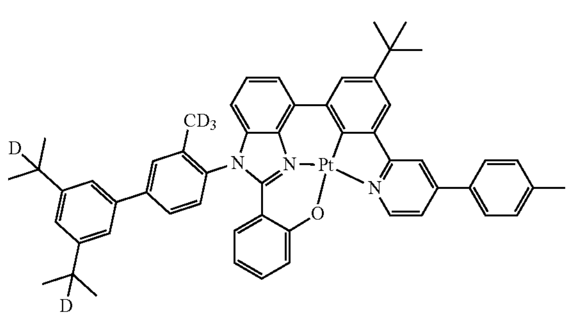
4-1689
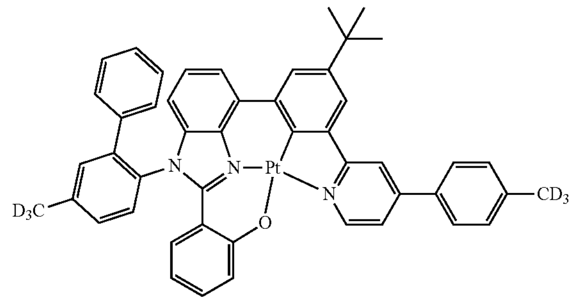
4-1690
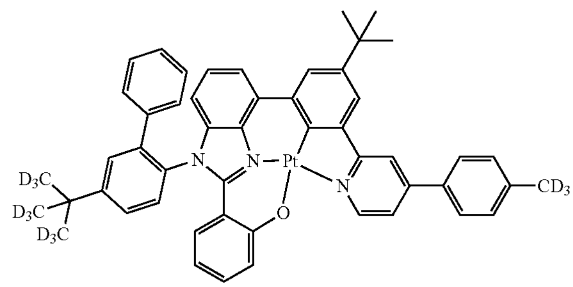
4-1691
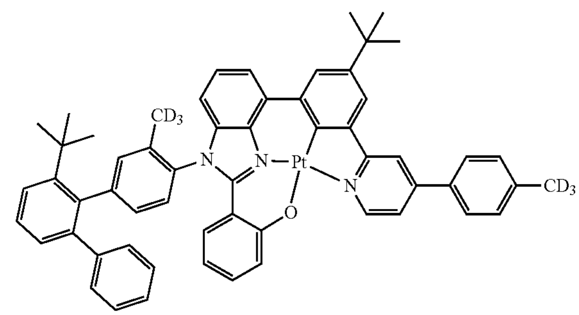
4-1692
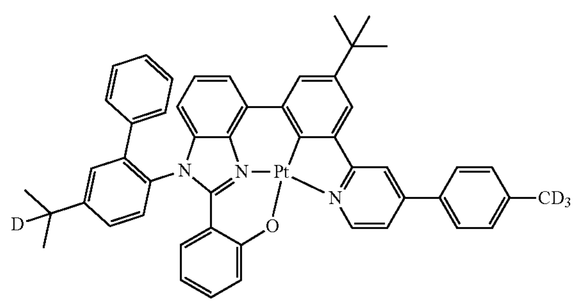
4-1693
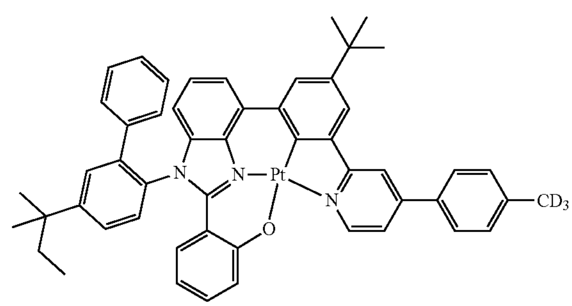

-continued
4-1694
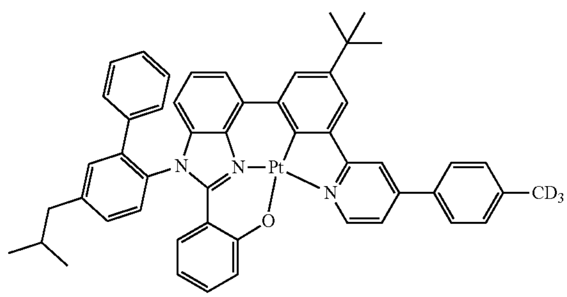
4-1695
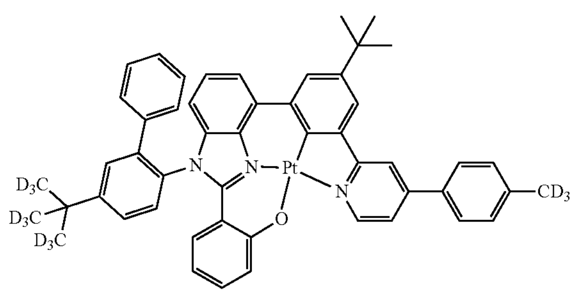
4-1696
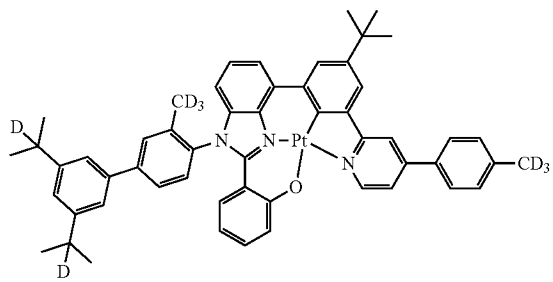
4-1697
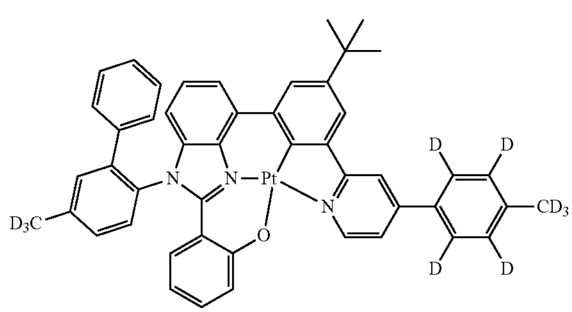
4-1698
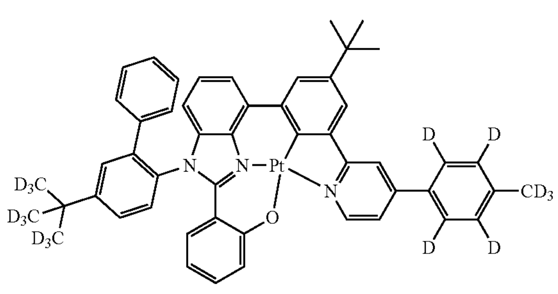
-continued
4-1699
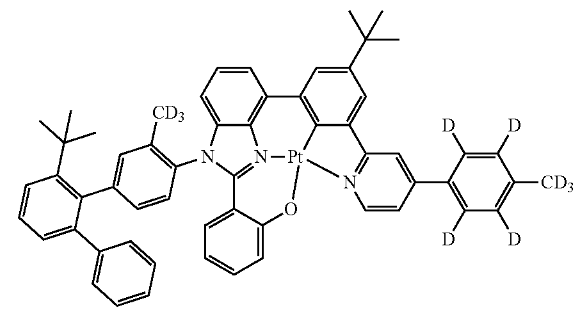
4-1700
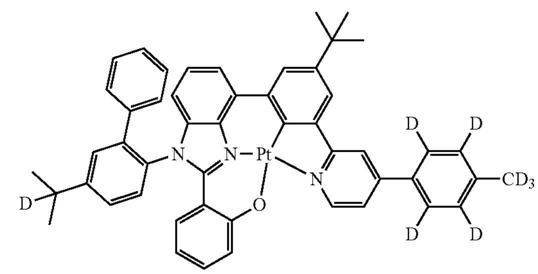
4-1701
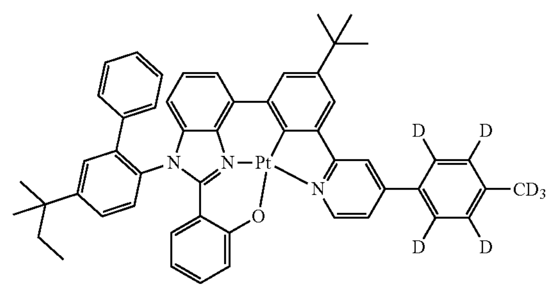
4-1702
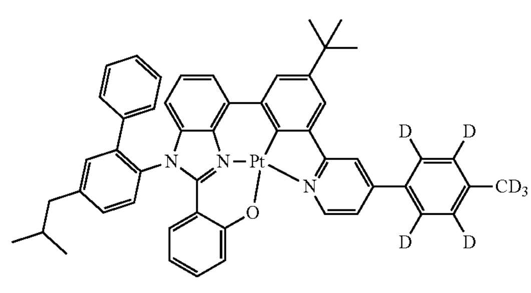
4-1703
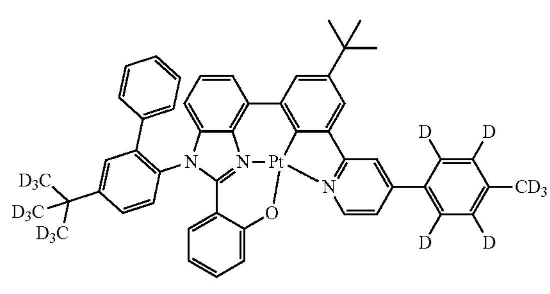

-continued
4-1704
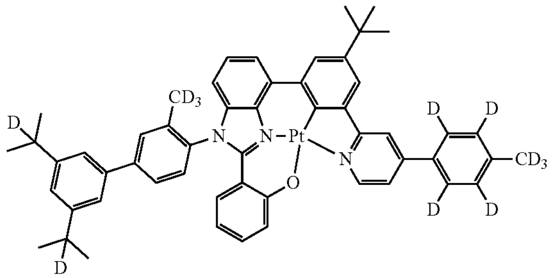
4-1705
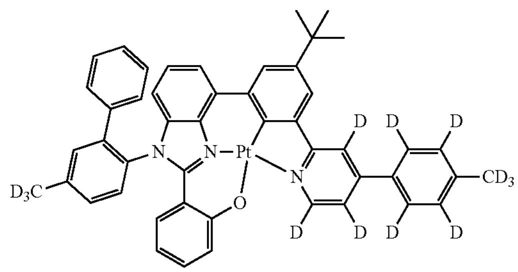
4-1706
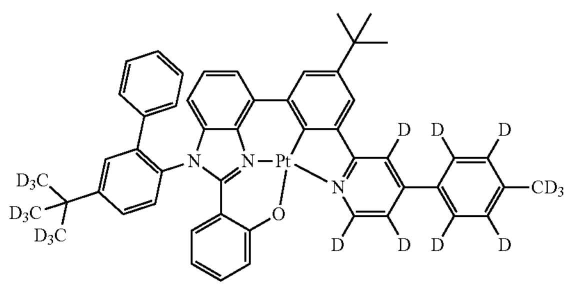
4-1707
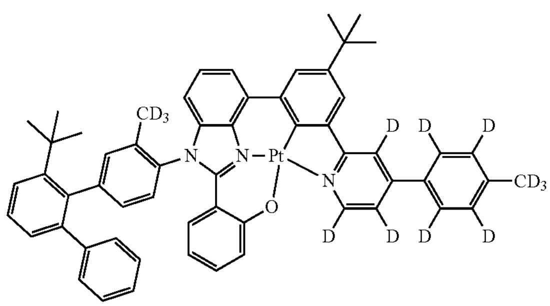
4-1708
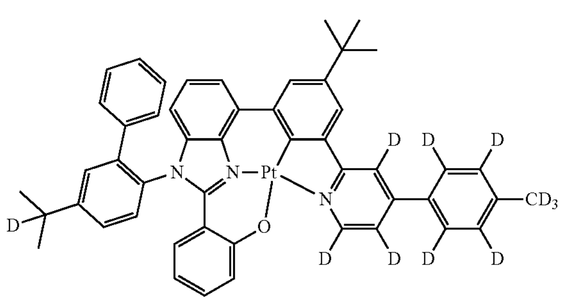
-continued
4-1709
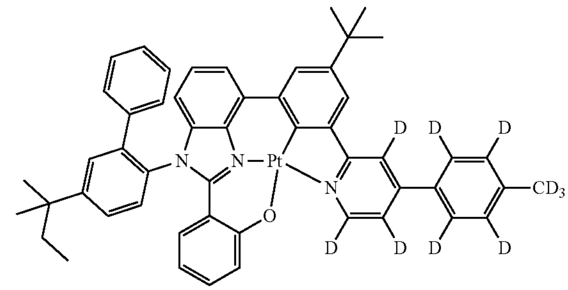
4-1710
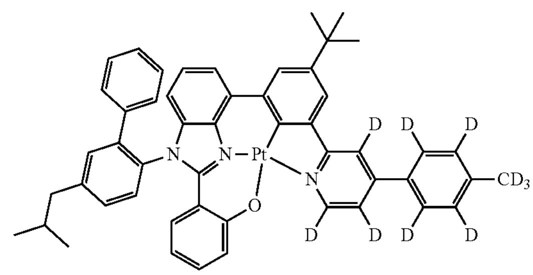
4-1711
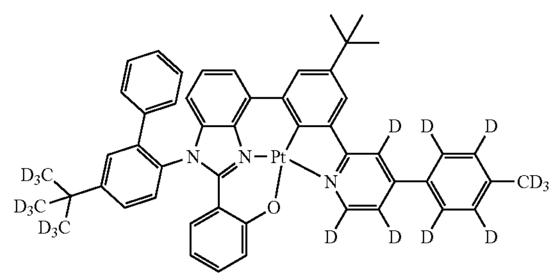
4-1712
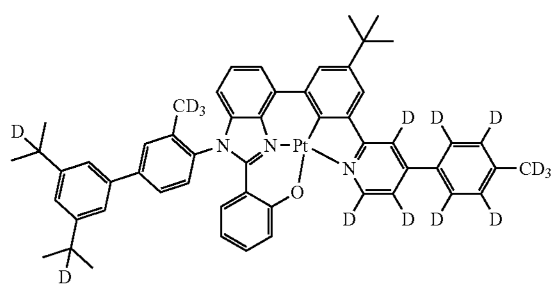
4-1713
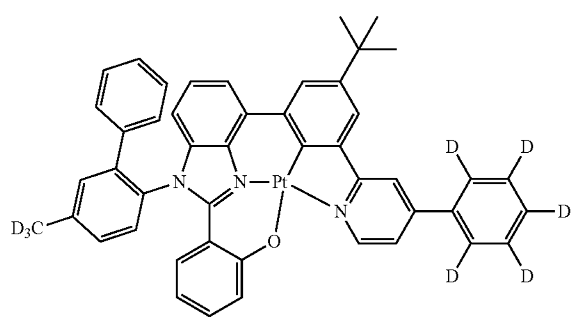

-continued
4-1714
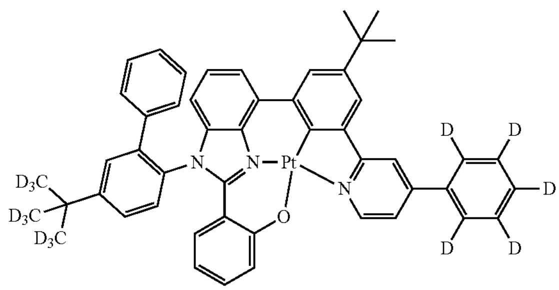
4-1715
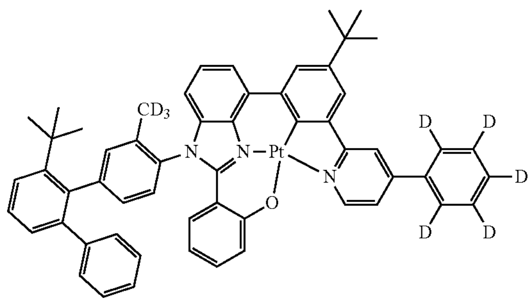
4-1716
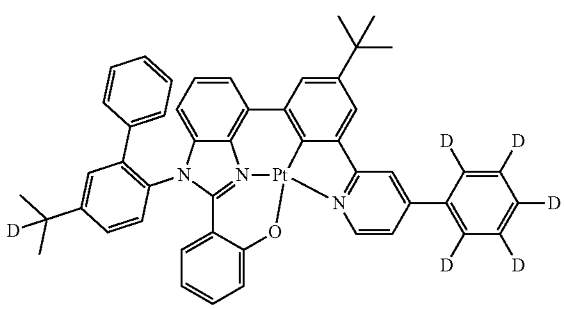
4-1717
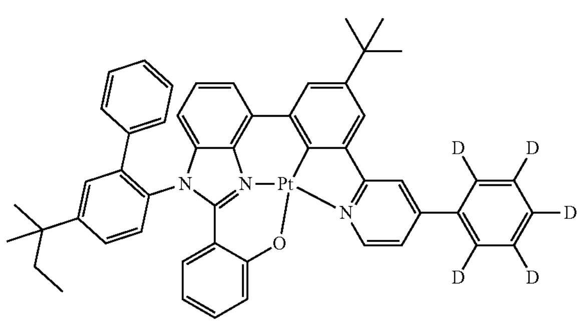
4-1718
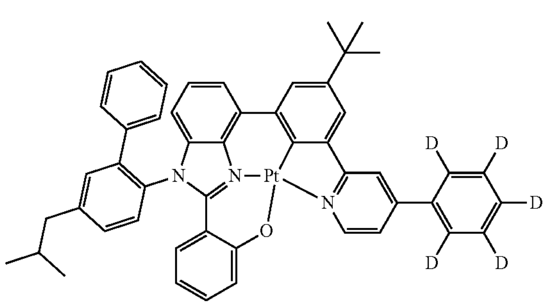
-continued
4-1719
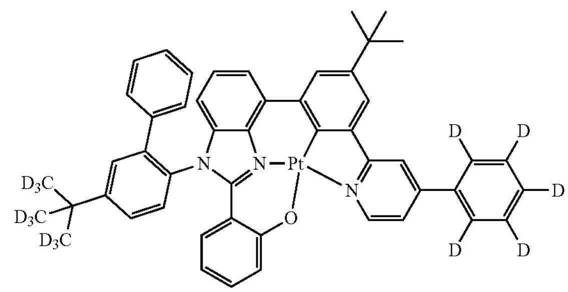
4-1720
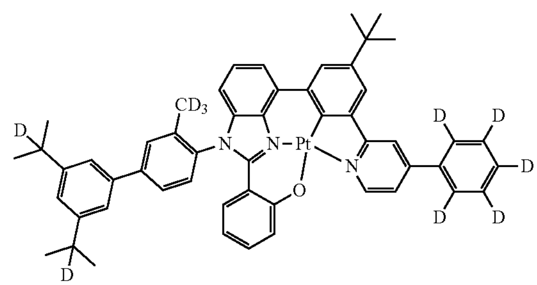
4-1721
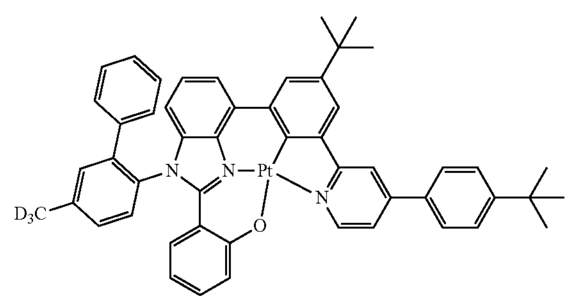
4-1722
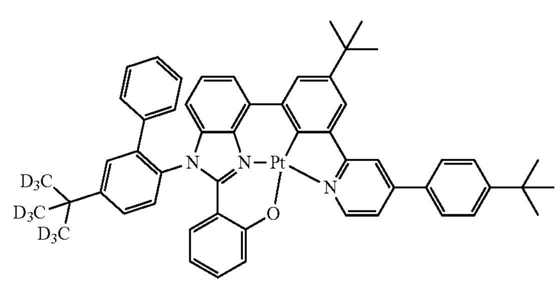
4-1723
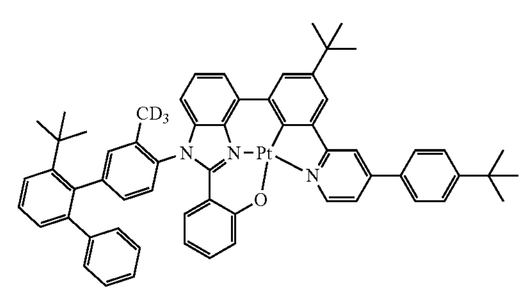

-continued
4-1724
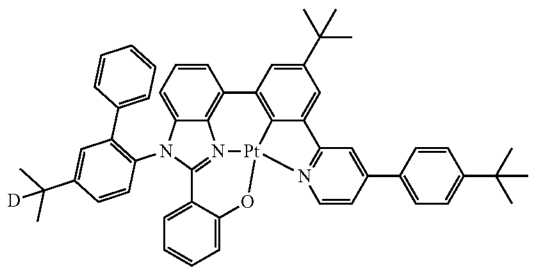
4-1725
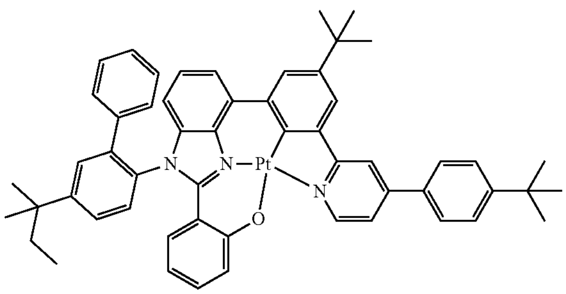
4-1726
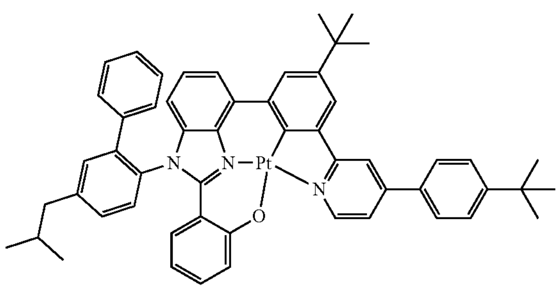
4-1727
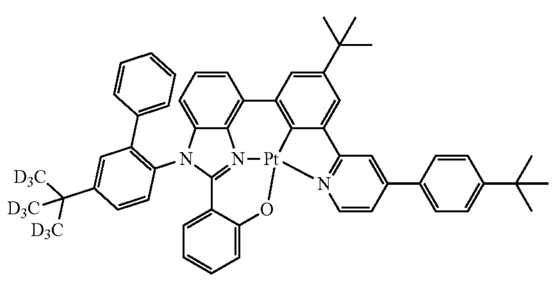
4-1728
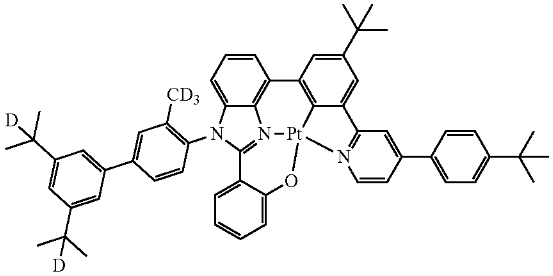
-continued
4-1729
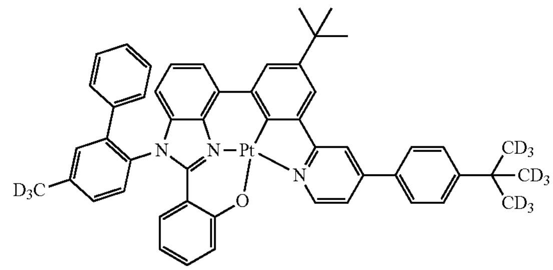
4-1730
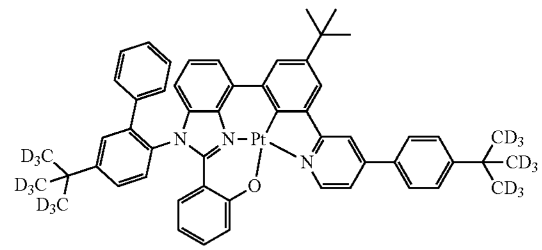
4-1731
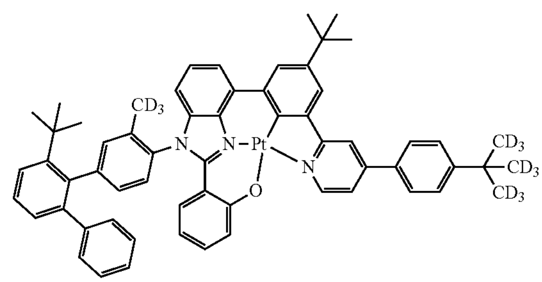
4-1732
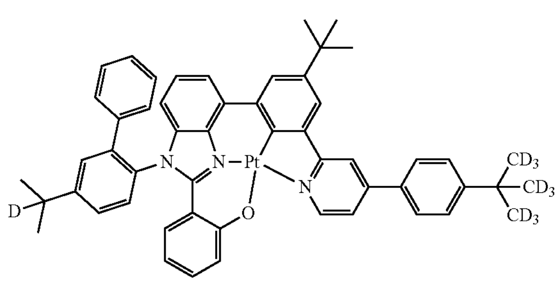
4-1733
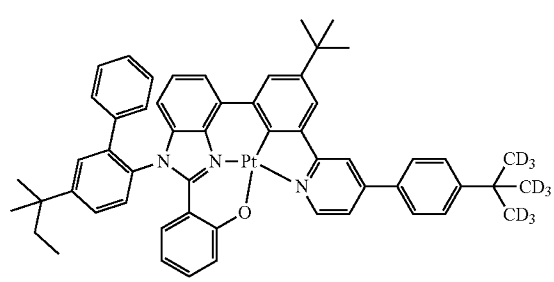

-continued
4-1734
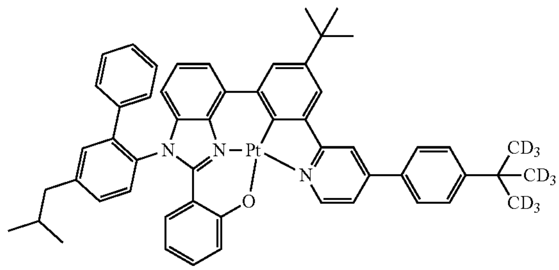
4-1735
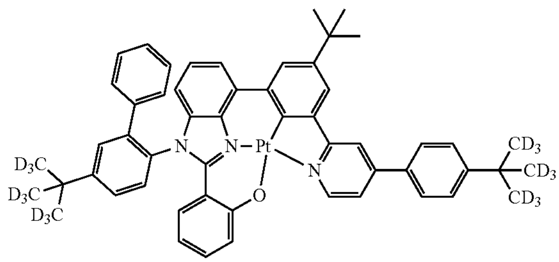
4-1736
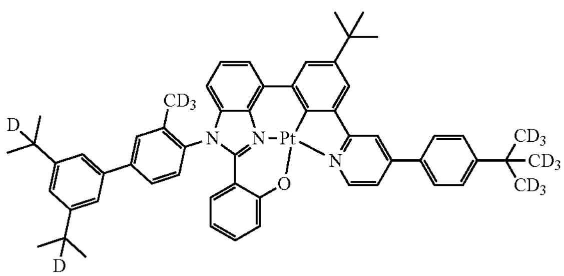
4-1737
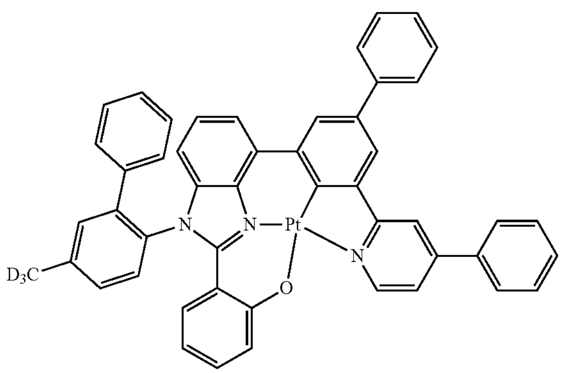
4-1738
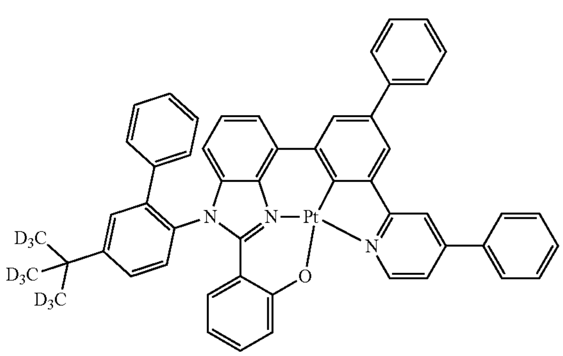
-continued
4-1739
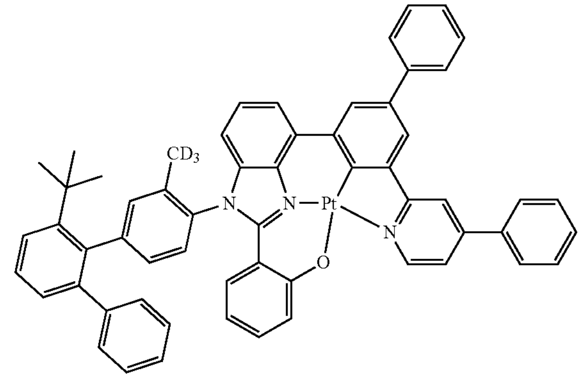
4-1740
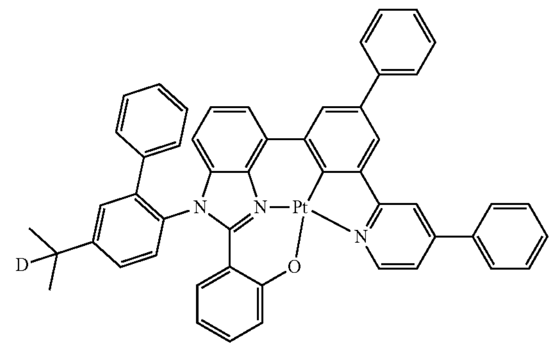
4-1741
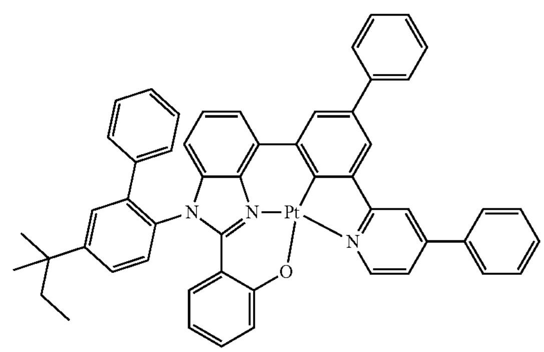
4-1742
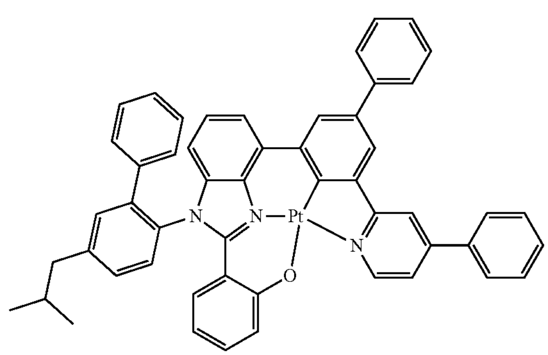

-continued
4-1743
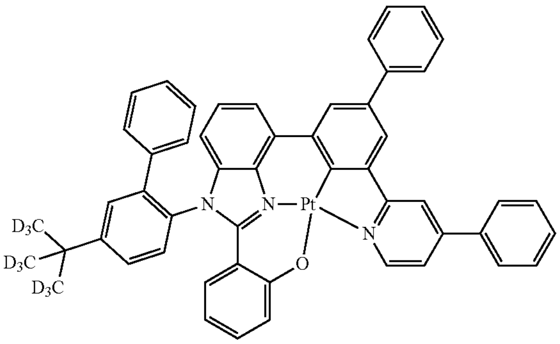
4-1744
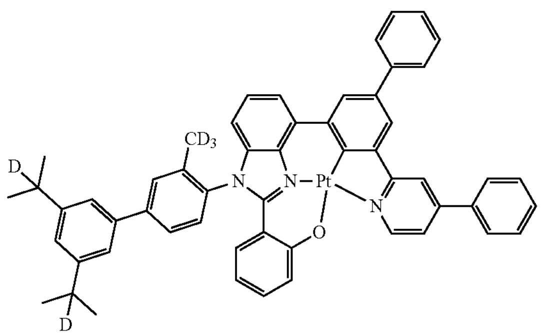
4-1745
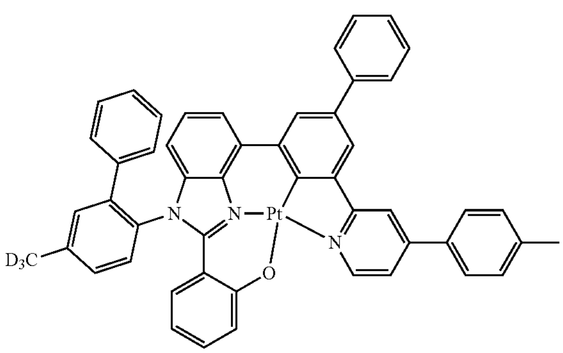
4-1746
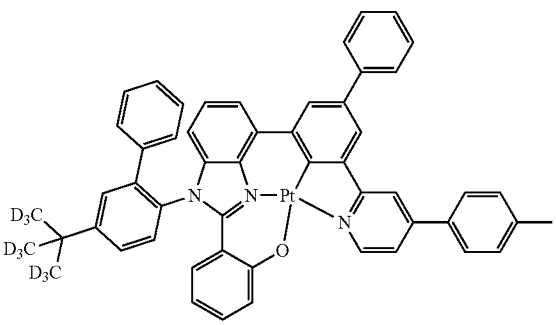
-continued
4-1747
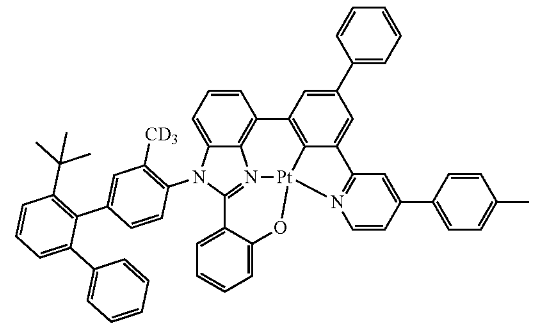
4-1748
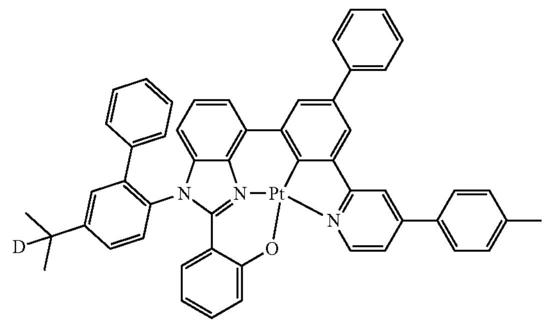
4-1749
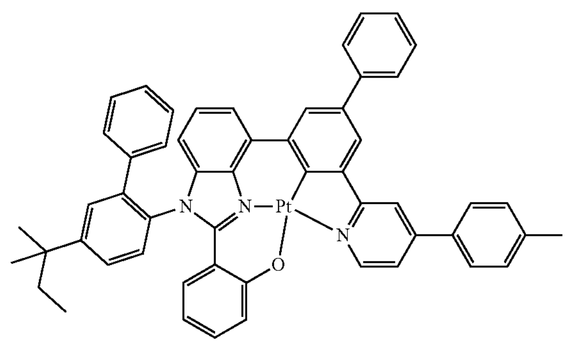
4-1750
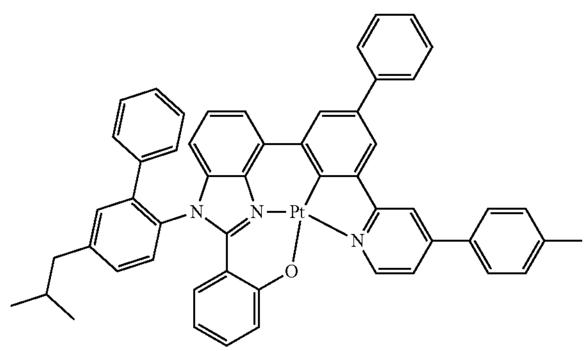

-continued
4-1751
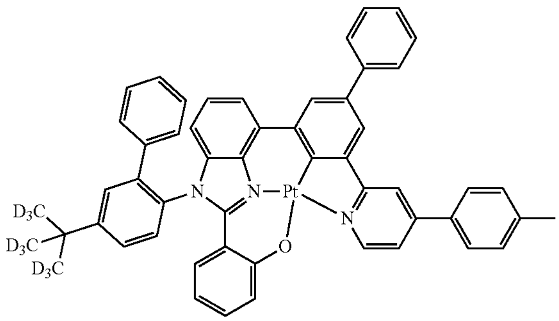
4-1752
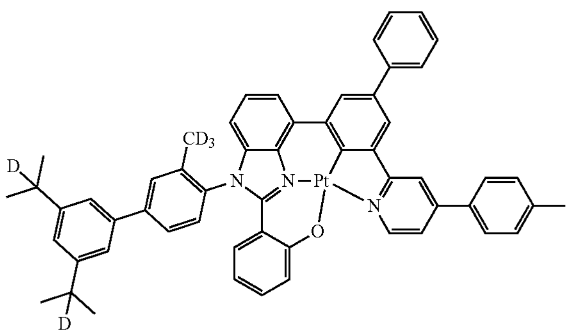
4-1753
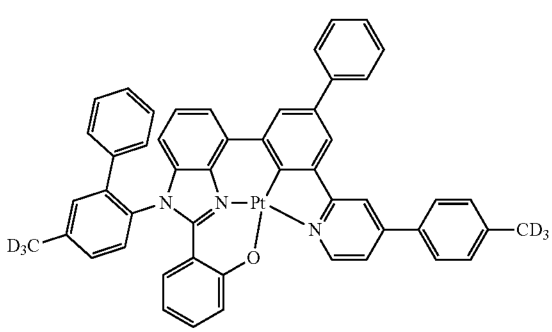
4-1754
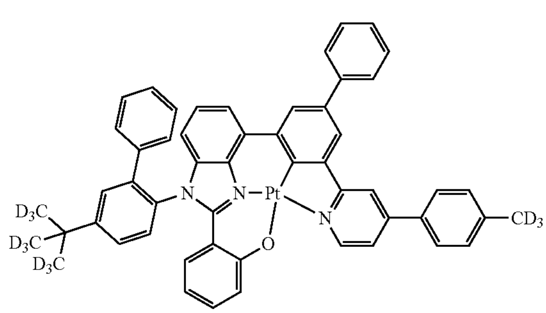
-continued
4-1755
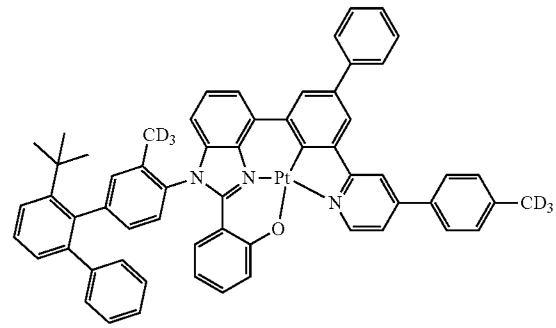
4-1756
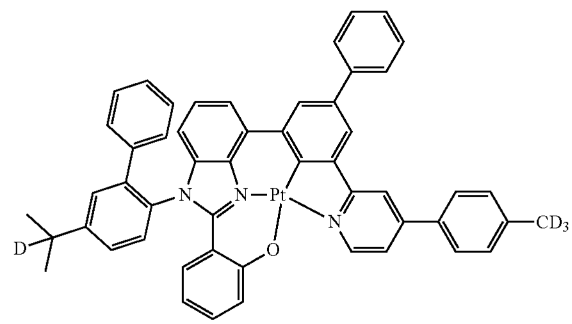
4-1757
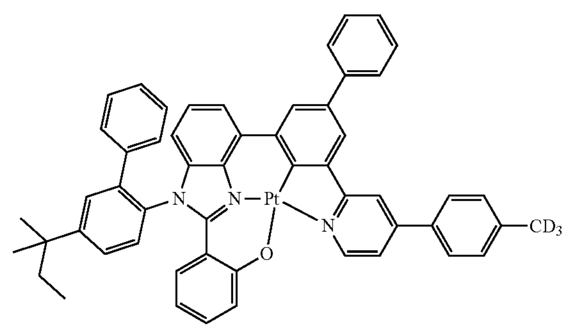
4-1758
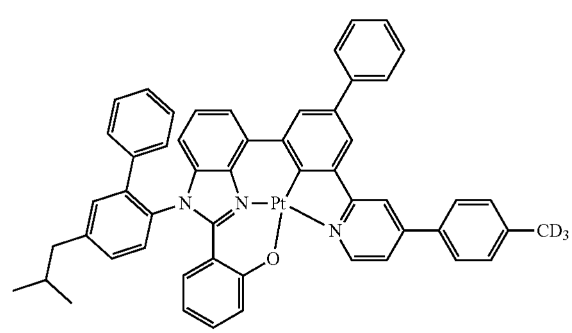

-continued
4-1759
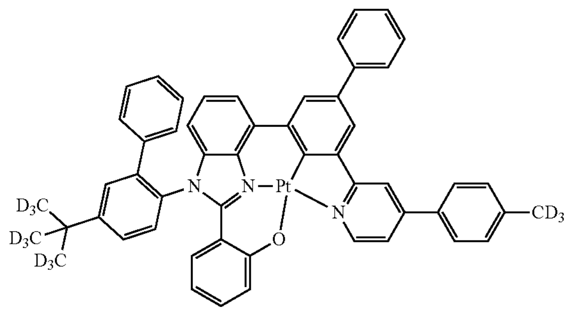
4-1760
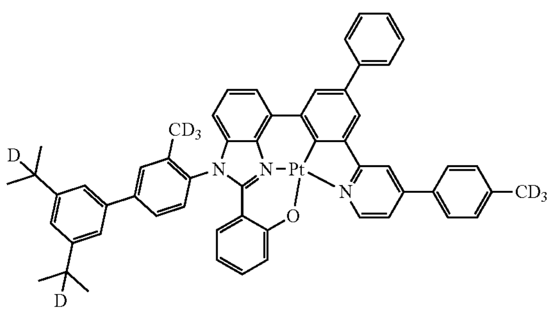
4-1761
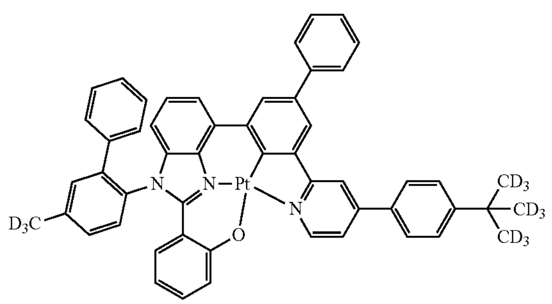
4-1762
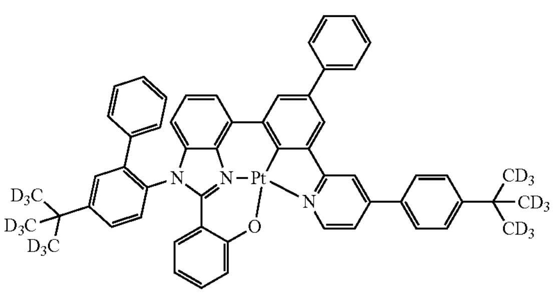
4-1763
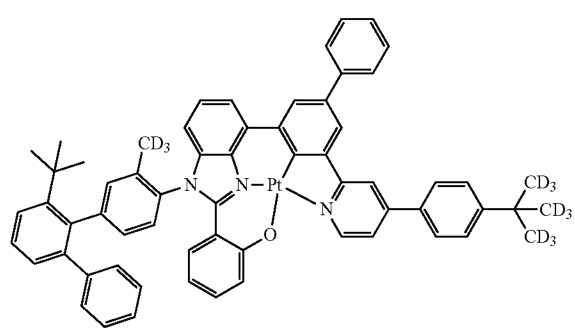
-continued
4-1764
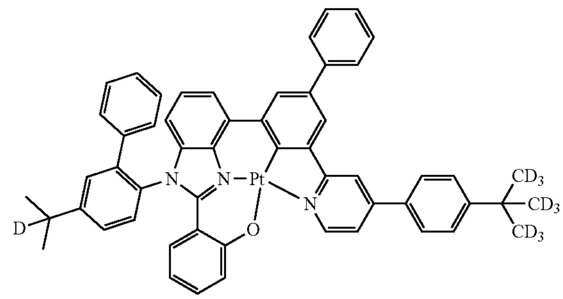
4-1765
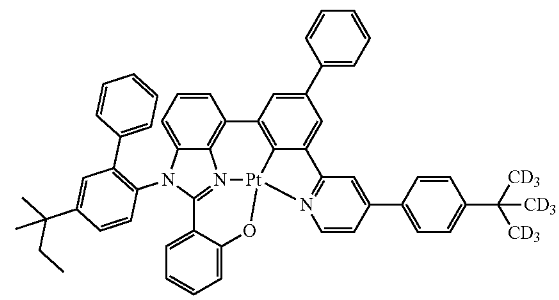
4-1766
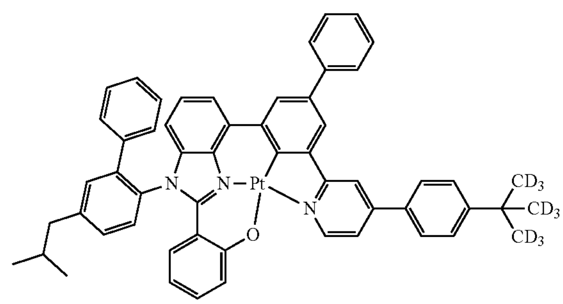
4-1767
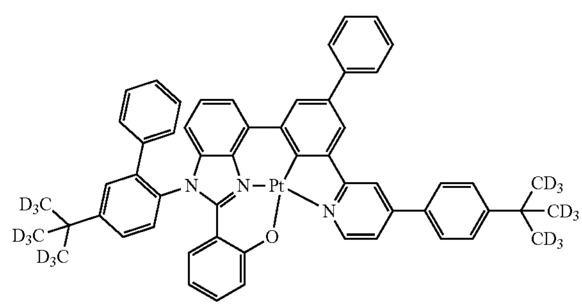
4-1768
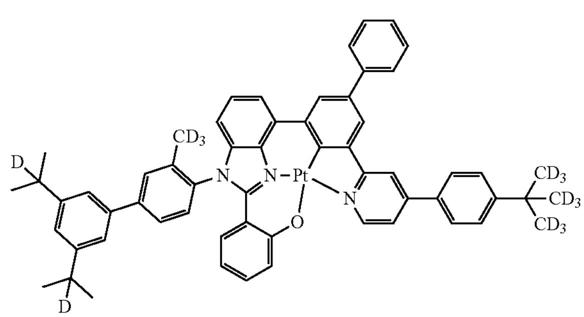

-continued
4-1769
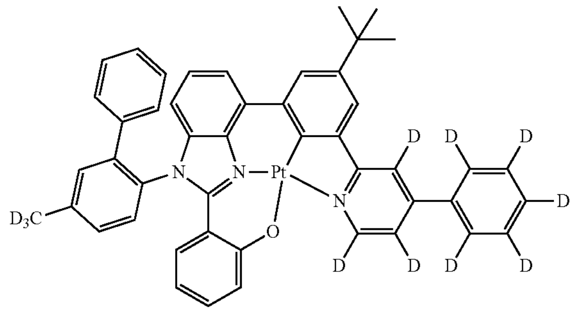
4-1770
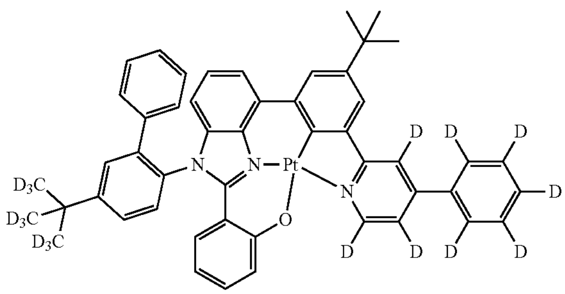
4-1771
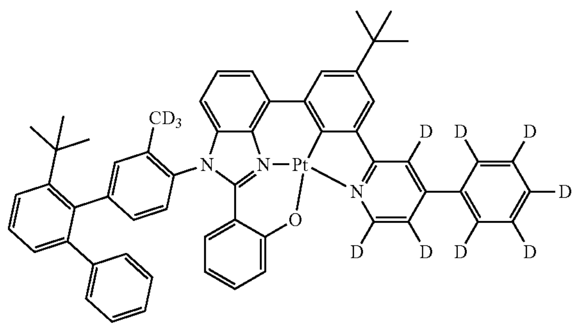
4-1772
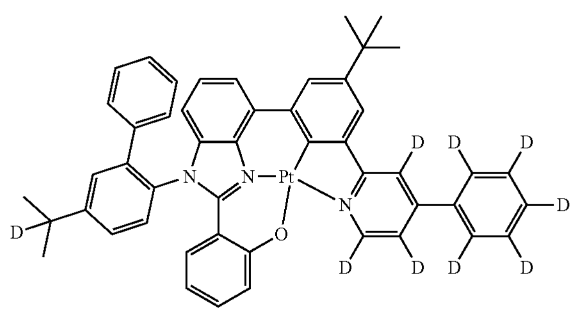
4-1773
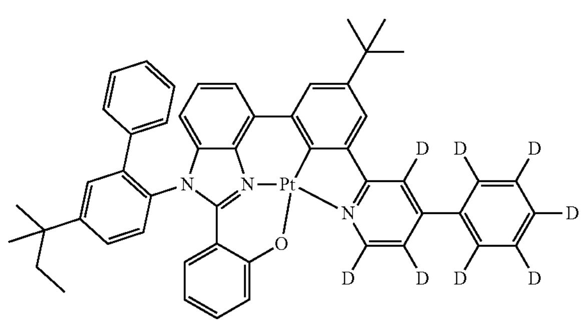
-continued
4-1774
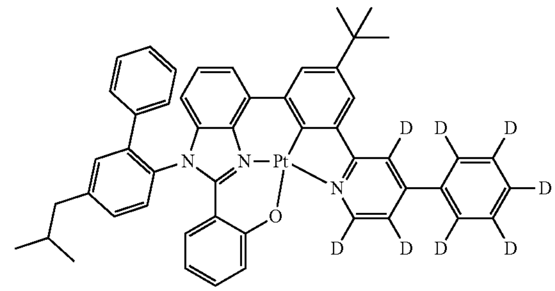
4-1775
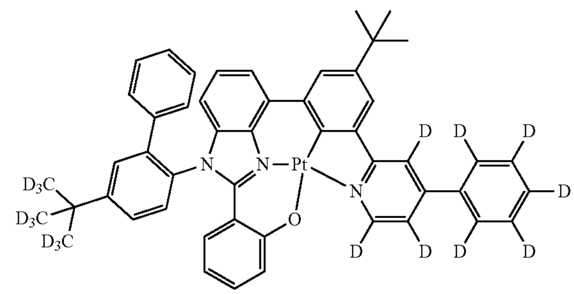
4-1776
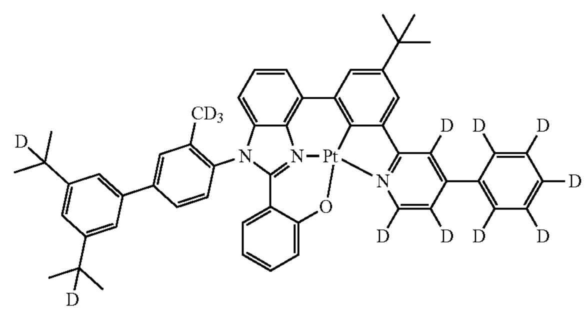
4-1777
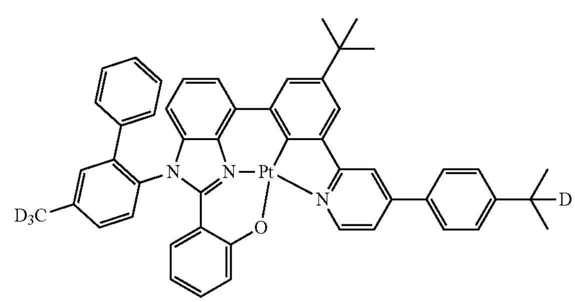
4-1778
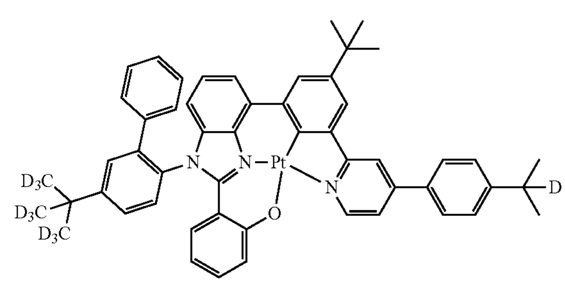

-continued
4-1779
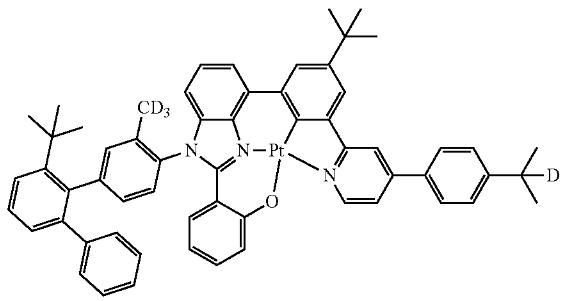
4-1780
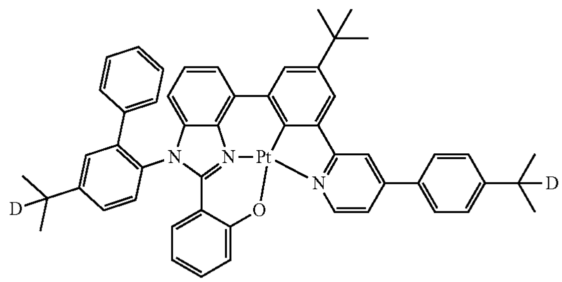
4-1781
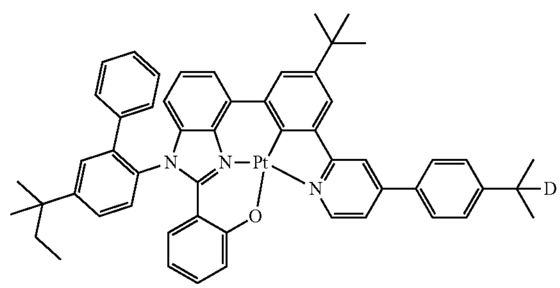
4-1782
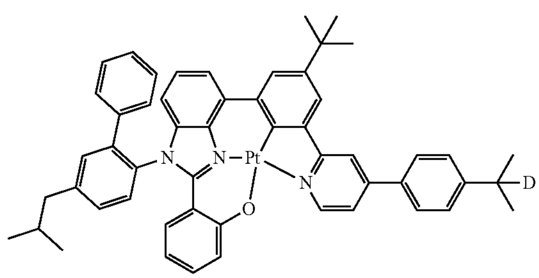
4-1783
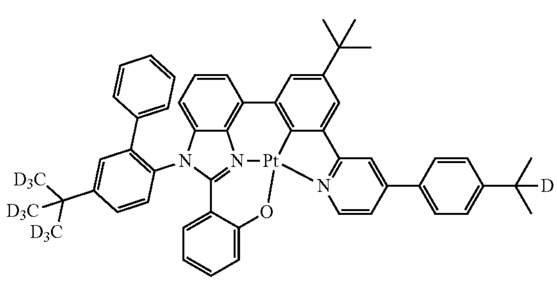
-continued
4-1784
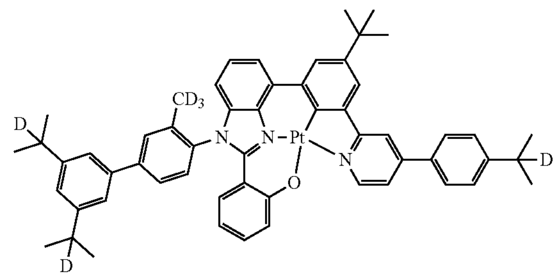
4-1785
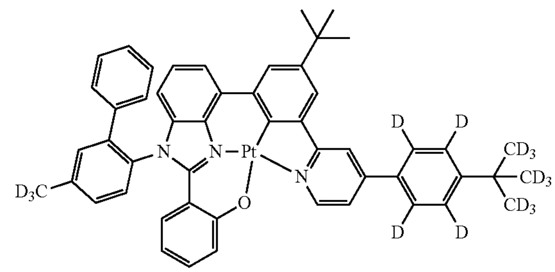
4-1786
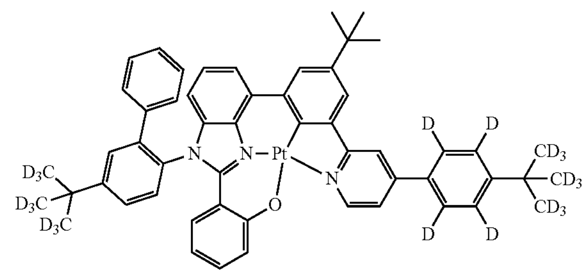
4-1787
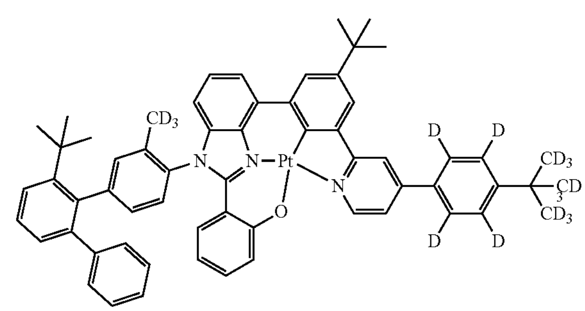
4-1788
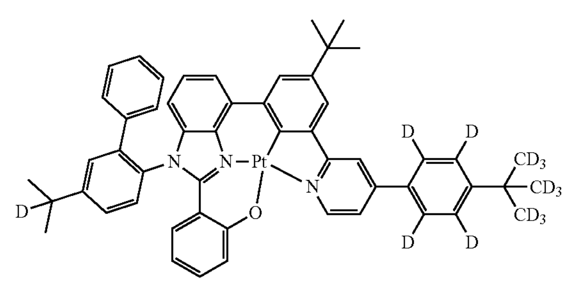

-continued
4-1789
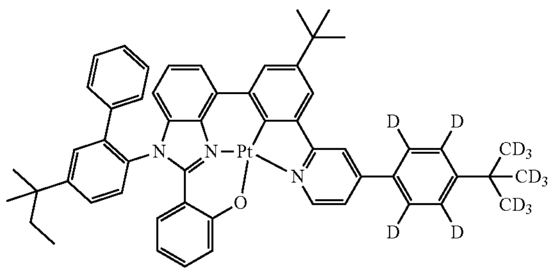
4-1790
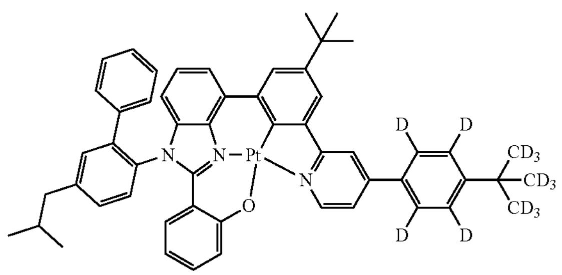
4-1791
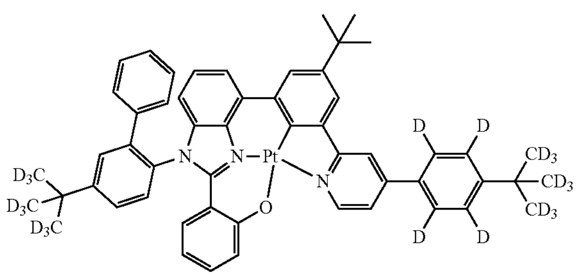
4-1792
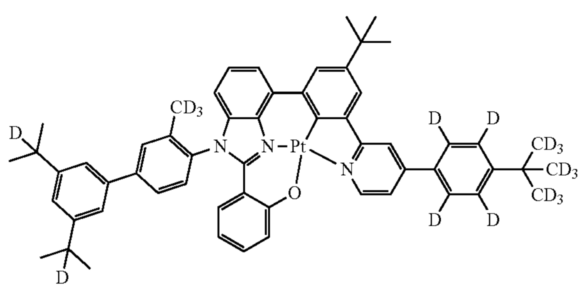
4-1793
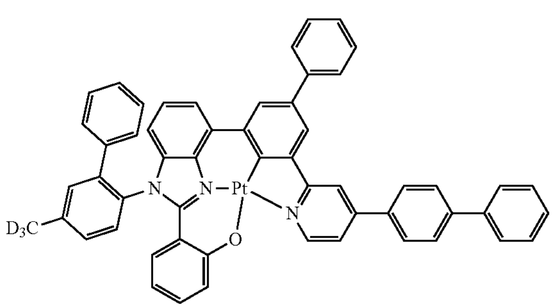
-continued
4-1794
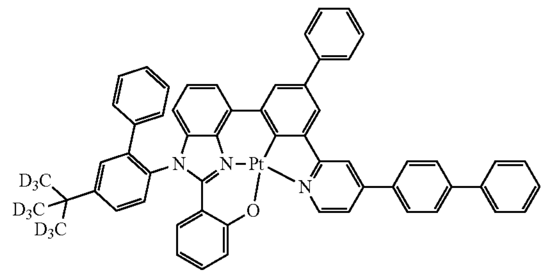
4-1795
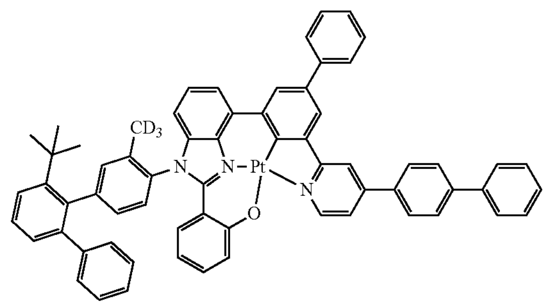
4-1796
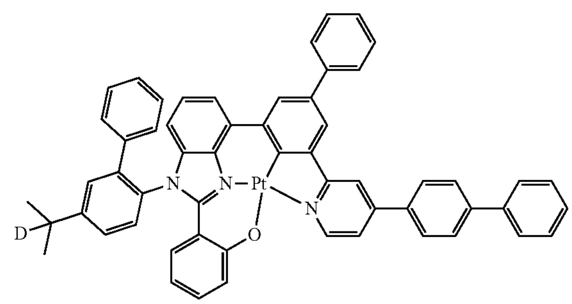
4-1797
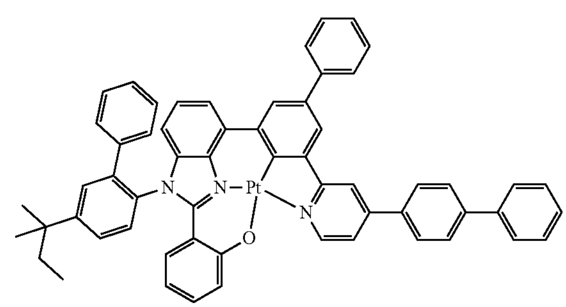
4-1798
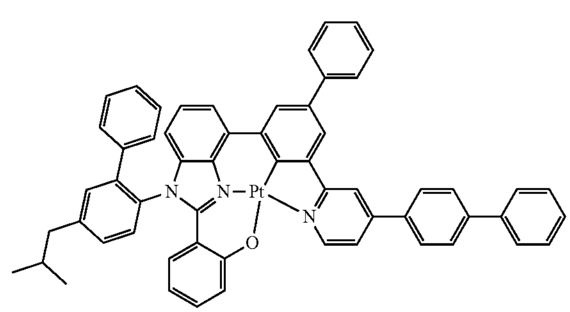

-continued
4-1799
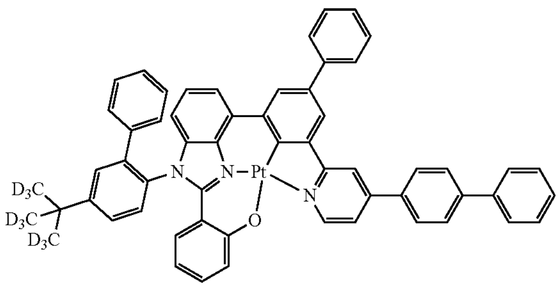
4-1800
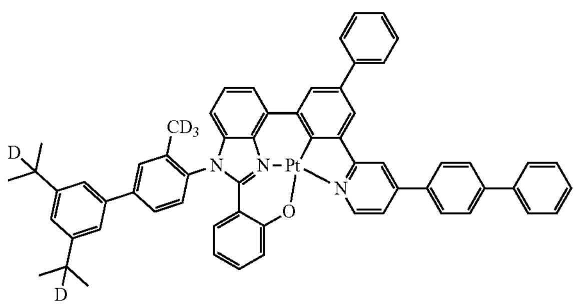
4-1801
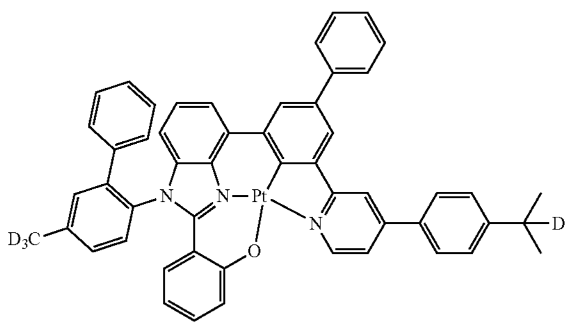
4-1802
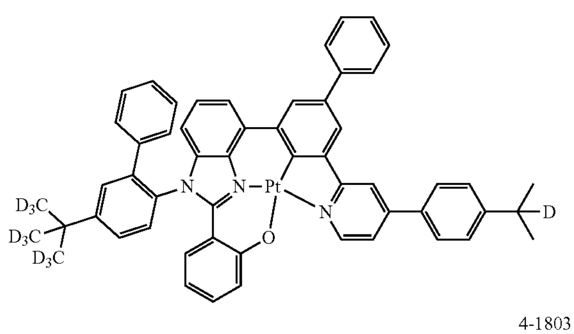
4-1803
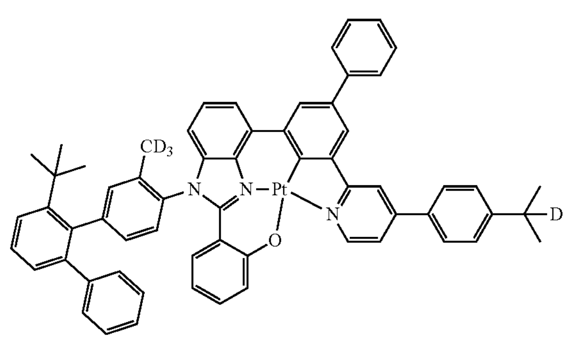
-continued
4-1804
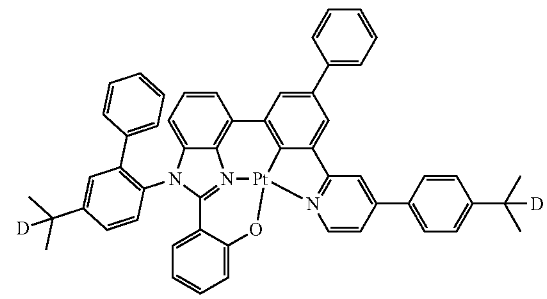
4-1805
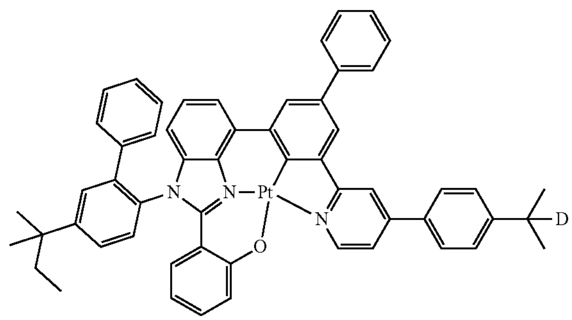
4-1806
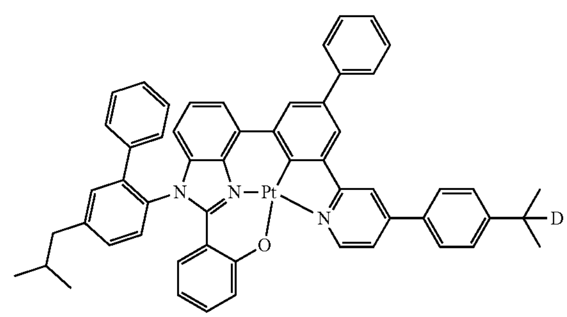
4-1807
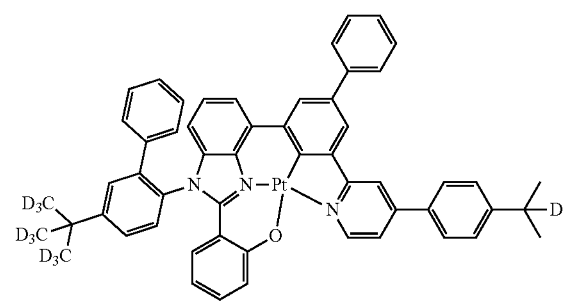
4-1808
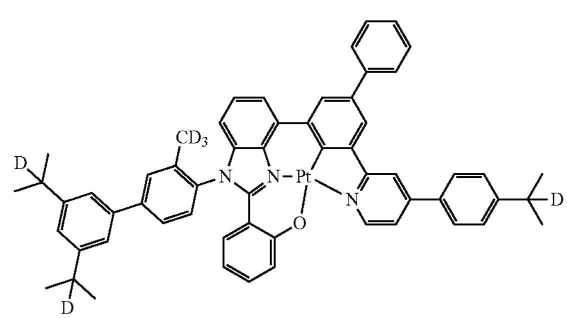

-continued
4-1809
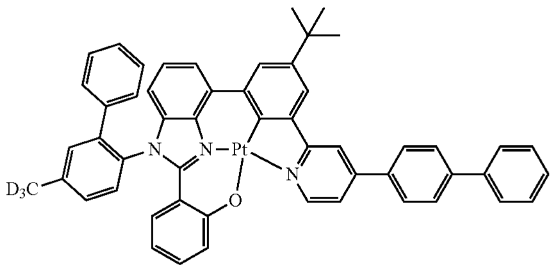
4-1810
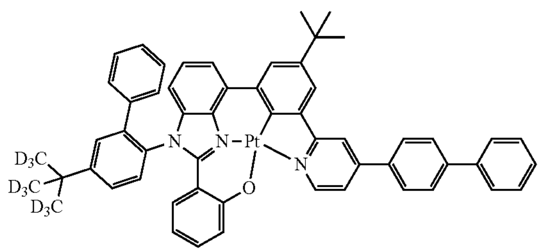
4-1811
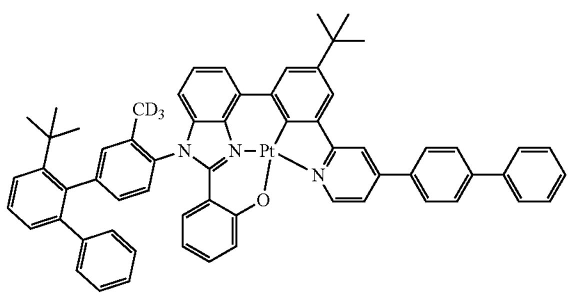
4-1812
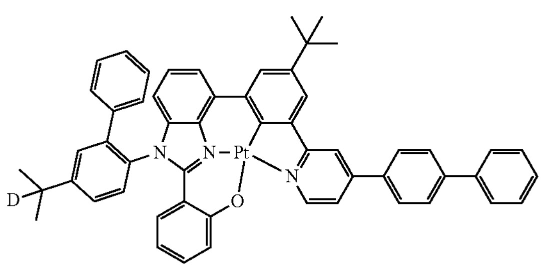
4-1813
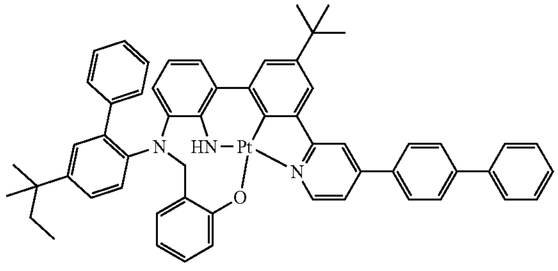
-continued
4-1814
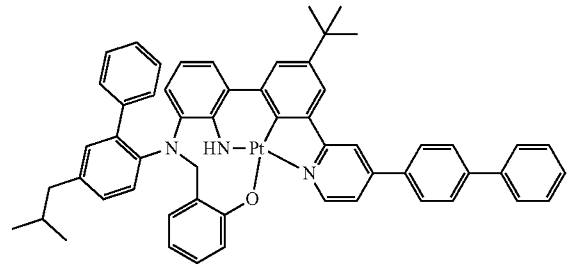
4-1815
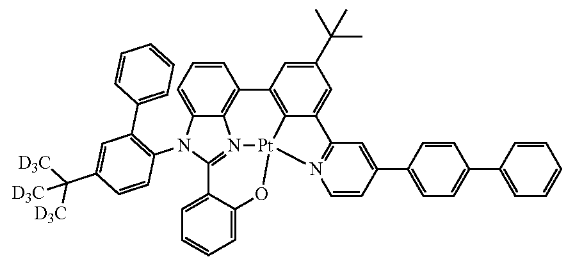
4-1816
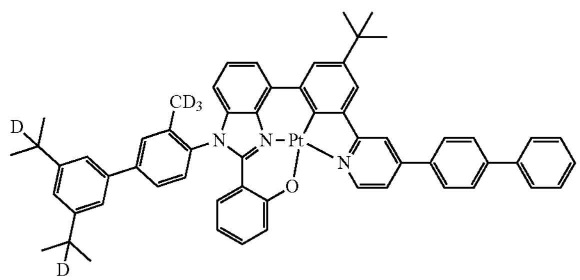
4-1817
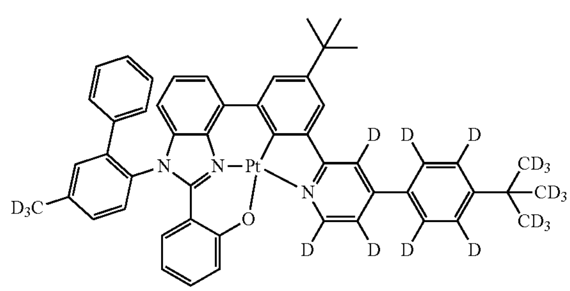
4-1818
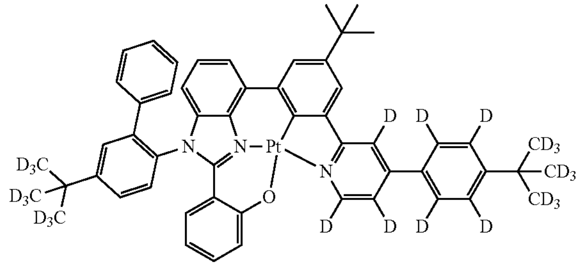

4-1819
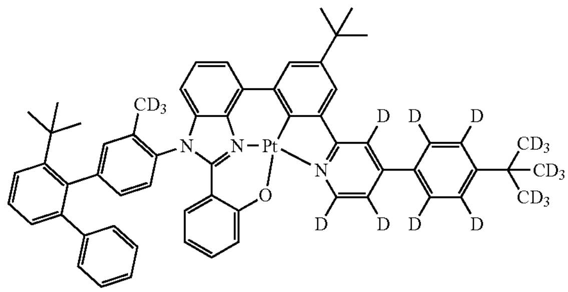
4-1820
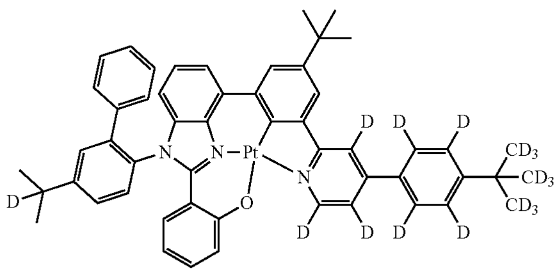
4-1821
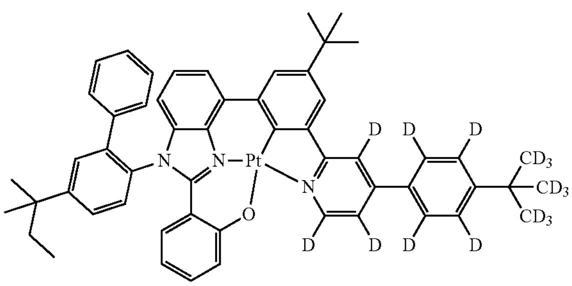
4-1822
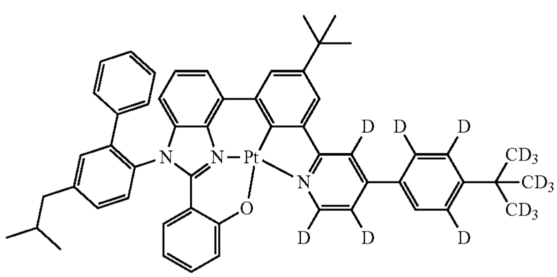
4-1823
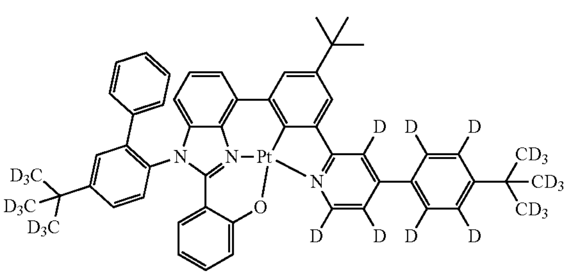
4-1824
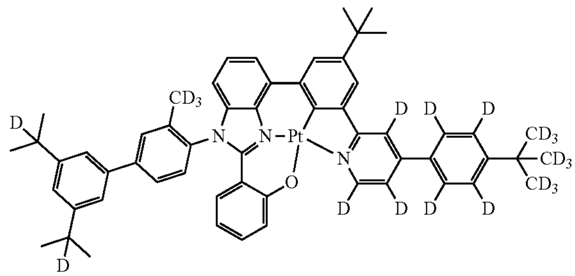
4-1825
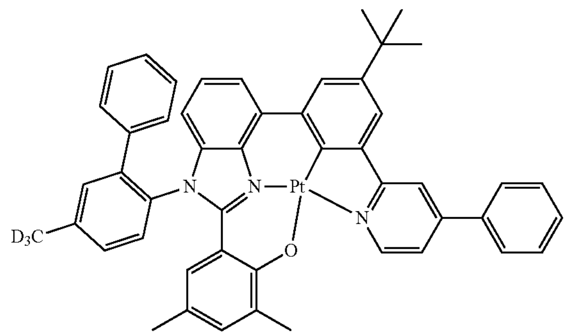
4-1826
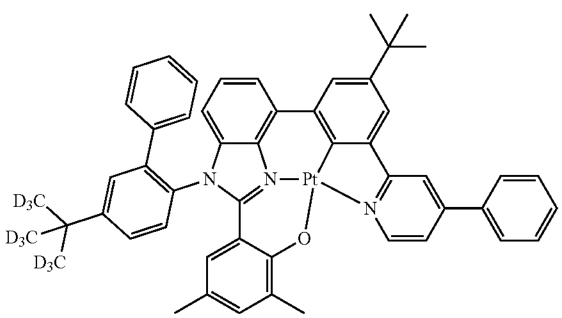
4-1827
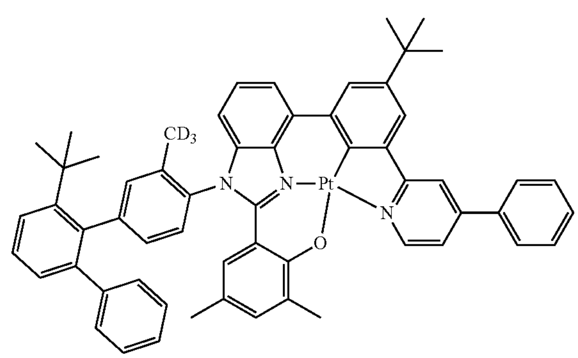

-continued
4-1828
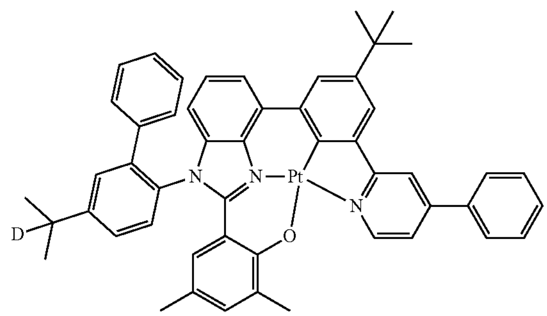
4-1829
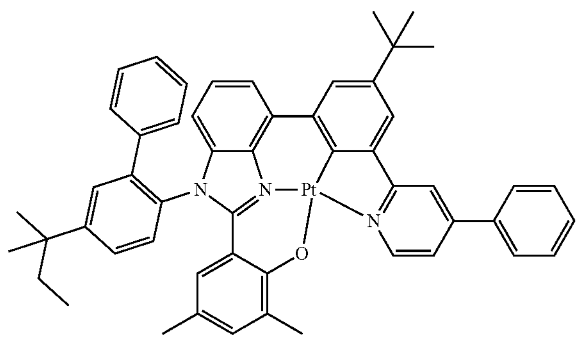
4-1830
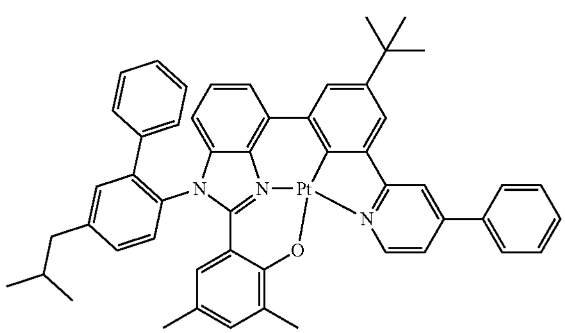
4-1831
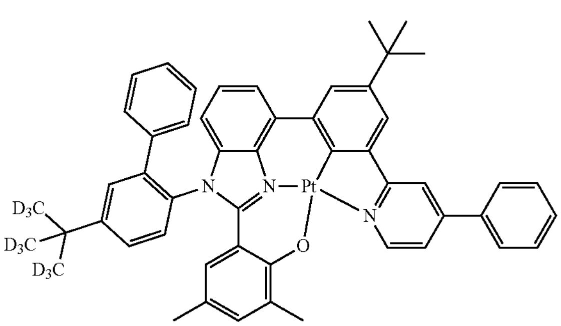
-continued
4-1832
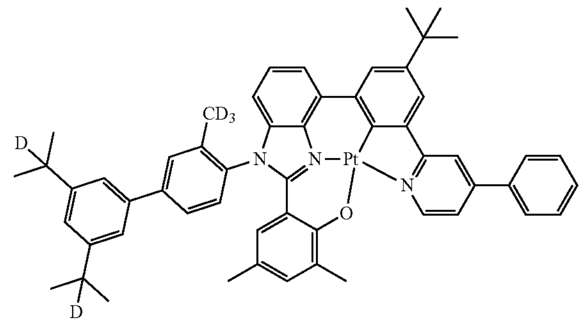
4-1833
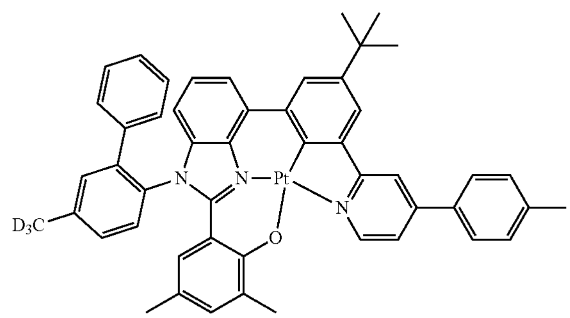
4-1834
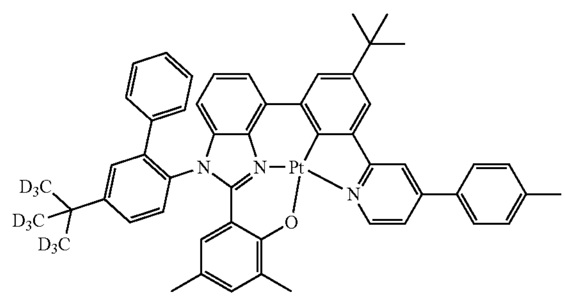
4-1835
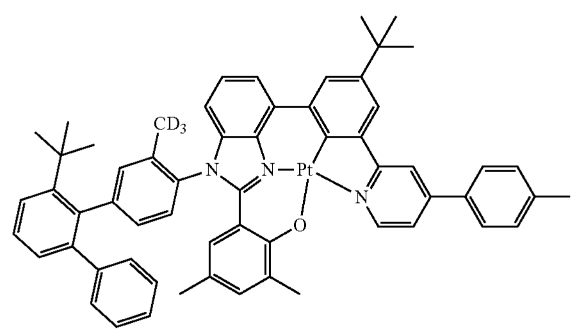

-continued
4-1836
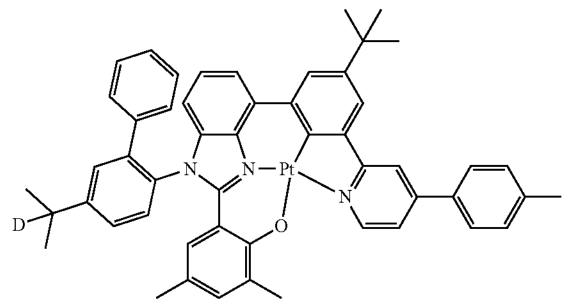
4-1837
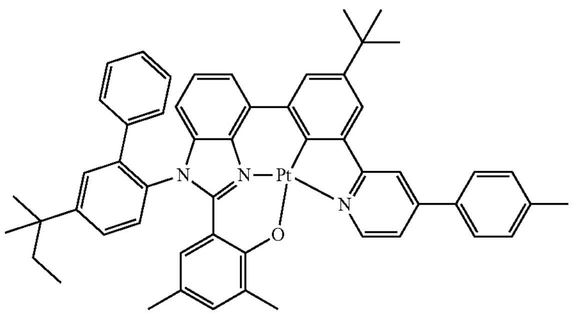
4-1838
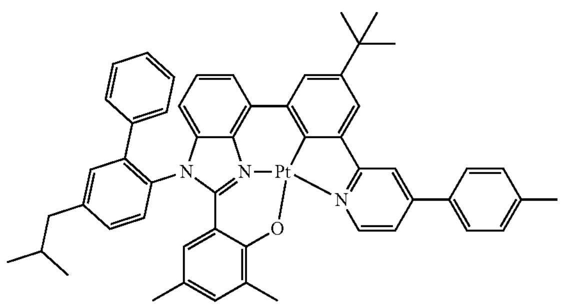
4-1839
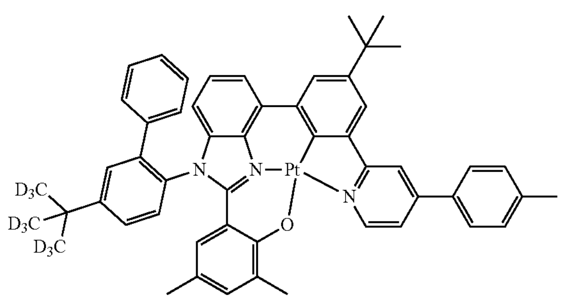
4-1840
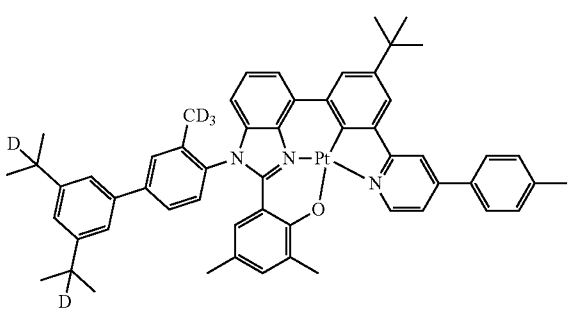
-continued
4-1841
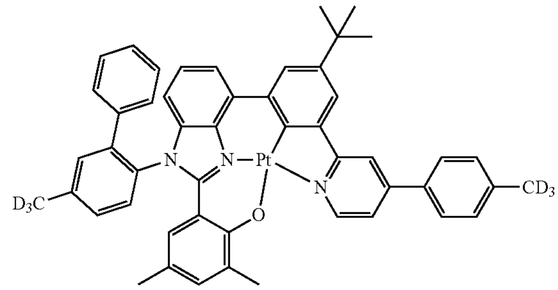
4-1842
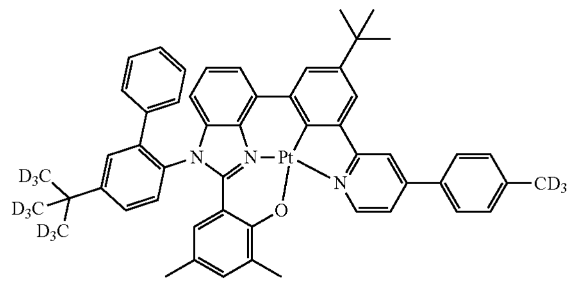
4-1843
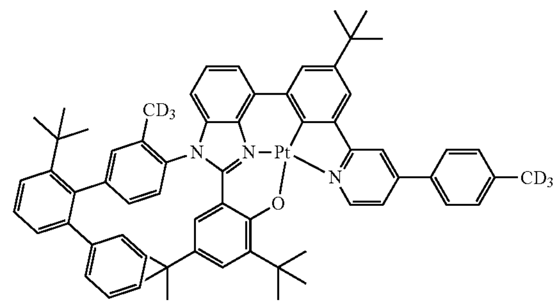
4-1844
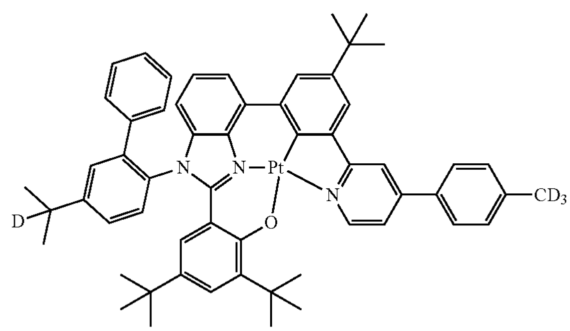
4-1845
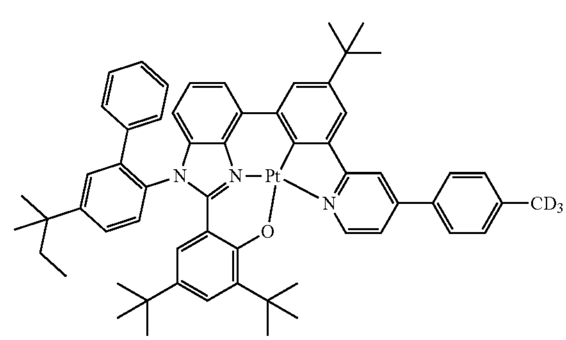

4-1846
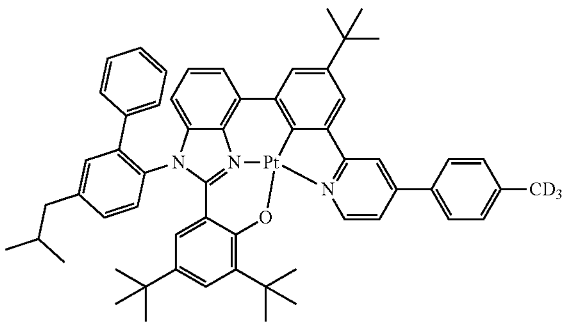
4-1847
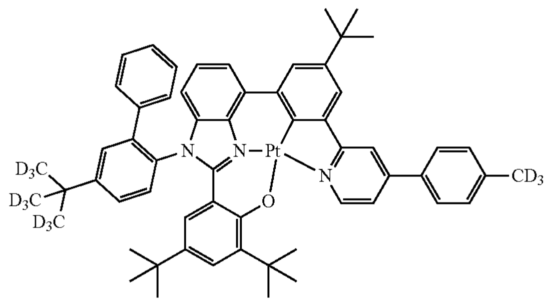
4-1848
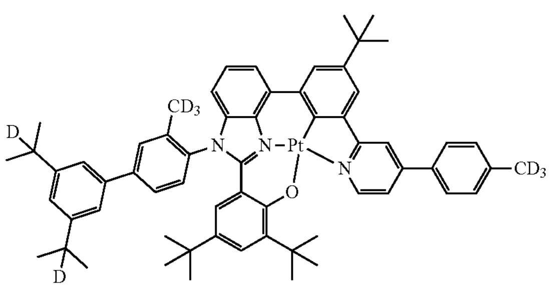
4-1849
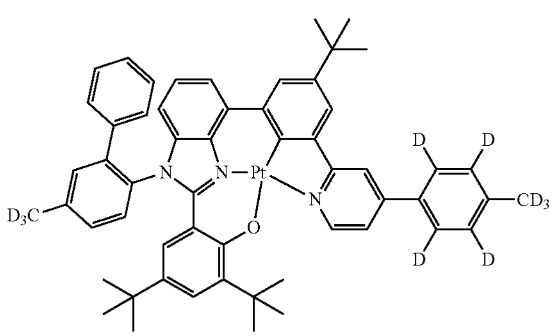
4-1850
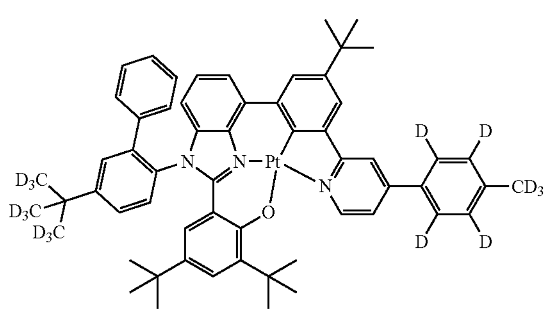
4-1851
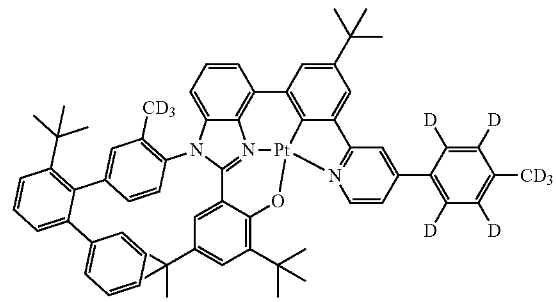
4-1852
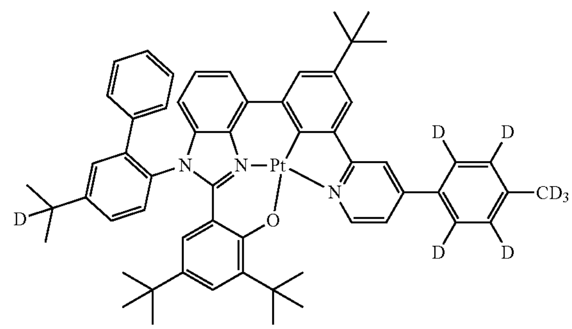
4-1853
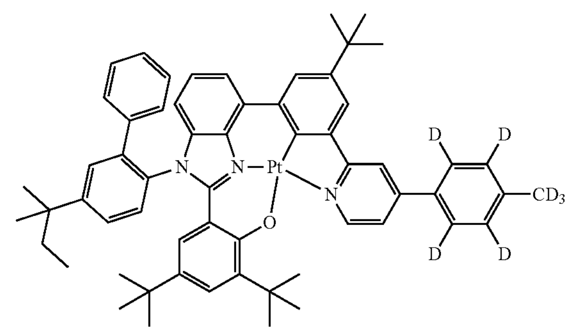
4-1854
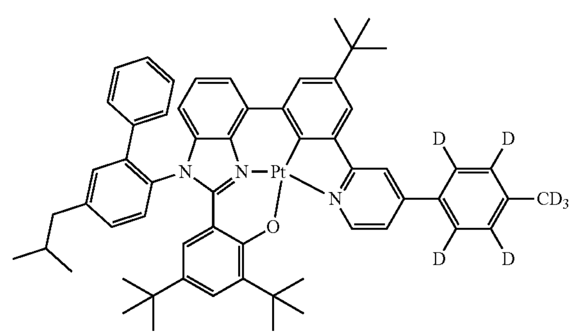

-continued
4-1855
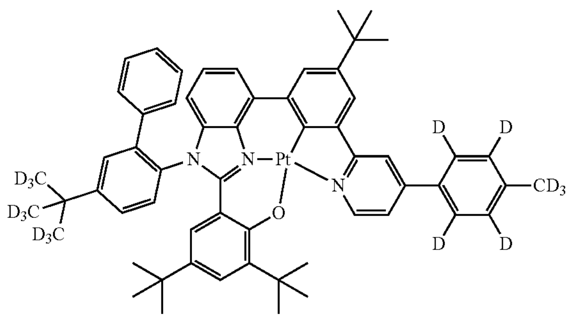
4-1856
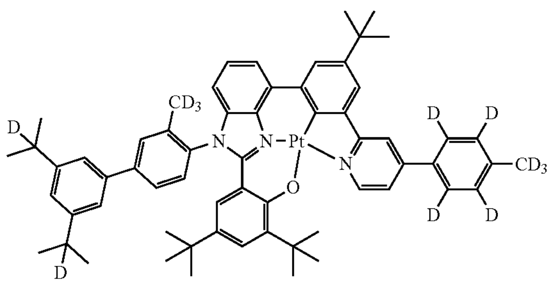
4-1857
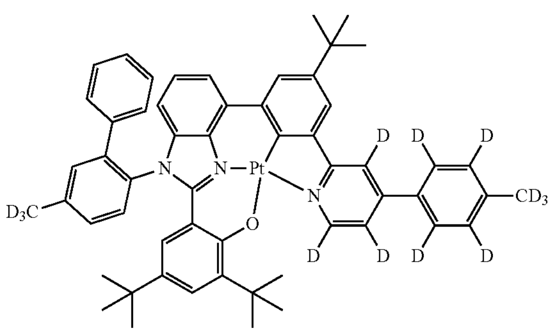
4-1858
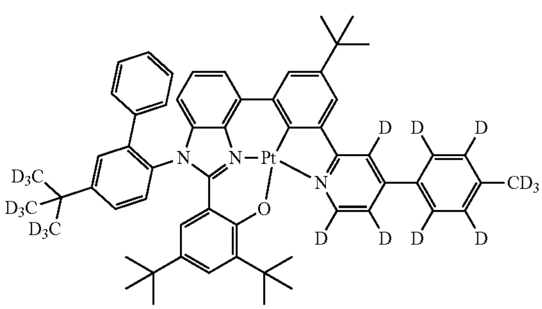
4-1859
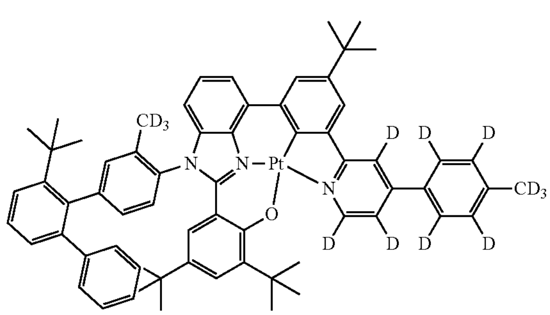
-continued
4-1860
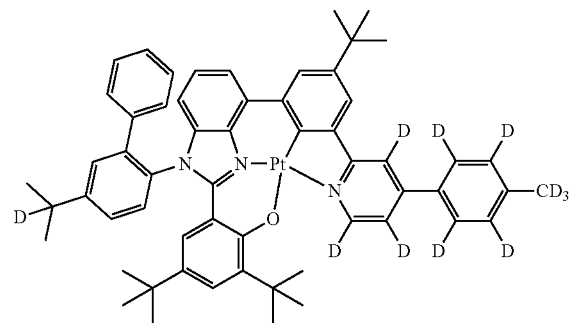
4-1861
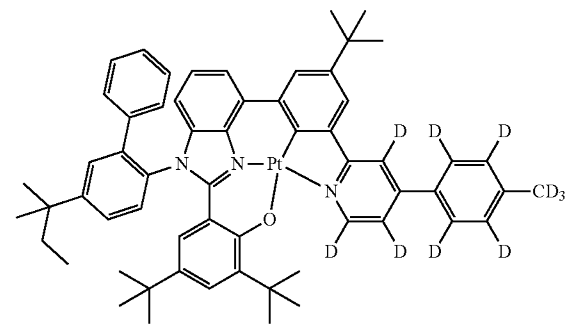
4-1862
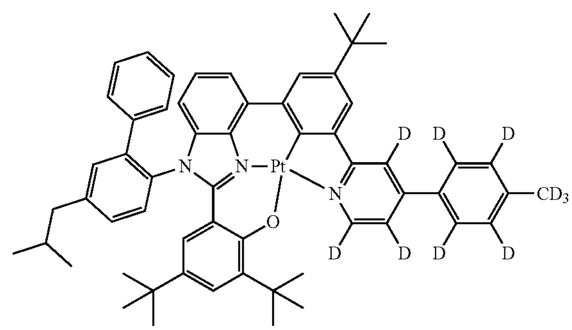
4-1863
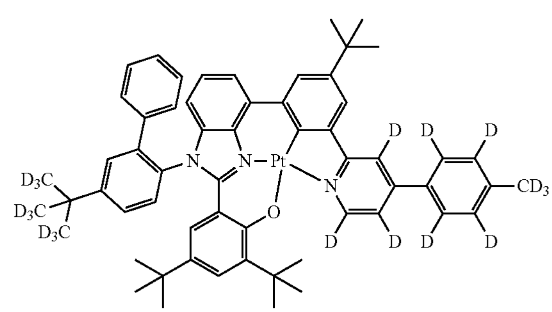

-continued
4-1864
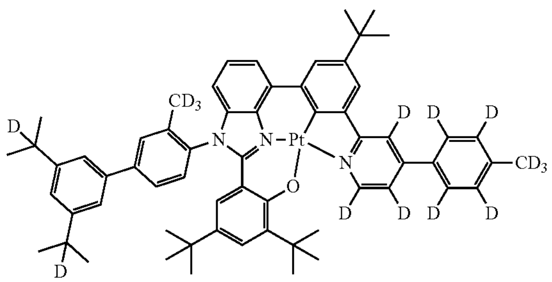
4-1865
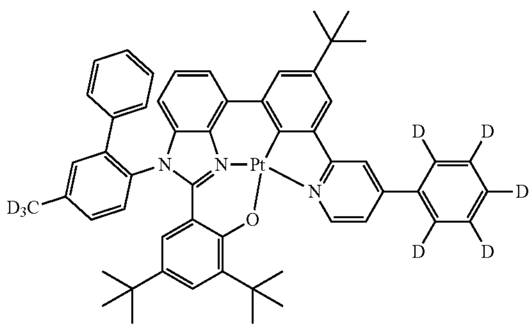
4-1866
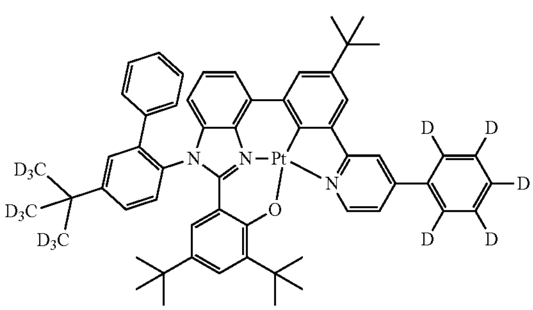
4-1867
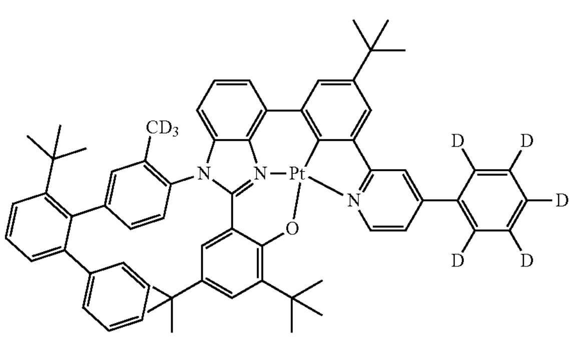
-continued
4-1868
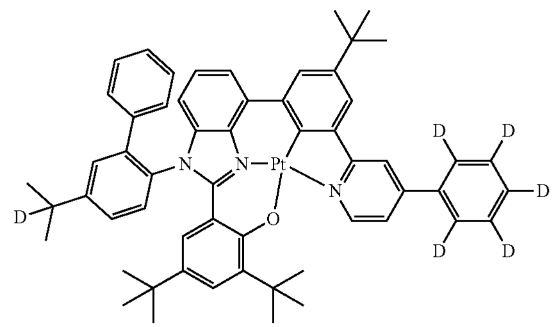
4-1869
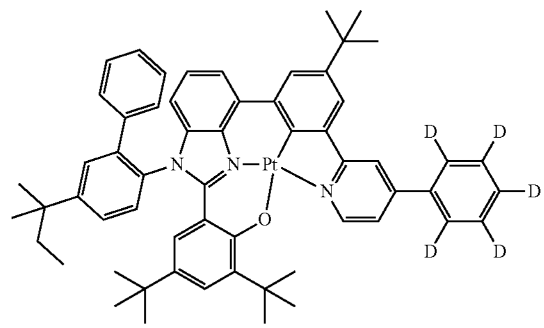
4-1870
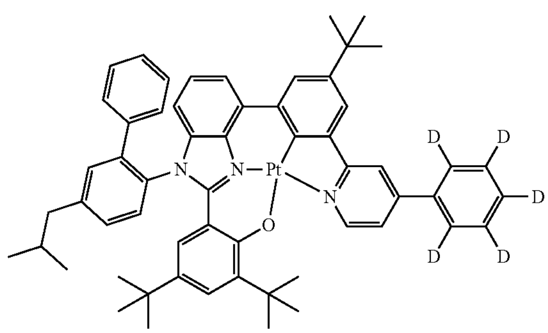
4-1871
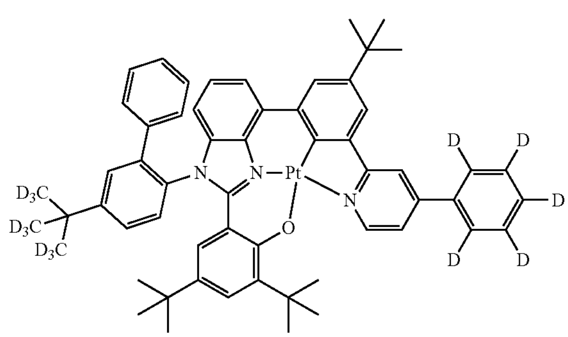

4-1872
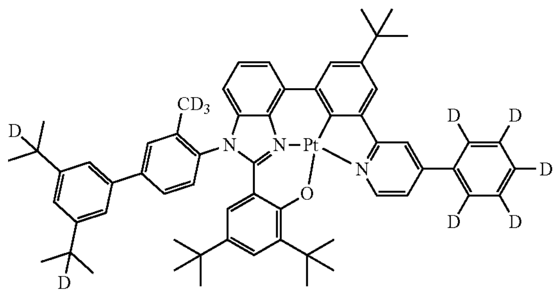
4-1873
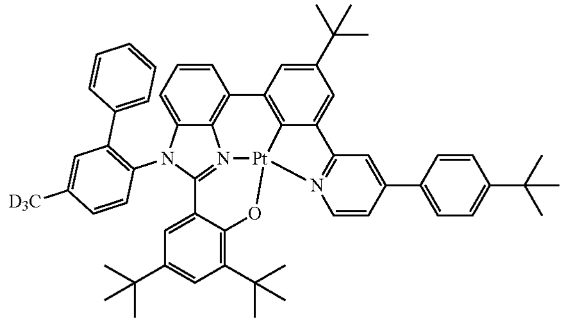
4-1874
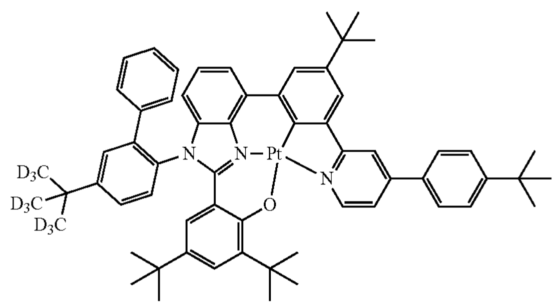
4-1875
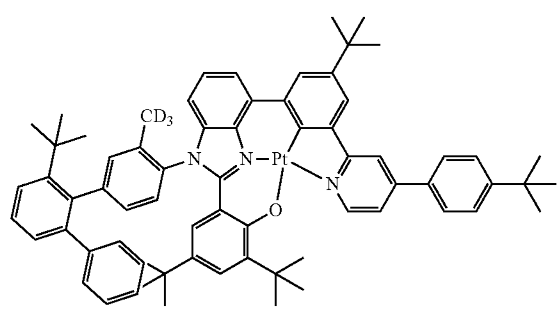
4-1876
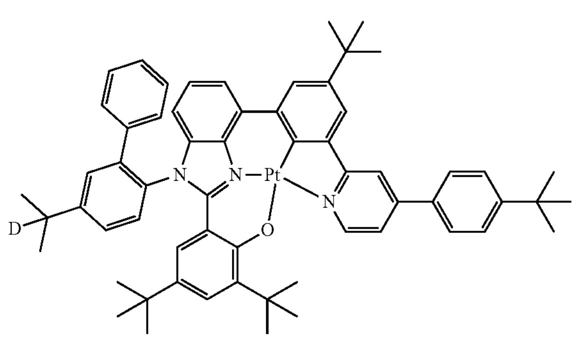
4-1877
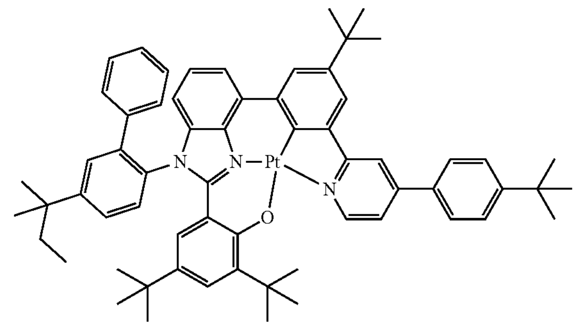
4-1878
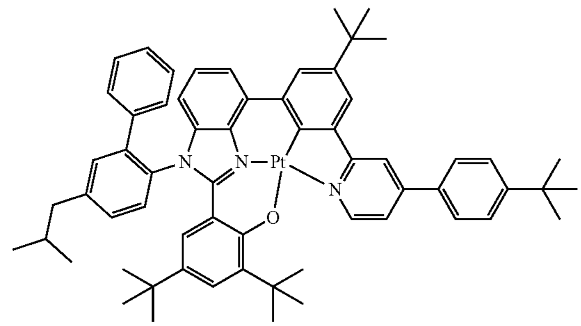
4-1879
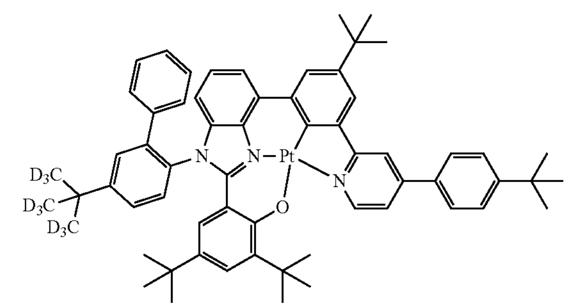
4-1880
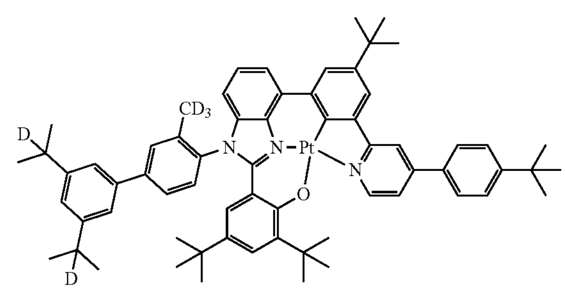
4-1881
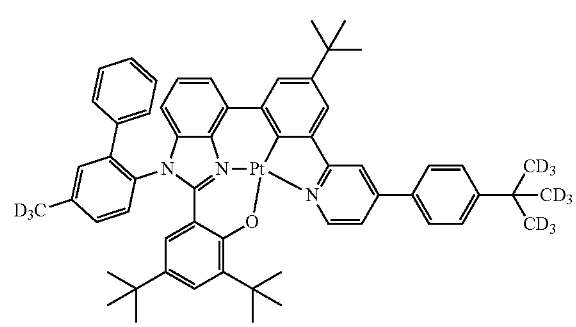

4-1882
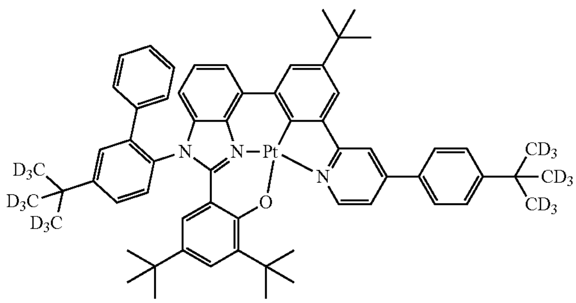
4-1883
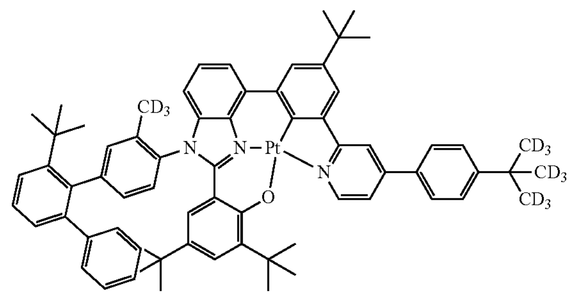
4-1884
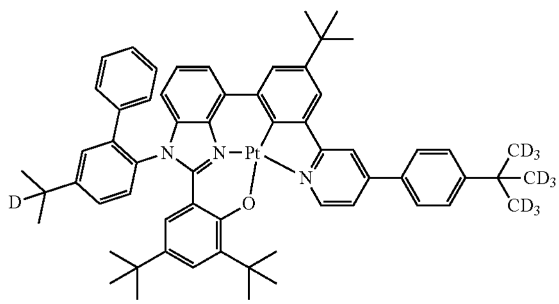
4-1885
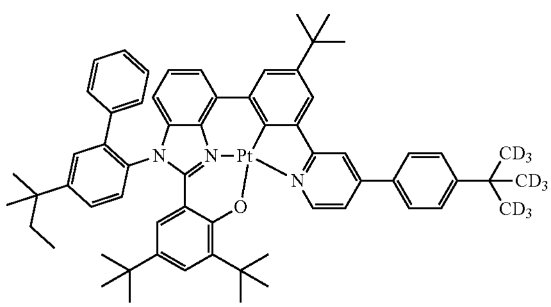
4-1886
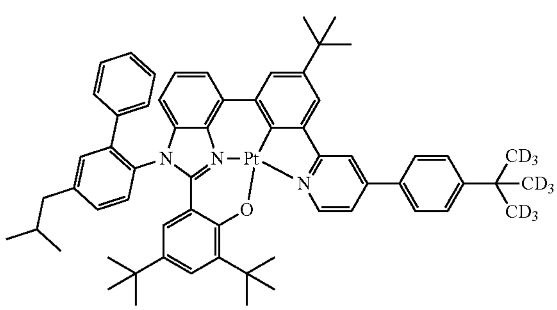
4-1887
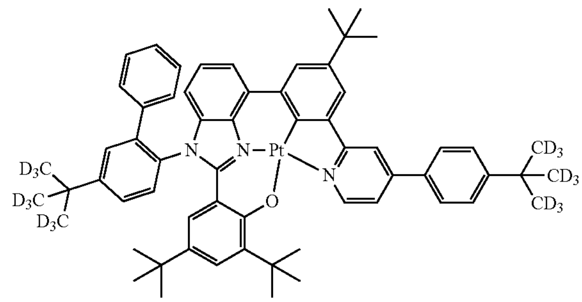
4-1888
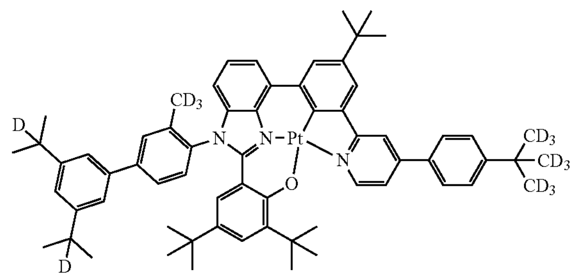
4-1889
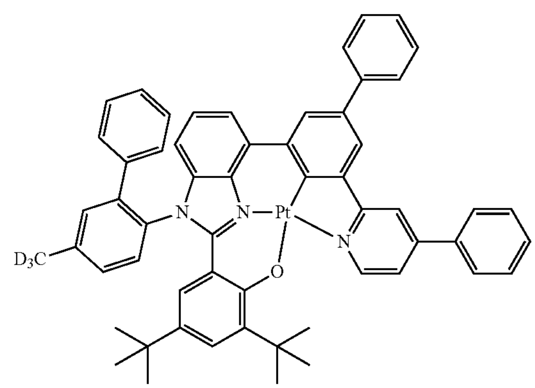
4-1890
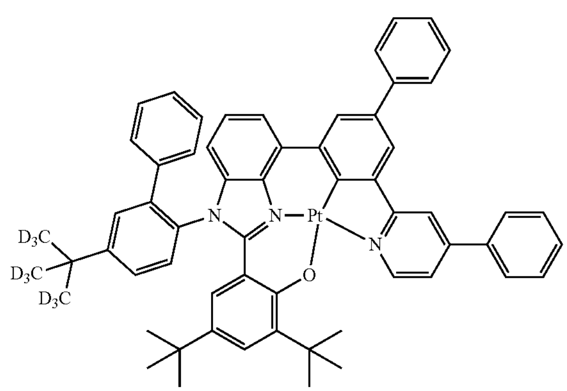

-continued
4-1891
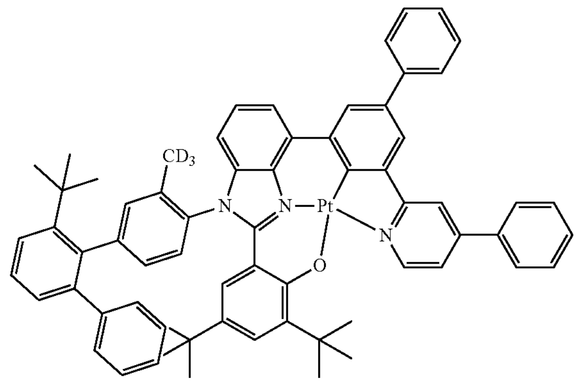
4-1892
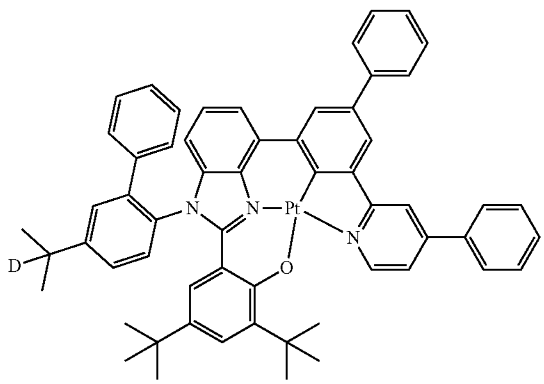
4-1893
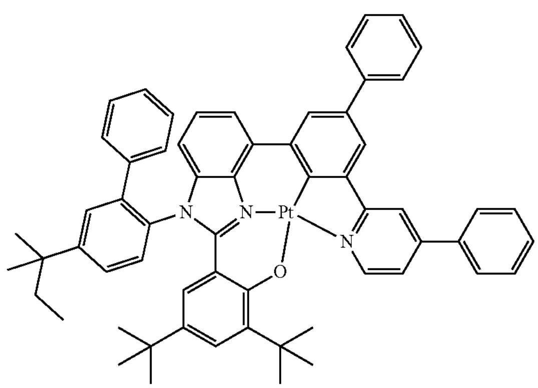
4-1894
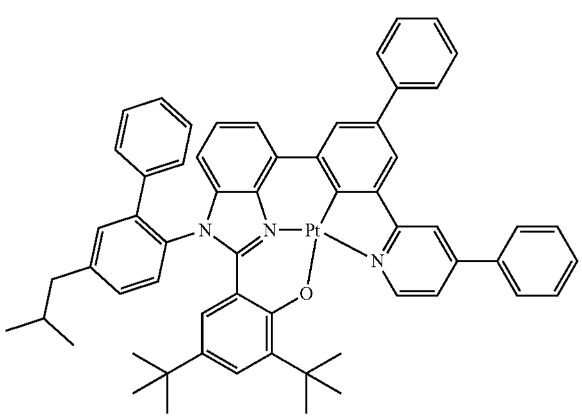
-continued
4-1895
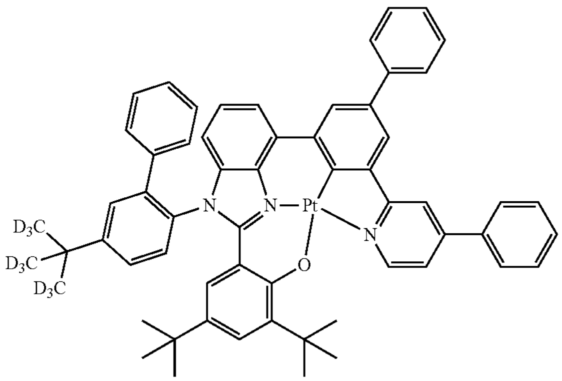
4-1896
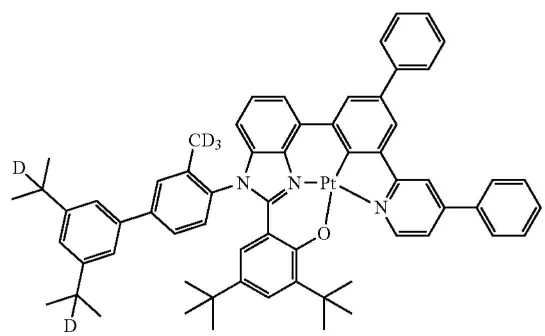
4-1897
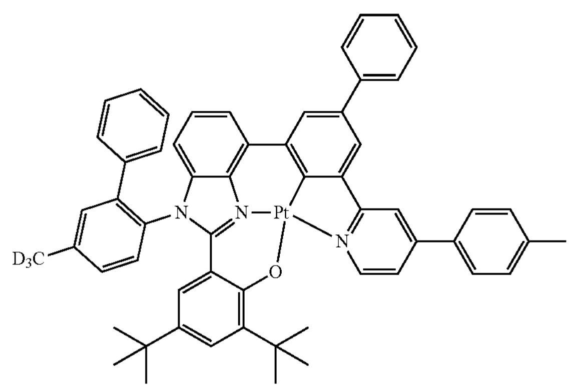
4-1898
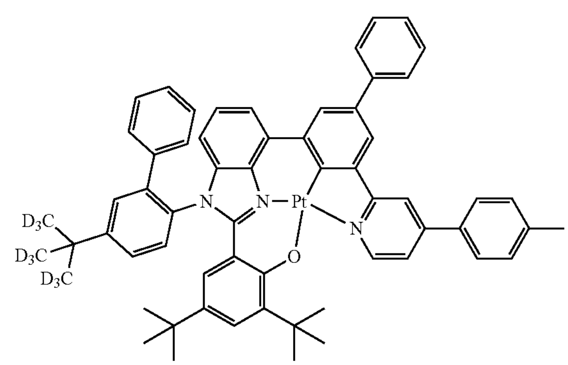

-continued
4-1899
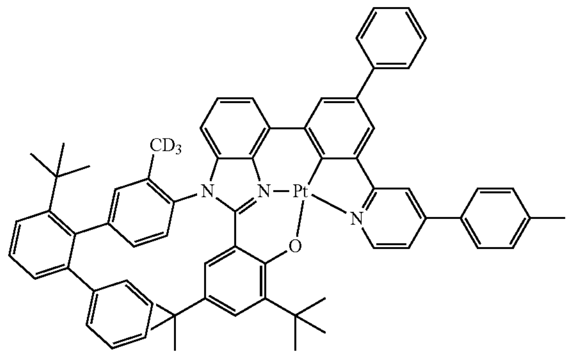
4-1900
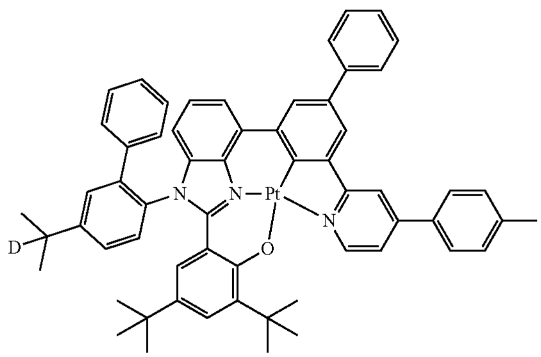
4-1901
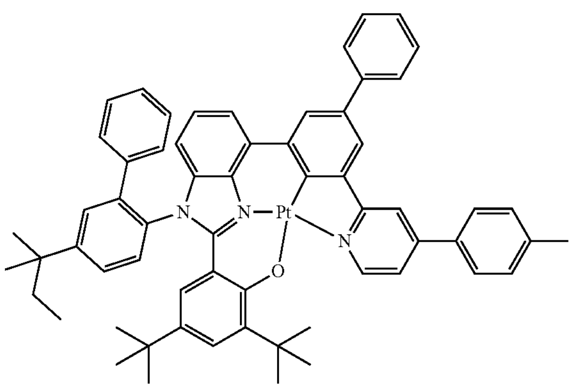
4-1902
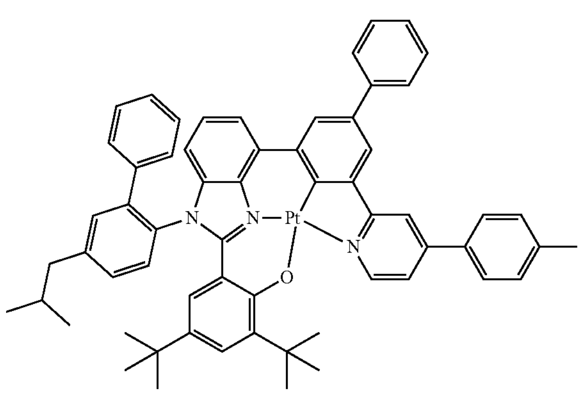
-continued
4-1903
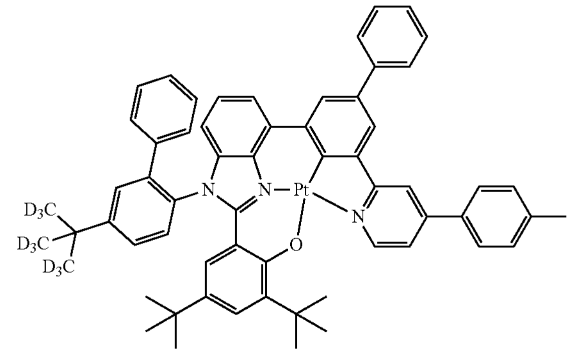
4-1904
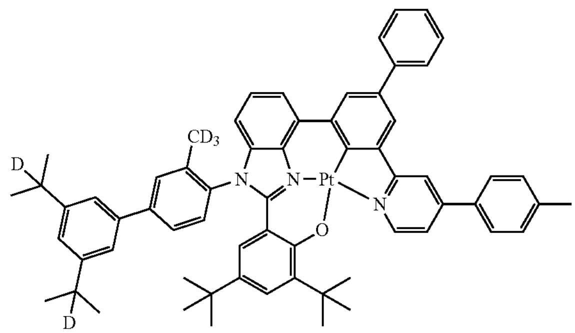
4-1905
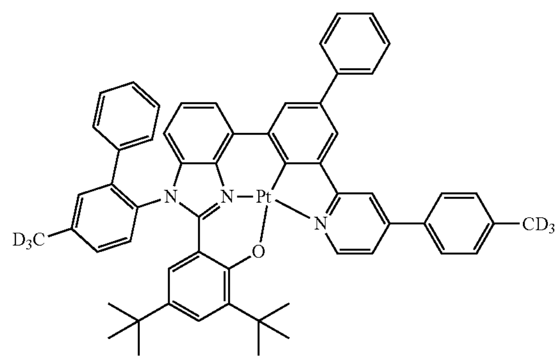
4-1906
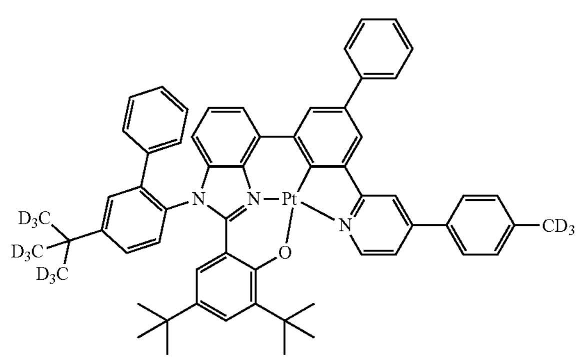

-continued
4-1907
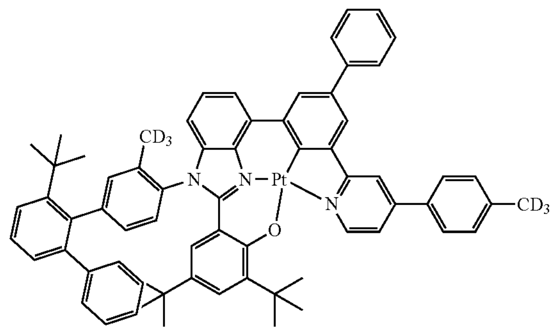
4-1908
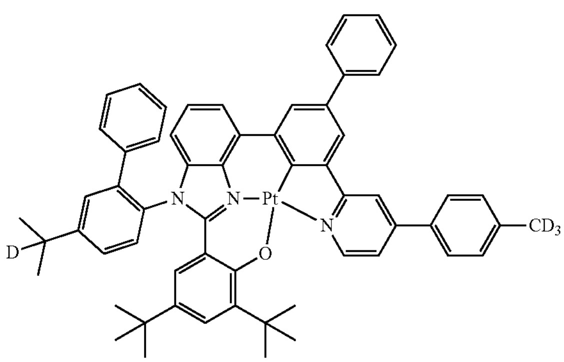
4-1909
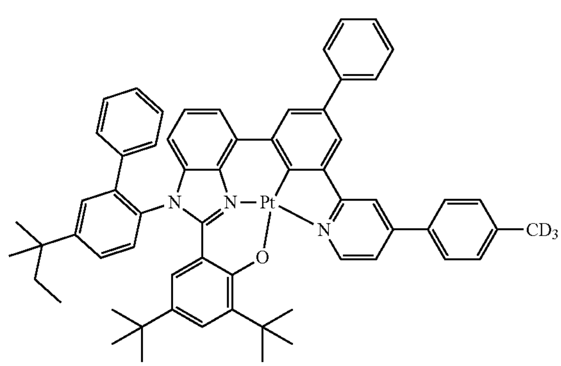
4-1910
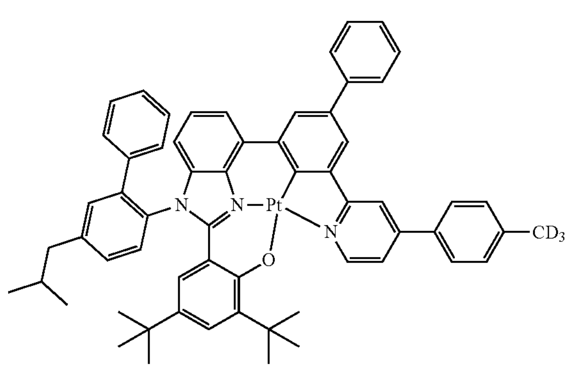
-continued
4-1911
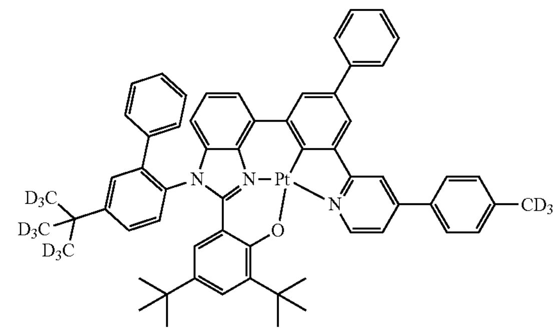
4-1912
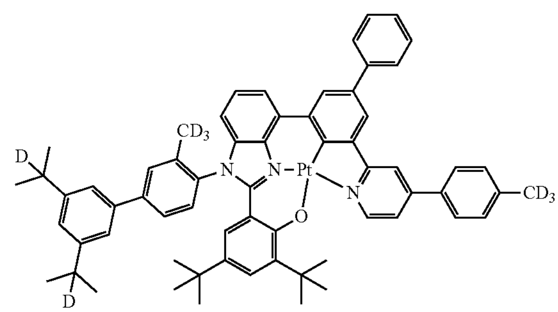
4-1913
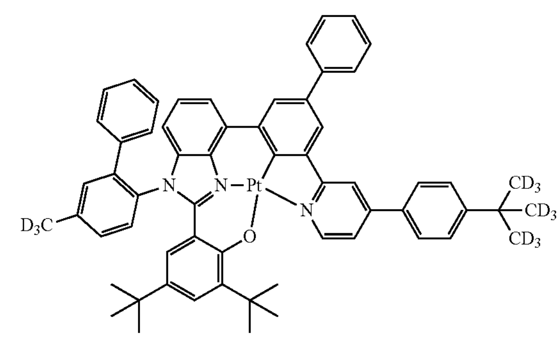
4-1914
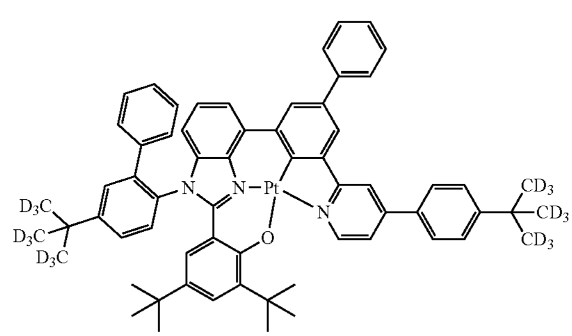

4-1915
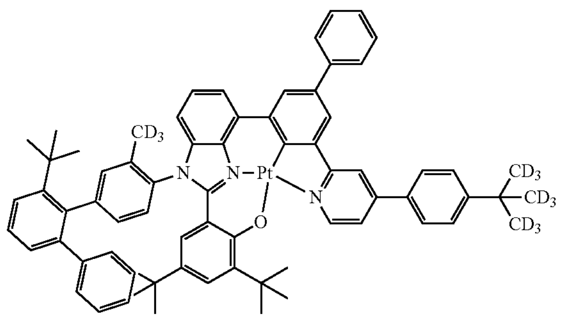
4-1916
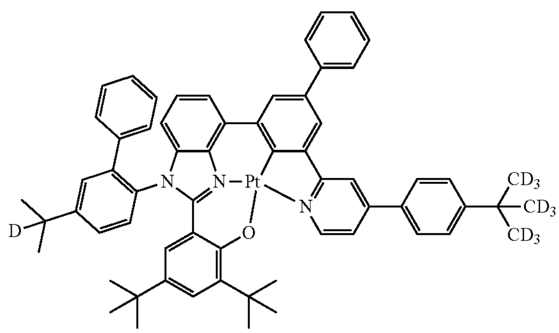
4-1917
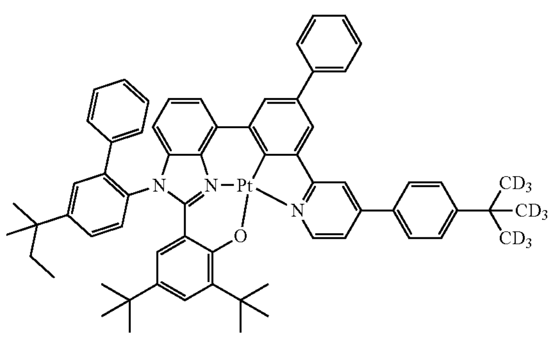
4-1918
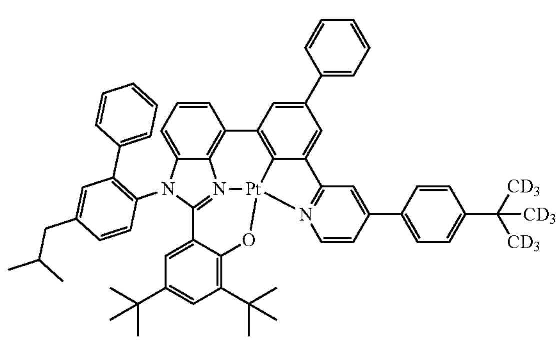
4-1919
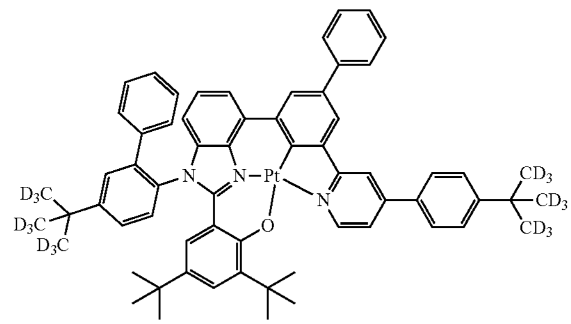
4-1920
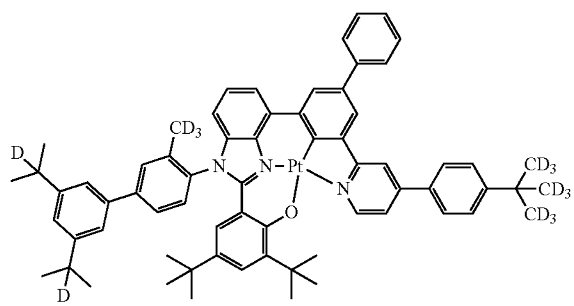
4-1921
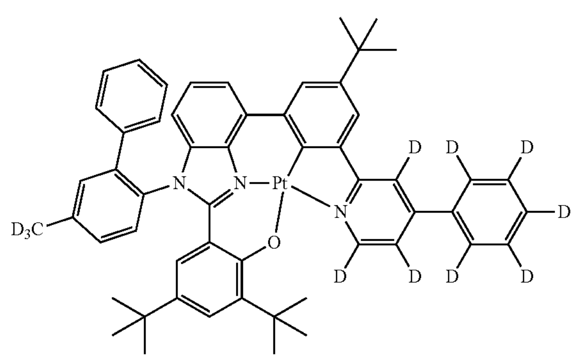
4-1922
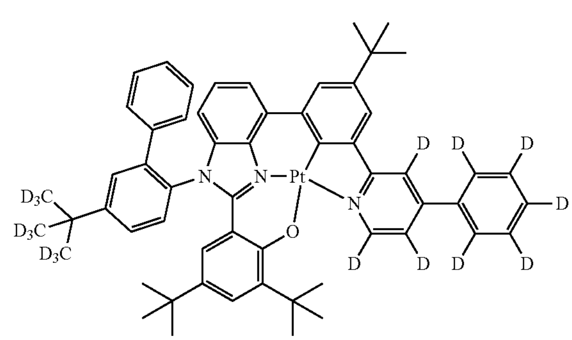

4-1923
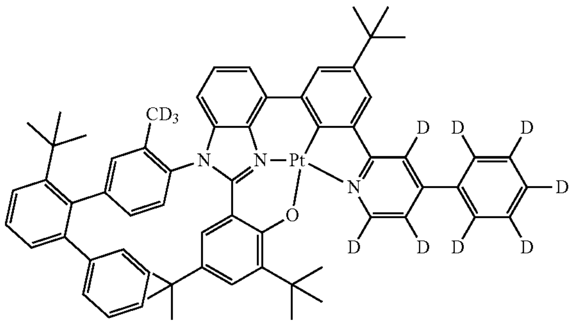
4-1924
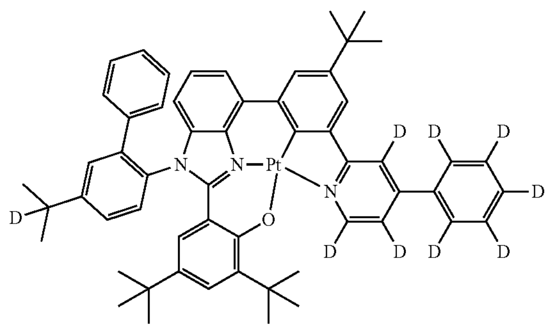
4-1925
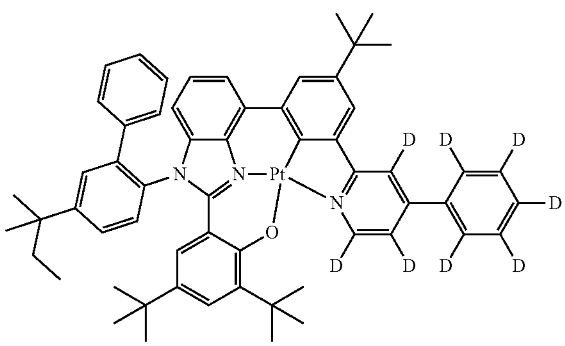
4-1926
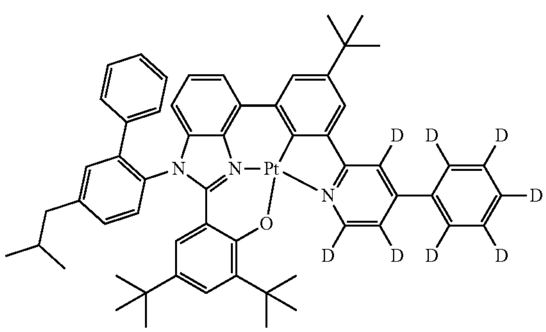
4-1927
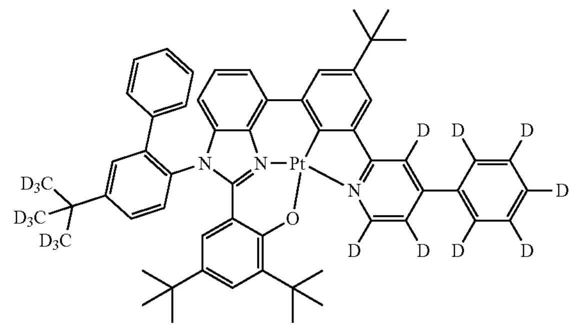
4-1928
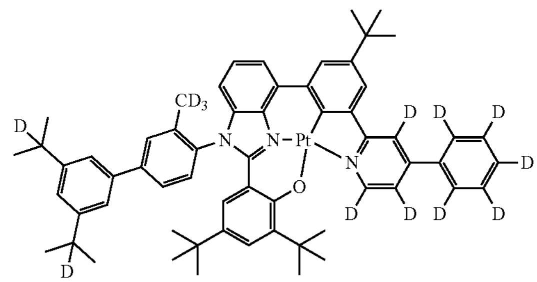
4-1929
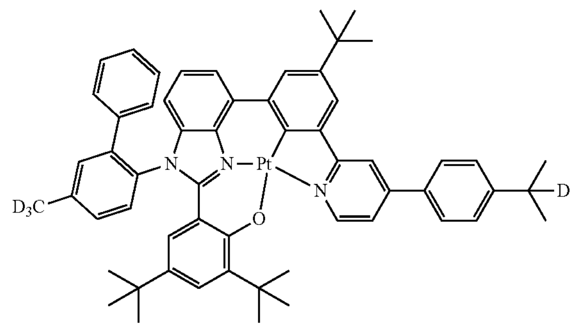
4-1930
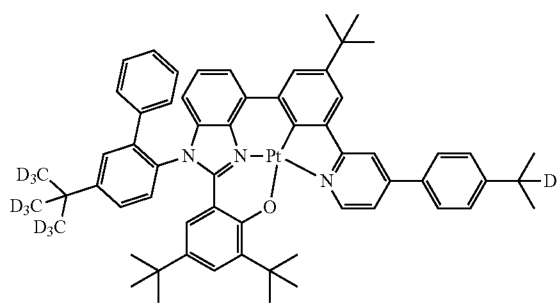
4-1931
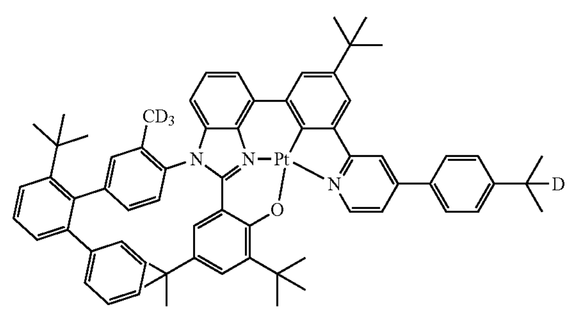

4-1932
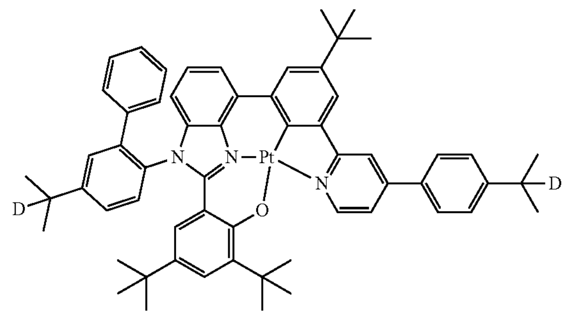
4-1933
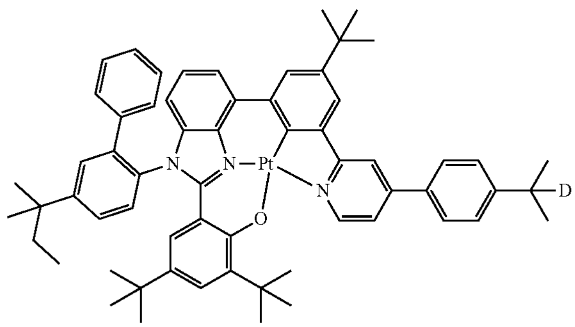
4-1934
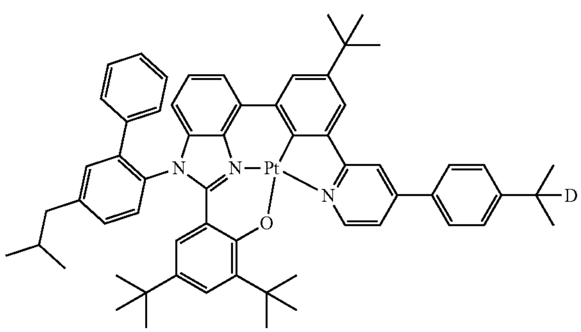
4-1935
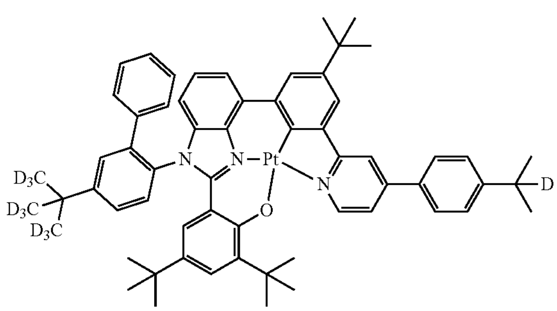
4-1936
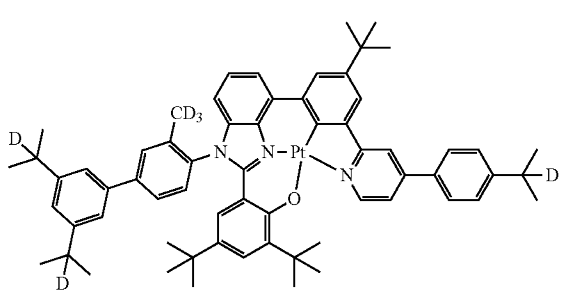
4-1937
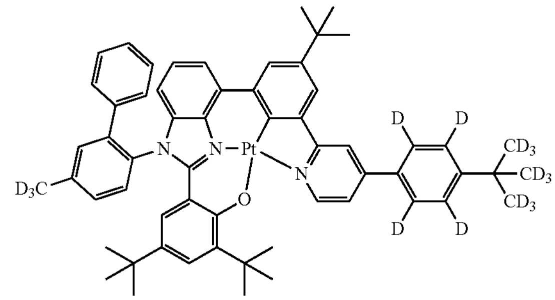
4-1938
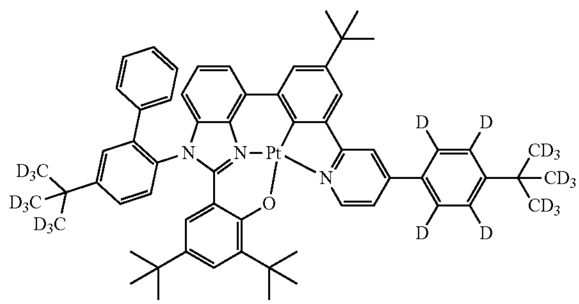
4-1939
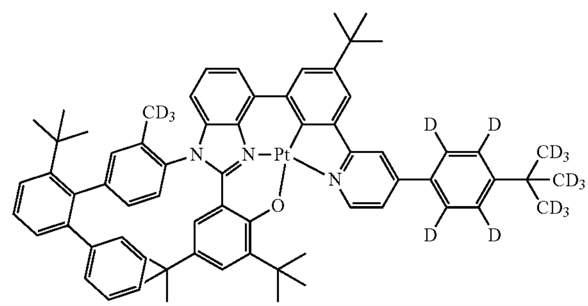
4-1940
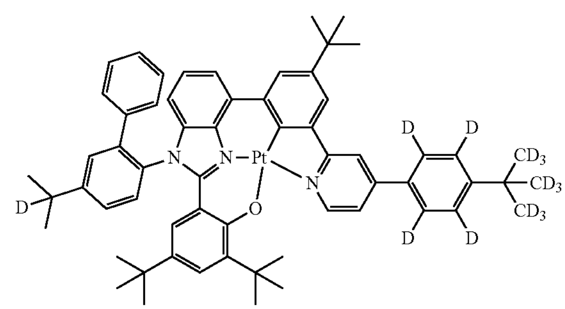
4-1941
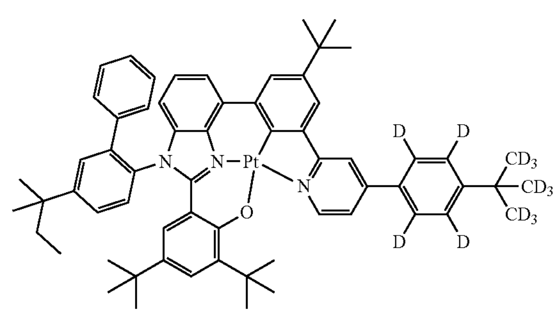

4-1942
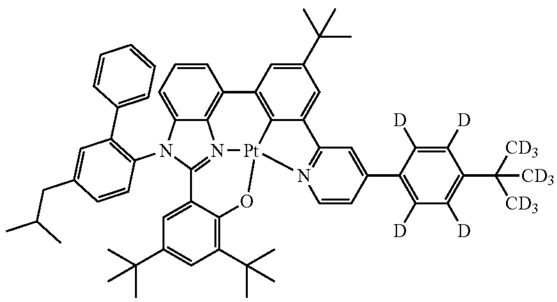
4-1943
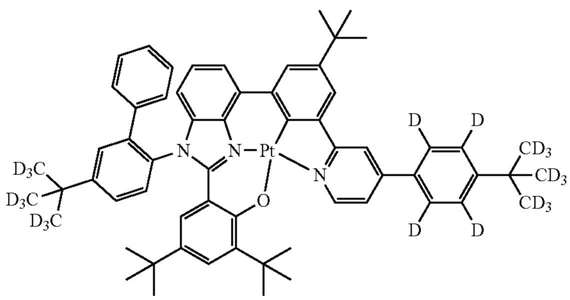
4-1944
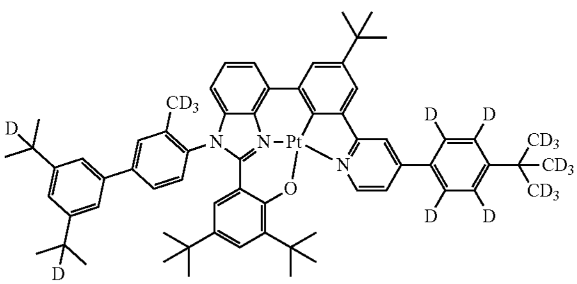
9-1945
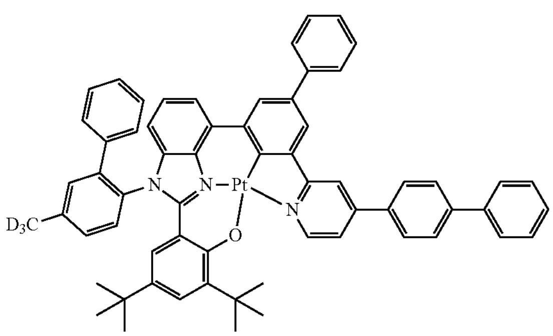
4-1946
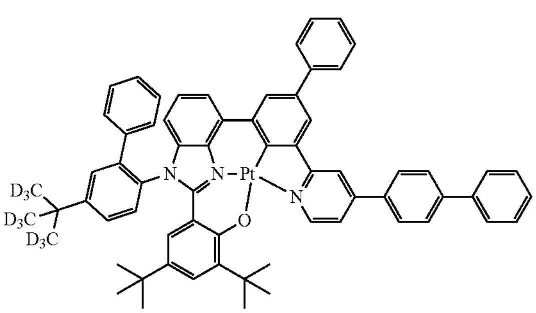
4-1947
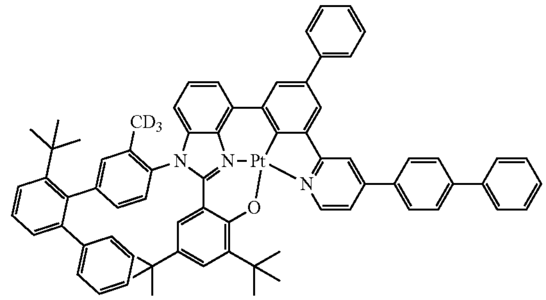
4-1948
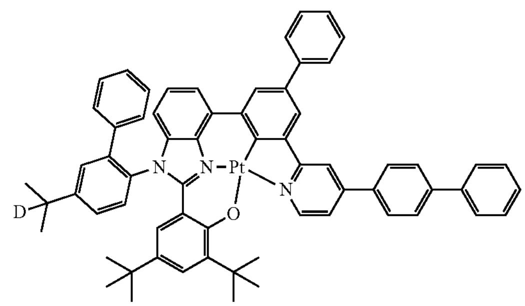
4-1949
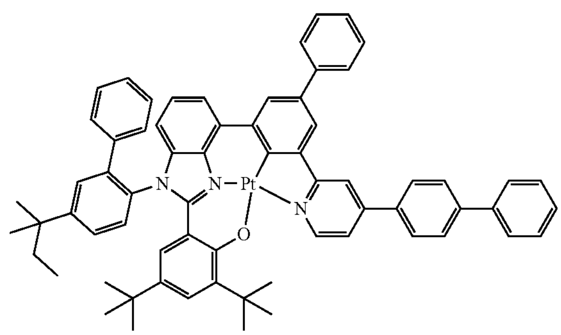
4-1950
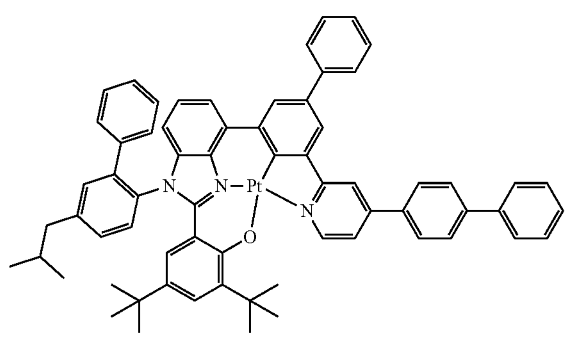

-continued
4-1951
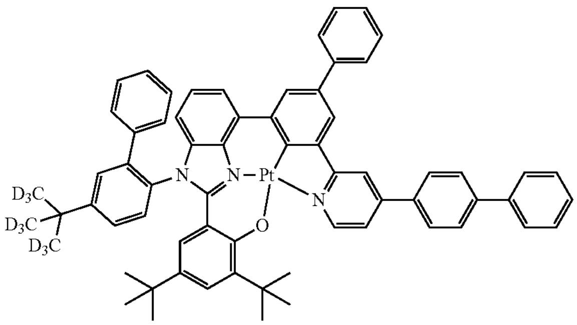
4-1952
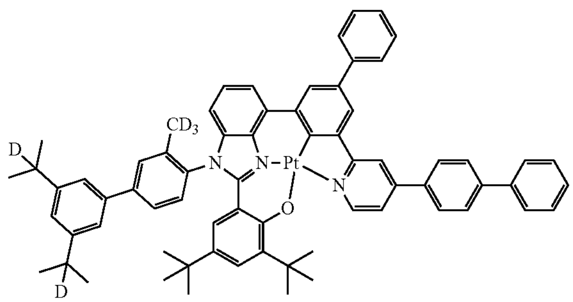
4-1953
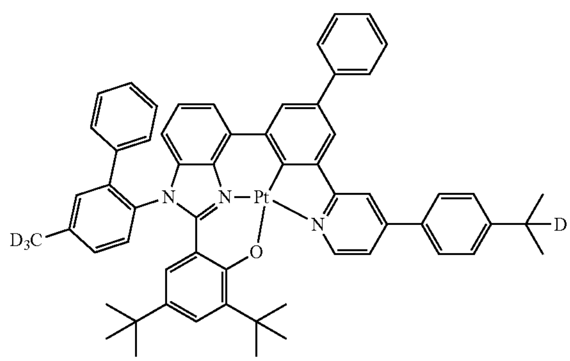
4-1954
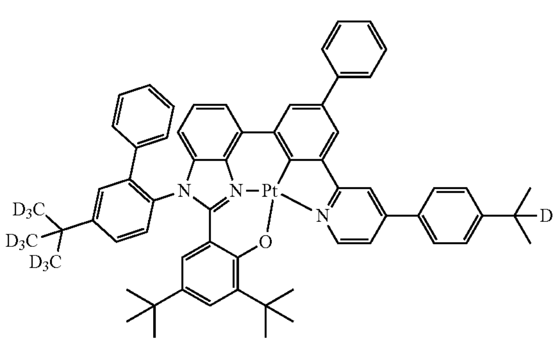
-continued
4-1955
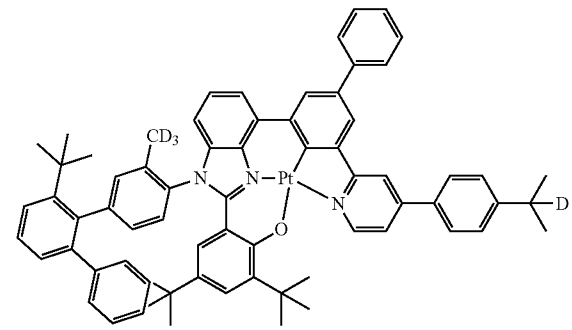
4-1956
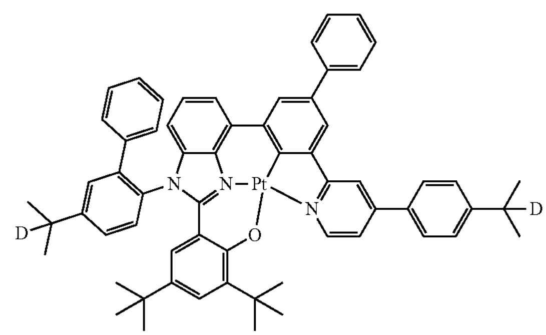
4-1957
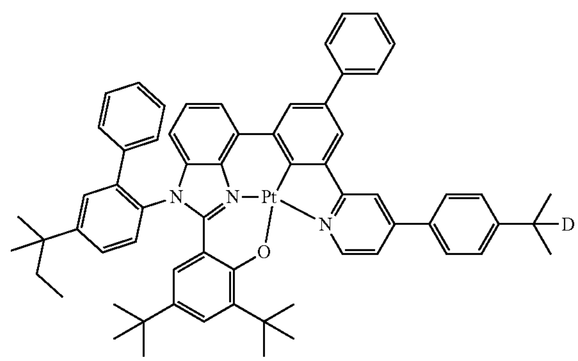
4-1958
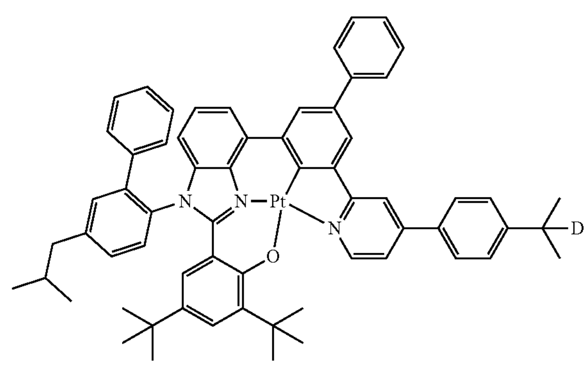

-continued
4-1959
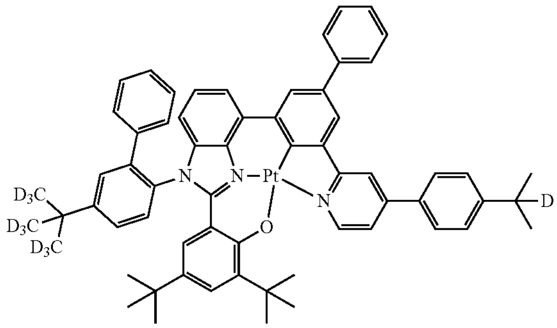
4-1960
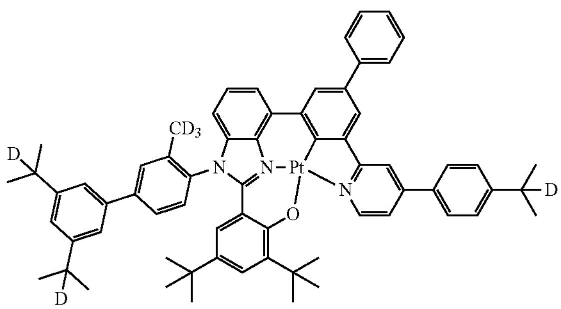
4-1961
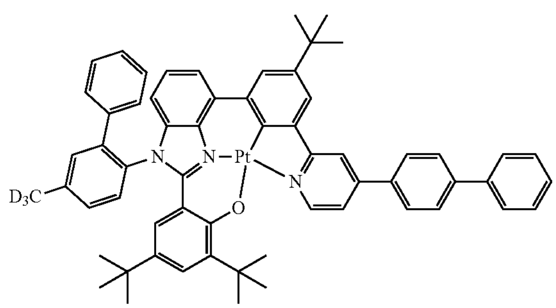
4-1962
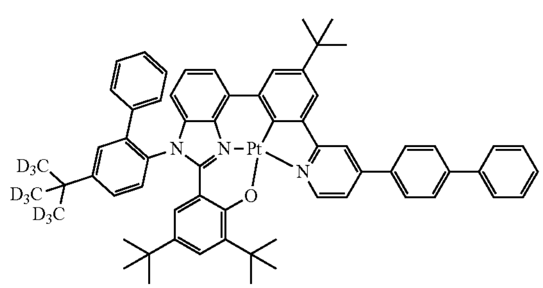
4-1963
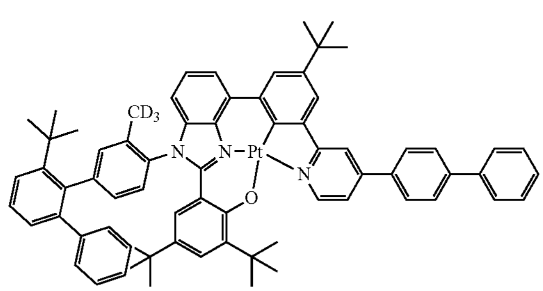
-continued
4-1964
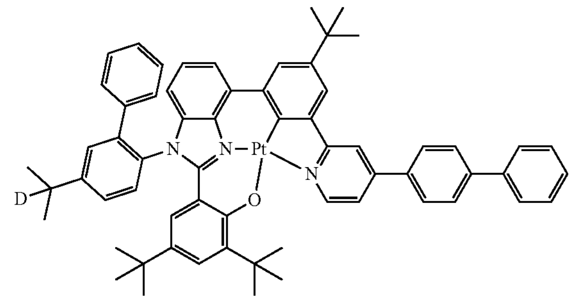
4-1965
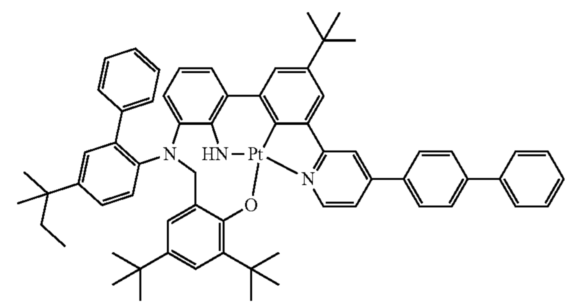
4-1966
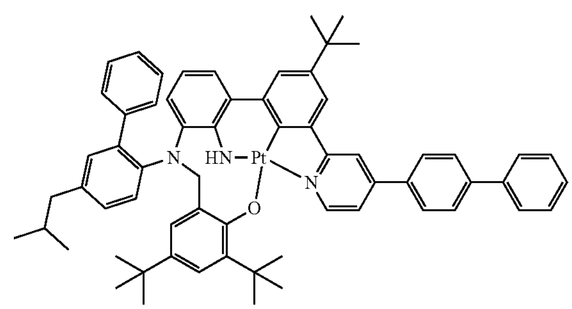
4-1967
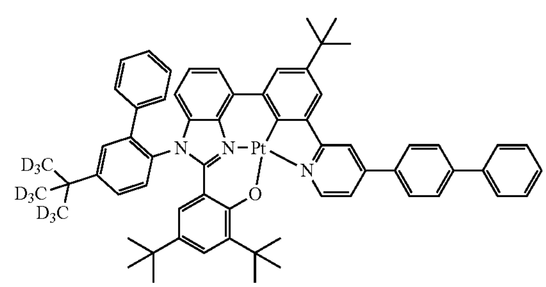
4-1968
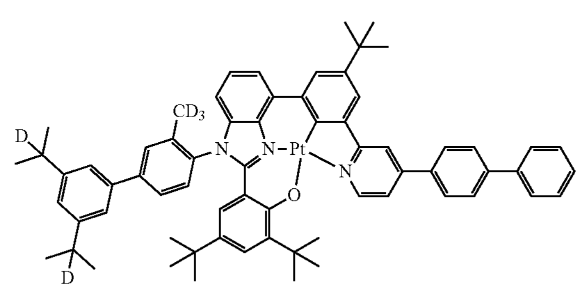

4-1969
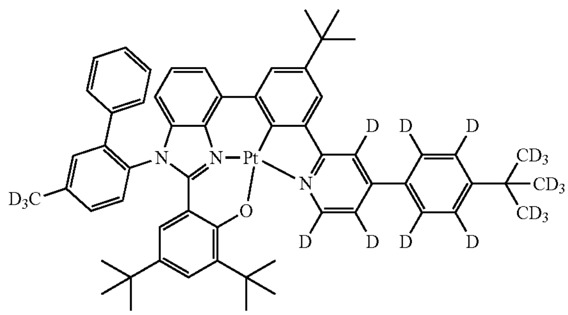
4-1970
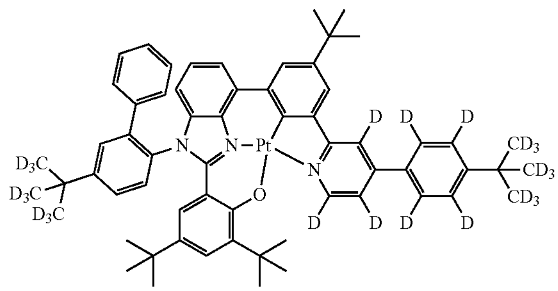
4-1971
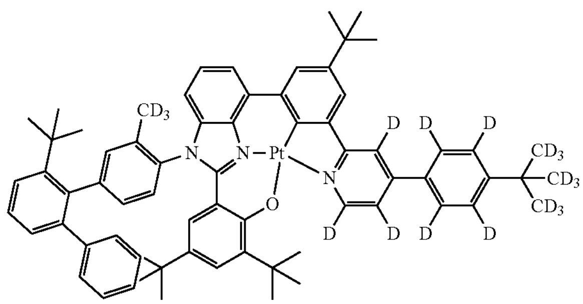
4-1972
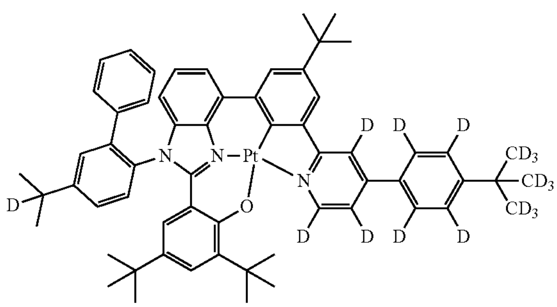
4-1973
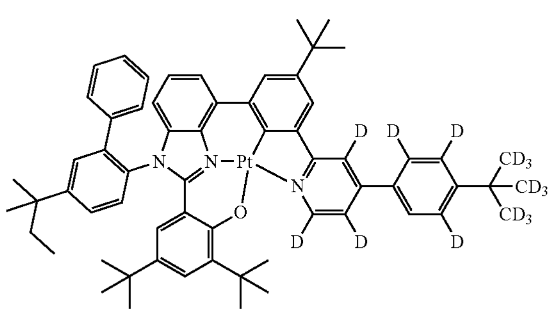
4-1974
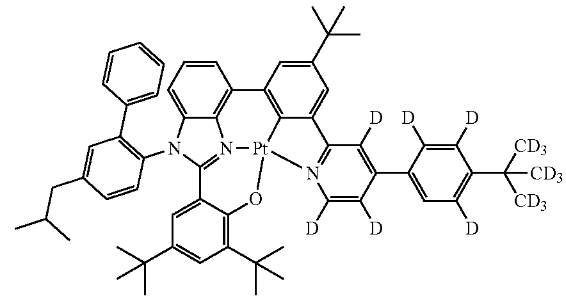
4-1975
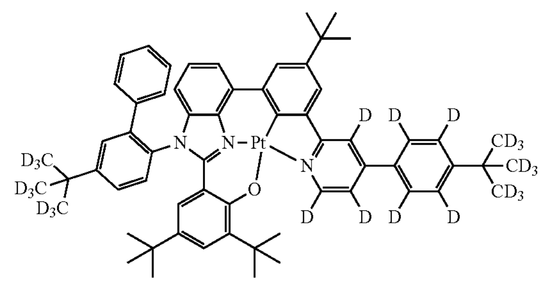
4-1976
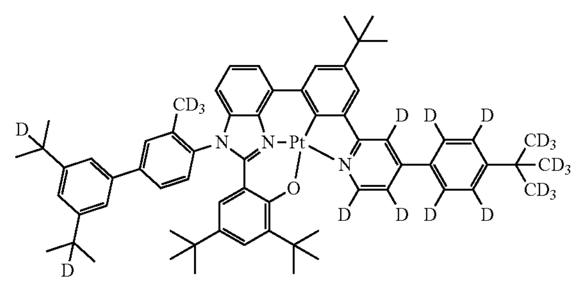
4-1977
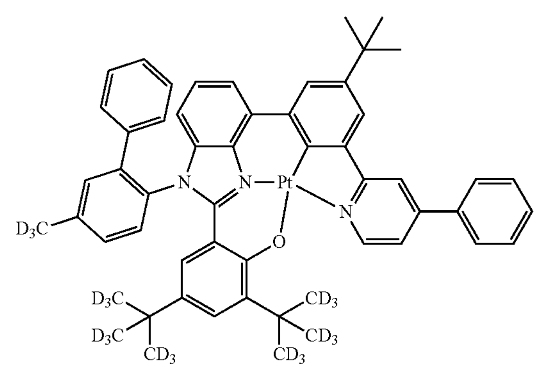

4-1978
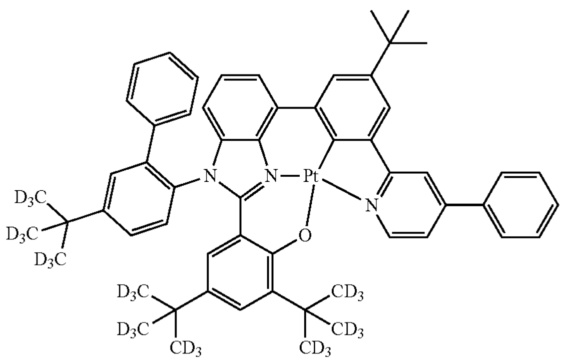
4-1979
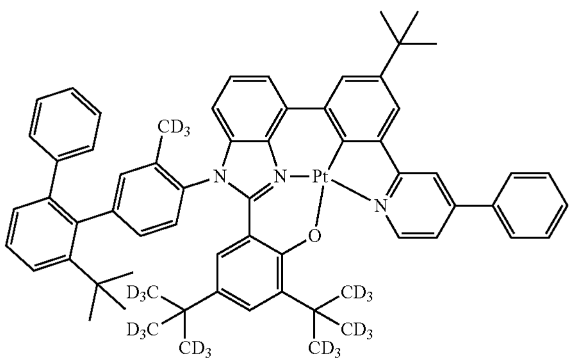
4-1980
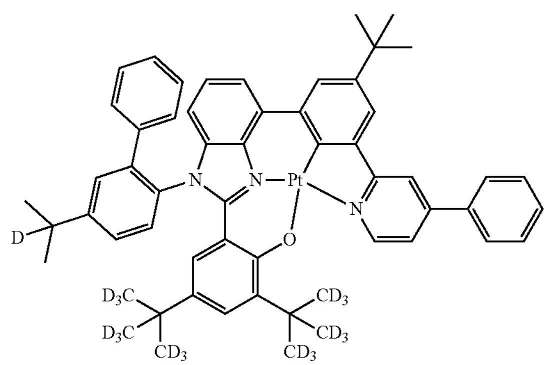
4-1981
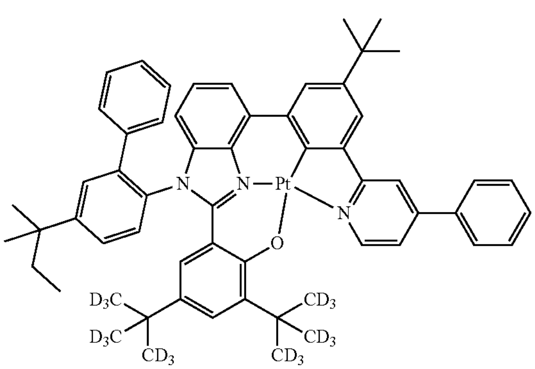
4-1982
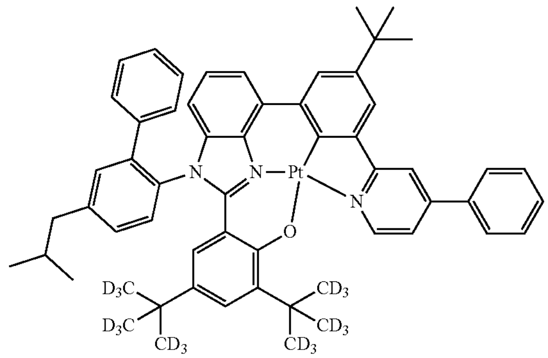
4-1983
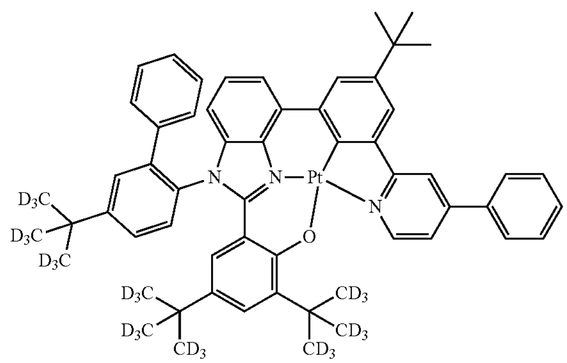
4-1984
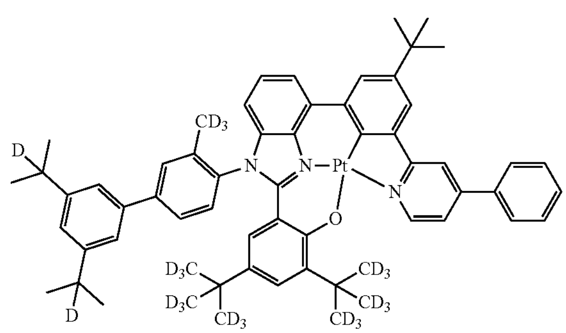
4-1985
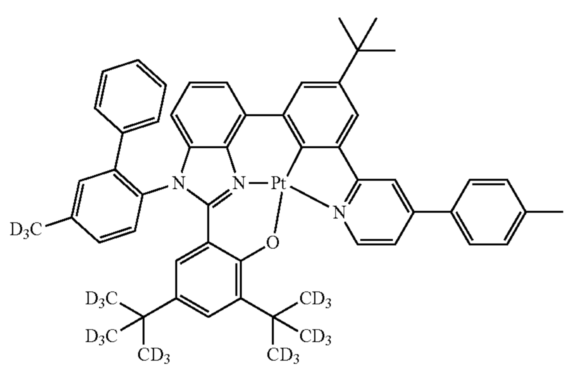

-continued
4-1986
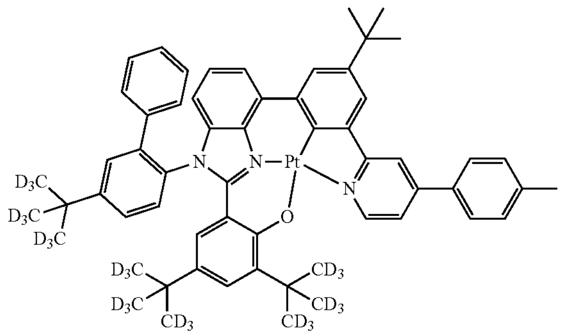
4-1987
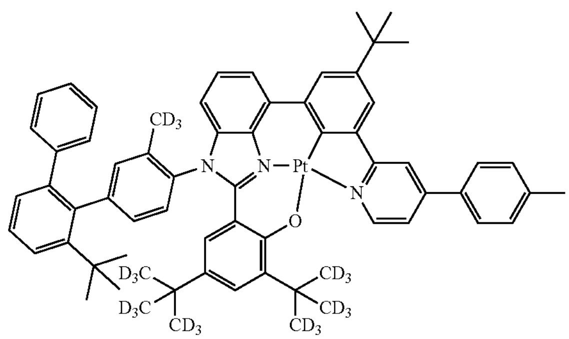
4-1988
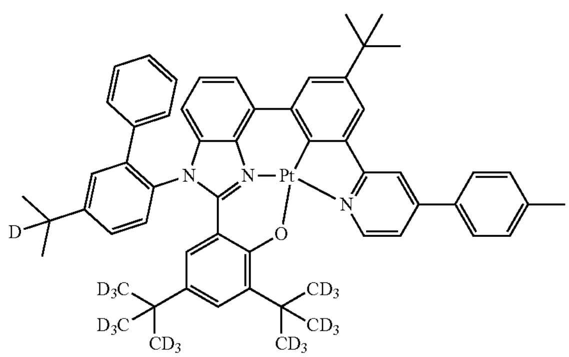
4-1989
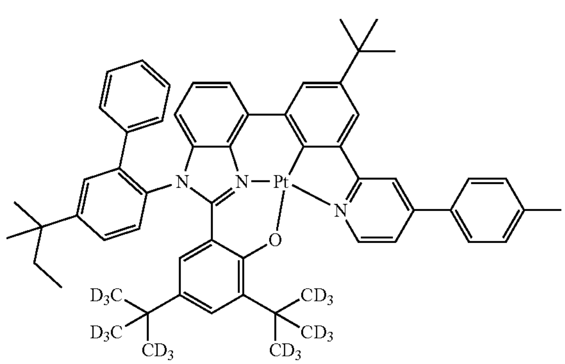
-continued
4-1990
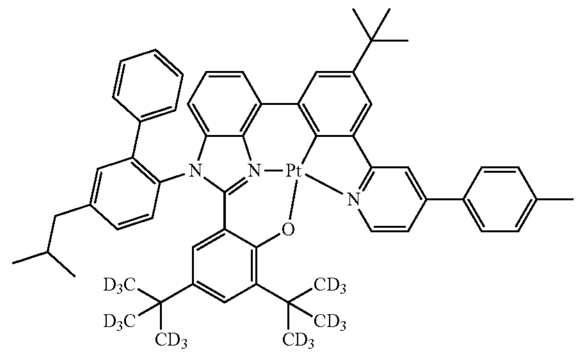
4-1991
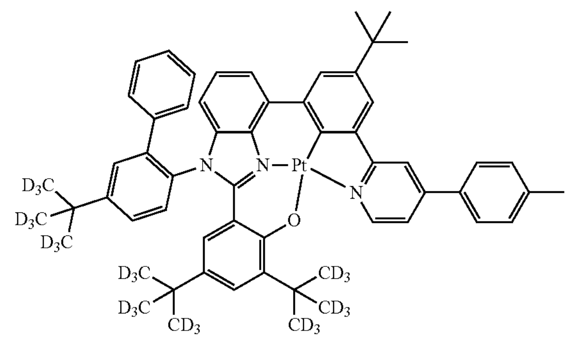
4-1992
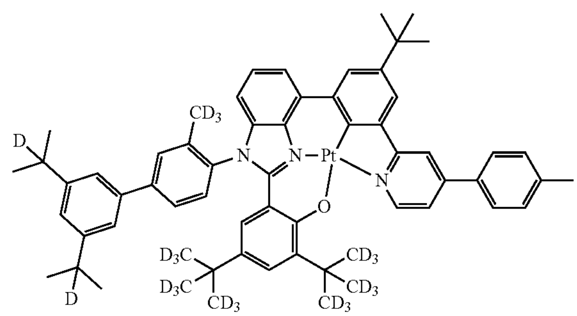
4-1993
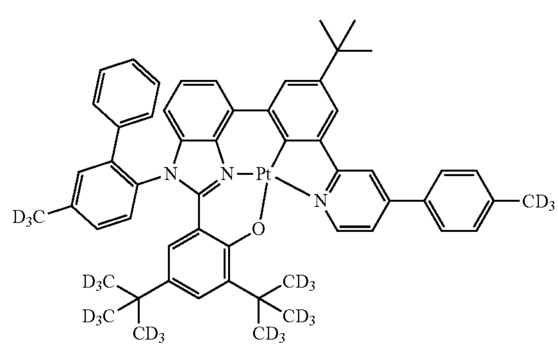

-continued
4-1994
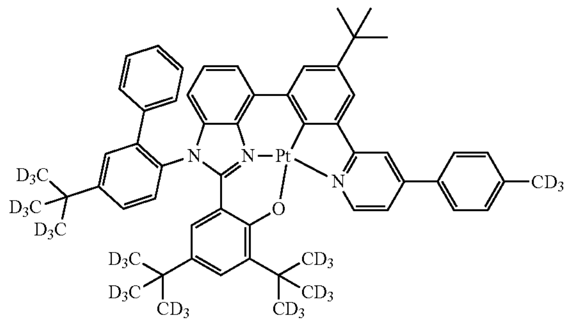
4-1995
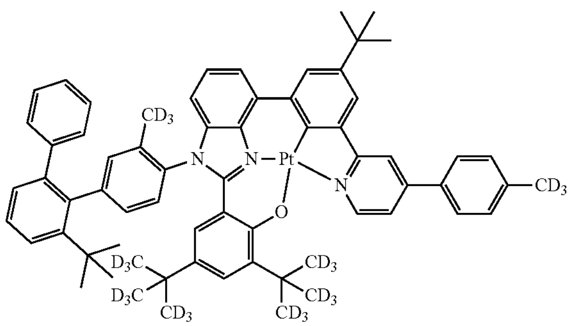
4-1996
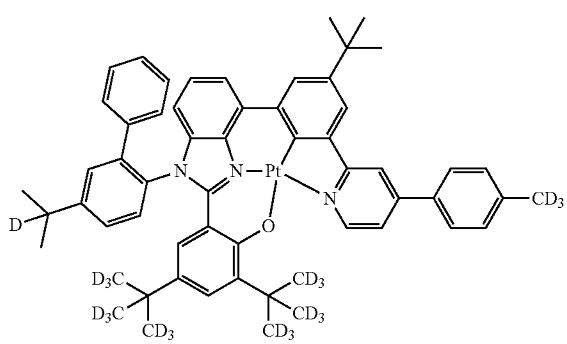
4-1997
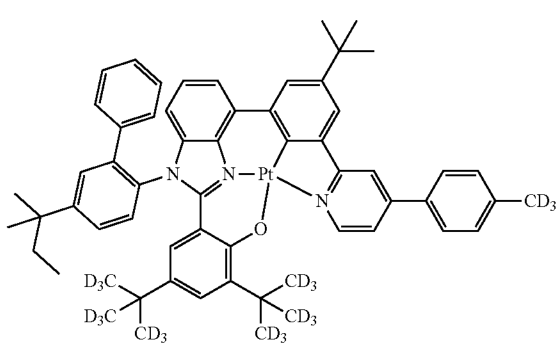
-continued
4-1998
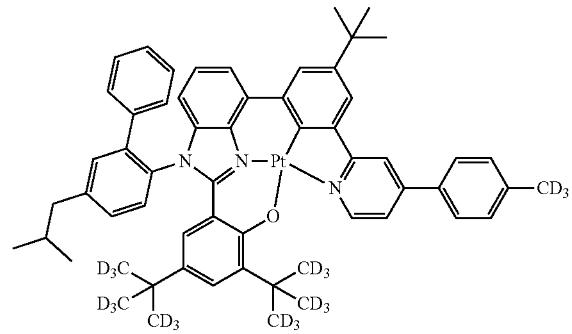
4-1999
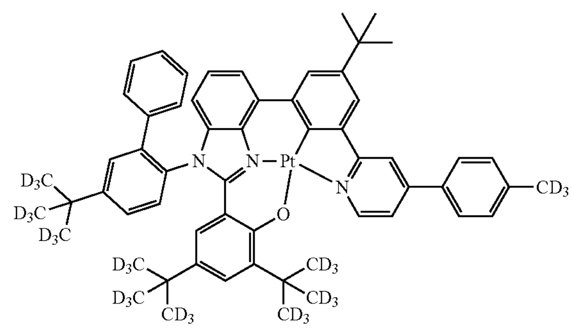
4-2000
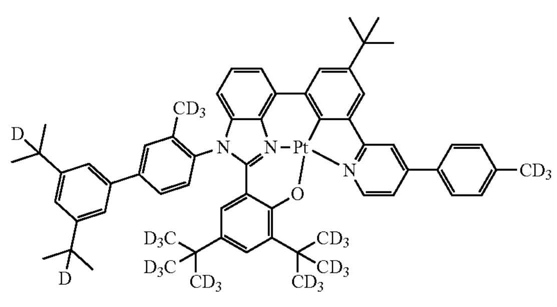
4-2001
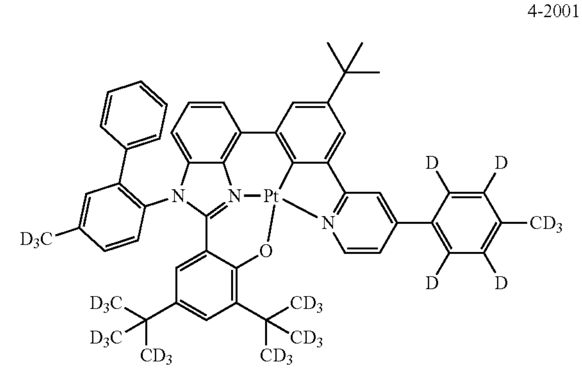

-continued
4-2002
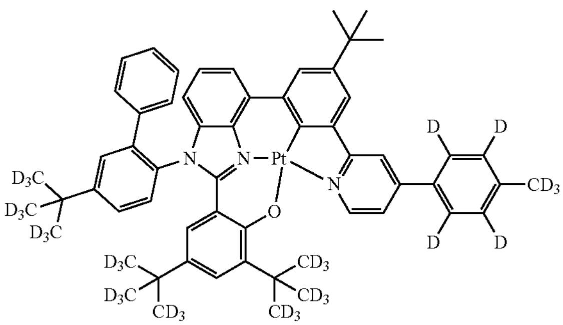
4-2003
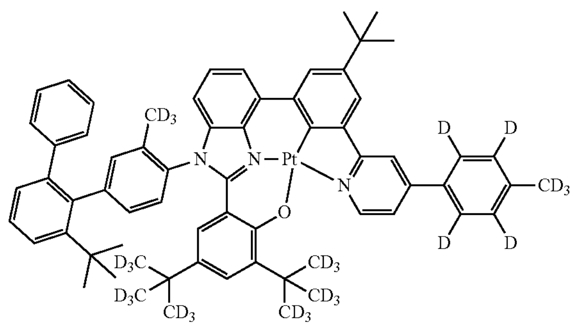
4-2004
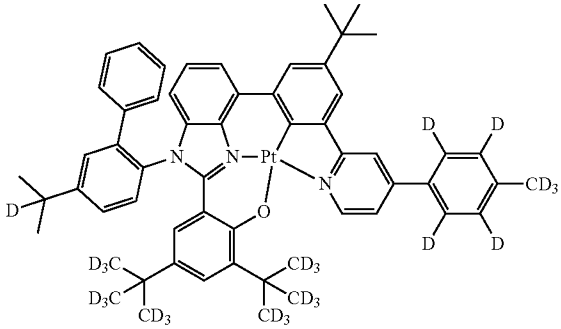
4-2005
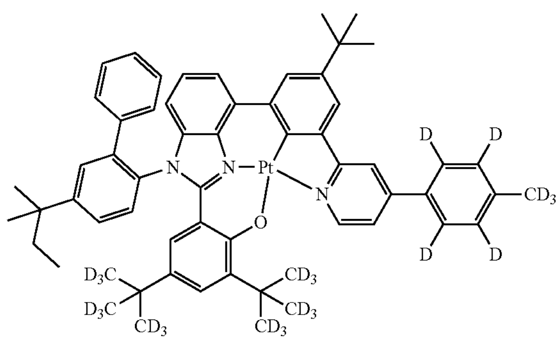
-continued
4-2006
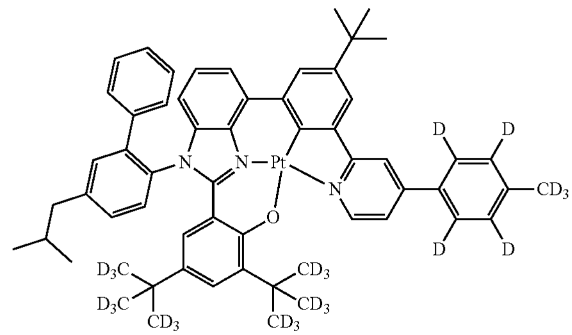
4-2007
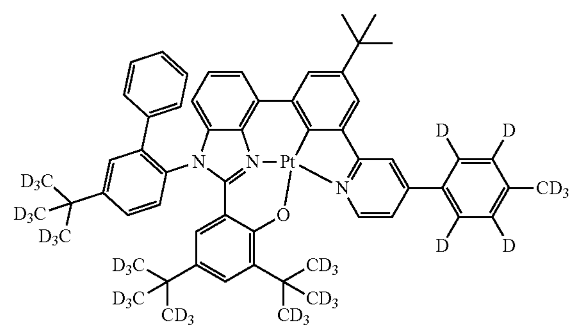
4-2008
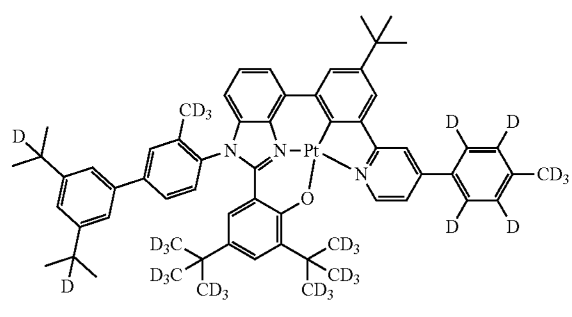
4-2009
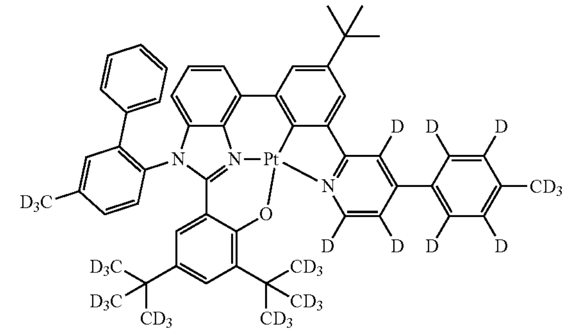

-continued
4-2010
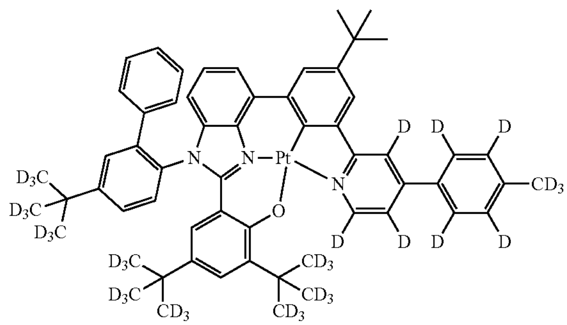
4-2011
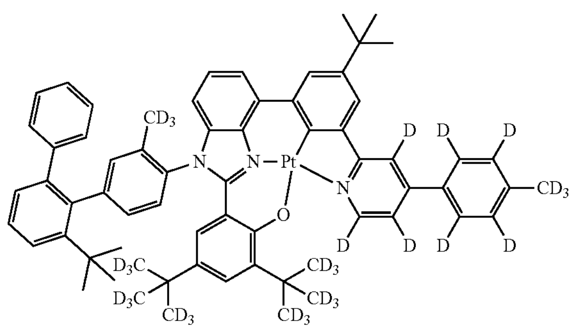
4-2012
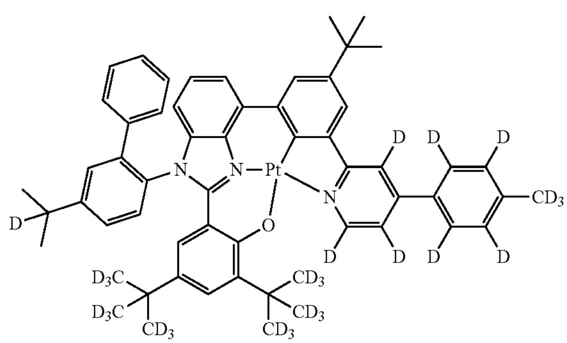
4-2013
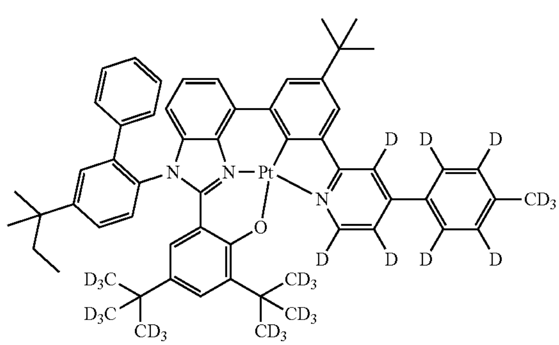
-continued
4-2014
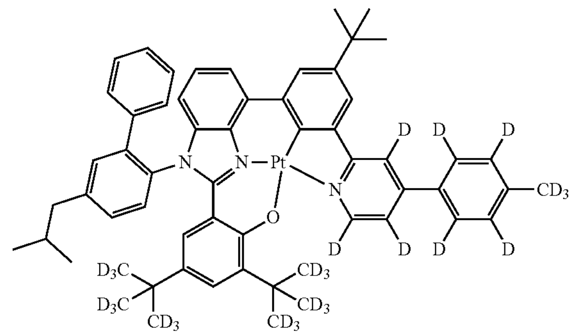
4-2015
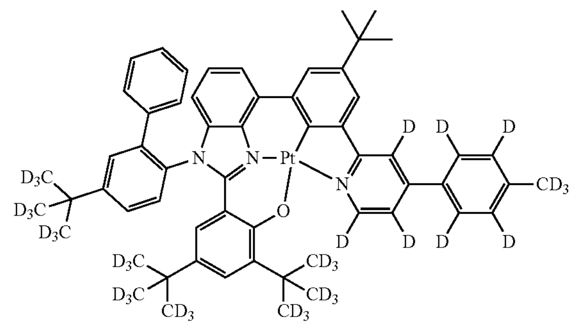
4-2016
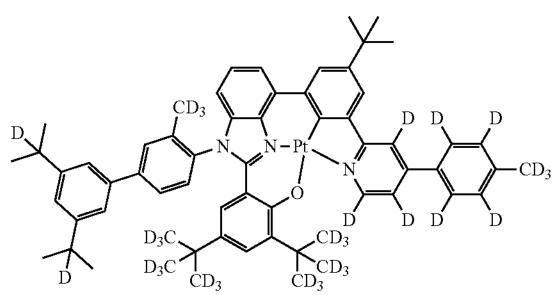
4-2017
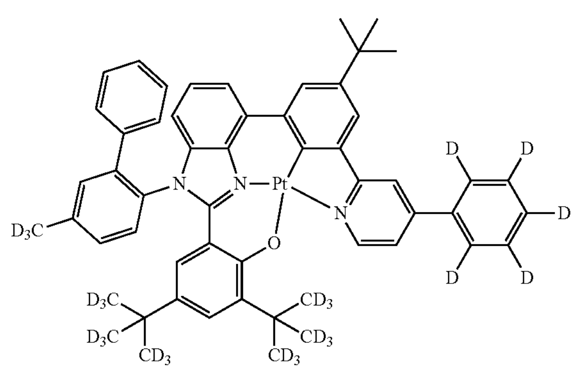

-continued
4-2018
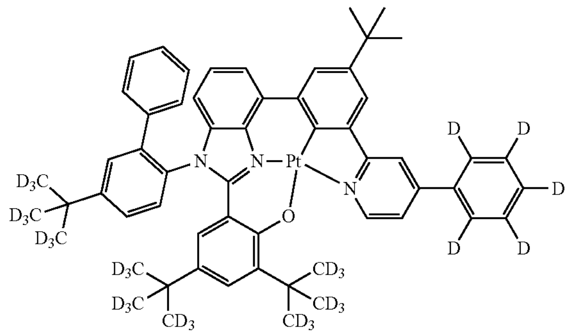
4-2019
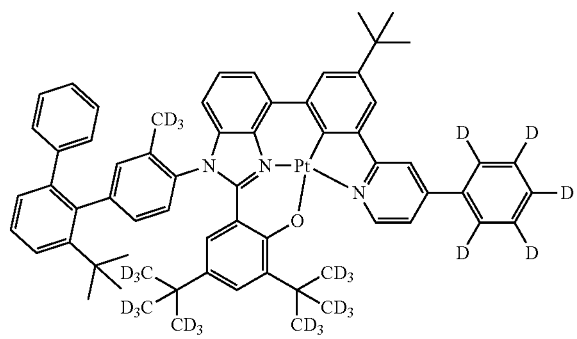
4-2020
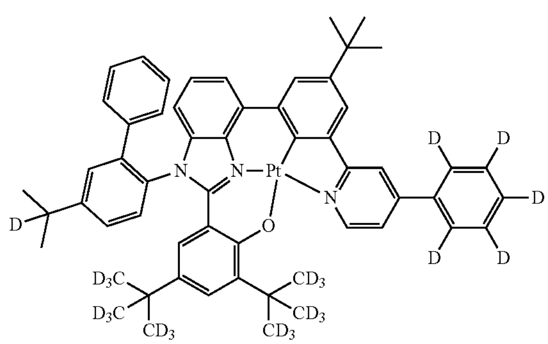
4-2021
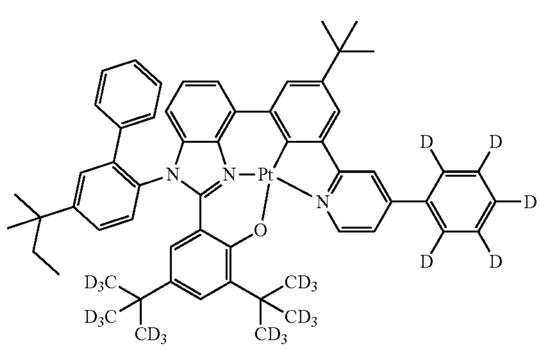
-continued
4-2022
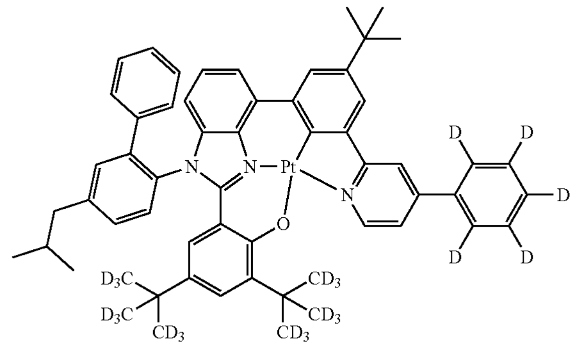
4-2023
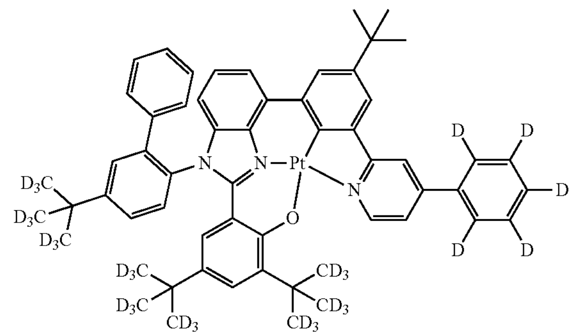
4-2024
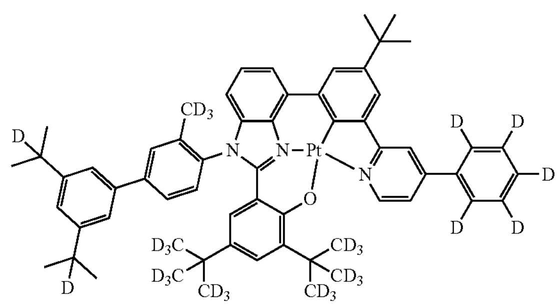
4-2025
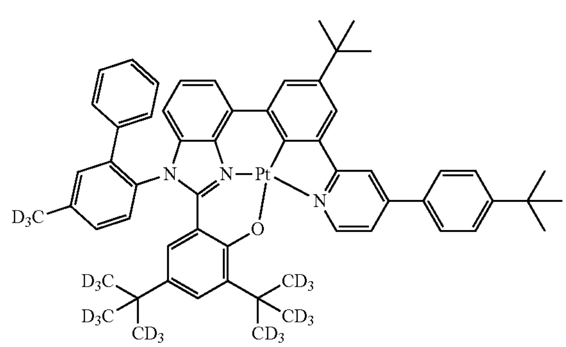

4-2026
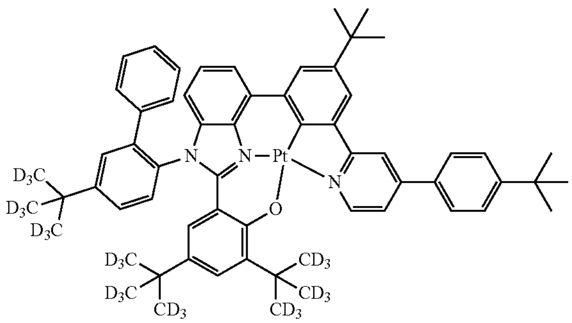
4-2027
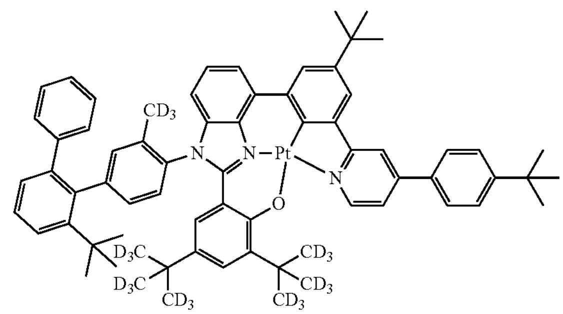
4-2028
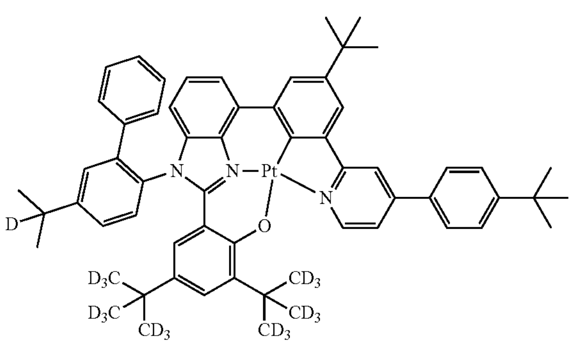
4-2029
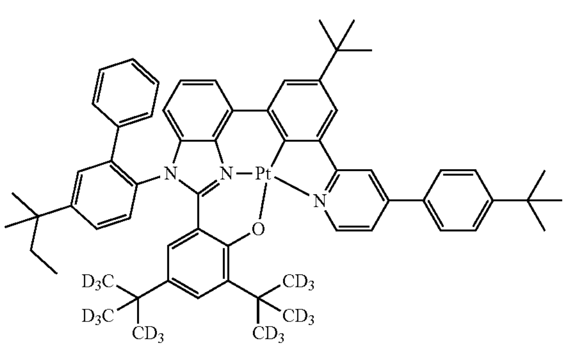
4-2030
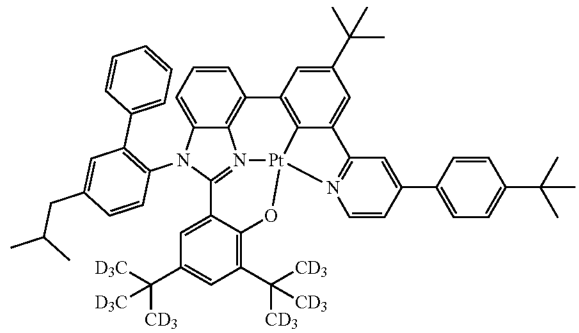
4-2031
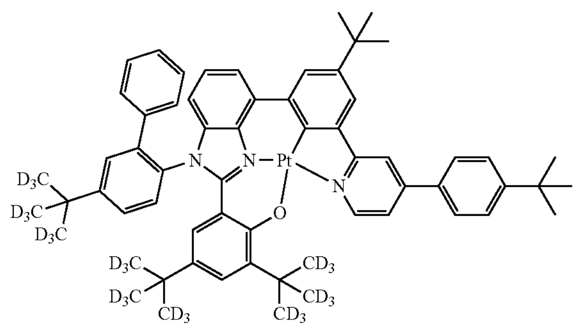
4-2032
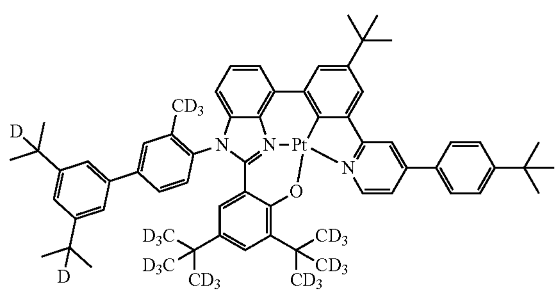
4-2033
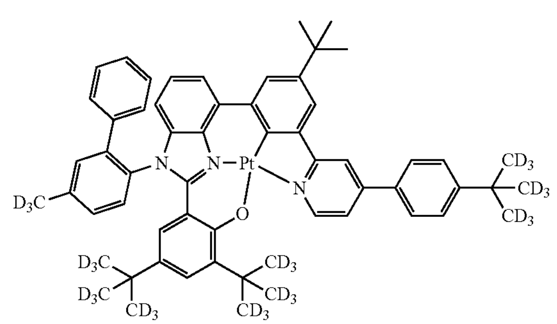

-continued
4-2034
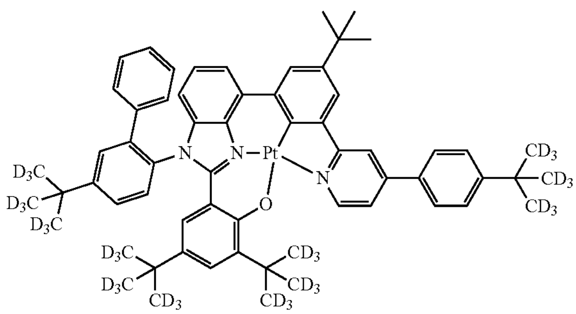
4-2035
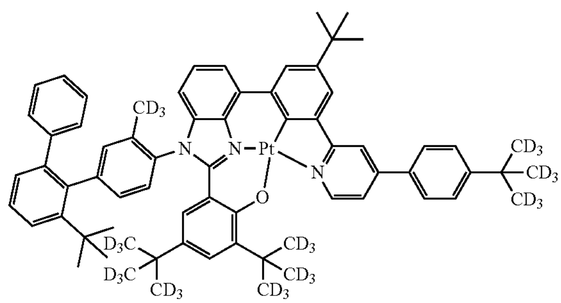
4-2036
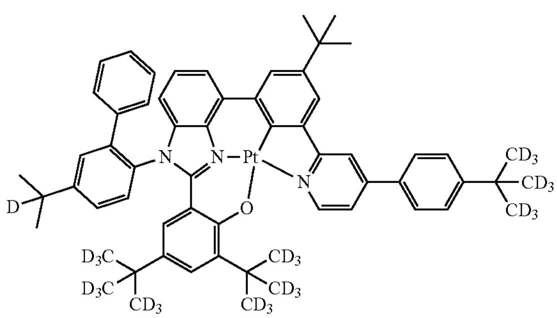
4-2037
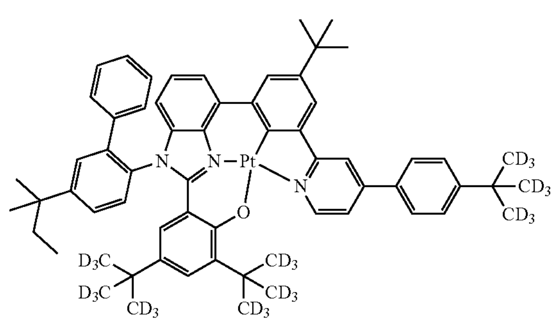
-continued
4-2038
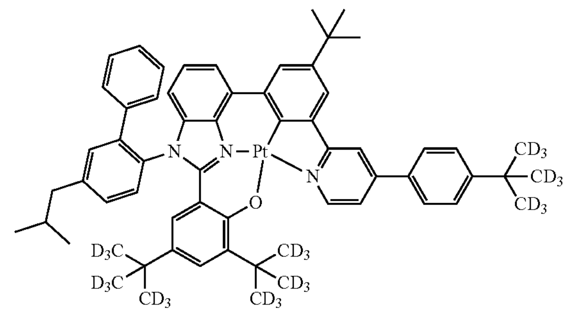
4-2039
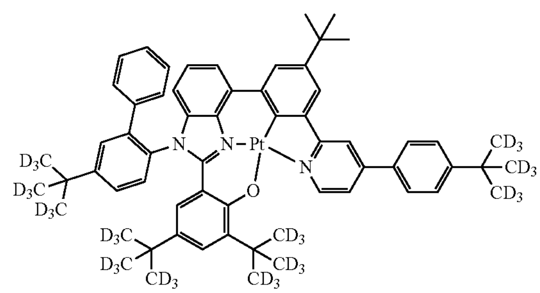
4-2040
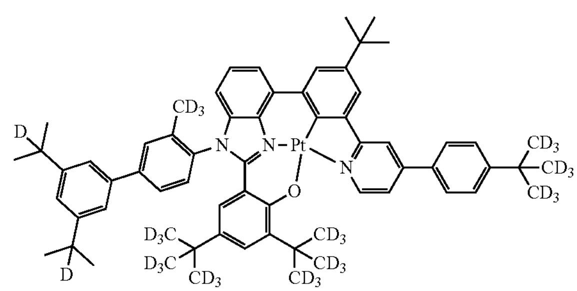
4-2041
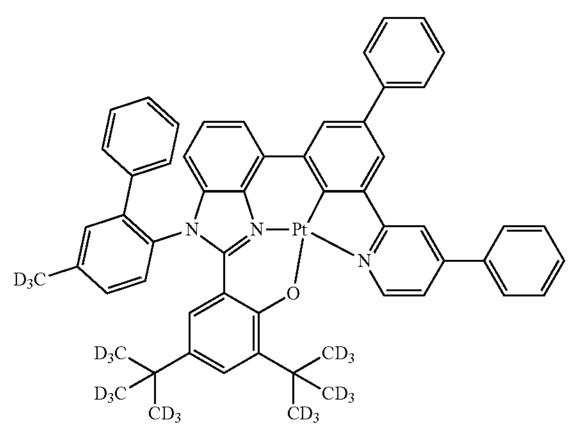

-continued
4-2042
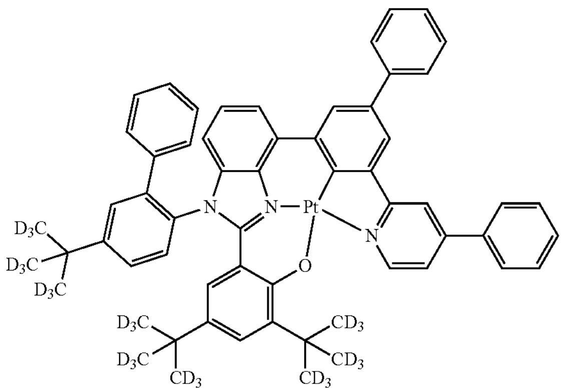
4-2043
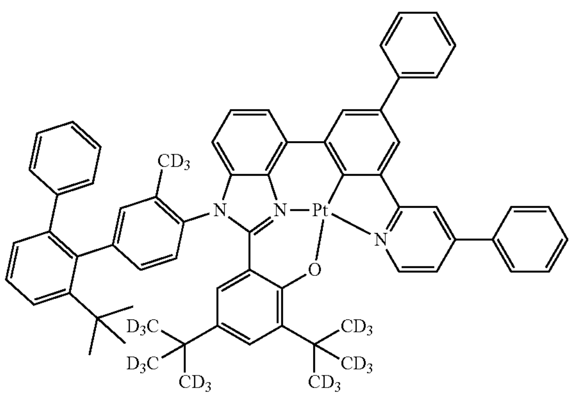
4-2044
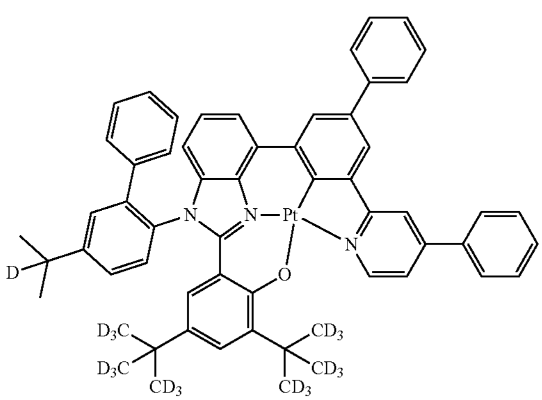
4-2045
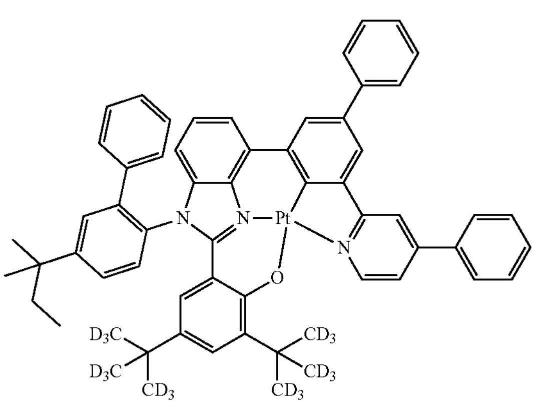
-continued
4-2046
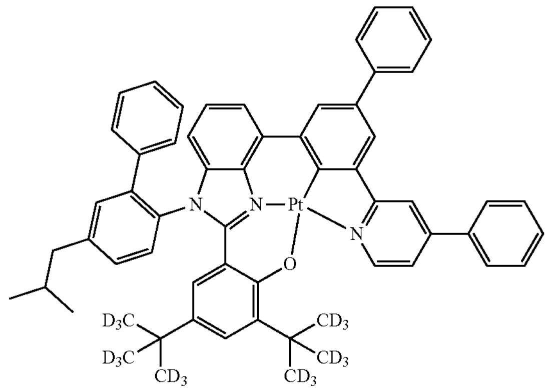
4-2047
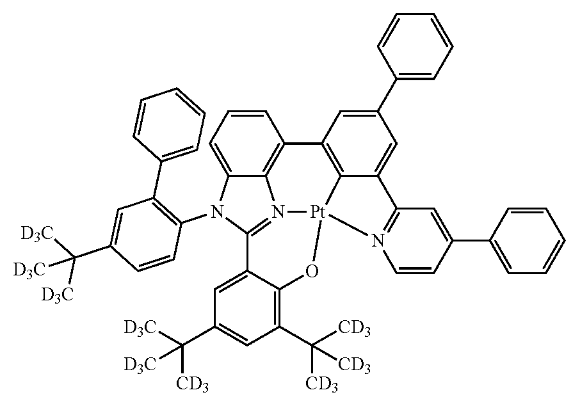
4-2048
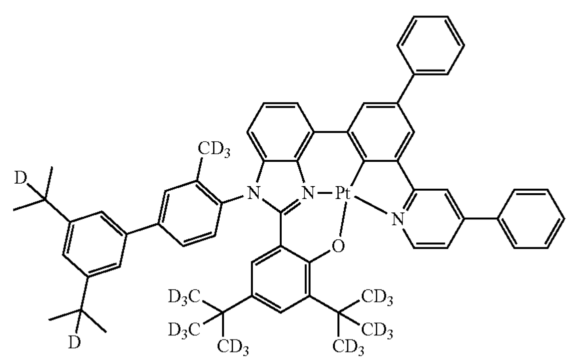
4-2049
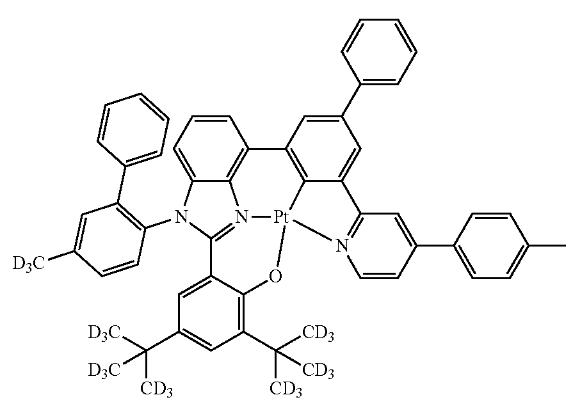

-continued
4-2050
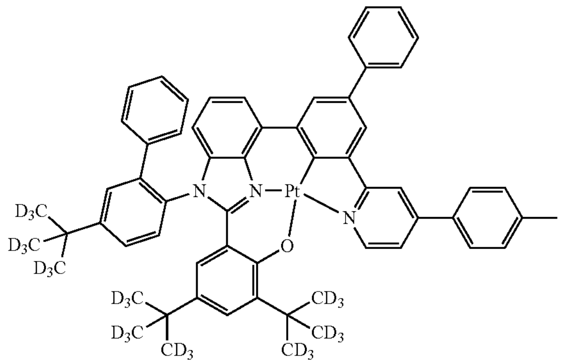
4-2051
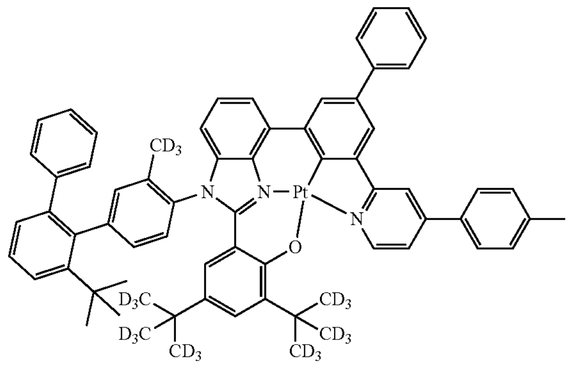
4-2052
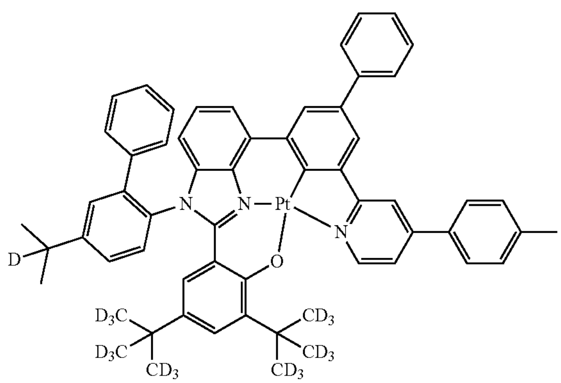
4-2053
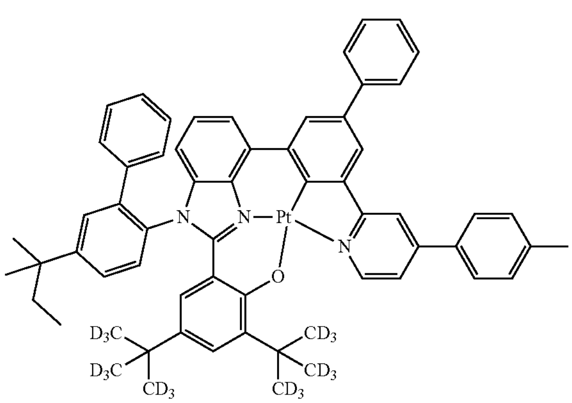
-continued
4-2054
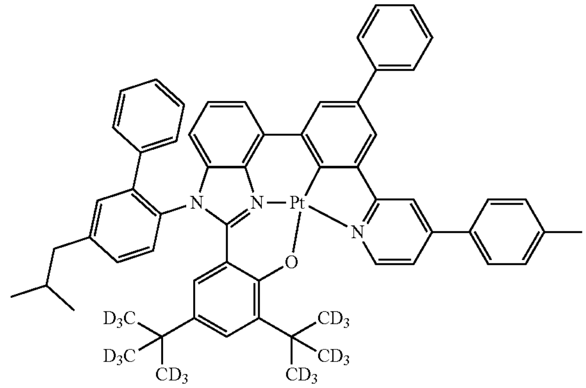
4-2055
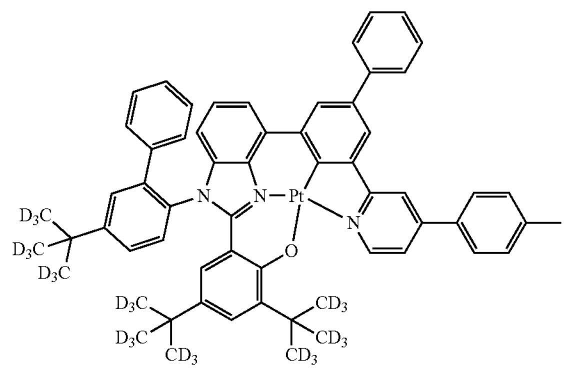
4-2056
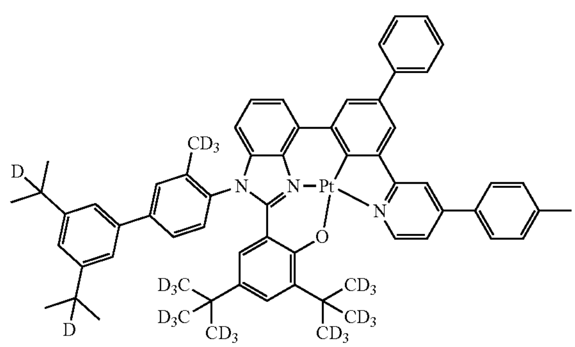
4-2057
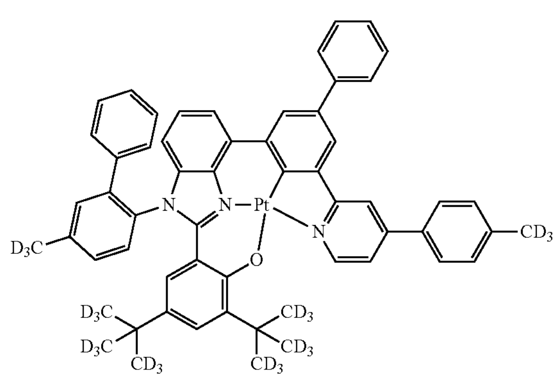

-continued
4-2058
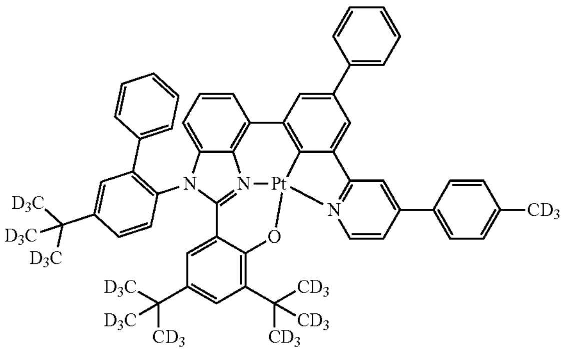
4-2059
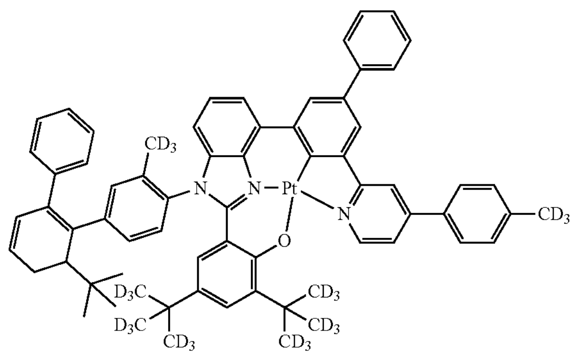
4-2060
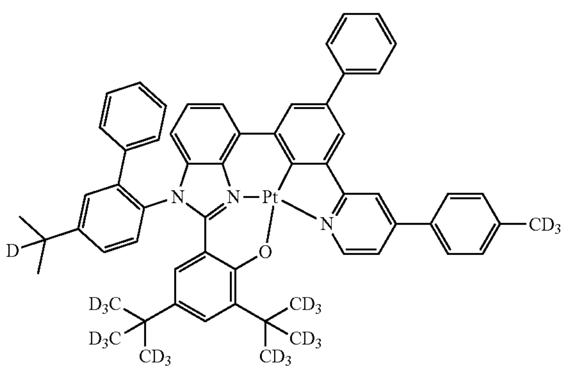
4-2061
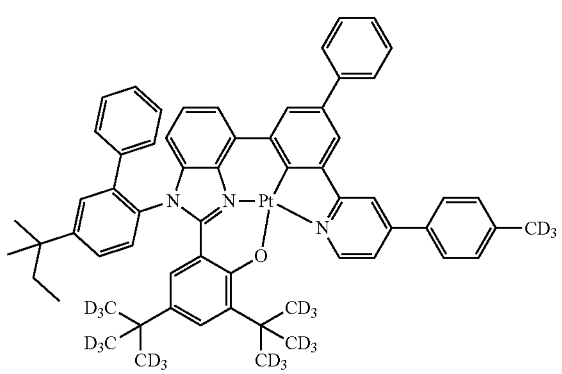
-continued
4-2062
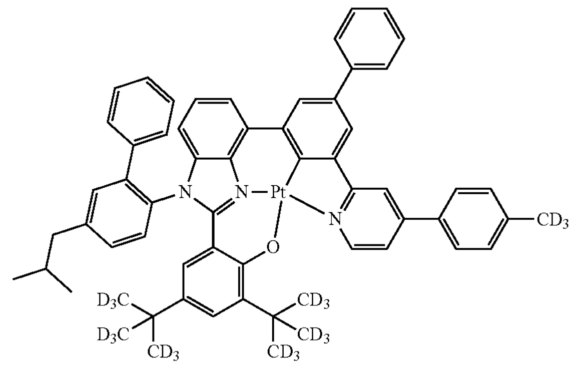
4-2063
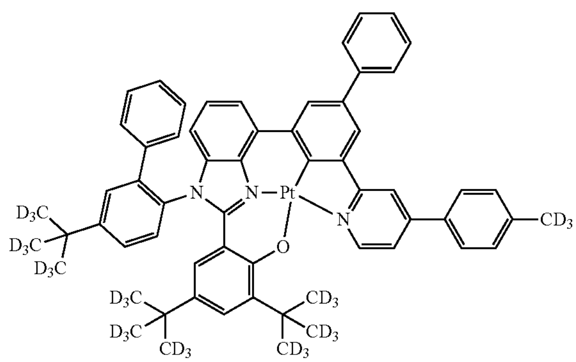
4-2064
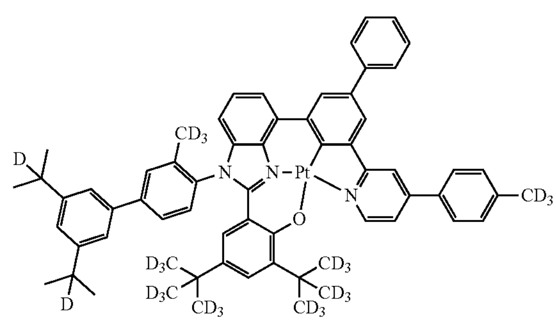
4-2065
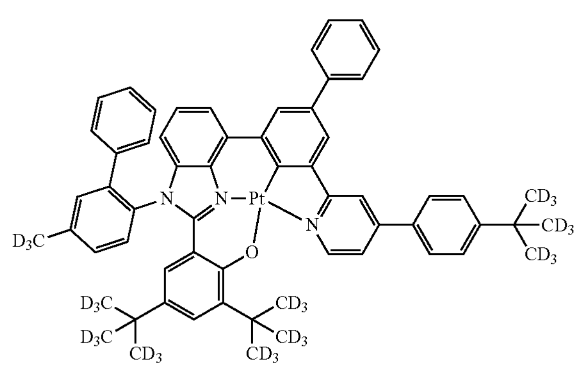

-continued
4-2066
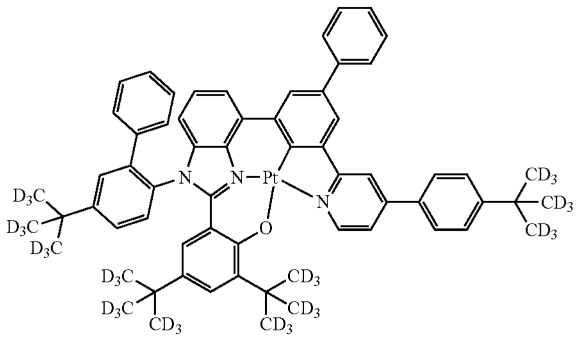
4-2067
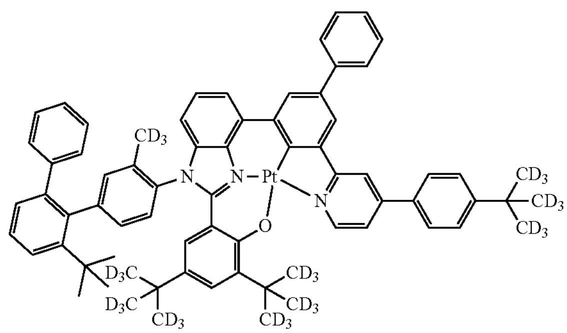
4-2068
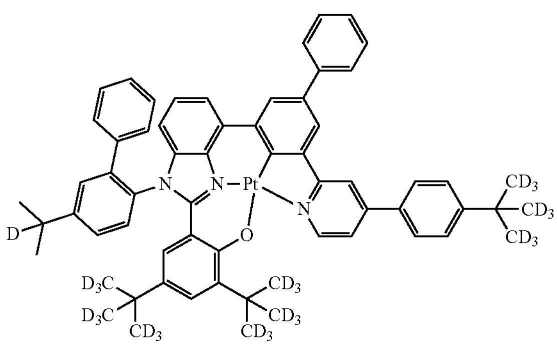
4-2069
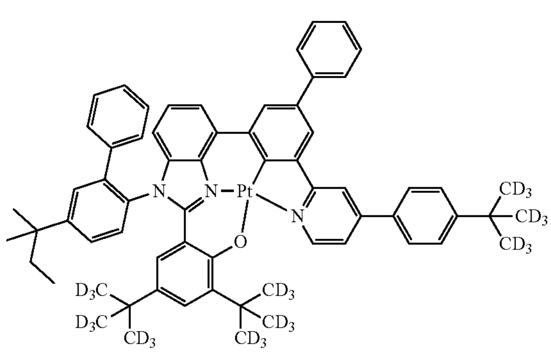
-continued
4-2070
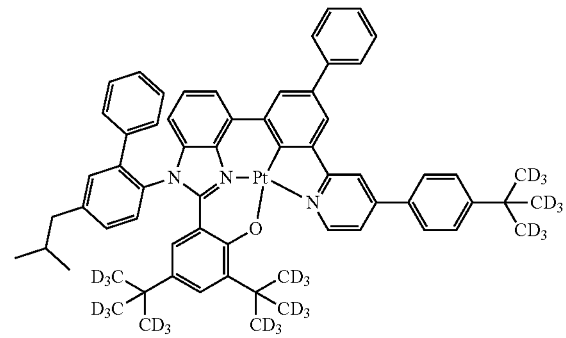
4-2071
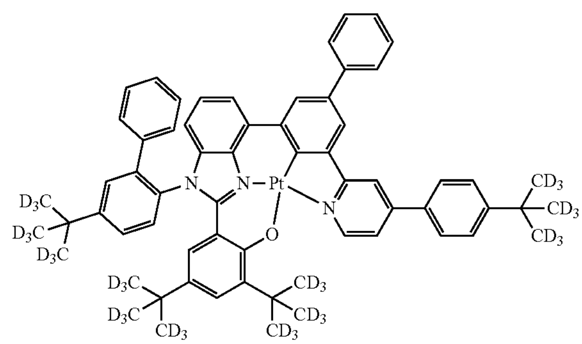
4-2072
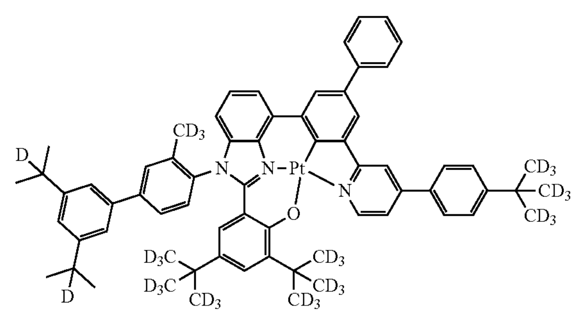
4-2073
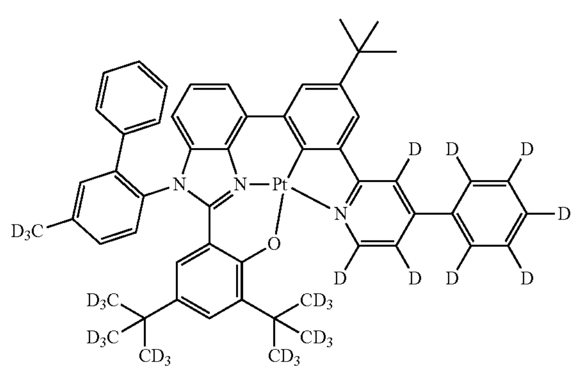

-continued
4-2074
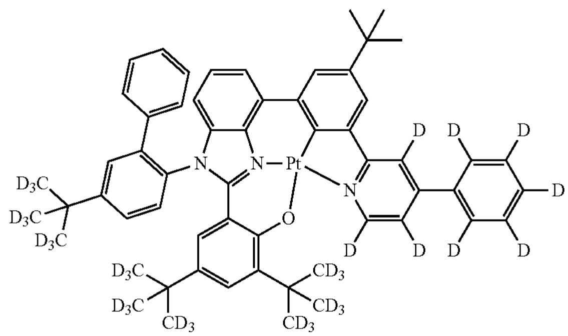
4-2078
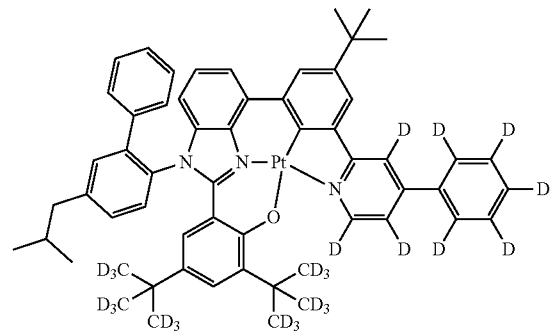
4-2075
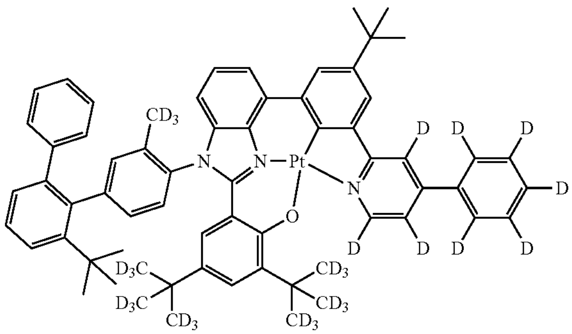
4-2079
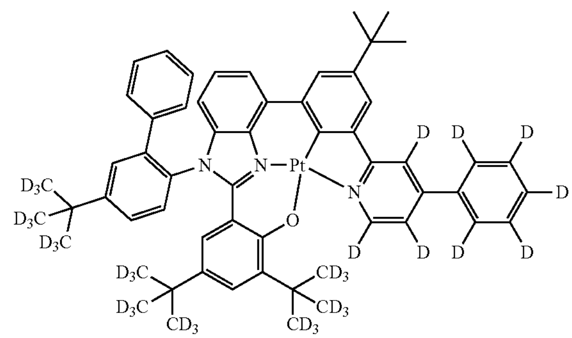
4-2076
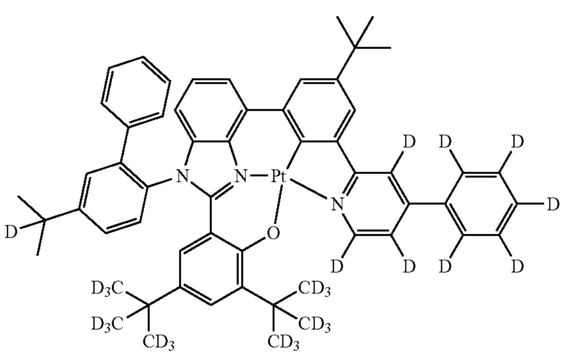
4-2080
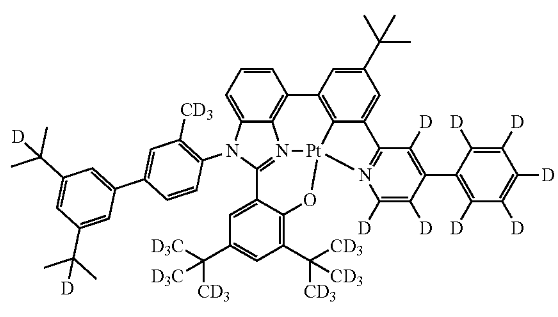
4-2077
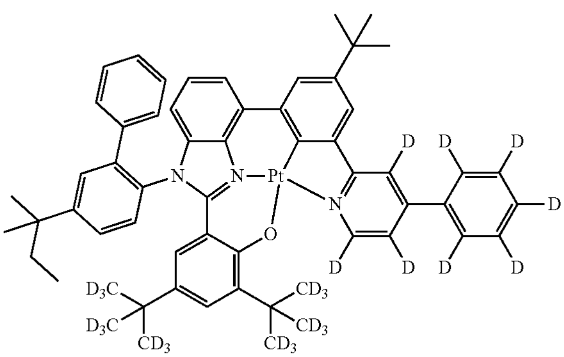
4-2081
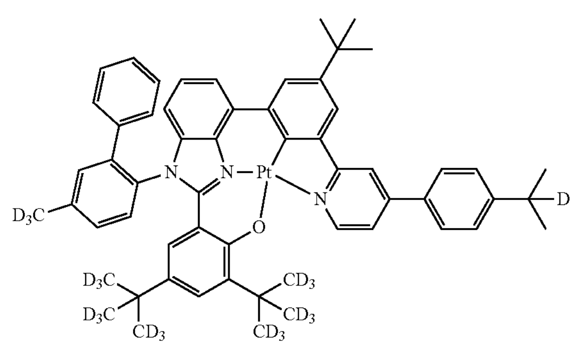

4-2082
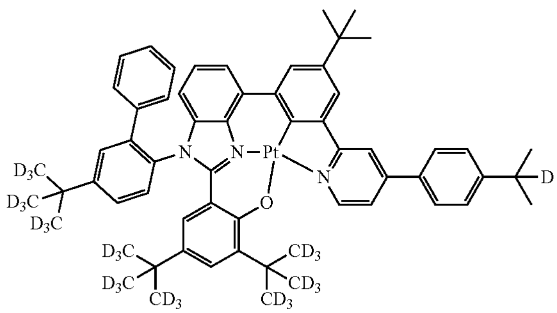
4-2083
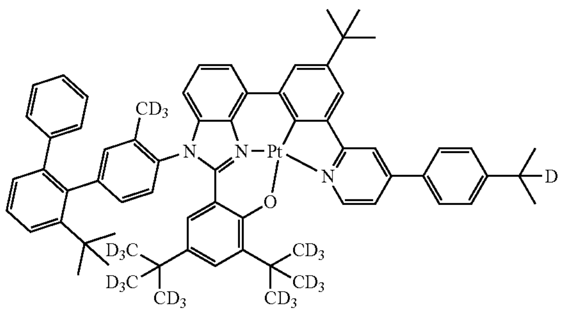
4-2084
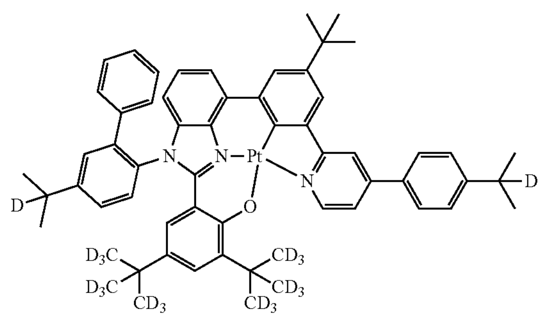
4-2085
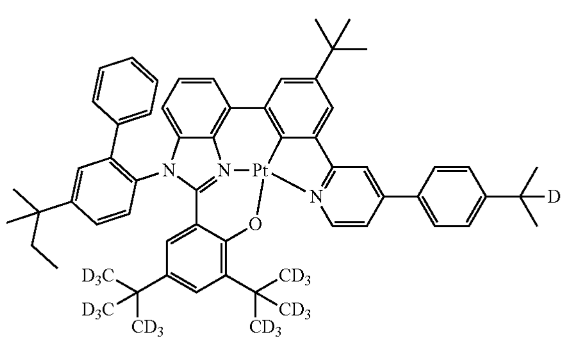
4-2086
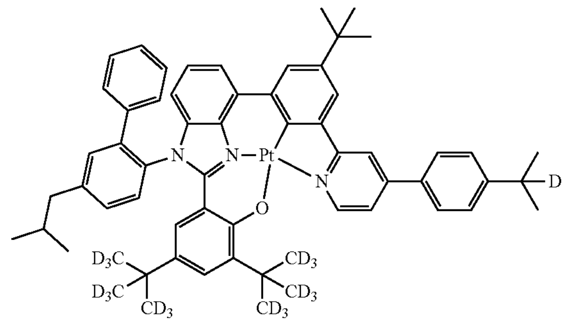
4-2087
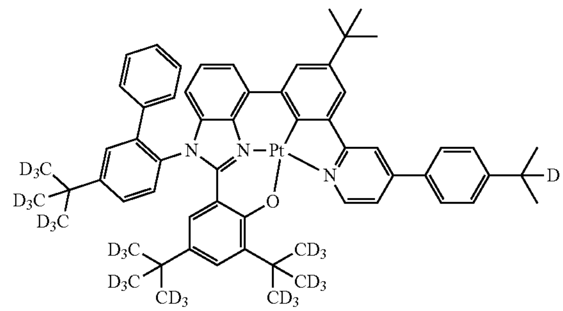
4-2088
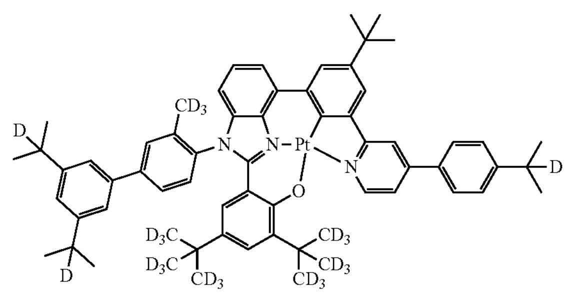
4-2089
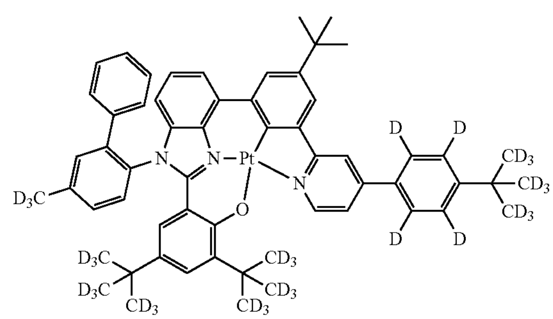
4-2090
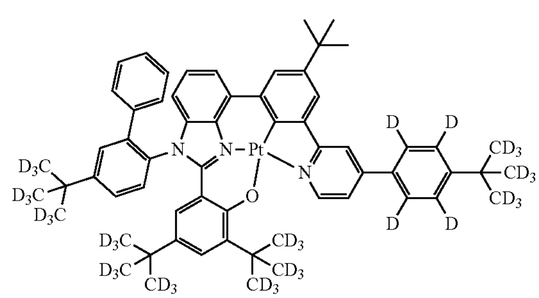

-continued
4-2091
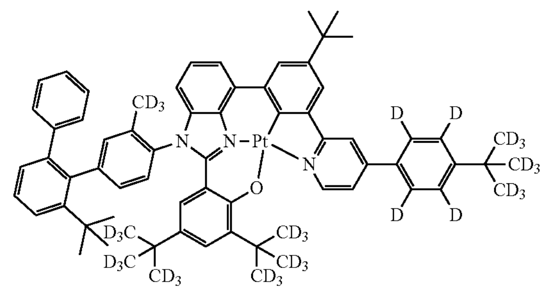
4-2092
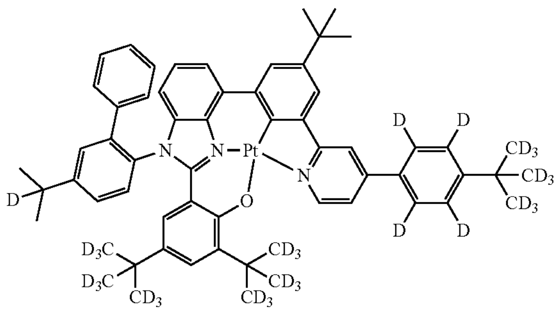
4-2093
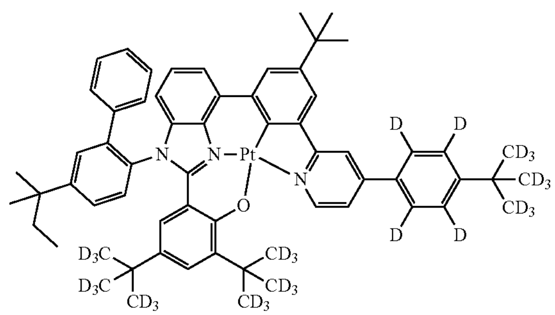
4-2094
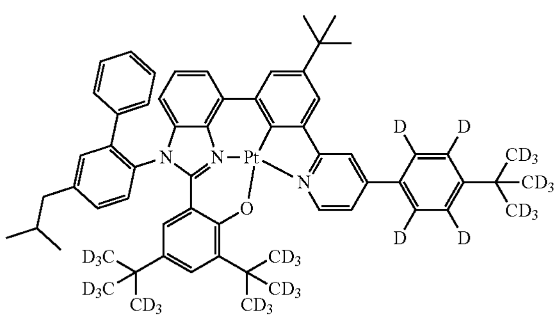
4-2095
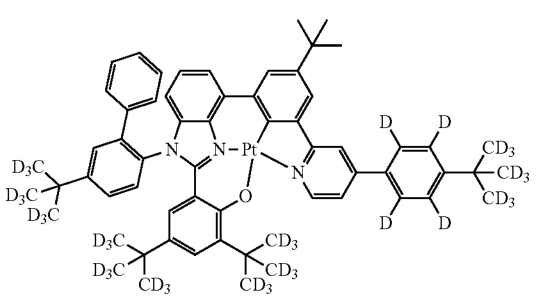
-continued
4-2096
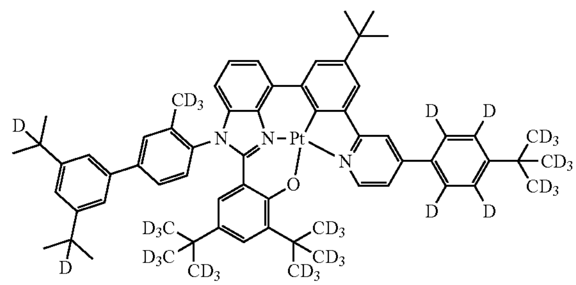
4-2097
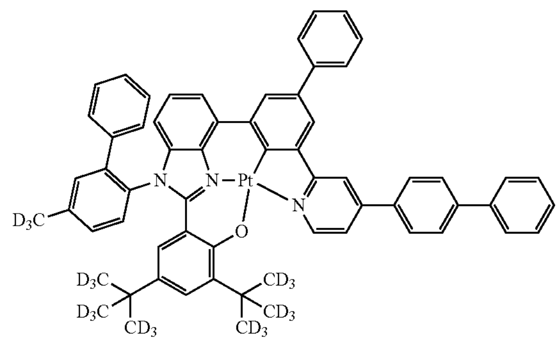
4-2098
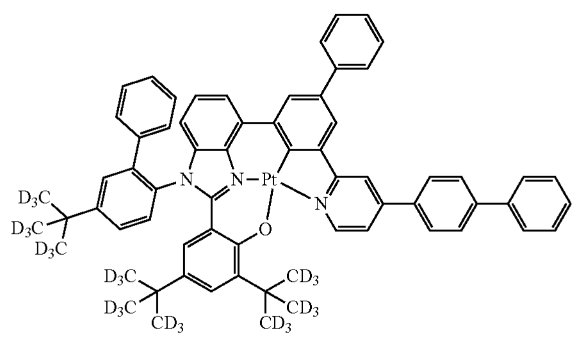
4-2099
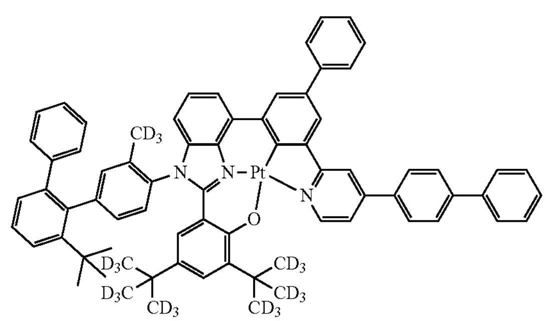

-continued
4-2100
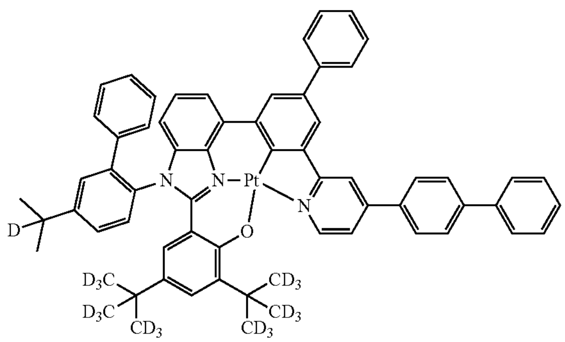
4-2101
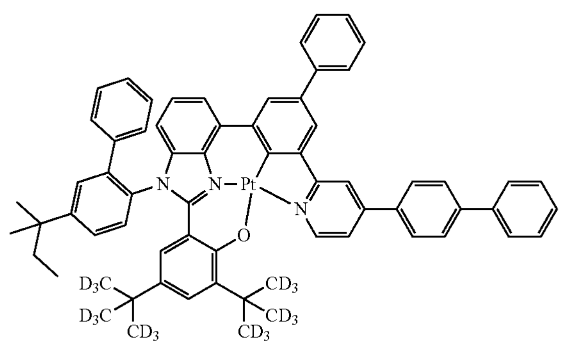
4-2102
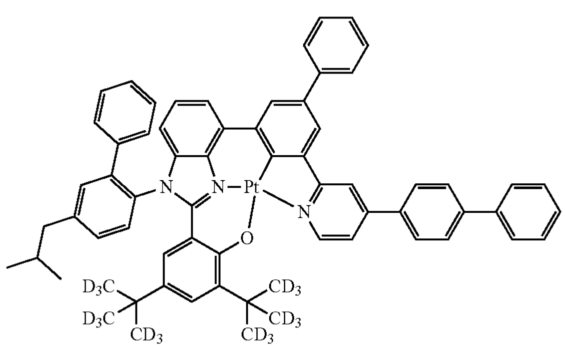
4-2103
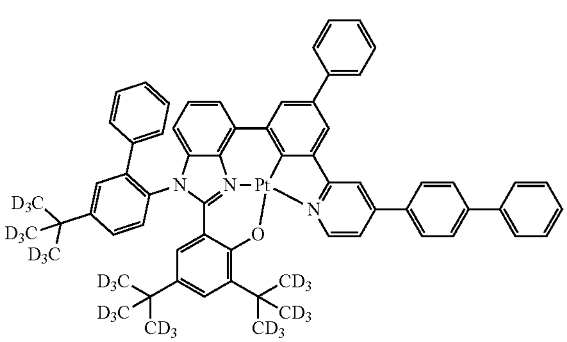
-continued
4-2104
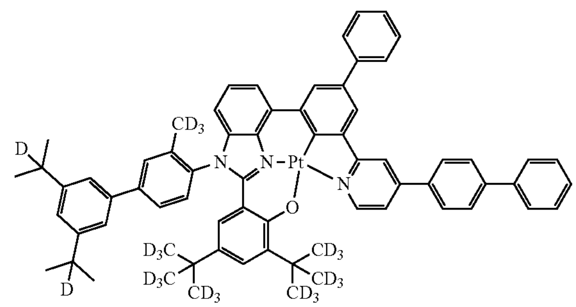
4-2105
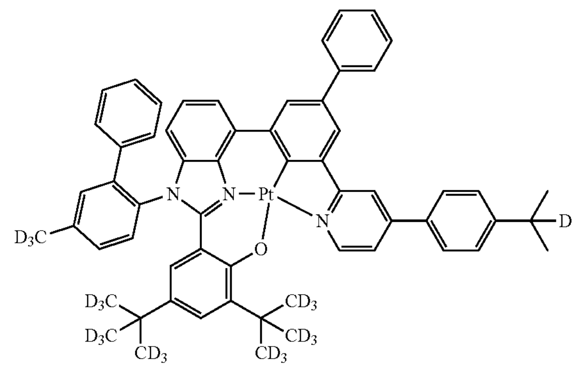
4-2106
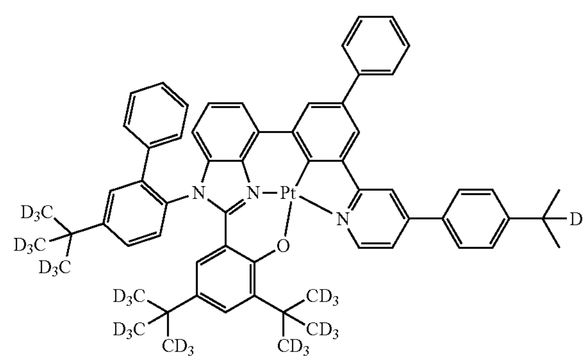
4-2107
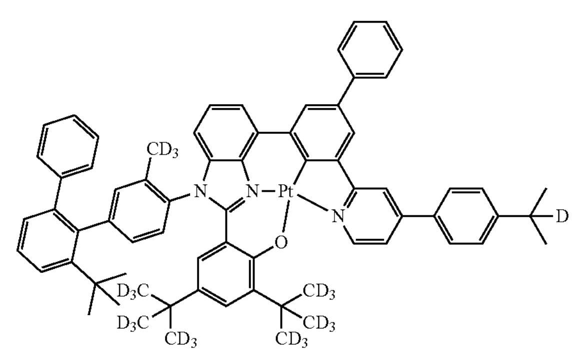

-continued
4-2108
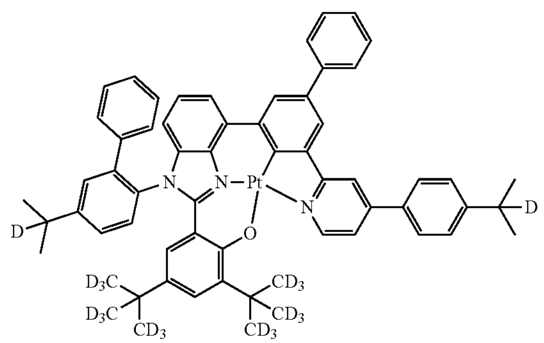
4-2109
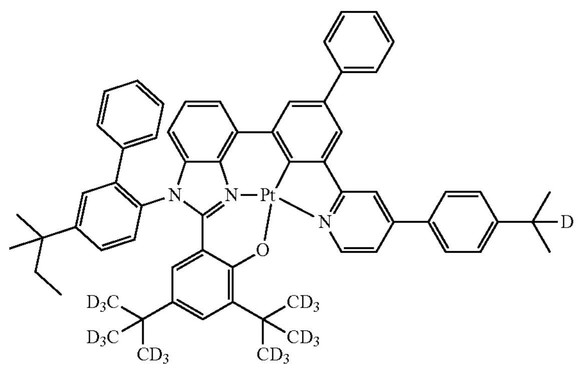
4-2110
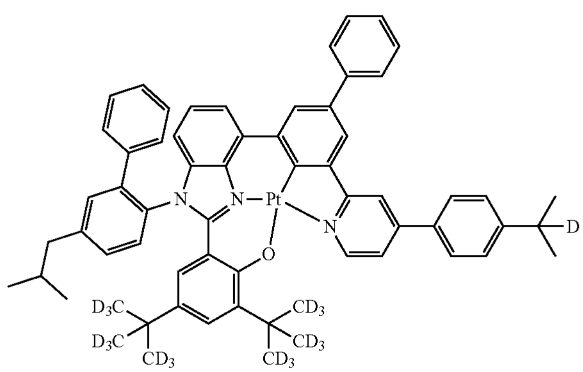
4-2111
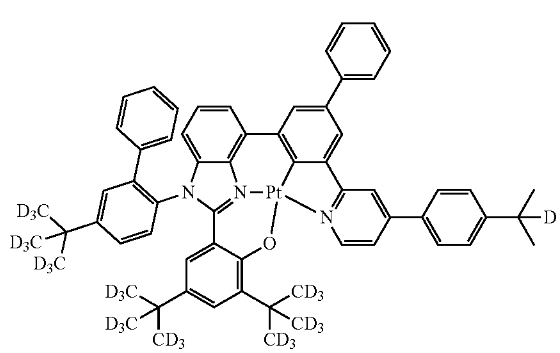
-continued
4-2112
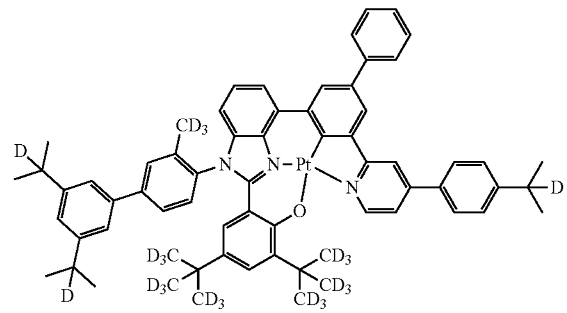
4-2113
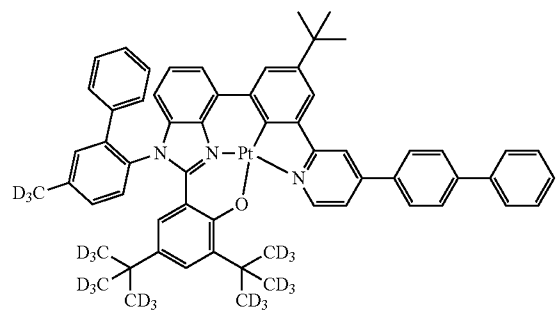
4-2114
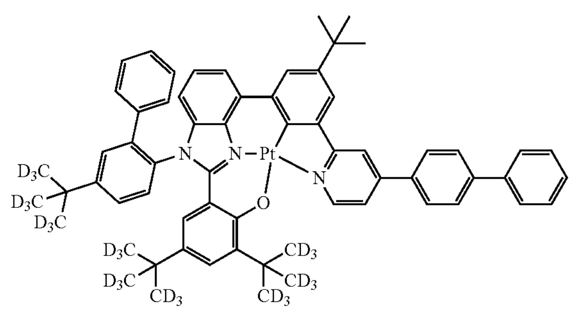
4-2115
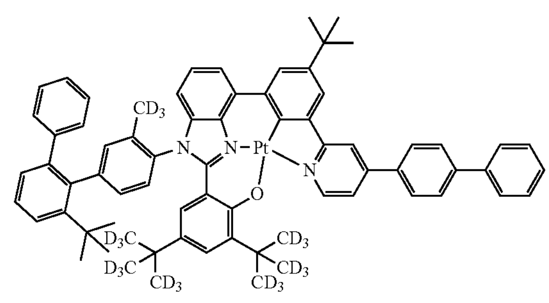
4-2116
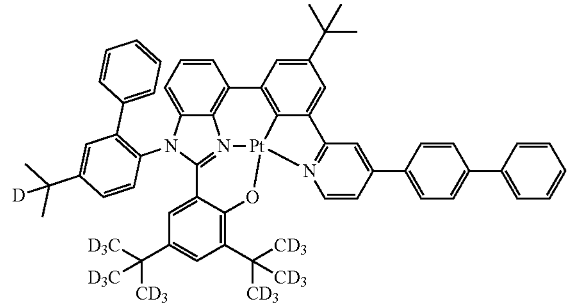

-continued
4-2117
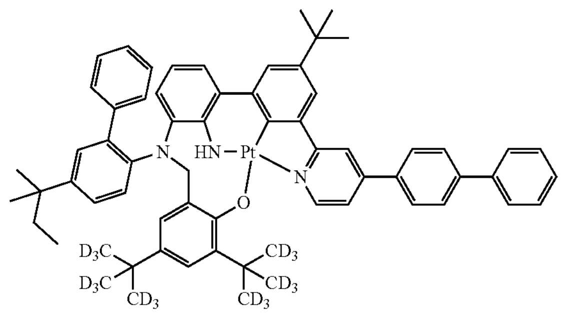
4-2118
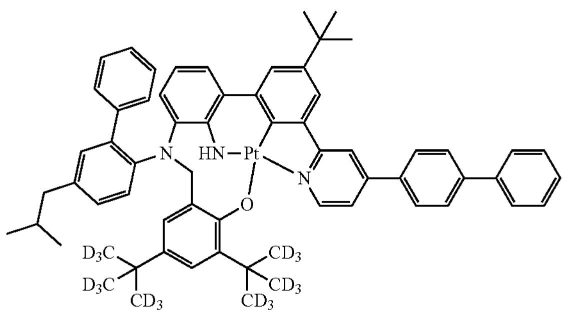
4-2119
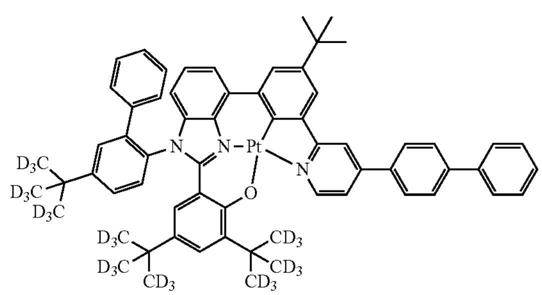
4-2120
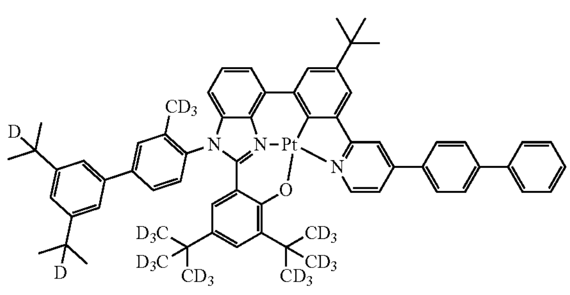
4-2121
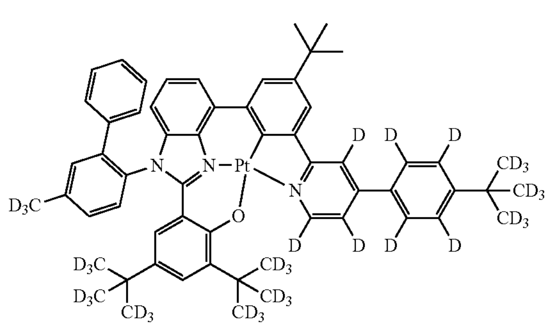
-continued
4-2122
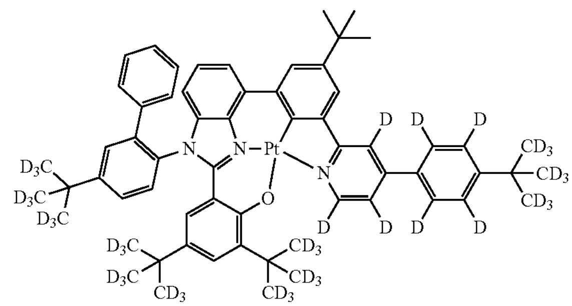
4-2123
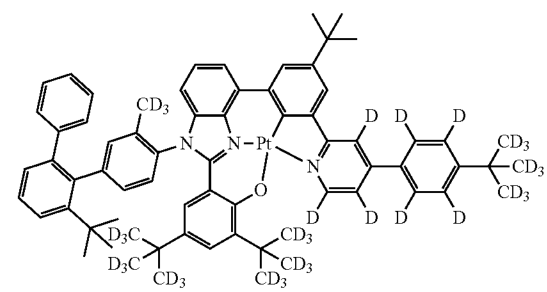
4-2124
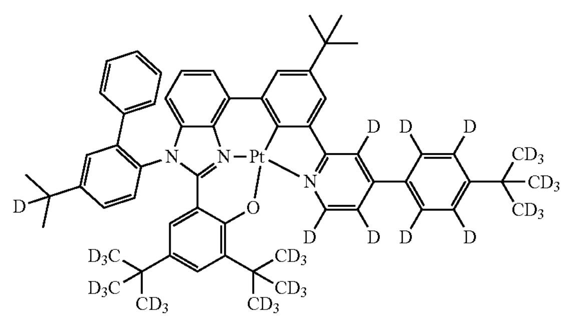
4-2125
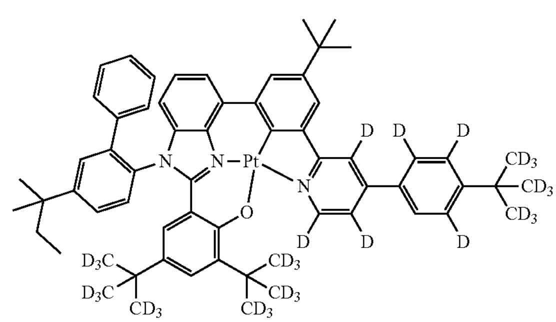
4-2126
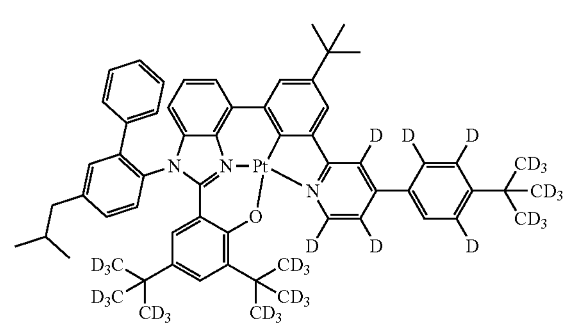

-continued
4-2127
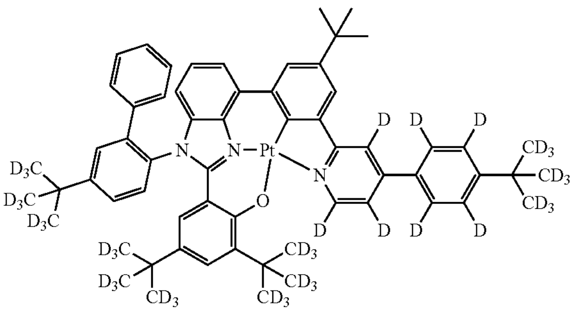
4-2128
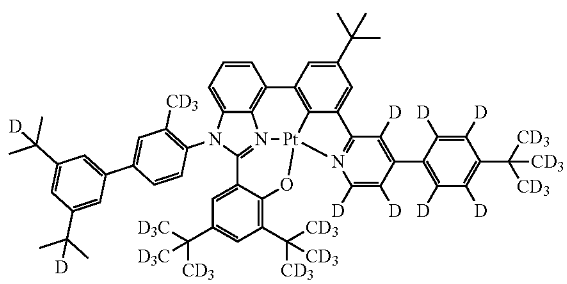
4-2129
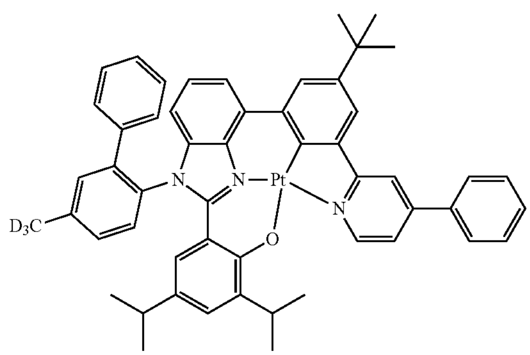
4-2130
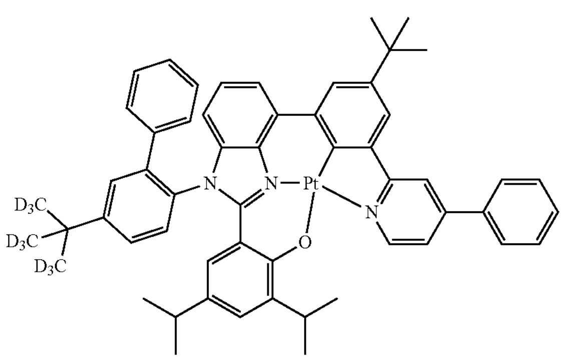
-continued
4-2131
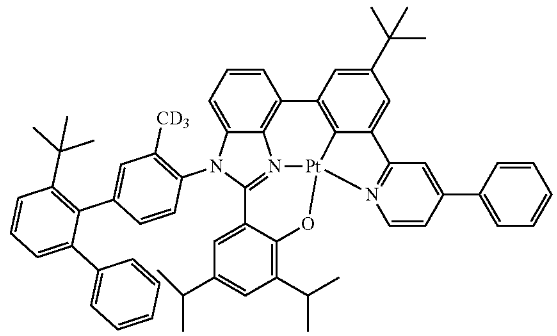
4-2132
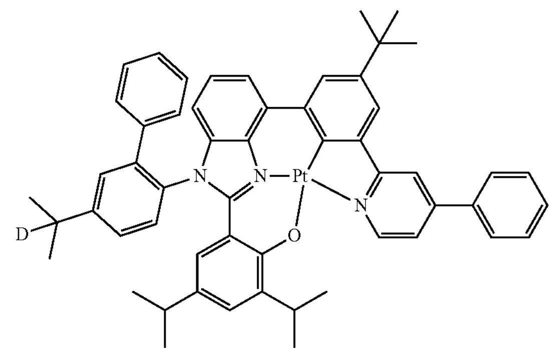
4-2133
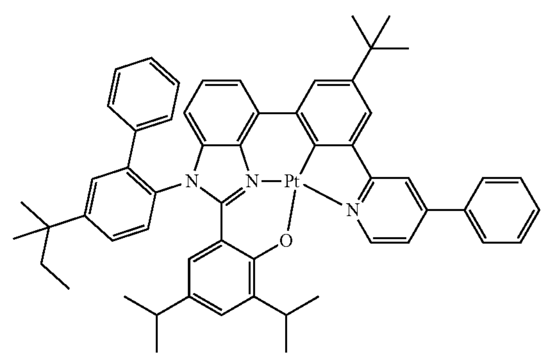
4-2134
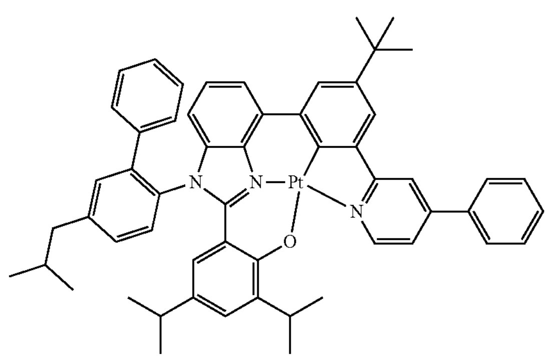

-continued
4-2135
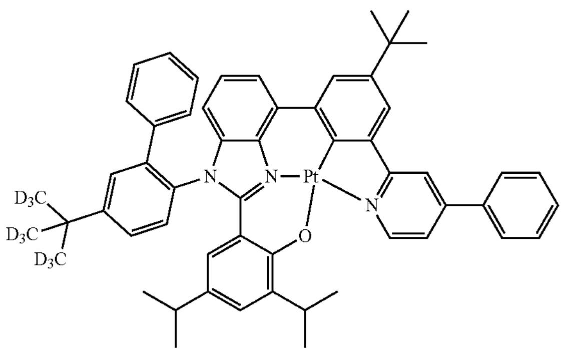
4-2136
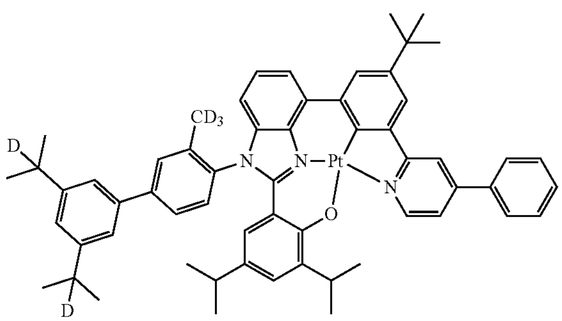
4-2137
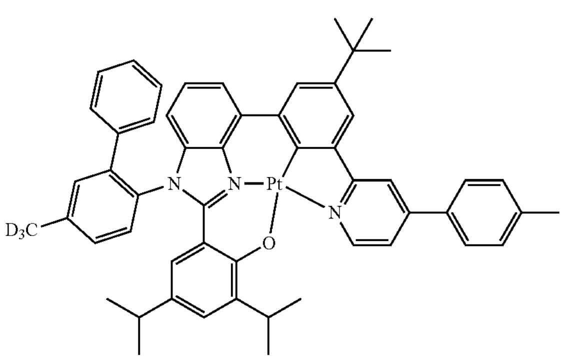
4-2138
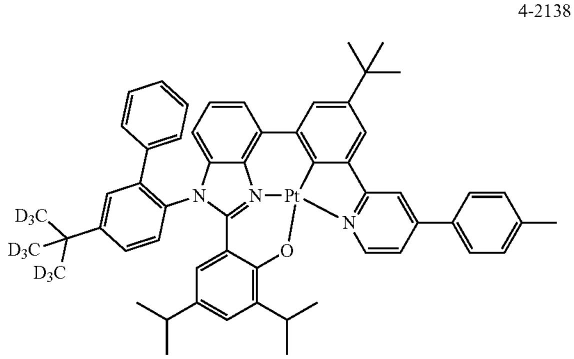
-continued
4-2139
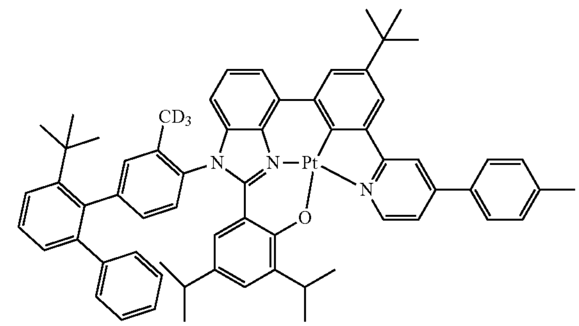
4-2140
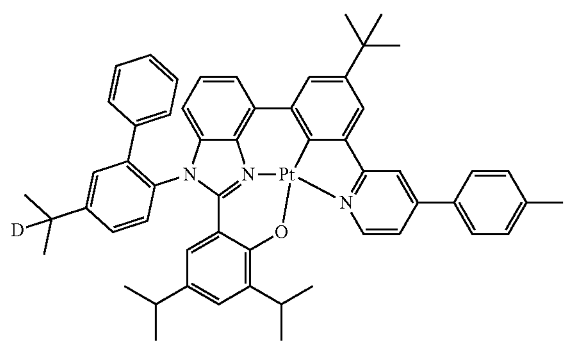
4-2141
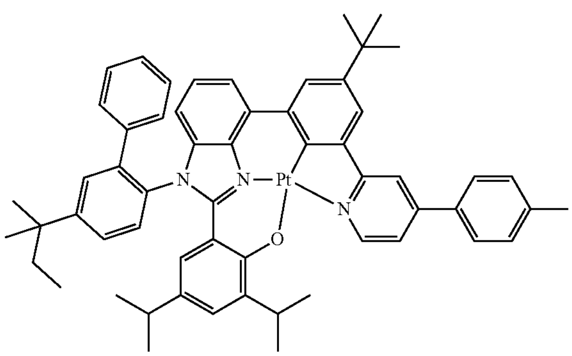
4-2142
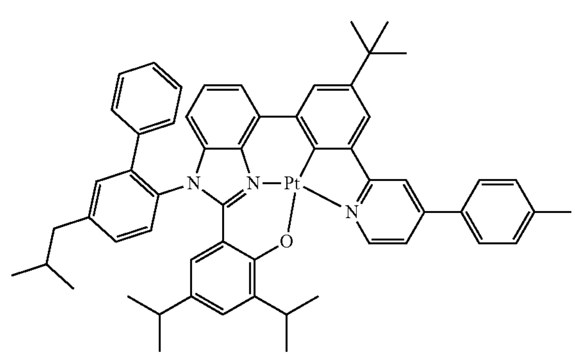

4-2143
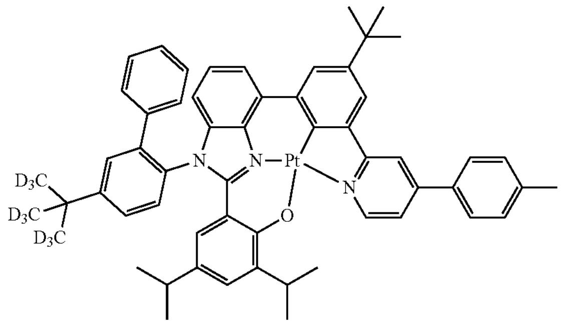
4-2144
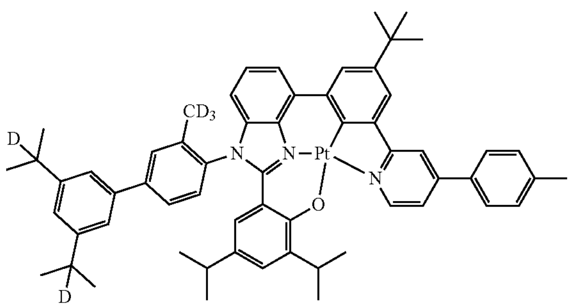
4-2145
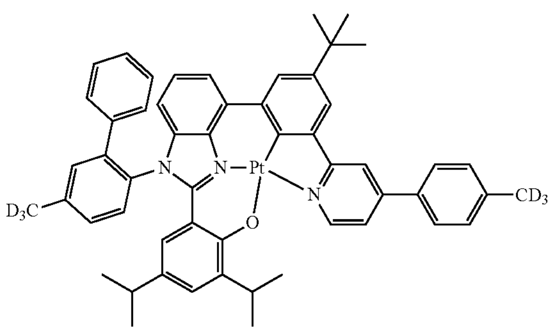
4-2146
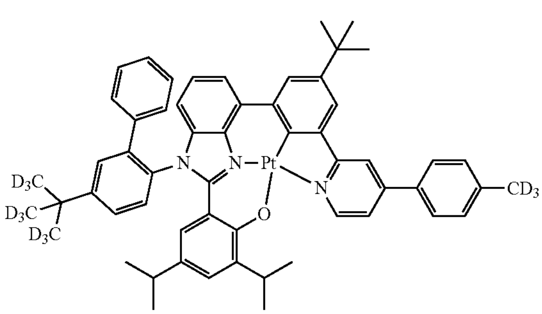
4-2147
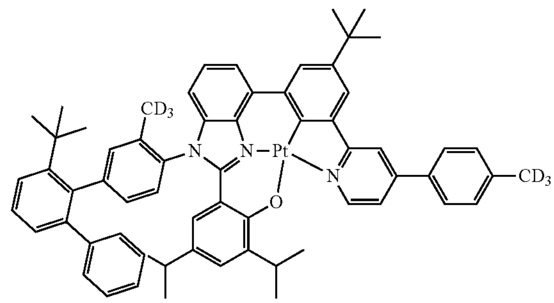
4-2148
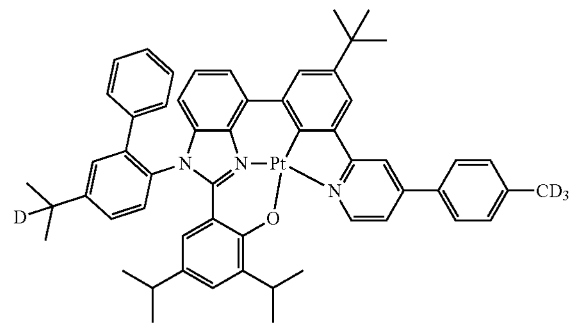
4-2149
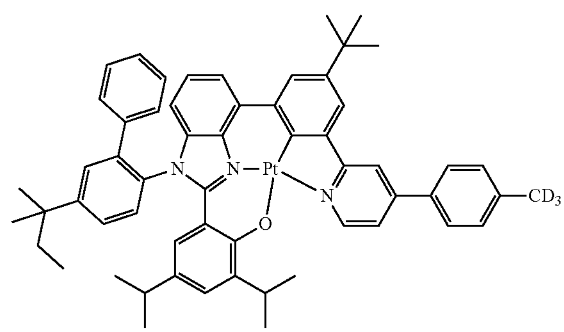
4-2150
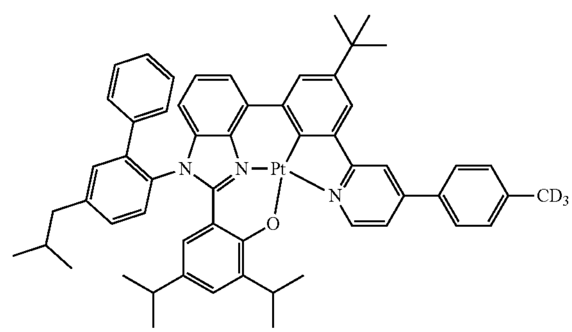

-continued
4-2151
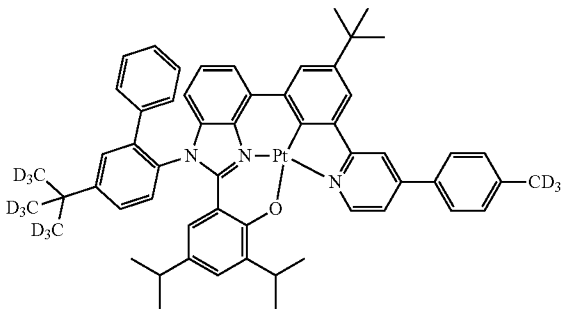
4-2152
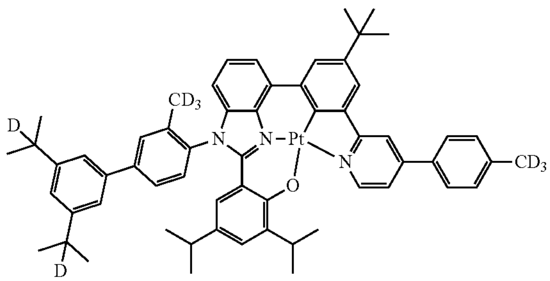
4-2153
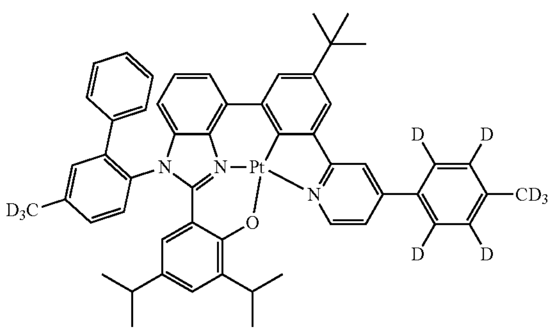
4-2154
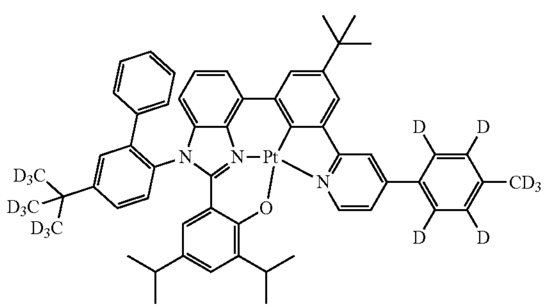
4-2155
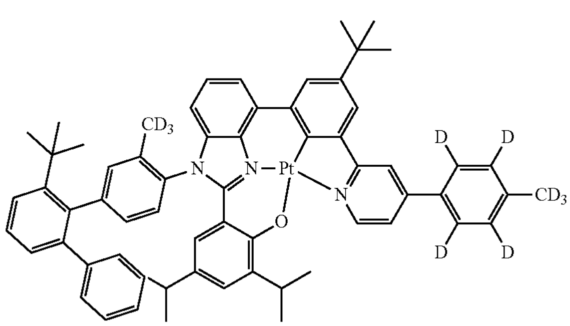
-continued
4-2156
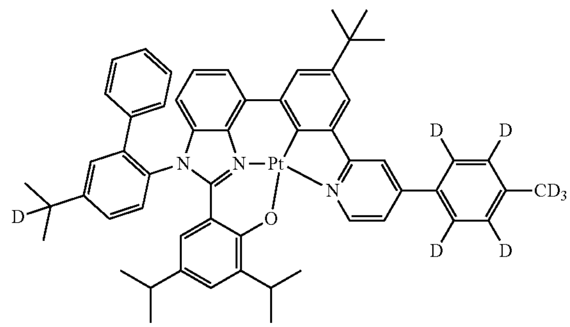
4-2157
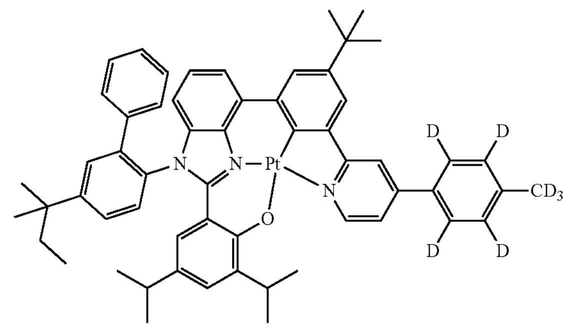
4-2158
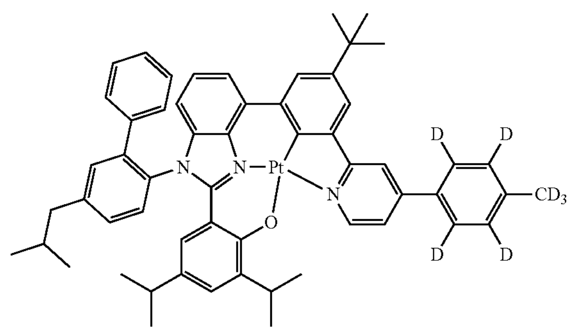
4-2159
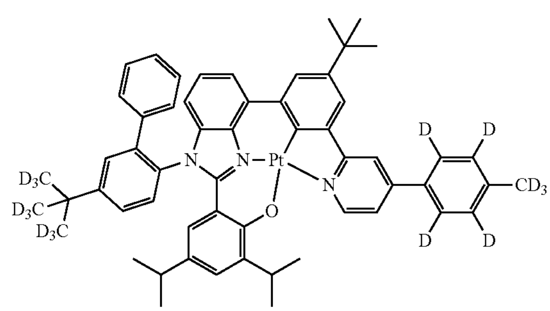

-continued
4-2160
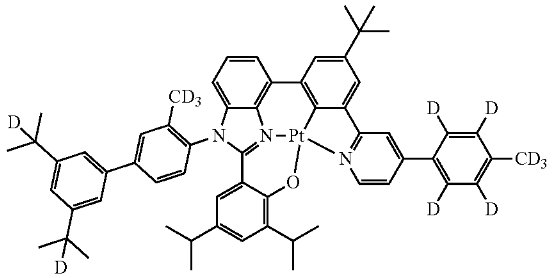
4-2161
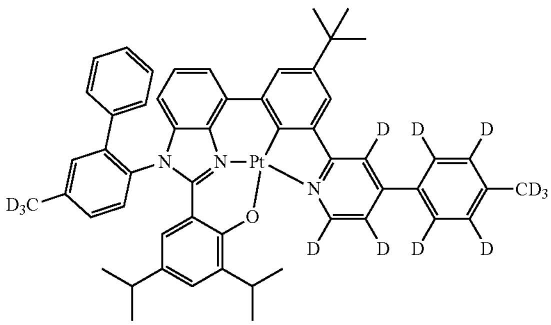
4-2162
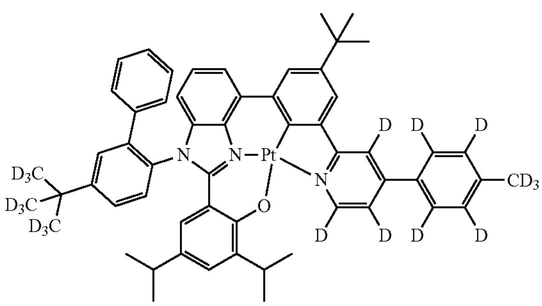
4-2163
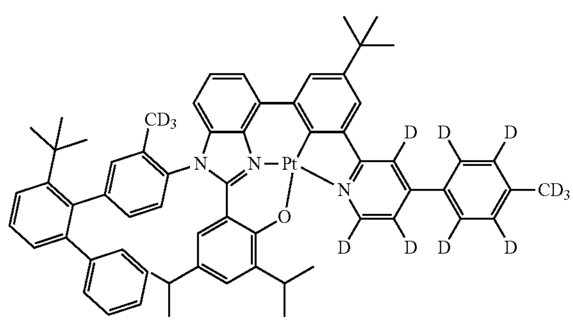
4-2164
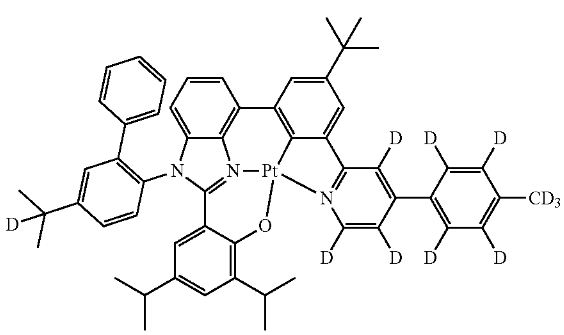
-continued
4-2165
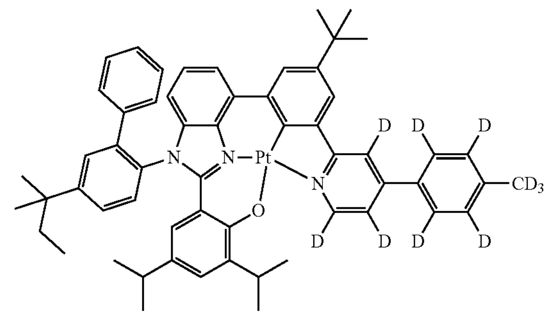
4-2166
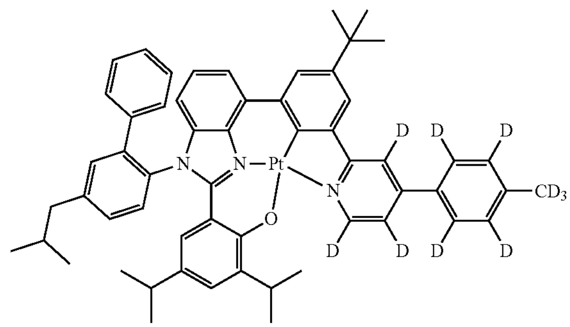
4-2167
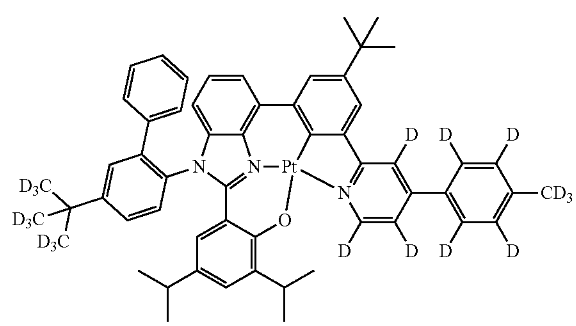
4-2168
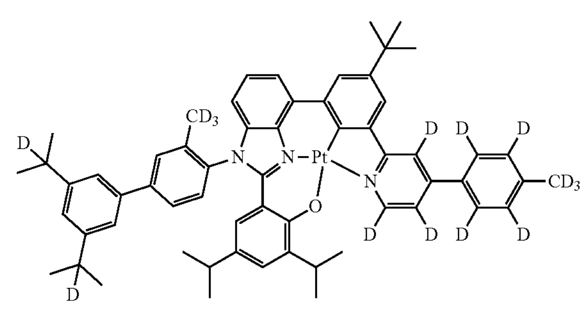

4-2169
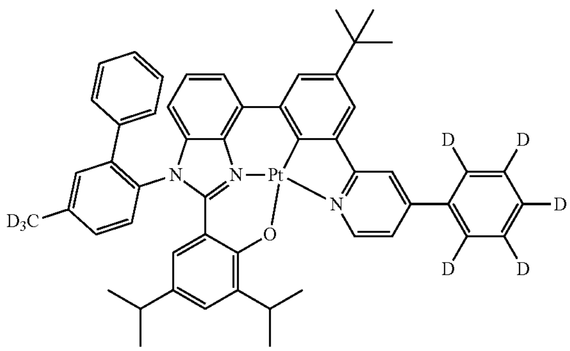
4-2170
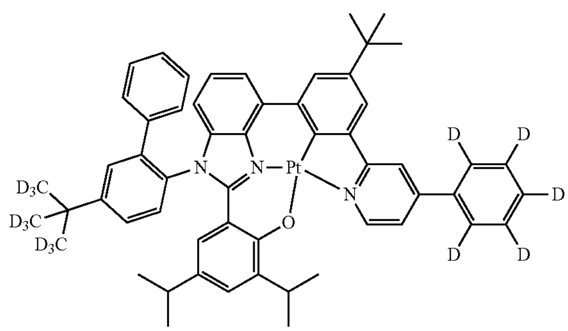
4-2171
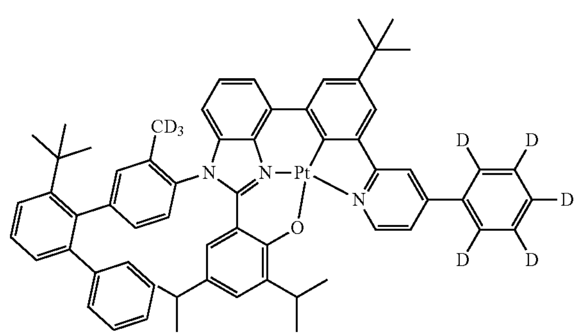
4-2172
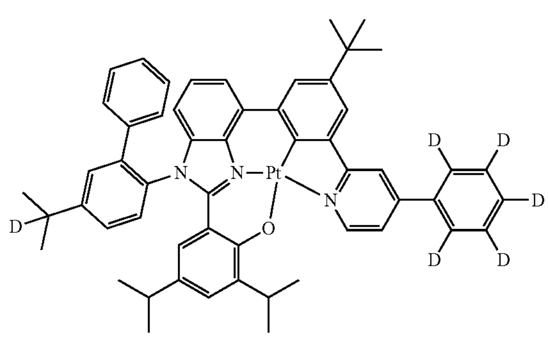
4-2173
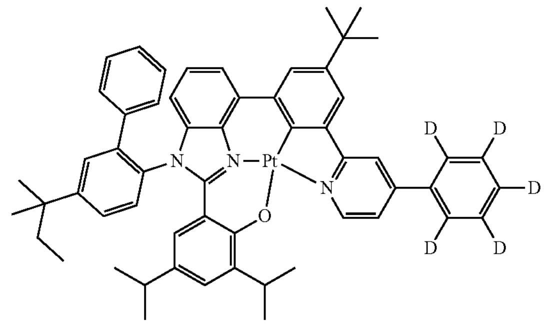
4-2174
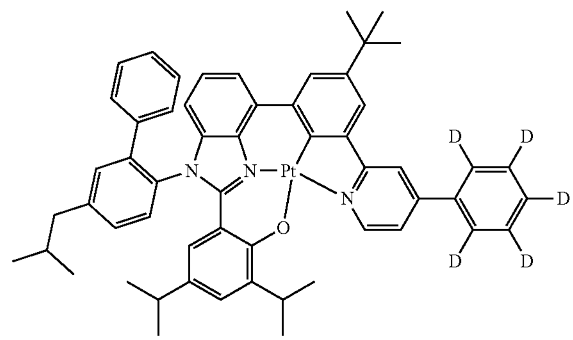
4-2175
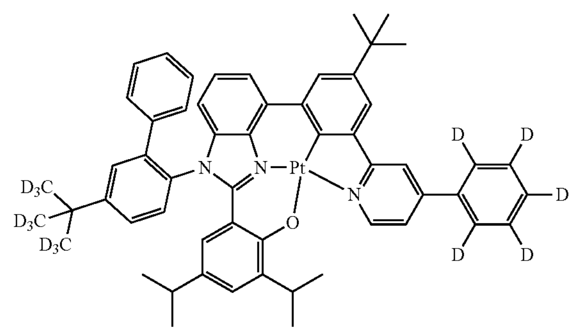
4-2176
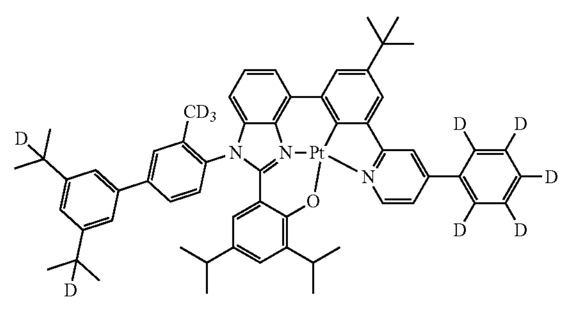

4-2177
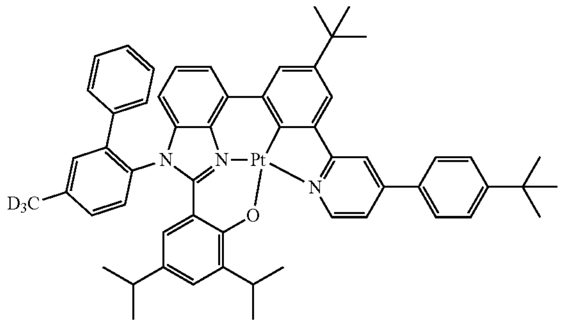
4-2178
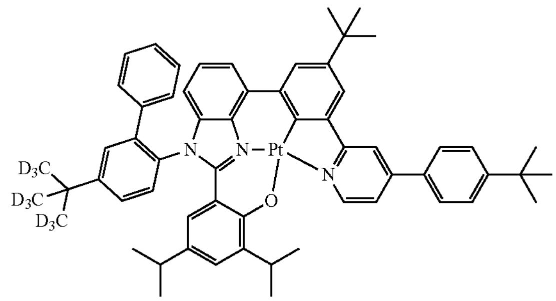
4-2179
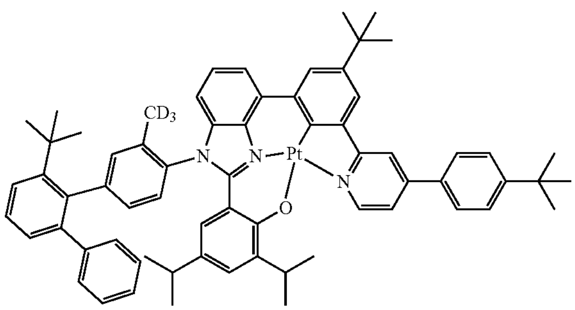
4-2180
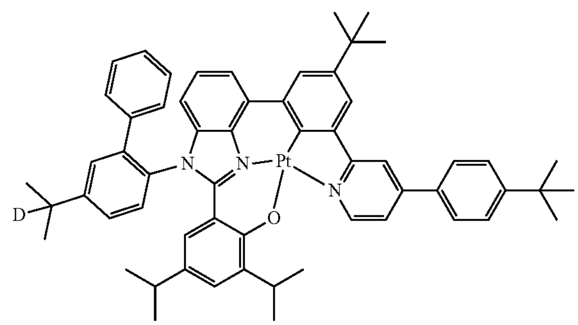
4-2181
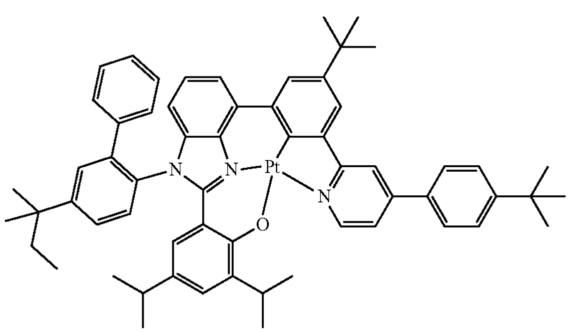
4-2182
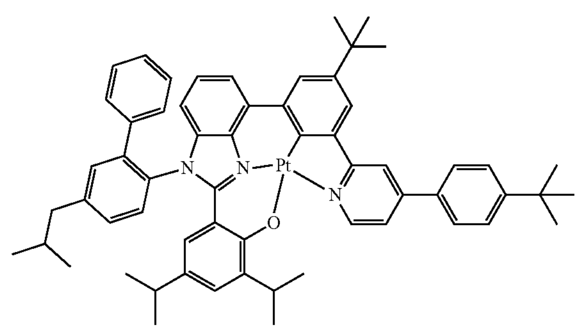
4-2183
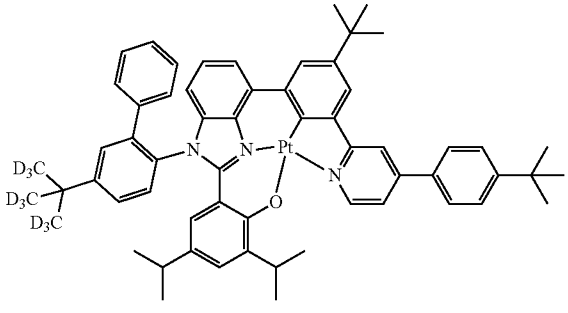

-continued
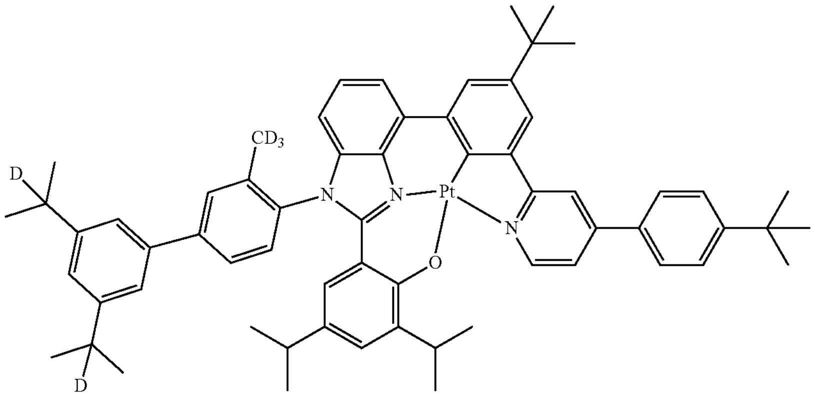
4-2184
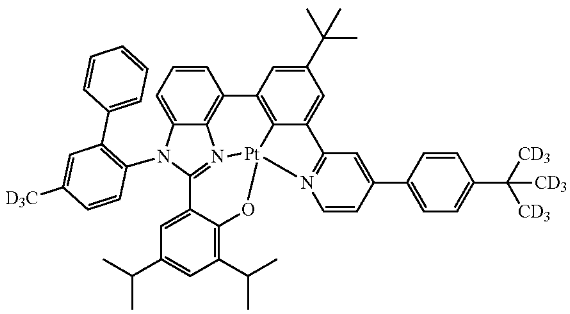
4-2185
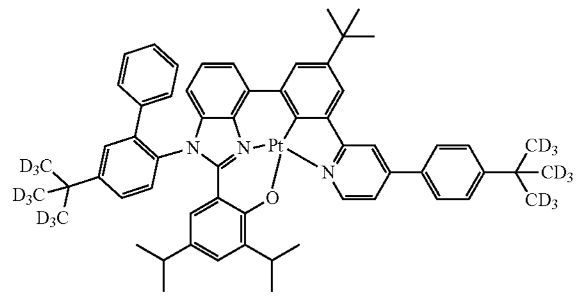
4-2186
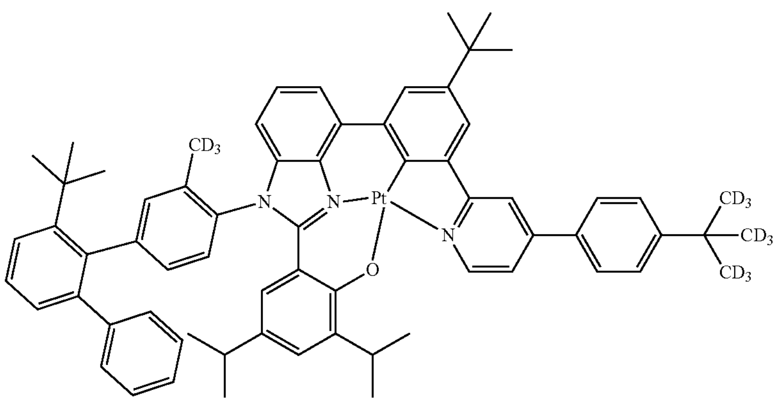
4-2187
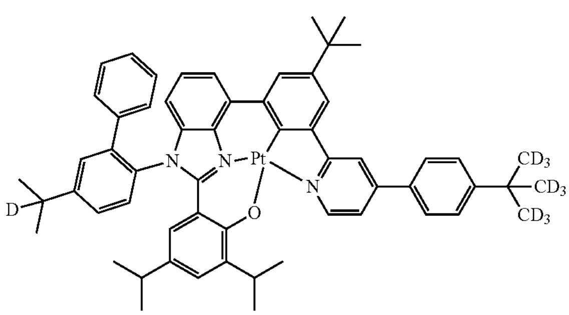
4-2188
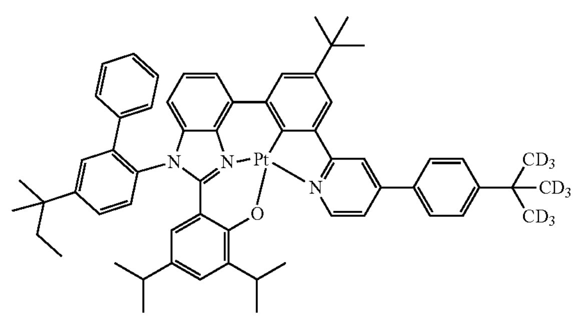
4-2189

-continued
4-2190
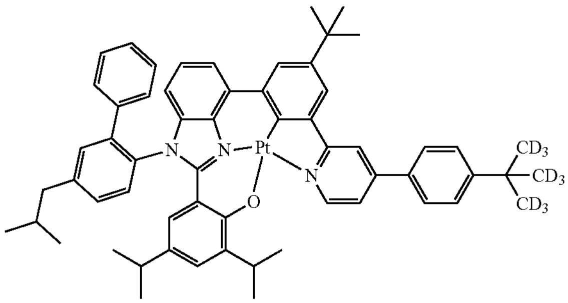
4-2191
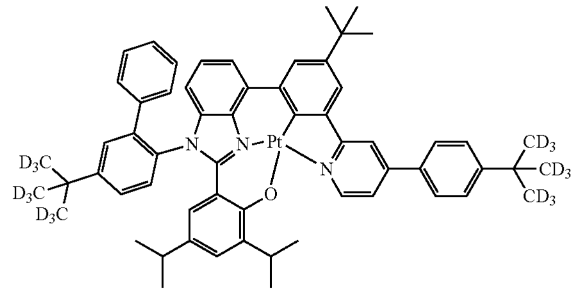
4-2192
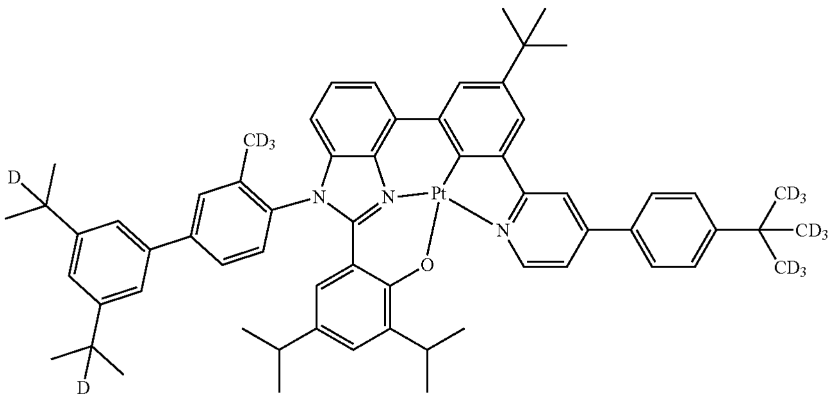
4-2193
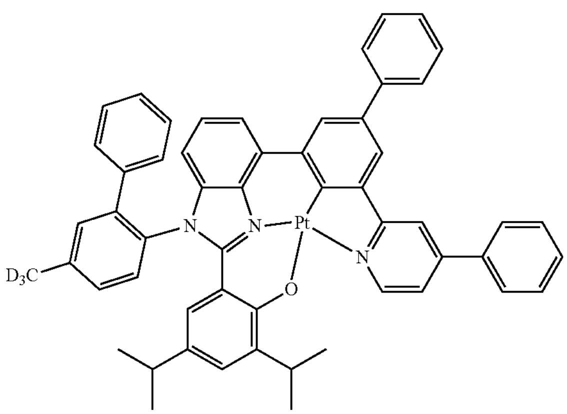
4-2194
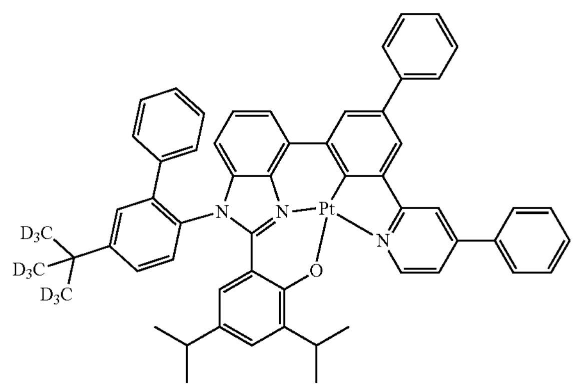
4-2195
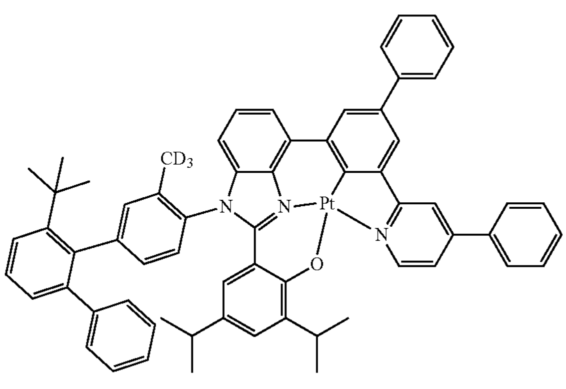
4-2196
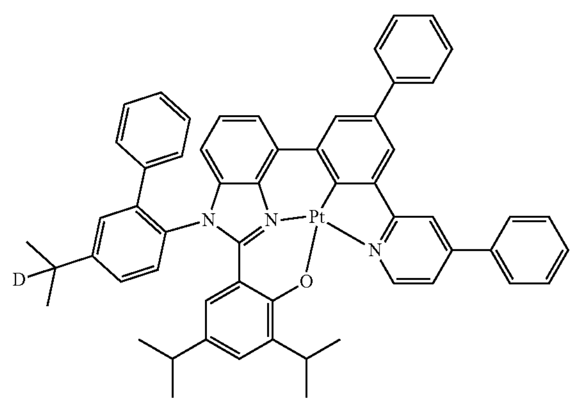

-continued
4-2197
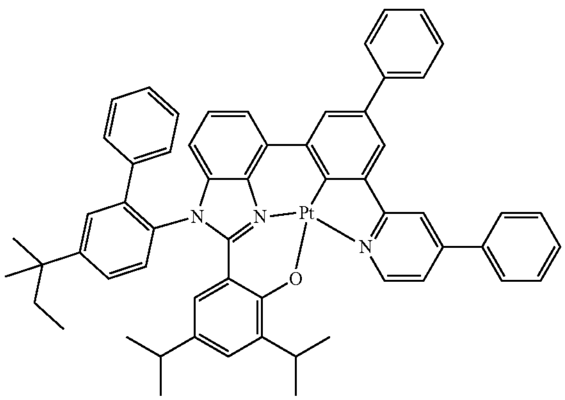
4-2198
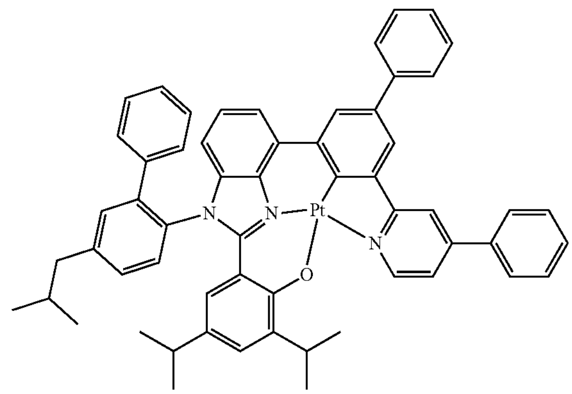
4-2199
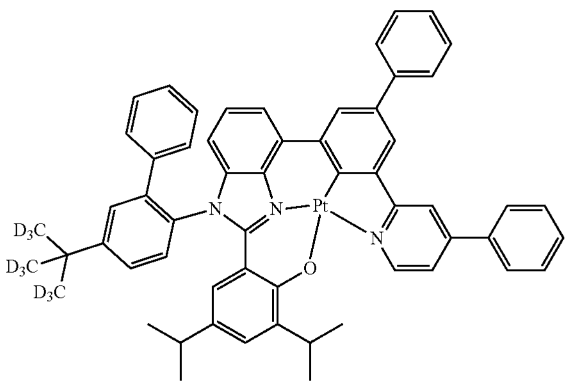
4-2200
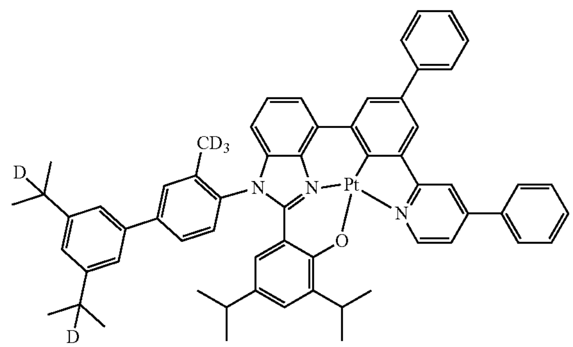
4-2201
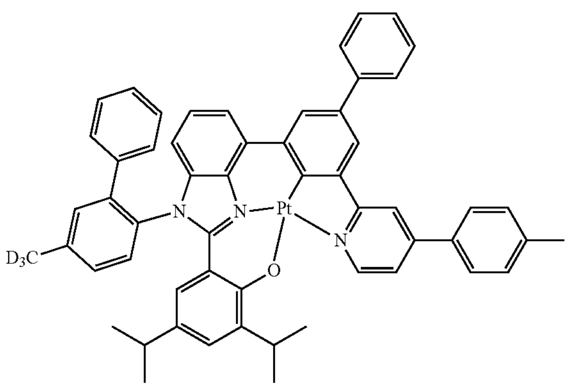
4-2202
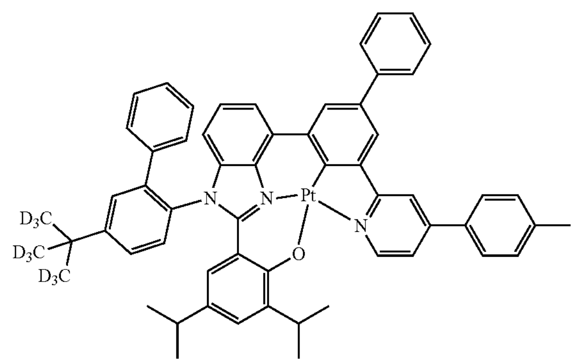
4-2203
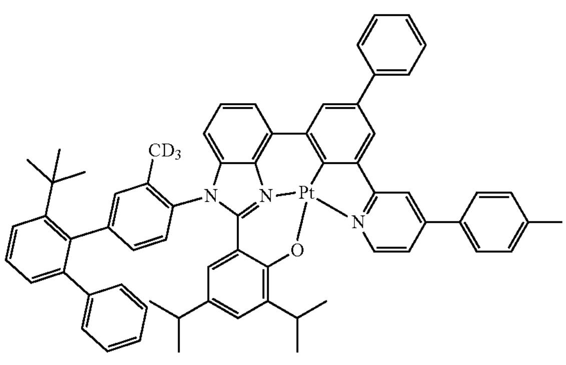
4-2204
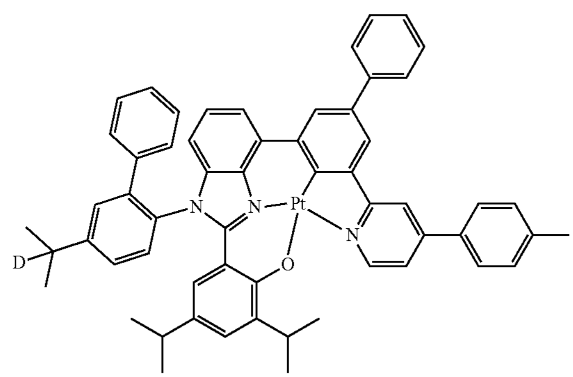

-continued
4-2205
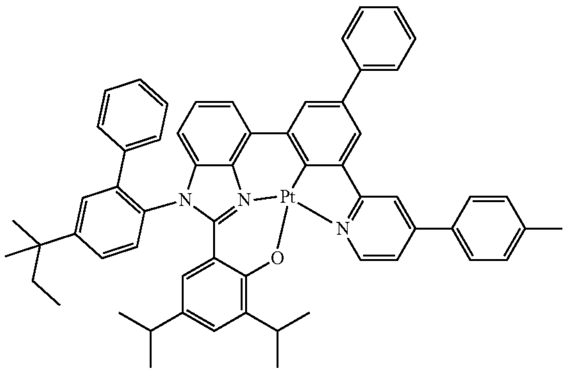
4-2206
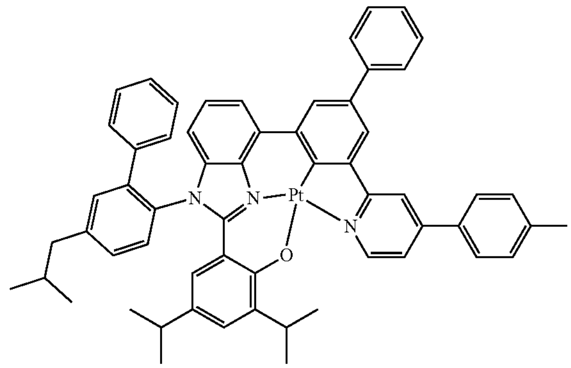
4-2207
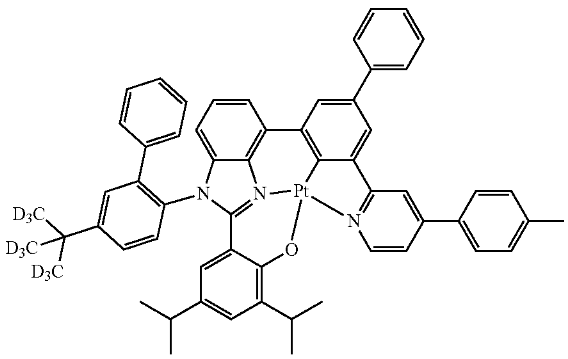
4-2208
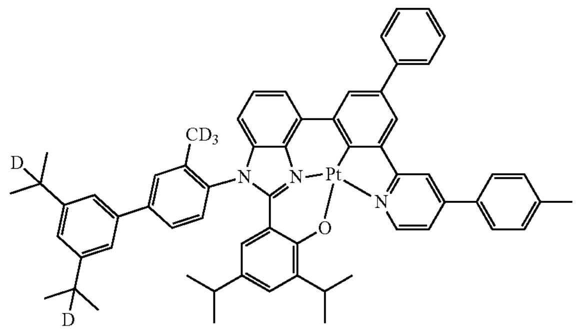
4-2209
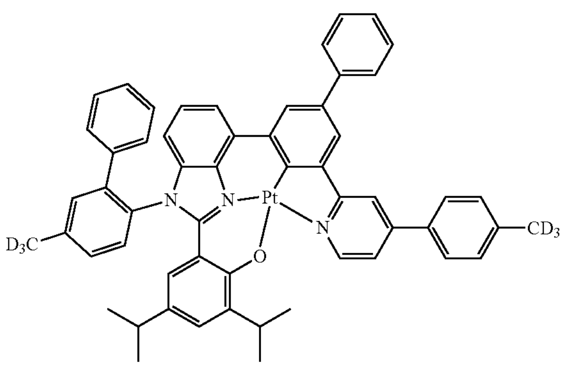
4-2210
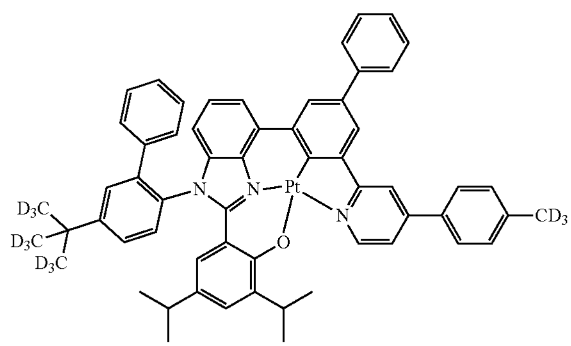
4-2211
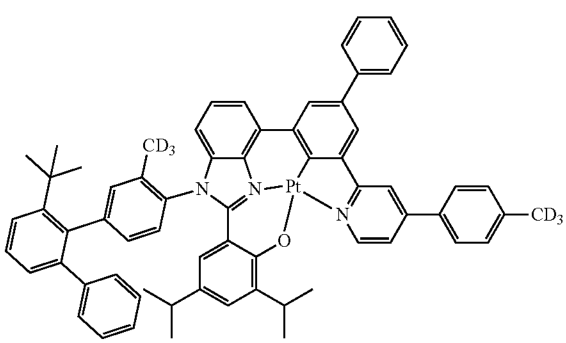
4-2212
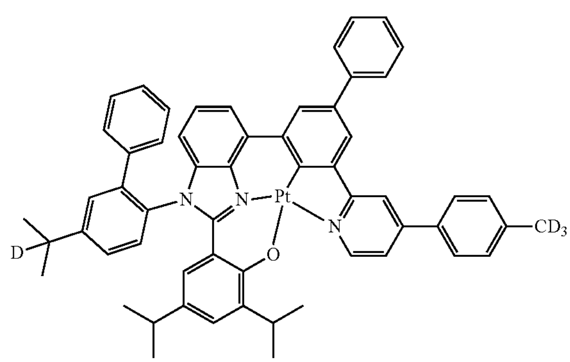

-continued
4-2213
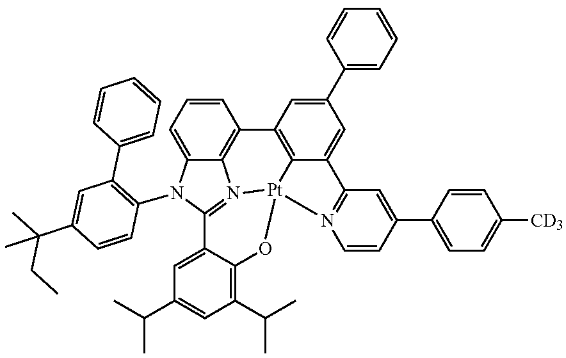
4-2214
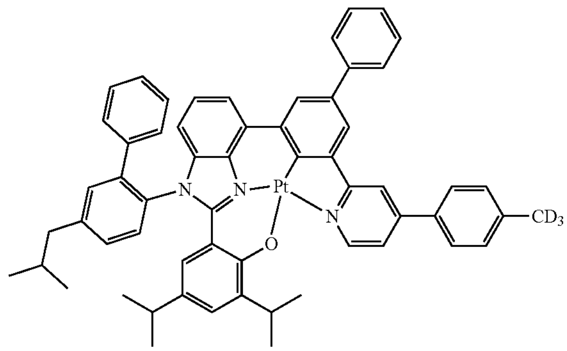
4-2215
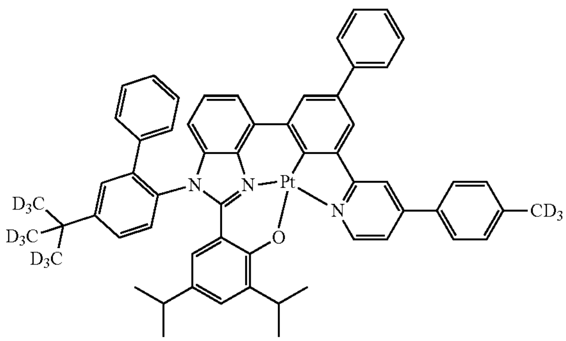
4-2216
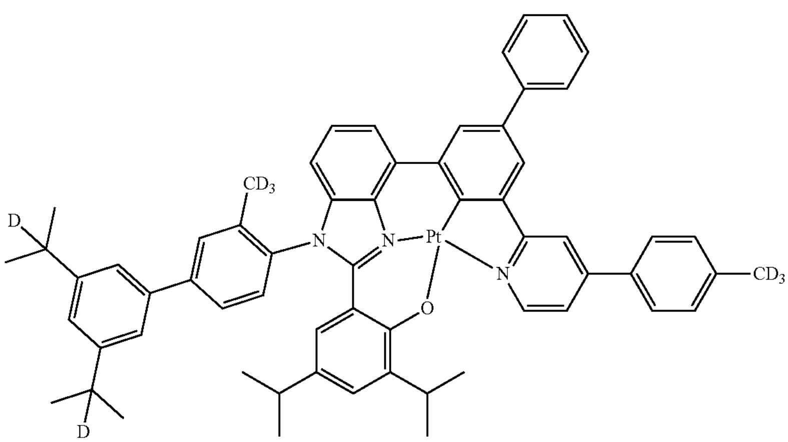
4-2217
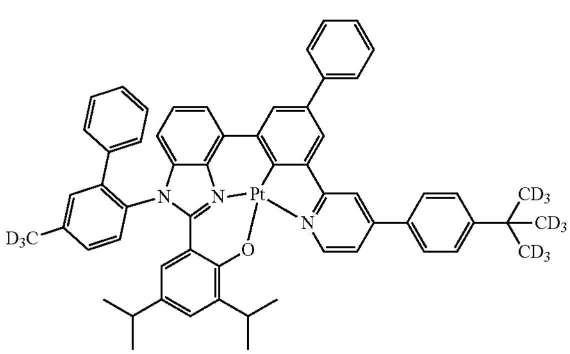
4-2218
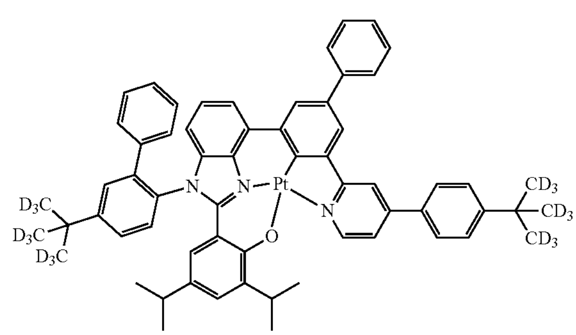

-continued
4-2219
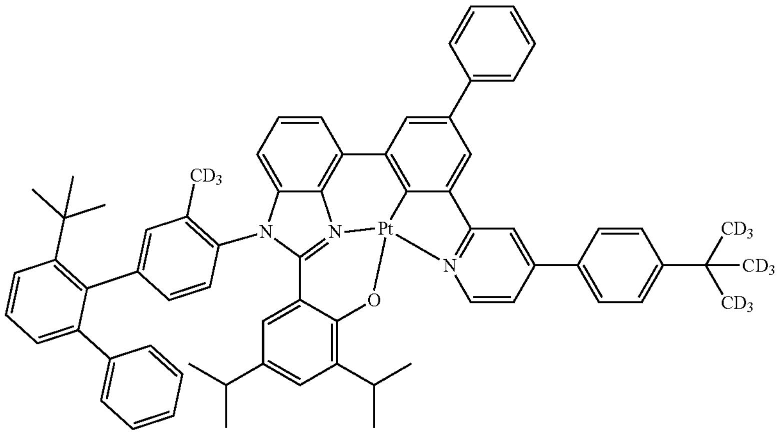
4-2220
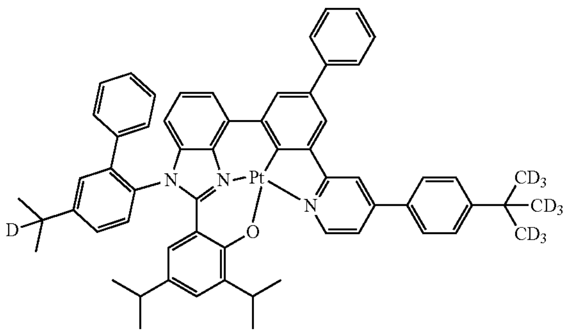
4-2221
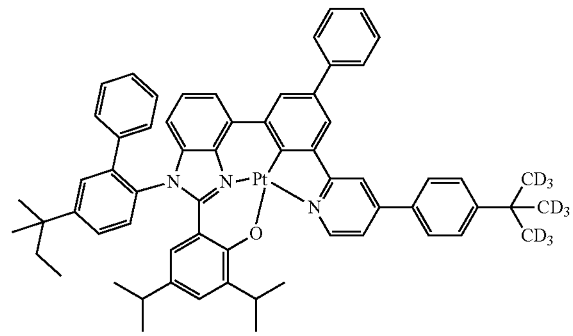
4-2222
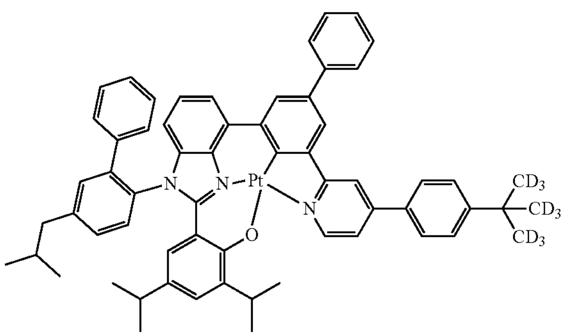
4-2223
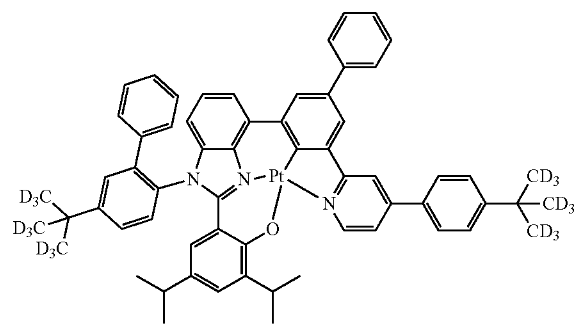
4-2224
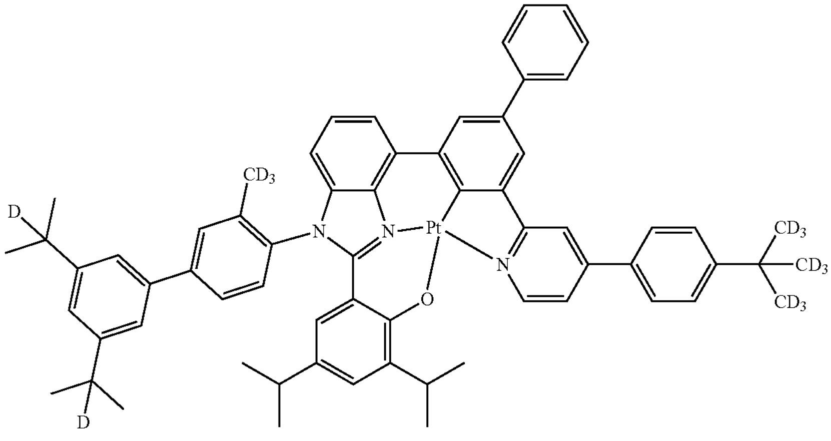

-continued
4-2225
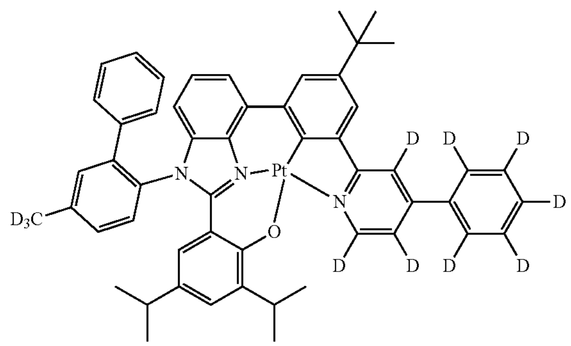
4-2226
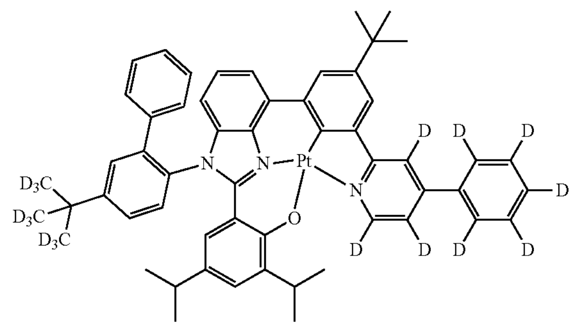
4-2227
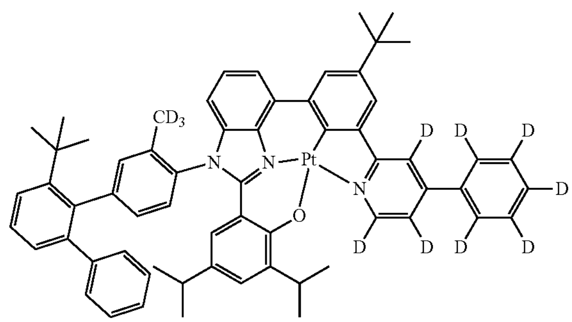
4-2228
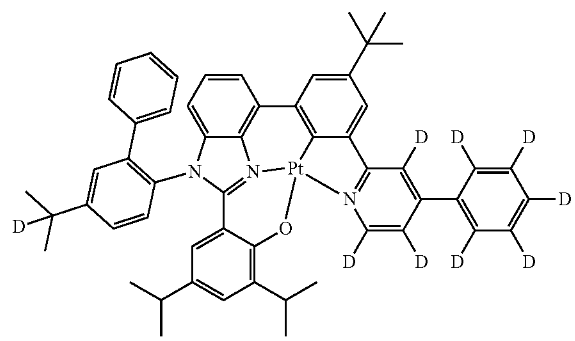
4-2229
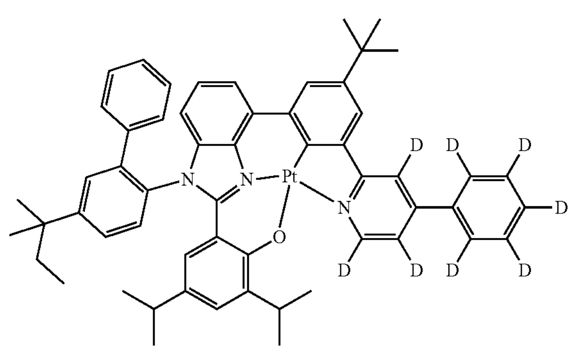
4-2230
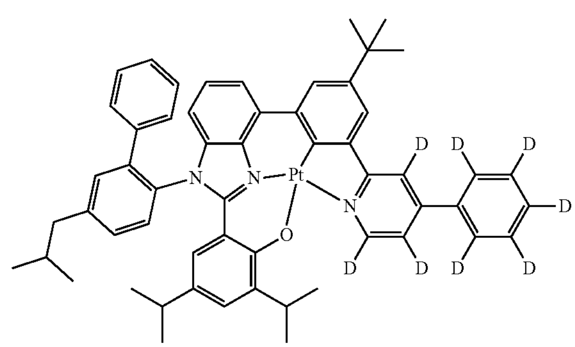
4-2231
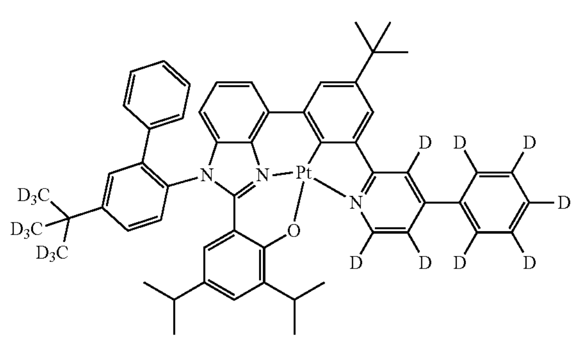
4-2232
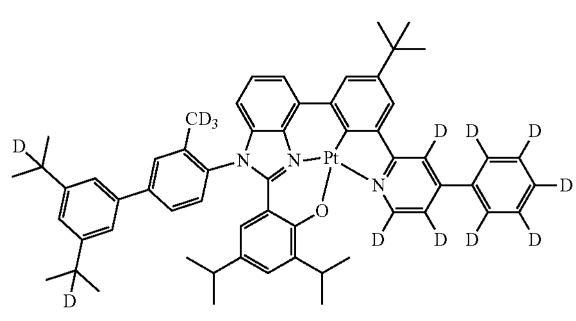

-continued
4-2233
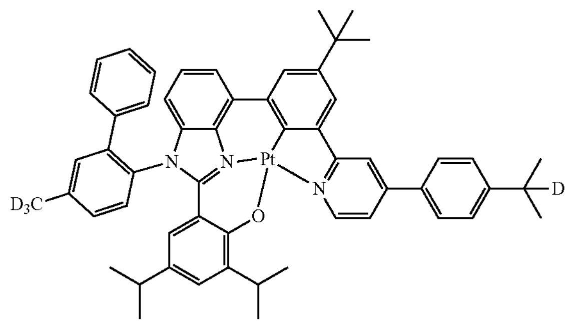
4-2234
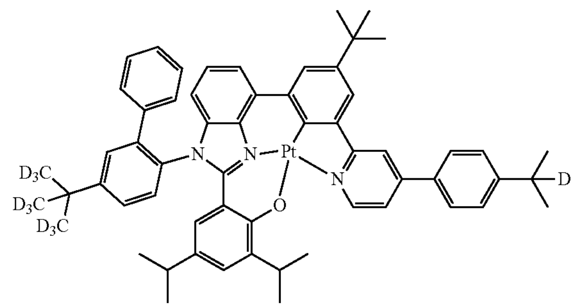
4-2235
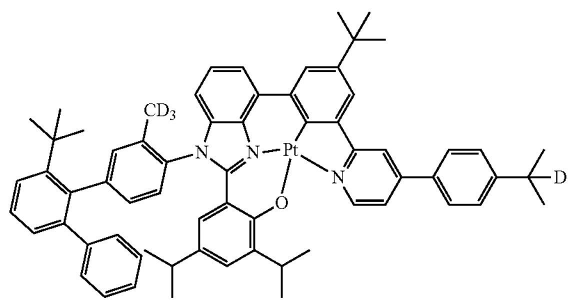
4-2236
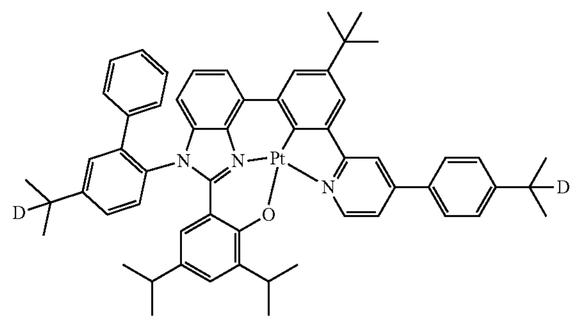
4-2237
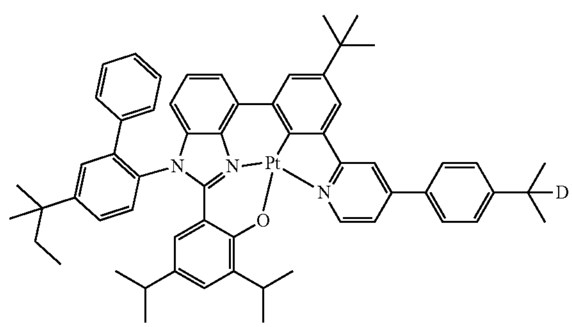
4-2238
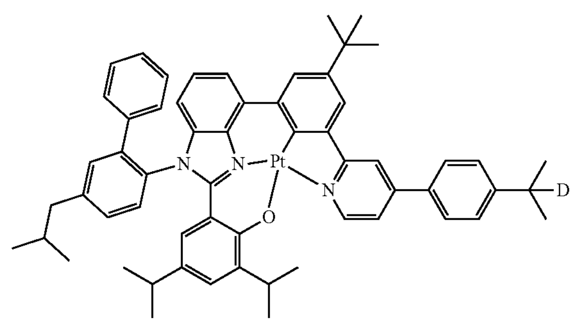
4-2239
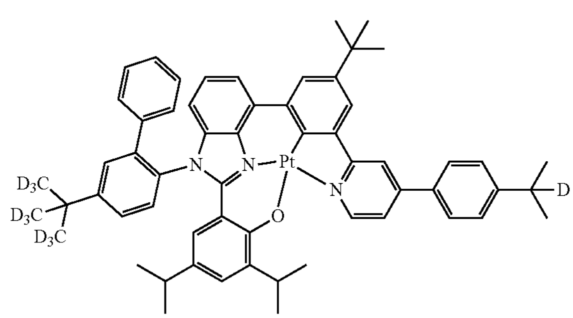

-continued
4-2240
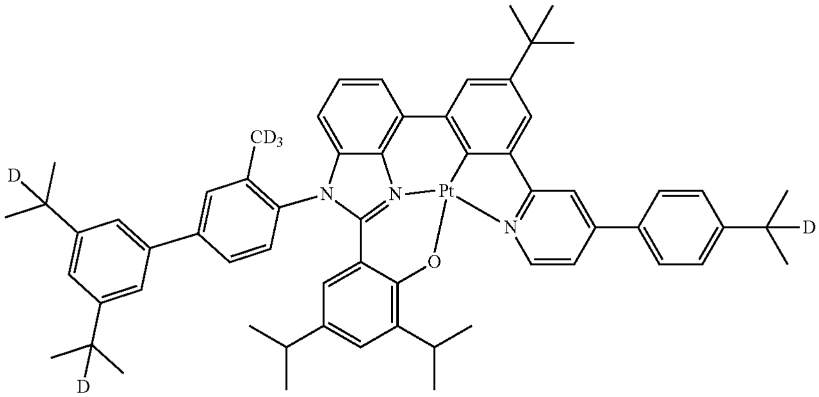
4-2241
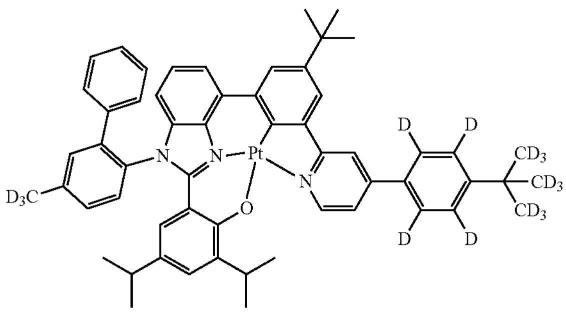
4-2242
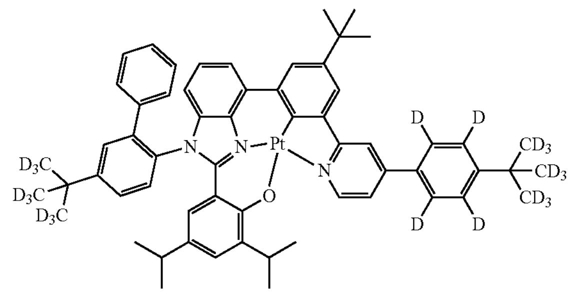
4-2243
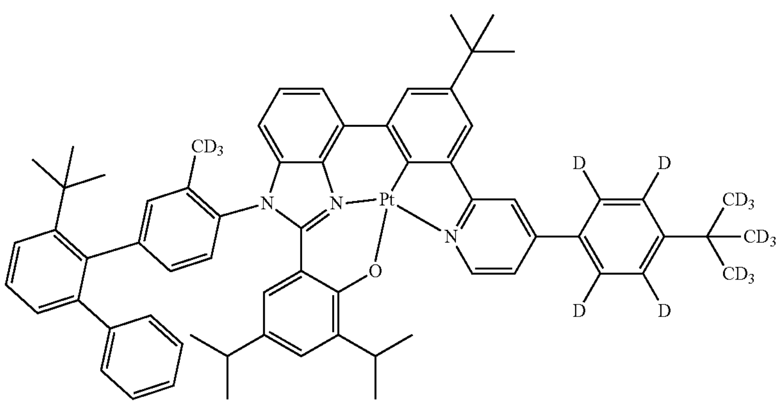
4-2244
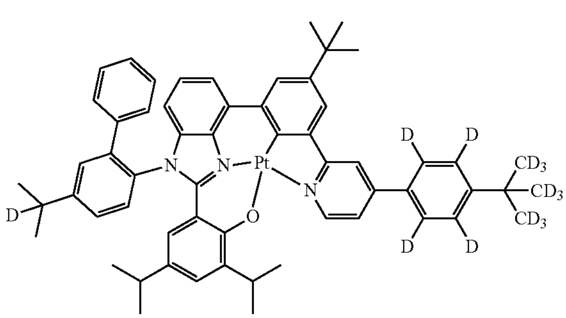
4-2245
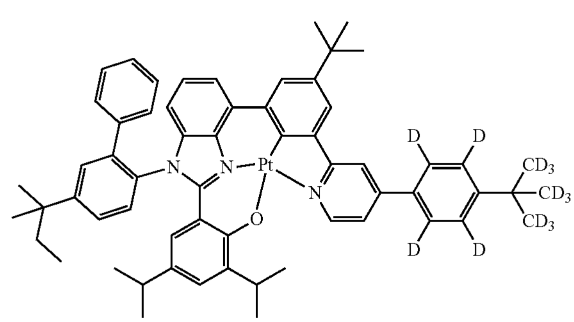

-continued
4-2246
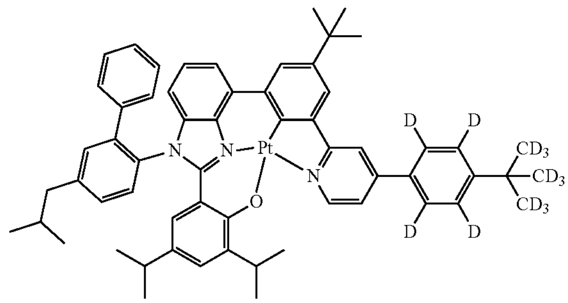
4-2247
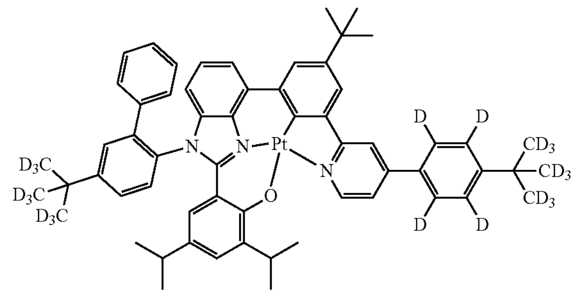
4-2248
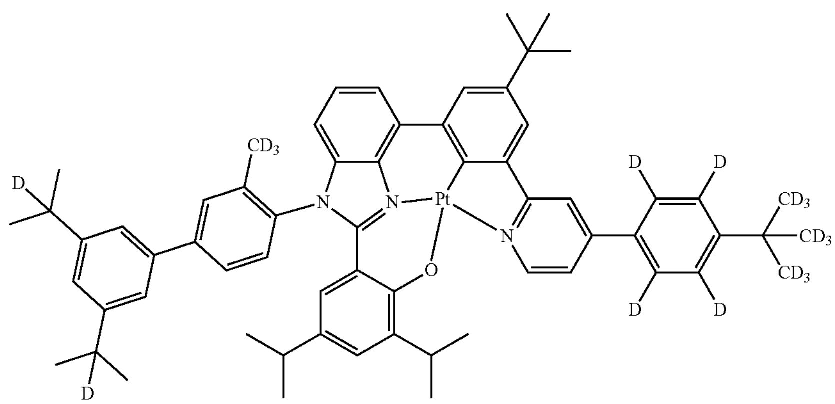
4-2249
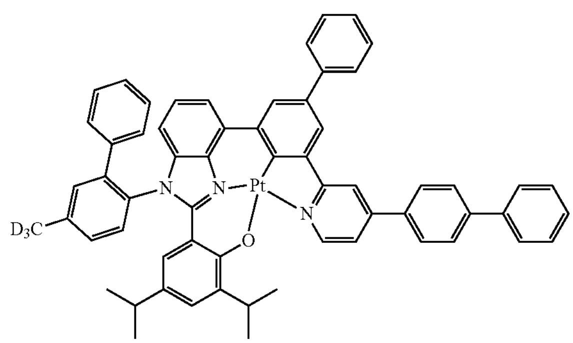
4-2250
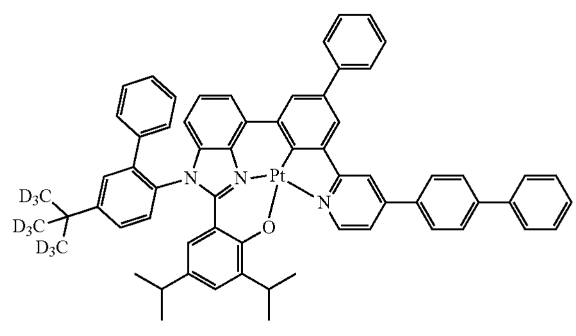
4-2251
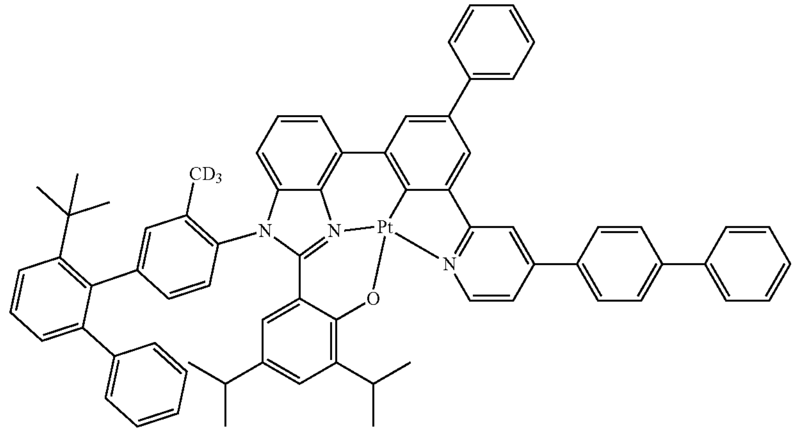

-continued
4-2252
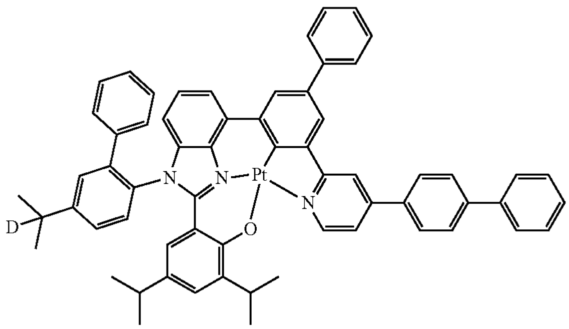
4-2253
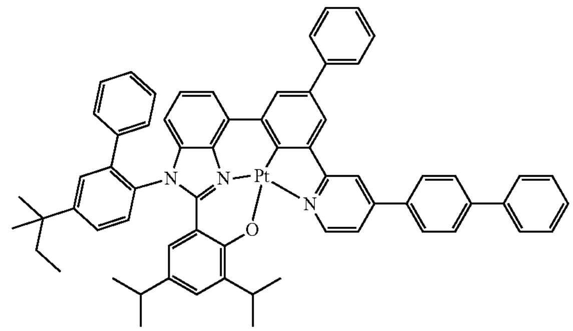
4-2254
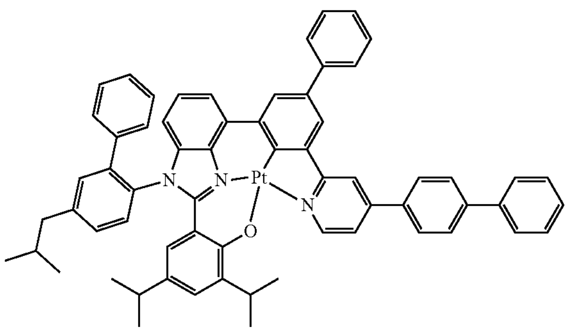
4-2255
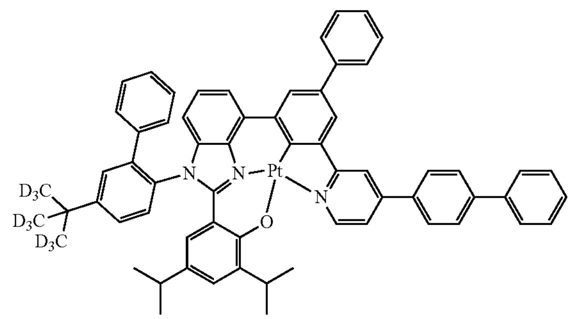
4-2256
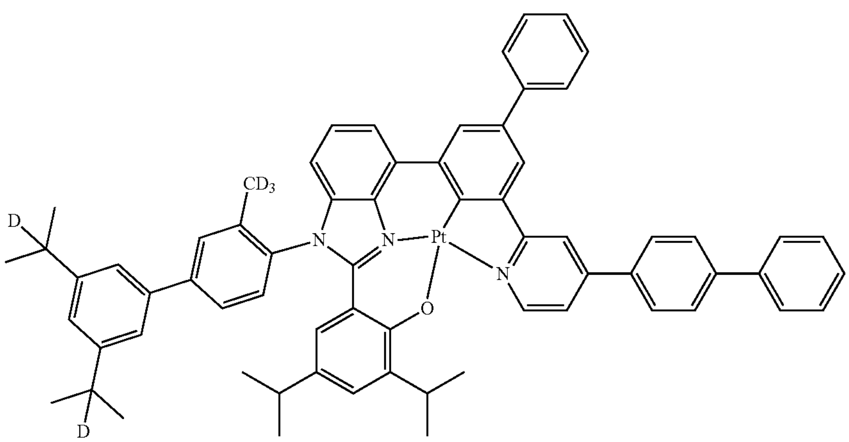
4-2257
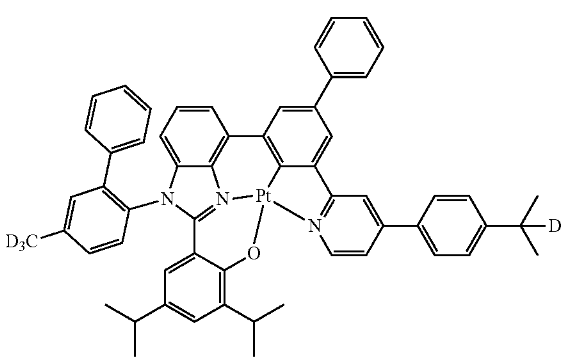
4-2258
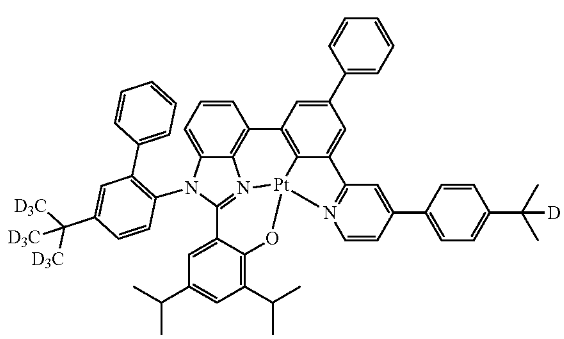

-continued
4-2259
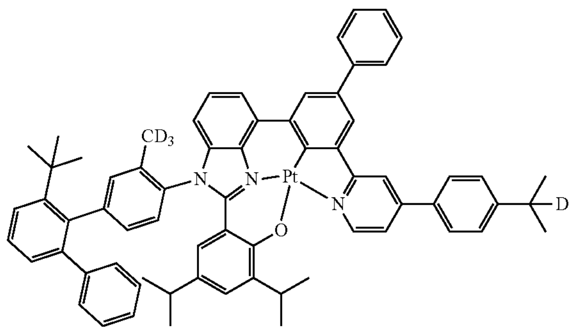
4-2260
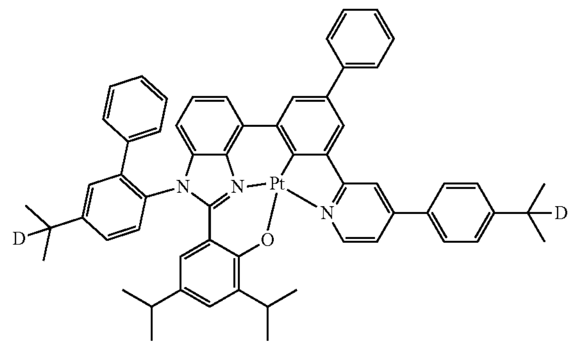
4-2261
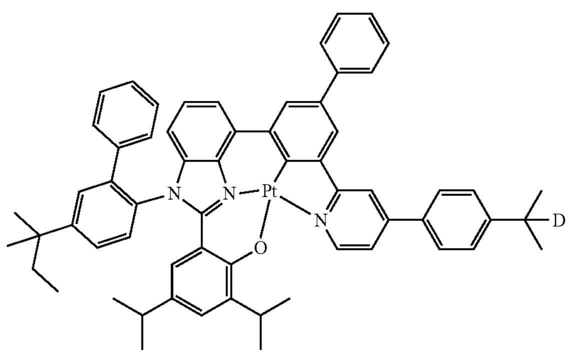
4-2262
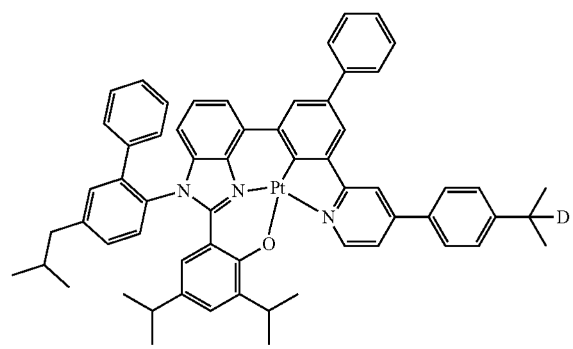
4-2263
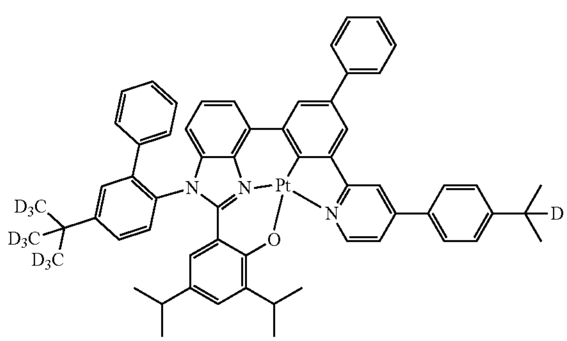
4-2264
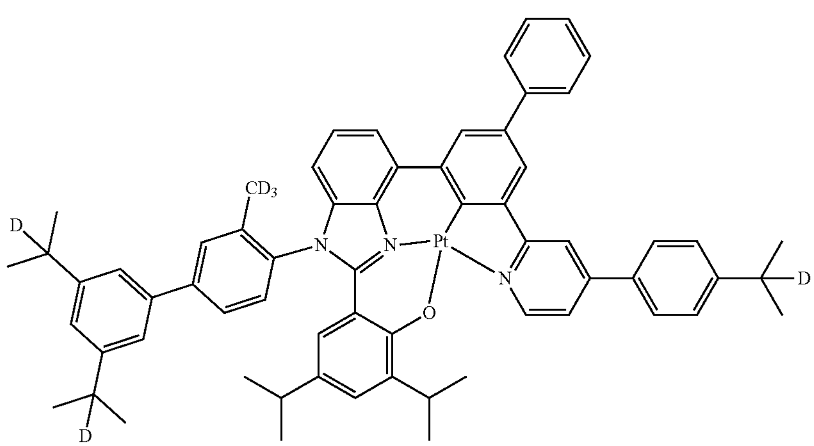

-continued
4-2265
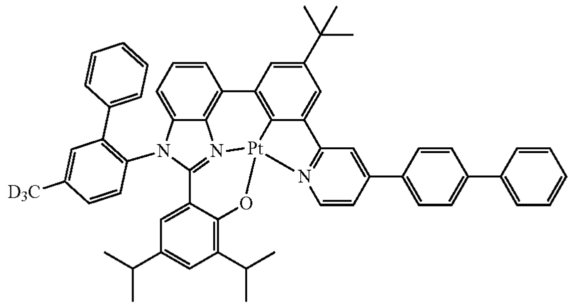
4-2266
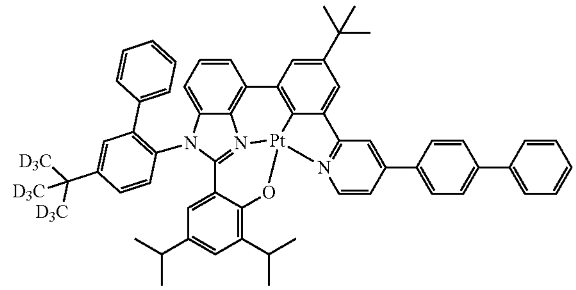
4-2267
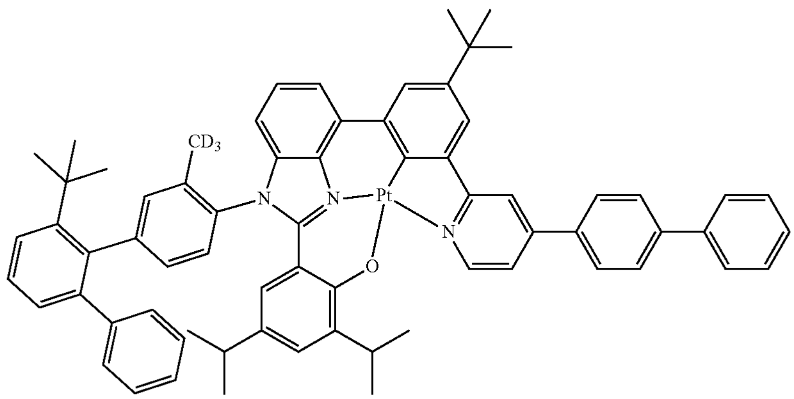
4-2268
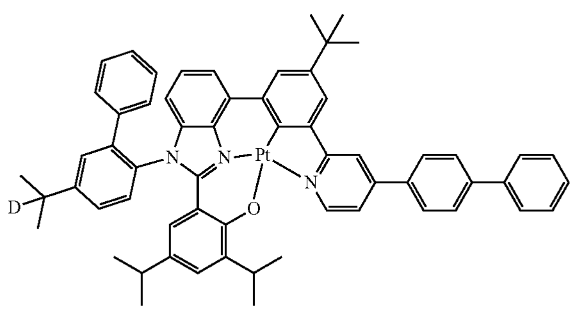
4-2269
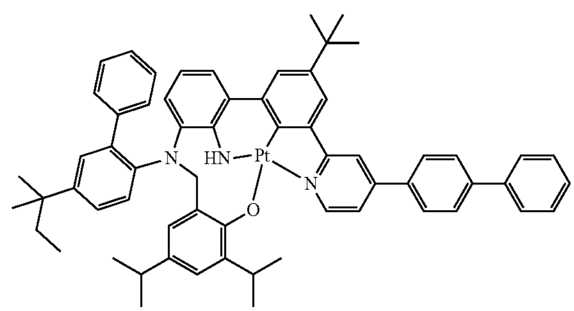
4-2270
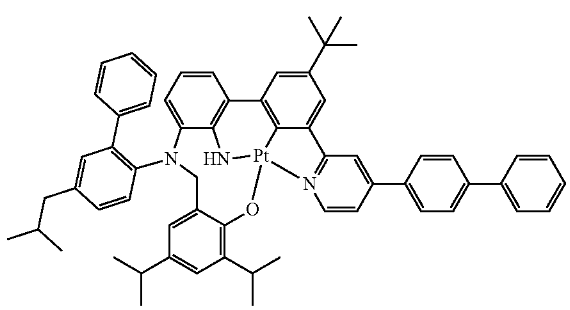
4-2271
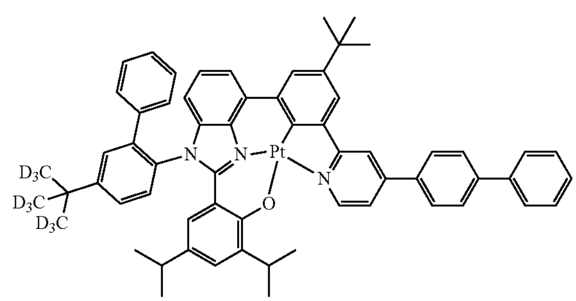

-continued
4-2272
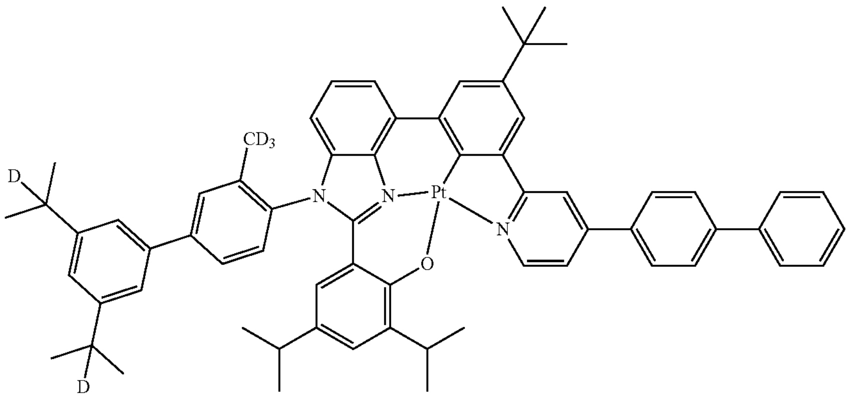
4-2273
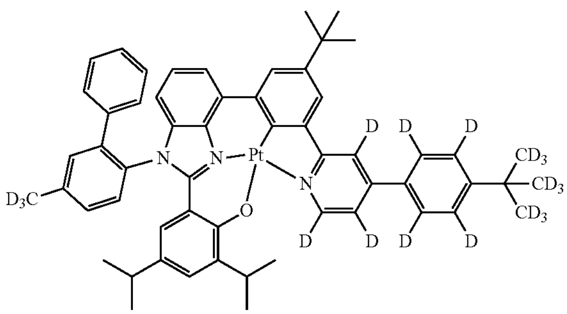
4-2274
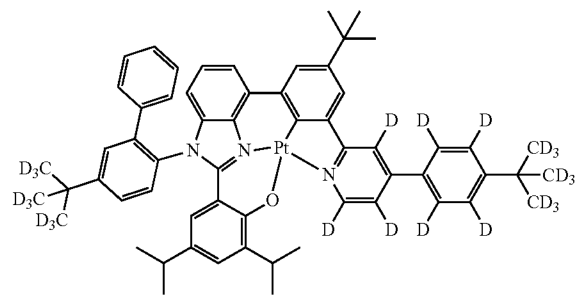
4-2275
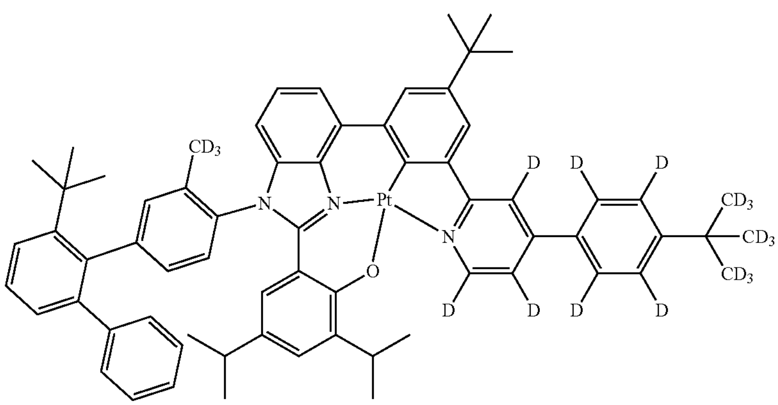
4-2276
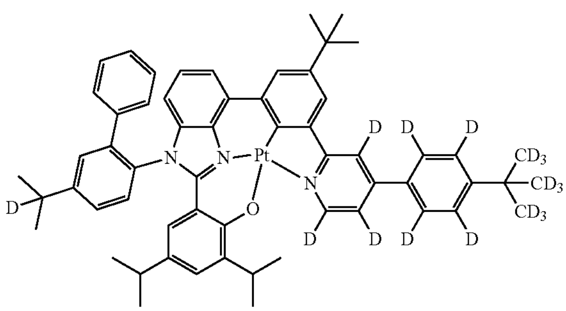
4-2277
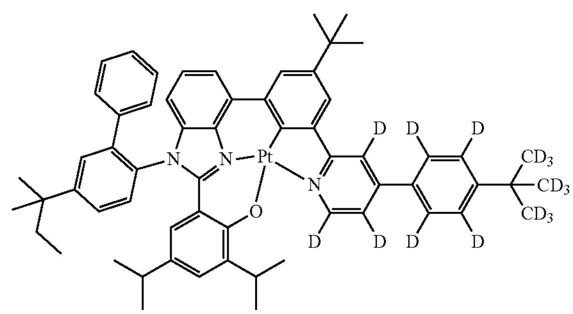

-continued
4-2278
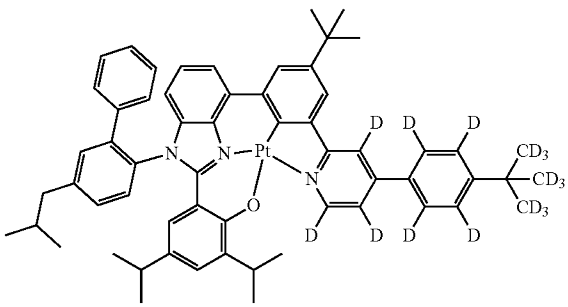
4-2279
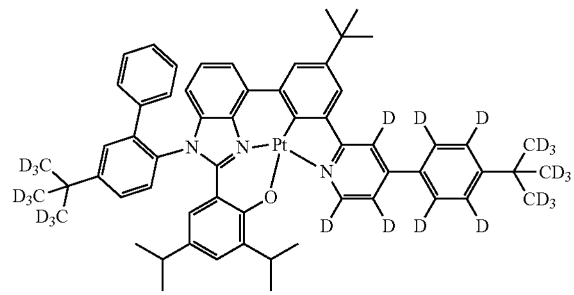
4-2280
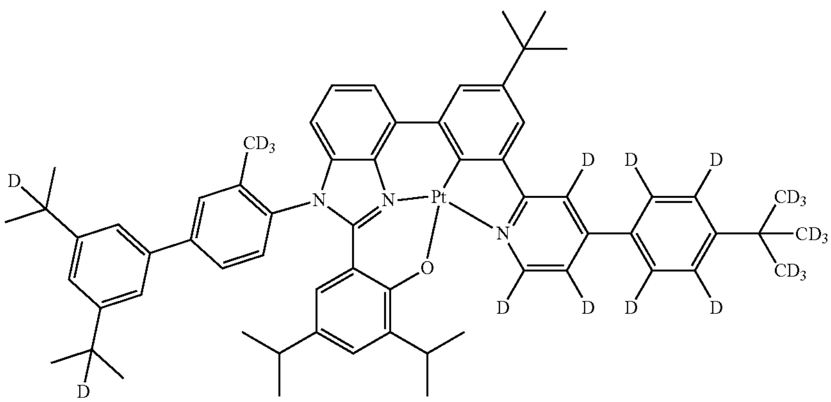
4-2281
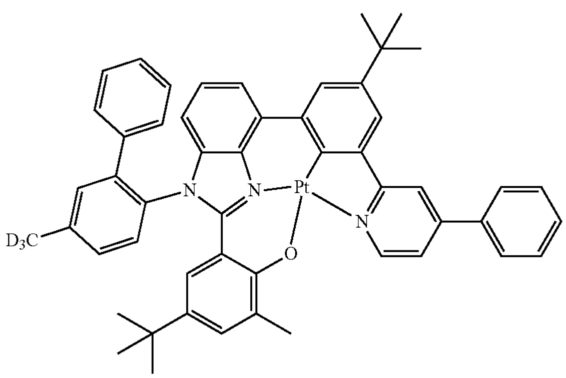
4-2282
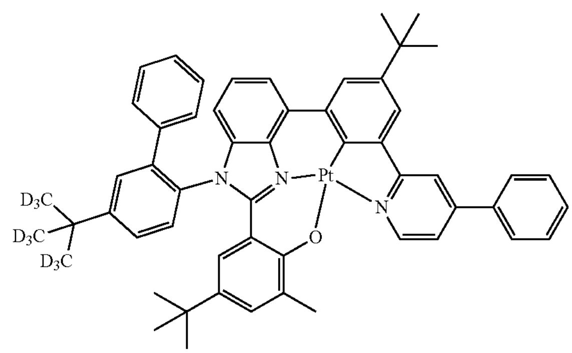
4-2283
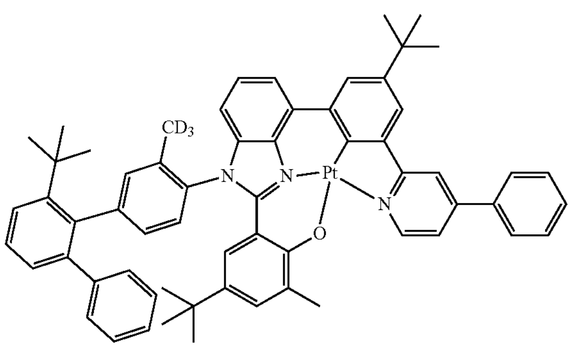
4-2284
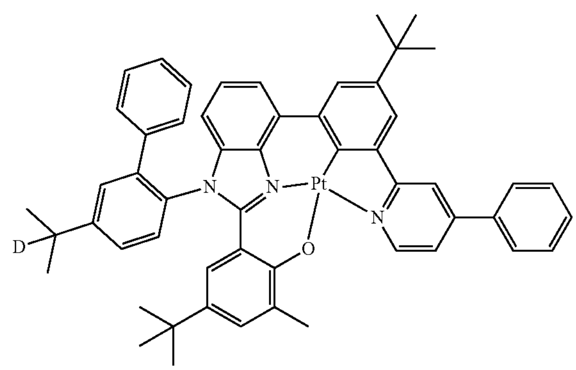

-continued
4-2285
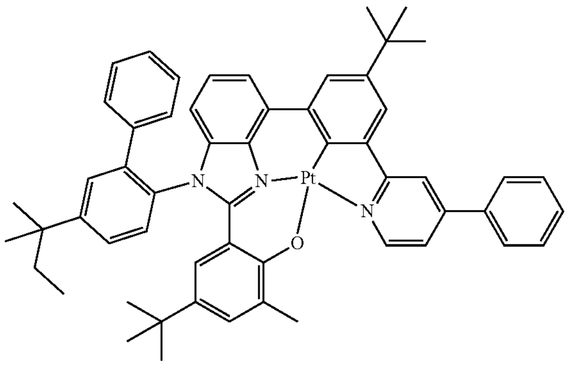
4-2286
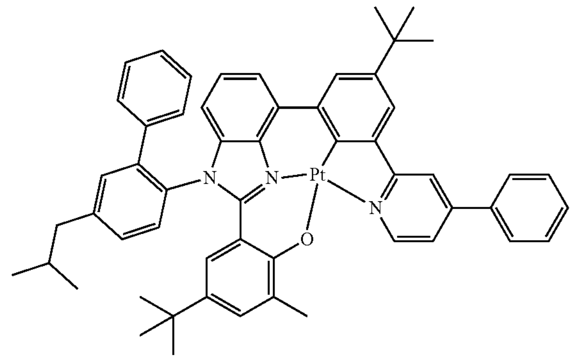
4-2287
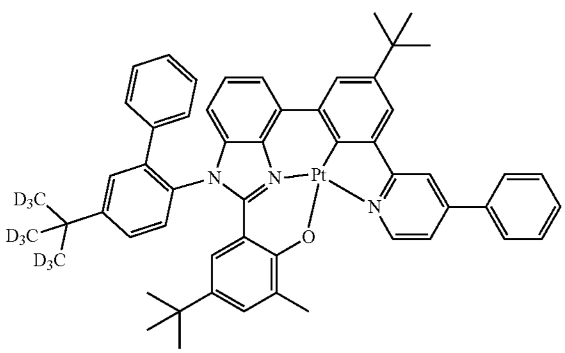
4-2288
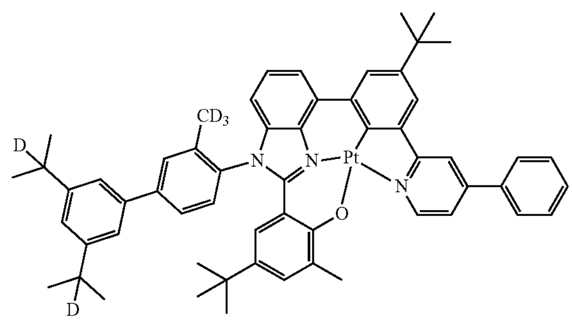
4-2289
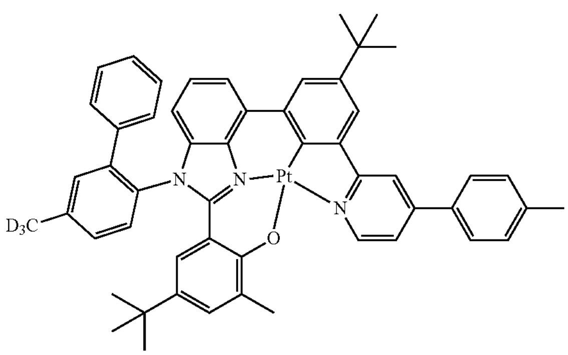
4-2290
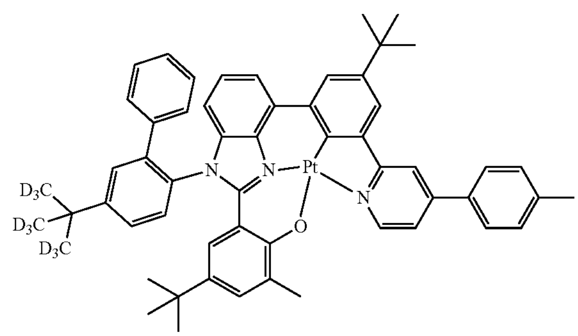
4-2291
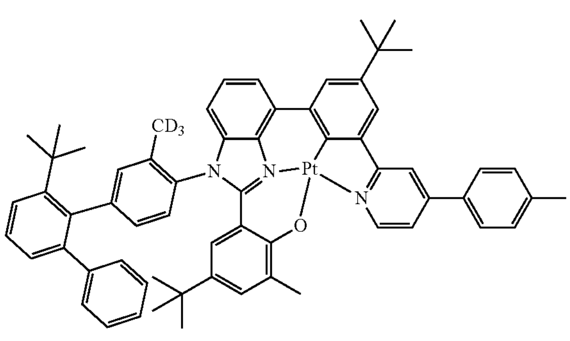
4-2292
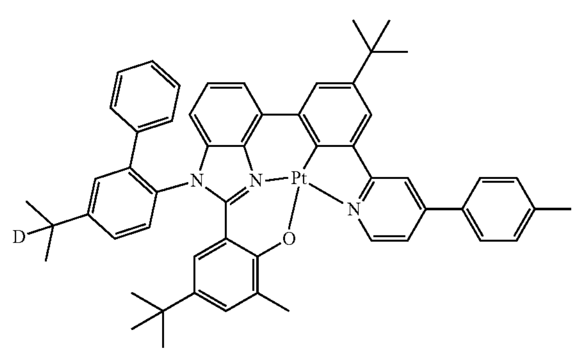

-continued
4-2293
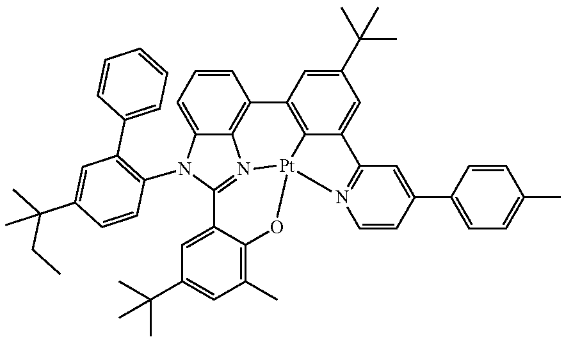
4-2294
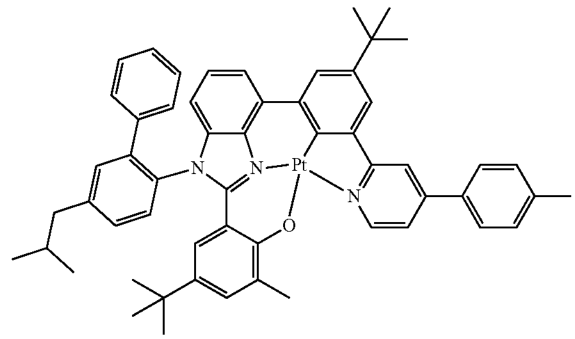
4-2295
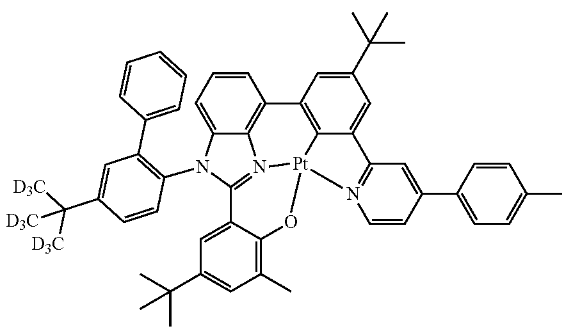
4-2296
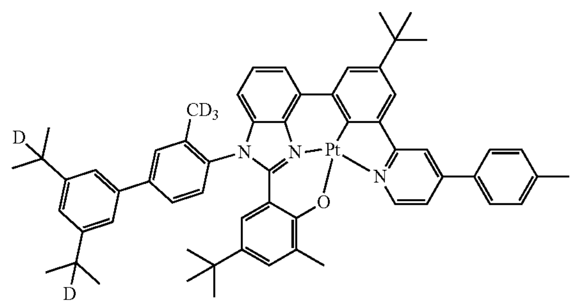
4-2297
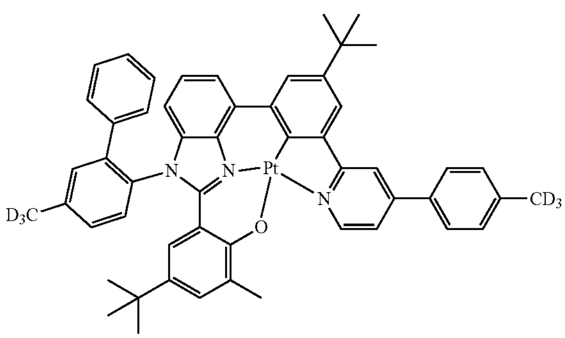
4-2298
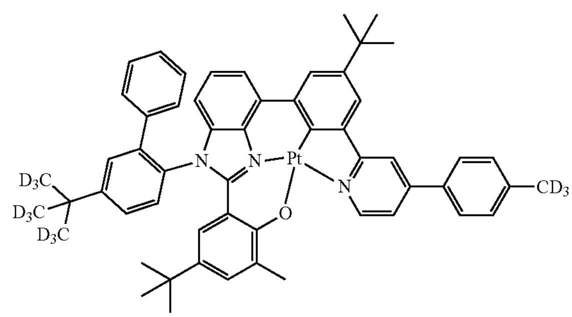
4-2299
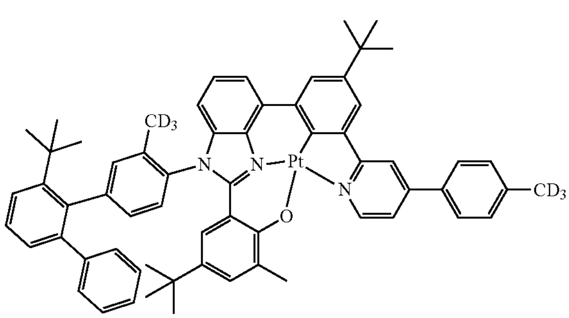
4-2300
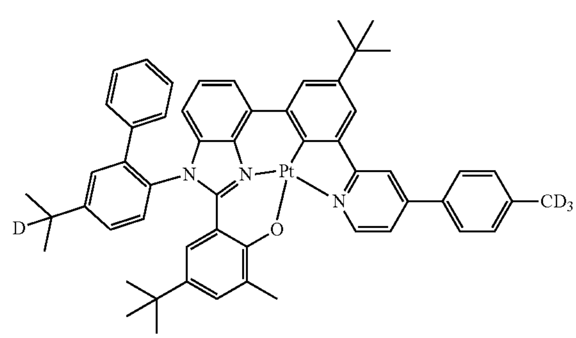

-continued
4-2301
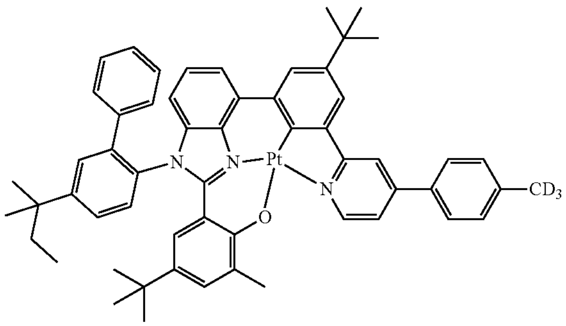
4-2302
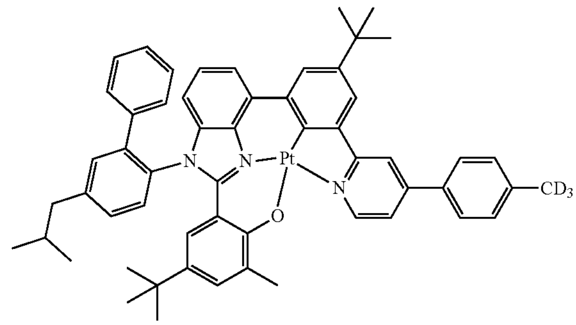
4-2303
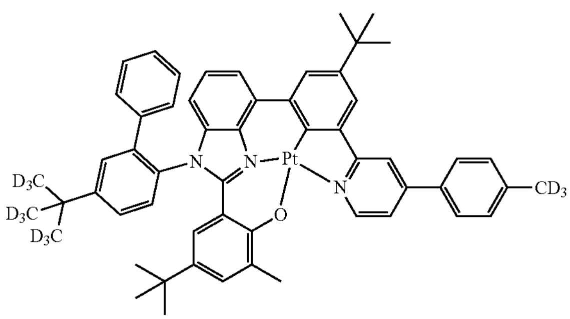
4-2304
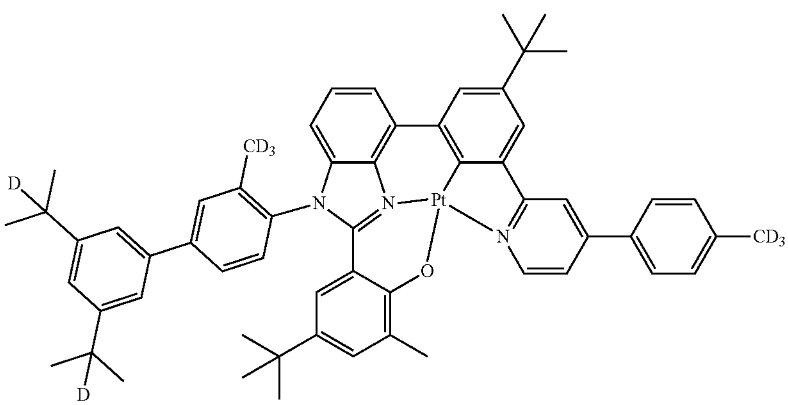
4-2305
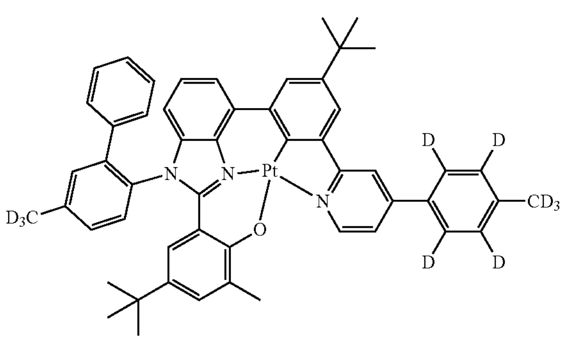
4-2306
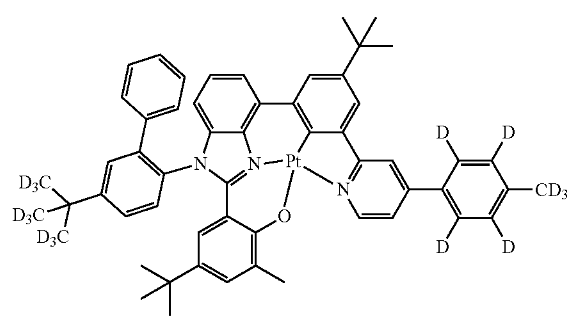

-continued
4-2307
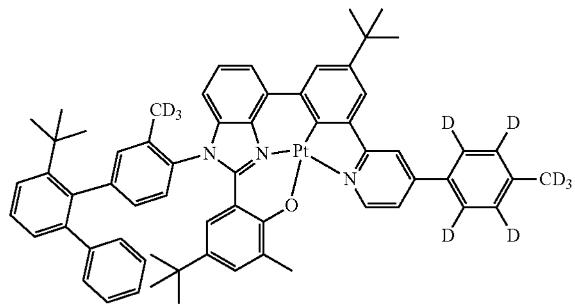
4-2308
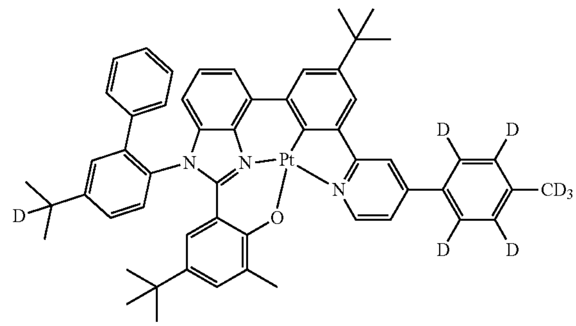
4-2309
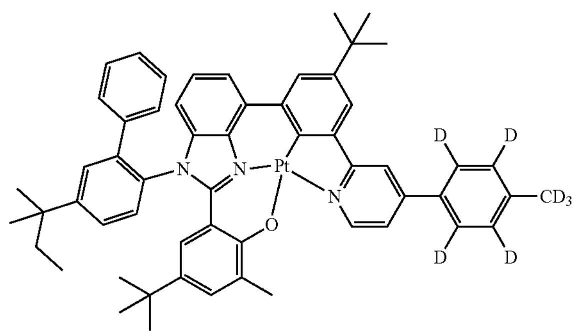
4-2310
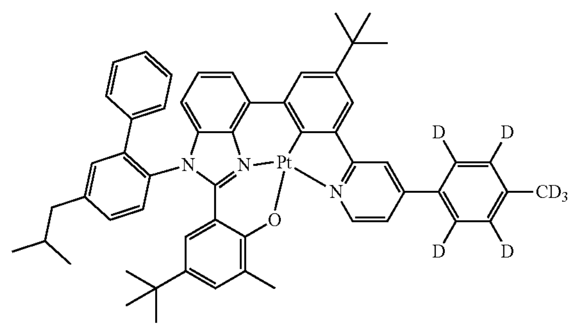
4-2311
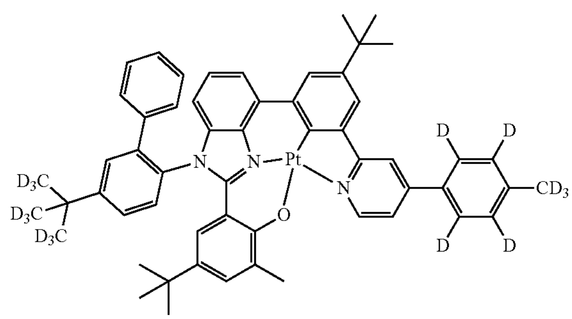
4-2312
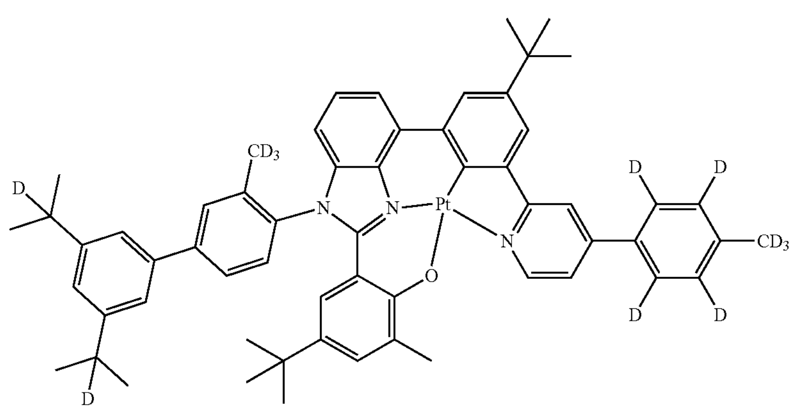

-continued
4-2313
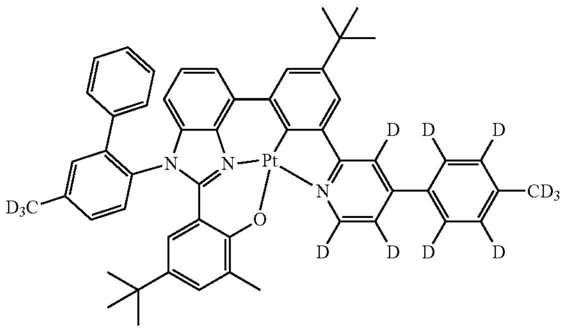
4-2314
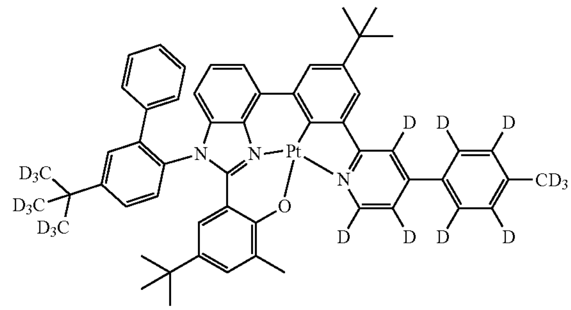
4-2315
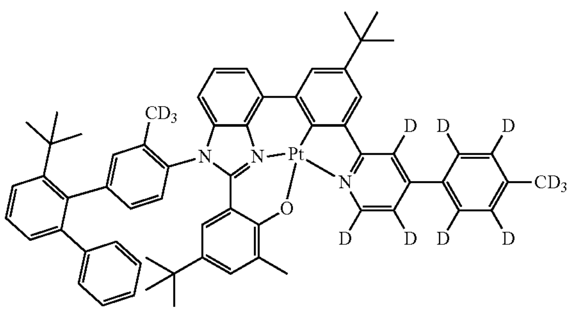
4-2316
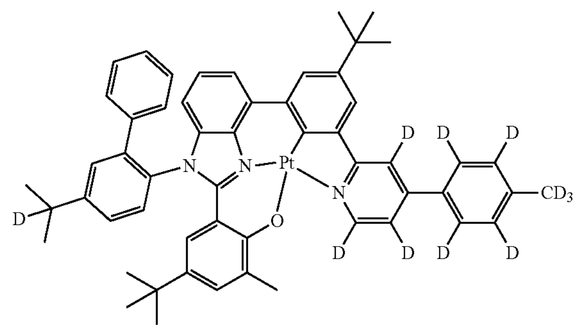
4-2317
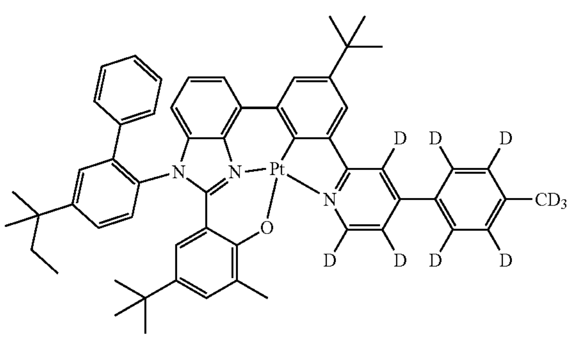
4-2318
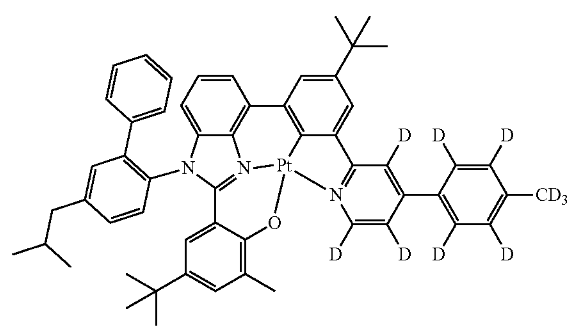
4-2319
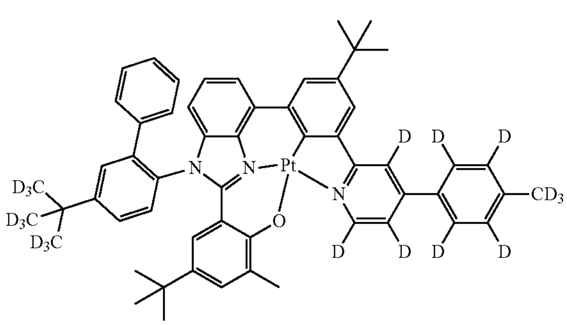

-continued
4-2320
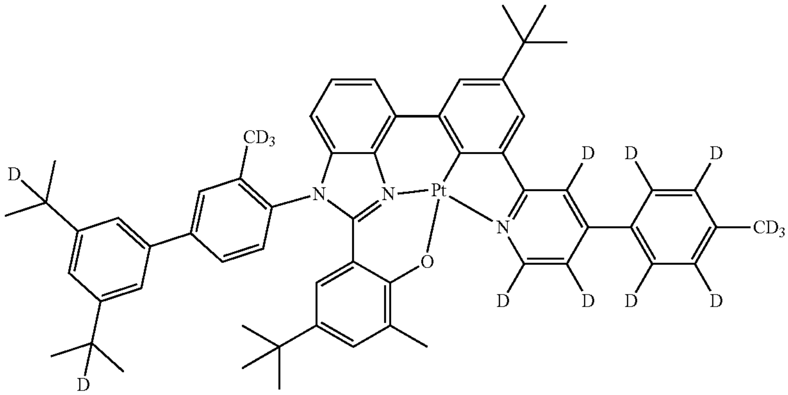
4-2321
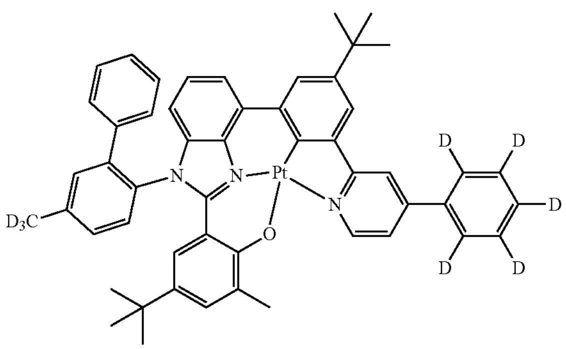
4-2322
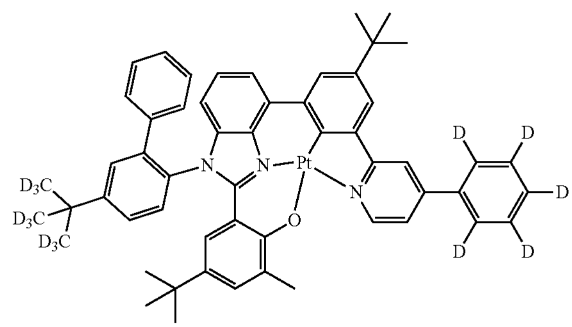
4-2323
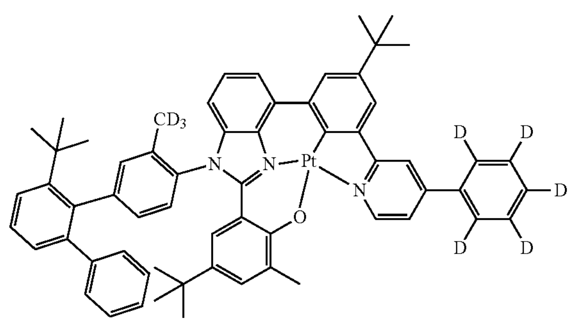
4-2324
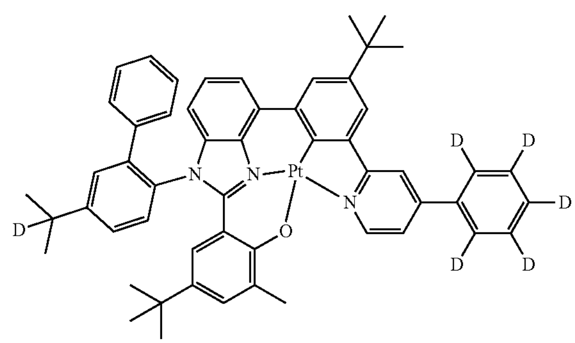
4-2325
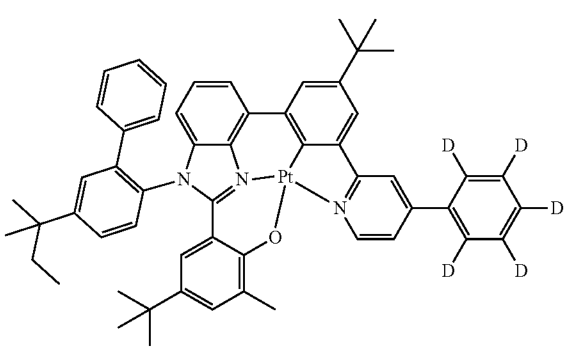
4-2326
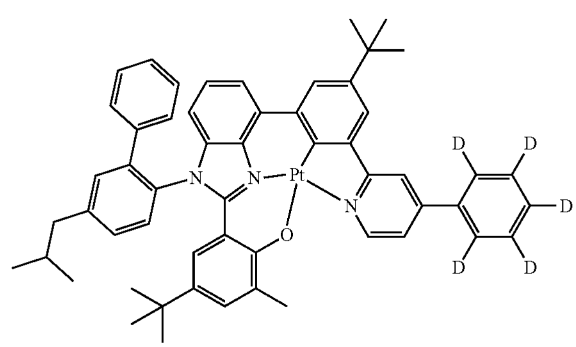

-continued
4-2327
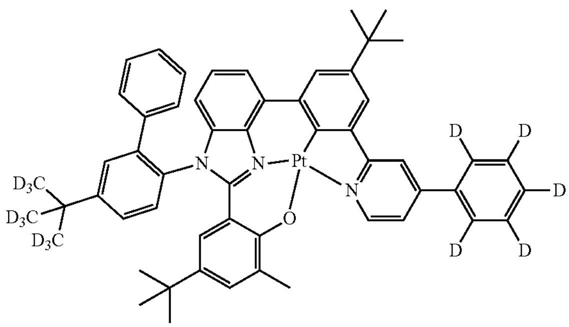
4-2328
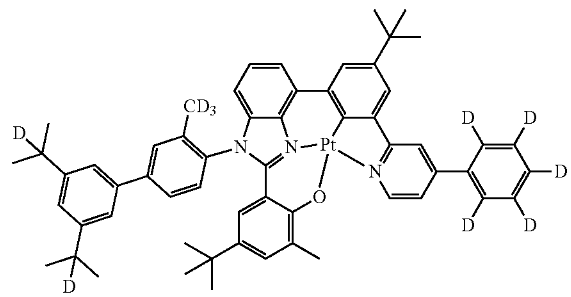
4-2329
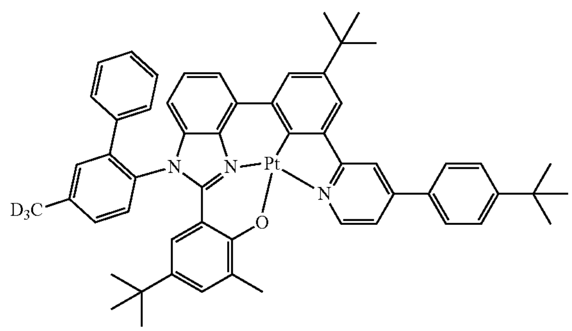
4-2330
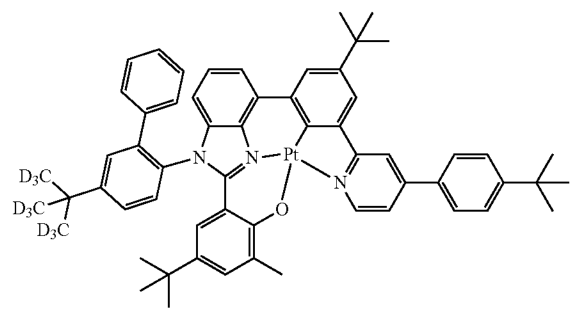
4-2331
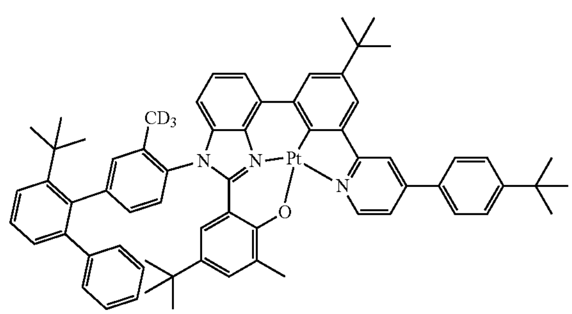
4-2332
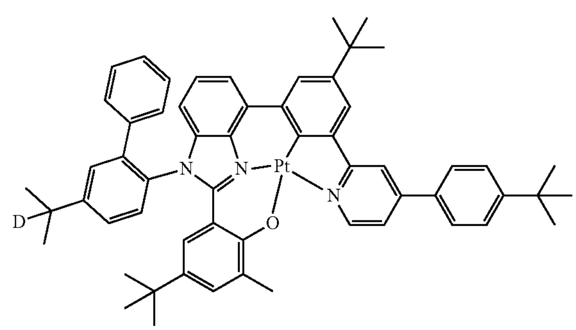
4-2333
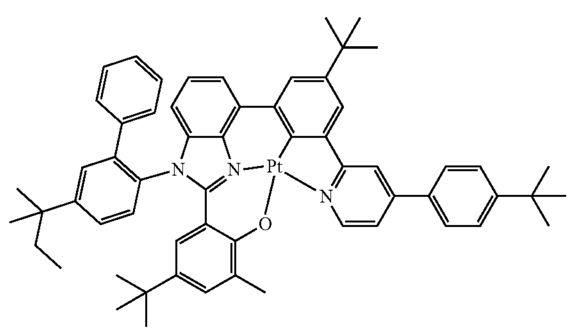
4-2334
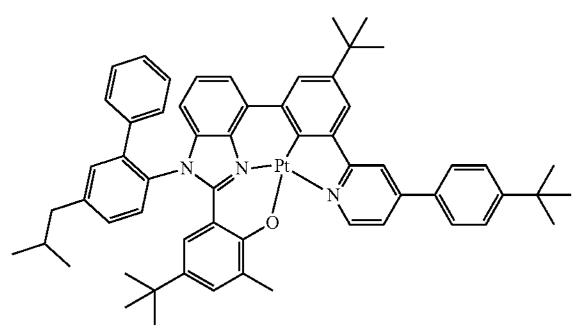

-continued
4-2335
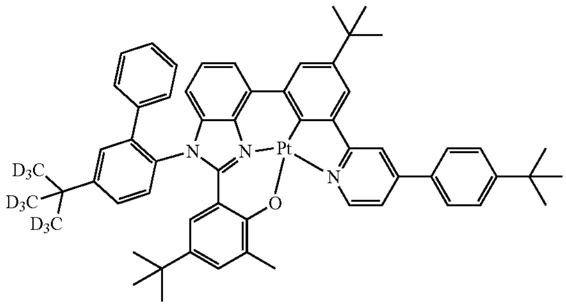
4-2336
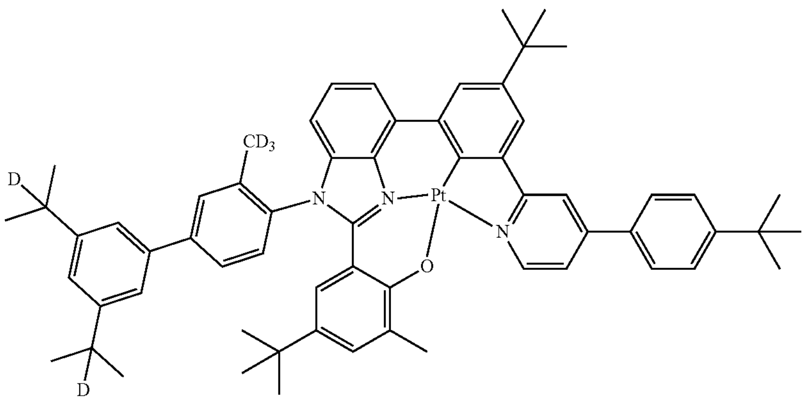
4-2337
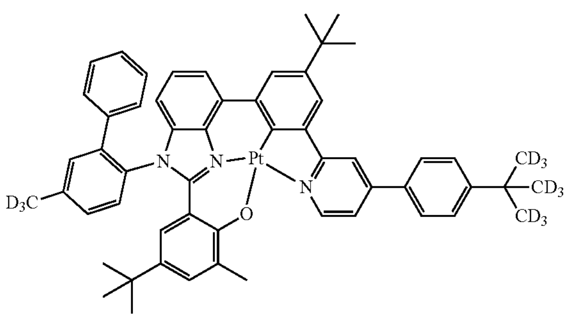
4-2338
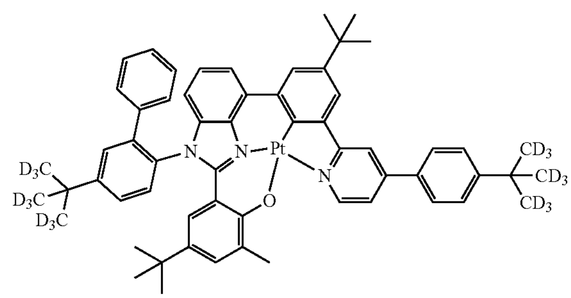
4-2339
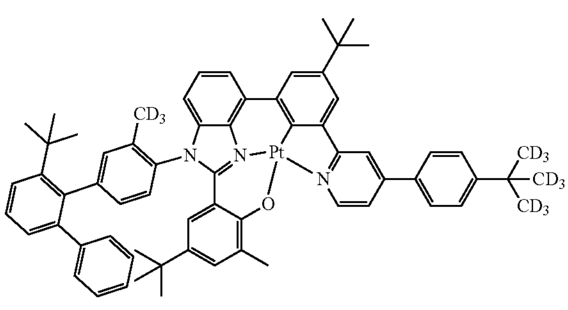
4-2340
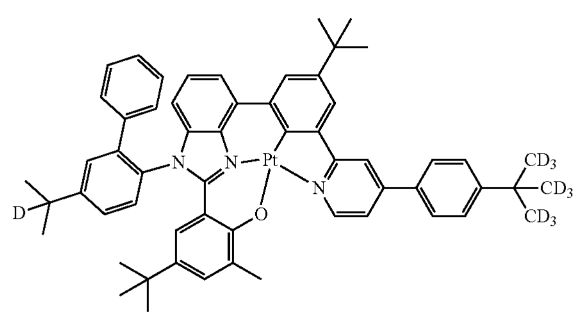

-continued
4-2341
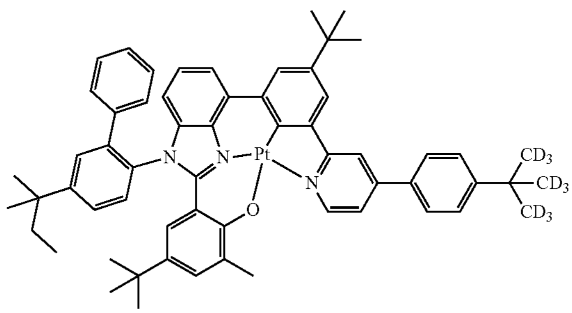
4-2342
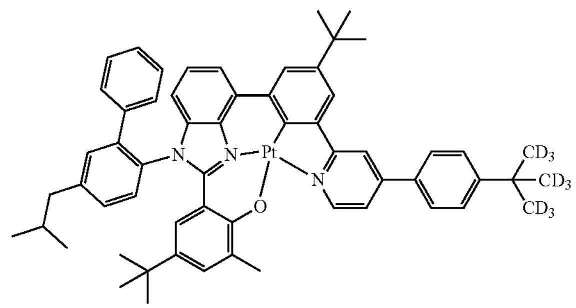
4-2343
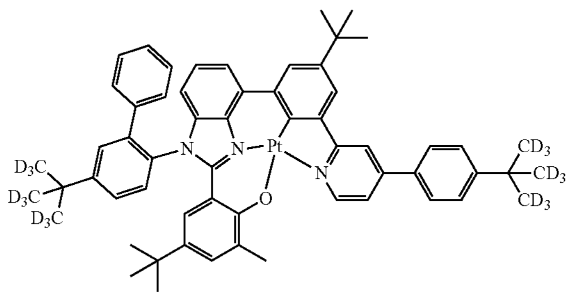
4-2344
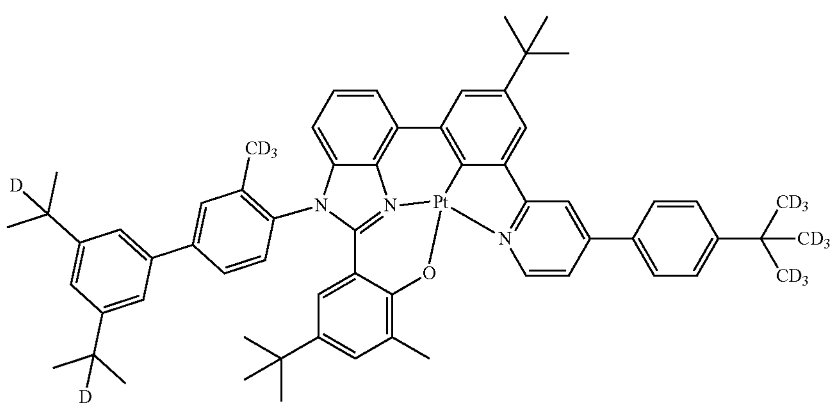
4-2345
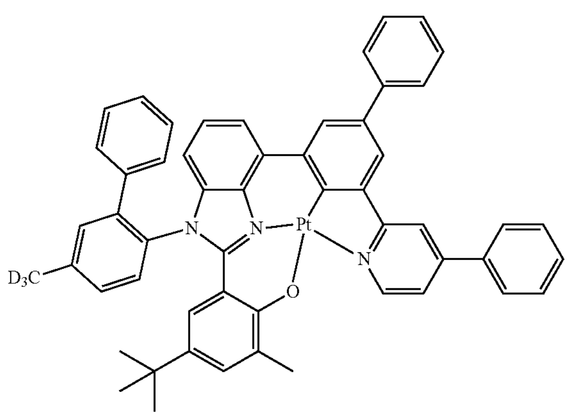
4-2346
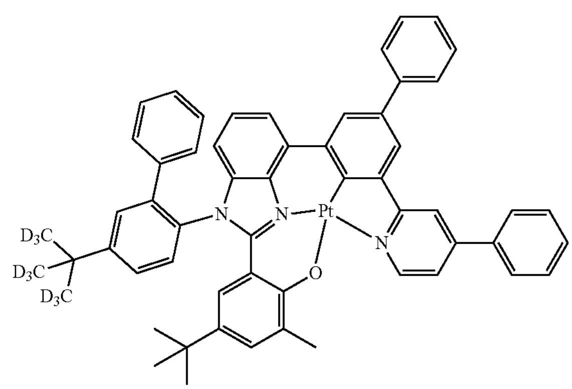

-continued
4-2347
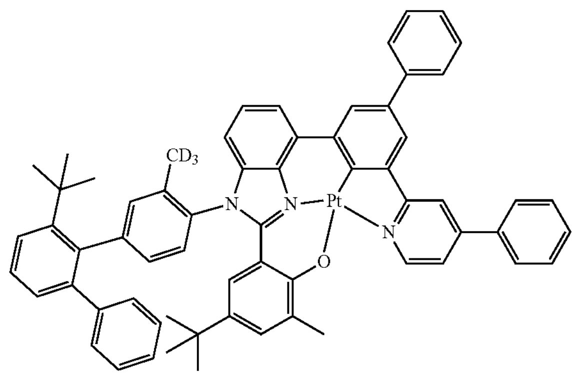
4-2348
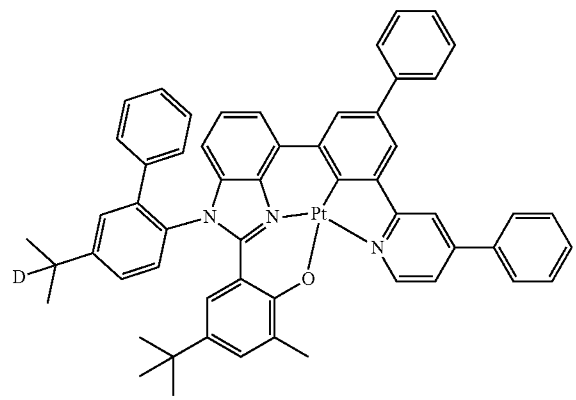
4-2349
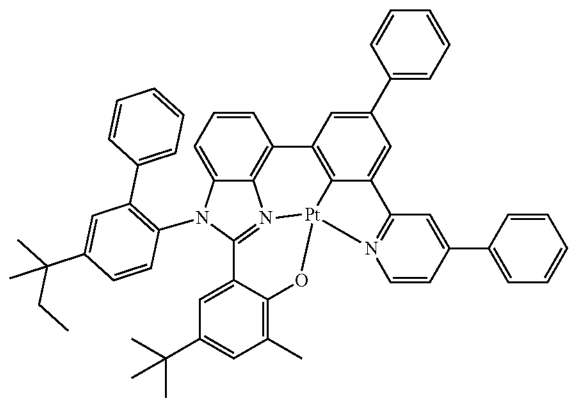
4-2350
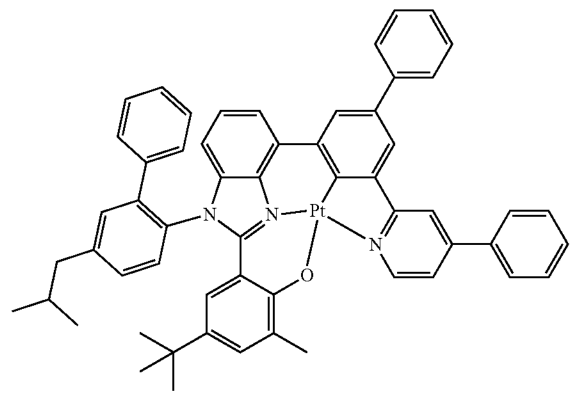
4-2351
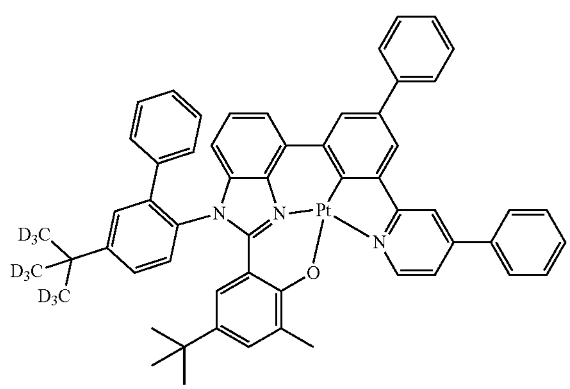
4-2352
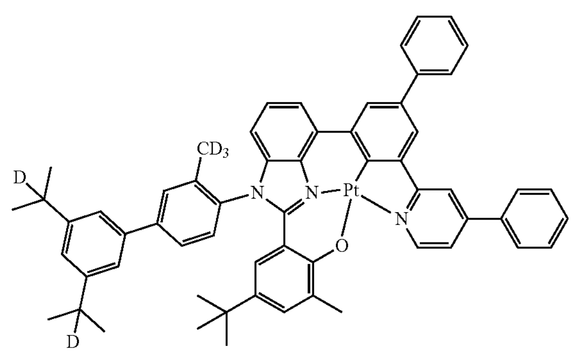
4-2353
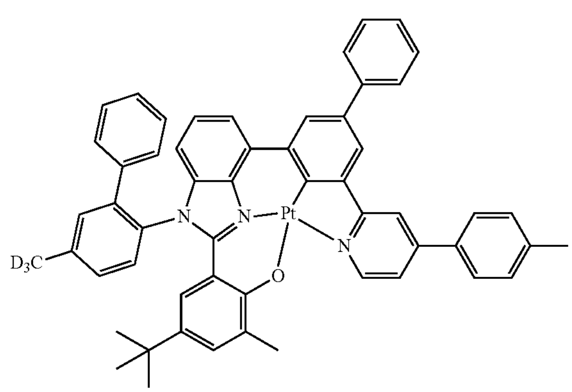
4-2354
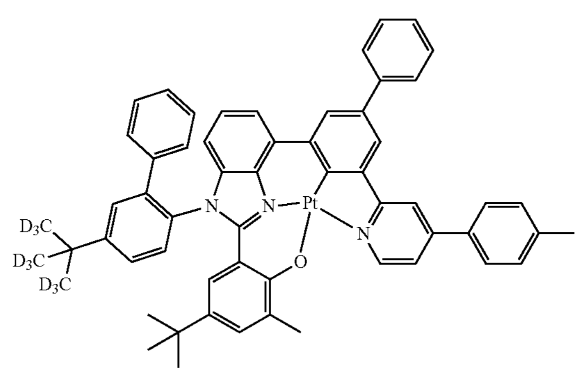

-continued
4-2355
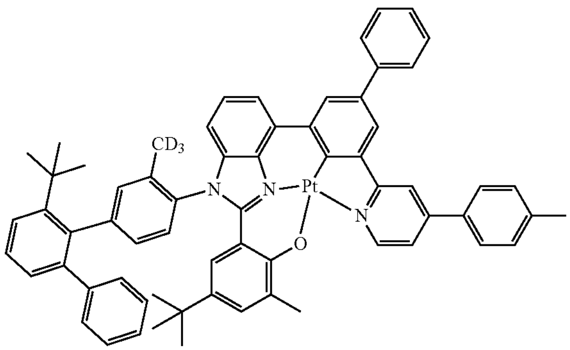
4-2356
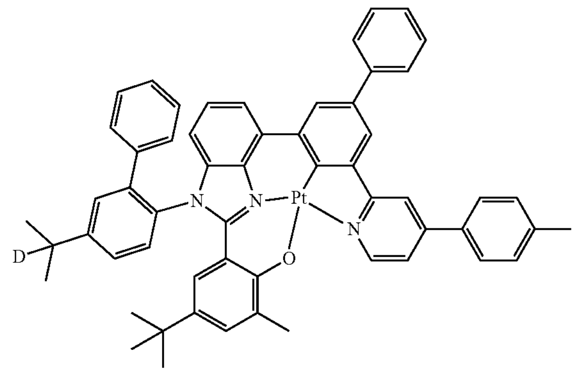
4-2357
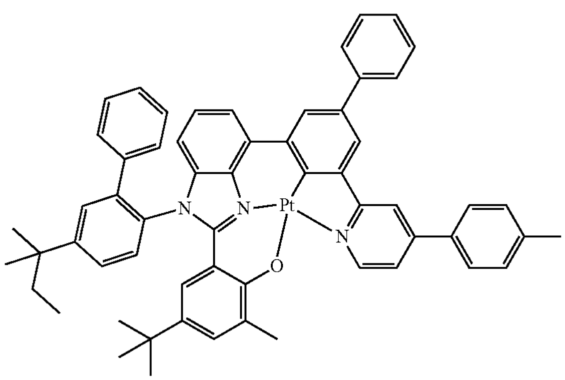
4-2358
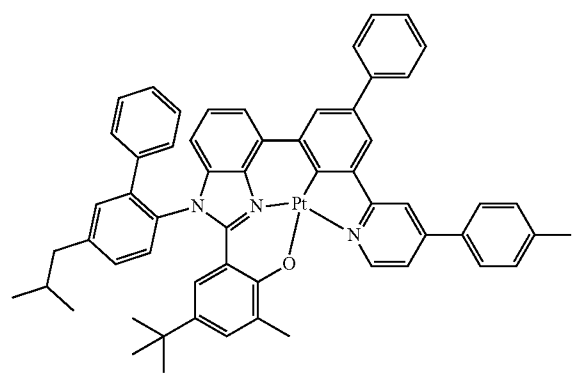
4-2359
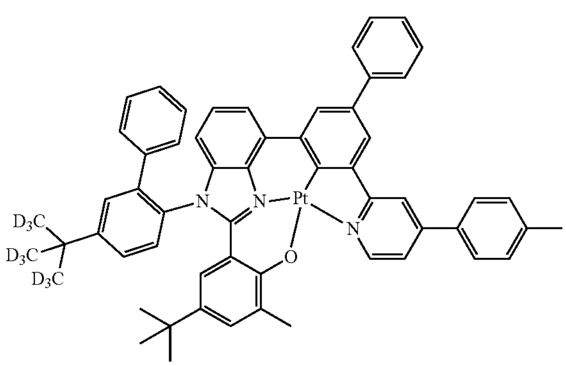
4-2360
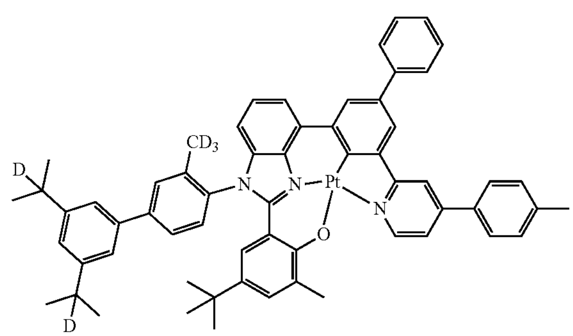
4-2361
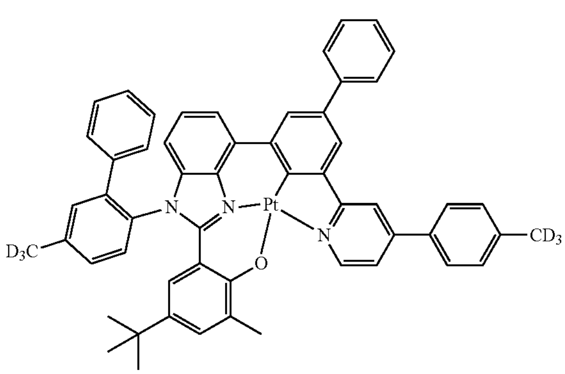
4-2362
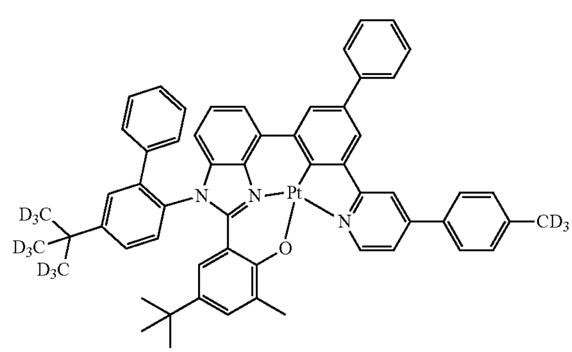

-continued
4-2363
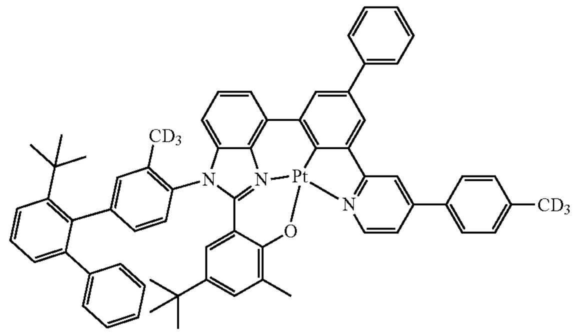
4-2364
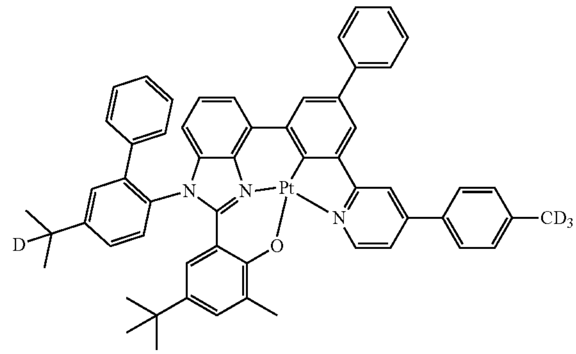
4-2365
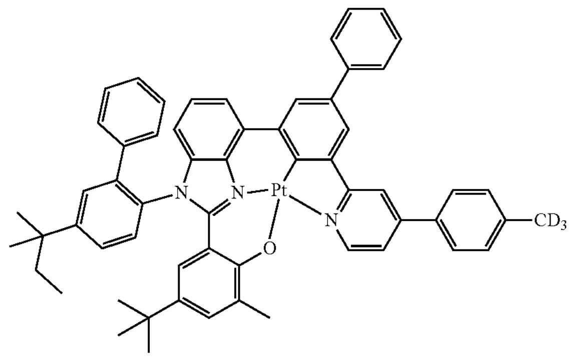
4-2366
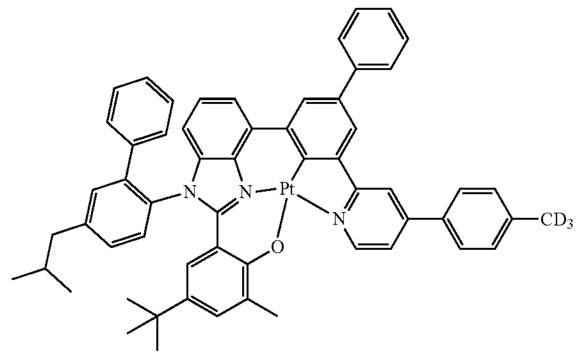
4-2367
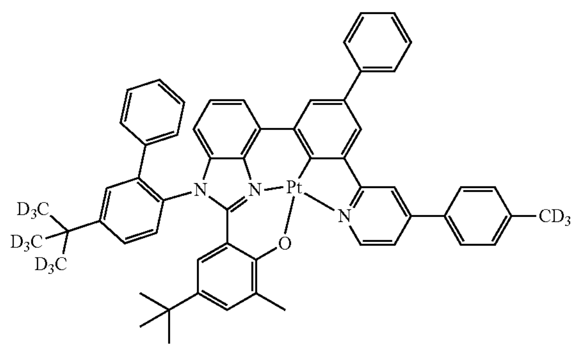
4-2368
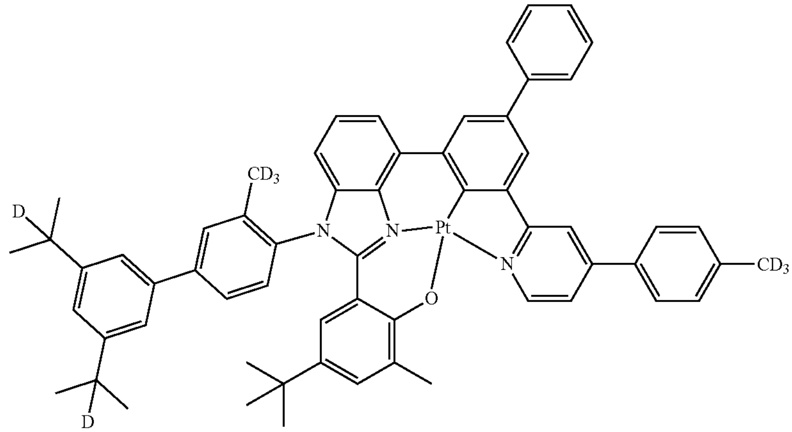

-continued
4-2369
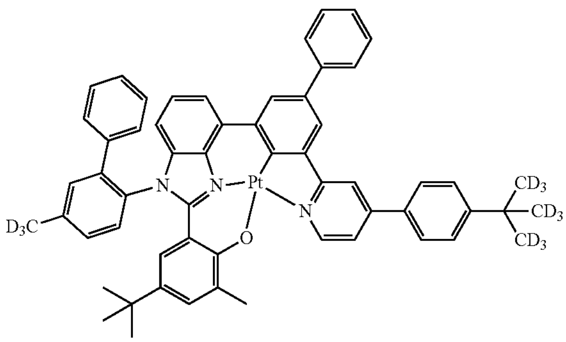
4-2370
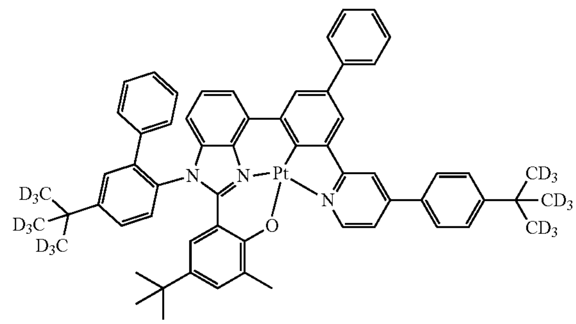
4-2371
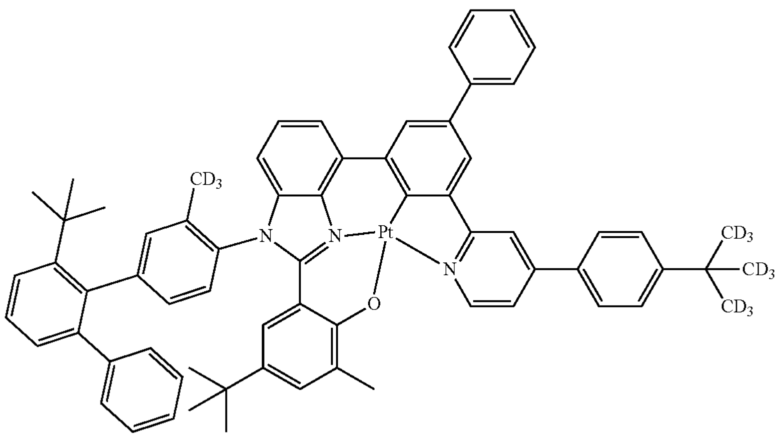
4-2372
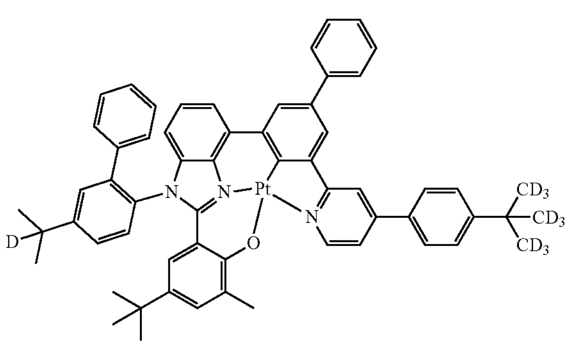
4-2373
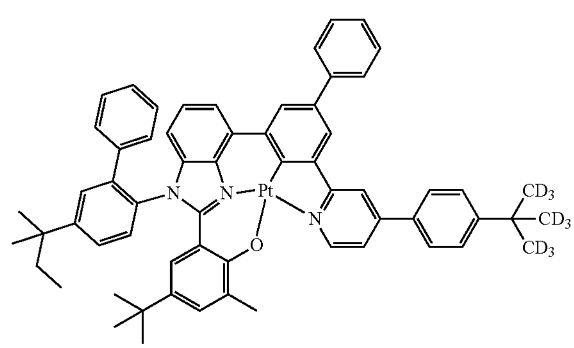
4-2374
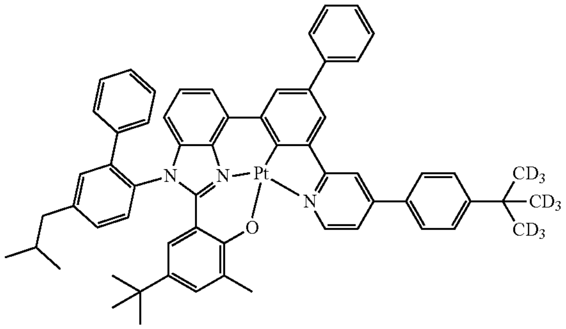
4-2375
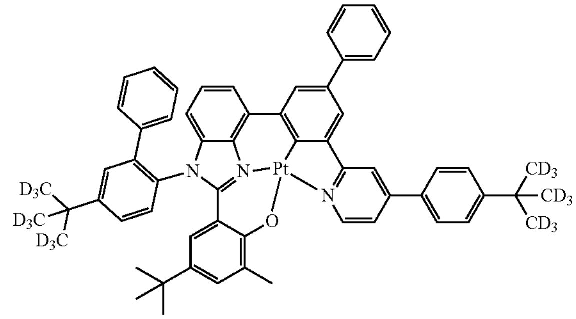

-continued
4-2376
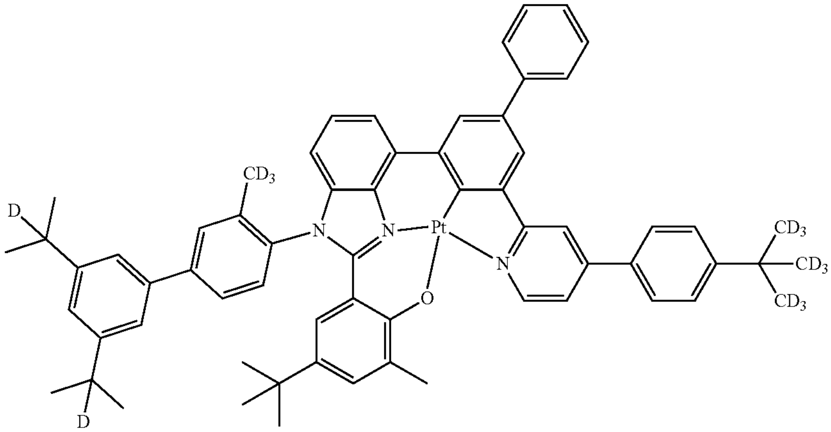
4-2377
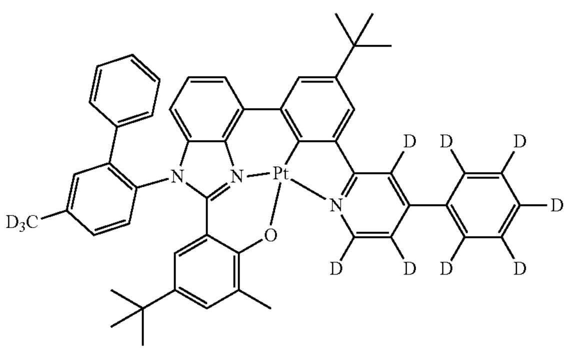
4-2378
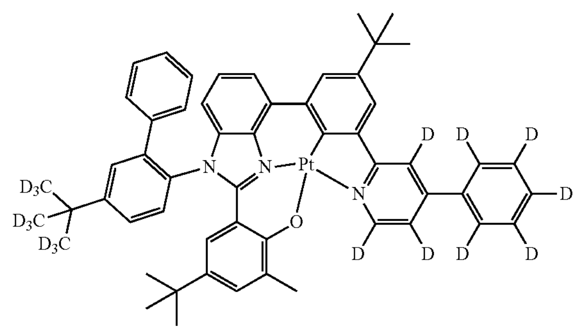
4-2379
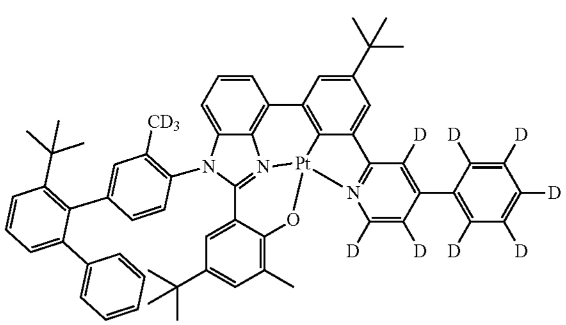
4-2380
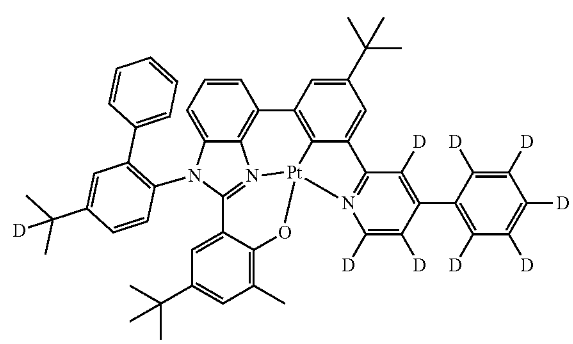
4-2381
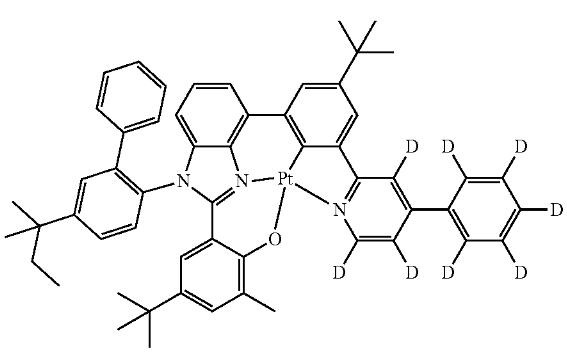
4-2382
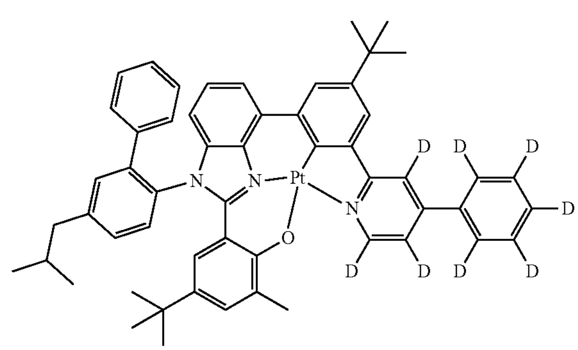

-continued
4-2383
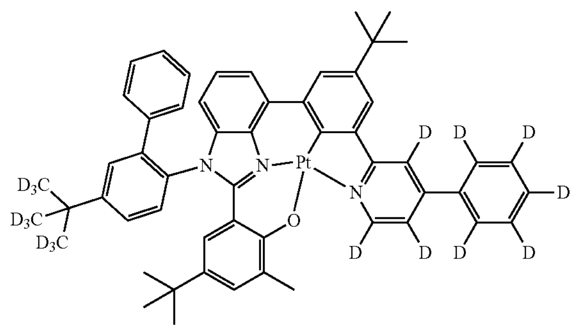
4-2384
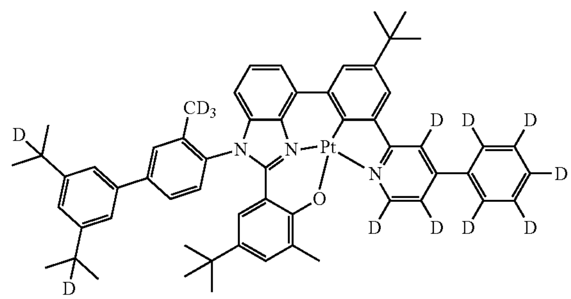
4-2385
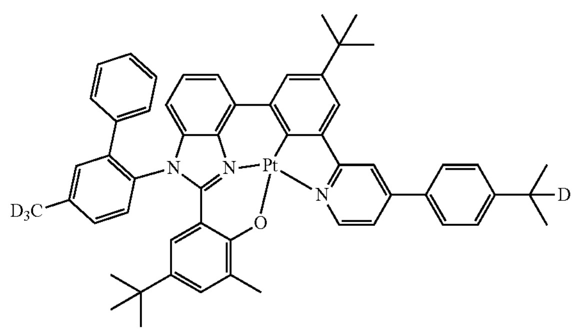
4-2365
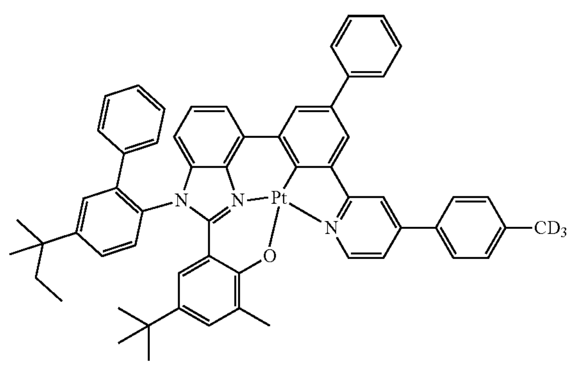
4-2366
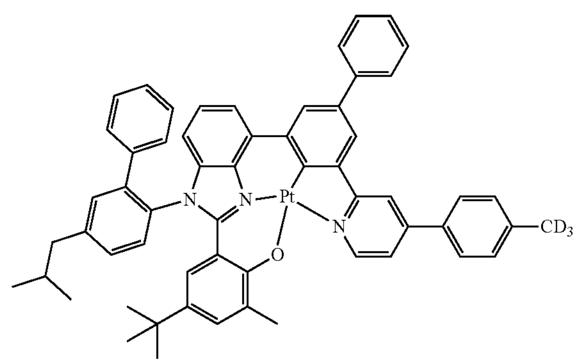
4-2367
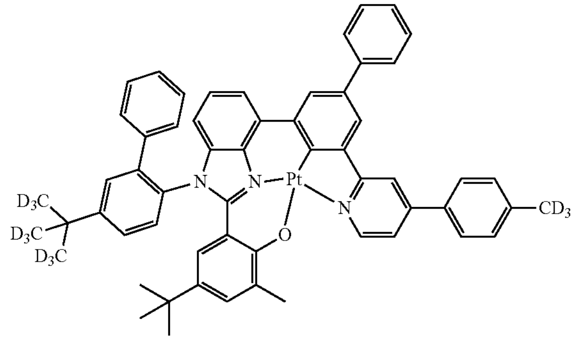

-continued
4-2368
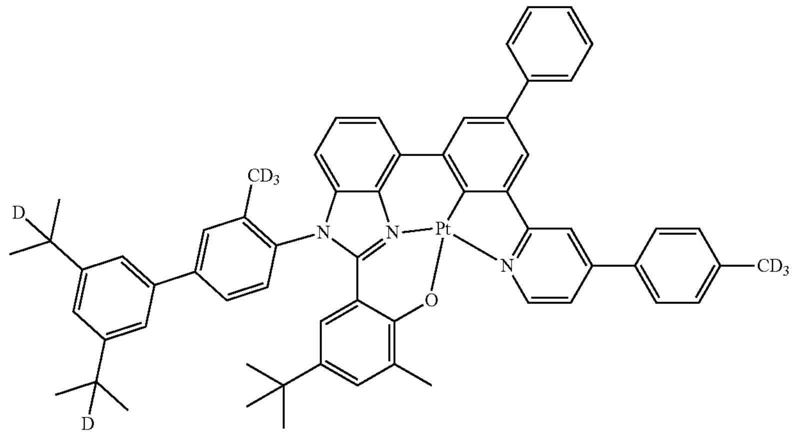
4-2369
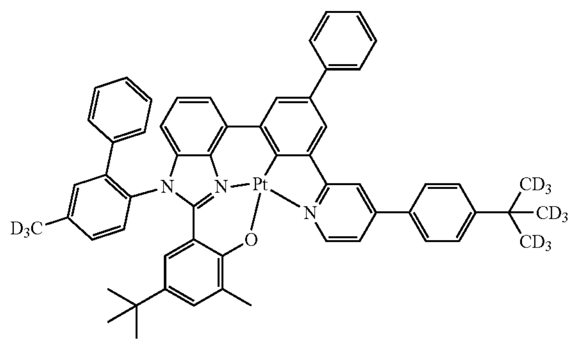
4-2370
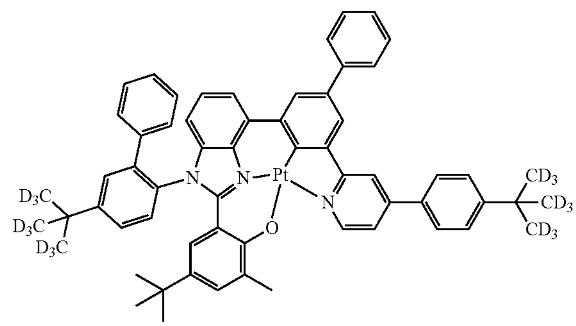
4-2371
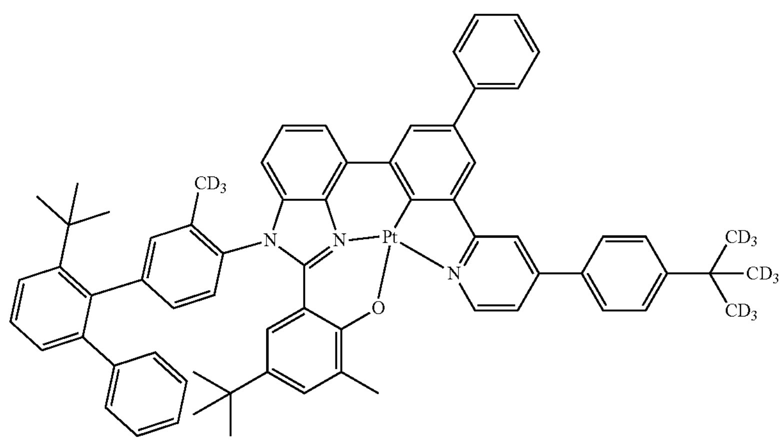
4-2372
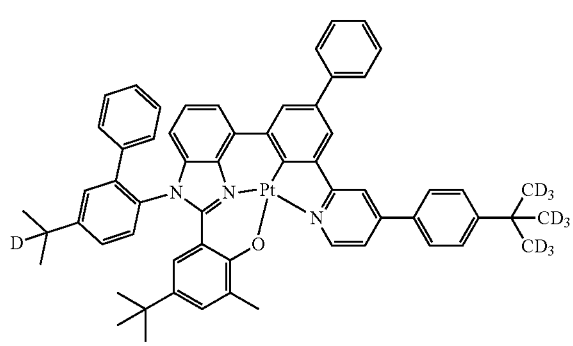
4-2373
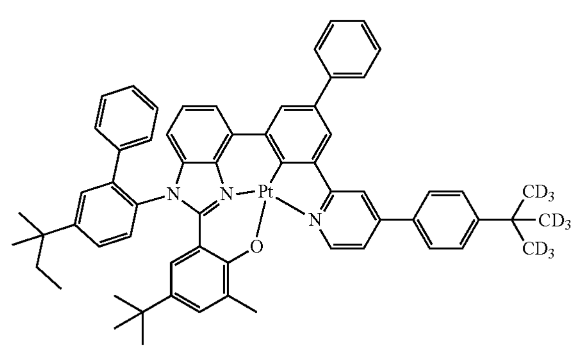

-continued
4-2374
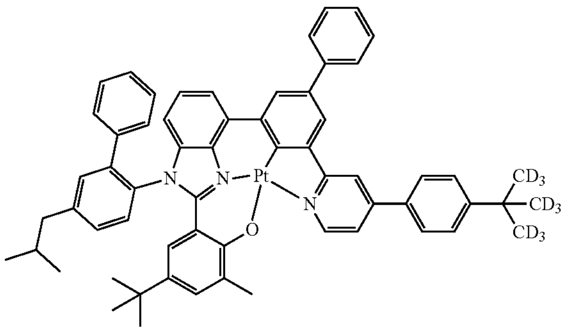
4-2375
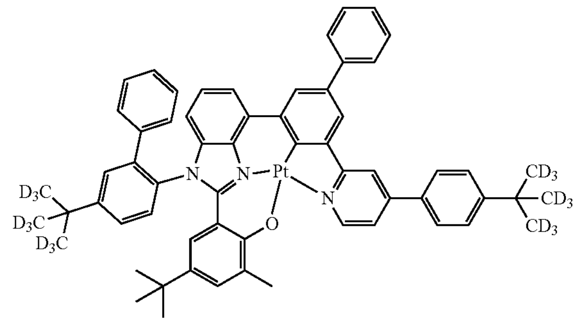
4-2376
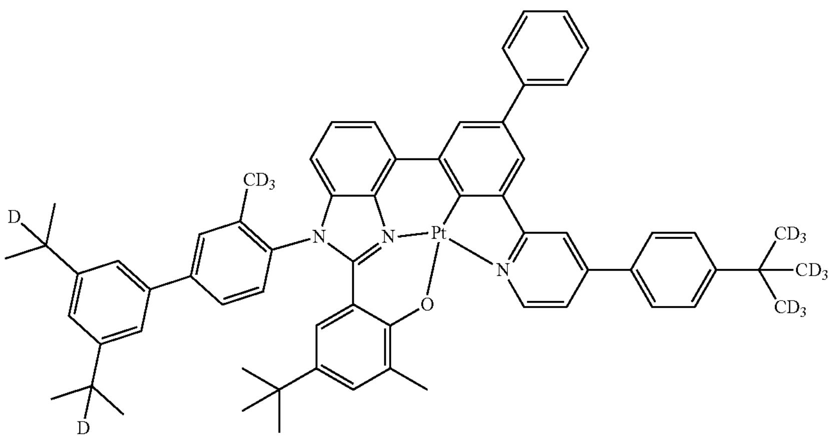
4-2377
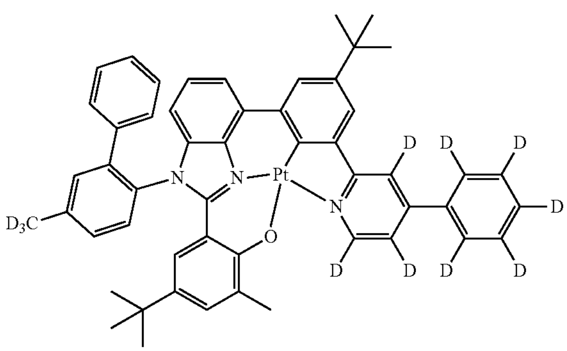
4-2378
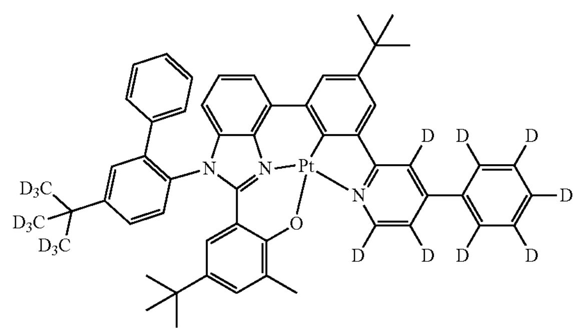
4-2379
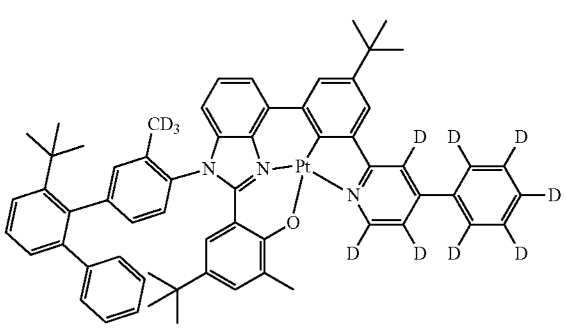
4-2380
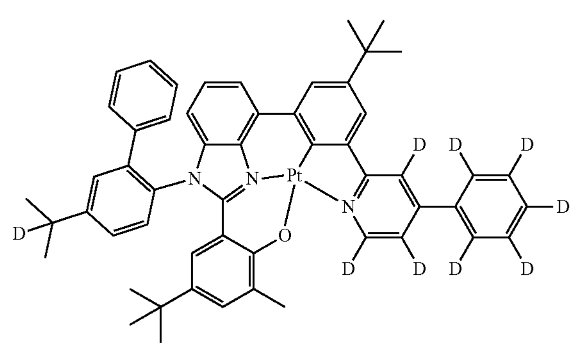

-continued
4-2381
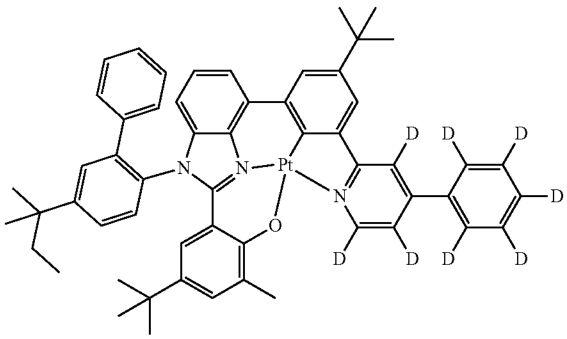
4-2382
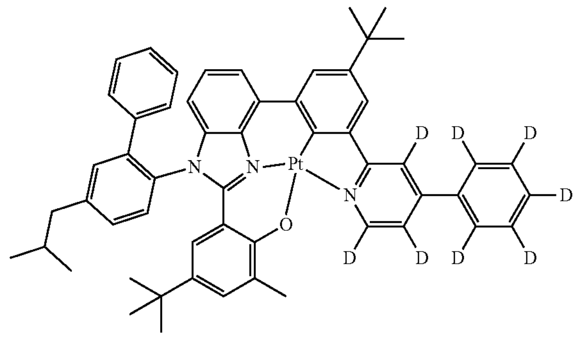
4-2383
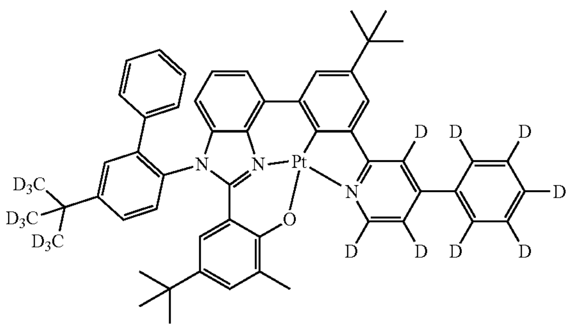
4-2384
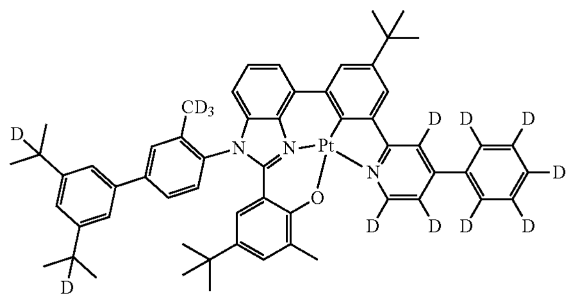
4-2385
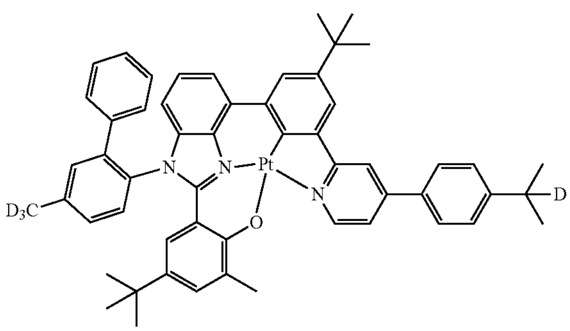
4-2386
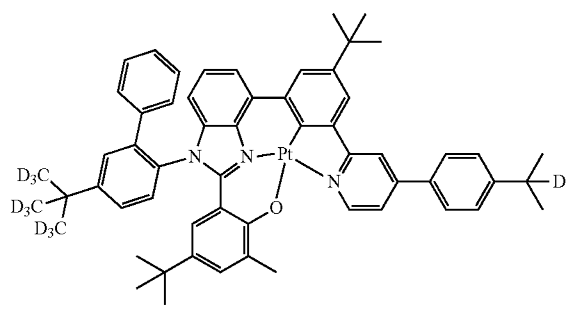
4-2387
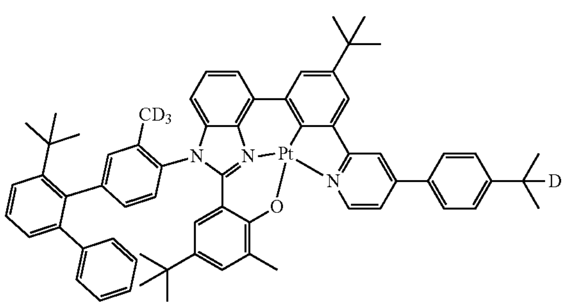
4-2388
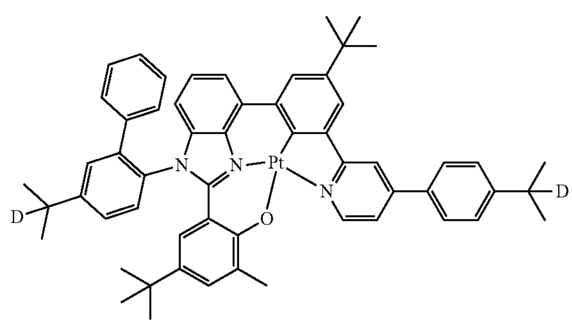

-continued
4-2389
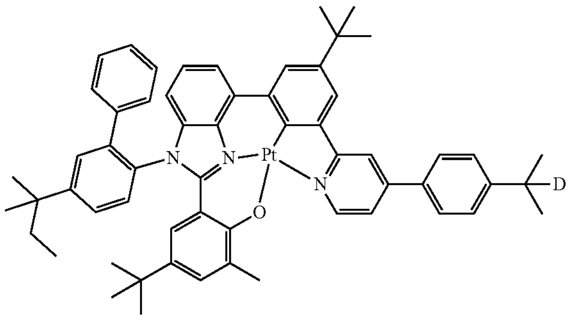
4-2390
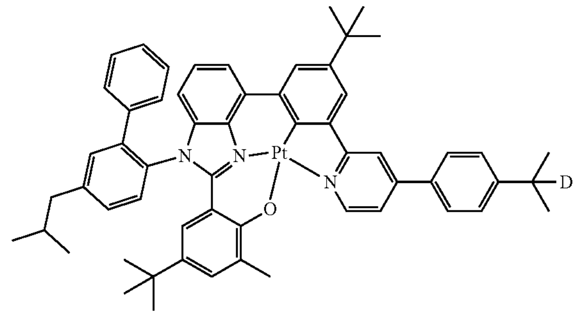
4-2391
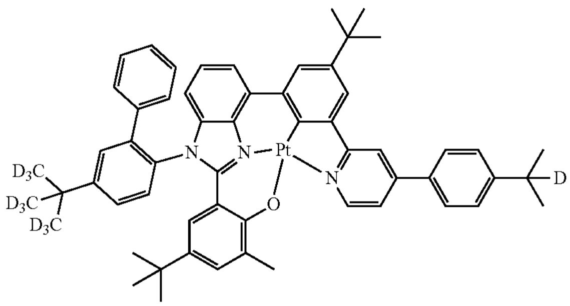
4-2392
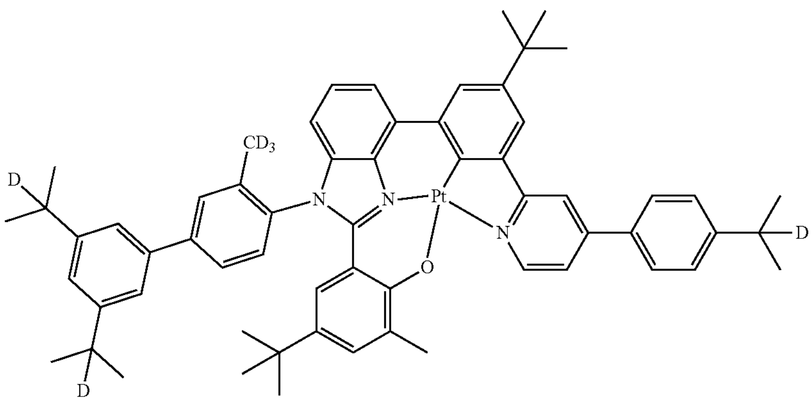
4-2393
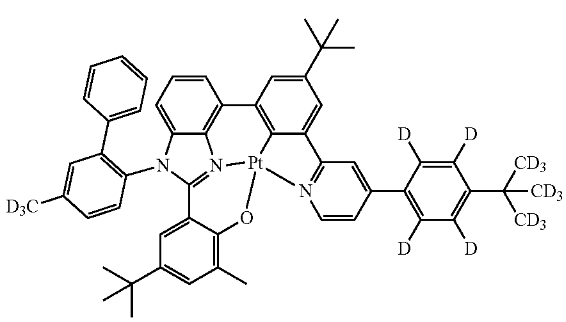
4-2394
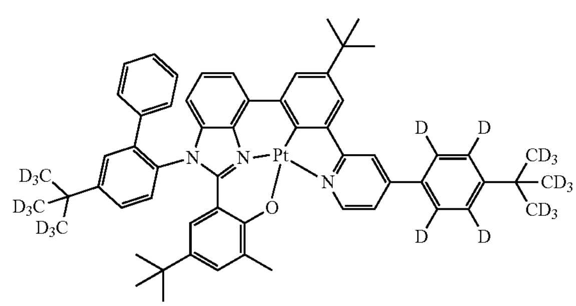

-continued
4-2395
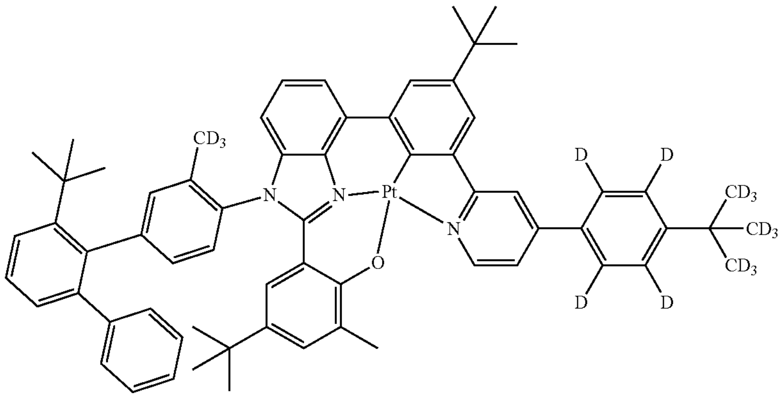
4-2396
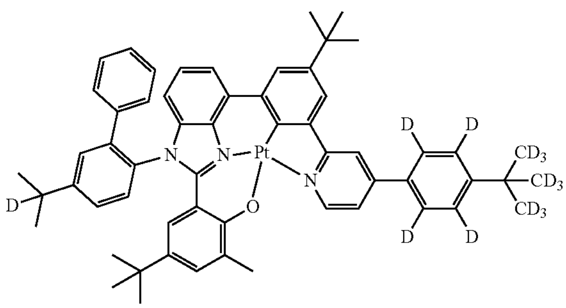
4-2397
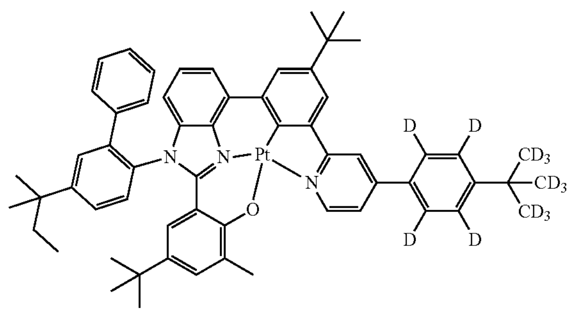
4-2398
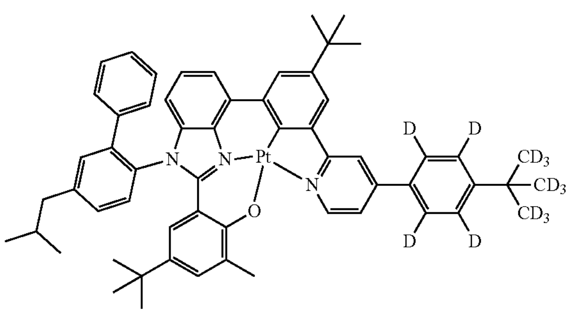
4-2399
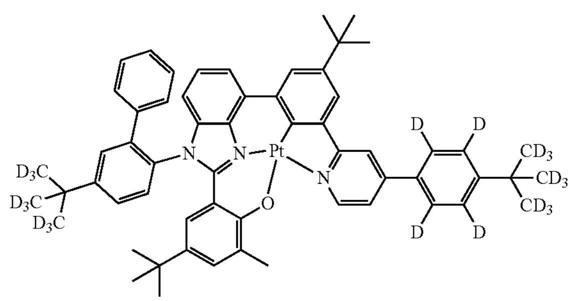
4-2400
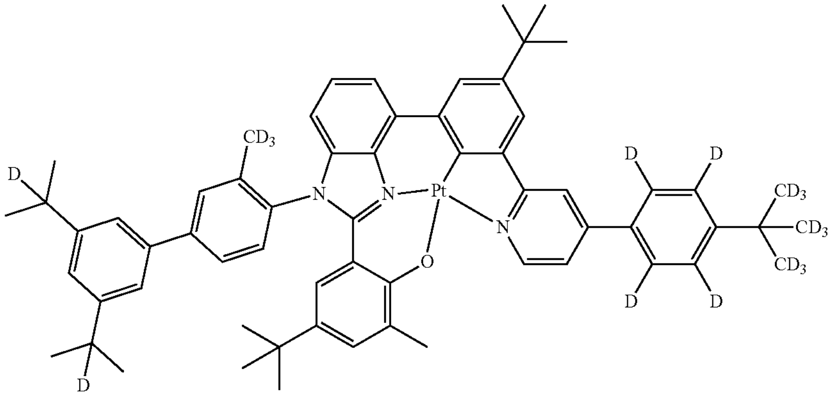

-continued
4-2401
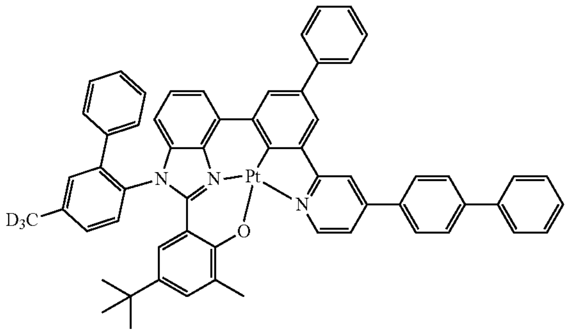
4-2402
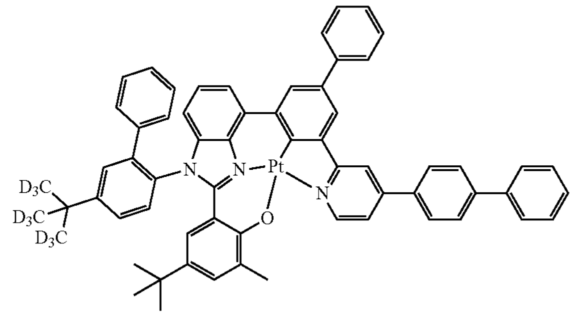
4-2403
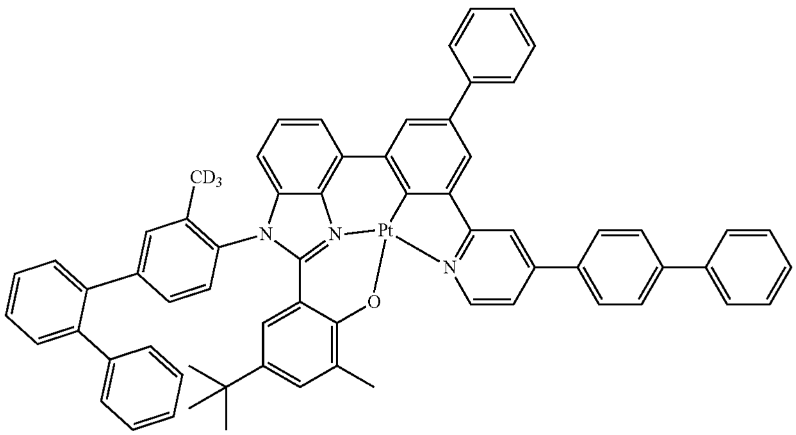
4-2404
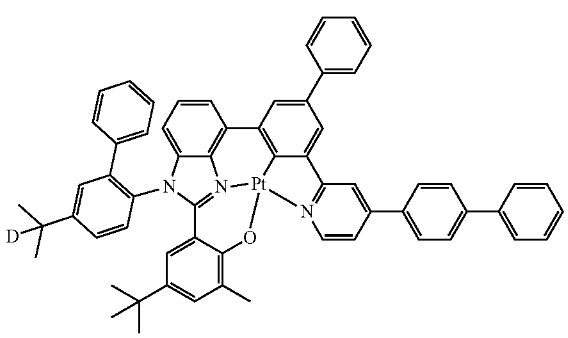
4-2405
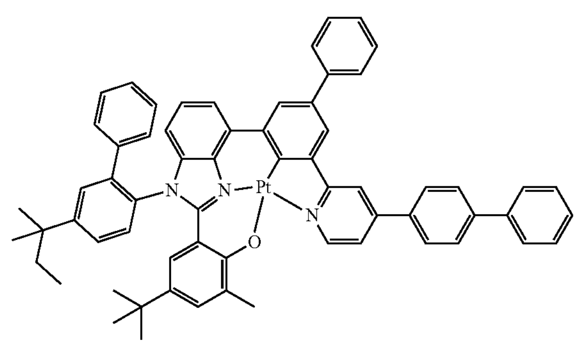
4-2406
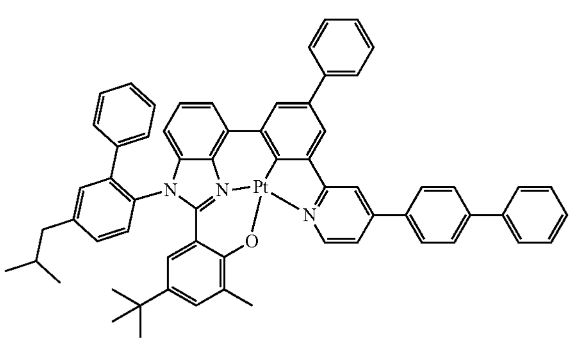
4-2407
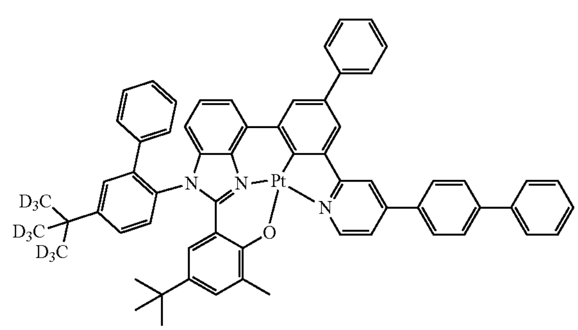

-continued
4-2408
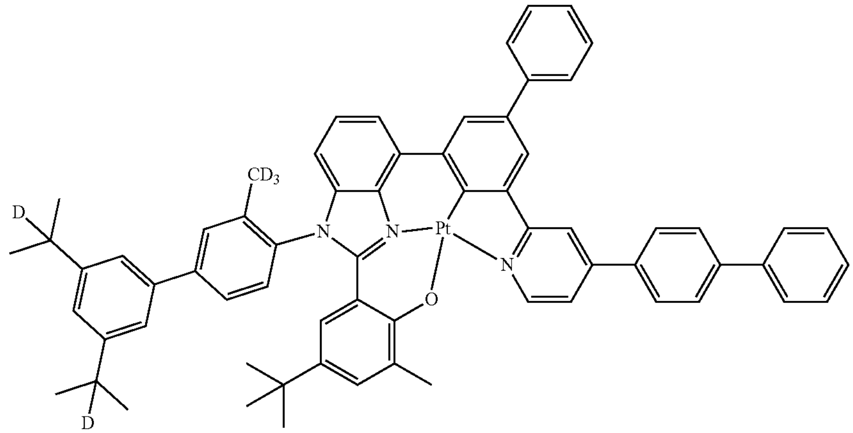
4-2409
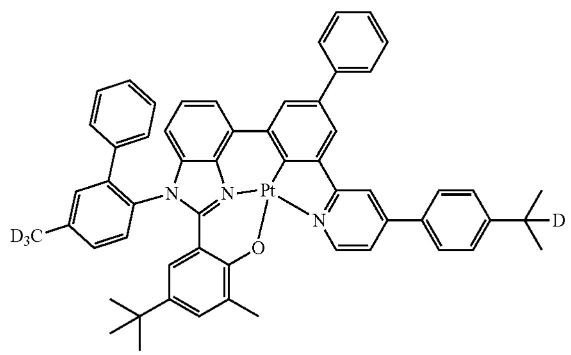
4-2410
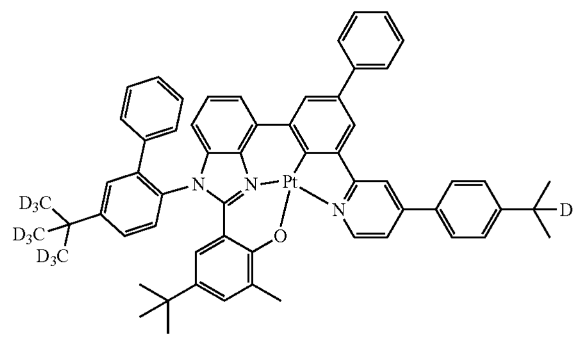
4-2411
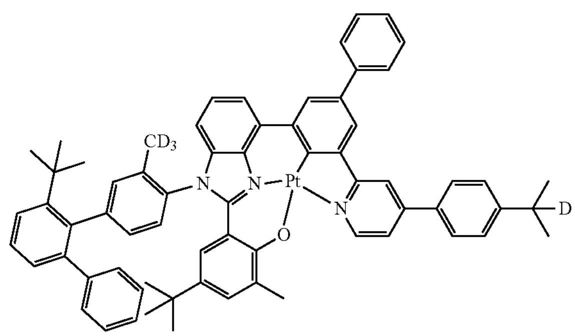
4-2412
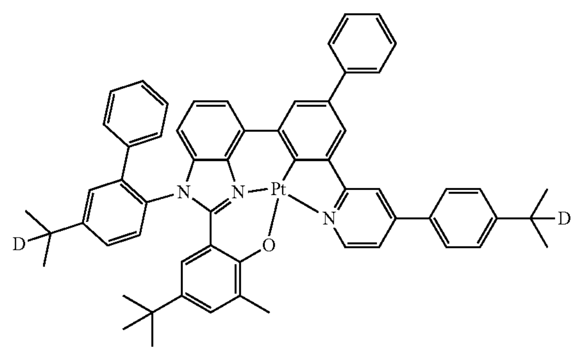
4-2413
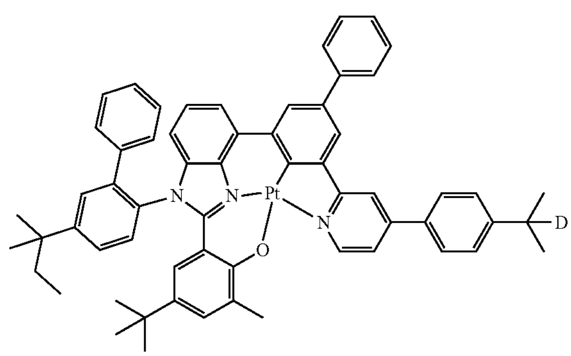
4-2414
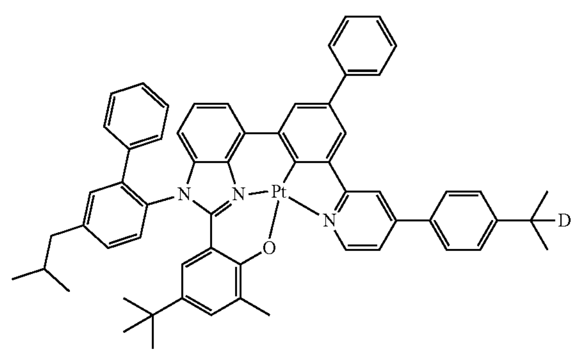

-continued
4-2415
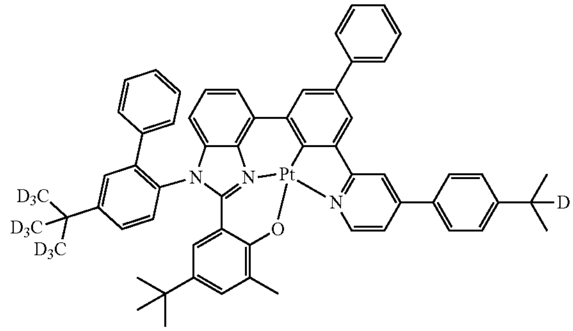
4-2416
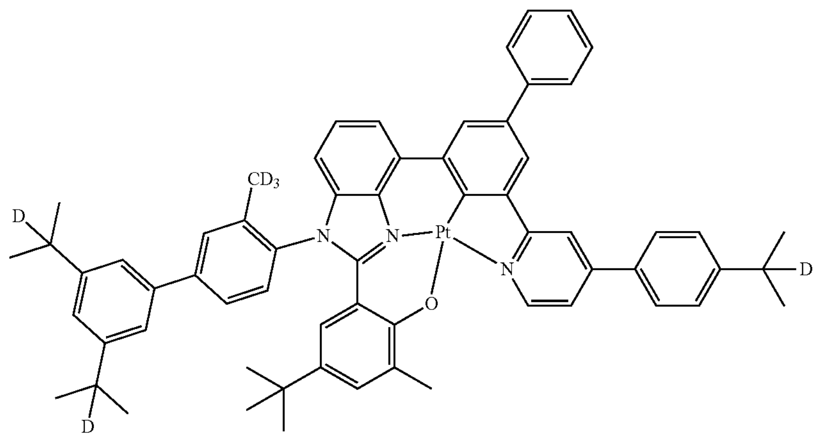
4-2417
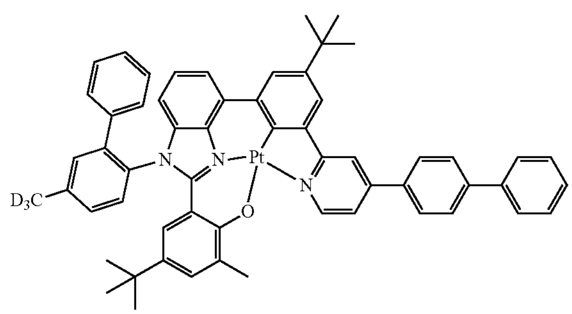
4-2418
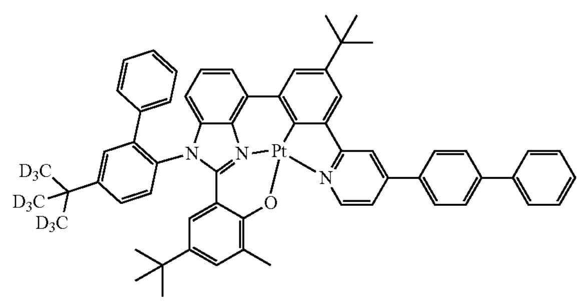
4-2419
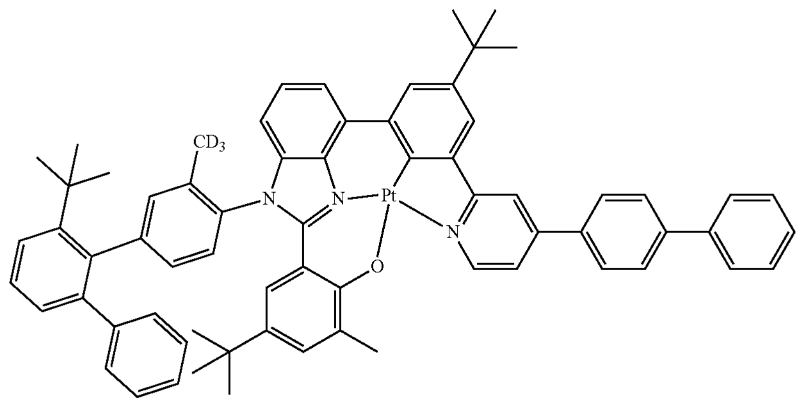

-continued
4-2420
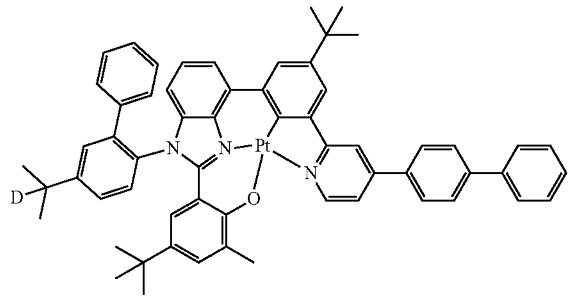
4-2421
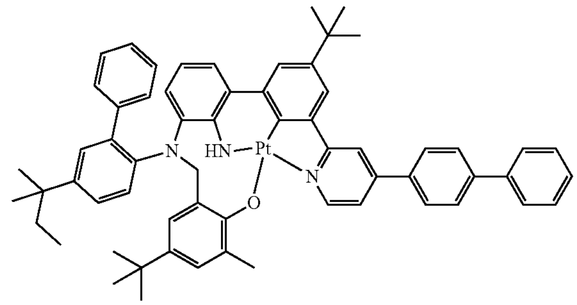
4-2422
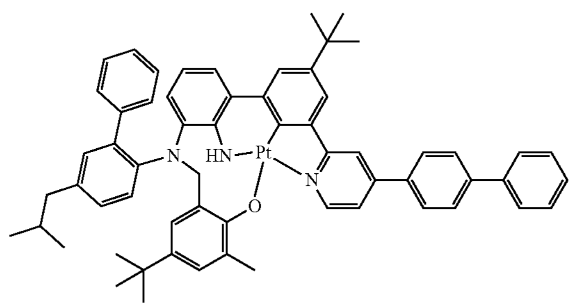
4-2423
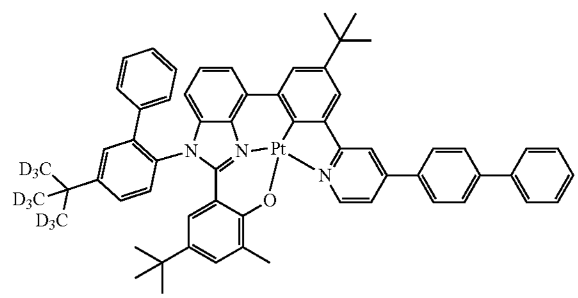
4-2424
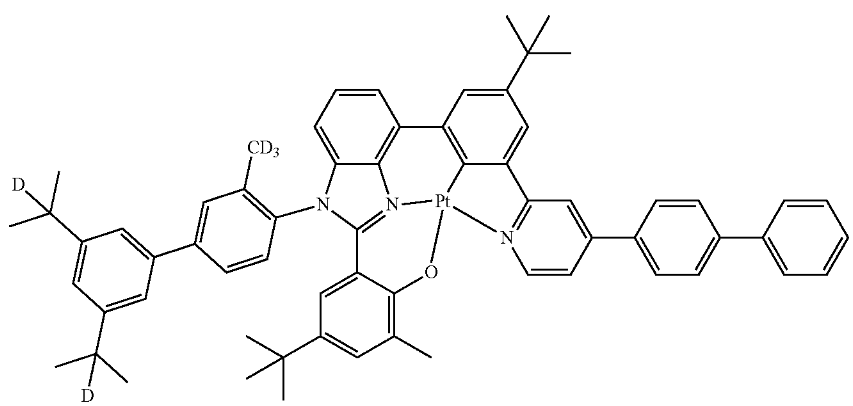
4-2425
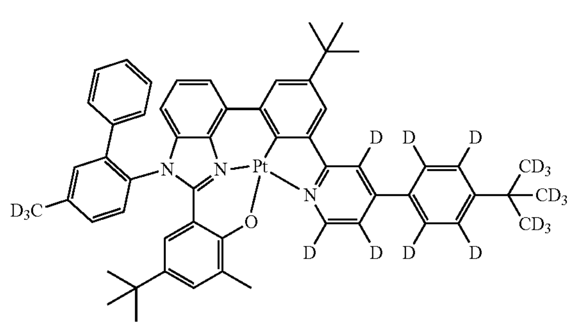
4-2426
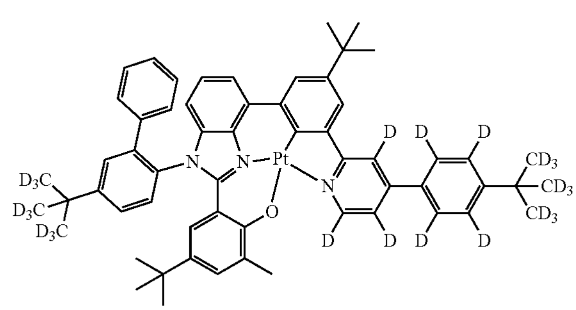

-continued
4-2427
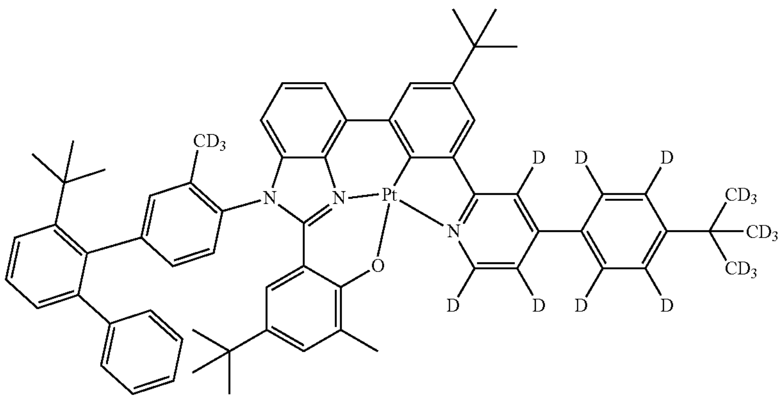
4-2428
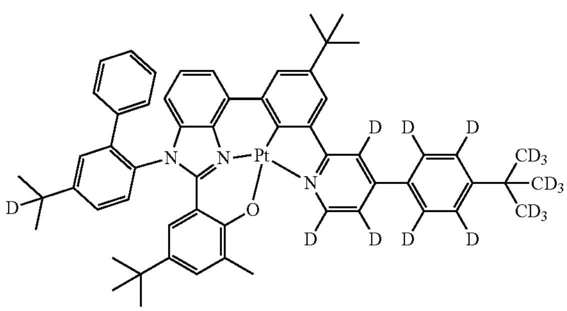
4-2429
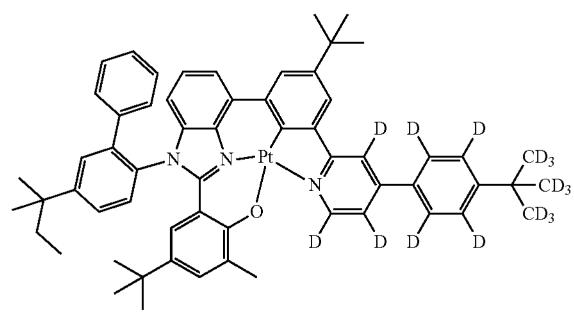
4-2430
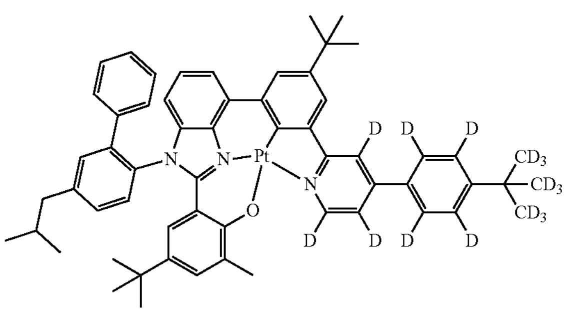
4-2431
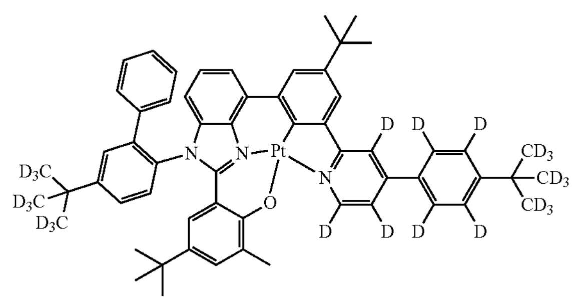
4-2432
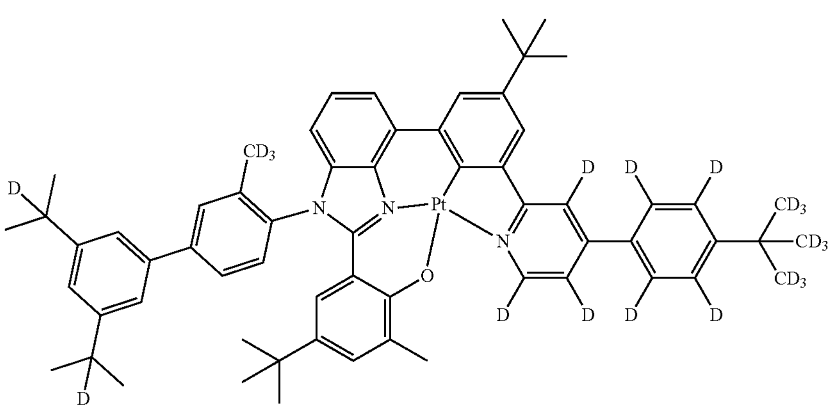

-continued
4-2433
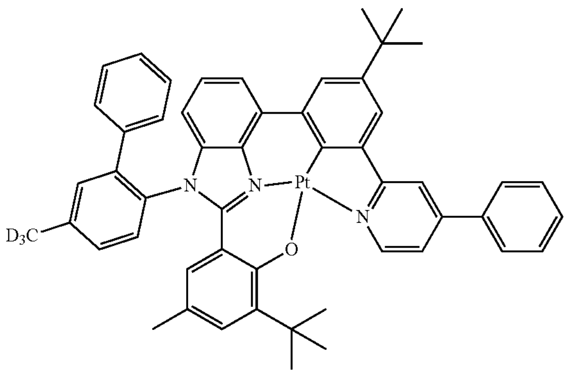
4-2434
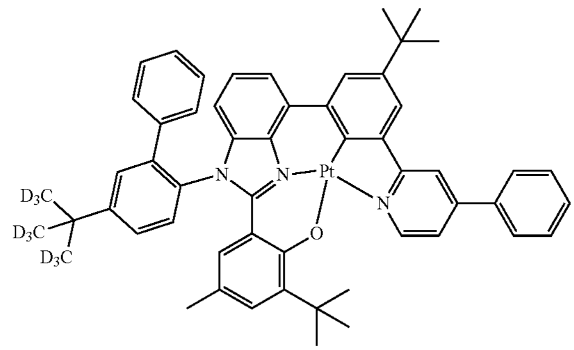
4-2435
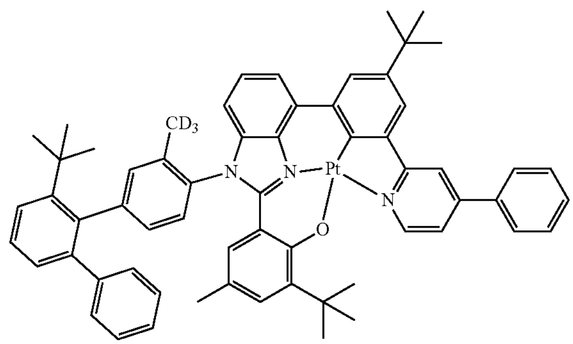
4-2436
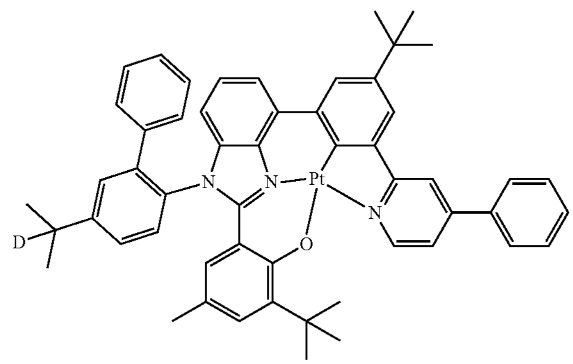
4-2437
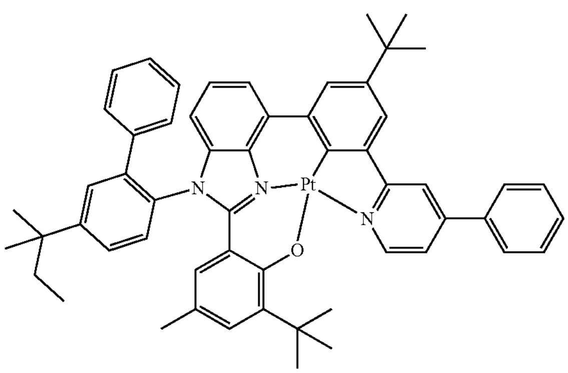
4-2438
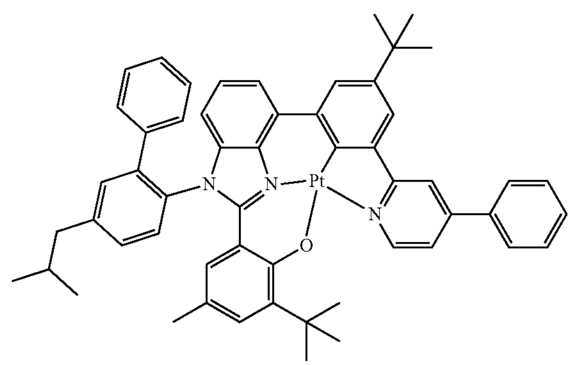
4-2439
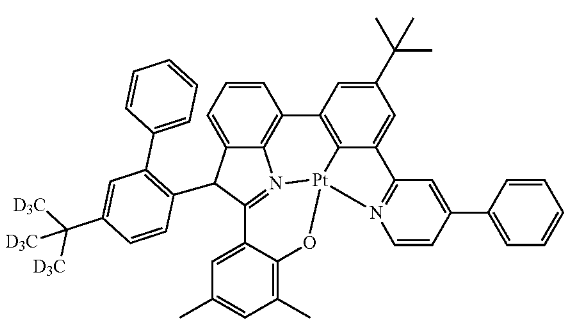
4-2440
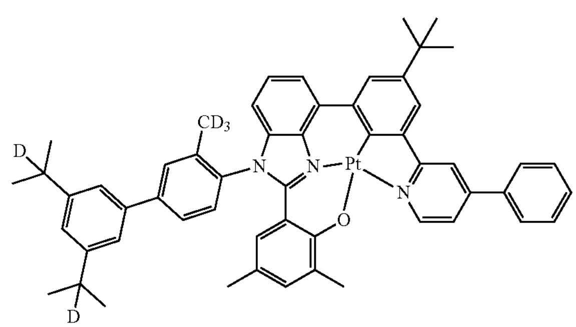

-continued
4-2441
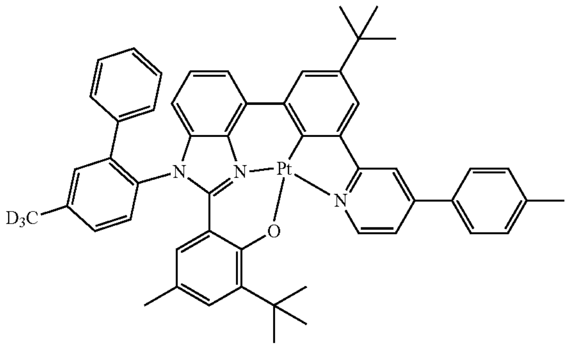
4-2442
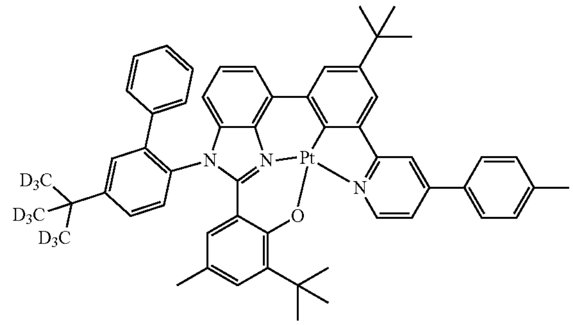
4-2443
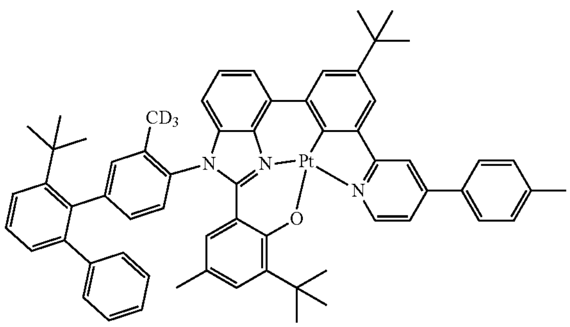
4-2444
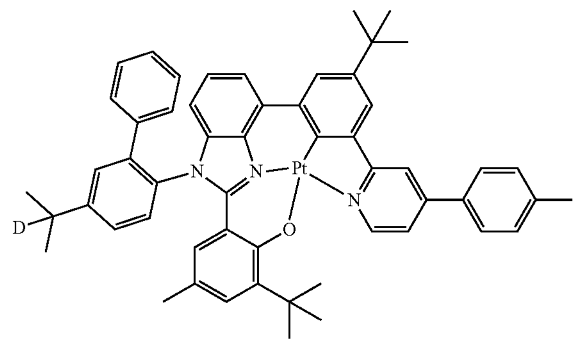
4-2445
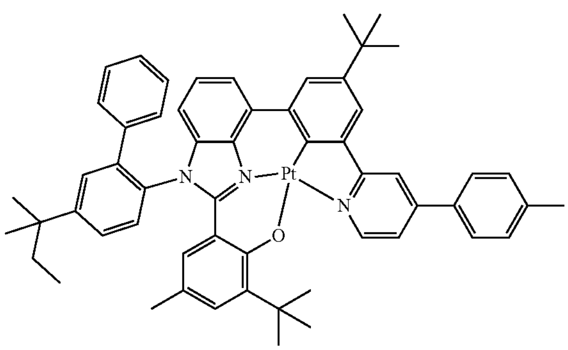
4-2446
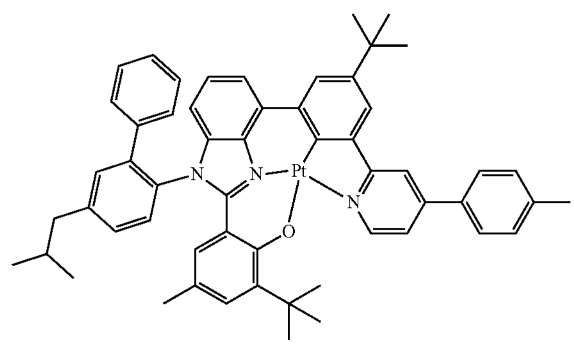
4-2447
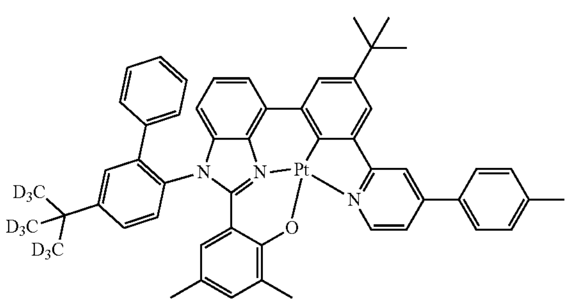
4-2448
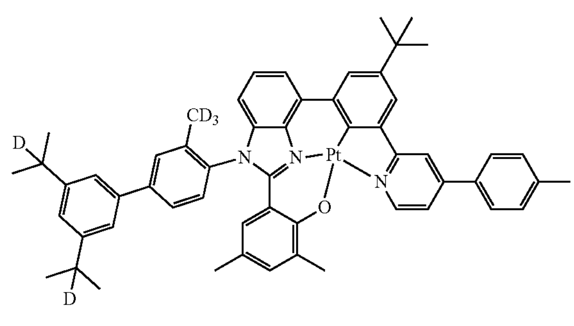

-continued
4-2449
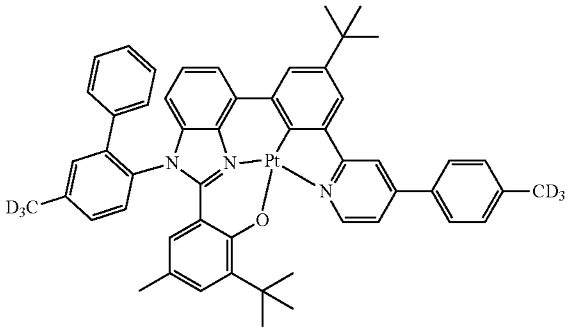
4-2450
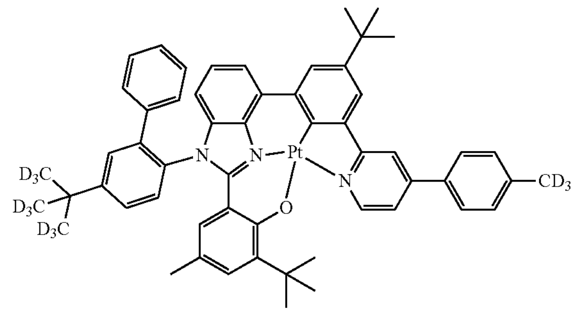
4-2451
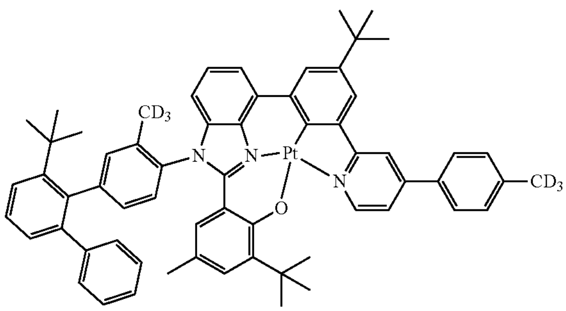
4-2452
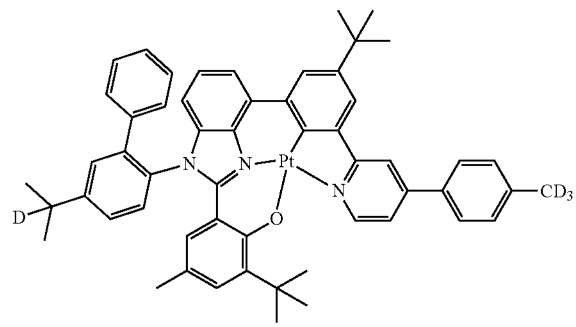
4-2453
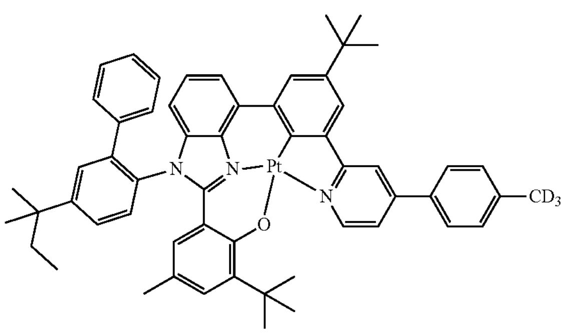
4-2454
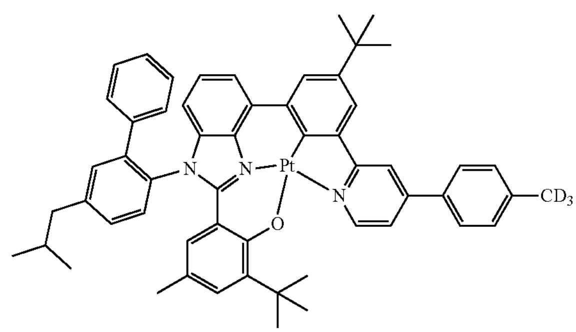
4-2455
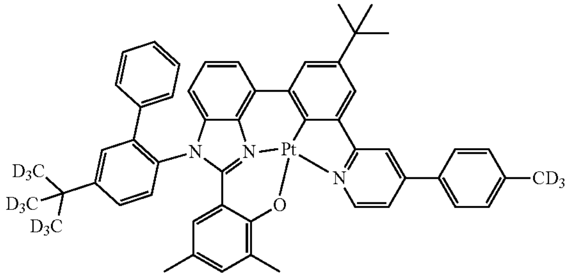

-continued
4-2456
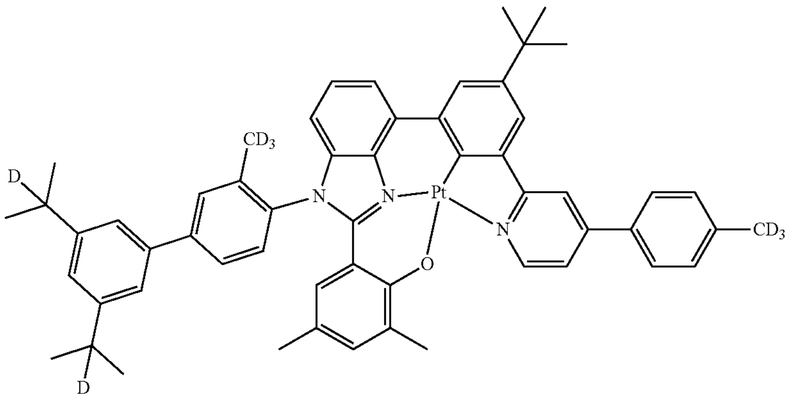
4-2457
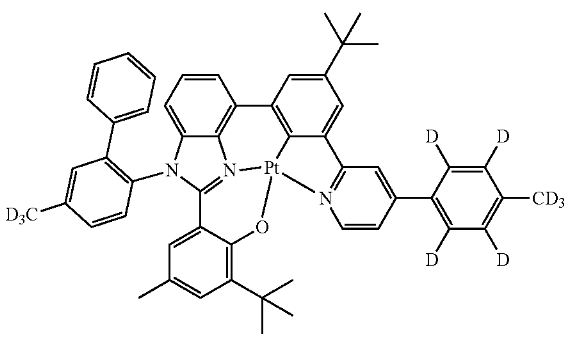
4-2458
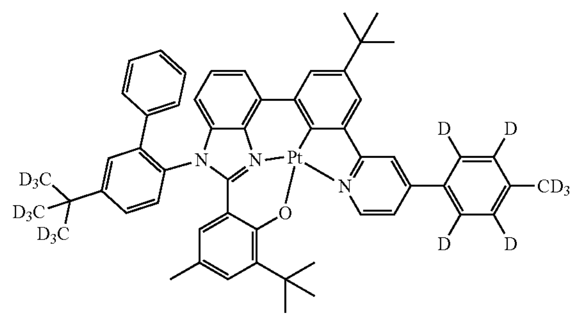
4-2459
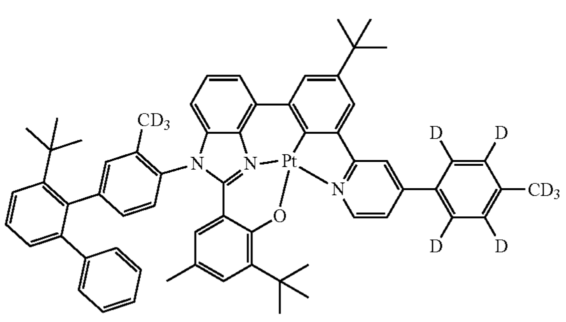
4-2460
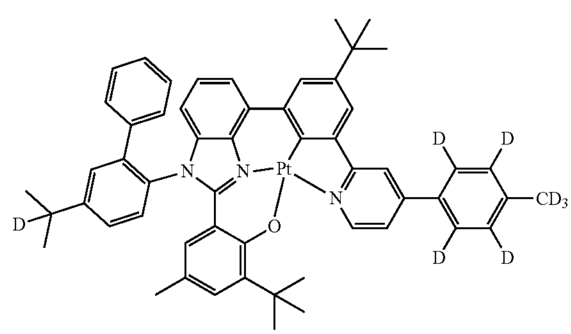
4-2461
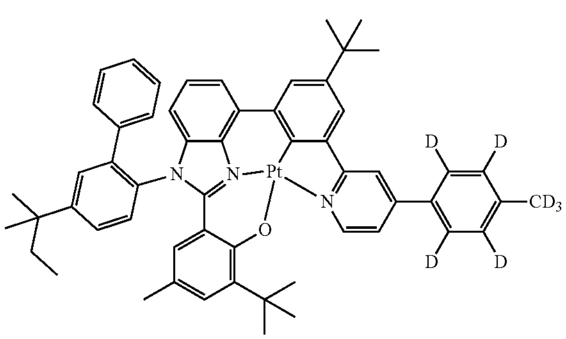
4-2462
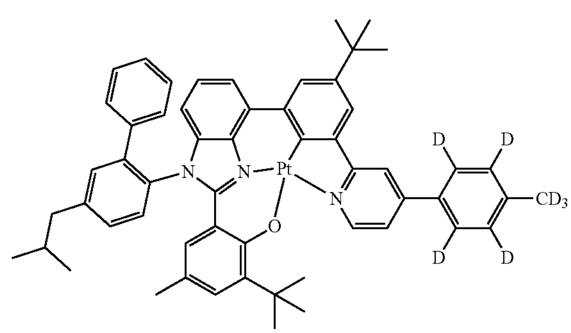

-continued
4-2463
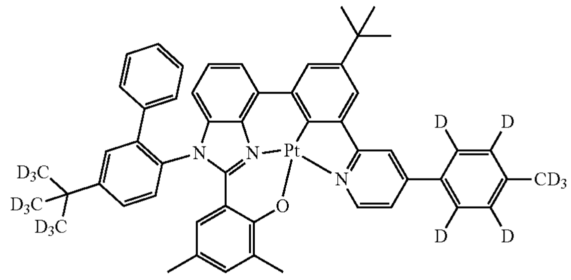
4-2464
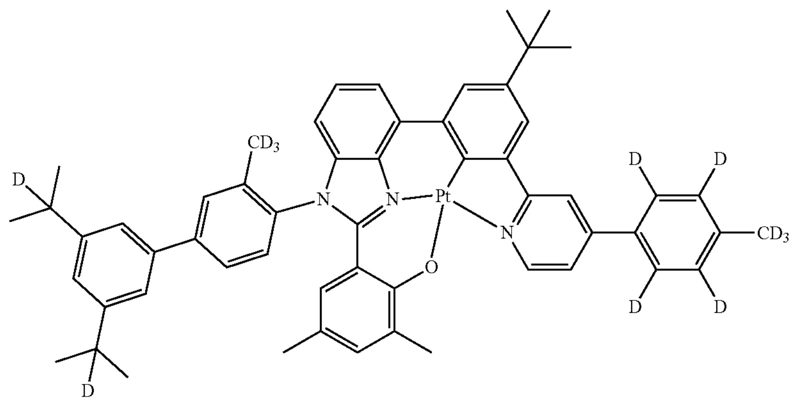
4-2465
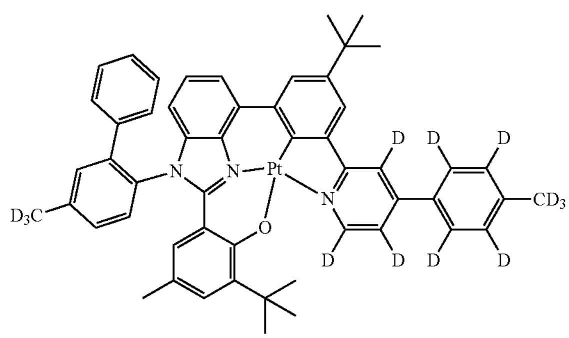
4-2466
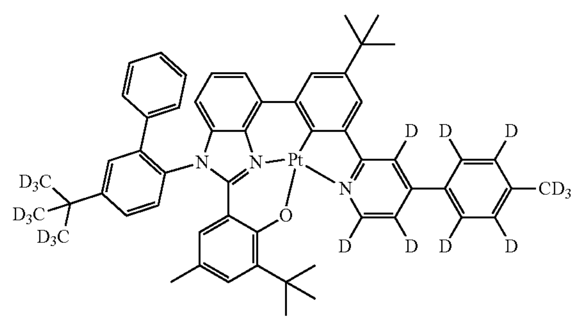
4-2467
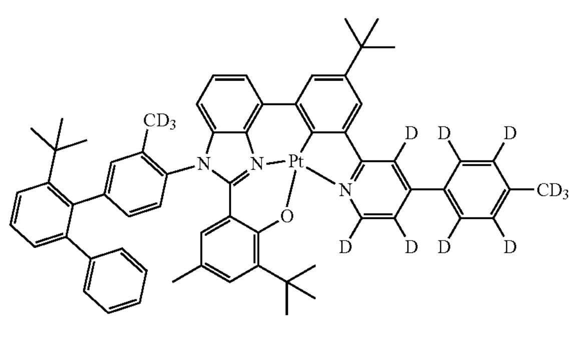
4-2468
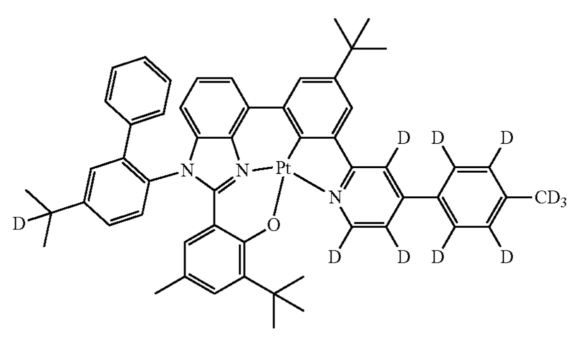

-continued
4-2469
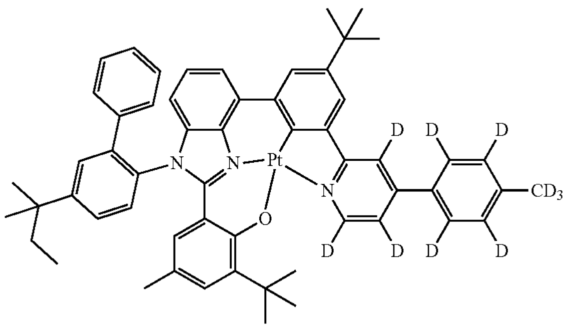
4-2470
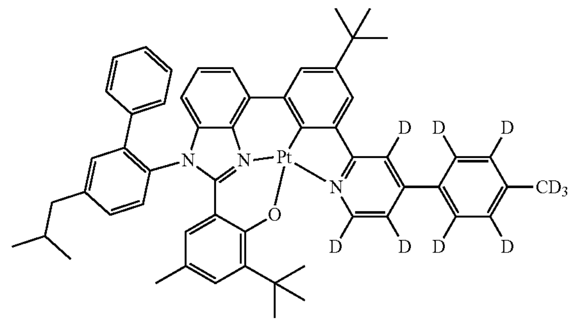
4-2471
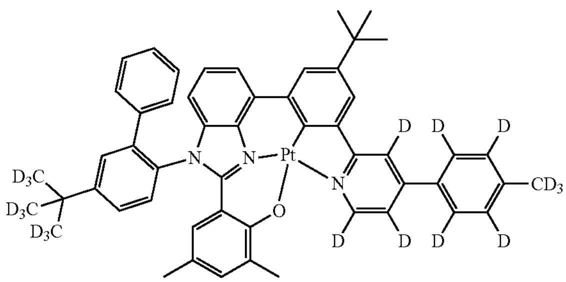
4-2472
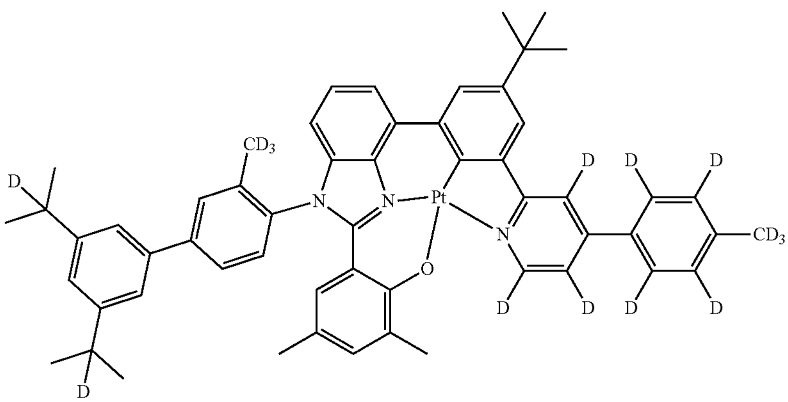
4-2473
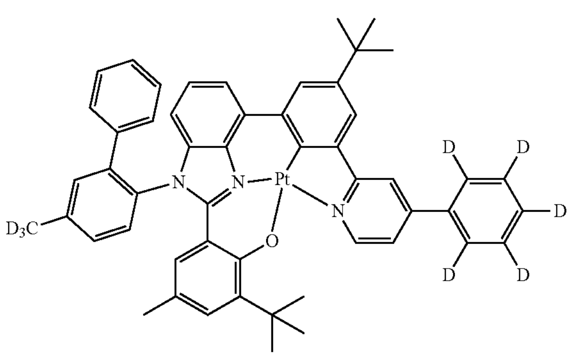
4-2474
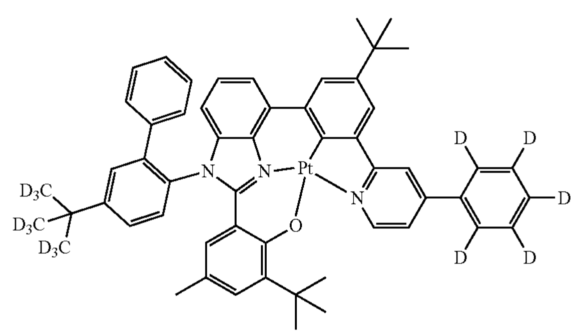

-continued
4-2475
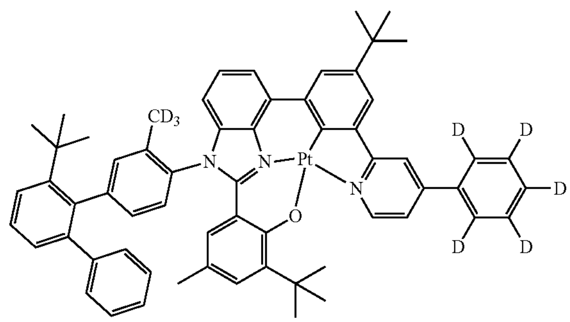
4-2476
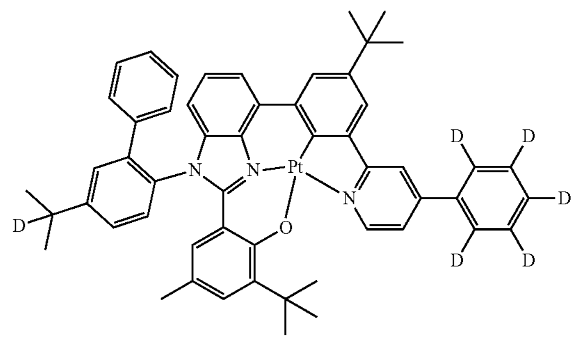
4-2477
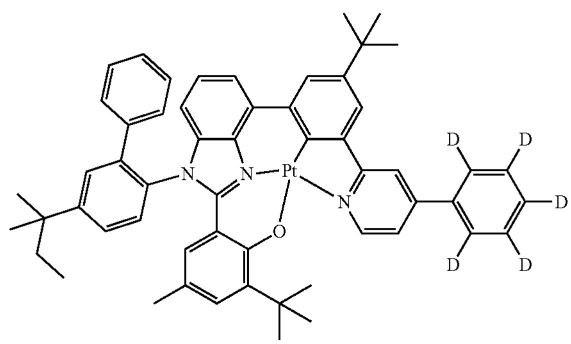
4-2478
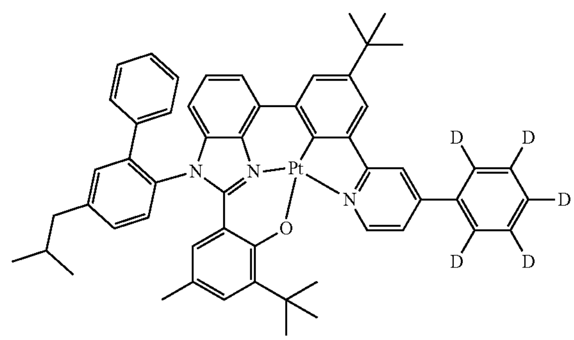
4-2479
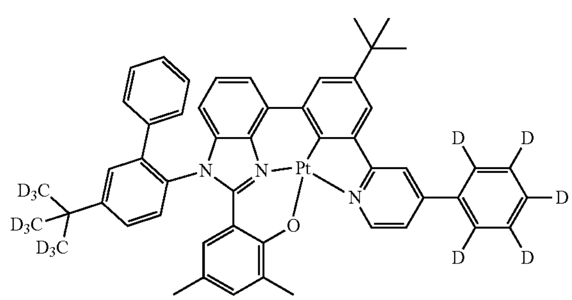
4-2480
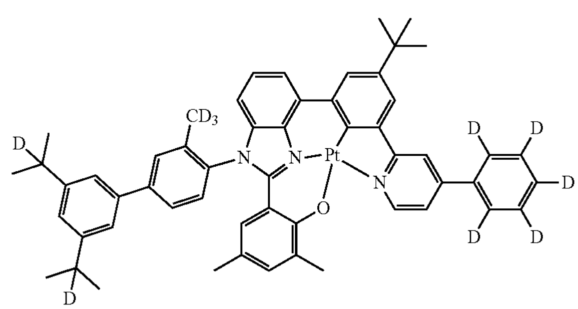
4-2481
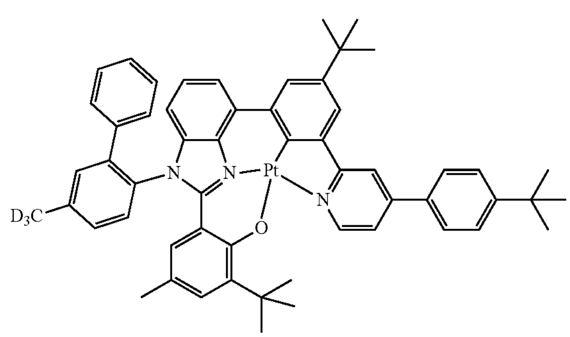
4-2482
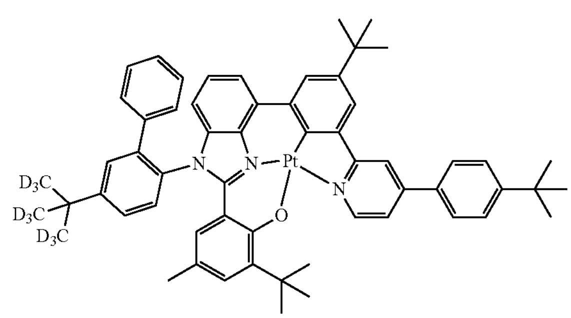

-continued
4-2483
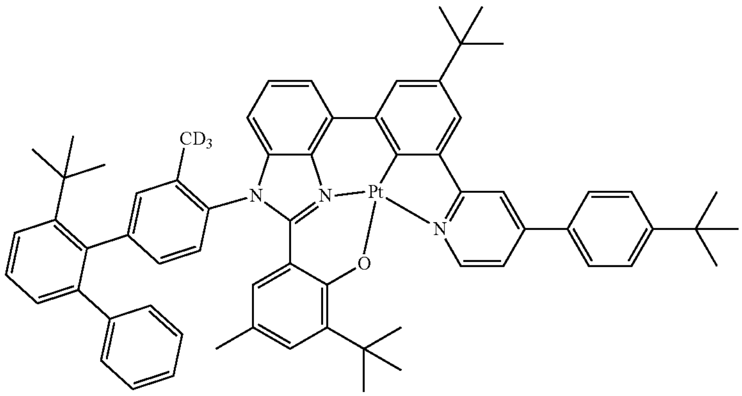
4-2484
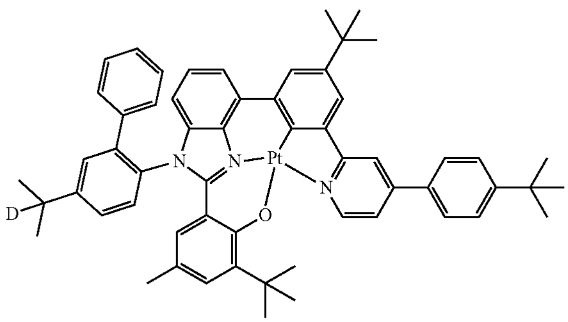
4-2485
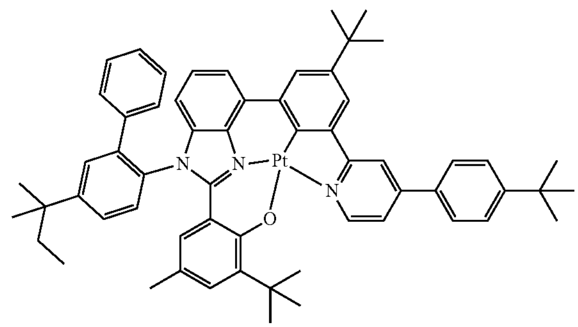
4-2486
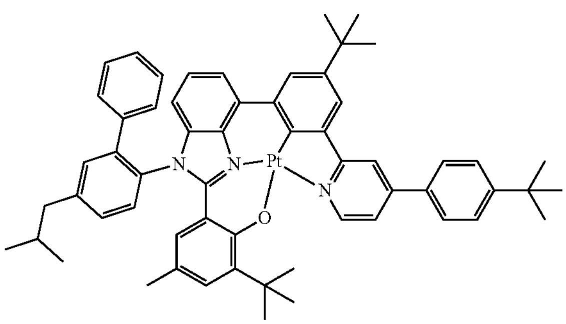
4-2487
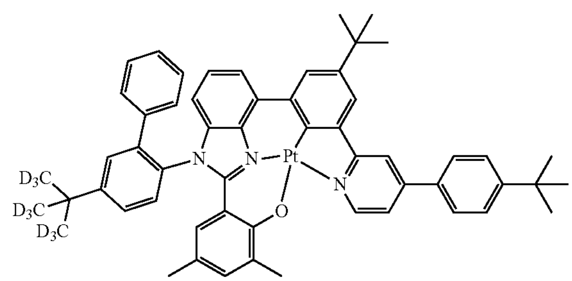
4-2488
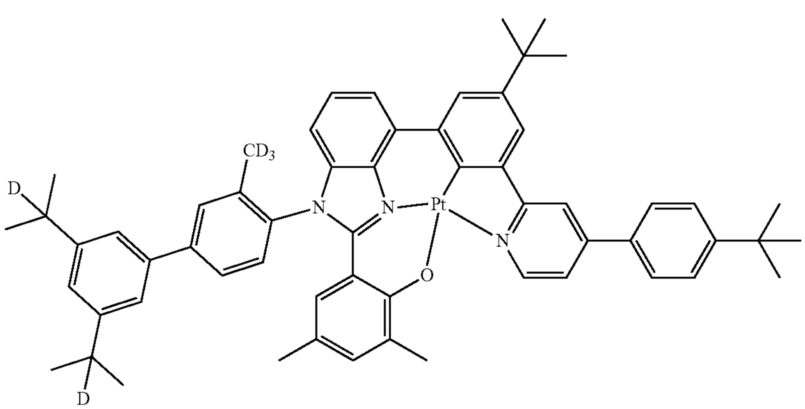

-continued
4-2489
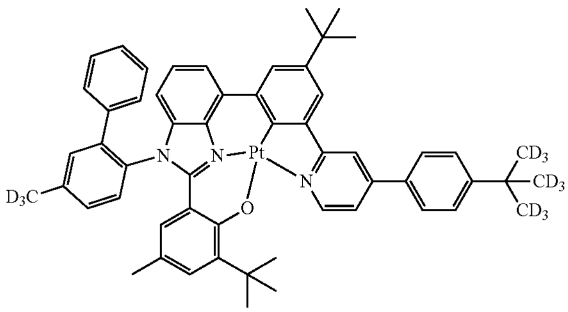
4-2490
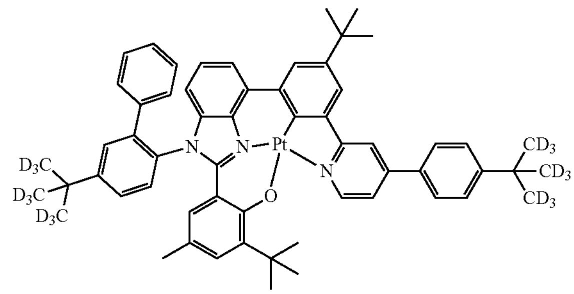
4-2491
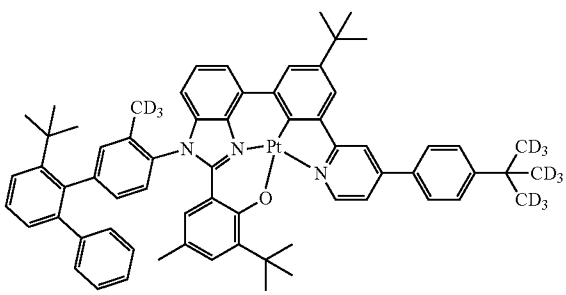
4-2492
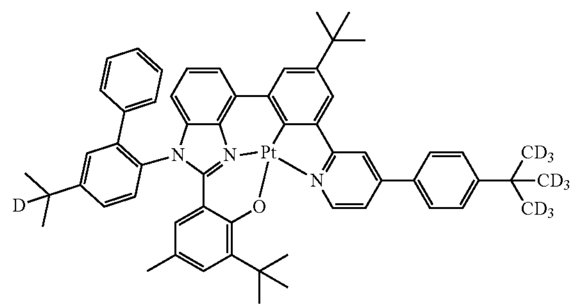
4-2493
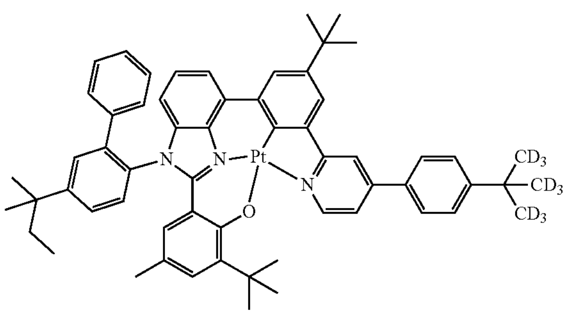
4-2494
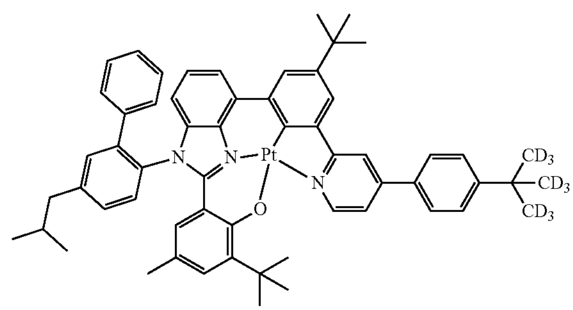
4-2495
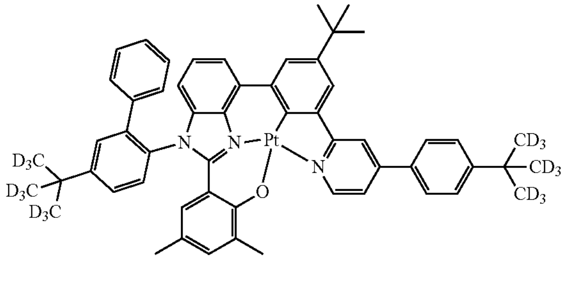

-continued
4-2496
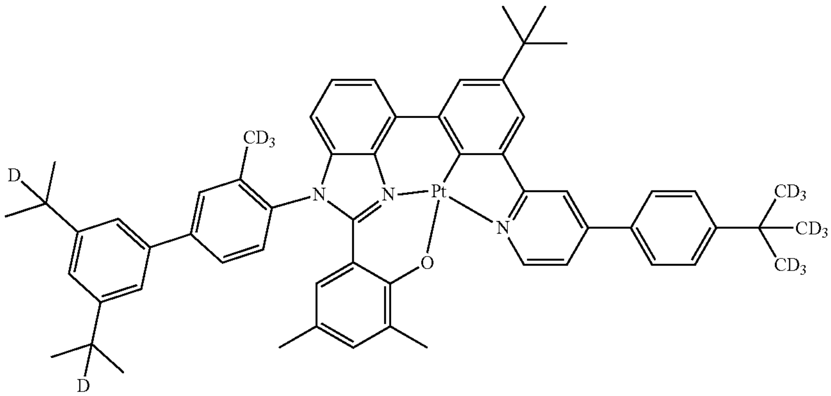
4-2497
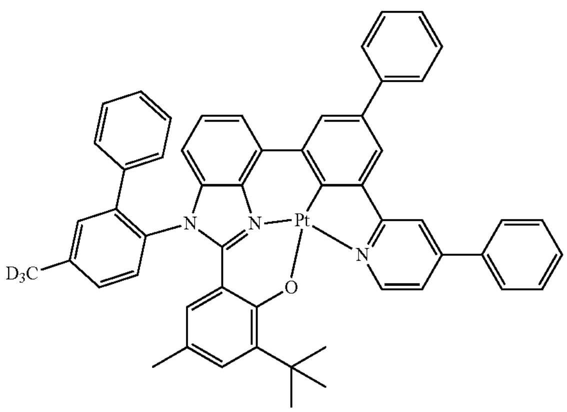
4-2498
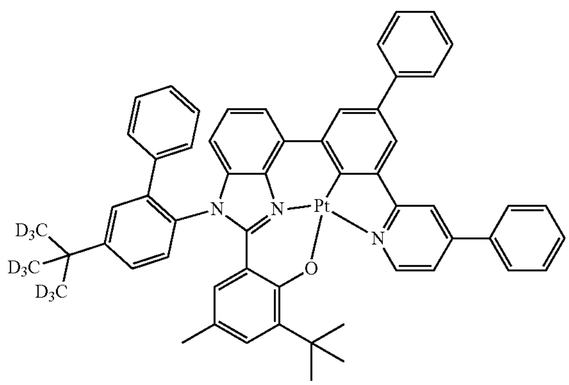
4-2499
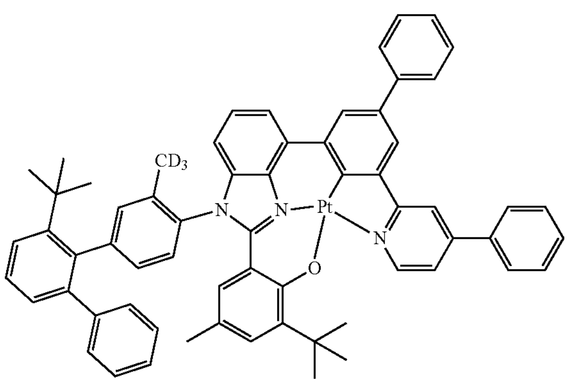
4-2500
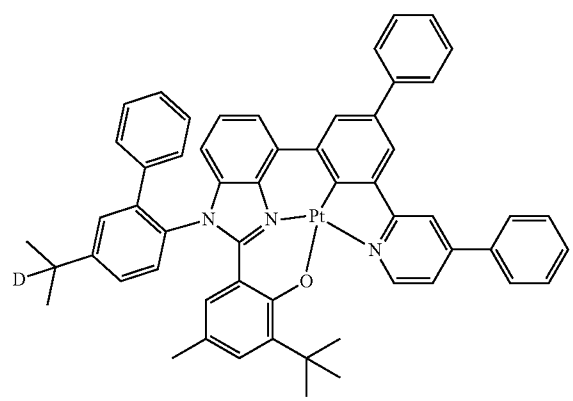
4-2501
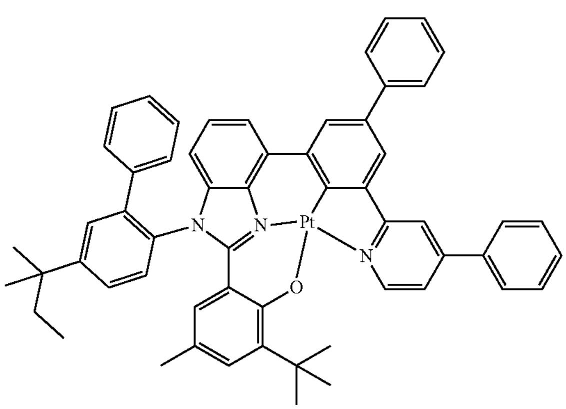
4-2502
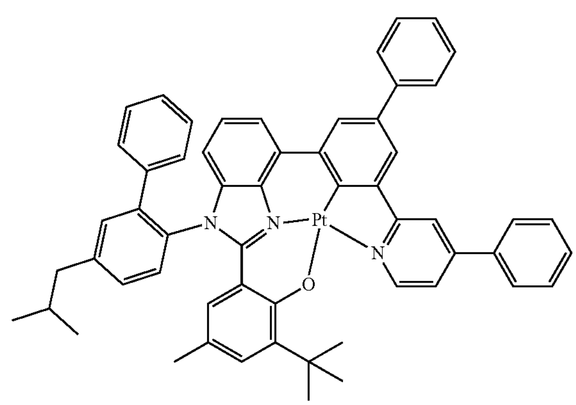

-continued
4-2503
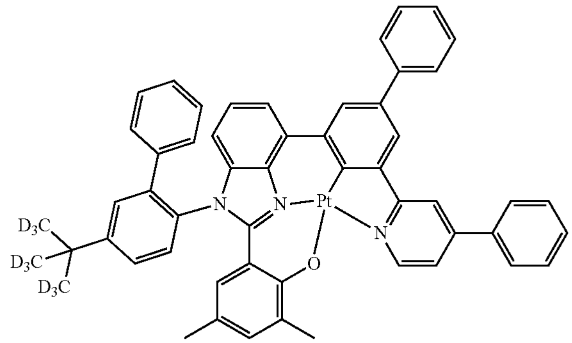
4-2504
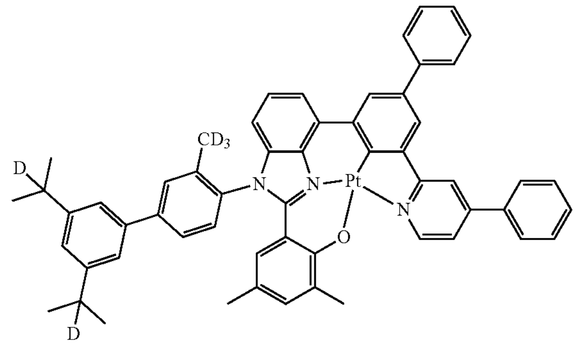
4-2505
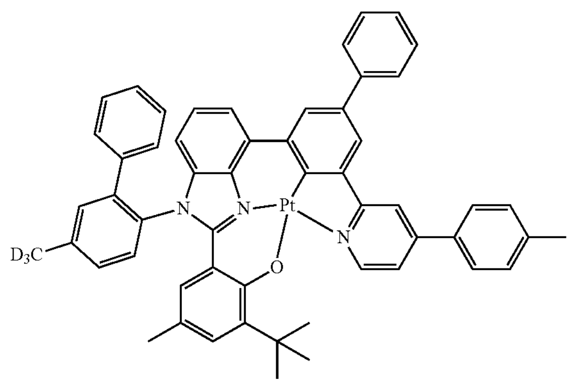
4-2506
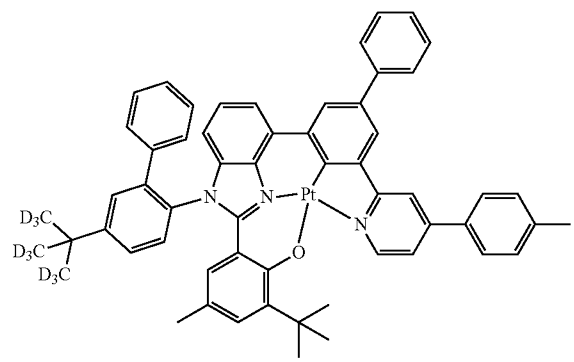
4-2507
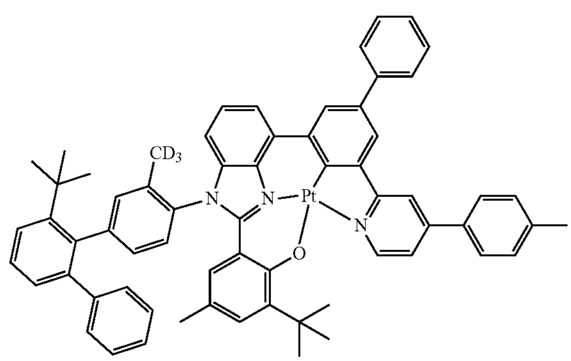
4-2508
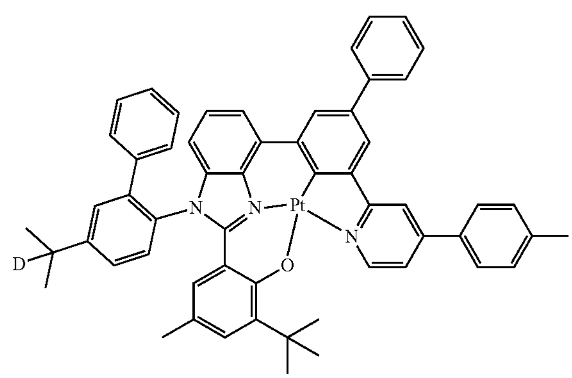
4-2509
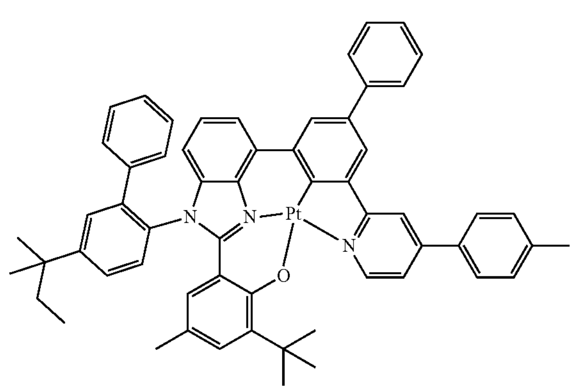
4-2510
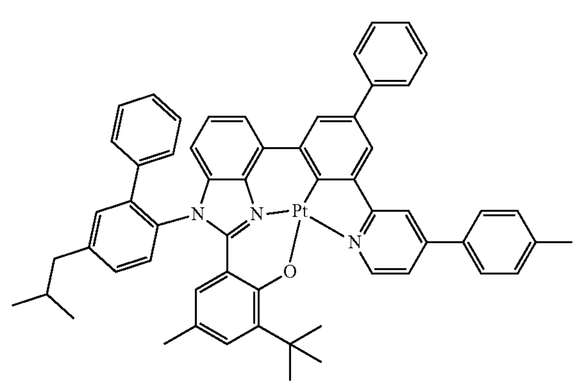

-continued
4-2511
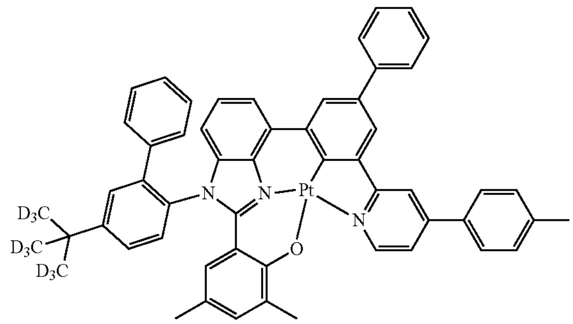
4-2512
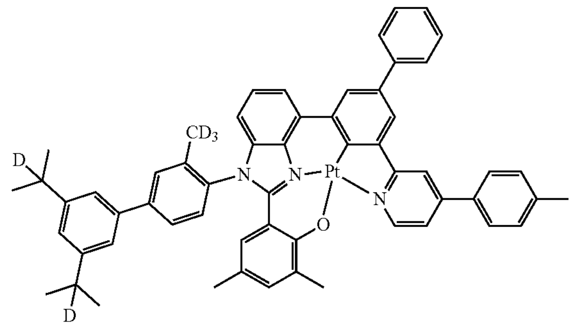
4-2513
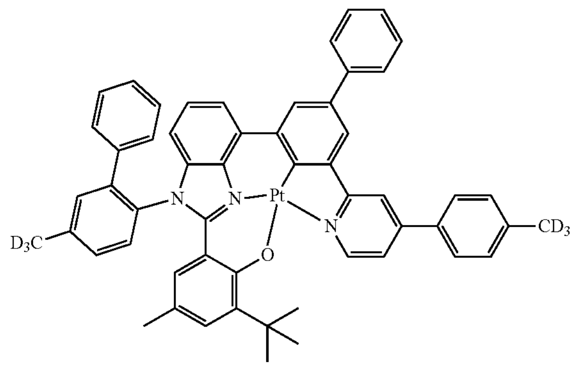
4-2514
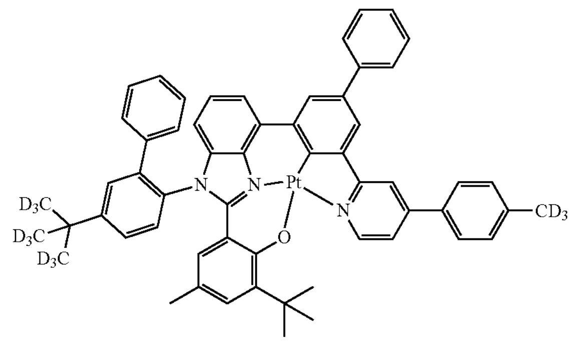
4-2515
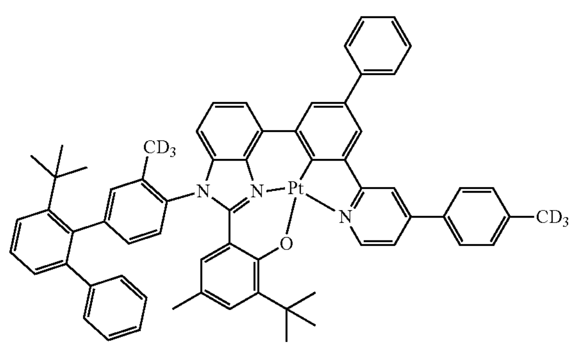
4-2516
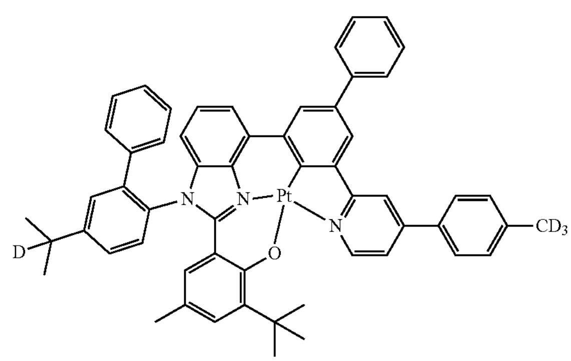
4-2517
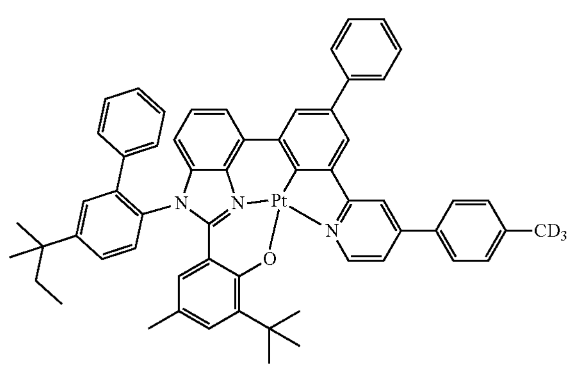
4-2518
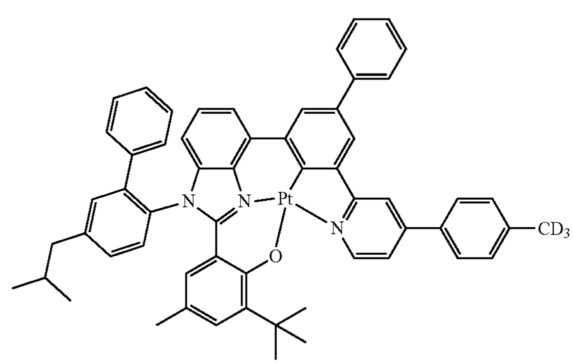

-continued
4-2519
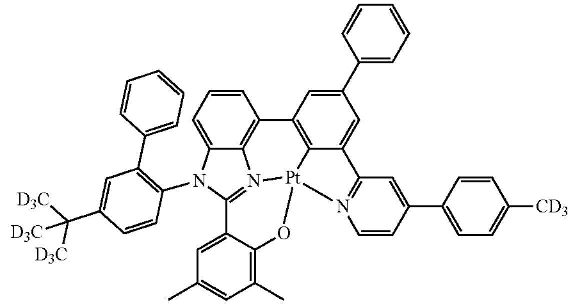
4-2520
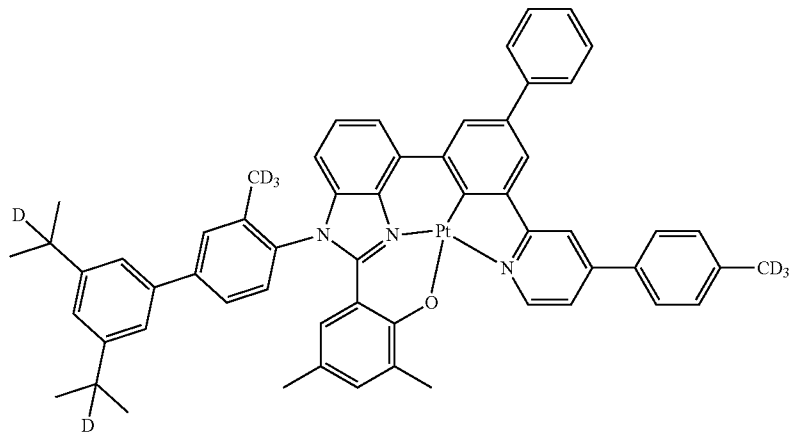
4-2521
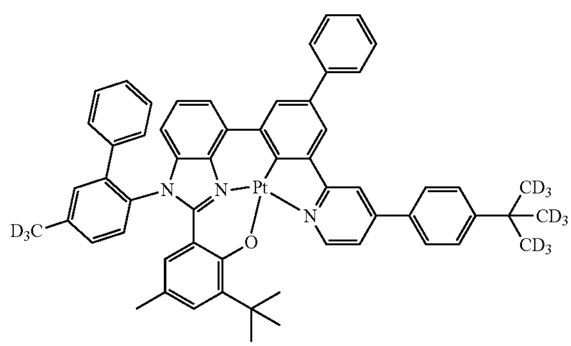
4-2522
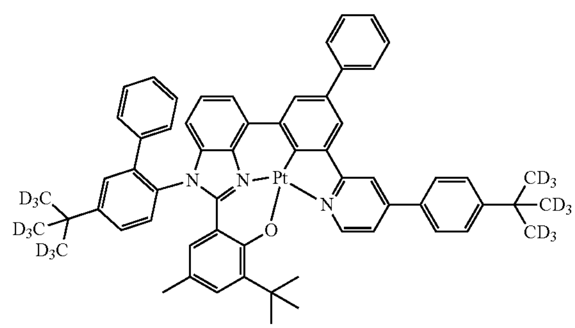
4-2523
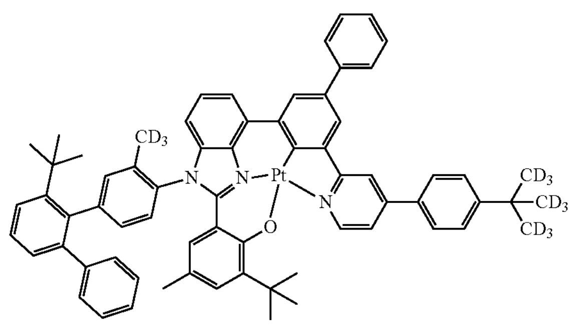
4-2524
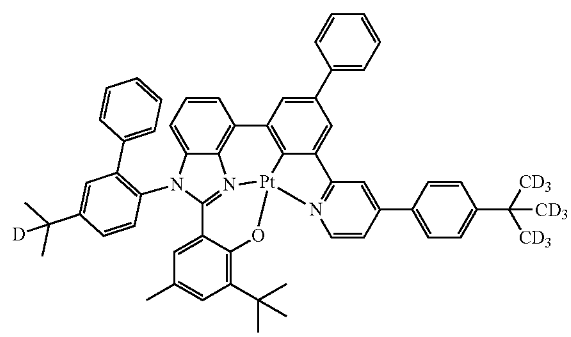

-continued
4-2525
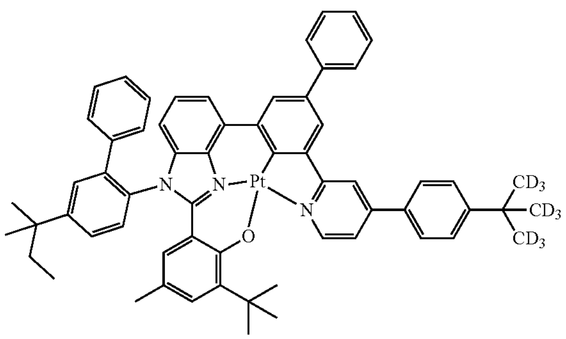
4-2526
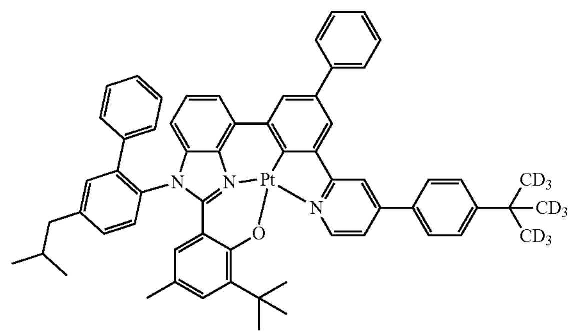
4-2527
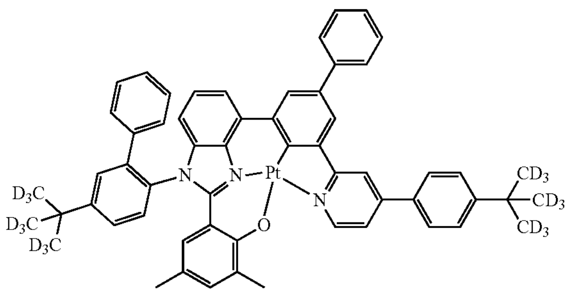
4-2528
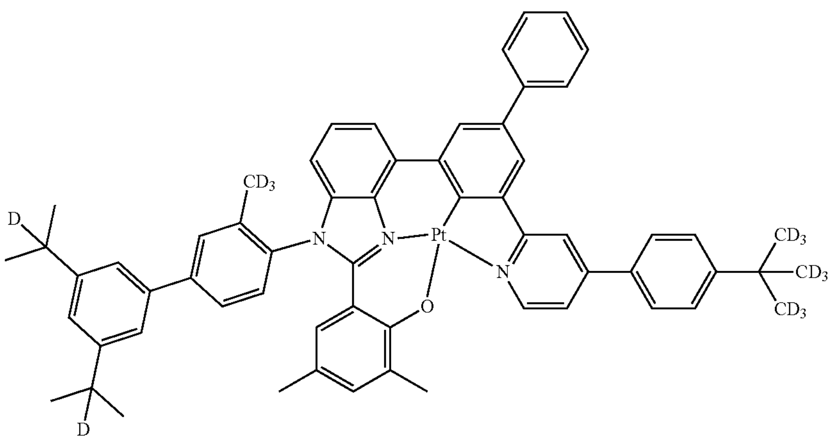
4-2529
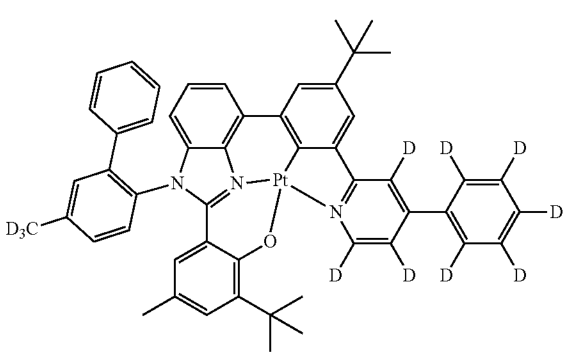
4-2530
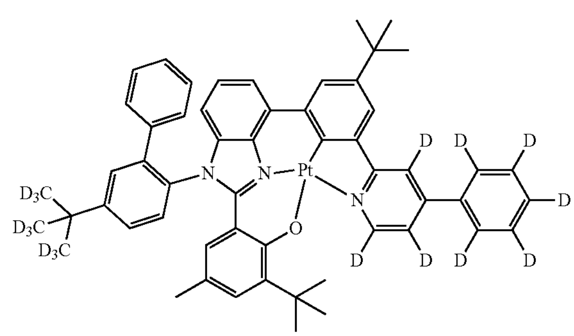

-continued
4-2531
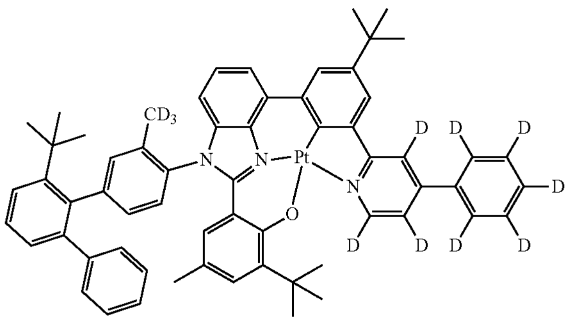
4-2532
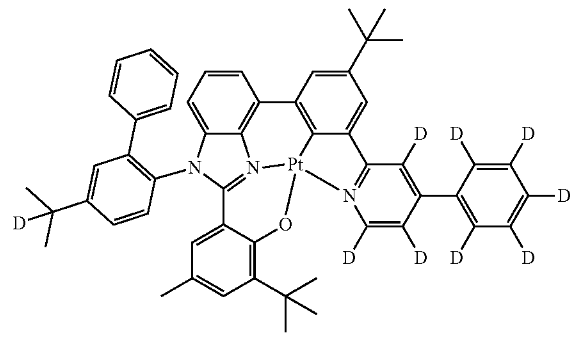
4-2533
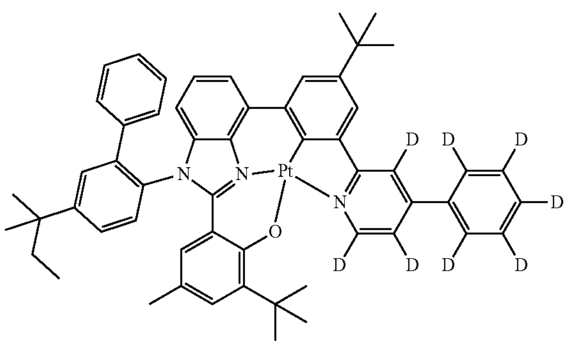
4-2534
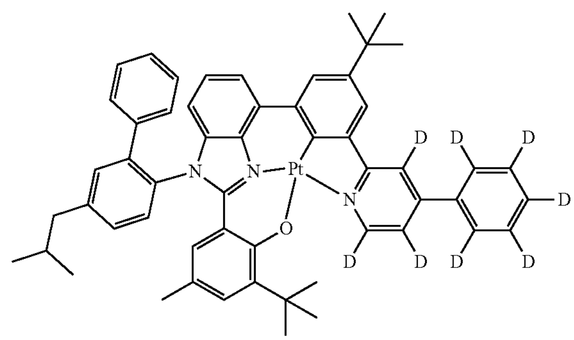
4-2535
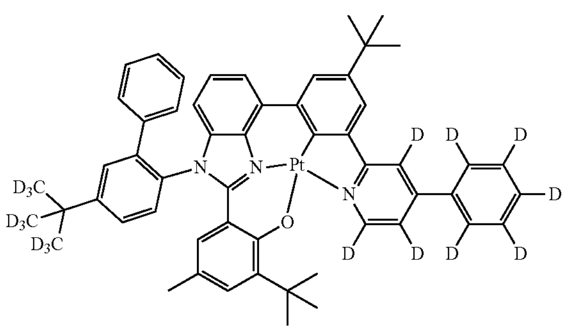
4-2536
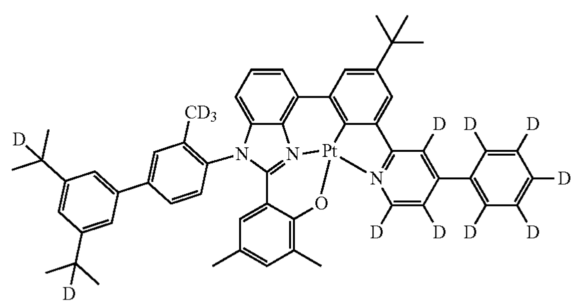
4-2537
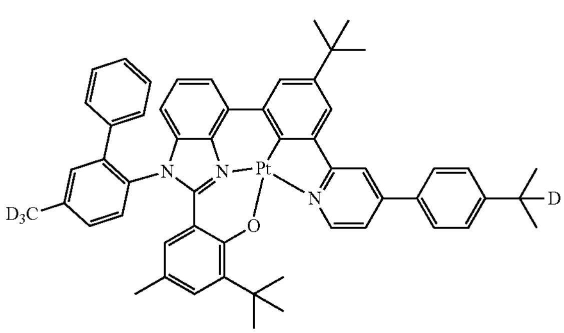
4-2538
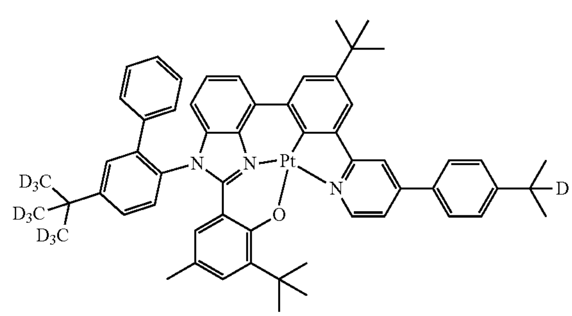

-continued
4-2539
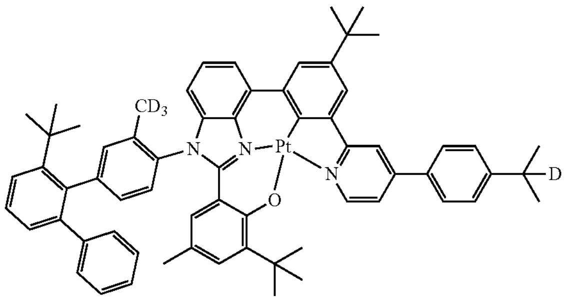
4-2540
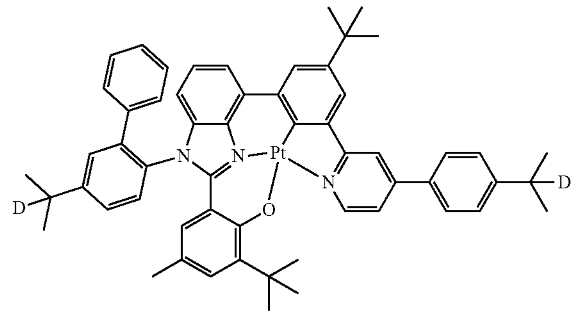
4-2541
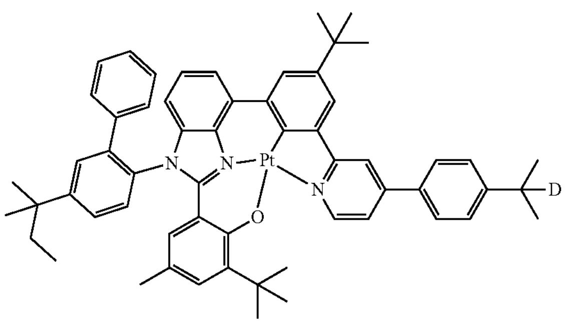
4-2542
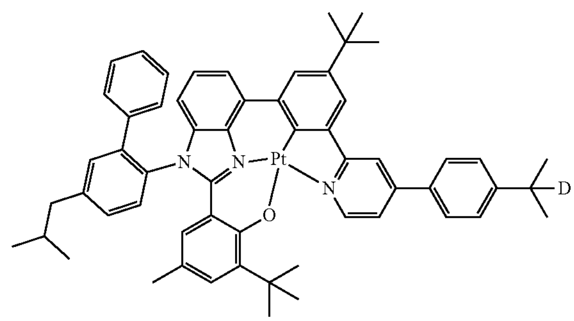
4-2543
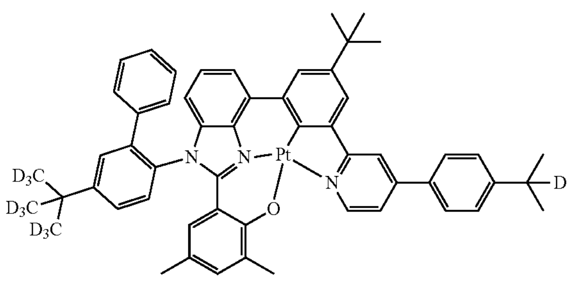
4-2544
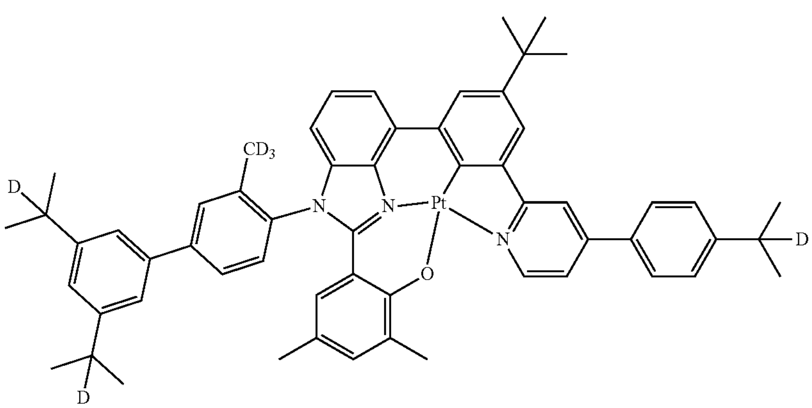

-continued
4-2545
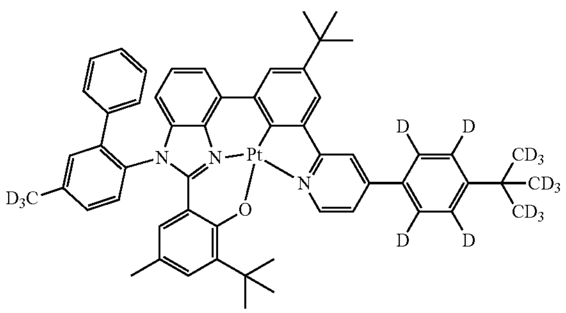
4-2546
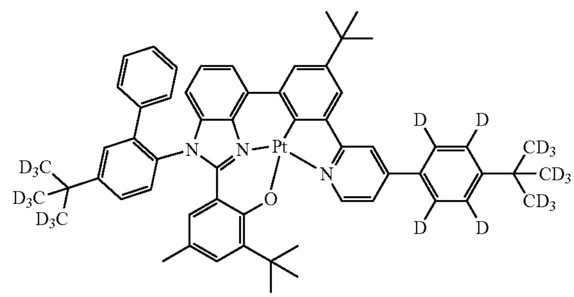
4-2547
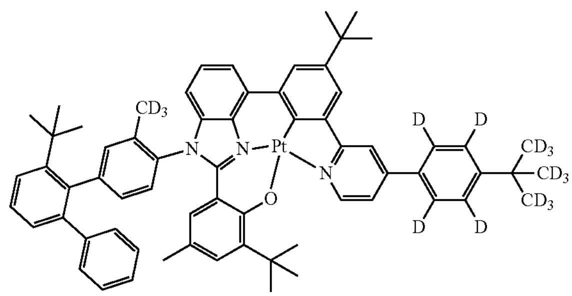
4-2548
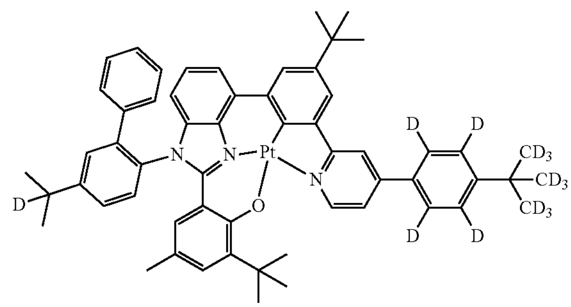
4-2549
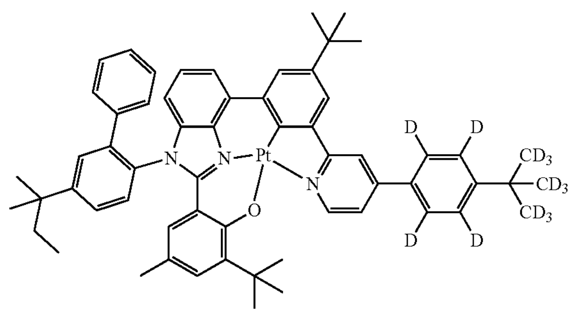
4-2550
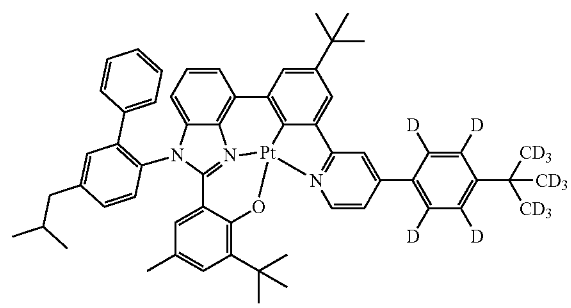
4-2551
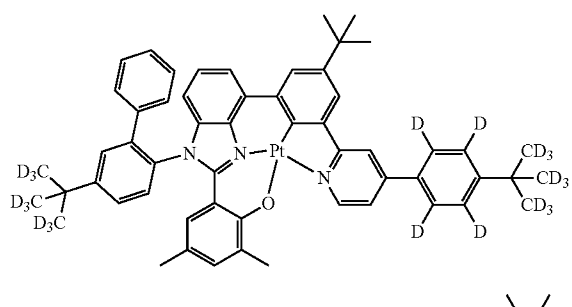
4-2552
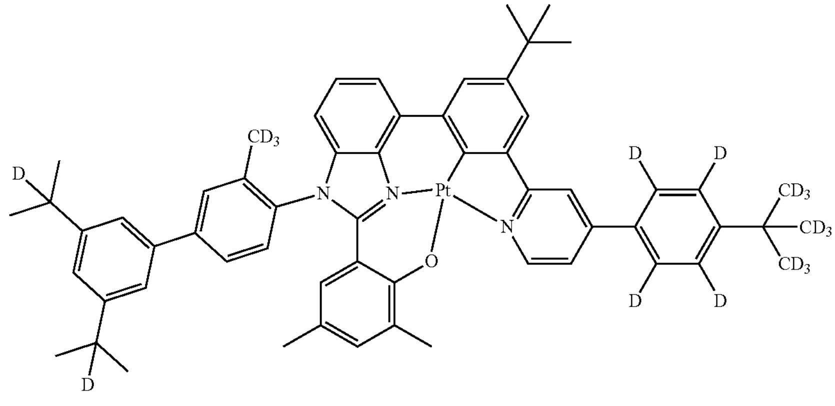

-continued
4-2553
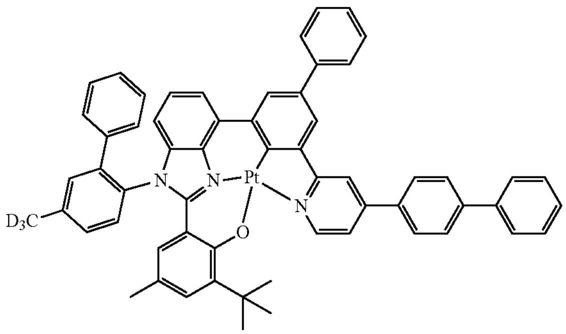
4-2554
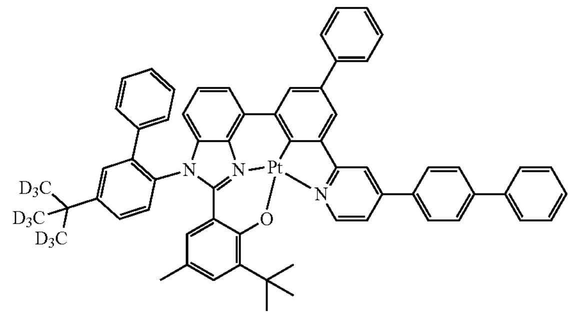
4-2555
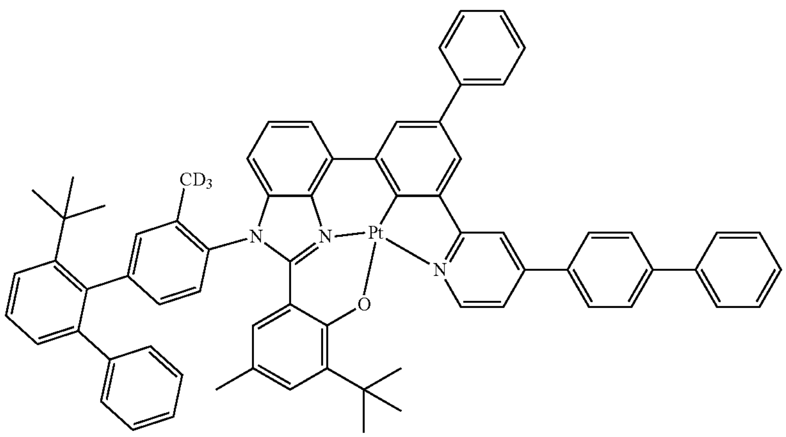
4-2556
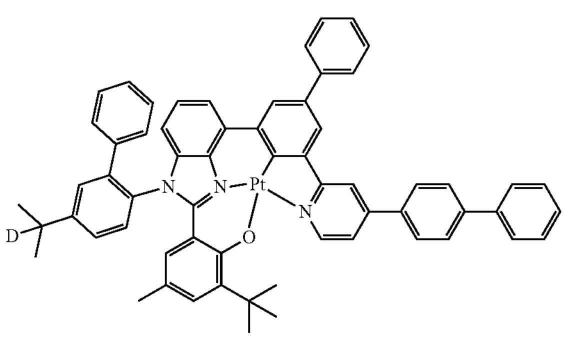
4-2557
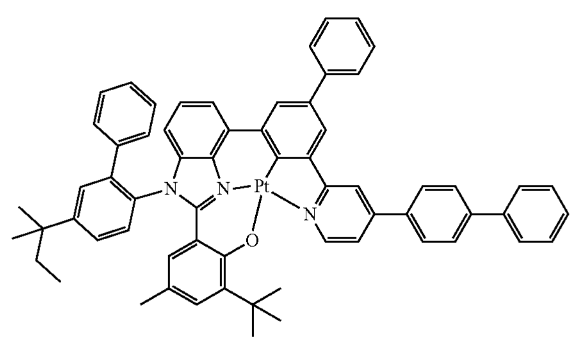
4-2558
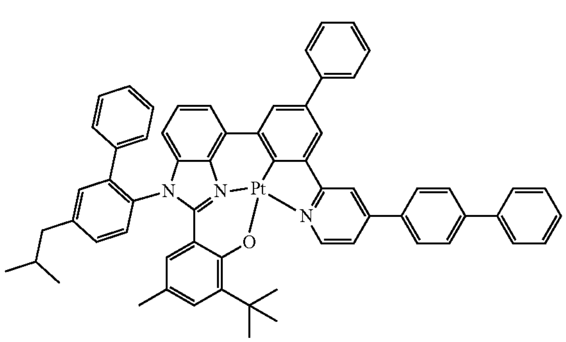
4-2559
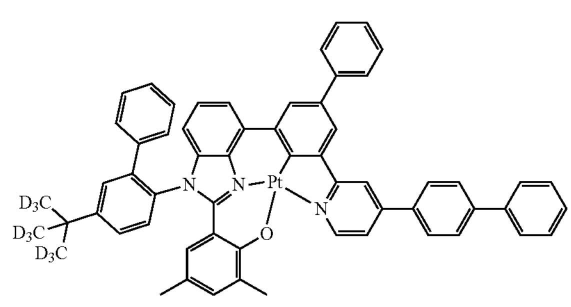

-continued
4-2560
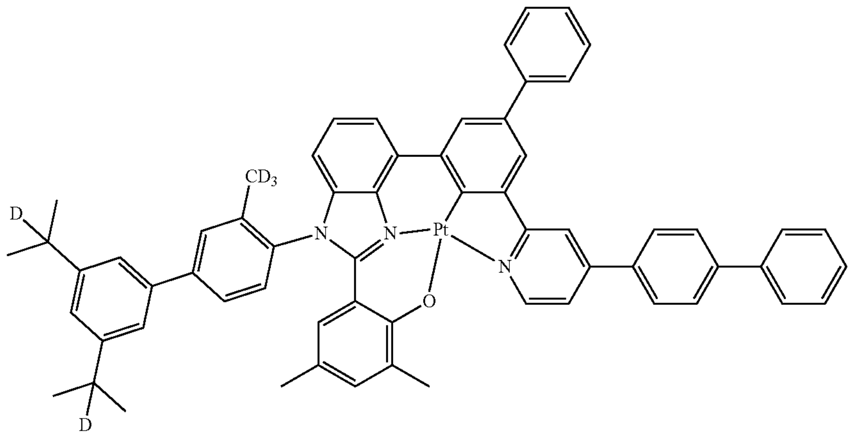
4-2561
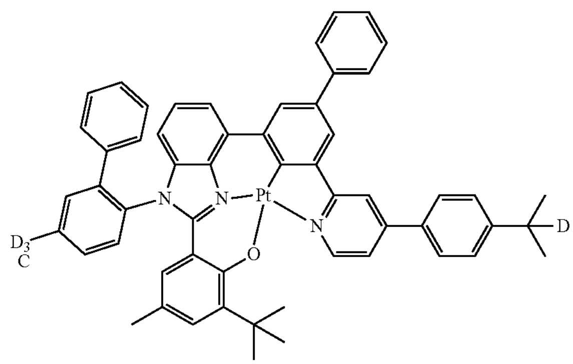
4-2562
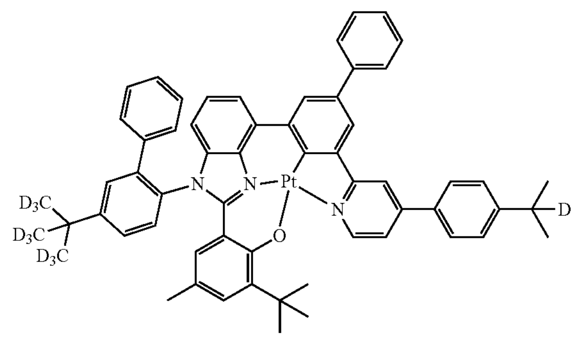
4-2563
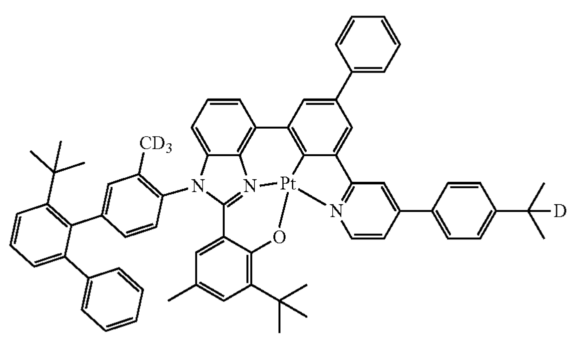
4-2564
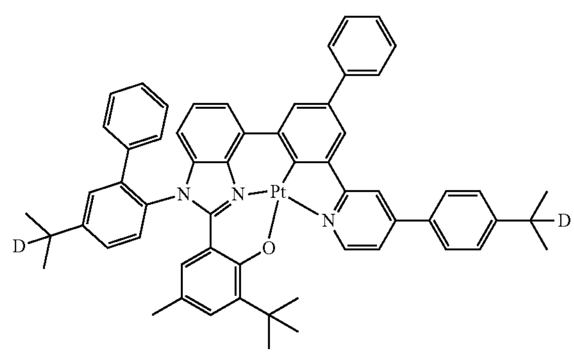
4-2565
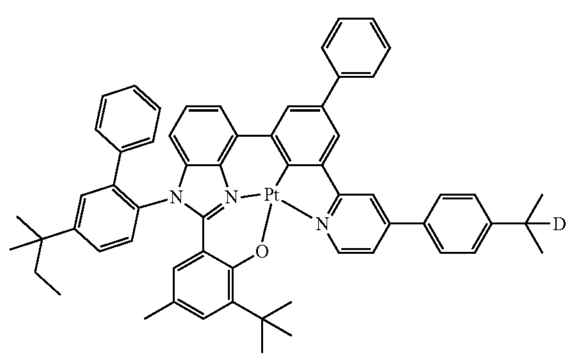
4-2566
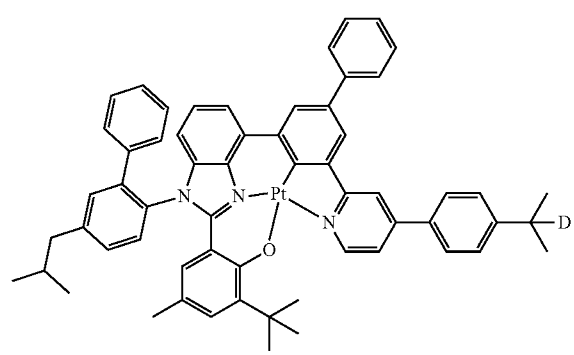

-continued
4-2567
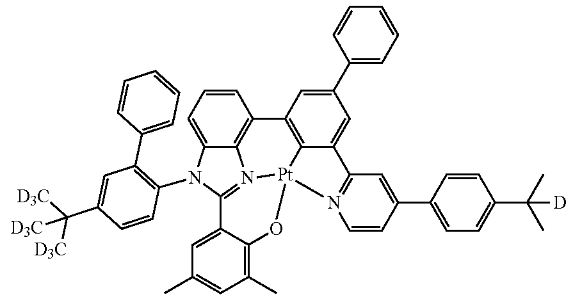
4-2568
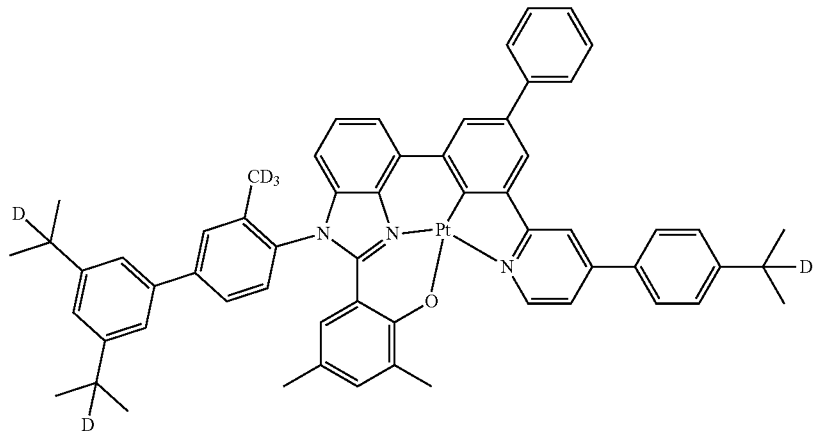
4-2569
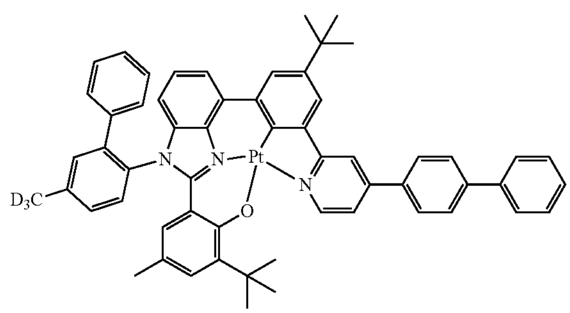
4-2570
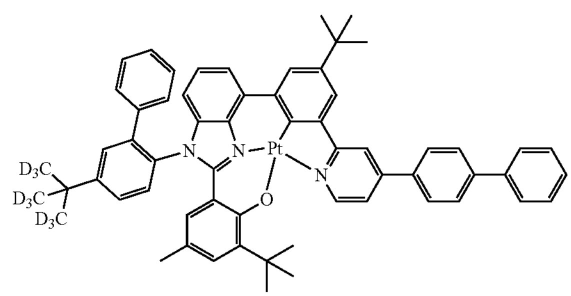
4-2571
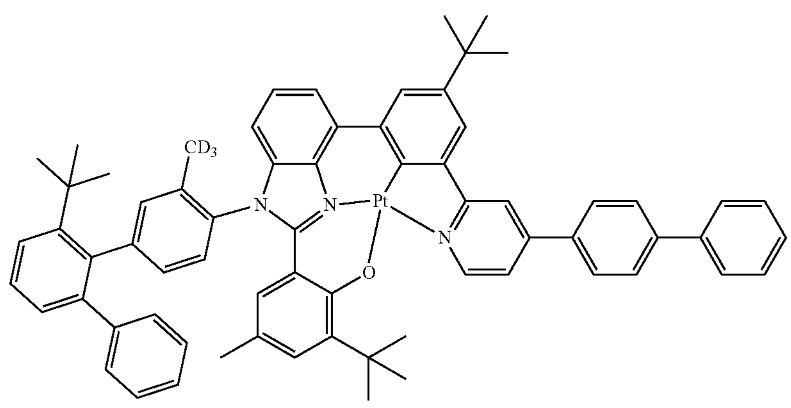

-continued
4-2572
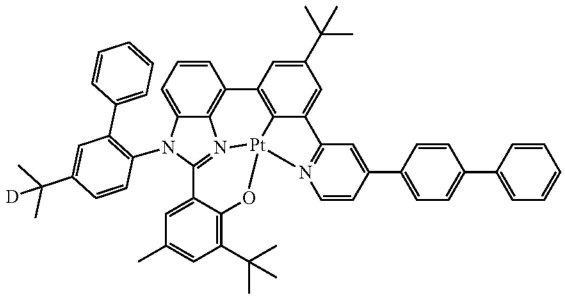
4-2573
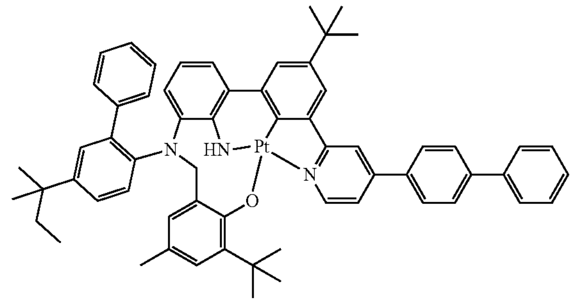
4-2574
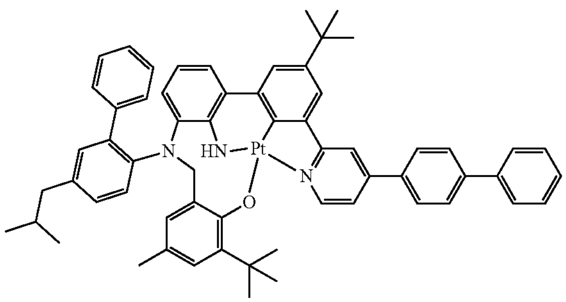
4-2575
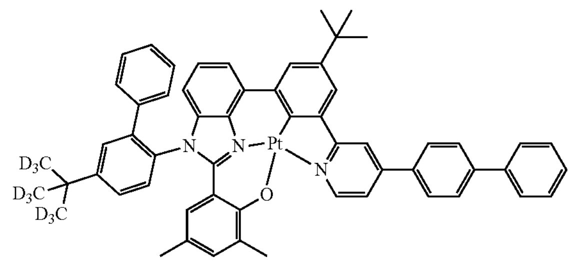
4-2576
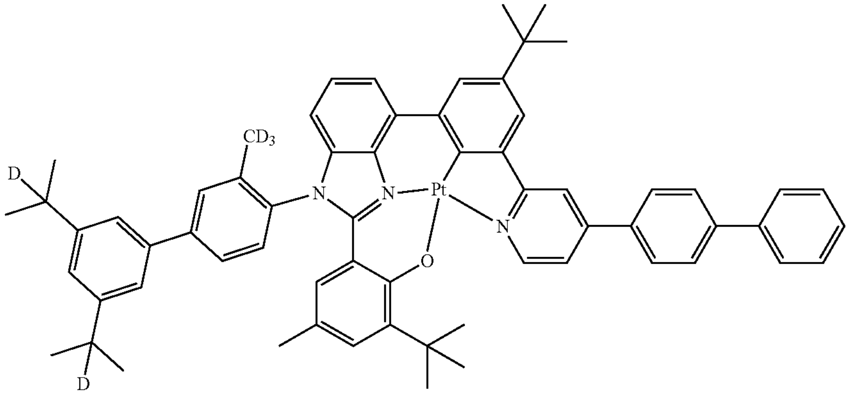
4-2577
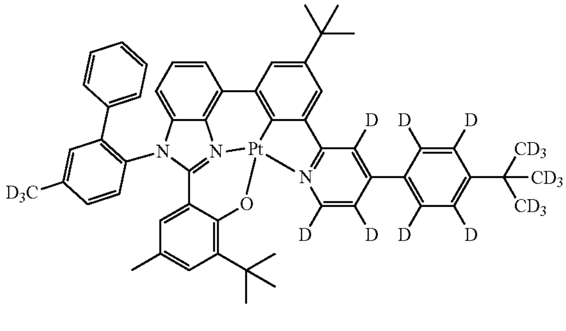
4-2578
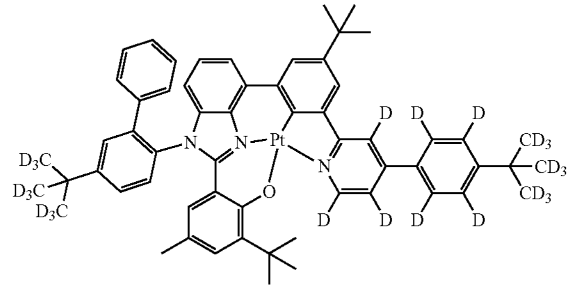

-continued
4-2579
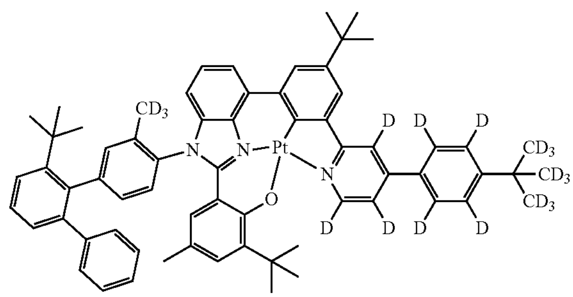
4-2580
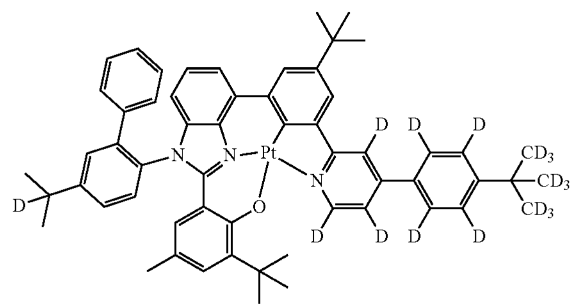
4-2581
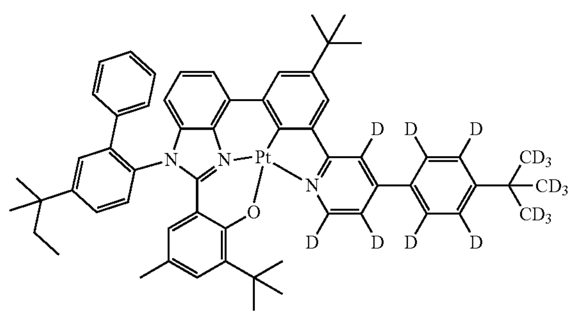
4-2582
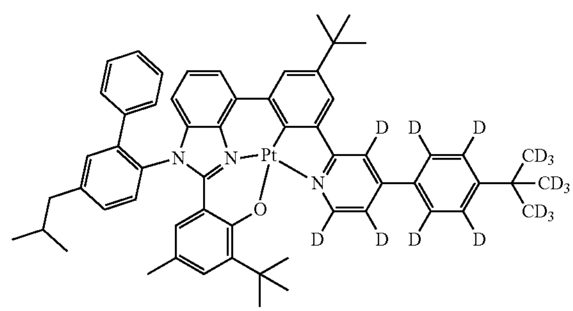
4-2583
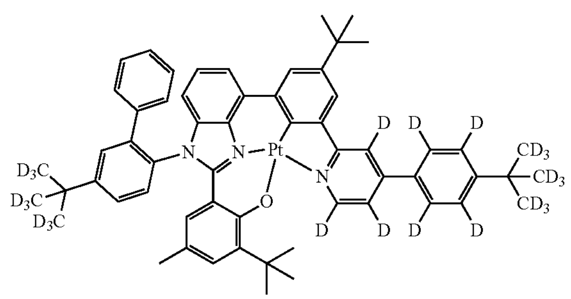
4-2584
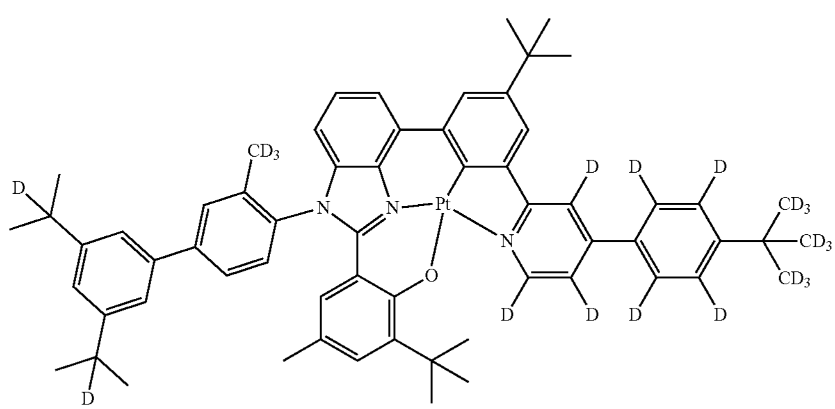

-continued
4-2585
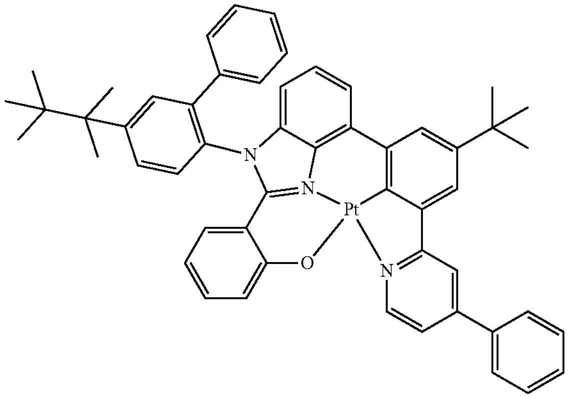
4-2586
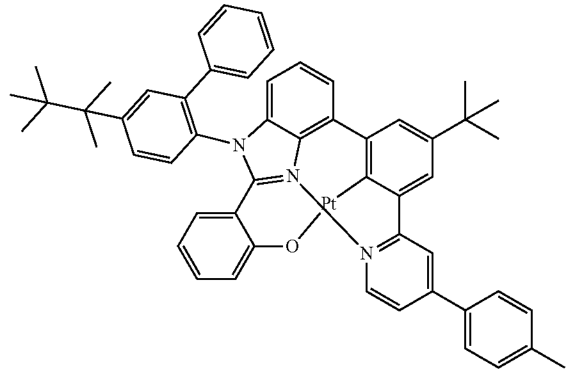
4-2587
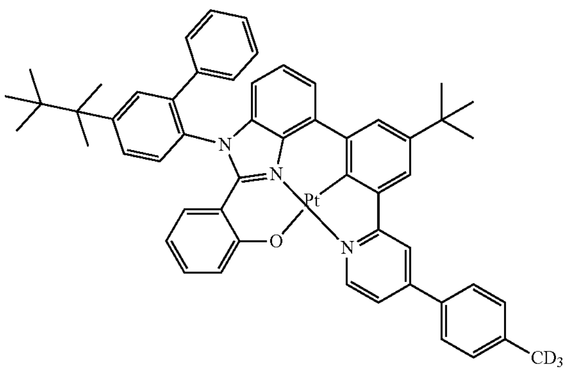
4-2588
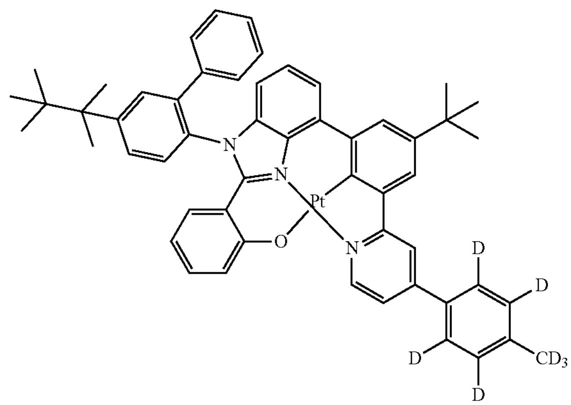
4-2589
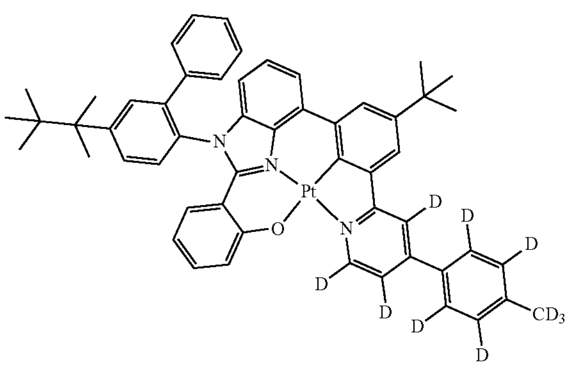
4-2590
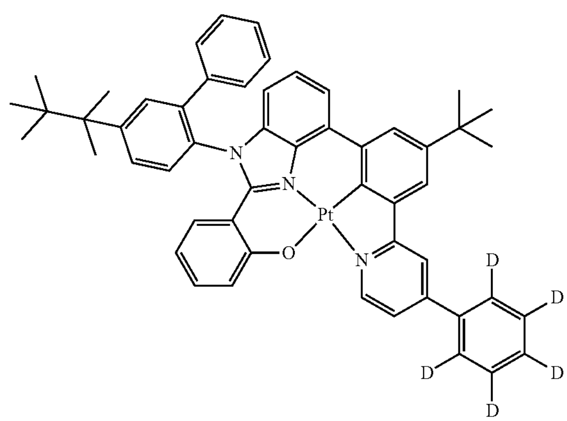

-continued
4-2591
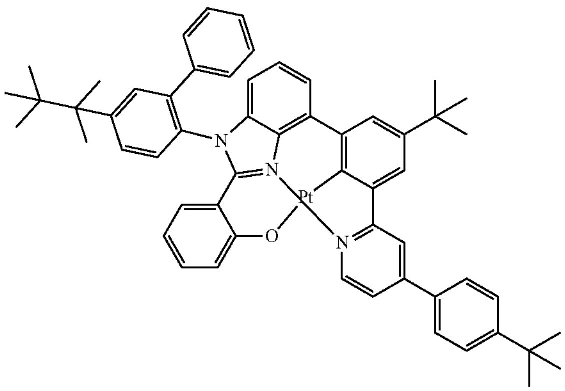
4-2592
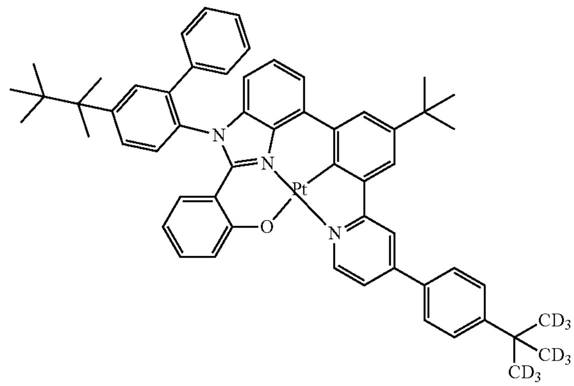
4-2593
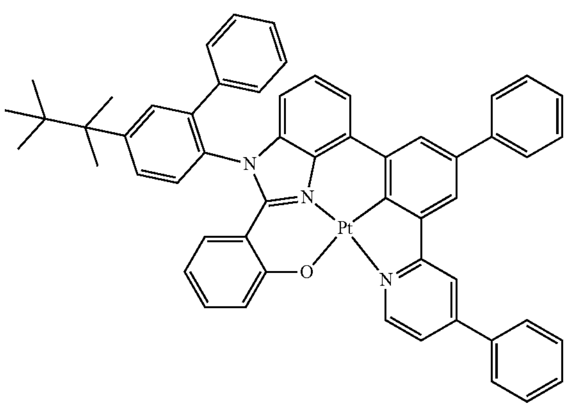
4-2594
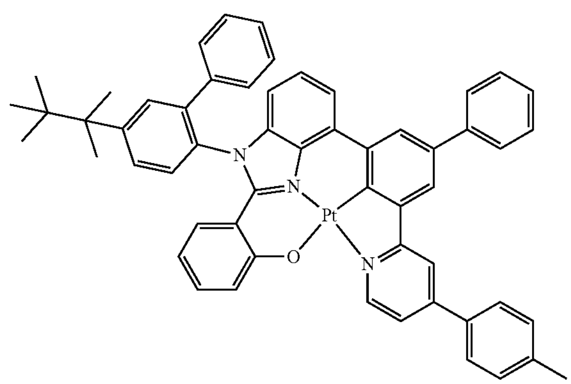
4-2595
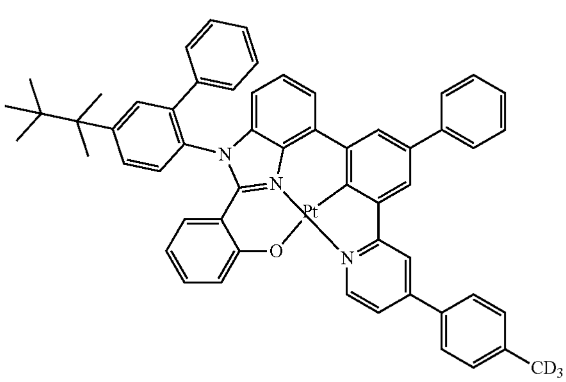
4-2596
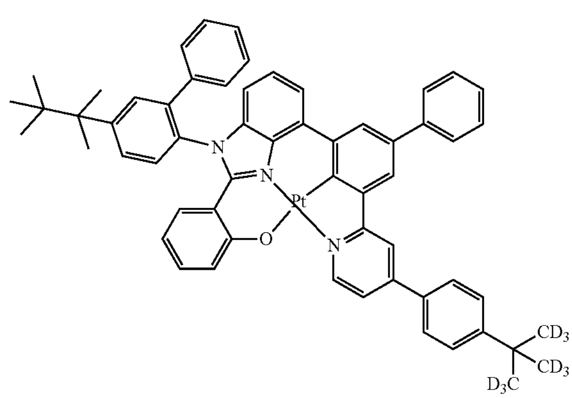

-continued
4-2597
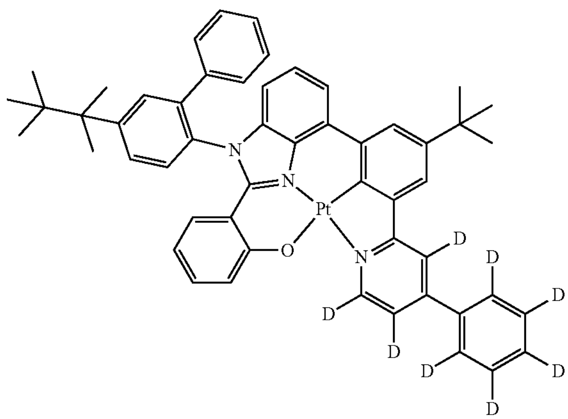
4-2598
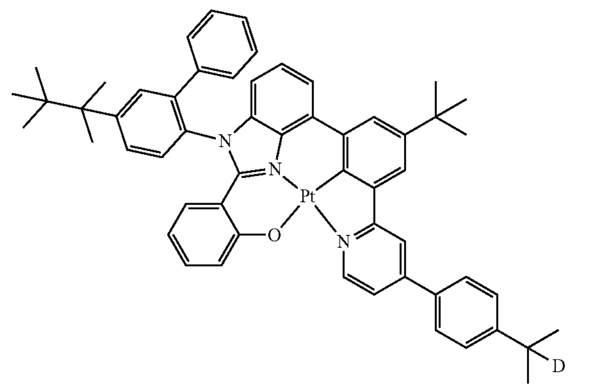
4-2599
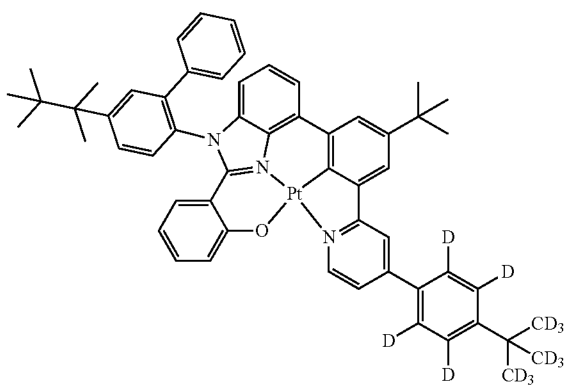
4-2600
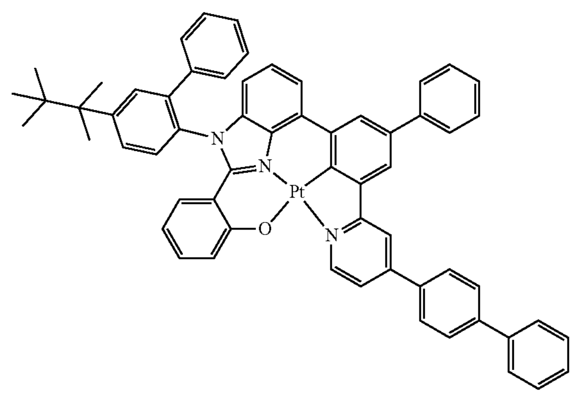
4-2601
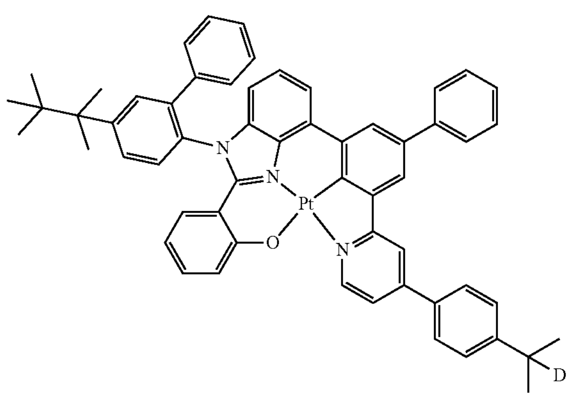
4-2602
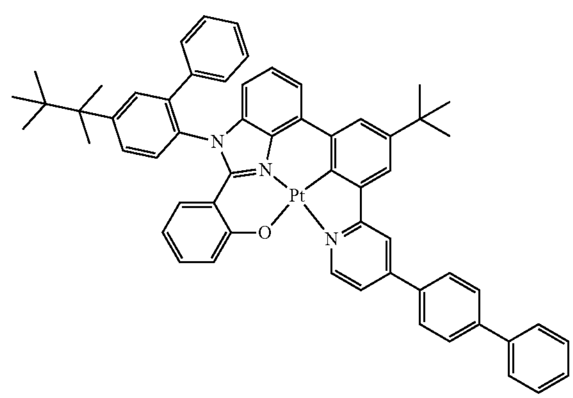
4-2603
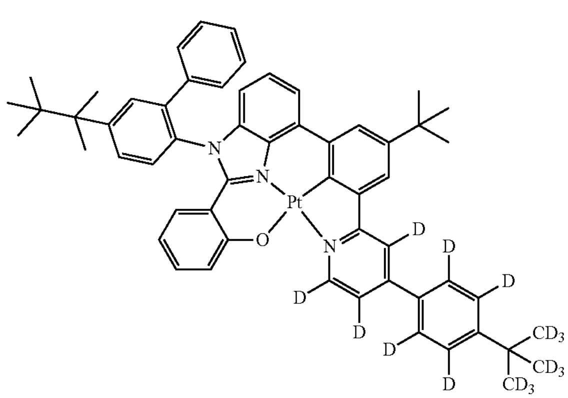
4-2604
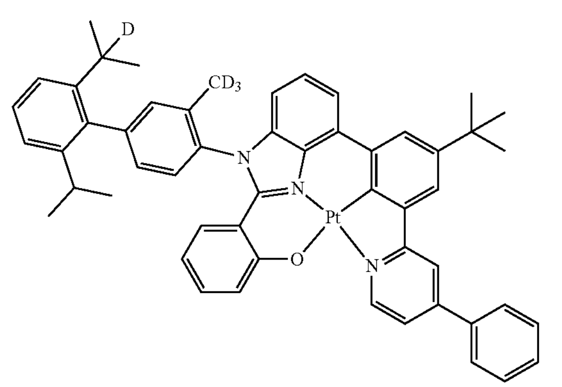

-continued
4-2605
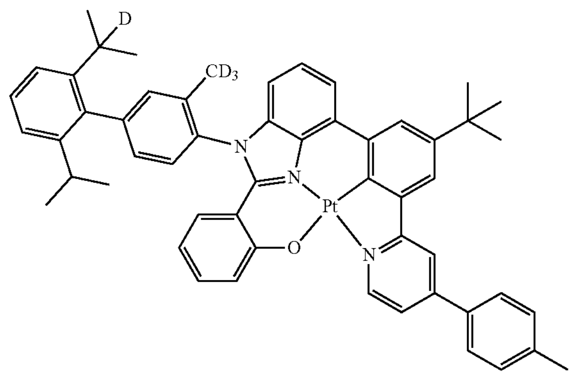
4-2606
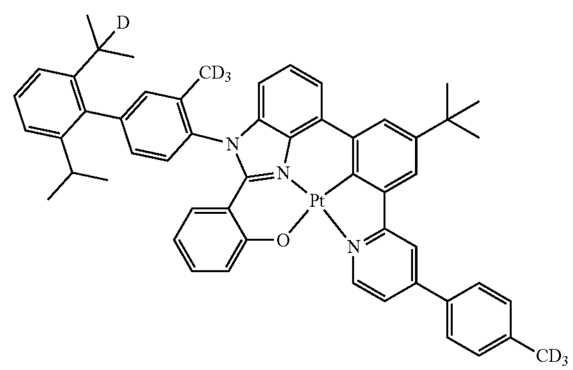
4-2607
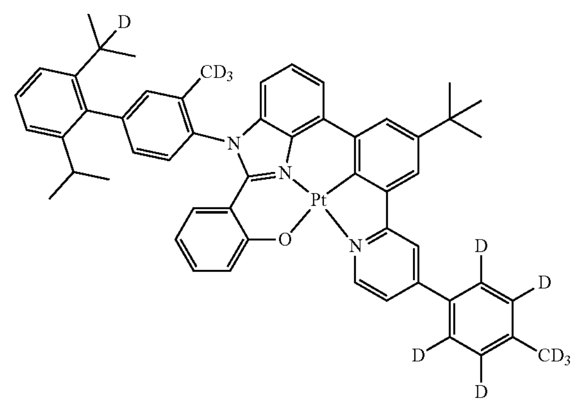
4-2608
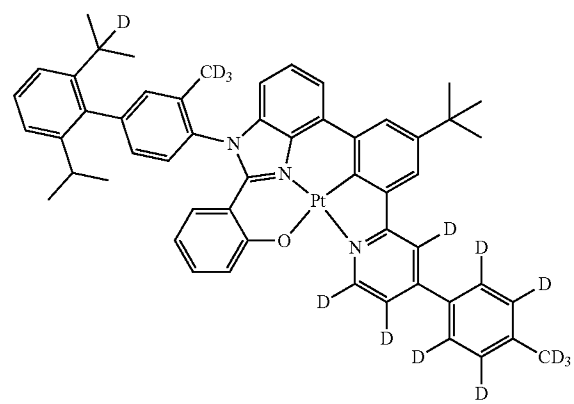
4-2609
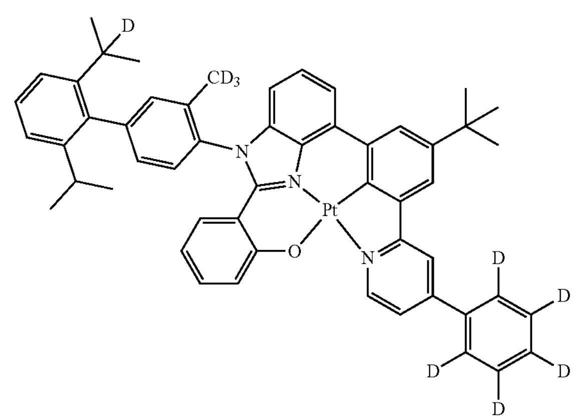
4-2610
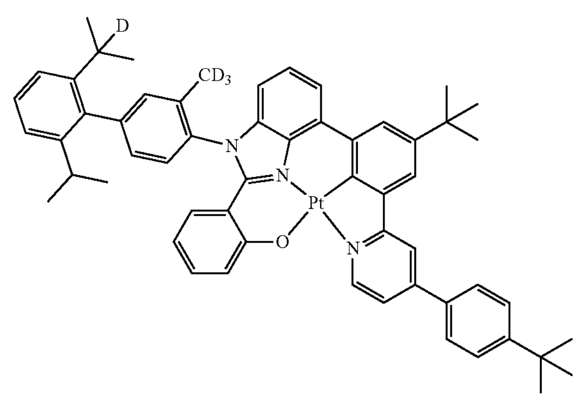
4-2611
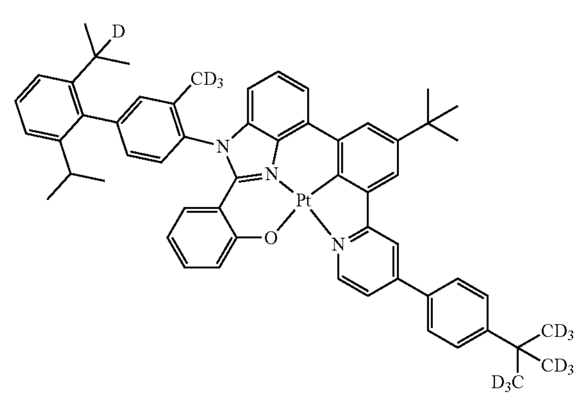
4-2612
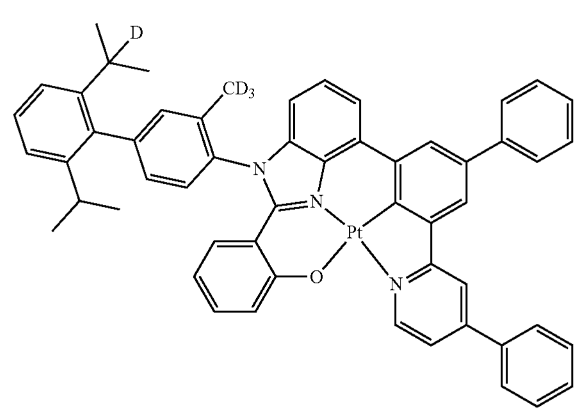

-continued
4-2613
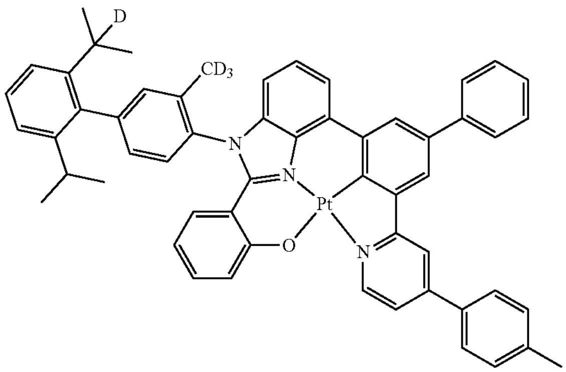
4-2614
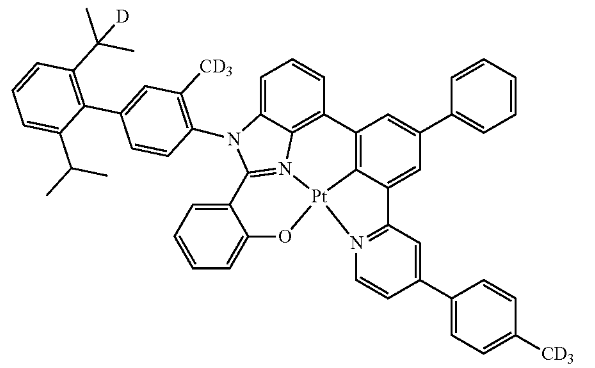
4-2615
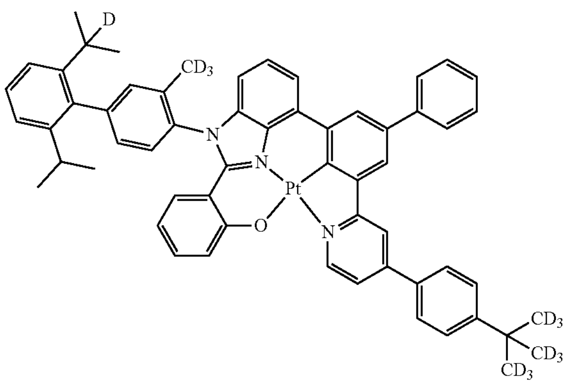
4-2616
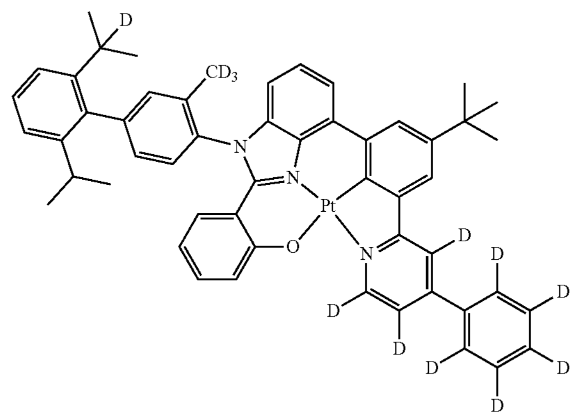
4-2617
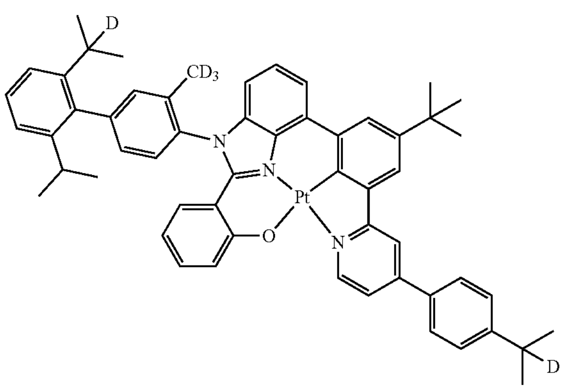
4-2618
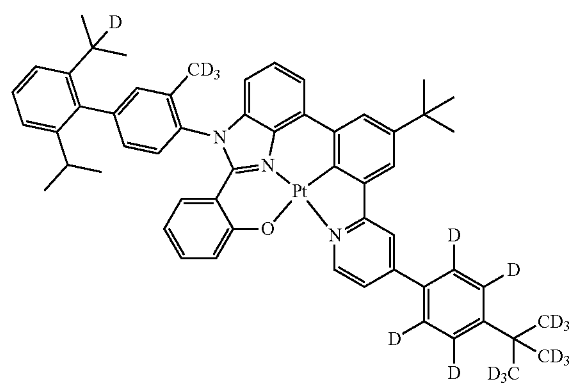
4-2619
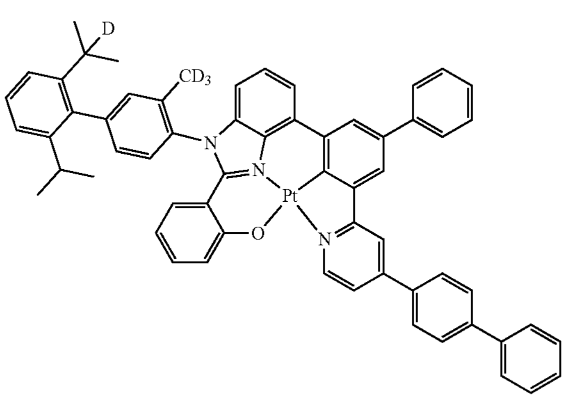
4-2620
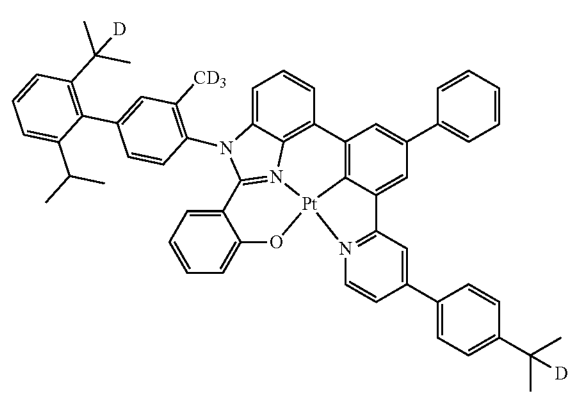

-continued
4-2621
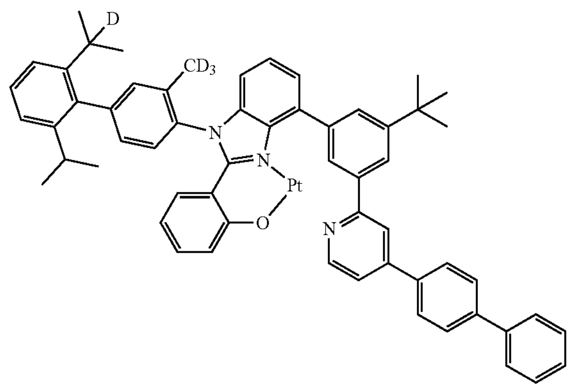
4-2622
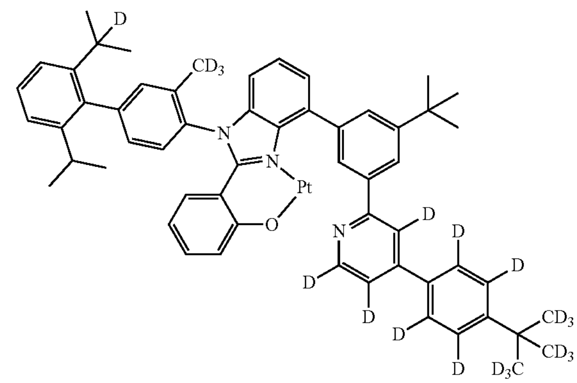
4-2623
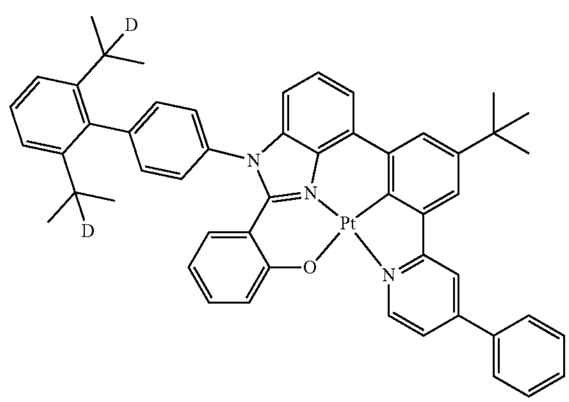
4-2624
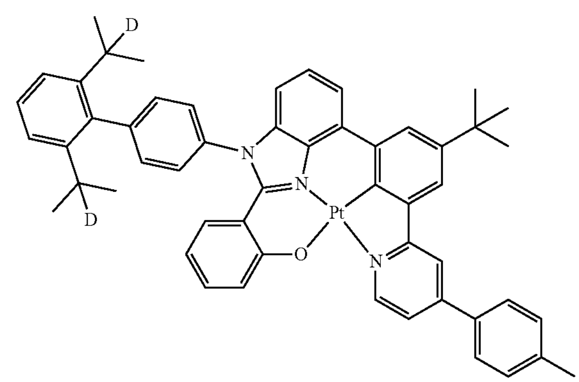
4-2625
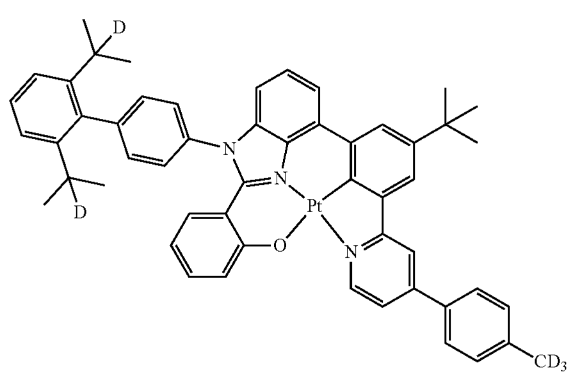
4-2626
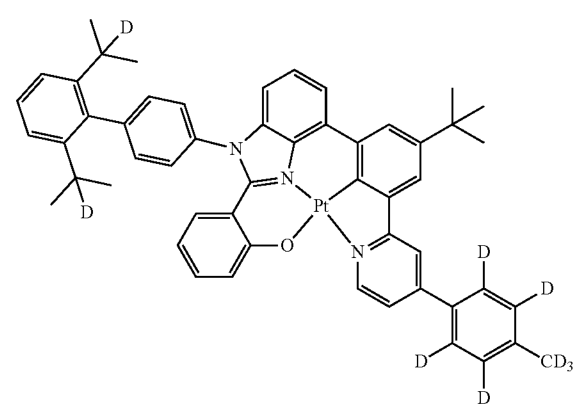

-continued
4-2627
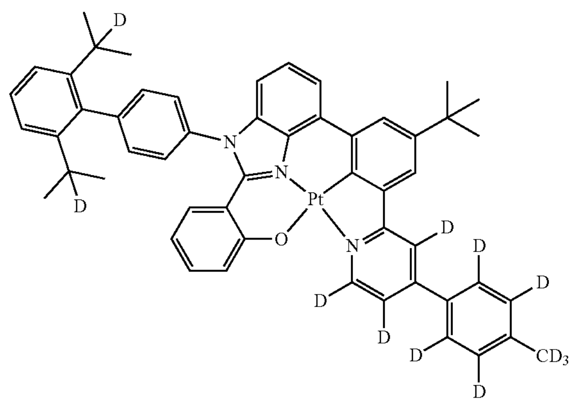
4-2628
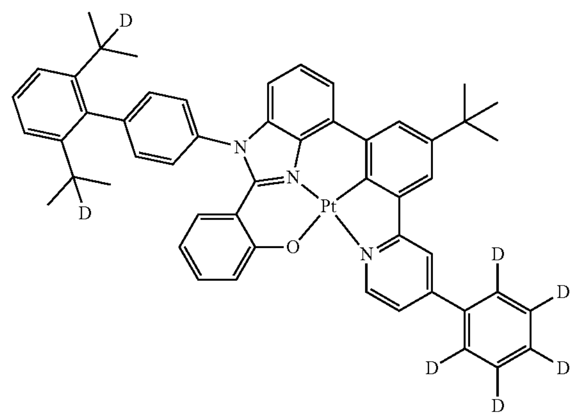
4-2629
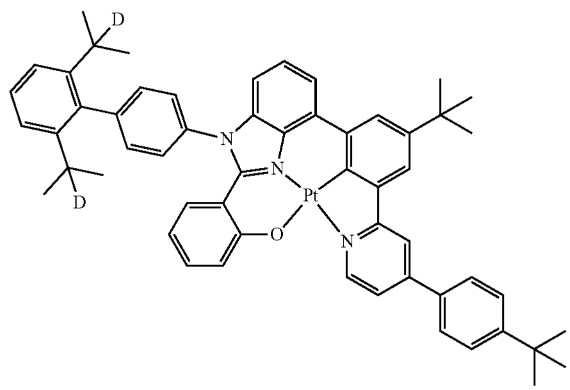
4-2630
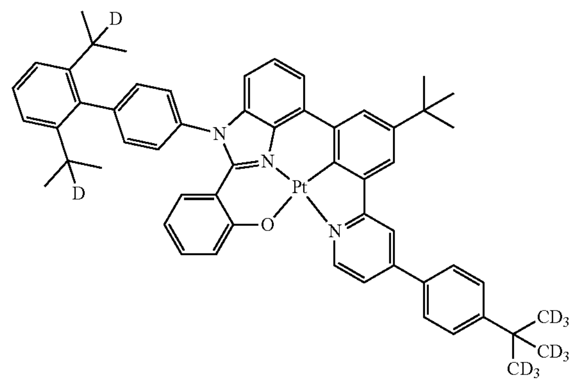
4-2631
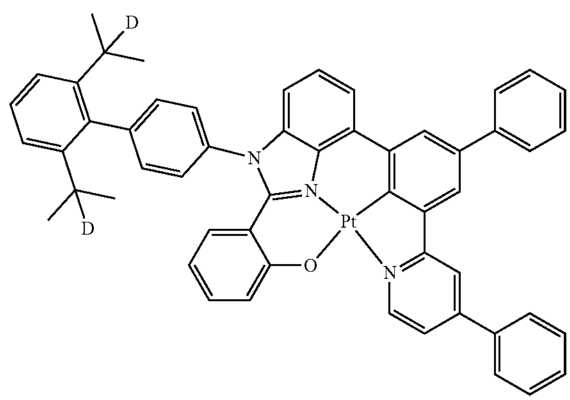
4-2632
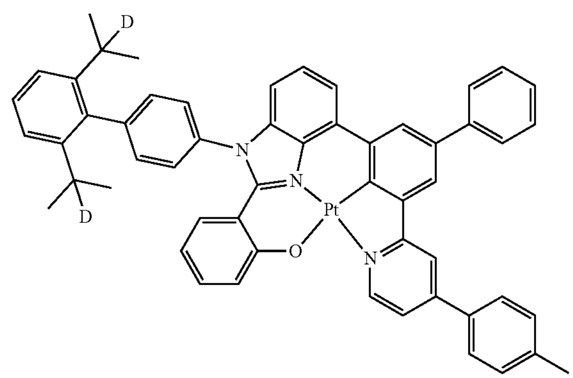
4-2633
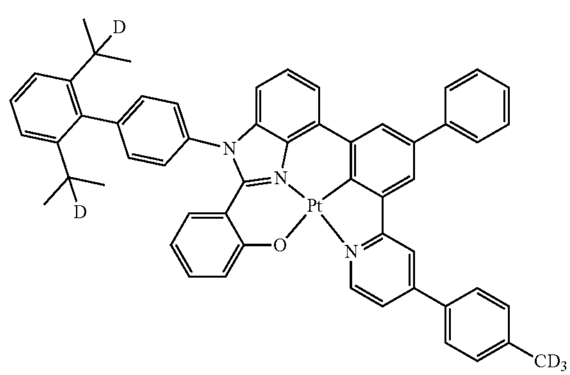
4-2634
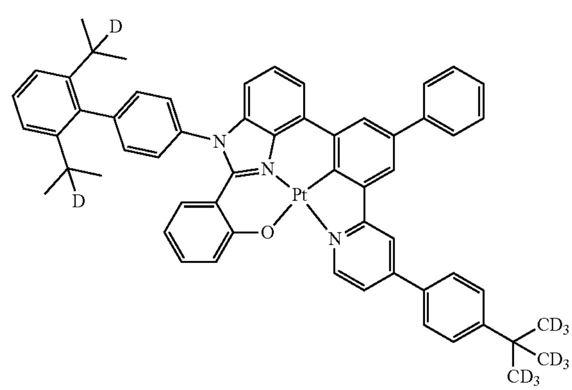

-continued
4-2635
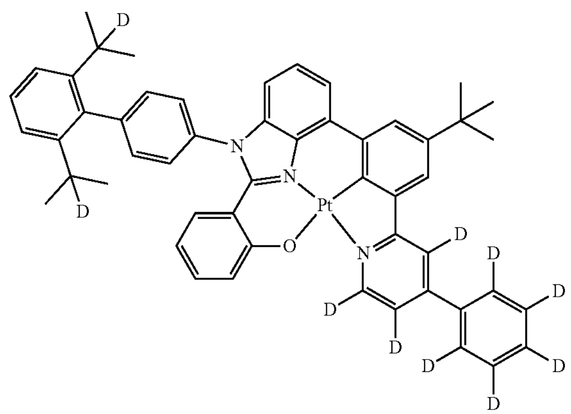
4-2636
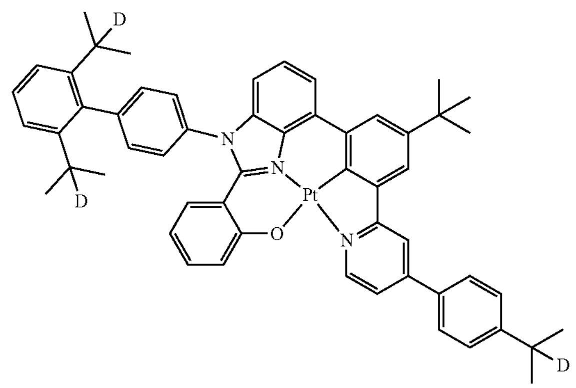
4-2637
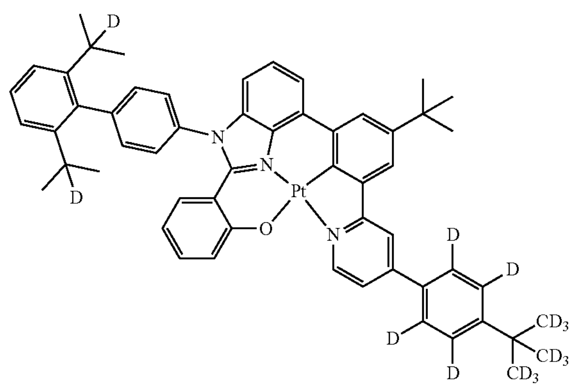
4-2638
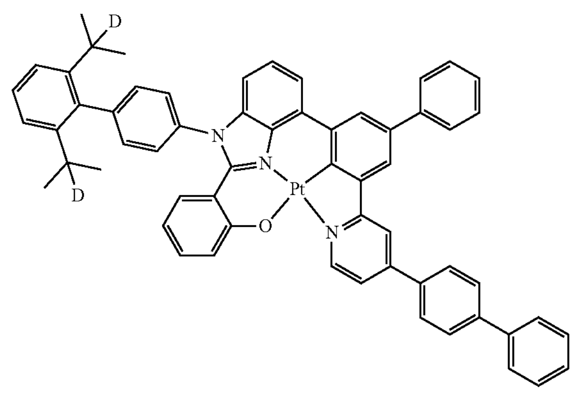
4-2639
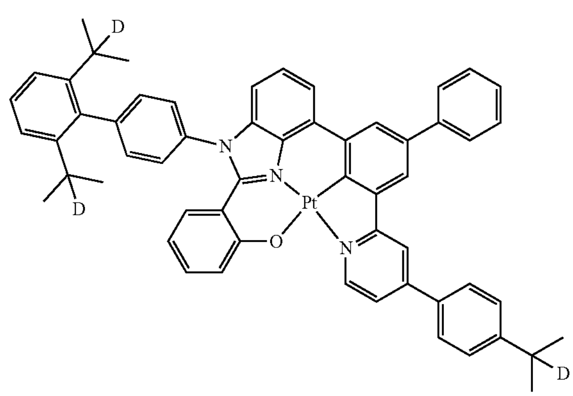
4-2640
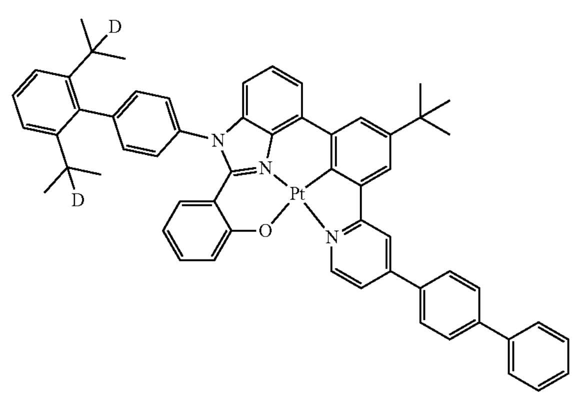
4-2641
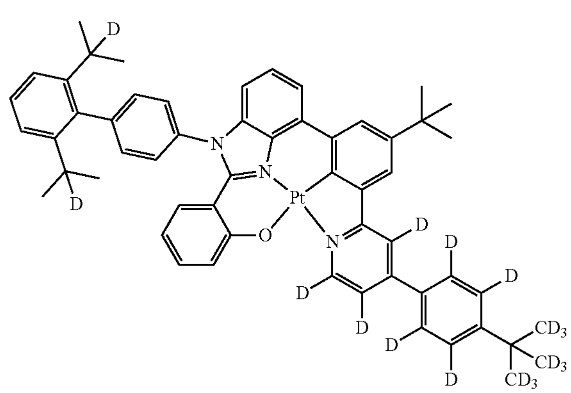
4-2642
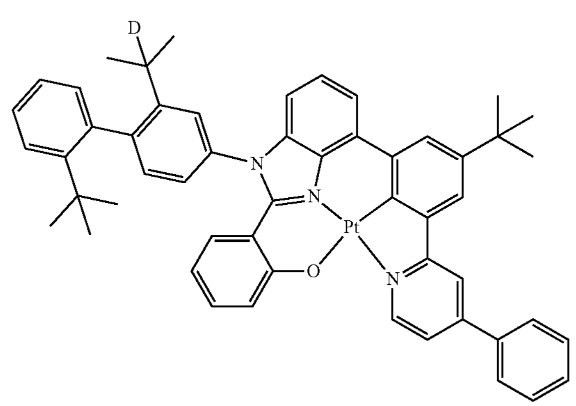

-continued
4-2643
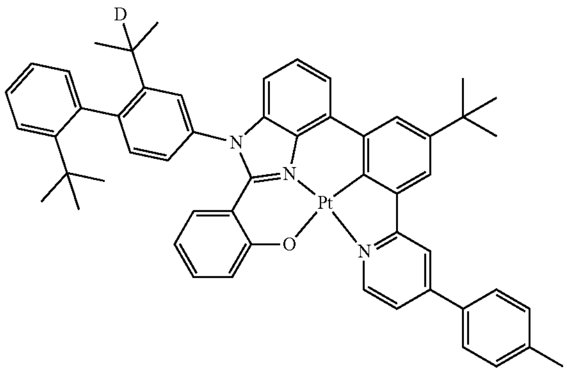
4-2644
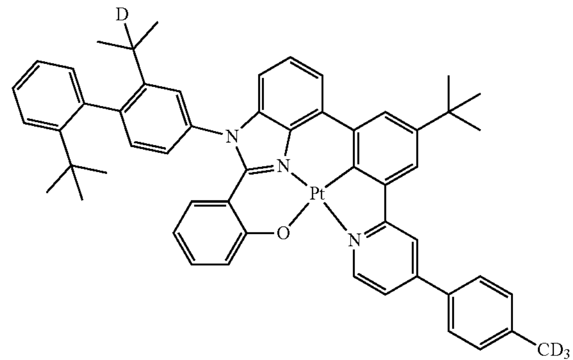
4-2645
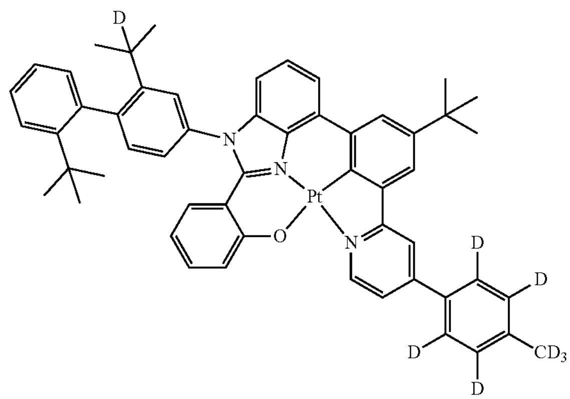
4-2646
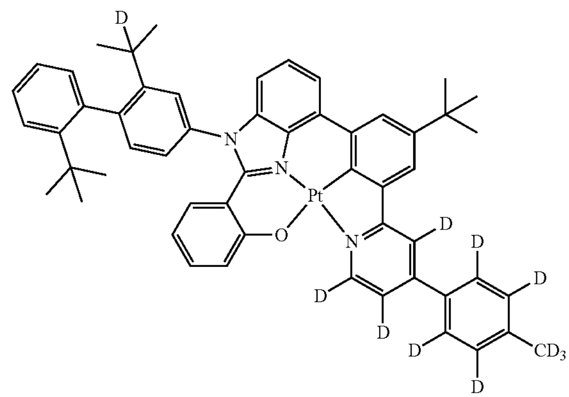
4-2647
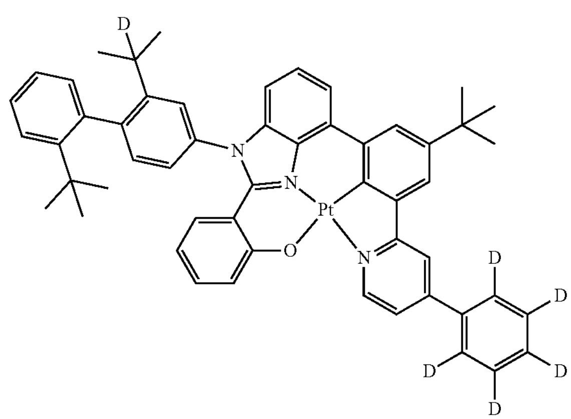
4-2648
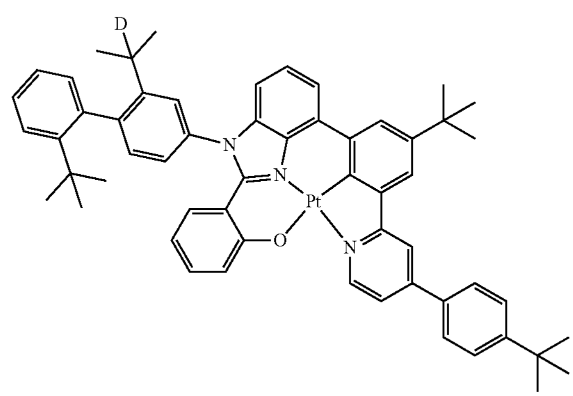
4-2649
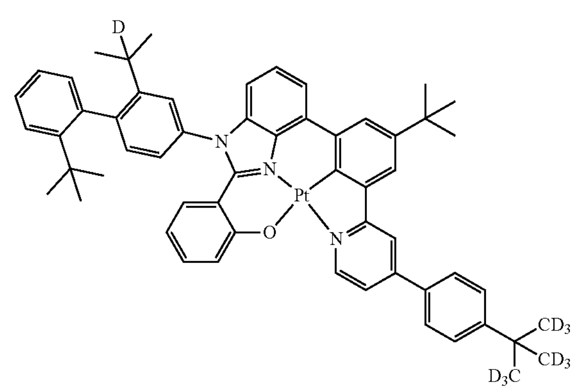
4-2650
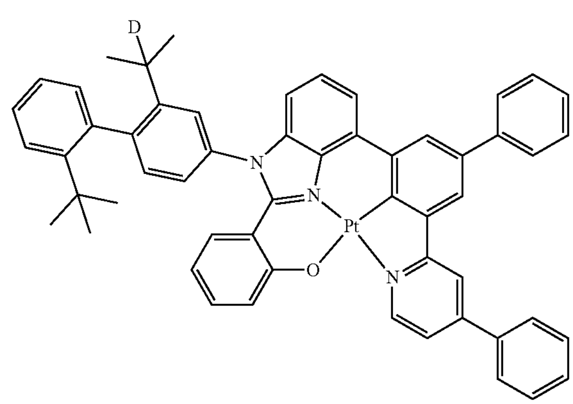

-continued
4-2651
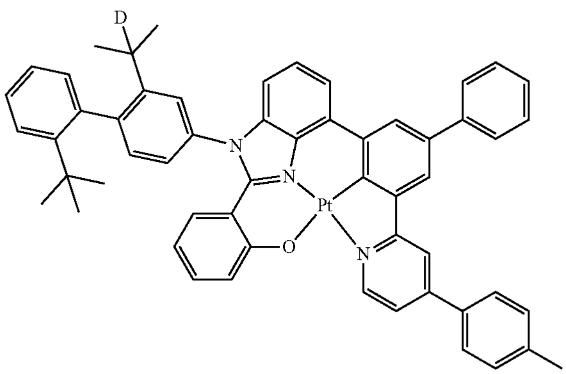
4-2652
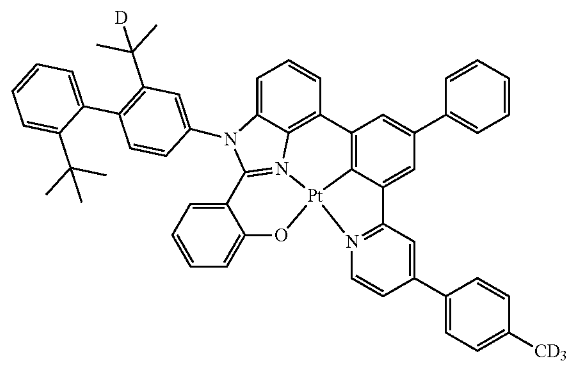
4-2653
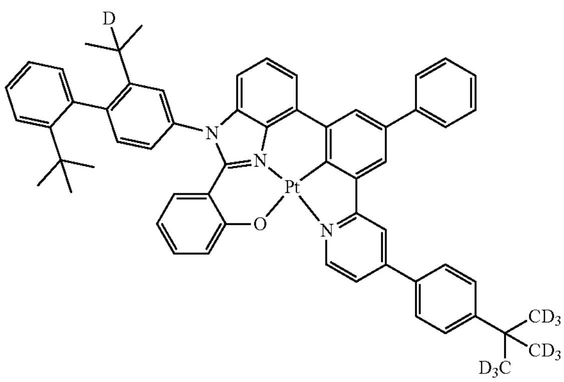
4-2654
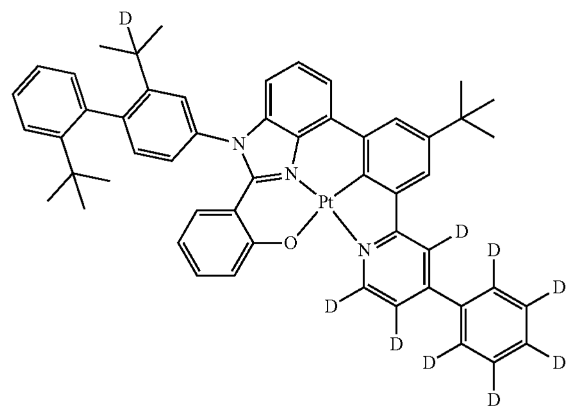
4-2655
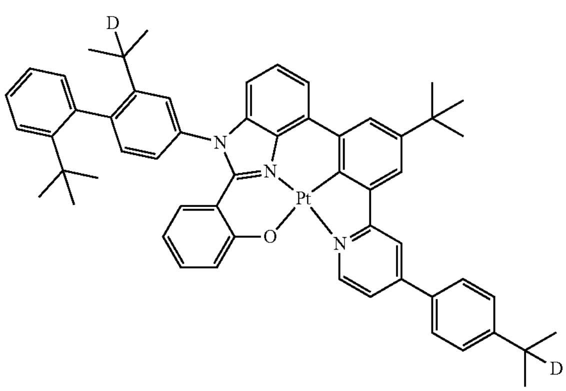
4-2656
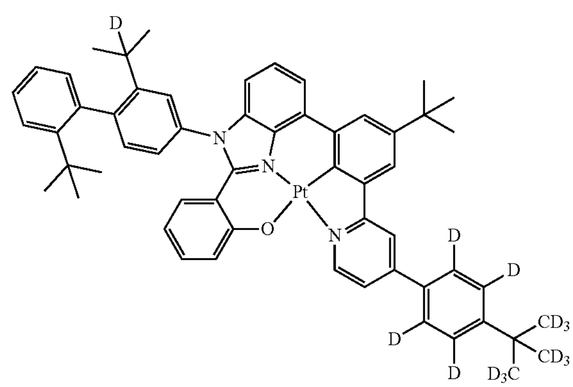
4-2657
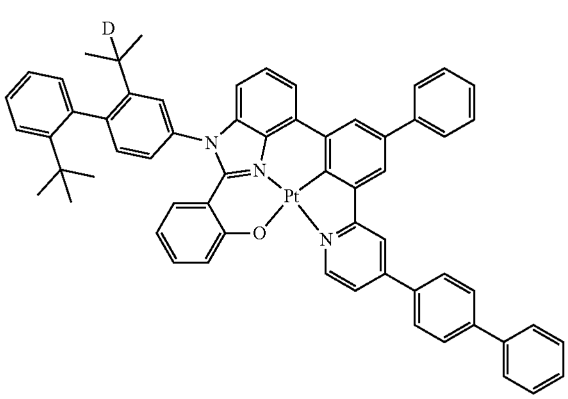
4-2658
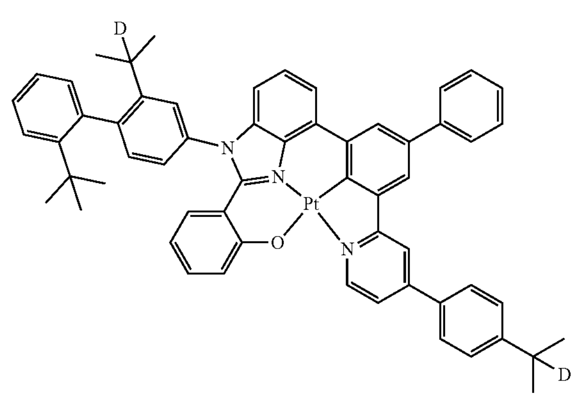

-continued
4-2659
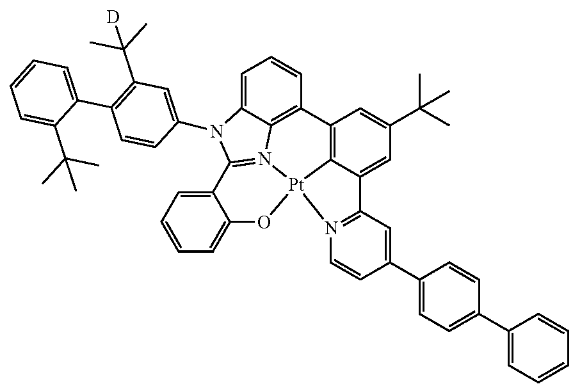
4-2660
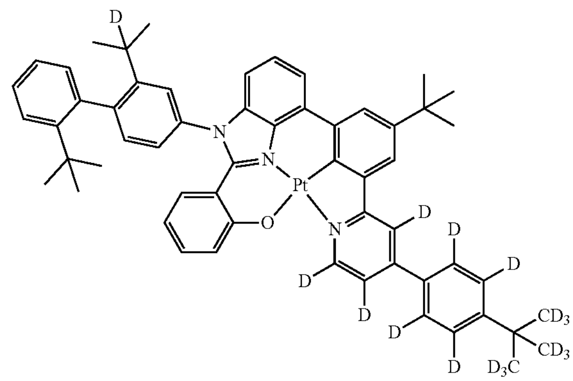
4-2661
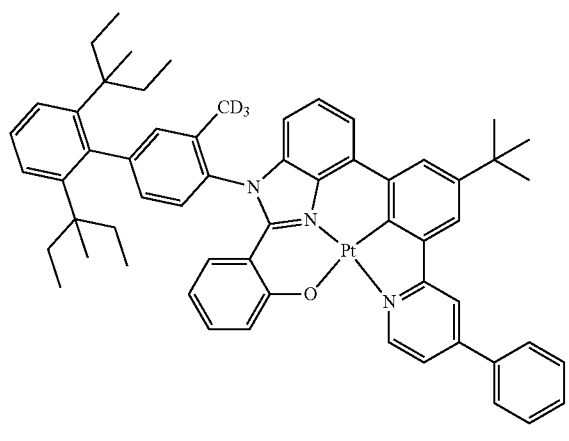
4-2662
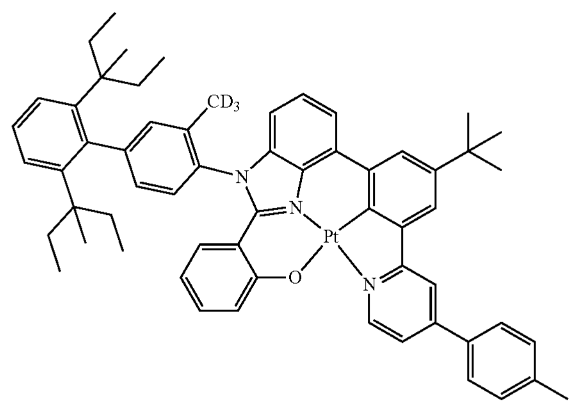
4-2663
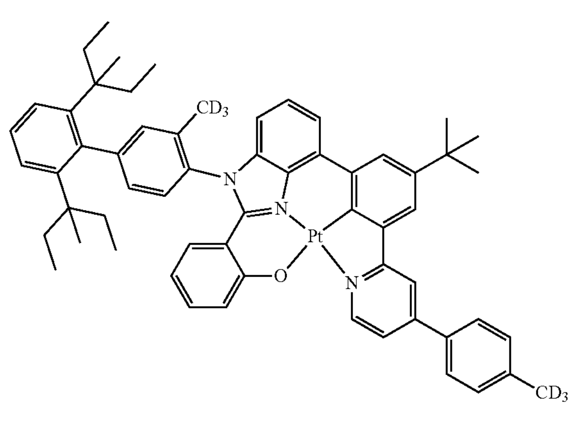
4-2664
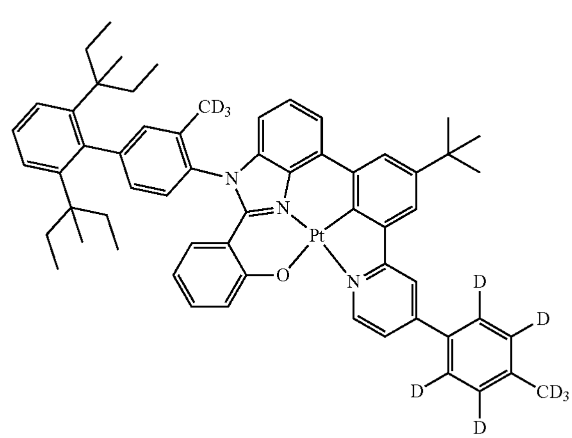

-continued
4-2665
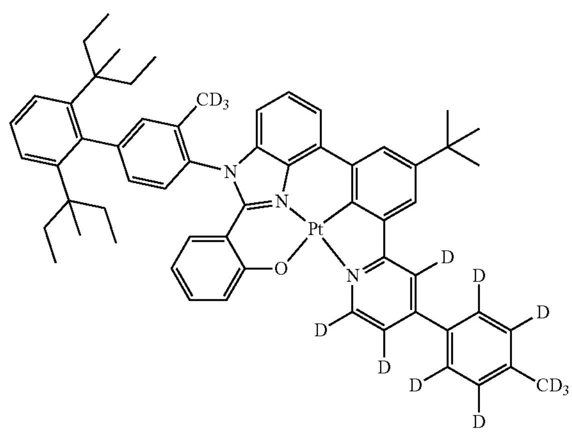
4-2666
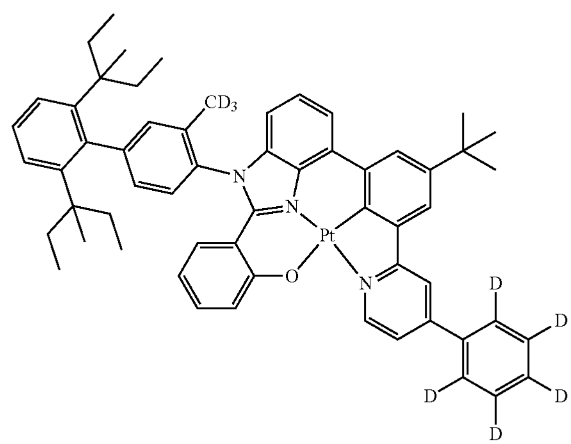
4-2667
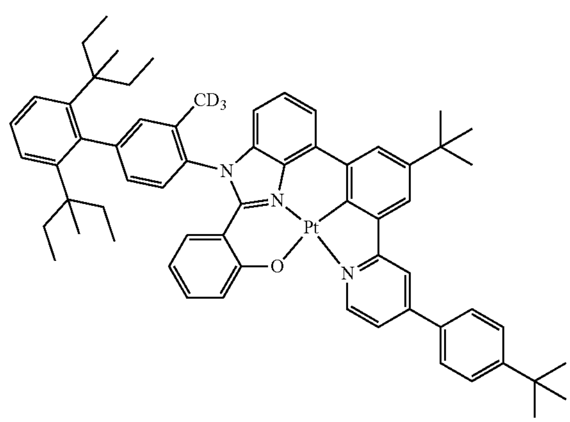
4-2668
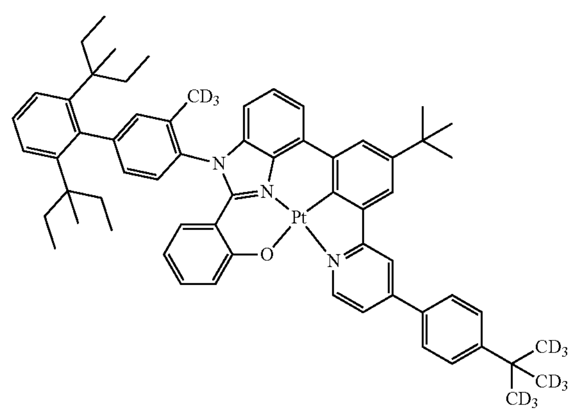
4-2669
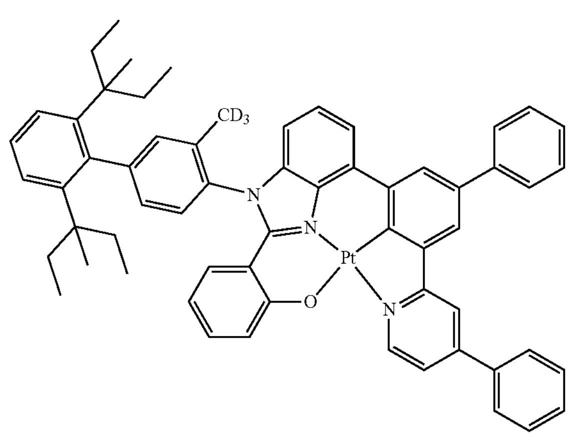
4-2670
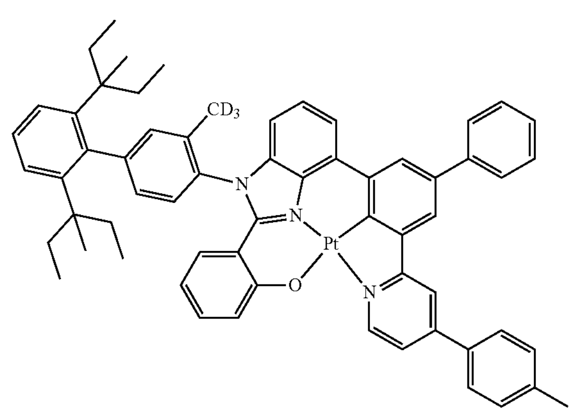

-continued
4-2671
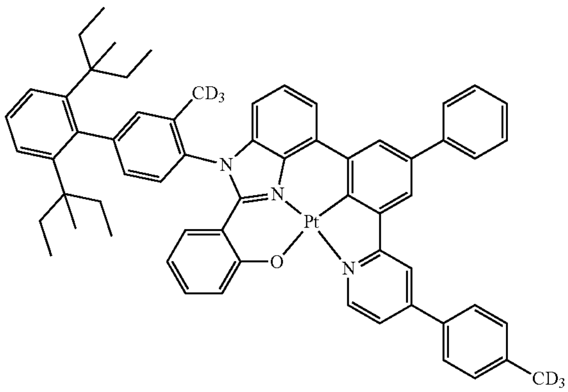
4-2672
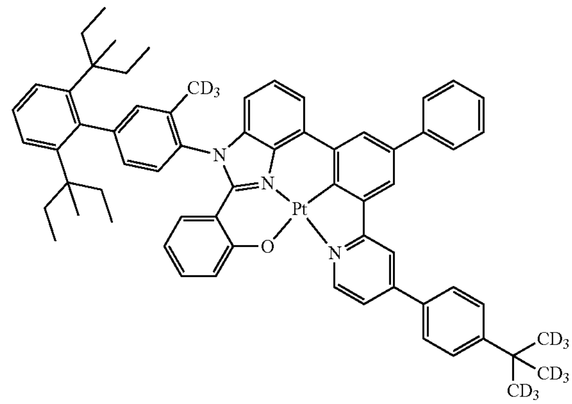
4-2673
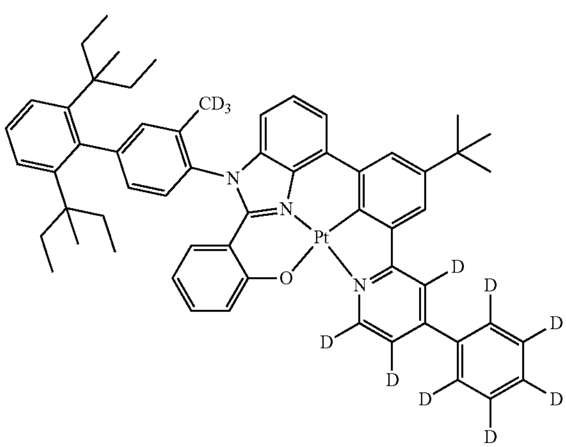
4-2674
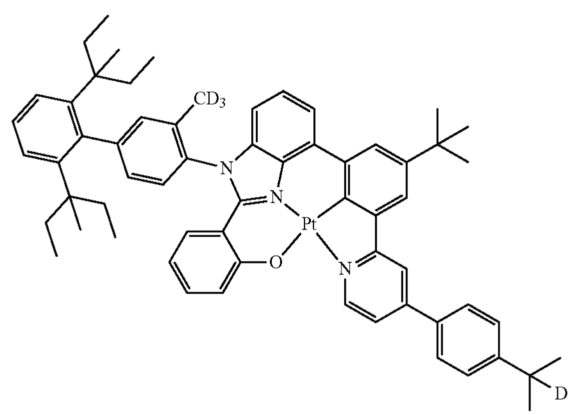
4-2675
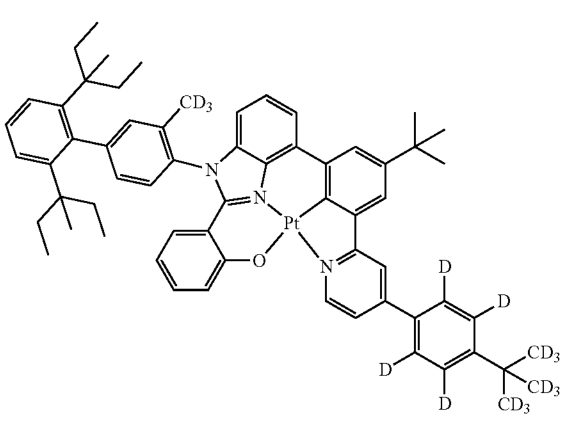
4-2676
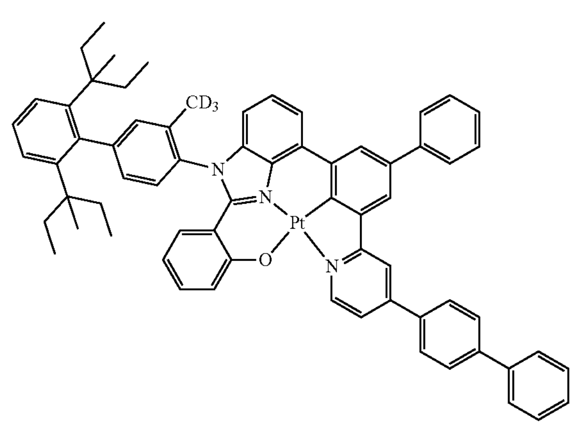

-continued
4-2677
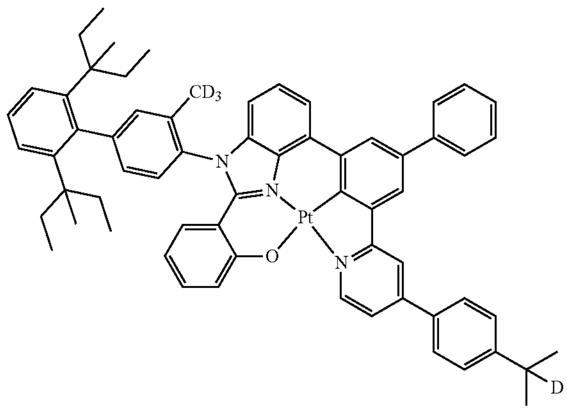
4-2678
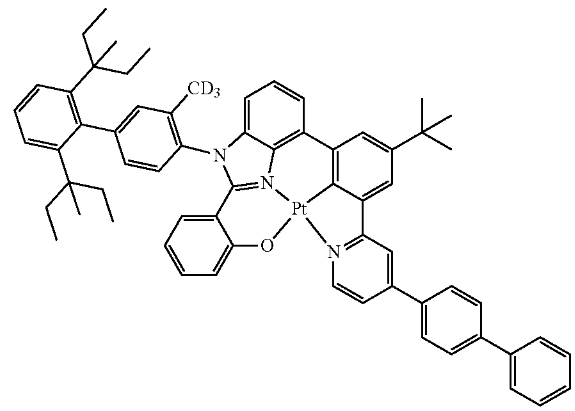
4-2679
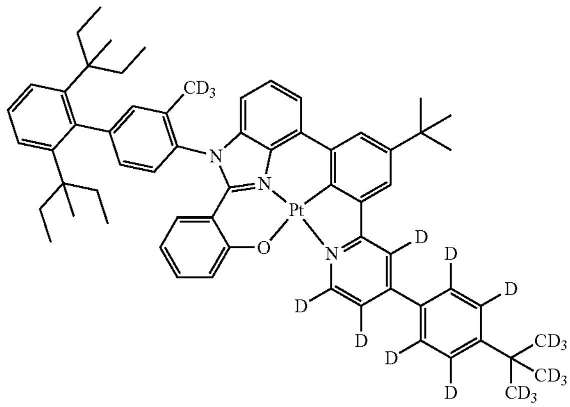
4-2680
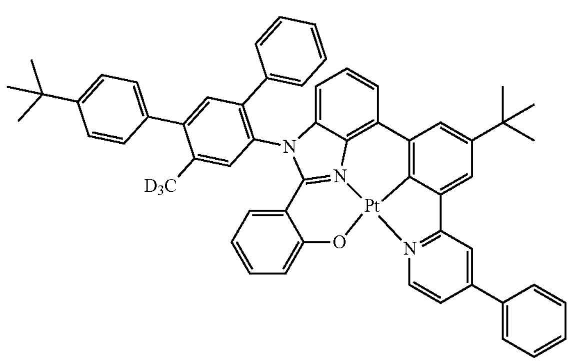
4-2681
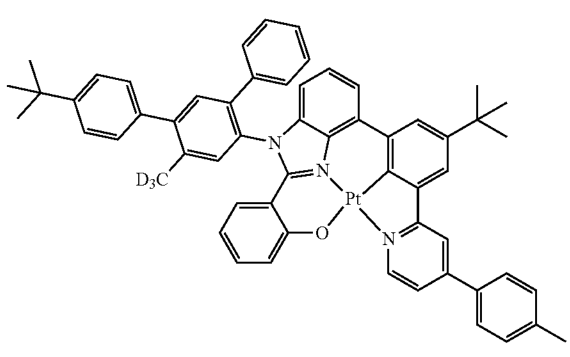
-continued
4-2682
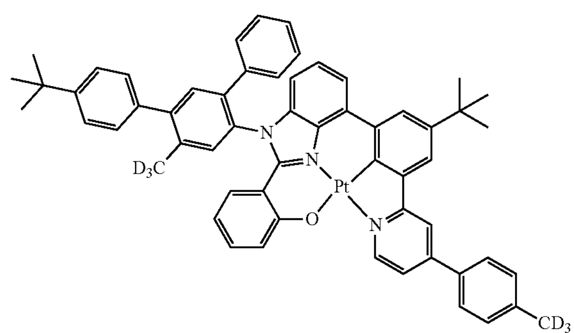
4-2683
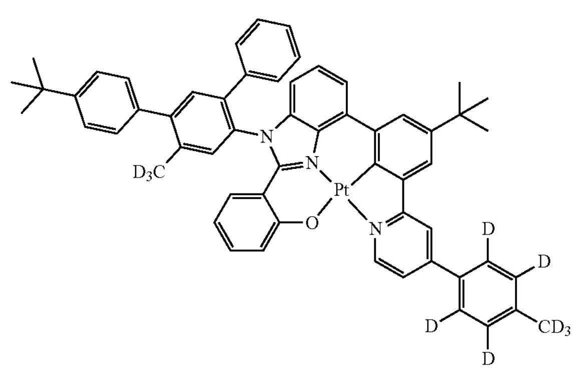

-continued
4-2684
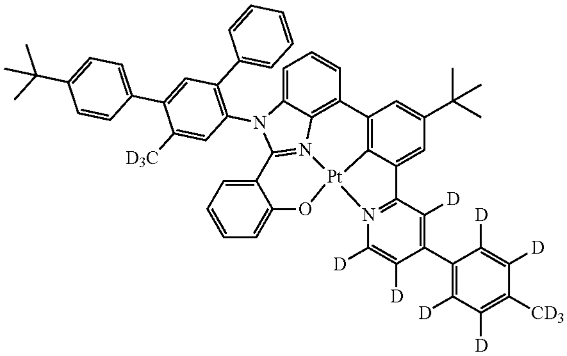
4-2685
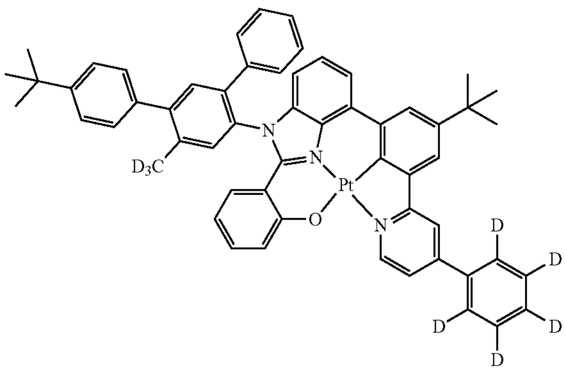
4-2686
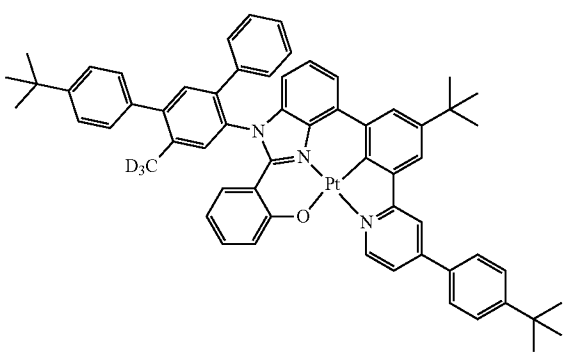
4-2687
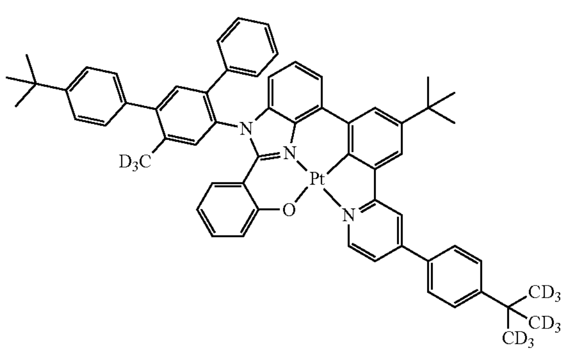
-continued
4-2688
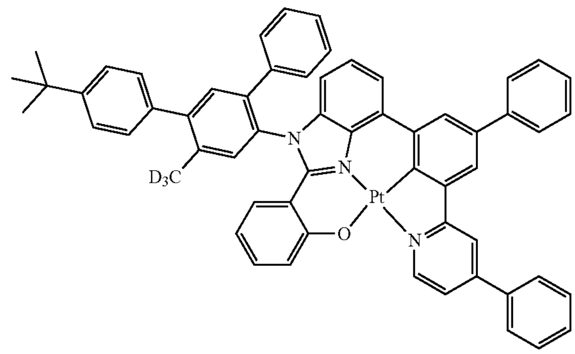
4-2689
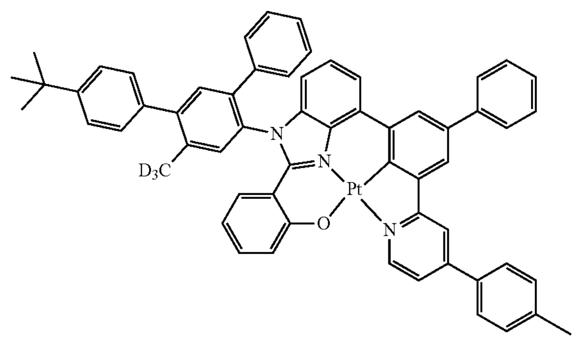
4-2690
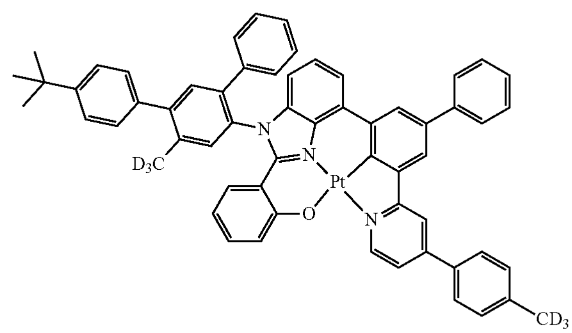
4-2691
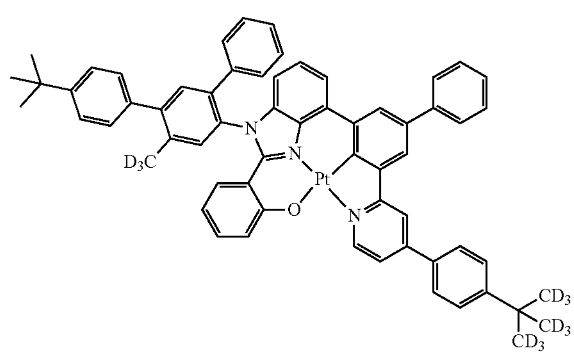

-continued
4-2692
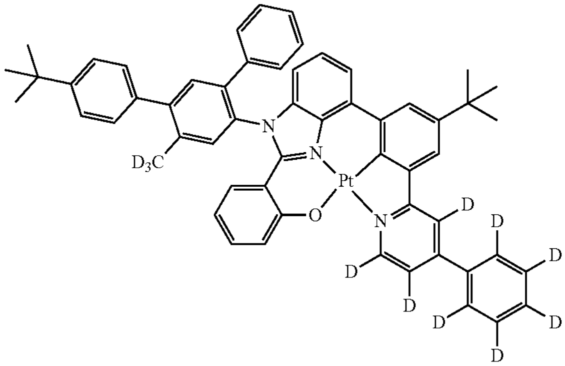
4-2693
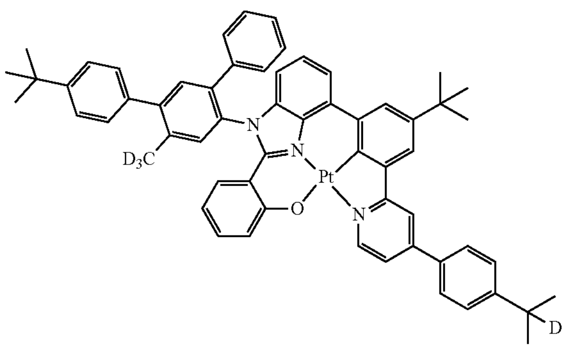
4-2694
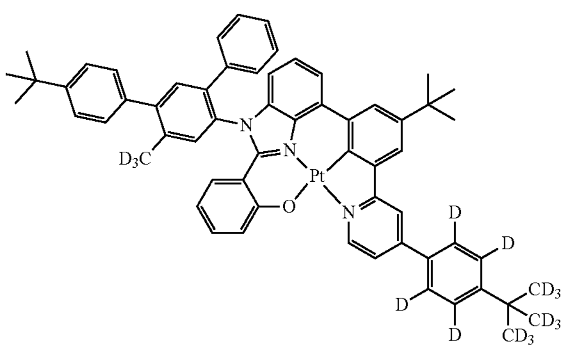
4-2695
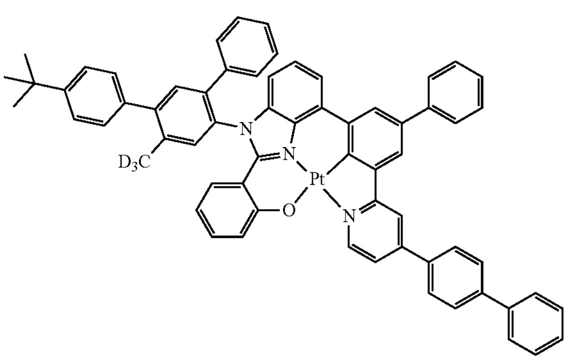
-continued
4-2696
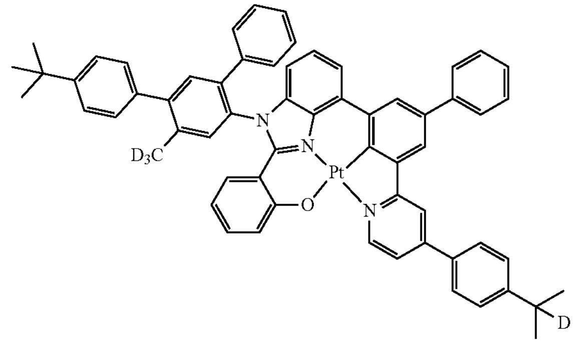
4-2697
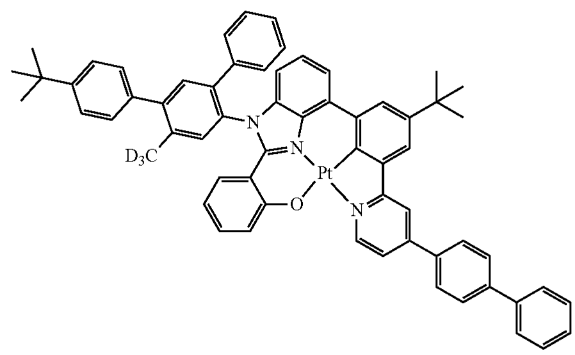
4-2698
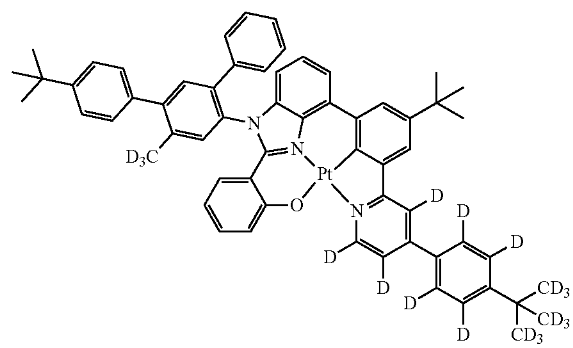
4-2699
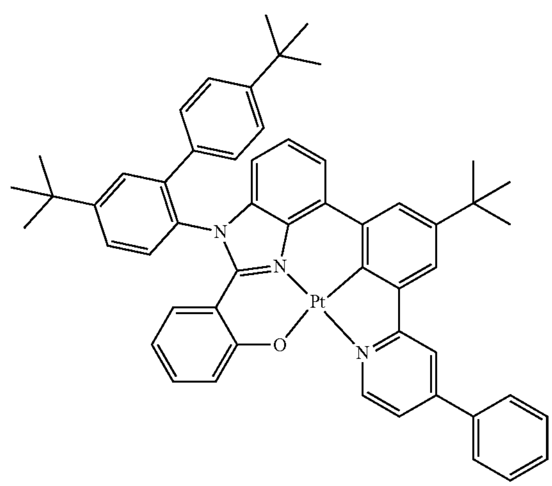

-continued
4-2700
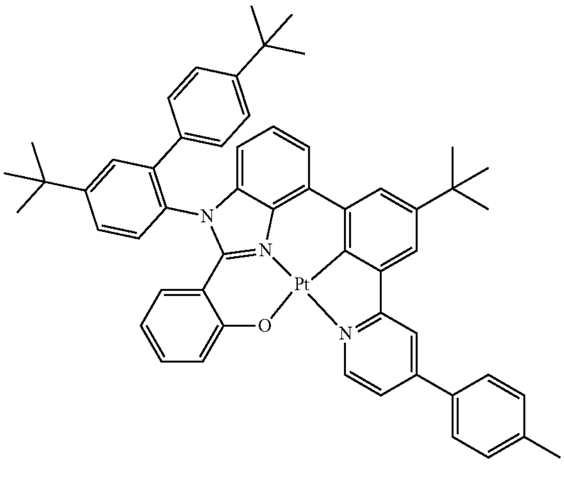
4-2701
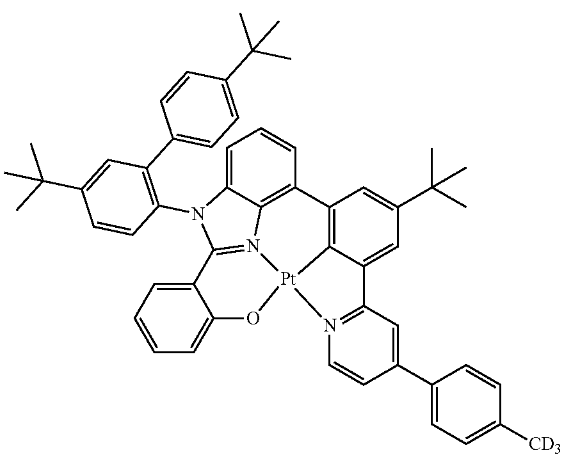
4-2702
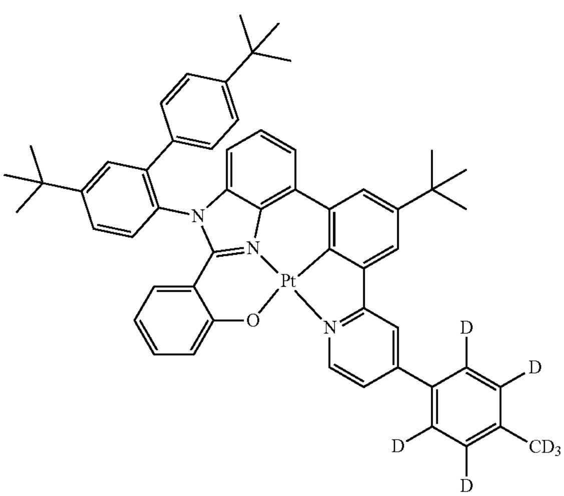
-continued
4-2703
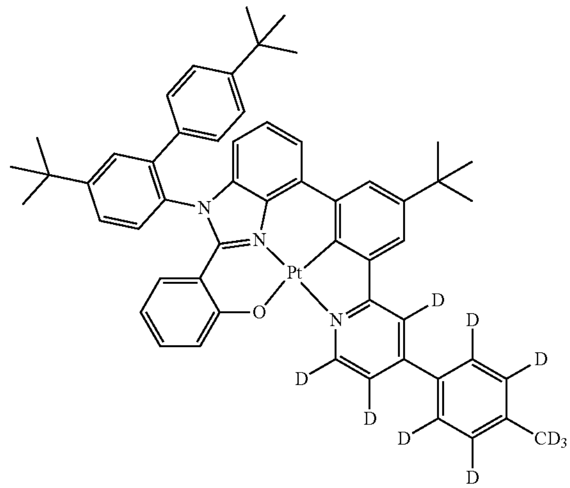
4-2704
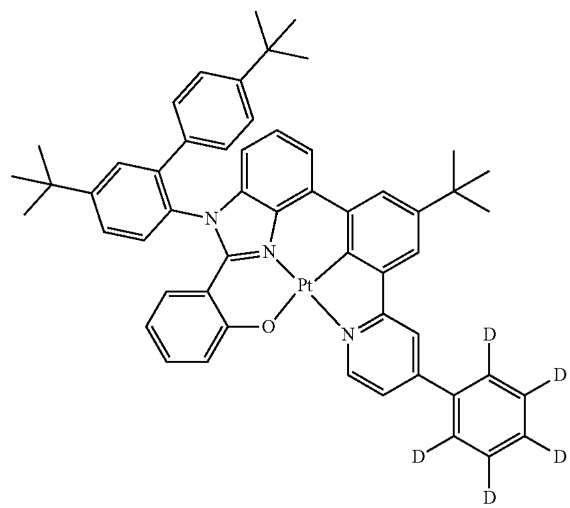
4-2705
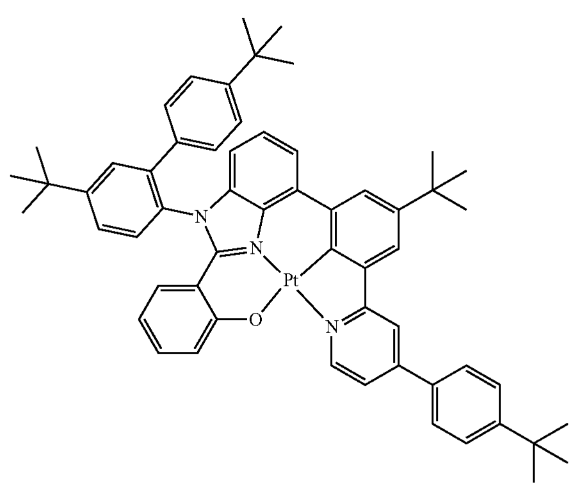

-continued
4-2706
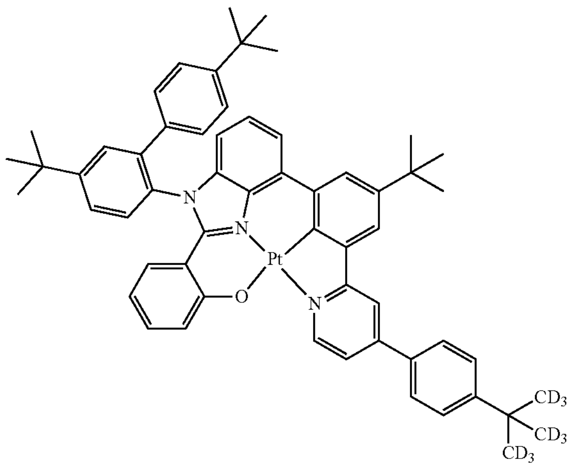
4-2707
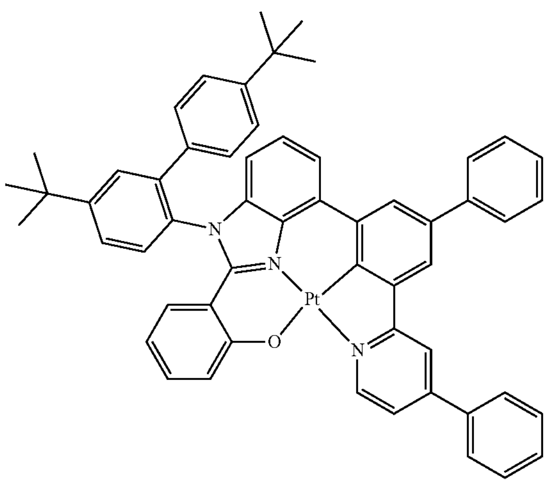
4-2708
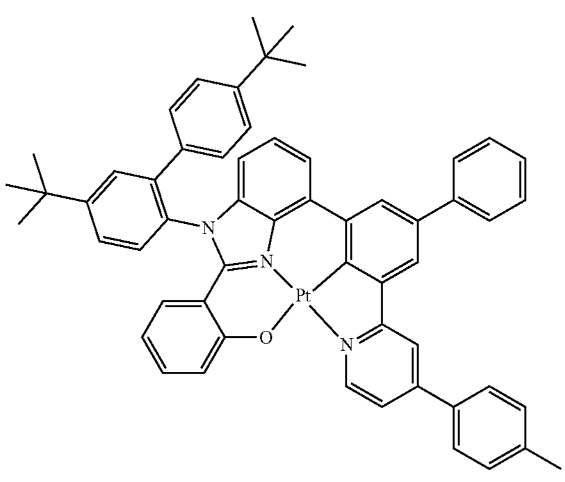
-continued
4-2709
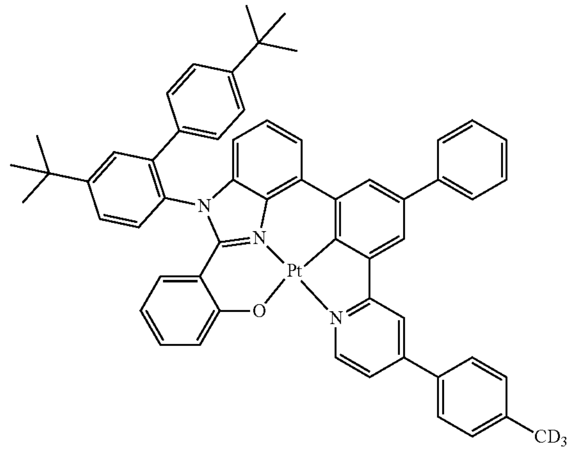
4-2710
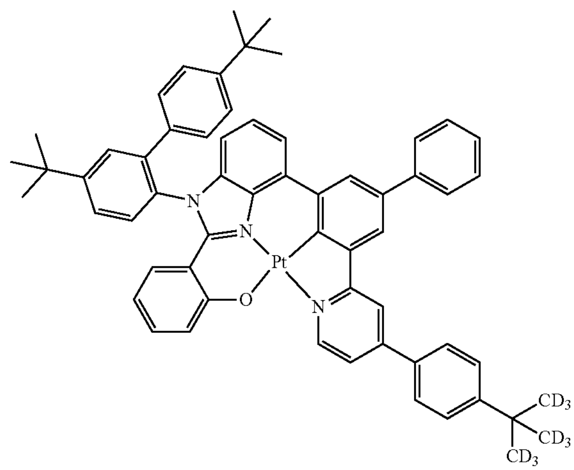
4-2711
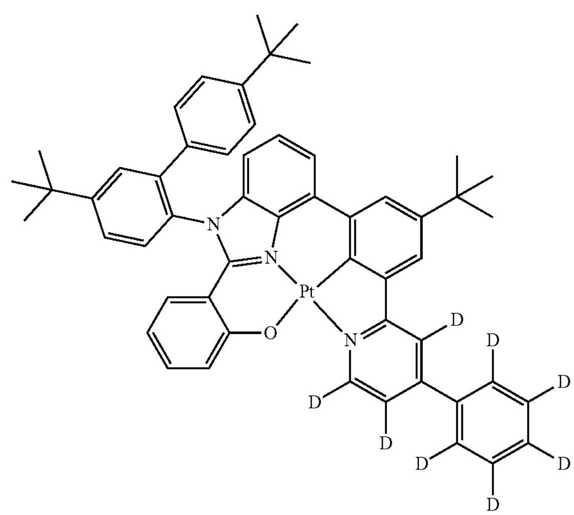

-continued
4-2712
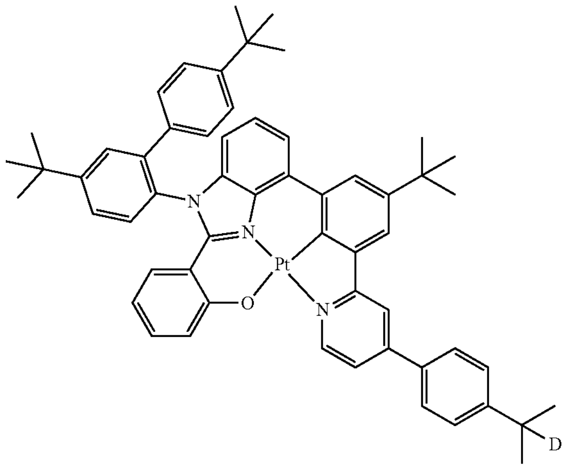
4-2713
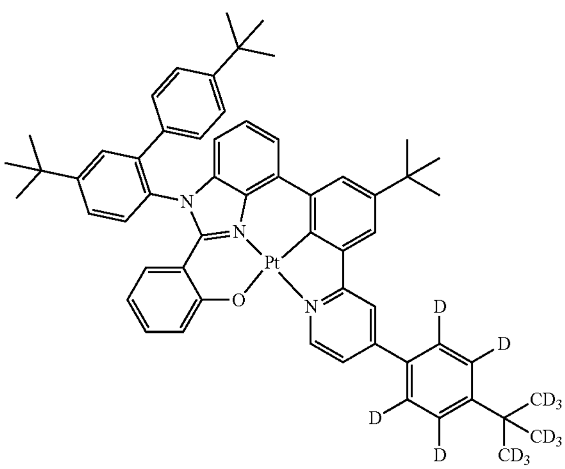
4-2714
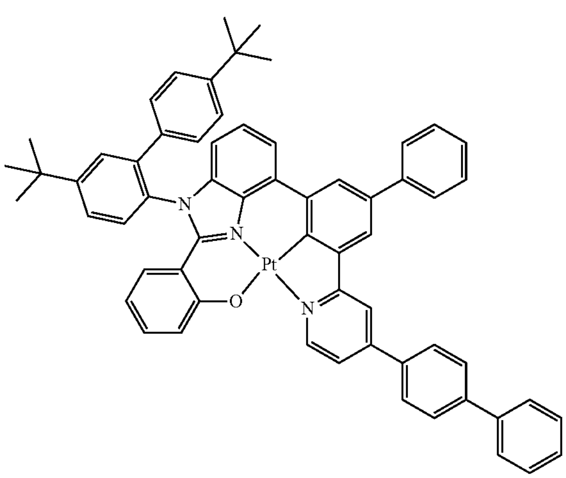
-continued
4-2715
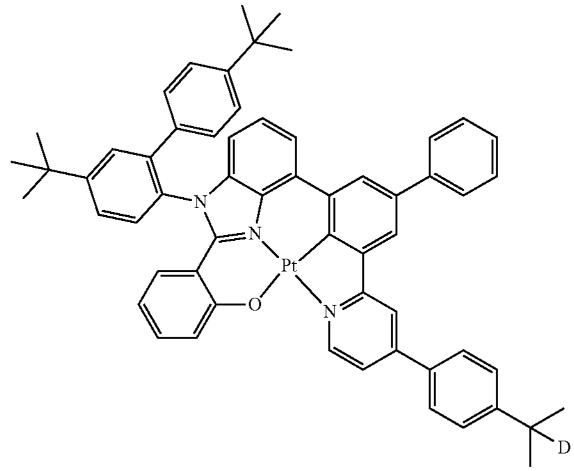
4-2716
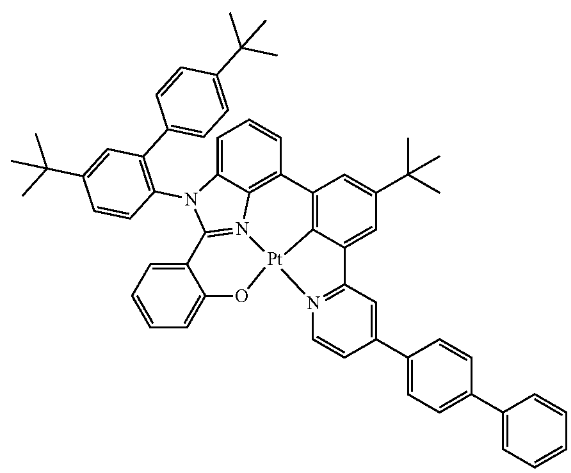
4-2717
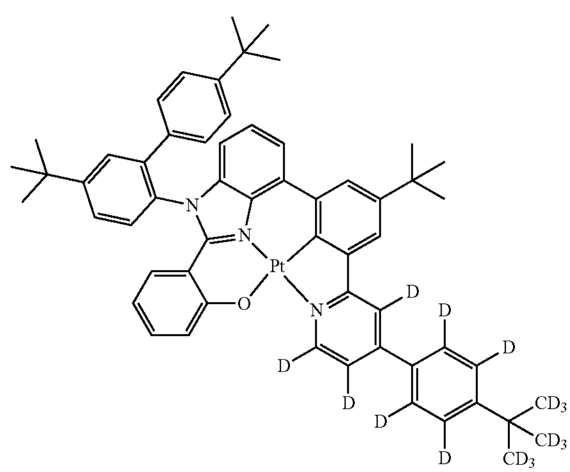

-continued
4-2718
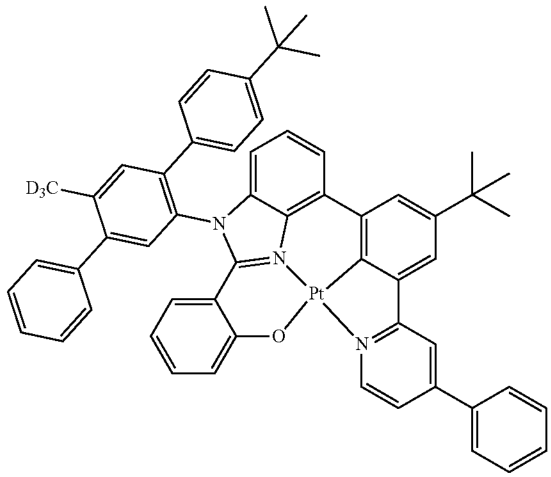
4-2719
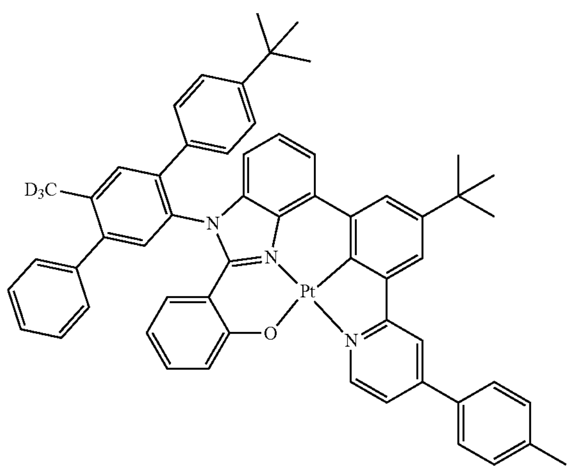
4-2720
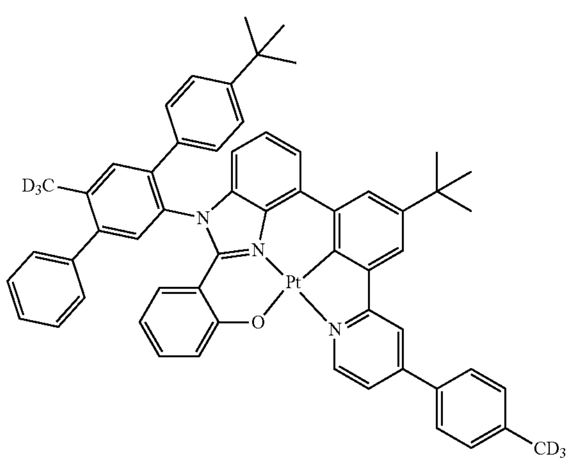
-continued
4-2721
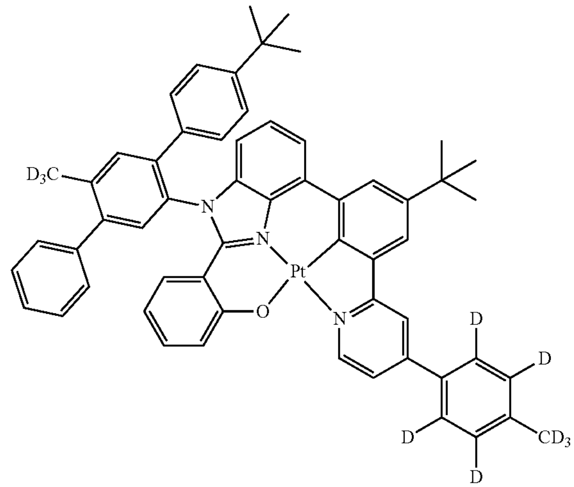
4-2722
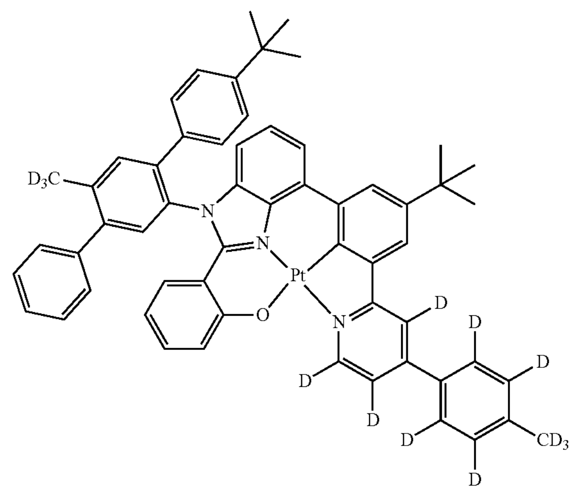
4-2723
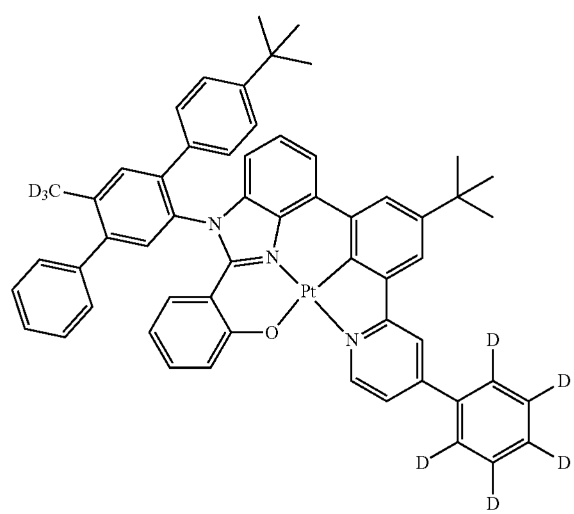

4-2724
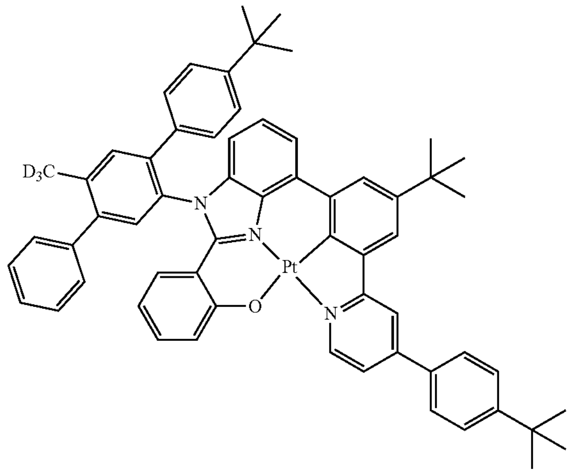
4-2725
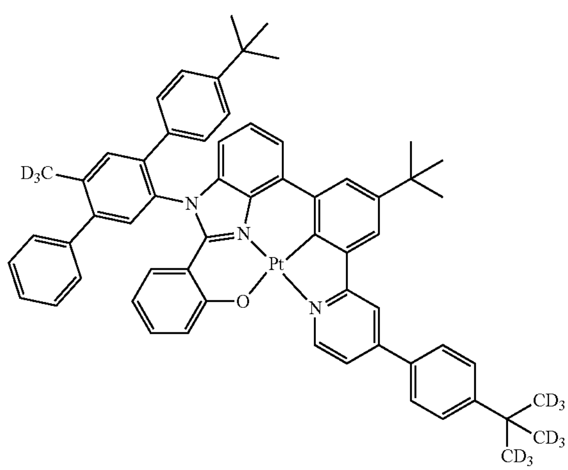
4-2726
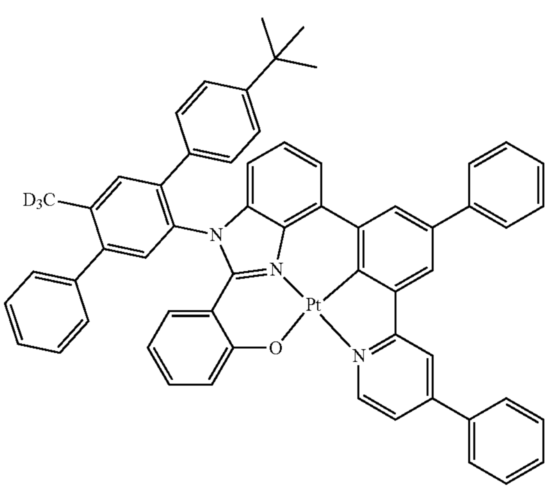
4-2727
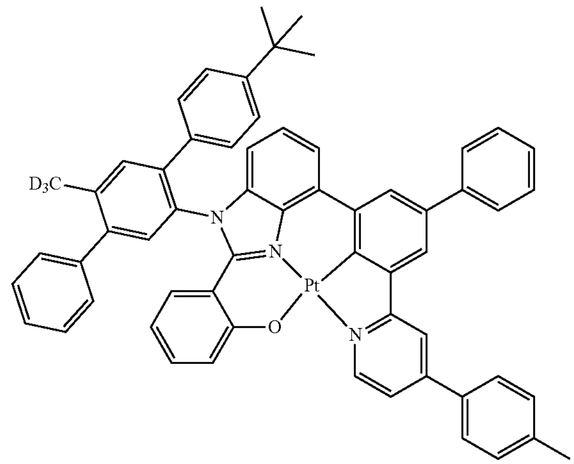
4-2728
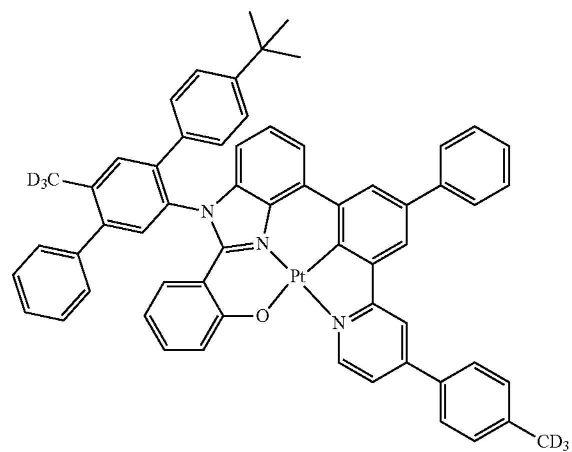
4-2729
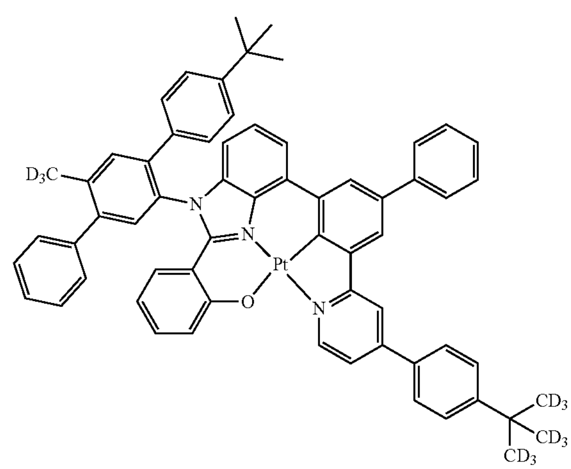

-continued
2-2730
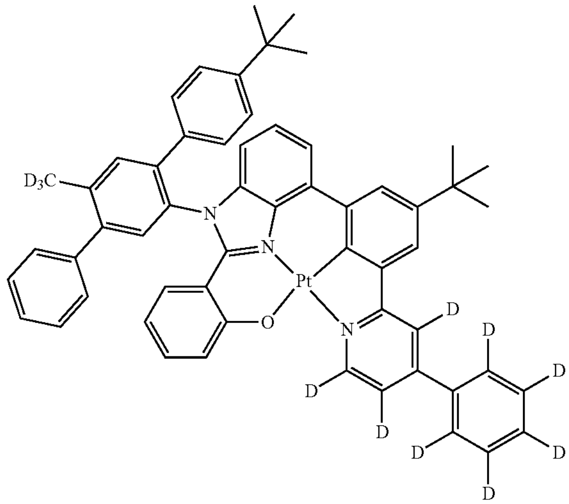
4-2731
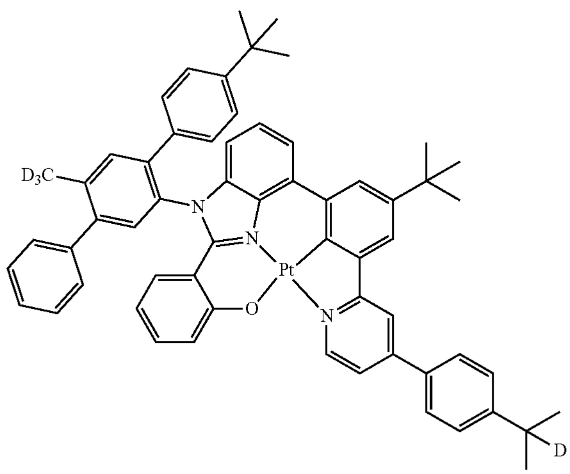
4-2732
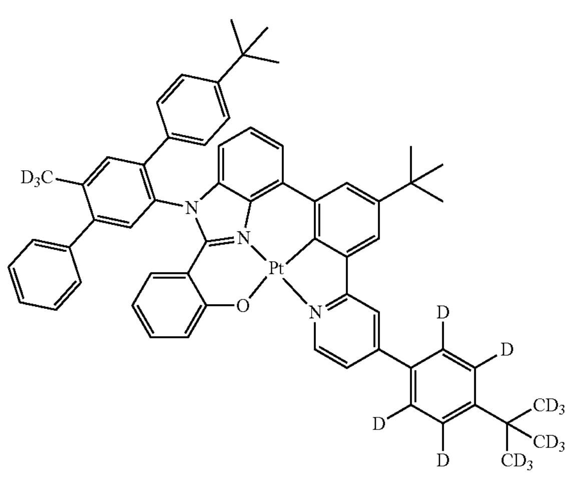
-continued
4-2733
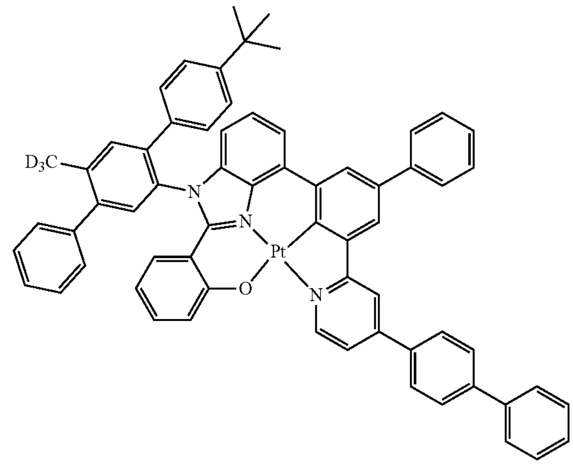
4-2734
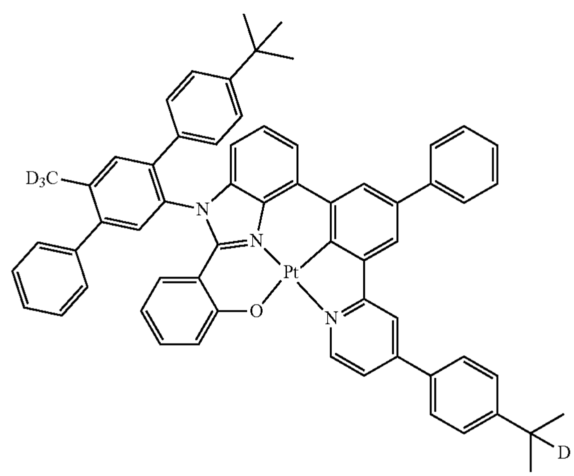
4-2735
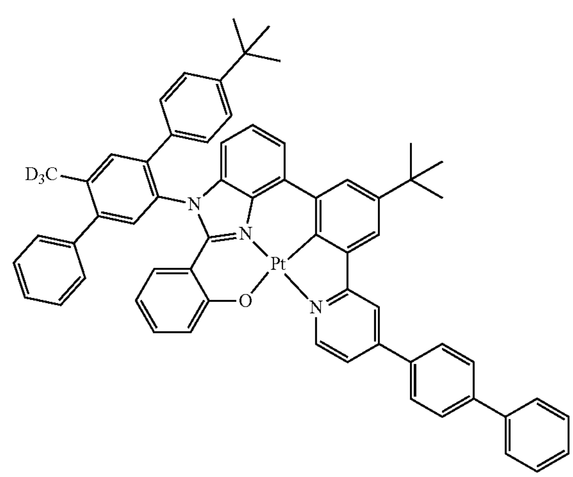

4-2736
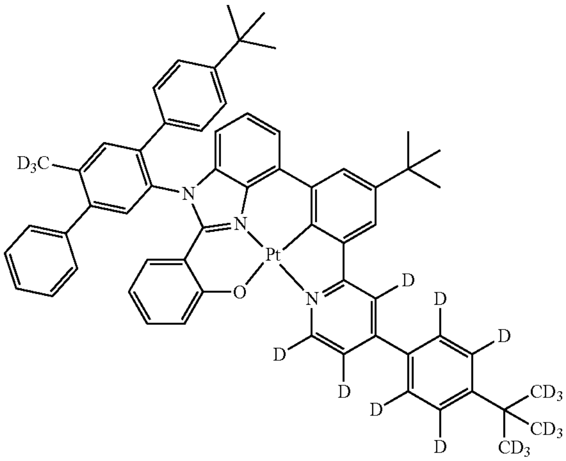
4-2737
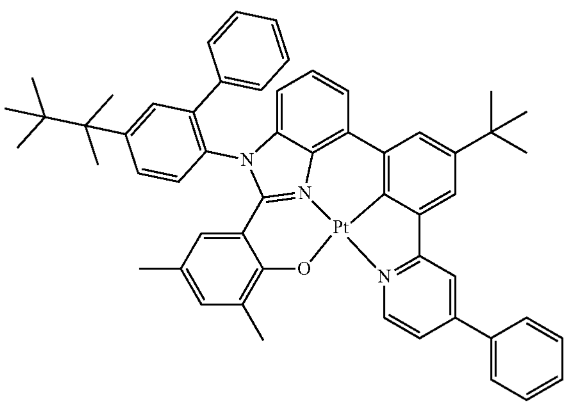
4-2738
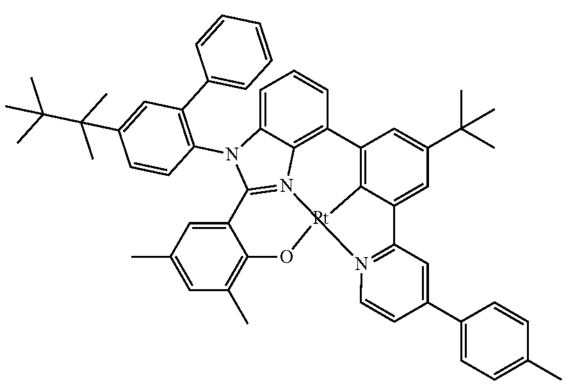
4-2739
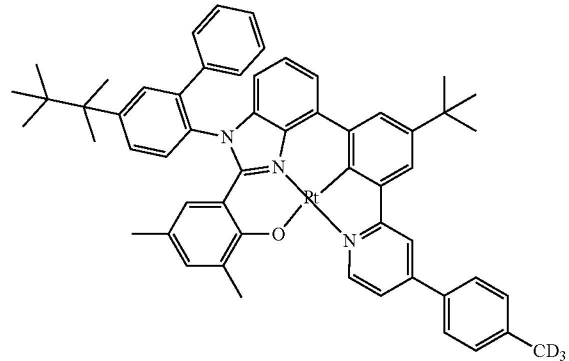
4-2740
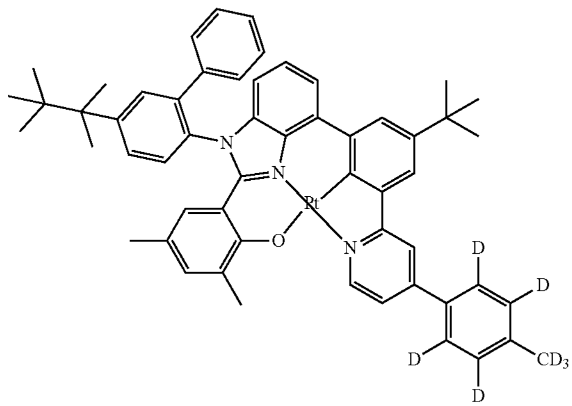
4-2741
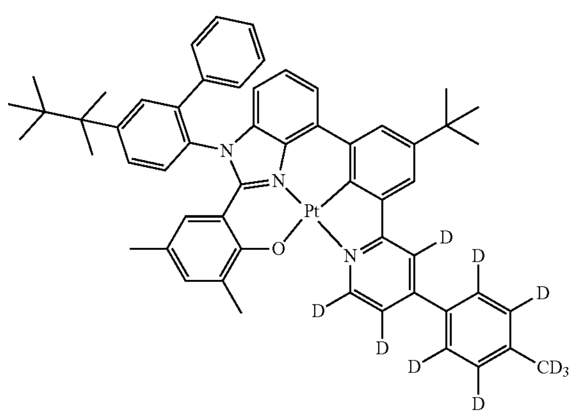

4-2742
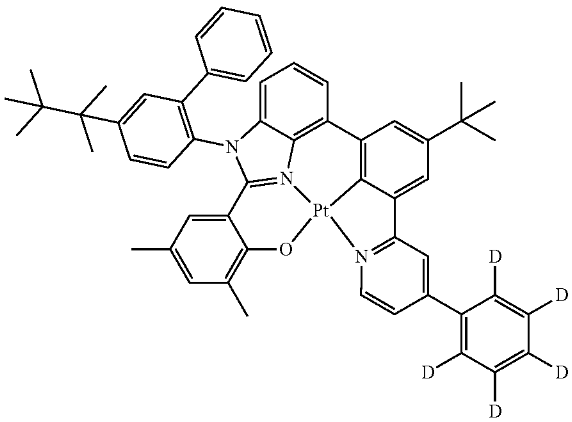
4-2743
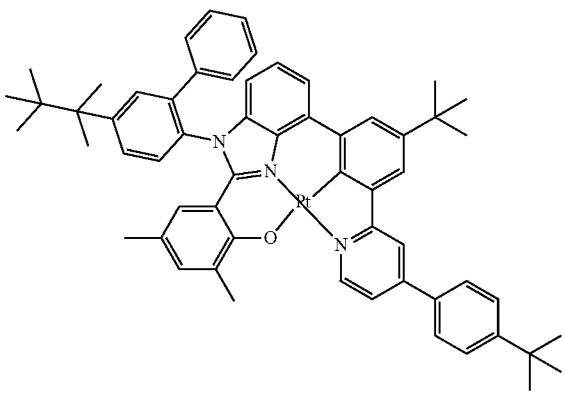
4-2744
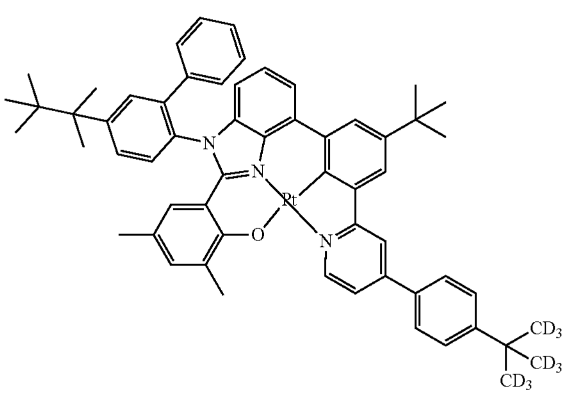
4-2745
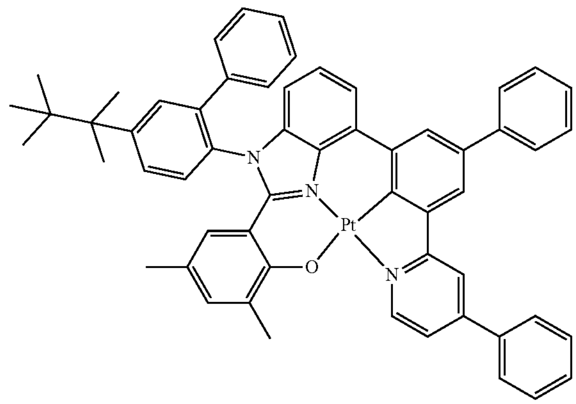
4-2746
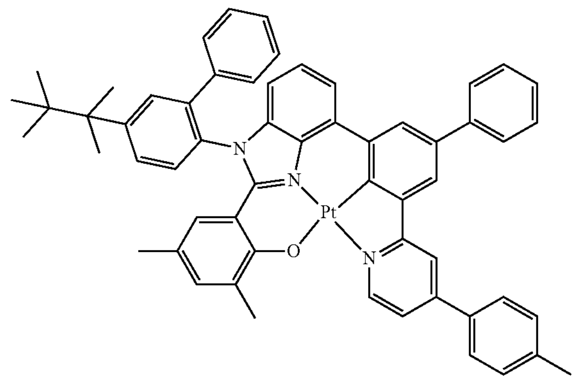
4-2747
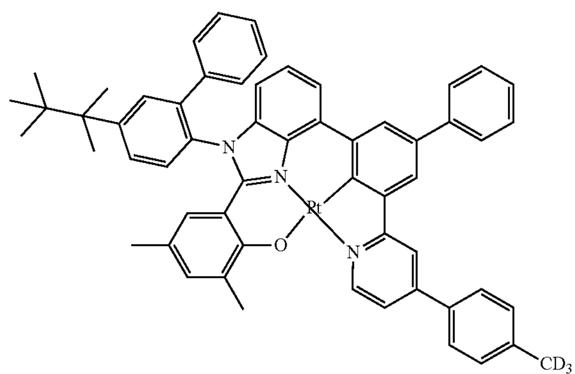
4-2748
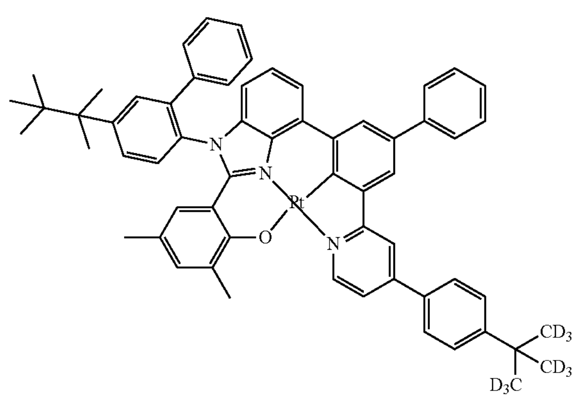

4-2749
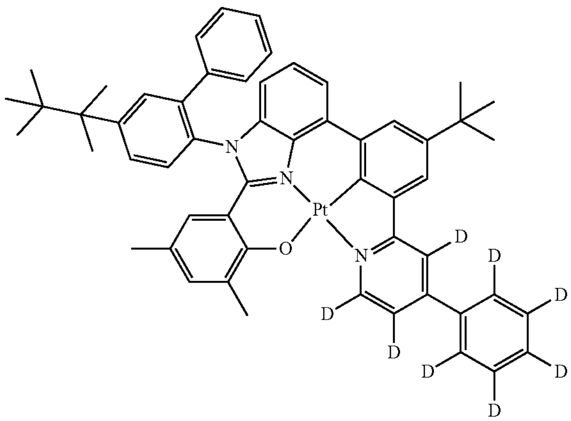
4-2750
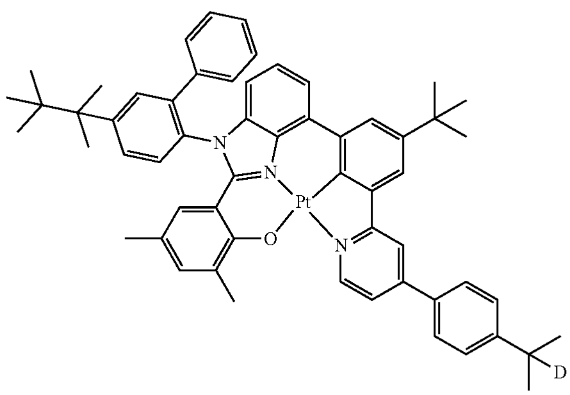
4-2751
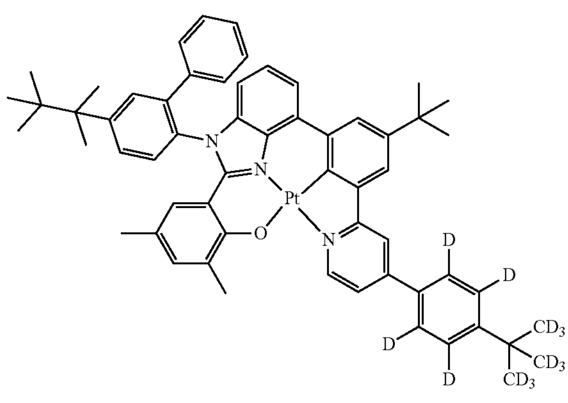
4-2752
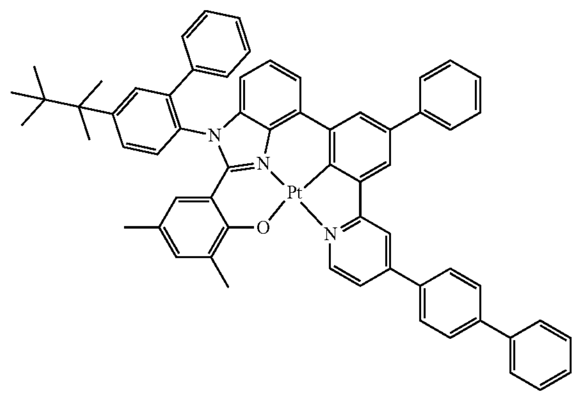
4-2753
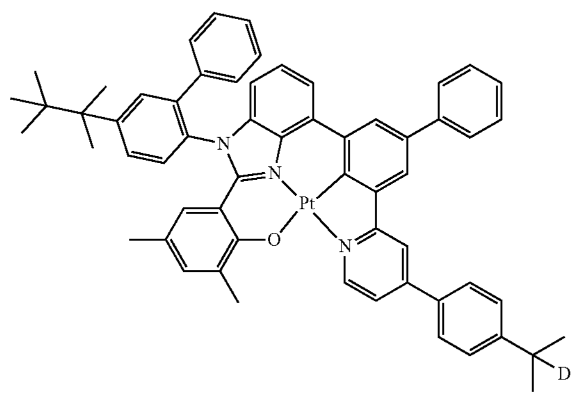
4-2754
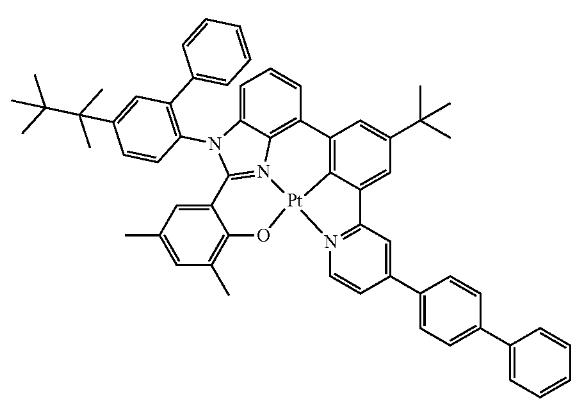
4-2755
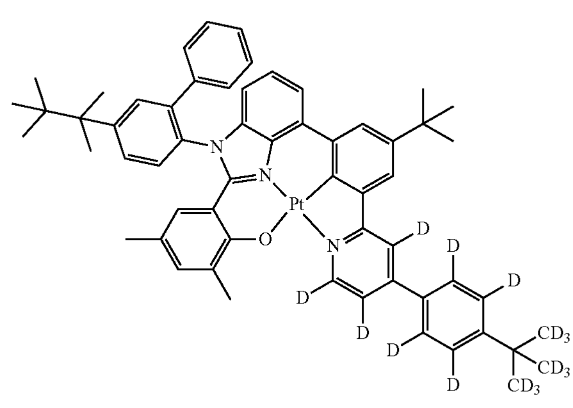

4-2756
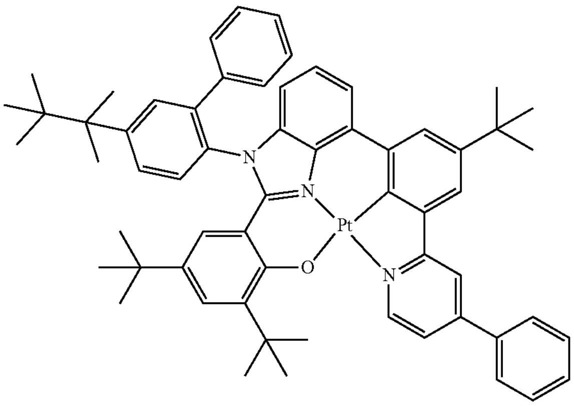
4-2757
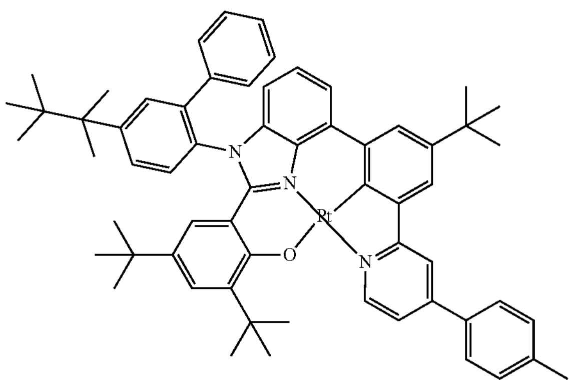
4-2758
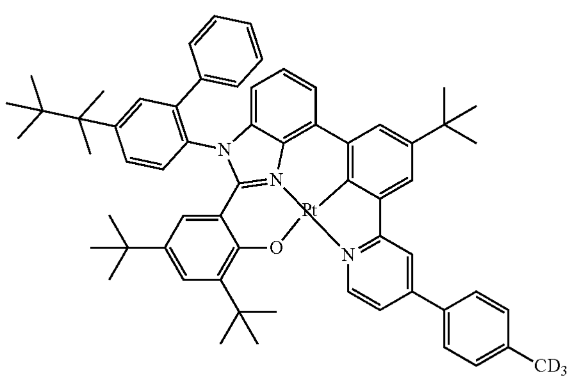
4-2759
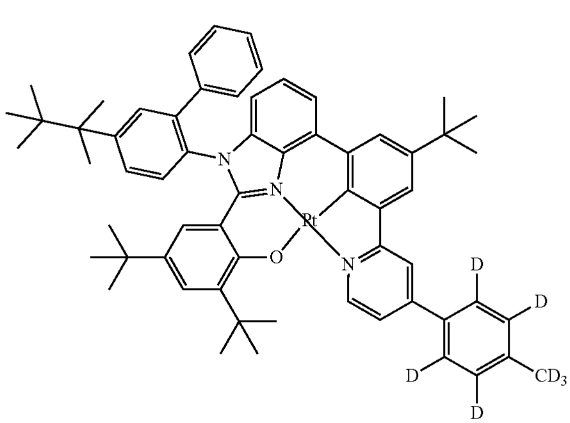
4-2760
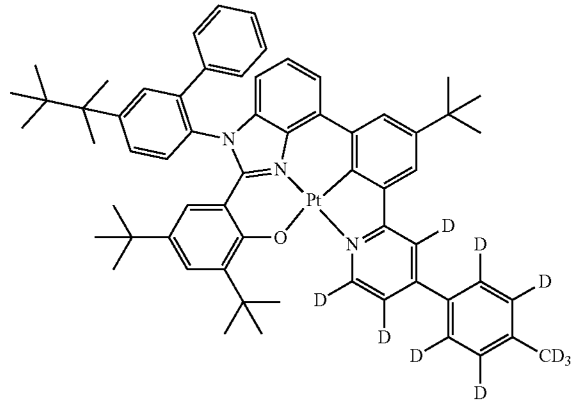
4-2761
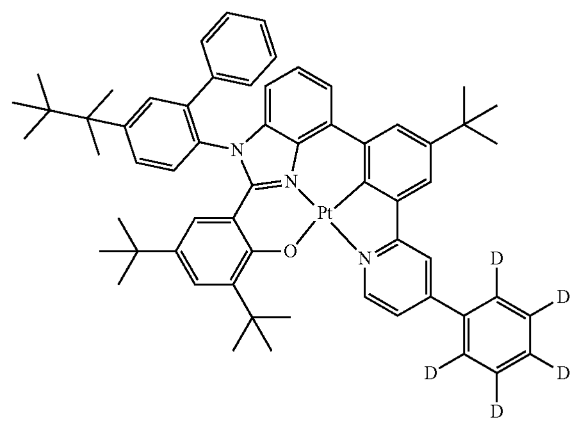
4-2762
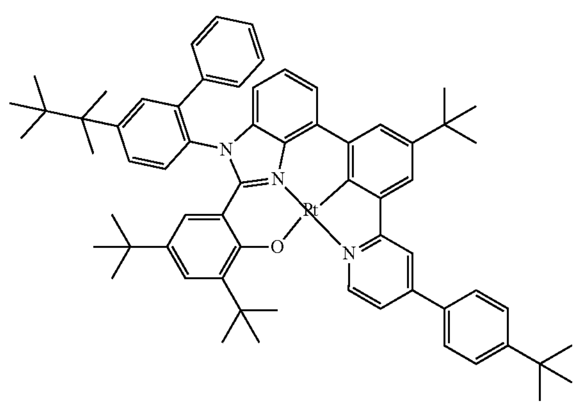

4-2763
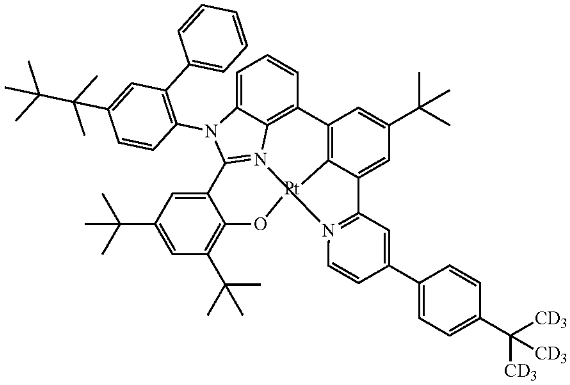
4-2764
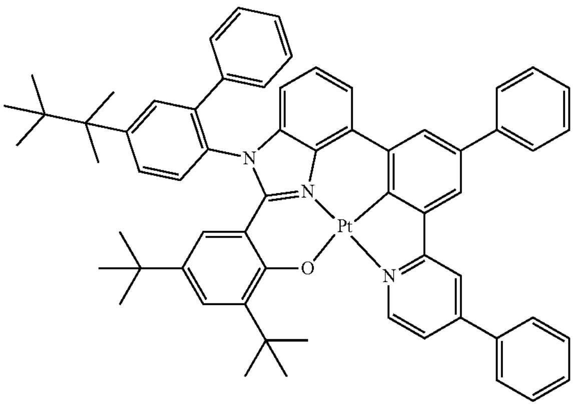
4-2765
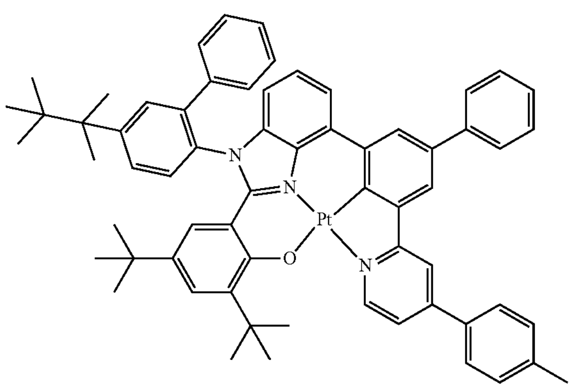
4-2766
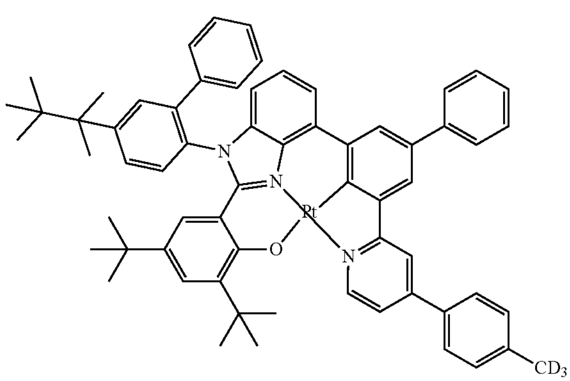
4-2767
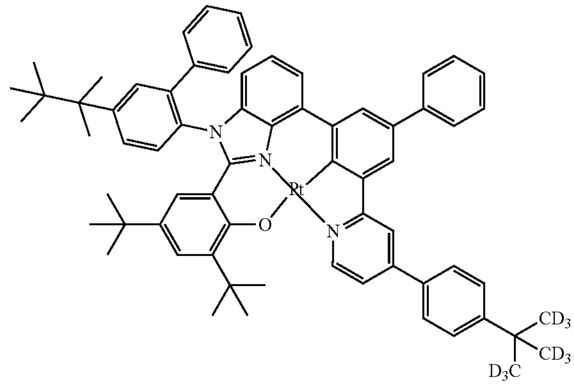
4-2768
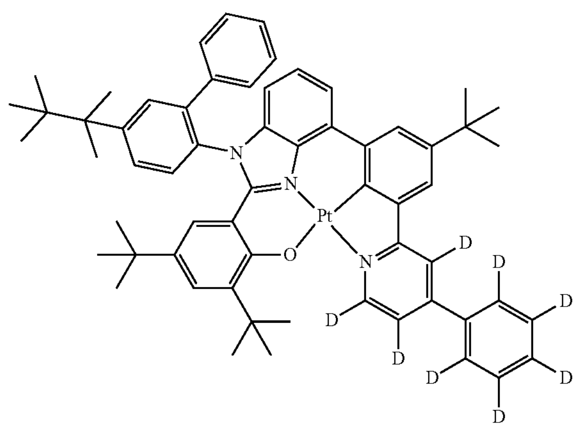
4-2769
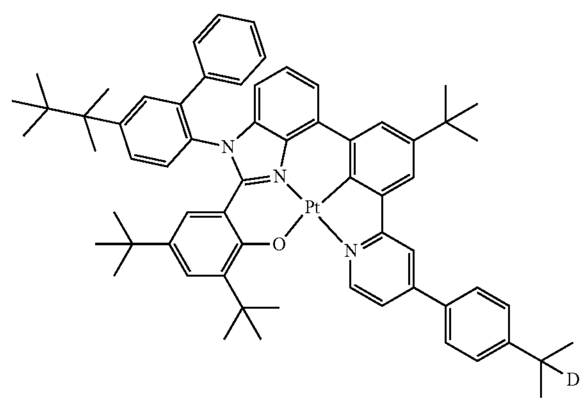

-continued
4-2770
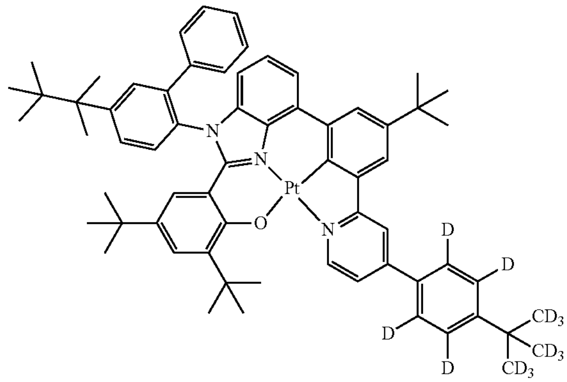
4-2771
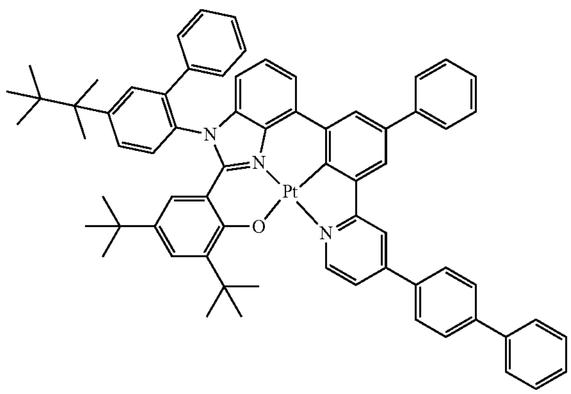
4-2772
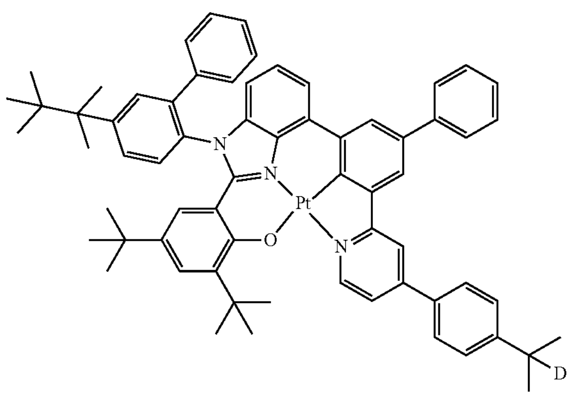
4-2773
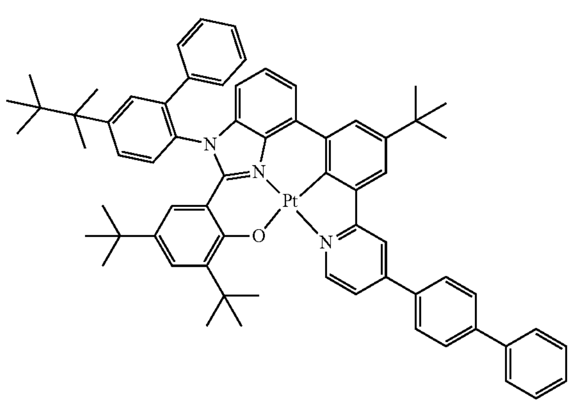
-continued
4-2774
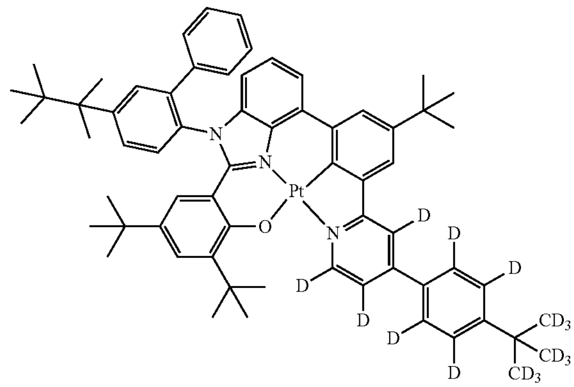
4-2775
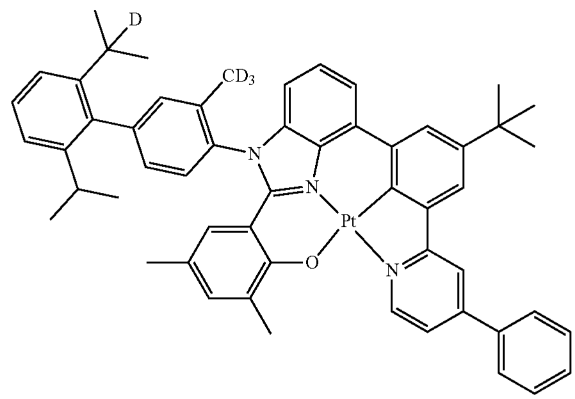
4-2776
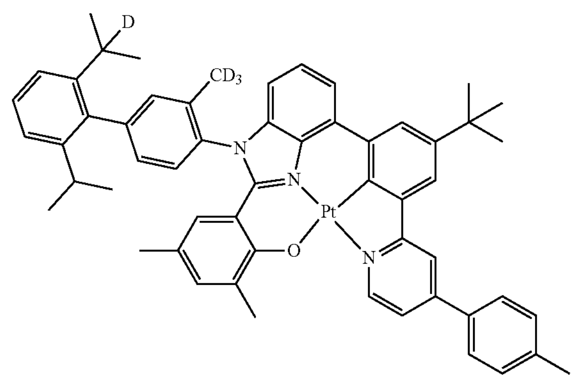
4-2777
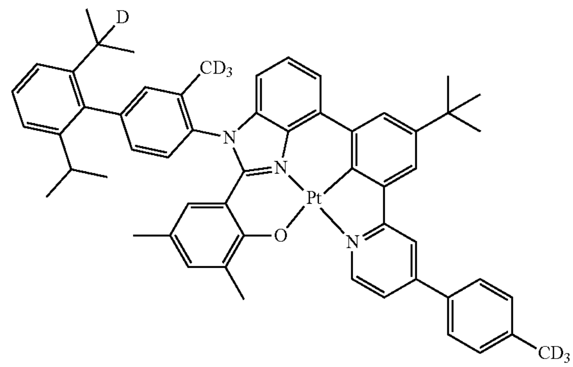

-continued
4-2778
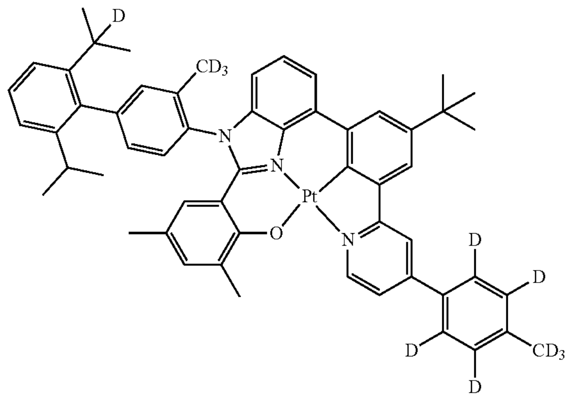
4-2779
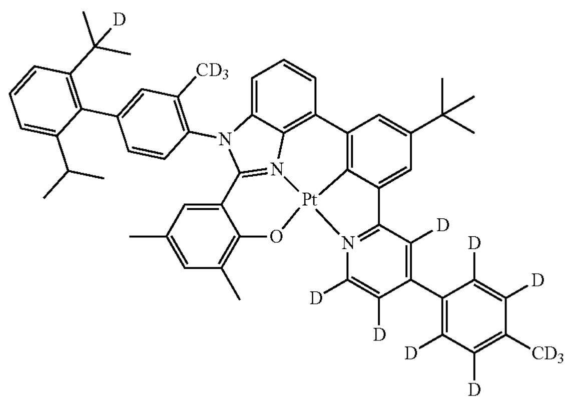
4-2780
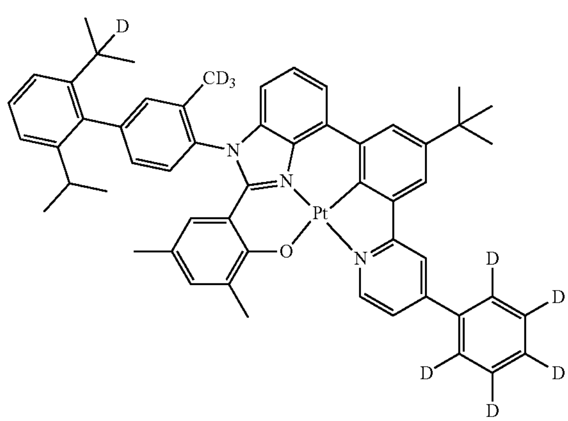
-continued
4-2781
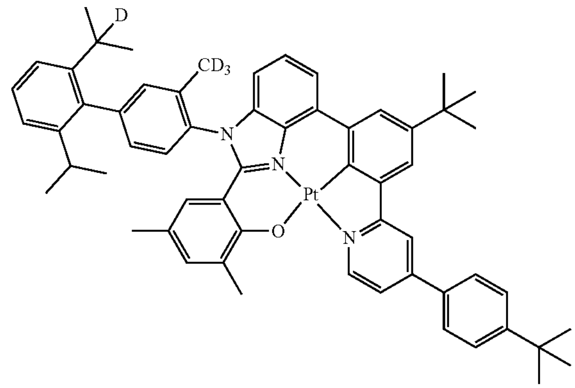
4-2782
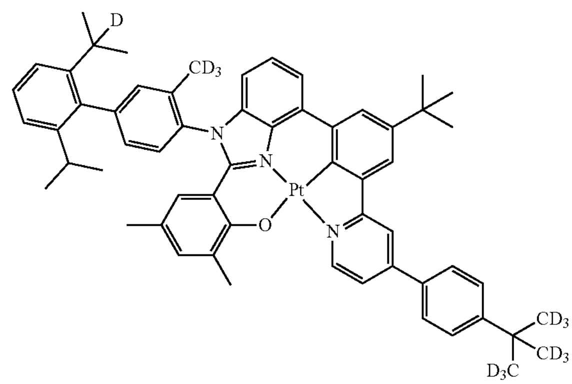
4-2783
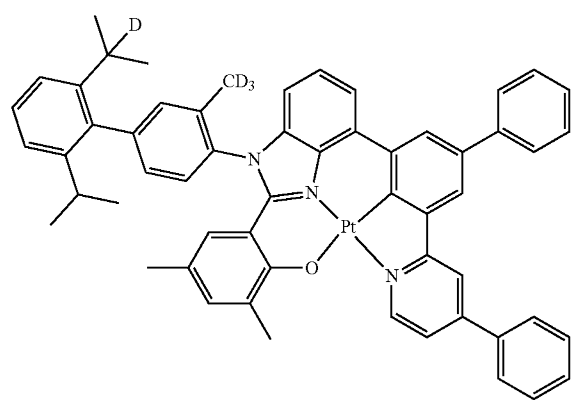
4-2784
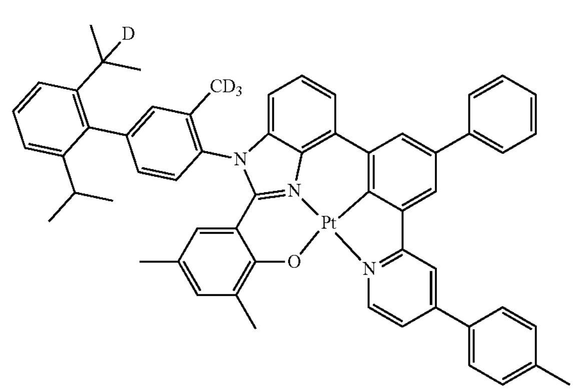

-continued
4-2785
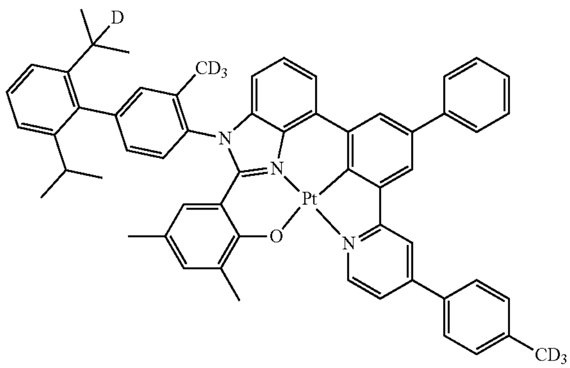
4-2786
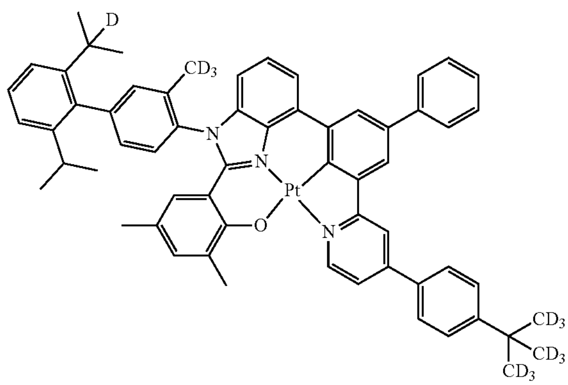
4-2787
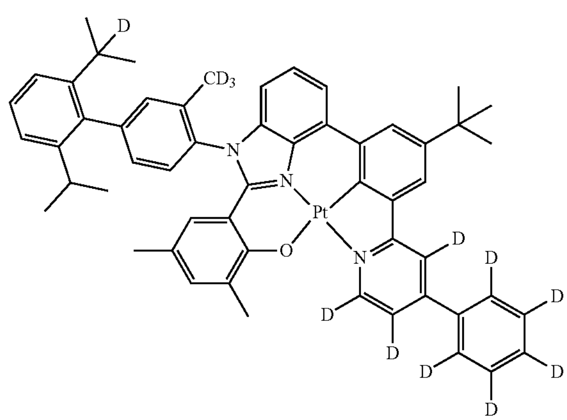
4-2788
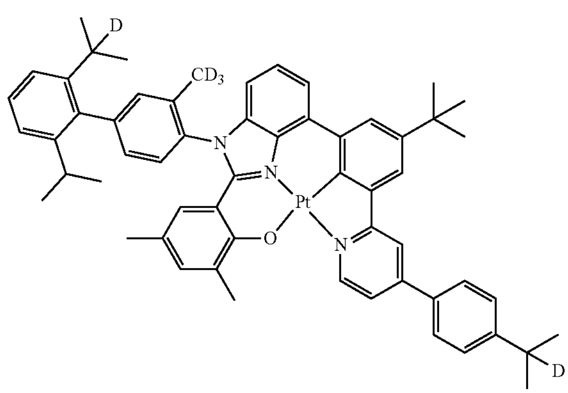
-continued
4-2789
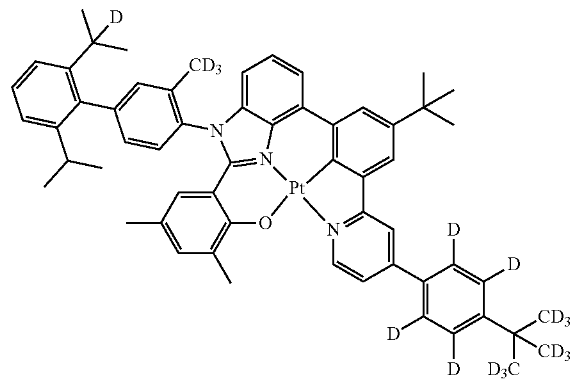
4-2790
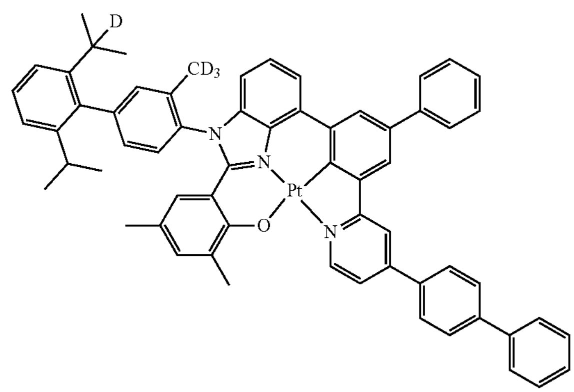
4-2791
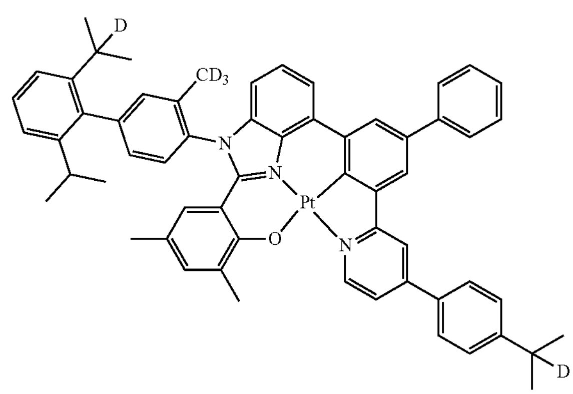
4-2792
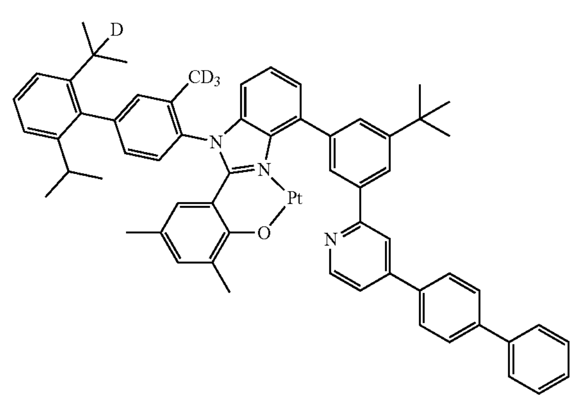

4-2793
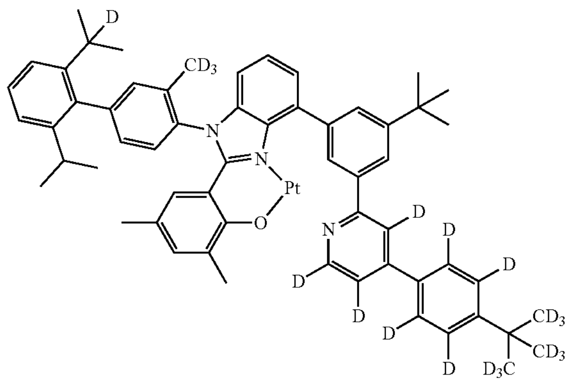
4-2794
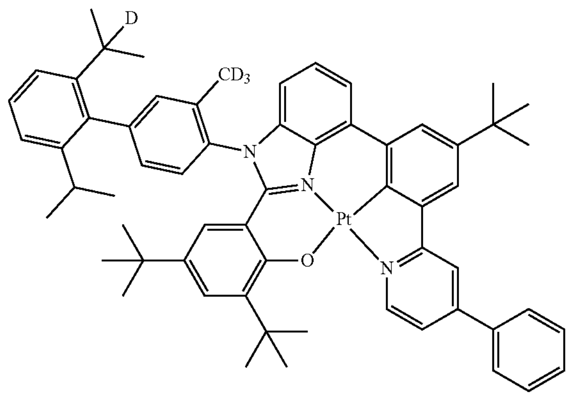
4-2795
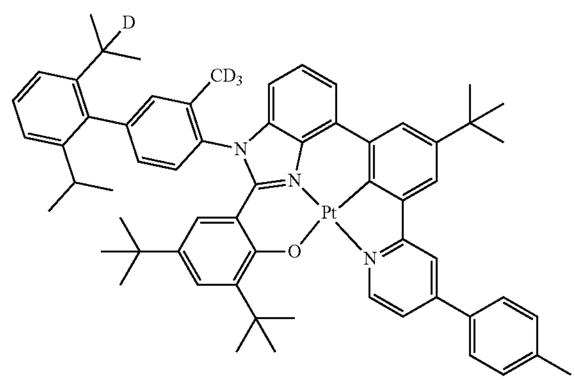
4-2796
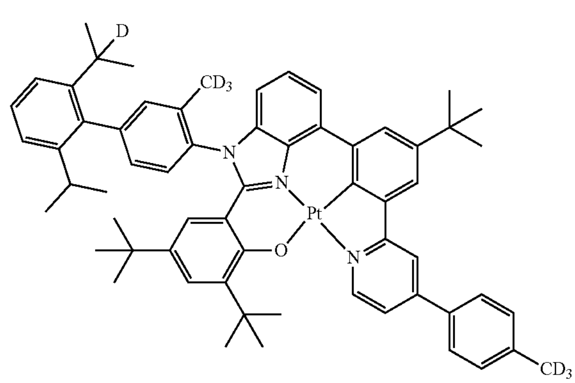
4-2797
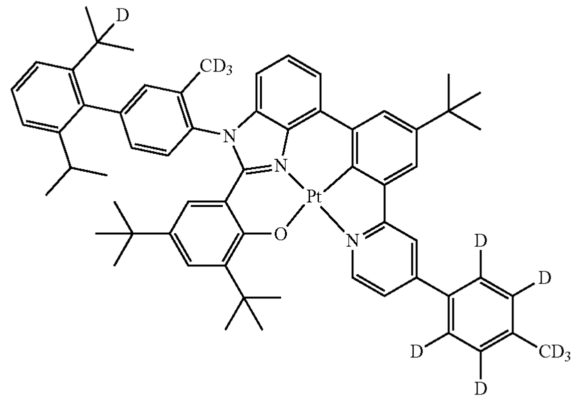
4-2798
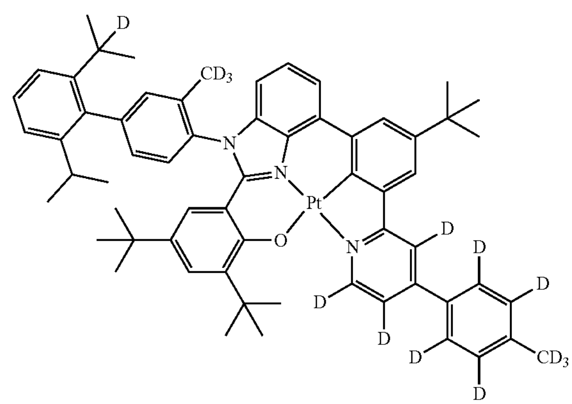
4-2799
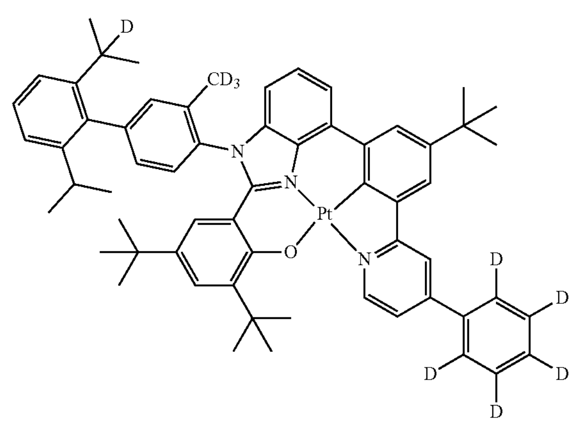

-continued
4-2800
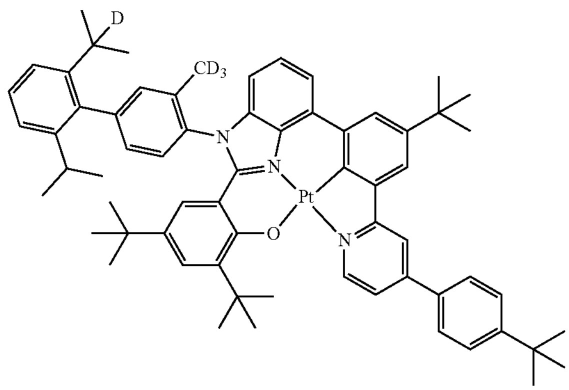
4-2801
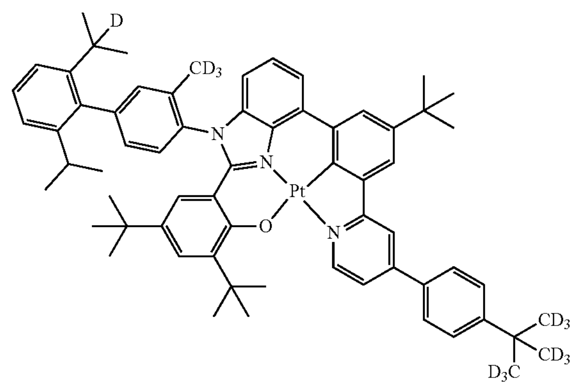
4-2802
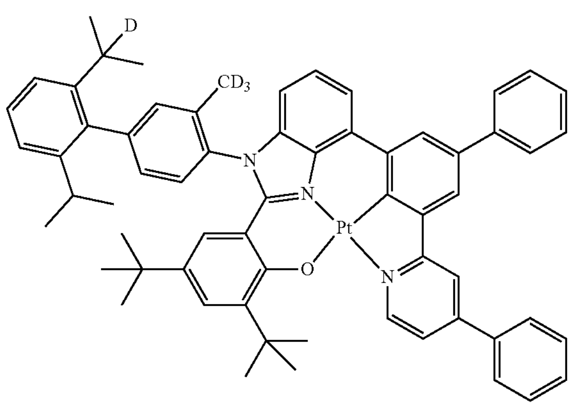
4-2803
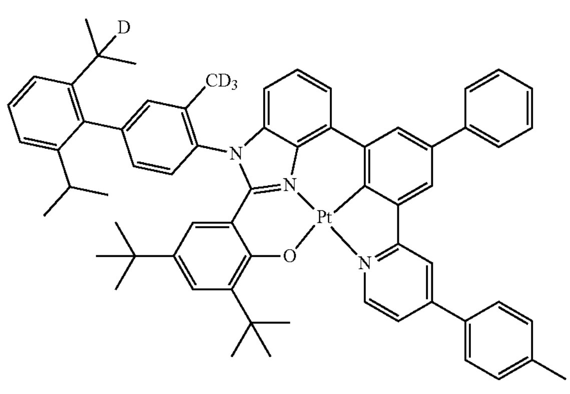
-continued
4-2804
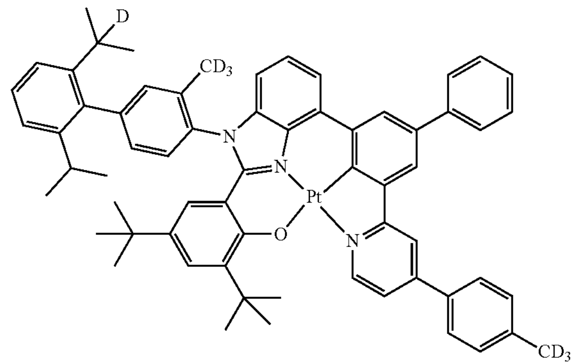
4-2805
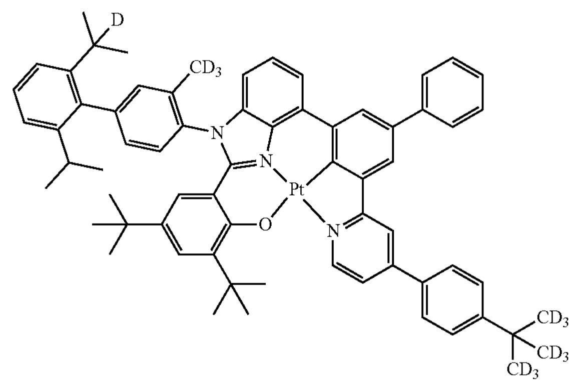
4-2806
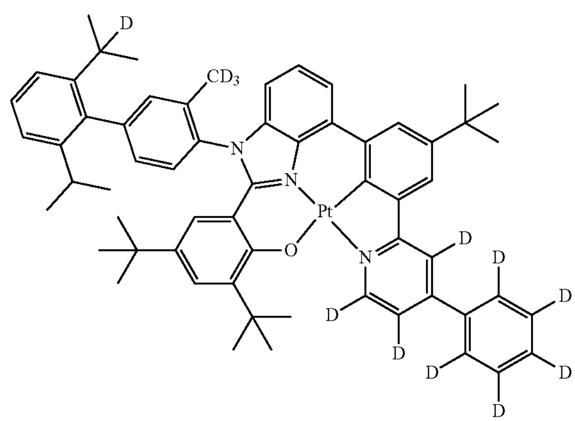
4-2807
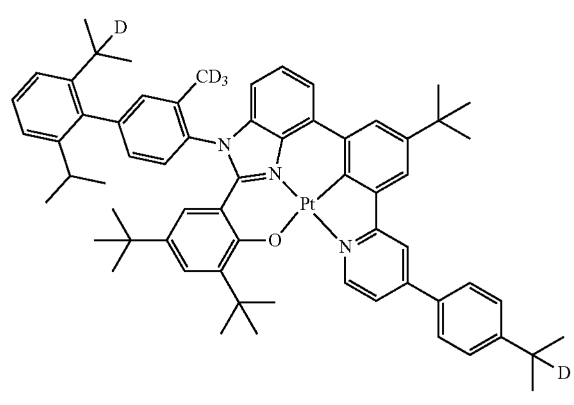

-continued
4-2808
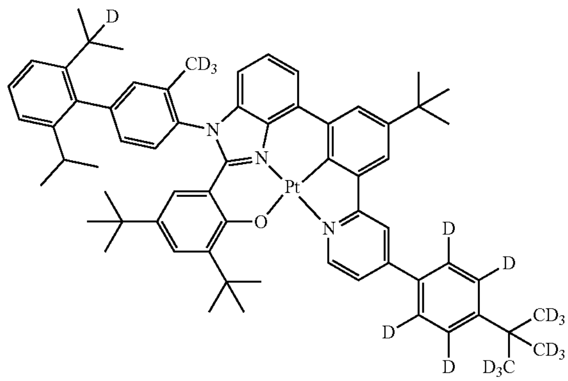
4-2809
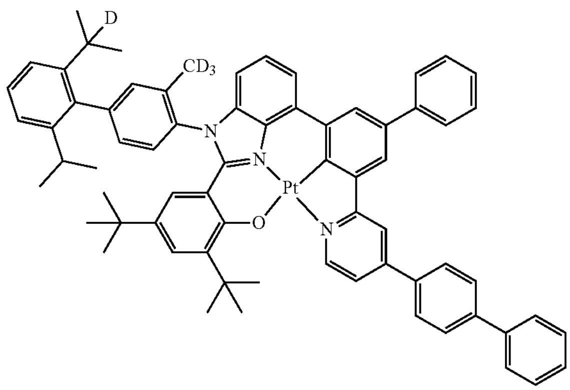
4-2810
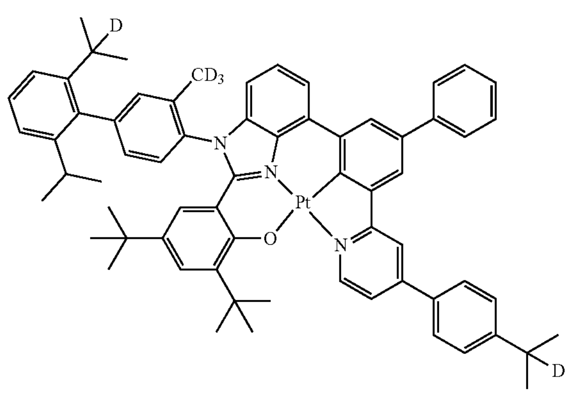
4-2811
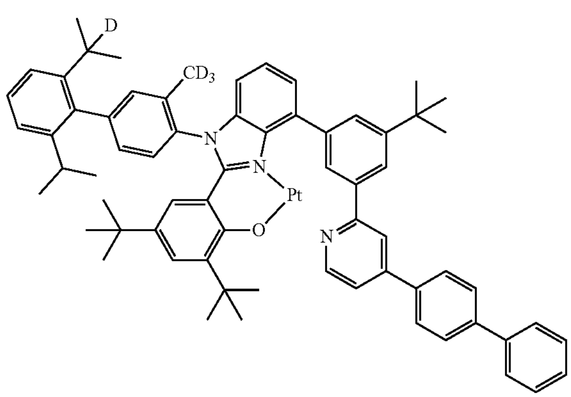
-continued
4-2812
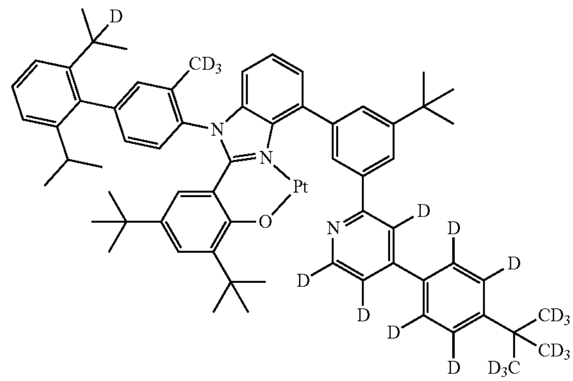
4-2813
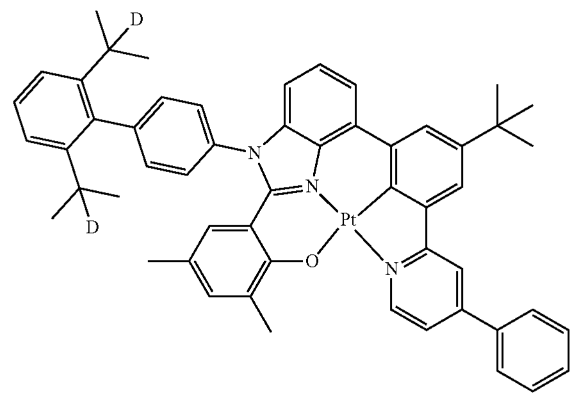
4-2814
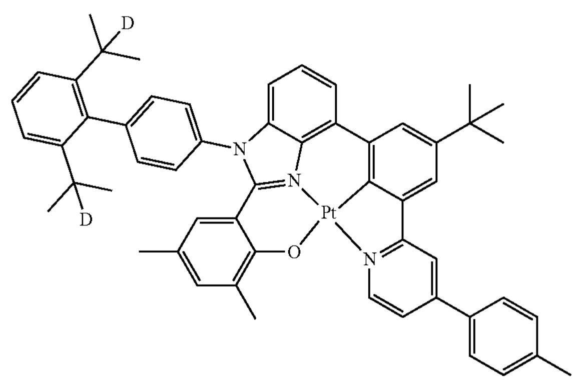
4-2815
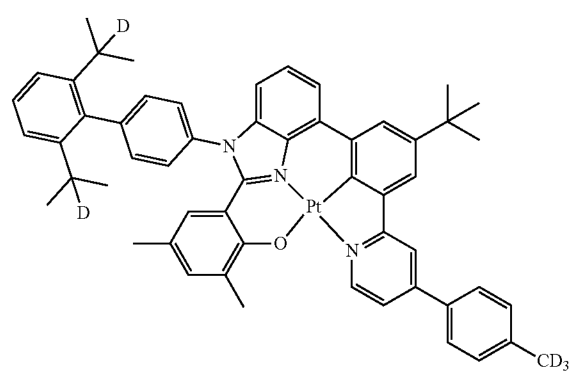

-continued
4-2816
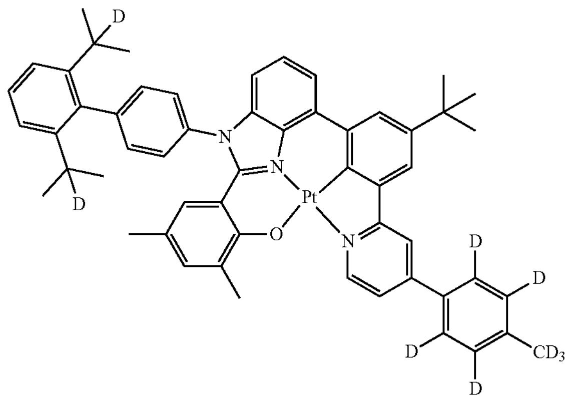
4-2817
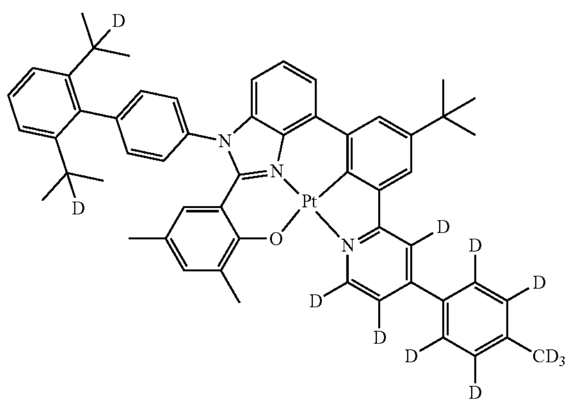
4-2818
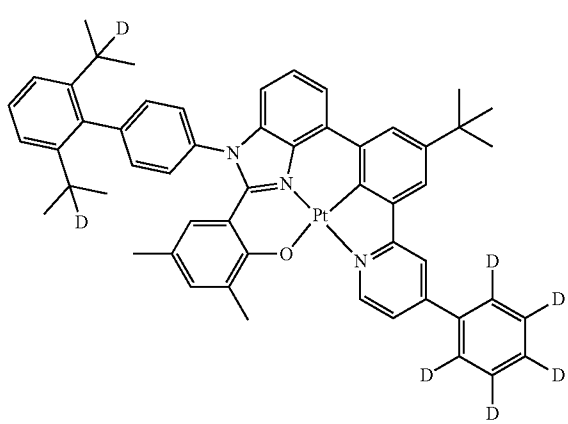
-continued
4-2819
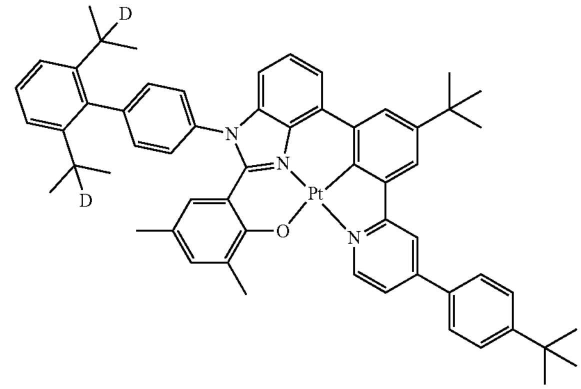
4-2820
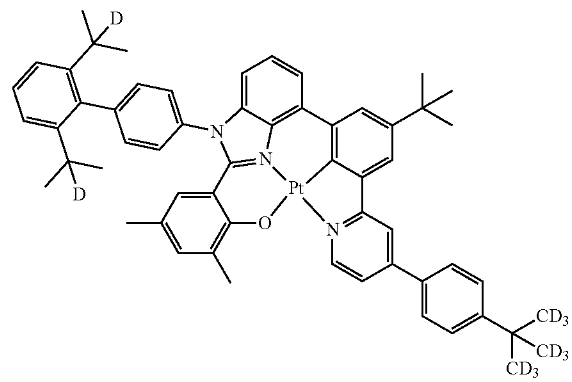
4-2821
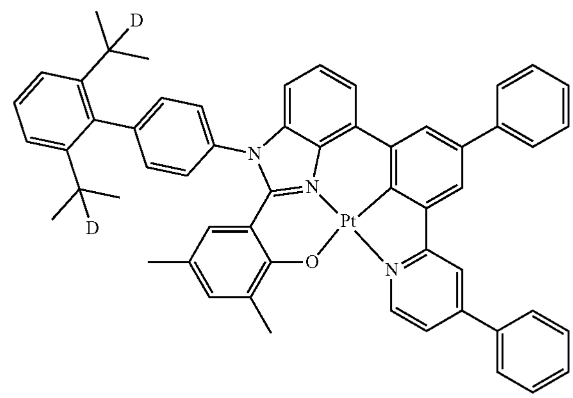
4-2822
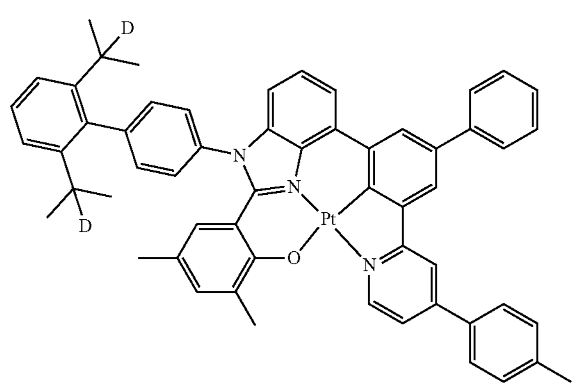

4-2823
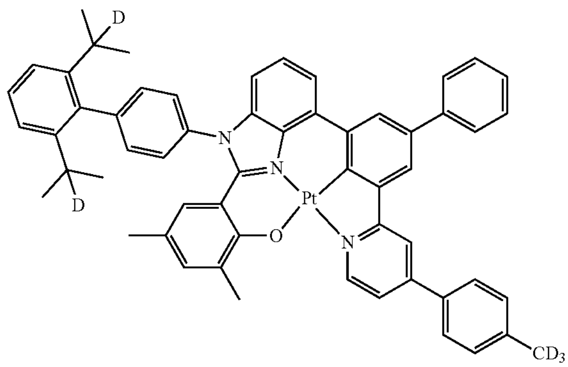
4-2824
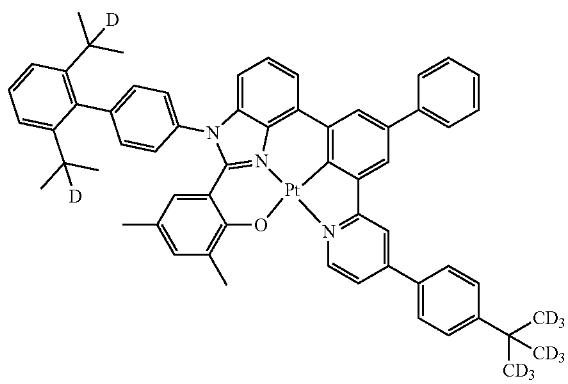
4-2825
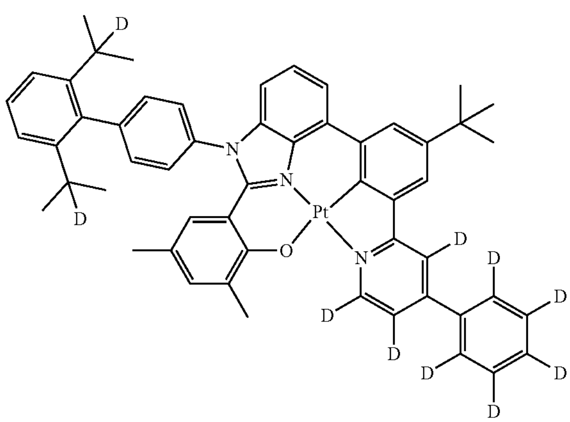
4-2826
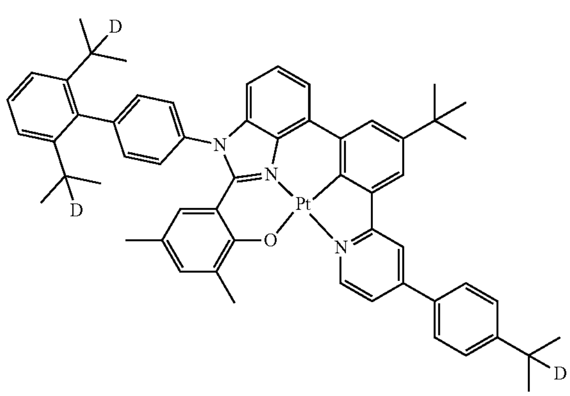
4-2827
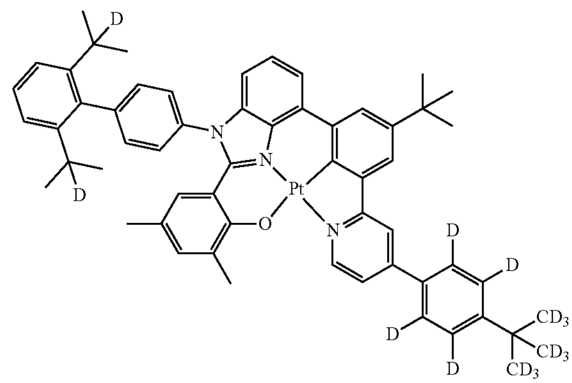
4-2828
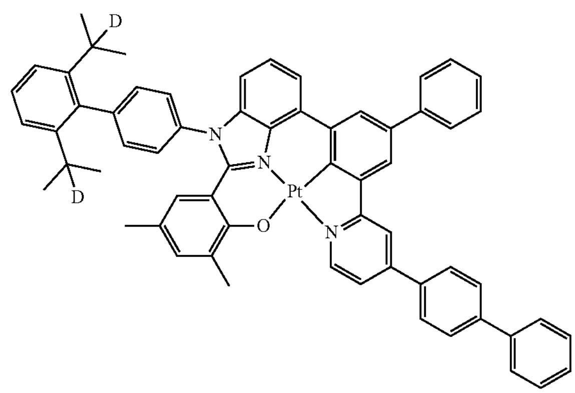
4-2829
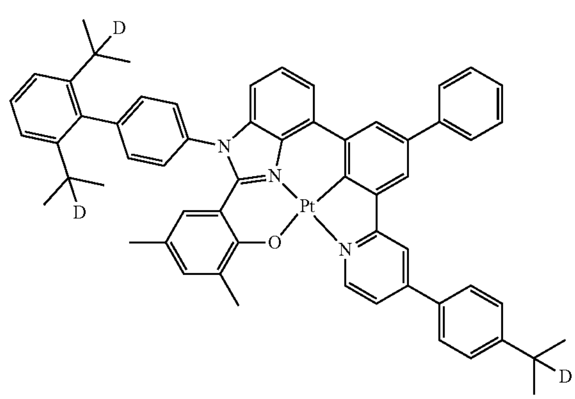
4-2830
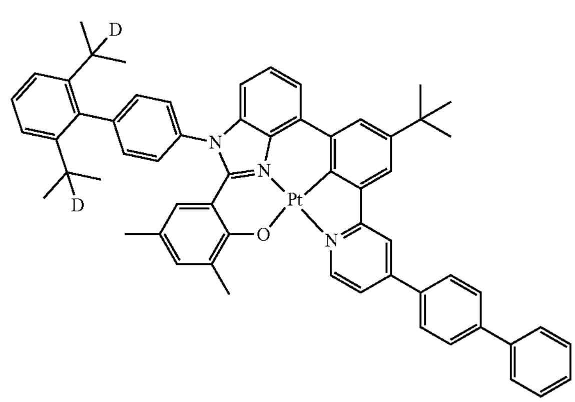

-continued
4-2831
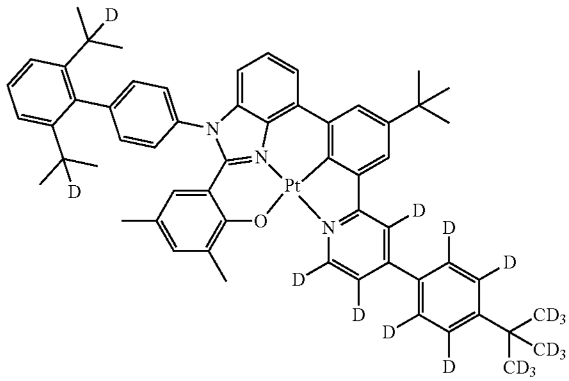
4-2832
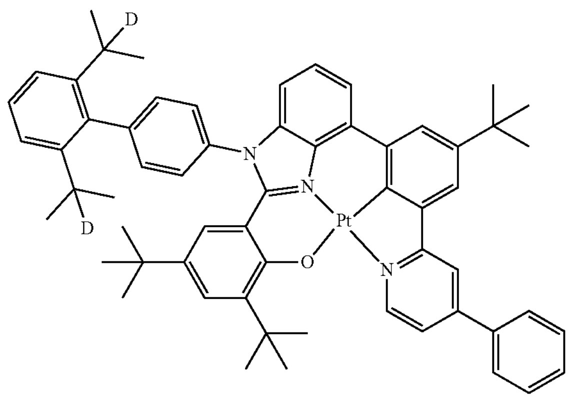
4-2833
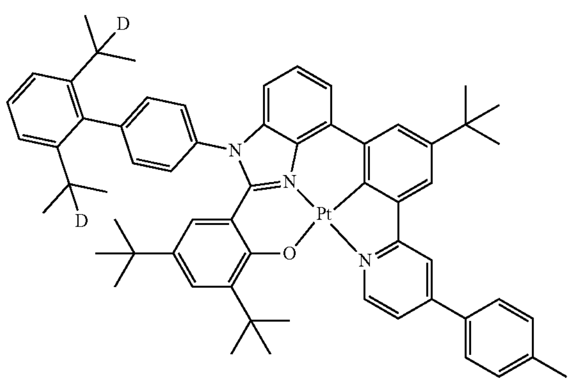
4-2834
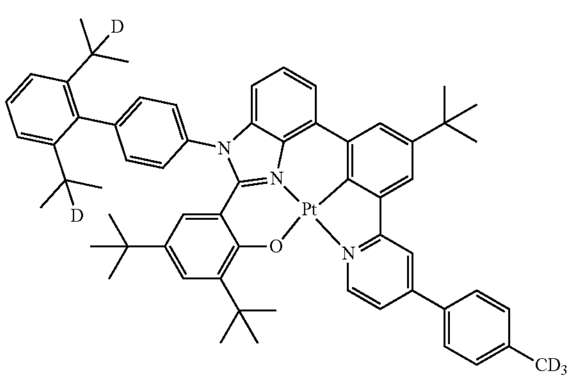
-continued
4-2835
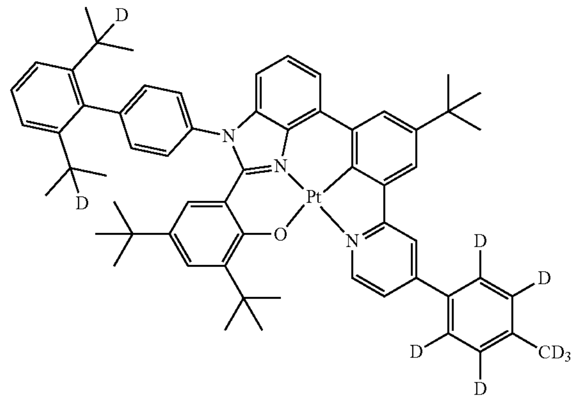
4-2836
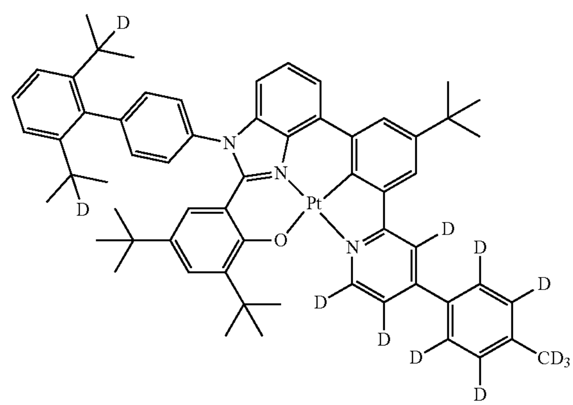
4-2837
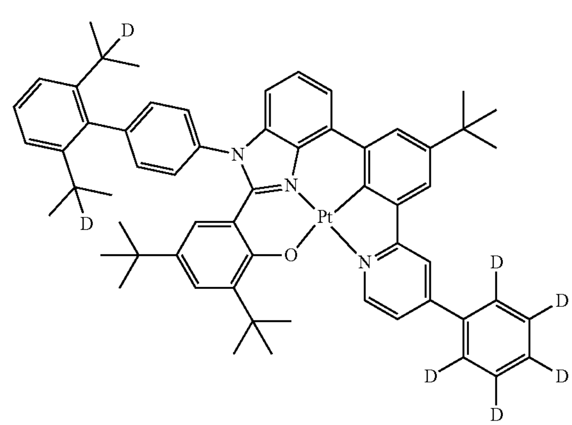

-continued
4-2838
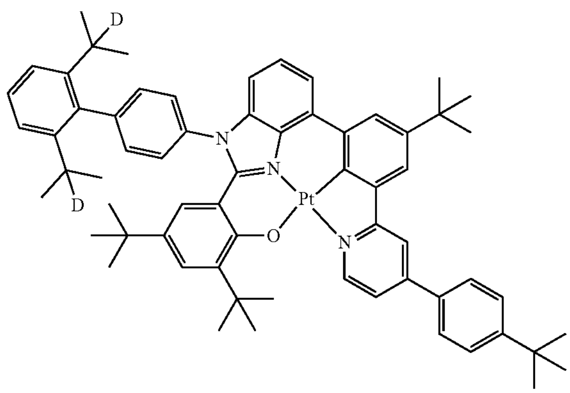
4-2839
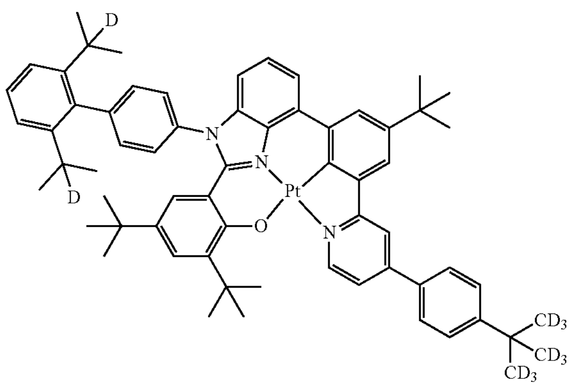
4-2840
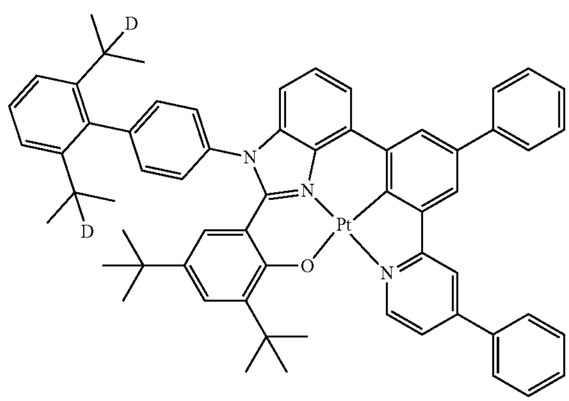
4-2841
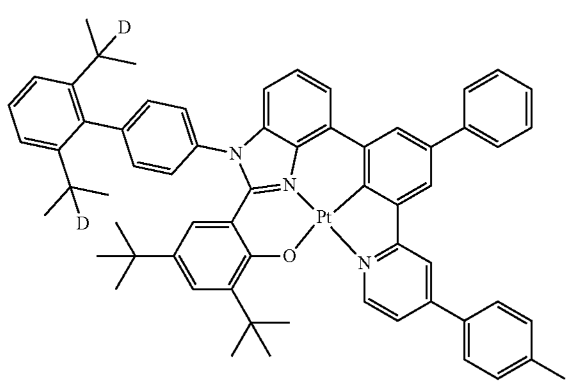
-continued
4-2842
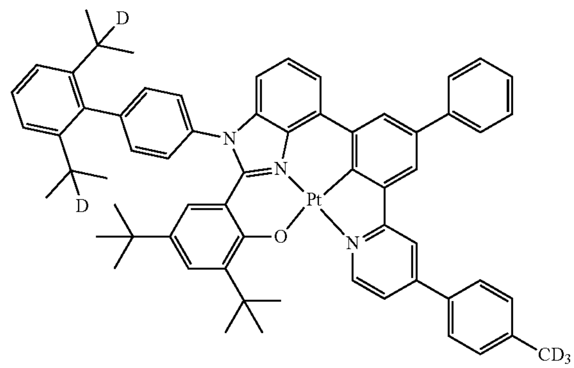
4-2843
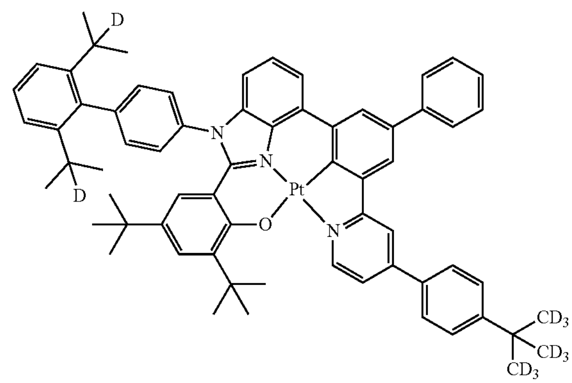
4-2844
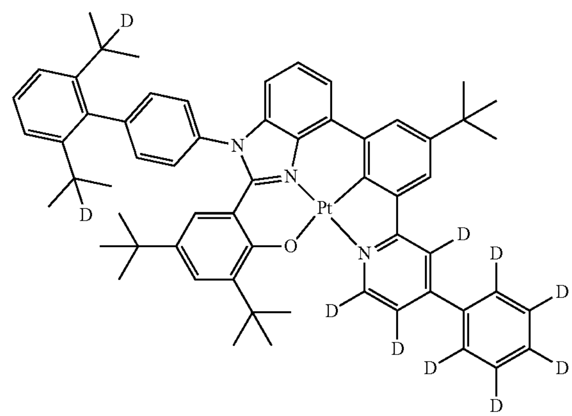
4-2845
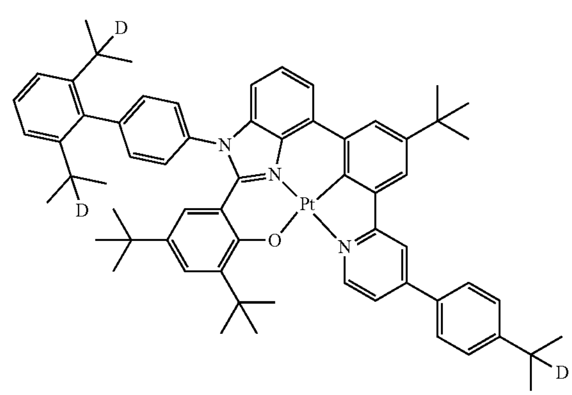

-continued
4-2846
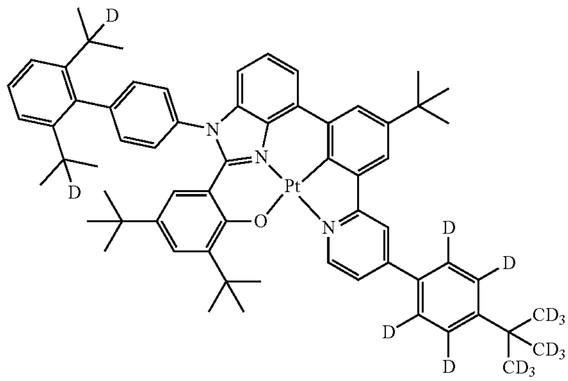
4-2847
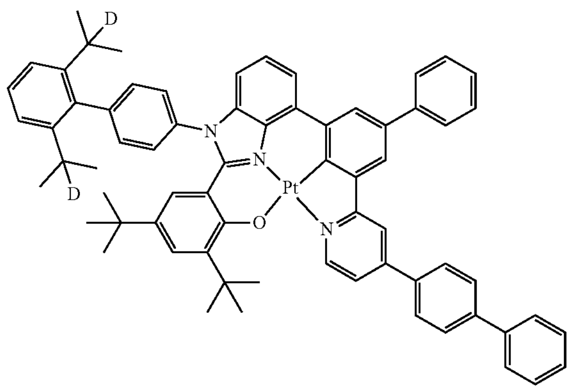
4-2848
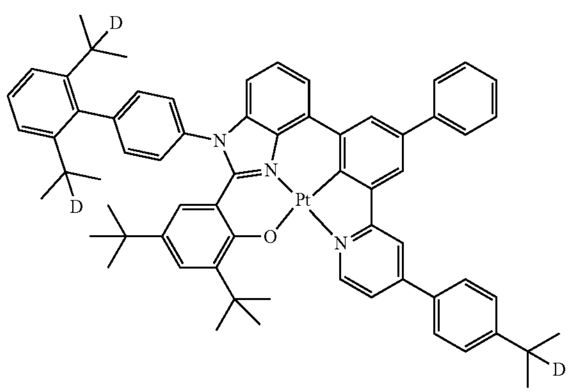
4-2849
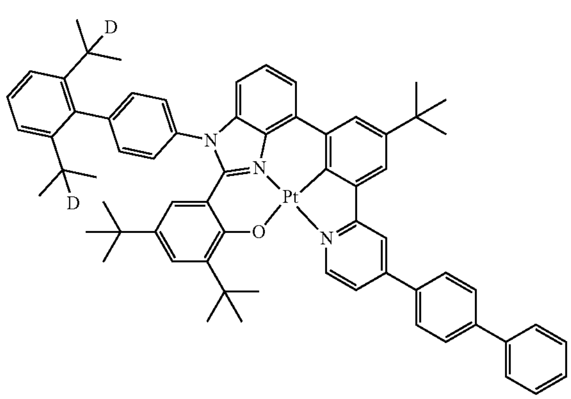
-continued
4-2850
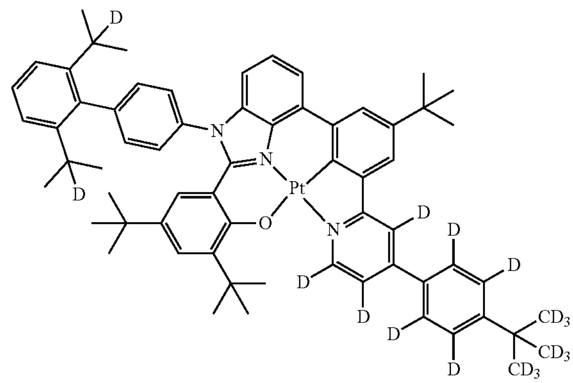
4-2851
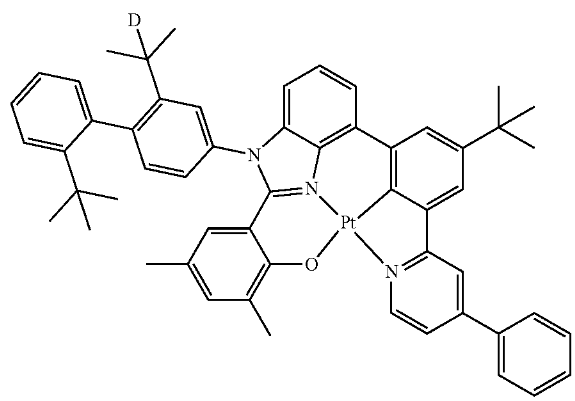
4-2852
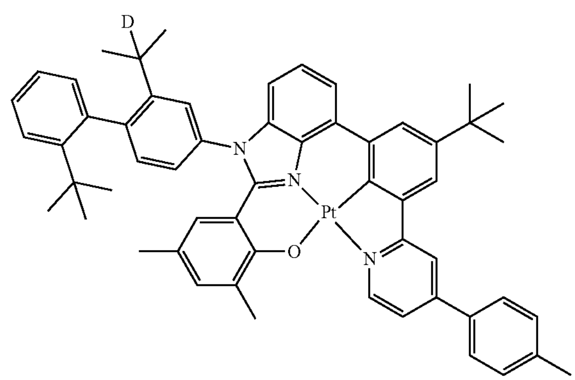
4-2853
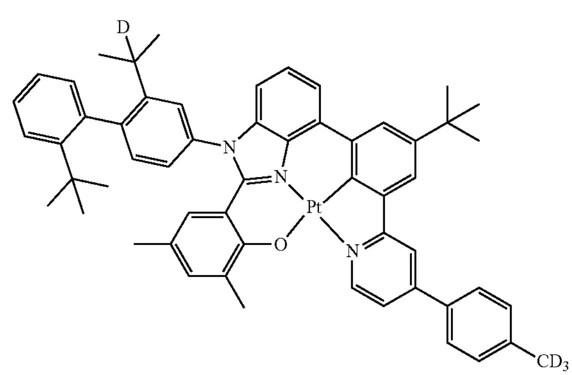

-continued
4-2854
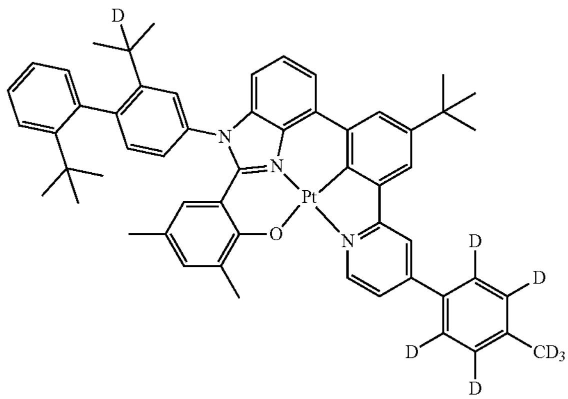
4-2855
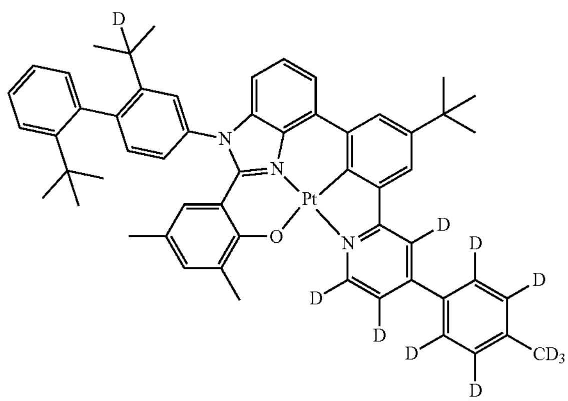
4-2856
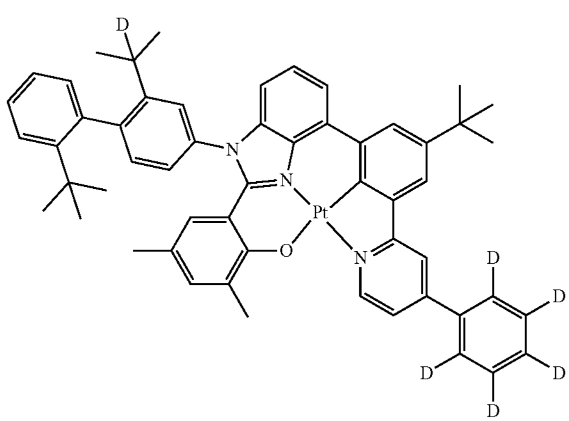
-continued
4-2857
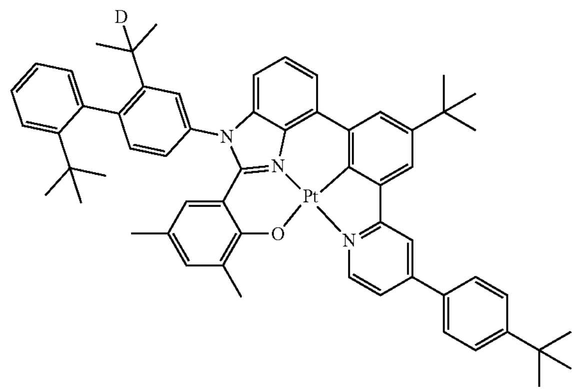
4-2858
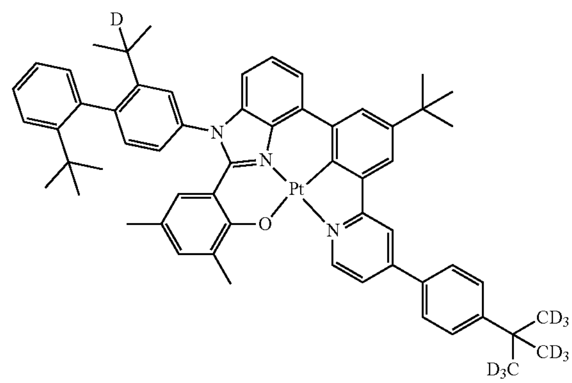
4-2859
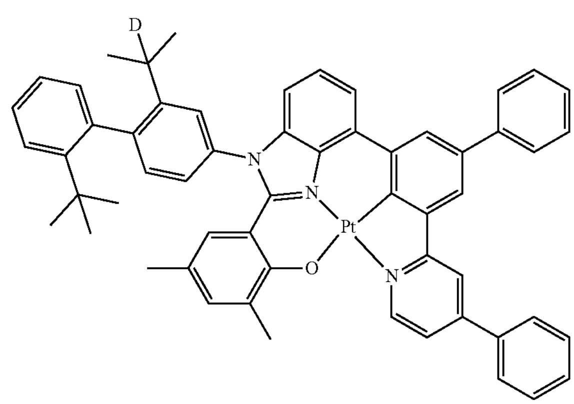
4-2860
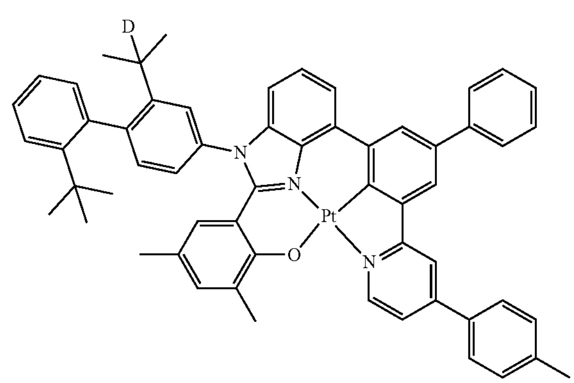

-continued
4-2861
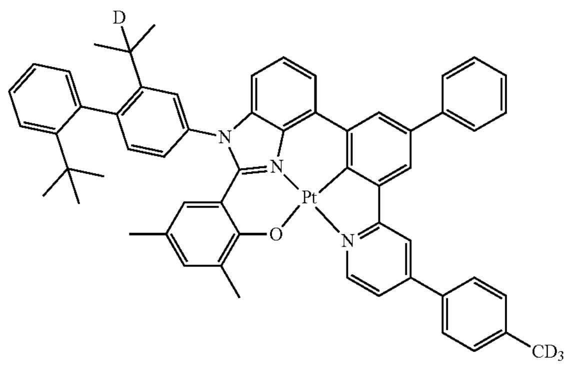
4-2862
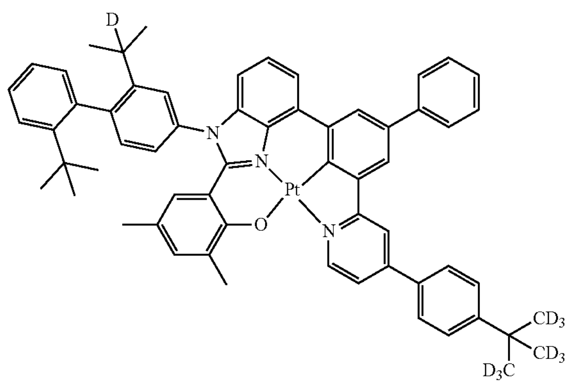
4-2863
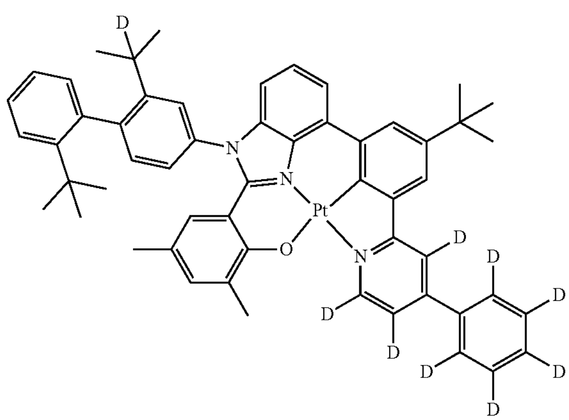
4-2864
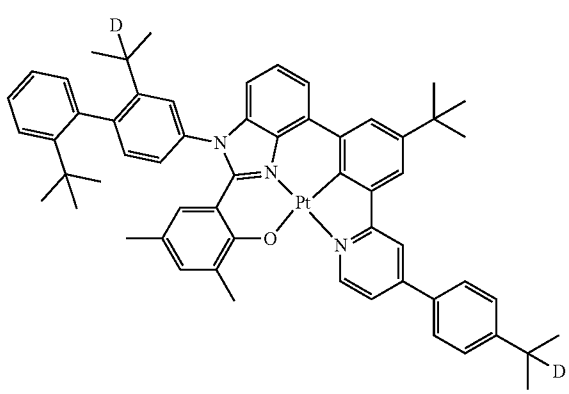
-continued
4-2865
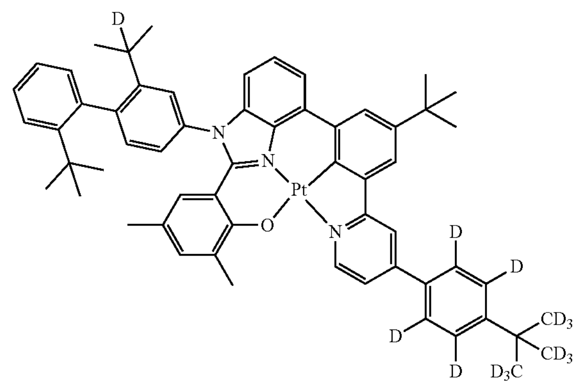
4-2866
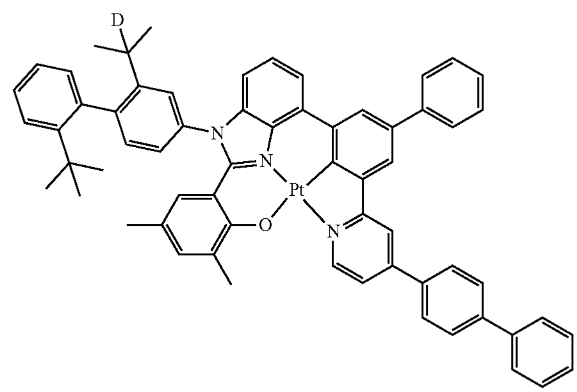
4-2867
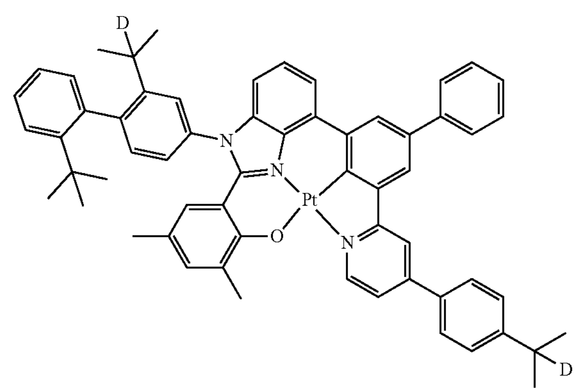
4-2868
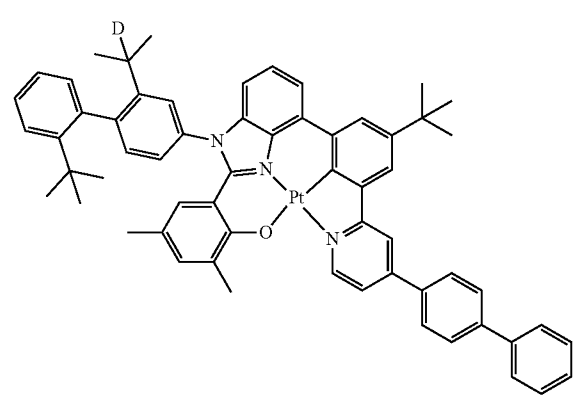

4-2869
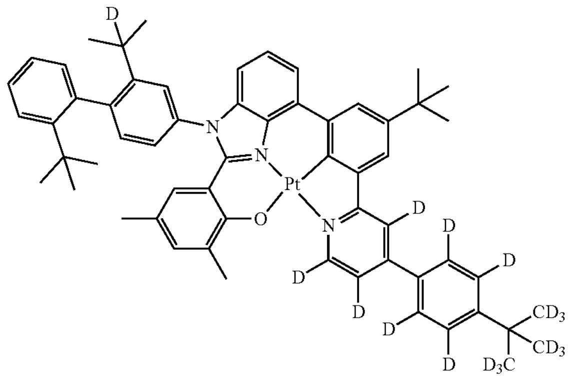
4-2870
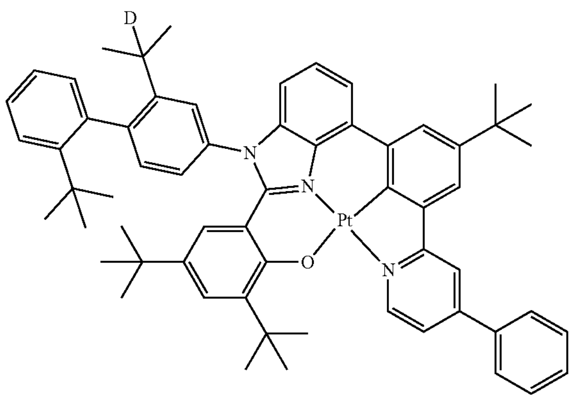
4-2871
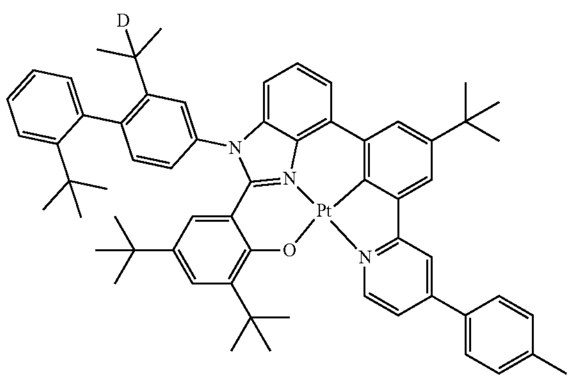
4-2872
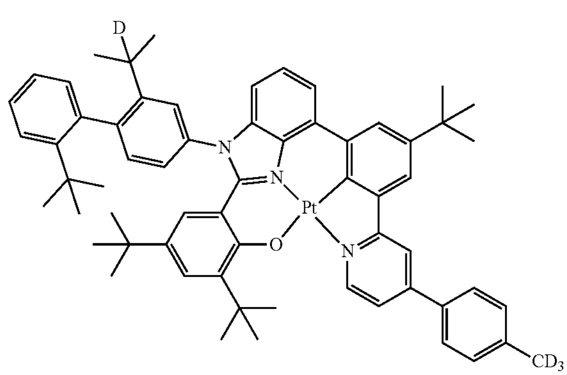
4-2873
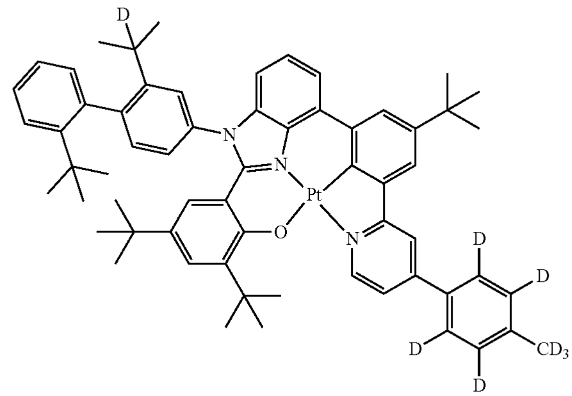
4-2874
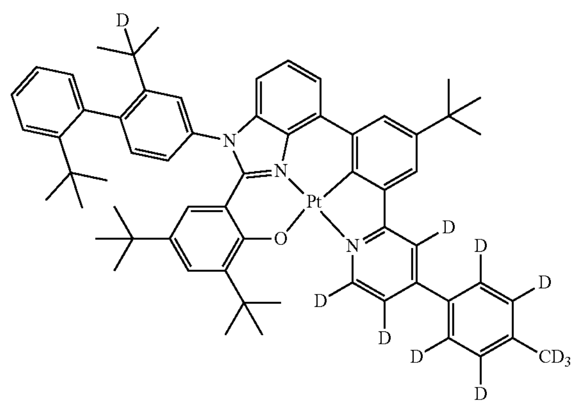
4-2875
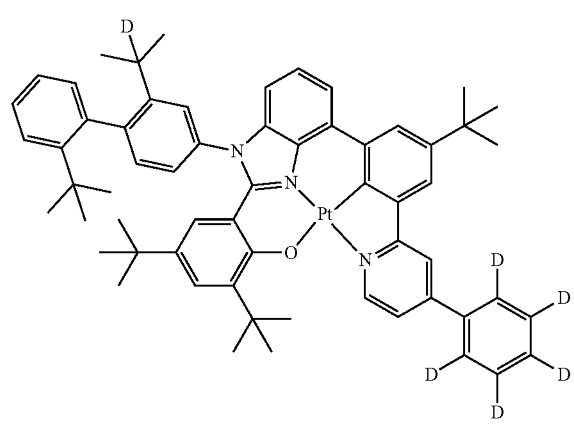

-continued
4-2876
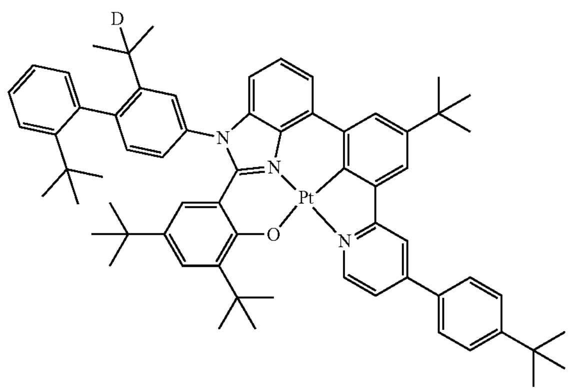
4-2877
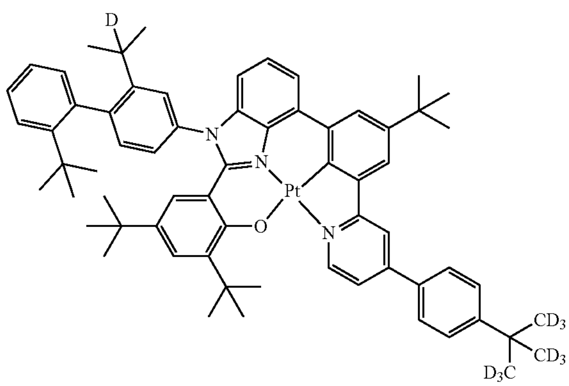
4-2878
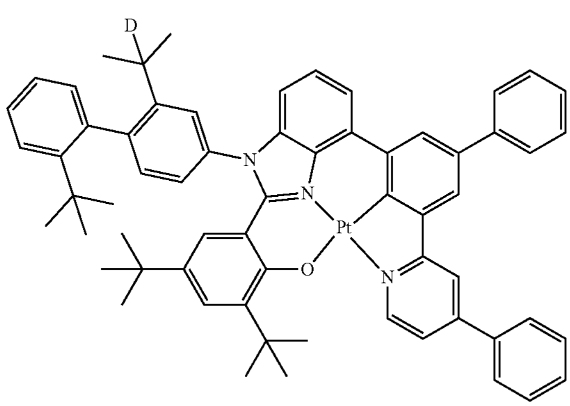
4-2879
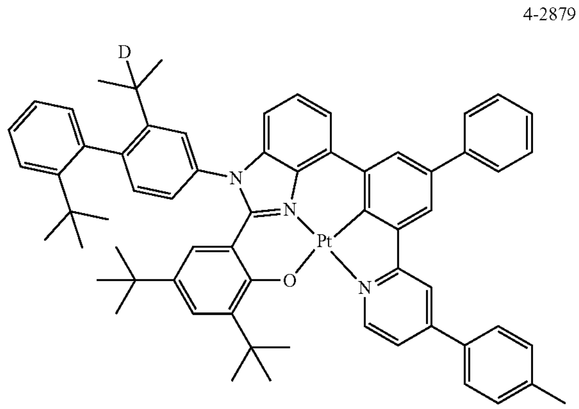
-continued
4-2880
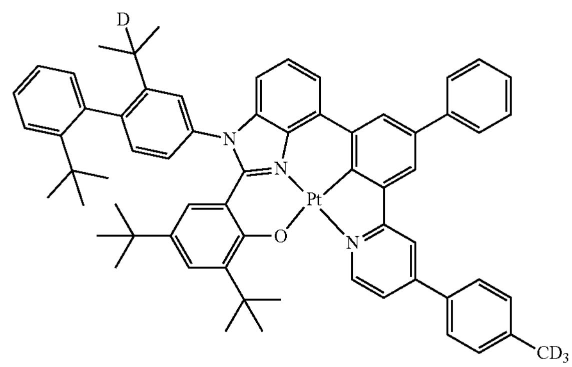
4-2881
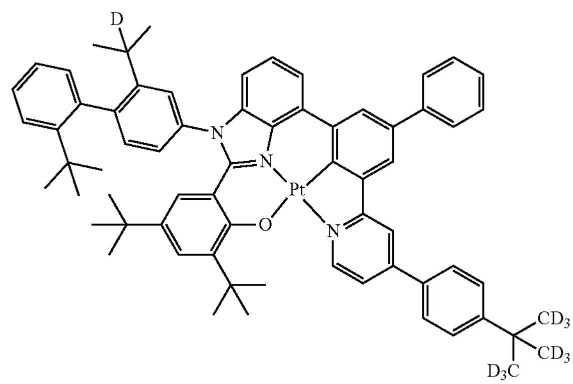
4-2882
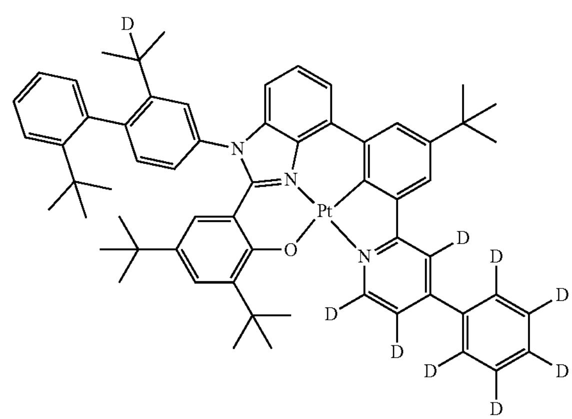
4-2883
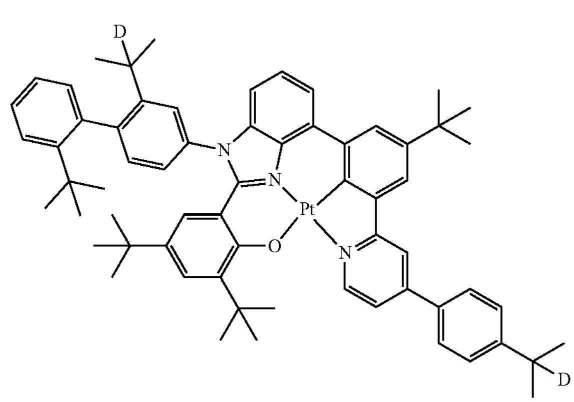

4-2884
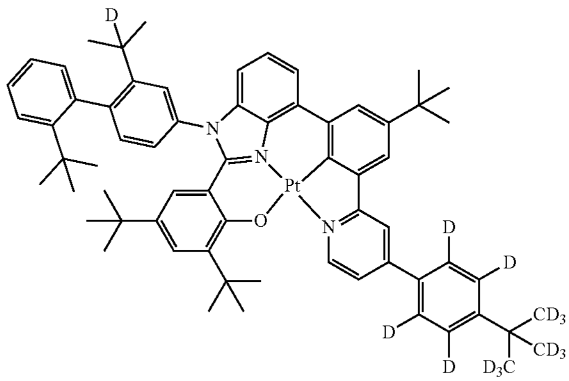
4-2885
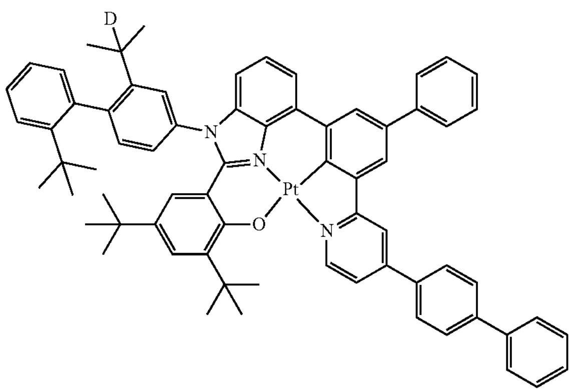
4-2886
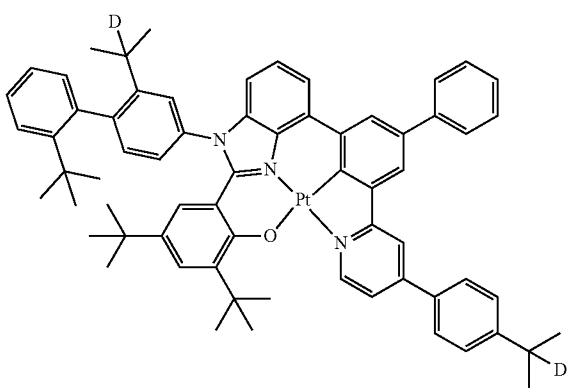
4-2887
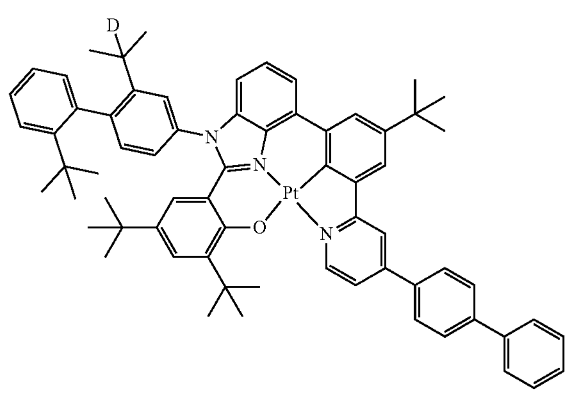
4-2888
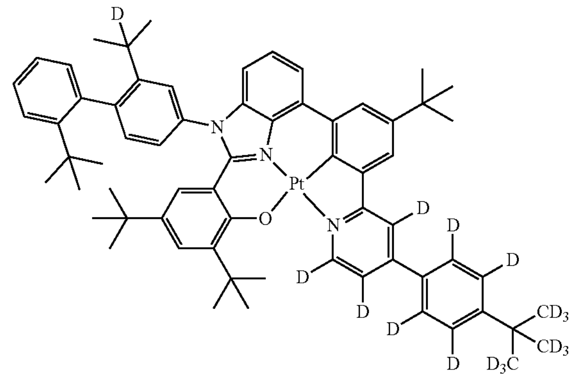
4-2889
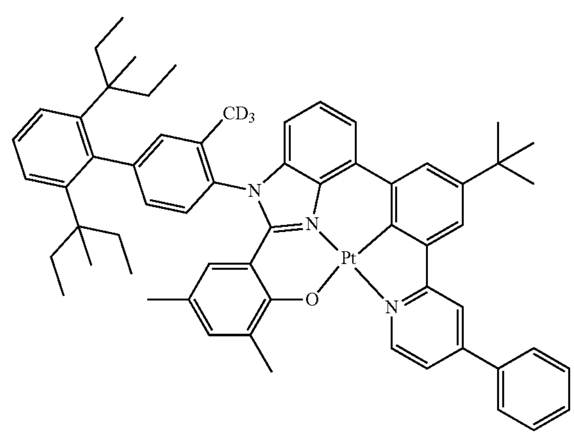
4-2890
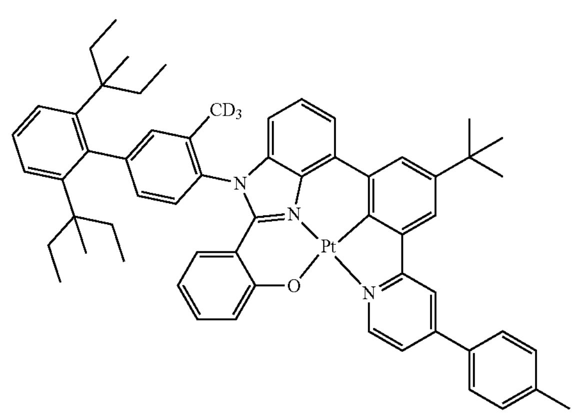

4-2891
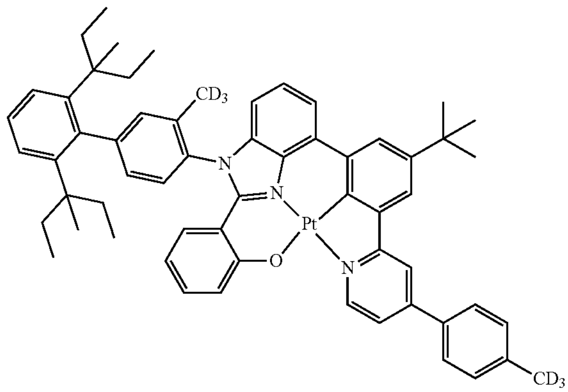
4-2892
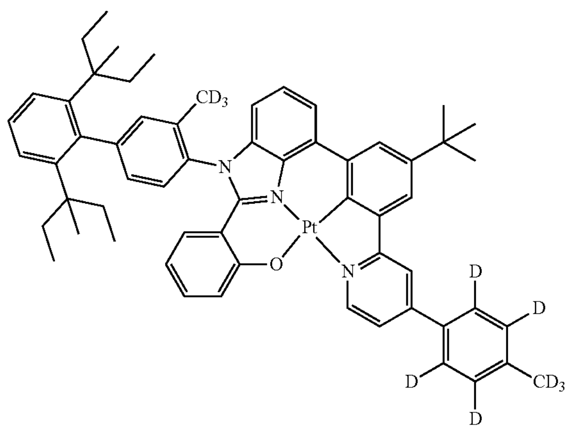
4-2893
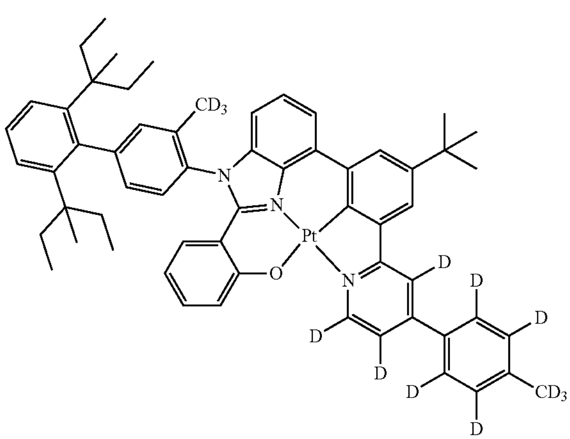
4-2894
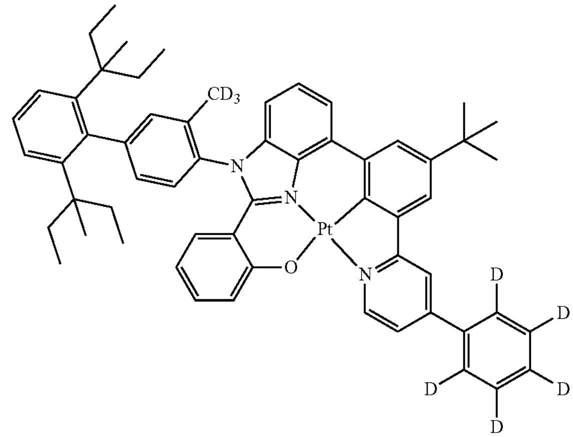
4-2895
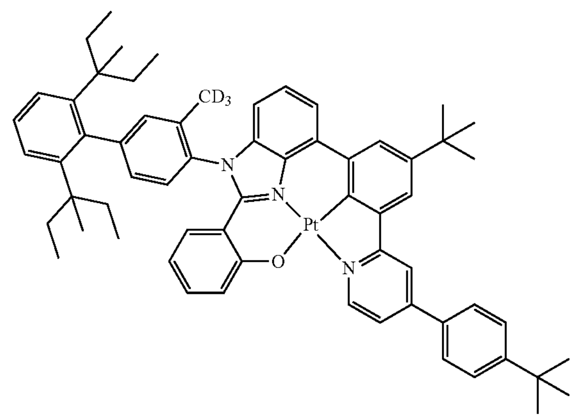
4-2896
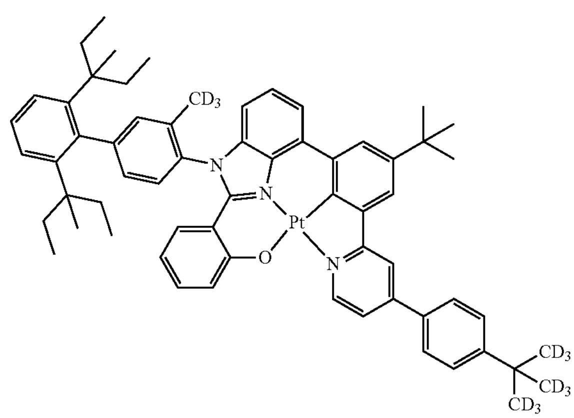

-continued
4-2897
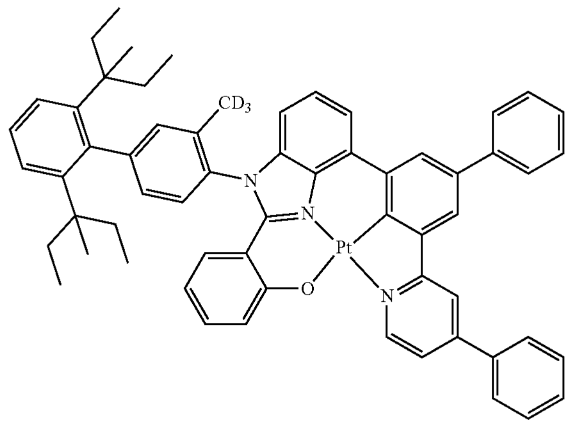
4-2898
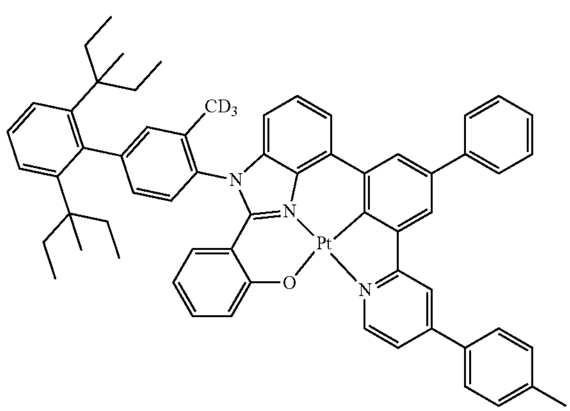
4-2899
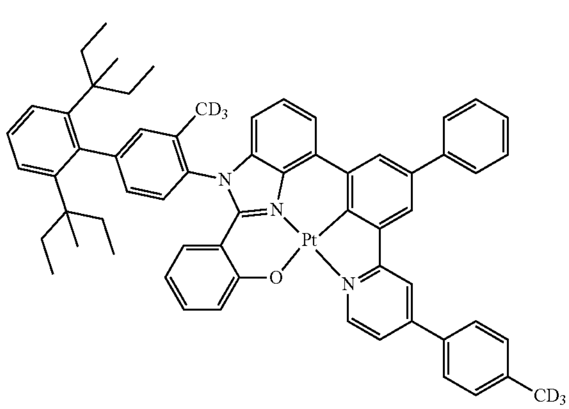
-continued
4-2900
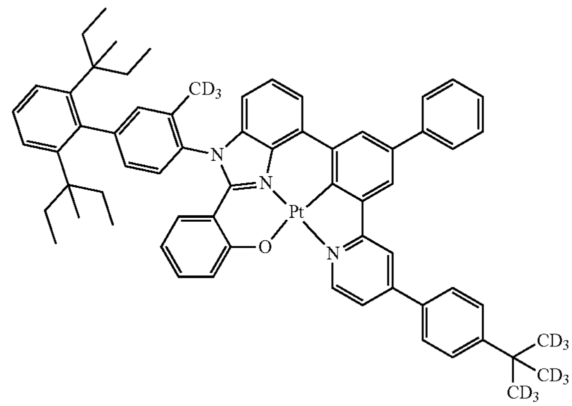
4-2901
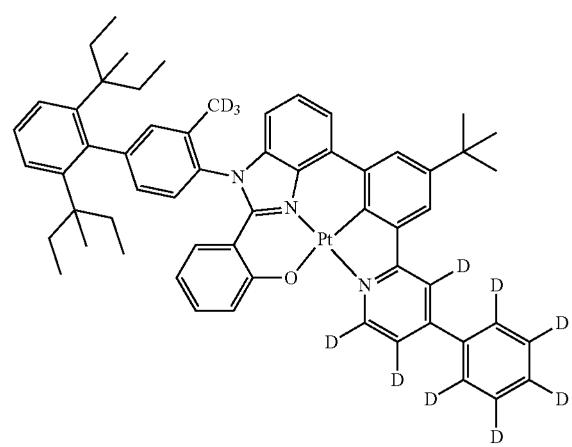
4-2902
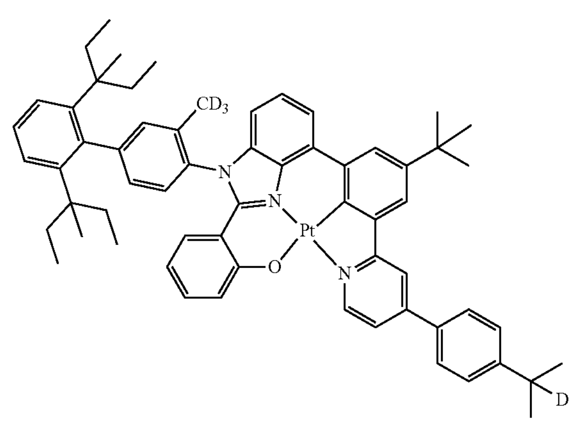

4-2903
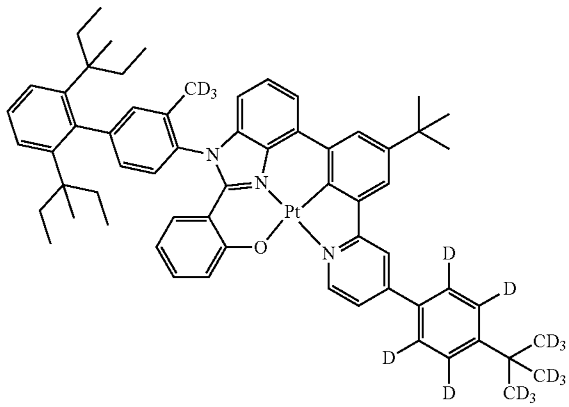
4-2904
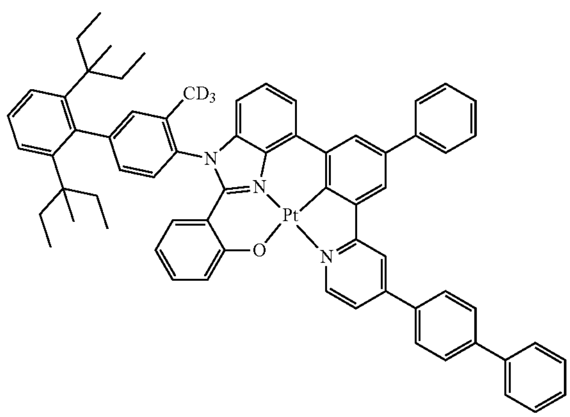
4-2905
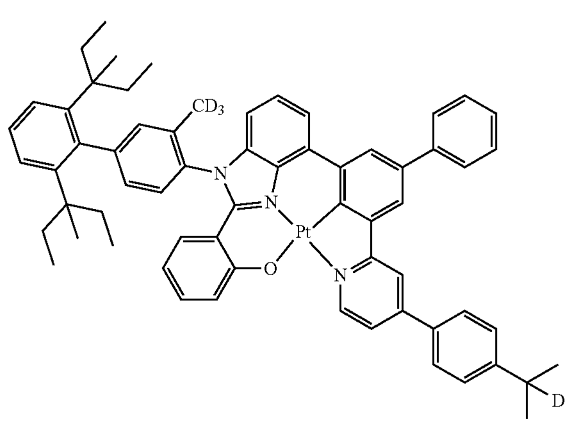
4-2906
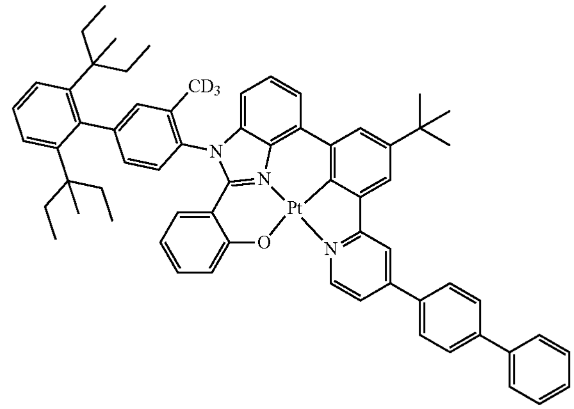
4-2907
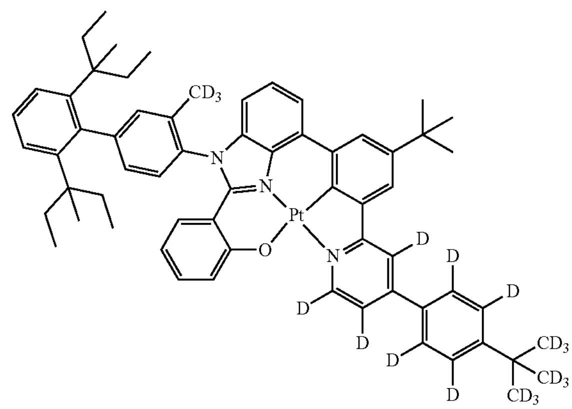
4-2908
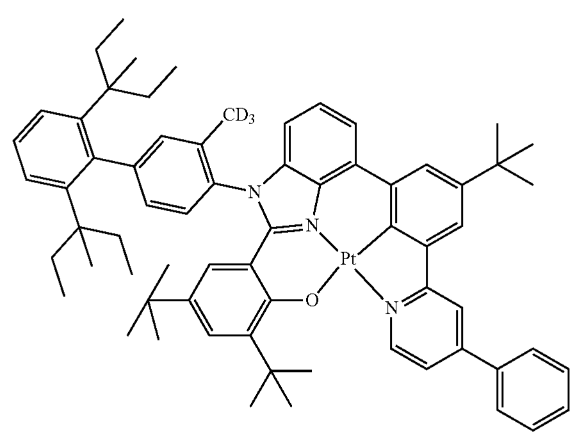

4-2909
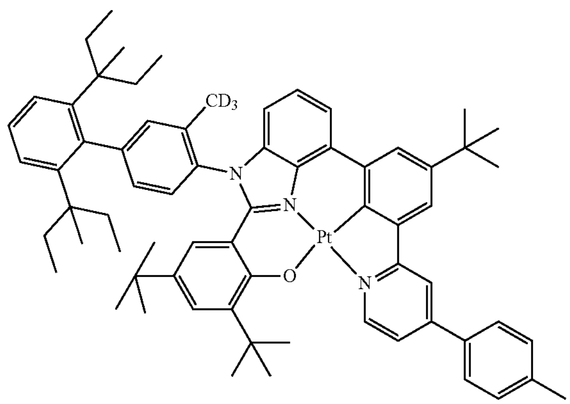
4-2910
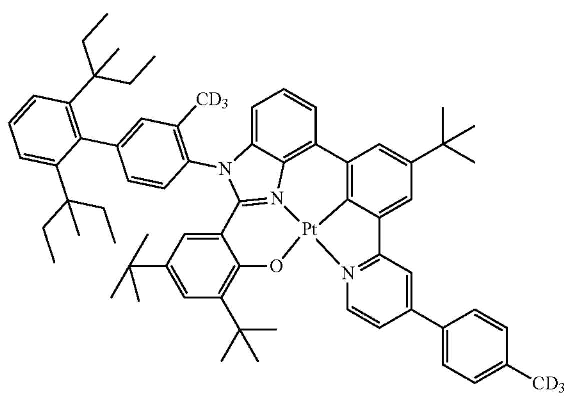
4-2911
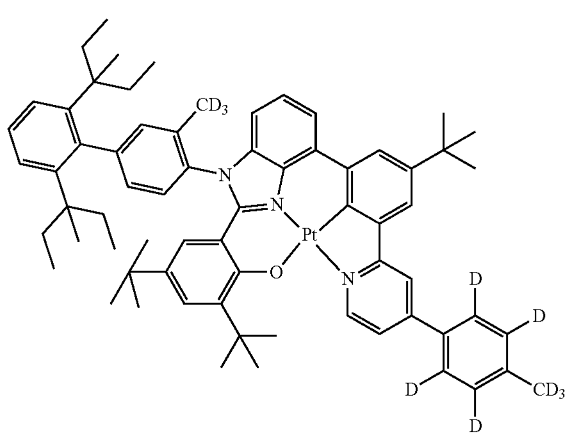
4-2912
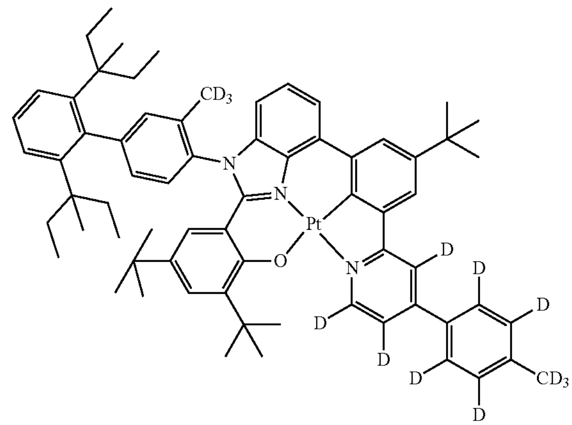
4-2913
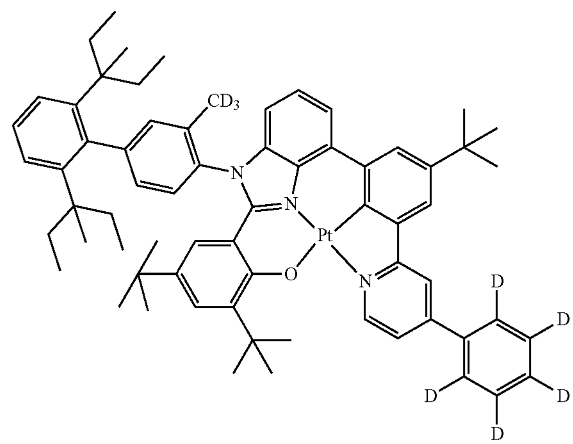
4-2914
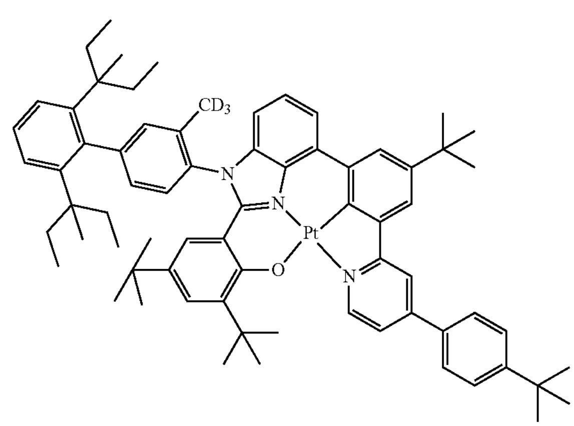

-continued
4-2915
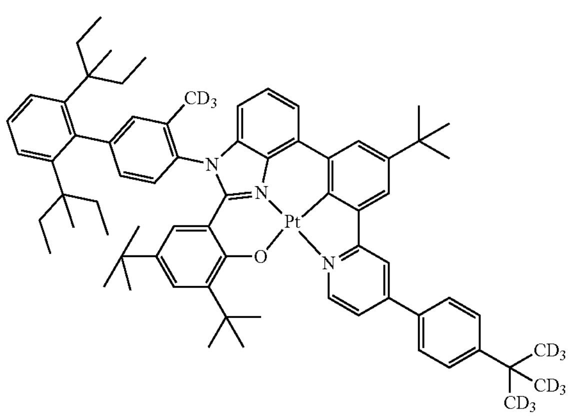
4-2916
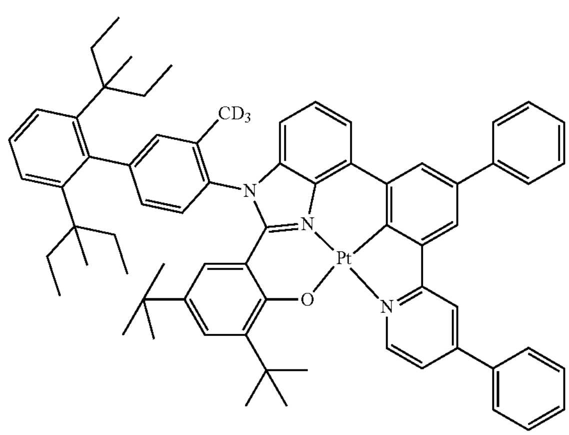
4-2917
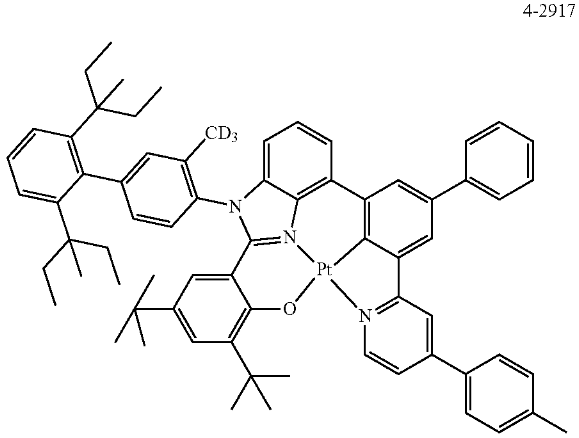
-continued
4-2918
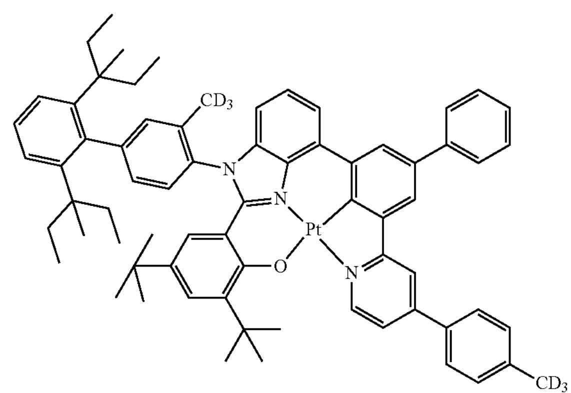
4-2919
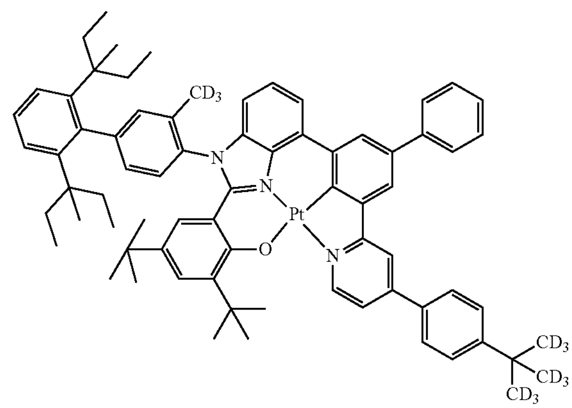
4-2920
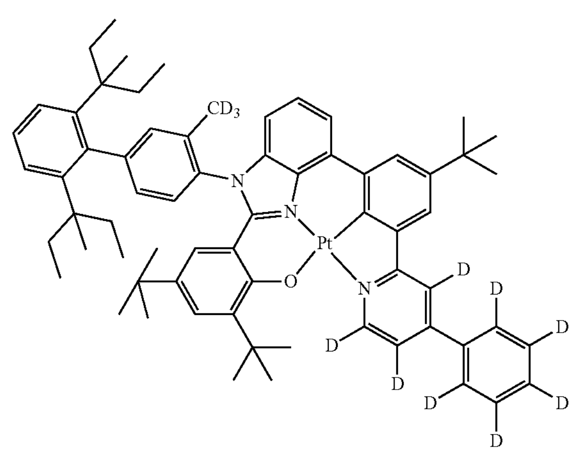

-continued
4-2921
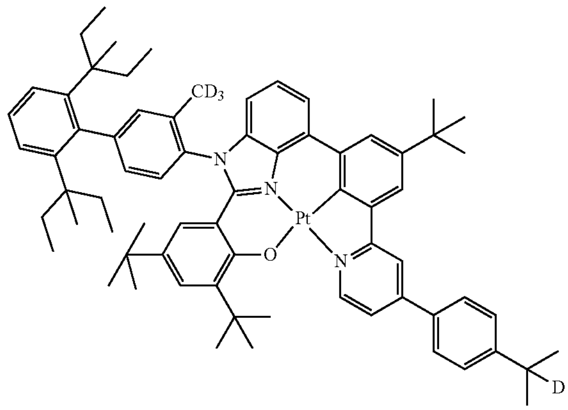
4-2922
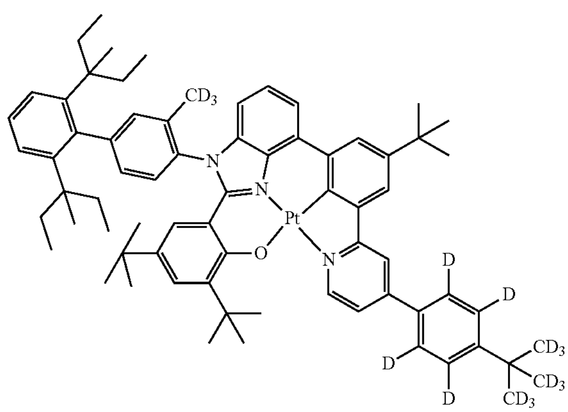
4-2923
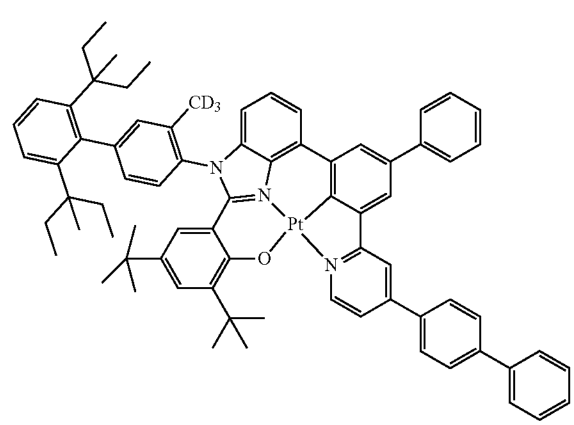
-continued
4-2924
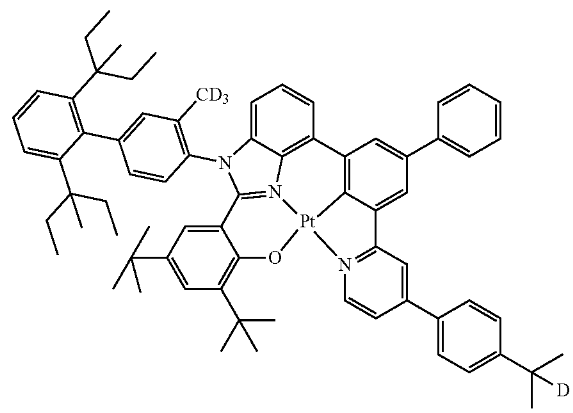
4-2925
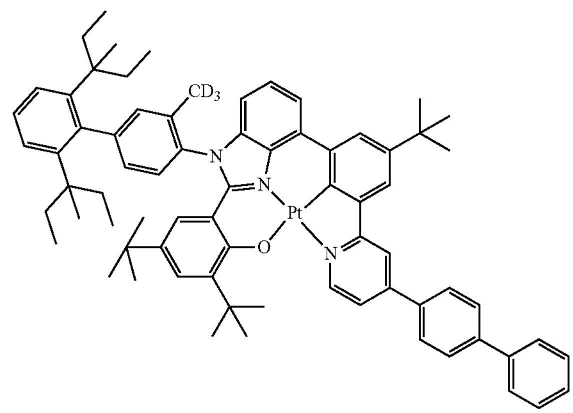
4-2926
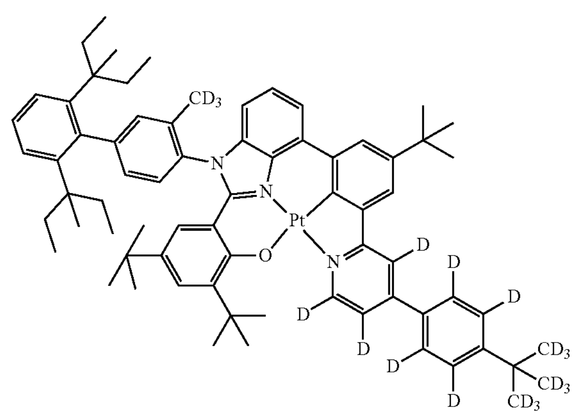
4-2927
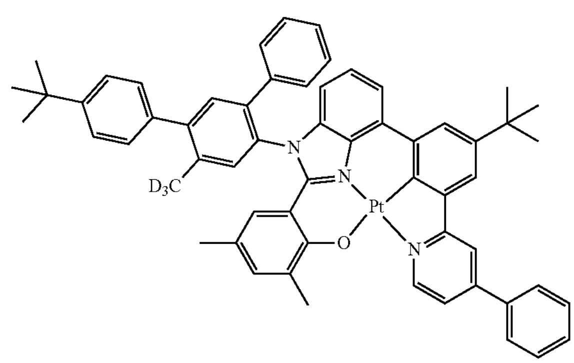

-continued
4-928
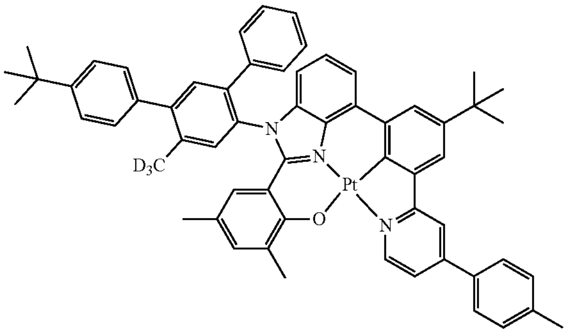
4-2929
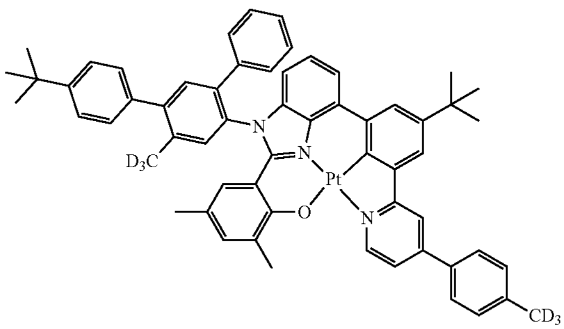
4-2930
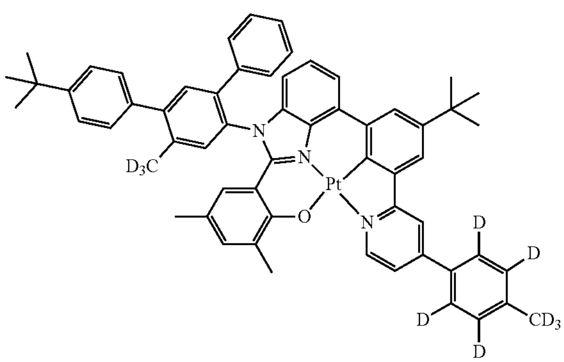
4-2931
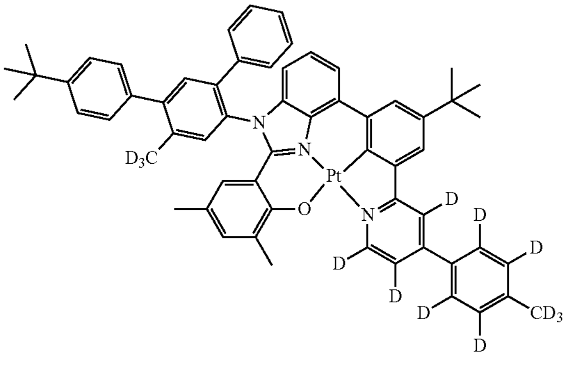
-continued
4-2932
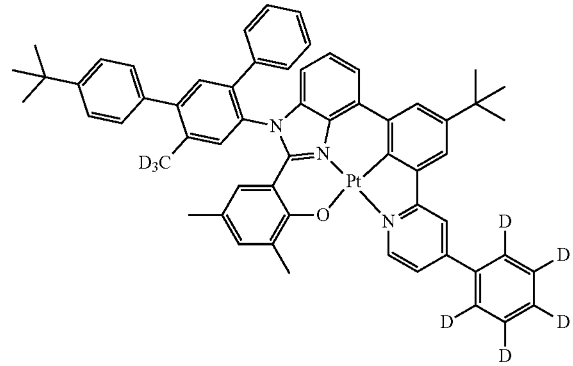
4-2933
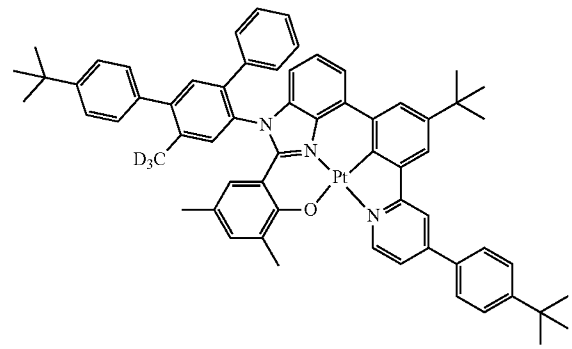
4-2934
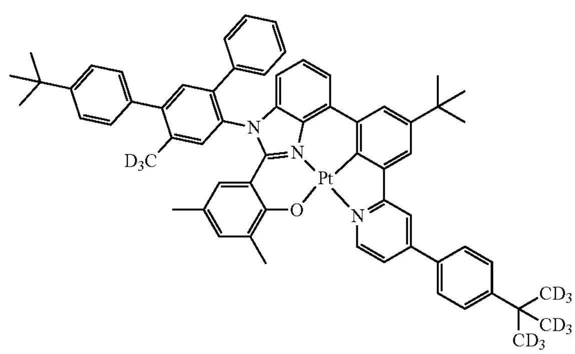
4-2935
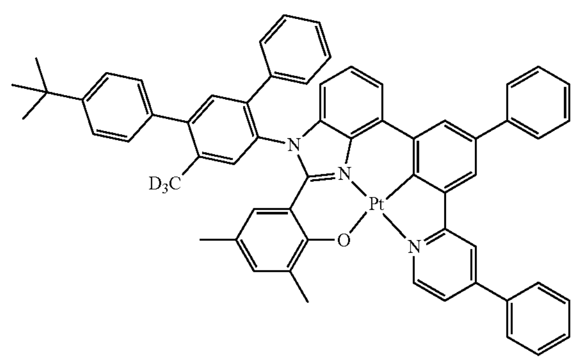

-continued
4-2936
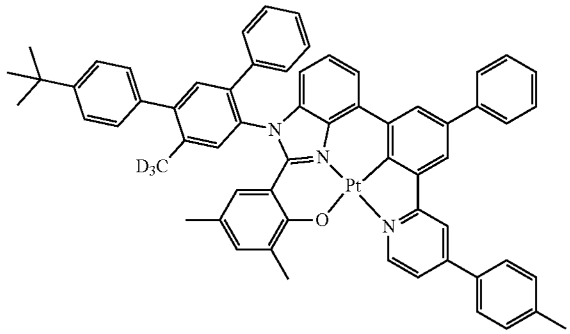
4-2937
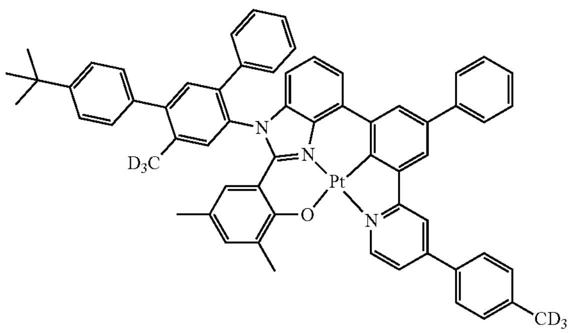
4-2938
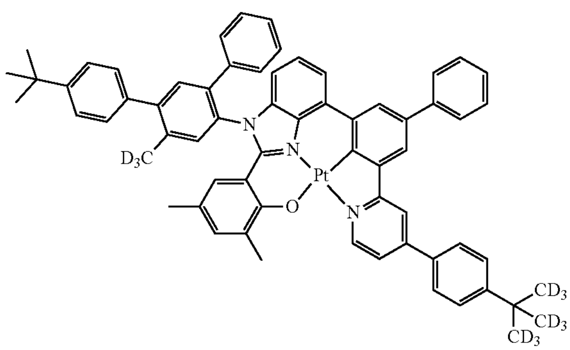
4-2939
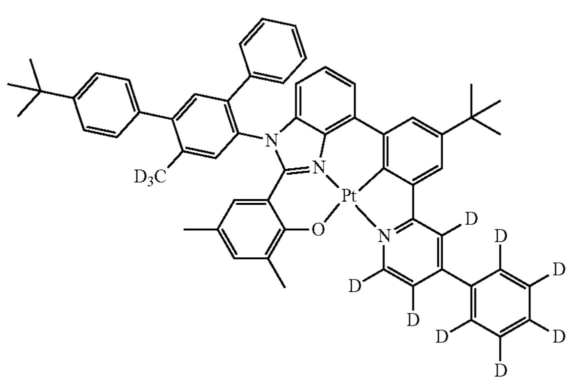
-continued
4-2940
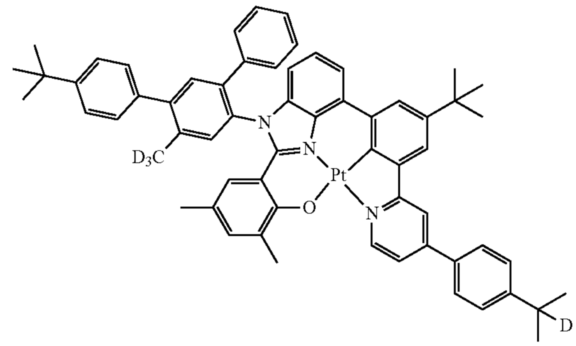
4-2941
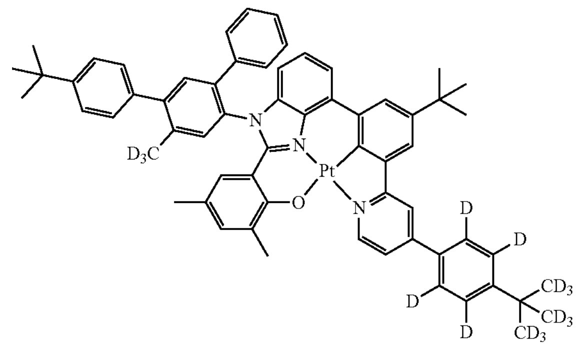
4-2942
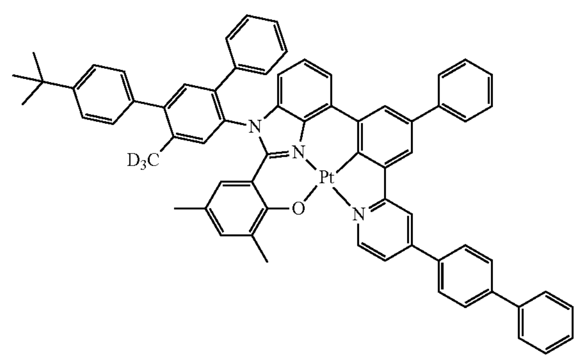
4-2943
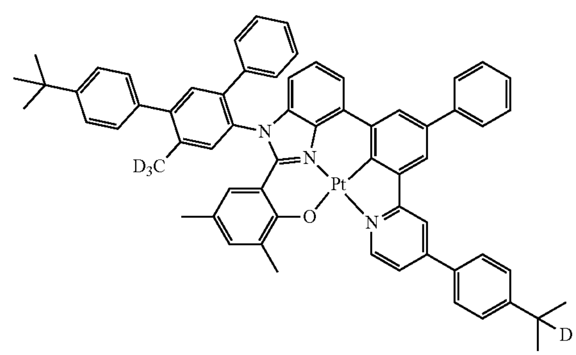

-continued
4-2944
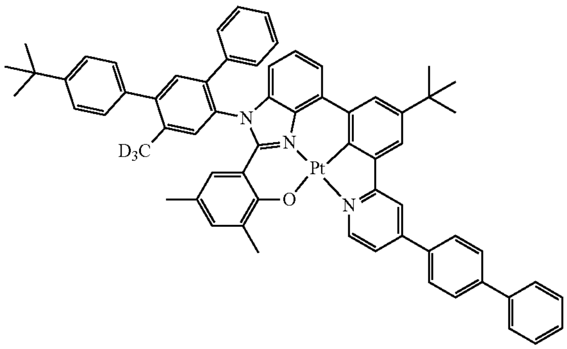
4-2945
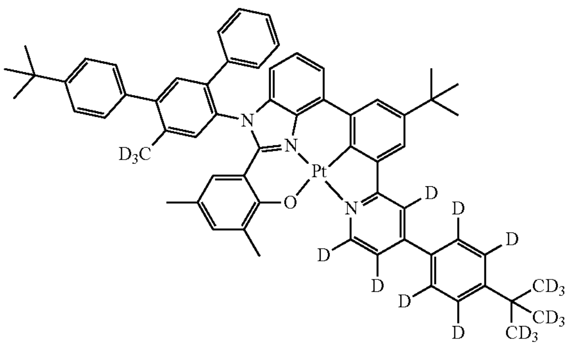
4-2946
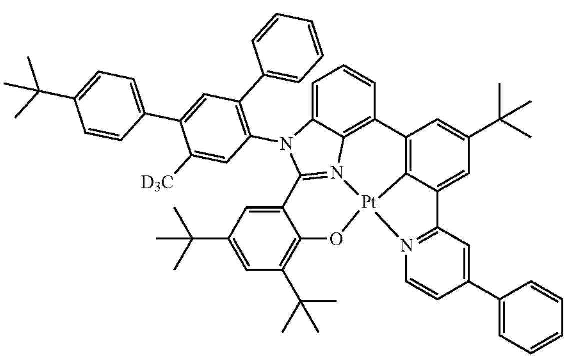
4-2947
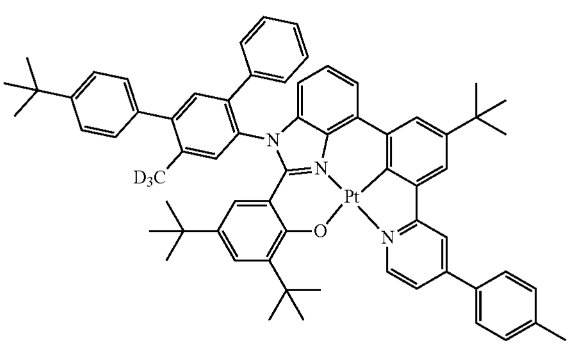
-continued
4-2948
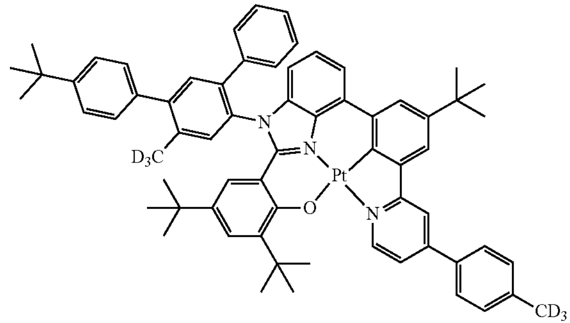
4-2949
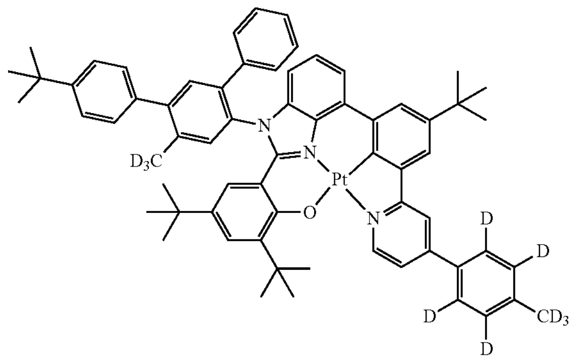
4-2950
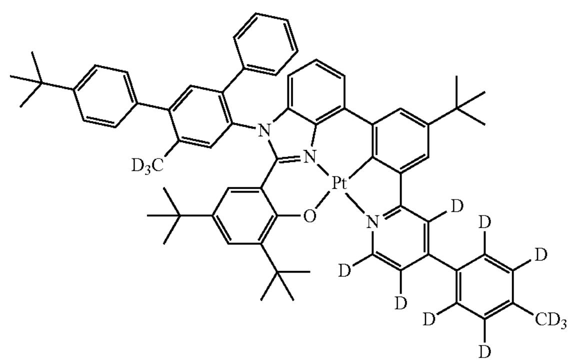
4-2951
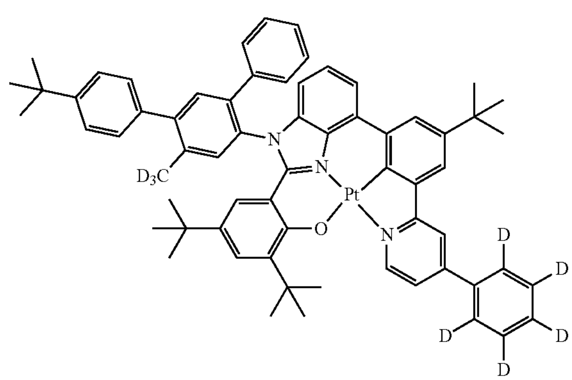

-continued
4-2952
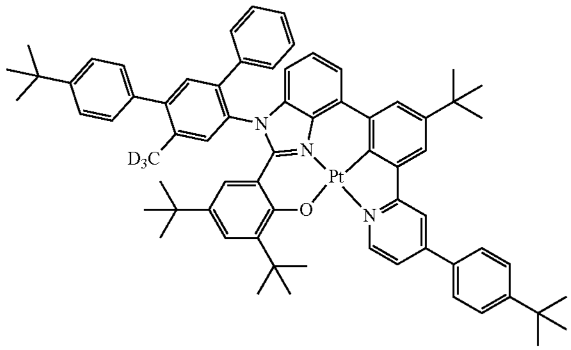
4-2953
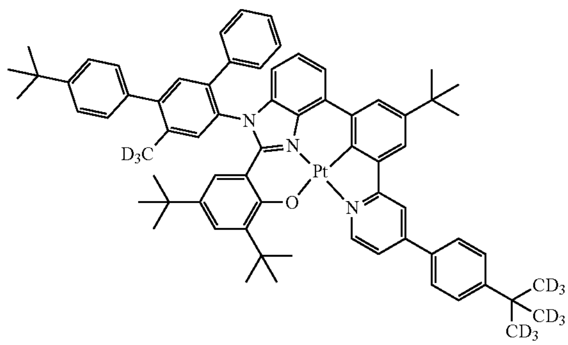
4-2954
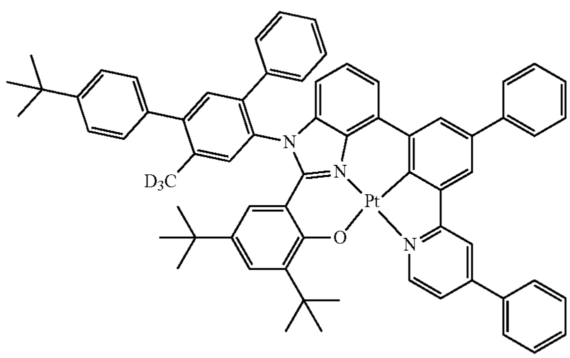
4-2955
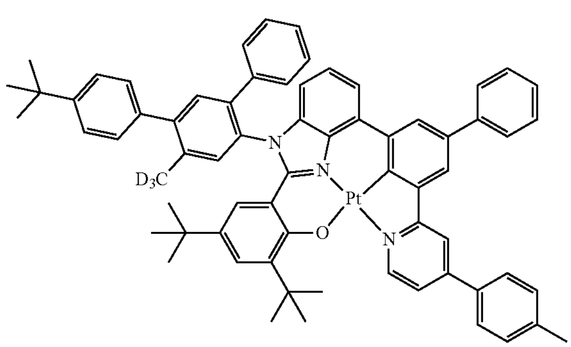
-continued
4-2956
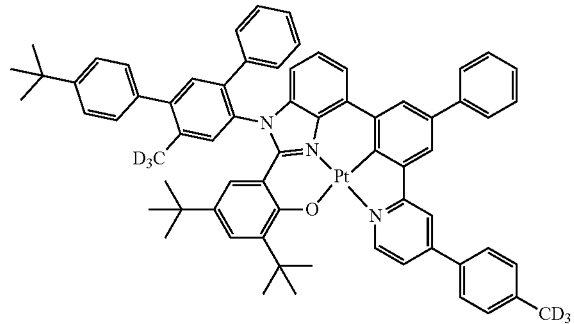
4-2957
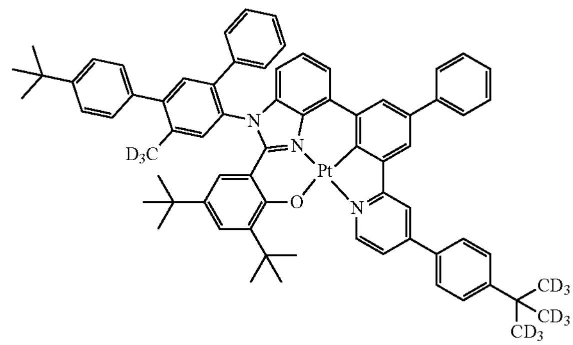
4-2958
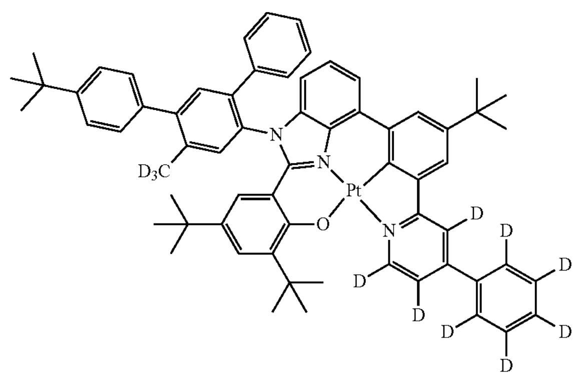
4-2959
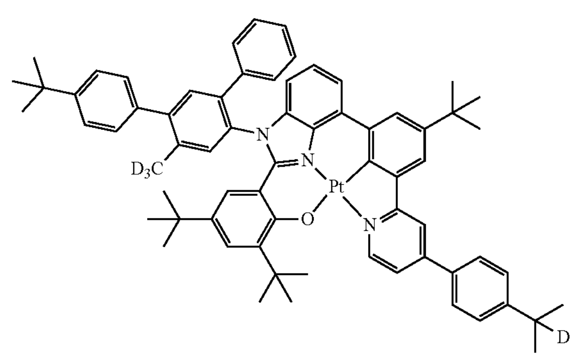

-continued
4-2960
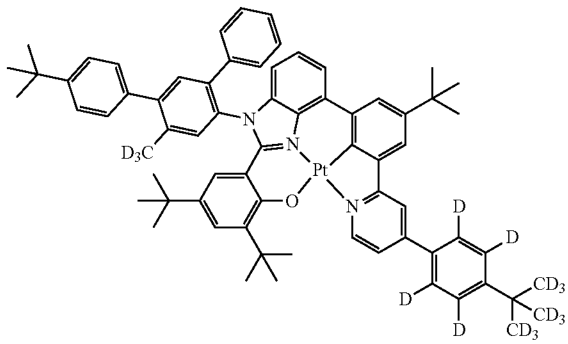
4-2961
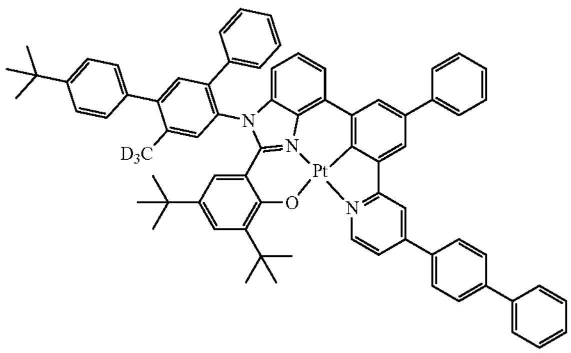
4-2962
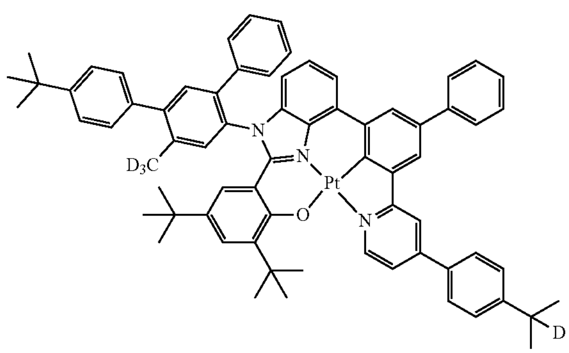
4-2963
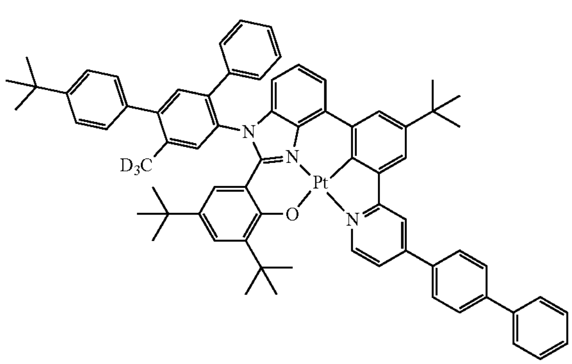
-continued
4-2964
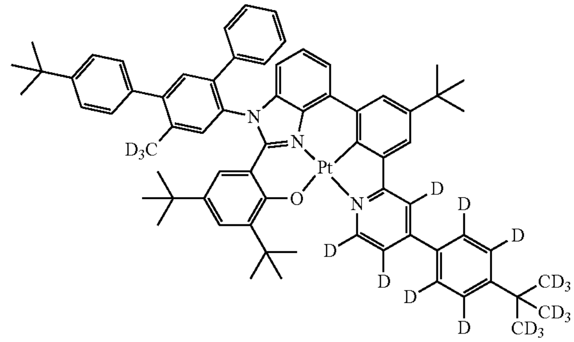
4-2965
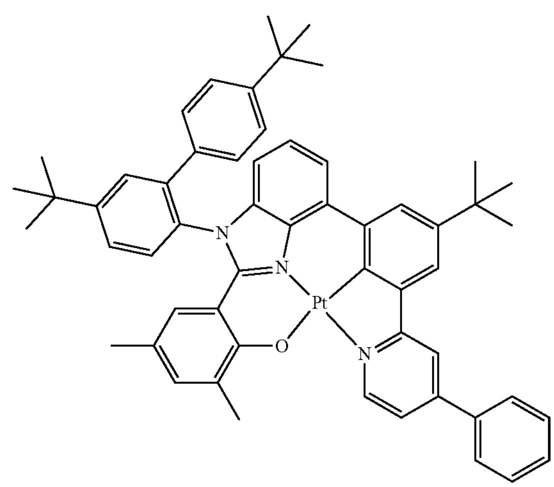
4-2966
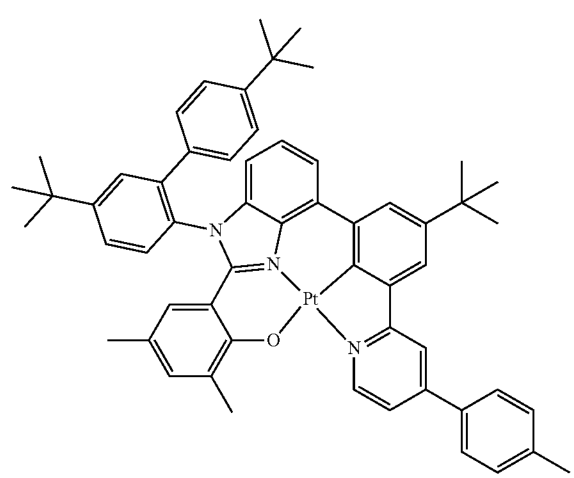

4-2967
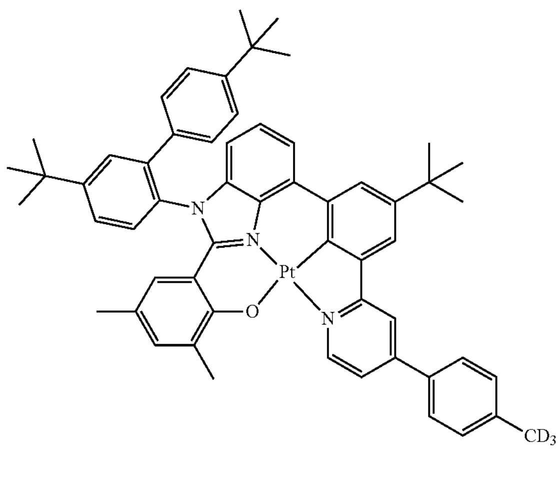
4-2968
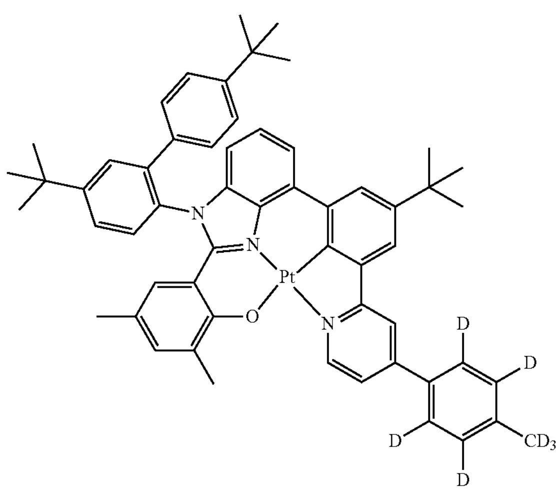
4-2969
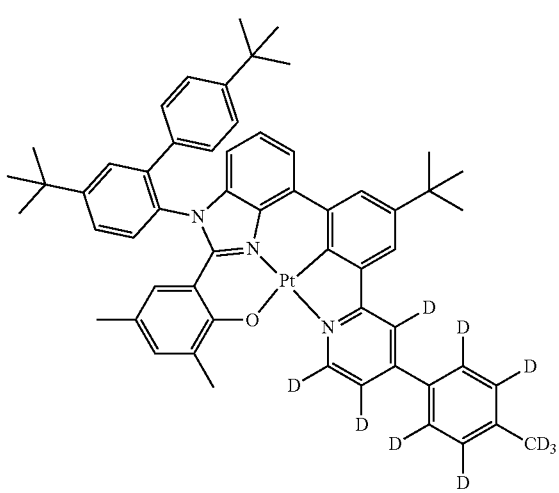
4-2970
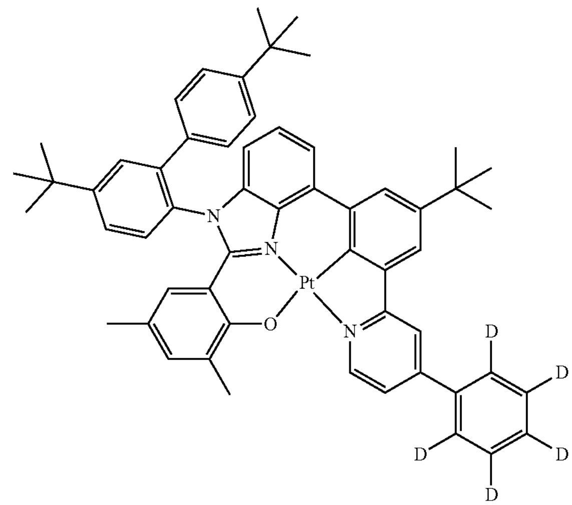
4-2971
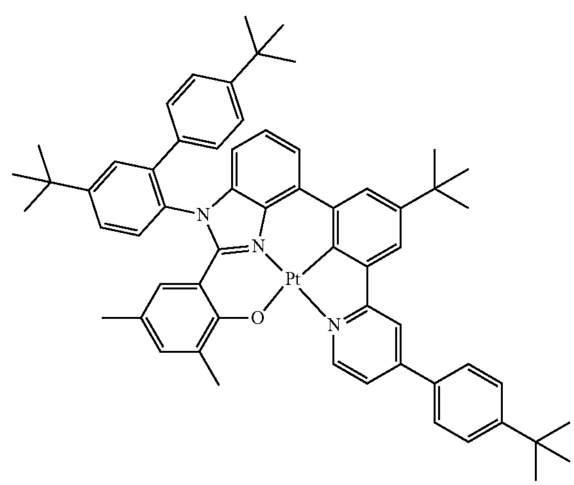
4-2972
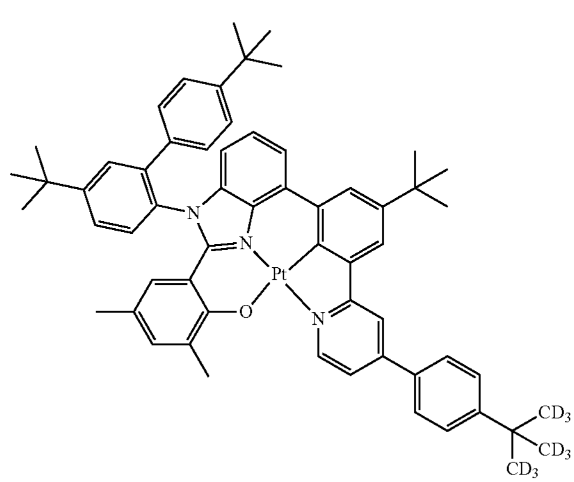

-continued
4-2973
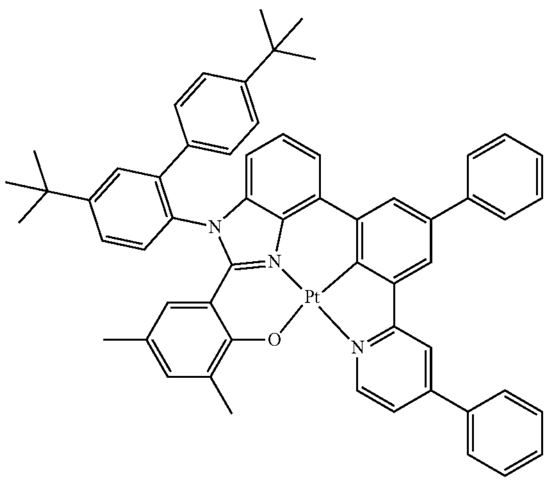
4-2974
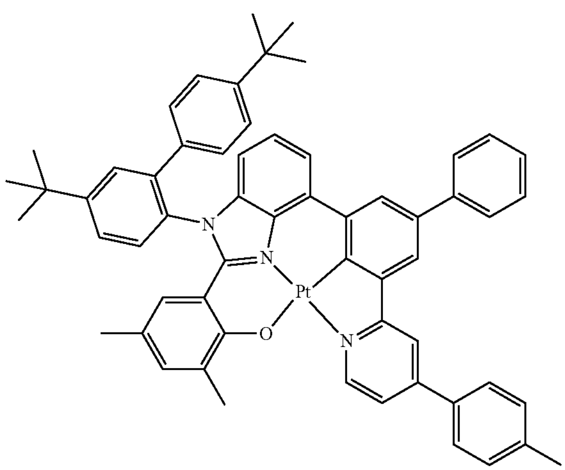
4-2975
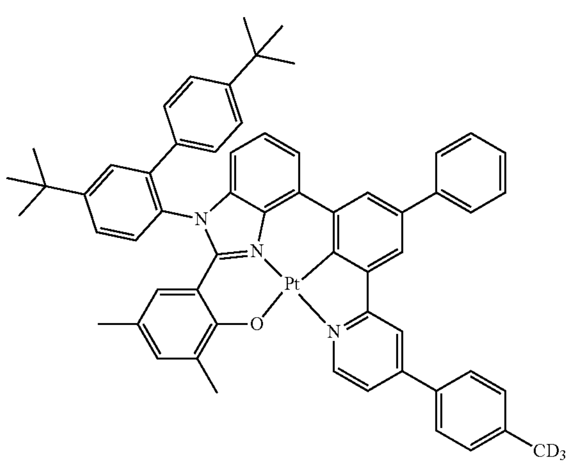
-continued
4-2976
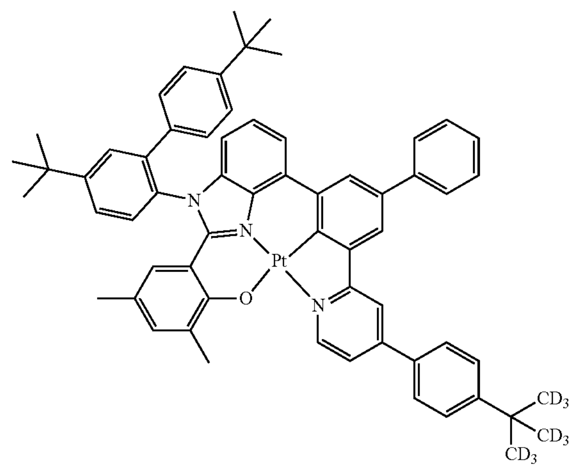
4-2977
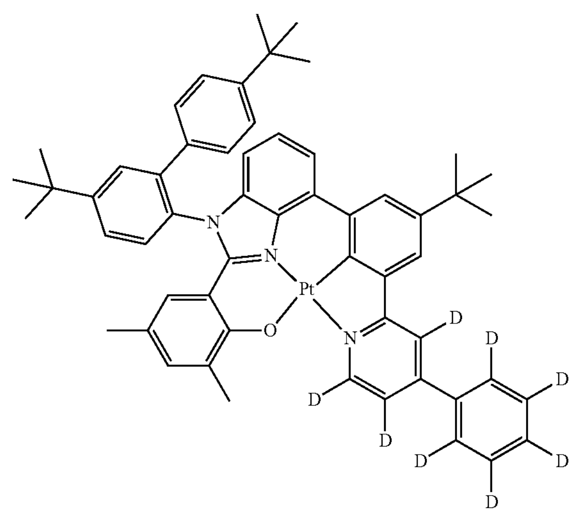
4-2978
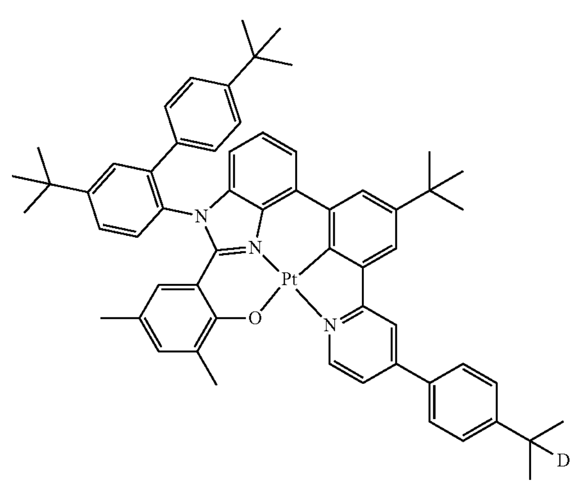

4-2979
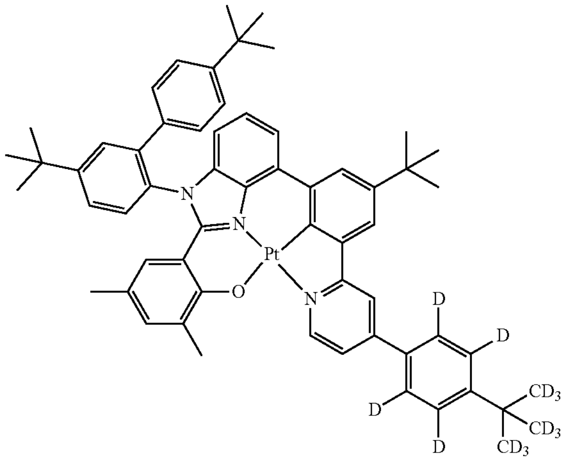
4-2980
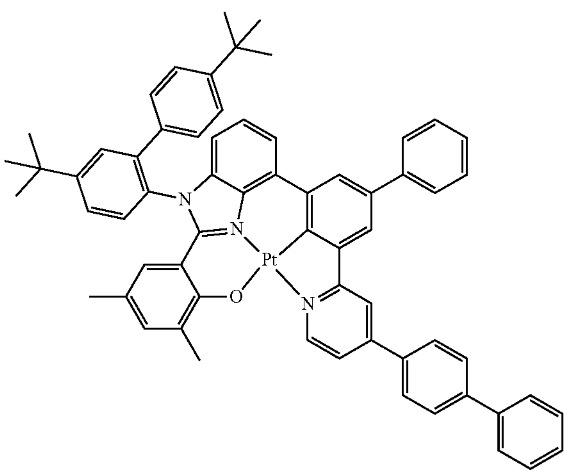
4-2981
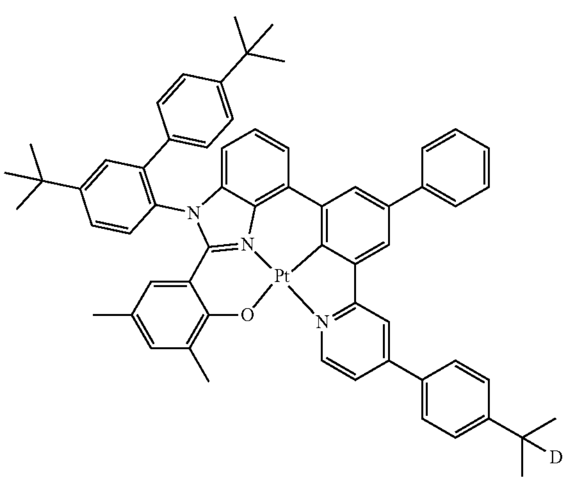
4-2982
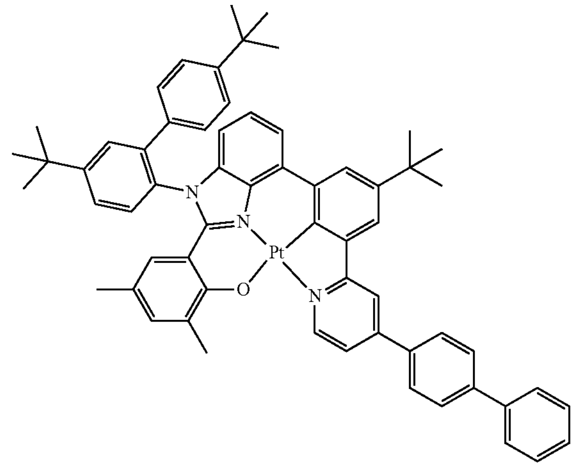
4-2983
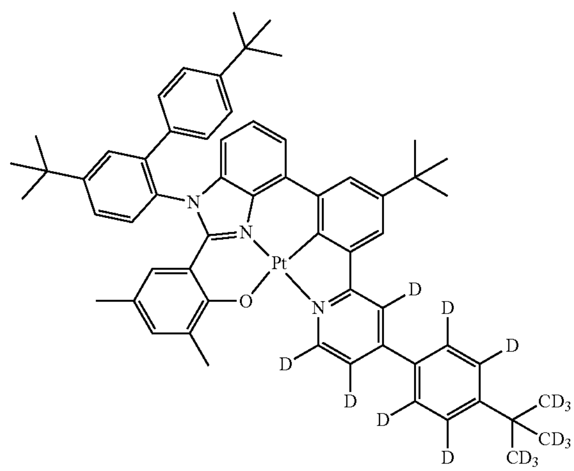
4-2984
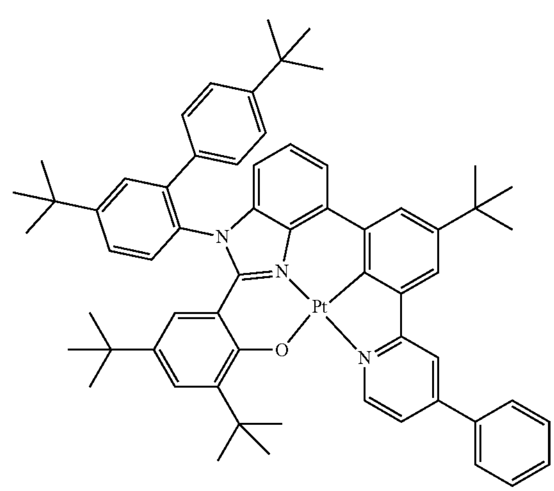

-continued
4-2985
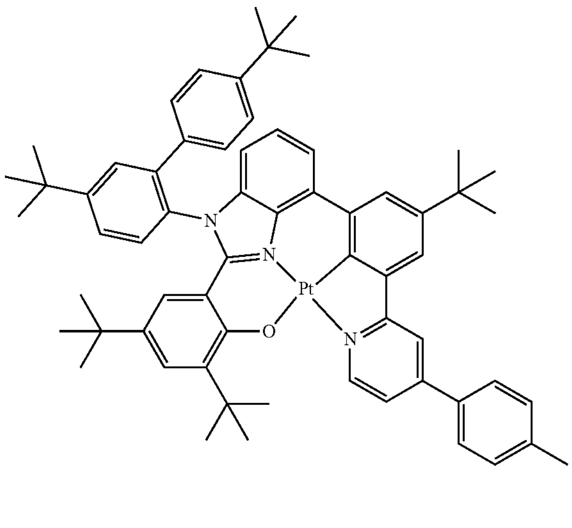
4-2986
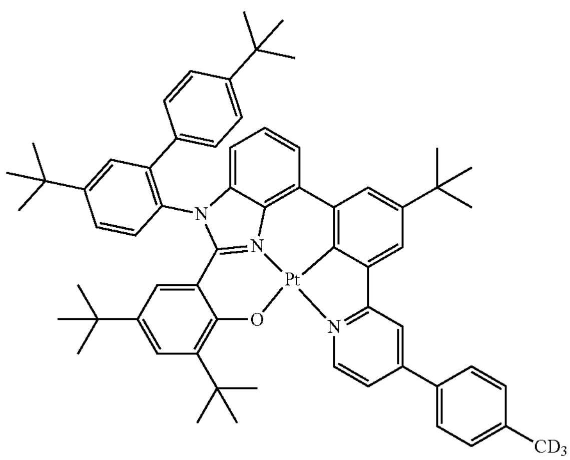
4-2987
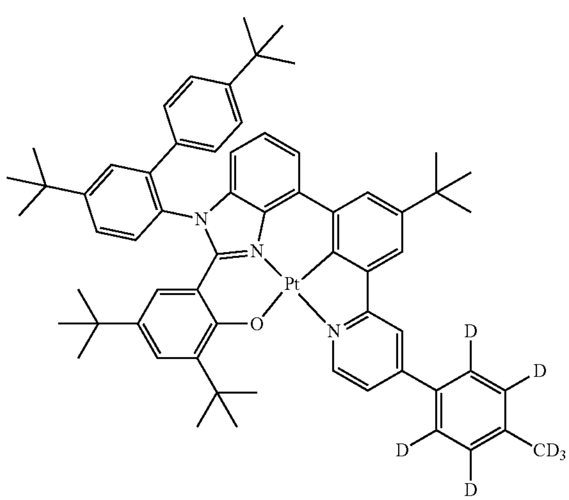
-continued
4-2988
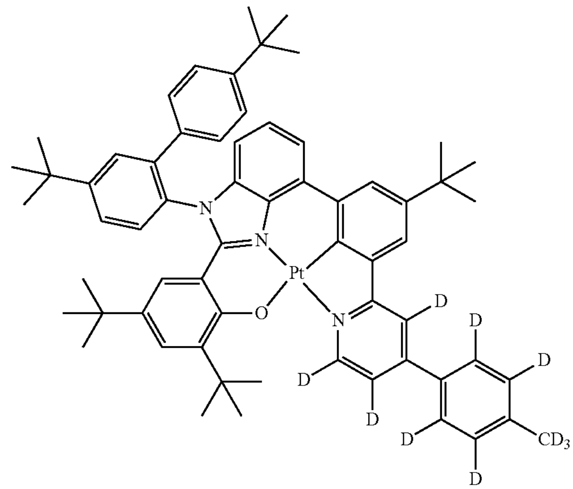
4-2989
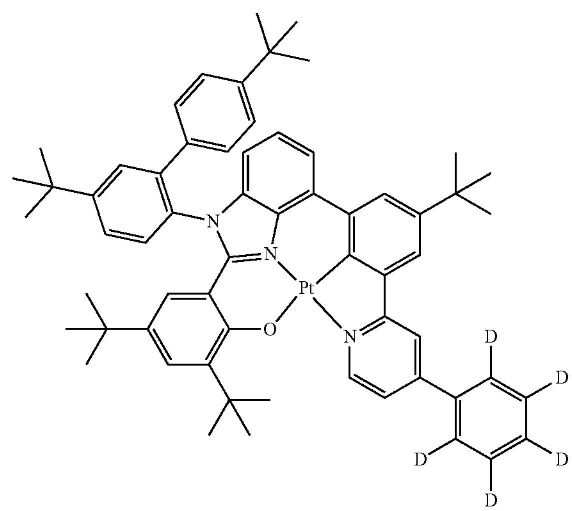
4-2990
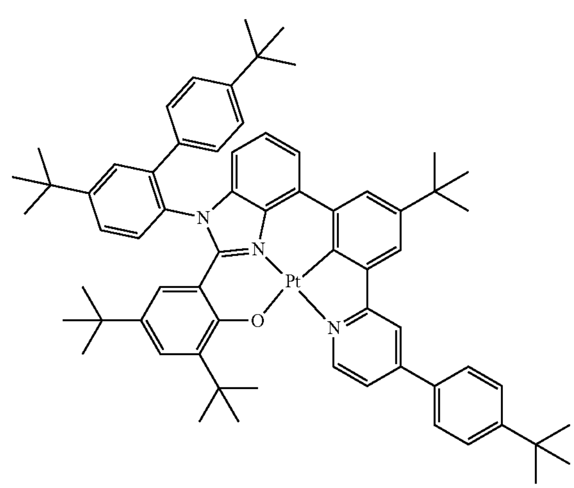

-continued
4-2991
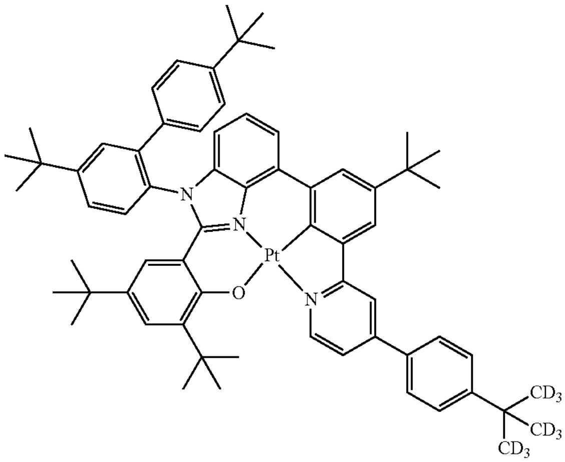
4-2992
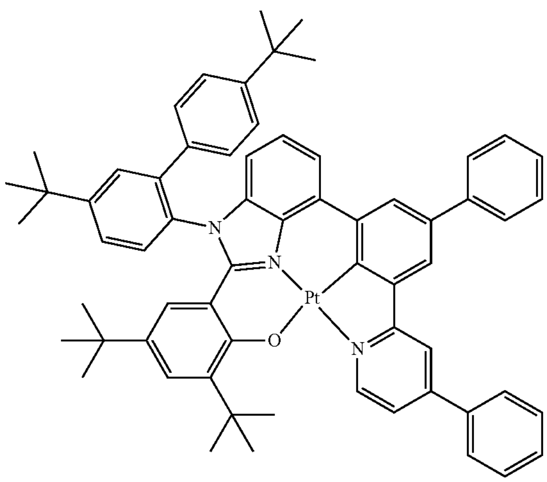
4-2993
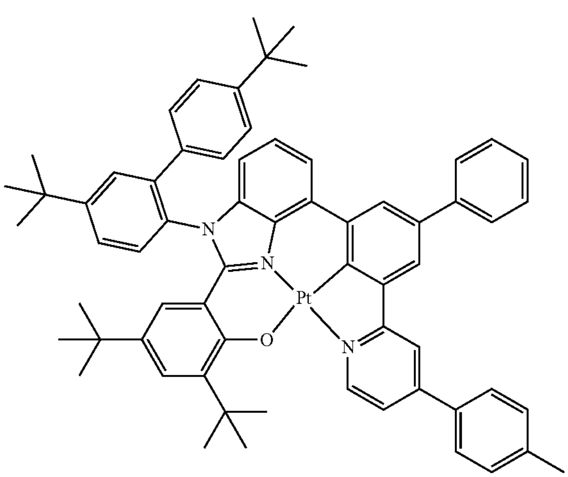
-continued
4-2994
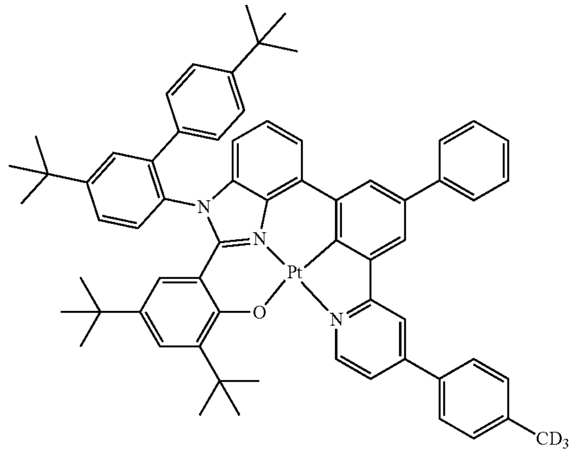
4-2995
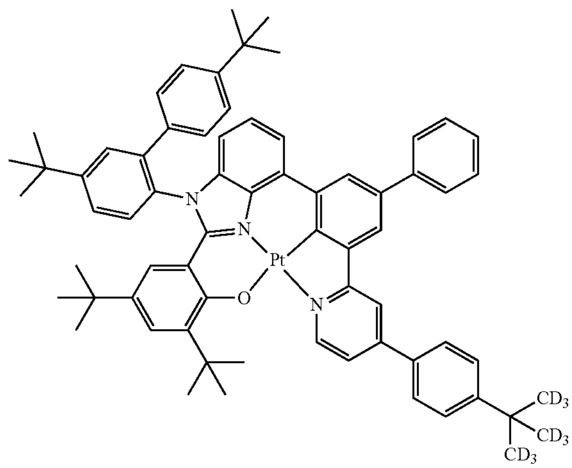
4-2996
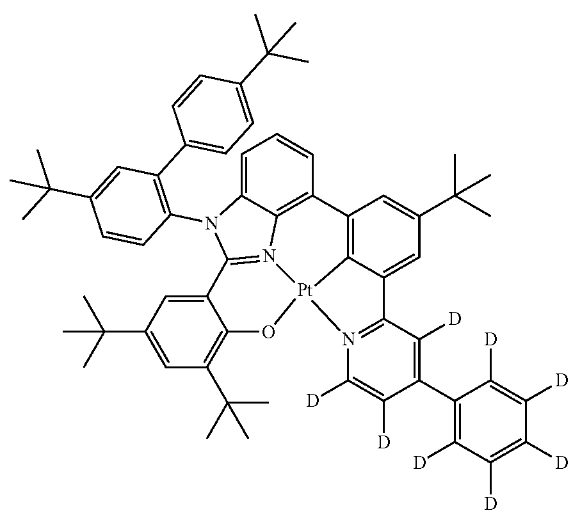

4-2997
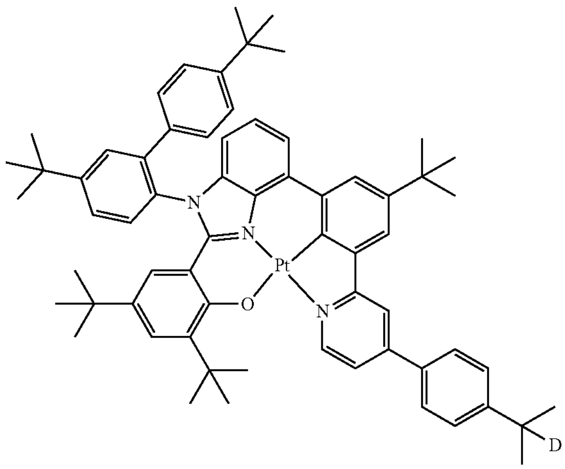
4-2998
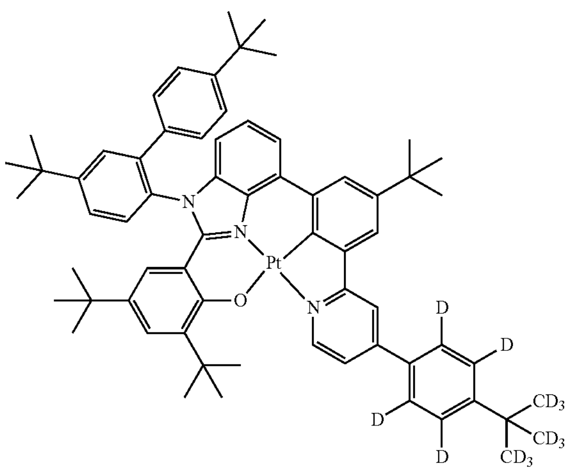
4-2999
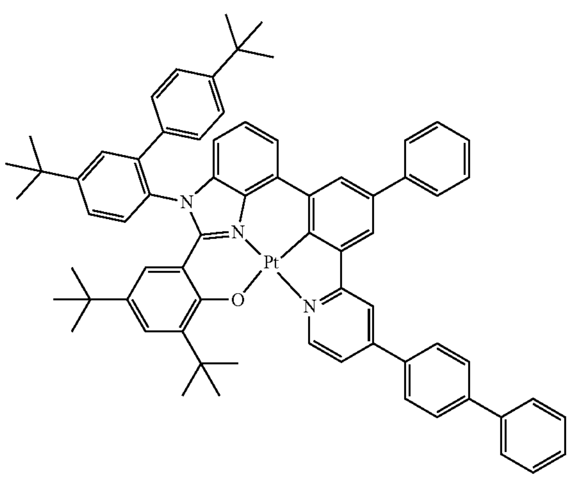
4-3000
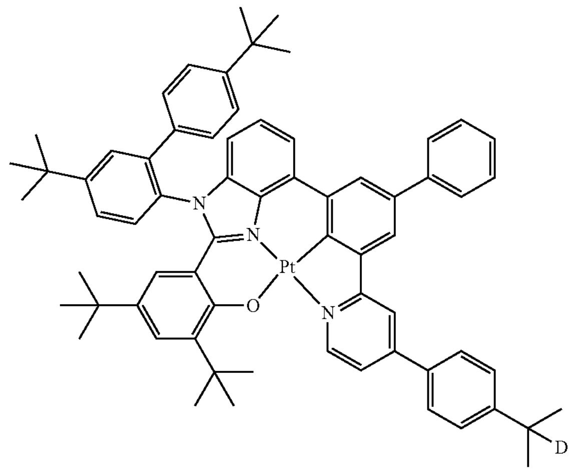
4-3001
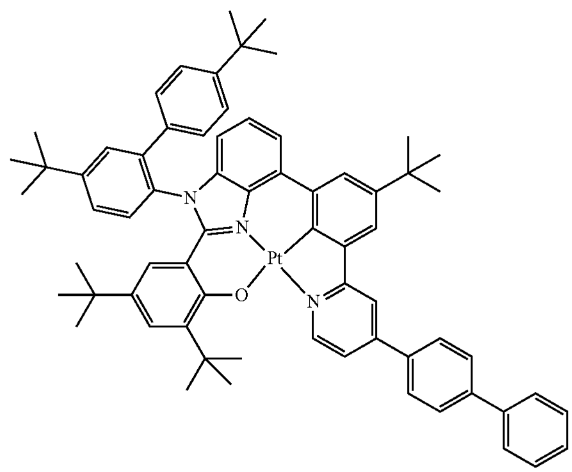
4-3002
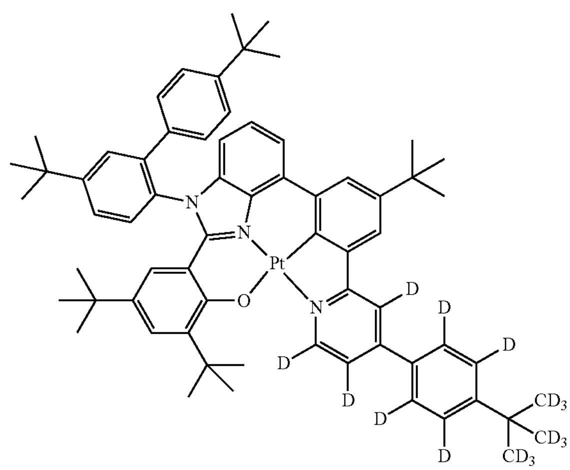

-continued
4-3003
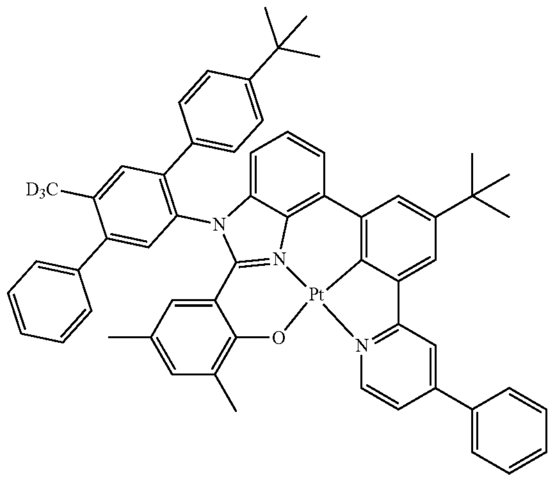
4-3004
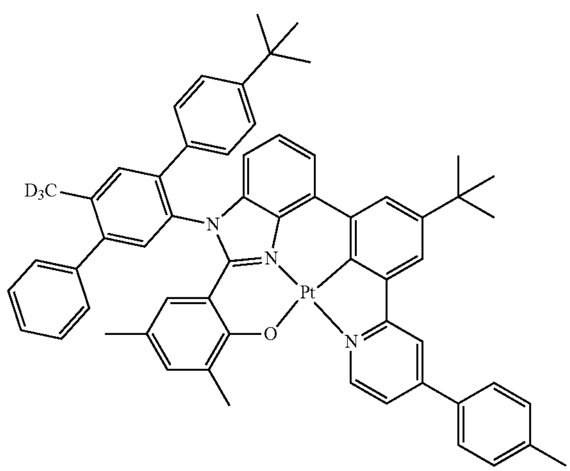
4-3005
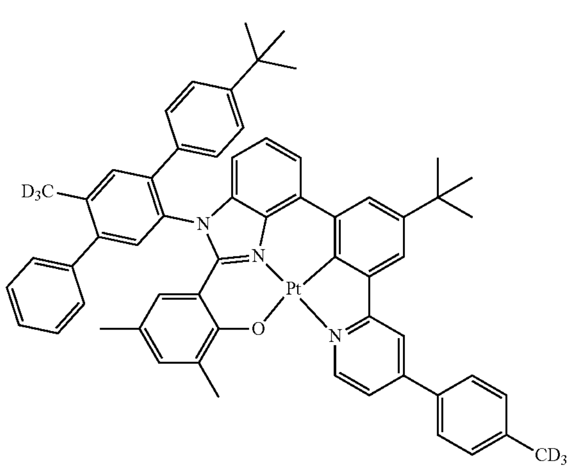
-continued
4-3006
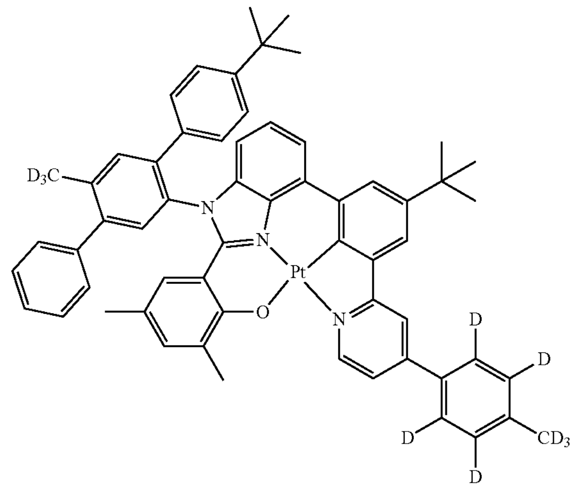
4-3007
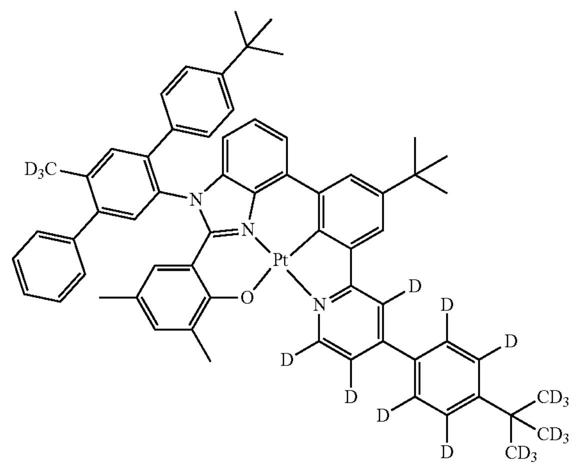
4-3008
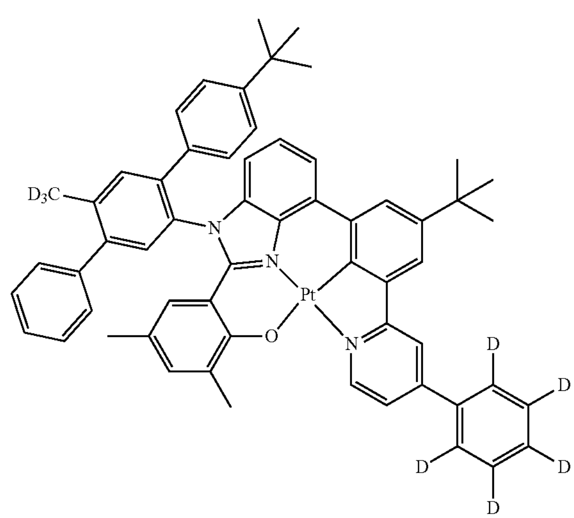

-continued
4-3009
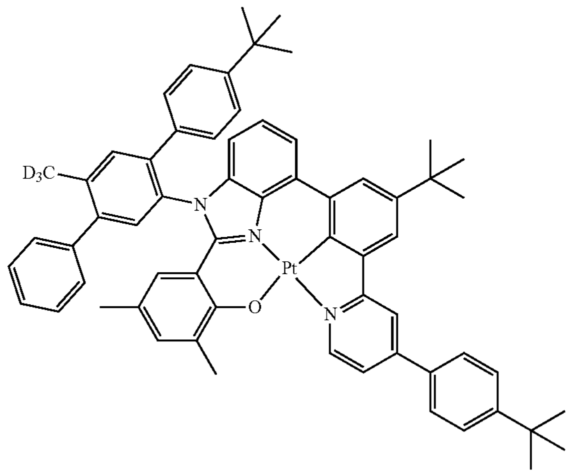
4-3010
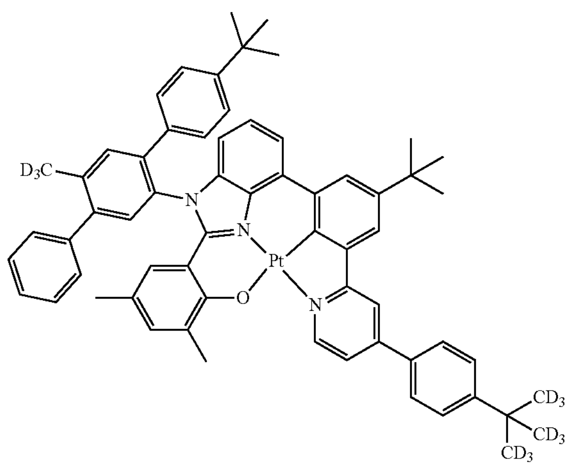
4-3011
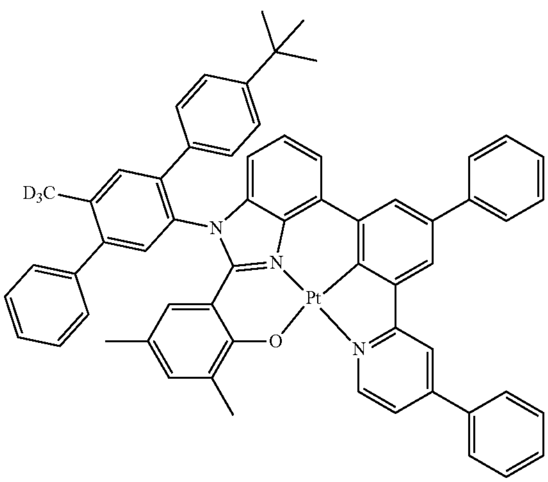
-continued
4-3012
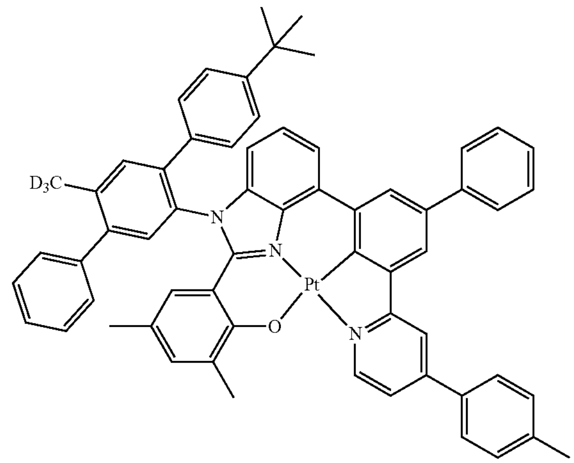
4-3013
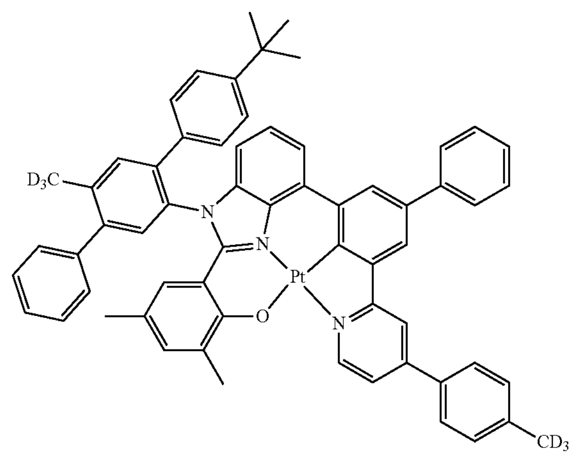
4-3014
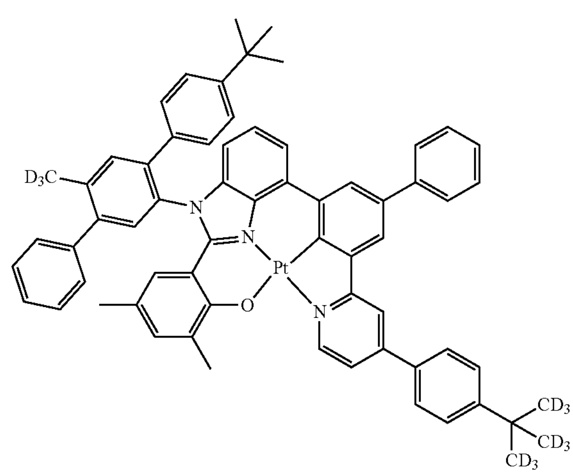

4-3015
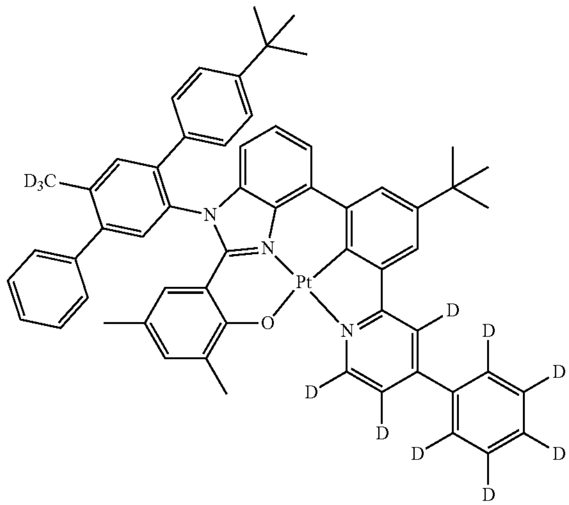
4-3016
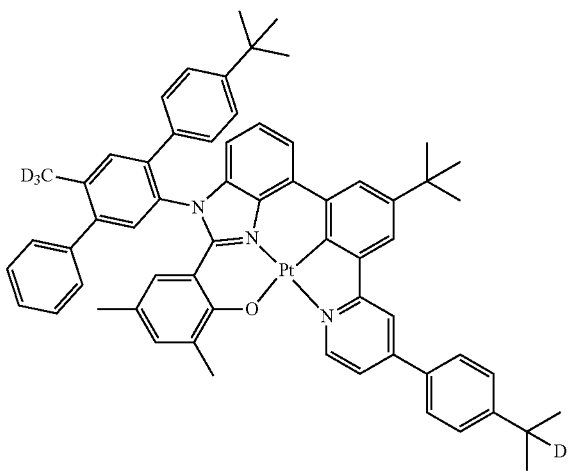
4-3017
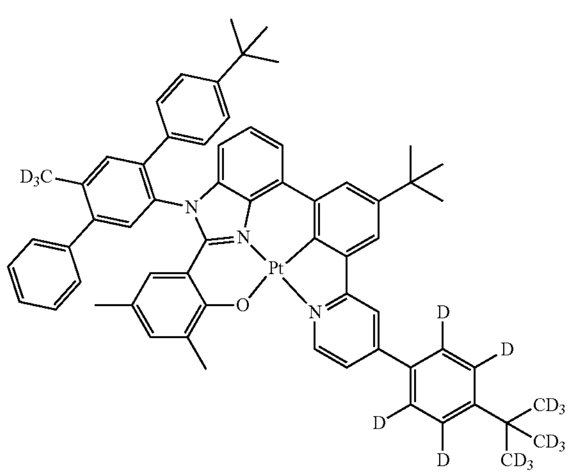
4-3018
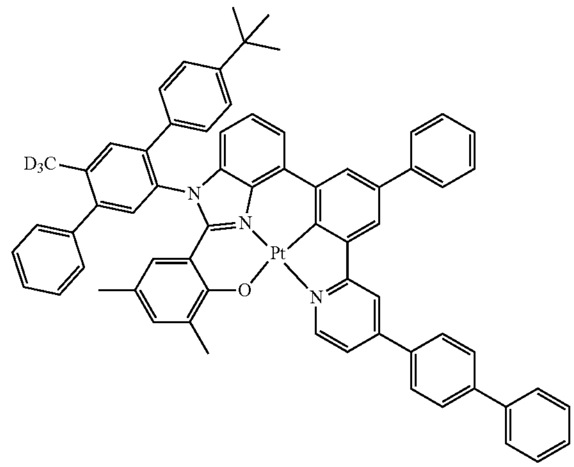
4-3019
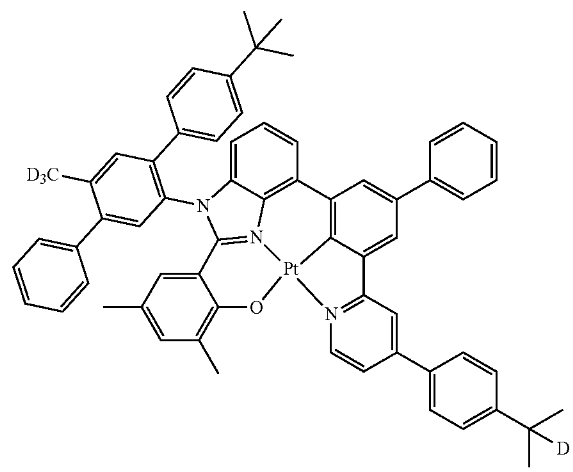
4-3020
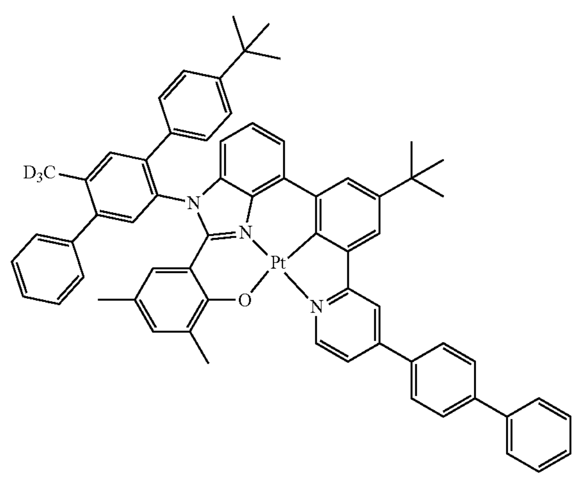

4-3021
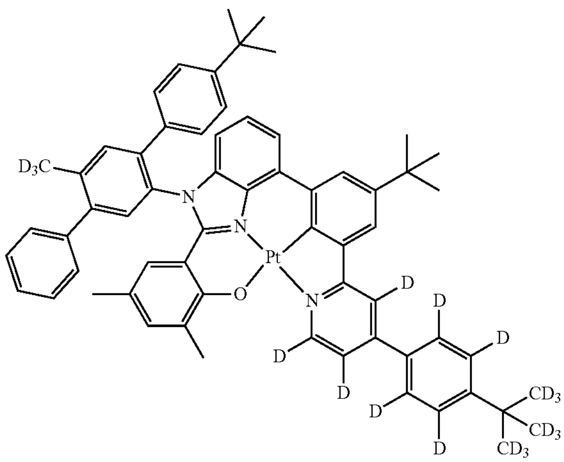
4-3022
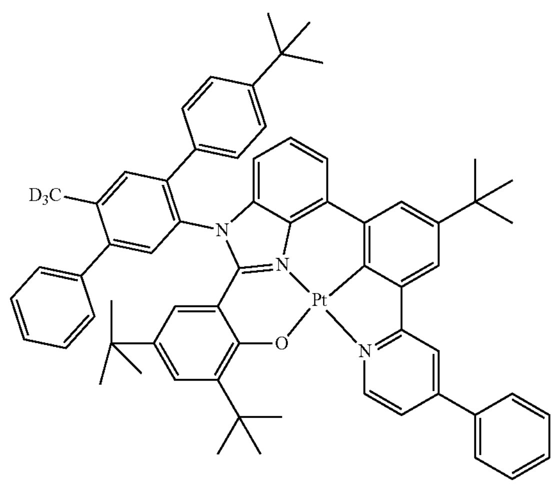
4-3023
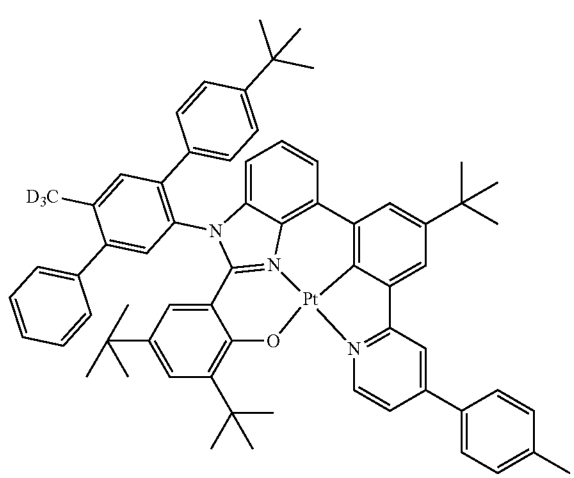
4-3024
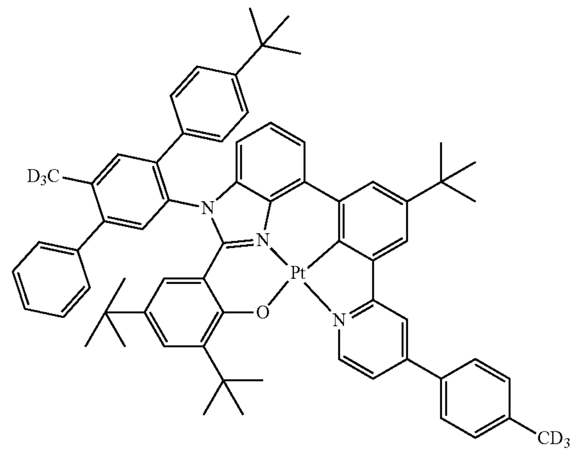
4-3025
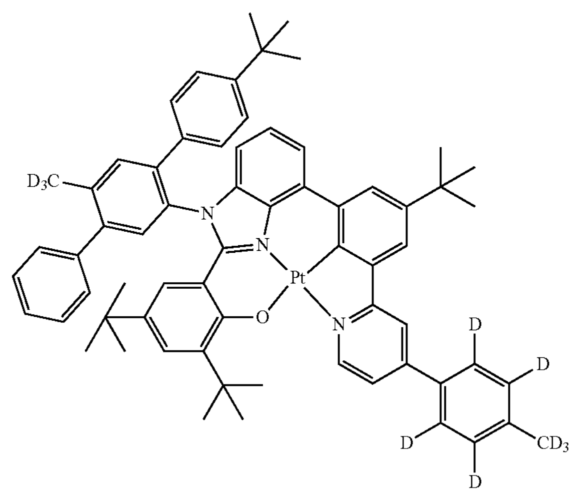
4-3026
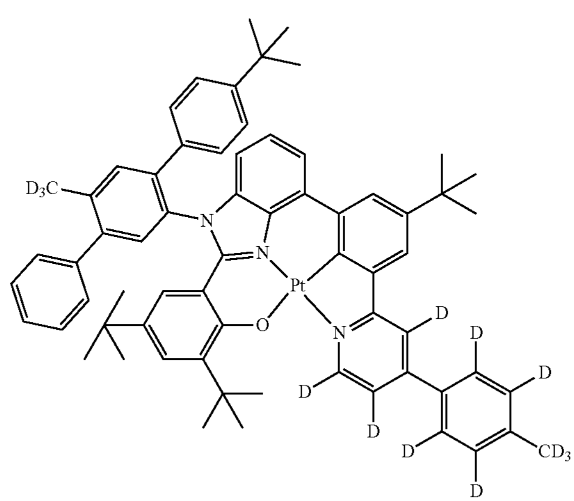

-continued
4-3027
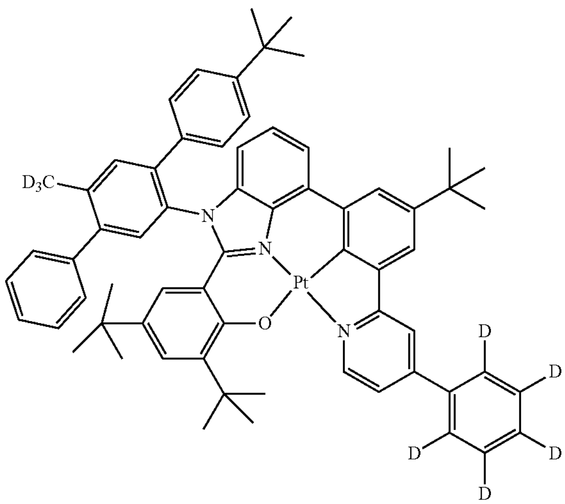
4-3028
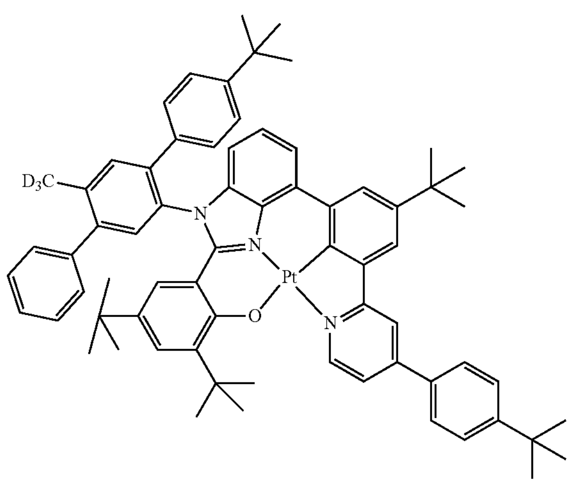
4-3029
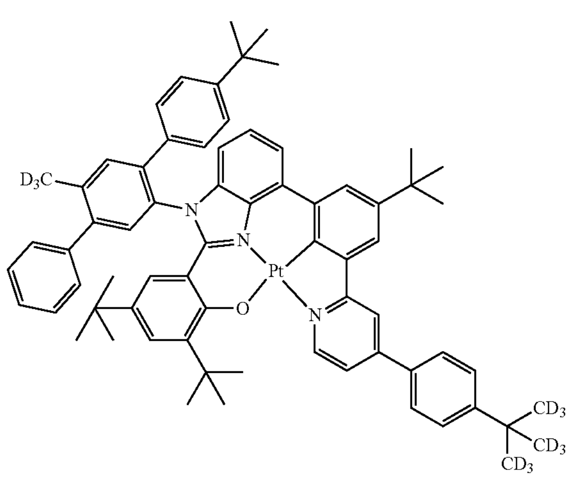
-continued
4-3030
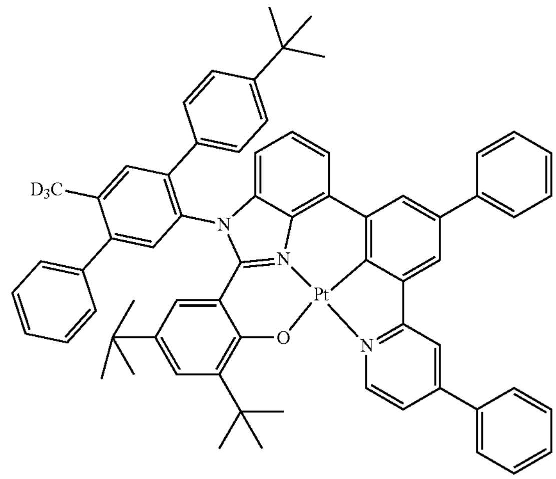
4-3031
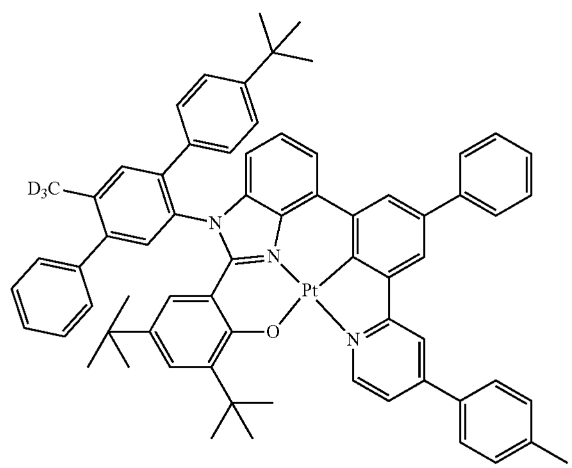
4-3032
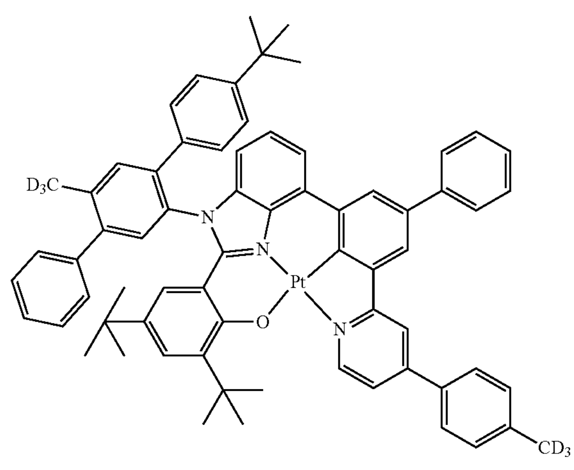

-continued
4-3033
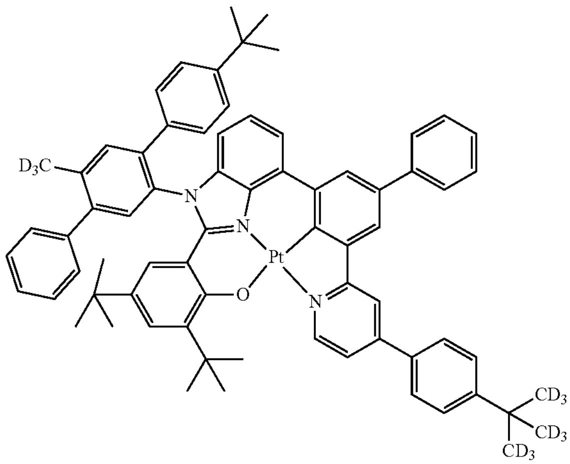
4-3034
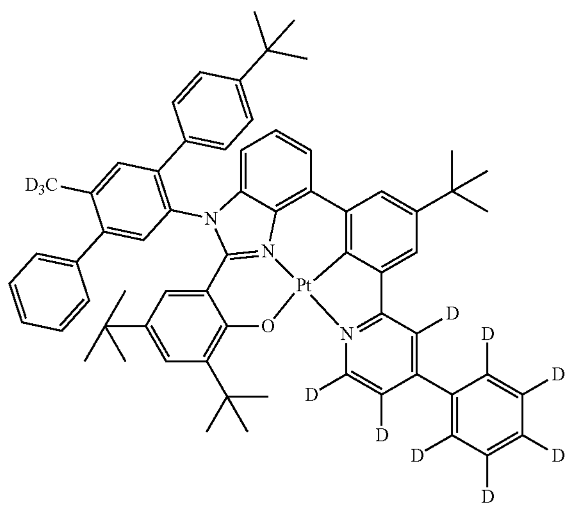
4-3035
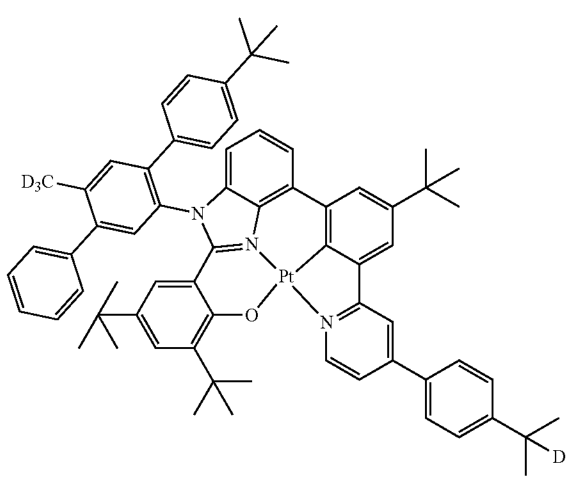
-continued
4-3036
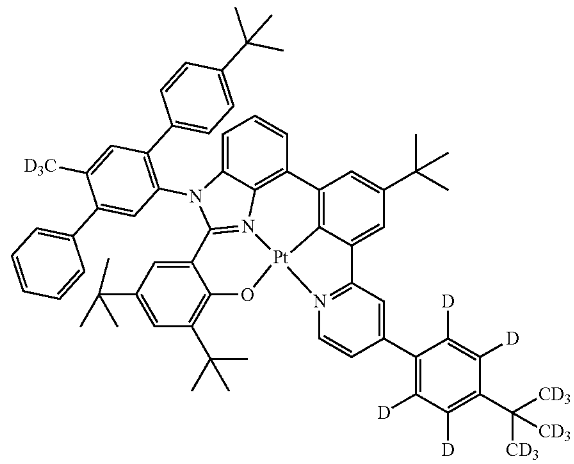
4-3037
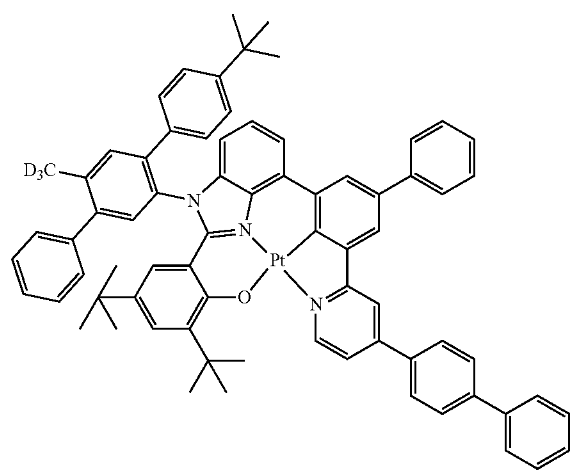
4-3038
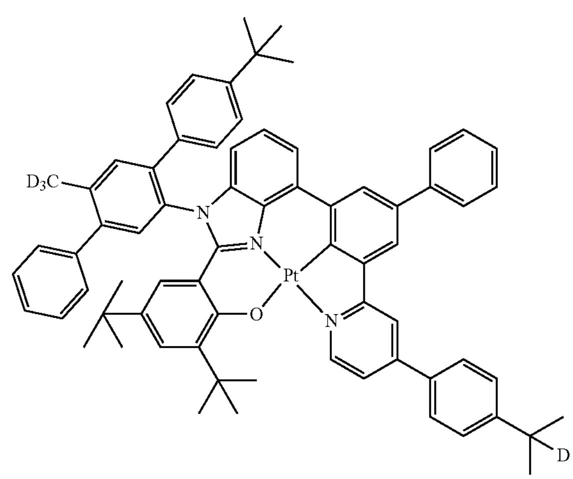

4-3039
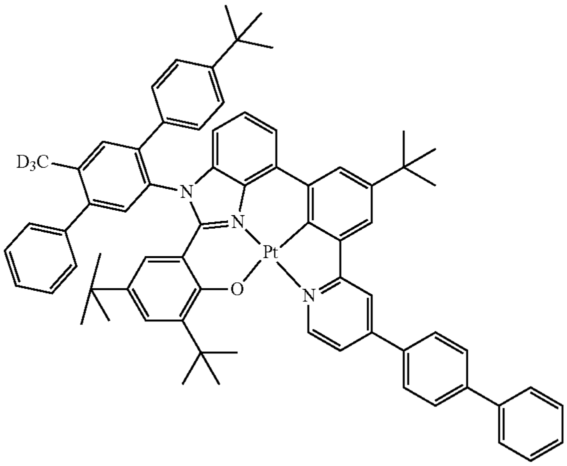
4-3040
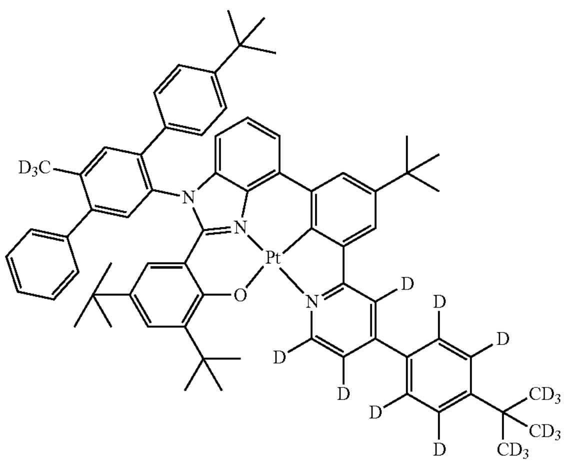
4-3041
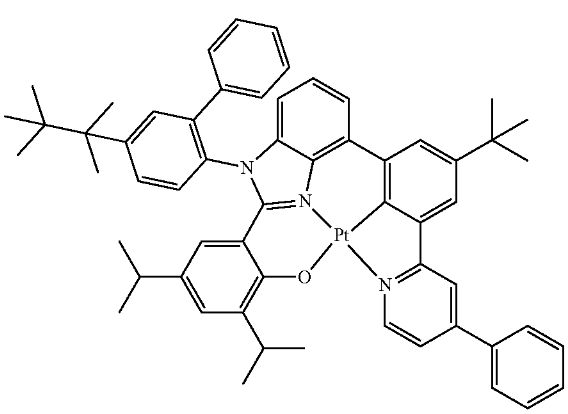
4-3042
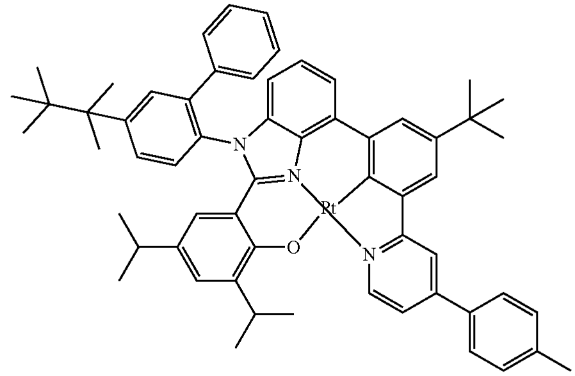
4-3043
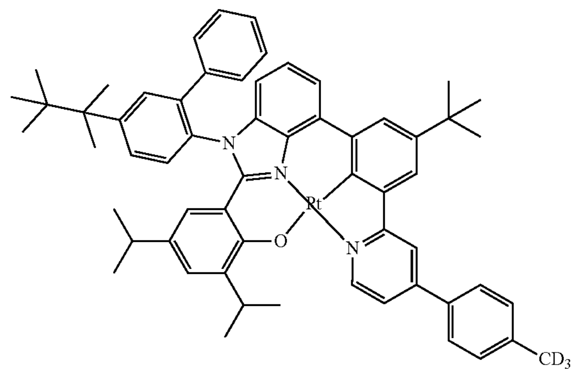
4-3044
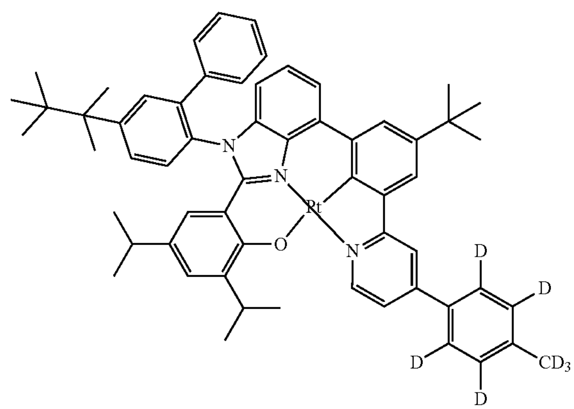
4-3045
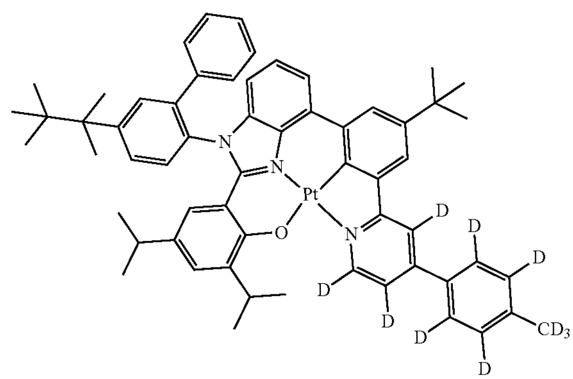

-continued
4-3046
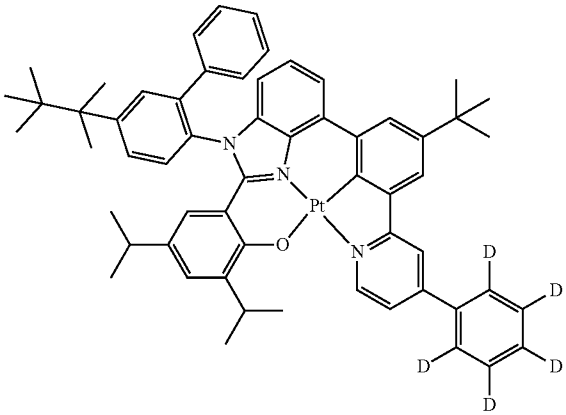
4-3047
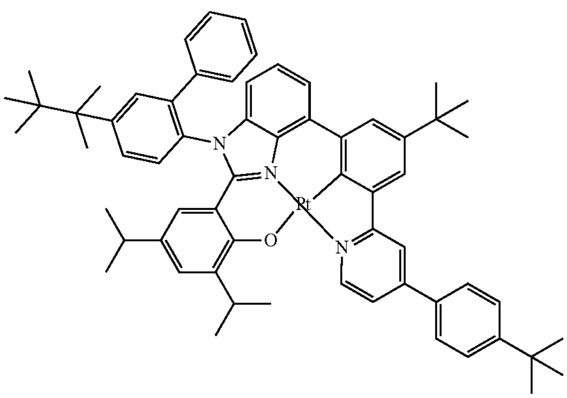
4-3048
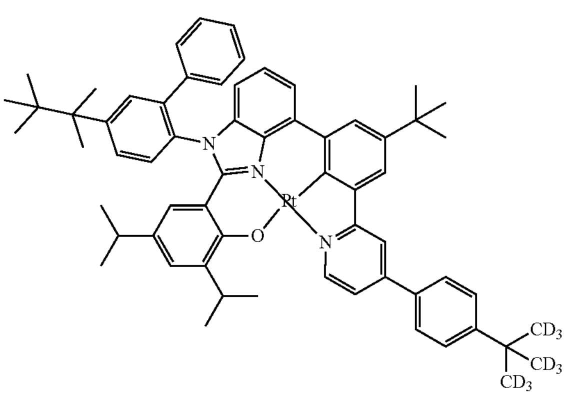
-continued
4-3049
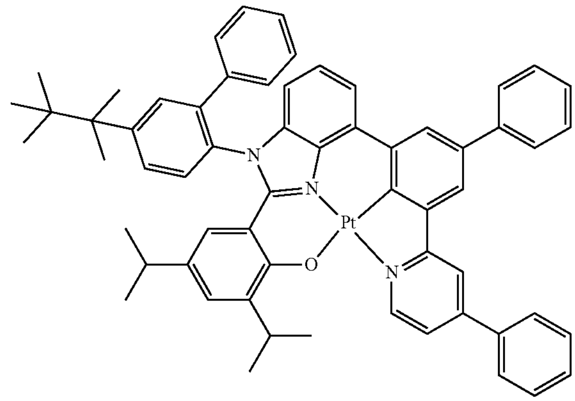
4-3050
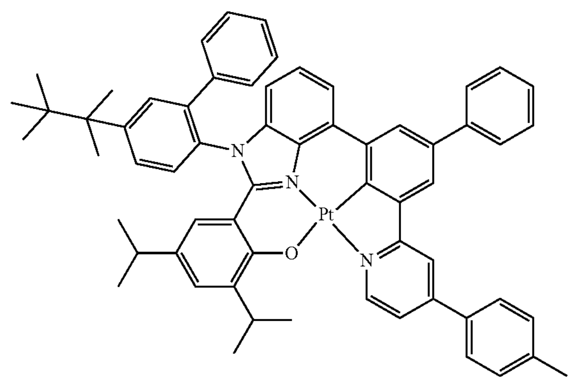
4-3051
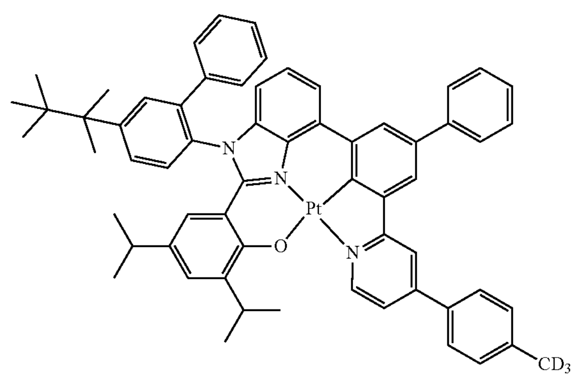
4-3052
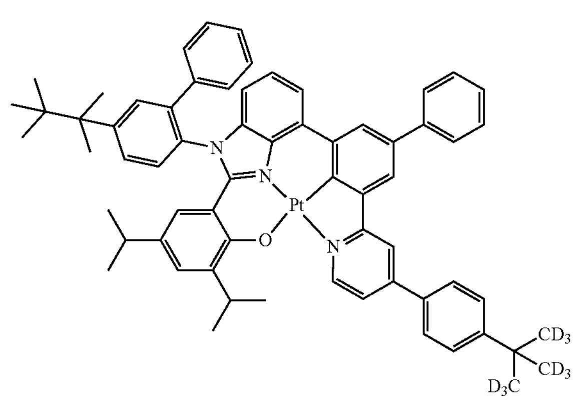

-continued
4-3053
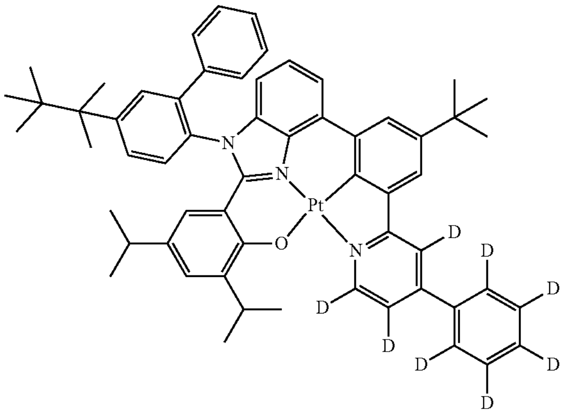
4-3054
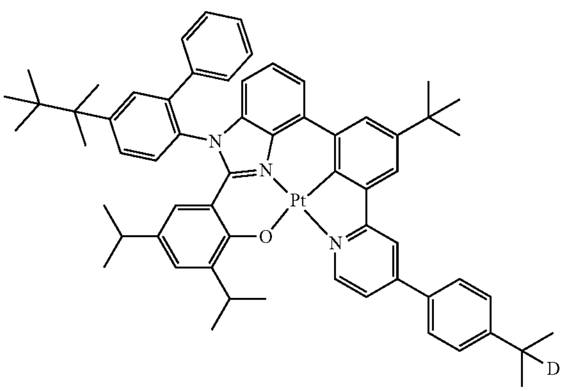
4-3055
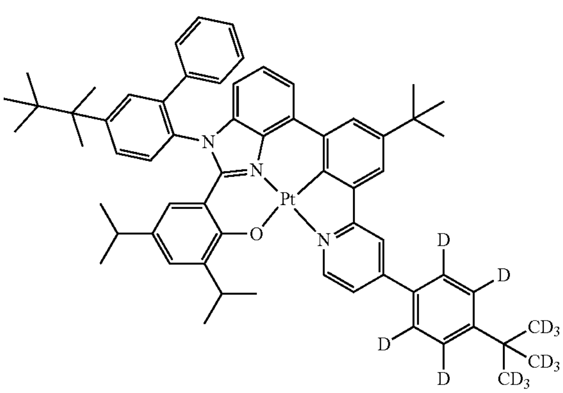
-continued
4-3056
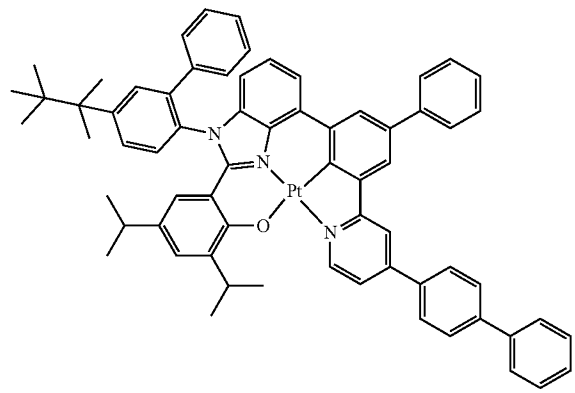
4-3057
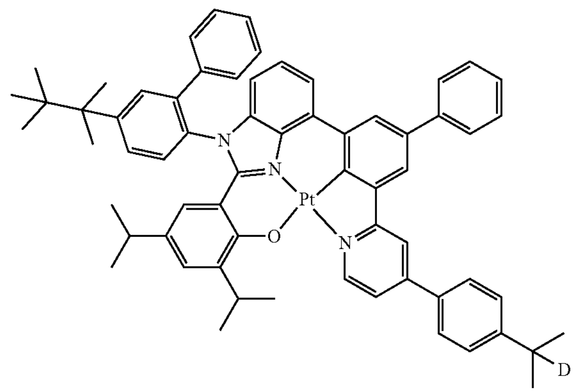
4-3058
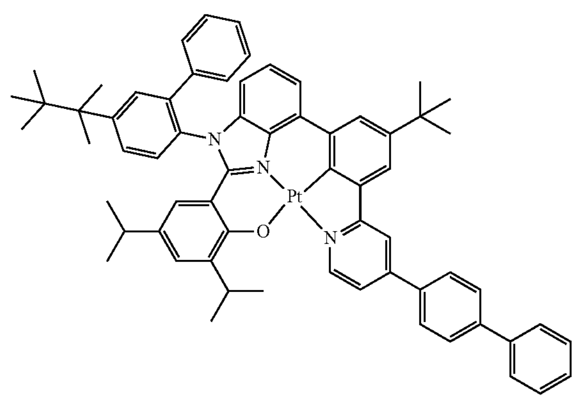
4-3059
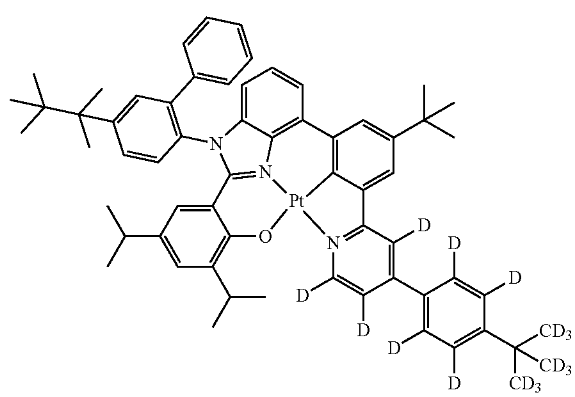

-continued
4-3060
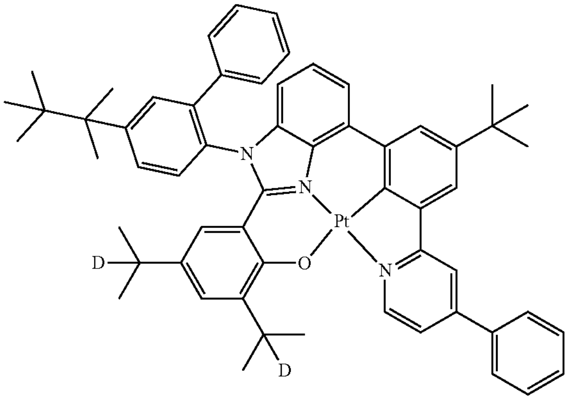
4-3061
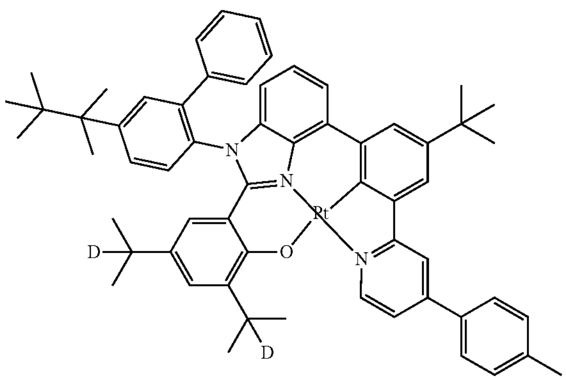
4-3062
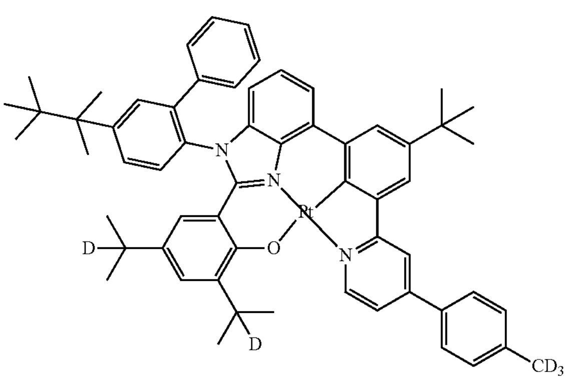
4-3063
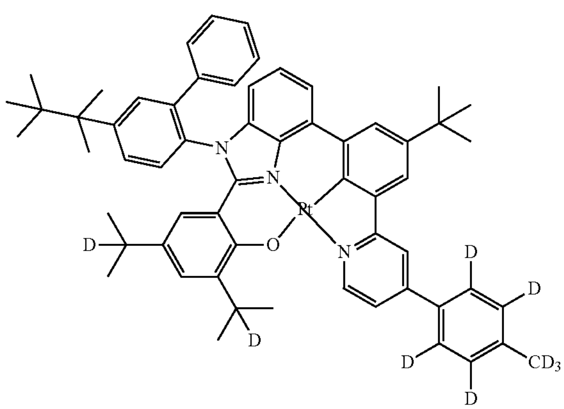
-continued
4-3064
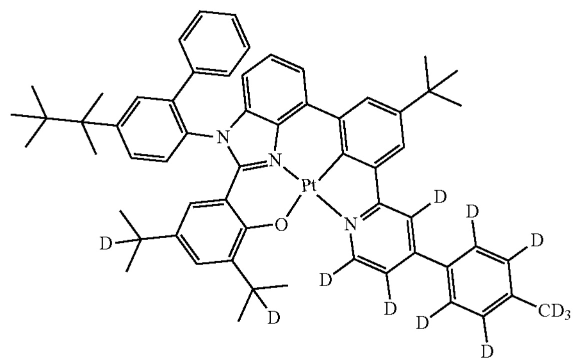
4-3065
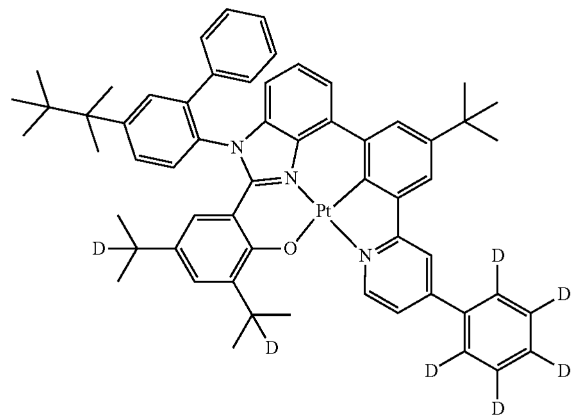
4-3066
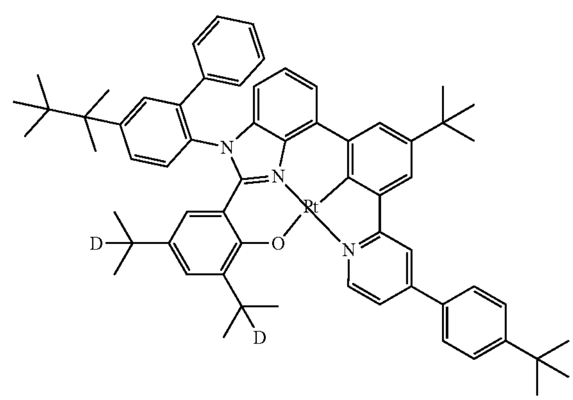
4-3067
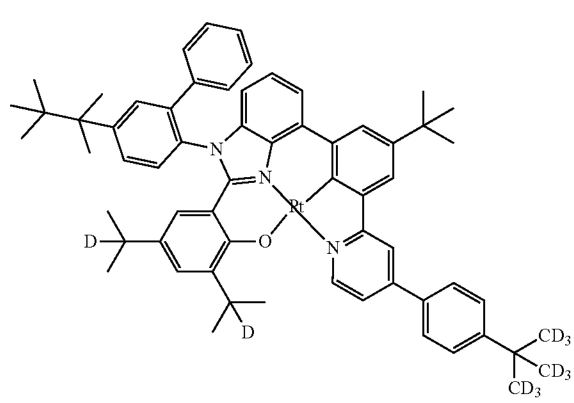

-continued
4-3068
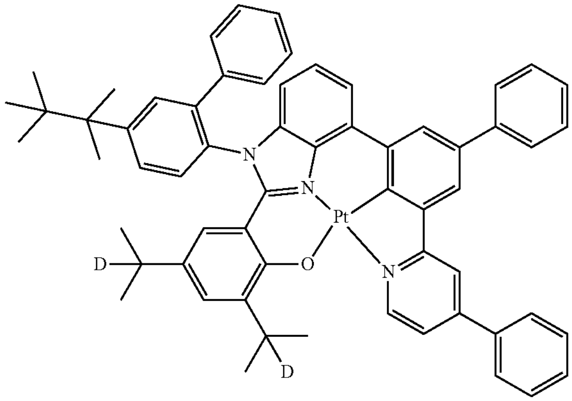
4-3069
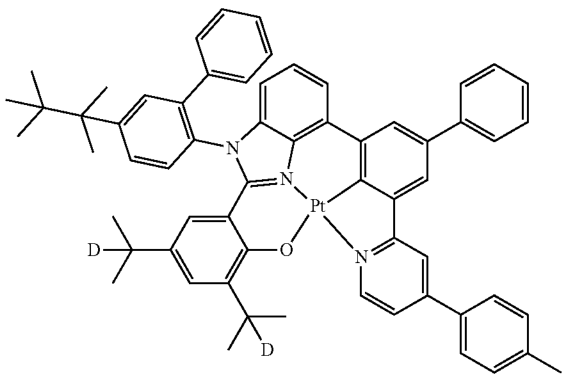
4-3070
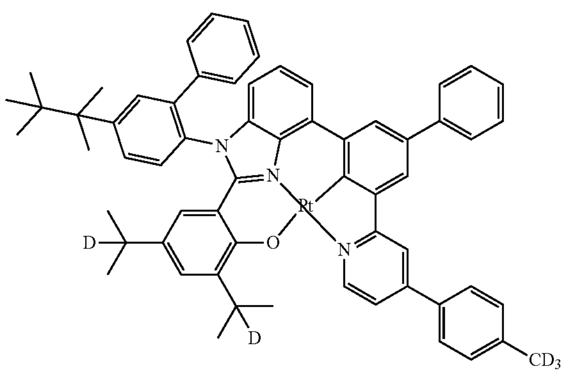
4-3071
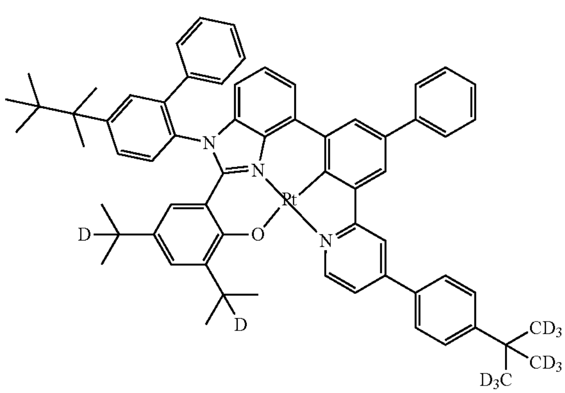
-continued
4-3072
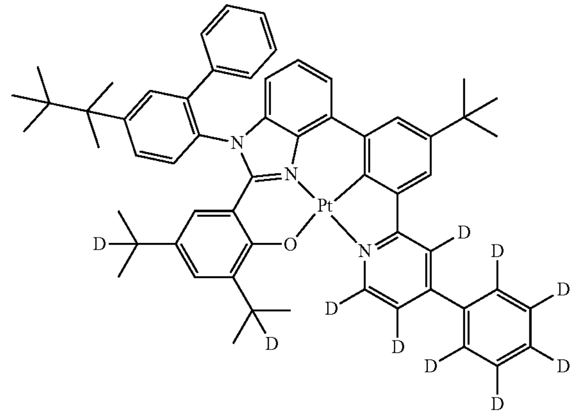
4-3073
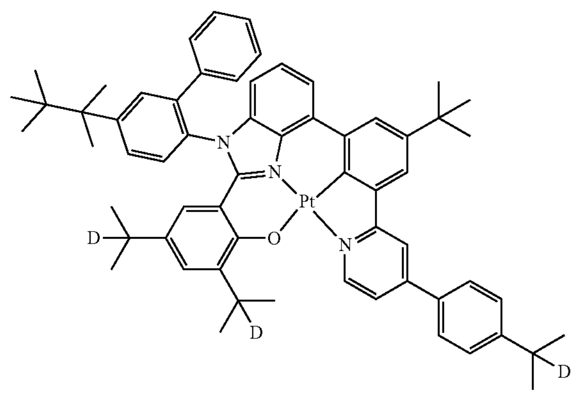
4-3074
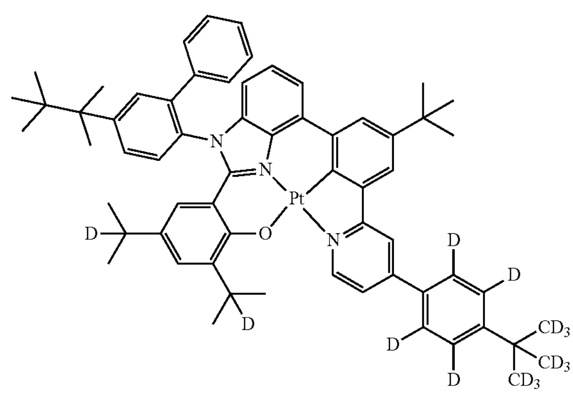

4-3075
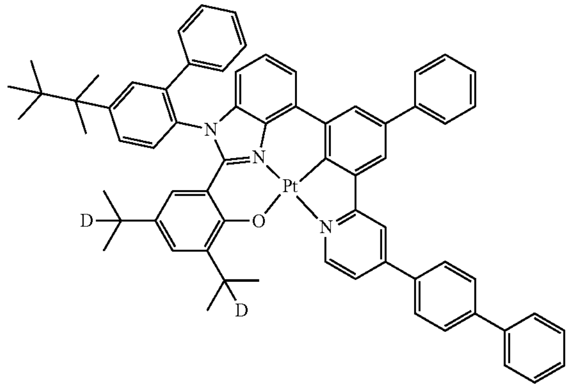
4-3076
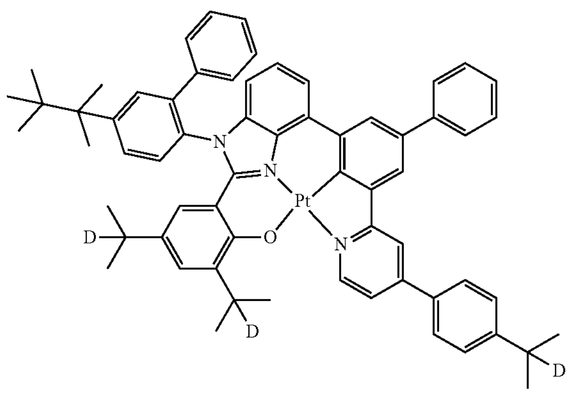
4-3077
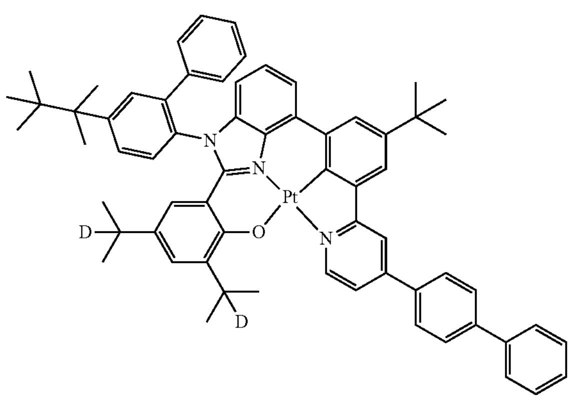
4-3078
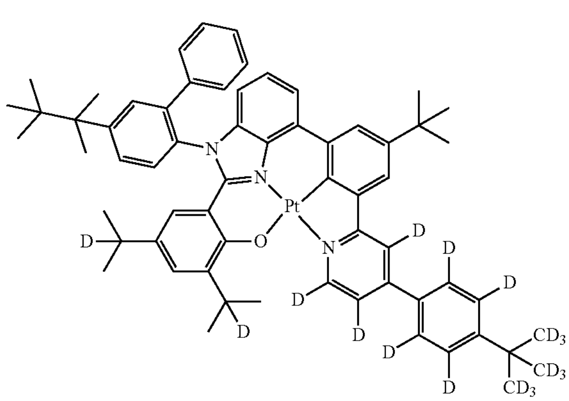
4-3079
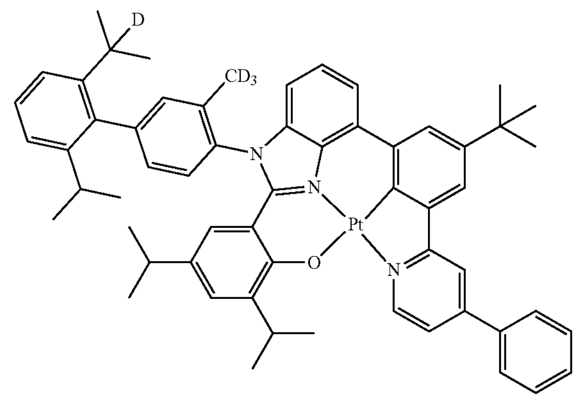
4-3080
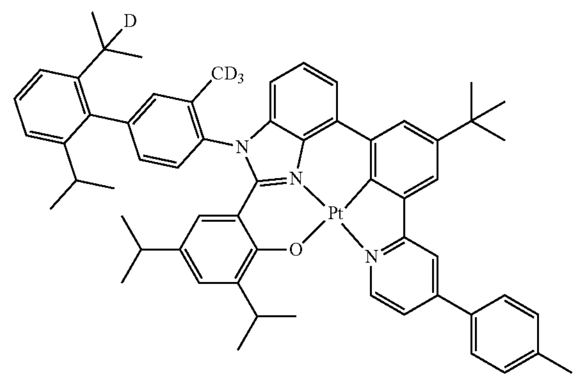
4-3081
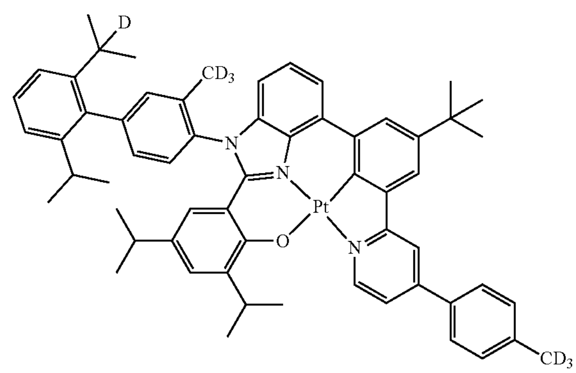
4-3082
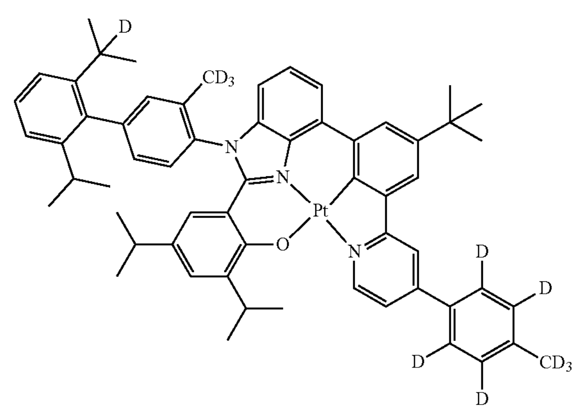

-continued
4-3083
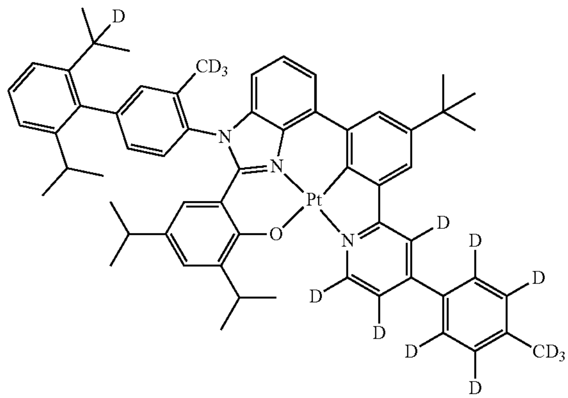
4-3084
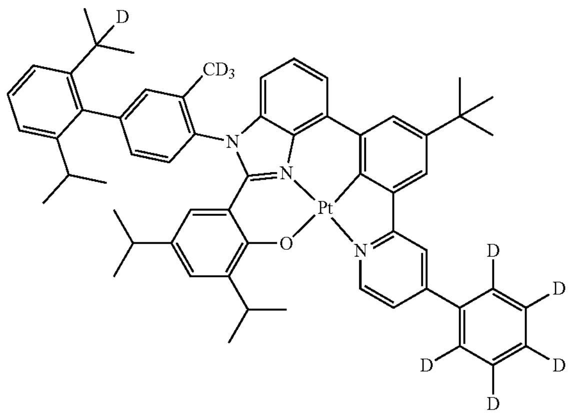
4-3085
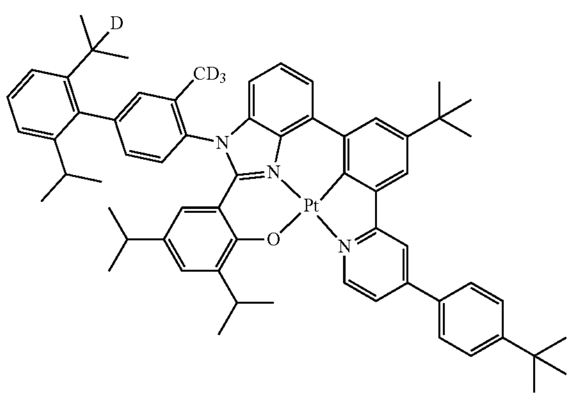
4-3086
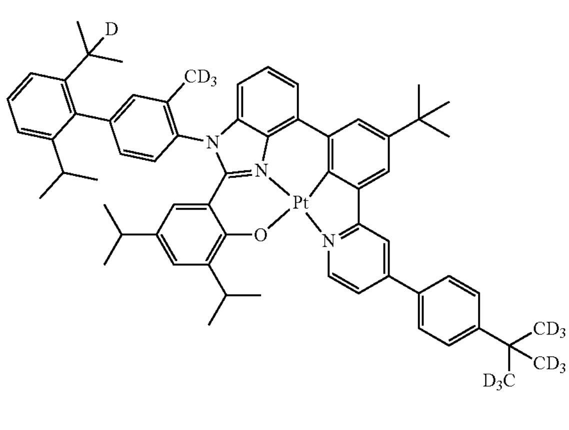
-continued
4-3087
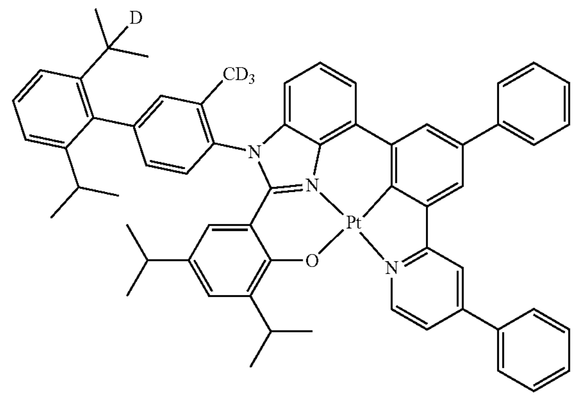
4-3088
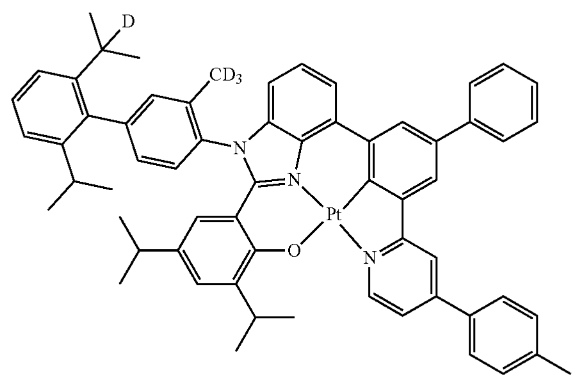
4-3089
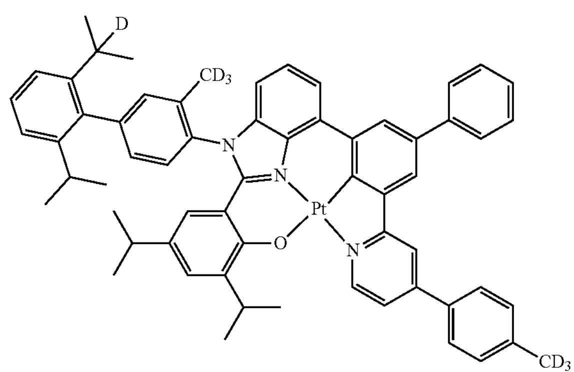
4-3090
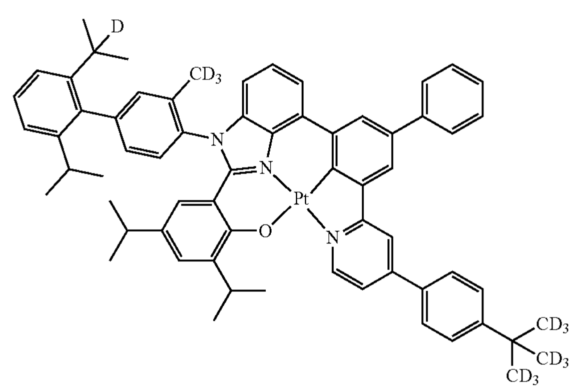

-continued
4-3091
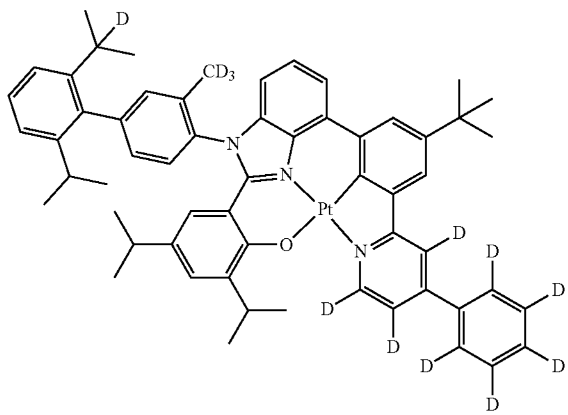
4-3092
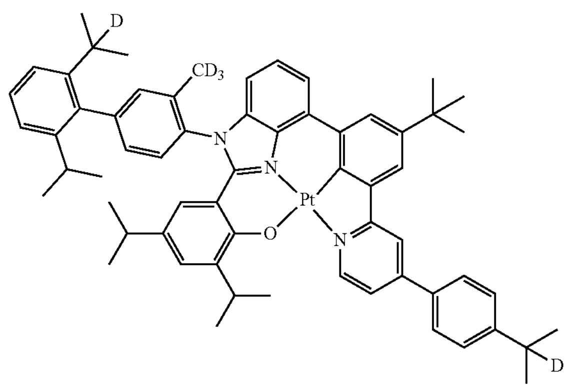
4-3093
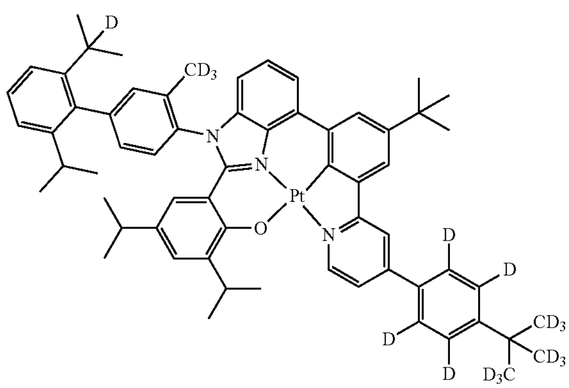
4-3094
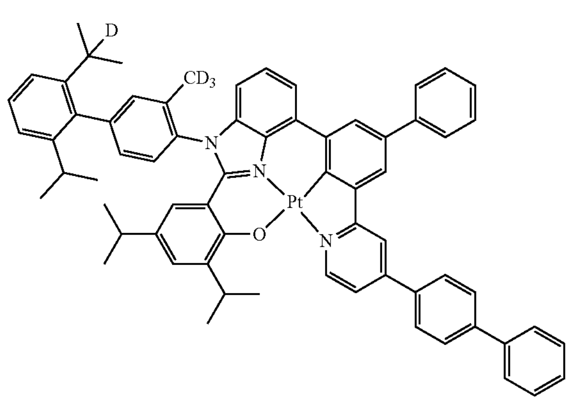
-continued
4-3095
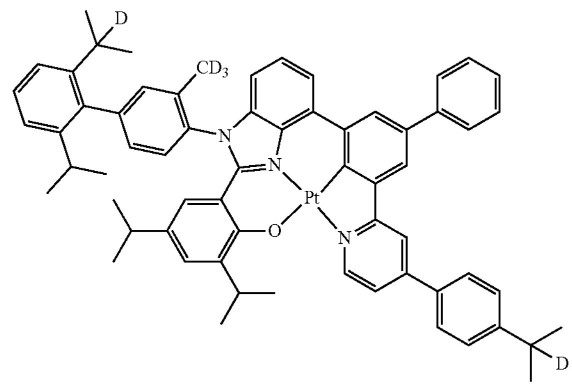
4-3096
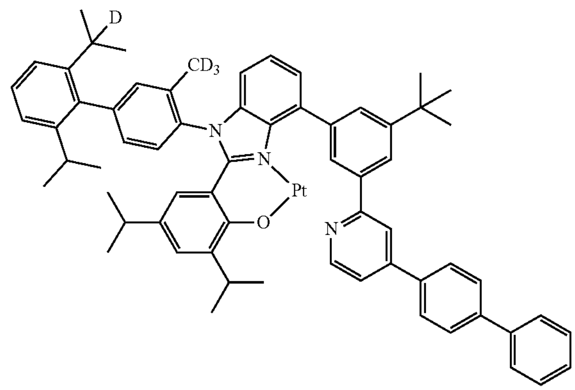
4-3097
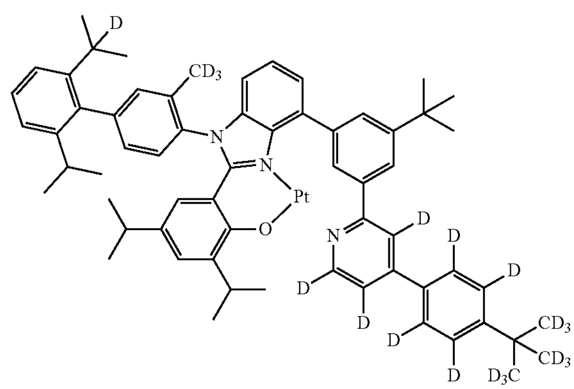
4-3098
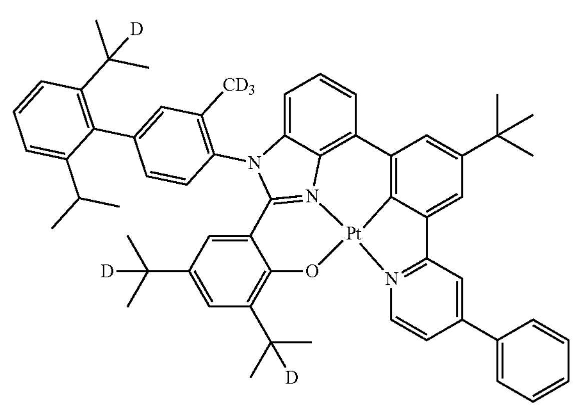

-continued
4-3099
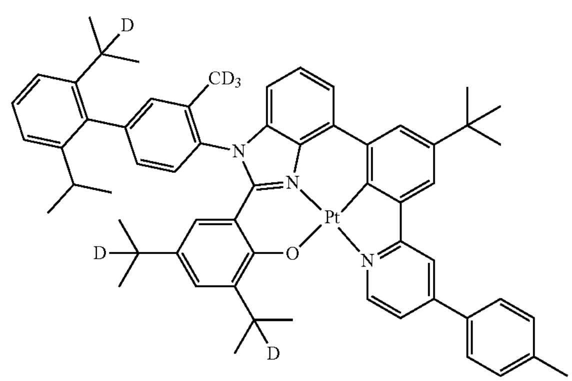
4-3100
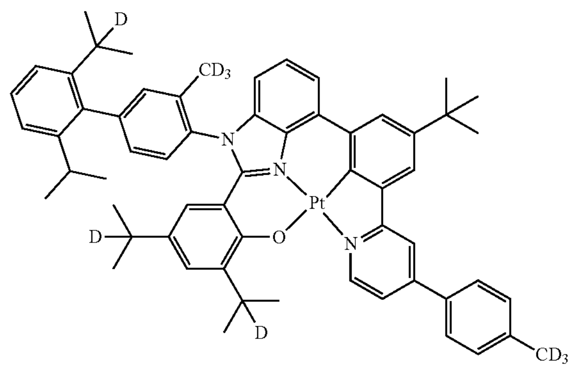
4-3101
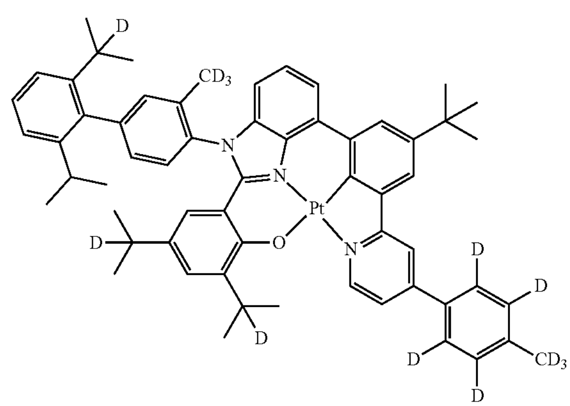
4-3102
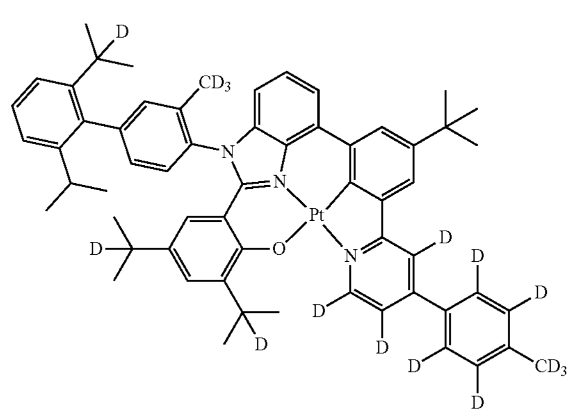
-continued
4-3103
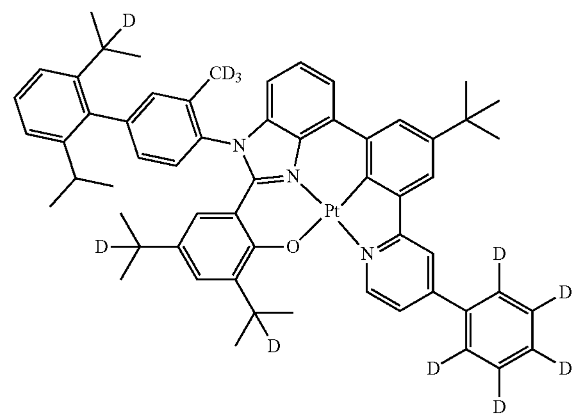
4-3104
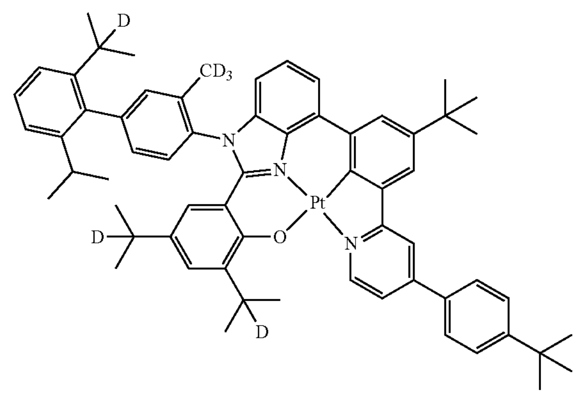
4-3105
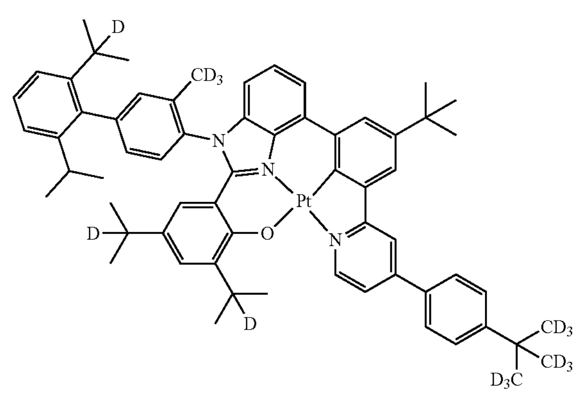
4-3106
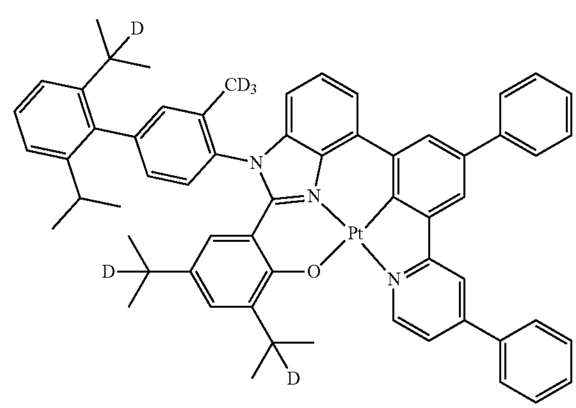

4-3107
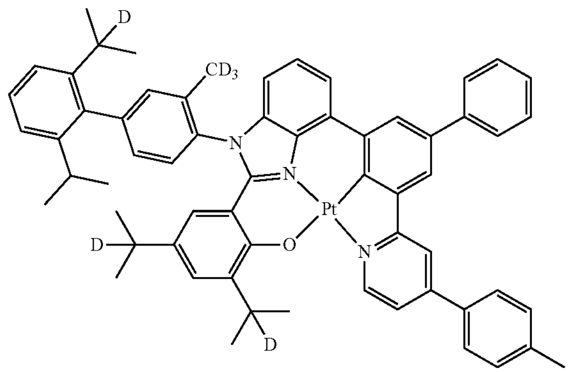
4-3108
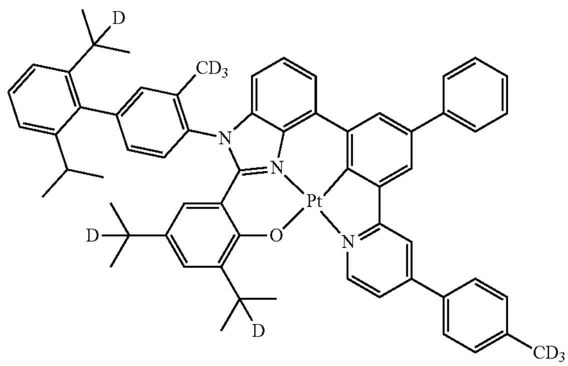
4-3109
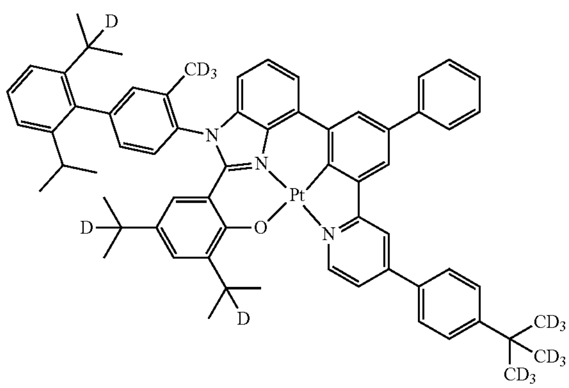
4-3110
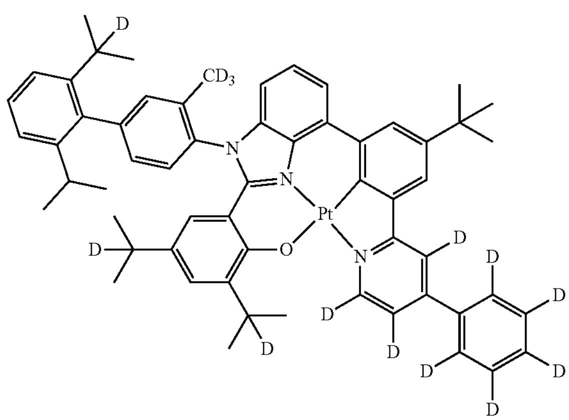
4-3111
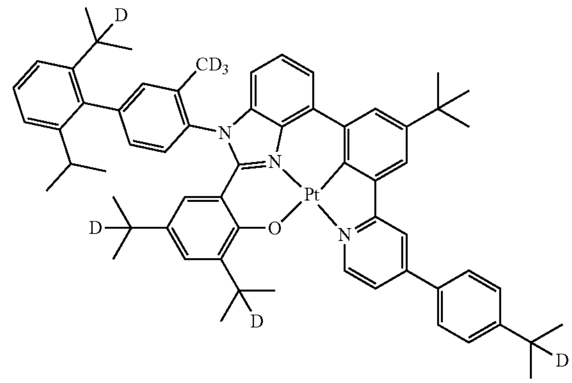
4-3112
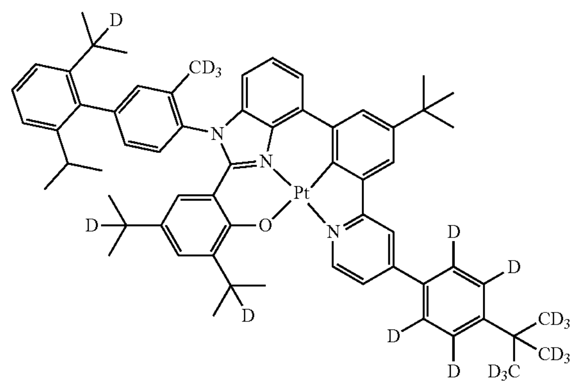
4-3113
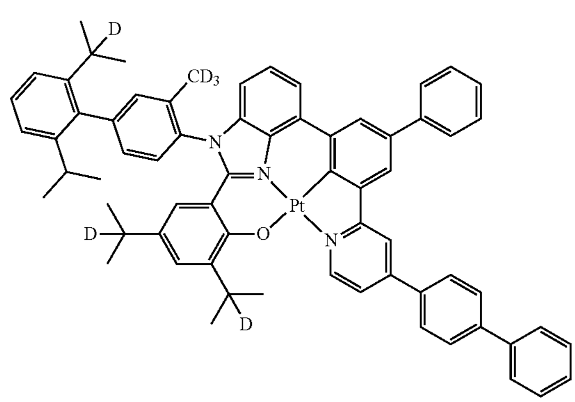

-continued
4-3114
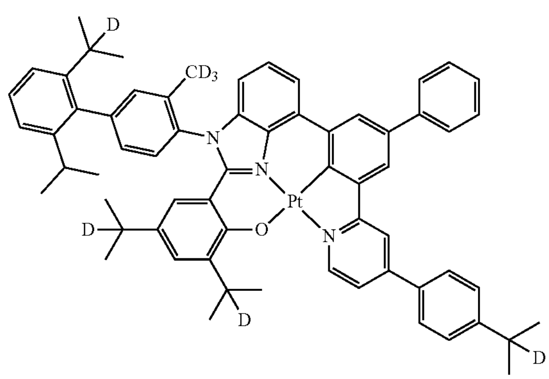
4-3115
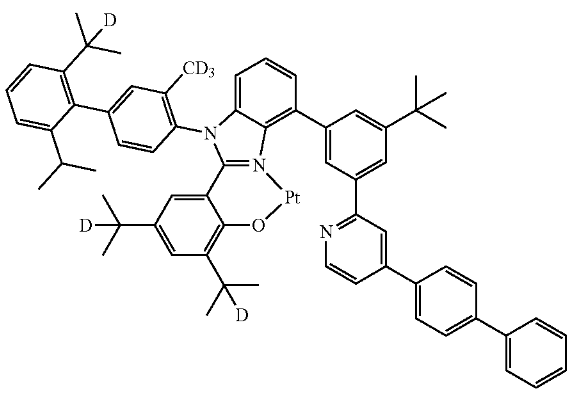
4-3116
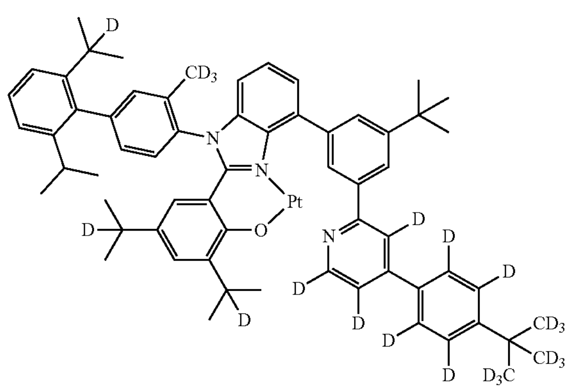
4-3117
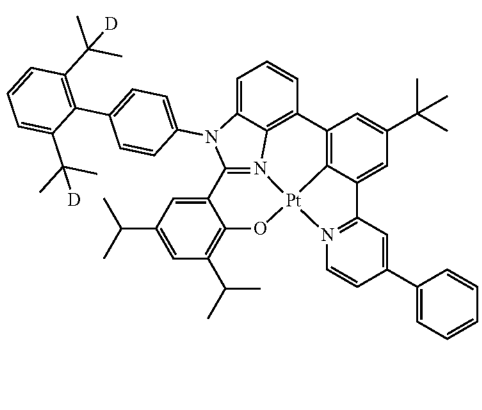
-continued
4-3118
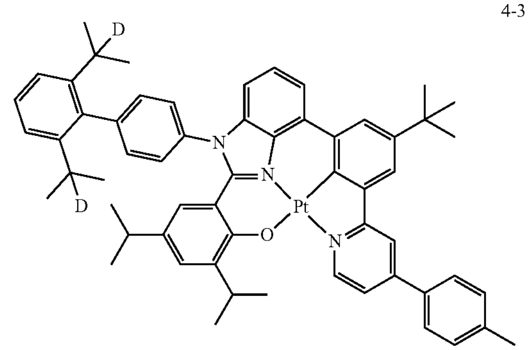
4-3119
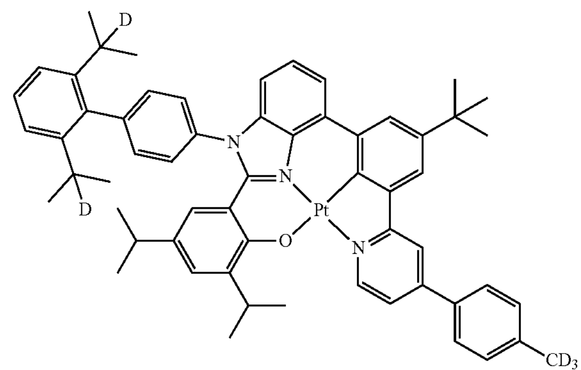
4-3120
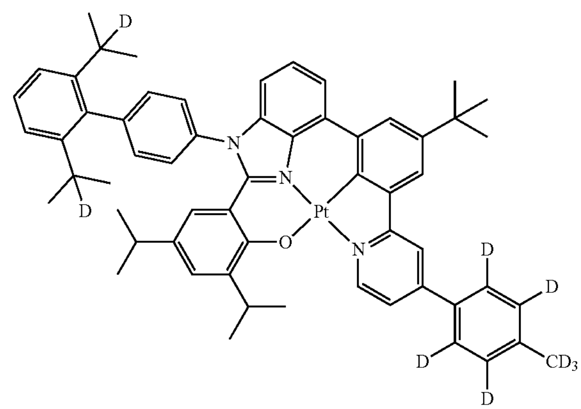
4-3121
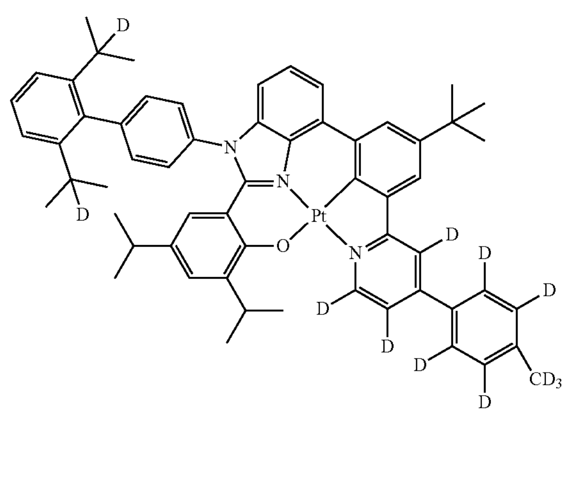

-continued
4-3122
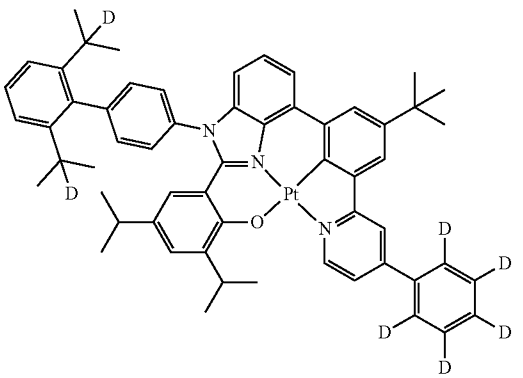
4-3123
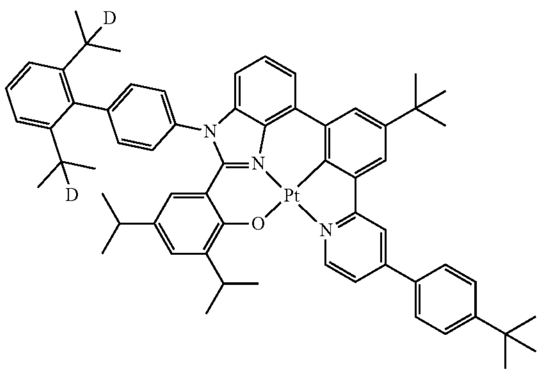
4-3124
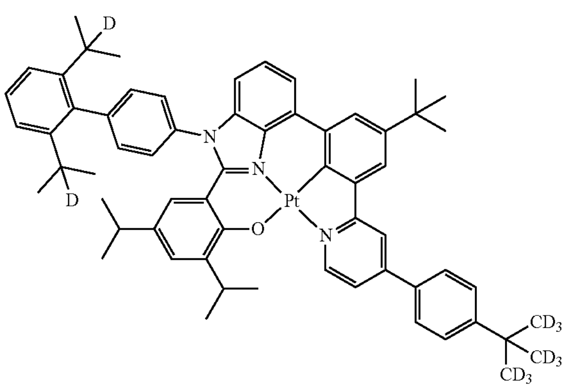
4-3125
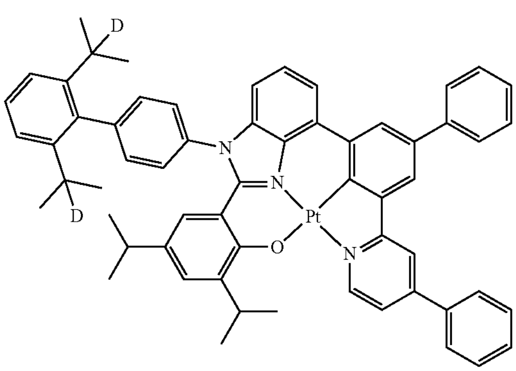
-continued
4-3126
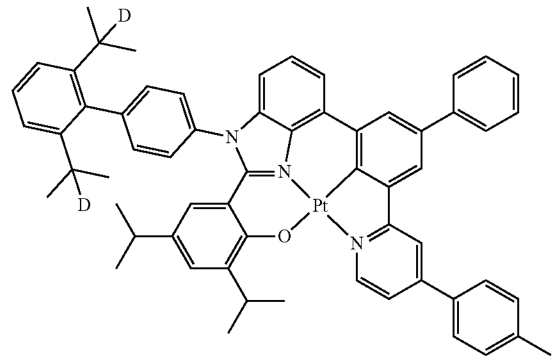
4-3127
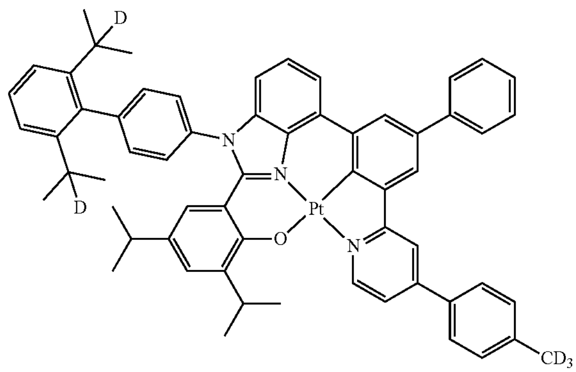
4-3128
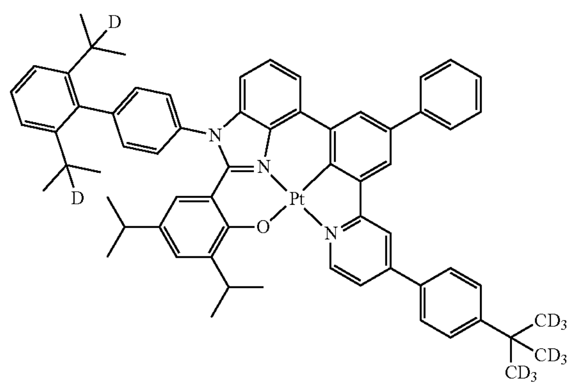
4-3129
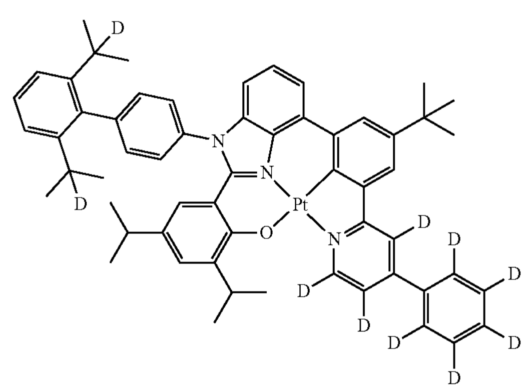

4-3130
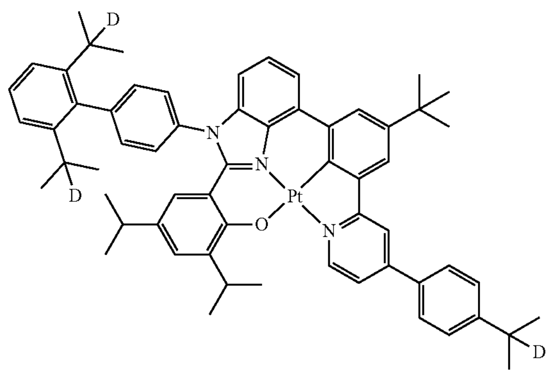
4-3131
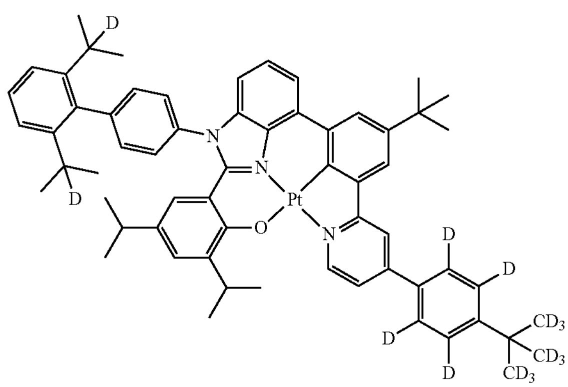
4-3132
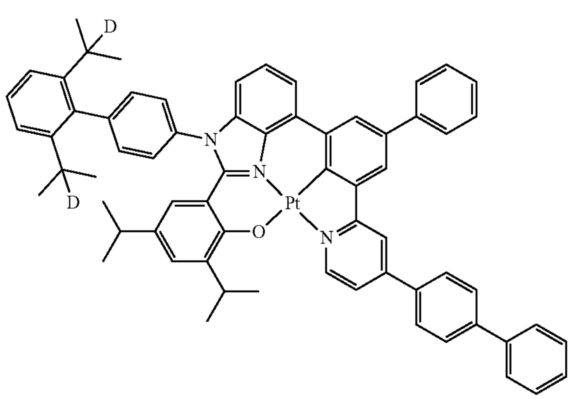
4-3133
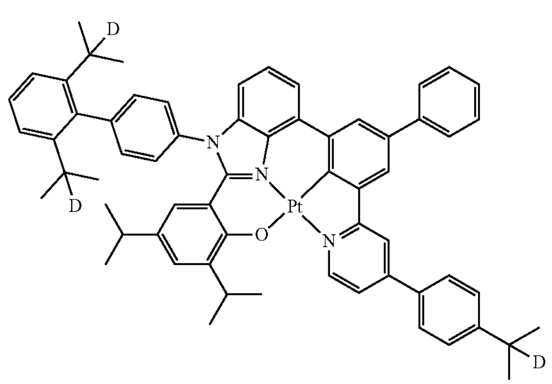
4-3134
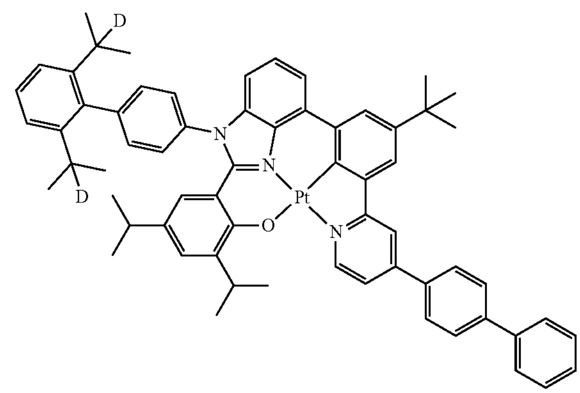
4-3135
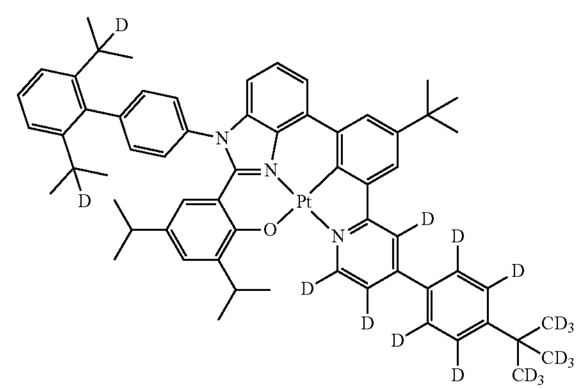
4-3136
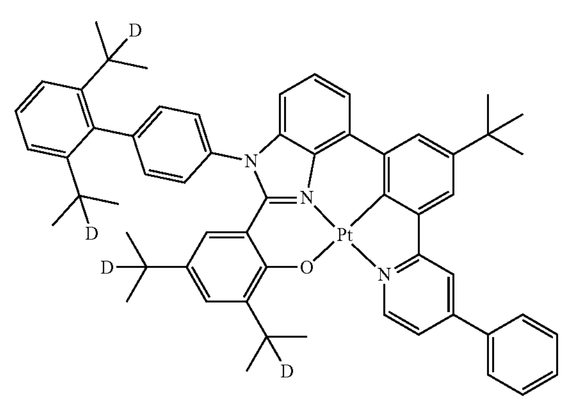
4-3137
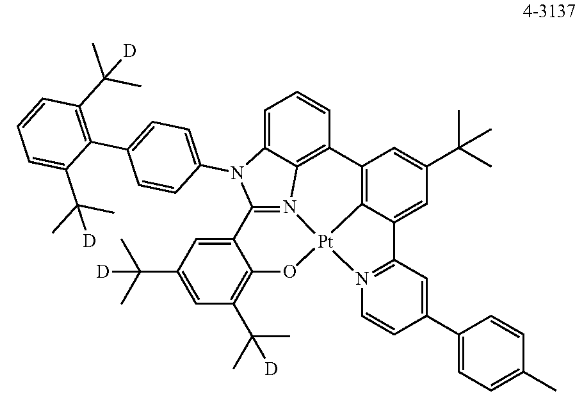

-continued
4-3138
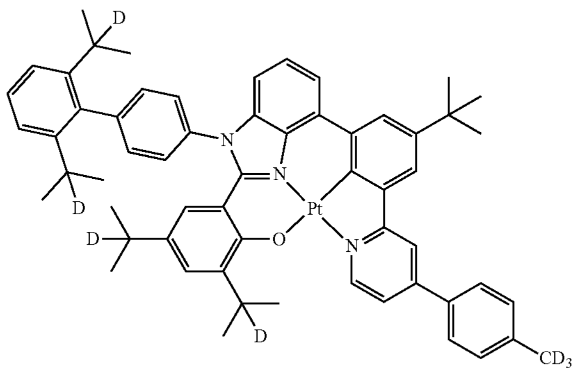
4-3139
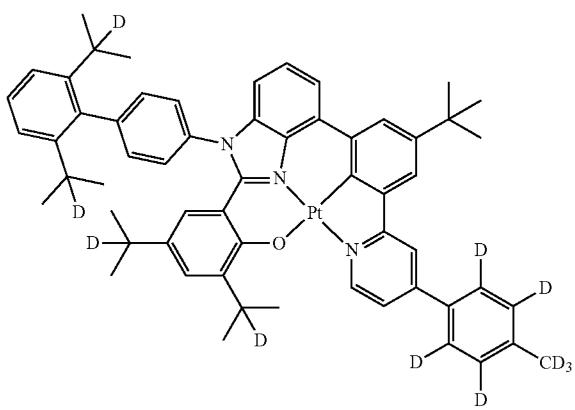
4-3140
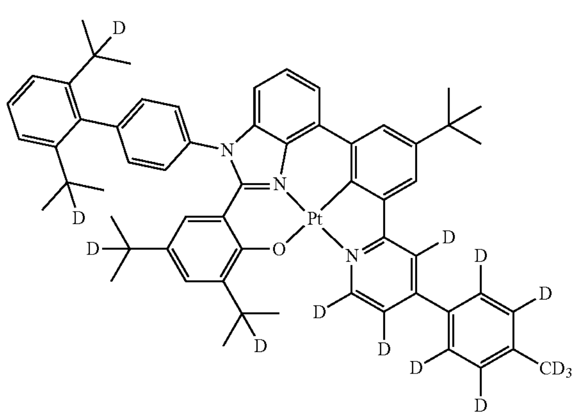
-continued
4-3141
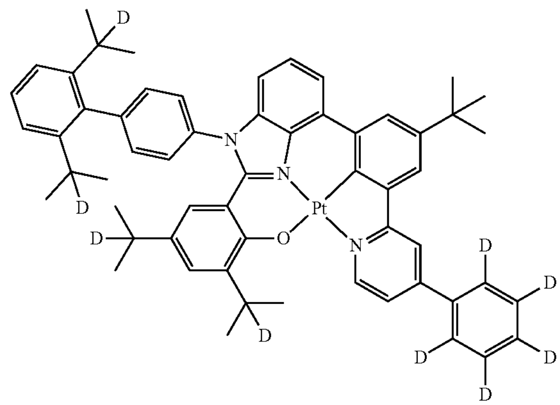
4-3142
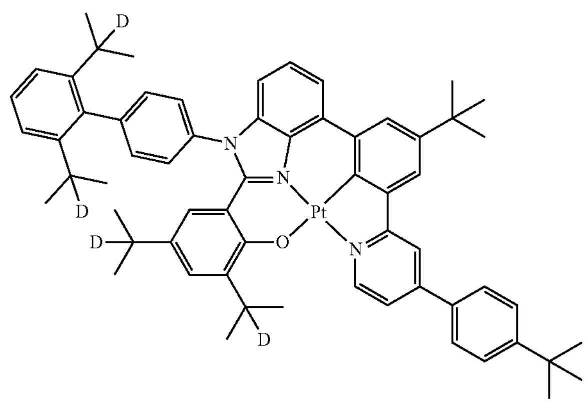
4-3143
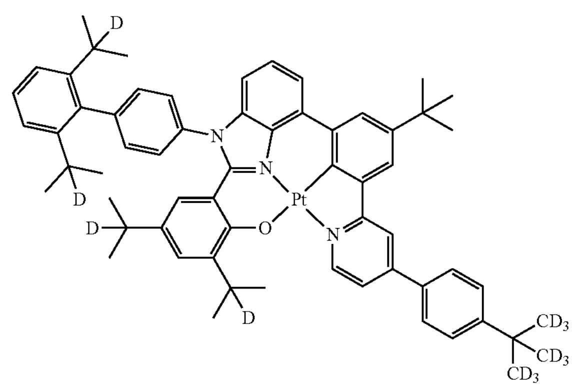
4-3144
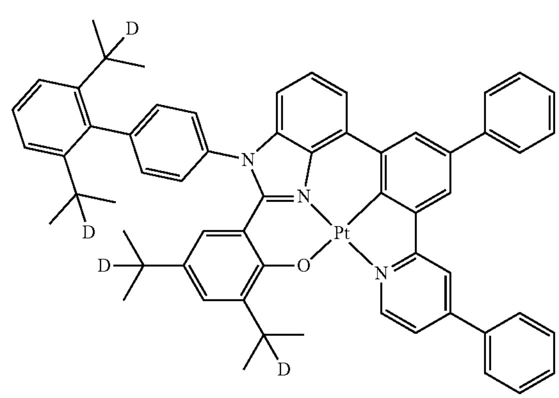

-continued
4-3145
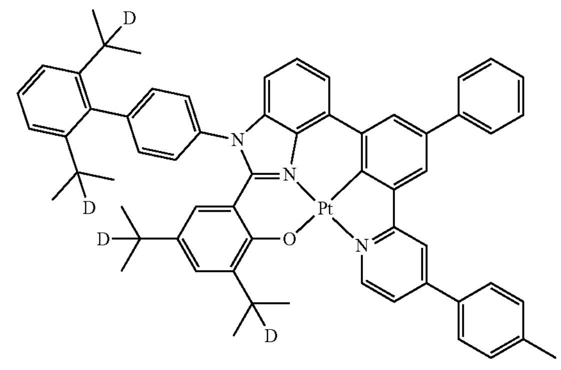
4-3146
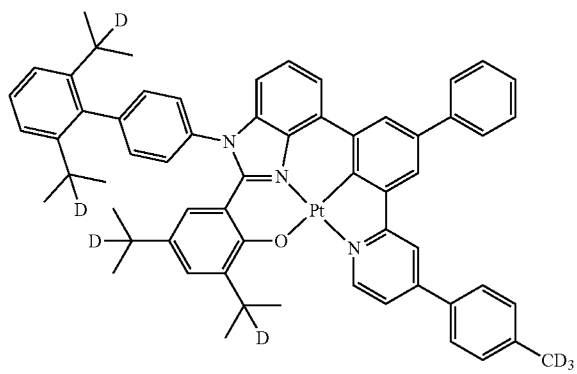
4-3147
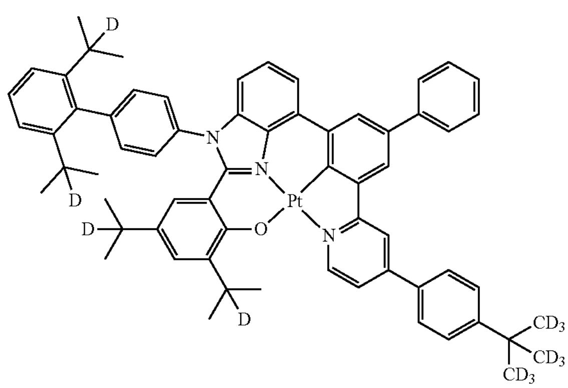
4-3148
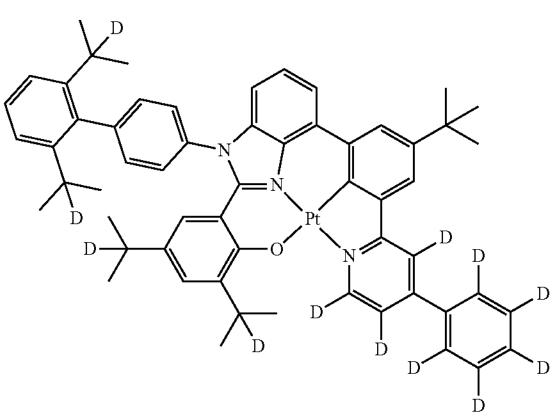
-continued
4-3149
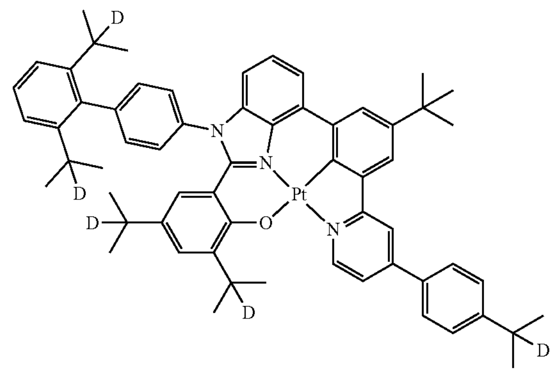
4-3150
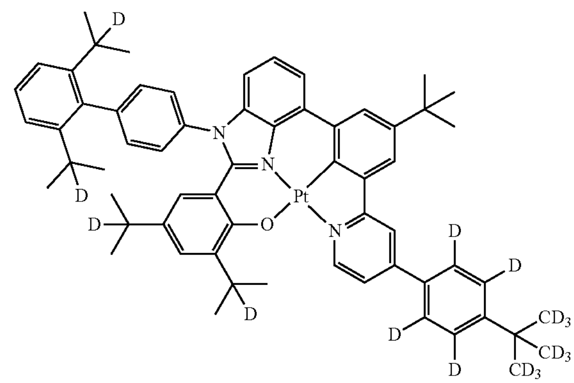
4-3151
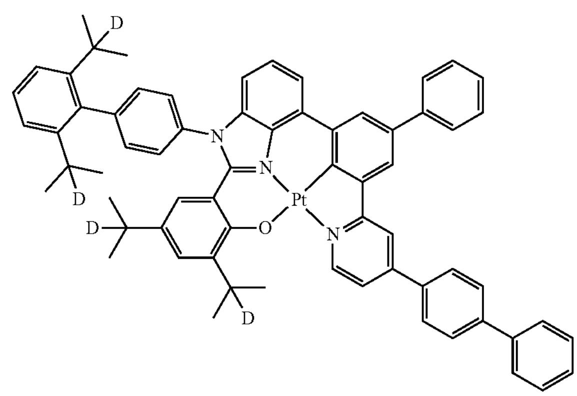
4-3152
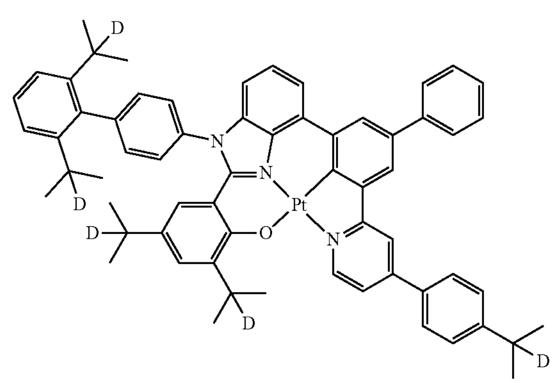

-continued
4-3153
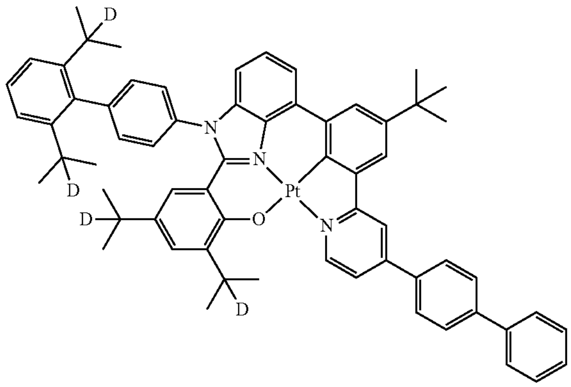
4-3154
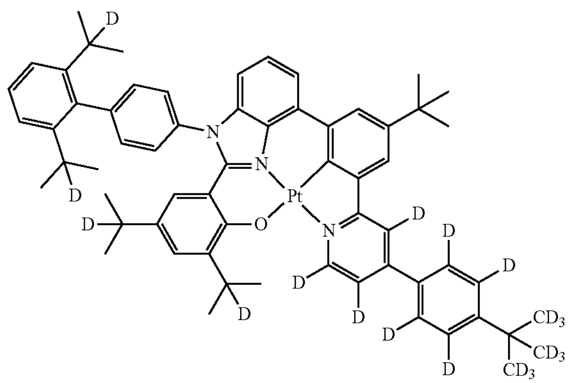
4-3155
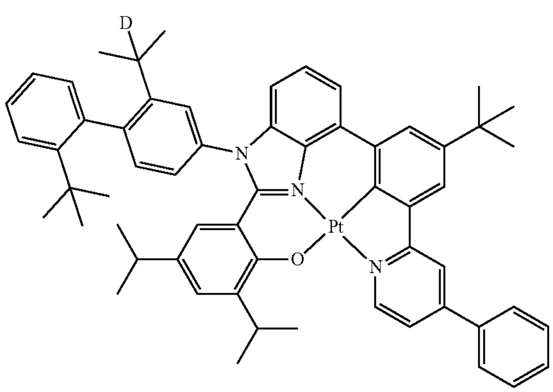
4-3156
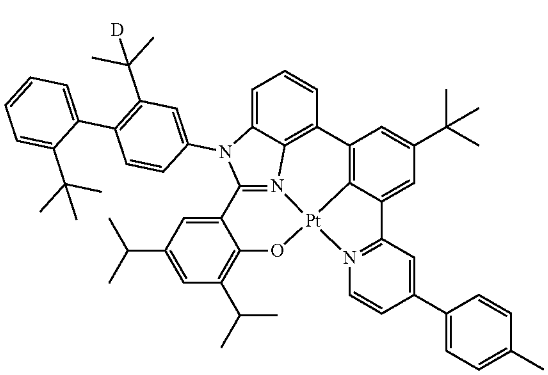
-continued
4-3157
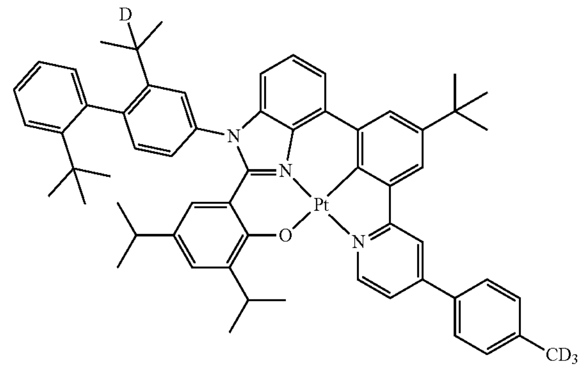
4-3158
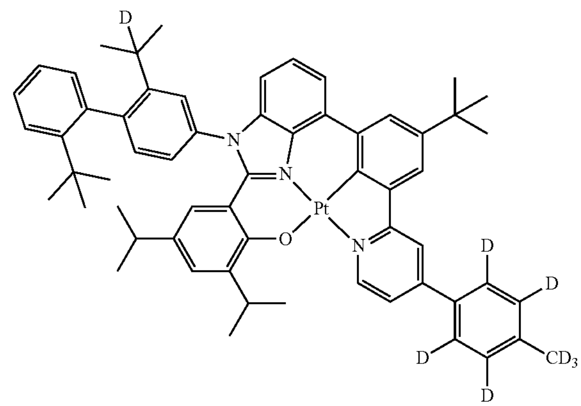
4-3159
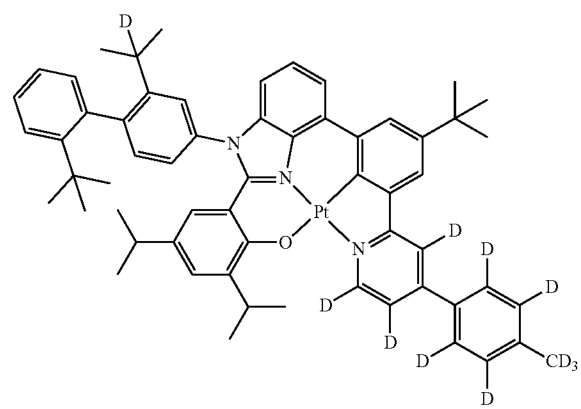
4-3160
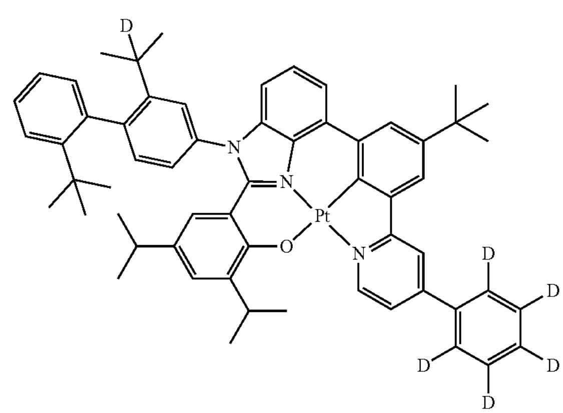

-continued
4-3161
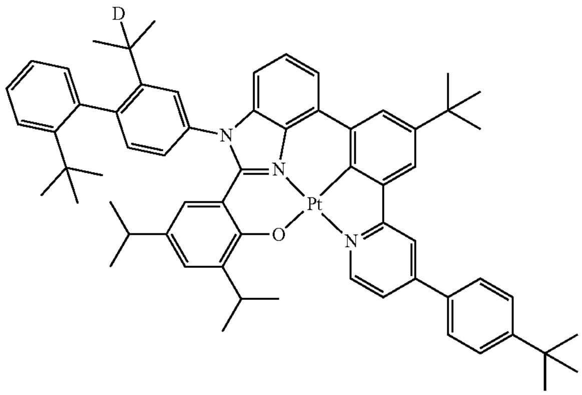
4-3162
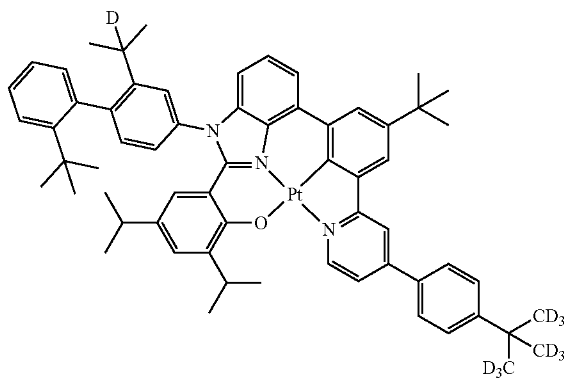
4-3163
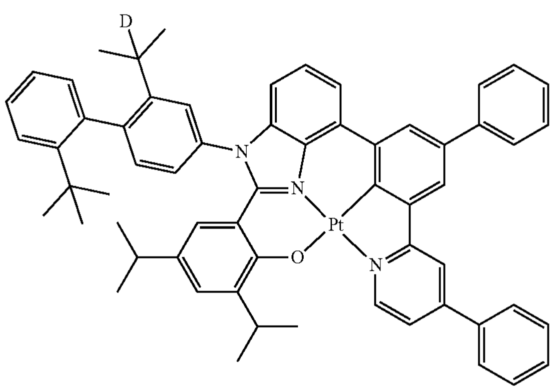
4-3164
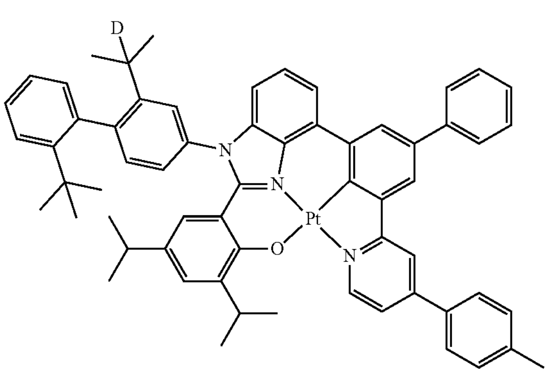
-continued
4-3165
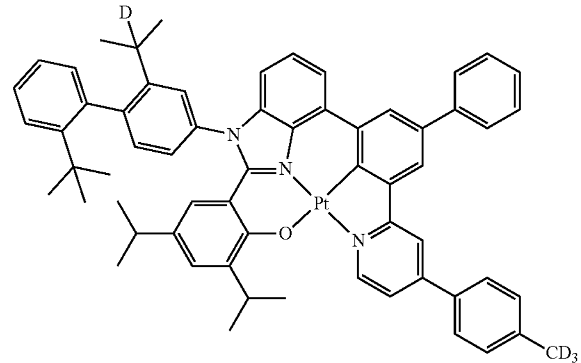
4-3166
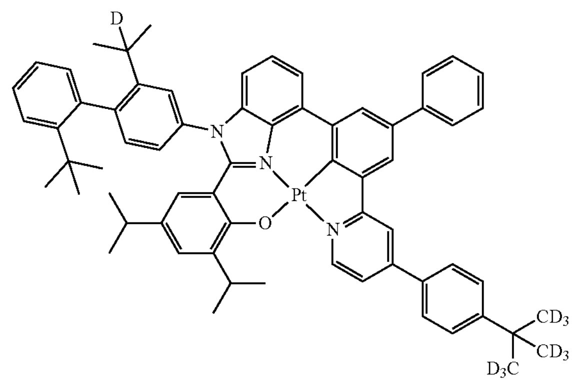
4-3167
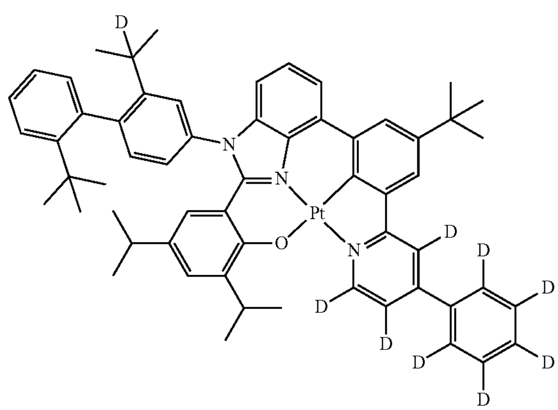
4-3168
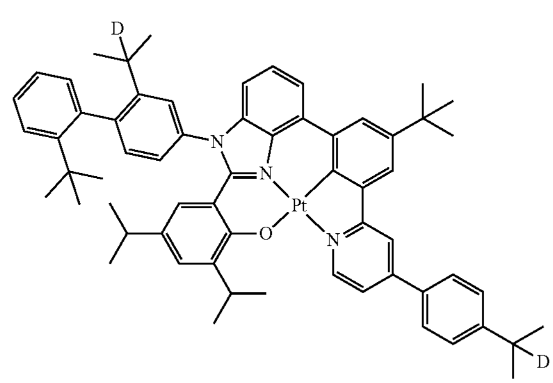

-continued
4-3169
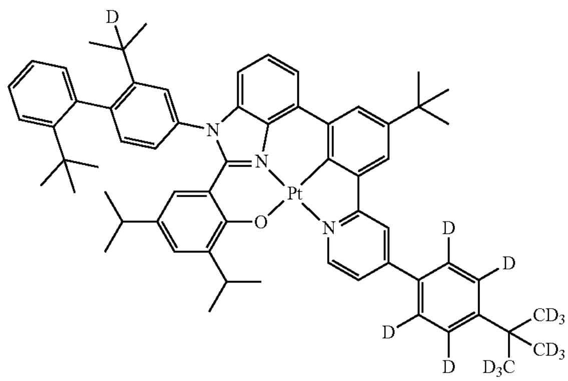
4-3170
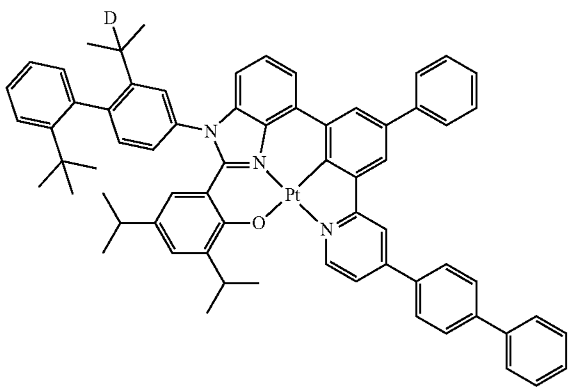
4-3171
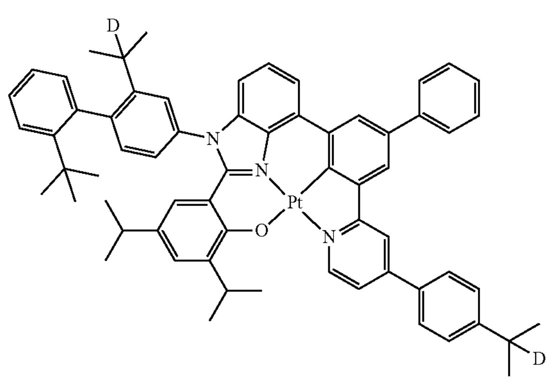
4-3172
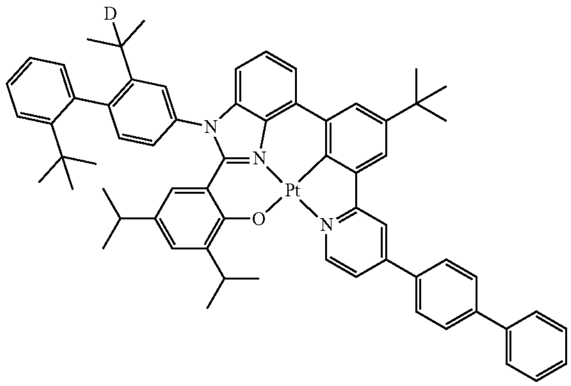
-continued
4-3173
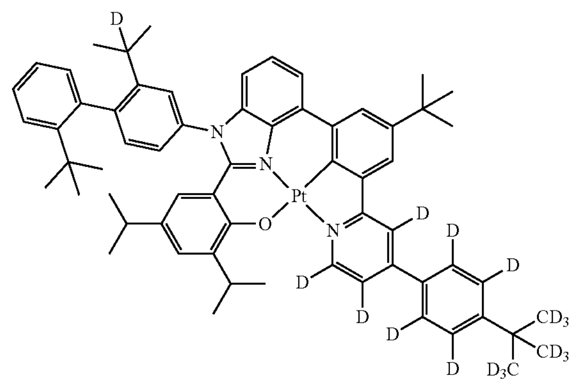
4-3174
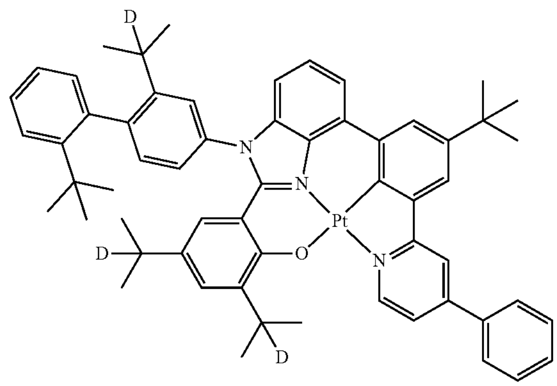
4-3175
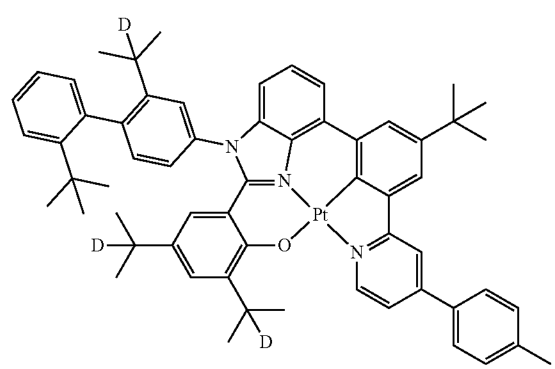
4-7136
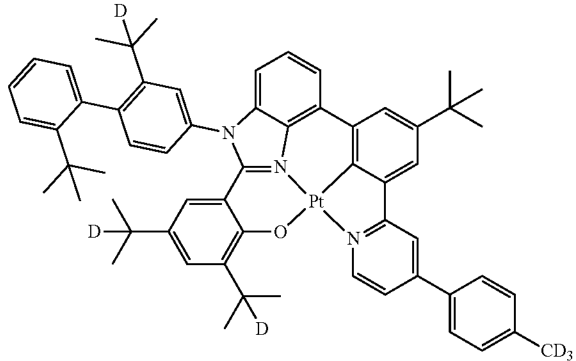

4-3177
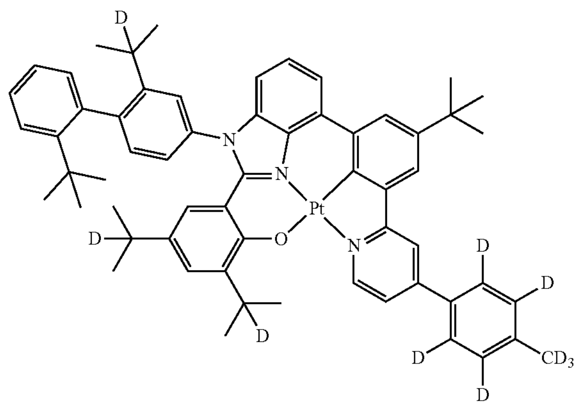
4-3178
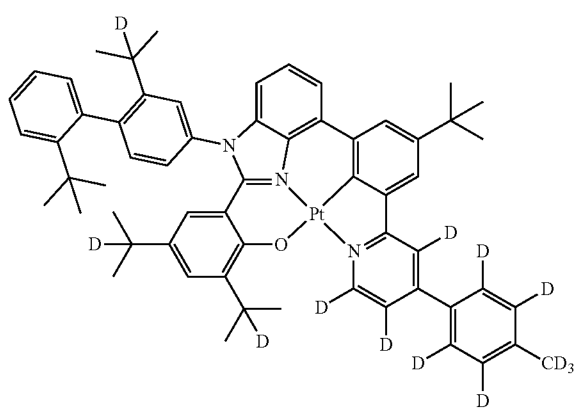
4-3179
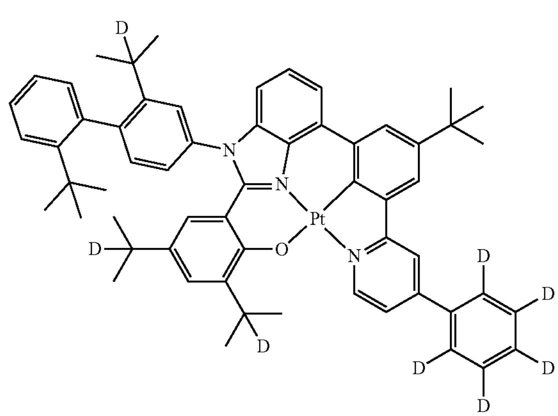
4-3180
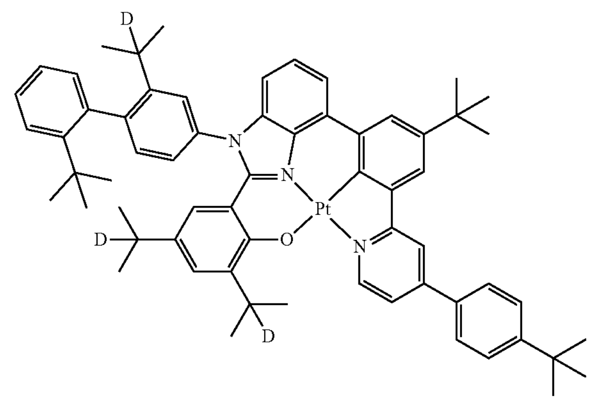
4-3181
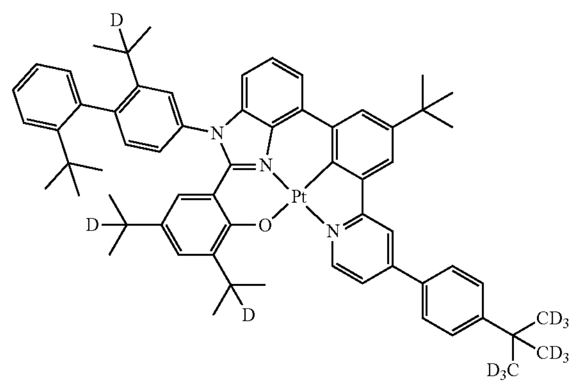
4-3182
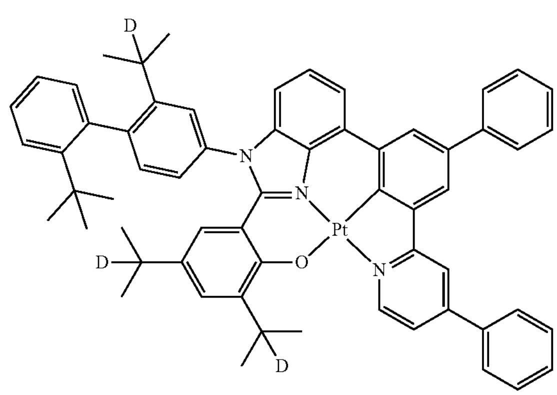
4-3183
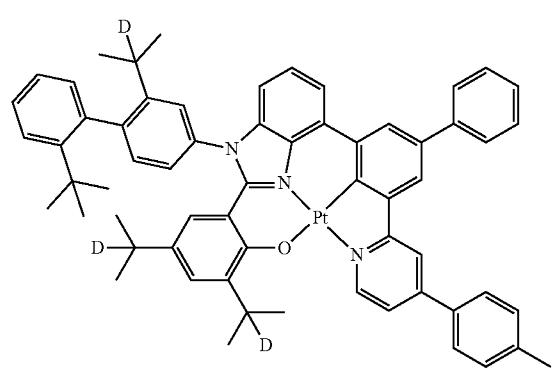

-continued
4-3184
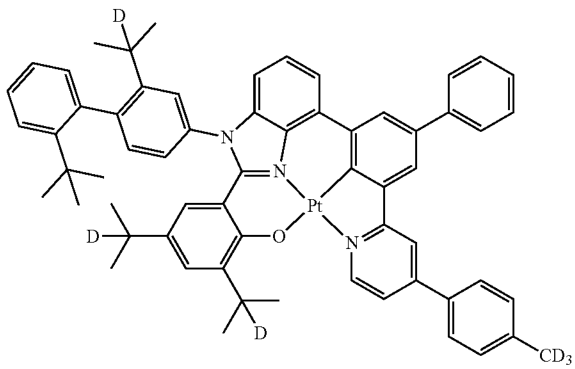
4-3185
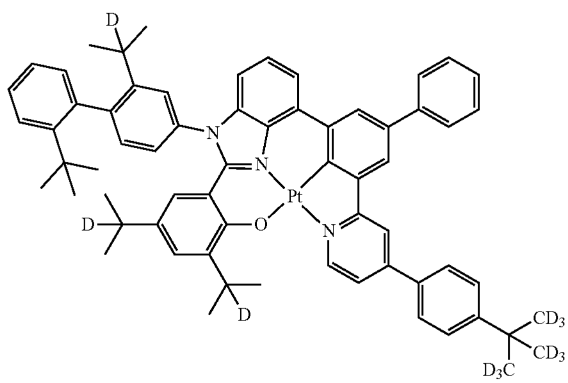
4-3186
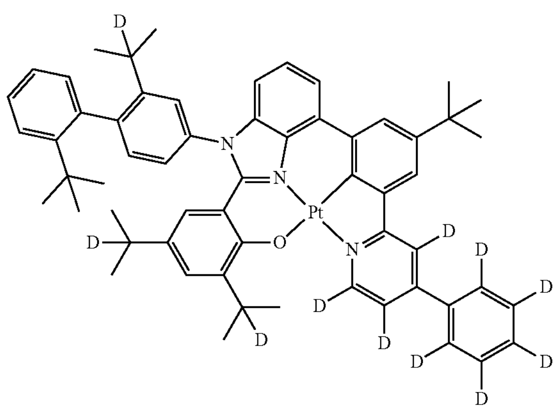
4-3187
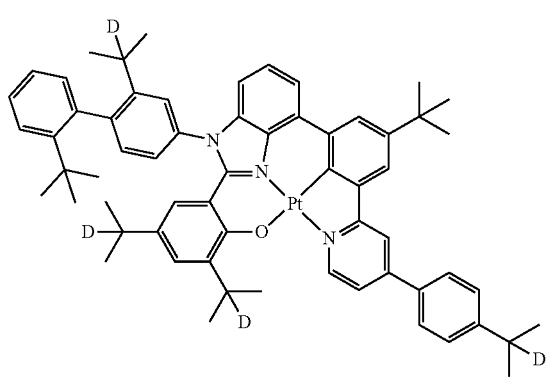
-continued
4-3188
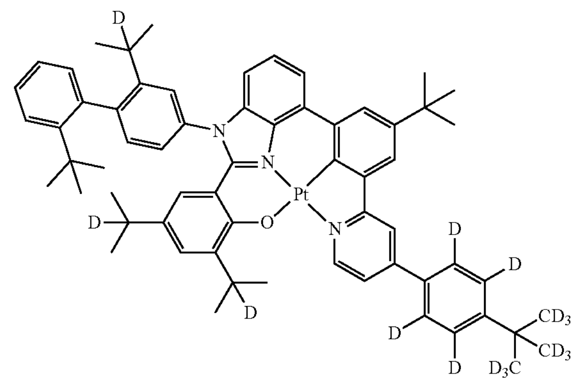
4-3189
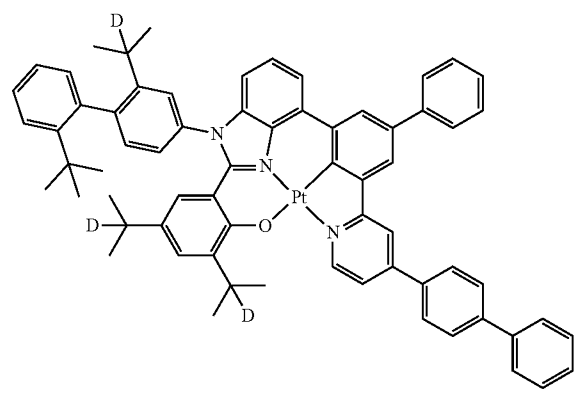
4-3190
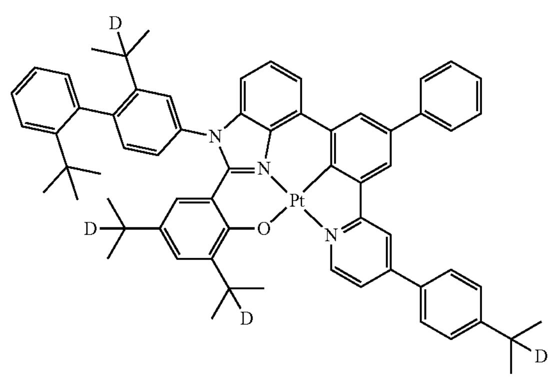
4-3191
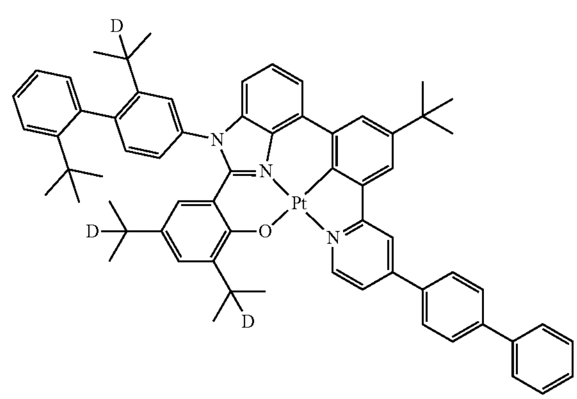

4-3192
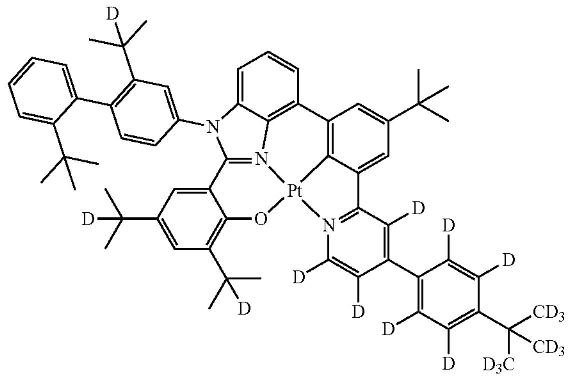
4-3193
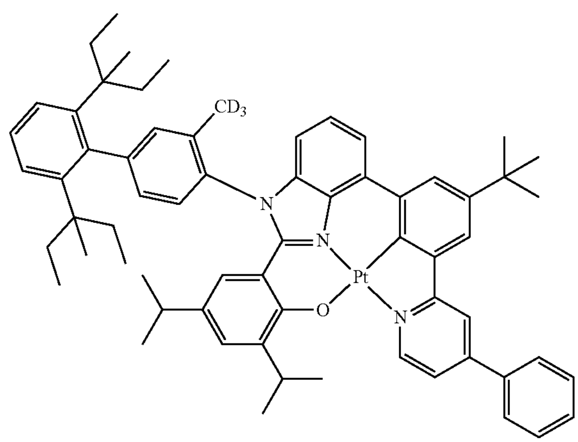
4-3194
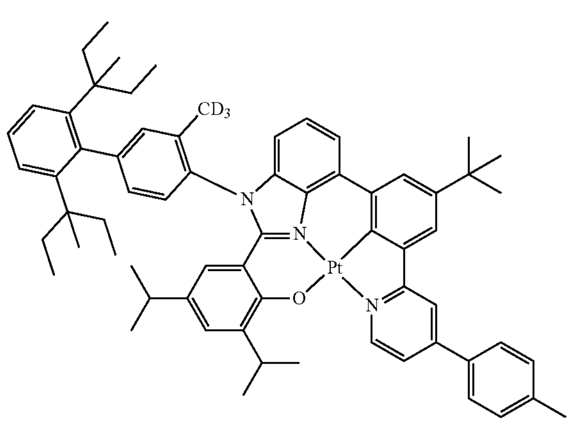
4-3195
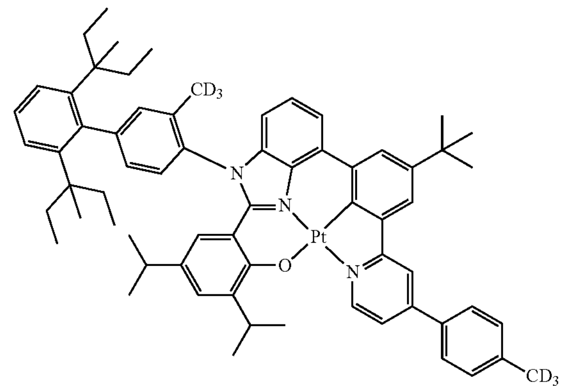
4-3196
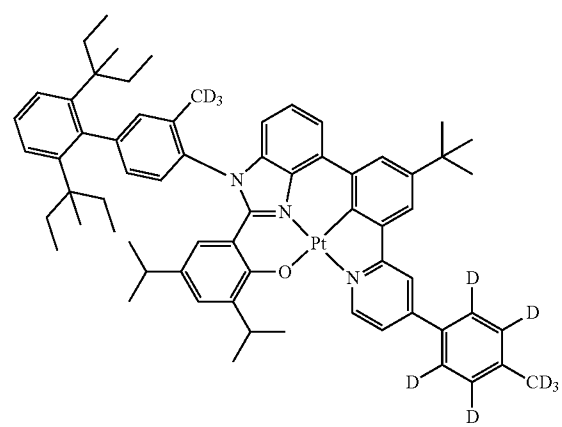
4-3197
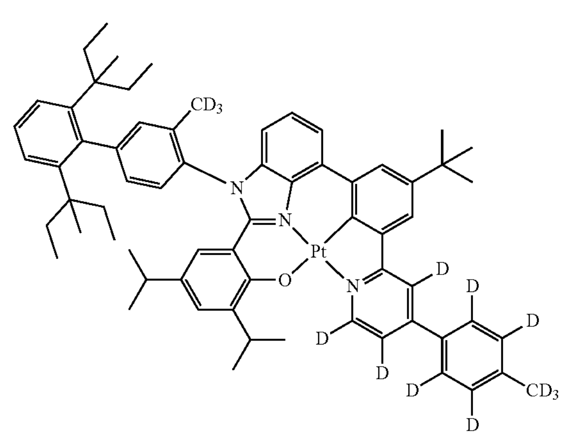

4-3198
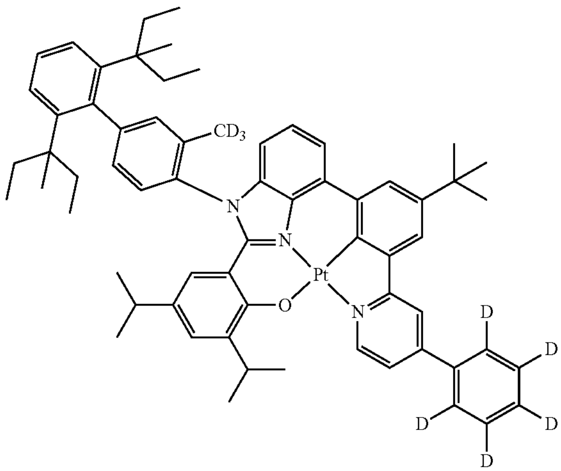
4-3199
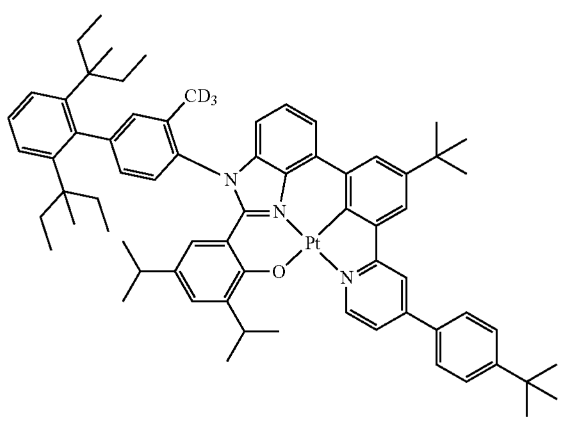
4-3200
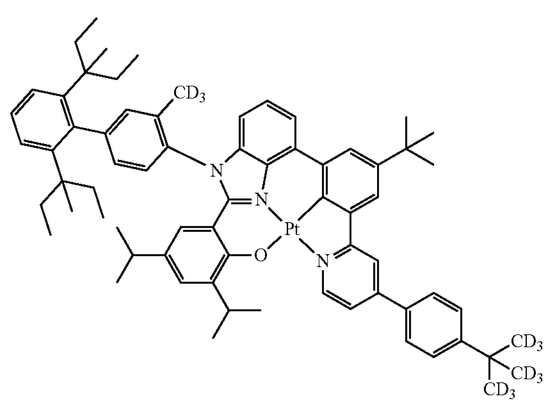
4-3201
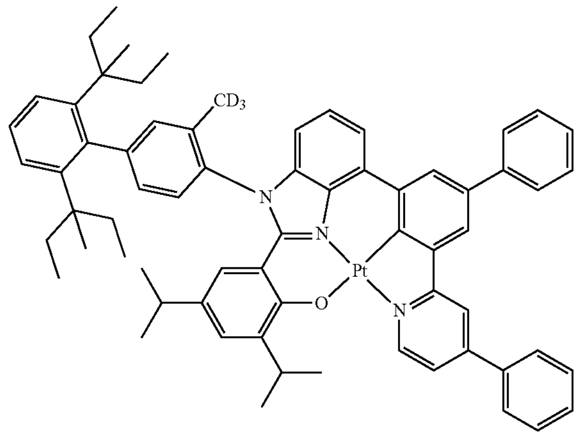
4-3202
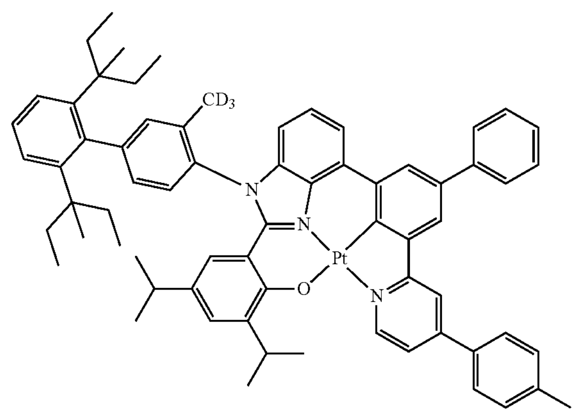
4-3203
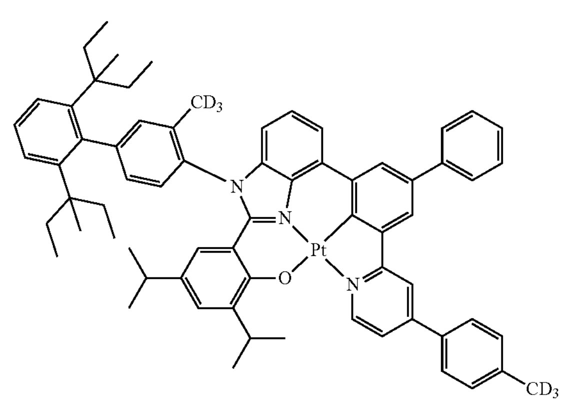

-continued
4-3204
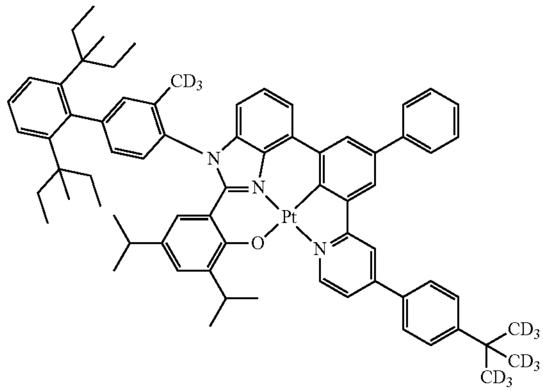
4-3205
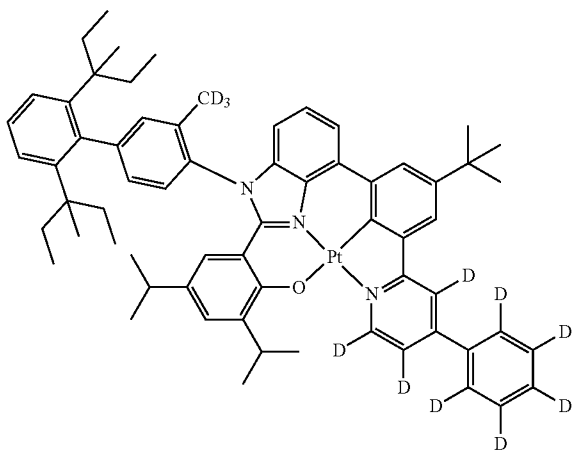
4-3206
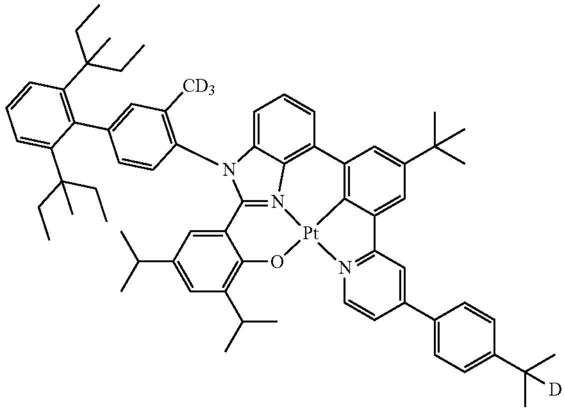
-continued
4-3207
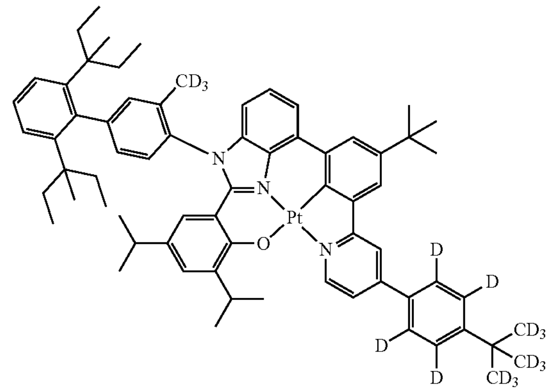
4-3208
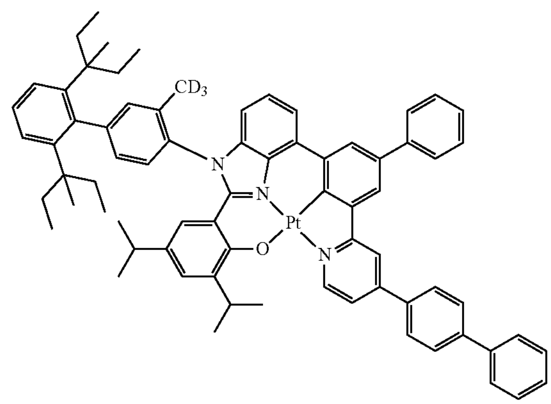
4-3209
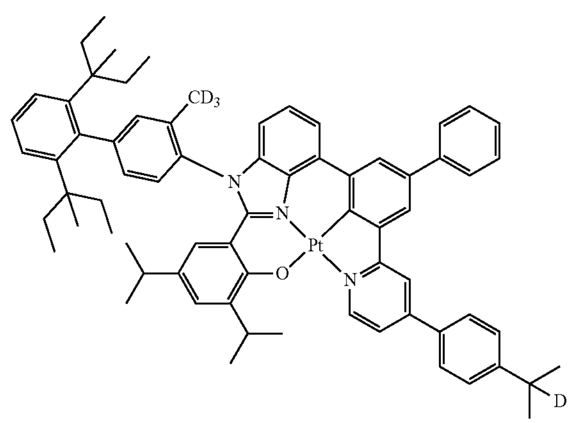

4-3210
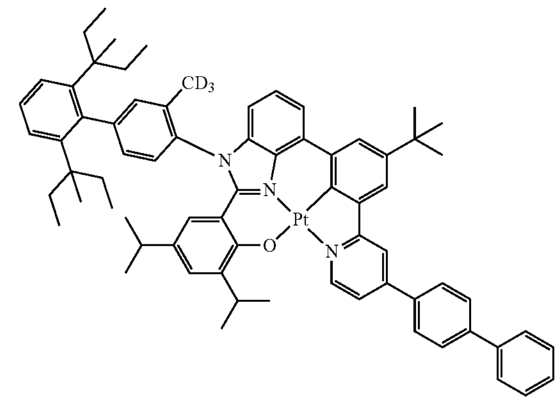
4-3211
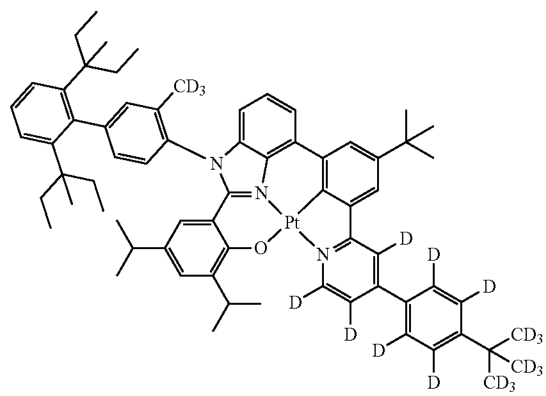
4-3212
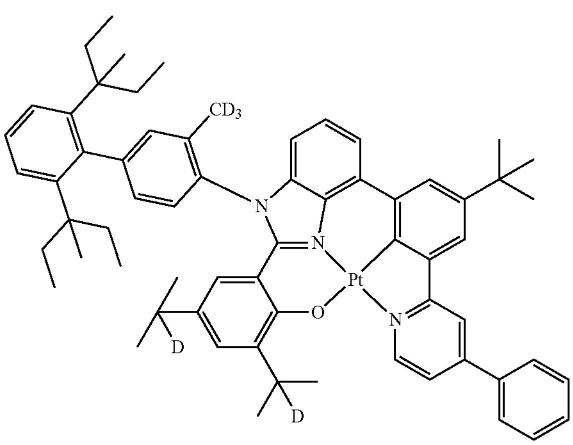
4-3213
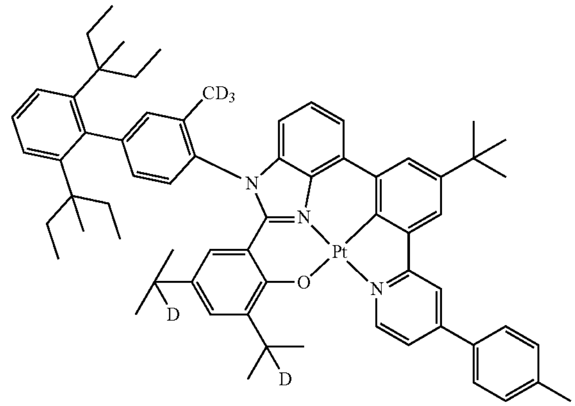
4-3214
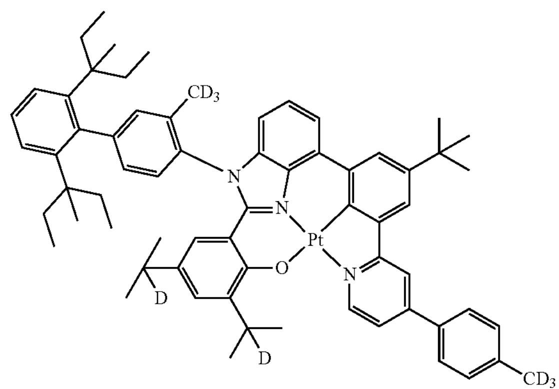
4-3215
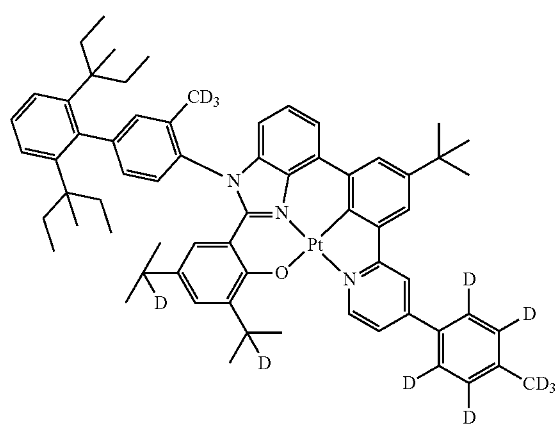

-continued
4-3216
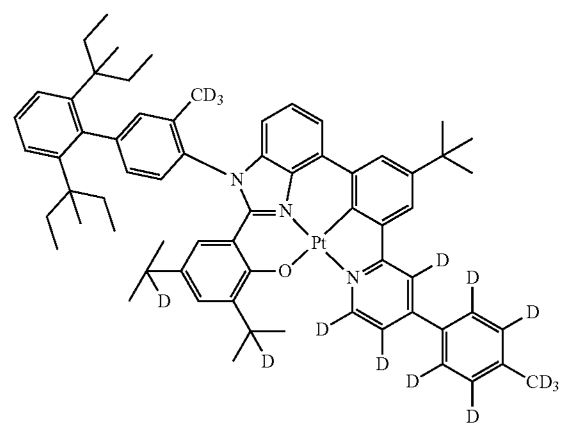
4-3217
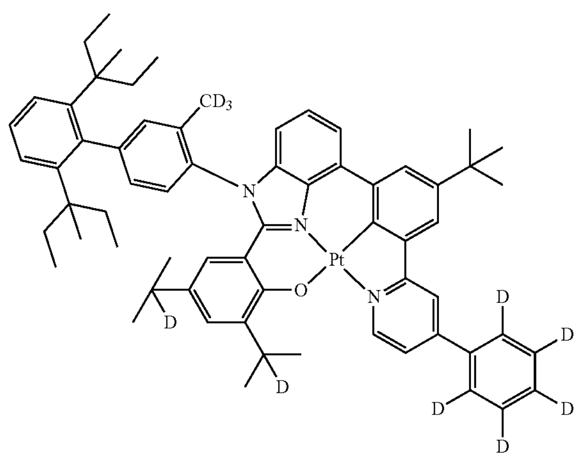
4-3218
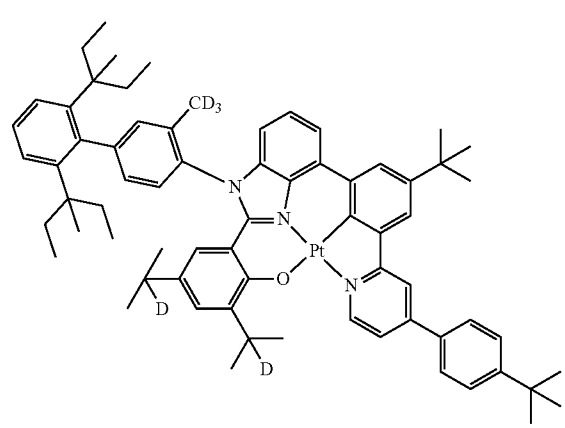
-continued
4-3219
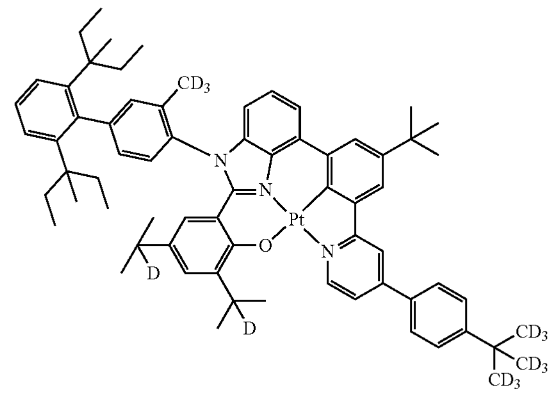
4-3220
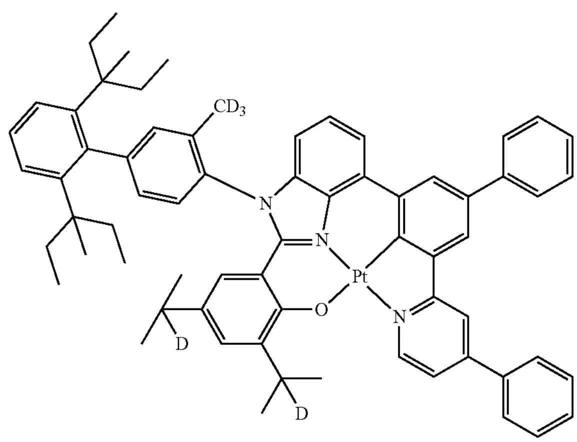
4-3221
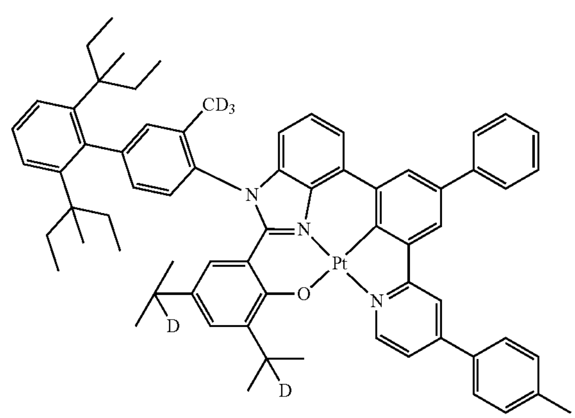

4-3222
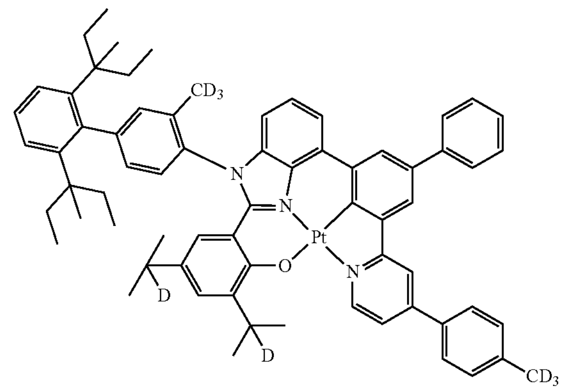
4-3223
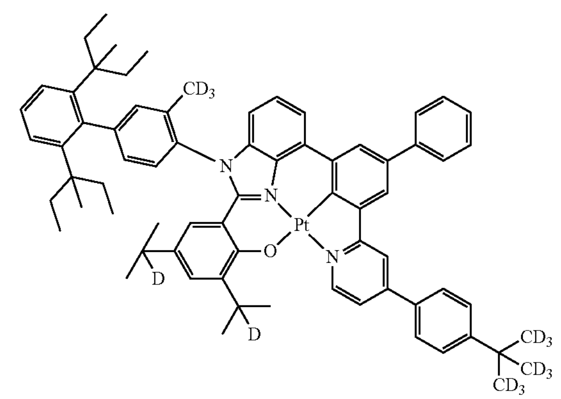
4-3224
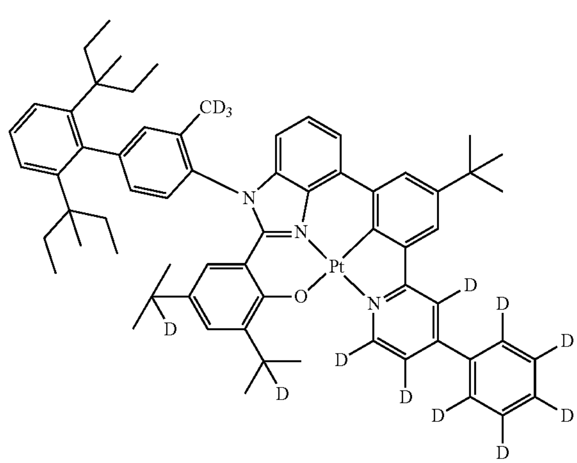
4-3225
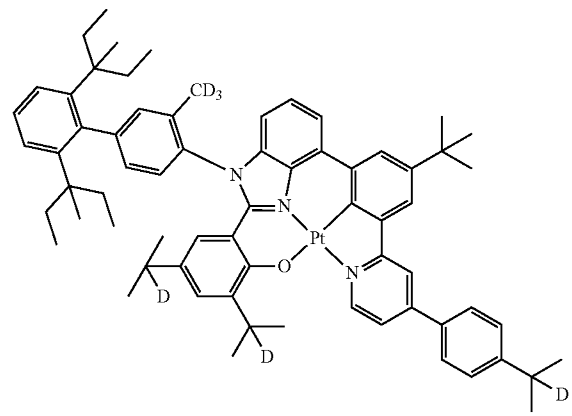
4-3226
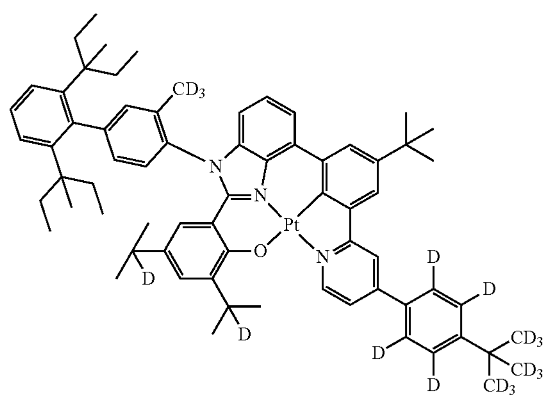
4-3227
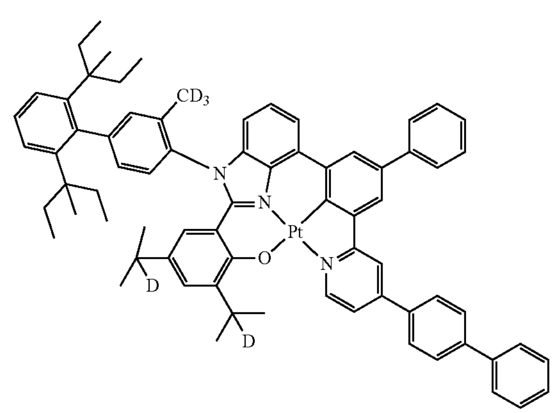

-continued
4-3228
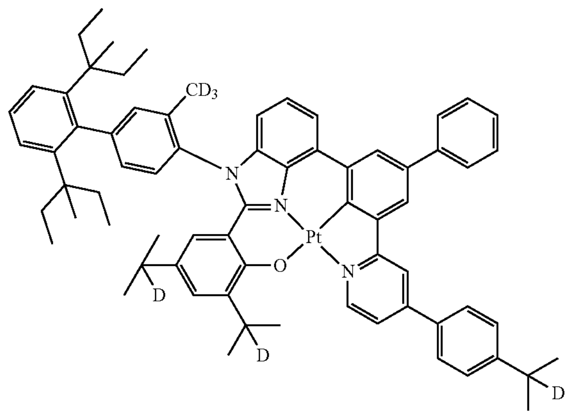
4-3229
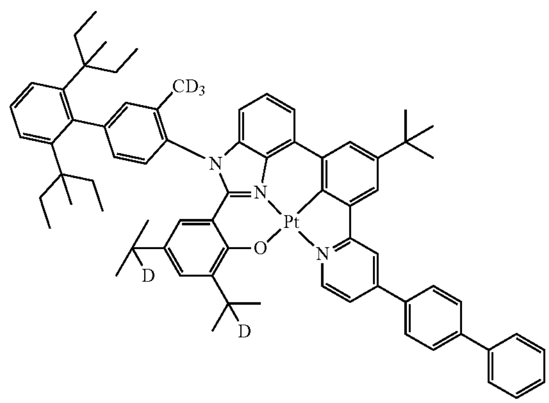
4-3230
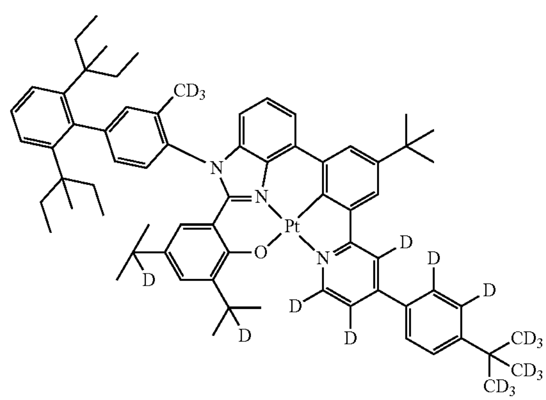
4-3231
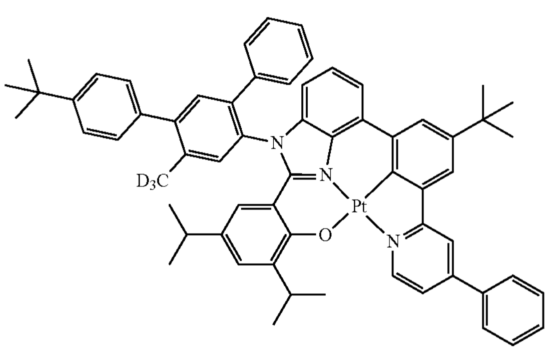
-continued
4-3232
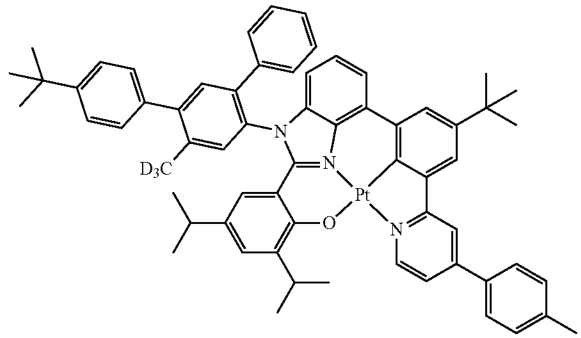
4-3233
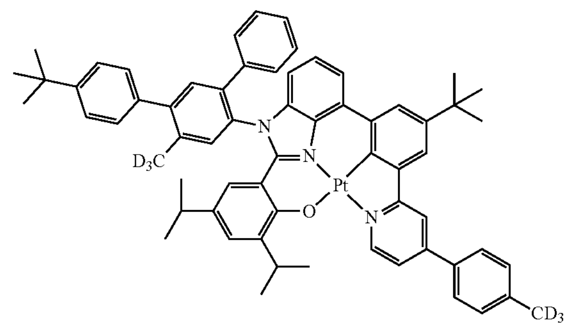
4-3234
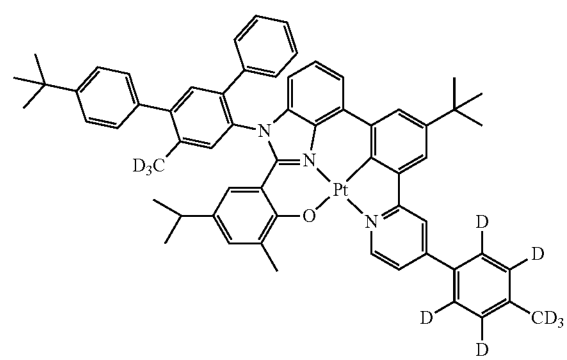
4-3235
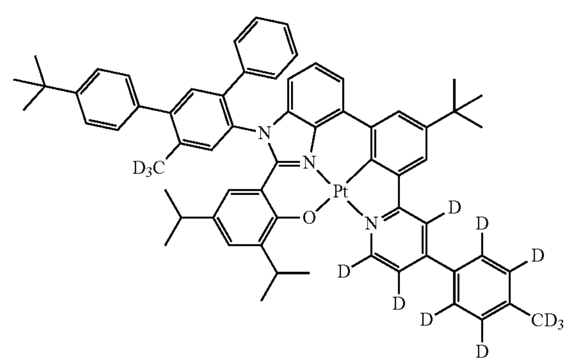

-continued
4-3236
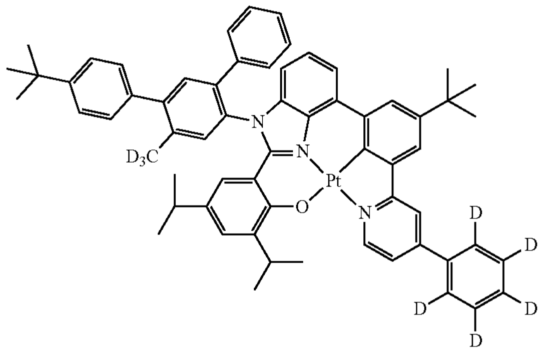
4-3237
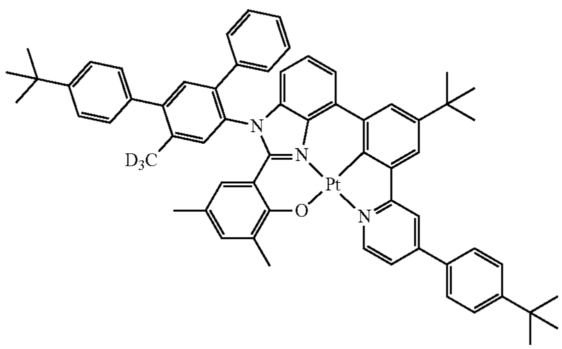
4-3238
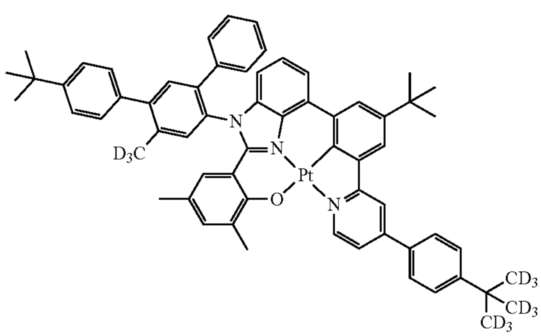
4-3239
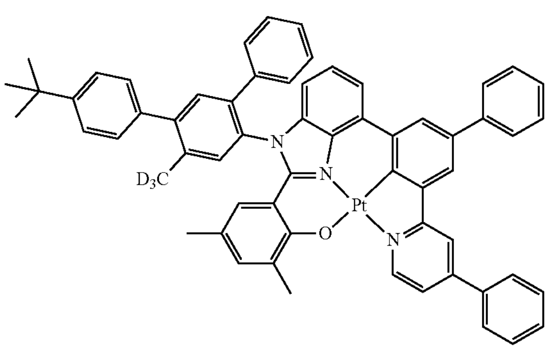
-continued
4-3240
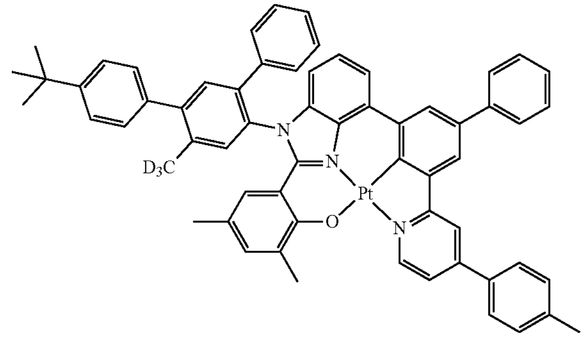
4-3241
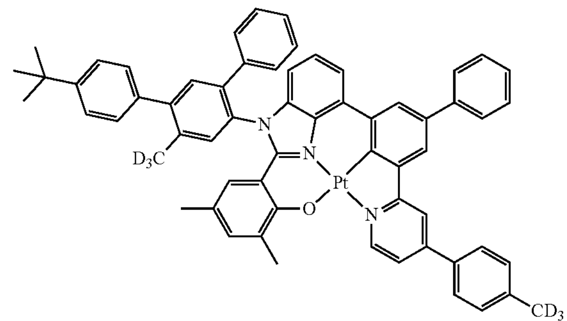
4-3242
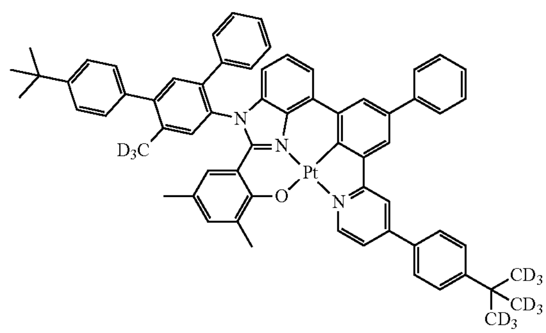
4-3243
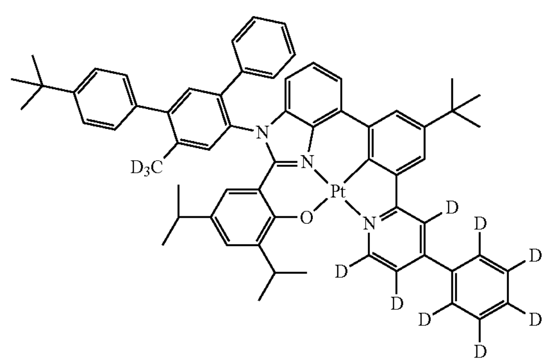

4-3244
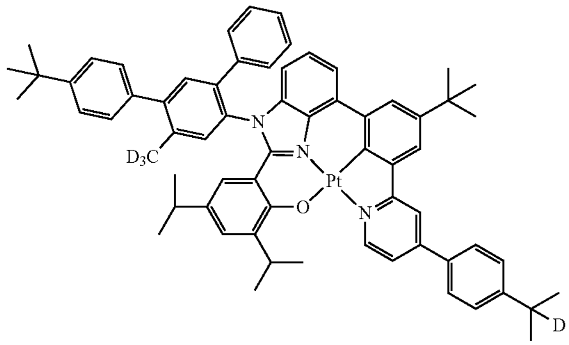
4-3245
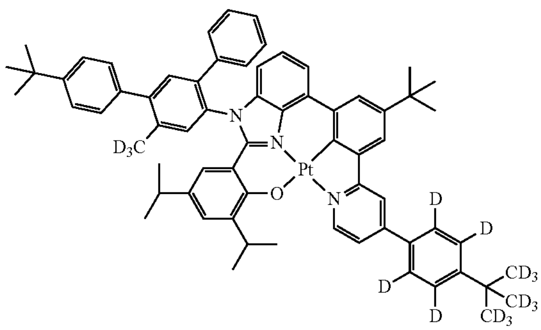
4-3246
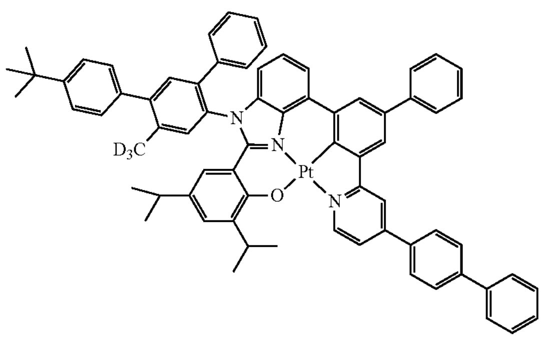
4-3247
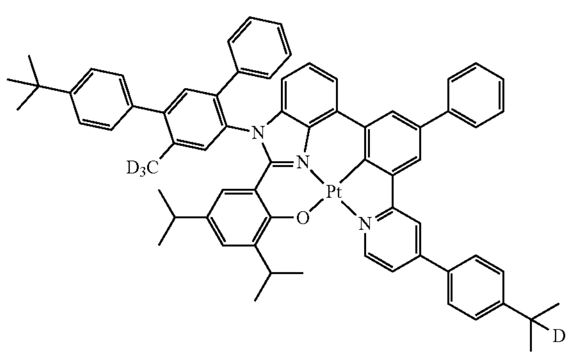
4-3248
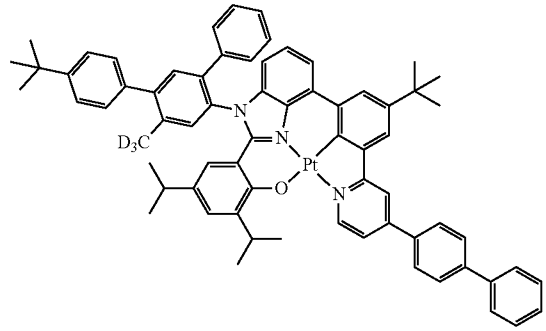
4-3249
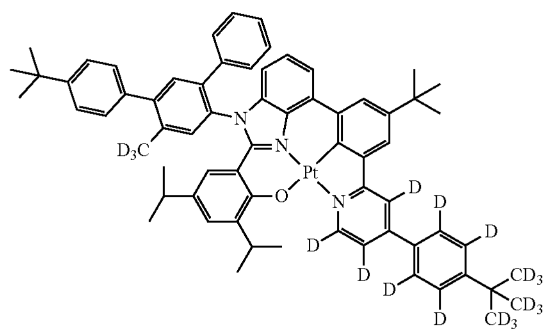
4-3250
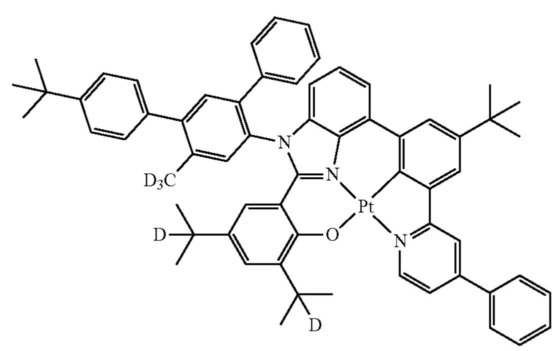
4-3251
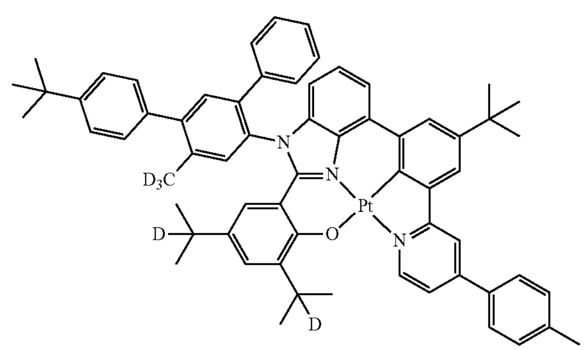

4-3252
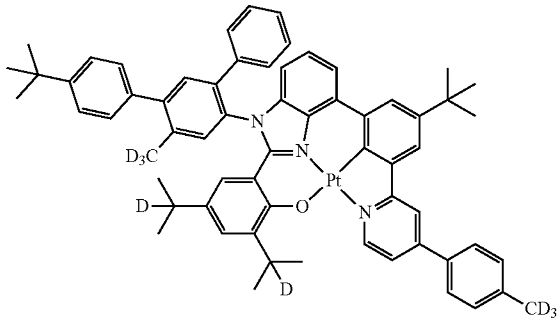
4-3253
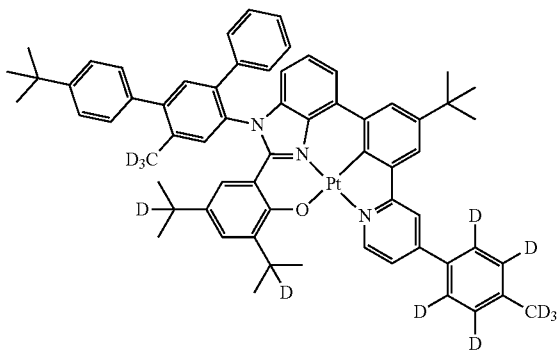
4-3254
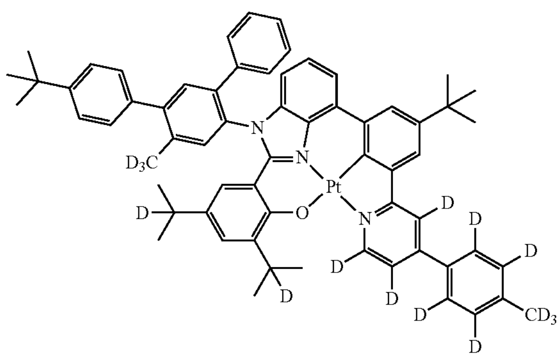
4-3255
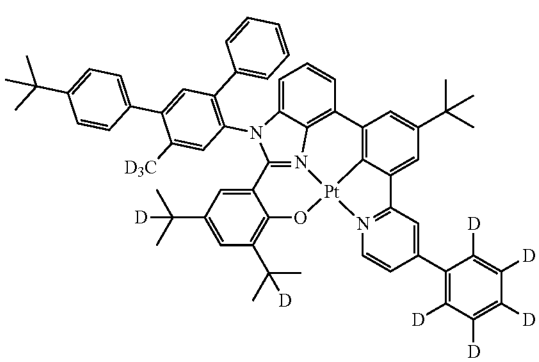
4-3256
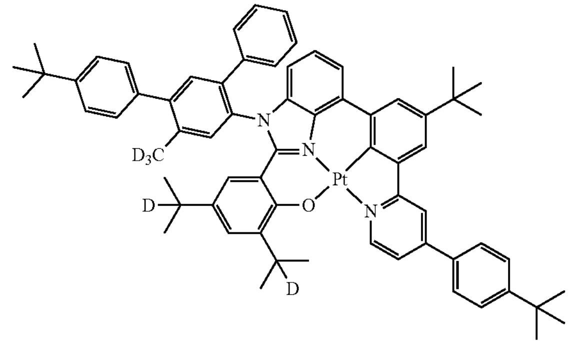
4-3257
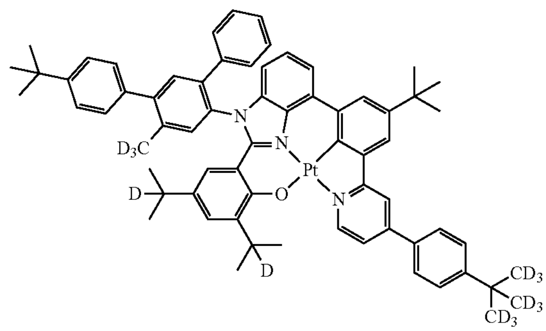
4-3258
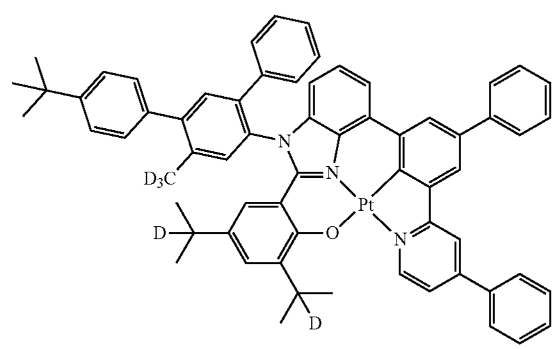
4-3259
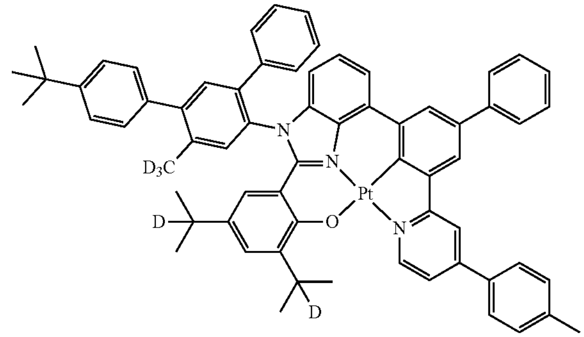

4-3260
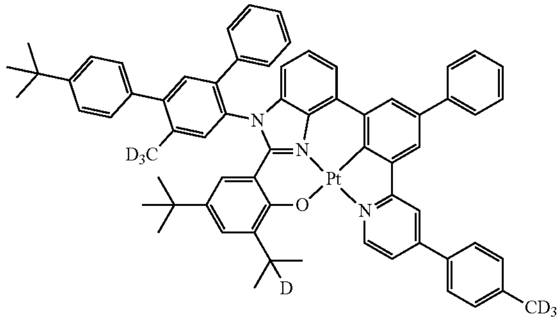
4-3261
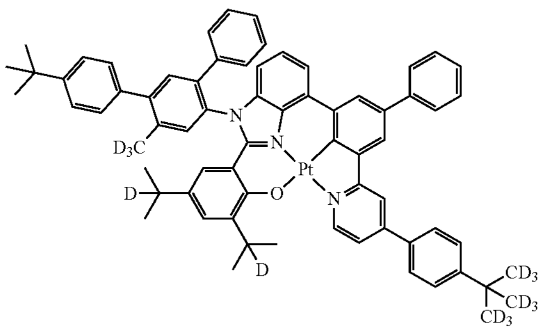
4-3262
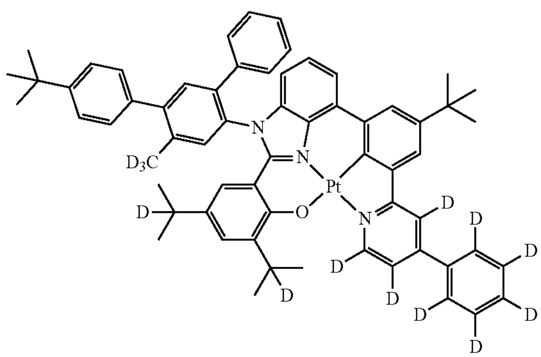
4-3263
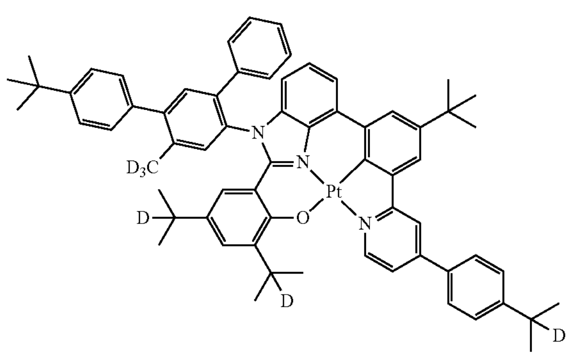
4-3264
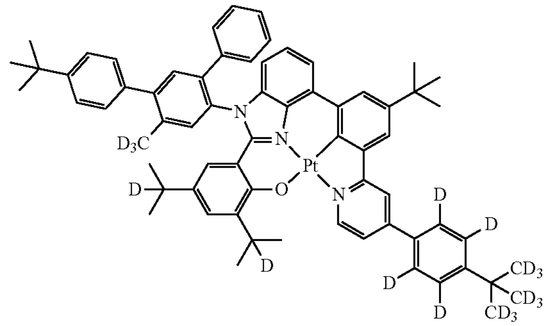
4-3265
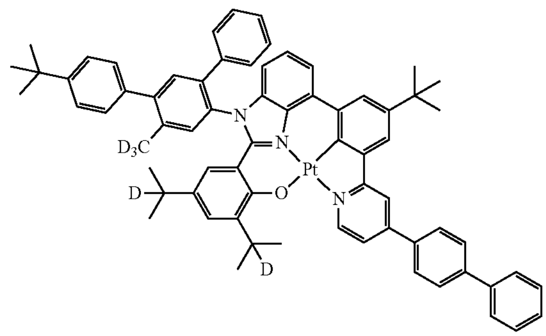
4-3266
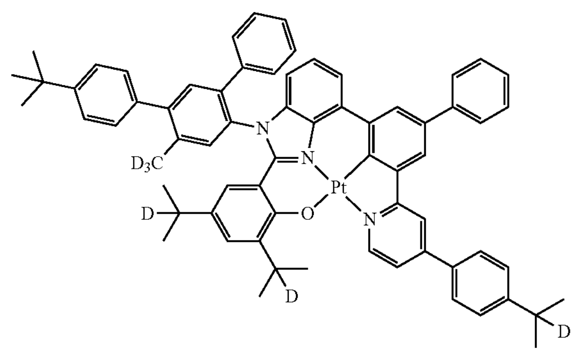
4-3267
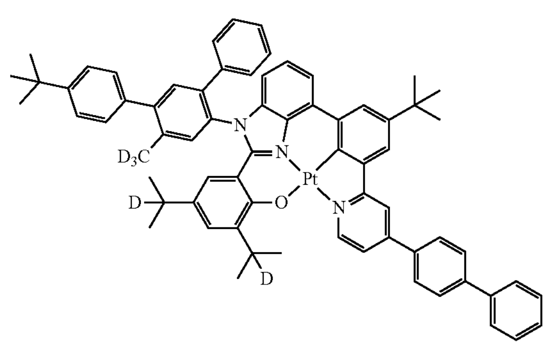

-continued
4-3268
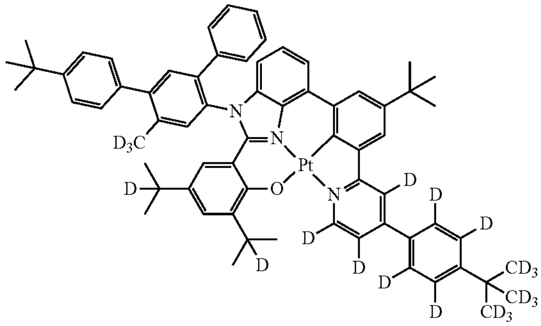
4-3269
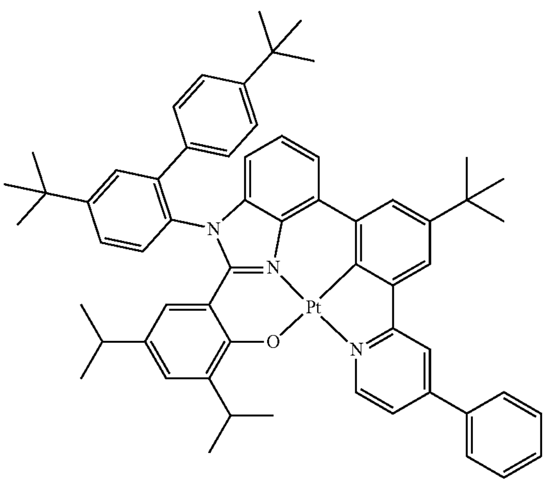
4-3270
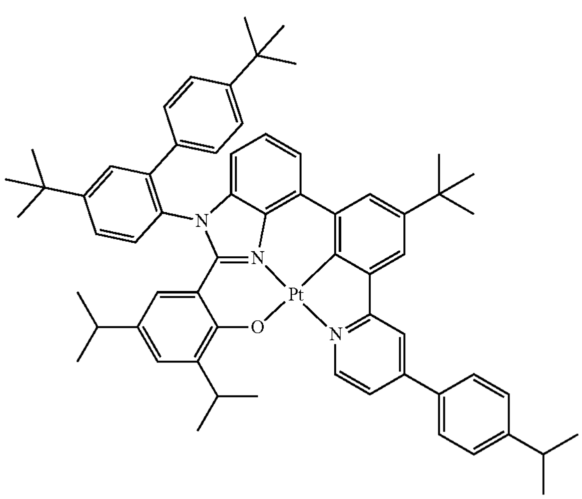
-continued
4-3271
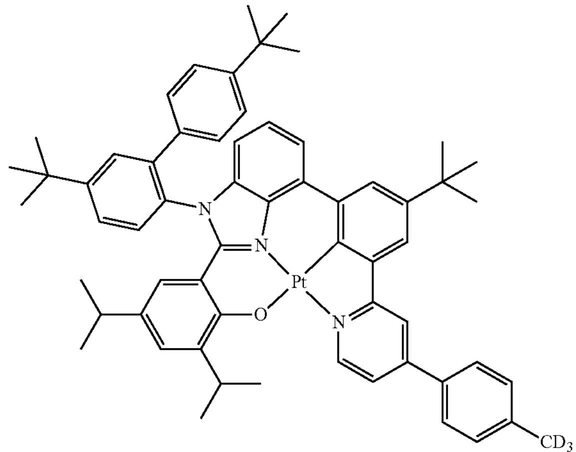
4-3272
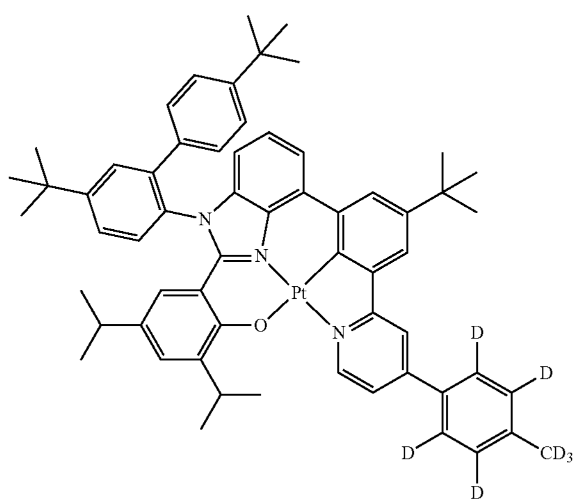
4-3273
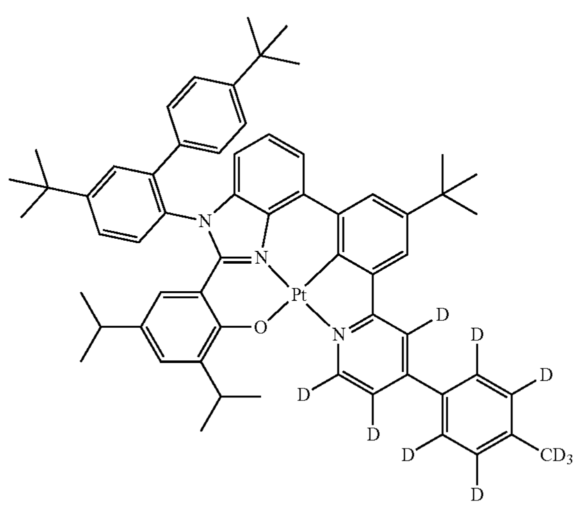

-continued
4-3274
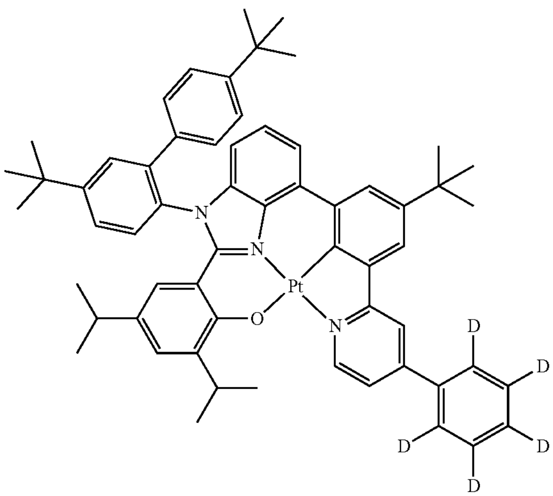
4-3275
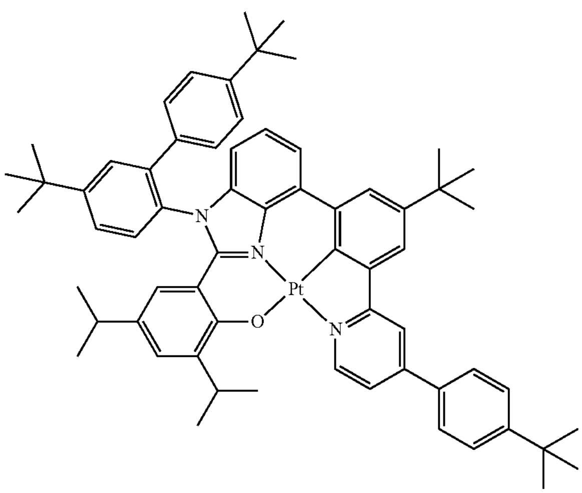
4-3276
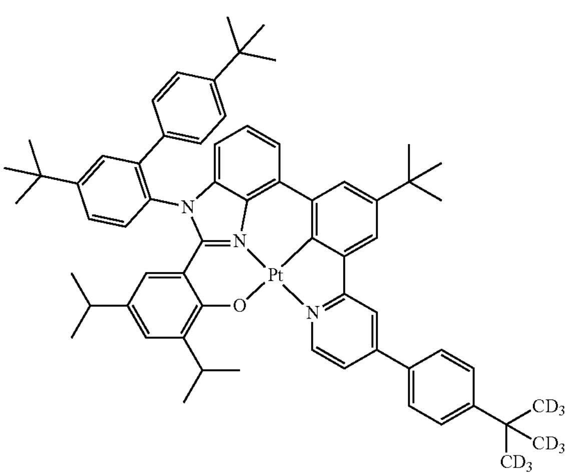
-continued
4-3277
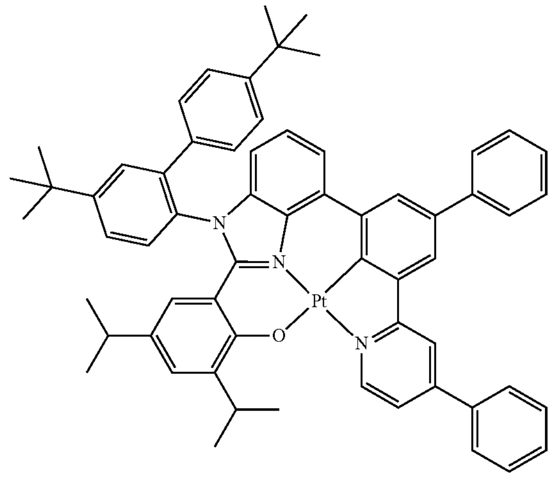
4-3278
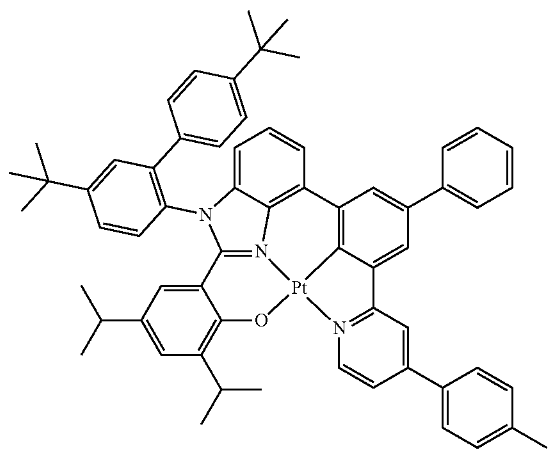
4-3279
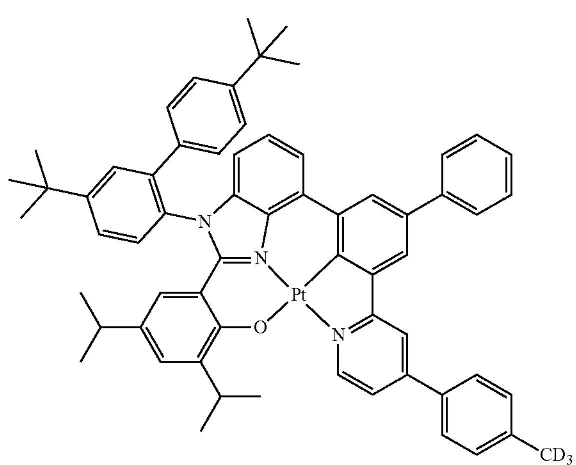

-continued
4-3280
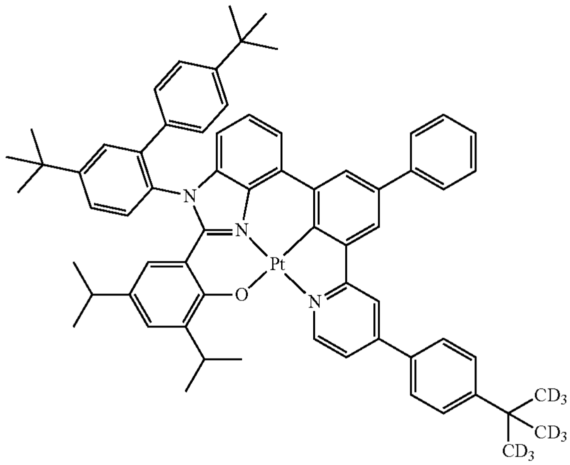
4-3281
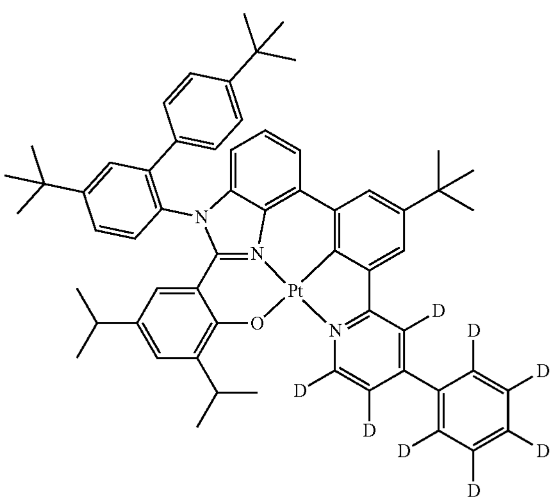
4-3282
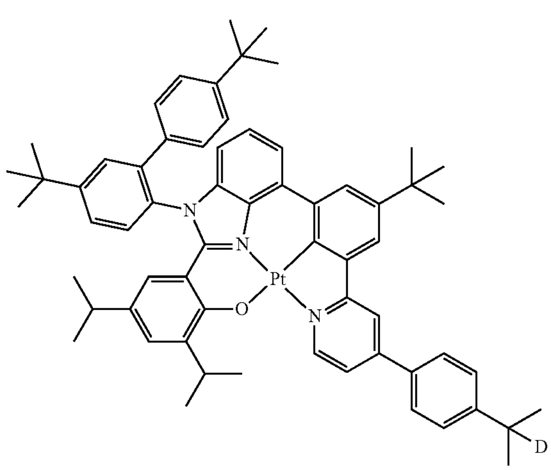
-continued
4-3283
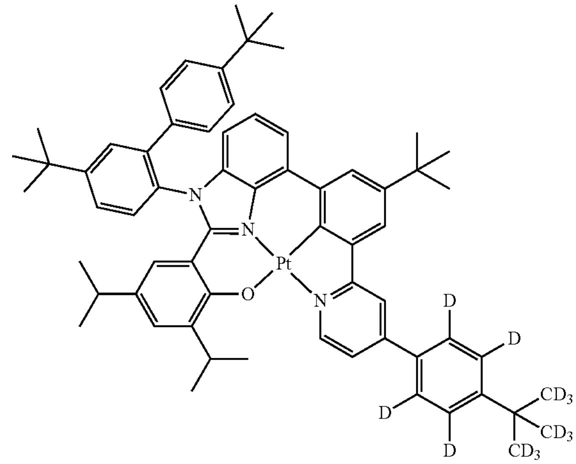
4-3284
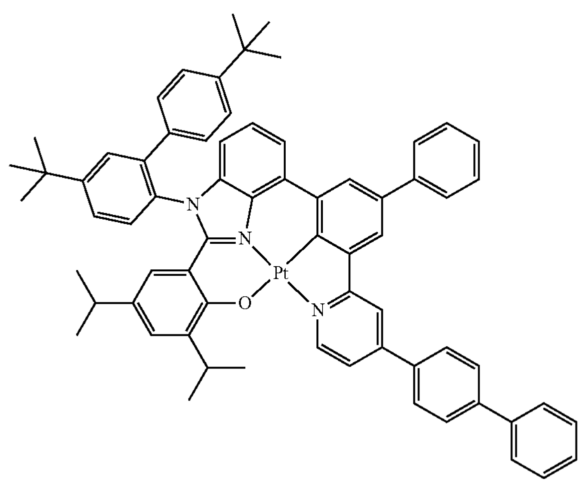
4-3285
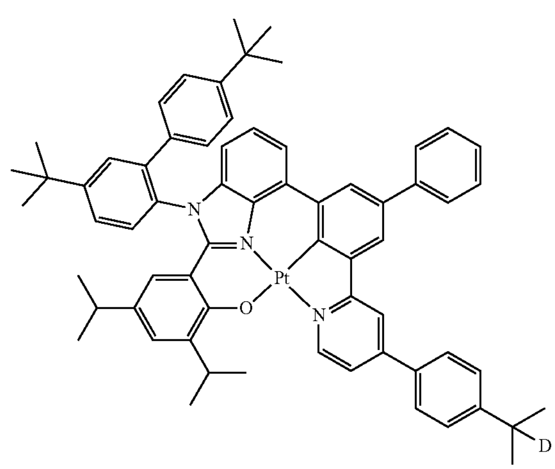

4-3286
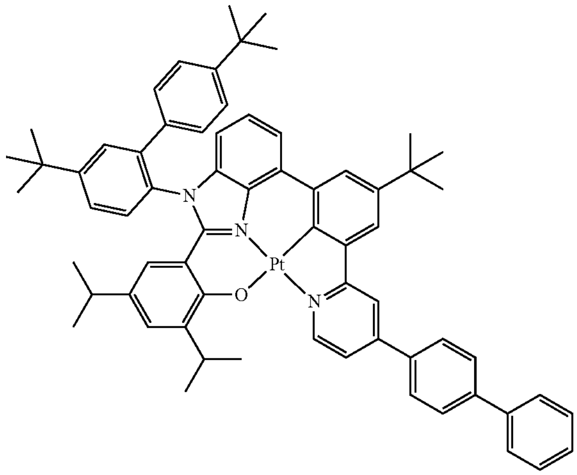
4-3287
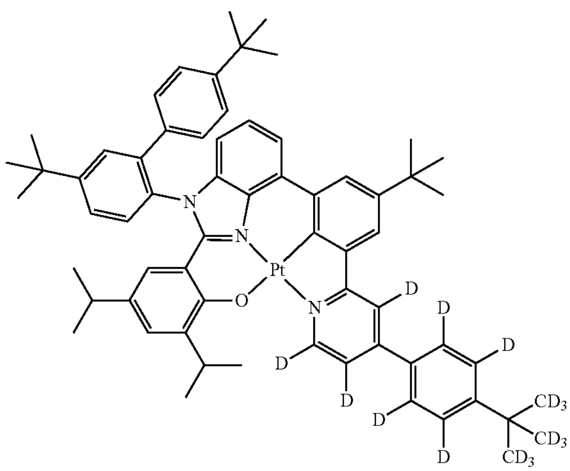
4-3288
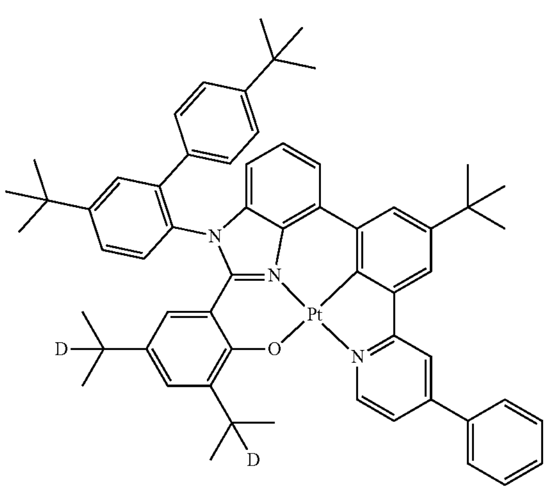
4-3289
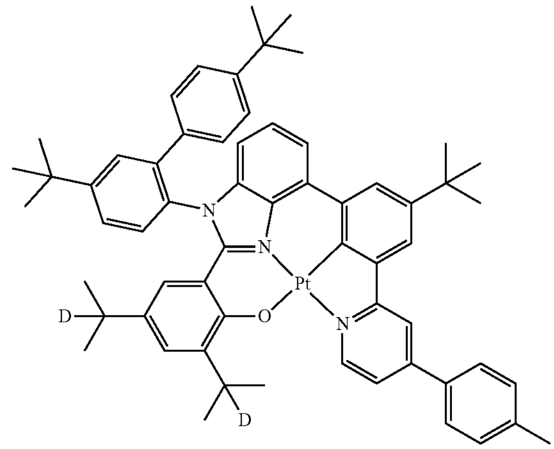
4-3290
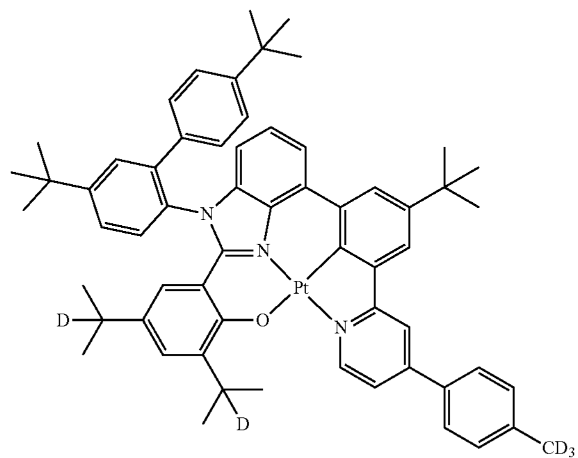
4-3291
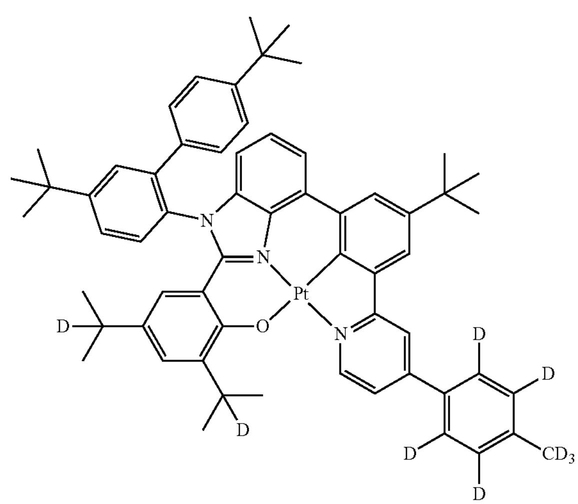

-continued
4-3292
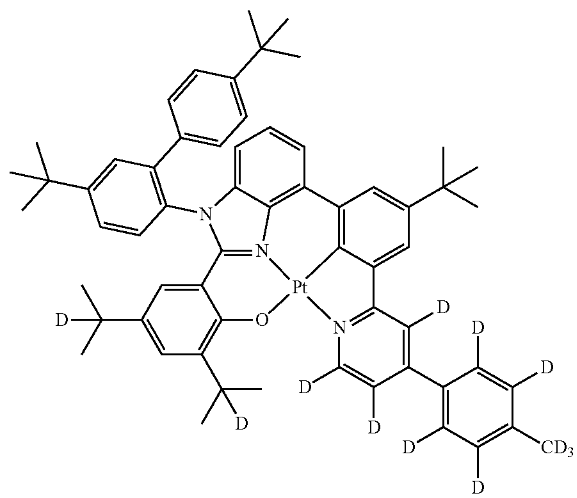
4-3293
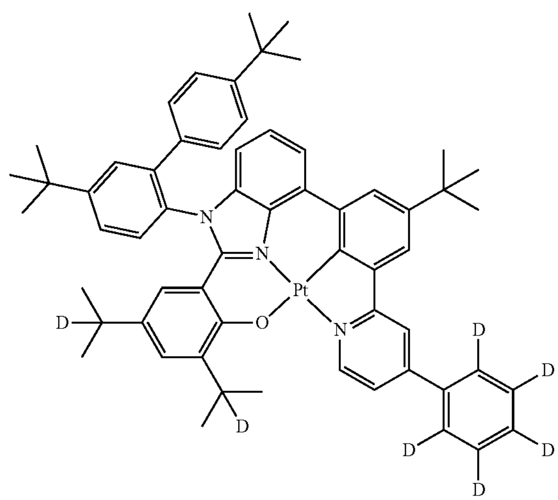
4-3294
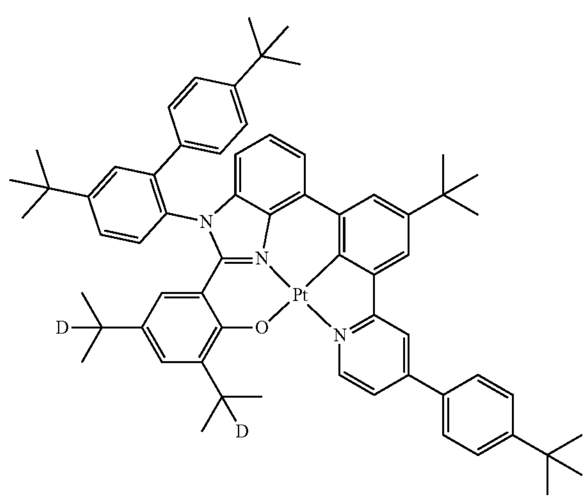
-continued
4-3295
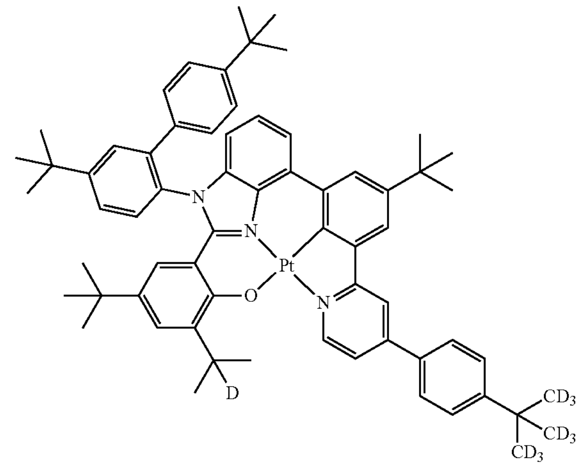
4-3296
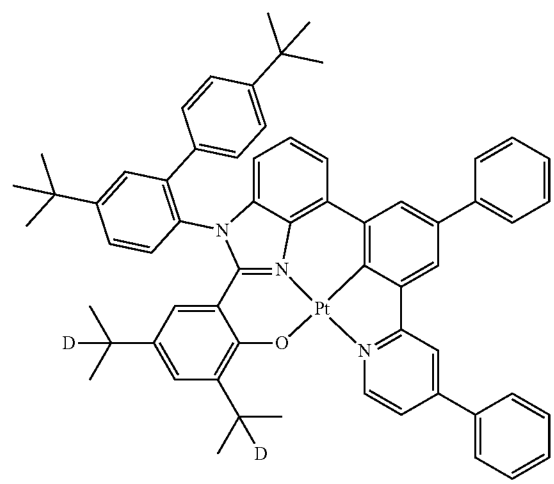
4-3297
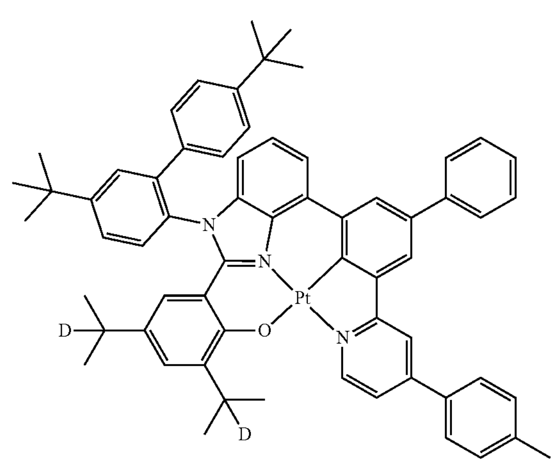

-continued
4-3298
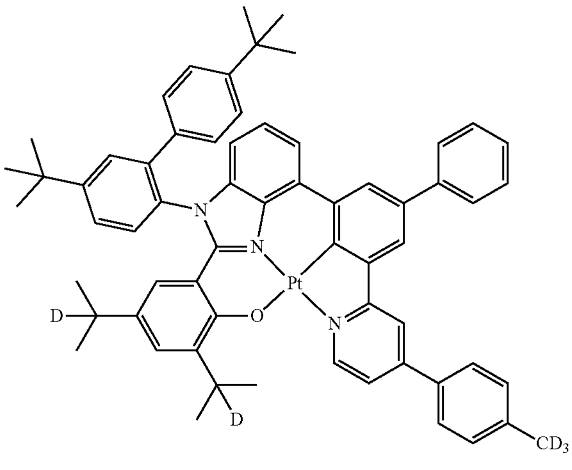
4-3299
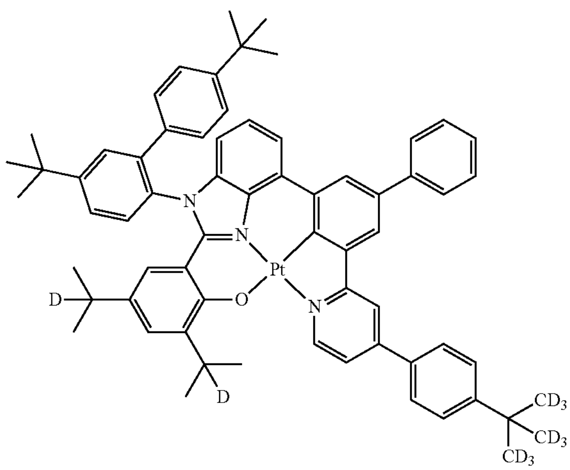
4-3300
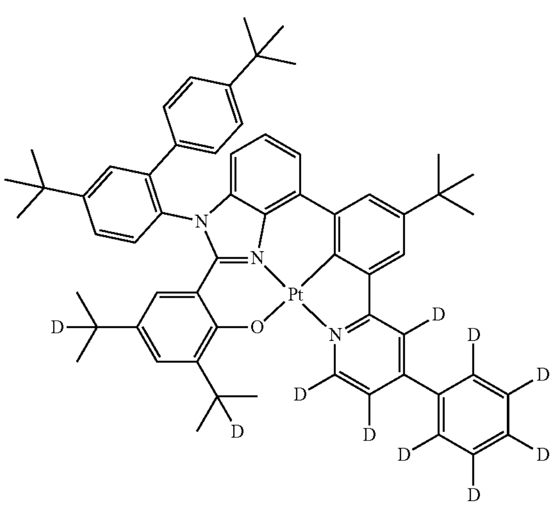
-continued
4-3301
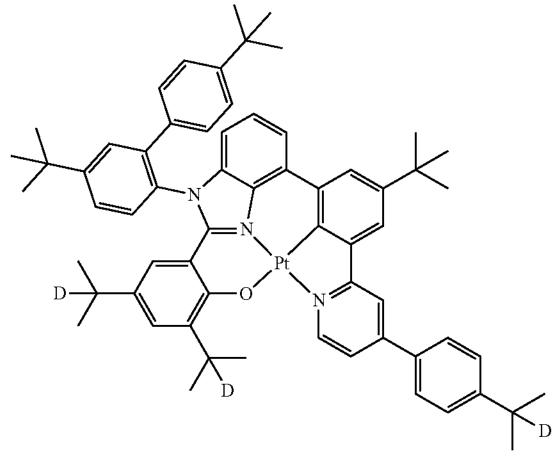
4-3302
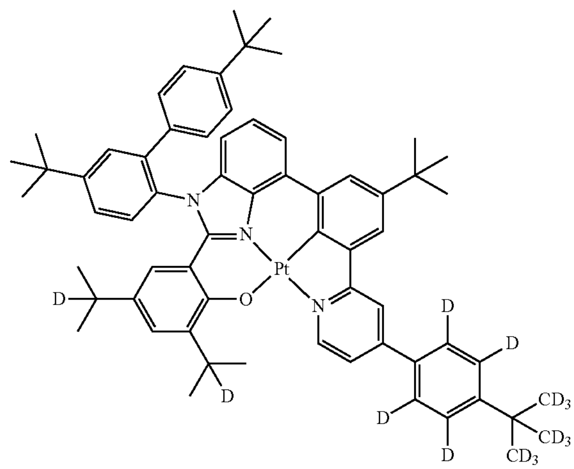
4-3303
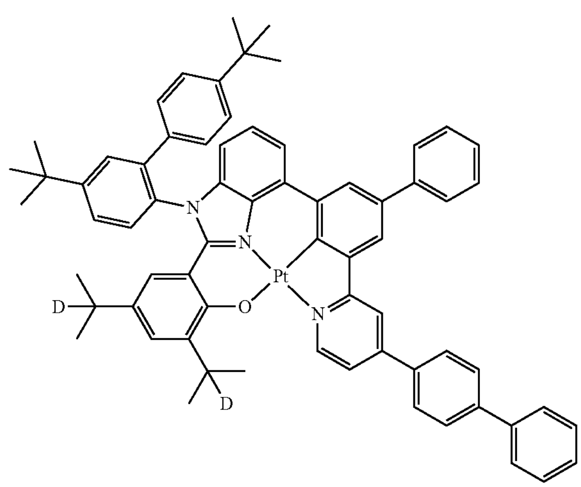

4-3304
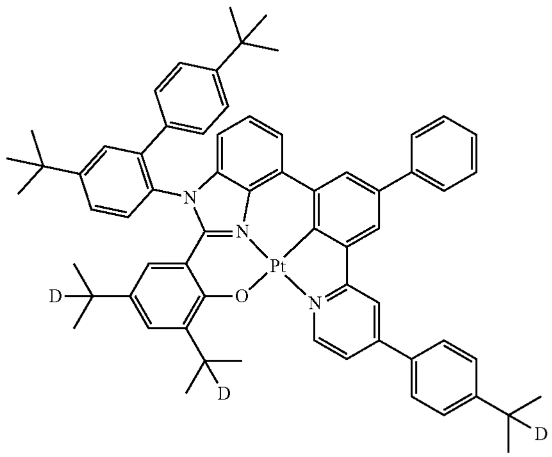
4-3305
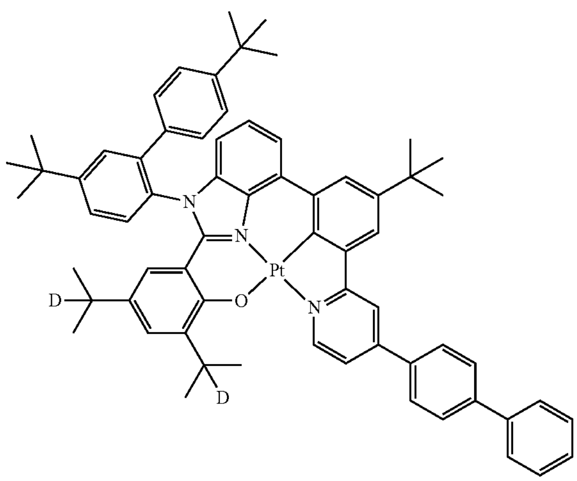
4-3306
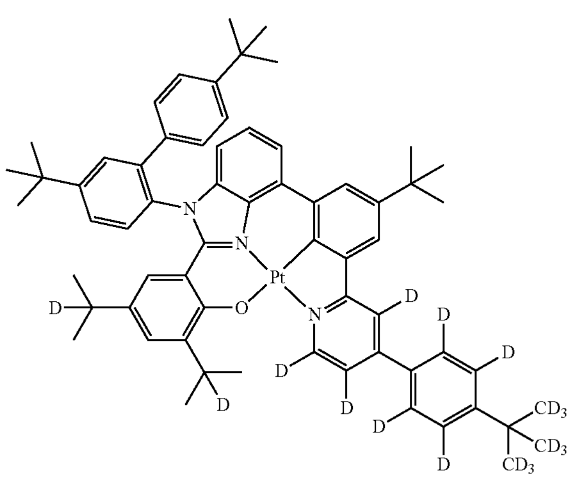
4-3307
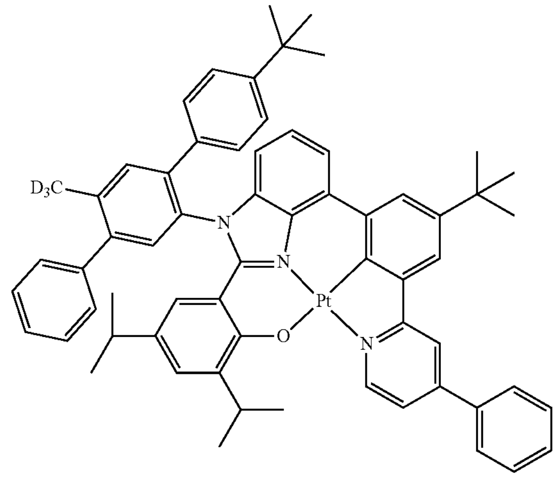
4-3308
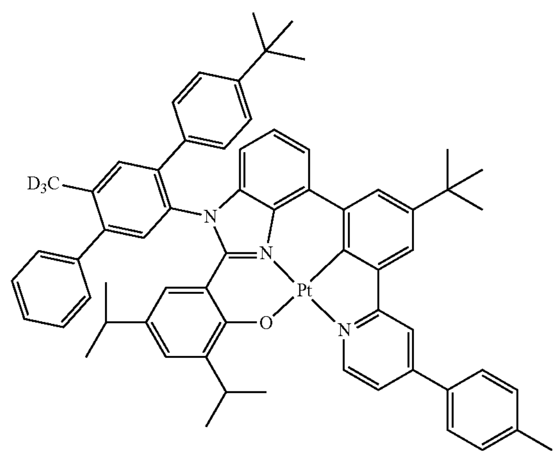
4-3309
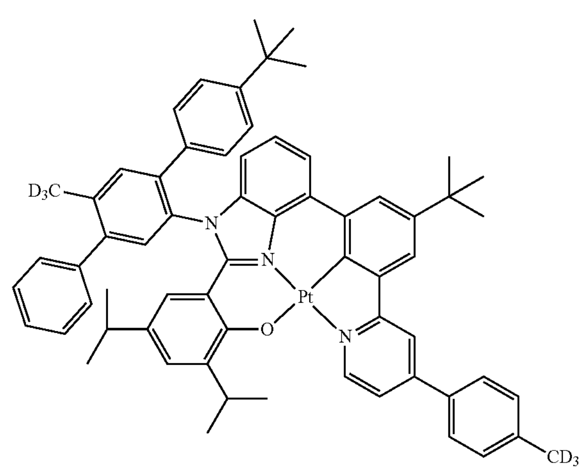

4-3310
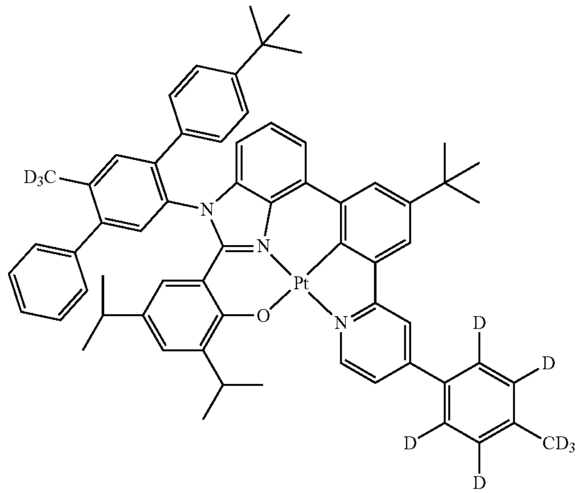
4-3311
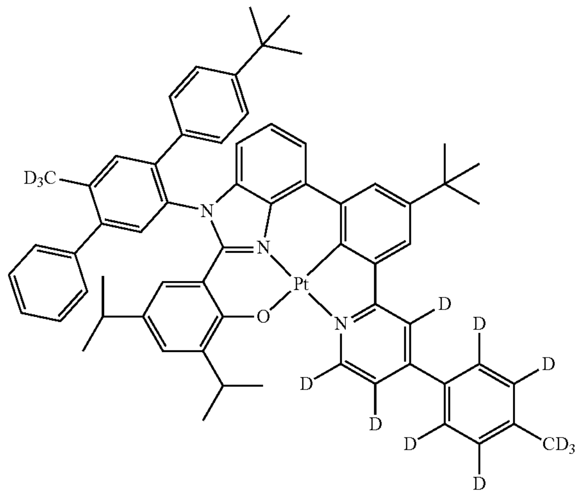
4-3312
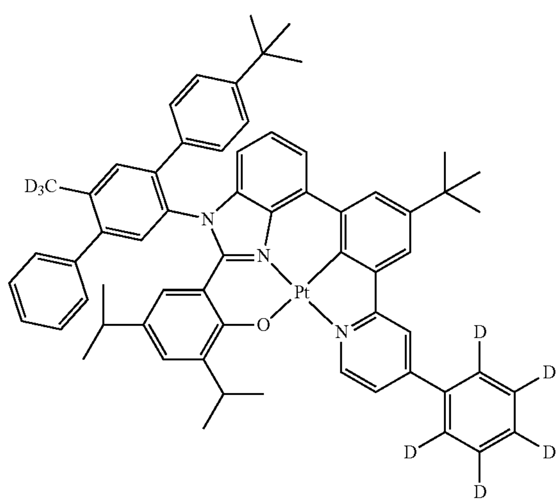
4-3313
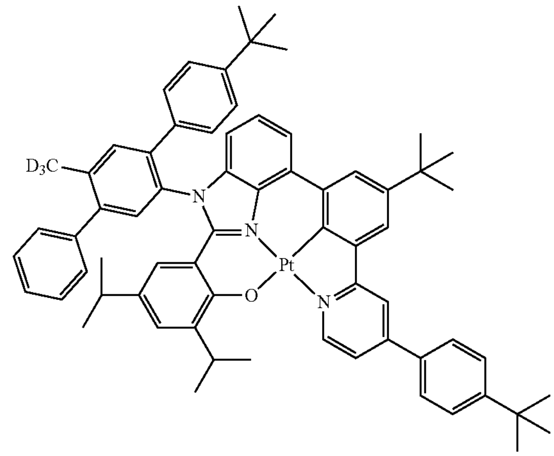
4-3314
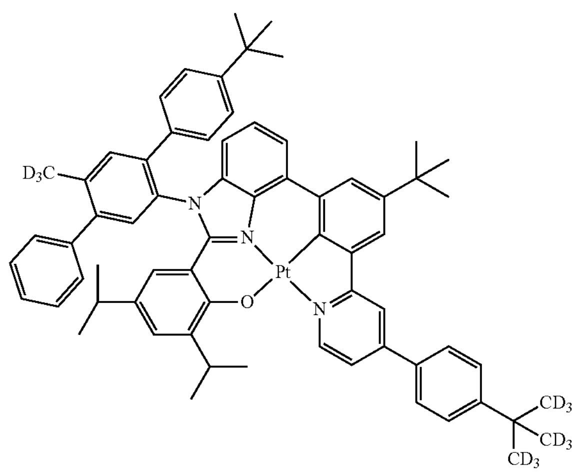
4-3315
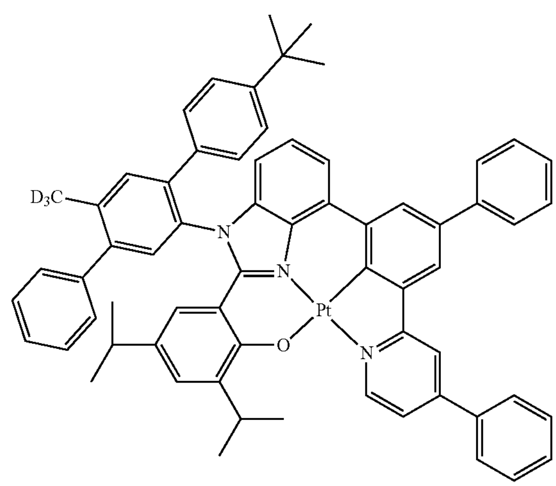

-continued
4-3316
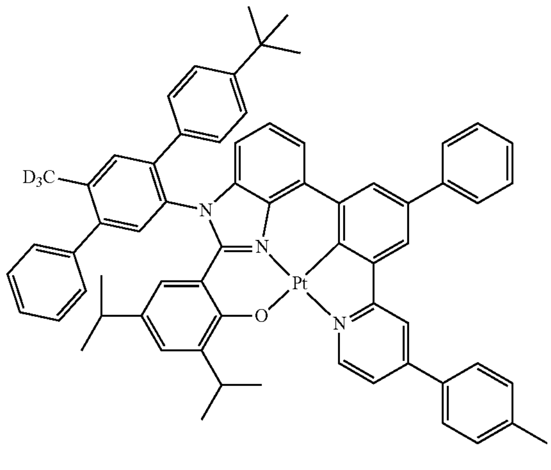
4-3317
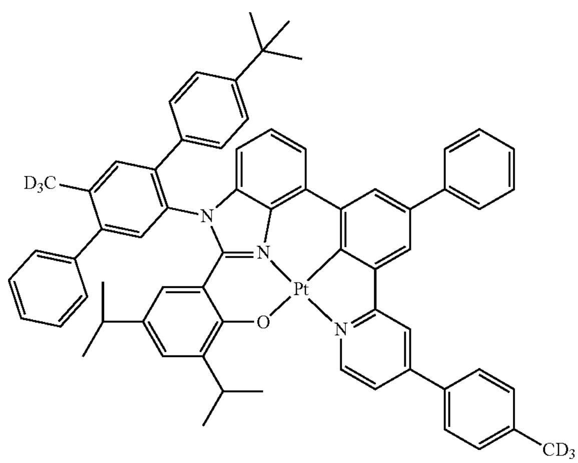
4-3318
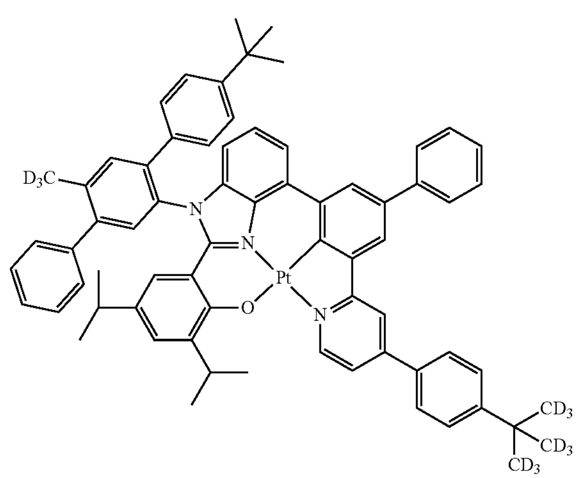
-continued
4-3319
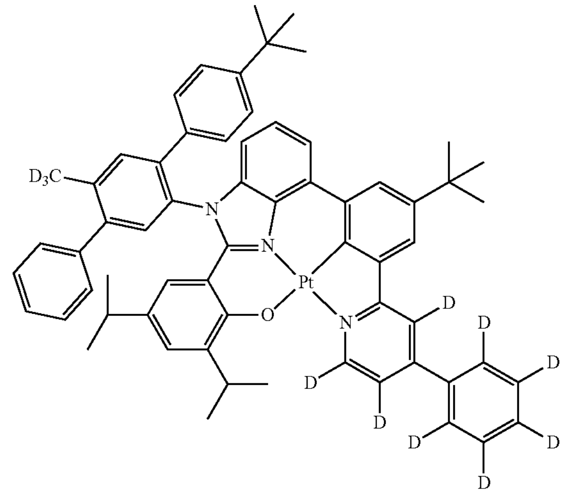
4-3320
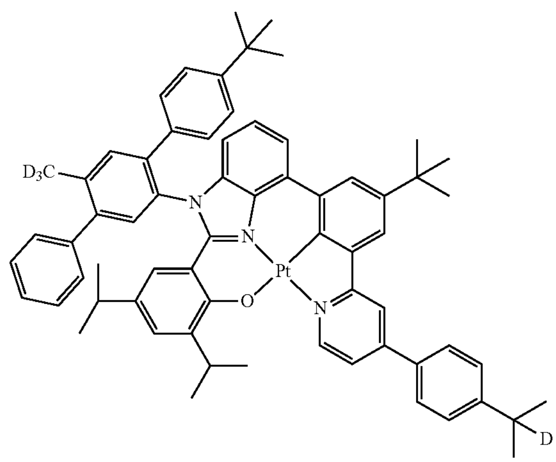
4-3321
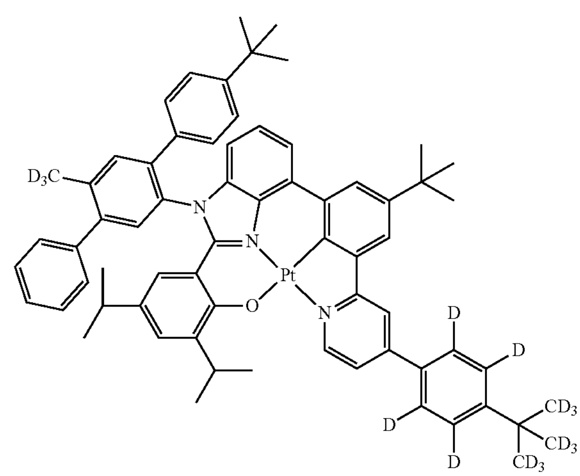

-continued
4-3322
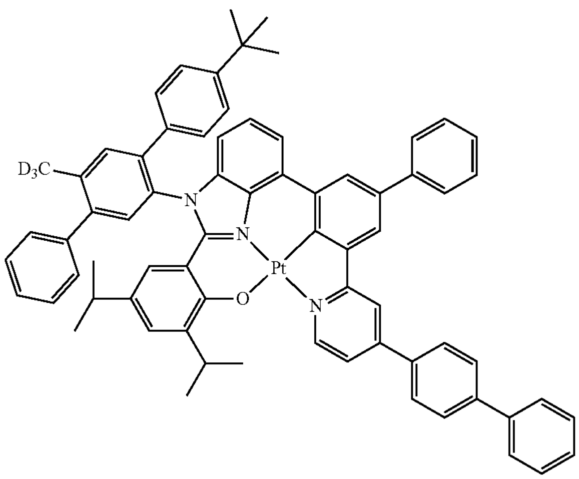
4-3323
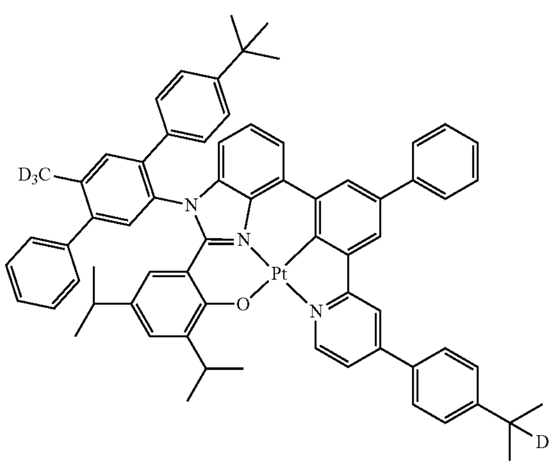
4-3324
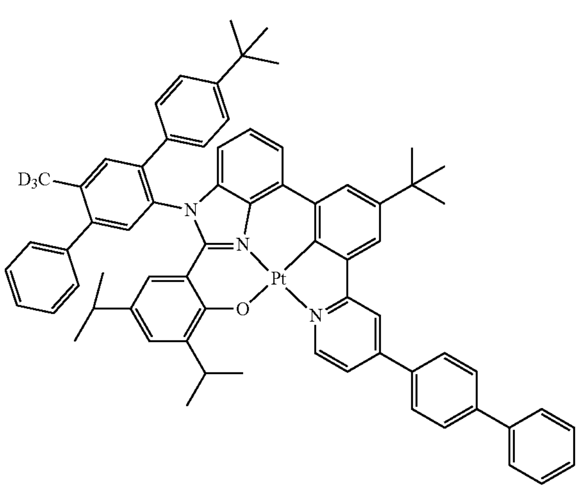
-continued
4-3325
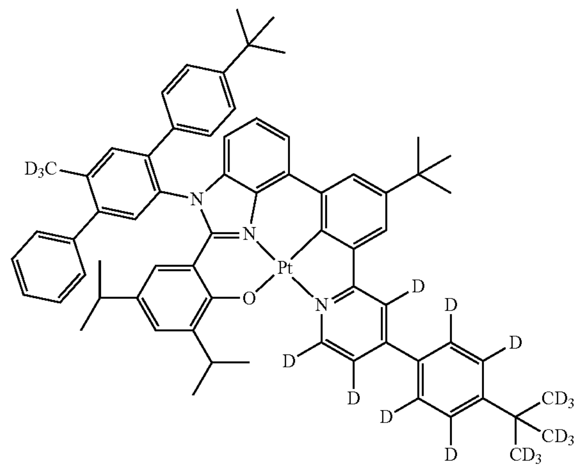
4-3326
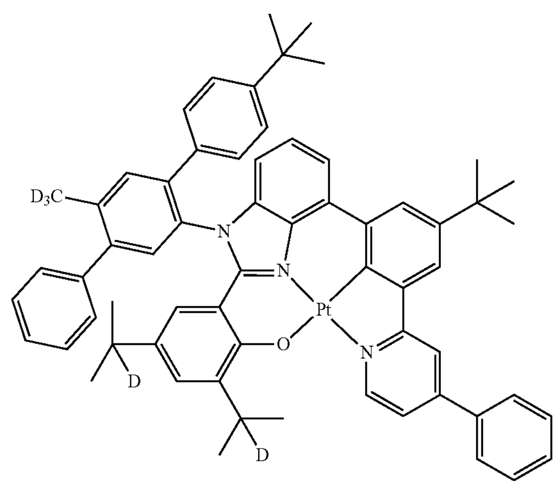
4-3327
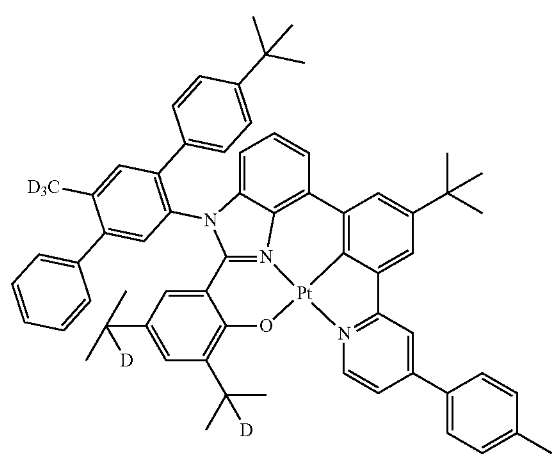

-continued
4-3328
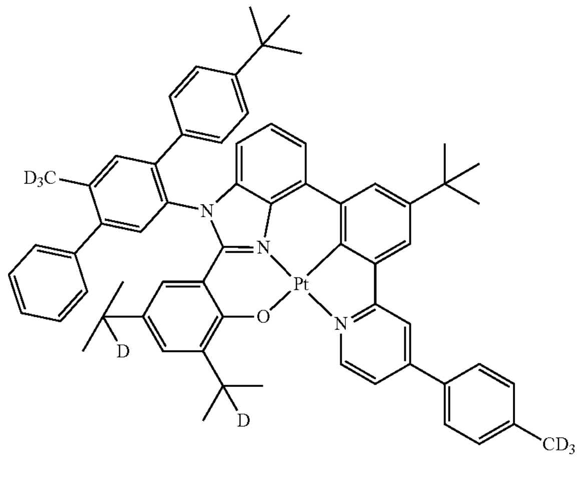
4-3329
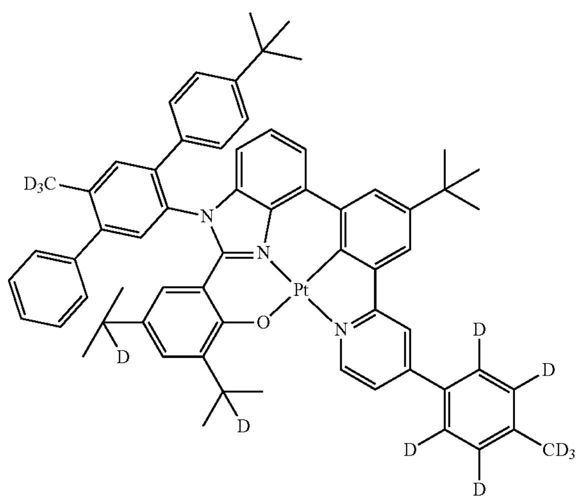
4-3330
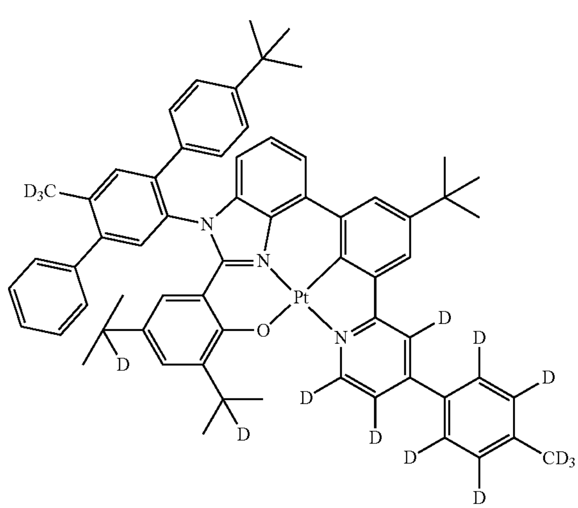
-continued
4-3331
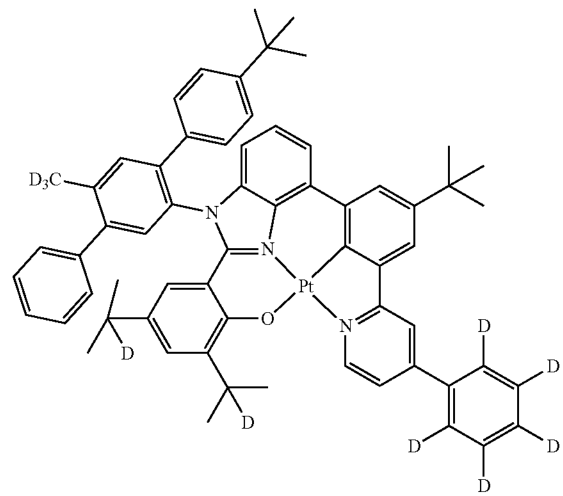
4-3332
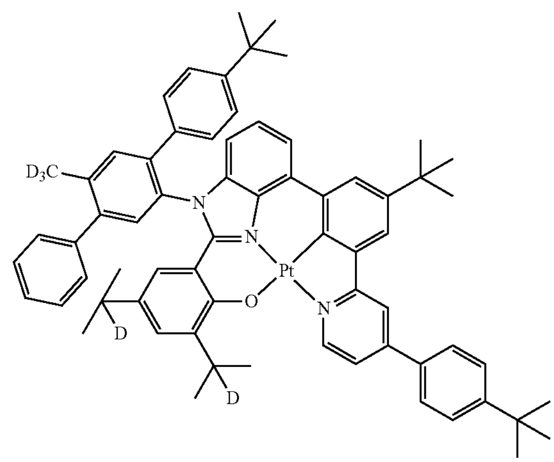
4-3333
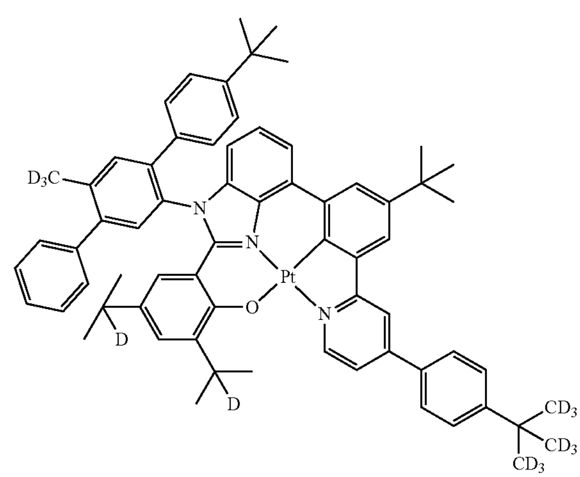

4-3334
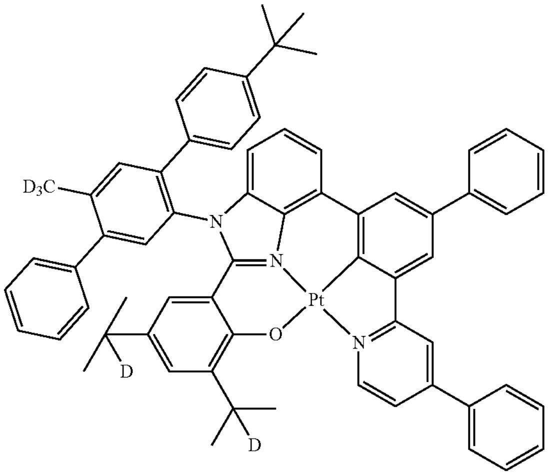
4-3335
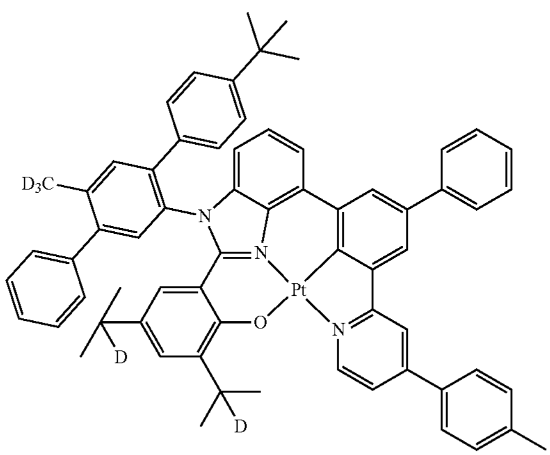
4-3336
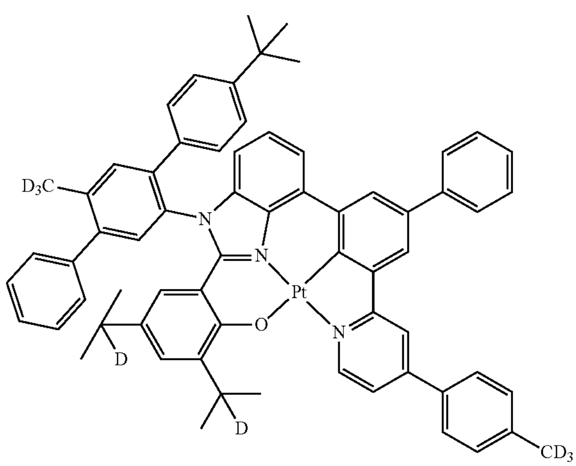
4-3337
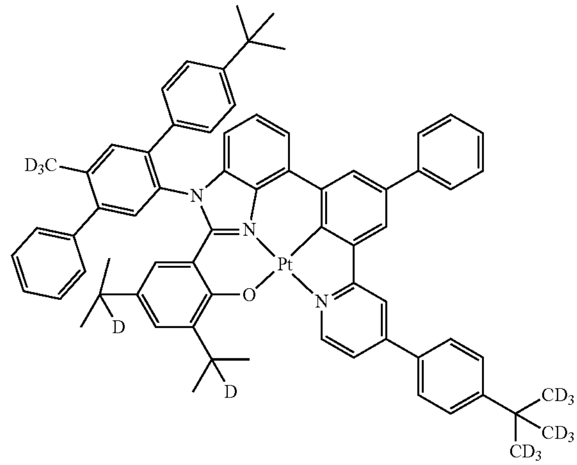
4-3338
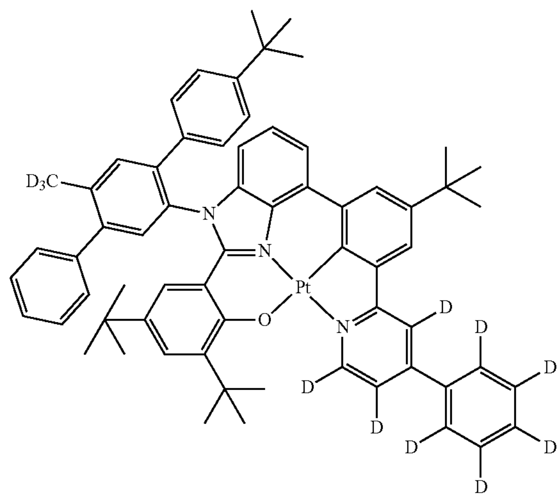
4-3339
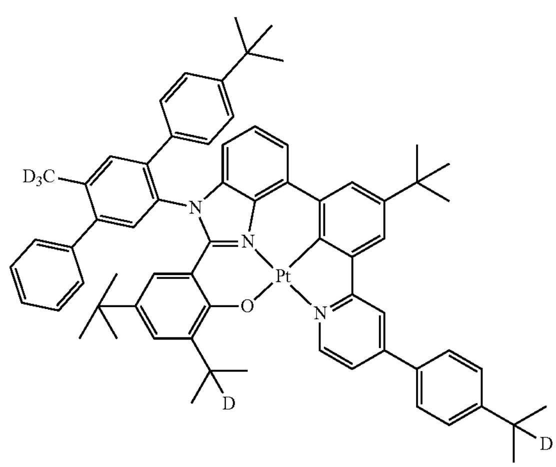

-continued
4-3340
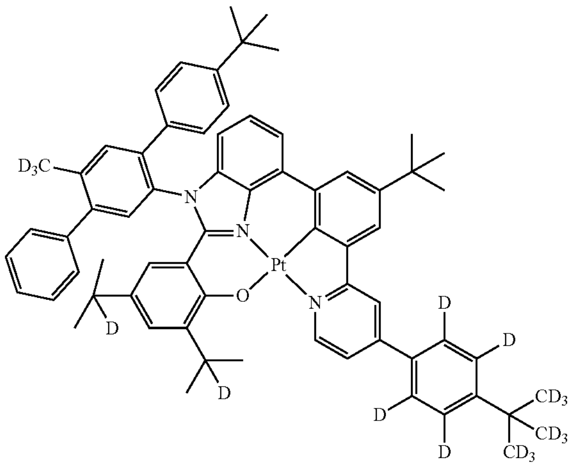
4-3341
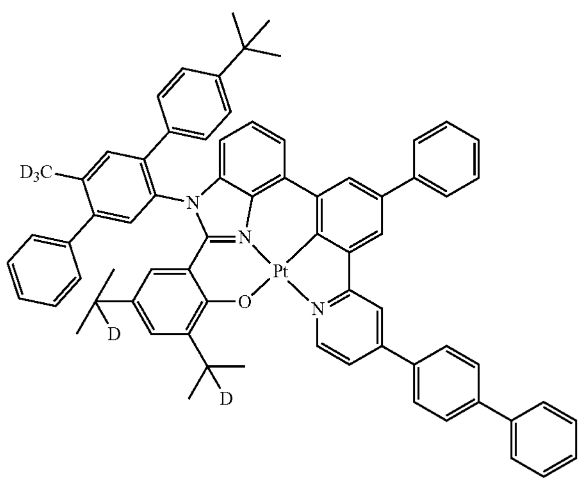
4-3342
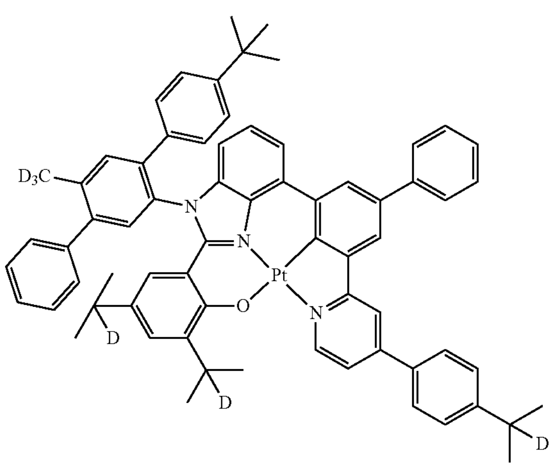
-continued
4-3343
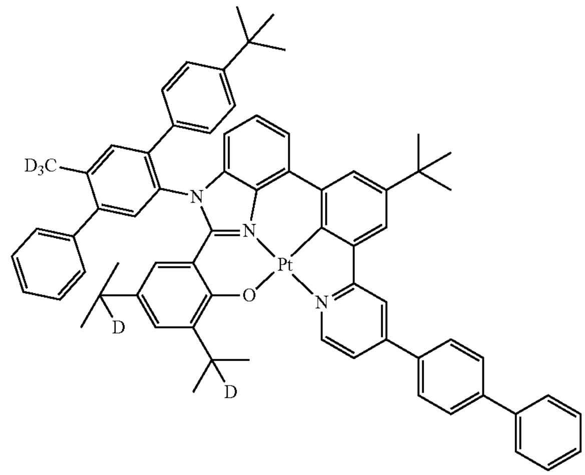
4-3344
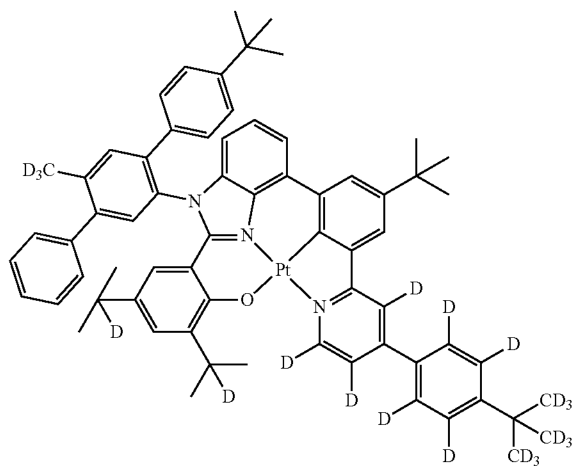
D1
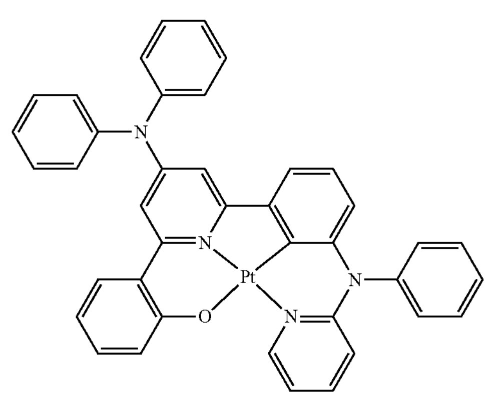

-continued
D2
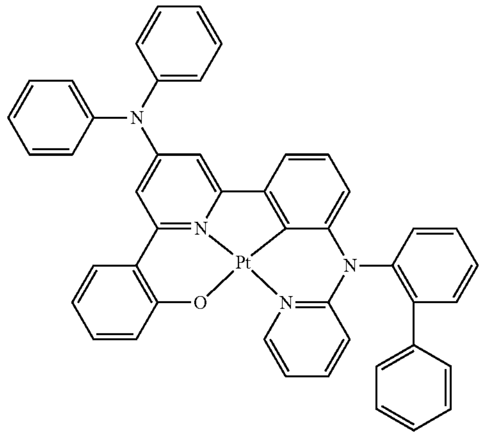
D3
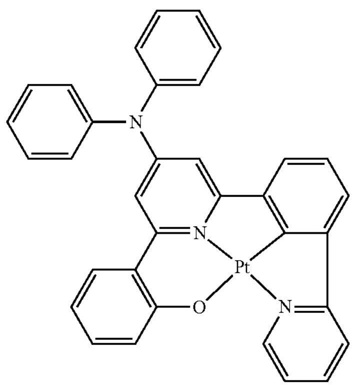
D4
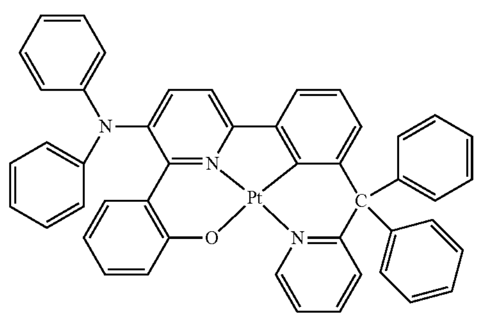
D5
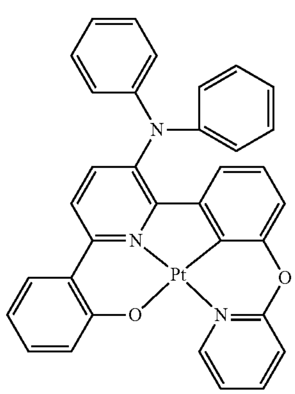
-continued
D6
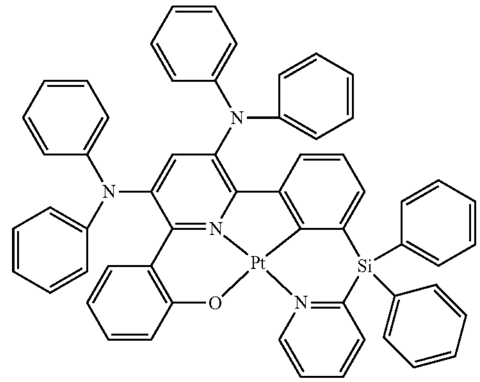
D7
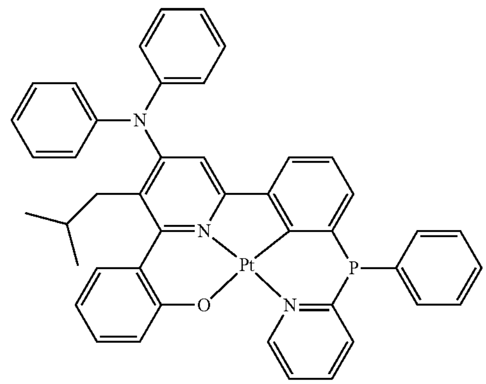
D8
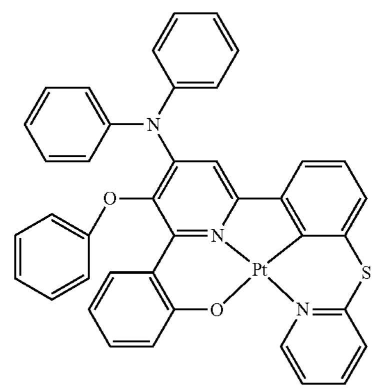
D9
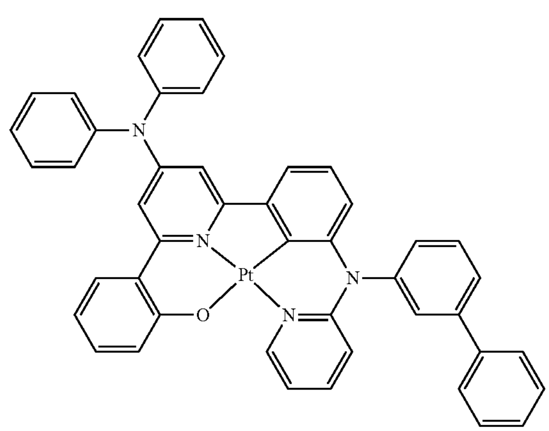

-continued
D10
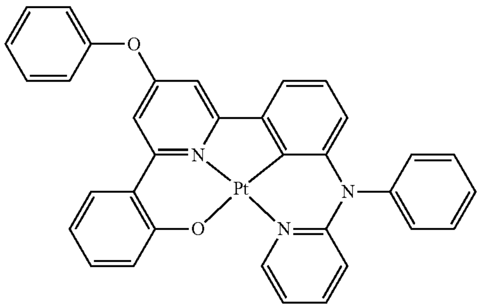
D11
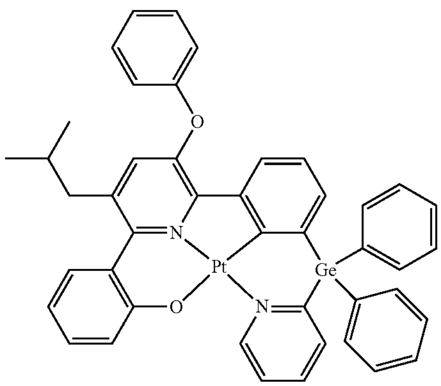
D12
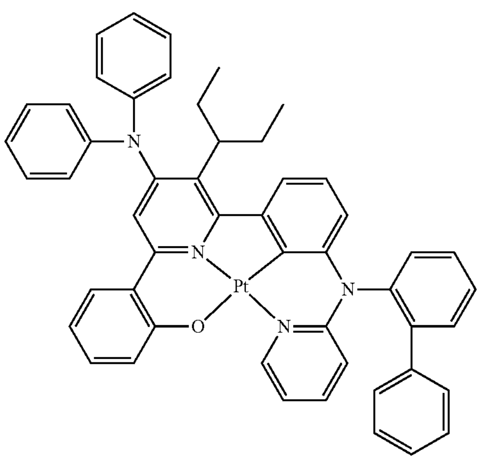
D13
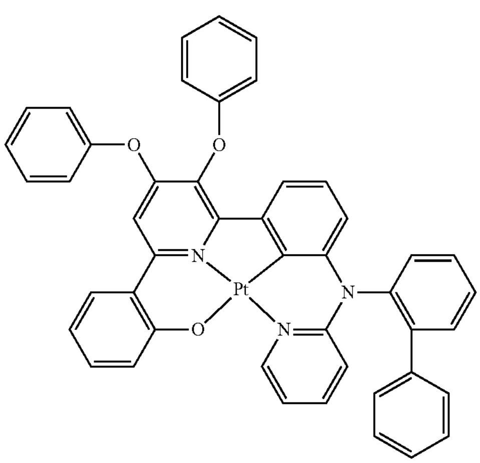
-continued
D14
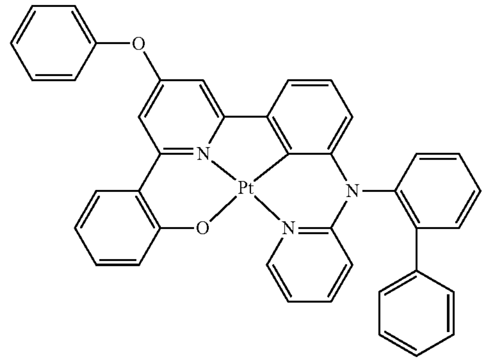
D15
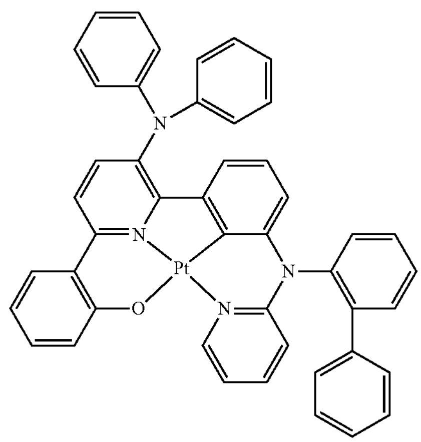
D16
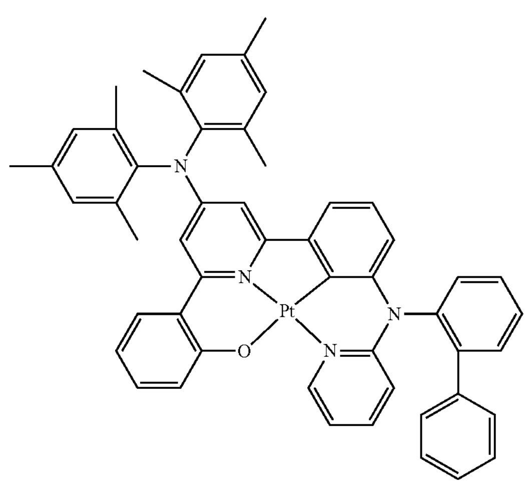

-continued
D17
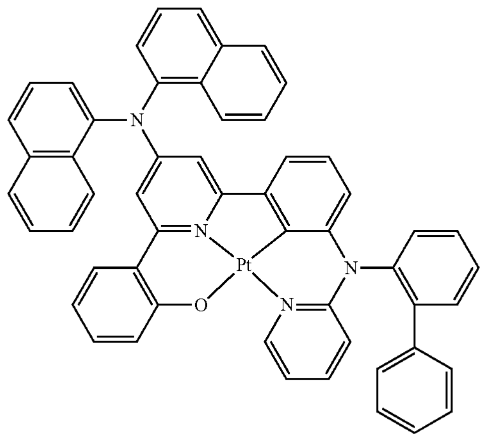
D18
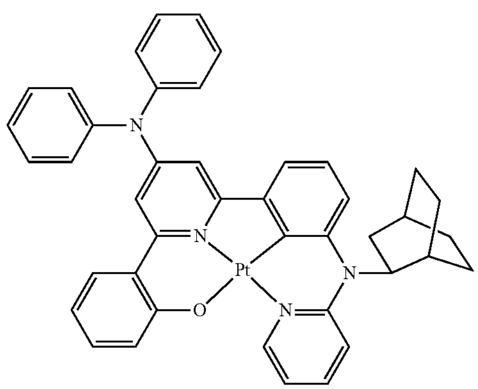
D19
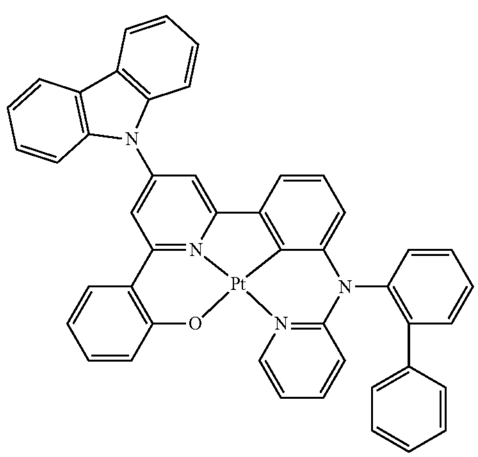
-continued
D20
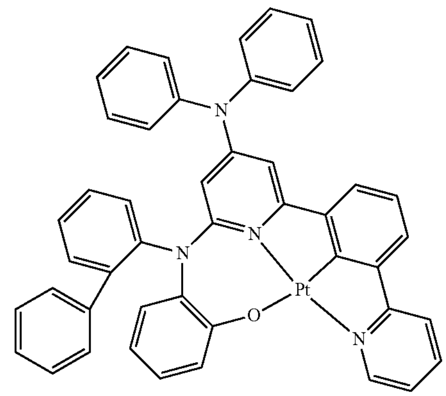
D21
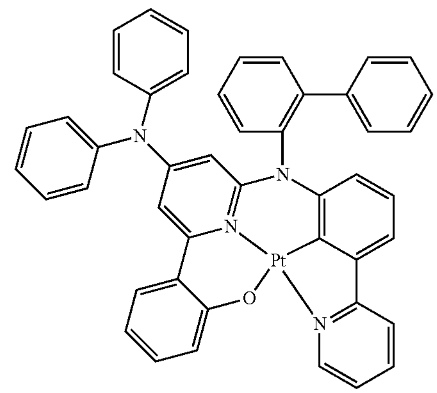
D22
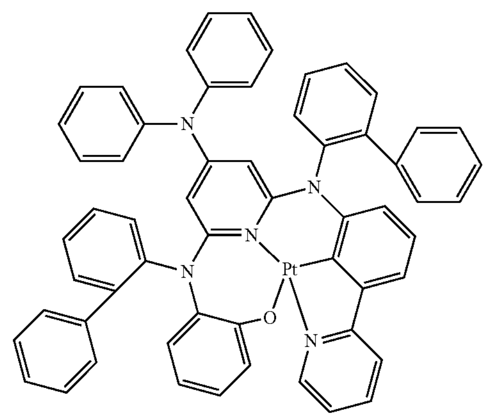
D23
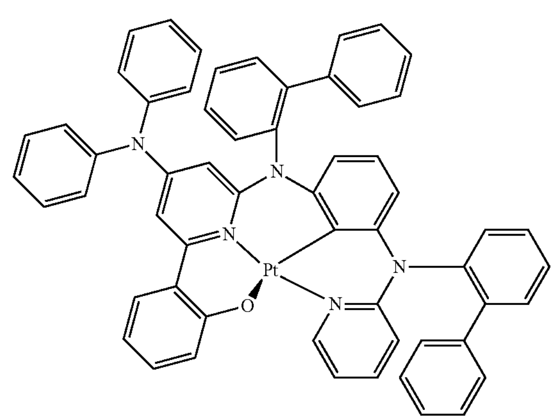

-continued
D24
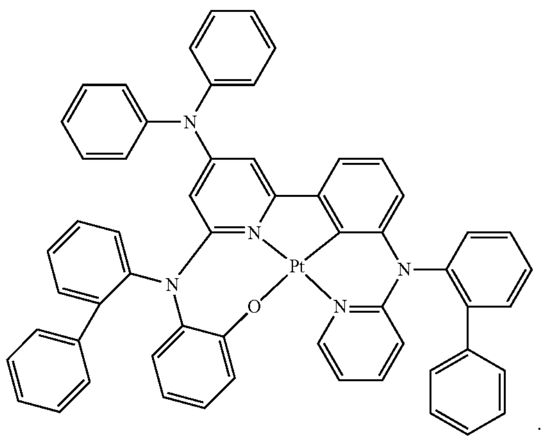
The first compound may be one of Compounds H1-1 to H1-75, but embodiments of the present disclosure are not limited thereto:
H1-1
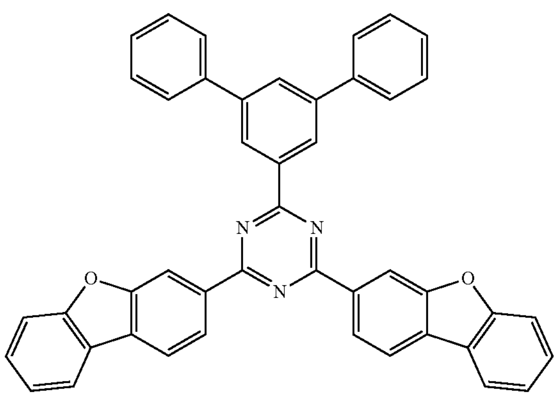
H1-2
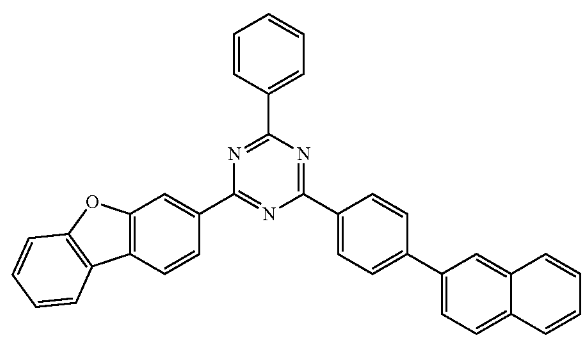
H1-3
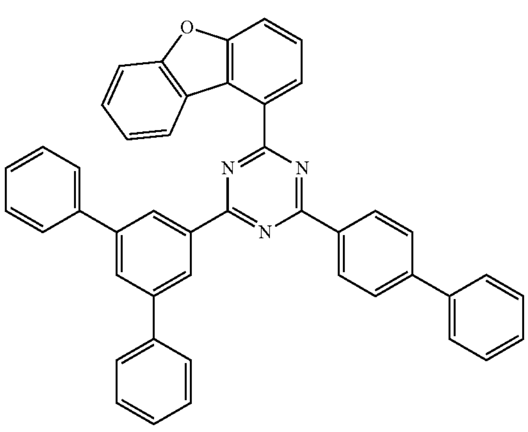
H1-4
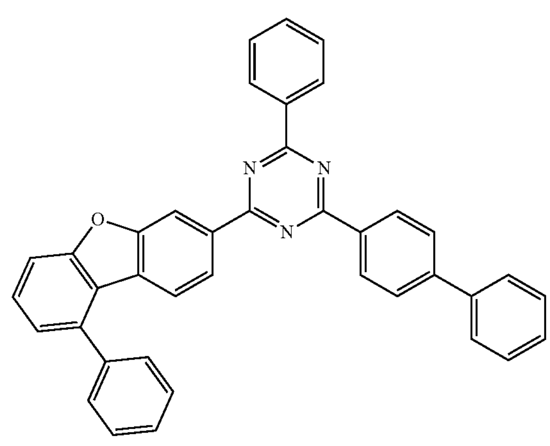

-continued
H1-5
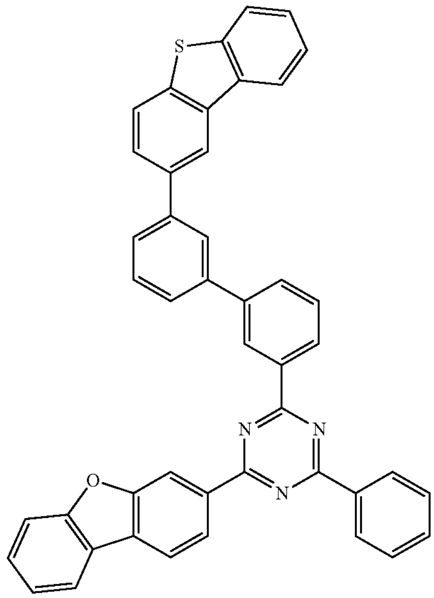
H1-6
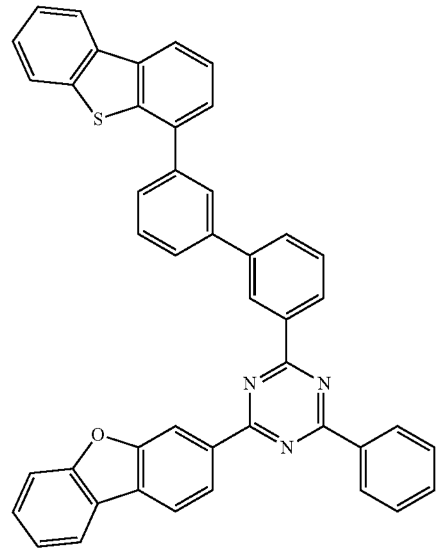
H1-7
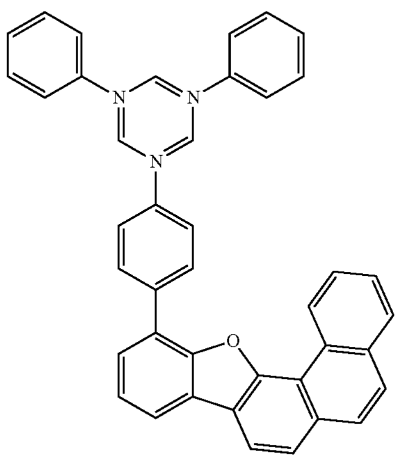
H1-8
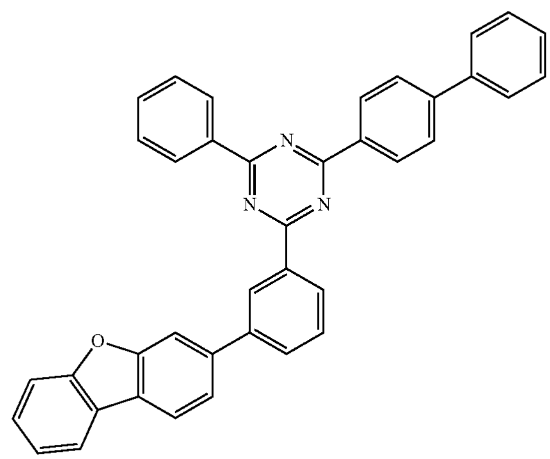
H1-9
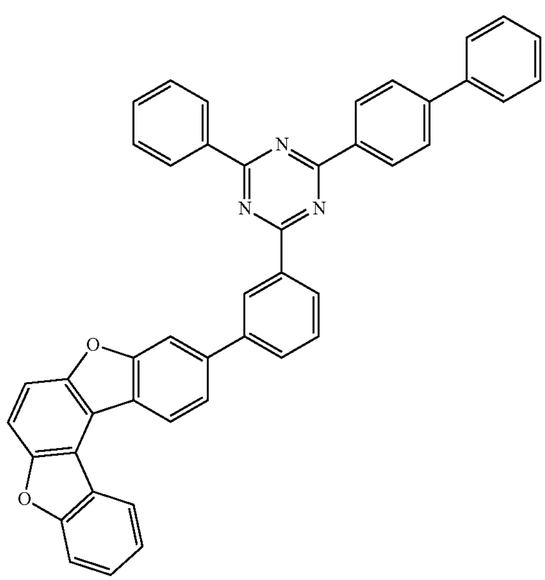

-continued
H1-10
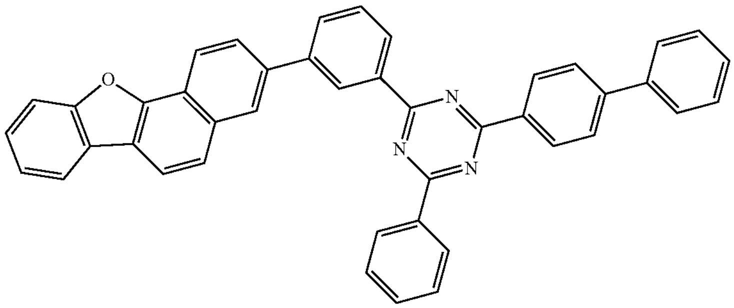
H1-11
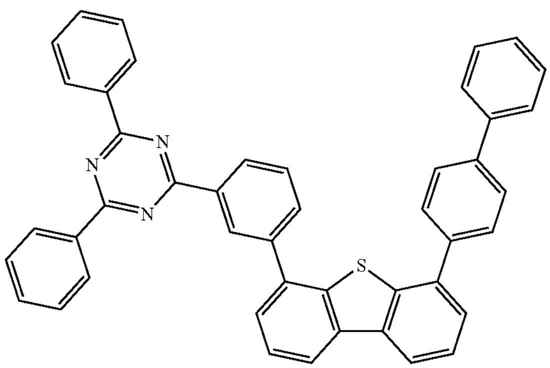
H1-12
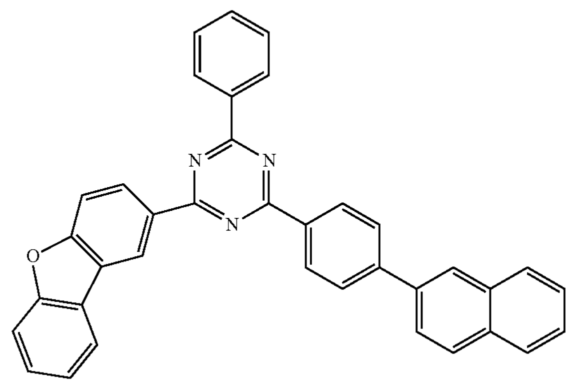
H1-13
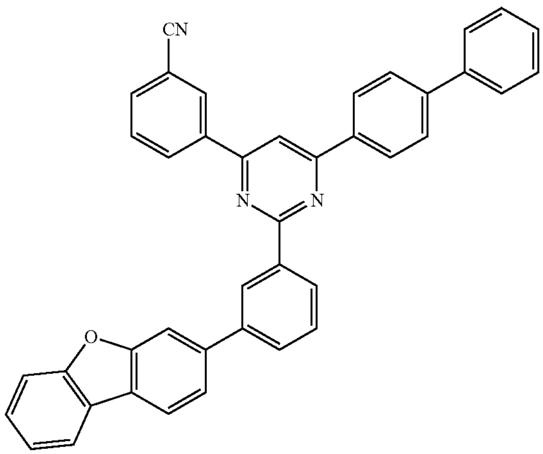
H1-14
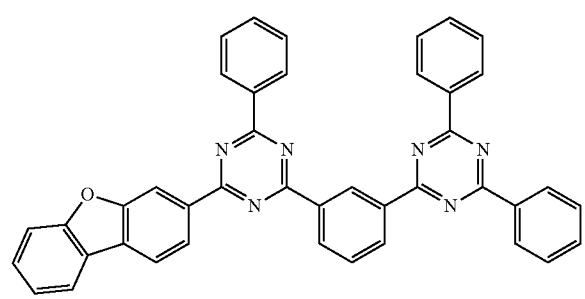

-continued
H1-15
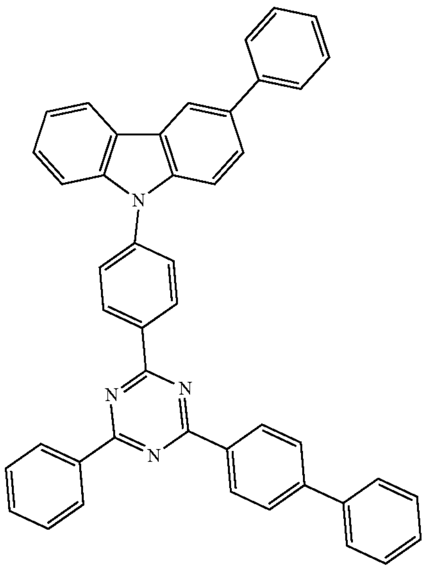
H1-16
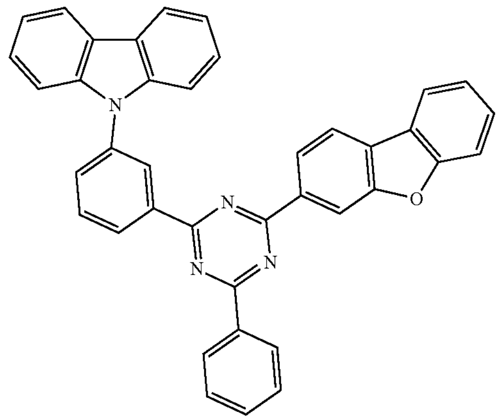
H1-17
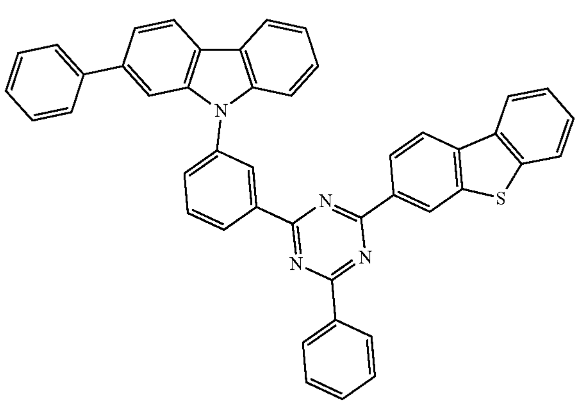
H1-18
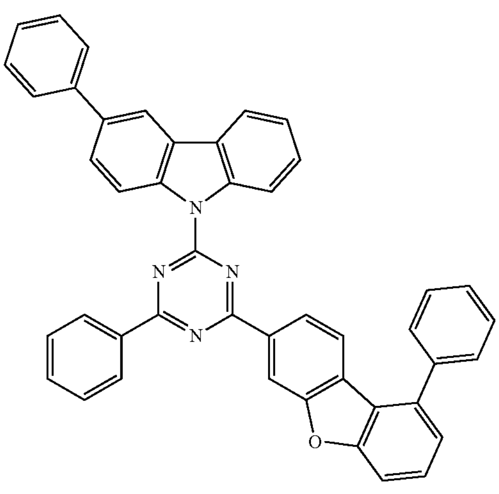

-continued
H1-19
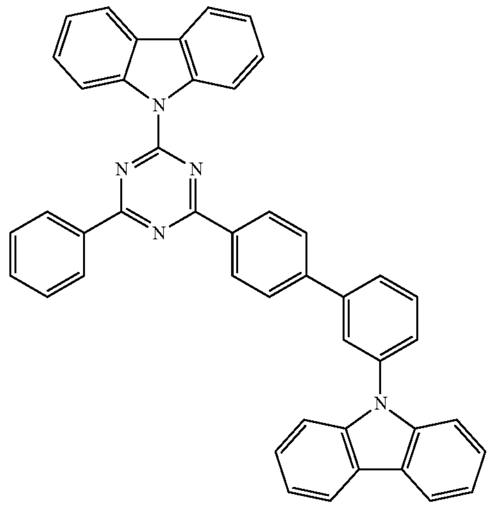
H1-20
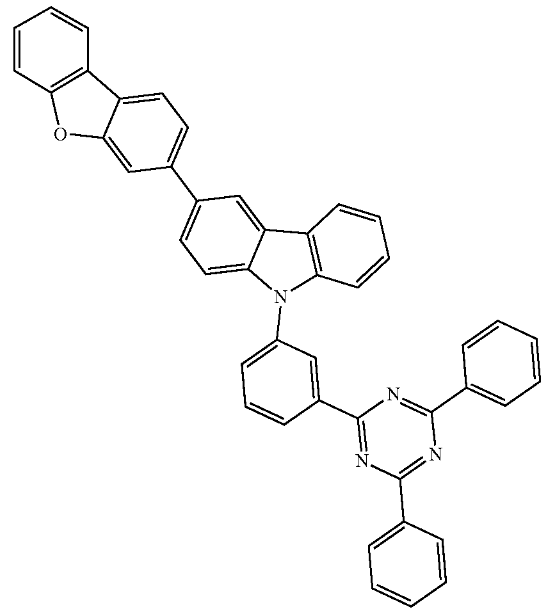
H1-21
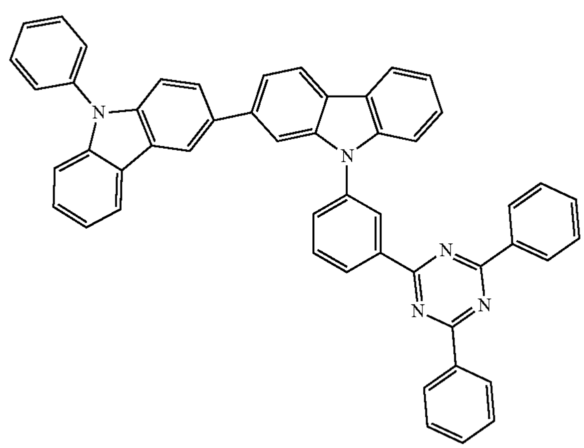
H1-22
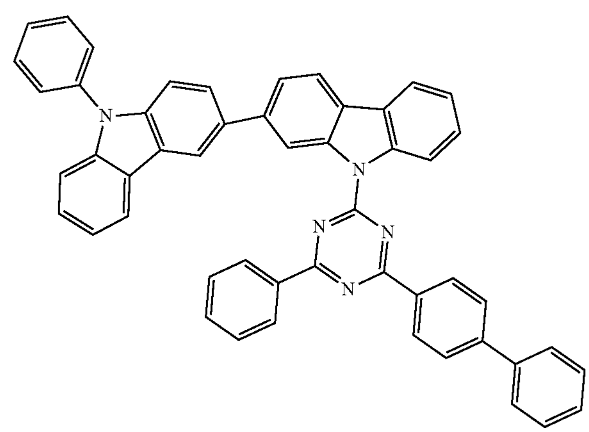

-continued
H1-23
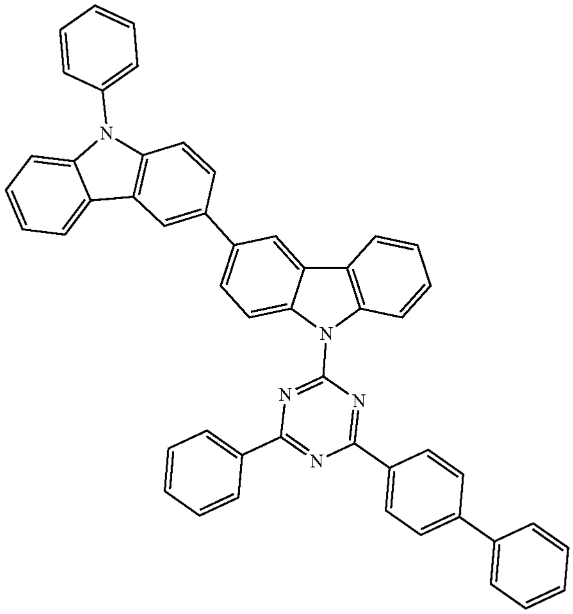
H1-24
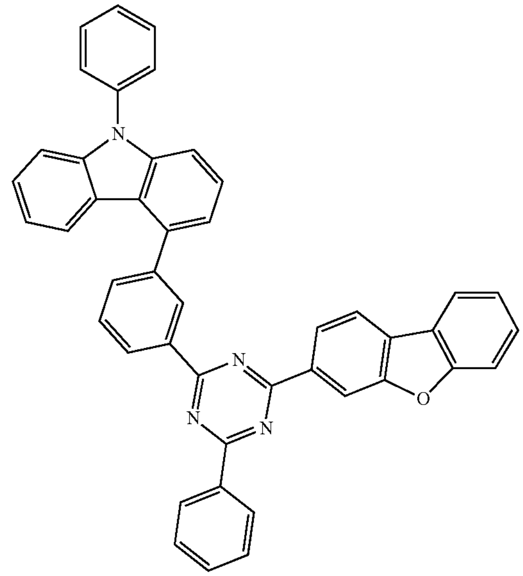
H1-25
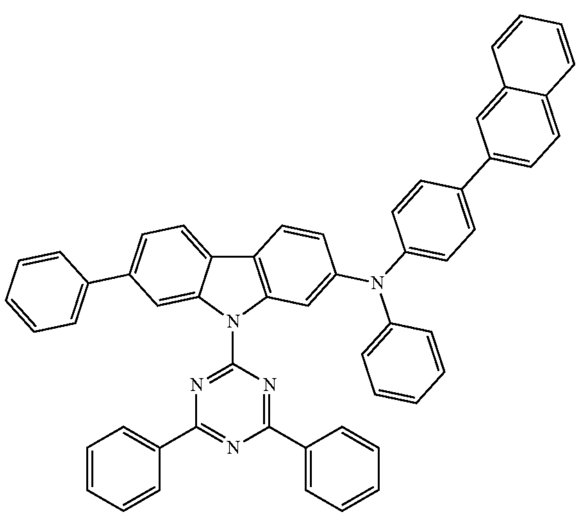
H1-26
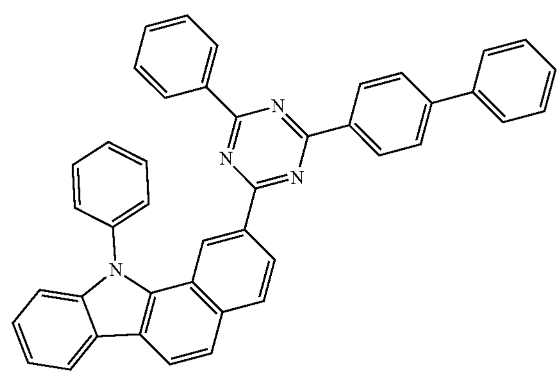

-continued
H1-27
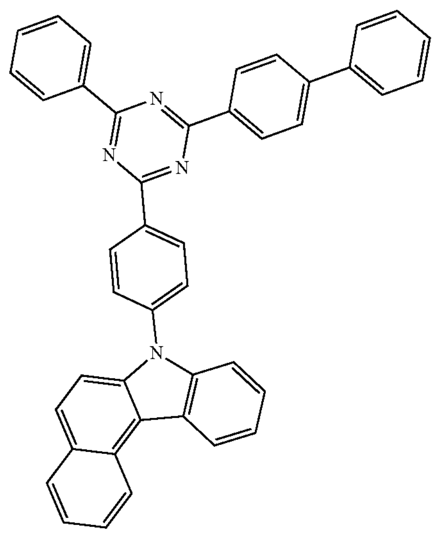
H1-28
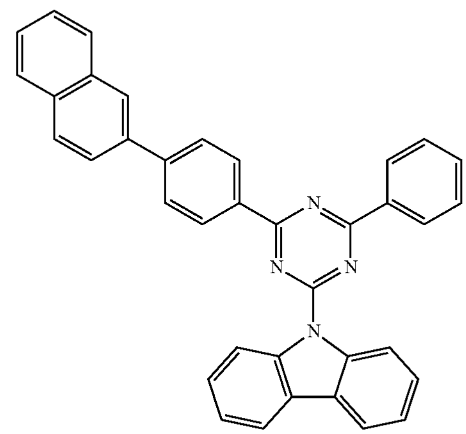
H1-29
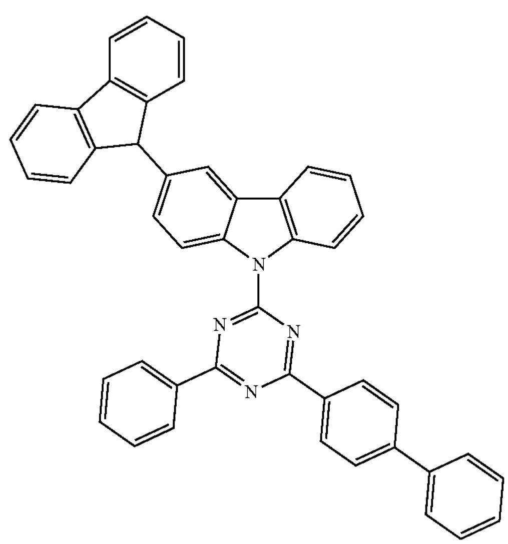
H1-30
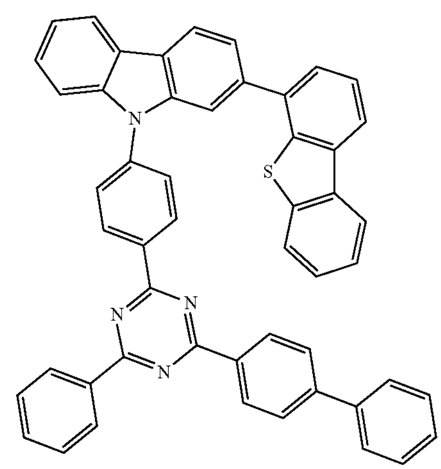
H1-31
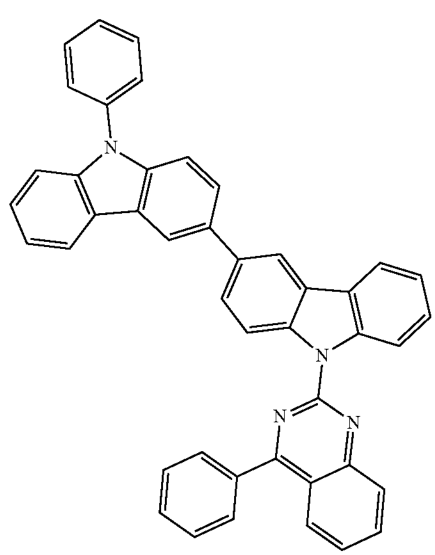
H1-32
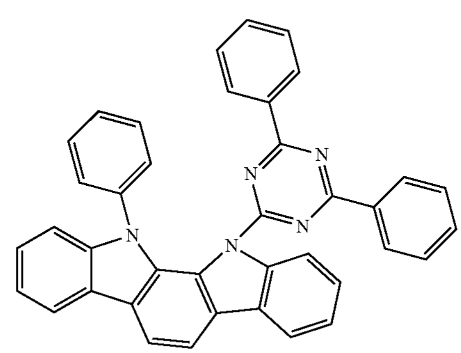

-continued
H1-33
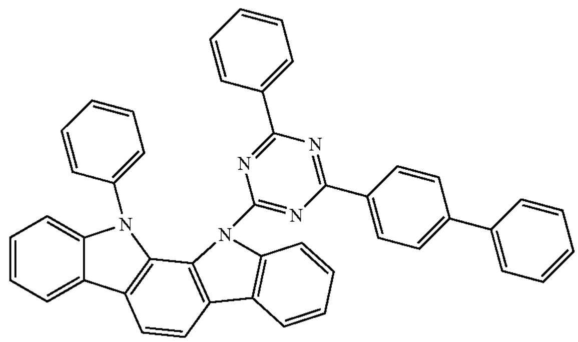
H1-34
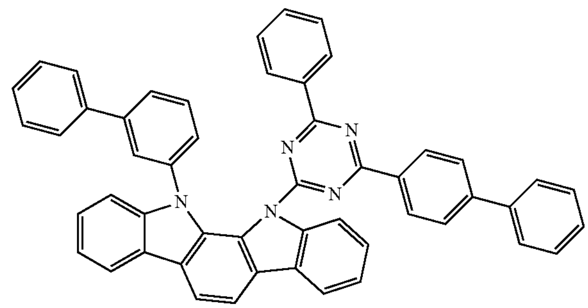
H1-35
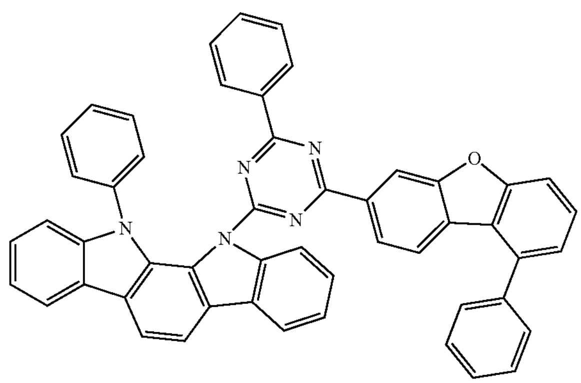
H1-36
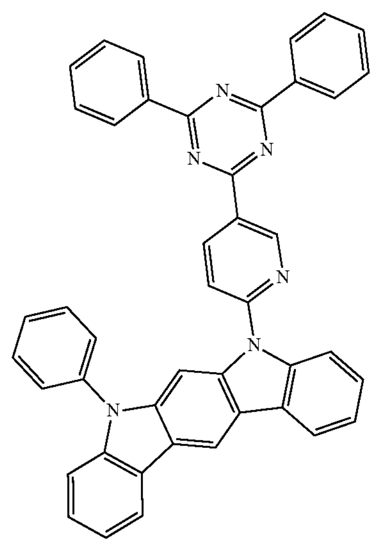
H1-37
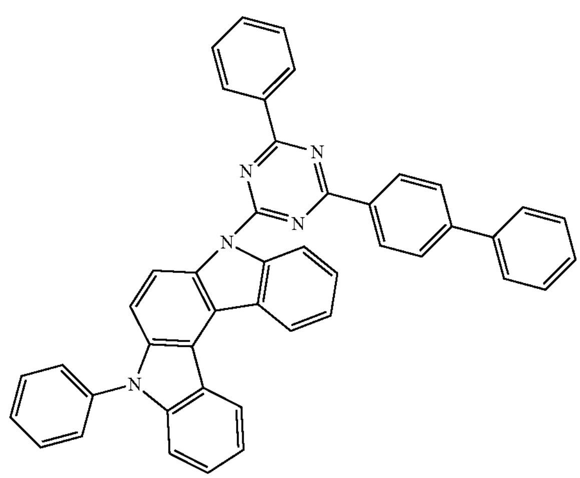
H1-38
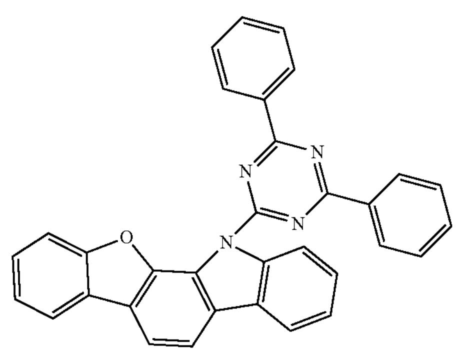

-continued
H1-39
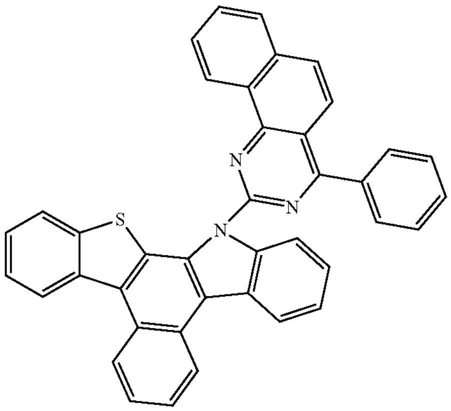
H1-40
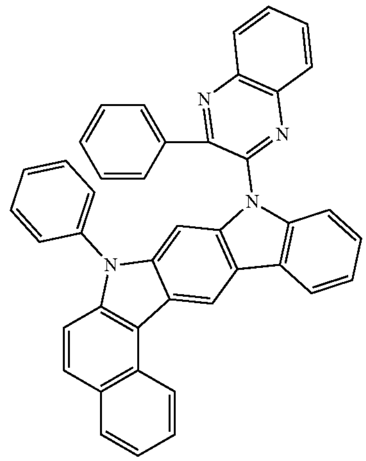
H1-41
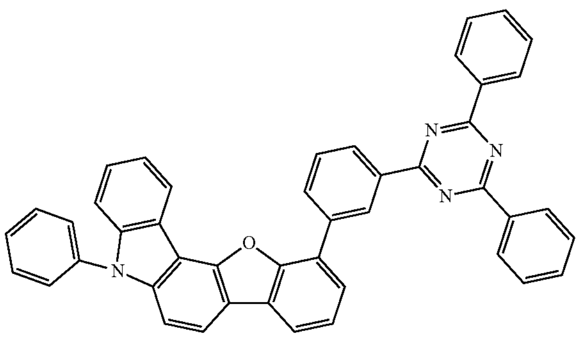
H1-42
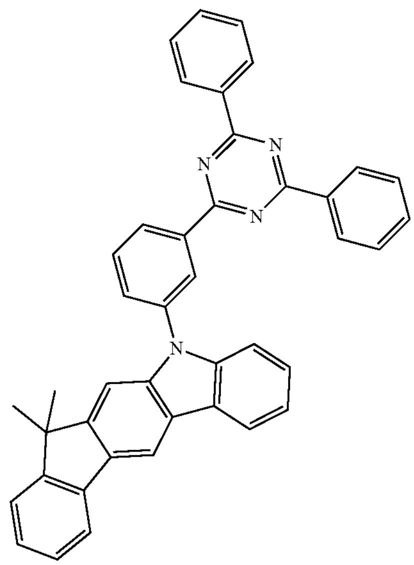
H1-43
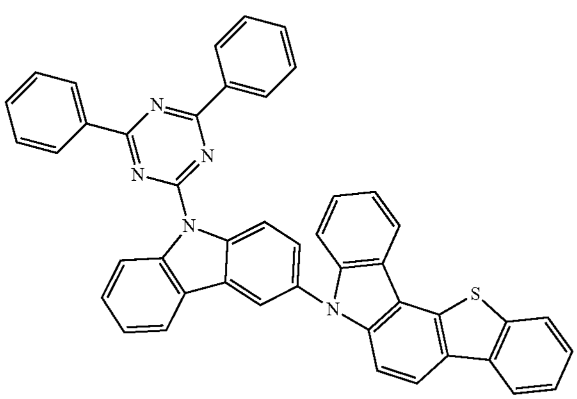
H1-44
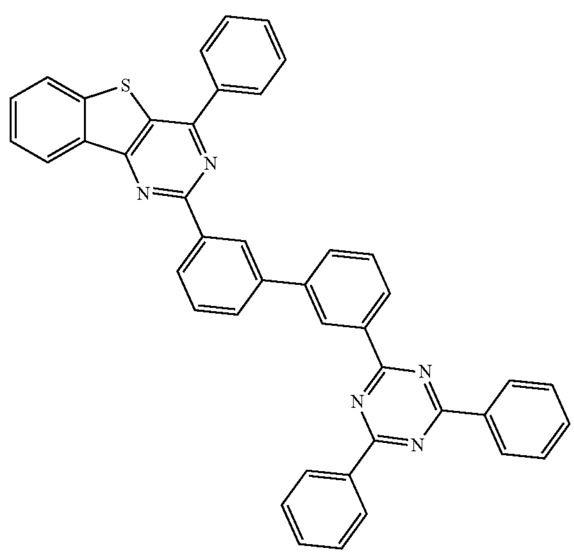

-continued
H1-45
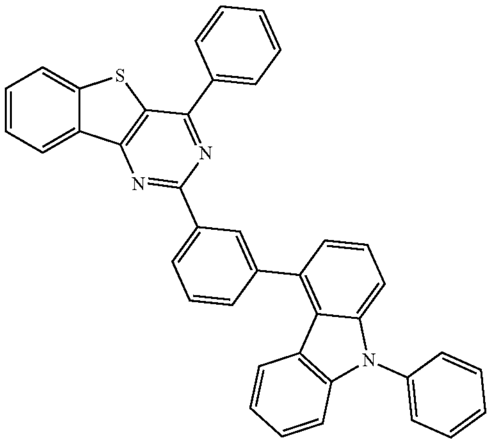
H1-46
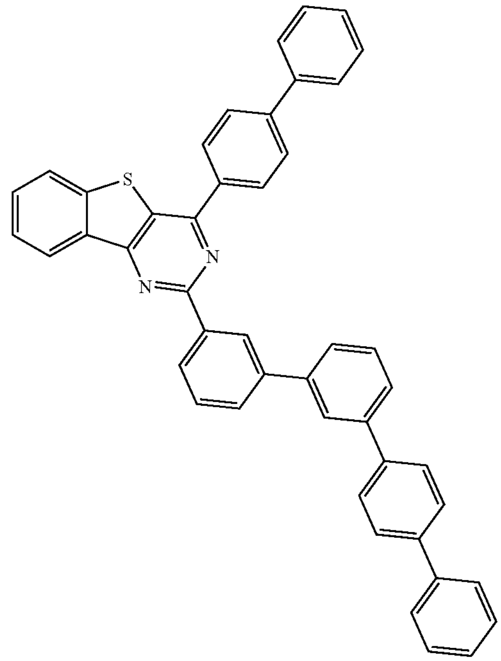
H1-47
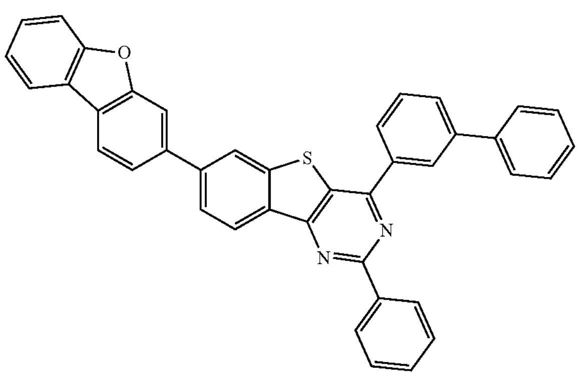
H1-48
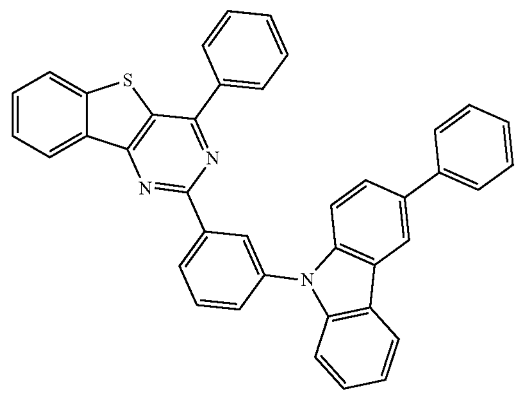
H1-49
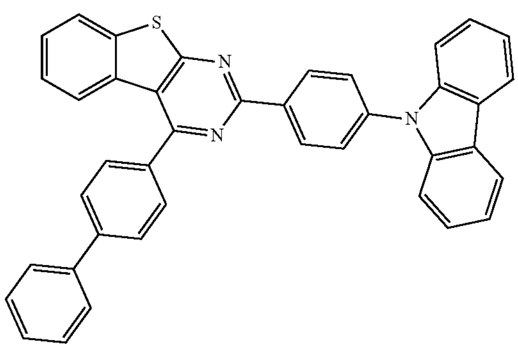
H1-50
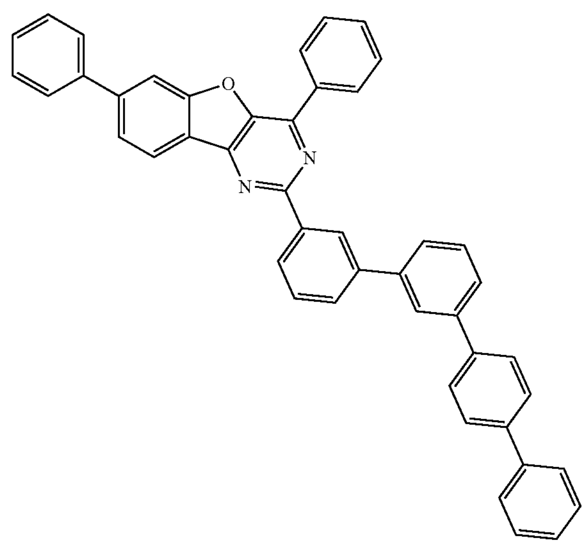

-continued
H1-51
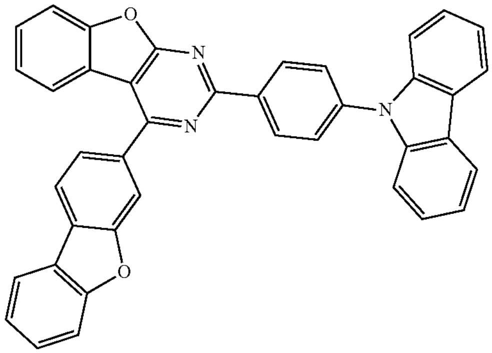
H1-52
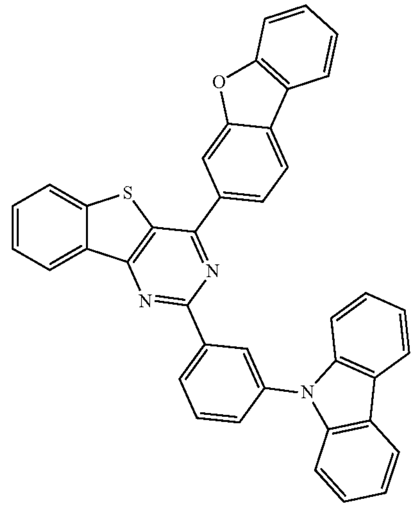
H1-53
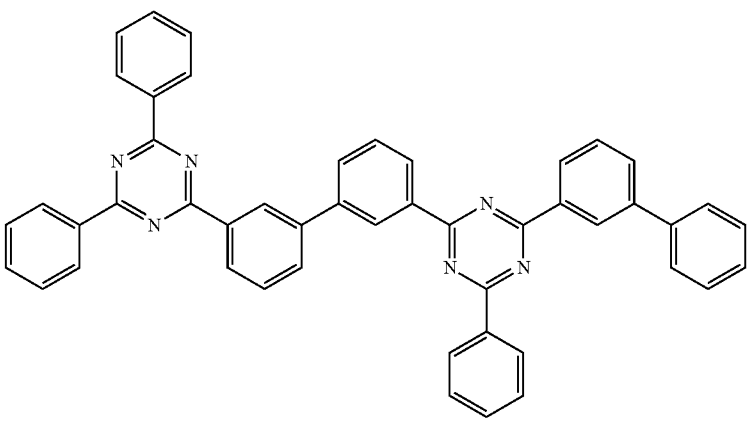
H1-54
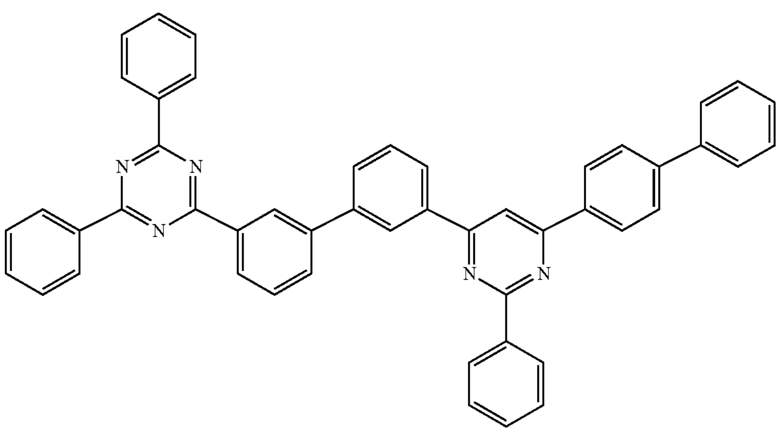

-continued
H1-55
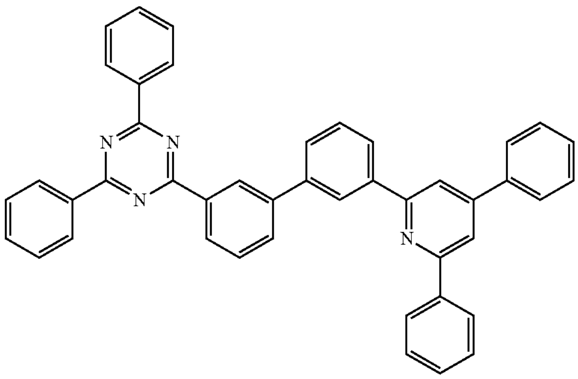
H1-56
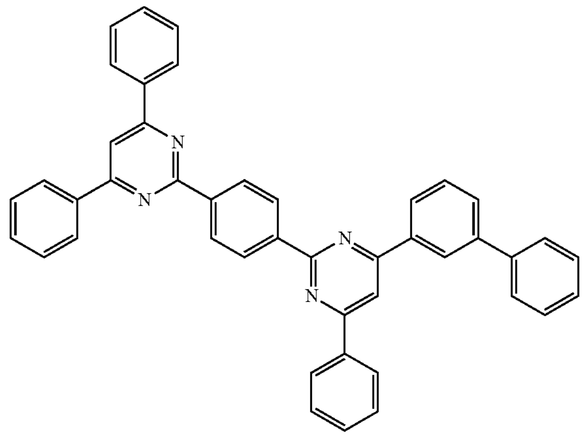
H1-57
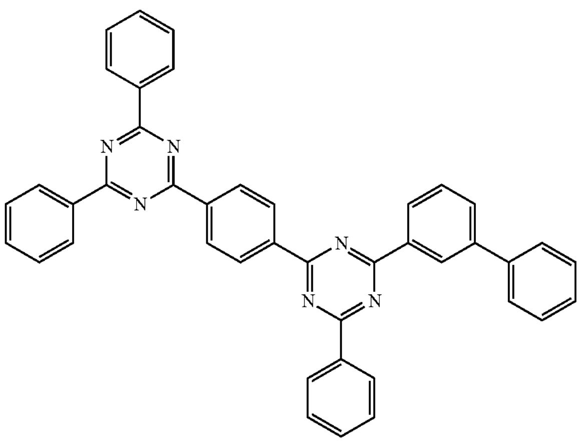
H1-58
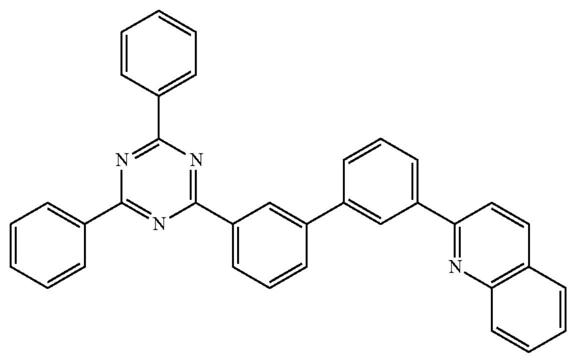
H1-59
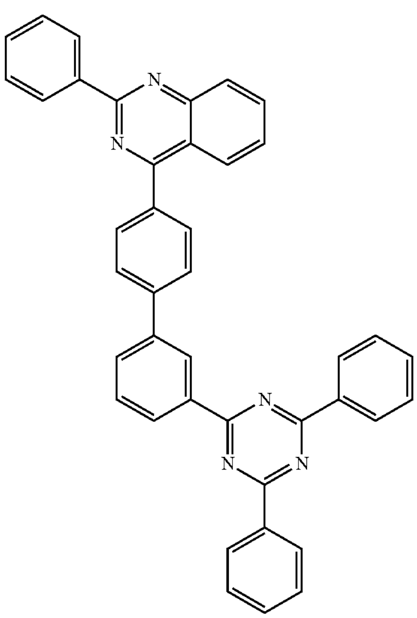
H1-60
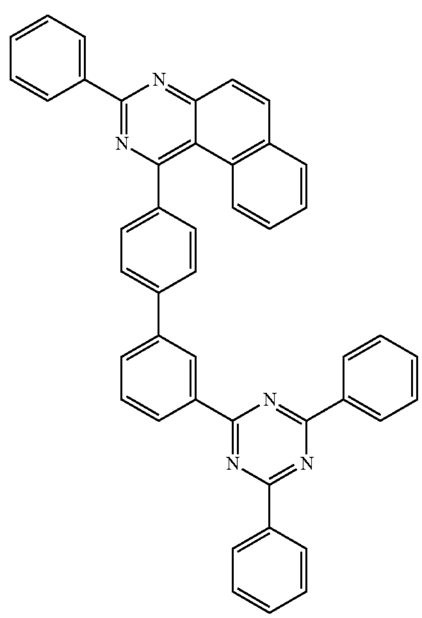

-continued
H1-61
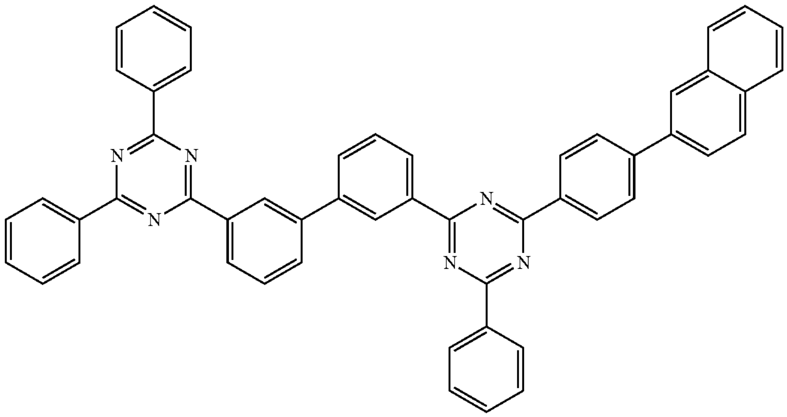
H1-62
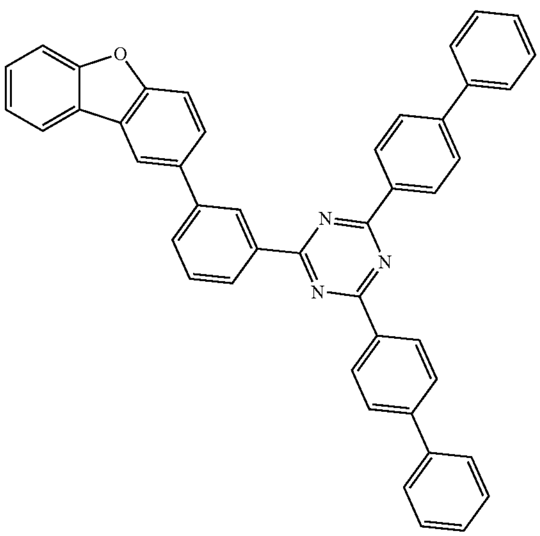
H1-63
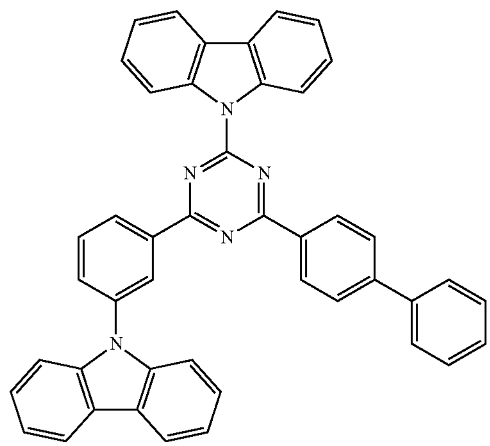
H1-64
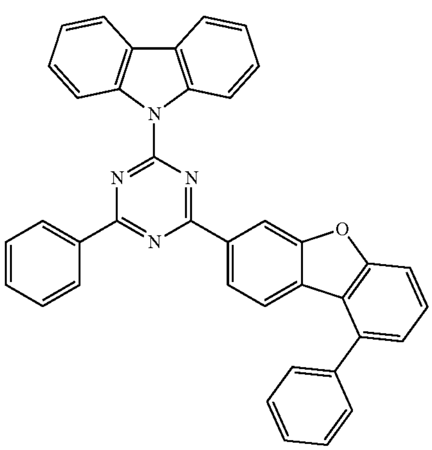
H1-65
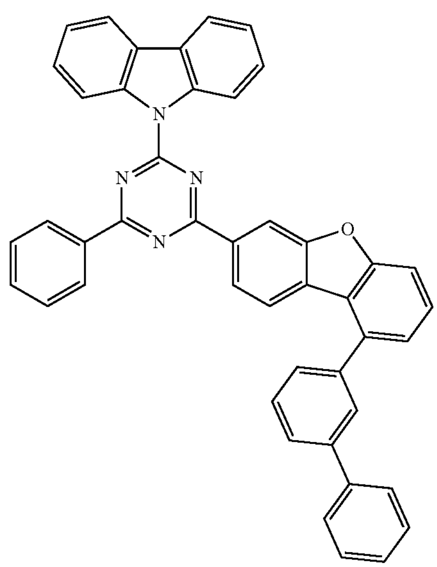

-continued
H1-66
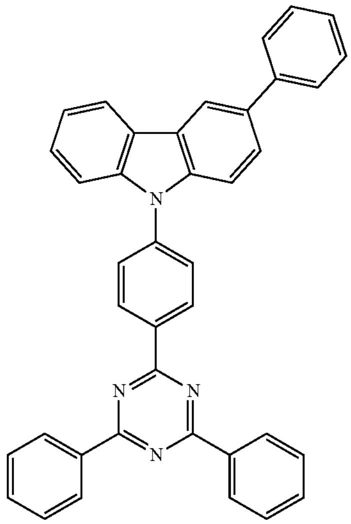
H1-67
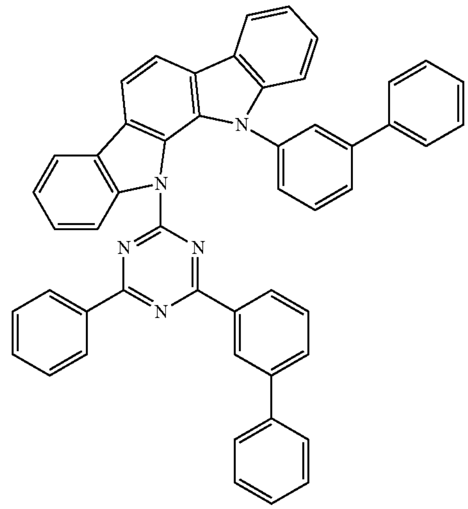
H1-68
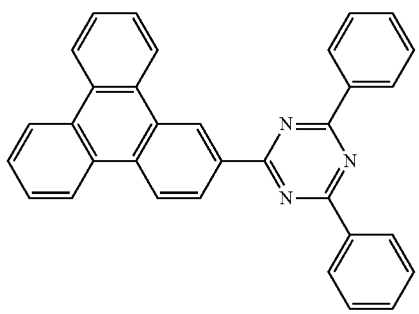
H1-69
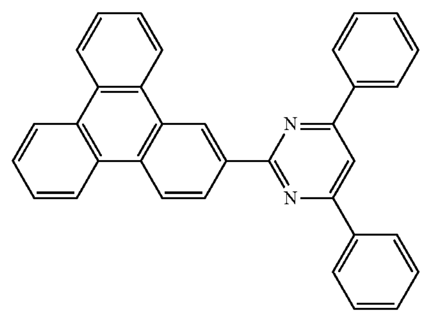
H1-70
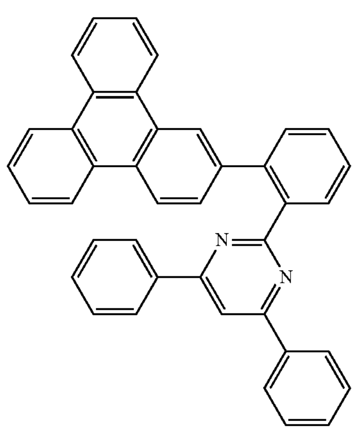
H1-71
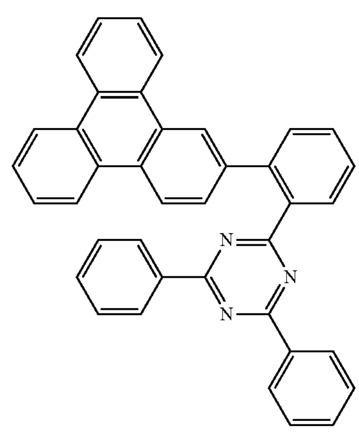

-continued
H1-72
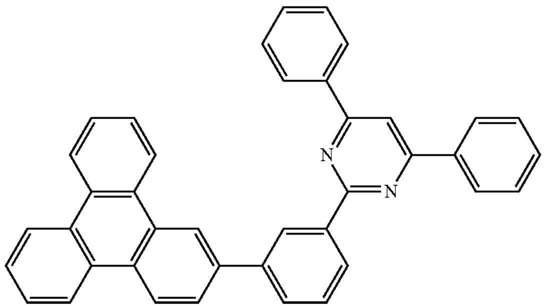
H1-73
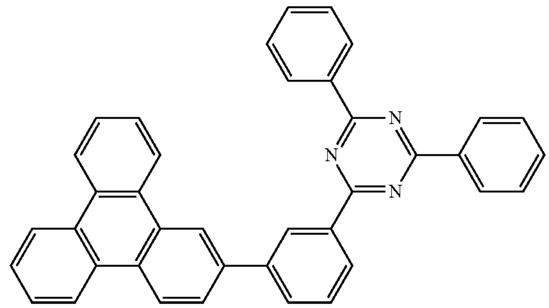
H1-74
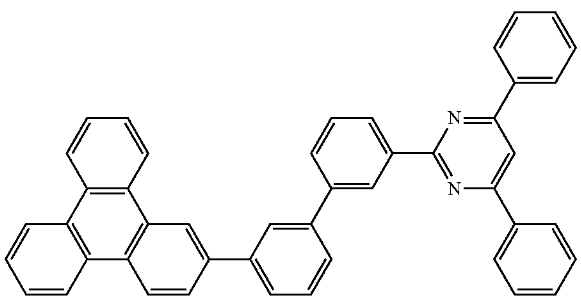
H1-75
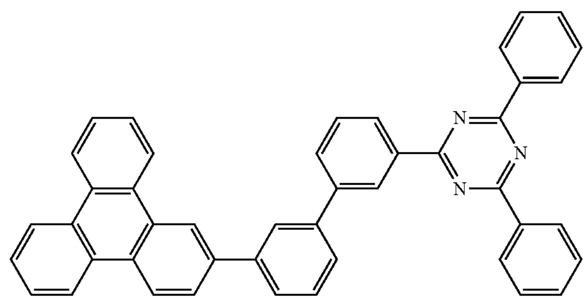
The second compound may be one of Compounds H2-1 to H2-73, but embodiments of the present disclosure are not limited thereto:
H2-1
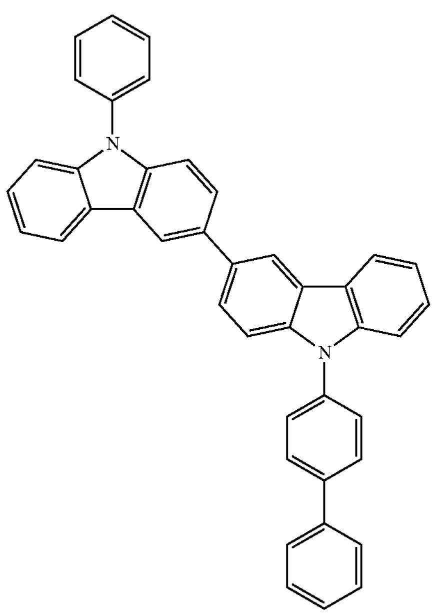
-continued
H2-2
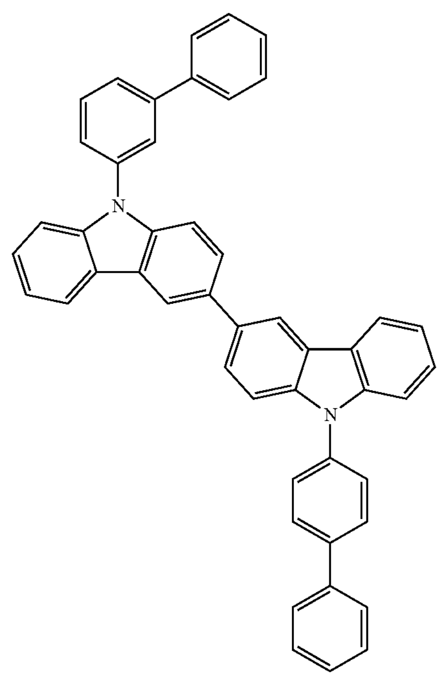

-continued
H2-3
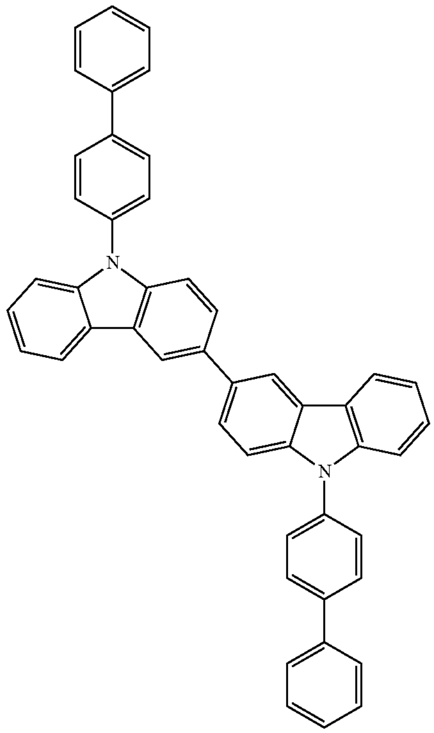
H2-4
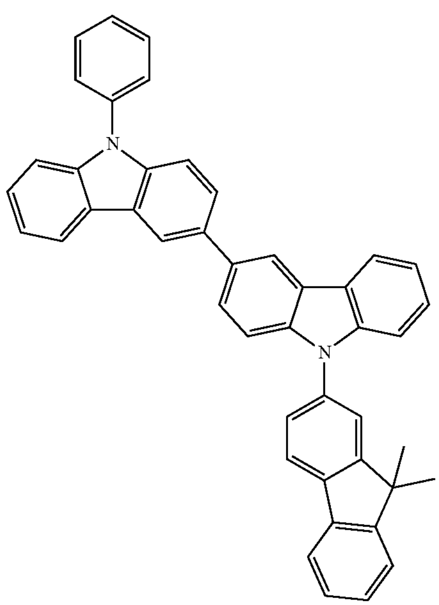
-continued
H2-5
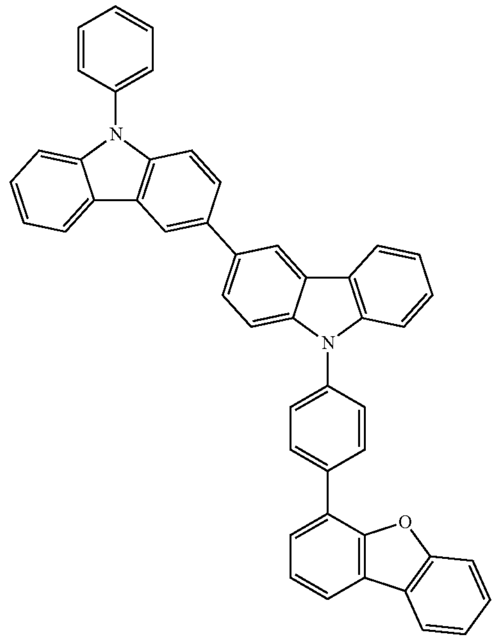
H2-6
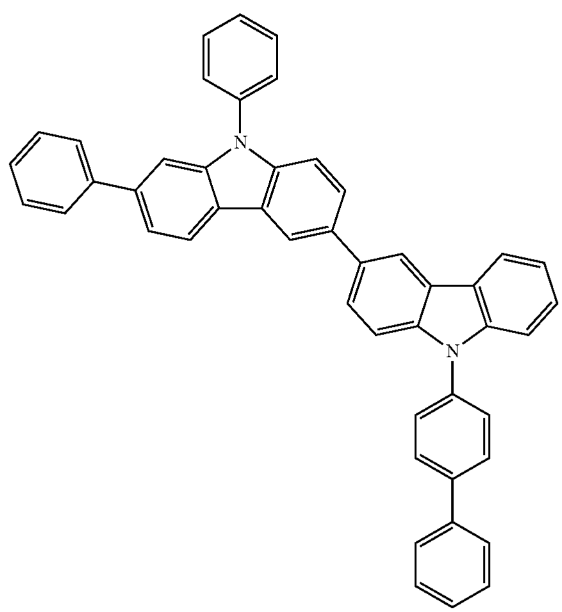

-continued
H2-7
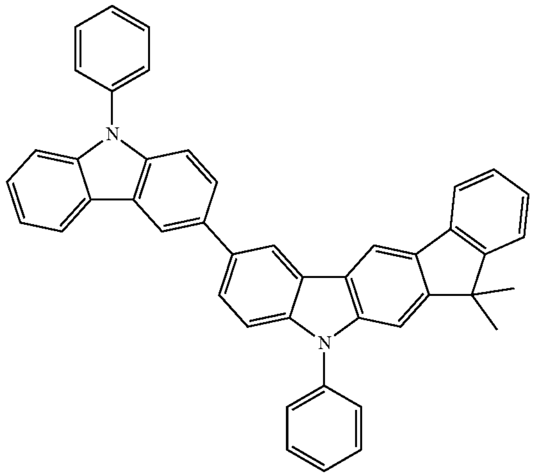
H2-8
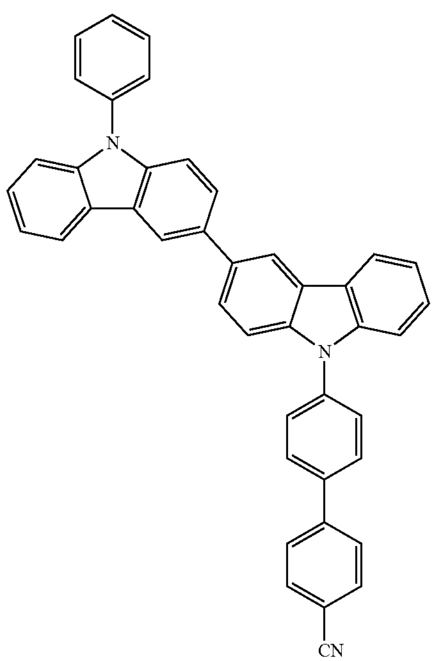
-continued
H2-9
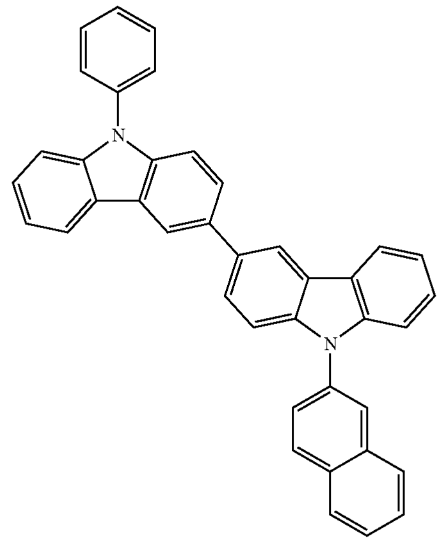
H2-10
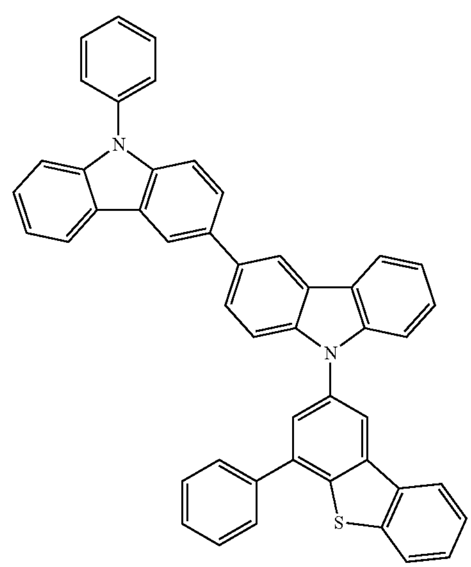

-continued
H2-11
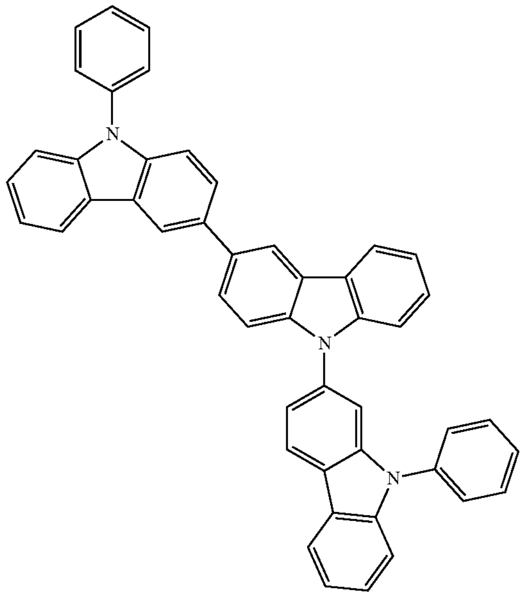
H2-12
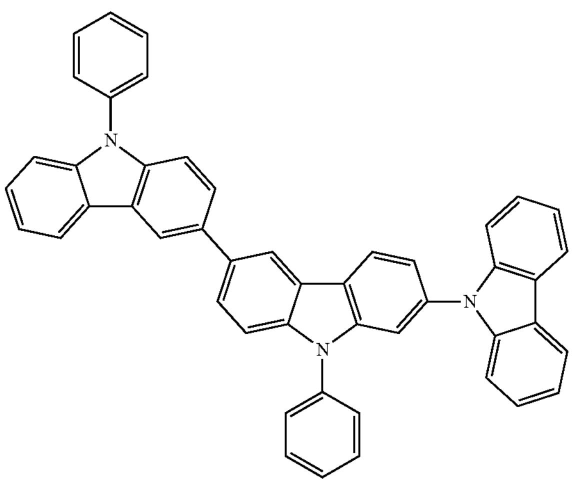
H2-13
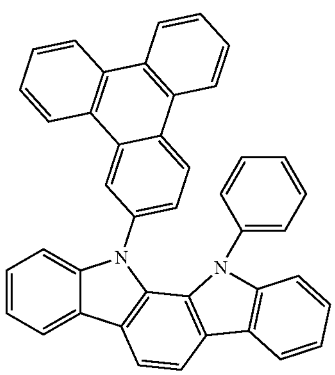
-continued
H2-14
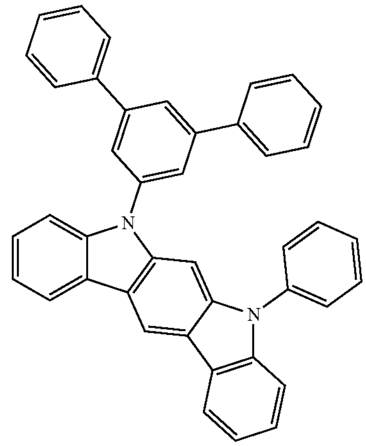
H2-15
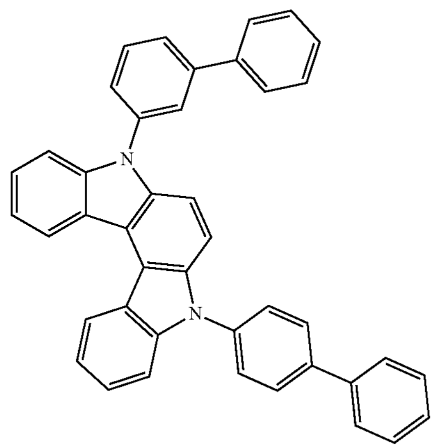
H2-16
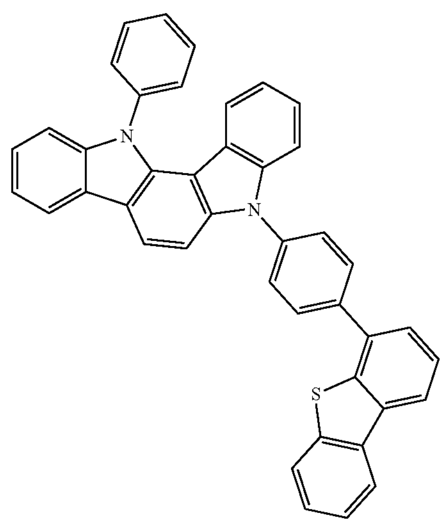

-continued
H2-17
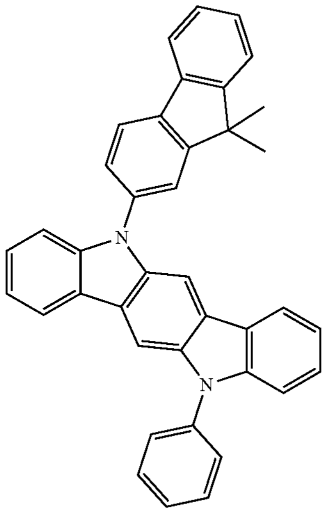
H2-18
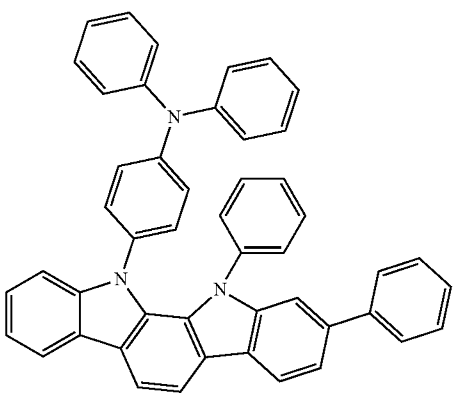
H2-19
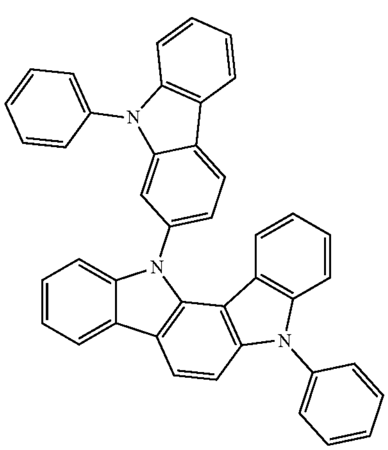
-continued
H2-20
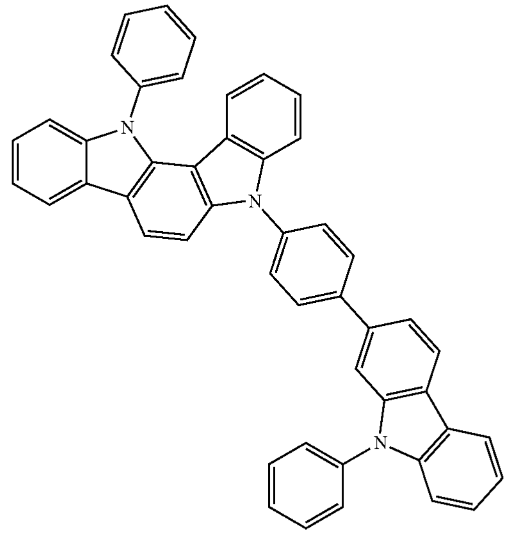
H2-21
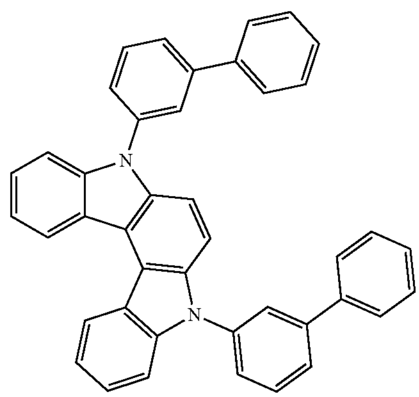
H2-22
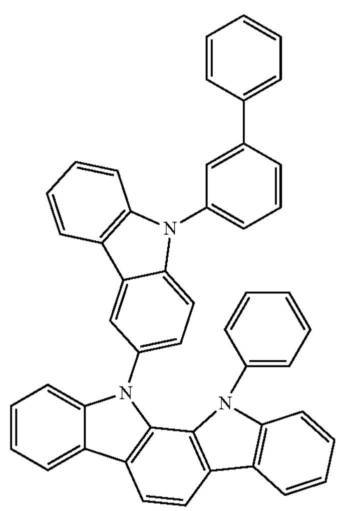

-continued
H2-23
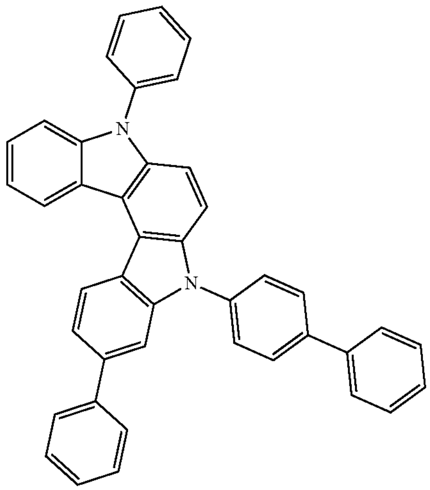
H2-24
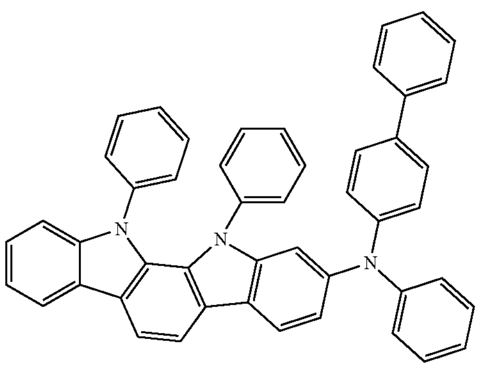
H2-25
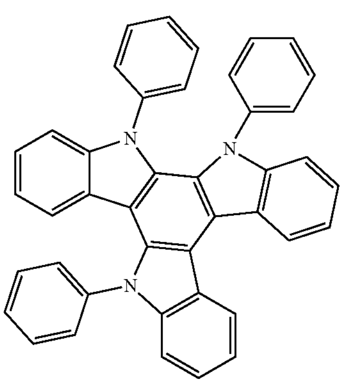
-continued
H2-26
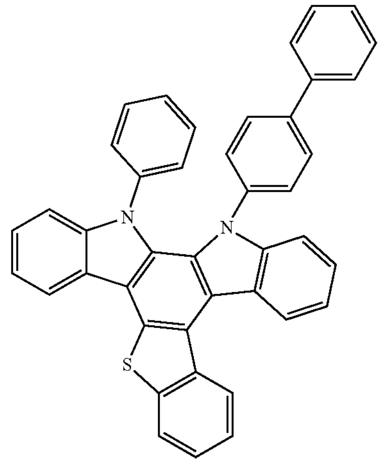
H2-27
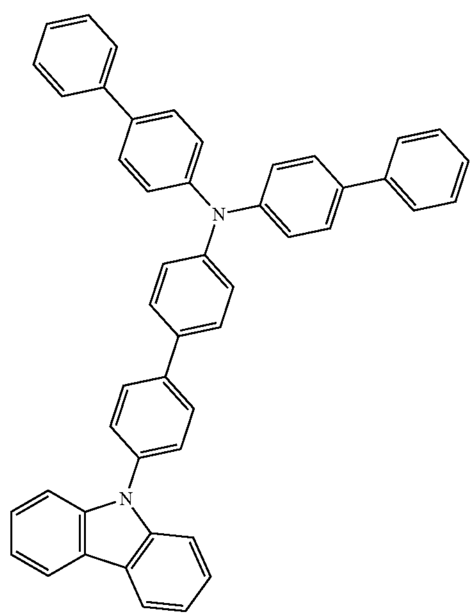

-continued
H2-28
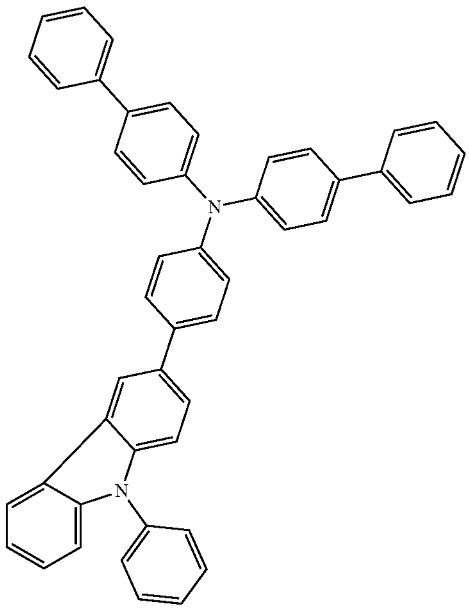
H2-29
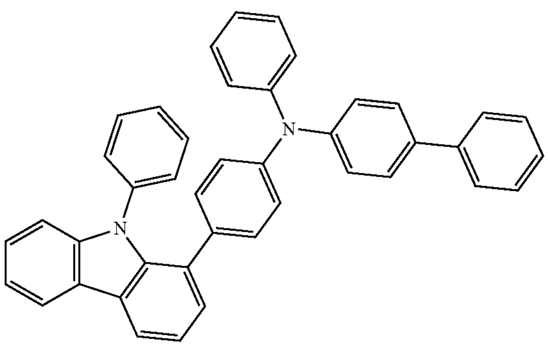
H2-30
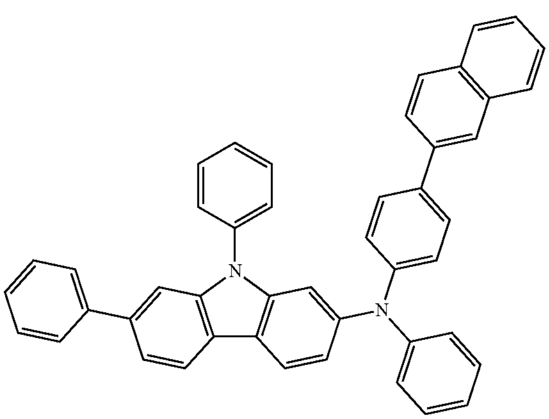
-continued
H2-31
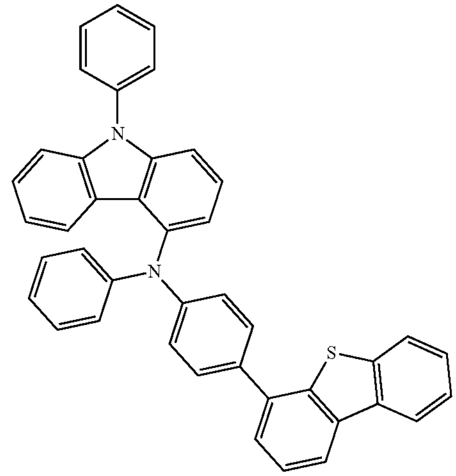
H2-32
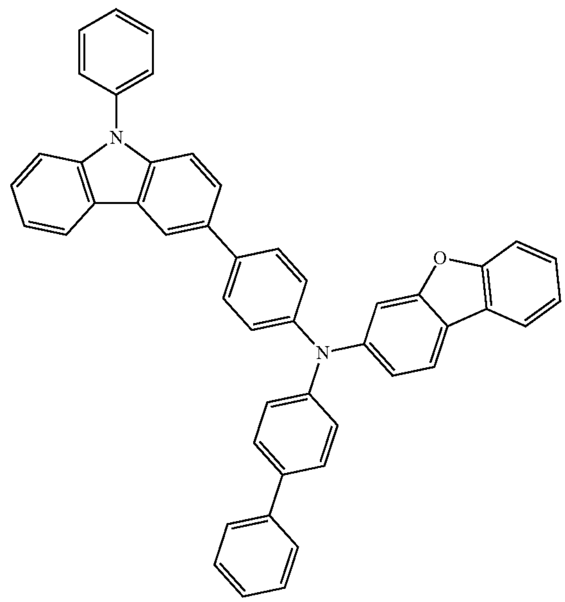
H2-33
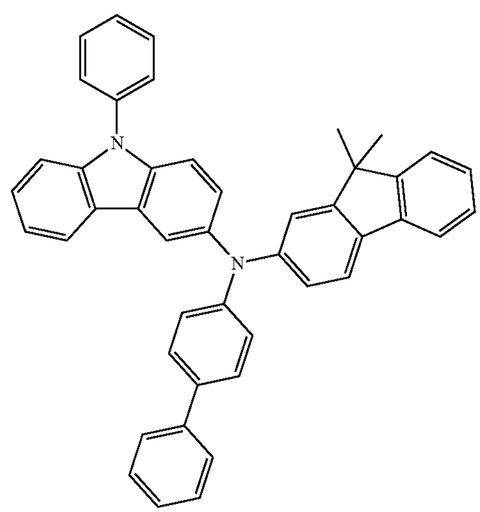

-continued
H2-34
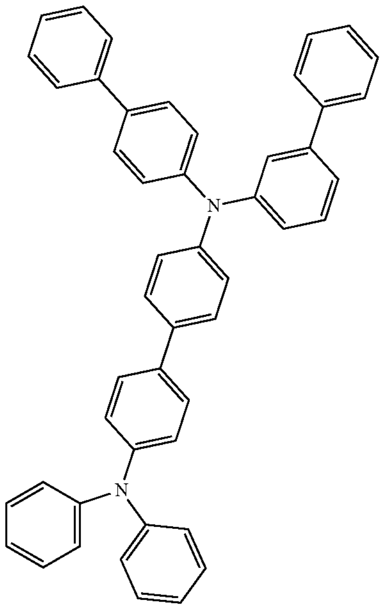
H2-35
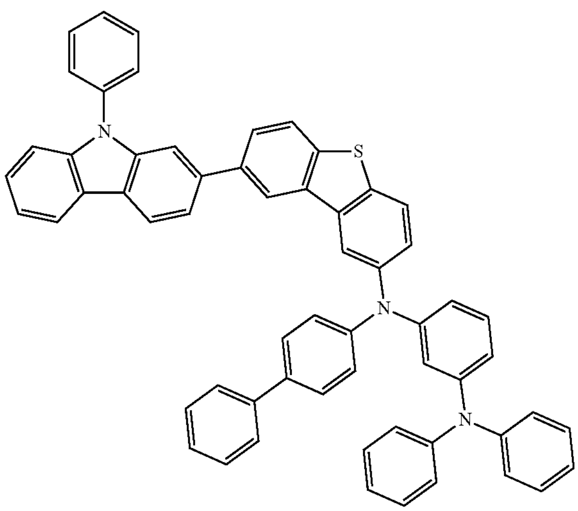
H2-36
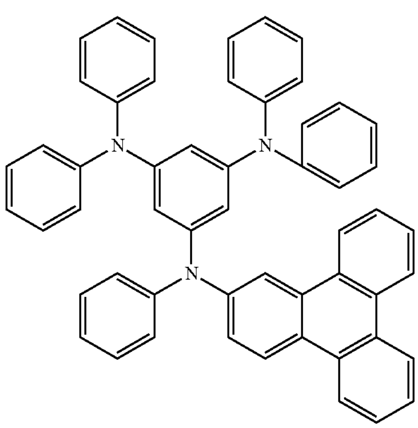
-continued
H2-37
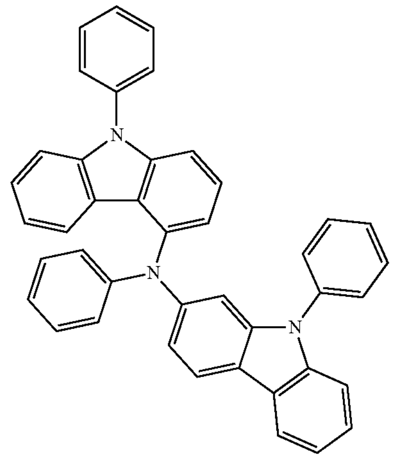
H2-38
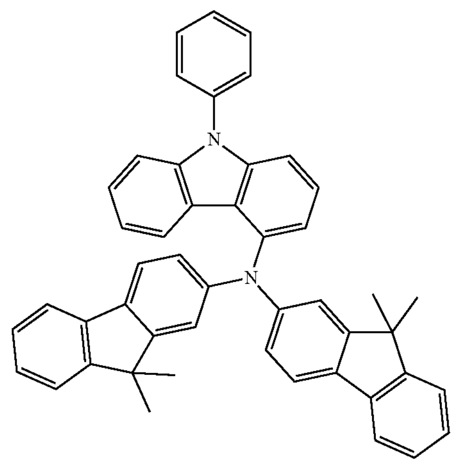
H2-39
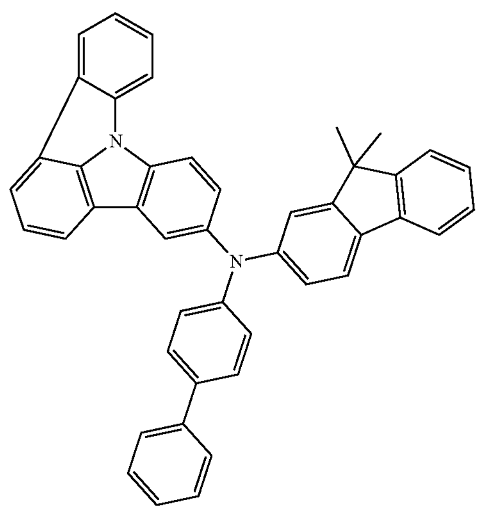

-continued
H2-40
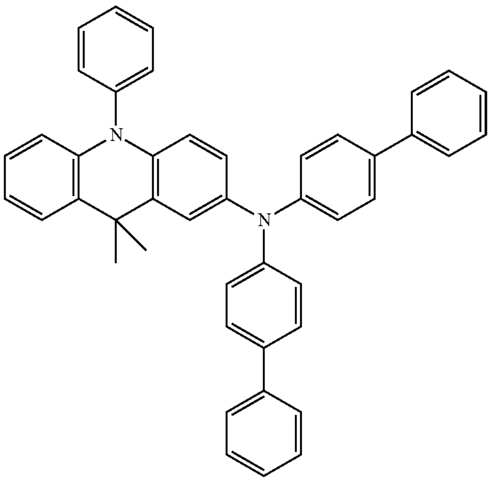
H2-41
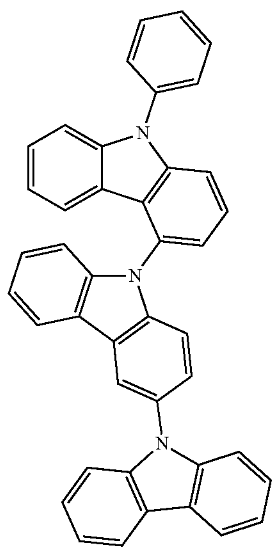
H2-42
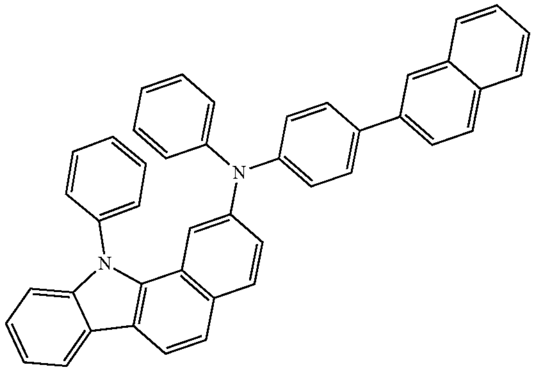
-continued
H2-43
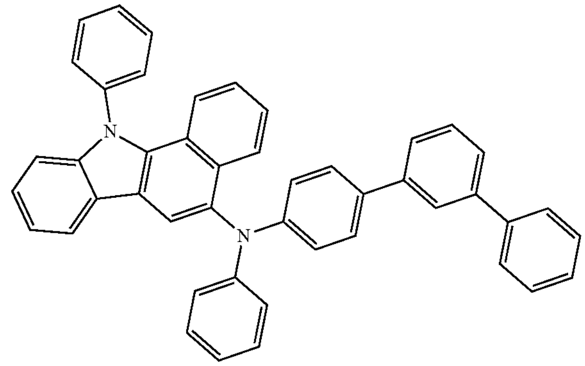
H2-44
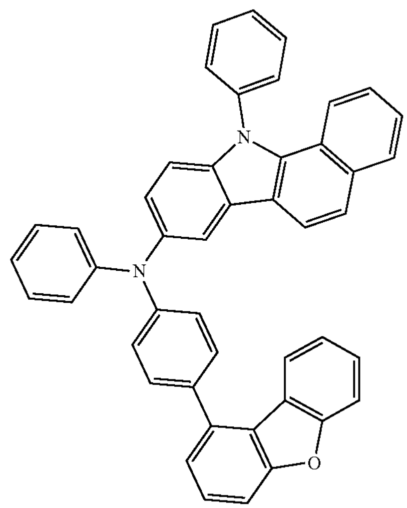
H2-45
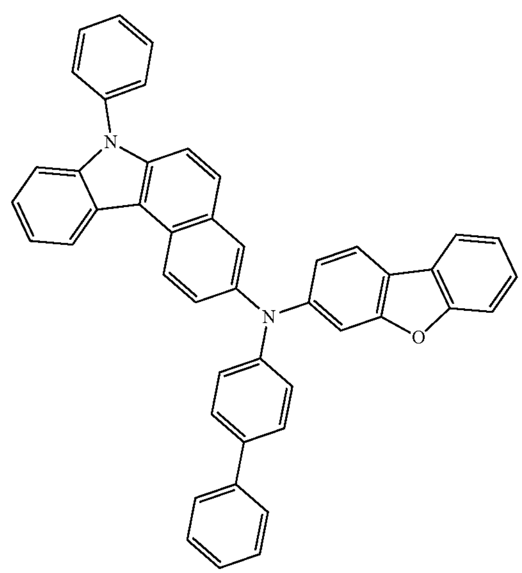

H2-46
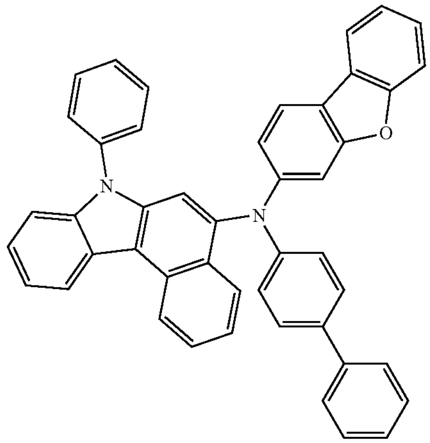
H2-47
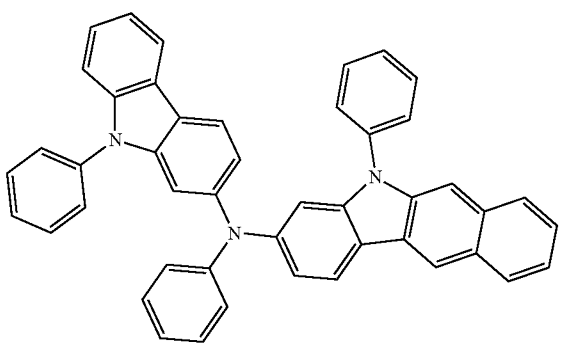
H2-48
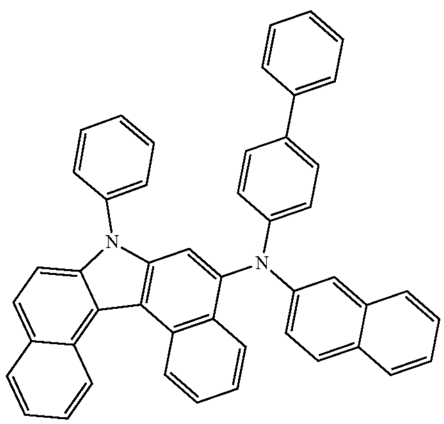
H2-49
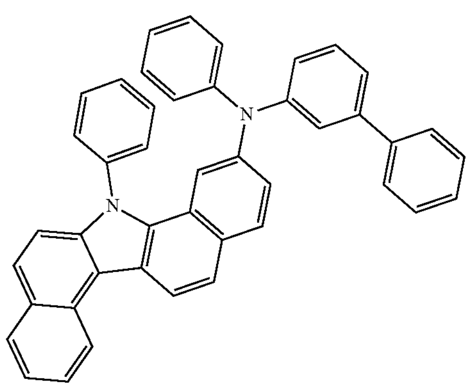
H2-50
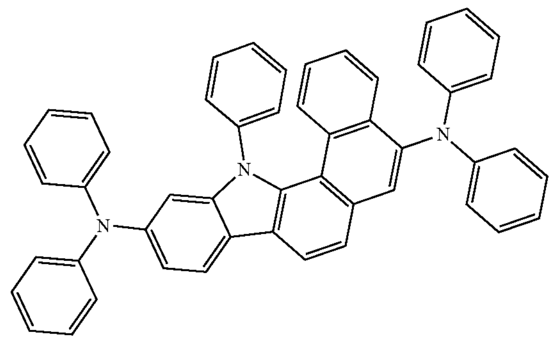
H2-51
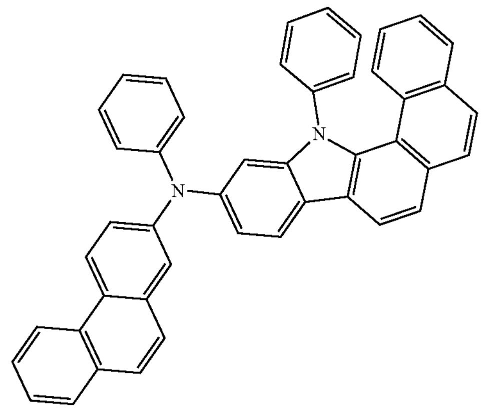
H2-52
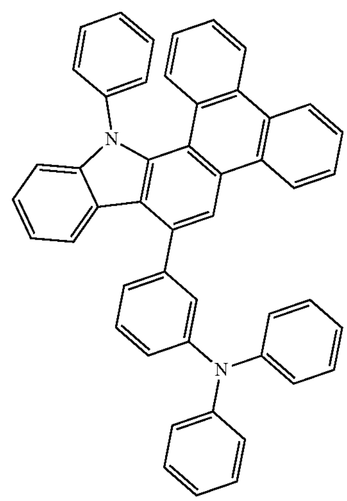
H2-53
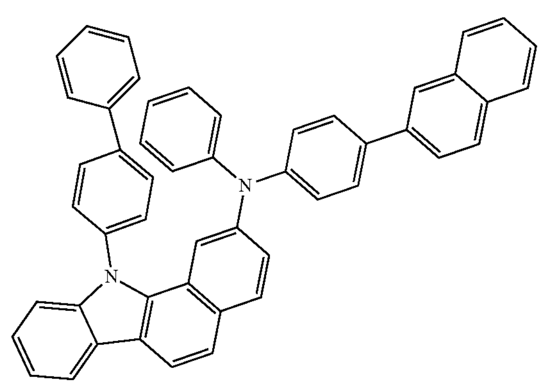

-continued
H2-54
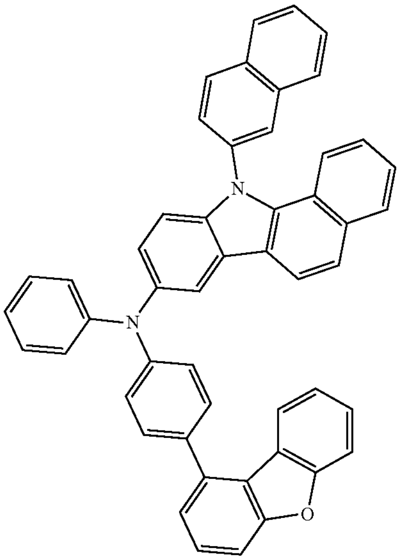
H2-55
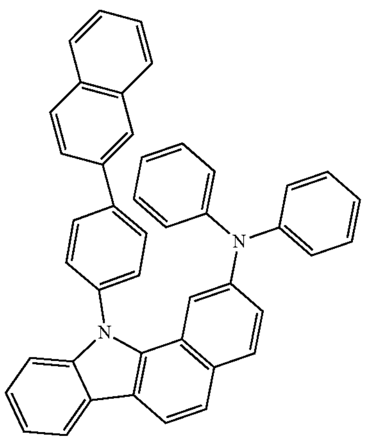
H2-56
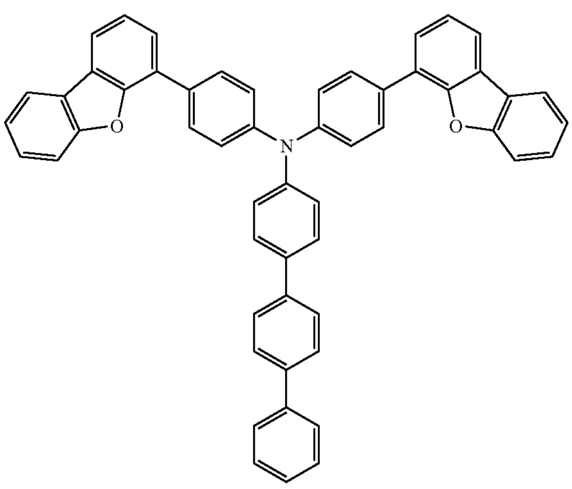
-continued
H2-57
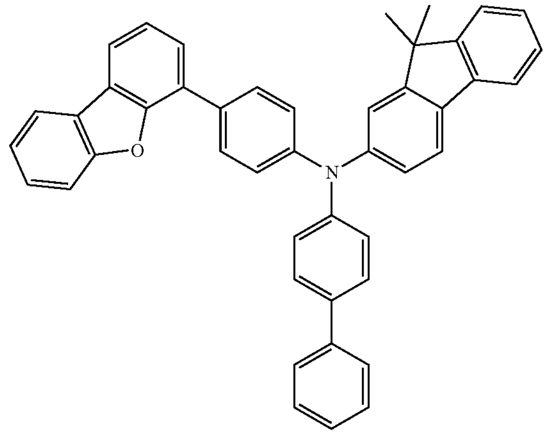
H2-58
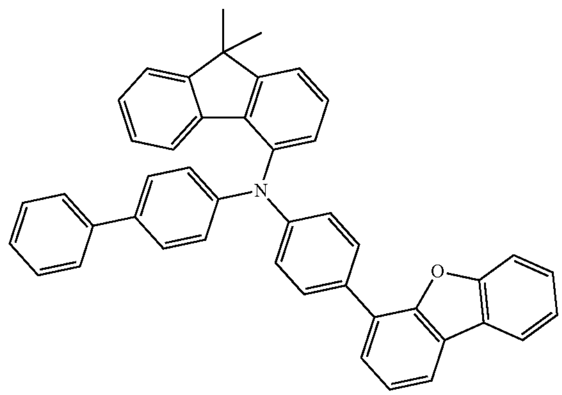
H2-59
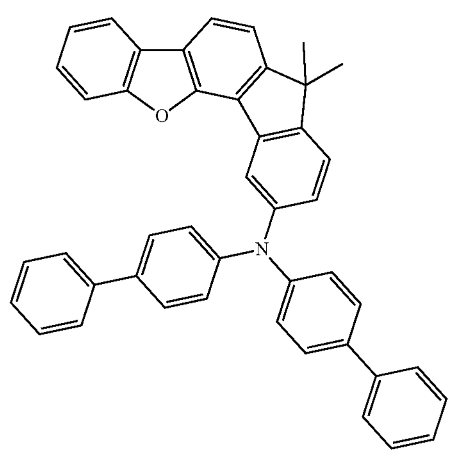

-continued
H2-60
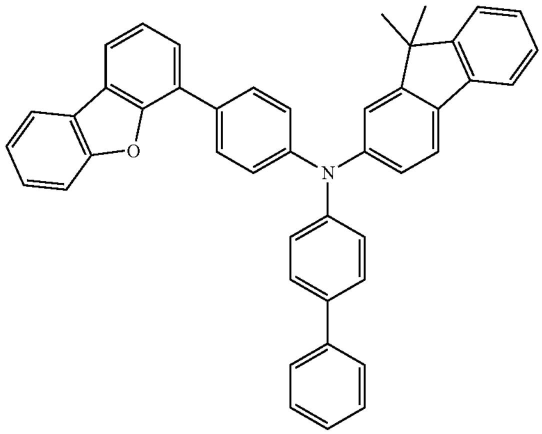
H2-61
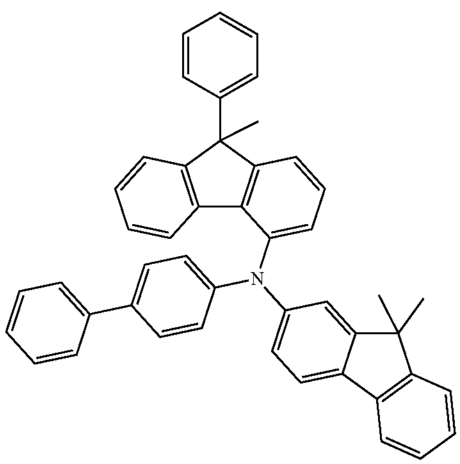
H2-62
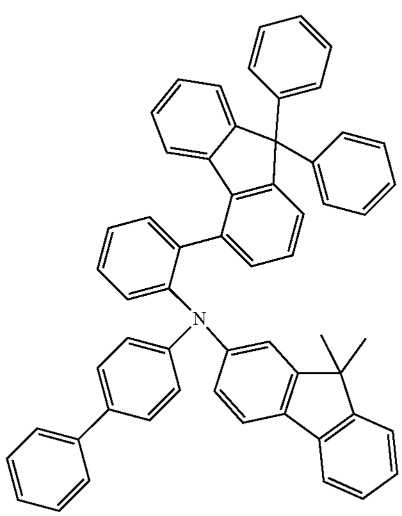
-continued
H2-63
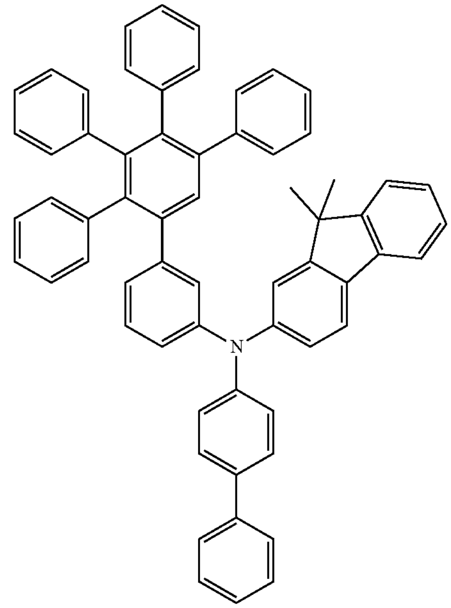
H2-64
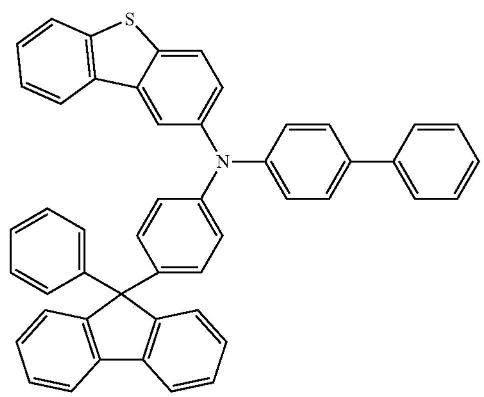
H2-65
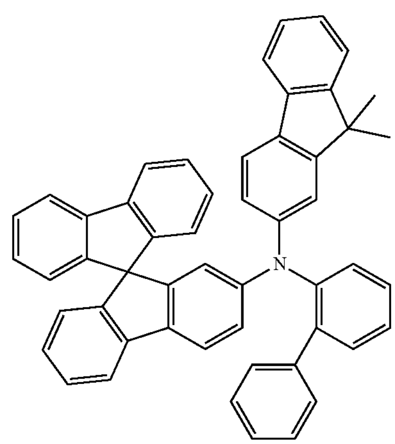

H2-66
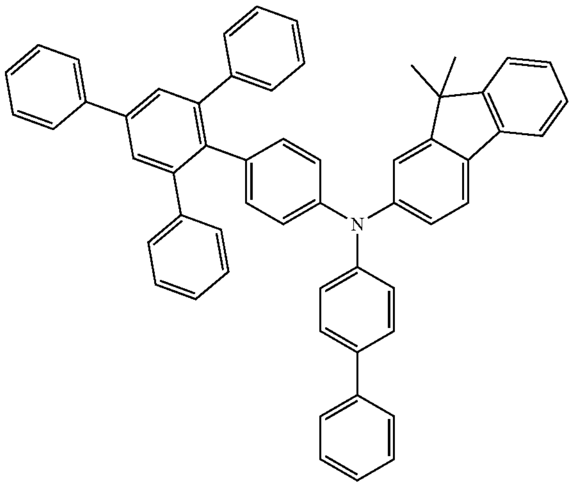
H2-67
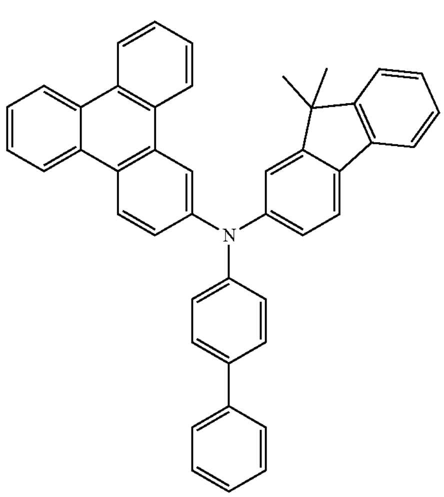
H2-68
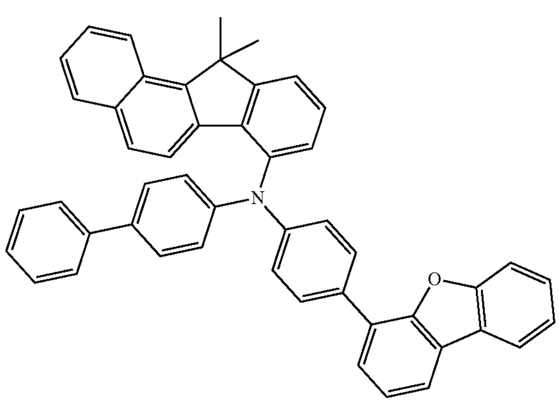
H2-69
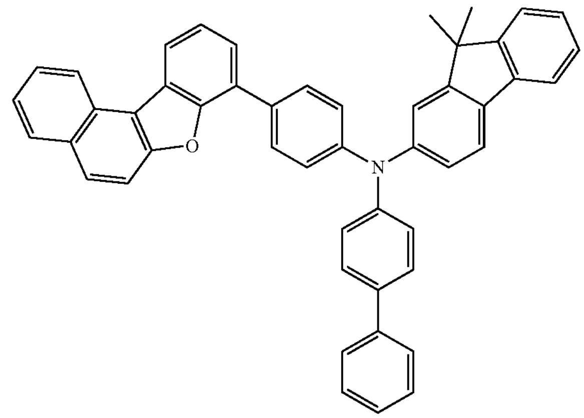
H2-70
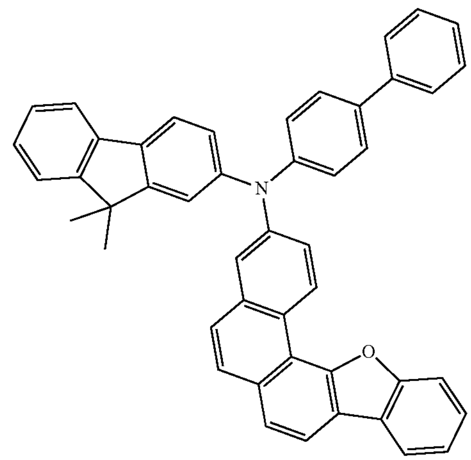
H2-71
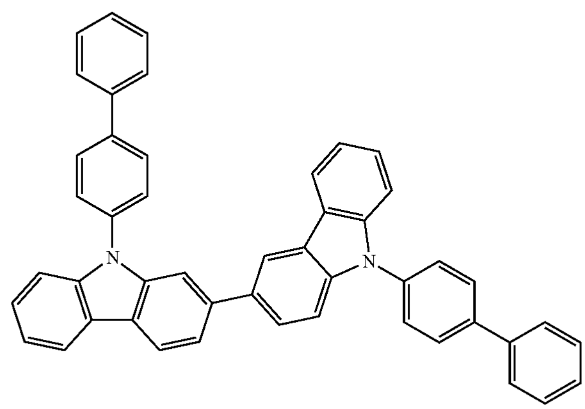
H2-72
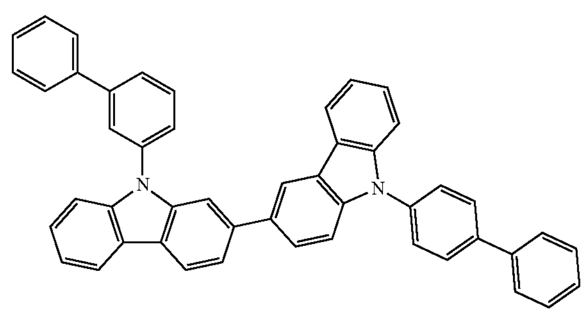

-continued
H2-73
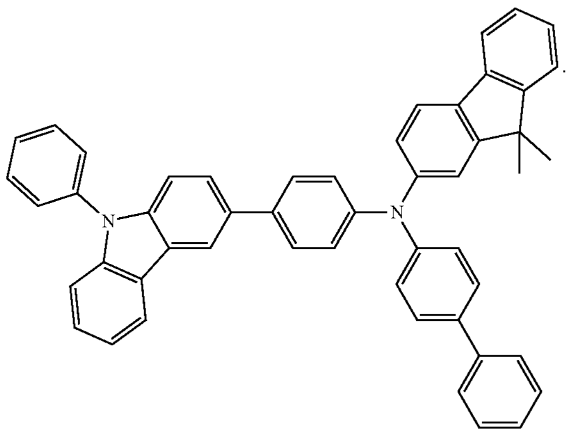
The third compound may be one of Compounds H3-1 to H3-78, but embodiments of the present disclosure are not limited thereto:
H3-1
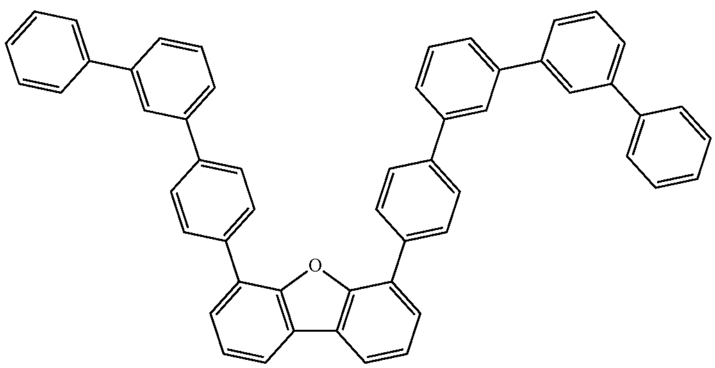
H3-2
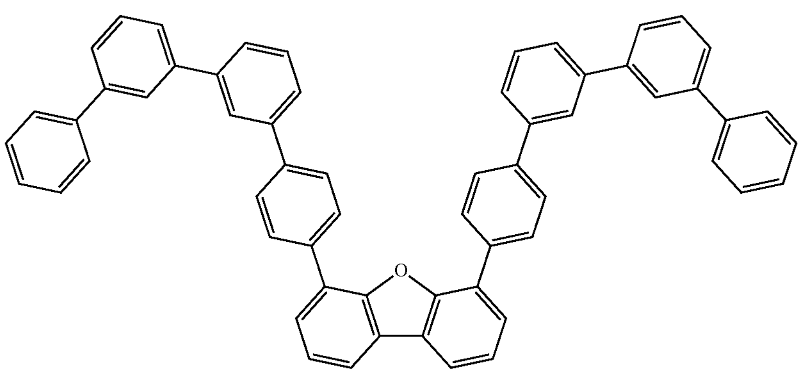

-continued
H3-3
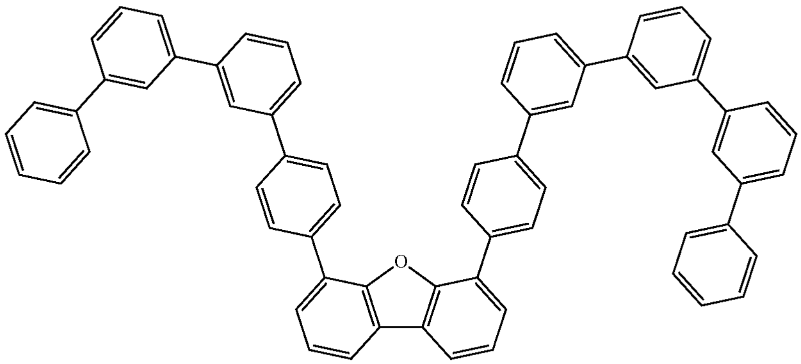
H3-4
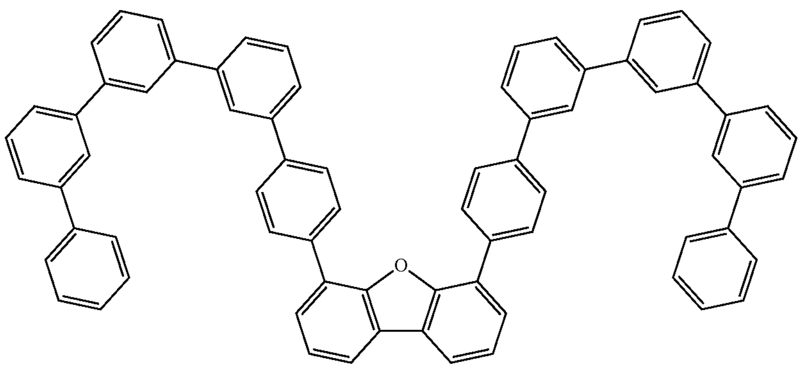
H3-5
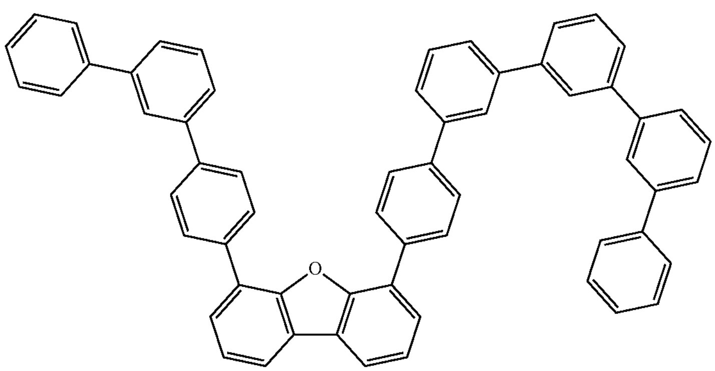
H3-6
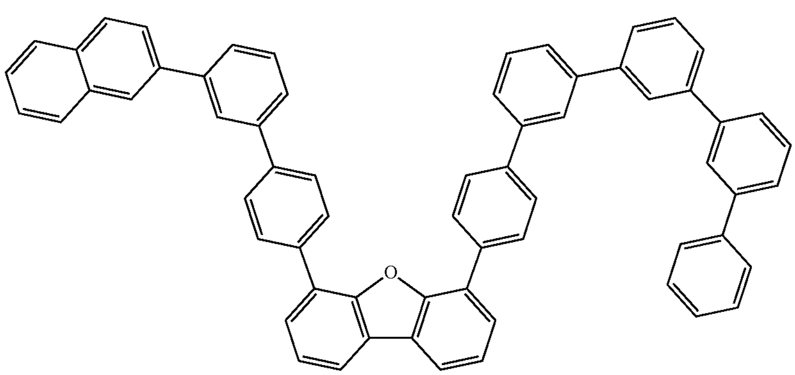

-continued
H3-7
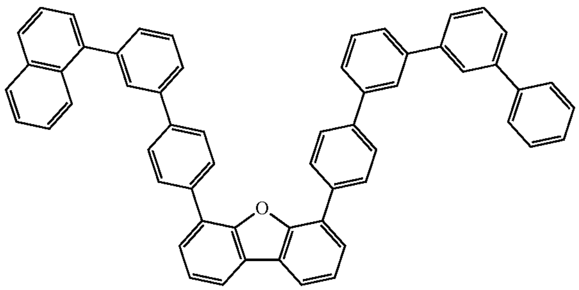
H3-8
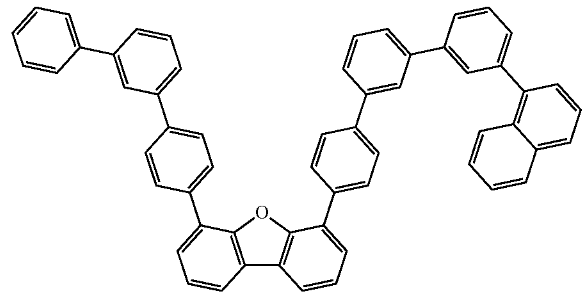
H3-9
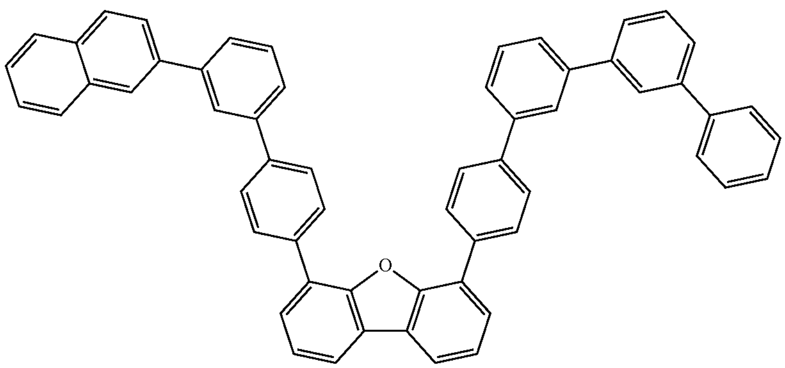
H3-10
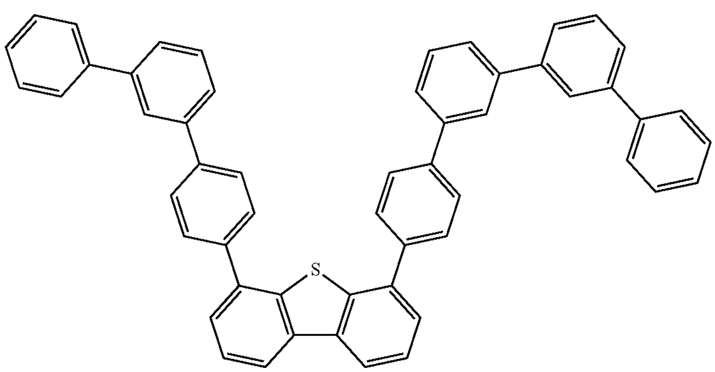
H3-11
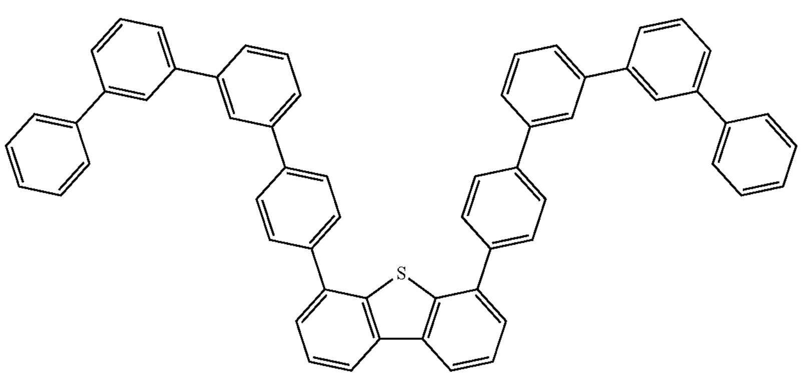

-continued
H3-12
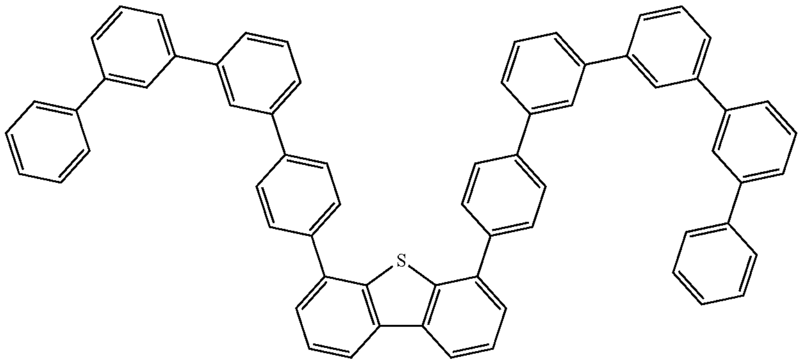
H3-13
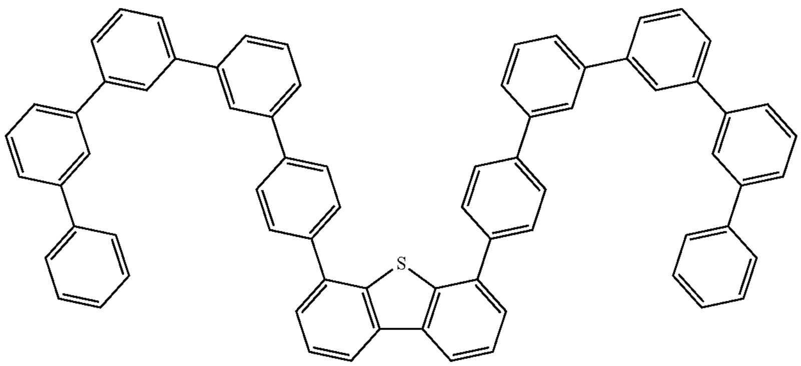
H3-14
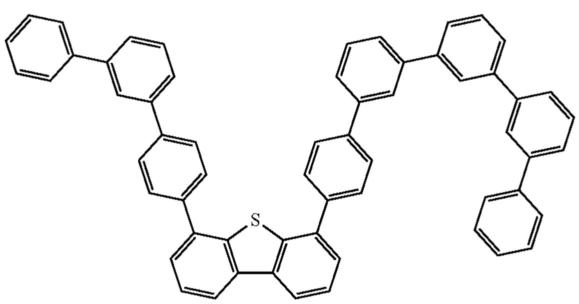
H3-15
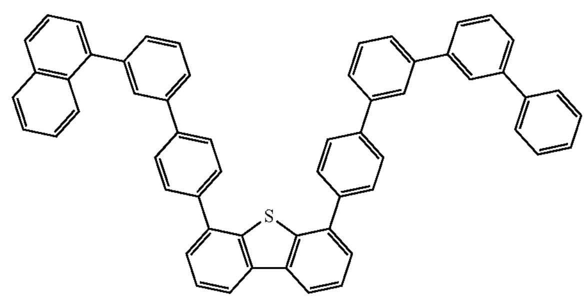
H3-16
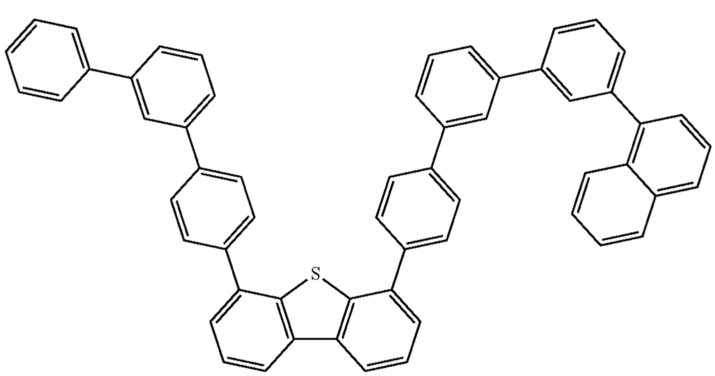

-continued
H3-17
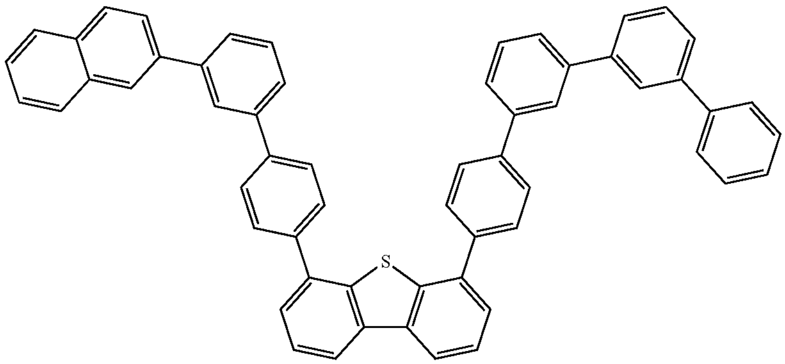
H3-18
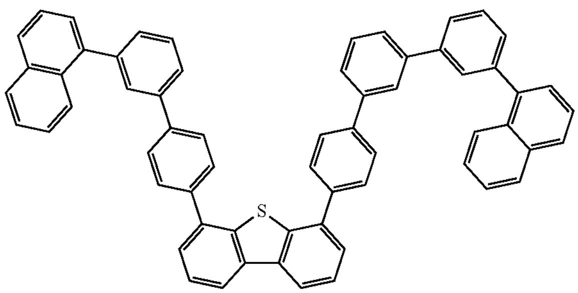
H3-19
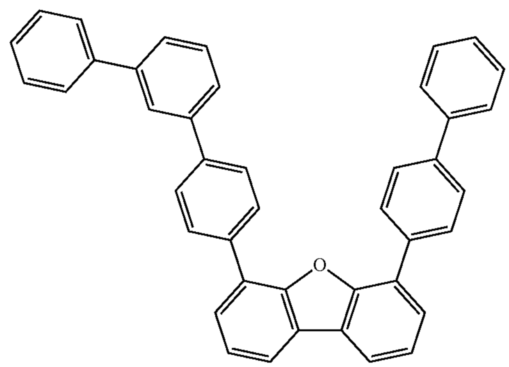
H3-20
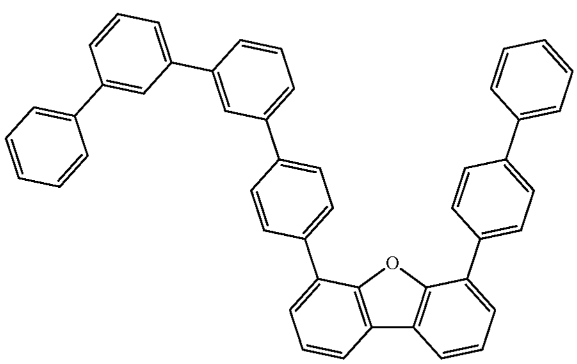
H3-21
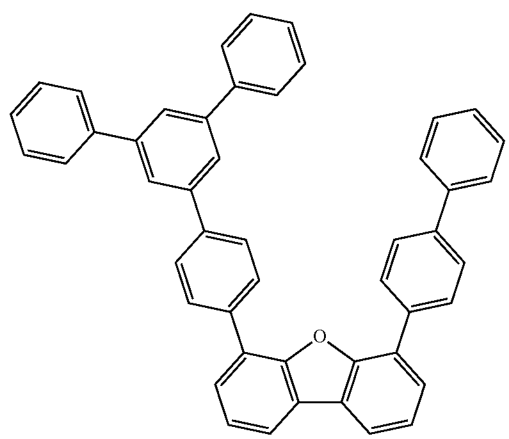
H3-22
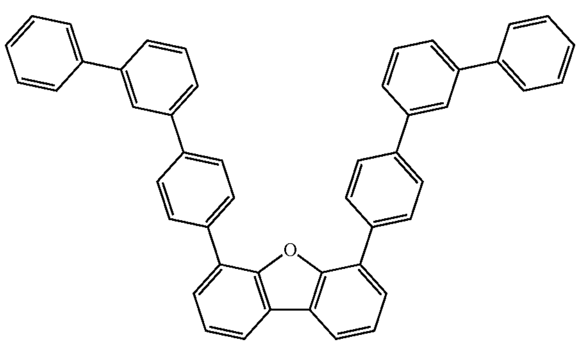
H3-23
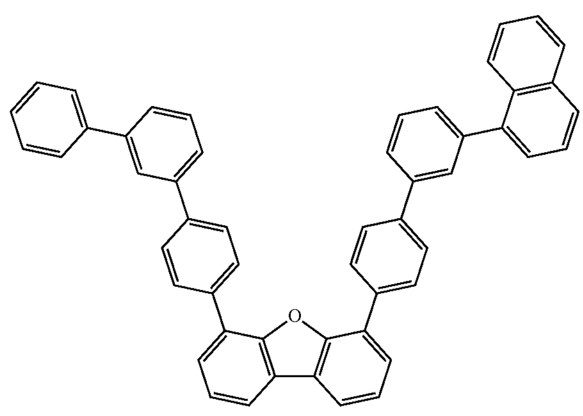

-continued
H3-24
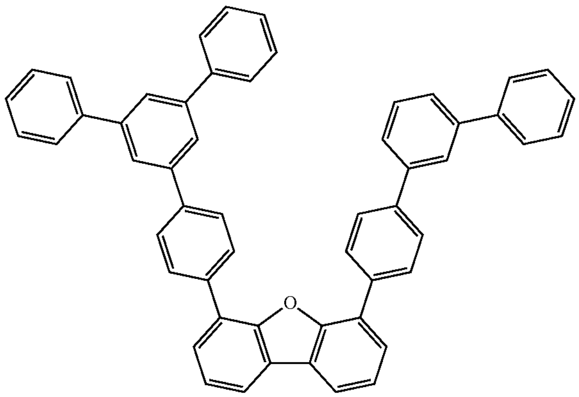
H3-25
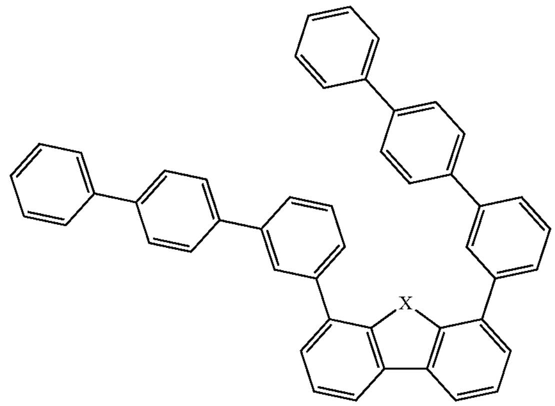
H3-26
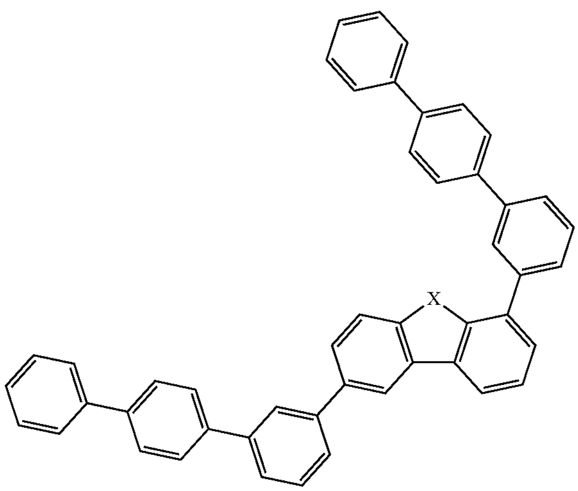
H3-27
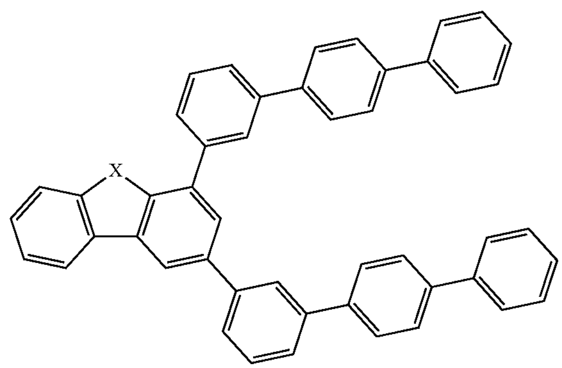
H3-28
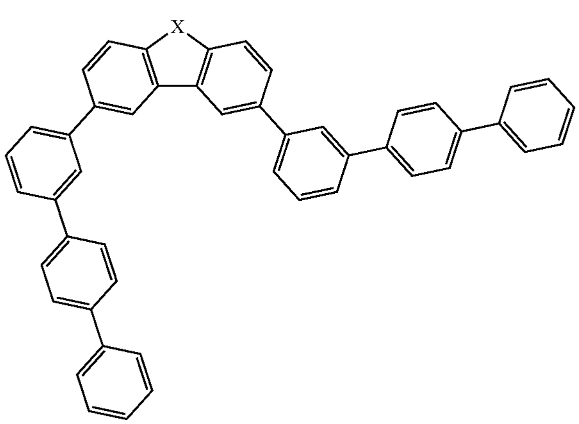
H3-29
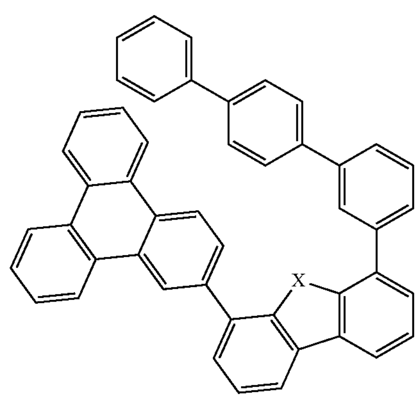

-continued
H3-30
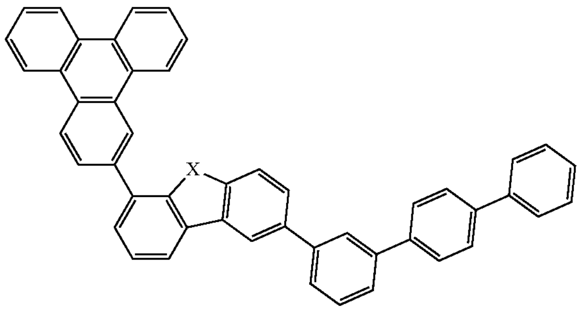
H3-31
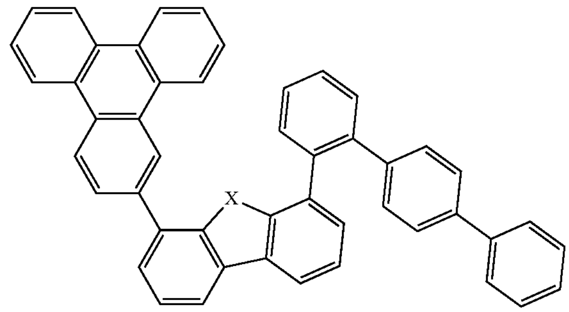
H3-32
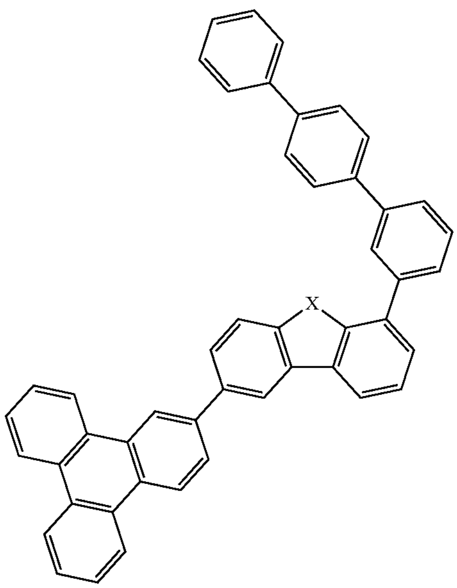
H3-33
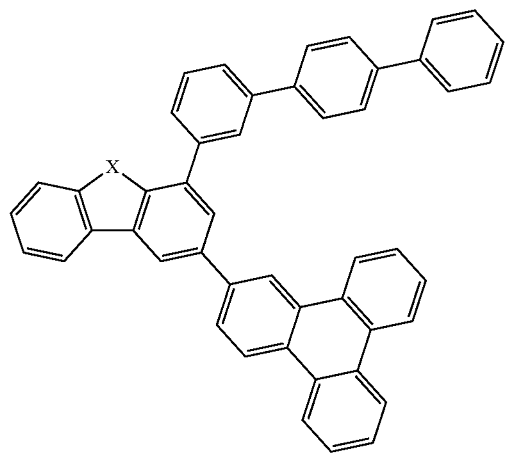
H3-34
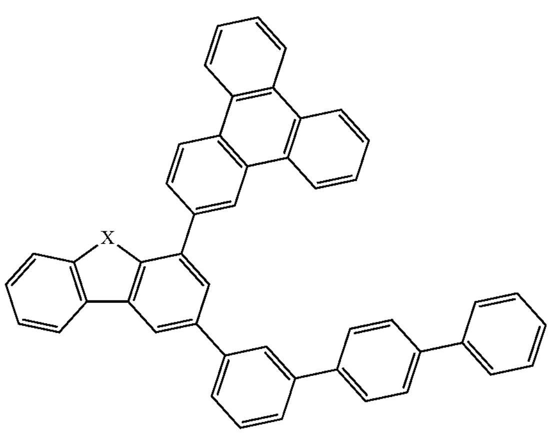
H3-35
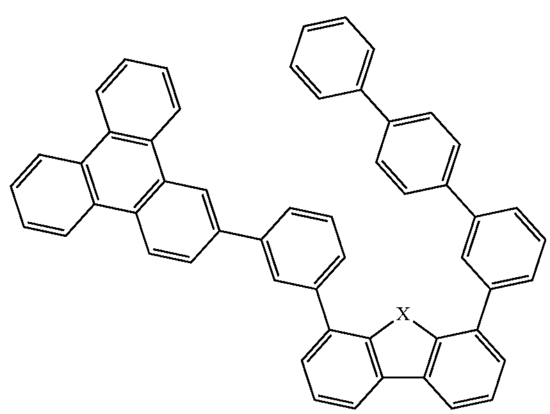

-continued
H3-36
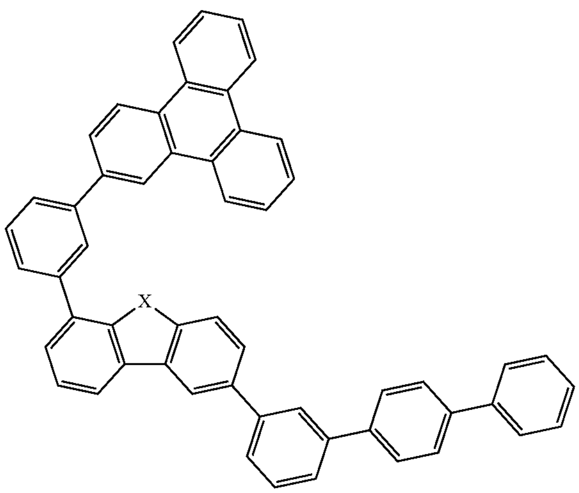
H3-37
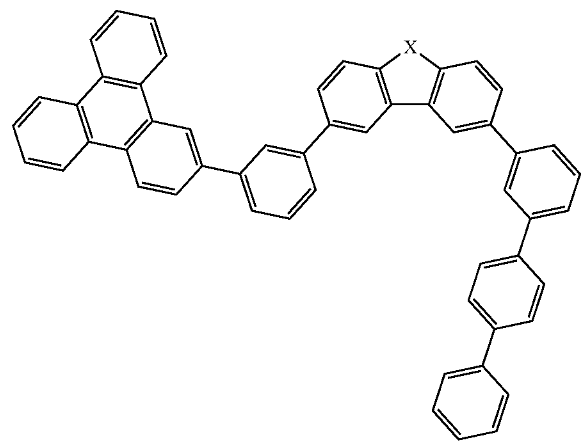
H3-38
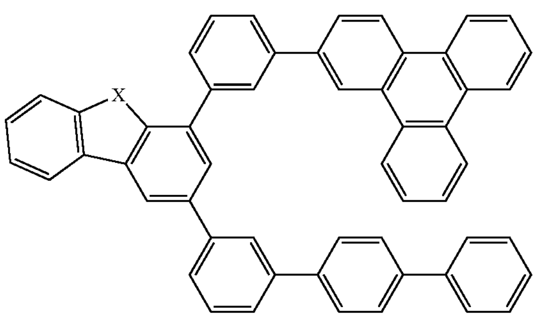
H3-39
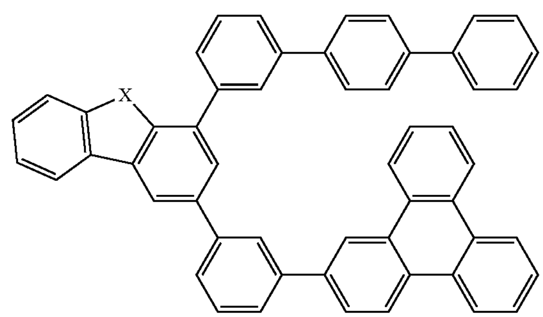
H3-40
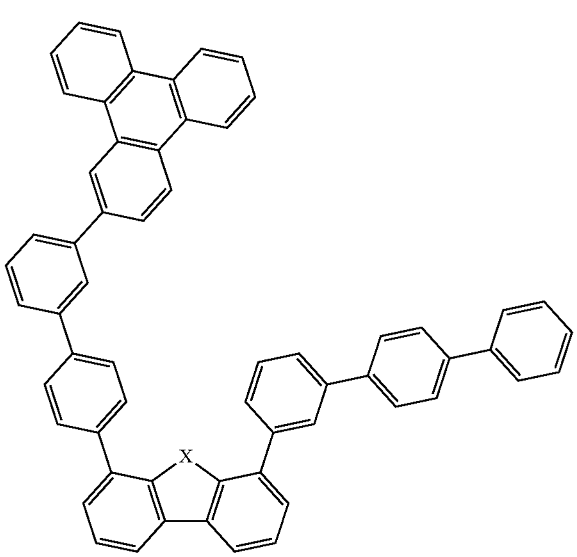
H3-41
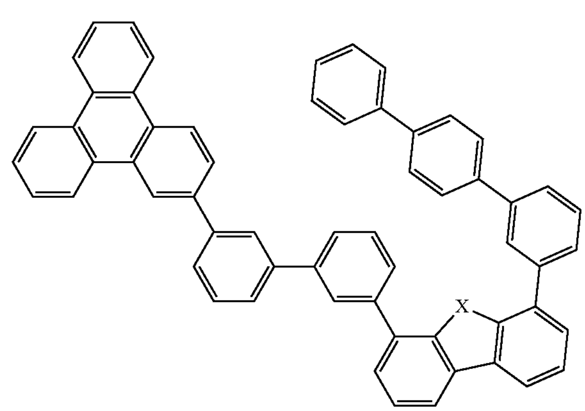

-continued
H3-42
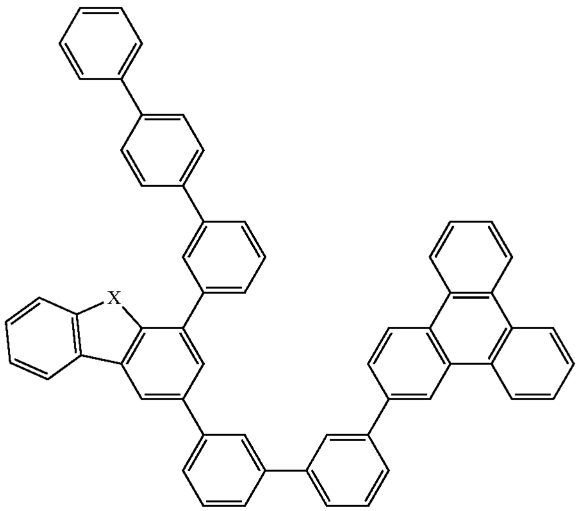
H3-43
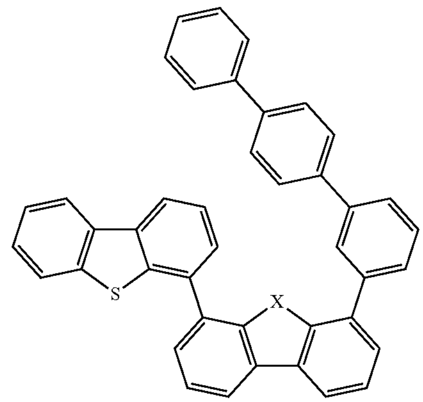
H3-44
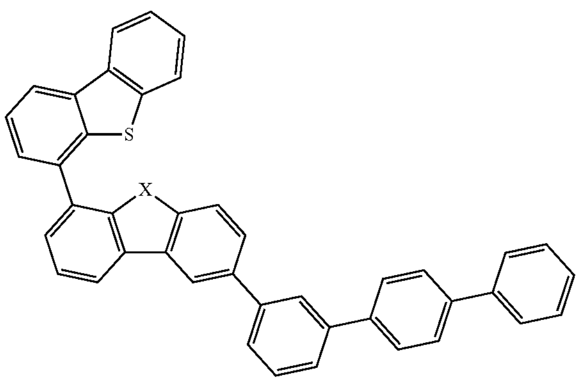
H3-45
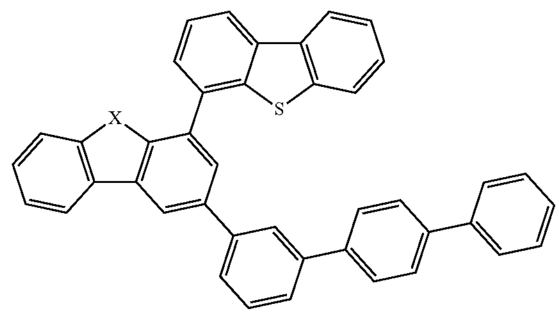
H3-46
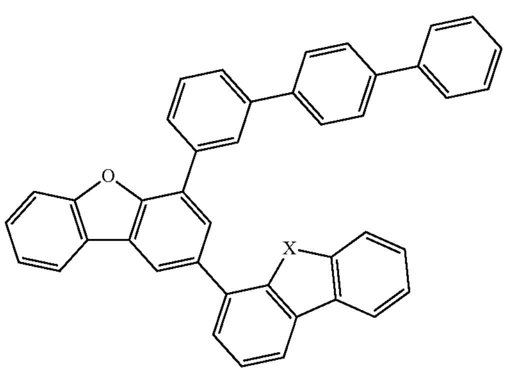
H3-47
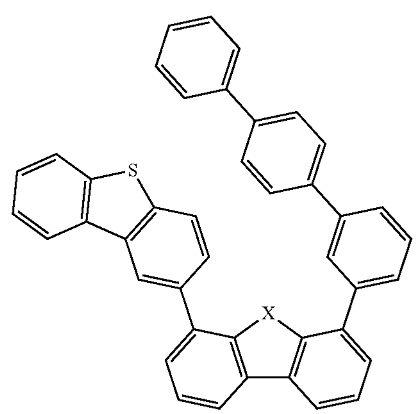

-continued
H3-48
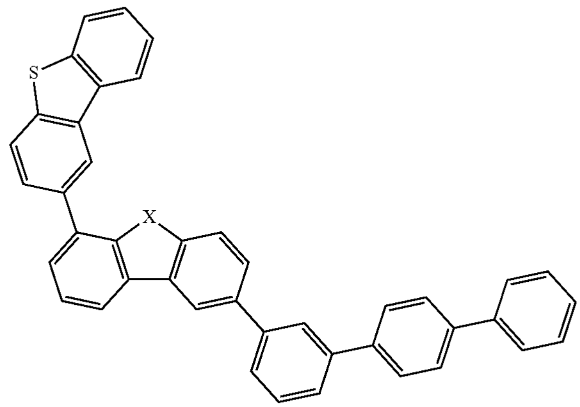
H3-49
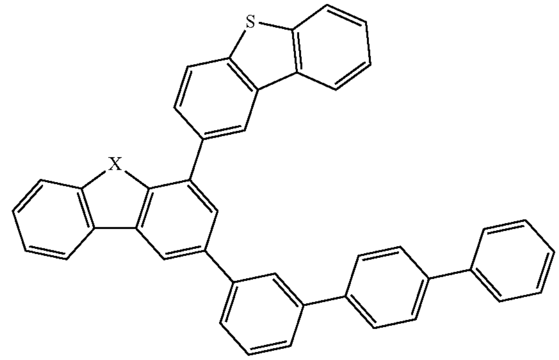
H3-50
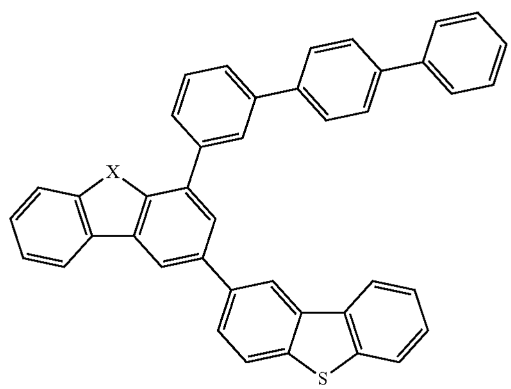
H3-51
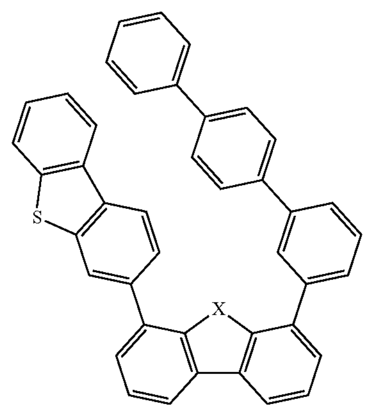
H3-52
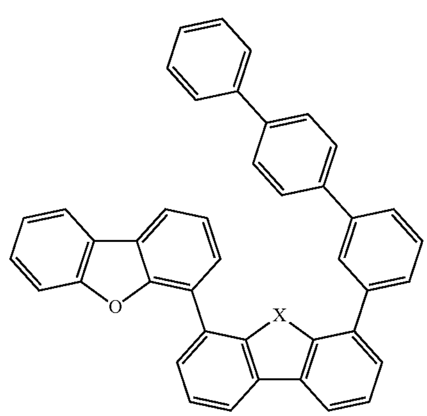
H3-53
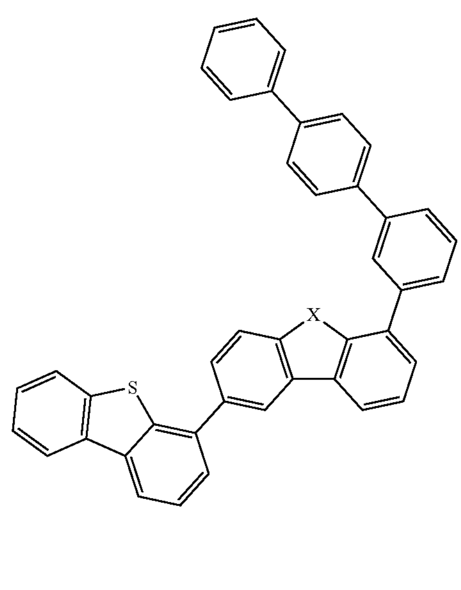

-continued
H3-54
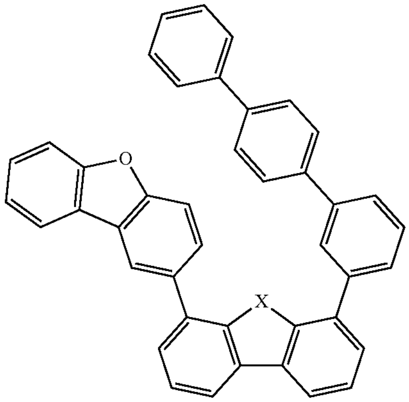
H3-55
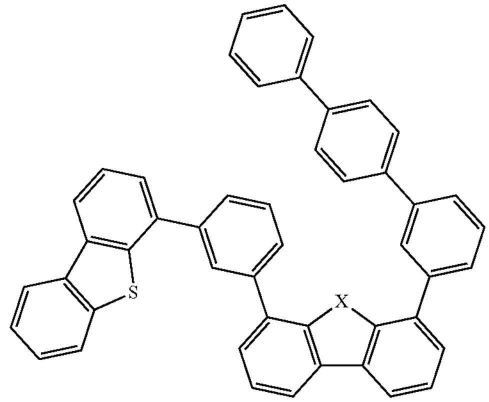
H3-56
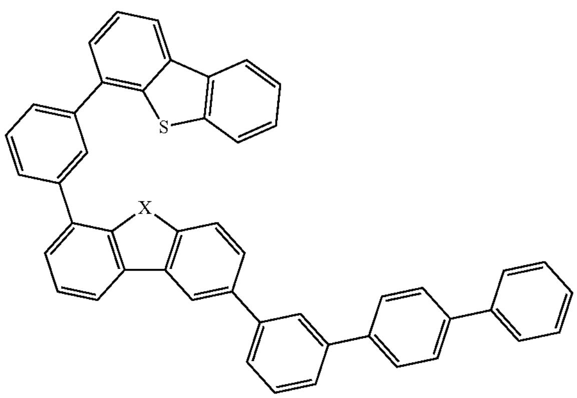
H3-57
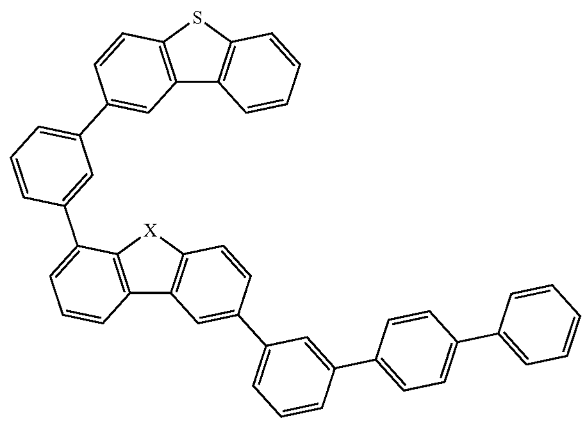
H3-58
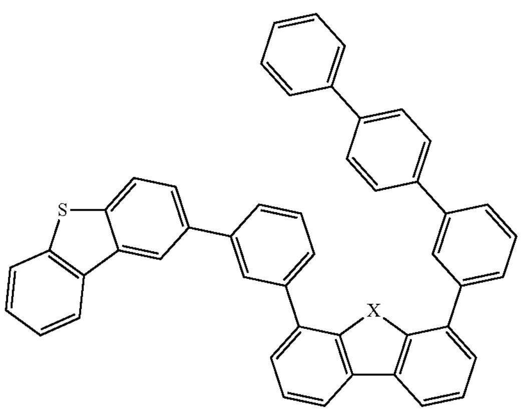
H3-59
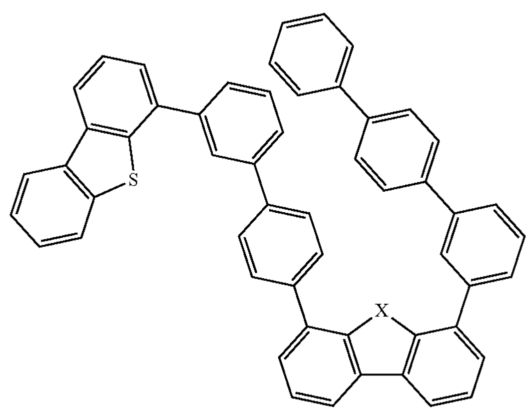
H3-60
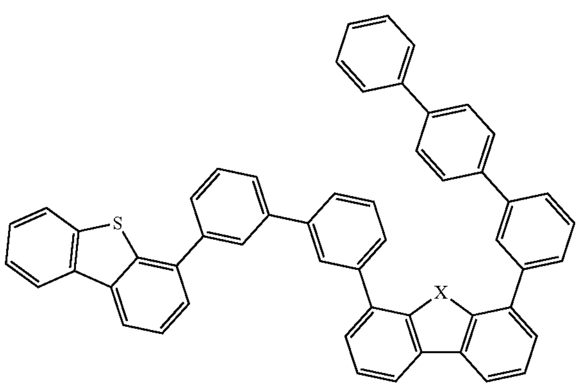
H3-61
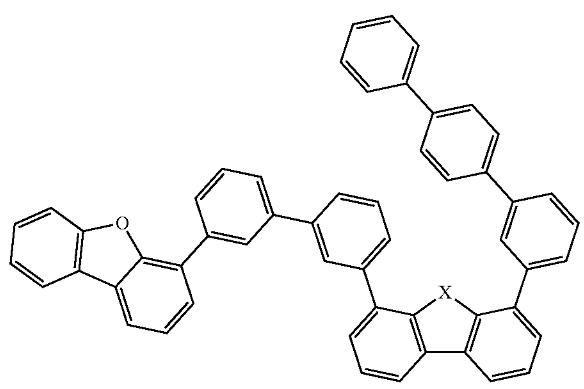

-continued
H3-62
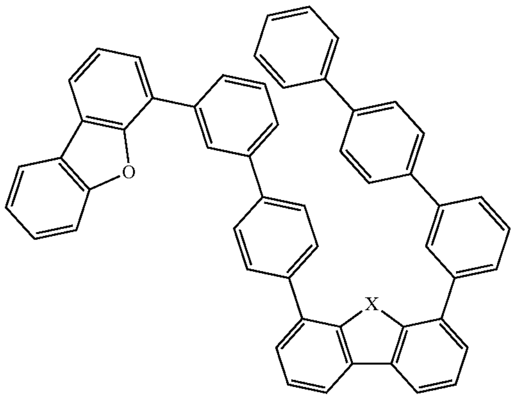
H3-63
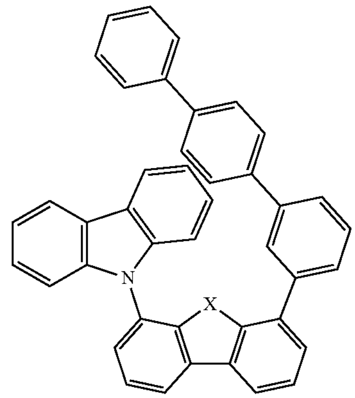
H3-64
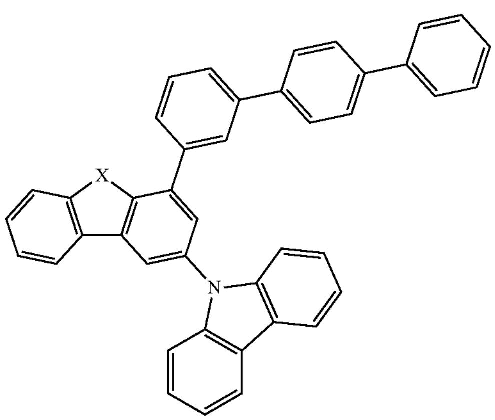
H3-65
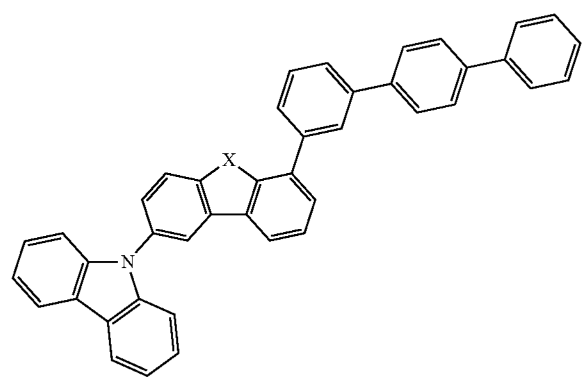
H3-66
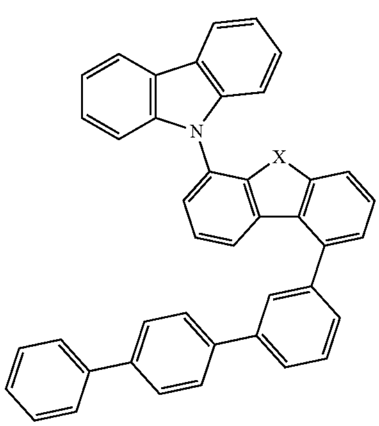
H3-67
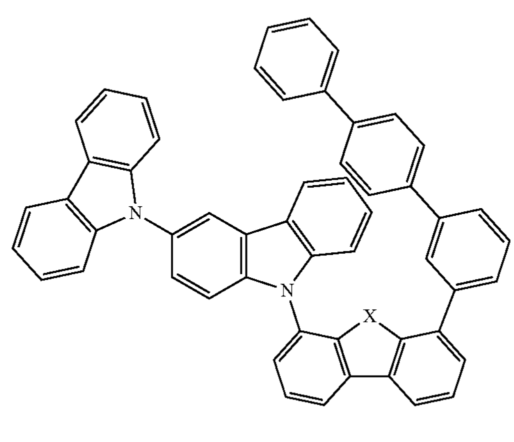

-continued
H3-68
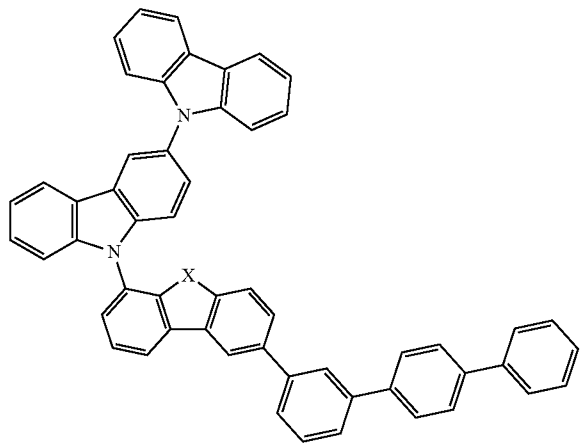
H3-69
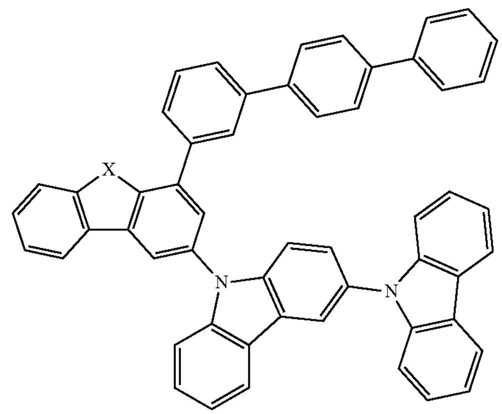
H3-70
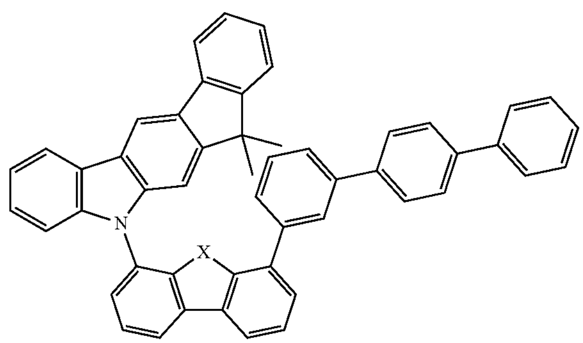
H3-71
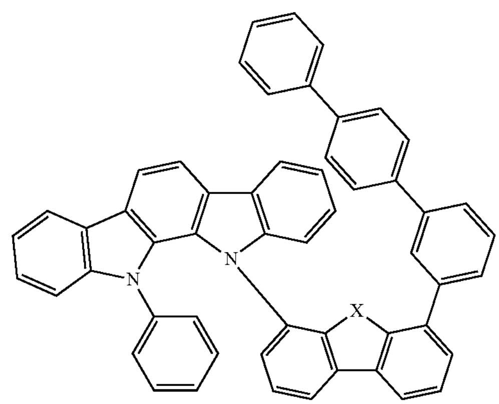
H3-72
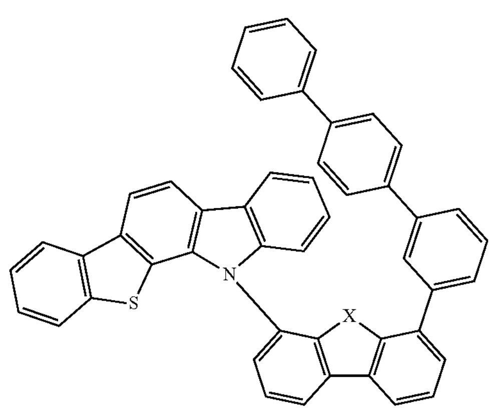
H3-73
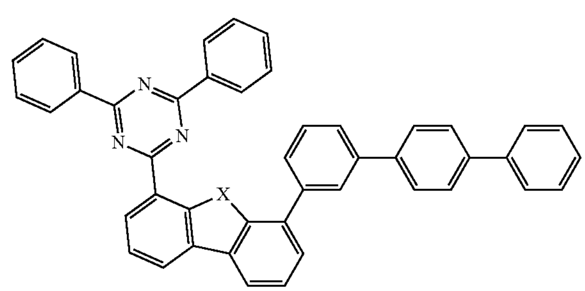

-continued

H3-74

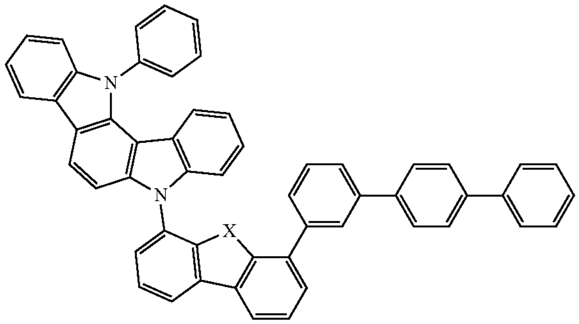

H3-75

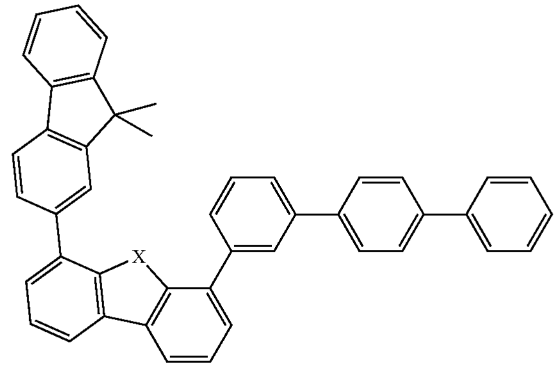

H3-76

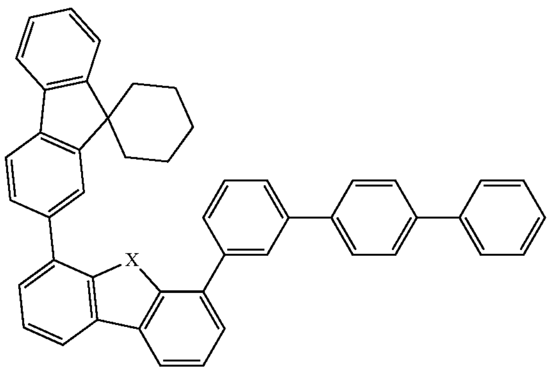

H3-77

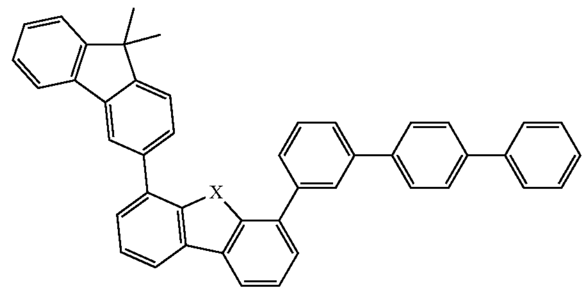

H3-78

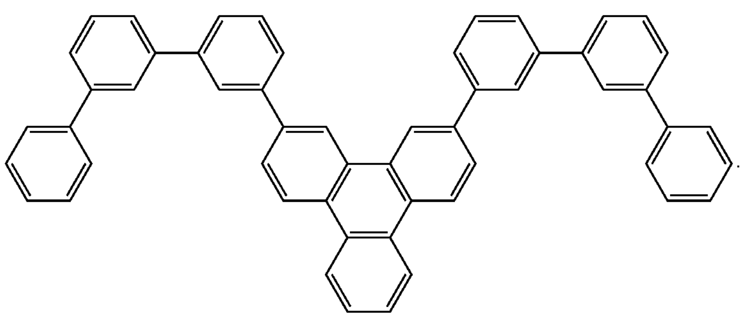

In Compounds H3-25 to H3-77, X may be O, S, or Se.

Another aspect of the present disclosure provides a composition including a platinum-containing organometallic compound, a first compound, a second compound and a third compound, wherein the platinum-containing organometallic compound, the first compound, the second compound, and the third compound may be different from each other, the first compound may include at least one electron transport moiety, the second compound may not include an electron transport moiety, the third compound may have a greater band gap than a band gap of the first compound and a band gap of the second compound, and the platinum-containing organometallic compound may be an organometallic compound represented by Formula 1-1 or 1-2.

The first compound, the second compound, and the third compound may each be the same as described in the present specification.

Formula 1-1

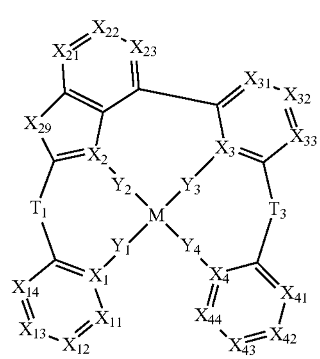

-continued

Formula 1-2

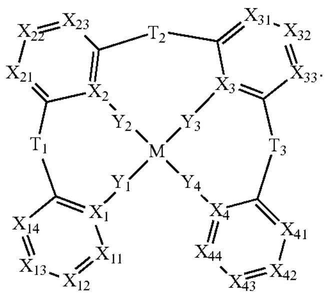

In Formulae 1-1 and 1-2, M, $Y_1$ to $Y_4$, $X_1$ to $X_3$, $T_1$ to $T_3$, $X_{11}$ to $X_{14}$, $X_{21}$ to $X_{23}$, $X_{29}$, $X_{31}$ to $X_{33}$, and $X_{41}$ to $X_{44}$ may each be the same as described in connection with those in Formulae 1-1 and 1-2.

The composition may include a first compound, a second compound, and a third compound. The third compound may have a greater band gap than a band gap of the first compound and a band gap of the second compound. In this regard, when the composition is applied to an organic layer, for example, an emission layer included in the organic layer, of an organic light-emitting device, the third compound may delay the movement speed of electrons and holes, so that the area where the electrons and the holes recombine in the emission layer may be increased. Such an increase leads to expansion of an emission zone, so that an organic light-emitting device including the composition may have improved luminescence efficiency and a long lifespan. In addition, such expansion of the emission zone may reduce the efficiency roll-off dependent upon the increase in luminance, so that the organic light-emitting device may exhibit high efficiency even under high luminance. Accordingly, a maximum luminance value that can be implemented by the organic light-emitting device may be also increased.

A difference between an absolute value of a HOMO energy level of the first compound and an absolute value of a HOMO energy level of the second compound may be equal to or less than about 0.35 eV. In this regard, as compared to the case of using a combination of compounds having an absolute value difference in HOMO energy levels greater than about 0.35 eV, the first compound may contribute not only to the movement of electrons, but also to the movement of holes. Thus, when the composition is applied to an organic light-emitting device, the organic light-emitting device may have a reduced driving voltage, and the inclusion of the third compound may result in an effect of offsetting an increase in driving voltage.

In an embodiment, the first compound may have a deeper HOMO energy level than the HOMO energy level of the second compound.

In an embodiment, an absolute value of the HOMO energy level of the second compound may be smaller than an absolute value of the HOMO energy level of the first compound and an absolute value of the HOMO energy level of the third compound. When the energy conditions are satisfied as described above, the movement of holes may be achieved through the second compound.

For example, the HOMO energy level of the first compound may be in a range of about −6.0 eV to about −5.2 eV, for example, about −5.5 eV to about −5.2 eV, the HOMO energy level of the second compound may be in a range of about −5.2 eV to about −4.7 eV, for example, about −5.1 eV to about −4.8 eV, and the HOMO energy level of the third compound may be in a range of about −7.0 eV to about −5.2 eV, for example, about −6.0 eV to about −5.3 eV. However, embodiments of the present disclosure are not limited thereto.

In an embodiment, an absolute value of the HOMO energy level of the first compound may be greater than an absolute value of the HOMO energy level of the second compound and an absolute value of the HOMO energy level of the third compound. When the energy conditions are satisfied as described above, the movement of electrons may be achieved through the first compound.

For example, the LUMO energy level of the at least one first compound may be in a range of about −2.4 eV to about −1.7 eV, for example, about −2.2 eV to about −1.9 eV, the LUMO energy level of the second compound may be in a range of about −1.6 eV to about −0.8 eV, for example, about −1.5 eV to about −0.9 eV, and the LUMO energy level of the third compound may be in a range of about −1.5 eV to about −0.6 eV, for example, about −1.4 eV to about −0.8 eV. However, embodiments of the present disclosure are not limited thereto.

In the composition, an amount of the first compound may be, based on the total weight of the composition, in a range of about 10 wt % to about 90 wt %, for example, about 10 wt % to about 80 wt %.

In the composition, an amount of the second compound may be, based on the total weight of the composition, in a range of about 10 wt % to about 90 wt %, for example, about 10 wt % to about 80 wt %.

In the composition, an amount of the third compound may be, based on the total weight of the composition, in a range of about 5 wt % to about 80 wt %, for example, about 10 wt % to about 50 wt %.

The composition including the platinum-containing organometallic compound, the first compound, the second compound, and the third compound may be suitable as a material for forming an organic layer, for example, an emission layer included in the organic layer, of an organic light-emitting device. Another aspect of the present disclosure provides an organic light-emitting device including: a first electrode; a second electrode; and an organic layer located between the first electrode and the second electrode and including an emission layer and the composition.

The composition may be used between a pair of electrodes of the organic light-emitting device. For example, the emission layer may include the composition. Here, the platinum-containing organometallic compound may serve as a dopant, and the first compound, the second compound, and the third compound may each act as a host.

The organic light-emitting device including the composition may emit red light, green light, or blue light. For example, the organic light-emitting device including the composition may emit green light, but embodiments of the present disclosure are not limited thereto.

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

For example, in the organic light-emitting device, the first electrode may be an anode, the second electrode may be a cathode, and the organic layer may further include a hole transport region located between the first electrode and the emission layer and an electron transport region located between the emission layer and the second electrode, wherein the hole transport region may include a hole injection layer, a hole transport layer, an electron blocking layer, a buffer layer, or any combination thereof, and the electron transport region may include a hole blocking layer, an electron transport layer, an electron injection layer, or any combination thereof.

The term "organic layer" as used herein refers to a single layer and/or a plurality of layers between the first electrode and the second electrode of the organic light-emitting device. The "organic layer" may include, in addition to an organic compound, an organometallic complex including metal.

FIG. 1s a schematic cross-sectional view of an organic light-emitting device 10 according to an embodiment. Hereinafter, the structure of an organic light-emitting device according to an embodiment of the present disclosure and a method of manufacturing an organic light-emitting device according to an embodiment of the present disclosure will be described in connection with the FIGURE. The organic light-emitting device 10 includes a first electrode 11, an organic layer 15, and a second electrode 19, which are sequentially stacked.

A substrate may be additionally located under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

The first electrode 11 may be, for example, formed by depositing or sputtering a material for forming the first electrode 11 on the substrate. The first electrode 11 may be an anode. The material for forming the first electrode 11 may be a material with a high work function to facilitate hole injection. The first electrode 11 may be a reflective electrode, a semi-transmissive electrode, or a transmissive electrode. In an embodiment, the material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but embodiments of the present disclosure are not limited thereto.

The organic layer 15 is located on the first electrode 11.

The organic layer 15 may include a hole transport region, an emission layer, and an electron transport region.

The hole transport region may be located between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. For example, the hole transport region may have a hole injection layer/hole transport layer structure or a hole injection layer/hole transport layer/electron blocking layer structure, wherein, for each structure, each layer is sequentially stacked in this stated order on the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about 10-8 torr to about $10^{-3}$ torr, and a deposition rate of about 0.01 Å/sec to about 100 Å/sec. However, the deposition conditions are not limited thereto.

When the hole injection layer is formed using spin coating, the coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include at least one m-MTDATA, TDATA, 2-TNATA, NPB, p-NPB, TPD, Spiro-TPD, Spiro-NPB, methylated-NPB, TAPC, HMTPD, 4,4',4"-tris (N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid (PANI/CSA), polyaniline/poly(4-styrenesulfonate) (PANI/PSS), a compound represented by Formula 201, a compound represented by Formula 202, or any combination thereof:

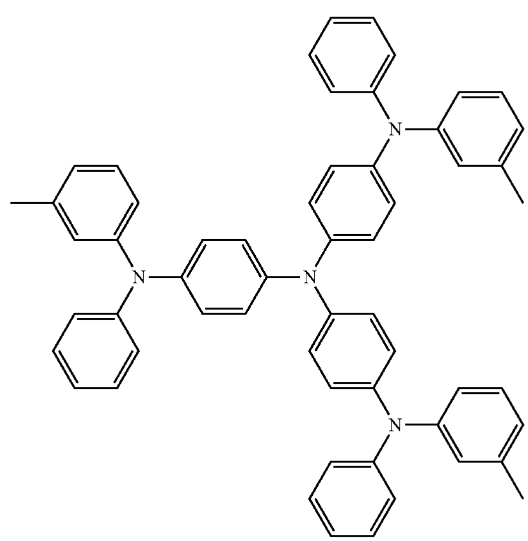

m-MTDATA

-continued
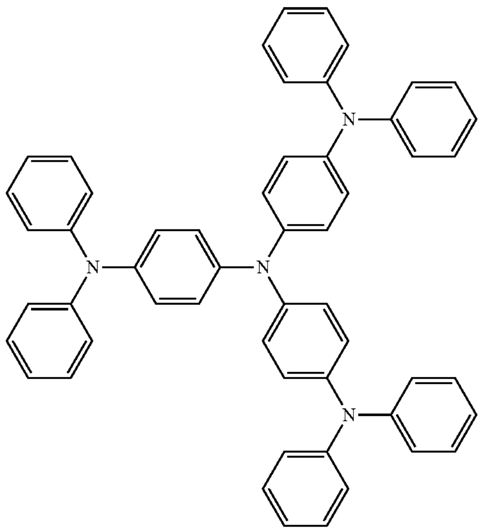
TDATA
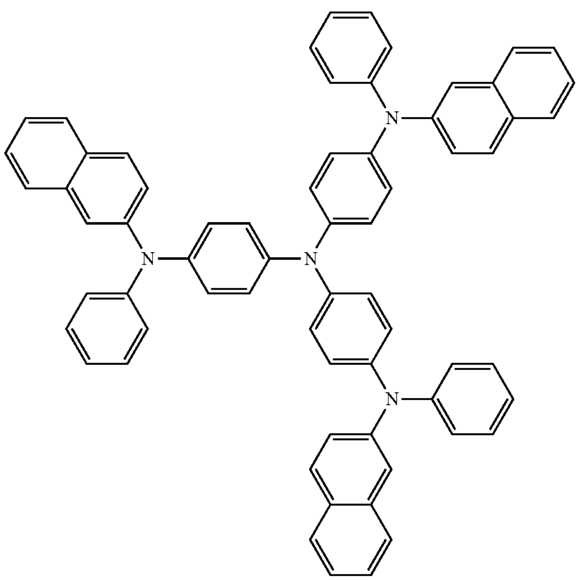
2-TNATA
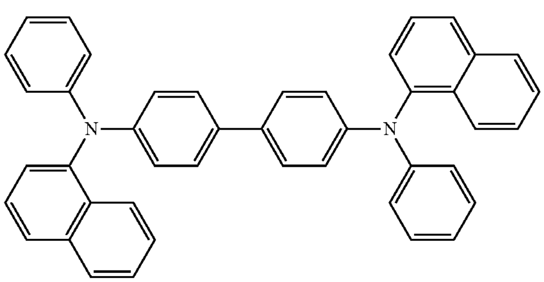
NPB
-continued
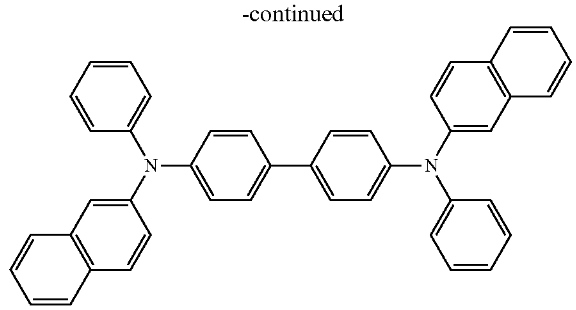
β-NPB
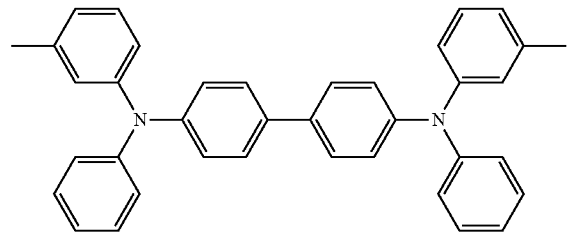
TPD
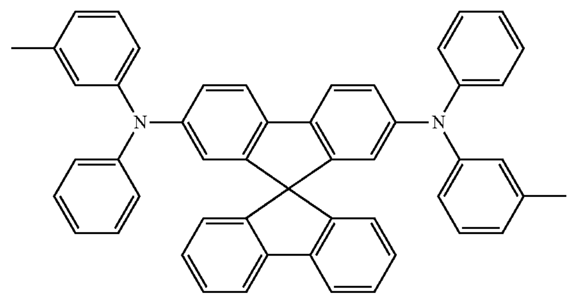
Spiro-TPD
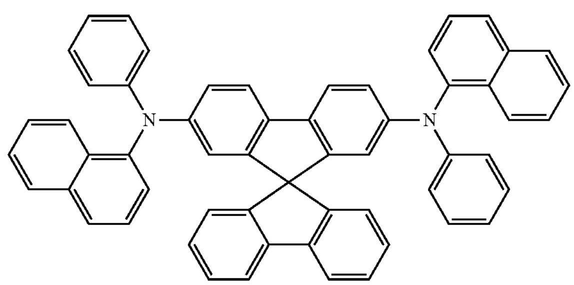
Spiro-NPB
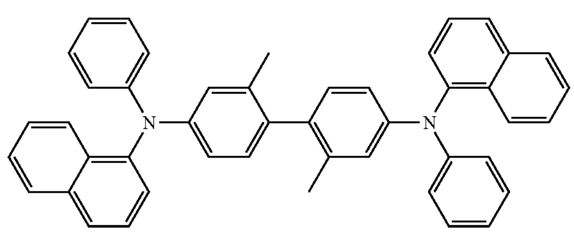
methylated NPB -continued

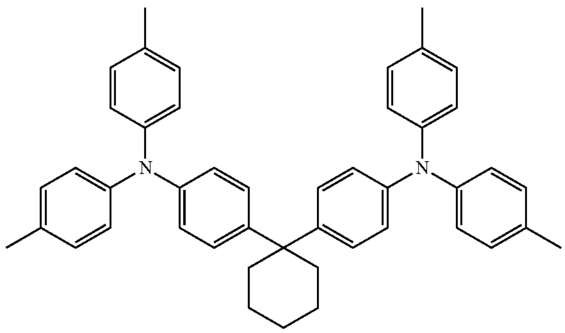

TAPC

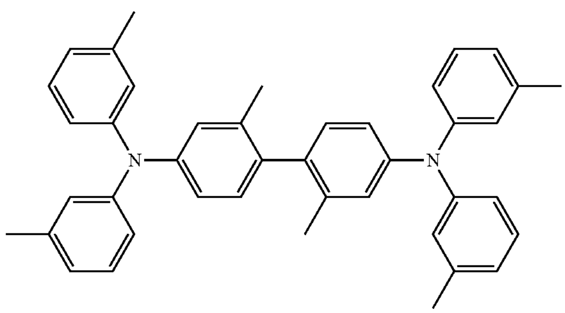

HMTPD

Formula 201

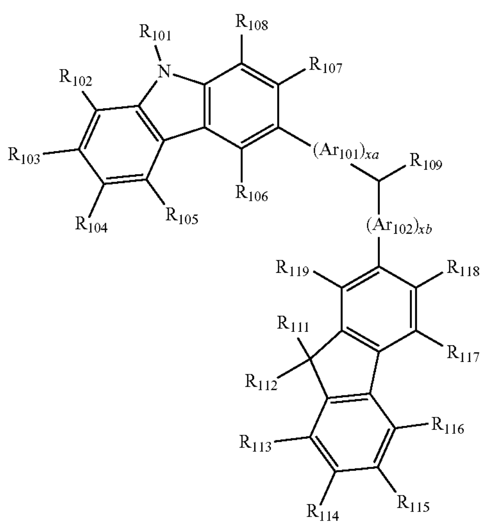

Formula 202

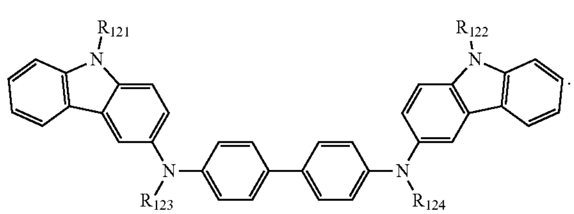

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

In Formula 201, xa and xb may each independently be an integer from 0 to 5, or 0, 1, or 2. For example, xa may be 1, and xb may be 0. However, embodiments of the present disclosure are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group (for example, a methyl group, an ethyl group, a propyl group, a butyl group, pentyl group, a hexyl group, or the like), or a $C_1$-$C_{10}$ alkoxy group (for example, a methoxy group, an ethoxy group, a propoxy group, a butoxy group, a pentoxy group, and the like);

a $C_1$-$C_{10}$ alkyl group or a $C_1$-$C_{10}$ alkoxy group, each substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group, or a pyrenyl group, each unsubstituted or substituted with at least one deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof.

In Formula 201, $R_{109}$ may be a phenyl group, a naphthyl group, an anthracenyl group, or a pyridinyl group, each unsubstituted or substituted with at least one deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In an embodiment, the compound represented by Formula 201 may be represented by Formula 201A, but embodiments of the present disclosure are not limited thereto:

Formula 201A

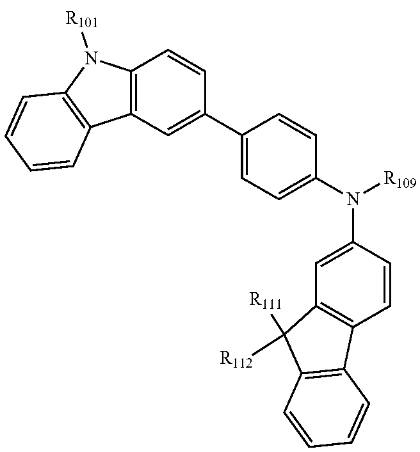

wherein $R_{101}$, $R_{111}$, $R_{112}$, and $R_{109}$ in Formula 201A may each be the same as described above.

In an embodiment, the compound represented by Formula 201 and the compound represented by Formula 202 may each include one of Compounds HT1 to HT20 or any combination thereof, but embodiments of the present disclosure are not limited thereto:

HT1

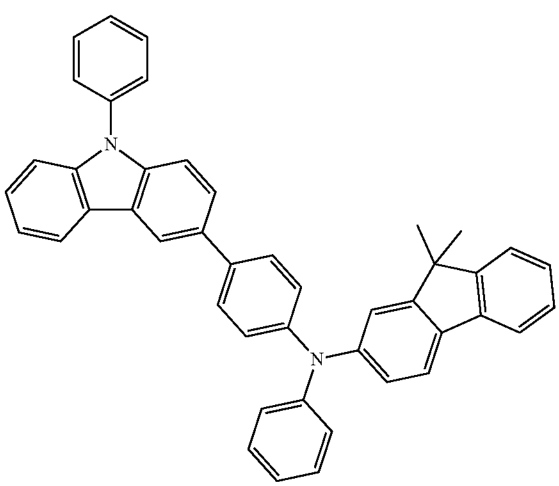

-continued

HT2

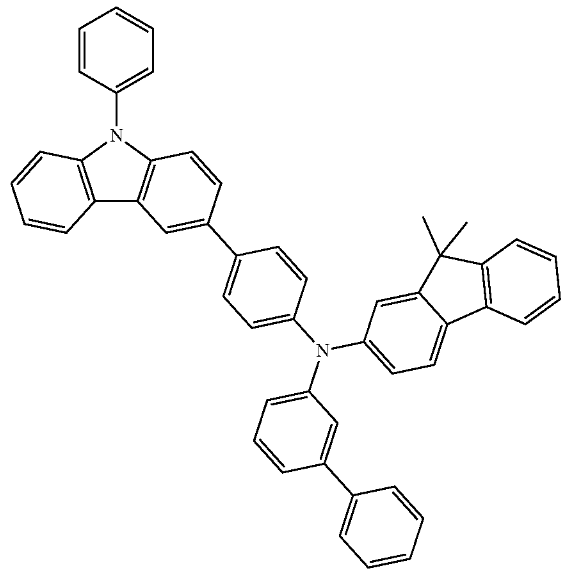

HT3

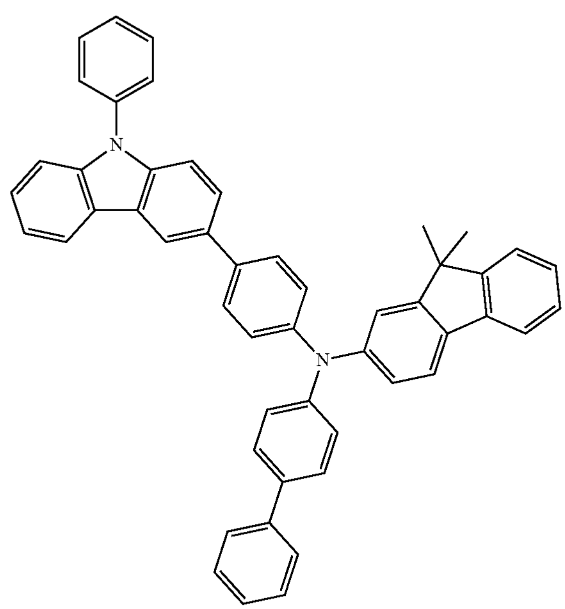

-continued
HT4
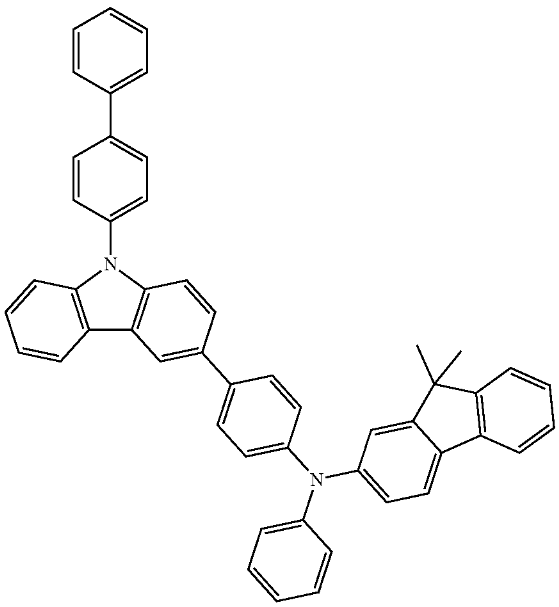
HT5
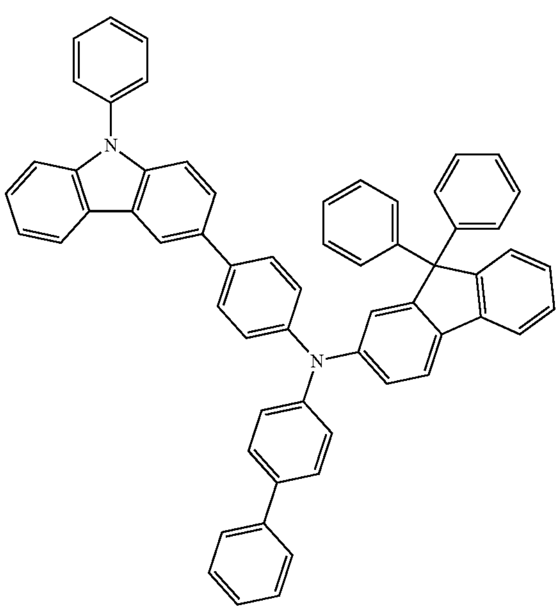
-continued
HT6
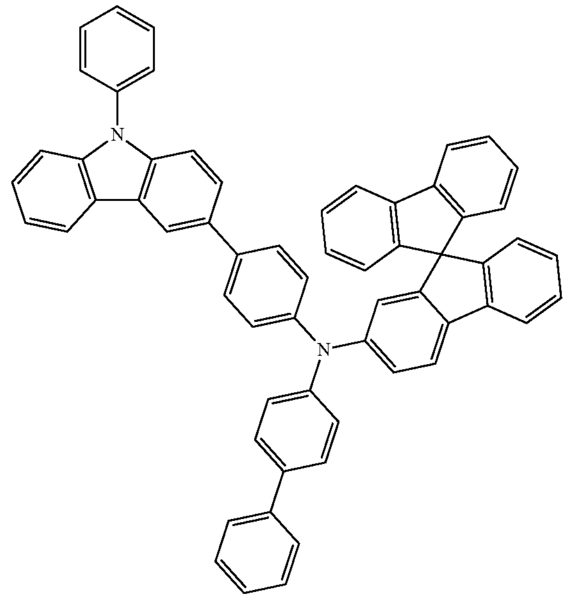
HT7
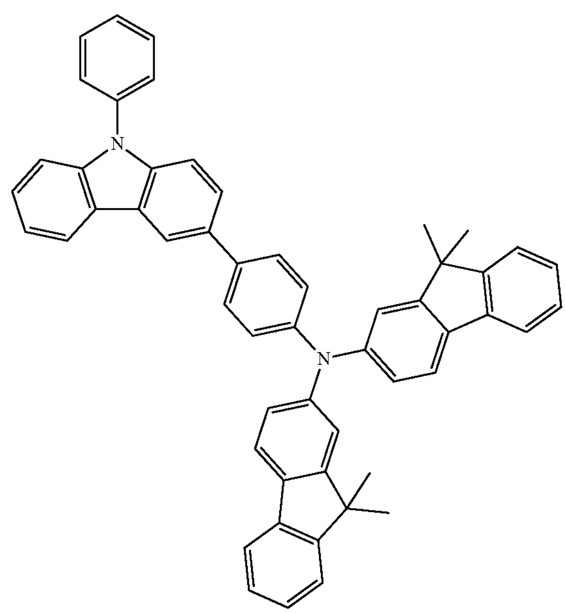

HT8
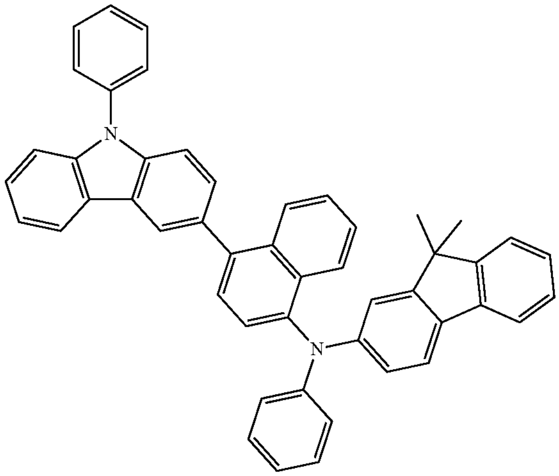
HT9
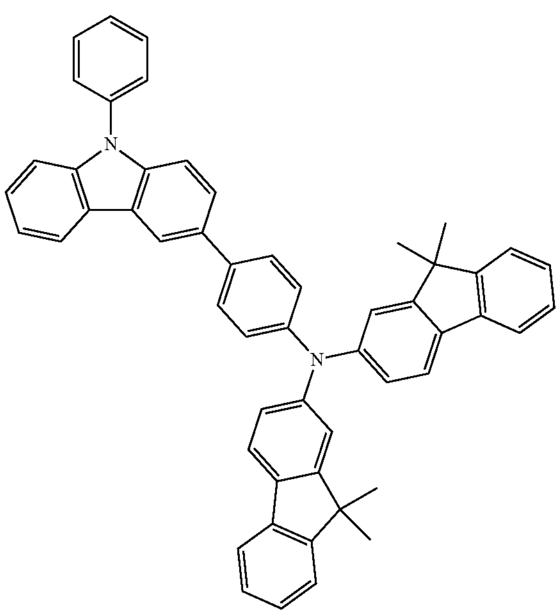
HT10
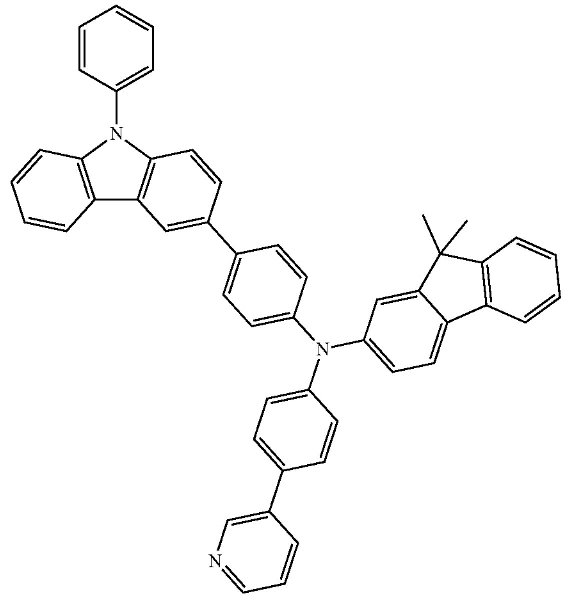
HT11
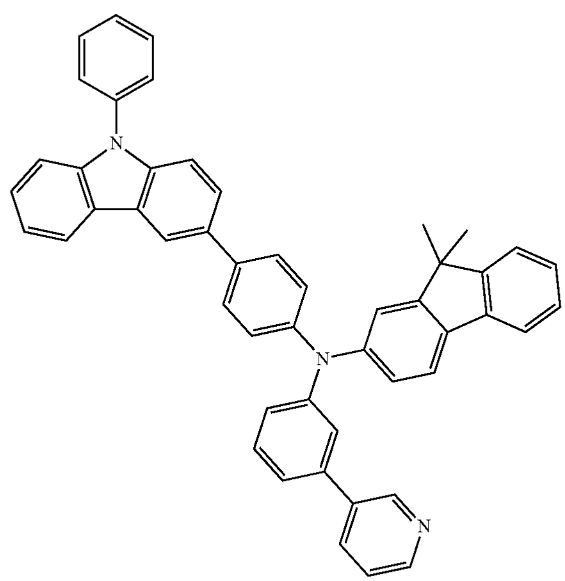

-continued
HT12
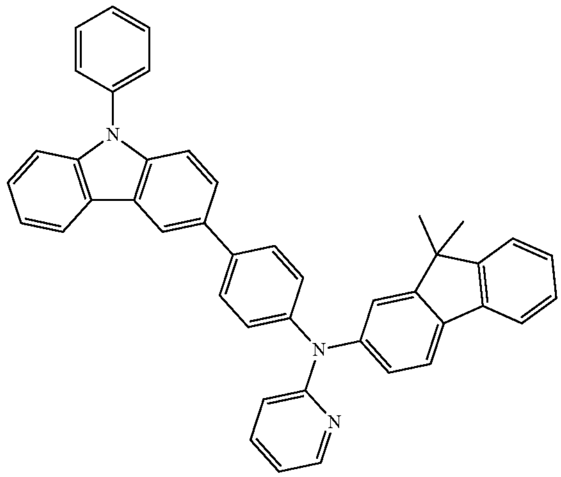
HT13
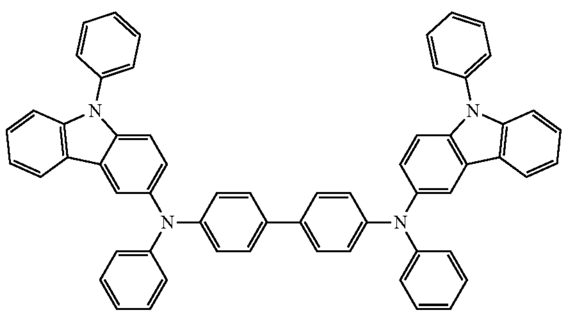
HT14
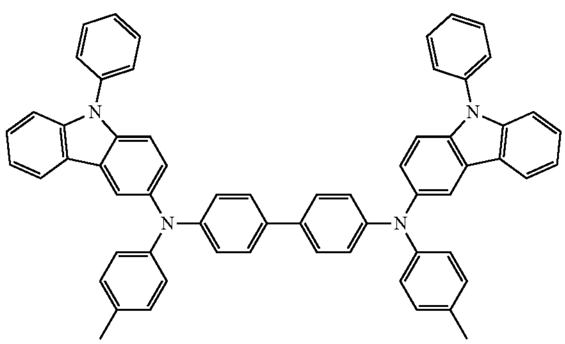
HT15
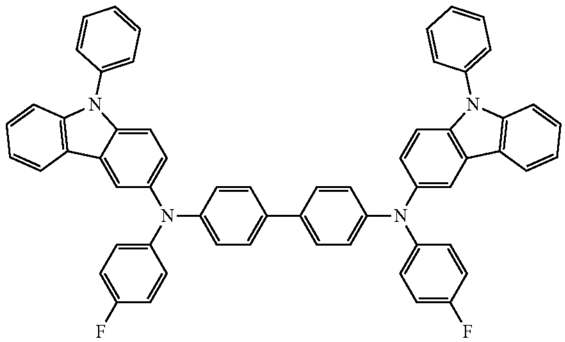
-continued
HT16
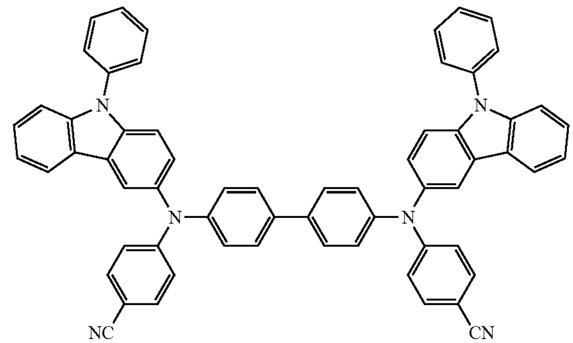
HT17
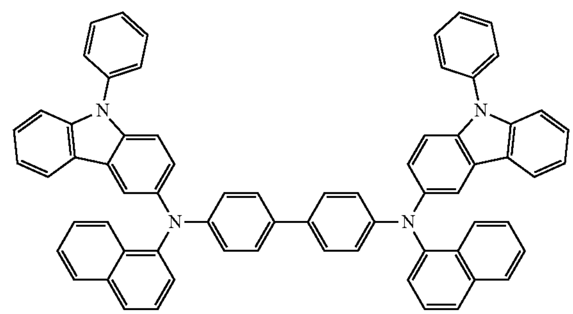
HT18
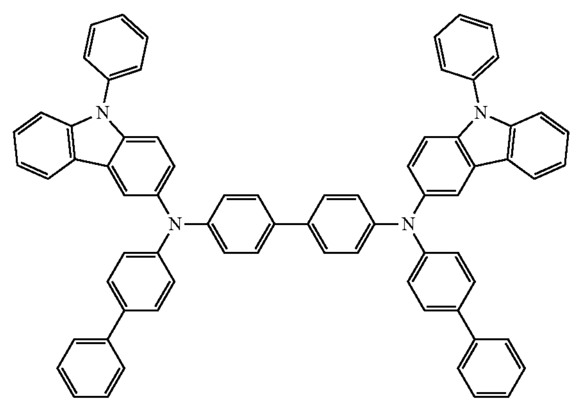
HT19
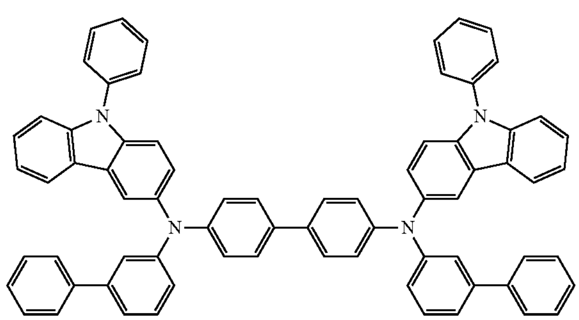

-continued

HT20

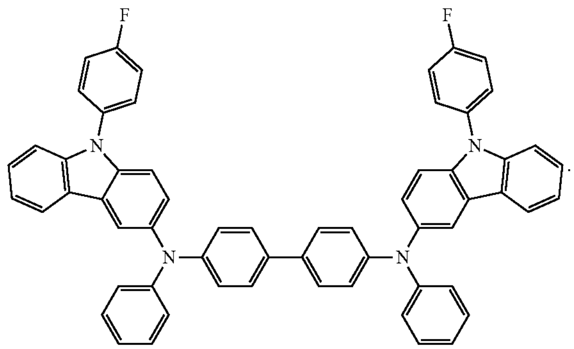

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within the ranges above, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one of a quinone derivative, a metal oxide, and a cyano group-containing compound, but embodiments of the present disclosure are not limited thereto. Examples of the p-dopant are: a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1, but embodiments of the present disclosure are not limited thereto:

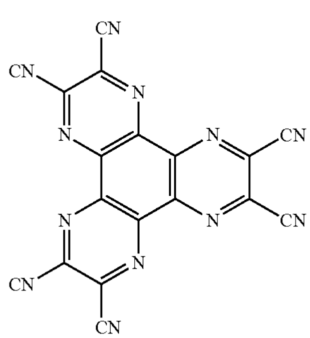

HT-D1

-continued

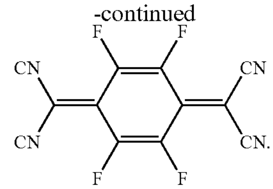

F4-TCNQ

The hole transport region may include a buffer layer.

The buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a material that is used to form the hole transport layer.

Meanwhile, when the hole transport region includes an electron blocking layer, a material for forming the electron blocking layer may be a material for forming the hole transport region as described above and a host material to be explained later. However, embodiments of the present disclosure are not limited thereto. For example, when the hole transport region includes an electron blocking layer, the material for forming the electron blocking layer may be mCP to be explained later.

The emission layer may include the composition including the platinum-containing organometallic compound, the first compound, the second compound, and the third compound.

In an embodiment, the emission layer may include a dopant and a host, wherein the dopant may include the platinum-containing organometallic compound, and the host may include the first compound, the second compound, and the third compound.

In one or more embodiments, the emission layer may further include, in addition to the composition, any dopant and/or host.

When the organic light-emitting device 10 is a full-color organic light-emitting device, the emission layer may be patterned into a red emission layer, a green emission layer, and a blue emission layer. Due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within the ranges above, excellent light-emission characteristics may be obtained without a substantial increase in driving voltage.

Then, an electron transport region may be located on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but embodiments of the present disclosure are not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, Bphen, BAlq, or any combination thereof, but embodiments of the present disclosure are not limited thereto:

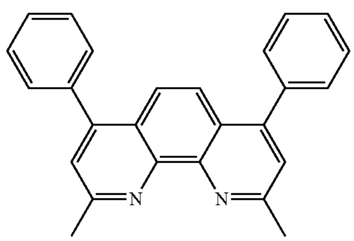

BCP

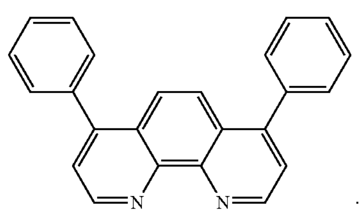

Bphen

A thickness of the hole blocking layer may be in a range of about 20 Å to about 1,000 Å, for example, about 30 Å to about 300 Å. When the thickness of the hole blocking layer is within the ranges above, excellent hole blocking characteristics may be obtained without a substantial increase in driving voltage.

In an embodiment, the electron transport layer may include BCP, Bphen, $Alq_3$, BAlq, TAZ, NTAZ, or any combination thereof:

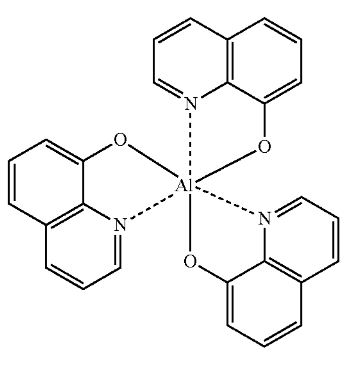

$Alq_3$

-continued

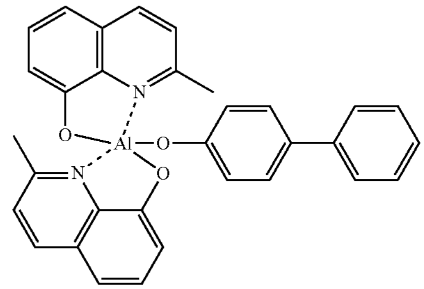

BAlq

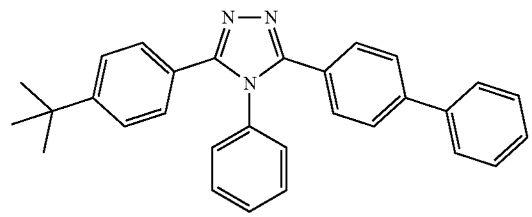

TAZ

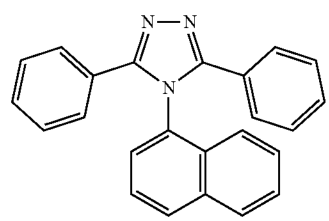

NTAZ

In one or more embodiments, the electron transport layer may include one of Compounds ET1 to ET25 or any combination thereof, but embodiments of the present disclosure are not limited thereto:

ET1

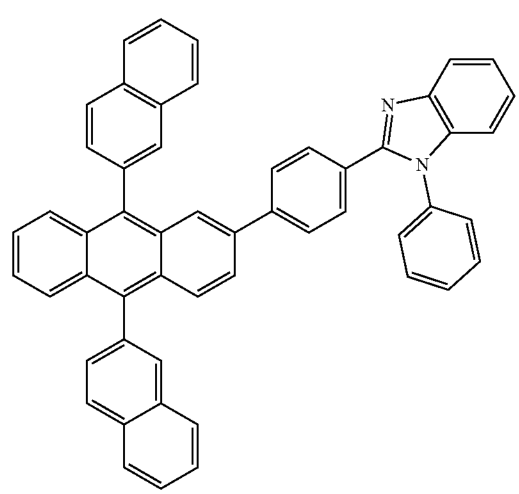

-continued
ET2
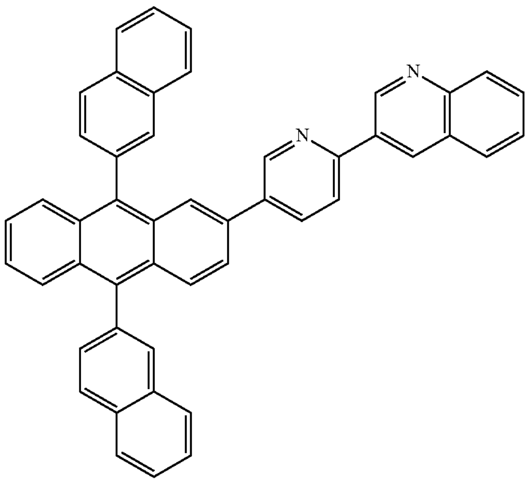
ET3
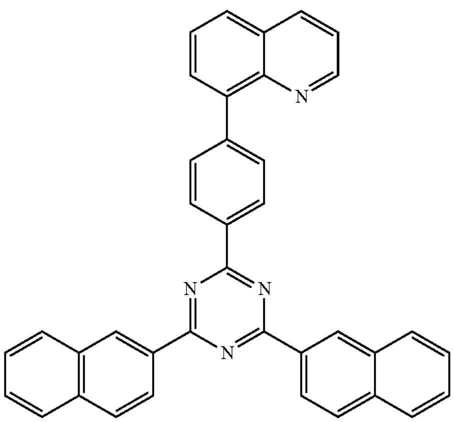
ET4
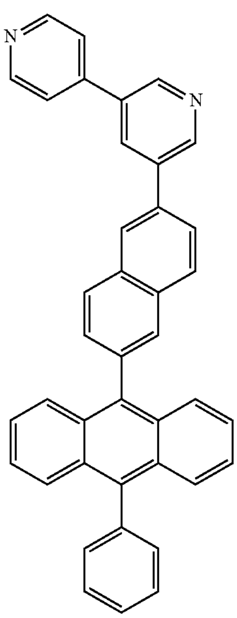
-continued
ET5
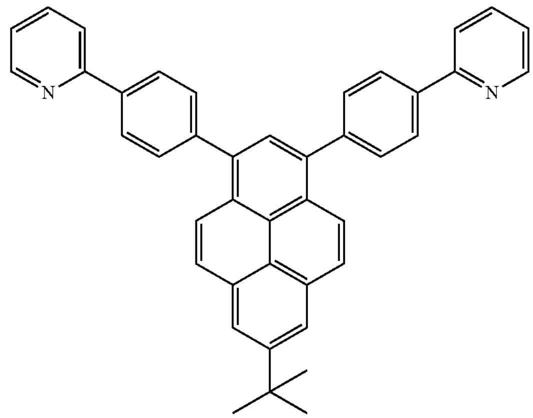
ET6
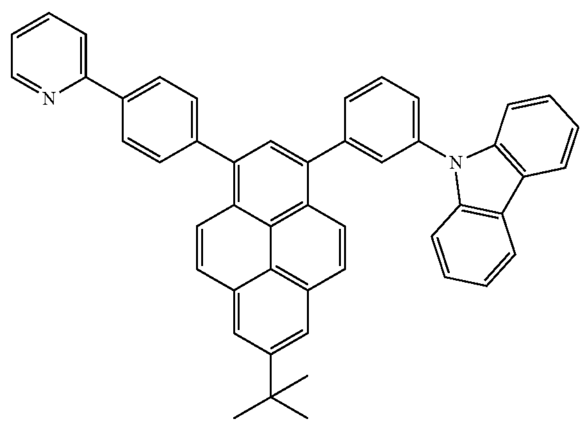
ET7
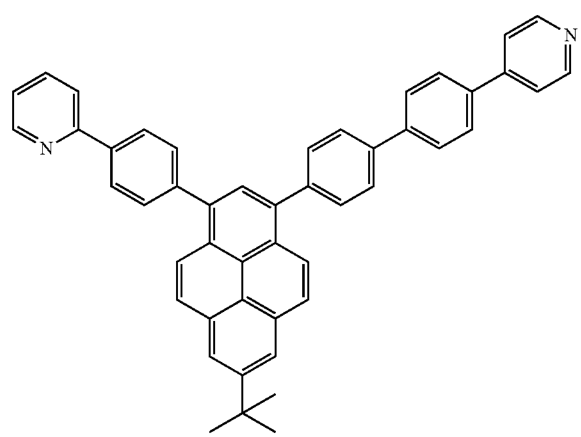

-continued
ET8
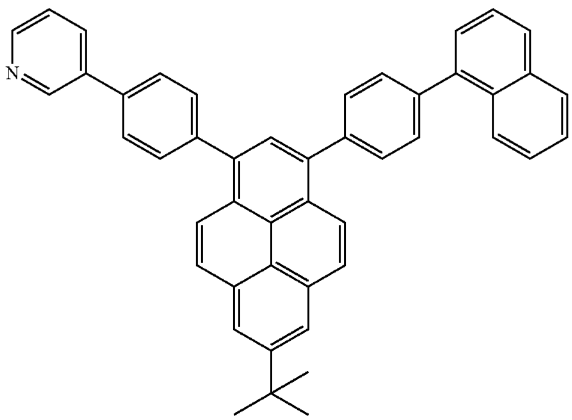
ET9
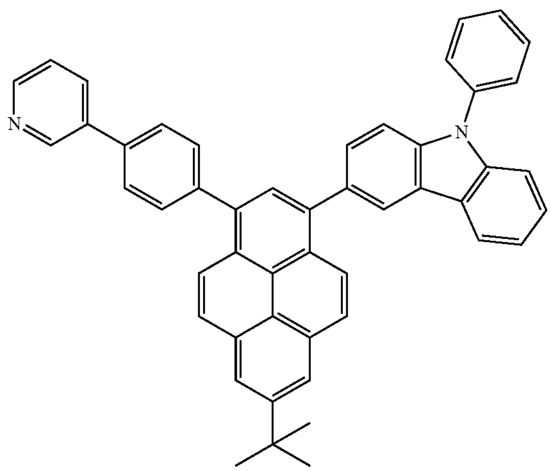
ET10
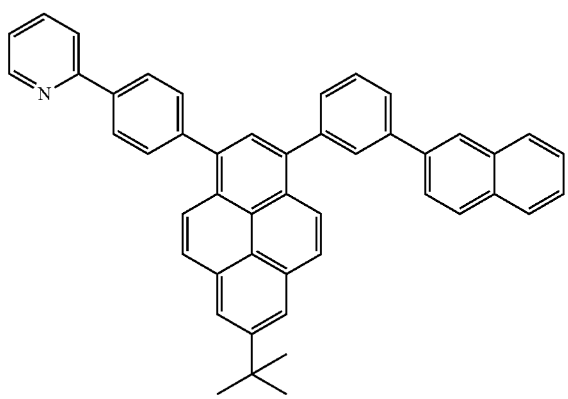
ET11
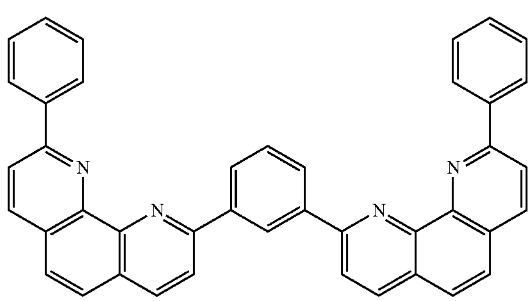
-continued
ET12
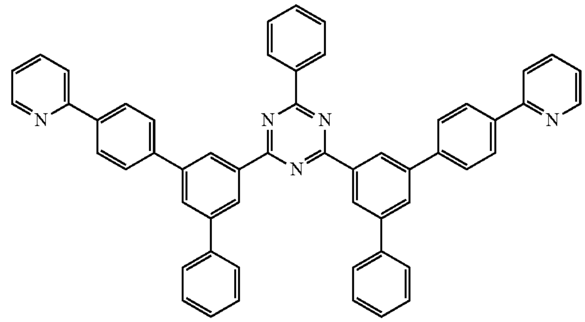
ET13
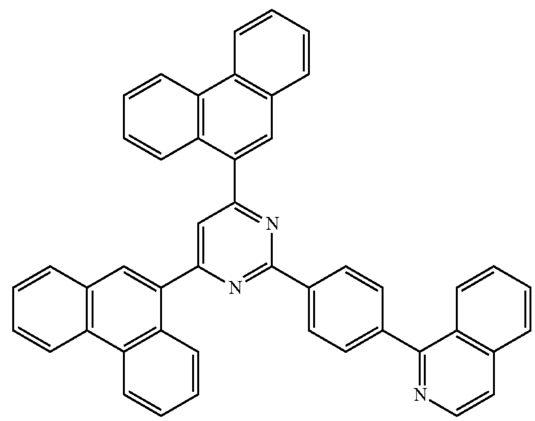
ET14
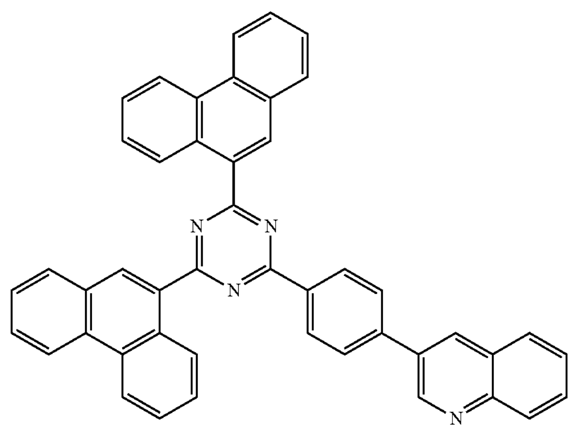
ET15
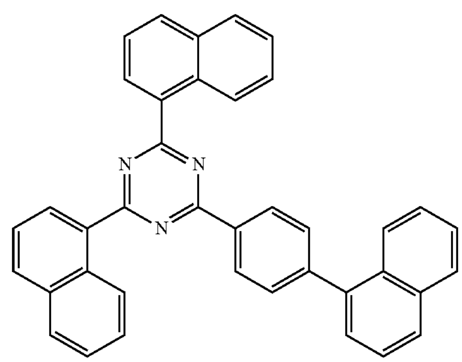

ET16
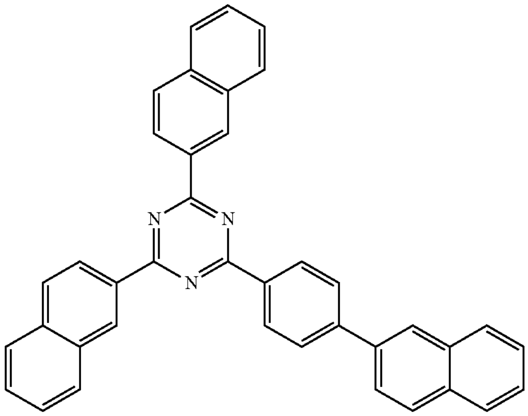
ET17
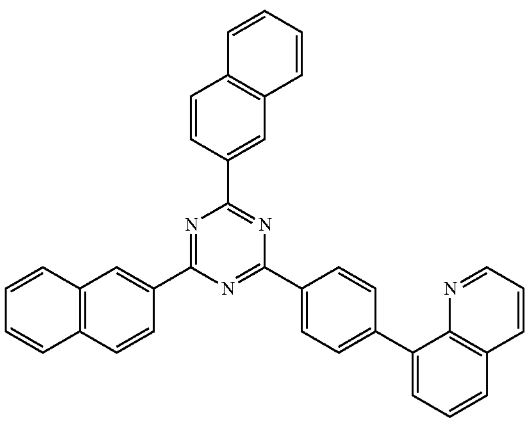
ET18
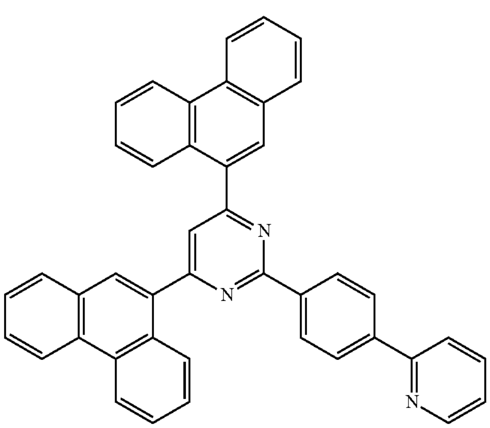
ET19
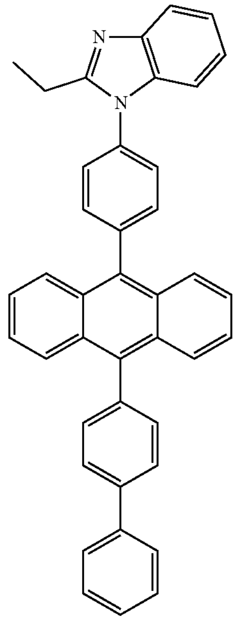
ET20
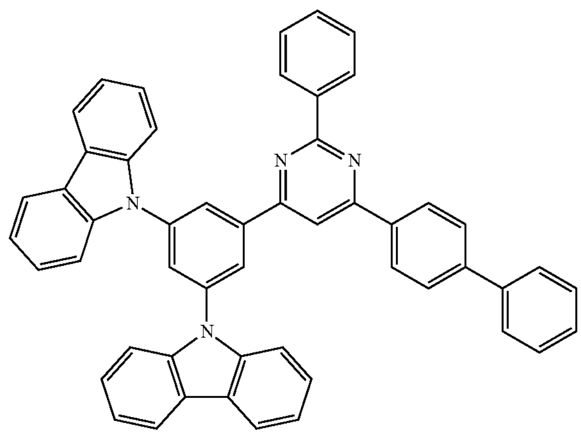
ET21
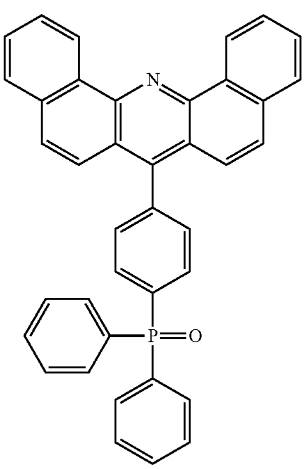

-continued

ET22

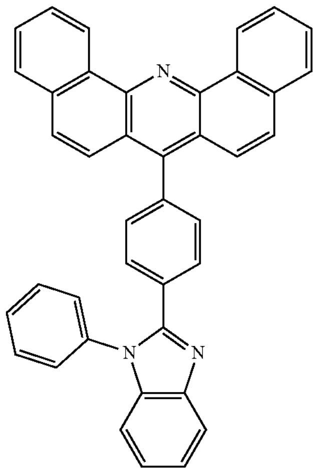

ET23

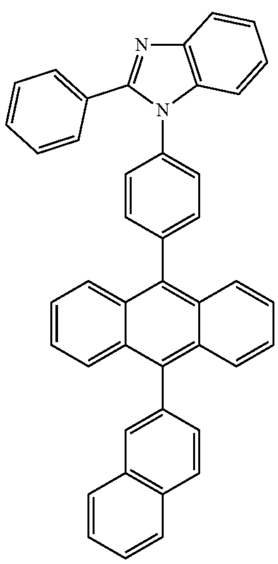

ET24

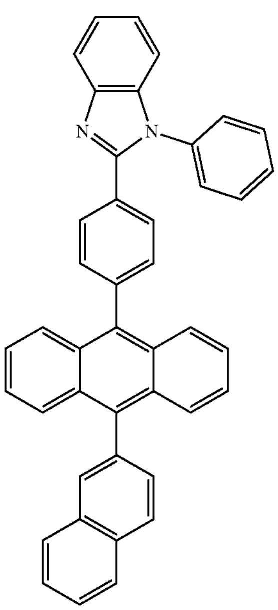

-continued

ET25

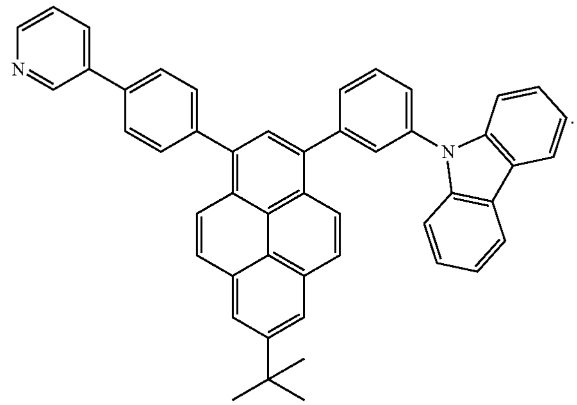

A thickness of the electron transport layer may be in a range of about 100 Å to about 1,000 Å, for example, about 150 Å to about 500 Å. When the thickness of the electron transport layer is within the ranges above, satisfactory electron transport characteristics may be obtained without a substantial increase in driving voltage.

Also, the electron transport layer may further include, in addition to the materials described above, a metal-containing material.

The metal-containing material may include a Li complex. The Li complex may include, for example, Compound ET-D1 (LiQ), Compound ET-D2, or any combination thereof:

ET-D1

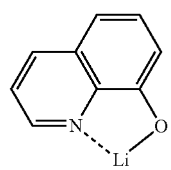

ET-D2

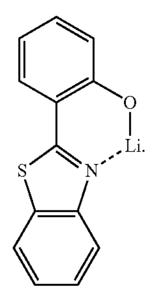

The electron transport region may include an electron injection layer that facilitates the injection of electrons from the second electrode 19.

The electron injection layer may include LiF, NaCl, CsF, $Li_2O$, BaO, or any combination thereof.

A thickness of the electron injection layer may be in a range of about 1 Å to about 100 Å, and, for example, about 3 Å to about 90 Å. When the thickness of the electron injection layer is within the ranges above, satisfactory electron injection characteristics may be obtained without a substantial increase in driving voltage.

The second electrode 19 is located on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. To manufacture a top-emission type light-emitting device, a transmissive electrode formed using ITO or IZO may be used as the second electrode 19.

Hereinbefore, the organic light-emitting device 10 has been described with reference to the FIGURE, but embodiments of the present disclosure are not limited thereto.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom N, O, P, Si, and S as a ring-forming atom and 1 to 10 carbon atoms, and examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom N, O, P, Si, and S as a ring-forming atom, 1 to 10 carbon atoms, and at least one carbon-carbon double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having at least one of N, O, P, Si, B, Se, Ge, Te, S, or any combination thereof as a ring-forming atom and a cyclic aromatic system having 1 to 60 carbon atoms, and the term "$C_1$-$C_{60}$ heteroarylene group" as used herein refers to a divalent group having at least one of N, O, P, Si, B, Se, Ge, Te, S, or any combination thereof as a ring-forming atom and a carbocyclic aromatic system having 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the two or more rings may be fused to each other.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. An example of the monovalent non-aromatic condensed polycyclic group includes a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, at least one of N, O, P, Si, B, Se, Ge, Te, S, or any combination thereof, other than carbon atoms, as a ring-forming atom, and no aromaticity in its entire molecular structure. An example of the monovalent non-aromatic condensed heteropolycyclic group includes a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one N, O, Si, P, B, Se, Ge, Te, S, or any combination thereof other than 1 to 30 carbon atoms. The $C_1$-$C_{30}$ heterocyclic group may be a monocyclic group or a polycyclic group.

A substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

- deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;
- a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, $—P(=O)(Q_{18})(Q_{19})$, or any combination thereof;
- a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with at least one deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, $—P(=O)(Q_{28})(Q_{29})$, or any combination thereof; or
- $—N(Q_{31})(Q_{32})$, $—Si(Q_{33})(Q_{34})(Q_{35})$, $—B(Q_{36})(Q_{37})$, or $—P(=O)(Q_{38})(Q_{39})$; or
- any combination thereof.

In the present specification, $Q_1$ to $Q_9$, $Q_1$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one a $C_1$-$C_{60}$ alkyl group, a $C_6$-$C_{60}$ aryl group, or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

Hereinafter, a compound and an organic light-emitting device according to embodiments are described in detail with reference to Synthesis Example and Examples. However, the present disclosure is not limited thereto. The wording "B was used instead of A" used in describing Synthesis Examples means that an amount of A used was identical to an amount of B used, in terms of a molar equivalent.

EXAMPLES

Evaluation Example 1

Regarding the following compounds, HOMO and LUMO energy levels were calculated using a DFT method with Gaussian program on structures optimized using B3LYP/6-31G(d,p) functional and basis set. The results are shown in Table 1.

TABLE 1

| Compound | Calculated HOMO energy level (eV) | Calculated LUMO energy level (eV) |
|---|---|---|
| H2-1 | −4.97 | −0.99 |
| H1-63 | −5.26 | −1.91 |
| H3-78 | −5.63 | −1.27 |
| H3-1 | −5.64 | −1.34 |
| HA1 | −5.42 | −2.09 |

H2-1

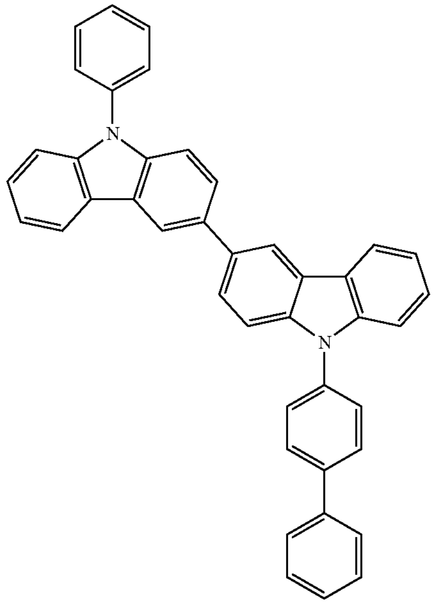

H1-63

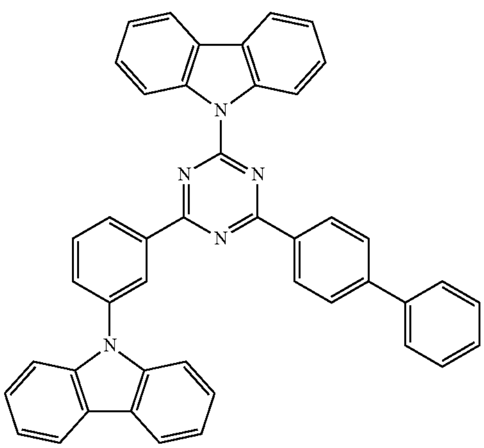

H3-78

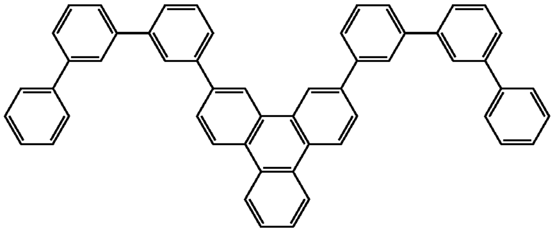

-continued

H3-1

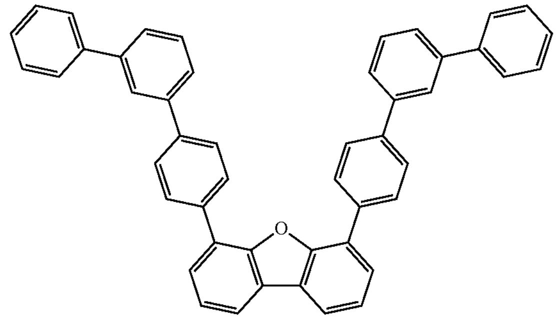

HA1

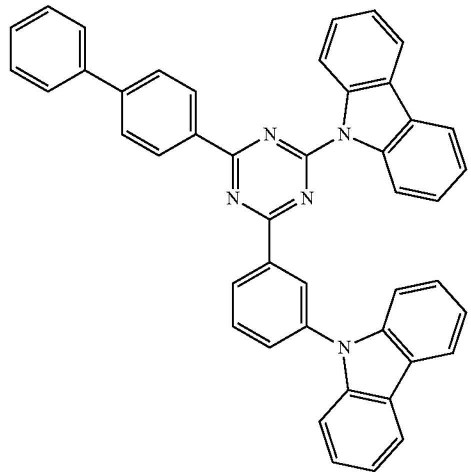

Example 1

An ITO glass substrate was cut to a size of 50 mm×50 mm×0.5 mm and then, sonicated in acetone isopropyl alcohol and pure water, each for 15 minutes, and then, washed by exposure to UV ozone for 30 minutes.

Subsequently, F6-TCNNQ was deposited on the ITO electrode (i.e., an anode) of the substrate to form a hole injection layer having a thickness of 100 Å, HT1 was deposited on the hole injection layer to form a first hole transport layer having a thickness of 1,260 Å, and F6-TCNNQ and HT1 were co-deposited at a weight ratio of 5:95 on the first hole transport layer to form a second hole transport layer having a thickness of 100 Å, thereby forming a hole transport region.

By using Compounds H2-1, H3-78, and H1-63 (at a weight ratio of 3.5:3:3.5) as hosts and Compound 3-337 as a dopant, the hosts and the dopant were deposited at a weight ratio of 85:15 on the hole transport region to form an emission layer having a thickness of 380 Å.

Next, Compound ET1 and LiQ were co-deposited at a weight ratio of 5:5 on the emission layer to form an electron transport layer having a thickness of 360 Å, LiF was deposited on the electron transport layer to form an electron injection layer having a thickness of 5 Å, and Al was vacuum-deposited on the electron injection layer to form a second electrode (i.e., a cathode) having a thickness of 800 Å, thereby completing the manufacture of an organic light-emitting device.

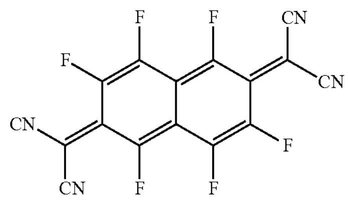

F6-TCNNQ

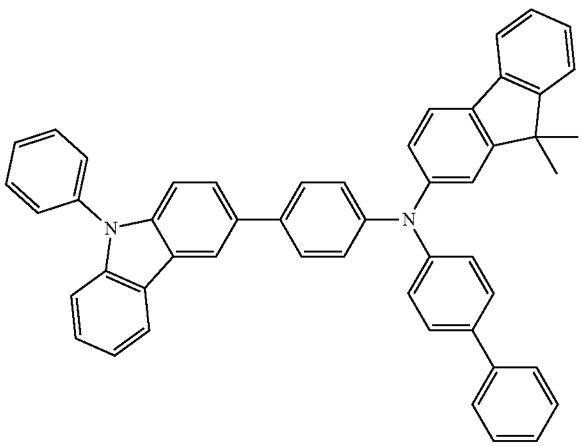

HT1

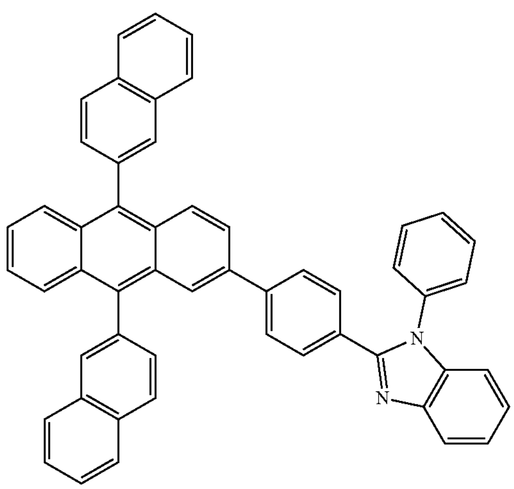

ET1

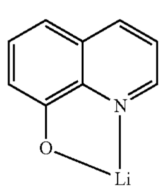

Liq

-continued

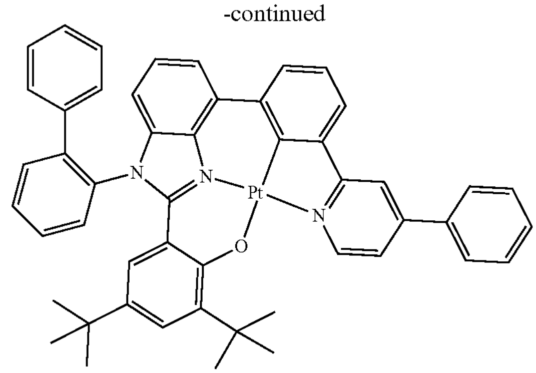

3-337

Example 2

An organic light-emitting device was manufactured in the same manner as in Example 1, except that an emission layer was formed to a thickness of 330 Å.

Example 3

An organic light-emitting device was manufactured in the same manner as in Example 1, except that, in forming an emission layer, H3-1 was used instead of H3-78.

Comparative Example 1

An organic light-emitting device was manufactured in the same manner as in Example 1, except that, in forming an emission layer, Compounds H2-1 and H1-63 (at a weight ratio of 6.5:3.5) as hosts and Ir-D1 as a dopant were co-deposited at a weight ratio of 88:12 to form an emission layer having a thickness of 330 Å.

Ir-D1

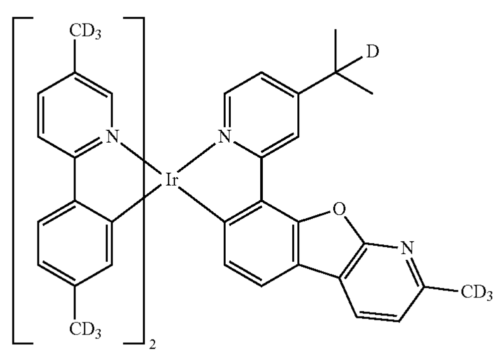

Comparative Example 2

An organic light-emitting device was manufactured in the same manner as in Example 1, except that, in forming an emission layer, Compounds H2-1, H3-78, and H1-63 (at a weight ratio of 5:2:3) as hosts and Ir-D1 as a dopant were co-deposited at a weight ratio of 88:12 to form an emission layer having a thickness of 330 Å.

Comparative Example 3

An organic light-emitting device was manufactured in the same manner as in Example 1, except that, in forming an emission layer, Compounds H2-1 and H1-63 (at a weight ratio of 5.5:4.5) as hosts and Compound 3-337 as a dopant were co-deposited at a weight ratio of 85:15 to form an emission layer having a thickness of 380 Å.

Comparative Example 4

An organic light-emitting device was manufactured in the same manner as in Example 1, except that, in forming an emission layer, Compound HA1 was used as a host instead of Compound H1-63.

Evaluation Example 2

Regarding the organic light-emitting devices manufactured according to Examples 1 to 3 and Comparative Examples 1 to 4, the driving voltage, external quantum luminescence efficiency, and lifespan ($T_{97}$) were evaluated, and results thereof are shown in Table 2. Here, a current-voltage meter (Keithley 2400) and a luminescence meter (Minolta Cs-1,000A) were used as evaluation devices, and the lifespan ($T_{97}$) (at 6,000 nit) was evaluated by measuring, as a relative value (%) with respect to the lifespan of the organic light-emitting device of Comparative Example 1, the amount of time that elapsed until luminance was reduced to 97% of the initial luminance (100%).

TABLE 2

| | Driving voltage (V) | Maximum external quantum luminescence efficiency (Max EQE) (%) | External quantum luminescence efficiency (%) | Lifespan (%) |
|---|---|---|---|---|
| Comparative Example 1 | 3.77 | 22.8 | 19.9 | 100 |
| Comparative Example 2 | 3.86 | 23.0 | 19.6 | 103 |
| Comparative Example 3 | 3.42 | 27.8 | 24.5 | 100 |
| Comparative Example 4 | 4.15 | 27.0 | 24.0 | 91 |
| Example 1 | 3.66 | 28.7 | 25.0 | 170 |
| Example 2 | 3.50 | 29.1 | 25.4 | 150 |
| Example 3 | 3.66 | 28.0 | 24.6 | 165 |

Referring to Table 2, it was confirmed that the organic light-emitting devices of Examples 1 to 3 had a low driving voltage and excellent characteristics in terms of external quantum luminescence efficiency and lifespan, compared to the organic light-emitting devices of Comparative Examples 1 to 4.

According to the one or more embodiments, a composition may have excellent electrical characteristics and stability, so that an electronic device, such as an organic light-emitting device, including the composition may have improved characteristics in terms of external quantum luminescence efficiency, driving voltage, and lifespan.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A composition comprising:

a platinum-containing organometallic compound, a first compound, a second compound, and a third compound, wherein the platinum-containing organometallic compound, the first compound, the second compound, and the third compound are different from each other, the first compound comprises at least one electron transport moiety, the second compound does not comprise an electron transport moiety, the third compound has a greater band gap than each of a band gap of the first compound and a bandgap of the second compound, a difference between an absolute value of a highest occupied molecular orbital (HOMO) energy level of the first compound and an absolute value of a HOMO energy level of the second compound is equal to or less than about 0.35 eV, and the HOMO energy levels of the first compound and the second compound are each measured using a DFT method with Gaussian program on structures structurally optimized using B3LYP/6-31G(d,p) functional and basis set.

2. The composition of claim 1, wherein the platinum-containing organometallic compound comprises platinum and a tetradentate organic ligand, and the platinum and the tetradentate organic ligand together comprise 3 or 4 cyclometalated rings.

3. The composition of claim 2, wherein the tetradentate organic ligand comprises a benzimidazole group, or the tetradentate organic ligand comprises at least one of an amino group, a boryl group, a silyl group, an alkoxy group, or any combination thereof.

4. The composition of claim 1, wherein the electron transport moiety is a cyano group, a fluoro group, a π-electron deficient nitrogen-containing cyclic group, a group represented by one of the following formulae, or a combination thereof:

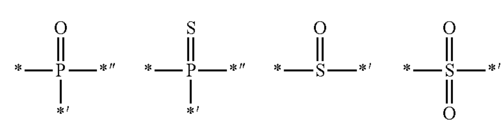

wherein *, *', and *" in the formulae above are each a binding site to a neighboring atom.

5. The composition of claim 1, wherein the second compound comprises at least one carbazole group, at least one fused carbazole group, at least one amine group, or any combination thereof.

6. The composition of claim 1, wherein the third compound comprises at least one group represented by Formula 4A, 4B, or 4C:

Formula 4A

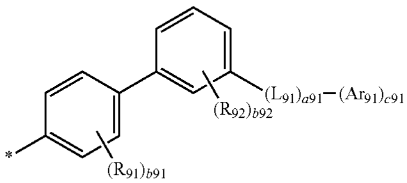

Formula 4B

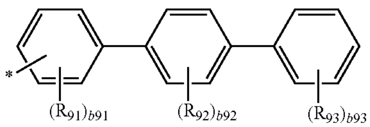

Formula 4C

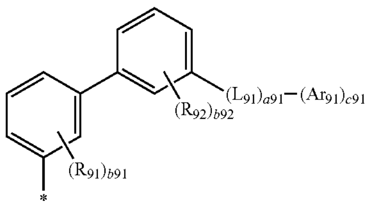

wherein, in Formulae 4A to 4C, $L_{91}$ is a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, a91 is an integer from 1 to 10, $Ar_{91}$ is a substituted or unsubstituted benzene group or a substituted or unsubstituted naphthalene group, c91 is an integer from 1 to 5, $R_{91}$ to $R_{93}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{10}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, b91 and b92 are each independently an integer from 1 to 4, b93 is an integer from 1 to 5, and

* indicates a binding site to a neighboring atom.

7. The composition of claim 1, wherein the platinum-containing organometallic compound is an organometallic compound represented by Formula 1, the first compound is a compound represented by Formula 2, the second compound is a compound represented by one of Formulae 3-1 to 3-4, and/or the third compound is a compound represented by one of Formulae 4-1 to 4-3:

Formula 1

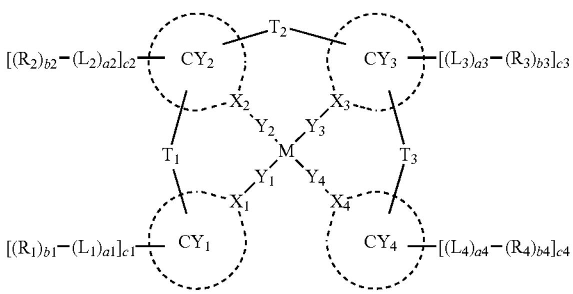

Formula 2

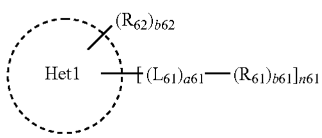

Formula 3-1

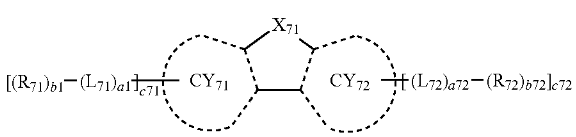

Formula 3-2

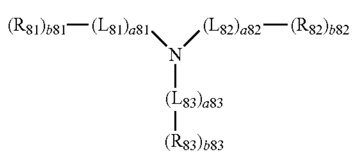

Formula 3-3

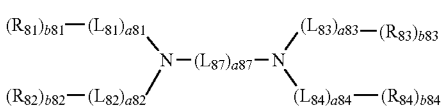

Formula 3-4

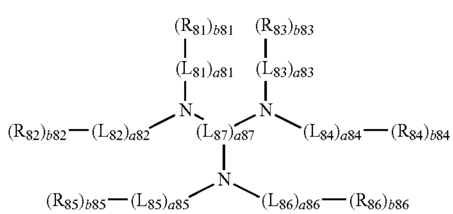

-continued

Formula 4-1

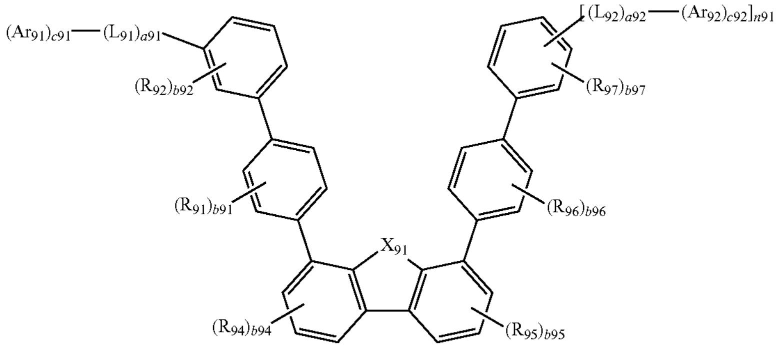

Formula 4-2

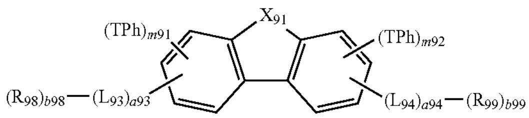

Formula 4-3

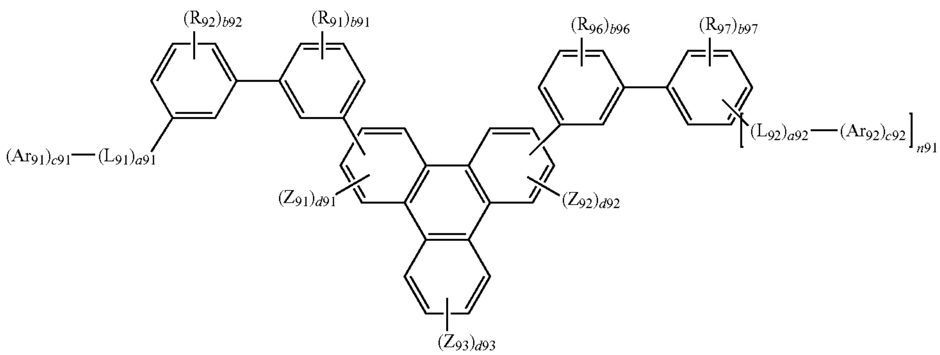

Formula 4B

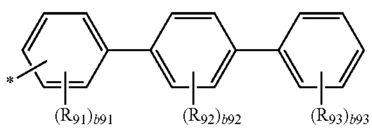

M in Formula 1 is platinum (Pt), $Y_1$ to $Y_4$ in Formula 1 are each independently a chemical bond, O, S, $N(R_a)$, $C(R_a)(R_b)$, or $Si(R_a)(R_b)$, $X_1$ to $X_4$ in Formula 1 are each independently C or N, ring $CY_1$ to ring $CY_4$ in Formula 1 are each independently a $C_5$-$C_{30}$ carbocyclic group or a $C_1$-$C_{30}$ heterocyclic group, $T_1$ in Formula 1 is a single bond, a double bond, $*—N(R_{51})—*'$, $*—B(R_{51})—*'$, $*—P(R_{51})—*'$, $*—C(R_{51})(R_{52})—*'$, $*—Si(R_{51})(R_{52})—*'$, $*—Ge(R_{51})(R_{52})—*'$, $*—S—*'$, $*—Se—*'$, $*—O—*'$, $*—C(=O)—*'$, $*—S(=O)—*'$, $*—S(=O)_2—*'$, $*—C(R_{51})=*'$, $*=C(R_{51})—*'$, $*—C(R_{51})=C(R_{52})—*'$, $*—C(=S)—*'$, or $*—C≡C—*'$, $T_2$ in Formula 1 is a single bond, a double bond, $*—N(R_{53})—*'$, $*—B(R_{53})—*'$, $*—P(R_{53})—*'$, $*—C(R_3)(R_{54})—*'$, $*—Si(R_{53})(R_{54})—*'$, $*—Ge(R_{53})(R_{54})*'$, $*—S—*'$, $*—Se—*'$, $*—O—*'$, $*—C(=O)—*'$, $*—S(=O)—*'$, $*—S(=O)_2—*'$, $*—C(R_{53})=*'$, $*=C(R_{53})—*'$, $*—C(R_{53})=C(R_{54})—*'$, $*—C(=S)—*'$, or $*—C≡C—*'$, $T_3$ in Formula 1 is a single bond, a double bond, $*—N(R_{55})—*'$, $*—B(R_{55})—*'$, $*—P(R_{55})—*'$, $*—C(R_{55})(R_{56})—*'$, $*—Si(R_{55})(R_{56})—*'$, $*—Ge(R_{55})(R_{56})*'$, $*—S—*'$, $*—Se—*'$, $*—O—*'$, $*—C(=O)—*'$, $*—S(=O)—*—S(=O)_2—*'$, $*—C(R_{55})=*'$, $*=C(R_{55})—*'$, $*—C(R_{55})=C(R_{56})—*'$, $*—C(=S)—*'$, or $*—C≡C—*'$, Het1 in Formula 2 is a $C_1$-$C_{30}$ π-electron deficient nitrogen-containing cyclic group, n61 in Formula 2 is an integer from 1 to 10, ring $CY_{71}$ and ring $CY_{72}$ in Formula 3-1 are each independently a $C_3$-$C_{30}$ π-electron rich cyclic group, and are optionally linked to each other via a $C_3$-$C_{30}$ π-electron rich cyclic group that is unsubstituted or substituted with at least one $R_{10a}$, $X_{71}$ in Formula 3-1 is O, S, $N$-$(L_{73})_{a73}$-$(R_{73})_{b73}$, $C(R_{73})(R_{74})$, or $Si(R_{73})(R_{74})$, c71 and c72 in Formula 3-1 are each independently an integer from 0 to 3, $X_{91}$ in Formulae 4-1 and 4-2 is O, S, or Se, $Ar_{91}$ and $Ar_{92}$ in Formulae 4-1 and 4-3 are each independently a substituted or unsubstituted benzene group or a substituted or unsubstituted naphthalene group, c91 and c92 in Formulae 4-1 and 4-3 are each independently an integer from 1 to 5, TPh in Formula 4-2 is a group represented by Formula 4B, m91 and m92 in Formula 4-2 are each independently an integer from 0 to 2, and the sum of m91 and m92 is 1 or more, $L_1$ to $L_4$, $L_{61}$, $L_{71}$ to $L_{73}$, $L_{81}$ to $L_{87}$, and $L_{91}$ to $L_{94}$ in Formulae 1, 2, 3-1 to 3-4, and 4-1 to 4-3 are each independently a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, a1 to a4, a61, a71 to a73, a81 to a87, and a91 to a94 in Formulae 1, 2, 3-1 to 3-4, and 4-1 to 4-3 are each independently an integer from 1 to 10, $R_a$, $R_b$, $R_1$ to $R_4$, $R_{51}$ to $R_{56}$, $R_{61}$, $R_{62}$, $R_{71}$ to $R_{74}$, $R_{81}$ to $R_{86}$, $R_{91}$ to $R_{99}$, and $Z_{91}$ to $Z_{93}$ in Formulae 1, 2, 3-1 to 3-4, 4-1 to 4-3, and 4B are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, two or more of $R_a$, $R_b$, $R_1$ to $R_4$, and $R_{51}$ to $R_{56}$ in Formula 1 are optionally linked together to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, b1 to b4, b61, b62, b71, b72, b81 to b86, b98, and b99 in Formulae 1, 2, 3-1 to 3-4, and 4-2 are each independently an integer from 1 to 10, b91, b92, b96, and d93 in Formulae 4-1, 4-3, and 4B are each independently an integer from 1 to 4, b93 and b97 in Formulae 4-1 and 4B are each independently an integer from 1 to 5, n91 in Formulae 4-1 and 4-3 are each independently an integer from 0 to 5, b94, b95, d91, and d92 in Formulae 4-1 and 4-3 are each independently an integer from 1 to 3, c1 to c4, n61, c71, and c72 in Formulae 1, 2, and 3-1 are each independently an integer from 1 to 10, $R_{10a}$ is the same as described in connection with $R_1$,

* and *' each indicate a binding site to a neighboring atom, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with at least one deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(=O)(Q_{28})(Q_{29})$, or any combination thereof; or —$N(Q_{31})(Q_{32})$, —$Si(Q_{33})(Q_{34})(Q_{35})$, —$B(Q_{36})(Q_{37})$, or —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_1$-$C_{60}$ alkyl group substituted with at least one deuterium, a $C_1$-$C_{60}$ alkyl group, a $C_6$-$C_{60}$ aryl group, or any combination thereof, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with at least one deuterium, a $C_1$-$C_{60}$ alkyl group, a $C_6$-$C_{60}$ aryl group, or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

8. The composition of claim 7, wherein in Formula 1, $Y_1$ is O or S, each of $Y_2$ to $Y_4$ is a chemical bond, each of $X_1$ and $X_3$ is C, and each of $X_2$ and $X_4$ is N.

9. The composition of claim 7, wherein Het1 in Formula 2 is a group represented by one of Formulae 2-1 to 2-40:

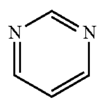
2-1

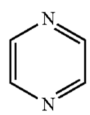
2-2

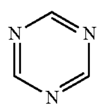
2-3

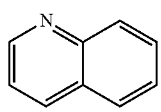
2-4

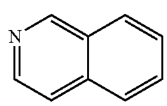
2-5

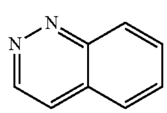
2-6

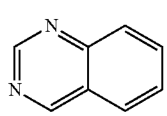
2-7

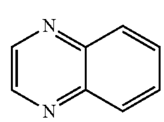
2-8

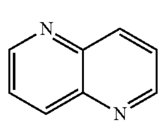
2-9

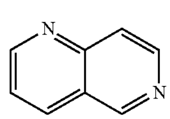
2-10

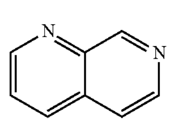
2-11

-continued

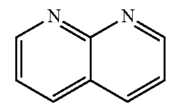
2-12

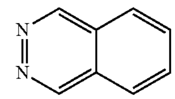
2-13

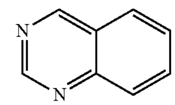
2-14

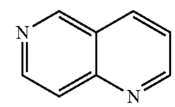
2-15

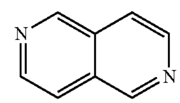
2-16

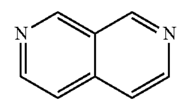
2-17

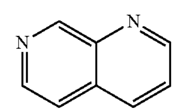
2-18

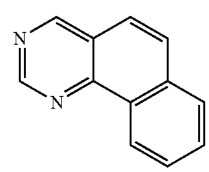
2-19

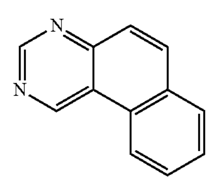
2-20

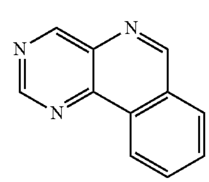
2-21

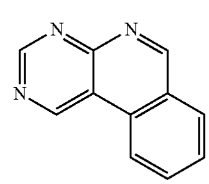
2-23

-continued 2-24

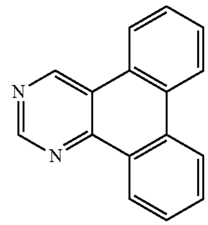

2-25

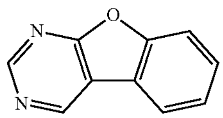

2-26

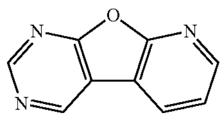

2-27

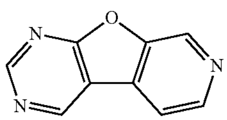

2-28

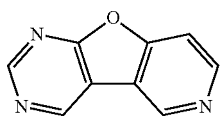

2-29

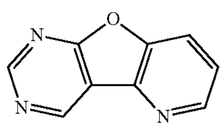

2-30

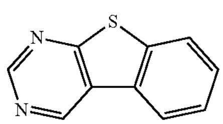

2-31

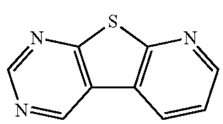

2-32

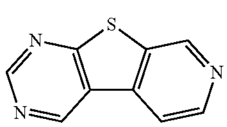

2-33

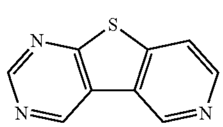

2-34

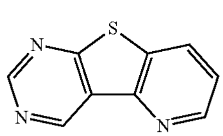

-continued 2-35

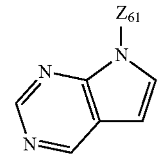

2-36

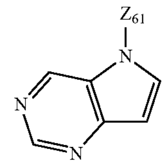

2-37

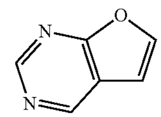

2-38

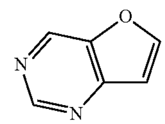

2-39

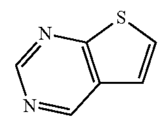

2-40

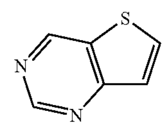

wherein $Z_{61}$ in Formulae 2-35 and 2-36 is a group represented by *-$(L_{61})_{a61}$-$(R_{61})_{b61}$ in Formula 2 or $R_{62}$.

10. The composition of claim 7, wherein at least one of $R_{61}$(s) in the number of b61 in Formula 2 is a group represented by Formula 2A or Formula 2B:

2A

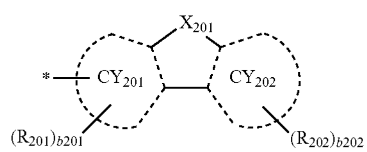

2B

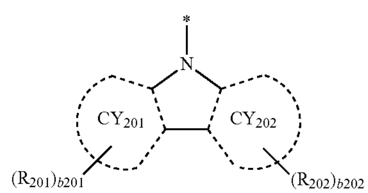

wherein, in Formulae 2A and 2B, ring $CY_{201}$ and ring $CY_{202}$ are each independently a benzene ring, a naphthalene ring, an anthracene ring, a phenanthrene ring, a carbazole ring, a dibenzofuran ring, a dibenzothiophene ring, a benzocarbazole ring, a naphthobenzofuran ring, a naphthobenzothiophene ring, a dibenzocarbazole ring, a dinaphthofuran ring, or a dinaphthothiophene ring, $X_{201}$ is O, S, or $N(R_{203})$,
$R_{201}$ to $R_{203}$ are each the same as described in connection with $R_1$,
b201 and b202 are each independently an integer from 1 to 8, and
* indicates a binding site to a neighboring atom.
11. The composition of claim 7, wherein a group represented by
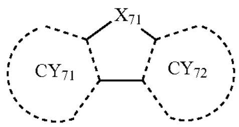
in Formula 3-1 is represented by one of Formulae 3(1) to 3(67) and 3(94) to 3(96):
3(1)
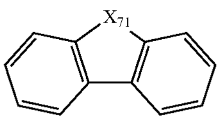
3(2)
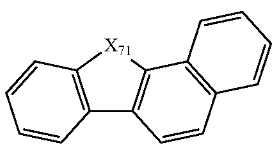
3(3)
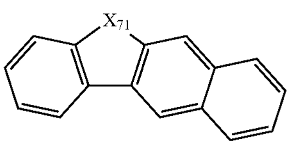
3(4)
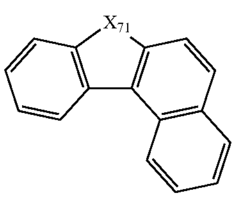
3(5)
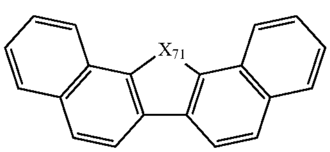
3(6)
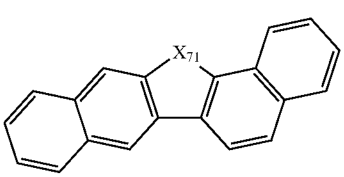
-continued
3(7)
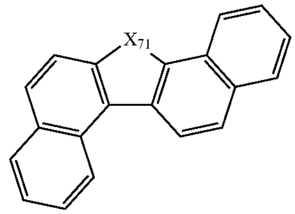
3(8)
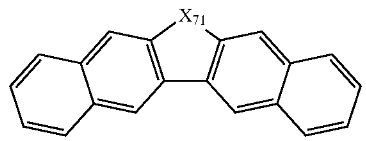
3(9)
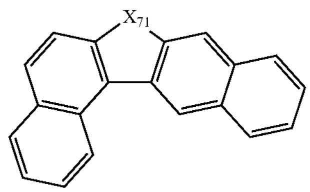
3(10)
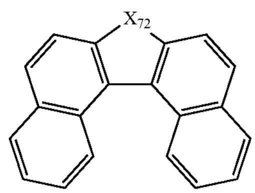
3(11)
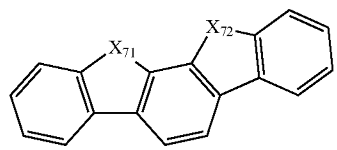
3(12)
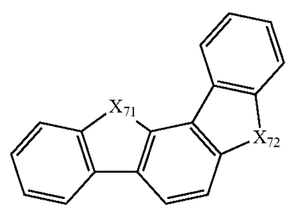
3(13)
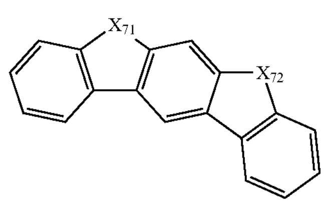
3(14)
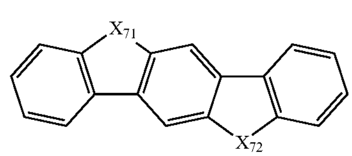

-continued
3(15)
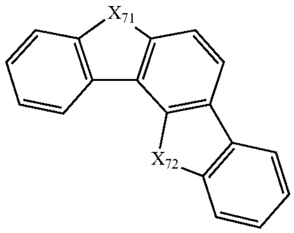
3(16)
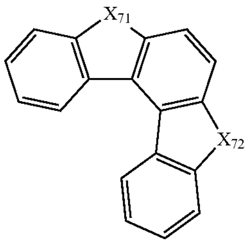
3(17)
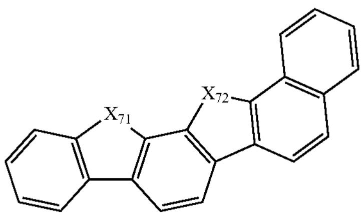
3(18)
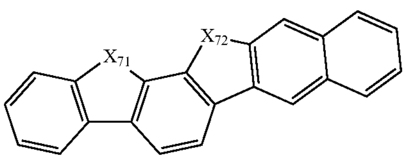
3(19)
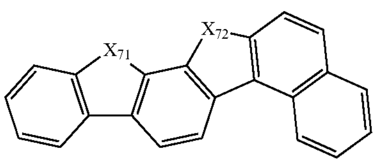
3(20)
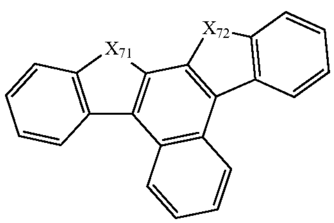
3(21)
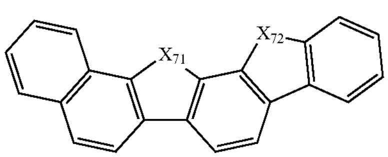
3(22)
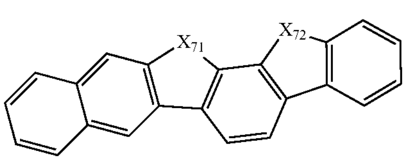
-continued
3(23)
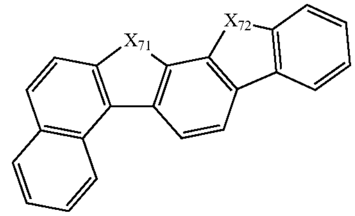
3(24)
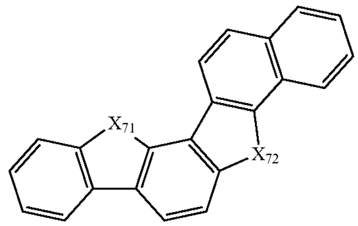
3(25)
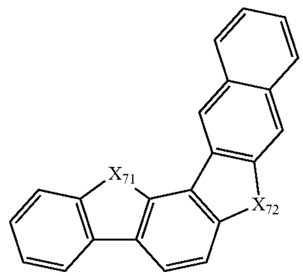
3(26)
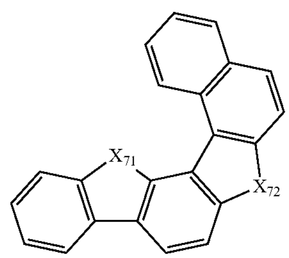
3(27)
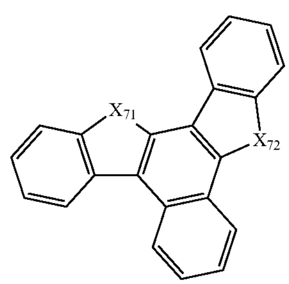
3(28)
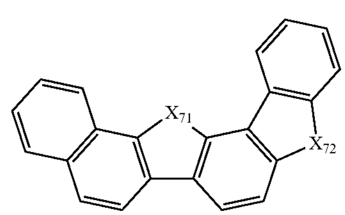

3(29)
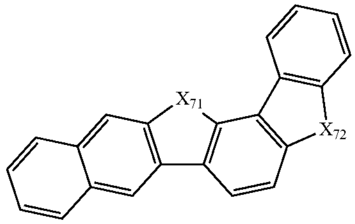
3(30)
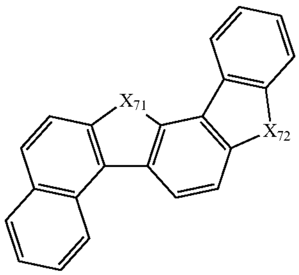
3(31)
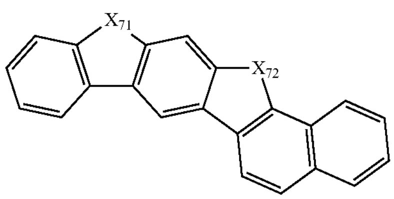
3(32)
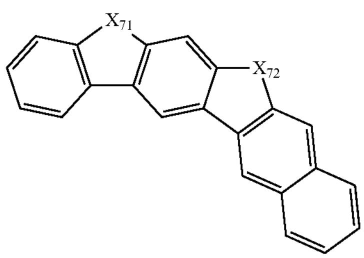
3(33)
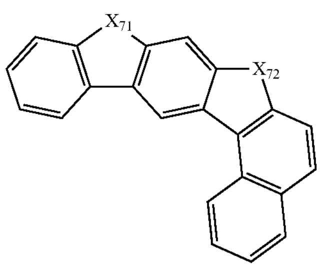
3(34)
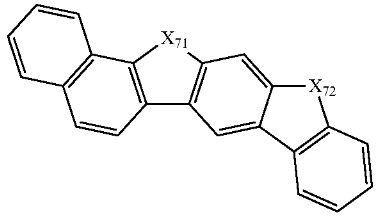
3(35)
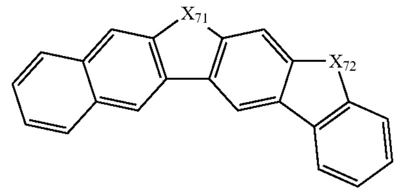
3(36)
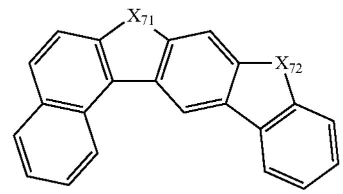
3(37)
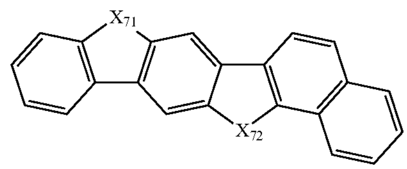
3(38)
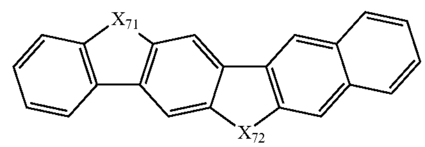
3(39)
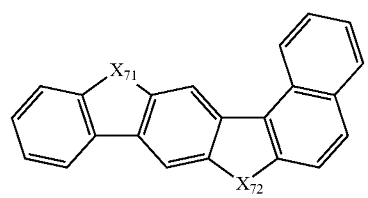
3(40)
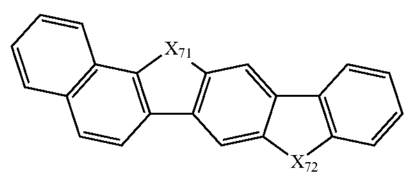
3(41)
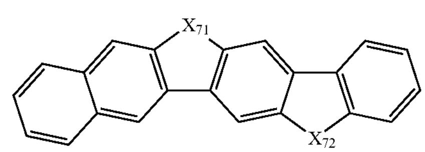
3(42)
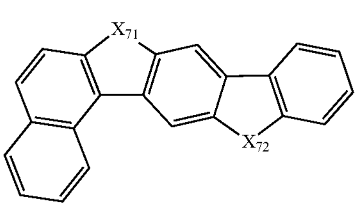

-continued
3(43)
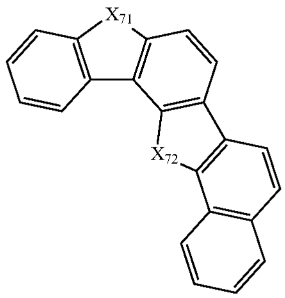
3(44)
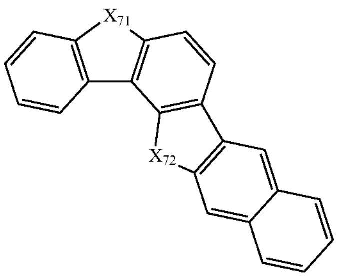
3(45)
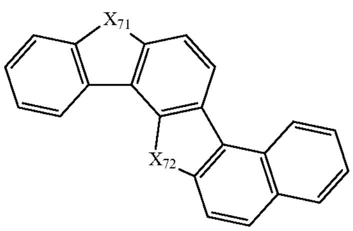
3(46)
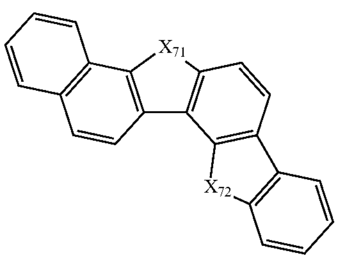
3(47)
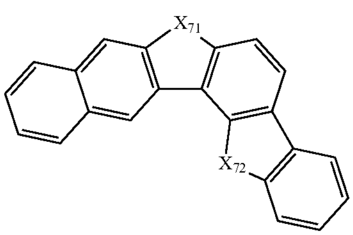
3(48)
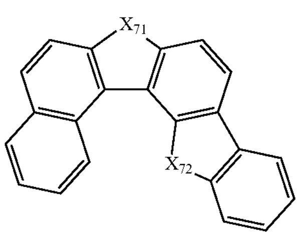
-continued
3(49)
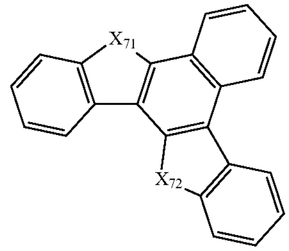
3(50)
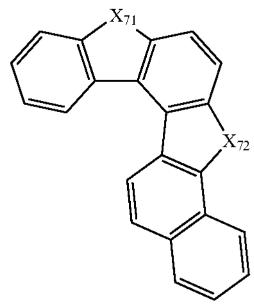
3(51)
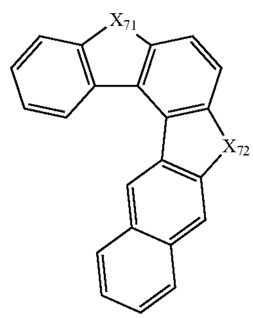
3(52)
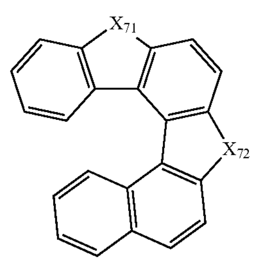
3(53)
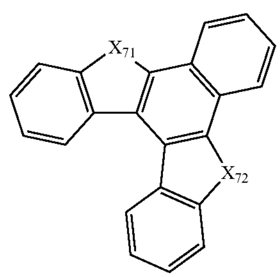

-continued
3(54)
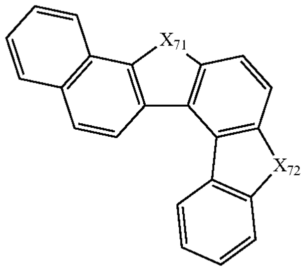
3(55)
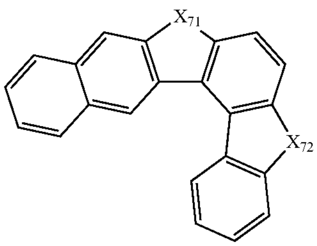
3(56)
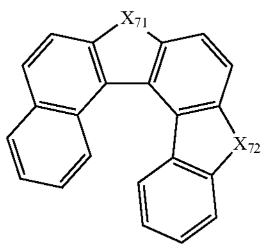
3(57)
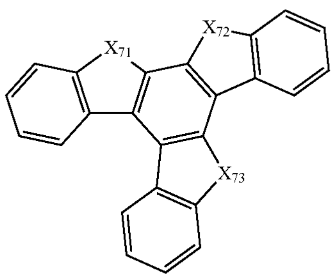
3(58)
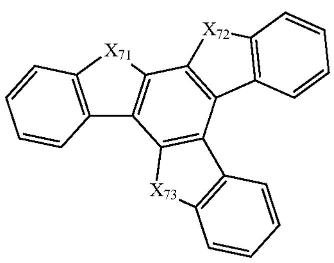
3(59)
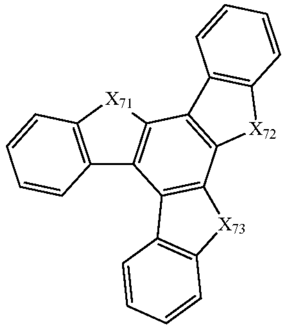
-continued
3(60)
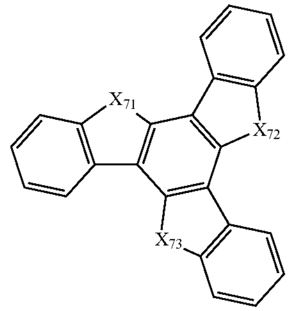
3(61)
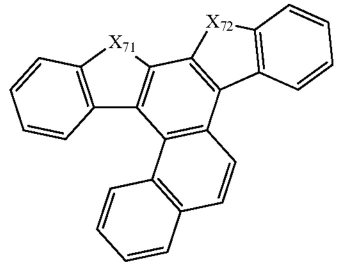
3(62)
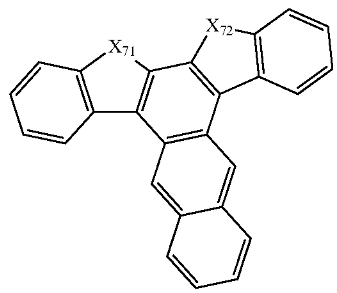
3(63)
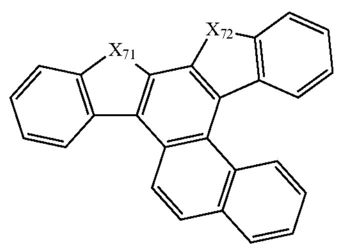
3(64)
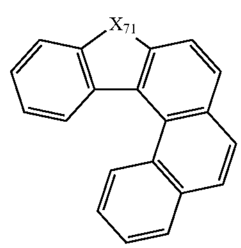
3(65)
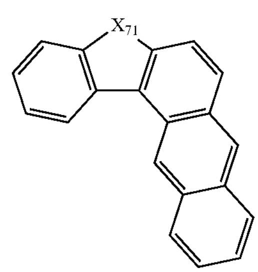

-continued
3(66)
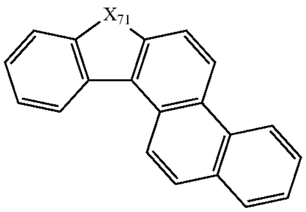
3(67)
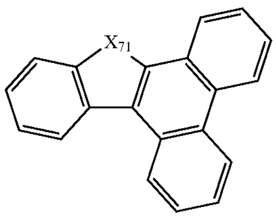
3(94)
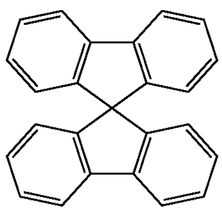
-continued
3(95)
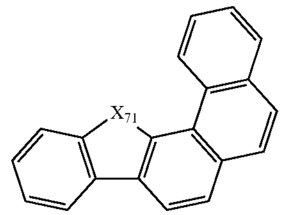
3(96)
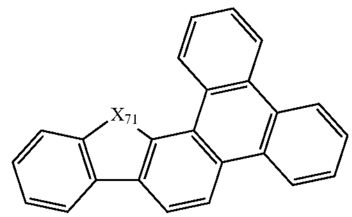
wherein, in Formulae 3(1) to 3(67) and 3(94) to 3(96), $X_{71}$ is the same as described in claim 7,
$X_{72}$ is O, S, $N(R_{75})$, $C(R_{75})(R_{76})$, or $Si(R_{75})(R_{76})$,
$X_{73}$ is O, S, $N(R_{77})$, $C(R_{77})(R_{78})$, or $Si(R_{77})(R_{78})$, and
$R_{75}$ to $R_{78}$ are each the same as described in connection with $R_{71}$ in claim 7.
12. The composition of claim 7, wherein
the third compound is a compound represented by one of Formulae 4-1(1), 4-1(2), 4-2(1) to 4-2(4), and 4-3(1):
Formula 4-1(1)
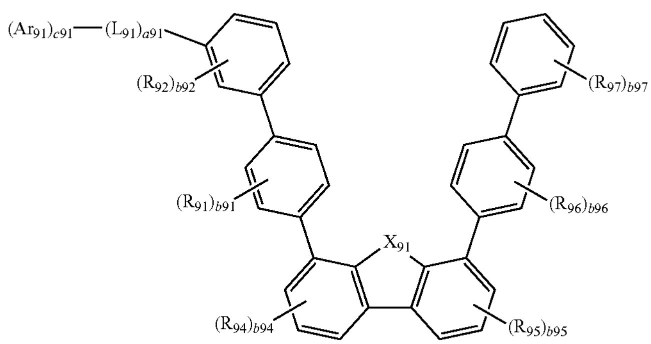
Formula 4-1(2)
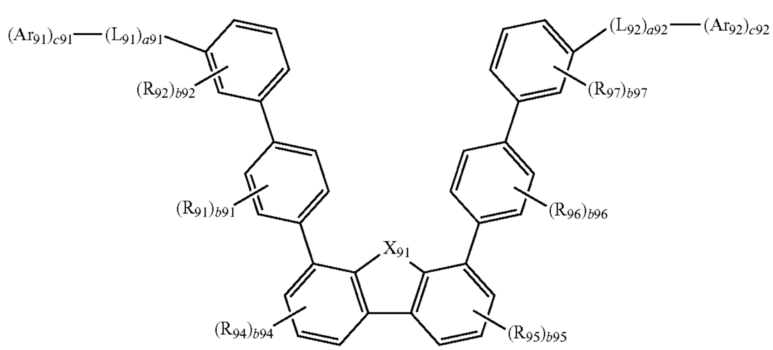
Formula 4-2(1)
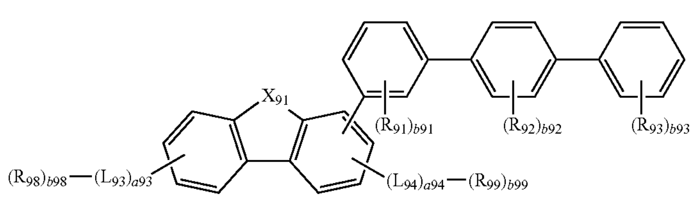

-continued

Formula 4-2(2)

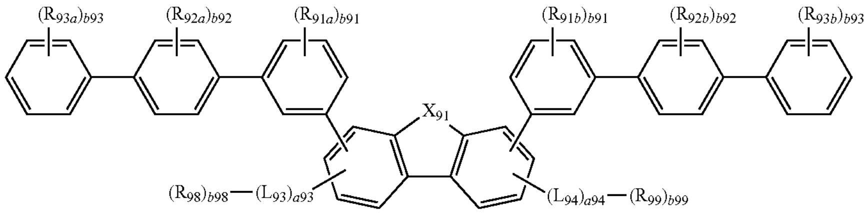

Formula 4-2(3)

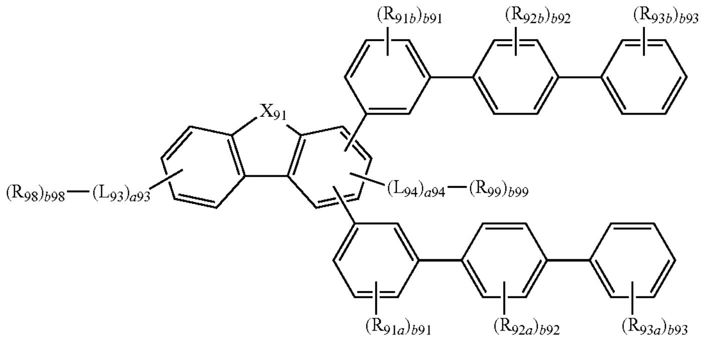

Formula 4-2(4)

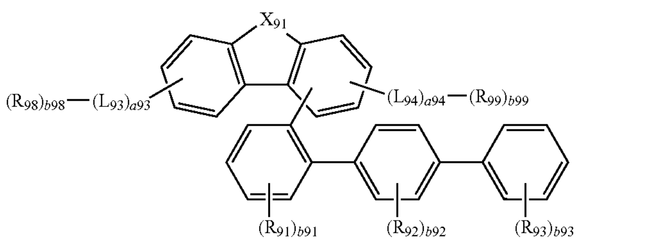

Formula 4-3(1)

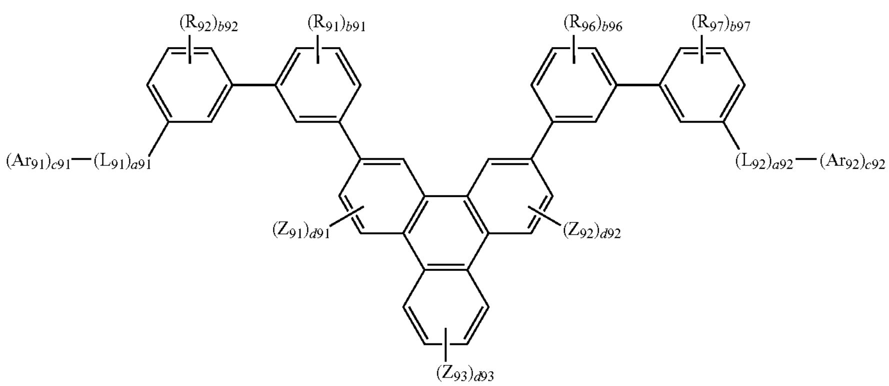

wherein, in Formulae 4-1(1), 4-1(2), 4-2(1) to 4-2(4), and 4-3(1), $X_{91}$, $L_{91}$ to $L_{94}$, a91 to a94, $Ar_{91}$, $Ar_{92}$, c91, c92, $R_{91}$ to $R_{99}$, $Z_{91}$ to $Z_{93}$, b91 to b99, and d91 to d93 are each the same as described in claim 7, $R_{91a}$ and $R_{91b}$ are each the same as described in connection with $R_{91}$ in claim 7, $R_{92a}$ and $R_{92b}$ are each the same as described in connection with $R_{92}$ in claim 7, and $R_{93a}$ and $R_{93b}$ are each the same as described in connection with $R_{93}$ in claim 7.

13. The composition of claim 1, wherein the first compound has a deeper energy level than the HOMO energy level of the second compound.

14. The composition of claim 1, wherein an absolute value of the HOMO energy level of the second compound is smaller than an absolute value of the HOMO energy level of the first compound and an absolute value of the HOMO energy level of the third compound.

15. The composition of claim 1, wherein an absolute value of the HOMO energy level of the first compound is greater than an absolute value of the HOMO energy level of the second compound and an absolute value of the HOMO energy level of the third compound.

16. A composition comprising:

a platinum-containing organometallic compound, a first compound, a second compound, and a third compound, wherein the platinum-containing organometallic compound, the first compound, the second compound, and the third compound are different from each other, the first compound comprises at least one electron transport moiety, the second compound does not comprise an electron transport moiety, the third compound has a greater band gap than a band gap of the first compound and a band gap of the second compound, the platinum-containing organometallic compound is an organometallic compound represented by Formula 1-1 or 1-2:

Formula 1-1

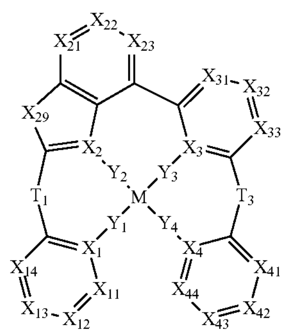

<Formula 1-2>

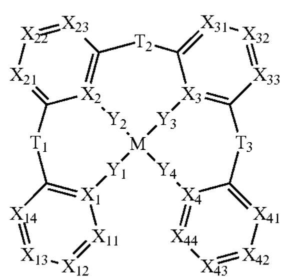

wherein, in Formulae 1-1 and 1-2,

M is platinum (Pt), $Y_1$ is O or S, and each of $Y_2$ to $Y_4$ is a chemical bond, each of $X_1$ and $X_3$ is C, and each of $X_2$ and $X_4$ is N, $T_1$ is a single bond, a double bond, *—N($R_{51}$)—*', *—B($R_{51}$)—*', *—P($R_{51}$)—*', *—C($R_{51}$)($R_{52}$)—*', *—Si($R_{51}$)($R_{52}$)—*', *—Ge($R_{51}$)($R_{52}$)—*', *—S—*', *—Se—*', *—O—*', *—C(═O)—*', *—S(═O)—*', *—S(═O)$_2$—*—C($R_{51}$)═*', *═C($R_{51}$)—*', *—C($R_{51}$)═C($R_{52}$)—*', *—C(═S)—*', or *—C≡C—*', $T_2$ is a single bond, a double bond, *—N($R_{53}$)—*', *—B($R_{53}$)—*', *—P($R_{53}$)—*', *—C($R_{53}$)($R_{54}$)—*', *—Si($R_{53}$)($R_{54}$)—*', *—Ge($R_{53}$)($R_{54}$)—*', *—S—*', *—Se—*', *—O—*', *—C(═O)—*', *—S(═O)—*', *—S(═O)$_2$—*—C($R_{53}$)═*', *═C($R_{53}$)—*', *—C($R_{53}$)═C($R_{54}$)—*', *—C(═S)—*', or *—C≡C—*', $T_3$ is a single bond, a double bond, *—N($R_{55}$)—*', *—B($R_{55}$)—*', *—P($R_{55}$)—*', *—C($R_{55}$)($R_{56}$)—*', *—Si($R_{55}$)($R_{56}$)—*', *—Ge($R_{55}$)($R_{56}$)—*', *—S—*', *—Se—*', *—O—*', *—C(═O)—*', *—S(═O)—*', *—S(═O)$_2$—*—C($R_{55}$)═*', *═C($R_{55}$)—*', *—C($R_{55}$)═C($R_{56}$)—*', *—C(═S)—*', or *—C≡C—*', $X_{11}$ is N or C-[$(L_{11})_{a11}$-$(R_{11})_{b11}$], $X_{12}$ is N or C-[$(L_{12})_{a12}$-$(R_{12})_{b12}$], $X_{13}$ is N or C-[$(L_{13})_{a13}$-$(R_{13})_{b13}$], and $X_{14}$ is N or C-[$(L_{14})_{a14}$-$(R_{14})_{b14}$], $X_{21}$ is N or C-[$(L_{21})_{a21}$-$(R_{21})_{b21}$], $X_{22}$ is N or C-[$(L_{22})_{a22}$-$(R_{22})_{b22}$], and $X_{23}$ is N or C-[$(L_{23})_{a23}$-$(R_{23})_{b23}$], $X_{29}$ is O, S, C($R_{27}$)($R_{28}$), Si($R_{27}$)($R_{28}$), or N-[$(L_{29})_{a29}$-$(R_{29})_{b29}$], $X_{31}$ is N or C-[$(L_{31})_{a31}$-$(R_{31})_{b31}$], $X_{32}$ is N or C-[$(L_{32})_{a32}$-$(R_{32})_{b32}$], and $X_{33}$ is N or C-[$(L_{33})_{a33}$-$(R_{33})_{b33}$], $X_{41}$ is N or C-[$(L_{41})_{a41}$-$(R_{41})_{b41}$], $X_{42}$ is N or C-[$(L_{42})_{a42}$-$(R_{42})_{b42}$], $X_{43}$ is N or C-[$(L_{43})_{a43}$-$(R_{43})_{b43}$], and $X_4$ is N or C-[$(L_{44})_{a44}$-$(R_{44})_{b44}$], $L_{11}$ to $L_{14}$, $L_{21}$ to $L_{23}$, $L_{31}$ to $L_{33}$, and $L_{41}$ to $L_{44}$ are each independently a single bond, a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$ a11 to a14, a21 to a23, a31 to a33, and a41 to a44 are each independently an integer from 1 to 10, $R_{11}$ to $R_{14}$, $R_{21}$ to $R_{23}$, $R_{27}$ to $R_{29}$, $R_{31}$ to $R_{33}$, and $R_{41}$ to $R_{44}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(═O)($Q_8$)($Q_9$), b11 to b14, b21 to b23, b29, b31 to b33, and b41 to b44 are each independently an integer from 1 to 10, two of $R_{11}$ to $R_{14}$ are optionally linked to each other form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$ two of $R_{21}$ to $R_{23}$ are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, two of $R_{31}$ to $R_{33}$ are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, and two of $R_{41}$ to $R_{44}$ are optionally linked to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$.

17. An organic light-emitting device comprising:

a first electrode;

a second electrode; and an organic layer located between the first electrode and the second electrode and comprising an emission layer, wherein the organic layer comprises the composition of claim 1.

18. The organic light-emitting device of claim 17, wherein the first electrode is an anode, the second electrode is a cathode, the organic layer further comprises a hole transport region located between the first electrode and the emission layer and an electron transport region located between the emission layer and the second electrode, the hole transport region comprises a hole injection layer, a hole transport layer, an electron blocking layer, a buffer layer, or any combination thereof, and the electron transport region comprises a hole blocking layer, an electron transport layer, an electron injection layer, or any combination thereof.

19. The organic light-emitting device of claim 17, wherein the emission layer comprises the composition.

20. The organic light-emitting device of claim 19, wherein the emission layer comprises a dopant and a host, the dopant comprises the platinum-containing organometallic compound included in the composition, and the host comprises the first compound, the second compound, and the third compound that are included in the composition.

* * * * *